US012540151B2

(12) United States Patent
Lee et al.

(10) Patent No.: US 12,540,151 B2
(45) Date of Patent: Feb. 3, 2026

(54) COMPOSITION AND ORGANIC LIGHT-EMITTING DEVICE INCLUDING THE SAME

(71) Applicant: Samsung Electronics Co., Ltd., Suwon-si (KR)

(72) Inventors: Banglin Lee, Suwon-si (KR); Sangdong Kim, Seongnam-si (KR); Myungsun Sim, Suwon-si (KR); Sukekazu Aratani, Hwaseong-si (KR); Kum Hee Lee, Suwon-si (KR); Jeoungin Yi, Seoul (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1235 days.

(21) Appl. No.: 17/201,067

(22) Filed: Mar. 15, 2021

(65) Prior Publication Data

US 2022/0077414 A1 Mar. 10, 2022

(30) Foreign Application Priority Data

Aug. 4, 2020 (KR) ........................ 10-2020-0097534

(51) Int. Cl.

*H10K 50/11* (2023.01)
*C07F 15/00* (2006.01)

(Continued)

(52) U.S. Cl.

CPC .......... *C07F 15/0033* (2013.01); *C09K 11/06* (2013.01); *H10K 50/11* (2023.02);

(Continued)

(58) Field of Classification Search

CPC . H10K 85/40; H10K 2101/40; H10K 2101/90

See application file for complete search history.

(56) References Cited

U.S. PATENT DOCUMENTS 6,465,115 B2 10/2002 Shi et al.
6,596,415 B2 7/2003 Shi et al.

(Continued)

FOREIGN PATENT DOCUMENTS

EP 3010067 A1 4/2016
EP 3010068 A1 4/2016

(Continued)

OTHER PUBLICATIONS

English Abstract of JP 2000-003782.

(Continued)

*Primary Examiner* — Sean M DeGuire

(74) *Attorney, Agent, or Firm* — CANTOR COLBURN LLP

(57) ABSTRACT

Provided are a compound and an organic light-emitting device including the same. The composition includes a first compound represented by Formula 1, a second compound having a highest occupied molecular orbital (HOMO) energy level of −5.5 eV, and a third compound having a lowest unoccupied molecular orbital (LUMO) energy level of −2.8 eV or less.

$M(L_1)_{n1}(L_2)_{n2}$ Formula 1

M, $L_1$, $L_2$, n1, and n2 in Formula 1 are the same as described in the present specification.

19 Claims, 1 Drawing Sheet

(51) Int. Cl.

*C09K 11/06* (2006.01)
*H10K 85/30* (2023.01)
*H10K 85/60* (2023.01)
*H10K 101/00* (2023.01)
*H10K 101/10* (2023.01)
*H10K 101/40* (2023.01)

(52) U.S. Cl.

CPC ......... *H10K 85/342* (2023.02); *H10K 85/654* (2023.02); *H10K 85/6572* (2023.02); *C09K 2211/1044* (2013.01); *C09K 2211/1059* (2013.01); *C09K 2211/185* (2013.01); *H10K 2101/10* (2023.02); *H10K 2101/40* (2023.02); *H10K 2101/90* (2023.02)

(56) References Cited

U.S. PATENT DOCUMENTS

| | | | | |
|---|---|---|---|---|
| 2001/0019782 | A1 | 9/2001 | Igarashi et al. | |
| 2013/0181190 | A1* | 7/2013 | Ma | C07F 15/0033 546/4 |
| 2013/0306940 | A1 | 11/2013 | Zeng et al. | |
| 2015/0090974 | A1* | 4/2015 | Kim | H10K 85/342 546/4 |
| 2016/0093816 | A1 | 3/2016 | Ma et al. | |
| 2016/0111663 | A1 | 4/2016 | Kim et al. | |
| 2016/0111665 | A1* | 4/2016 | Kim | H10K 85/633 257/40 |
| 2017/0170408 | A1* | 6/2017 | Park | H10K 85/40 |
| 2018/0013077 | A1 | 1/2018 | Boudreault et al. | |
| 2021/0083205 | A1 | 3/2021 | Hwang et al. | |
| 2021/0104691 | A1 | 4/2021 | Lee et al. | |

FOREIGN PATENT DOCUMENTS

| | | | |
|---|---|---|---|
| JP | 2000003782 | A | 1/2000 |
| KR | 1020210036829 | A | 4/2021 |

OTHER PUBLICATIONS

M. A. Baldo, et al, Very high-efficiency green organiclight-emitting devices based onelectrophosphorescence, Appl. Phys. Lett. 75, 4 (1999), 4 pp.

M. A. Baldo, et al., Highly efficient phosphorescent emission from organic electroluminescent devices, Nature, vol. 395, Sep. 10, 1998, 4 pp.

Qin Wang, et al., Effects of charged self-assembled quantum dots on two-dimensional quantum transport, Appl. Phys. Lett. 76, 1704 (2000); 4 pp.

Raymond C. Kwong, et al, High operational stability of electrophosphorescent devices, Appl. Phys. Lett. 81, 162 (2002). 4 pp.

Sergey Lamansky, et al., Highly Phosphorescent Bis-Cyclometalated Iridium Complexes:Synthesis, Photophysical Characterization, and Use in Organic LightEmitting Diodes, J. Am. Chem. Soc. 2001, 123, 4304-4312.

Sergey Lamansky, et al., Synthesis and Characterization of Phosphorescent Cyclometalated Iridium Complexes, Inorg. Chem. 2001, 40, 1704-1711.

* cited by examiner

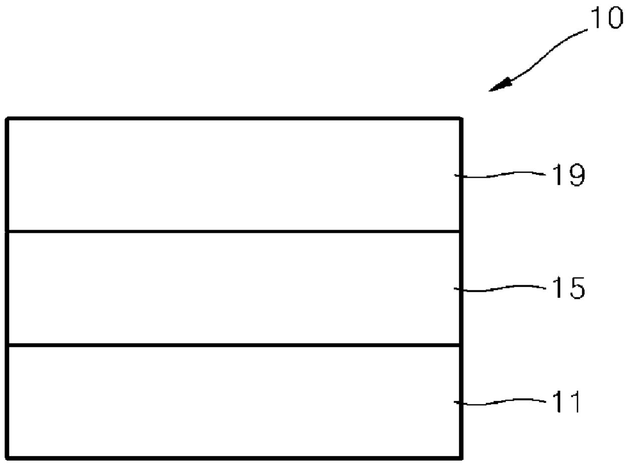
10
19
15
11

COMPOSITION AND ORGANIC LIGHT-EMITTING DEVICE INCLUDING THE SAME

CROSS-REFERENCE TO RELATED APPLICATION

This application claims priority to and the benefit of Korean Patent Application No. 10-2020-0097534, filed on Aug. 4, 2020, in the Korean Intellectual Property Office, and all of the benefits accruing under 35 U.S.C. § 119, the content of which is incorporated by reference herein in its entirety.

BACKGROUND

1. Field

The present disclosure relates to compositions and organic light-emitting devices including the same.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

Meanwhile, luminescent compounds, for example, phosphorescent compounds, may be used for monitoring, sensing, and detecting biological materials such as various cells and proteins.

SUMMARY

Provided are novel compositions and organic light-emitting devices including the same, and diagnostic compositions using the organic light-emitting devices.

Additional aspects will be set forth in part in the description which follows and, in part, will be apparent from the description, or may be learned by practice of the presented embodiments of the disclosure.

According to one or more embodiments, an organic light-emitting device includes at least one first compound, at least one second compound and at least one third compound, the first compound is represented by Formula 1, the second compound has a highest occupied molecular orbital (HOMO) energy level of about −5.5 eV or higher, and the third compound has a lowest unoccupied molecular orbital (LUMO) energy level of about −2.8 eV or less, $M(L_1)_{n1}(L_2)_{n2}$ Formula 1 wherein, in Formula 1,

M is a transition metal, $L_1$ is a ligand represented by Formula 1-1, $L_2$ is a ligand represented by Formula 1-2A or 1-2B, n1 and n2 are each independently 1 or 2, wherein, when n1 is 2, two of $L_1$(s) may be identical to or different from each other, and when n2 is 2, two of $L_2$(s) may be identical to or different from each other, Formula 1-1

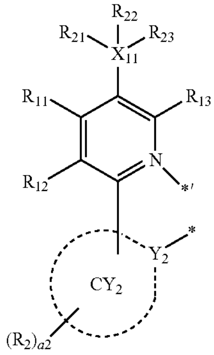

Formula 1-2A

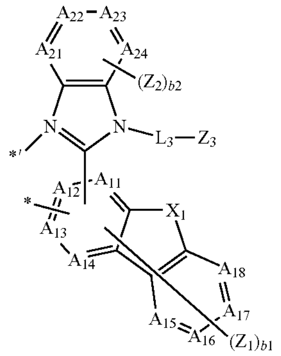

Formula 1-2B

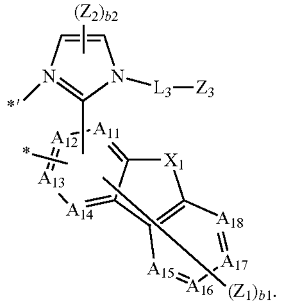

In Formulae 1-1 and 1-2A and 1-2B, $Y_2$ is C or N, ring $CY_2$ is a $C_5$-$C_{30}$ carbocyclic group or a $C_1$-$C_{30}$ heterocyclic group, $X_{11}$ is Si or Ge, $X_1$ is O, S, Se, $N(Z_{19})$, $C(Z_{19})(Z_{20})$, or $Si(Z_{19})(Z_{20})$, $A_{11}$ to $A_{14}$ are each independently C, N, C bonded to C between two N of a neighboring 5-membered ring, or C bonded to M in Formula 1, and one of $A_{11}$ to $A_{14}$ is C bonded to C between two N of a neighboring 5-membered ring, and one of the others of $A_{11}$ to $A_{14}$ is C bonded to M in Formula 1, and $A_{15}$ to $A_{18}$ and $A_{21}$ to $A_{24}$ are each independently C or N, $L_3$ is a single bond, a $C_5$-$C_{30}$ carbocyclic group unsubstituted or substituted with at least one $R_{10}$, or a $C_1$-$C_{30}$ heterocyclic group unsubstituted or substituted with at least one $R_{10}$, $R_2$, $R_{10}$ to $R_{13}$, $R_{21}$ to $R_{23}$, $Z_1$ to $Z_3$, $Z_{19}$, and $Z_{20}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or $P(Q_8)(Q_9)$, a2 is an integer of 0 to 20, wherein, when a2 is 2 or more, two or more of $R_2$(s) are identical to or different from each other, b1 is an integer from 0 to 6, wherein, when b1 is 2 or more, two or more of $Z_1$(s) may be identical to or different from each other, b2 is an integer from 0 to 4, wherein, when b2 is 2 or more, two or more of $Z_2$(s) may be identical to or different from each other, $R_{11}$ and $R_{12}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_1$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_2$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as explained in connection with $Z_1$,

* and *' each indicate a binding site to M in Formula 1, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof;

$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

According to another aspect, provided is an organic light-emitting device including a first electrode, a second electrode, and an organic layer including an emission layer disposed between the first electrode and the second electrode, wherein the organic layer includes the composition.

The composition may be included in an emission layer of the organic layer, and a first compound included in the emission layer may act as a dopant.

BRIEF DESCRIPTION OF THE DRAWING

The above and other aspects, features, and advantages of certain embodiments of the disclosure will be more apparent from the following description taken in conjunction with the accompanying drawings, in which FIGURE which shows a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

The composition includes at least one first compound, at least one second compound, and at least one third compound, and the first compound is represented by Formula 1 below, the second compound has a HOMO energy level of about 5.5 eV or more, and the third compound has a LUMO energy level of about −2.8 eV or less:

$M(L_1)_{n1}(L_2)n_2$. Formula 1

The composition may include one type of first compound, or may include two or more types of different first compounds.

The composition may include one type of second compound, or may include two or more types of different second compounds.

The composition may include one type of third compound, or may include two or more types of different third compounds.

Description of First Compound

The first compound is represented by Formula 1 below:

$M(L_1)_{n1}(L_2)n_2$. Formula 1

M in Formula 1 may be a transition metal.

For example, M may be a Period 1 transition metal, a Period 2 transition metal, or a Period 3 transition metal.

In one embodiment, M may be iridium (Ir), platinum (Pt), osmium (Os), titanium (Ti), zirconium (Zr), hafnium (Hf), europium (Eu), terbium (Tb), thulium (Tm)), or rhodium (Rh).

In an embodiment, M may be Ir, Pt, Os, or Rh.

Regarding Formula 1, $L_1$ may be a ligand represented by Formula 1-1, and $L_2$ may be a ligand represented by Formula 1-2A or 1-2B:

Formula 1-1

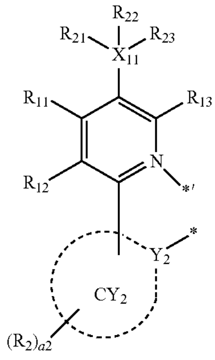

Formula 1-2A

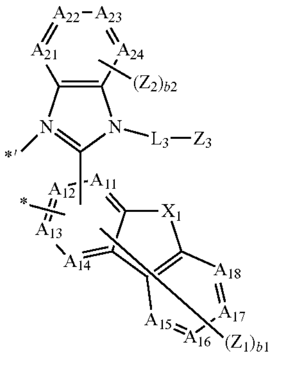

-continued

Formula 1-2B

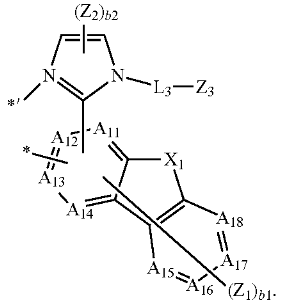

Formulae 1-1 and 1-2A and 1-2B are the same as described in the present specification.

$L_1$ and $L_2$ in Formula 1 are different from each other.

n1 and n2 in Formula 1 respectively indicate the number of $L_1$(s) and the number of $L_2$(s), and may each independently be 1 or 2. When n1 is 2, two $L_1$(s) may be identical to or different from each other, and when n2 is 2, two $L_2$(s) may be identical to or different from each other.

For example, regarding Formula 1, i) n1 may be 2, and n2 may be 1; or ii) n1 may be 1, and n2 may be 2, but embodiments of the present disclosure are not limited thereto.

In one embodiment, in Formula 1, i) M may be Ir or Os, and the sum of n1 and n2 may be 3 or 4; or ii) M may be Pt, and the sum of n1 and n2 may be 2.

$Y_2$ in Formulae 1-2A and 1-2B may be C or N.

For example, $Y_2$ may be C.

In Formula 1-1, ring $CY_2$ may be a $C_5$-$C_{30}$ carbocyclic group or a $C_1$-$C_{30}$ heterocyclic group.

For example, ring $CY_2$ may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a bicyclo[1.1.1]pentane group, a bicyclo[2.1.1]hexane group, a bicyclo [2.2.1]heptane group, a bicyclo[2.2.2]octane group, a cyclohexane group, a cyclohexene group, a benzene group, a pyridine group, a pyrimidine group, a pyrazine group, a pyridazine group, or a triazine group.

In an embodiment, ring $CY_2$ may be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a silole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In an embodiment, ring $CY_2$ may be a benzene group, a naphthalene group, a phenanthrene group, an indole group, a carbazole group, a fluorene group, a dibenzosilole group, a dibenzothiophene group, a dibenzofuran group, an azabenzosilole group, a pyridine group, a benzimidazole group, a benzoxazole group, or a benzothiazole group.

$X_{11}$ in Formula 1-1 may be Si or Ge.

$X_1$ in Formula 1-2A and 1-2B may be O, S, Se, $N(Z_{19})$, $C(Z_{19})(Z_{20})$, or $Si(Z_{19})(Z_{20})$. $Z_{19}$ and $Z_{20}$ are the same as described above.

For example, $X_1$ may be O, S, or $N(Z_{19})$.

Regarding Formulae 1-2A and 1-2B, $A_{11}$ to $A_{14}$ may each independently be C, N, C bonded to C between two N of a neighboring 5-membered ring, and C bonded to M in Formula 1, and one of $A_1$ to $A_{14}$ is C bonded to C between two N of a neighboring 5-membered ring, and one of the others of $A_{11}$ to $A_{14}$ may be C bonded to M in Formula 1.

$A_{15}$ to $A_{13}$ and $A_{21}$ to $A_{24}$ in Formulae 1-2A and 1-2B may each independently be C or N.

For example, at least one of $A_{11}$ to $A_{13}$ in Formula 1-2A and 1-2B may be N.

For example, one or two of $A_{11}$ to $A_{18}$ in Formulae 1-2A and 1-2B may be N.

In an embodiment, one or two of $A_{13}$ to $A_{13}$ in Formulae 1-2A and 1-2B may be N.

$A_{21}$ to $A_{24}$ in Formulae 1-2A and 1-2B may each independently be C or N.

In an embodiment, each of $A_{21}$ to $A_{24}$ may be C.

In one or more embodiments, at least one of $A_{21}$ to $A_{24}$ (for example, one or two of $A_{21}$ to $A_{24}$) may be N.

In one or more embodiments, one of $A_{21}$ to $A_{24}$ may be N.

$L_3$ in Formulae 1-2A and 1-2B may be a single bond, a $C_5$-$C_{30}$ carbocyclic group unsubstituted or substituted with at least one $R_{10}$, or a $C_1$-$C_{30}$ heterocyclic group unsubstituted or substituted with at least one $R_{10}$.

For example, $L_3$ may be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$.

In an embodiment, $L_3$ in Formula 1 may be:

a single bond; or a benzene group unsubstituted or substituted with at least one $R_{10a}$.

$R_2$, $R_{10}$ to $R_{13}$, $R_{21}$ to $R_{23}$, $Z_1$ to $Z_3$, $Z_{19}$, and $Z_{20}$ in Formulae 1-1, 1-2A, and 1-2B may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$. $Q_1$ to $Q_9$ are the same as described in the present specification.

For example, $R_2$, $R_{21}$ to $R_{23}$, $Z_1$ to $Z_3$, $Z_{19}$, and $Z_{20}$ in Formulae 1-1, 1-2A, and 1-2B may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$—$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof, or $N(Q_1)(Q_2)$, $—Si(Q_3)(Q_4)(Q_5)$, $—Ge(Q_3)(Q_4)(Q_5)$, $—B(Q_6)(Q_7)$, $—P(O)(Q_8)(Q_9)$, or $—P(Q_8)(Q_9)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

In an embodiment, $R_2$, $R_{10}$ to $R_{13}$, $R_{21}$ to $R_{23}$, $Z_1$ to $Z_3$, $Z_{19}$, and $Z_{20}$ may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, a group represented by one of Formulae 9-1 to 9-39, a group represented by one of Formulae 9-1 to 9-39 in which at least one hydrogen is substituted with deuterium, a group represented by one of Formulae 9-201 to 9-230, a group represented by one of Formulae 9-201 to 9-230 in which at least one hydrogen is substituted with deuterium, a group represented by one of Formulae 10-1 to 10-126, a group represented by one of Formulae 10-1 to 10-126 in which at least one hydrogen is substituted with deuterium, a group represented by one of Formulae 10-201 to 10-343, a group represented by one of Formulae 10-201 to 10-343 in which at least one hydrogen is substituted with deuterium, —Si $(Q_3)(Q_4)(Q_5)$, or $—Ge(Q_3)(Q_4)(Q_5)$ ($Q_3$ to $Q_5$ are the same as described in the present specification):
9-1
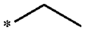
9-2
9-3
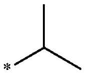
9-4
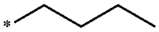
9-5
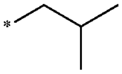
9-6
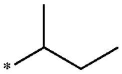
9-7
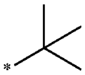
9-8
9-9
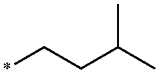
9-10
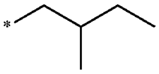
9-11
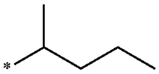
9-12
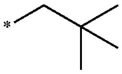
9-13
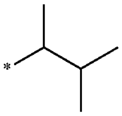
9-14
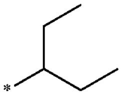
9-15
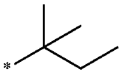
9-16
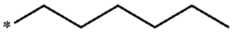
9-17
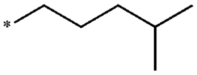
9-18
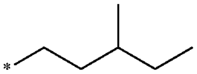
-continued
9-19
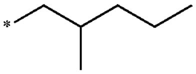
9-20
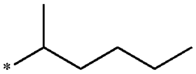
9-21
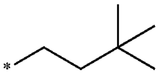
9-22
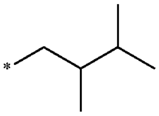
9-23
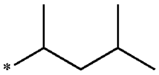
9-24
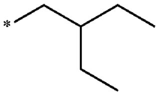
9-25
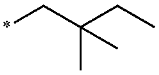
9-26
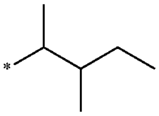
9-27
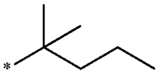
9-28
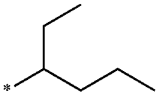
9-29
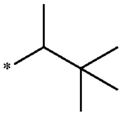
9-30
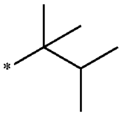
9-31
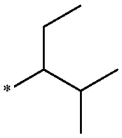
9-32
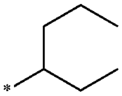

-continued
9-33
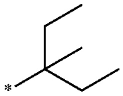
9-34
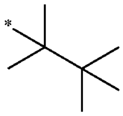
9-35
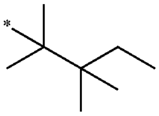
9-36
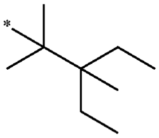
9-37
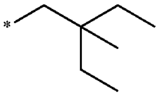
9-38
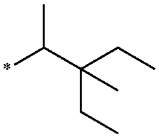
9-39
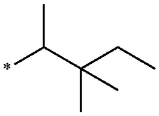
9-201
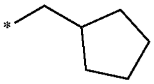
9-202
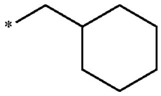
9-203
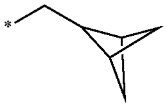
9-204
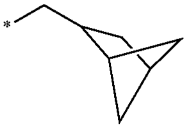
9-205
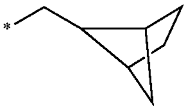
9-206
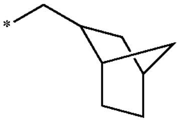
-continued
9-207
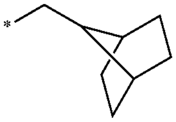
9-208
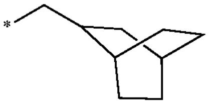
9-209
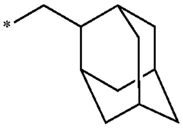
9-210
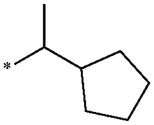
9-211
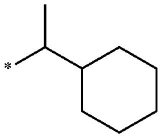
9-212
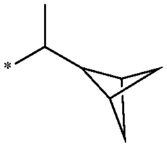
9-213
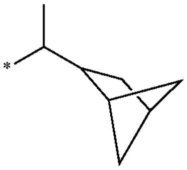
9-214
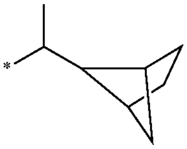
9-215
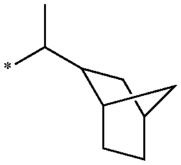
9-216
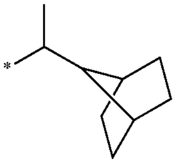

-continued
9-217
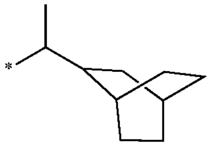
9-218
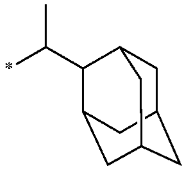
9-219
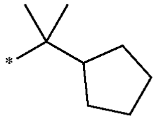
9-220
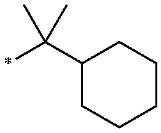
9-221
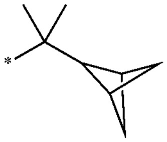
9-222
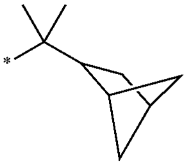
9-223
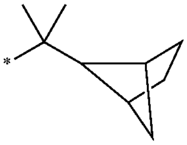
9-224
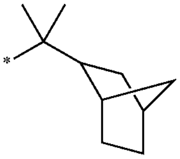
9-225
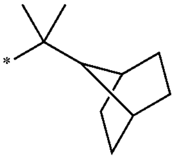
9-226
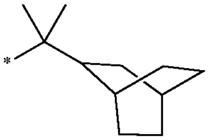
-continued
9-227
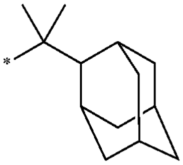
9-228
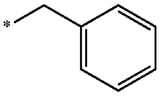
9-229
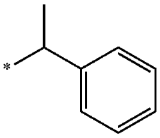
9-230
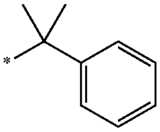
10-1
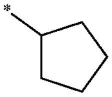
10-2
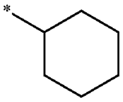
10-3
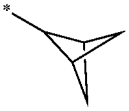
10-4
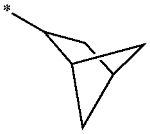
10-5
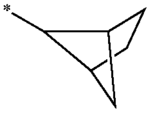
10-6
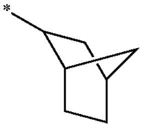
10-7
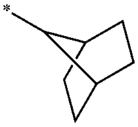
10-8
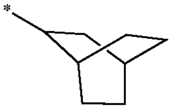

-continued
10-9
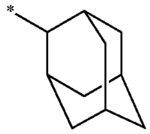
10-10
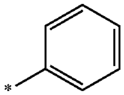
10-11
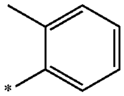
10-12
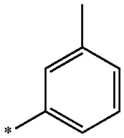
10-13
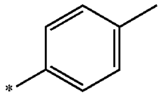
10-14
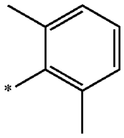
10-15
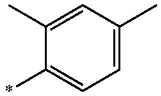
10-16
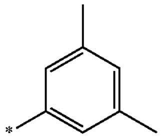
10-17
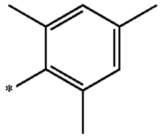
10-18
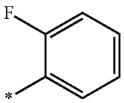
10-19
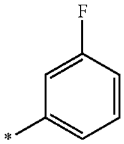
10-20
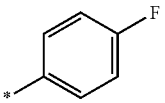
-continued
10-21
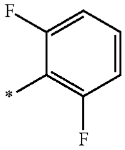
10-22
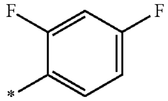
10-23
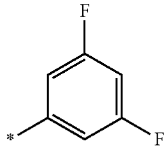
10-24
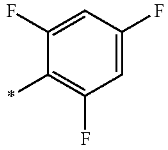
10-25
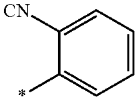
10-26
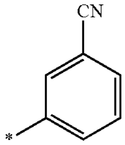
10-27
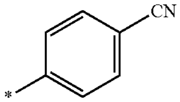
10-28
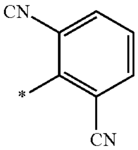
10-29
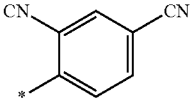
10-30
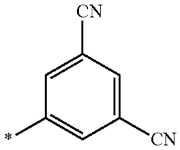
10-31
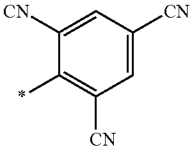

-continued
10-32
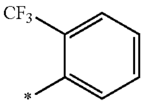
10-33
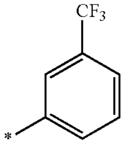
10-34
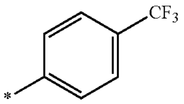
10-35
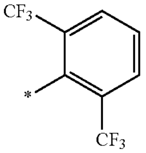
10-36
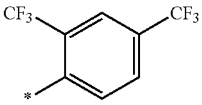
10-37
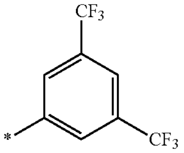
10-38
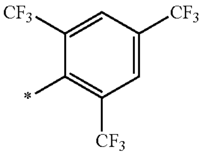
10-39
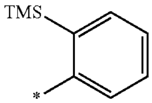
10-40
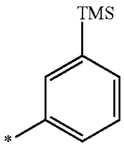
10-41
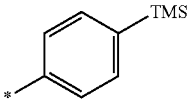
10-42
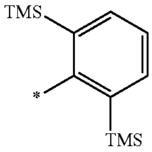
-continued
10-43
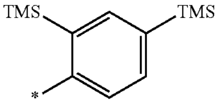
10-44
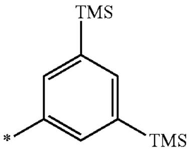
10-45
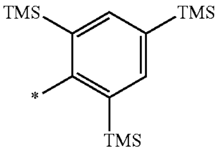
10-46
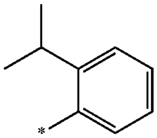
10-47
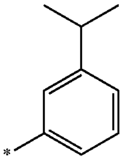
10-48
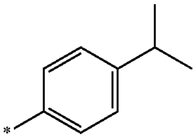
10-49
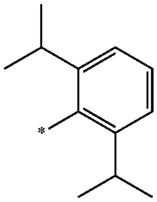
10-50
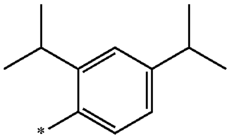
10-51
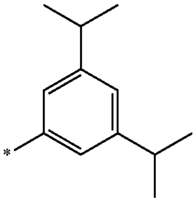

-continued
10-52
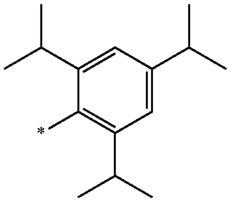
10-53
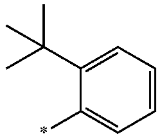
10-54
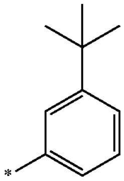
10-55
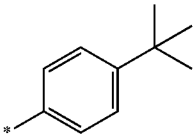
10-56
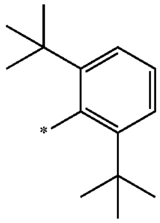
10-57
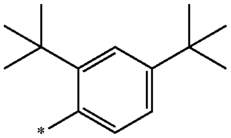
10-58
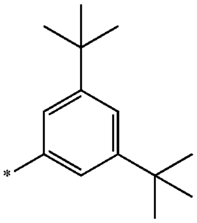
10-59
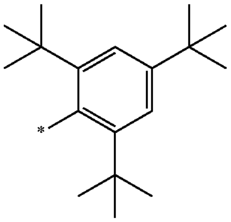
-continued
10-60
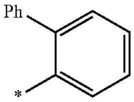
10-61
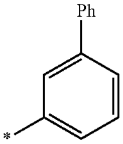
10-62
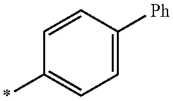
10-63
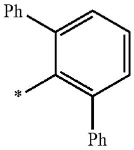
10-64
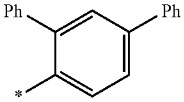
10-65
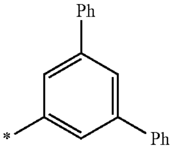
10-66
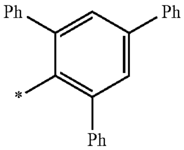
10-67
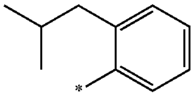
10-68
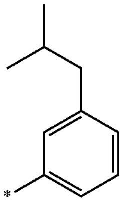
10-69
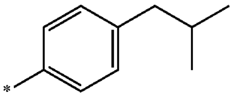

-continued
10-70
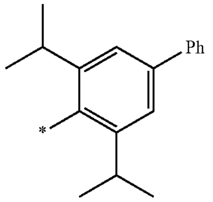
10-71
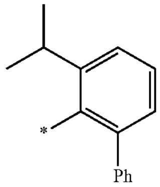
10-72
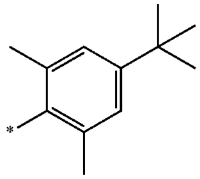
10-73
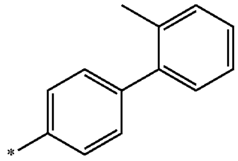
10-74
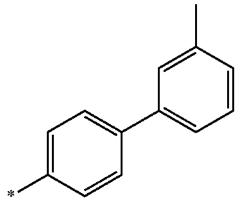
10-75
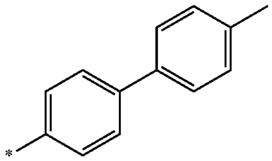
10-76
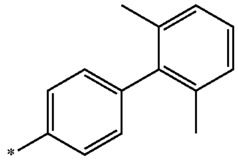
10-77
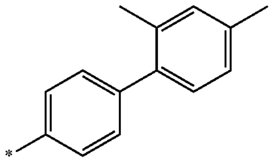
-continued
10-78
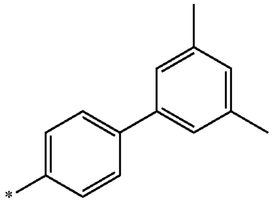
10-79
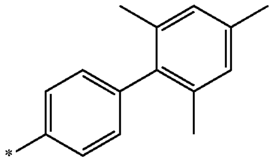
10-80
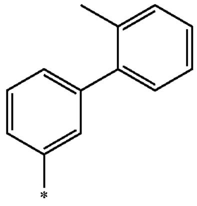
10-81
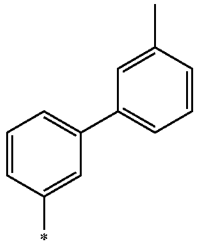
10-82
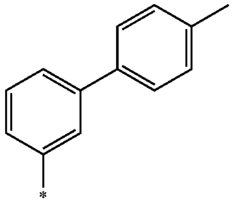
10-83
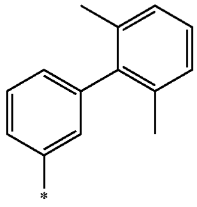
10-84
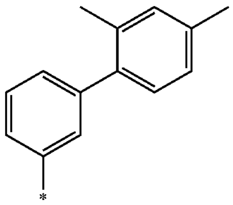

-continued
10-85
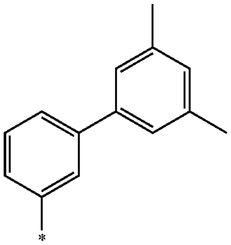
10-86
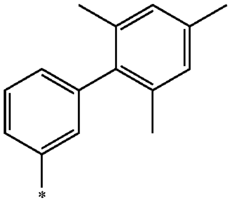
10-87
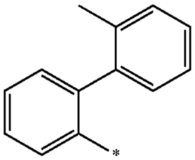
10-88
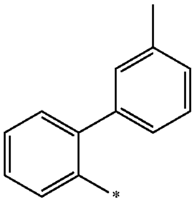
10-89
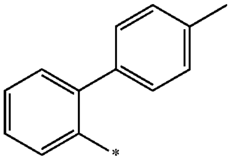
10-90
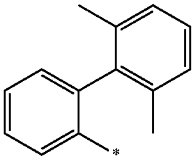
10-91
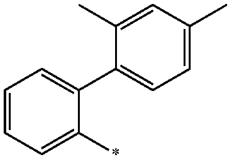
10-92
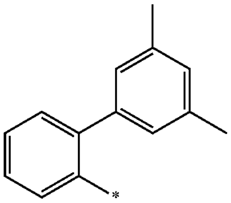
-continued
10-93
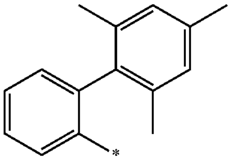
10-94
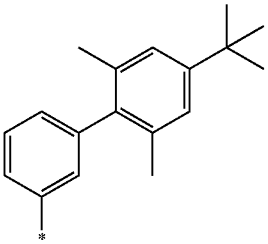
10-95
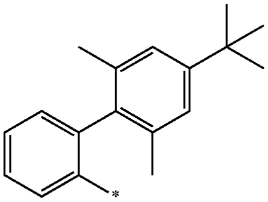
10-96
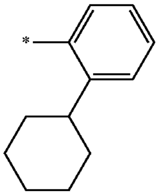
10-97
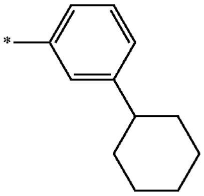
10-98
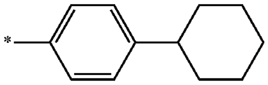
10-99
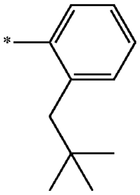
10-100
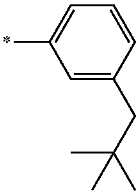

-continued
10-101
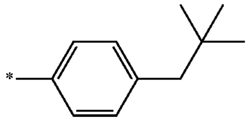
10-102
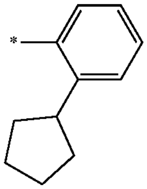
10-103
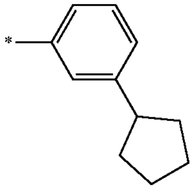
10-104
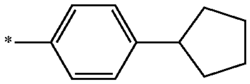
10-105
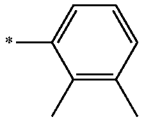
10-106
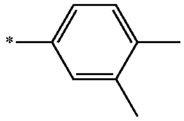
10-107
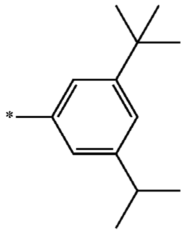
10-108
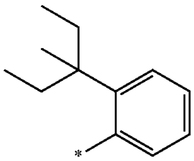
10-109
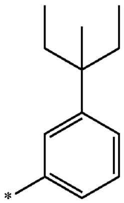
-continued
10-110
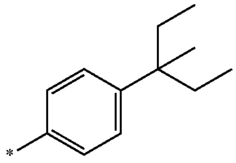
10-111
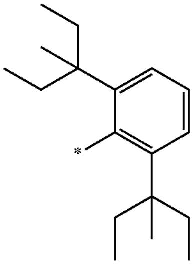
10-112
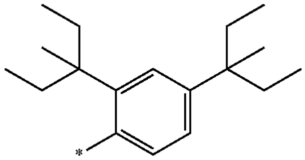
10-113
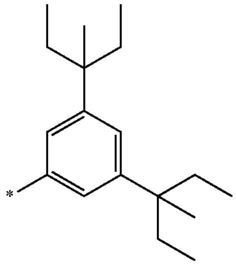
10-114
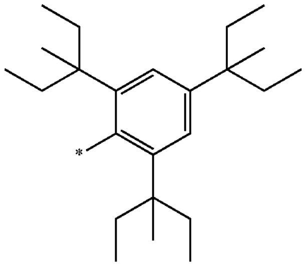
10-115
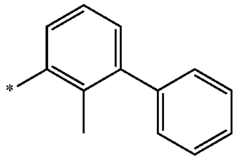
10-116
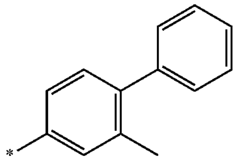

-continued
10-117
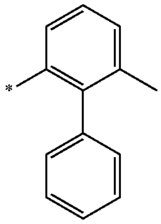
10-118
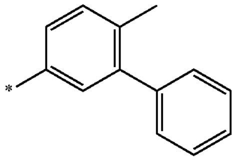
10-119
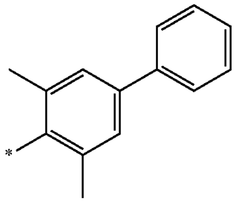
10-120
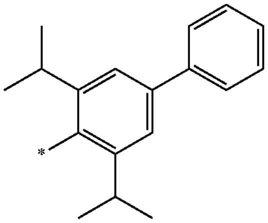
10-121
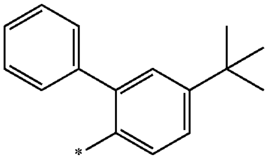
10-122
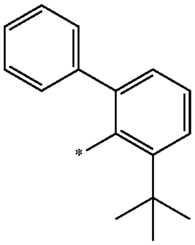
10-123
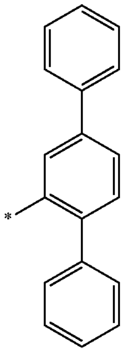
-continued
10-124
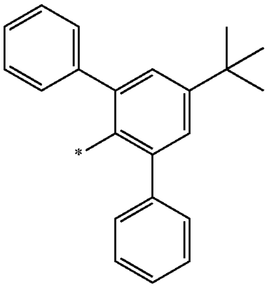
10-125
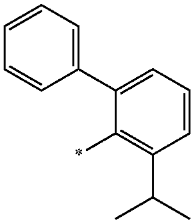
10-126
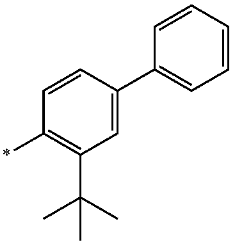
10-201
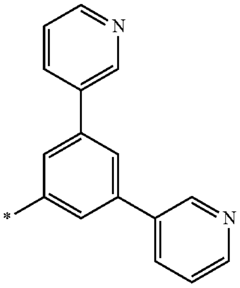
10-202
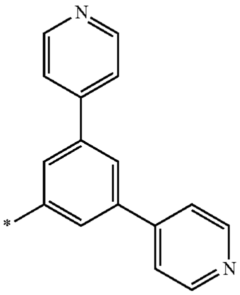

-continued
10-203
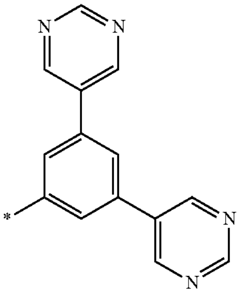
10-204
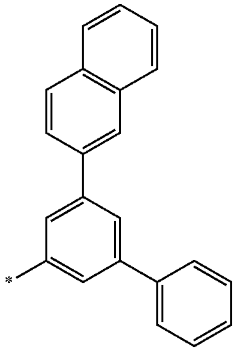
10-205
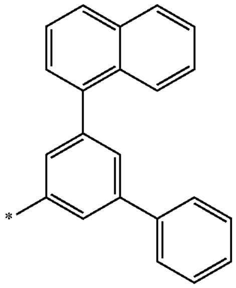
10-206
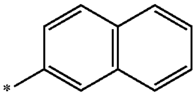
10-207
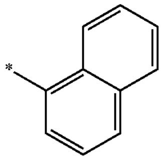
10-208
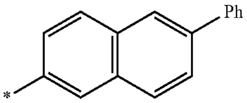
10-209
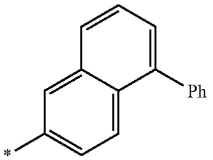
-continued
10-210
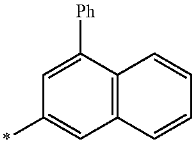
10-211
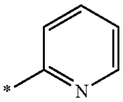
10-212
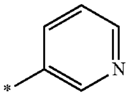
10-213
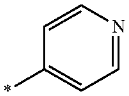
10-214
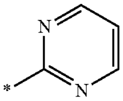
10-215
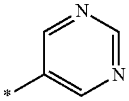
10-216
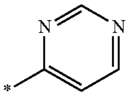
10-217
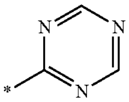
10-218
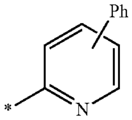
10-219
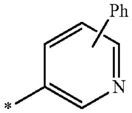
10-220
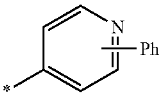
10-221
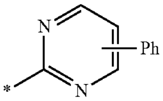
10-222
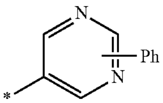

-continued
10-223
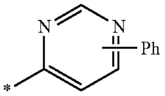
10-224
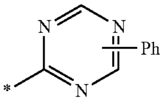
10-225
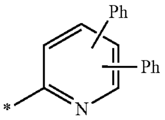
10-226
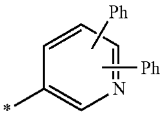
10-227
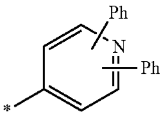
10-228
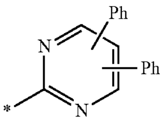
10-229
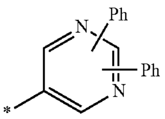
10-230
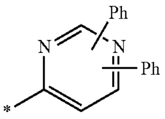
10-231
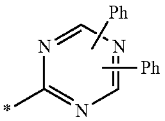
10-232
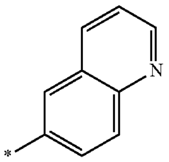
10-233
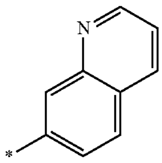
-continued
10-234
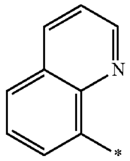
10-235
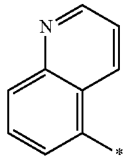
10-236
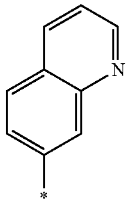
10-237
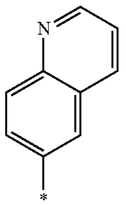
10-238
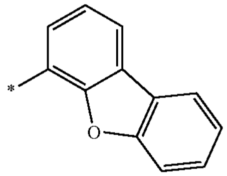
10-239
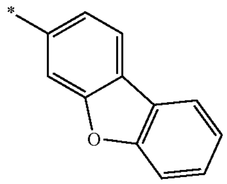
10-240
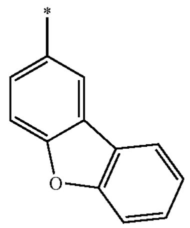
10-241
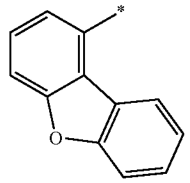

-continued
10-242
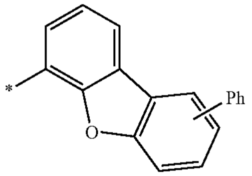
10-243
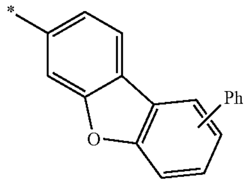
10-244
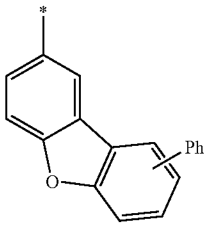
10-245
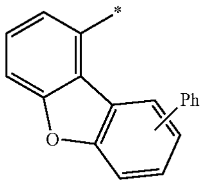
10-246
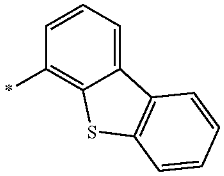
10-247
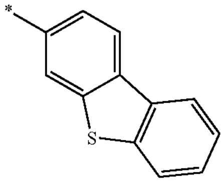
10-248
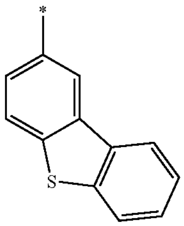
10-249
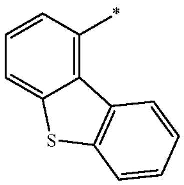
-continued
10-250
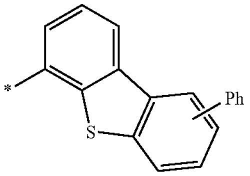
10-251
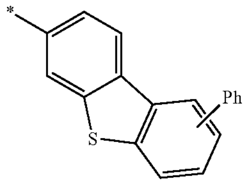
10-252
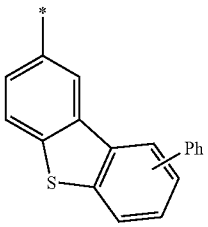
10-253
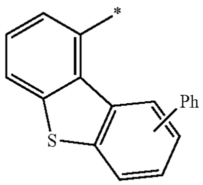
10-254
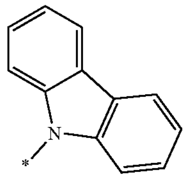
10-255
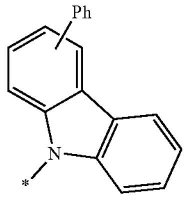
10-256
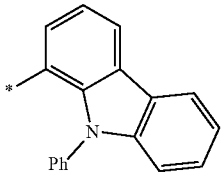
10-257
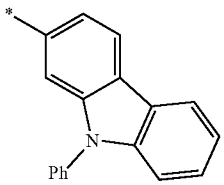

-continued
10-258
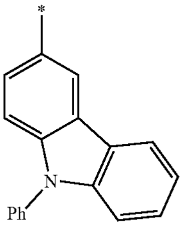
10-259
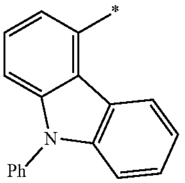
10-260
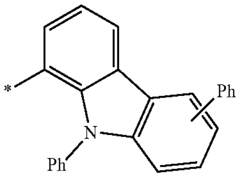
10-261
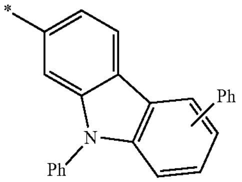
10-262
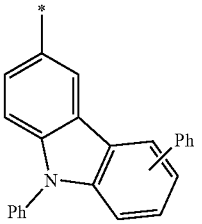
10-263
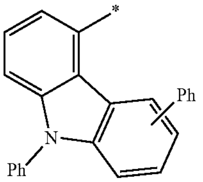
10-264
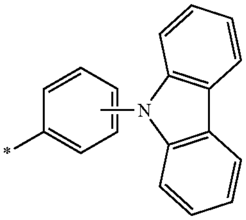
-continued
10-265
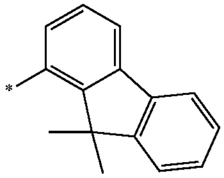
10-266
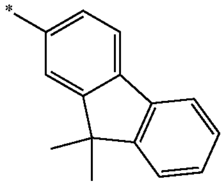
10-267
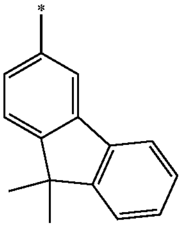
10-268
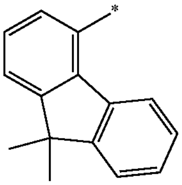
10-269
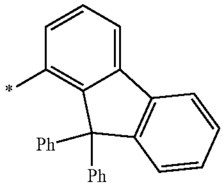
10-270
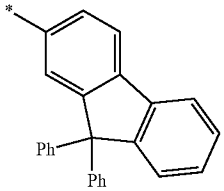
10-271
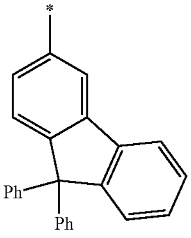

10-272
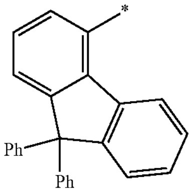
10-273
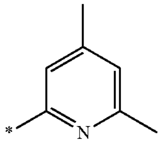
10-274
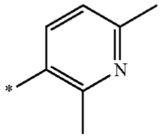
10-275
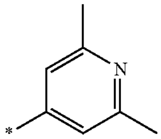
10-276
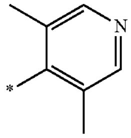
10-277
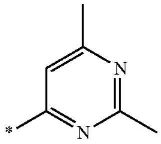
10-278
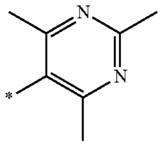
10-279
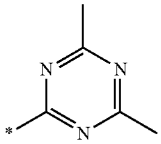
10-280
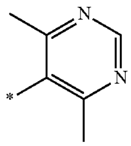
10-281
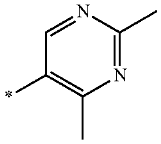
10-282
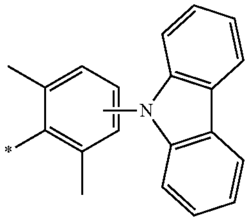
10-283
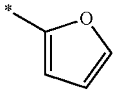
10-284
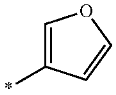
10-285
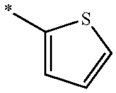
10-286
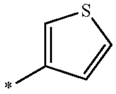
10-287
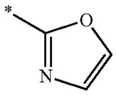
10-288
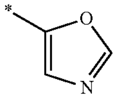
10-289
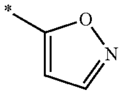
10-290
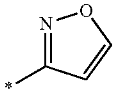
10-291
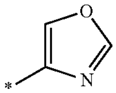
10-292
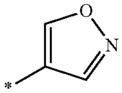
10-293
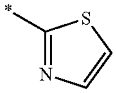
10-294
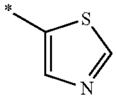

-continued
10-295
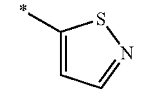
10-296
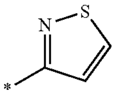
10-297
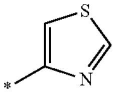
10-298
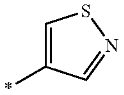
10-299
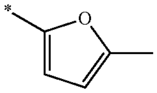
10-300
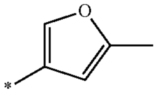
10-301
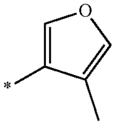
10-302
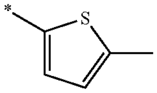
10-303
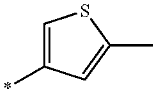
10-304
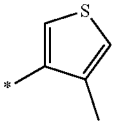
10-305
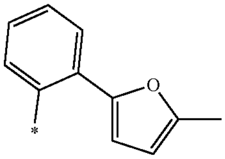
10-306
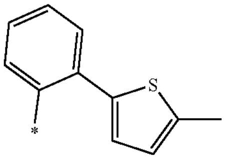
-continued
10-307
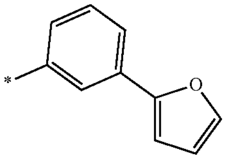
10-308
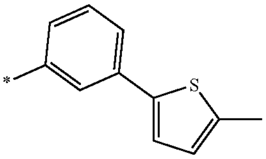
10-309
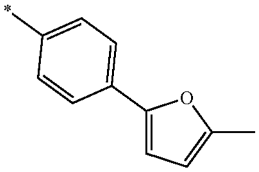
10-310
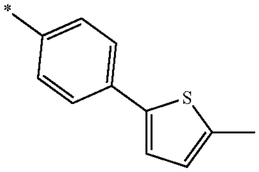
10-311
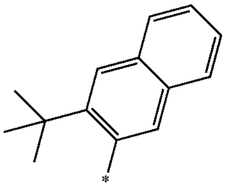
10-312
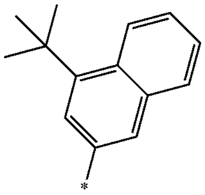
10-313
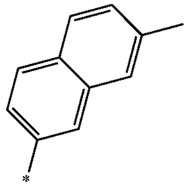
10-314
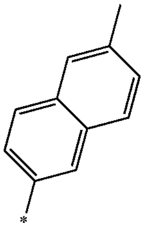

-continued
10-315
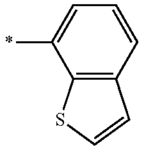
10-316
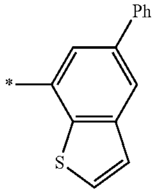
10-317
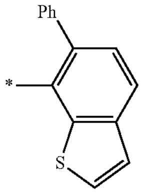
10-318
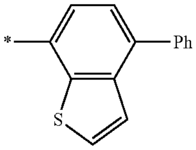
10-319
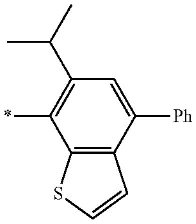
10-320
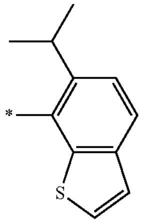
10-321
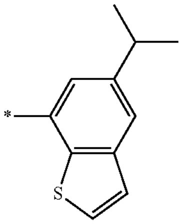
10-322
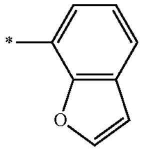
-continued
10-323
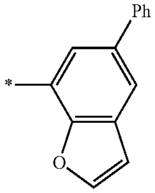
10-324
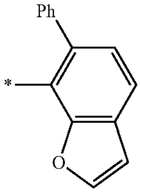
10-325
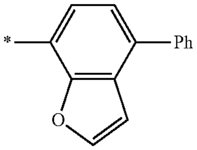
10-326
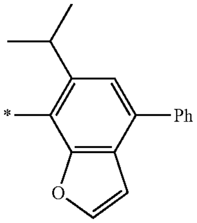
10-327
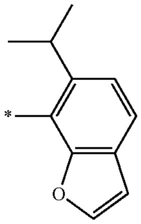
10-328
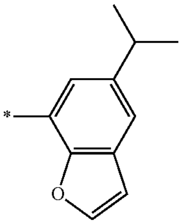
10-329
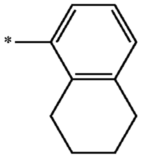

-continued 10-330

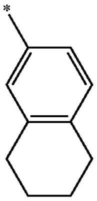

10-331

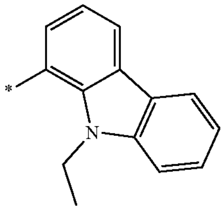

10-332

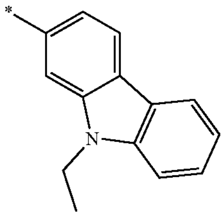

10-333

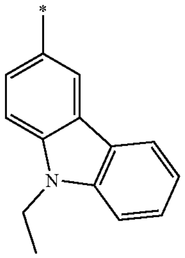

10-334

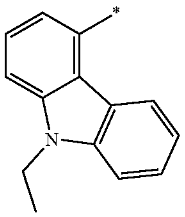

10-335

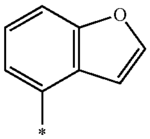

10-336

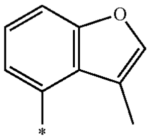

10-337

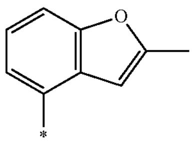

-continued 10-338

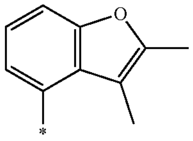

10-339

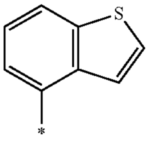

10-340

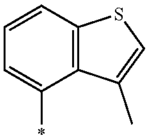

10-341

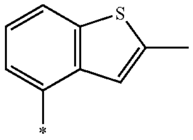

10-342

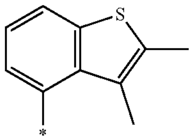

10-343

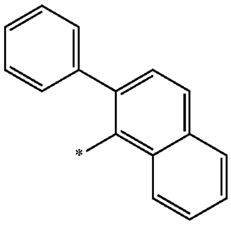

wherein, in Formulae 9-1 to 9-39, 9-201 to 9-230, 10-1 to 10-118, and 10-201 to 10-343, * indicates a binding site to a neighboring atom, Ph is a phenyl group, and TMS is a trimethylsilyl group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may be, for example, a group represented by one of Formulae 9-501 to 9-514 and 9-601 to 9-638, but embodiments of the present disclosure are not limited thereto.

9-501

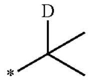

9-502

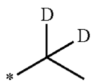

-continued
9-503
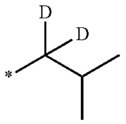
9-504
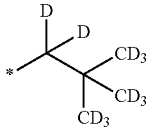
9-505
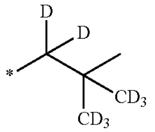
9-506
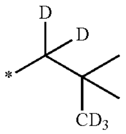
9-507
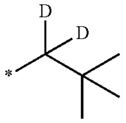
9-508
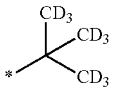
9-509
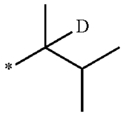
9-510
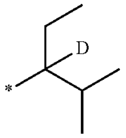
9-511
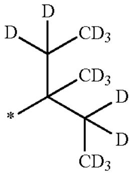
9-512
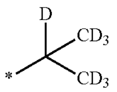
9-513
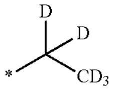
-continued
9-514
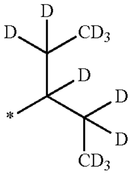
9-601
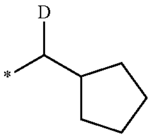
9-602
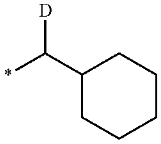
9-603
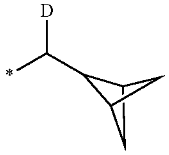
9-604
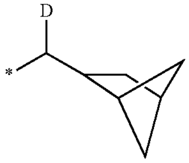
9-605
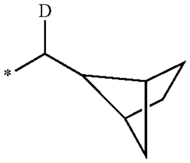
9-606
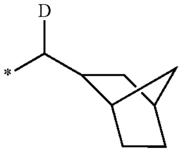
9-607
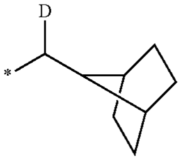
9-608
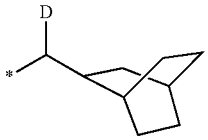

-continued
9-609
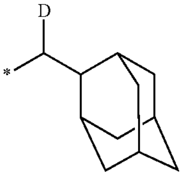
9-610
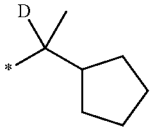
9-611
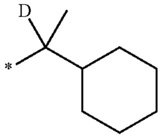
9-612
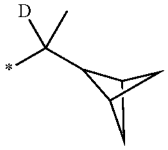
9-613
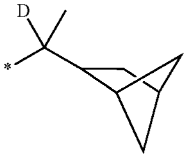
9-614
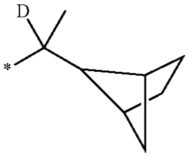
9-615
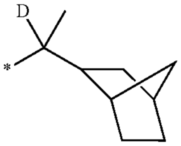
9-616
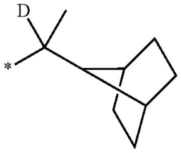
9-617
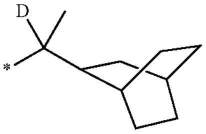
9-618
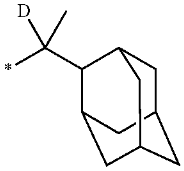
-continued
9-619
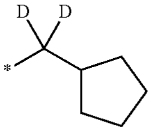
9-620
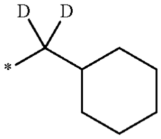
9-621
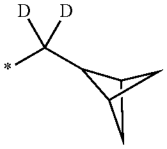
9-622
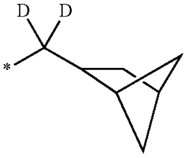
9-623
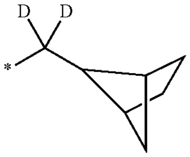
9-624
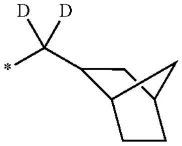
9-625
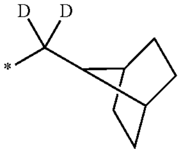
9-626
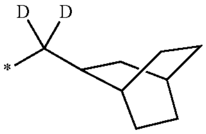
9-627
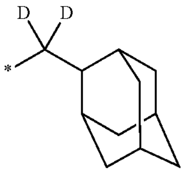
9-628
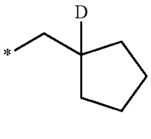

-continued
9-629
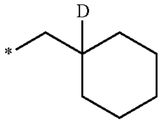
9-630
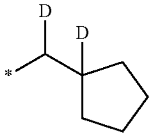
9-631
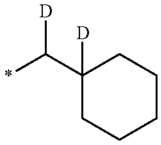
9-632
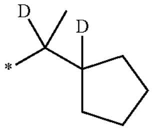
9-633
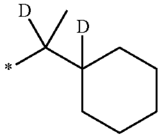
9-634
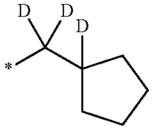
9-635
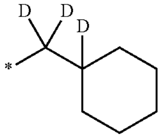
9-636
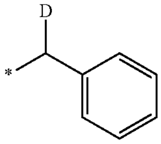
9-637
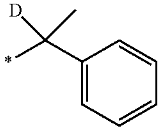
9-638
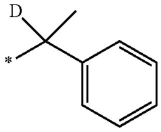
The "group represented by one of Formulae 10-1 to 10-118 in which at least one hydrogen is substituted with deuterium" and the "group represented by one of Formulae 10-201 to 10-342 in which at least one hydrogen is substituted with deuterium" may be, for example, a group represented by one of Formulae 10-501 to 10-553 but these groups are not limited thereto.
10-501
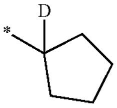
10-502
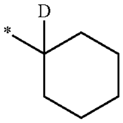
10-503
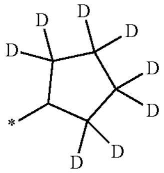
10-504
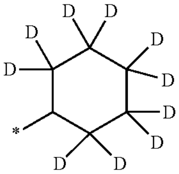
10-505
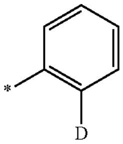
10-506
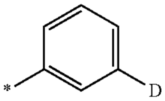
10-507
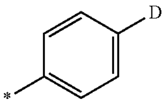
10-508
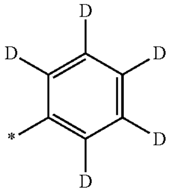
10-509
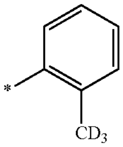
10-510
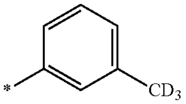

-continued
10-511
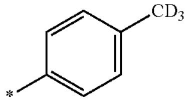
10-512
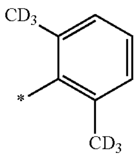
10-513
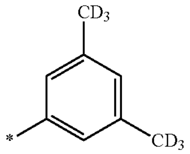
10-514
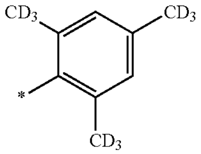
10-515
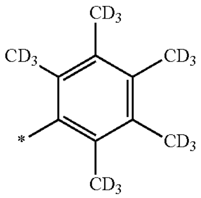
10-516
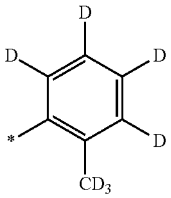
10-517
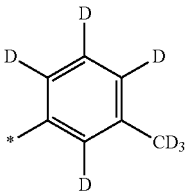
10-518
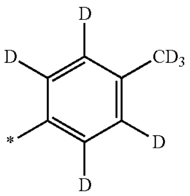
10-519
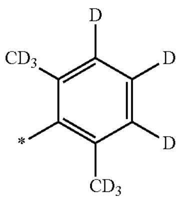
-continued
10-520
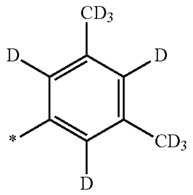
10-521
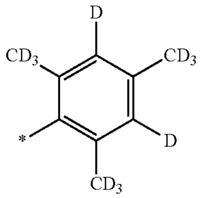
10-522
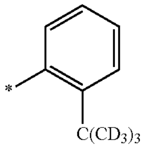
10-523
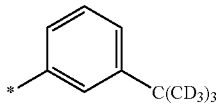
10-524
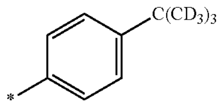
10-525
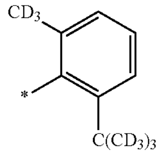
10-526
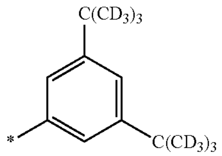
10-527
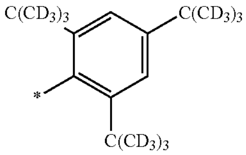
10-528
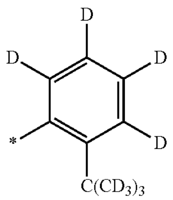

-continued
10-529
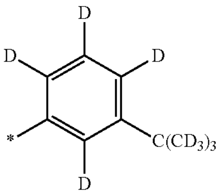
10-530
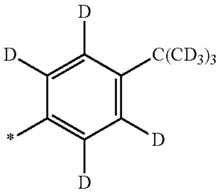
10-531
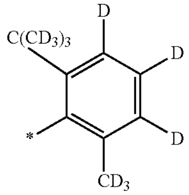
10-532
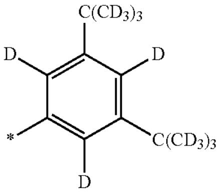
10-533
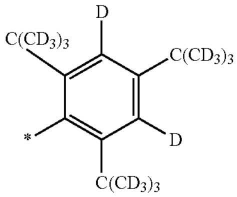
10-534
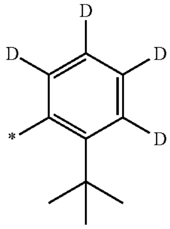
10-535
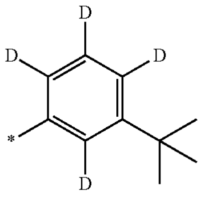
-continued
10-536
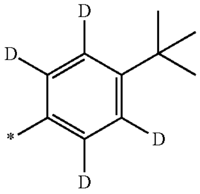
10-537
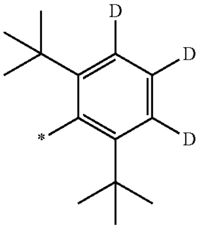
10-538
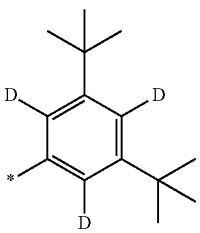
10-540
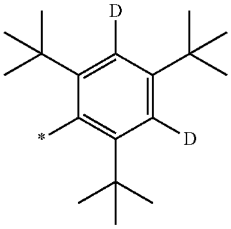
10-541
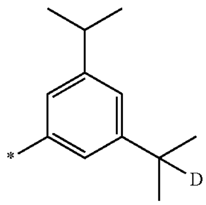
10-542
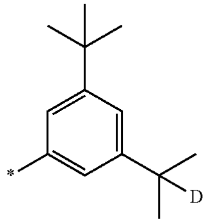
10-543
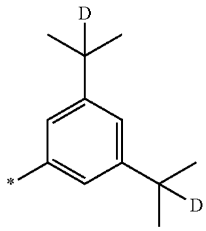

-continued 10-544

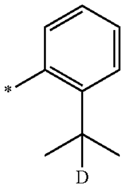

10-545

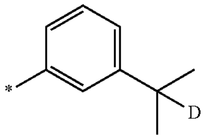

10-546

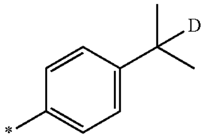

10-547

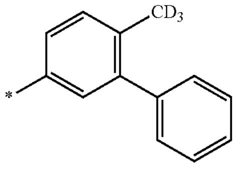

10-548

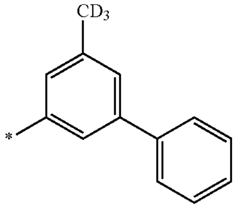

10-549

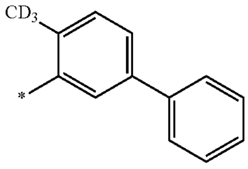

10-550

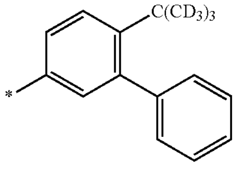

10-551

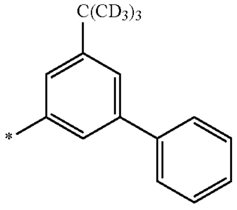

-continued 10-552

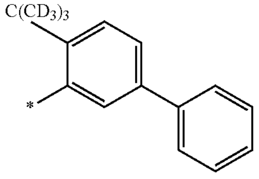

10-553

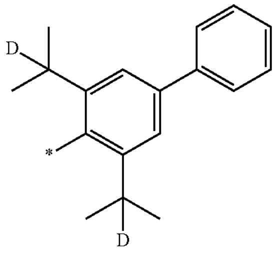

a2, b1, and b2 in Formulae 1-1, 1-2A, and 1-2B indicates the number of $R_2$(s), the number of $Z_1$(s), and the number of $Z_2$(s), respectively, and a2 may be an integer from 0 to 20 (for example, an integer from 0 to 10), b1 may be an integer from 0 to 6, and b2 may be an integer from 0 to 4. When a2 is 2 or more, two or more of $R_2$(s) may be identical to or different from each other, when b1 is 2 or more, two or more of $Z_1$(s) may be identical to or different from each other, and when b2 is 2 or more, two or more of $Z_2$(s) may be identical to or different from each other.

In an embodiment, $R_{10}$ to $R_{13}$ in Formula 1-1 may each independently be hydrogen, deuterium, a $C_1$-$C_{20}$ alkyl group, a deuterium-containing $C_1$-$C_{20}$ alkyl group, a $C_3$-$C_{10}$ cycloalkyl group, or a deuterium-containing $C_3$-$C_{10}$ cycloalkyl group.

In one or more embodiments, $R_{10}$ to $R_{13}$ in Formula 1-1 may each independently be hydrogen, deuterium, —F, —Cl, —Br, —I, a cyano group, a substituted or unsubstituted $C_1$-$C_{60}$ alkyl group, or a substituted or unsubstituted $C_3$-$C_{10}$ cycloalkyl group.

In one or more embodiments, $R_{10}$ to $R_{13}$ in Formula 1-1 may each independently be:

hydrogen, deuterium, —F, or a cyano group, a $C_1$-$C_{20}$ alkyl group unsubstituted or substituted with deuterium, —F, a cyano group, a $C_3$-$C_{10}$ cycloalkyl group, a ($C_1$-$C_{20}$ alkyl)$C_3$-$C_{10}$ cycloalkyl group, or any combination thereof; or a $C_3$-$C_{10}$ cycloalkyl group unsubstituted or substituted with deuterium, —F, a cyano group, a $C_1$-$C_{20}$ alkyl group, or any combination thereof.

In one or more embodiments, $R_{10}$ to $R_{13}$ in Formula 1-1 may each independently be:

hydrogen, deuterium, —F, or a cyano group;

a $C_1$-$C_{20}$ alkyl group unsubstituted or substituted with deuterium, —F, a cyano group, a cyclopentyl group, a cyclohexyl group, a cycloheptyl group, a cyclooctyl group, an adamantanyl group, a norbornanyl group, a norbornenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, or any combination thereof; or a cyclopentyl group, a cyclohexyl group, a cycloheptyl group, a cyclooctyl group, an adamantanyl group, a norbornanyl group, a norbornenyl group, a bicyclo[1.1.1]pentyl group, a bicyclo[2.1.1]hexyl group, a bicyclo[2.2.1]heptyl group, or a bicyclo[2.2.2]octyl group, each unsubstituted or substituted with deuterium, —F, a cyano group, a $C_1$-$C_{20}$ alkyl group, or any combination thereof.

In one or more embodiments, $R_2$, $R_{10}$ to $R_{13}$ and $Z_1$ in Formulae 1-1, 1-2A, and 1-2B may each independently be:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterium-containing $C_1$-$C_{20}$ alkyl group, a $C_3$-$C_{10}$ cycloalkyl group, a ($C_1$-$C_{20}$ alkyl)$C_3$-$C_{10}$ cycloalkyl group, a phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In an embodiment, regarding Formulae 1-1, 1-2A, and 1-2B, at least one of $R_2$ in the number of a2, $R_{11}$ to $R_{13}$, $Z_1$ in the number of b1, $Z_2$ in the number of b2, and $Z_3$ may not be hydrogen.

In one or more embodiments, $Z_2$ in Formulae 1-2A and 1-2B may be hydrogen, deuterium, a $C_1$-$C_{20}$ alkyl group, or a deuterium-containing $C_1$-$C_{20}$ alkyl group.

In one or more embodiments, $R_{11}$ in Formula 1-1 may not be hydrogen.

In one or more embodiments, $R_{11}$ in Formula 1-1 may not be hydrogen or a methyl group.

In one or more embodiments, $R_{11}$ in Formula 1-1 may not be hydrogen, a methyl group, or a cyano group.

In one or more embodiments, $R_{11}$ in Formula 1-1 may not be hydrogen, and $R_{12}$ and $R_{13}$ may each be hydrogen.

In one or more embodiments, $R_{11}$ in Formula 1-1 may be a group containing 4 or more carbons.

In one or more embodiments, $R_{21}$ to $R_{23}$ in Formula 1-1 may each independently be a $C_1$-$C_{60}$ alkyl group or a $C_6$-$C_{60}$ aryl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, or any combination thereof.

In one or more embodiments, $R_{21}$ to $R_{23}$ in Formula 1-1 may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a biphenyl group, or a naphthyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, or any combination thereof.

In one or more embodiments, $R_{21}$ to $R_{23}$ in Formula 1-1 may each independently be —$CH_3$, —$CH_2CH_3$, —$CD_3$, —$CD_2H$, —$CDH_2$, —$CH_2CD_3$, or —$CD_2CH_3$.

In one or more embodiments, $R_{21}$ to $R_{23}$ in Formula 1-1 may be identical to or different from each other.

In one or more embodiments, $R_{11}$ in Formula 1-1 may be:

a methyl group substituted with deuterium, —F, a cyano group, a $C_1$-$C_{20}$ alkyl group, a deuterium-containing $C_1$-$C_{20}$ alkyl group, a $C_3$-$C_{10}$ cycloalkyl group, a ($C_1$-$C_{20}$ alkyl)$C_3$-$C_{10}$ cycloalkyl group, a phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof, or a $C_2$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterium-containing $C_1$-$C_{20}$ alkyl group, a $C_3$-$C_{10}$ cycloalkyl group, a ($C_1$-$C_{20}$ alkyl)$C_3$-$C_{10}$ cycloalkyl group, a phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In one or more embodiments, regarding Formulae 1-2A and 1-2B, $L_3$ may be:

a single bond; or a benzene group, a naphthalene group, a phenanthrene group, a dibenzofuran group, or a dibenzothiophene group, each unsubstituted or substituted with deuterium, a $C_1$-$C_{20}$ alkyl group, a deuterium-containing $C_1$-$C_{20}$ alkyl group, a phenyl group, a ($C_1$-$C_{20}$alkyl)phenyl group, a naphthyl group, a ($C_1$-$C_{20}$ alkyl)naphthyl group, a phenanthrenyl group, a ($C_1$-$C_{20}$ alkyl)phenanthrenyl group, a dibenzofuranyl group, a dibenzothiophenyl group, or any combination thereof, $Z_3$ may be:

hydrogen, deuterium, or a $C_1$-$C_{20}$ alkyl group; or a phenyl group, a naphthyl group, a phenanthrenyl group, a dibenzofuranyl group, or a dibenzothiophenyl group, each unsubstituted or substituted with deuterium, a $C_1$-$C_{20}$ alkyl group, a deuterium-containing $C_1$-$C_{20}$ alkyl group, a phenyl group, a ($C_1$-$C_{20}$ alkyl)phenyl group, a naphthyl group, a ($C_1$-$C_{20}$ alkyl)naphthyl group, a phenanthrenyl group, a ($C_1$-$C_{20}$ alkyl)phenanthrenyl group, a dibenzofuranyl group, a dibenzothiophenyl group, or any combination thereof.

In one or more embodiments, $Z_1$ in Formulae 1-2A and 1-2B may not be hydrogen, and b1 may be an integer from 1 to 6.

In one or more embodiments, $Z_2$ in Formulae 1-2A and 1-2B may not be hydrogen, and b2 may be an integer from 1 to 4.

In one or more embodiments, $Z_3$ may be a $C_6$-$C_{20}$ aryl group simultaneously substituted with at least one $C_1$-$C_{20}$ alkyl group and at least one $C_6$-$C_{20}$ aryl group.

In one or more embodiments, the organometallic compound represented by Formula 1 may include at least one deuterium.

In one or more embodiments, the organometallic compound represented by Formula 1 may satisfy at least one of <Condition 1> to <Condition 6>:

Condition 1

$R_1$ may not be hydrogen, and may include at least one deuterium.

Condition 2

At least one of $R_{11}$ to $R_{13}$ may not be hydrogen, and may include at least one deuterium.

Condition 3

At least one of $R_2$(s) in the number of a2 may not be hydrogen, and may include at least one deuterium.

Condition 4

$L_3$ may not be a single bond, and may include at least one deuterium.

Condition 5

$Z_3$ may not be hydrogen, and may include at least one deuterium.

Condition 6

At least one of $Z_1$(s) in the number of b1 may not be hydrogen, and may include at least one deuterium.

Regarding Formulae 1-1, 1-2A, and 1-2B, i) $R_{11}$ and $R_{12}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $Z_1$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) two or more of a plurality of $Z_2$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ may be the same as described in connection with $Z_1$. For example, $R_{10a}$ may be the same as described in connection with $Z_1$, except that $R_{10a}$ may not be hydrogen.

Each of * and *' in Formulae 1-1, 1-2A and 1-2B is a binding site to a neighboring atom.

The terms "the $C_5$-$C_{30}$ carbocyclic group (unsubstituted or substituted with at least one $R_{10a}$)" and "the $C_1$-$C_{30}$ heterocyclic group (unsubstituted or substituted with at least one $R_{10a}$)" may refer to, for example, a cyclopentane group, a silole group, an azasilole group, a diazasilole group, a triazasilole group, an adamantane group, norbornane(norbornane) group, norbornene group, a bicyclo[1.1.1]pentane group, a bicyclo[2.1.1]hexane group, a bicyclo[2.2.1]heptane group, a bicyclo[2.2.2]octane group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each (unsubstituted or substituted with at least one $R_{10a}$).

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched C alkyl group, for example, a tert-butyl group that is substituted with two methyl groups.

Examples of the $C_1$-$C_{60}$ alkoxy group, a $C_1$-$C_{20}$ alkoxy group or $C_1$-$C_{10}$ alkoxy group are a methoxy group, an ethoxy group, a propoxy group, a butoxy group, and a pentoxy group.

Examples of the "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, and a bicyclo[2.2.2]octyl group.

The term "deuterium-containing $C_1$-$C_{60}$ alkyl group (or a deuterium-containing $C_1$-$C_{20}$ alkyl group, a deuterium-containing $C_2$-$C_{20}$ alkyl group, etc.)" as used herein refers to a $C_1$-$C_{60}$ alkyl group substituted with at least one deuterium (or, a $C_1$-$C_{20}$ alkyl group substituted with at least one deuterium or a $C_2$-$C_{20}$ alkyl substituted with at least one deuterium). Examples of the "deuterium-containing $C_1$ alkyl group (that is, a deuterium-containing a methyl group)" are $—CD_3$, $—CD_2H$, and $—CDH_2$.

The term "deuterium-containing $C_3$-$C_{10}$ cycloalkyl group" as used herein refers to a $C_3$-$C_{10}$ cycloalkyl group substituted with at least one deuterium. Examples of the "deuterium-containing $C_3$-$C_{10}$ cycloalkyl group" are Formula 10-501 and the like.

The term "the ($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group.

The term "($C_1$-$C_{20}$ alkyl)phenyl group" as used herein refers to a phenyl group substituted with at least one $C_1$-$C_{20}$ alkyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one carbon ring-forming carbons is substituted with nitrogen.

In an embodiment, a group represented by

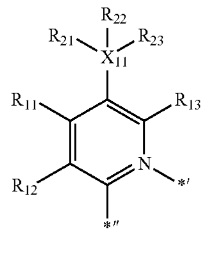

in Formula 1-1 may be a group represented by Formula 1-1(1) or 1-1(2):

Formula 1-1(1)

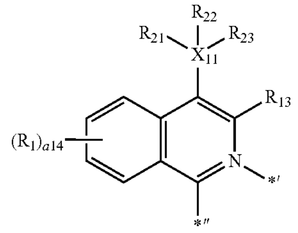

Formula 1-1(2)

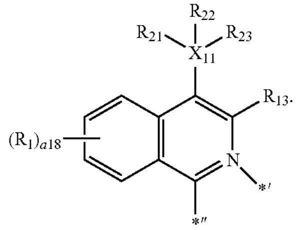

In Formulae 1-1(1) and 1-1(2), $X_{11}$, $R_{13}$ and $R_{21}$ to $R_{23}$ are the same as described in the present specification, $R_1$ is the same as described in connection with $R_{12}$, a14 may be an integer from 0 to 4, a18 may be an integer from 0 to 8,

*' indicates a binding site to M in Formula 1, and

*" is a binding site to a neighboring atom in Formula 1-1.

In one or more embodiments, a group represented by

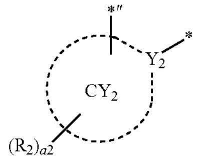

in Formula 1-1 may be a group represented by one of Formula CY2-1 to CY2-33:

CY2-1

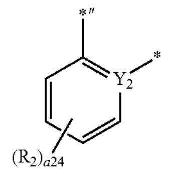

CY2-2

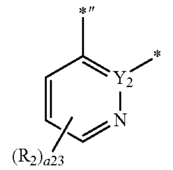

CY2-3

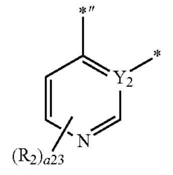

-continued
CY2-4
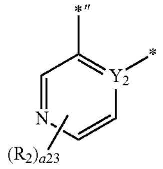
CY2-5
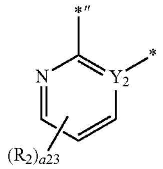
CY2-6
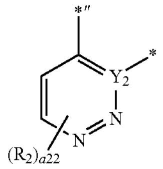
CY2-7
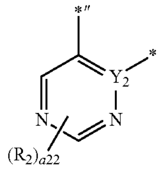
CY2-8
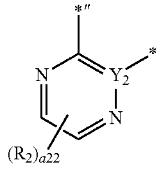
CY2-9
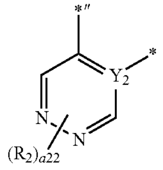
CY2-10
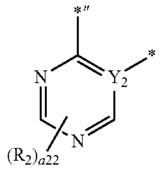
CY2-11
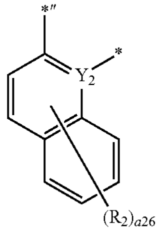
-continued
CY2-12
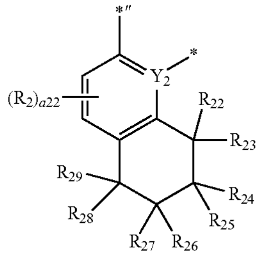
CY2-13
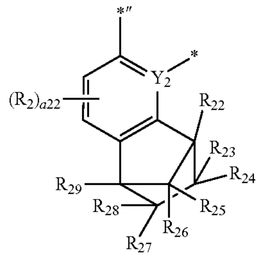
CY2-14
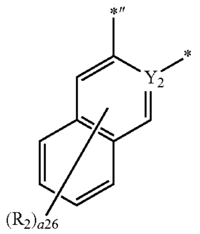
CY2-15
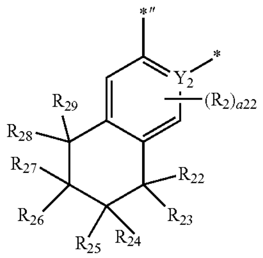
CY2-16
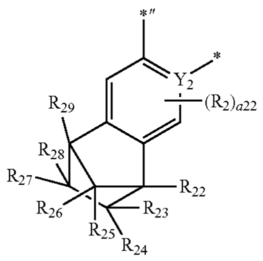
CY2-17
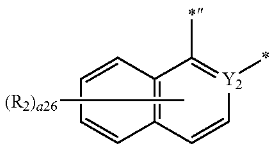

-continued
CY2-18
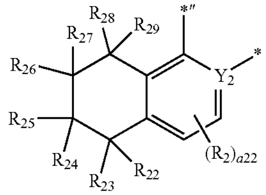
CY2-19
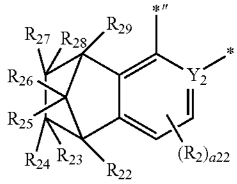
CY2-20
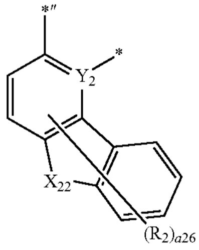
CY2-21
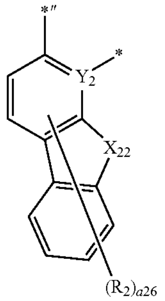
CY2-22
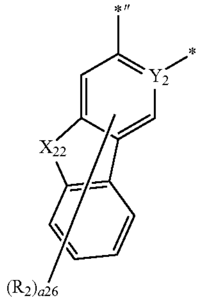
CY2-23
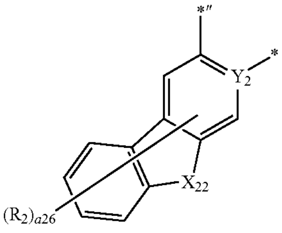
-continued
CY2-24
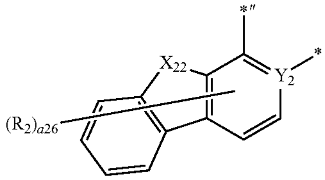
CY2-25
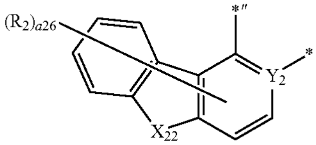
CY2-26
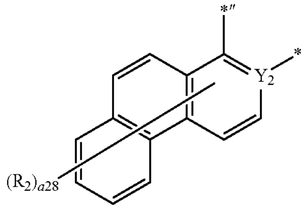
CY2-27
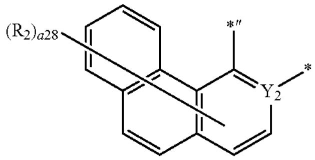
CY2-28
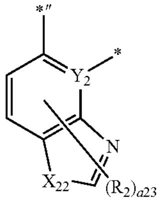
CY2-29
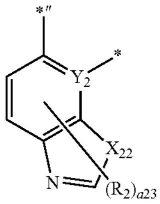
CY2-30
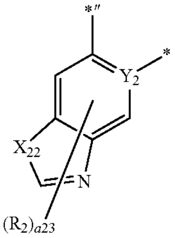
CY2-31
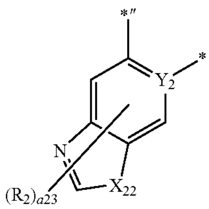

-continued

CY2-32

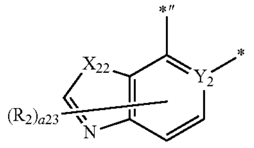

CY2-33

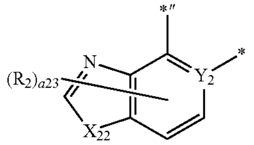

In Formulae CY2-1 to CY2-33, $Y_2$ and $R_2$ are the same as described in the present specification, $X_{22}$ may be $C(R_{22})(R_{23})$, $N(R_{22})$, O, S, or $Si(R_{22})(R_{23})$, $R_{22}$ to $R_{29}$ are the same as described in connection with $R_2$, a28 may be an integer from 0 to 8, a26 may be an integer from 0 to 6, a24 may be an integer from 0 to 4, a23 may be an integer from 0 to 3, a22 may be an integer from 0 to 2,

*" is a binding site to a neighboring atom in Formula 1-1, and

* is a binding site to M in Formula 1.

In one or more embodiments, a group represented by

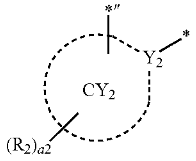

in Formula 1-1 may be a group represented by one of Formulae CY2(1) to CY2(56) or a group represented by one of Formulae CY2-11 to CY2-33:

CY2(1)

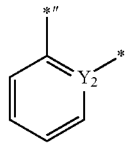

CY2(2)

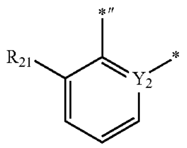

CY2(3)

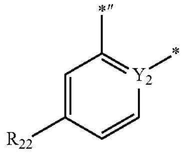

-continued

CY2(4)

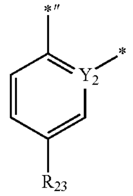

CY2(5)

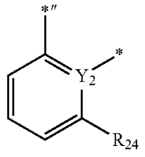

CY2(6)

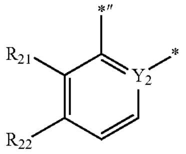

CY2(7)

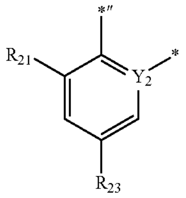

CY2(8)

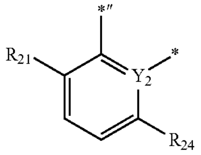

CY2(9)

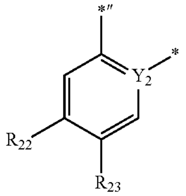

CY2(10)

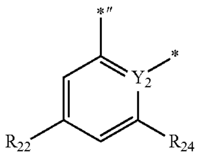

CY2(11)

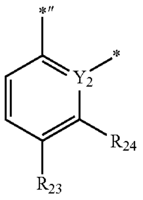

-continued
CY2(12)
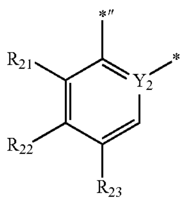
CY2(13)
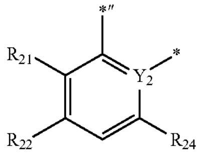
CY2(14)
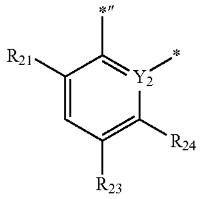
CY2(15)
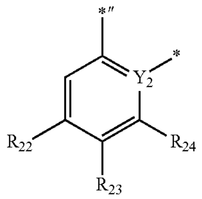
CY2(16)
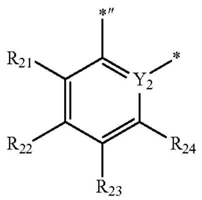
CY2(17)
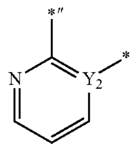
CY2(18)
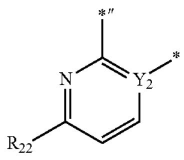
CY2(19)
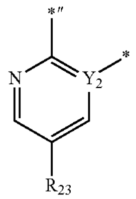
-continued
CY(20)
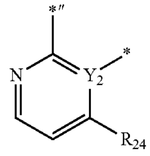
CY(21)
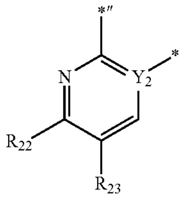
CY(22)
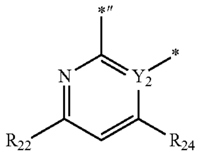
CY(23)
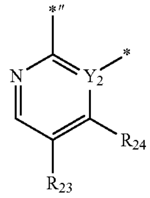
CY(24)
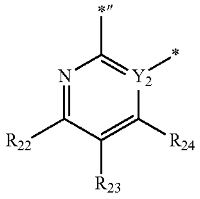
CY2(25)
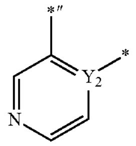
CY2(26)
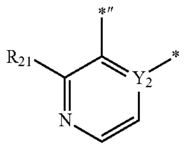
CY2(27)
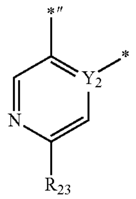
CY2(28)
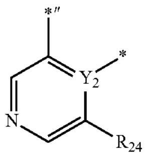

CY2(29)
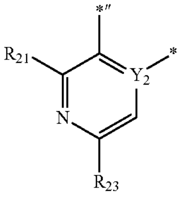
CY2(30)
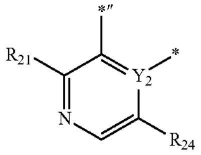
CY2(31)
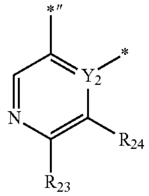
CY2(32)
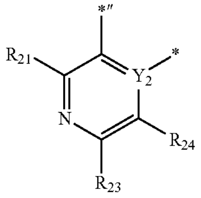
CY2(33)
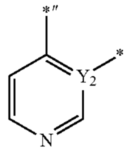
CY2(34)
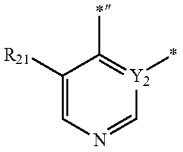
CY2(35)
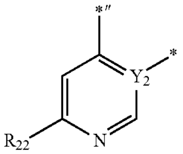
CY2(36)
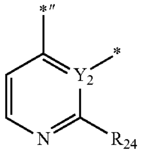
CY2(37)
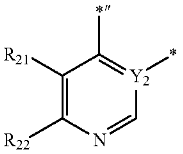
CY2(38)
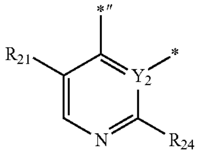
CY2(39)
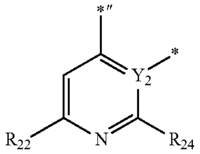
CY2(40)
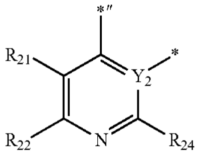
CY2(41)
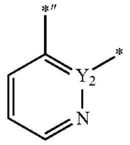
CY2(42)
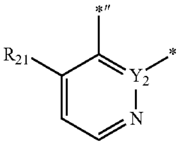
CY2(43)
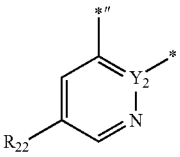
CY2(44)
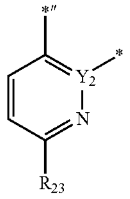
CY2(45)
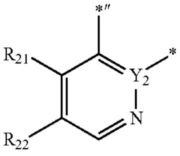
CY2(46)
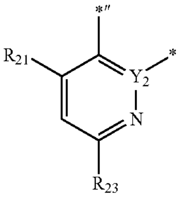

-continued

CY2(47)

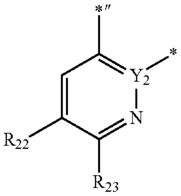

CY2(48)

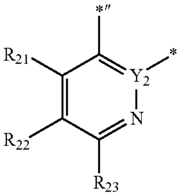

CY2(49)

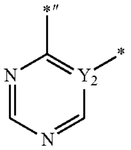

CY2(50)

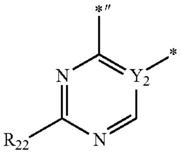

CY2(51)

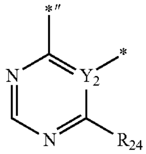

CY2(52)

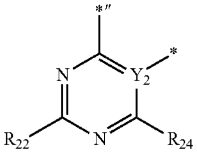

CY2(53)

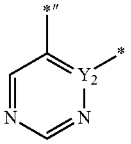

CY2(54)

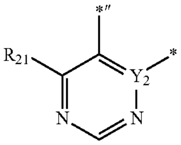

CY2(55)

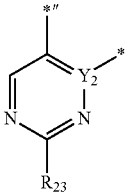

-continued

CY2(56)

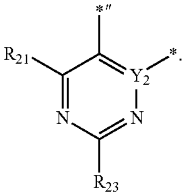

In Formulae CY2(1) to CY2(56), $Y_2$ is C, $R_{21}$ to $R_{24}$ are the same as described in connection with $R_2$, and $R_{21}$ to $R_{24}$ may each not be hydrogen,

*" is a binding site to a neighboring atom in Formula 1-1, and

* is a binding site to M in Formula 1.

In one or more embodiments, a group represented by

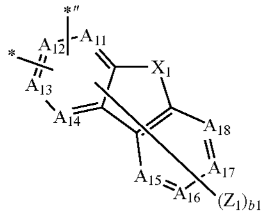

in Formulae 1-2A and 1-2B may be a group represented by one of Formulae CY3-1 to CY3-6:

CY3-1

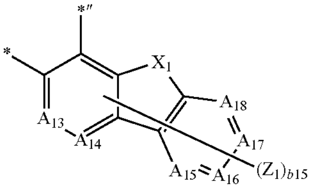

CY3-2

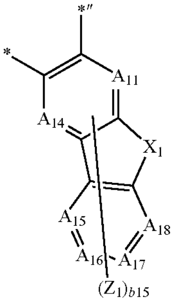

CY3-3

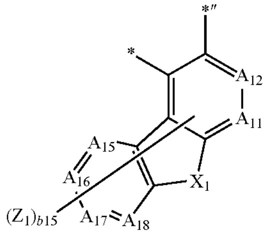

-continued

CY3-4

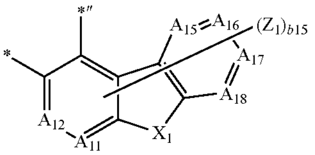

CY3-5

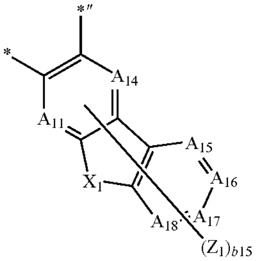

CY3-6

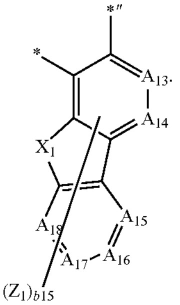

In Formulae CY3-1 to CY3-6, $X_1$ and $Z_1$ are the same as described in the present specification, $A_{11}$ to $A_{18}$ may each independently be C or N, b15 may be an integer from 0 to 5,

* indicates a binding site to M in Formula 1,

*" is a binding site to a neighboring atom in Formulae 1-2A and 1-2B.

For example, at least one of $A_{13}$ to $A_{18}$ in Formulae CY3-1 and CY3-6 may be N, at least one of $A_{11}$ and $A_{14}$ to $A_{18}$ in Formulae CY3-2 and CY3-5 may be N, and at least one of $A_{11}$, $A_{12}$ and $A_{15}$ to $A_{18}$ in Formulae CY3-3 and CY3-4 may be N.

In one or more embodiments, a group represented by

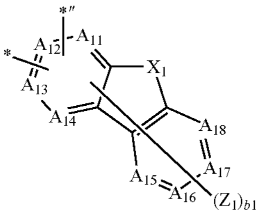

in Formulae 1-2A and 1-2B may be a group represented by one of Formulae CY3-1-1 to CY3-1-6, CY3-2-1 to CY3-2-6, CY3-3-1 to CY3-3-6, CY3-4-1 to CY3-4-6, CY3-5-1 to CY3-5-6, and CY3-6-1 to CY3-6-6:

CY3-1-1

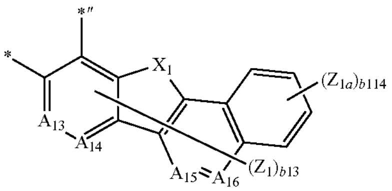

CY3-1-2

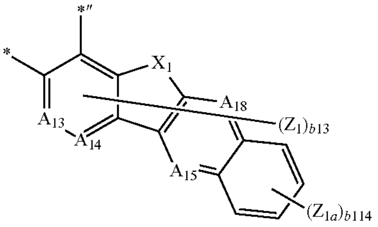

CY3-1-3

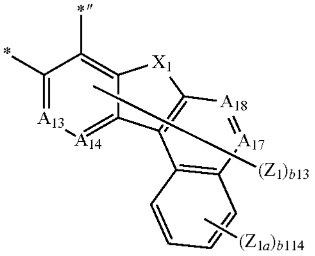

CY3-1-4

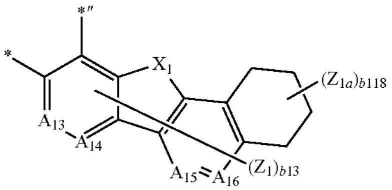

CY3-1-5

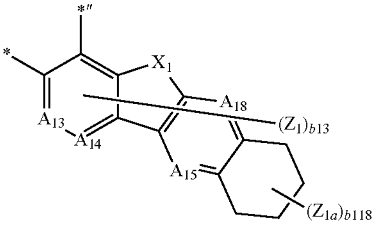

CY3-1-6

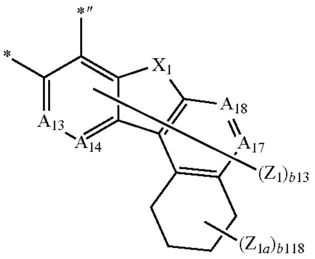

-continued
CY3-2-1
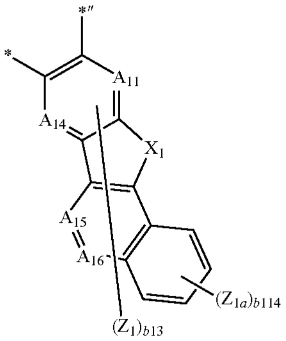
CY3-2-2
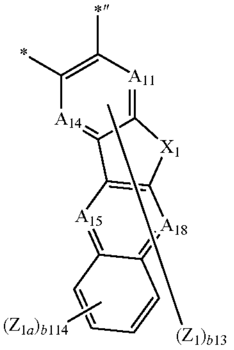
CY3-2-3
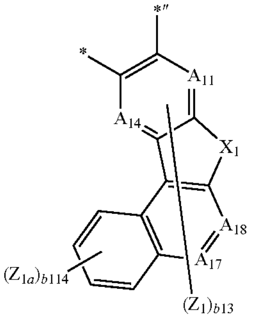
CY3-2-4
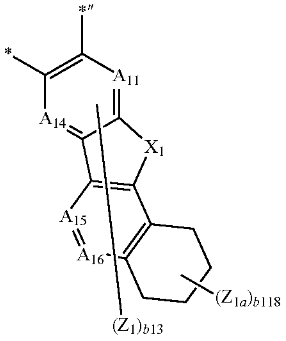
-continued
CY3-2-5
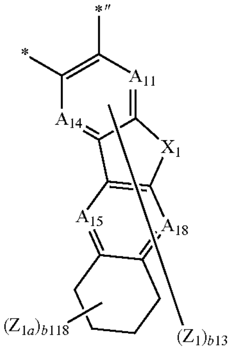
CY3-2-6
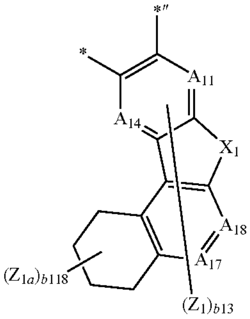
CY3-3-1
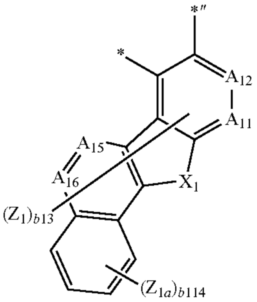
CY3-3-2
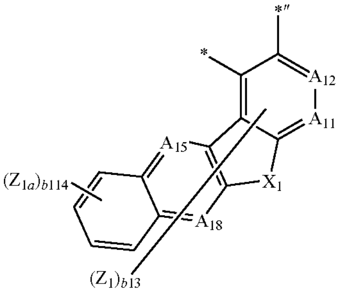
CY3-3-3
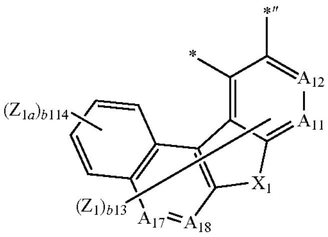

-continued
CY3-3-4
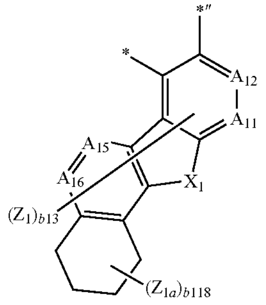
CY3-3-5
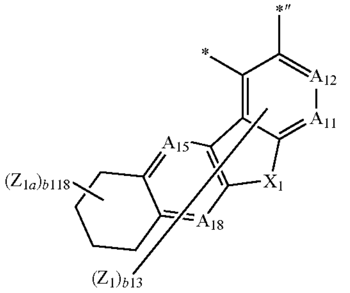
CY3-3-6
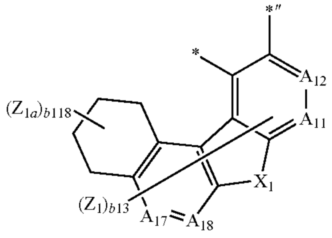
CY3-4-1
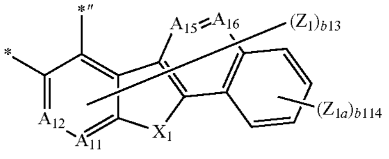
CY3-4-2
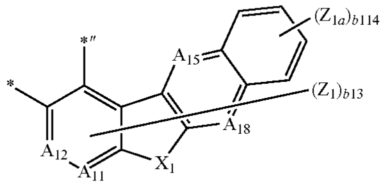
CY3-4-3
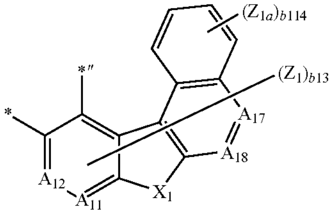
CY3-4-4
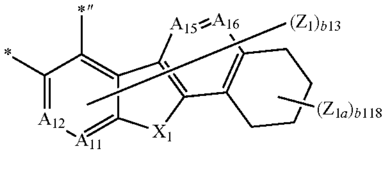
-continued
CY3-4-5
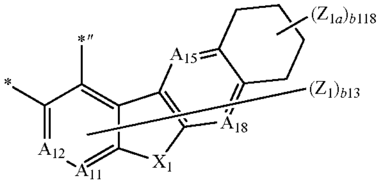
CY3-4-6
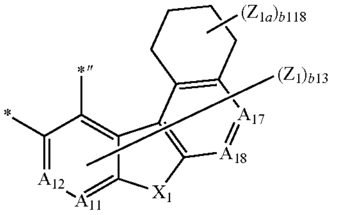
CY3-5-1
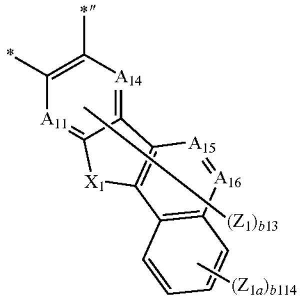
CY3-5-2
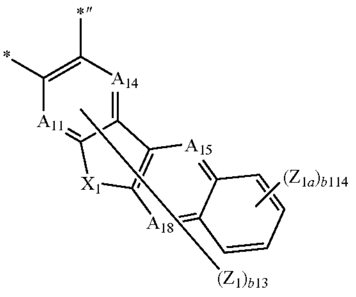
CY3-5-3
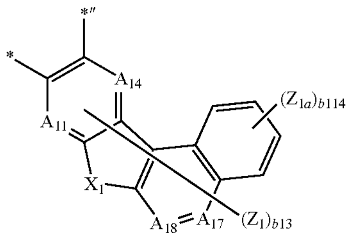
CY3-5-4
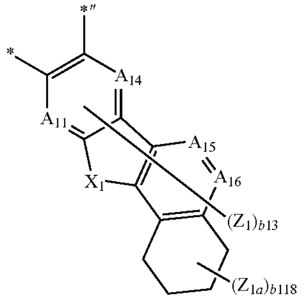

-continued

CY3-5-5

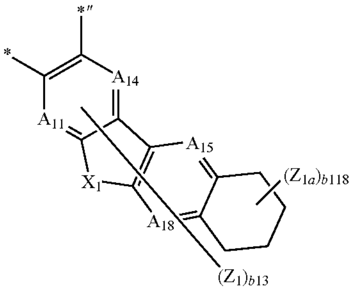

CY3-5-6

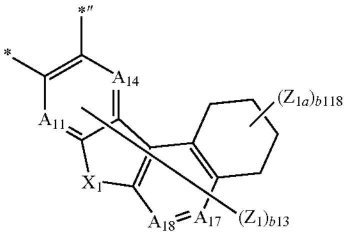

CY3-6-1

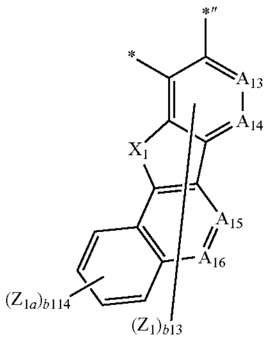

CY3-6-2

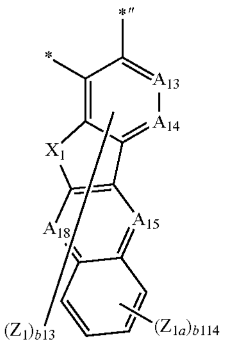

CY3-6-3

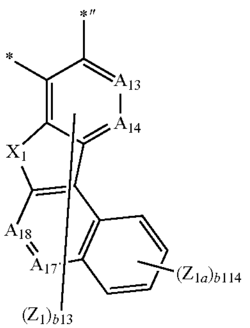

-continued

CY3-6-4

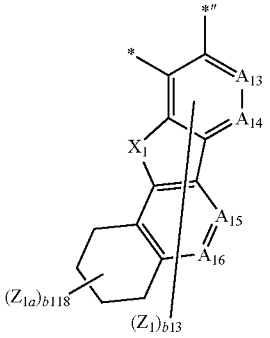

CY3-6-5

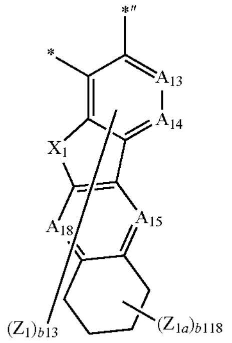

CY3-6-6

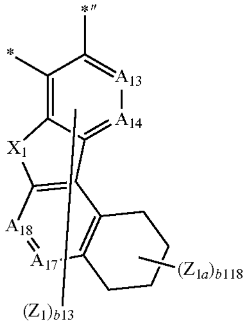

In Formulae CY3-1-1 to CY3-1-6, CY3-2-1 to CY3-2-6, CY3-3-1 to CY3-3-6, CY3-4-1 to CY3-4-6, CY3-5-1 to CY3-5-6 and CY3-6-1 to CY3-6-6, $X_1$ and $Z_1$ are the same as described in the present specification, $Z_{1a}$ is the same as described in connection with $R_{1a}$, $A_{11}$ to $A_{18}$ may each independently C or N, a) at least one of $A_{13}$, $A_{14}$, $A_{15}$, and $A_{16}$ in Formulae CY3-1-1, CY3-1-4, CY3-6-1 and CY3-6-4 may be N, b) at least one of $A_{13}$, $A_{14}$, $A_{15}$, and $A_{18}$ in Formulae CY3-1-2, CY3-1-5, CY3-6-2, and CY3-6-5 may be N, c) at least one of $A_{13}$, $A_{14}$, $A_{17}$ and $A_{18}$ in Formulae CY3-1-3, CY3-1-6, CY3-6-3, and CY3-6-6 may be N, d) at least one of $A_{11}$, $A_{14}$, $A_{15}$, and $A_{18}$ in Formulae CY3-2-1, CY3-2-4, CY3-5-1, and CY3-5-4 may be N, e) at least one of $A_{11}$, $A_{14}$, $A_{15}$, and $A_{18}$ in Formulae CY3-2-2, CY3-2-5, CY3-5-2, and CY3-5-5 may be N, f) at least one of $A_{11}$, $A_{14}$, $A_{17}$, and $A_{18}$ in Formulae CY3-2-3, CY3-2-6, CY3-5-3, and CY3-5-6 may be N, g) at least one of $A_{11}$, $A_{12}$, $A_{15}$, and $A_{16}$ in Formulae CY3-3-1, CY3-3-4, CY3-4-1, and CY3-4-4 may be N, h) at least one of $A_{11}$, $A_{12}$, $A_{15}$, and $A_{18}$ in Formulae CY3-3-2, CY3-3-5, CY3-4-2, and CY3-4-5 may be N, i) at least one of $A_{11}$, $A_{12}$, $A_{17}$, and $A_{18}$ in Formulae CY3-3-3, CY3-3-6, CY3-4-3, and CY3-3-6 may be N, and j) at least one of $A_{11}$, and $A_{14}$ to $A_{18}$ in Formulae CY3-2, and CY3-5 may be N, and $A_{11}$, $A_{12}$, and $A_{15}$ to $A_{18}$ in Formulae CY3-3, and CY3-4 may be N, b13 may be an integer from 0 to 3, b114 may be an integer from 0 to 4, b118 may be an integer from 0 to 8,

* indicates a binding site to M in Formula 1,

*" is a binding site to a neighboring atom in Formulae 1-2A and 1-2B.

In one or more embodiments, a group represented by

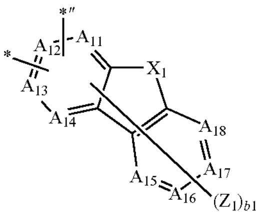

in Formulae 1-2A and 1-2B may be a group represented by one of Formulae CY3(1) to CY3(105):

CY3(1)

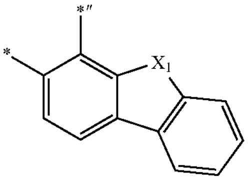

CY3(2)

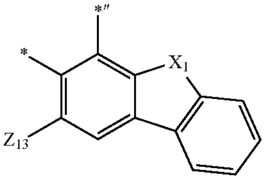

CY3(3)

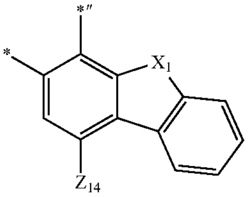

CY3(4)

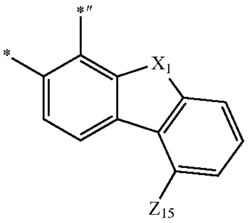

-continued

CY3(5)

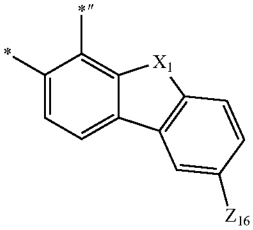

CY3(6)

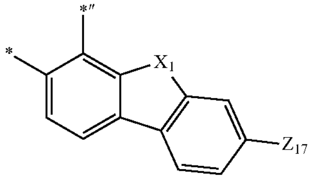

CY3(7)

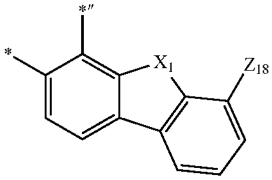

CY3(8)

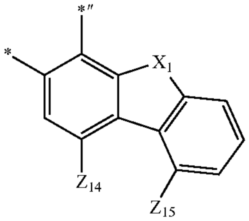

CY3(9)

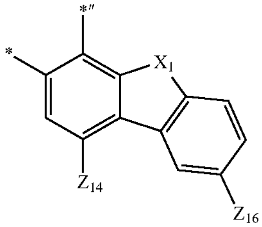

CY3(10)

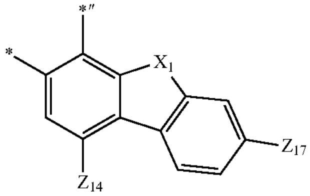

CY3(11)

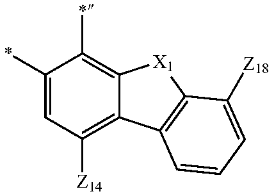

-continued
CY3(12)
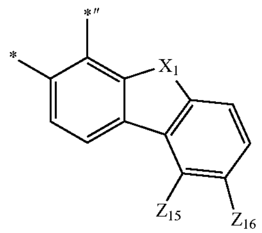
CY3(13)
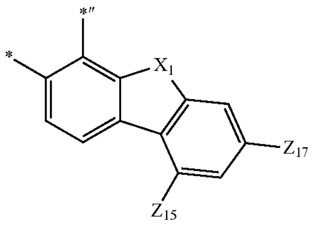
CY3(14)
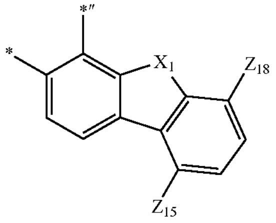
CY3(15)
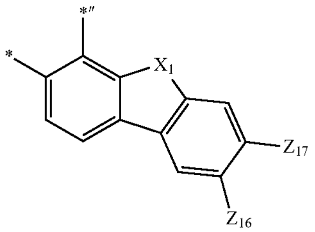
CY3(16)
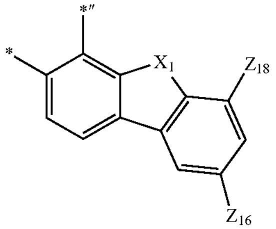
CY3(17)
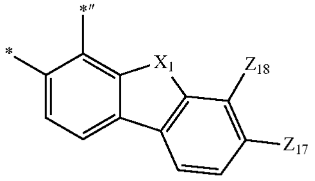
CY3(18)
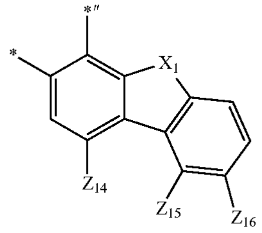
-continued
CY3(19)
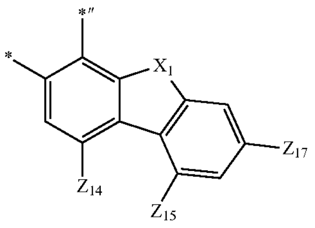
CY3(20)
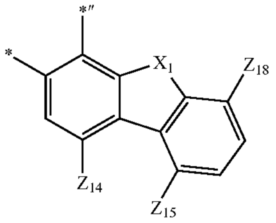
CY3(21)
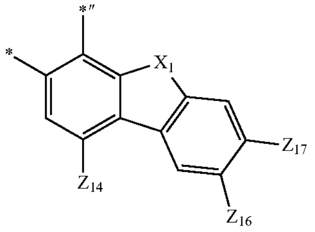
CY3(22)
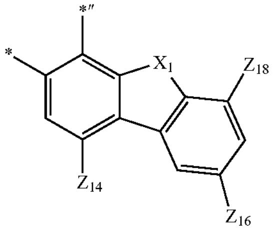
CY3(23)
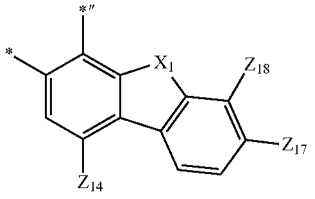
CY3(24)
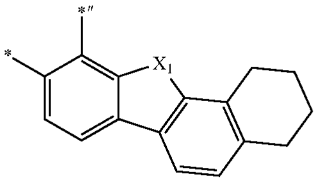
CY3(25)
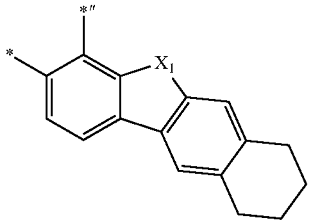

-continued
CY3(26)
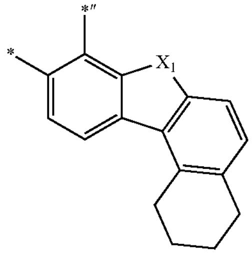
CY3(27)
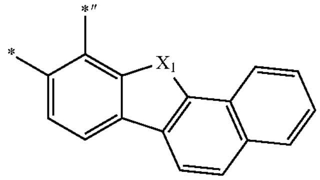
CY3(28)
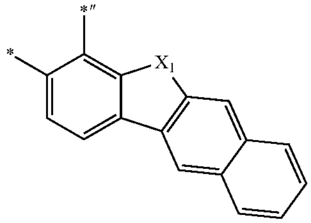
CY3(29)
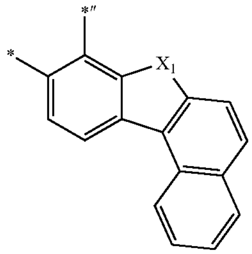
CY3(30)
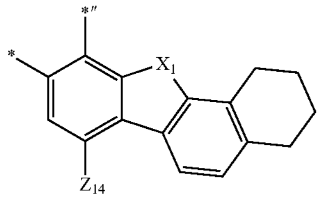
CY3(31)
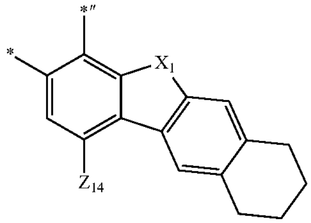
CY3(32)
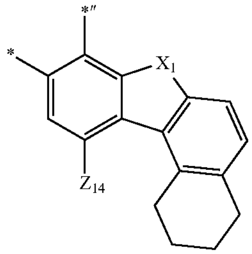
-continued
CY3(33)
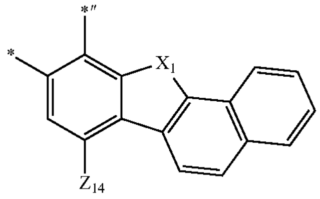
CY3(34)
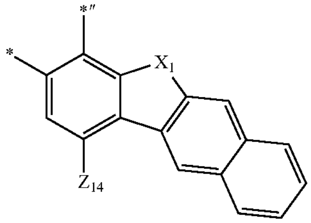
CY3(35)
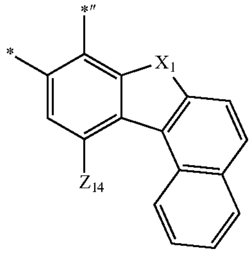
CY3(36)
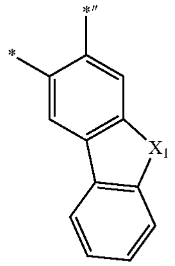
CY3(37)
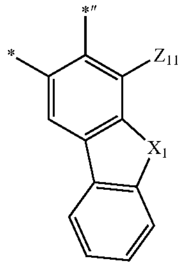
CY3(38)
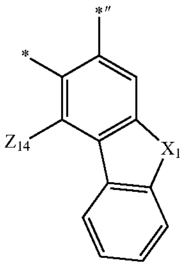

-continued
CY3(39)
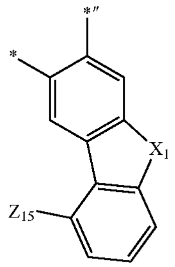
CY3(40)
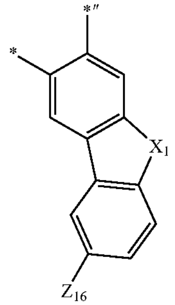
CY3(41)
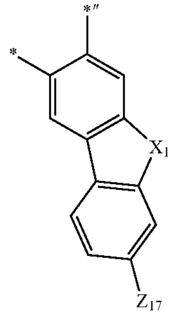
CY3(42)
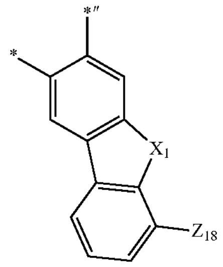
CY3(43)
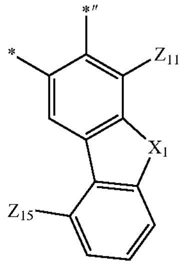
-continued
CY3(44)
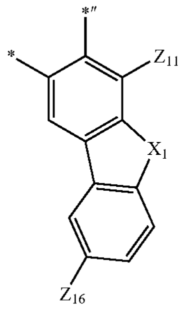
CY3(45)
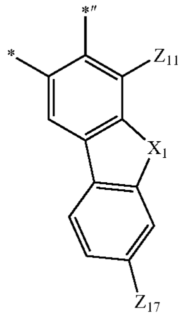
CY3(46)
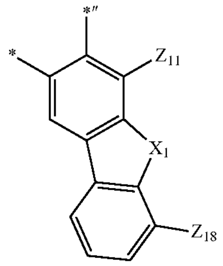
CY3(47)
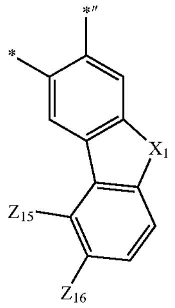
CY3(48)
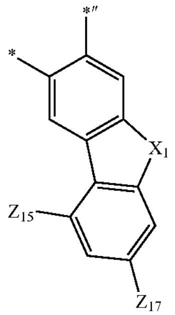

-continued
CY3(49)
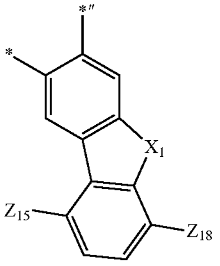
CY3(50)
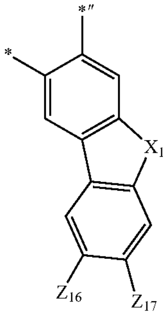
CY3(51)
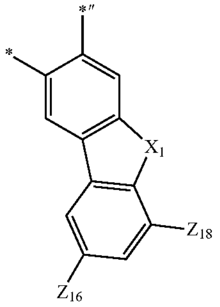
CY3(52)
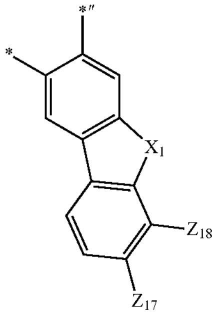
CY3(53)
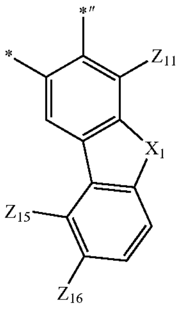
-continued
CY3(54)
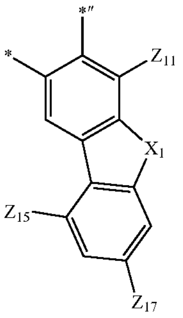
CY3(55)
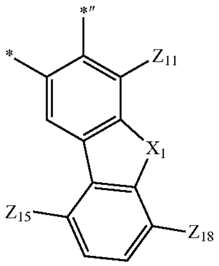
CY3(56)
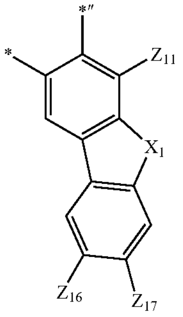
CY3(57)
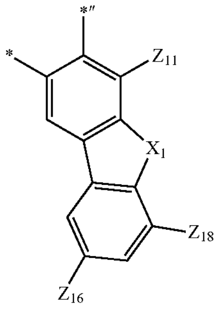
CY3(58)
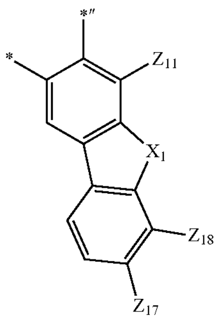

-continued
CY3(59)
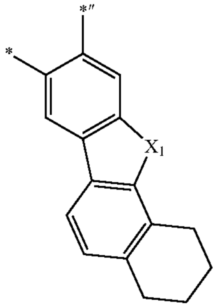
CY3(60)
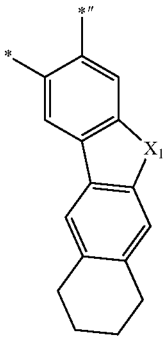
CY3(61)
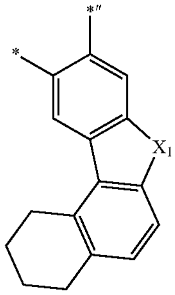
CY3(62)
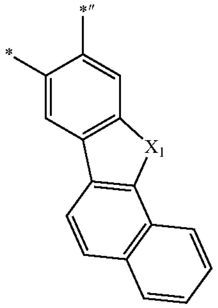
CY3(63)
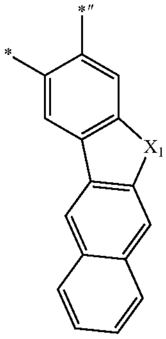
-continued
CY3(64)
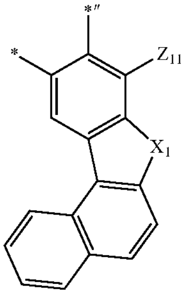
CY3(65)
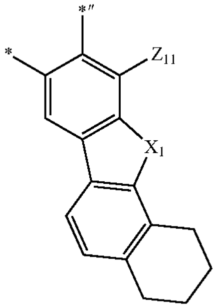
CY3(66)
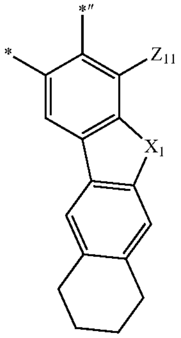
CY3(67)
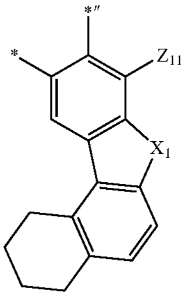
CY3(68)
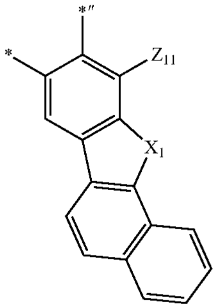

-continued
CY3(69)
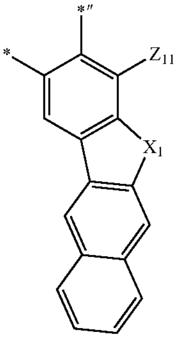
CY3(70)
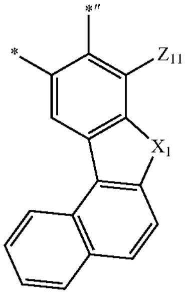
CY3(71)
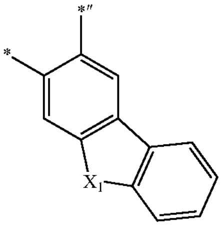
CY3(72)
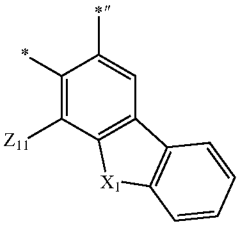
CY3(73)
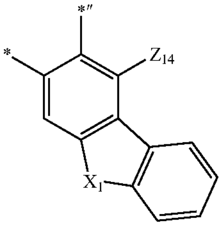
CY3(74)
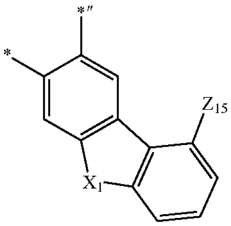
-continued
CY3(75)
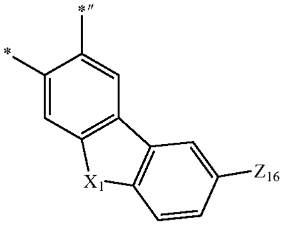
CY3(76)
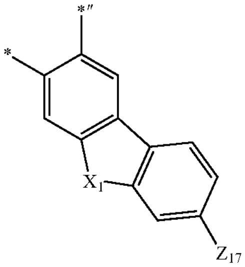
CY3(77)
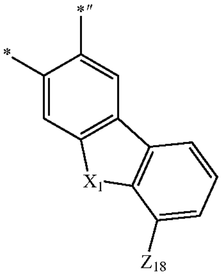
CY3(78)
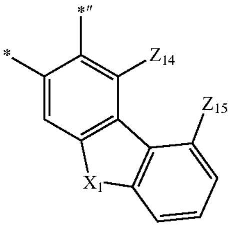
CY3(79)
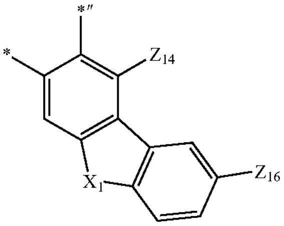
CY3(80)
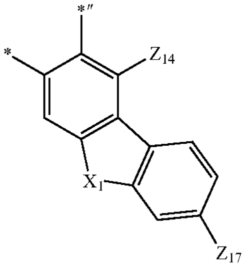

-continued
CY3(81)
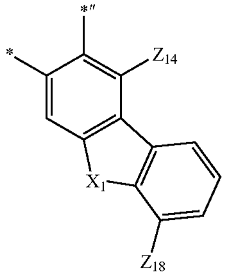
CY3(82)
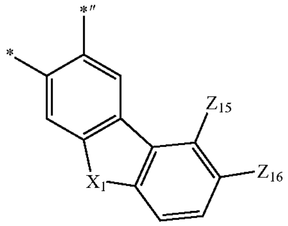
CY3(83)
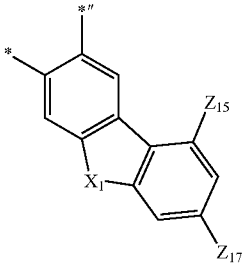
CY3(84)
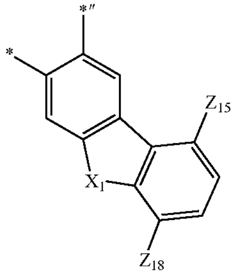
CY3(85)
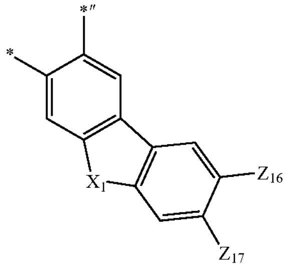
CY3(86)
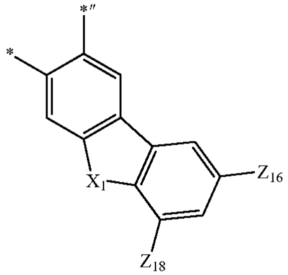
-continued
CY3(87)
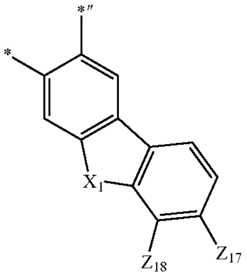
CY3(88)
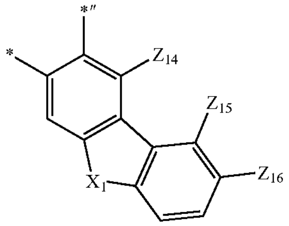
CY3(89)
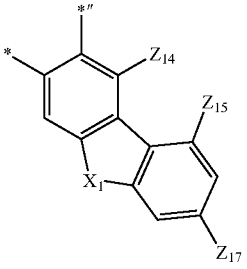
CY3(90)
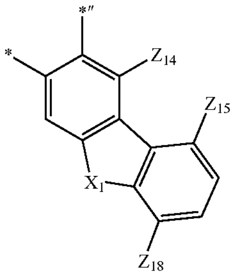
CY3(91)
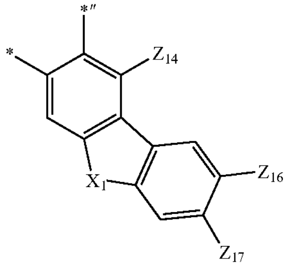
CY3(92)
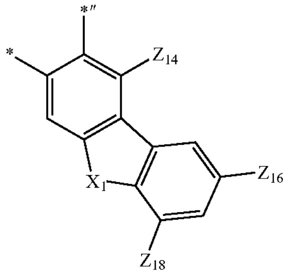

-continued
CY3(93)
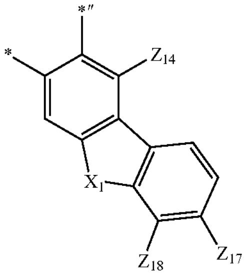
CY3(94)
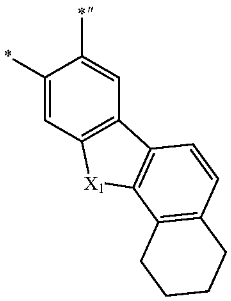
CY3(95)
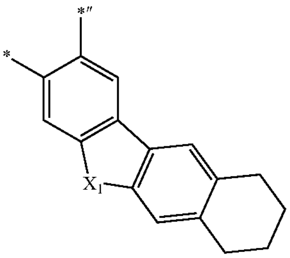
CY3(96)
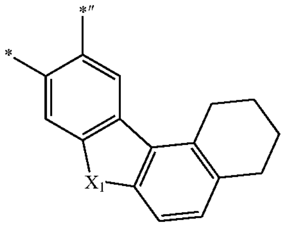
CY3(97)
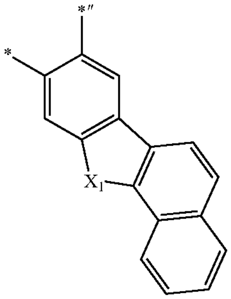
-continued
CY3(98)
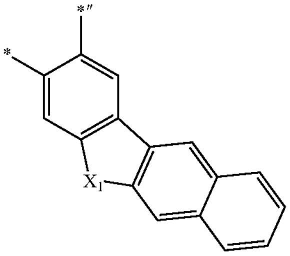
CY3(99)
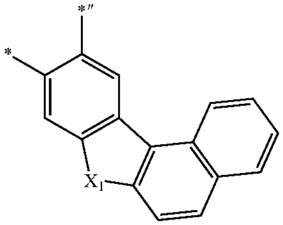
CY3(100)
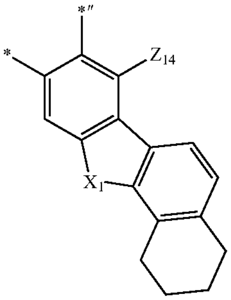
CY3(101)
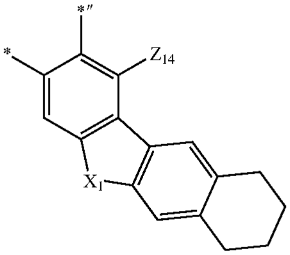
CY3(102)
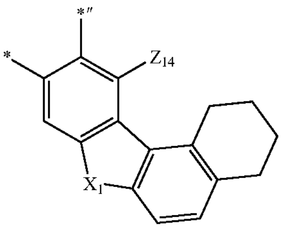
CY3(103)
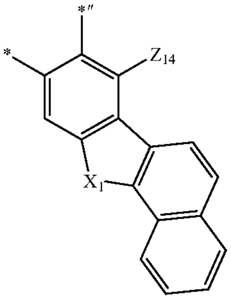

-continued

CY3(104)

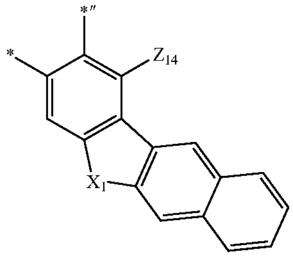

CY3(105)

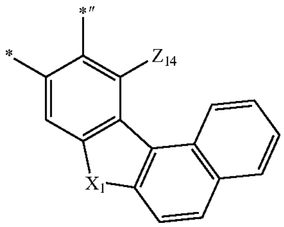

In Formulae CY3(1) to CY3(105), $X_1$ is the same as described above, $Z_{11}$ to $Z_{18}$ are the same as described in connection with $Z_1$, and each of $Z_1$ to $Z_{18}$ may not be hydrogen,

*indicates a binding site to M in Formula 1,

*" is a binding site to a neighboring atom in Formulae 1-2A and 1-2B.

In one or more embodiments, a group represented by

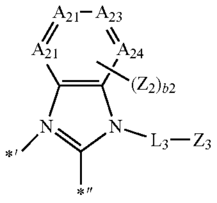

in Formulae 1-2A and 1-21B may be a group represented by one of Formulae CY4-1 to CY4-60:

CY4-1

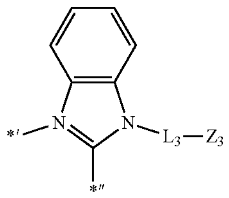

CY4-2

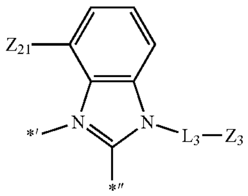

-continued

CY4-3

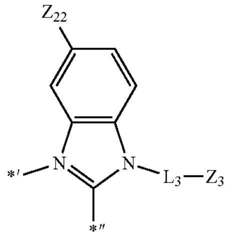

CY4-4

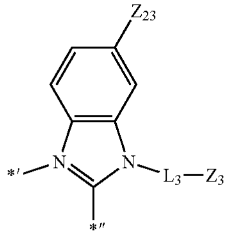

CY4-5

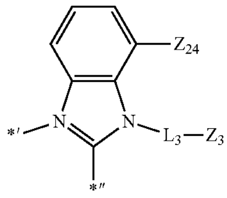

CY4-6

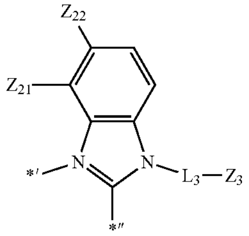

CY4-7

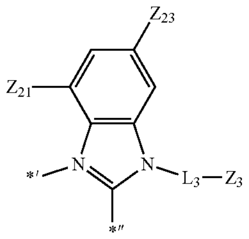

CY4-8

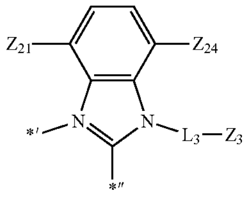

CY4-9

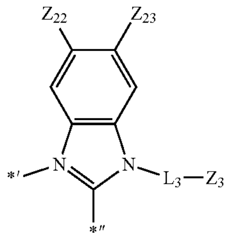

-continued
CY4-10
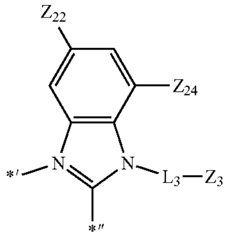
CY4-11
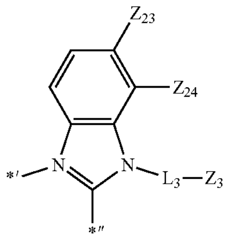
CY4-12
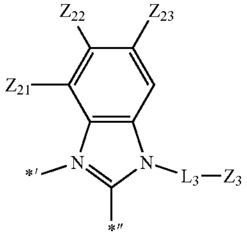
CY4-13
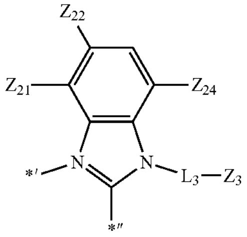
CY4-14
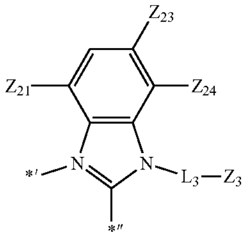
CY4-15
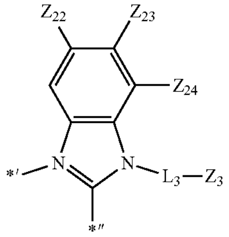
-continued
CY4-16
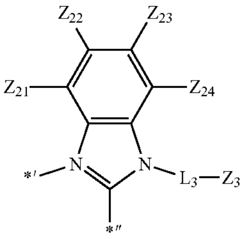
CY4-17
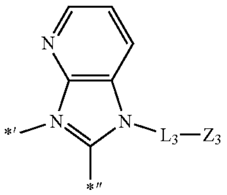
CY4-18
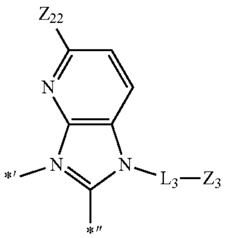
CY4-19
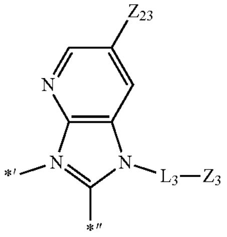
CY4-20
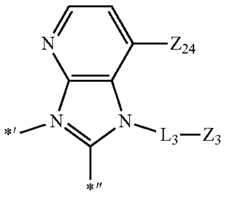
CY4-21
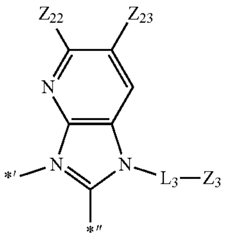
CY4-22
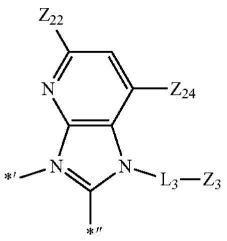

-continued
CY4-23
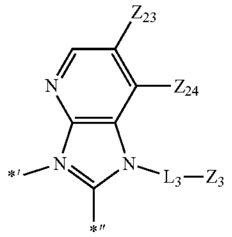
CY4-24
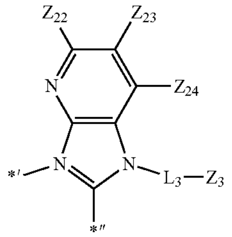
CY4-25
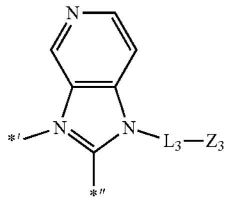
CY4-26
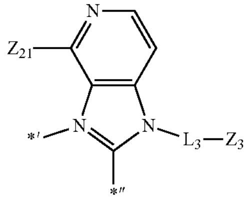
CY4-27
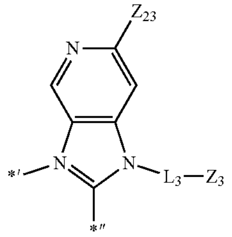
CY4-28
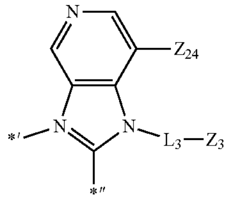
CY4-29
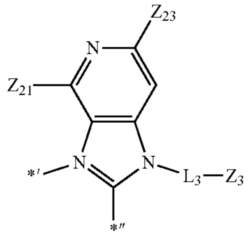
-continued
CY4-30
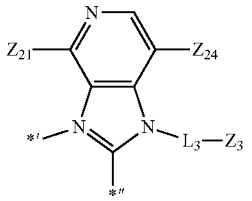
CY4-31
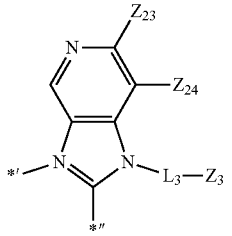
CY4-32
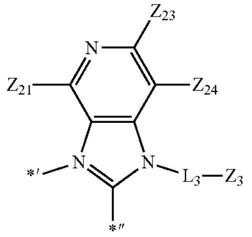
CY4-33
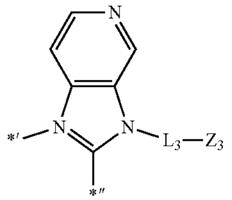
CY4-34
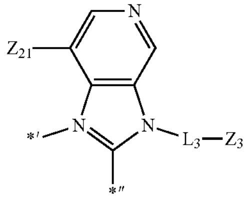
CY4-35
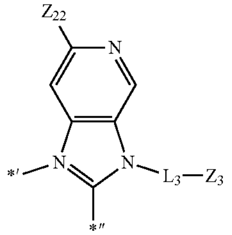
CY4-36
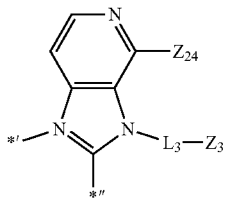

-continued
CY4-37
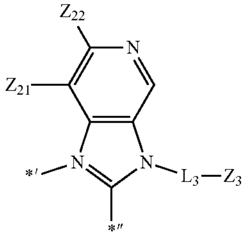
CY4-38
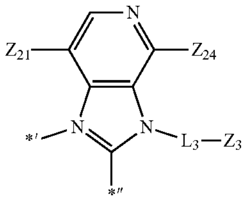
CY4-39
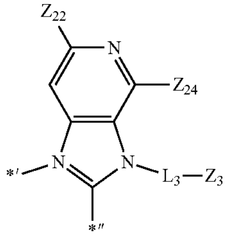
CY4-40
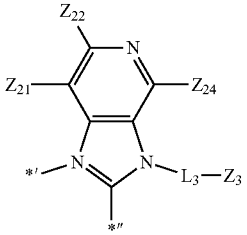
CY4-41
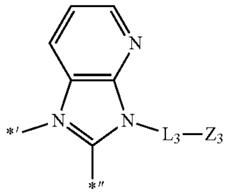
CY4-42
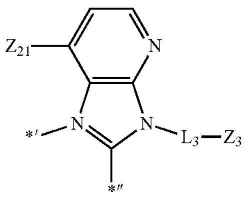
CY4-43
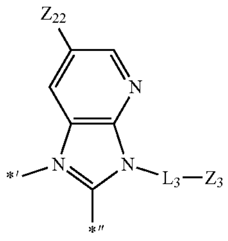
-continued
CY4-44
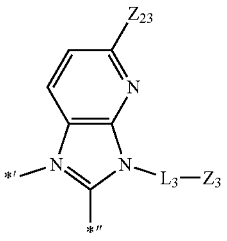
CY4-45
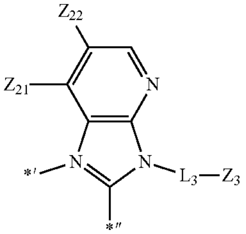
CY4-46
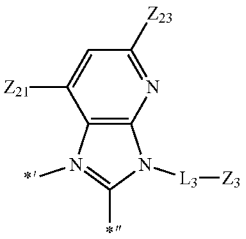
CY4-47
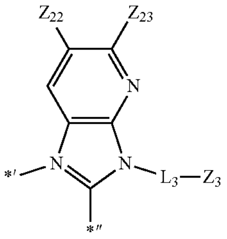
CY4-48
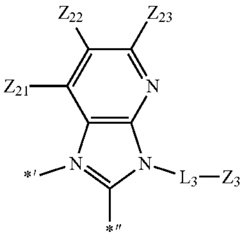
CY4-49
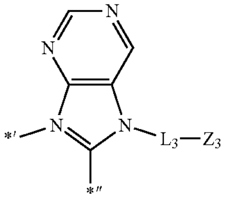

-continued

CY4-50

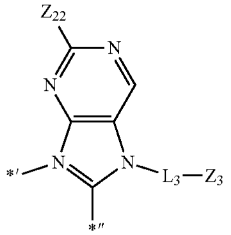

CY4-51

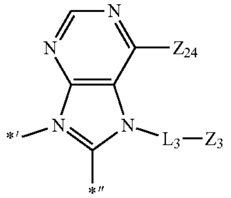

CY4-52

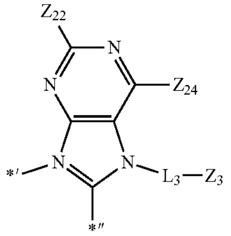

CY4-53

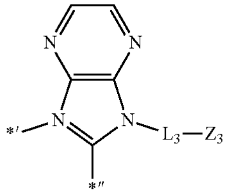

CY4-54

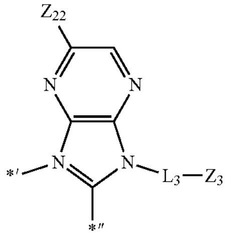

CY4-55

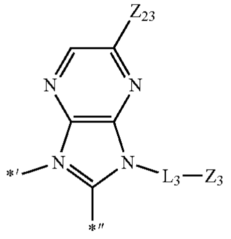

CY4-56

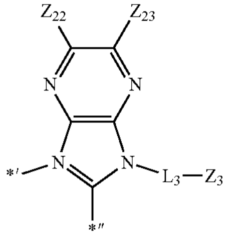

-continued

CY4-57

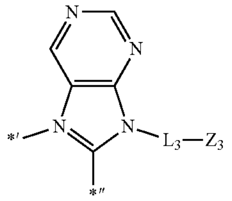

CY4-58

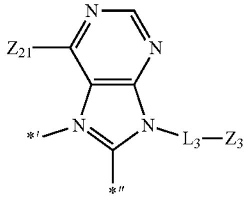

CY4-59

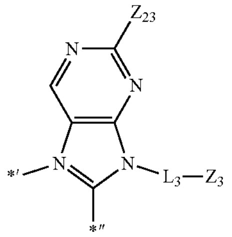

CY4-60

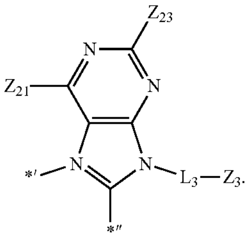

In Formulae CY4-1 to CY4-60, $L_3$ and $Z_3$ are the same as described in the present specification, $Z_{21}$ to $Z_{24}$ are each the same are the same as described in connection with $Z_2$, and each of $Z_{21}$ to $Z_{24}$ may not be hydrogen,

*' indicates a binding site to M in Formula 1, and

*" is a binding site to a neighboring atom in Formulae 1-2A and 1-2B.

In one or more embodiments, a group represented by

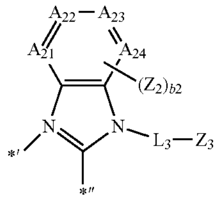

in Formulae 1-2A and 1-2B may be a group represented by one of Formulae $CY_4(1)$ to CY4(3):

-continued

CY4(1)

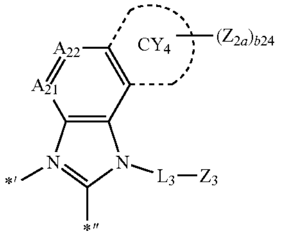

CY4(3)

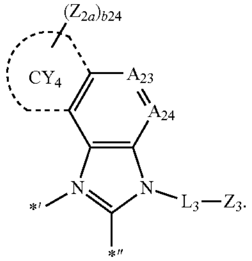

CY4(2)

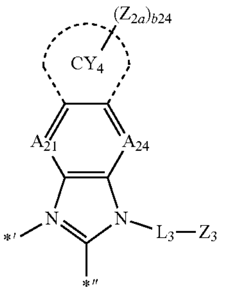

In Formulae CY4(1) to CY4(3), $A_{21}$ to $A_{24}$, $L_3$, and $Z_3$ are the same as described in the present specification, ring $CY_4$ may be a benzene group, a pyridine group, a pyrimidine group or a pyrazine group, $Z_{2a}$ is the same as described in connection with $R_{1a}$, b24 is an integer from 0 to 4,

*' indicates a binding site to M in Formula 1, and

*" is a binding site to a neighboring atom in Formulae 1-2A and 1-2B.

In an embodiment, the organometallic compound represented by Formula 1 may emit red light or green light, for example, red light or green light, each having a maximum luminescence wavelength of about 500 nm or more, for example, from about 500 nm or more and about 850 nm or less. For example, the organometallic compound may emit green light.

For example, the first compound may be one of Group I consisting of Compounds 1 to 2810 and Group II consisting of Compounds 1 to 1965, but embodiments of the present disclosure are not limited thereto:

Group I

1

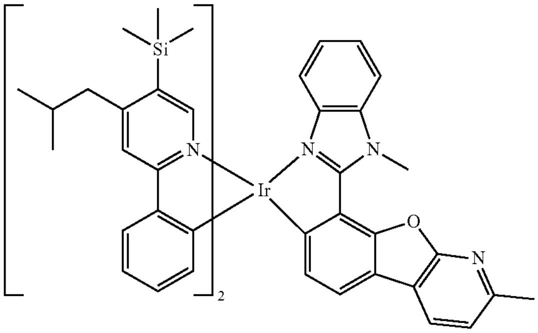

2

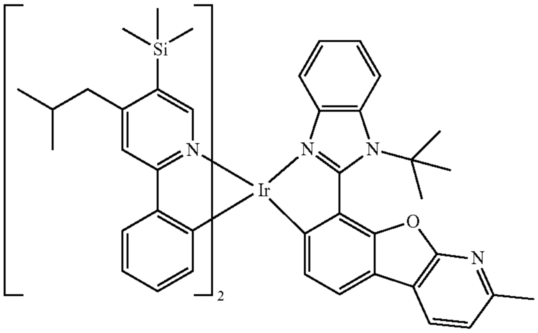

3

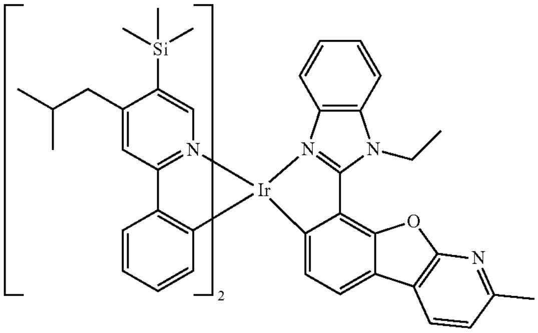

4

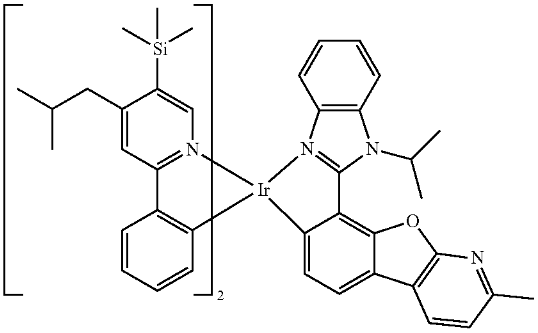

-continued
5
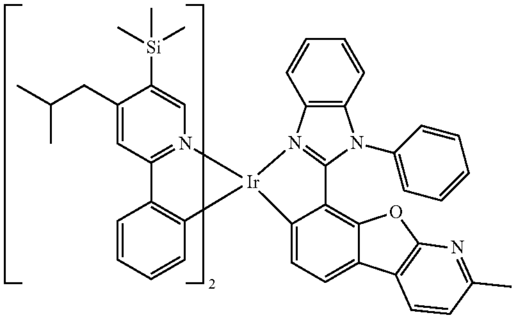
6
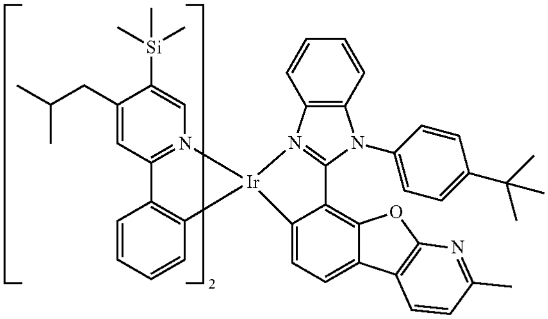
7
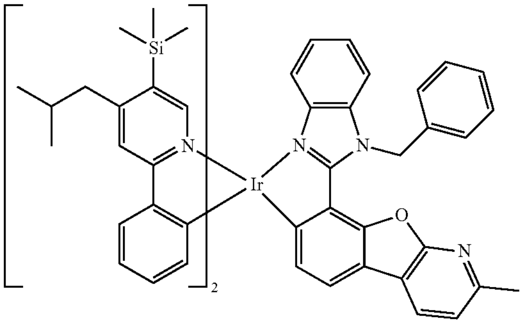
8
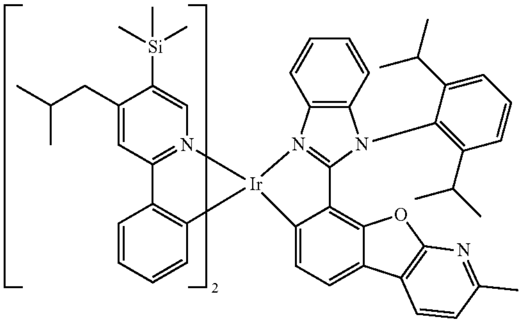
9
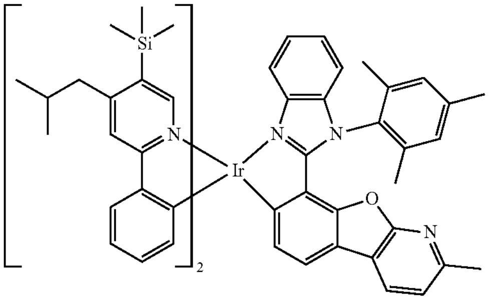
10
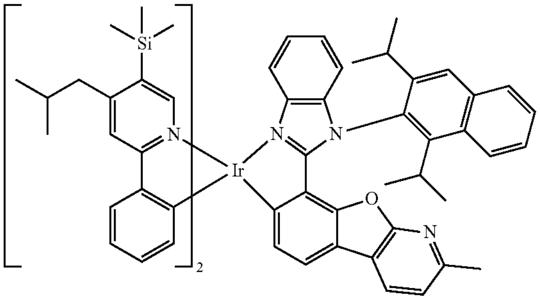
11
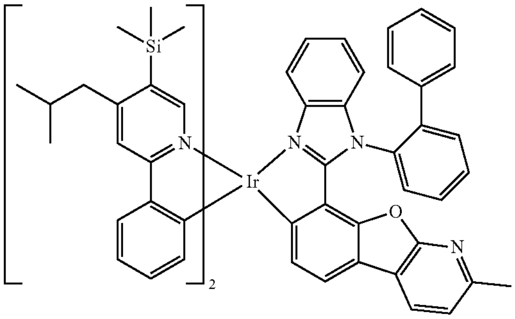
12
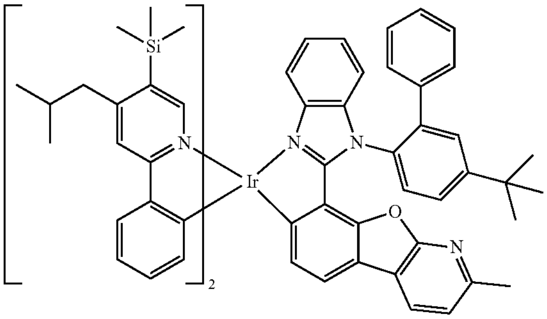
13
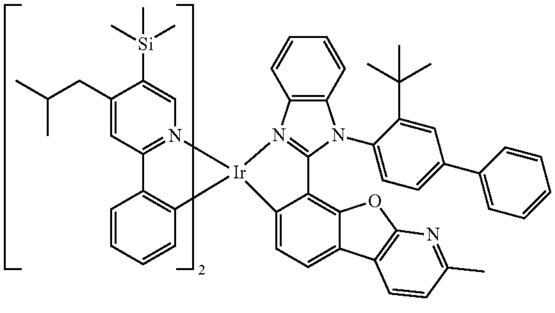
14
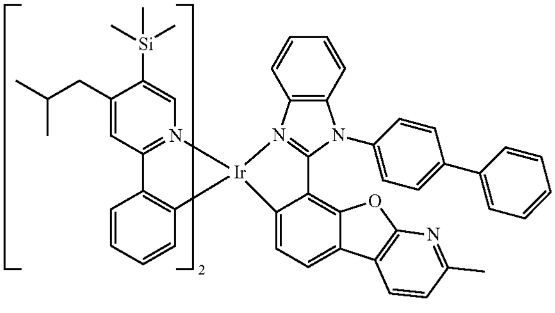

-continued
15
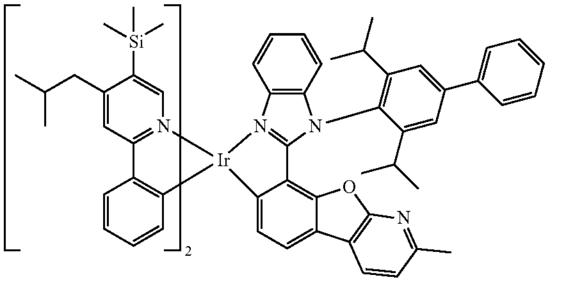
16
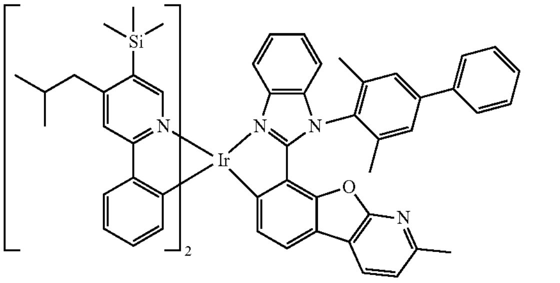
17
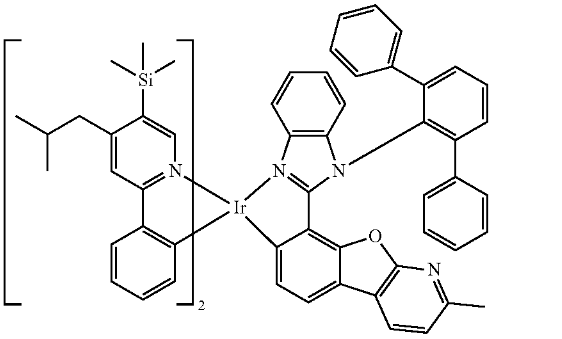
18
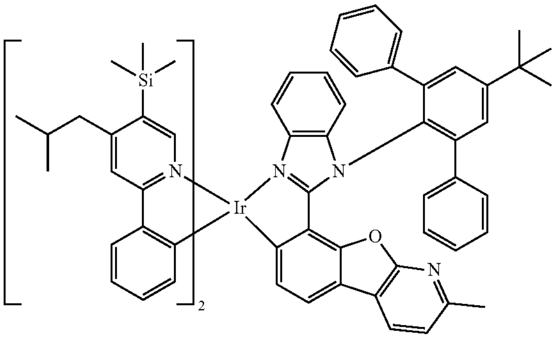
19
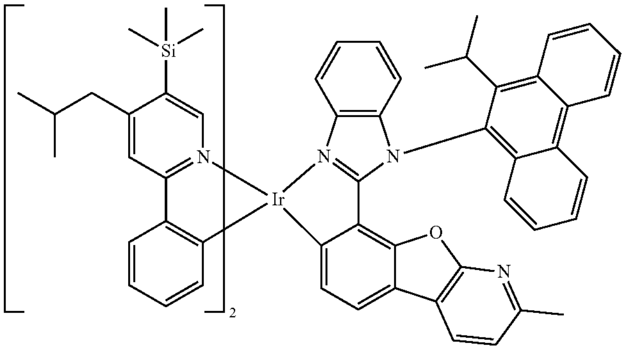
20
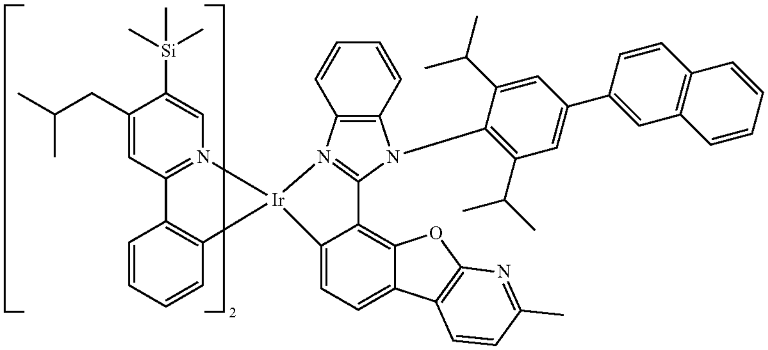

-continued
21
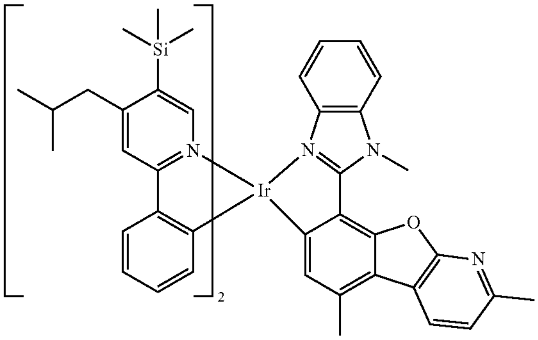
22
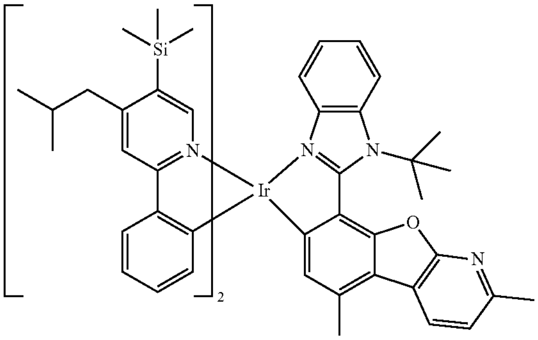
23
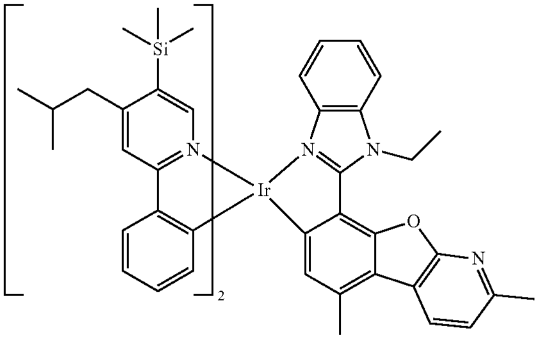
24
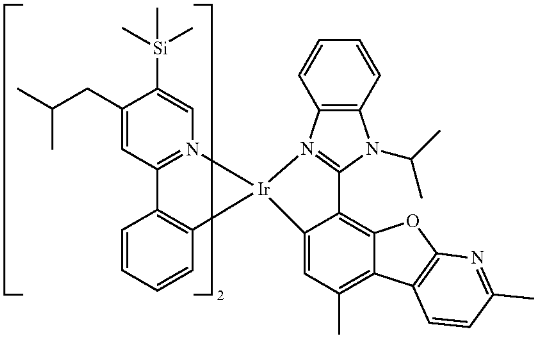
25
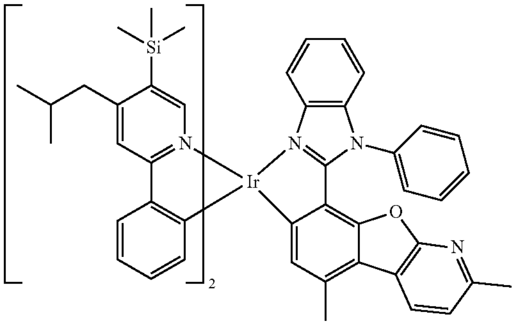
26
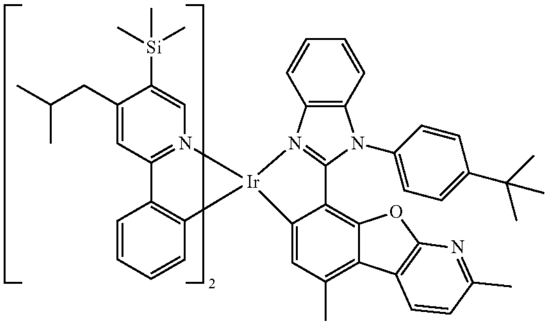
27
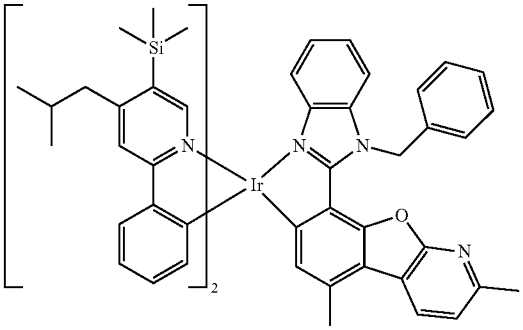
28
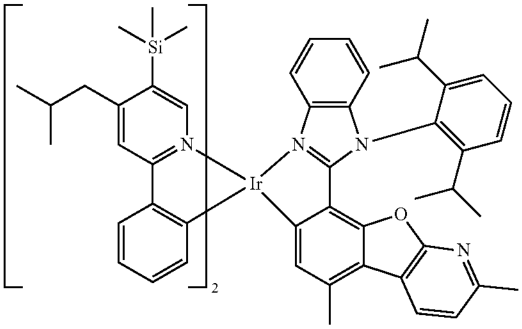

-continued
29
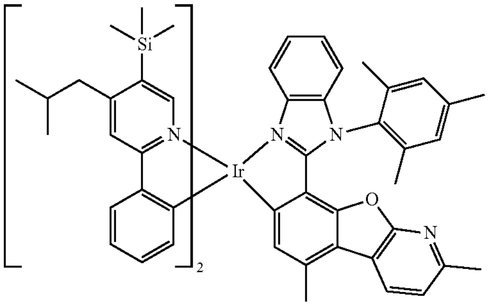
30
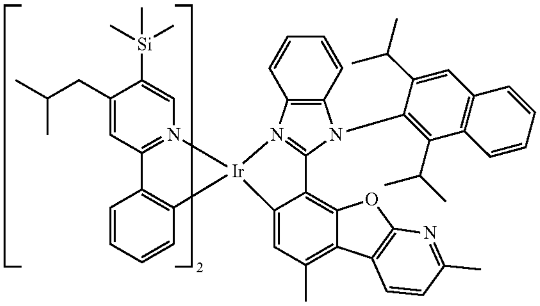
31
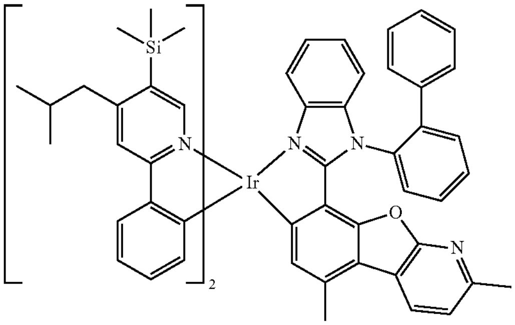
32
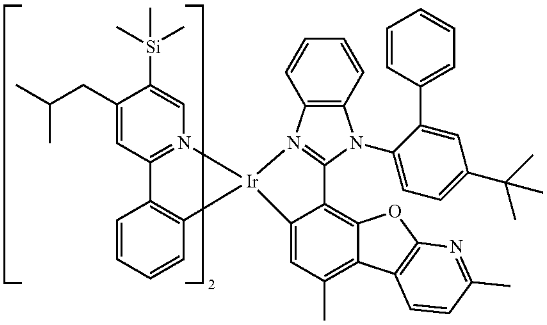
33
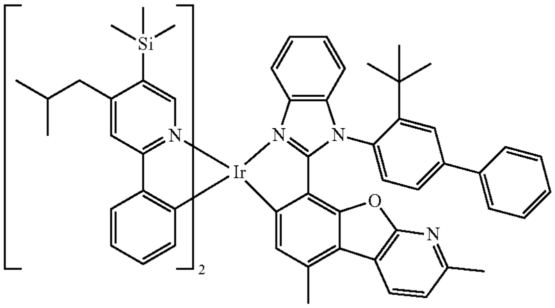
34
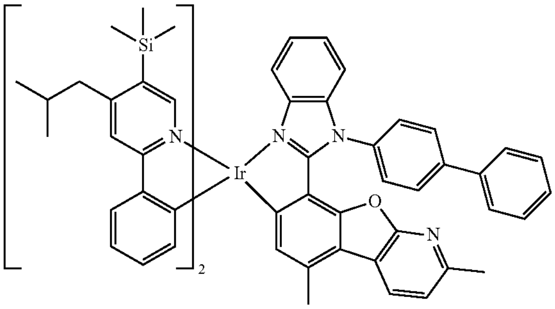
35
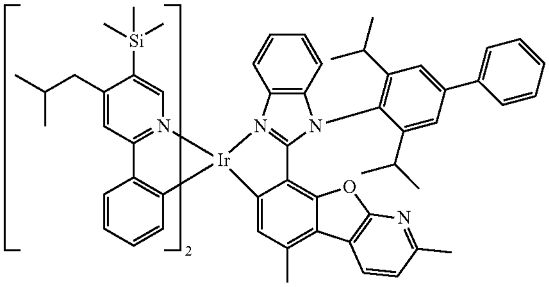
36
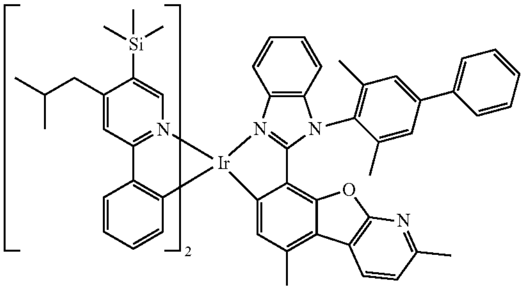
37
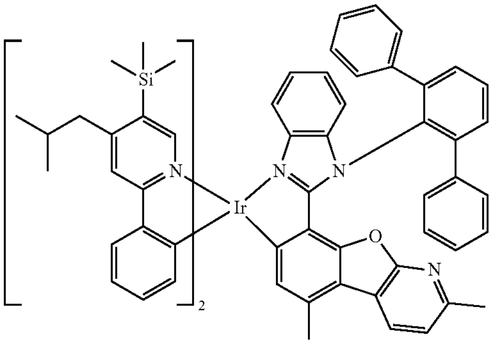
38
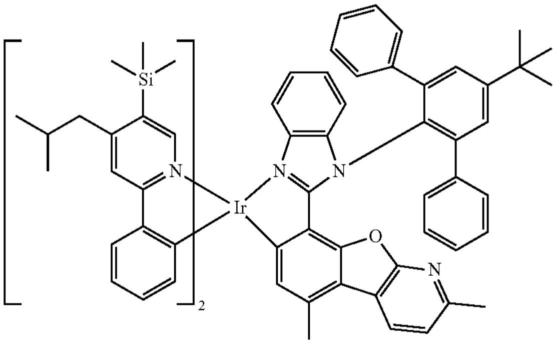

-continued
39
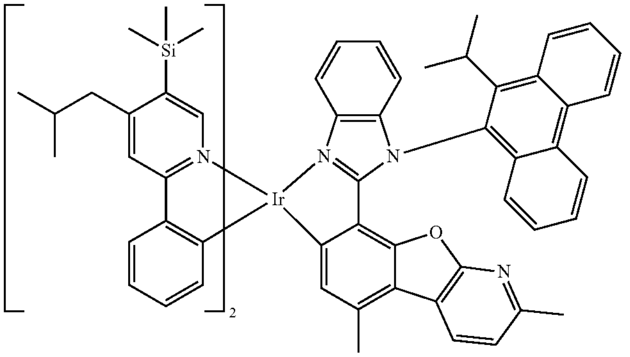
40
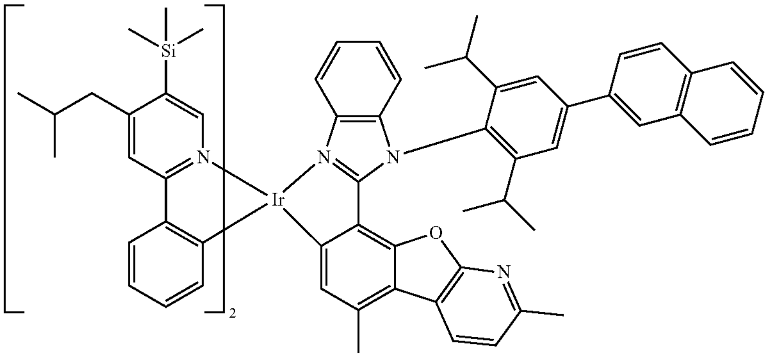
41
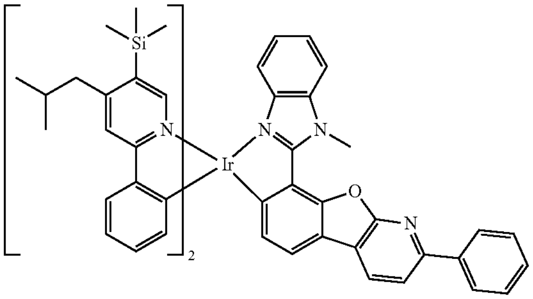
42
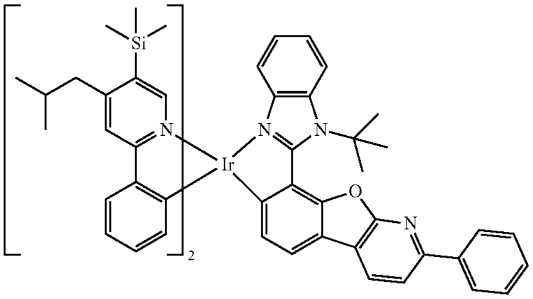
43
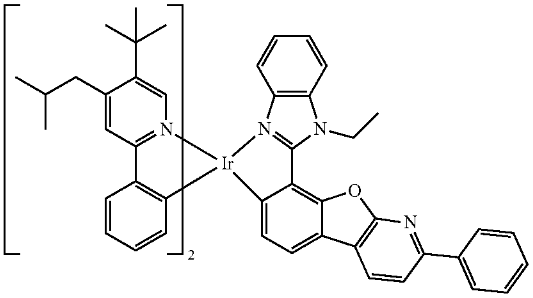
44
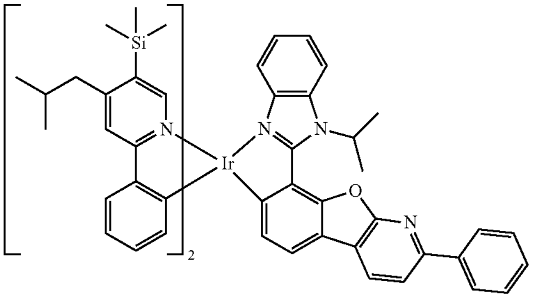
45
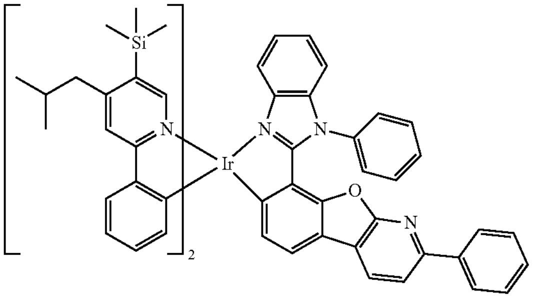
46
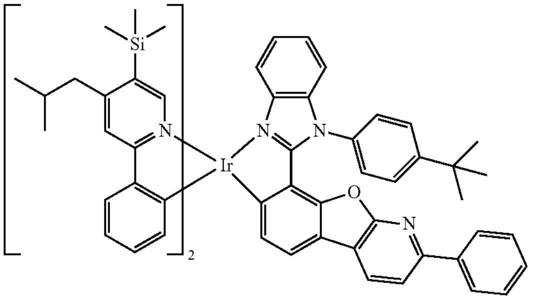

-continued
47
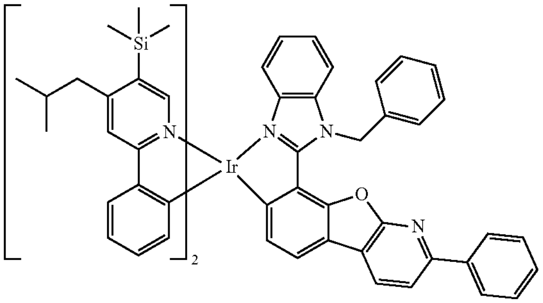
48
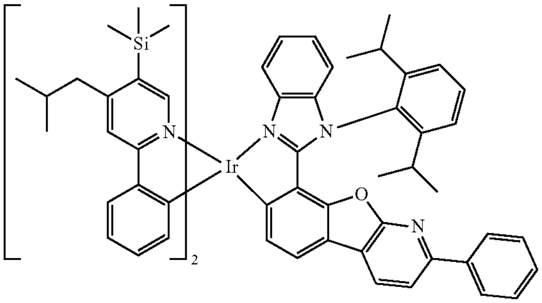
49
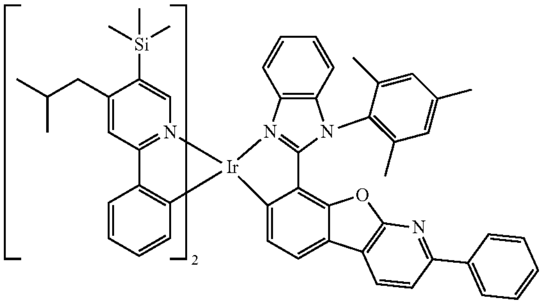
50
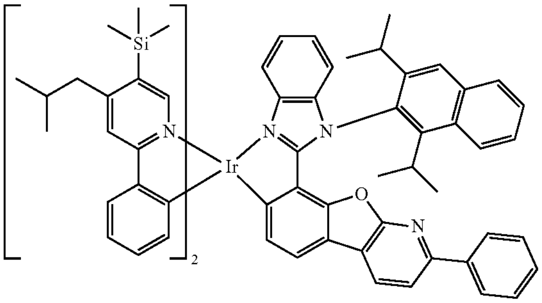
51
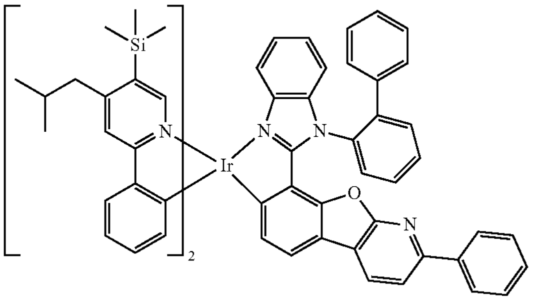
52
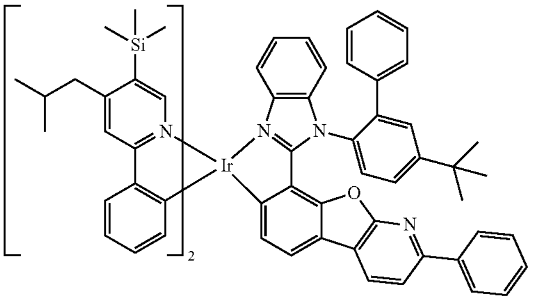
53
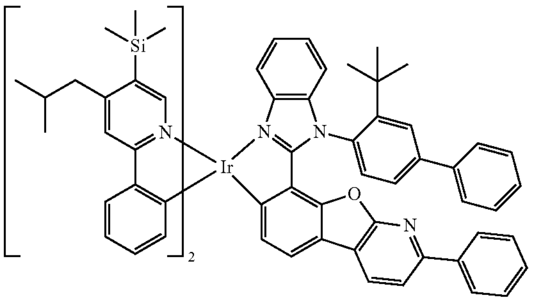
54
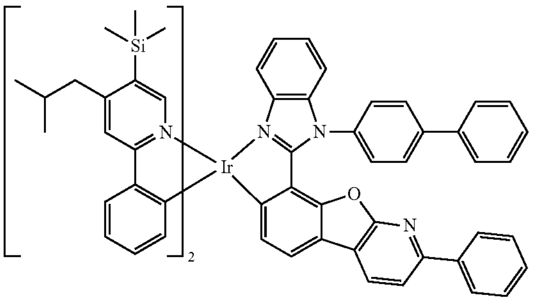
55
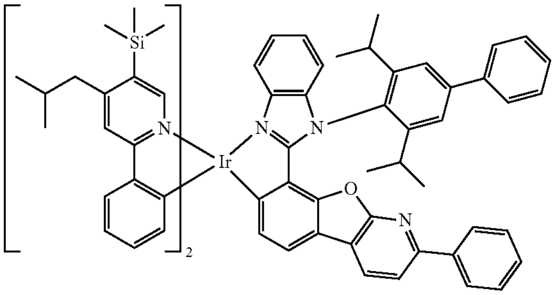
56
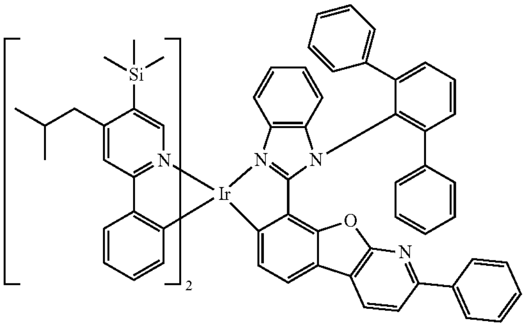

-continued
57
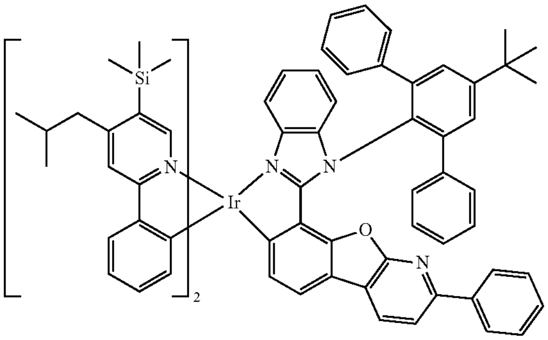
58
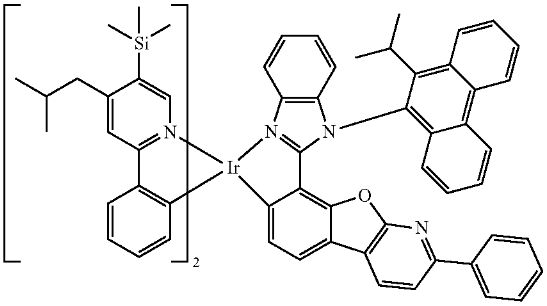
59
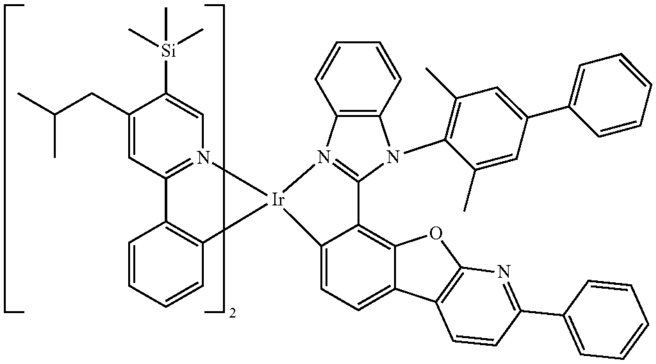
60
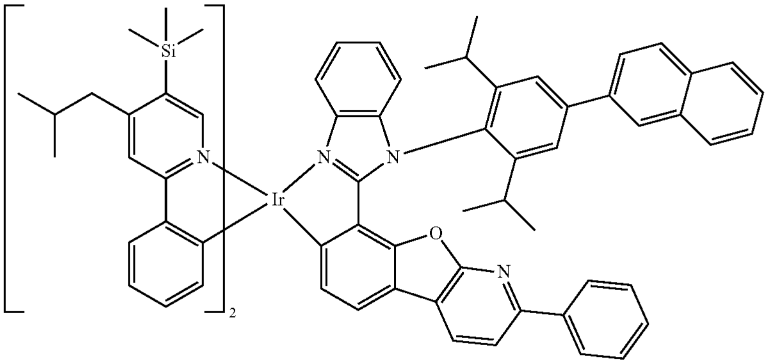
61
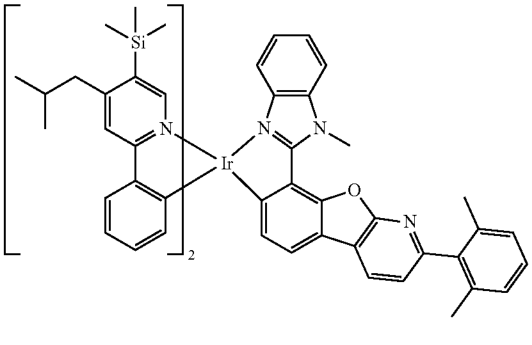
62
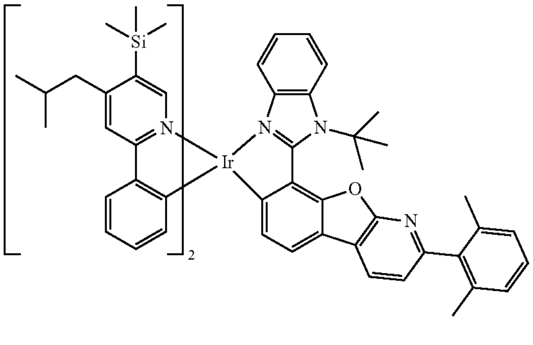

-continued
63
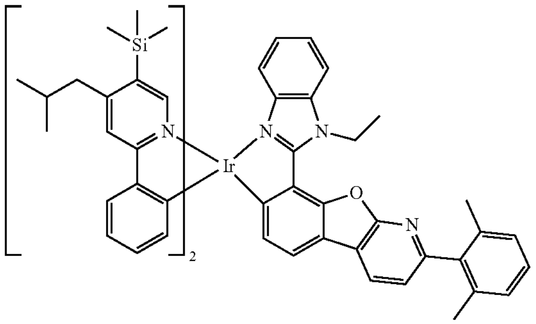
64
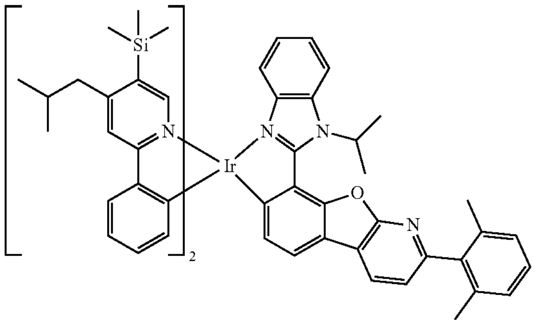
65
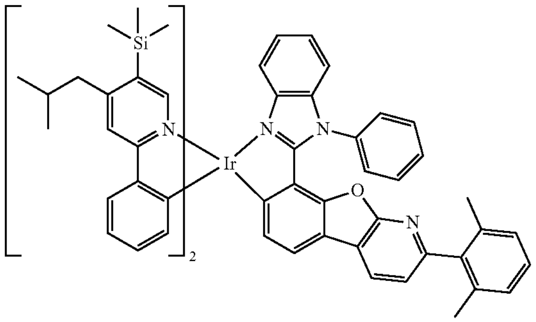
66
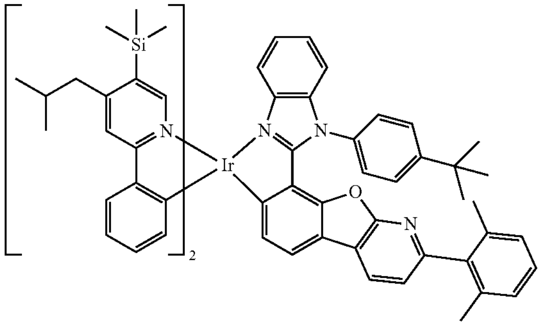
67
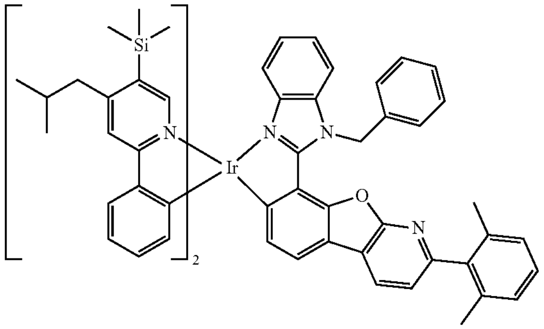
68
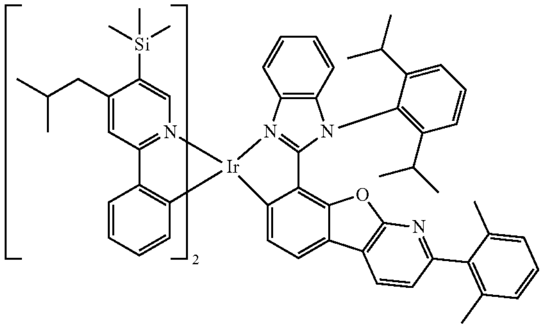
69
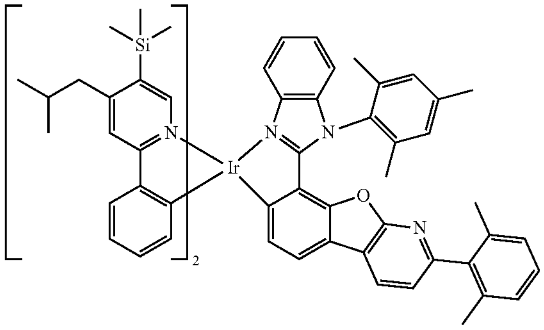
70
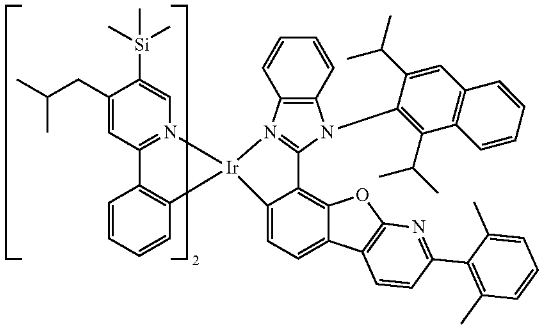

-continued
71
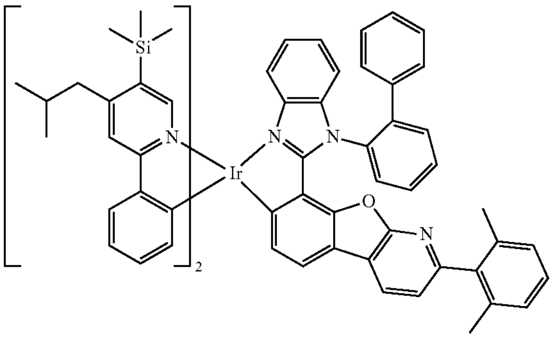
72
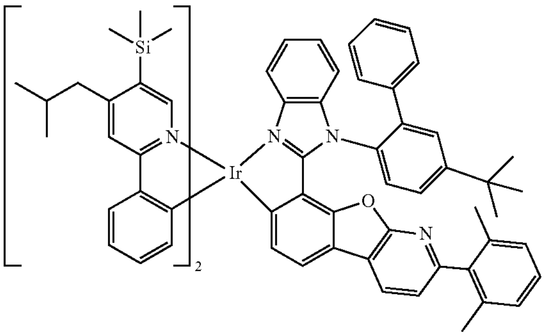
73
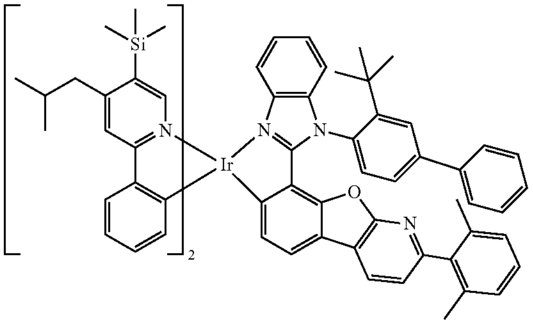
74
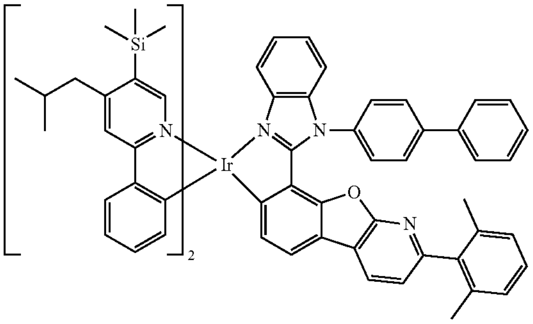
75
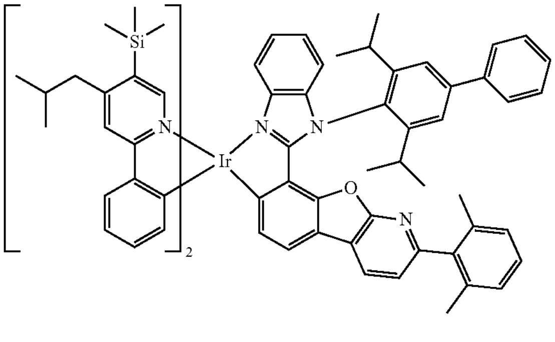
76
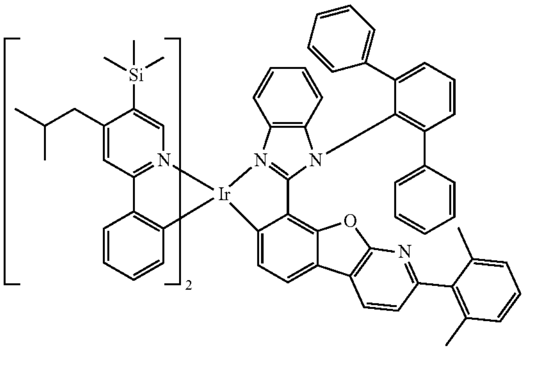
77
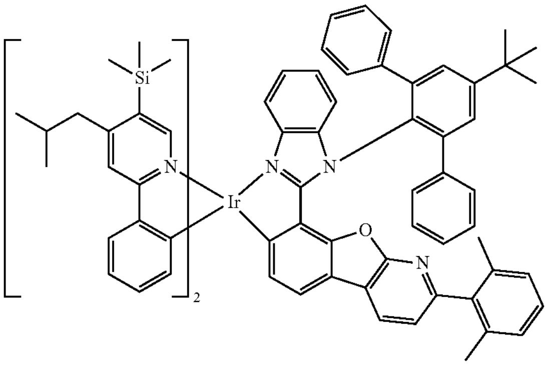
78
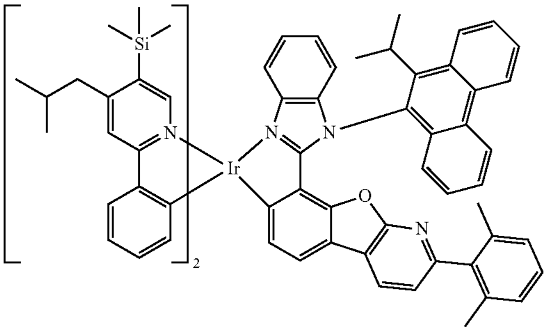

-continued
79
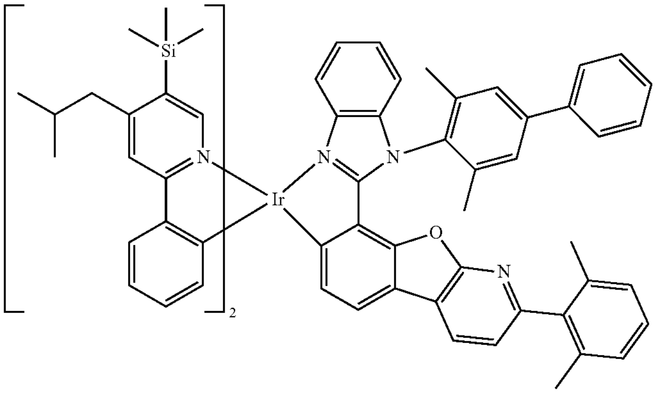
80
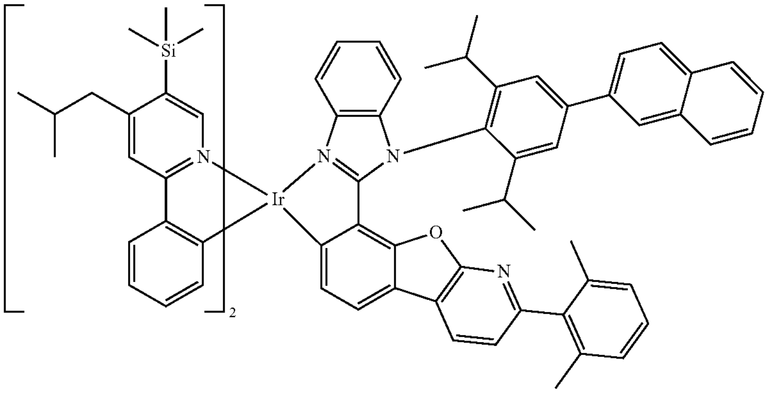
81
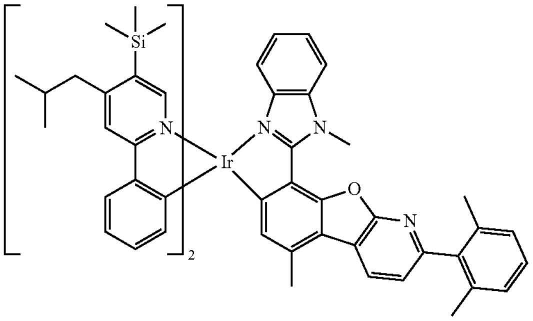
82
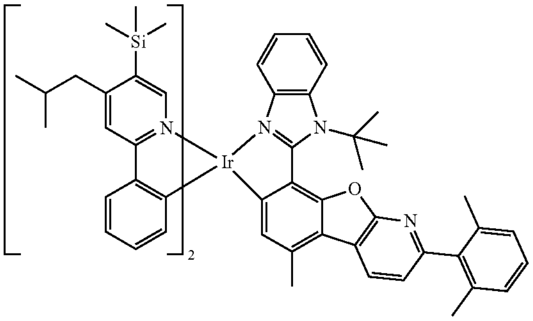
83
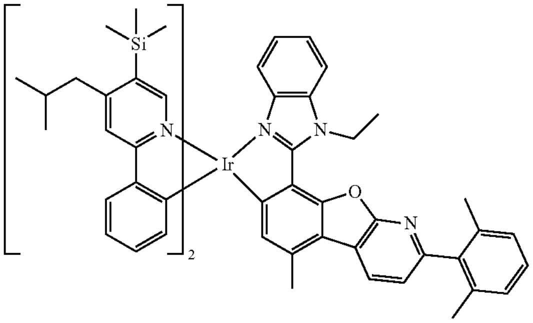
84
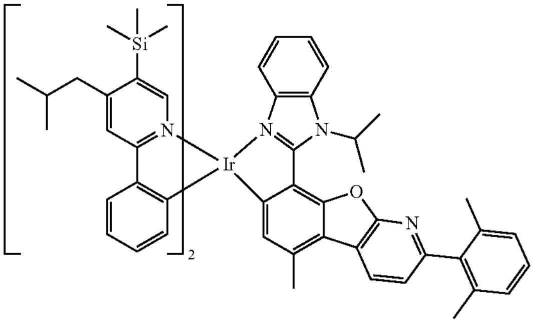

-continued
85
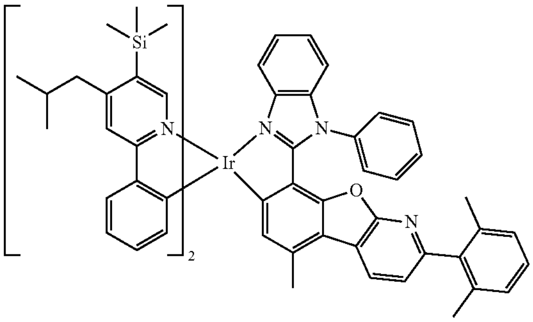
86
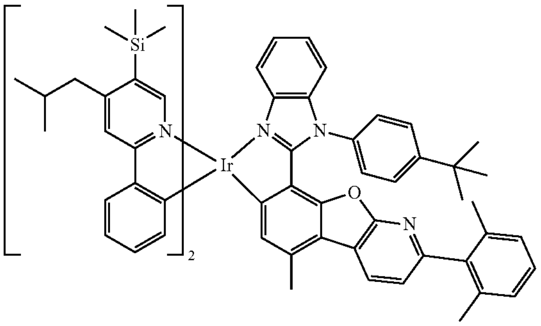
87
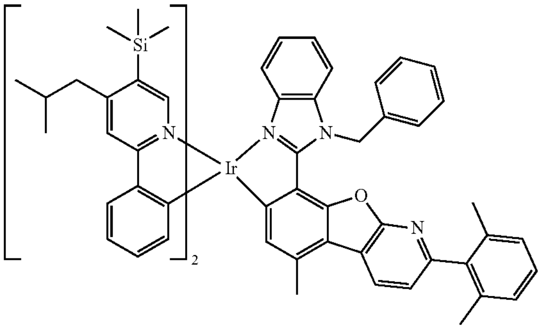
88
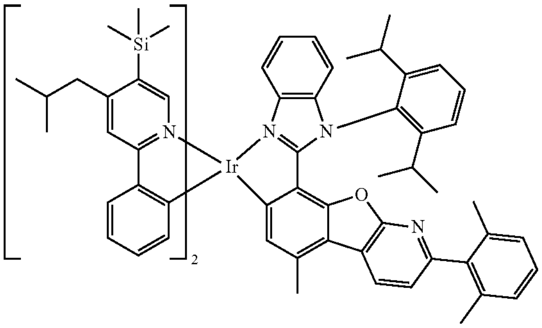
89
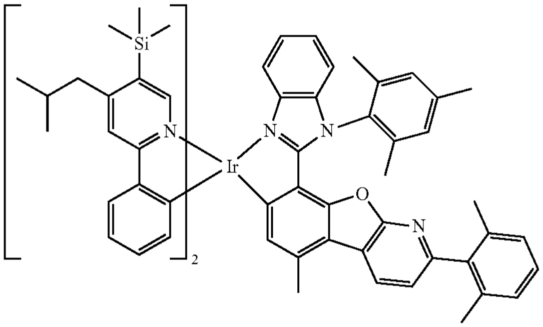
90
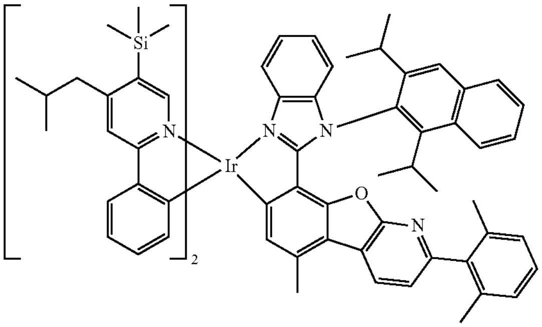
91
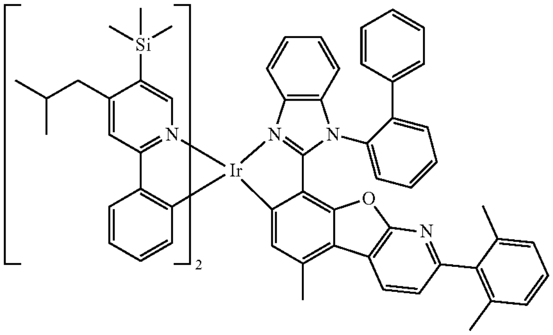
92
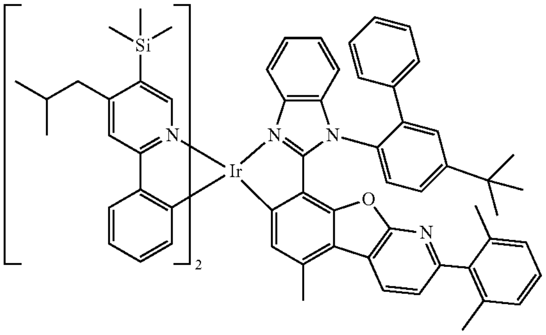

-continued
93
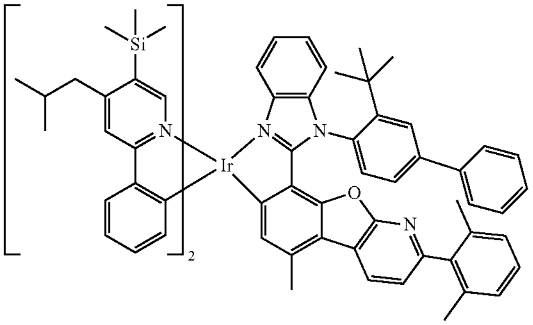
94
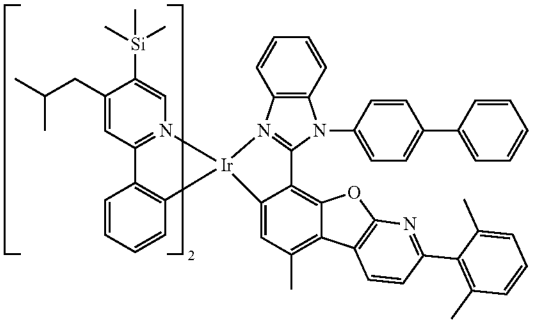
95
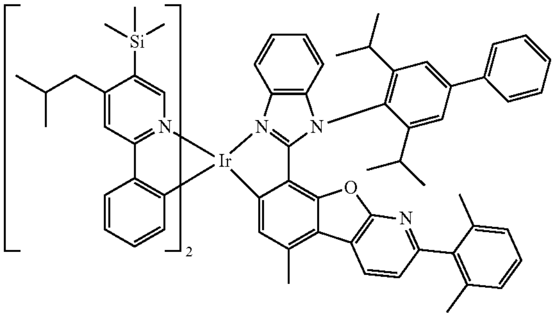
96
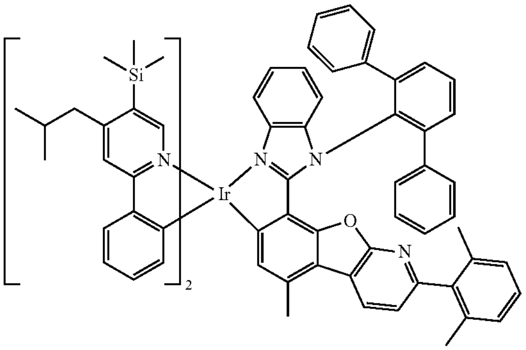
97
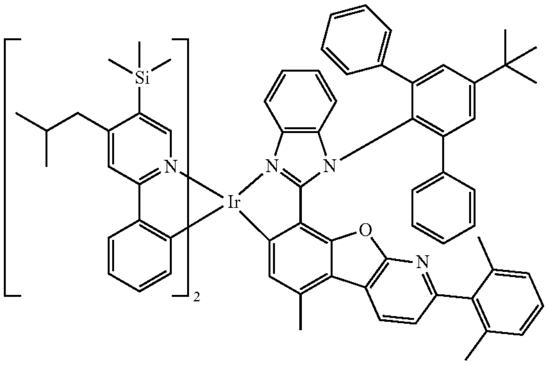
98
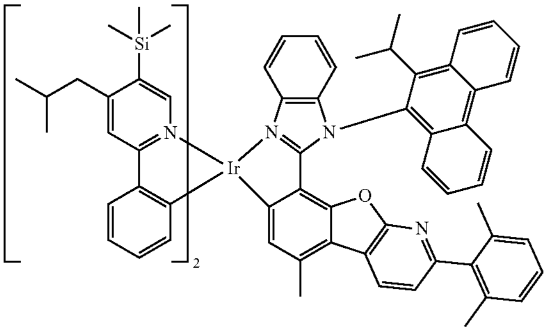
99
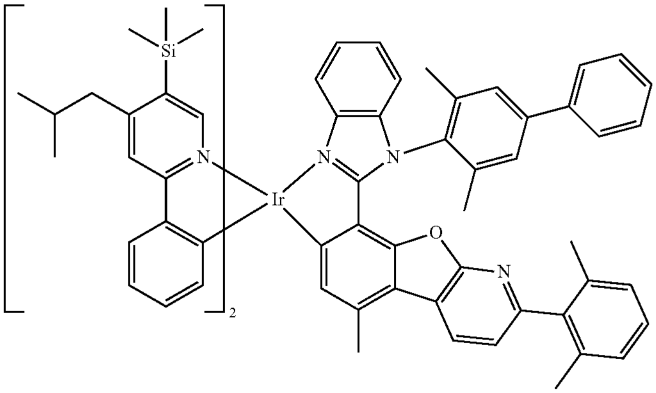

-continued
100
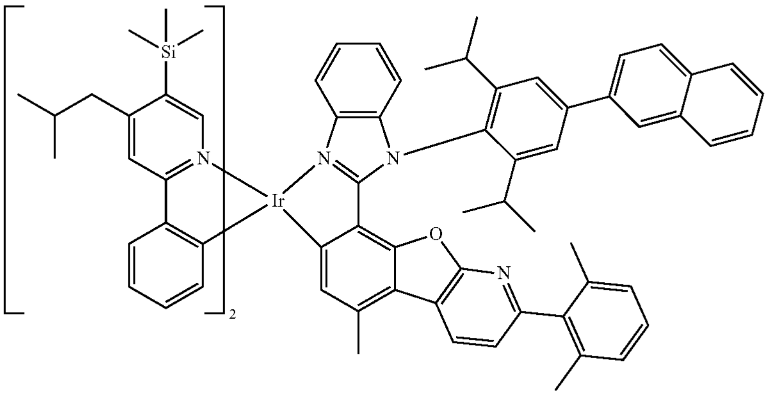
101
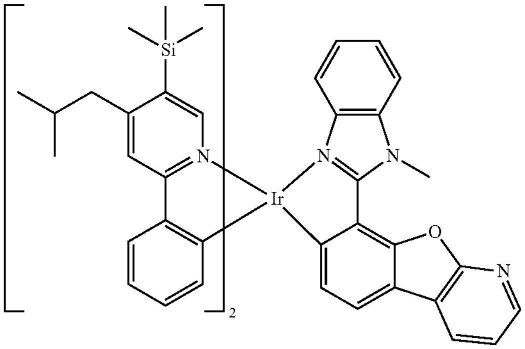
102
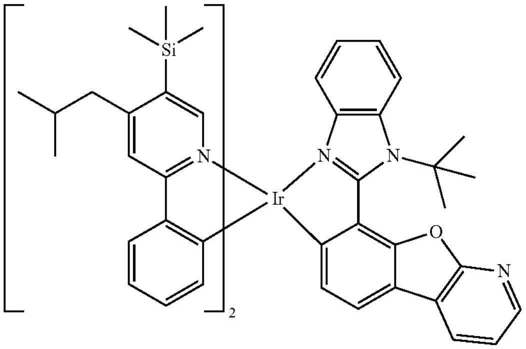
103
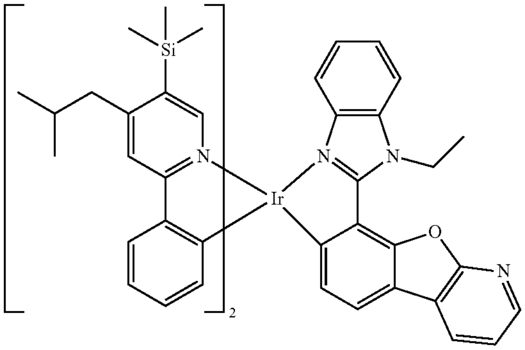
104
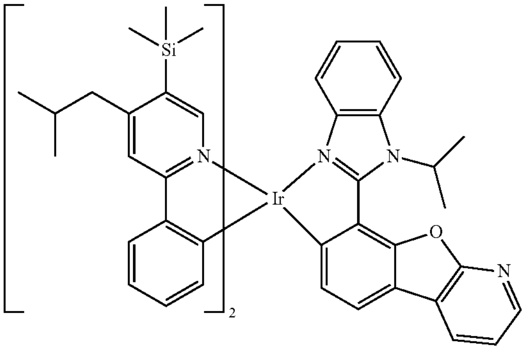
105
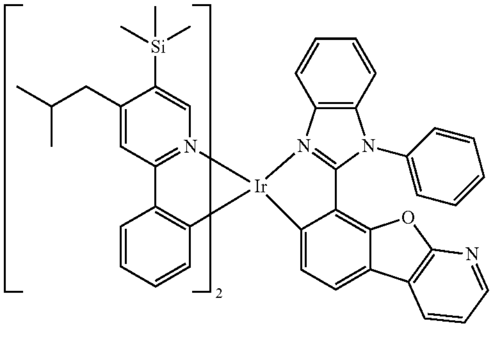
106
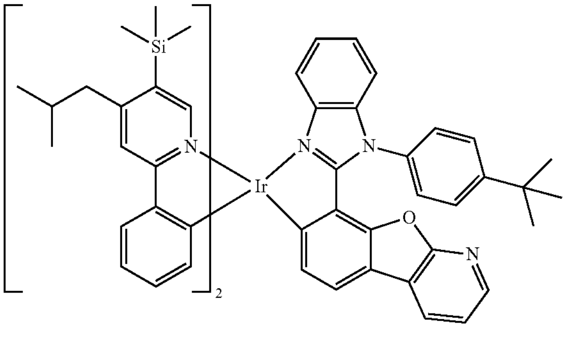

-continued
107
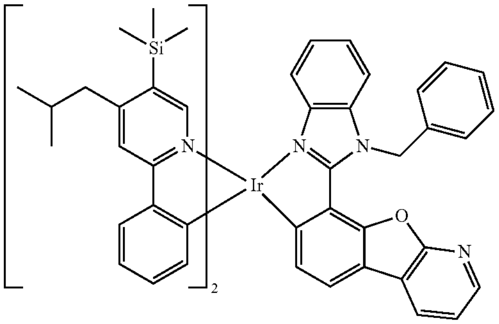
108
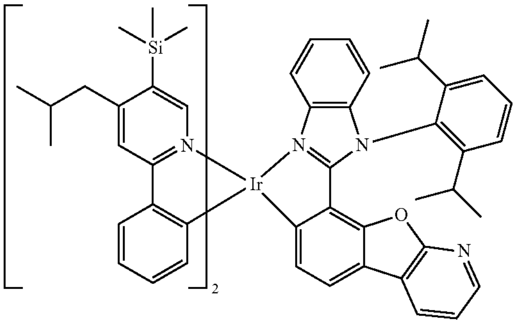
109
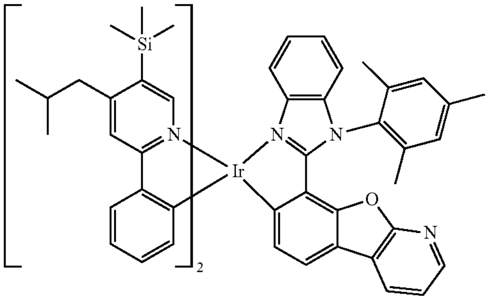
110
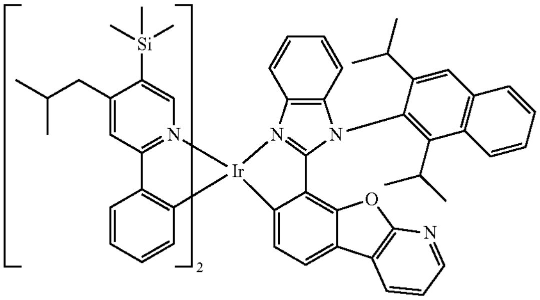
111
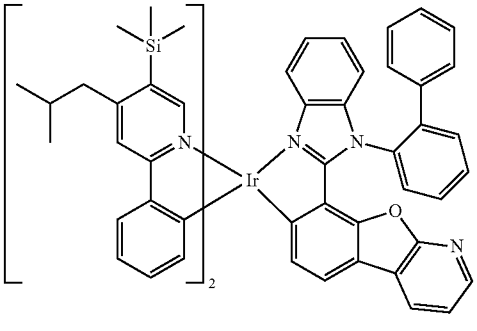
112
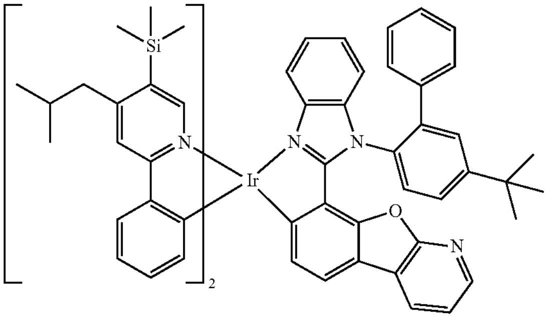
113
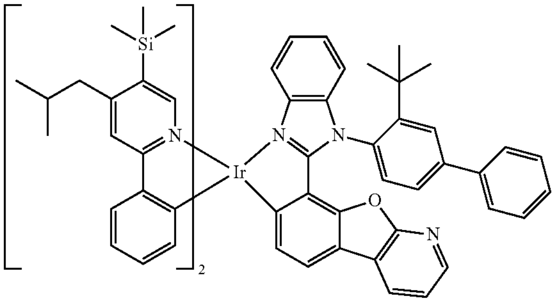
114
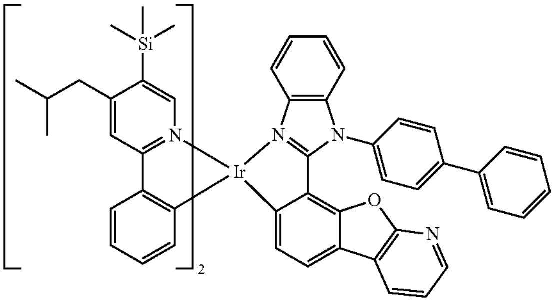
115
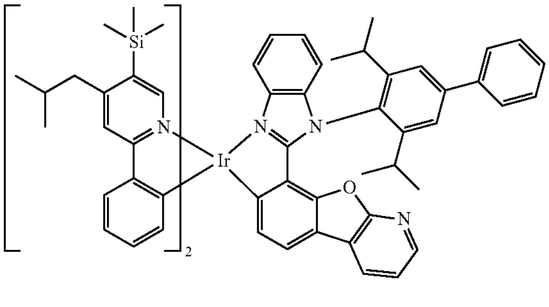
116
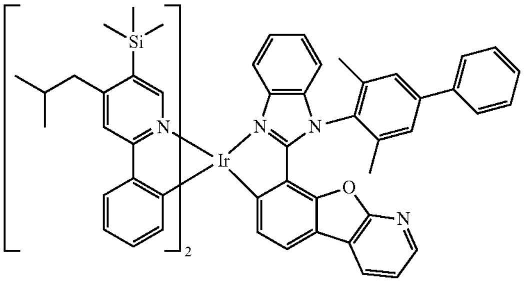

-continued
117
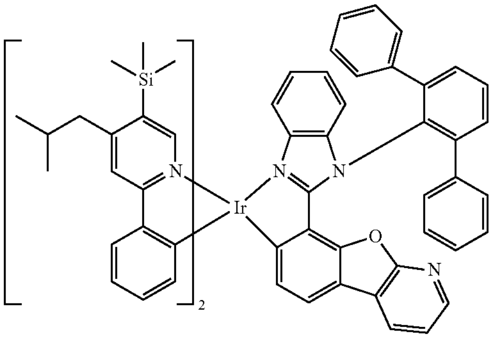
118
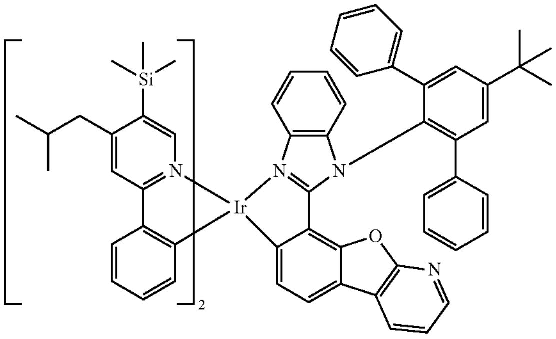
119
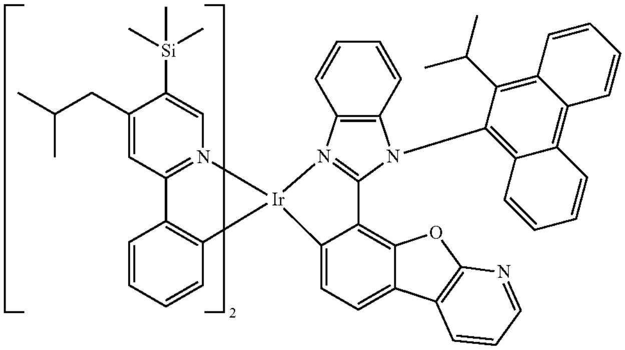
120
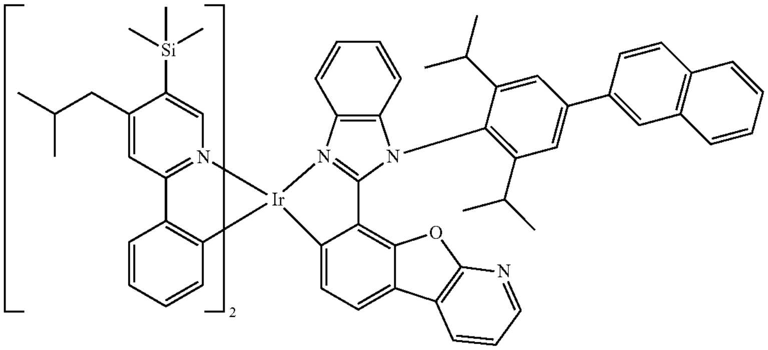
121
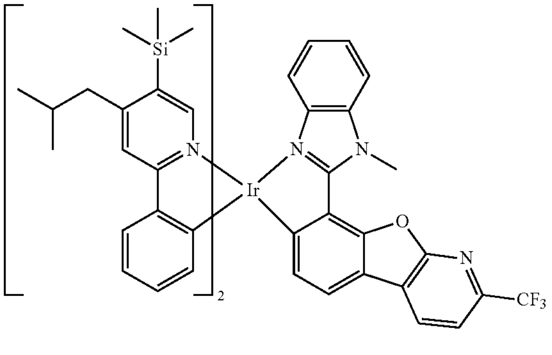
122
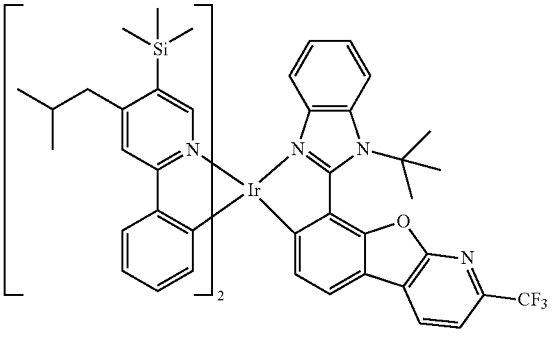

-continued
123
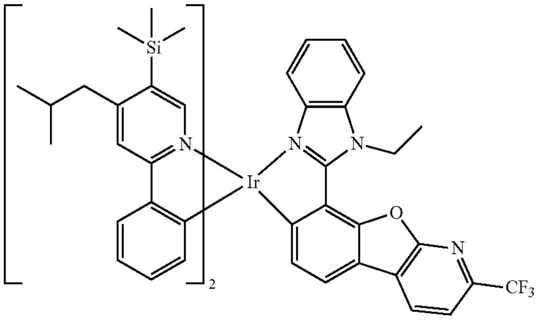
124
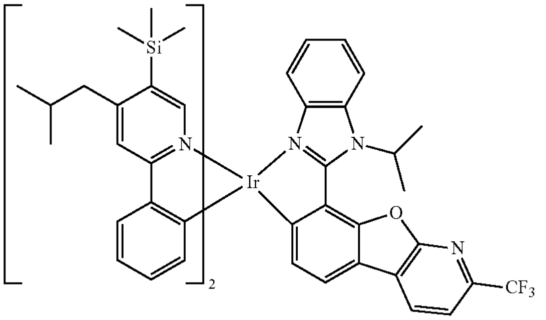
125
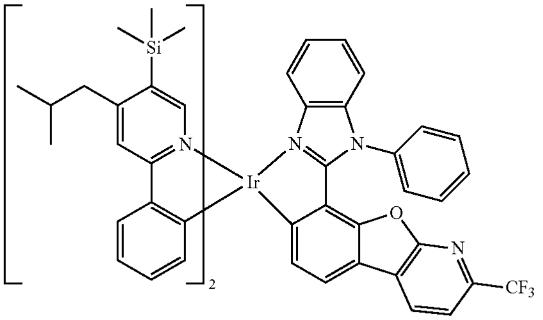
126
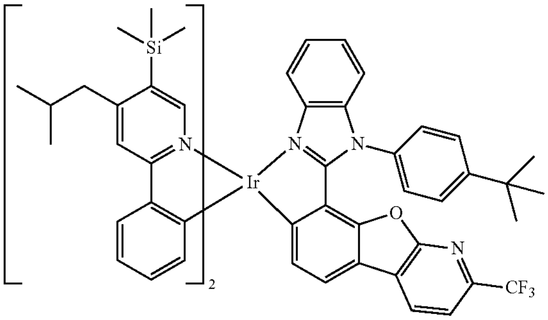
127
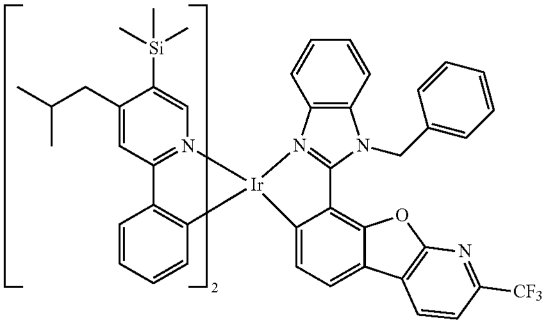
128
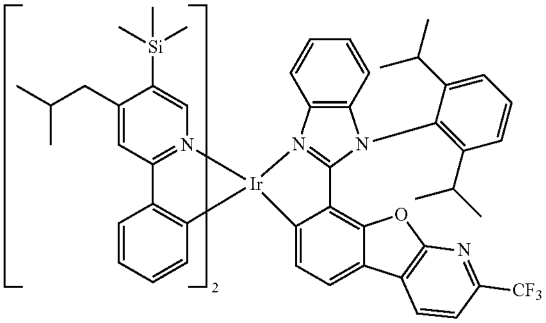
129
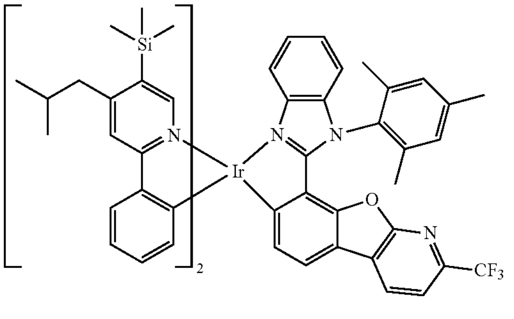
130
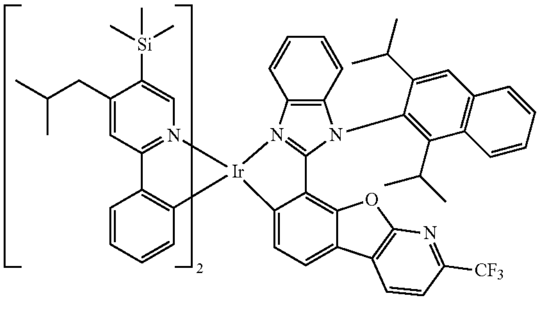
131
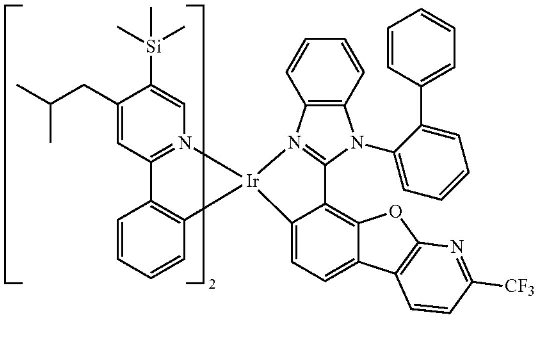
132
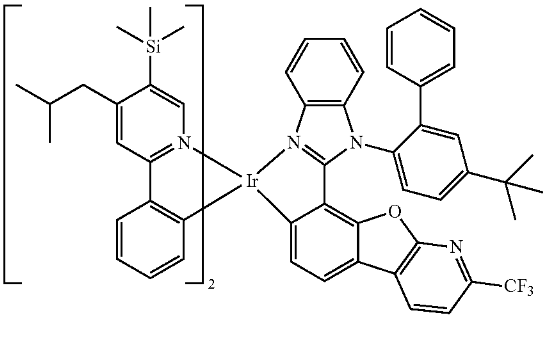

-continued
133
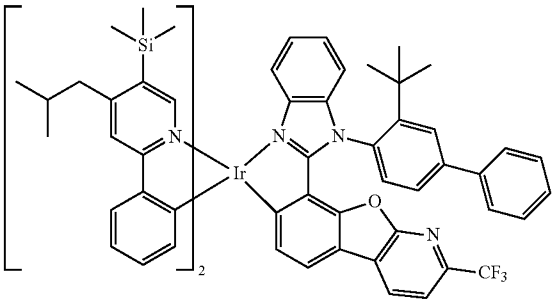
134
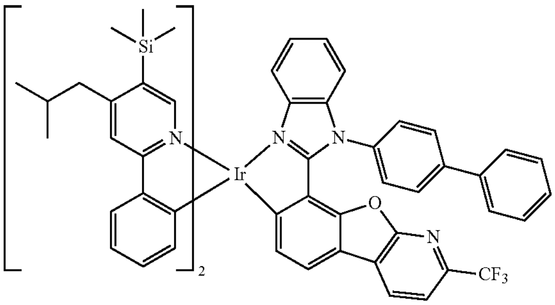
135
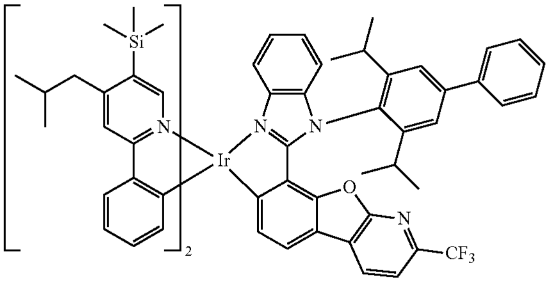
136
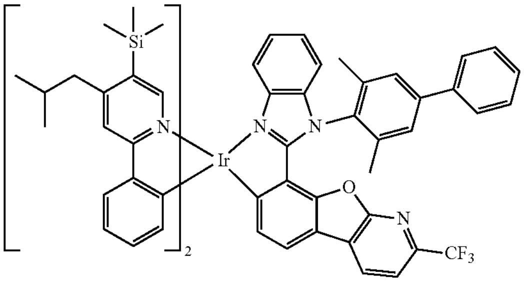
137
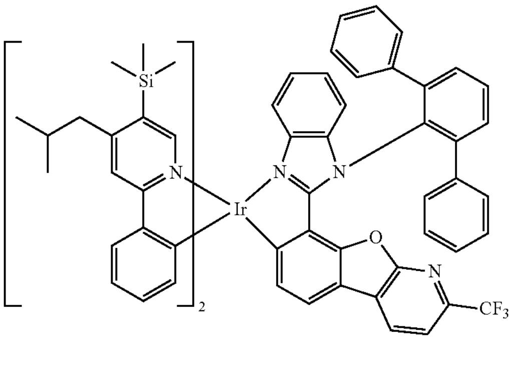
138
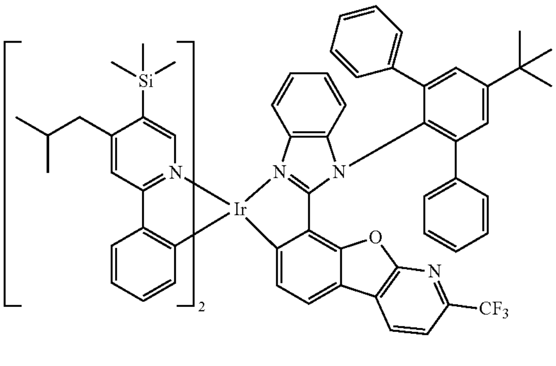
139
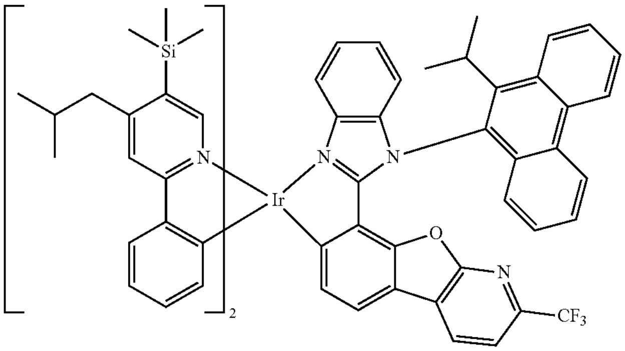

-continued
140
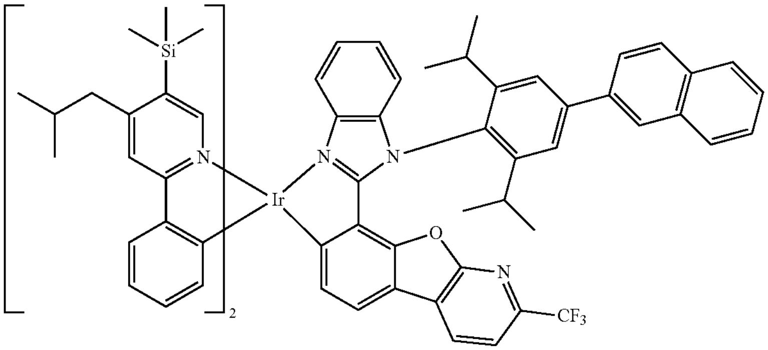
141
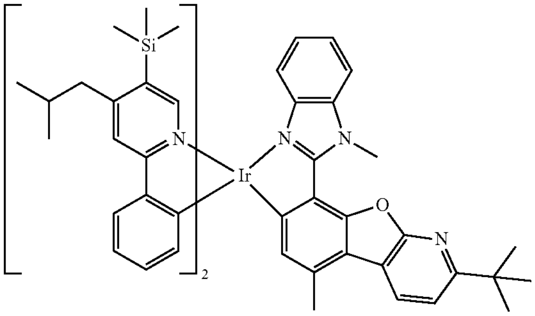
142
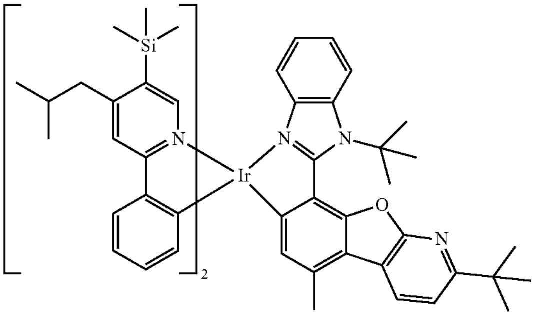
143
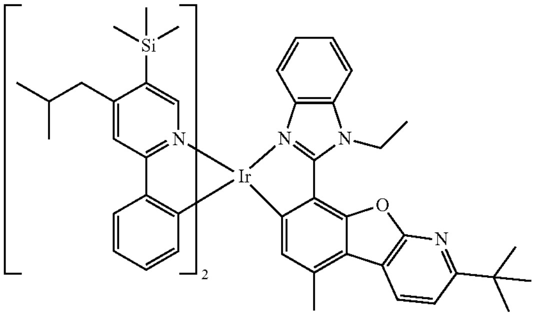
144
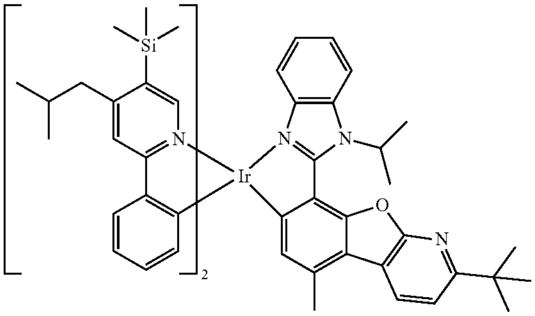
145
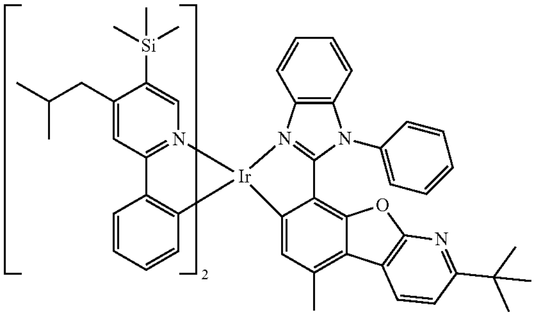
146
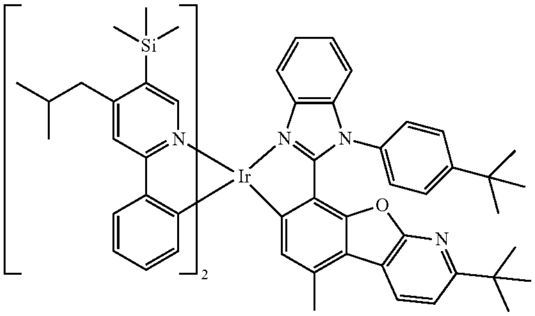
147
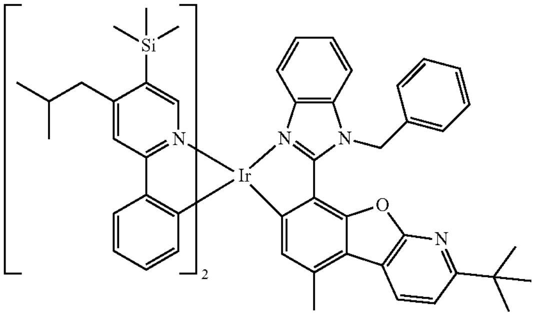
148
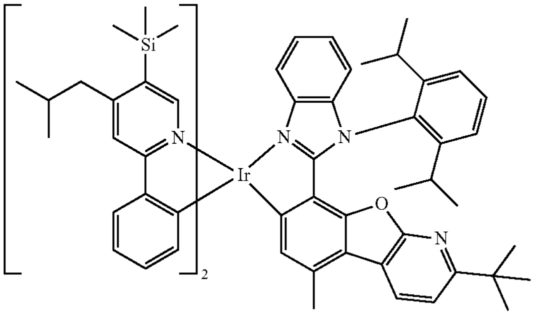

-continued
149
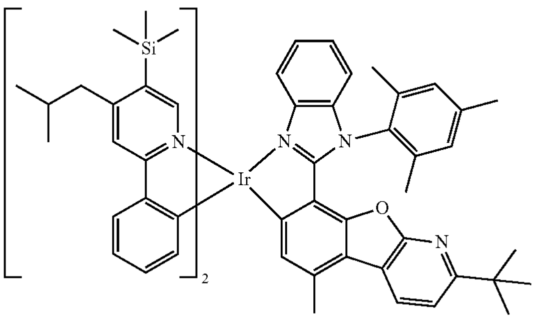
150
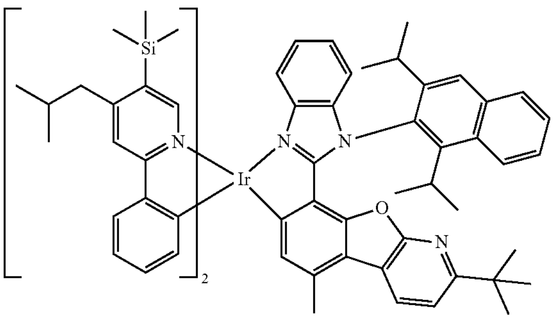
151
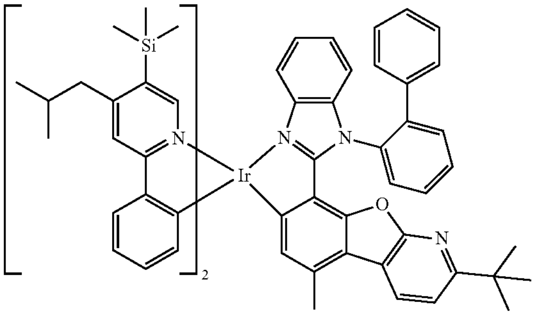
152
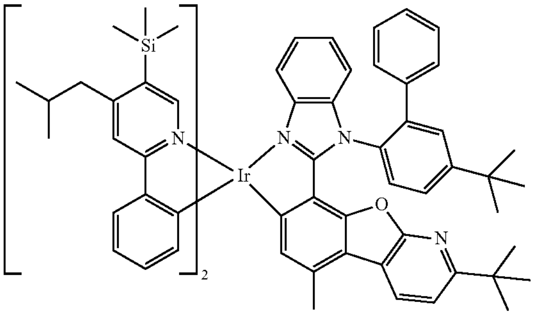
153
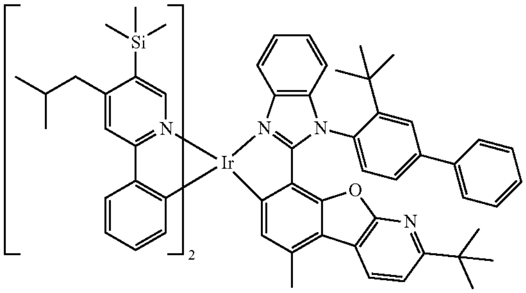
154
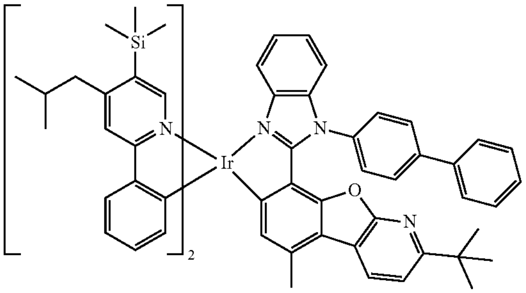
155
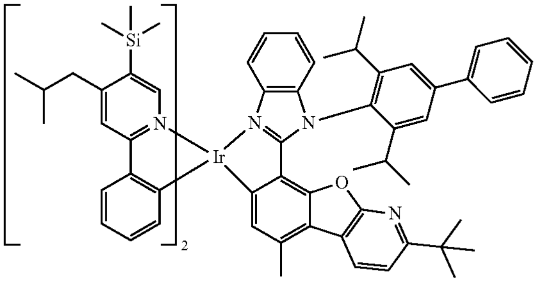
156
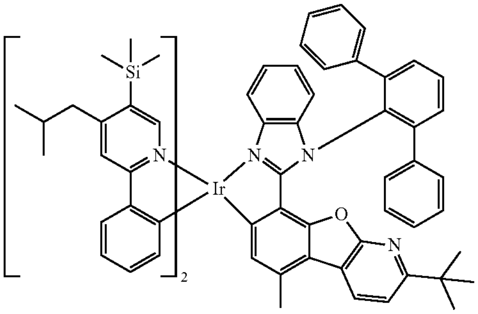
157
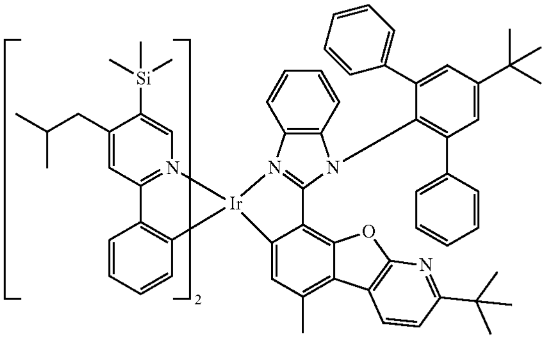
158
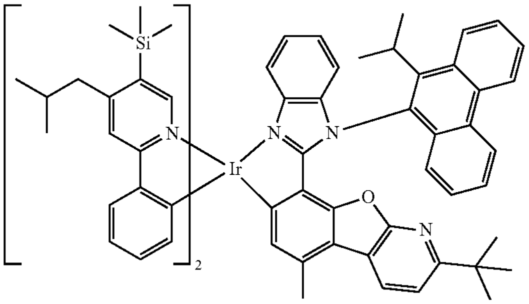

-continued
159
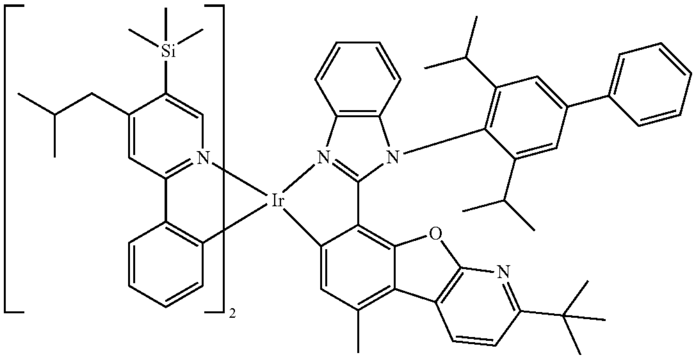
160
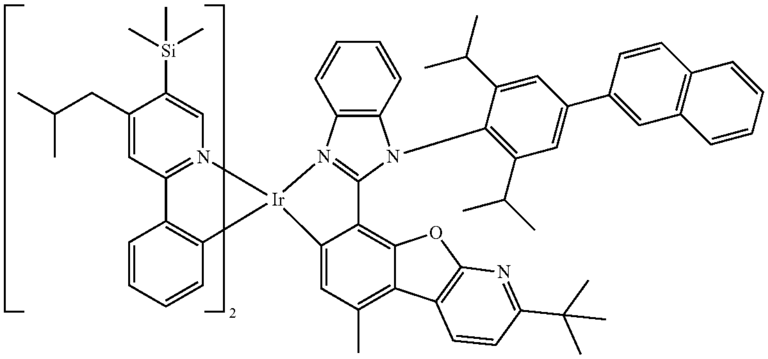
161
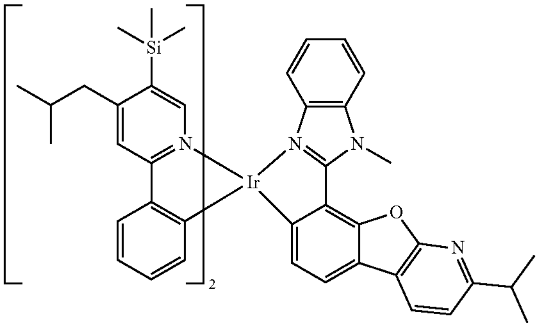
162
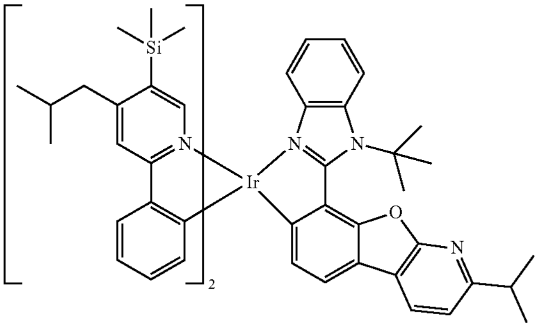
163
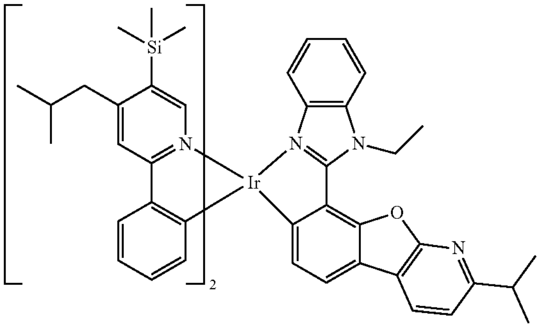
164
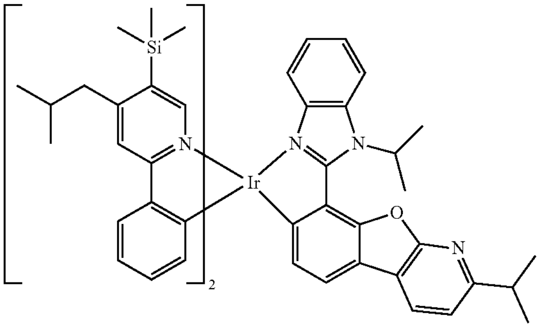

-continued
165
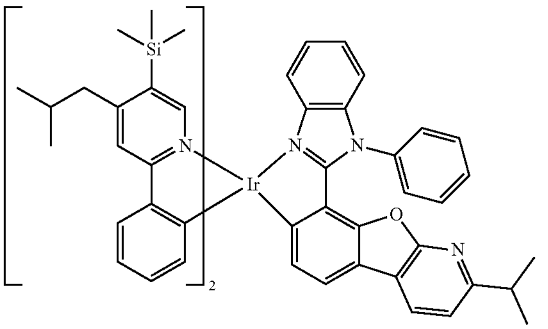
166
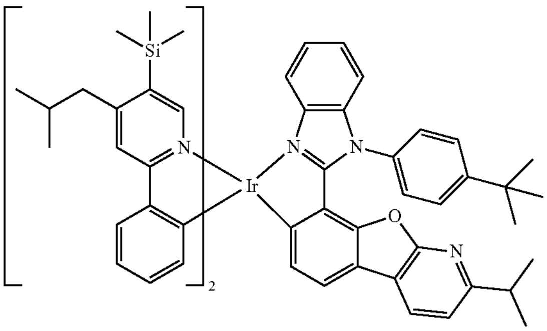
167
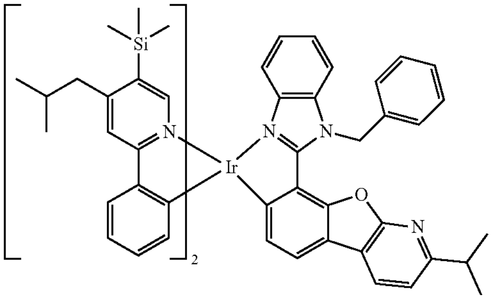
168
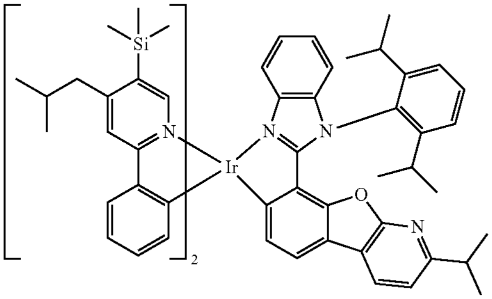
169
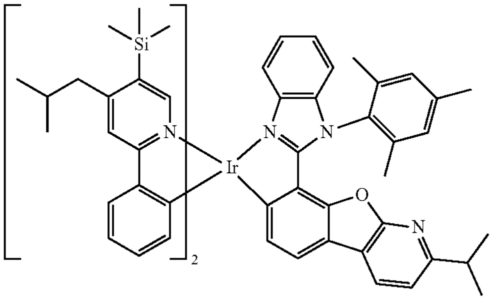
170
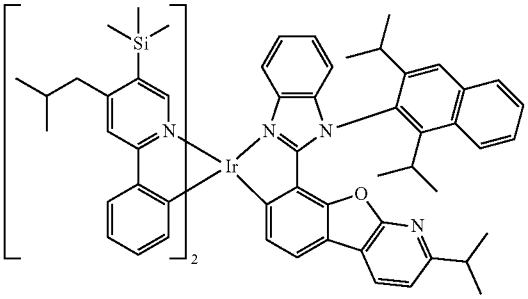
171
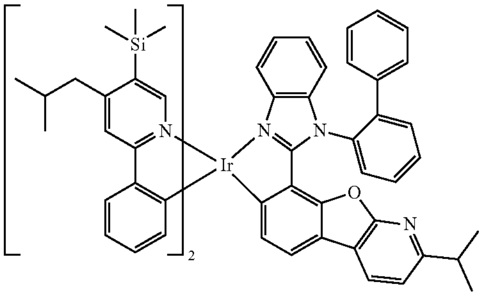
172
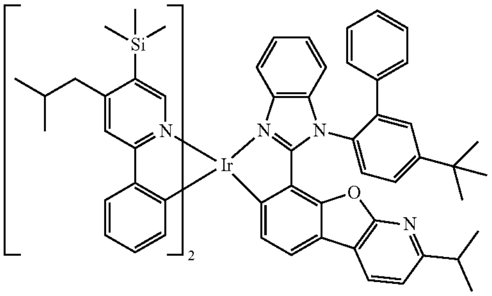
173
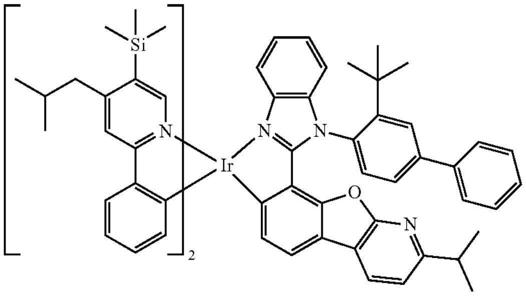
174
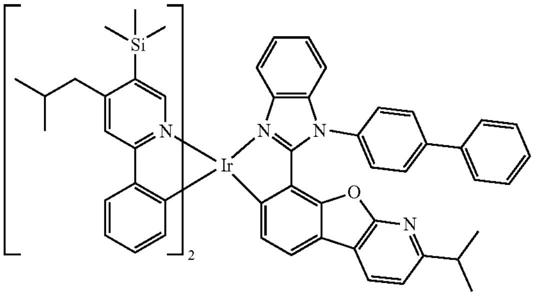

-continued
175
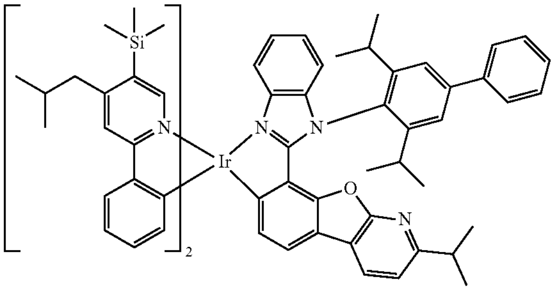
176
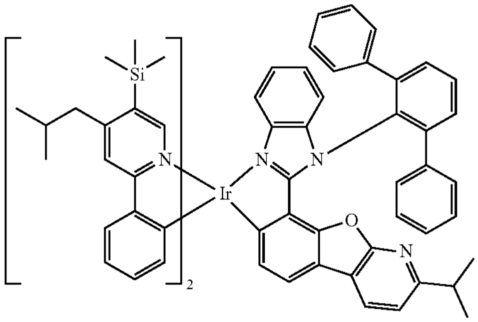
177
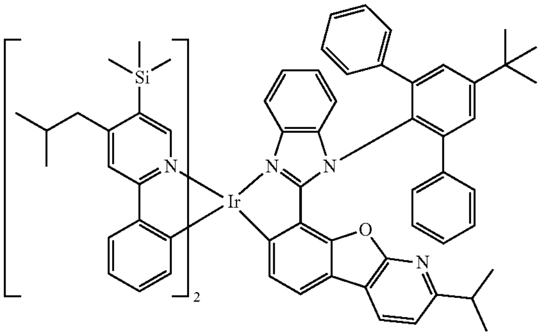
178
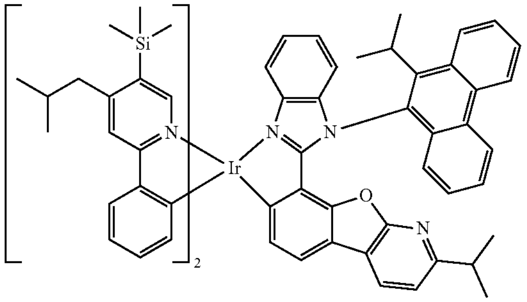
179
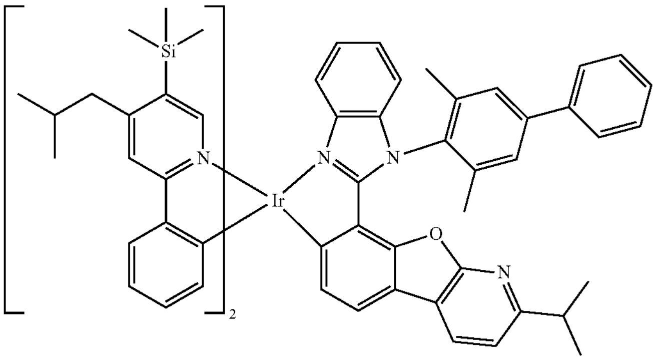
180
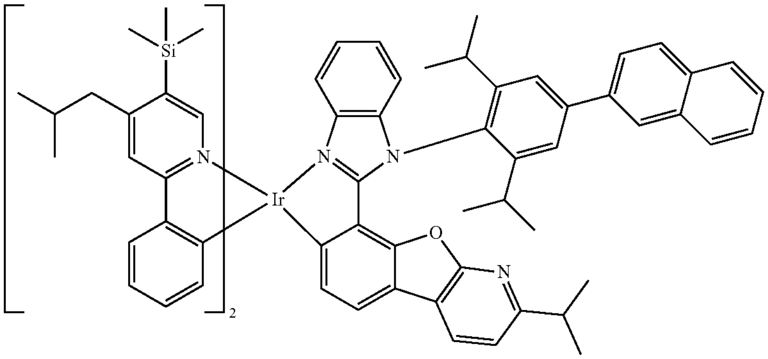

-continued
181
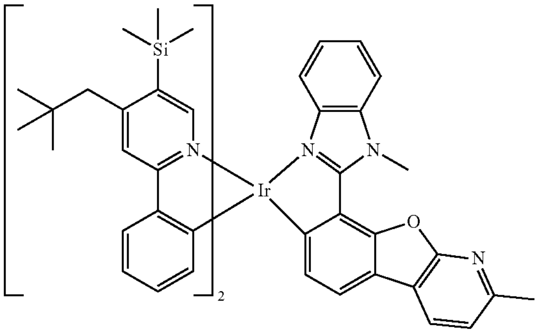
182
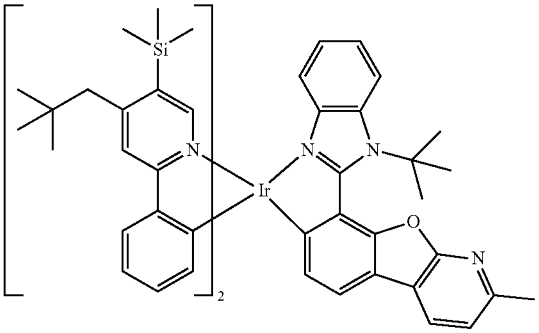
183
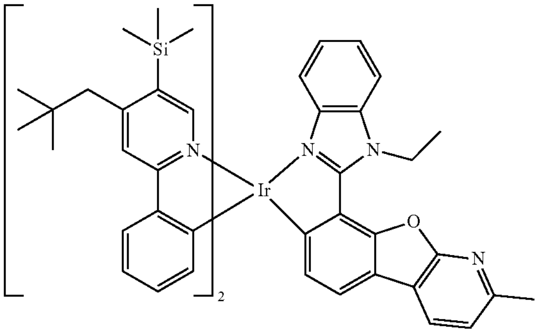
184
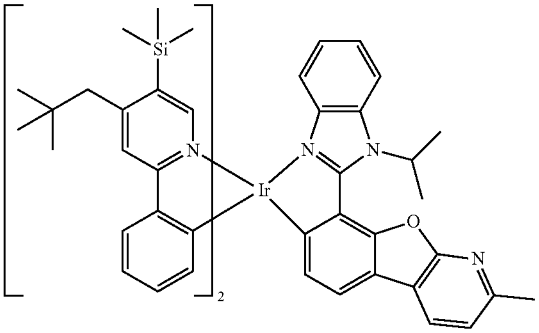
185
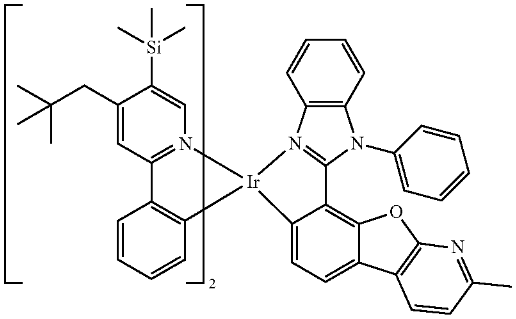
186
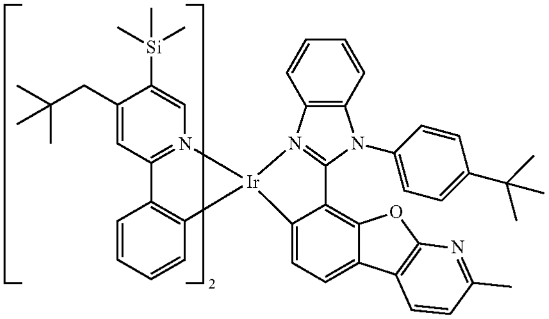
187
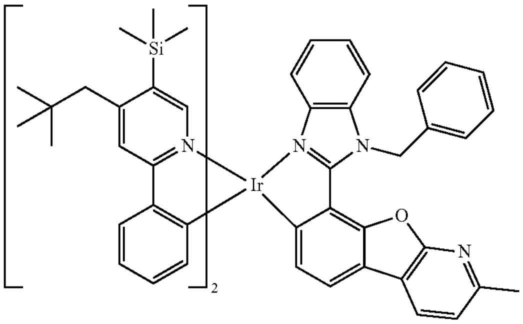
188
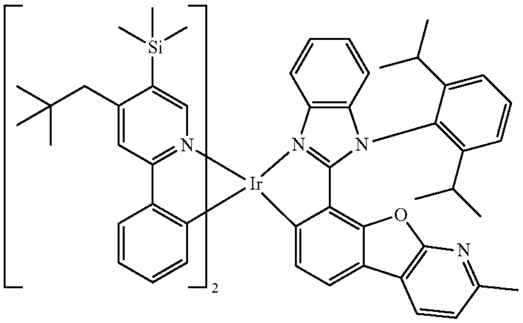
189
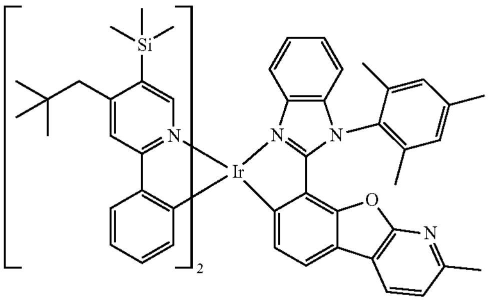
190
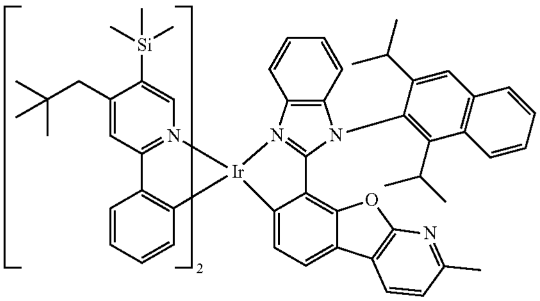

-continued
191
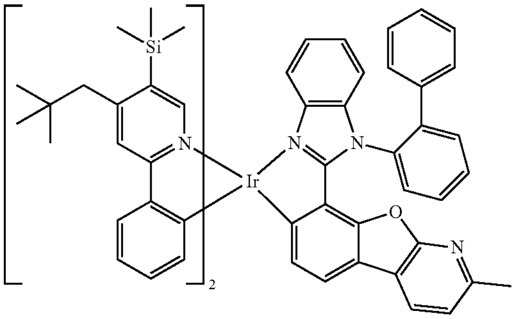
192
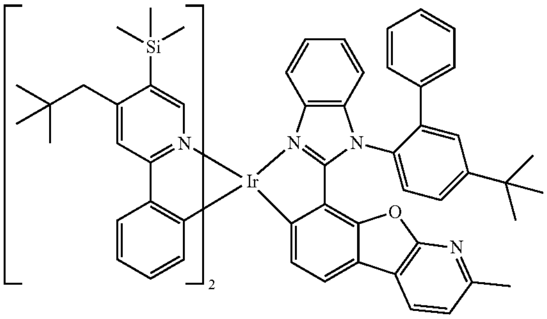
193
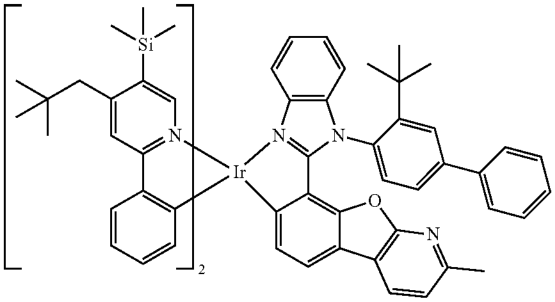
194
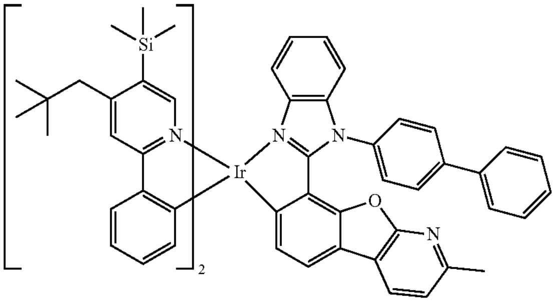
195
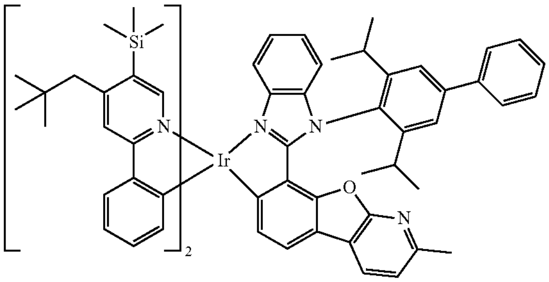
196
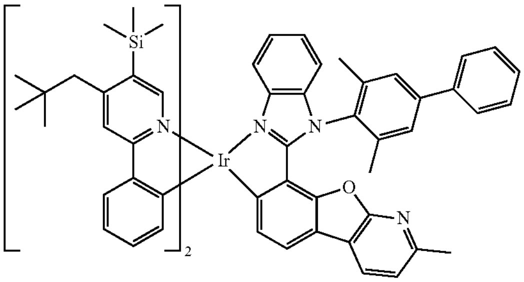
197
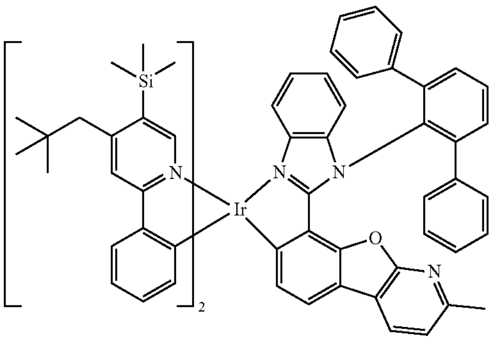
198
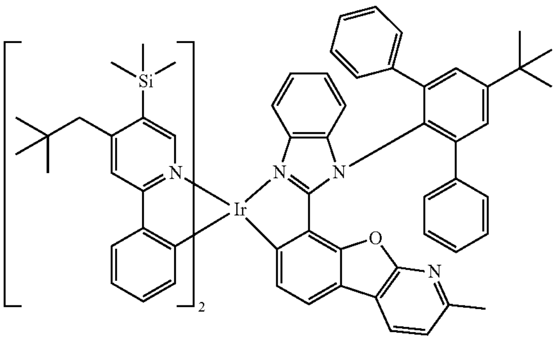

-continued
199
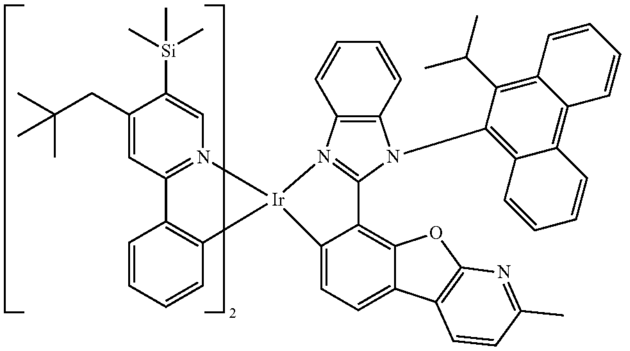
200
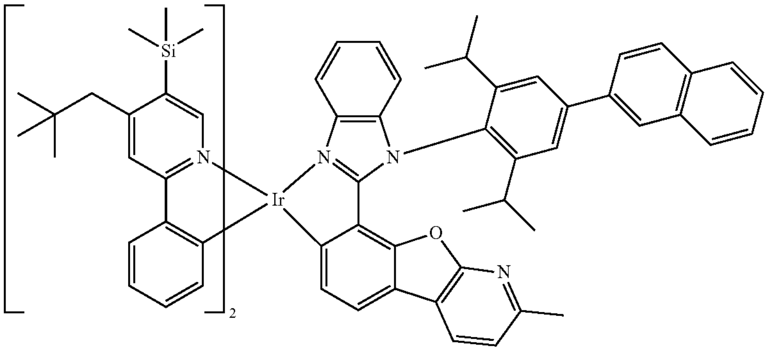
201
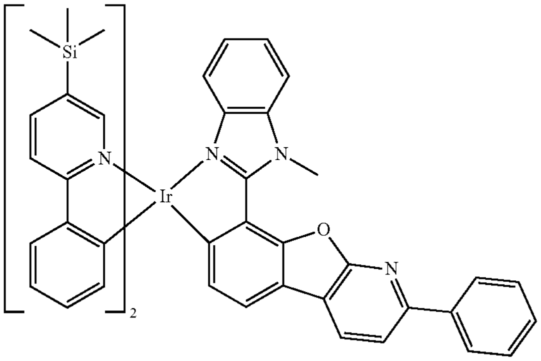
202
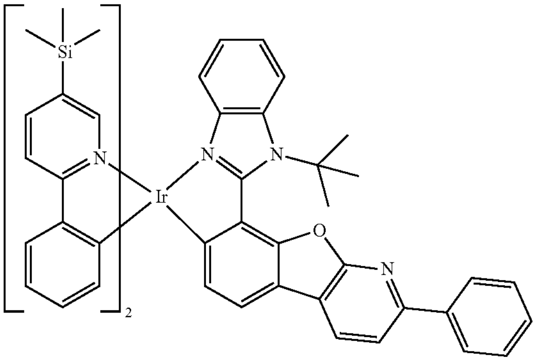
203
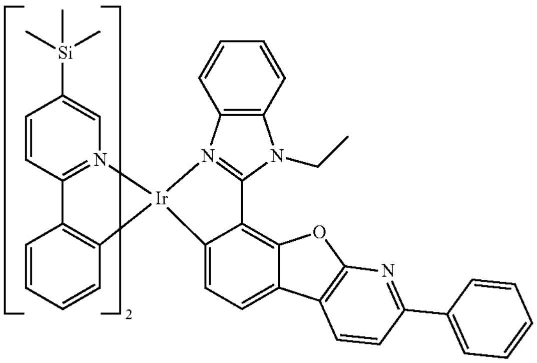
204
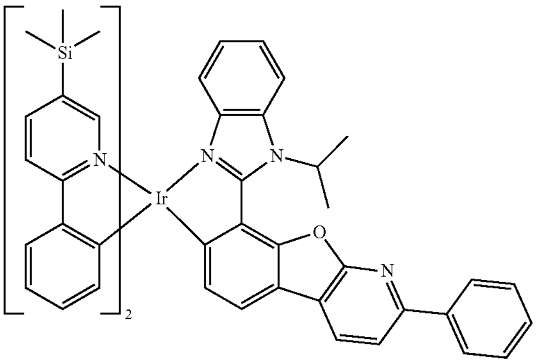

-continued
205
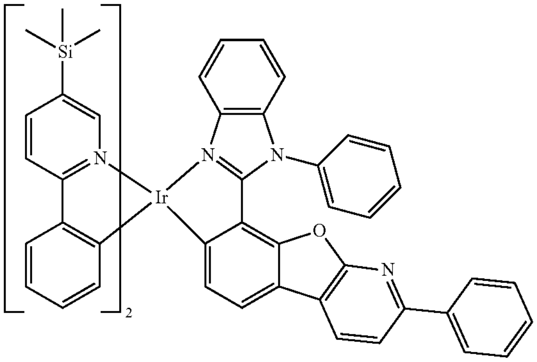
206
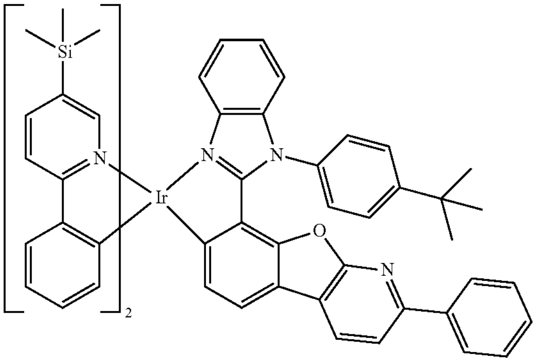
207
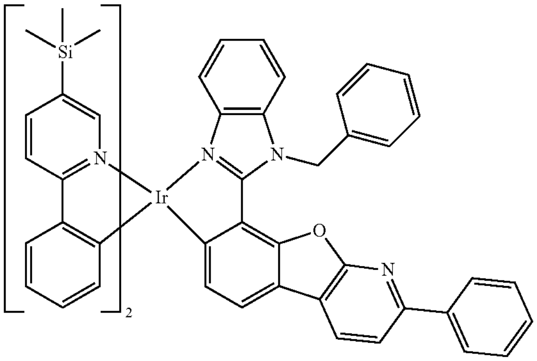
208
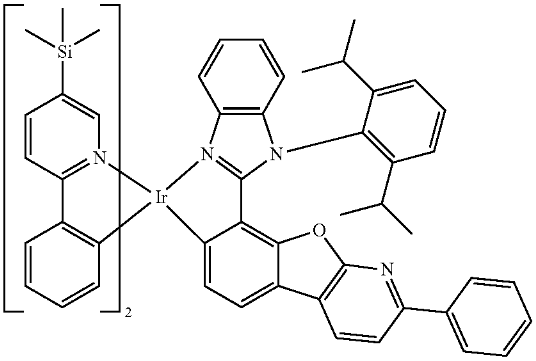
209
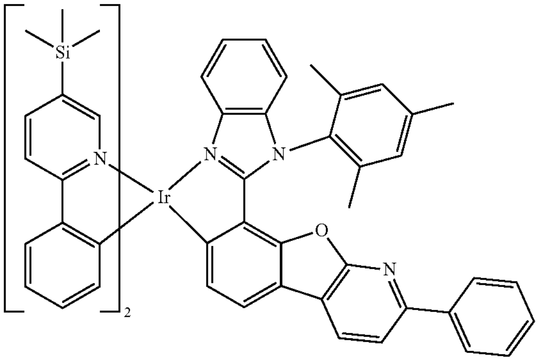
210
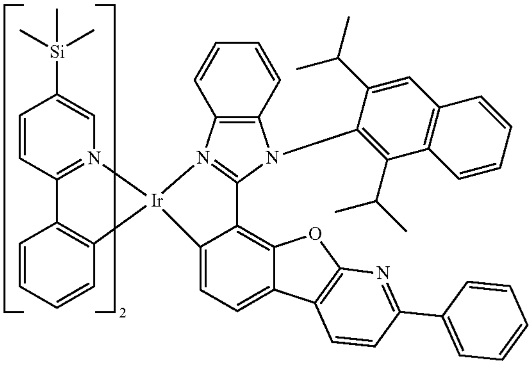
211
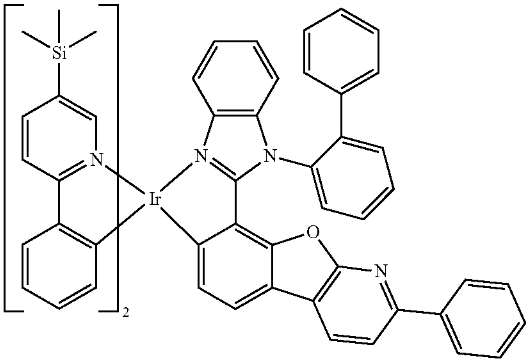
212
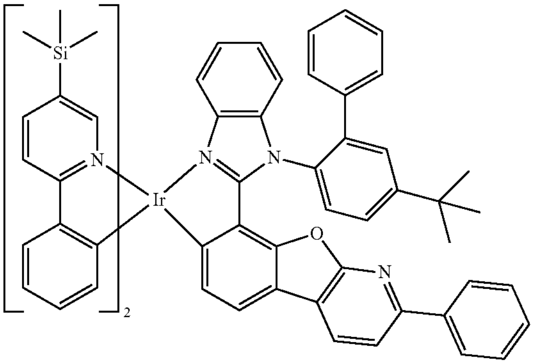

-continued
213
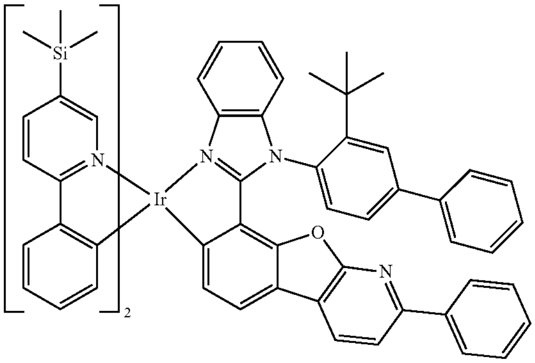
214
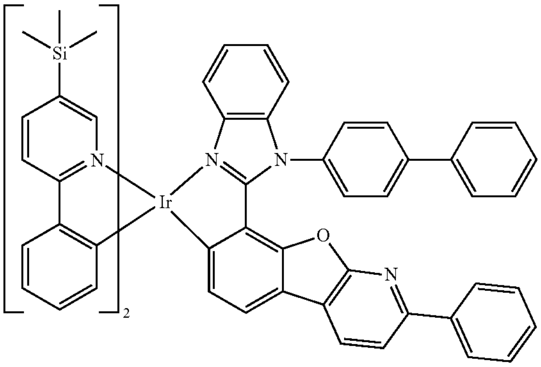
215
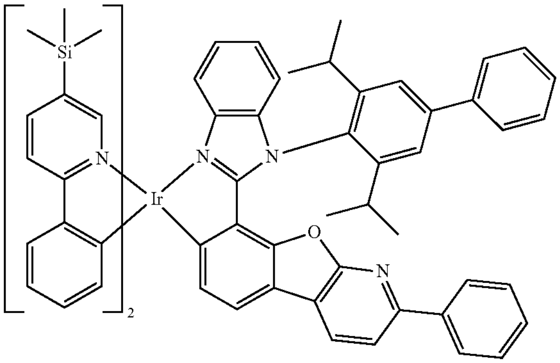
216
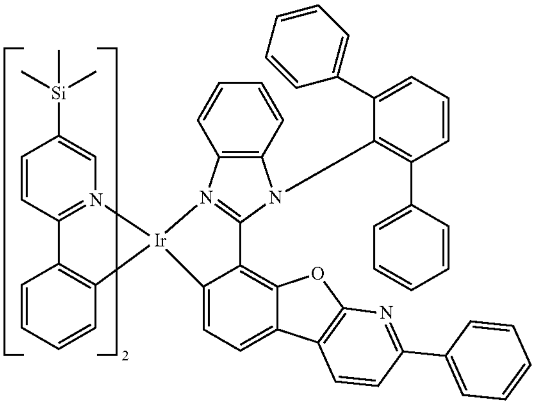
217
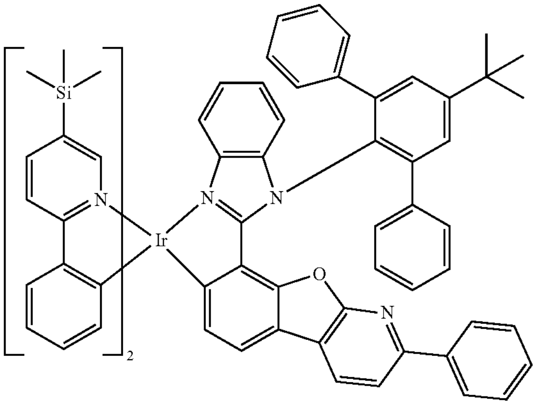
218
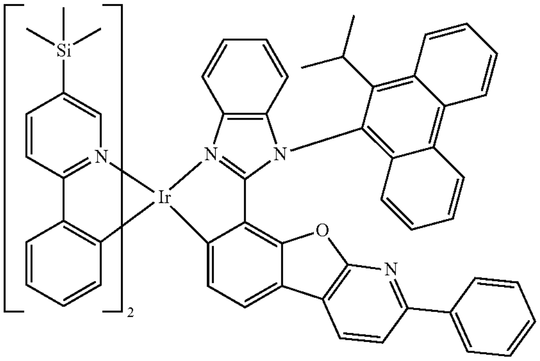
219
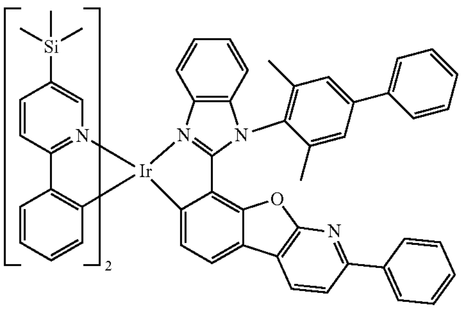
220
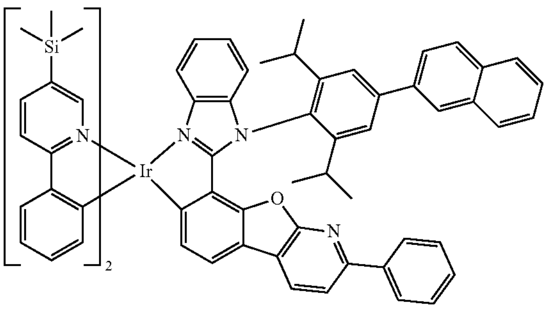

-continued
221
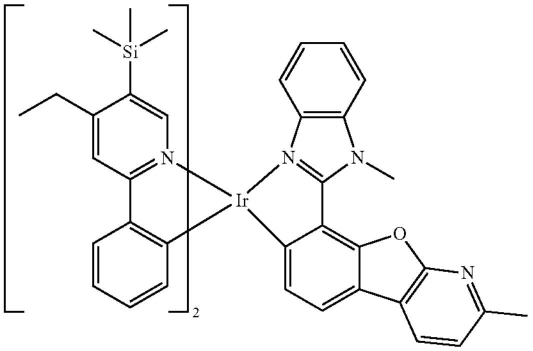
222
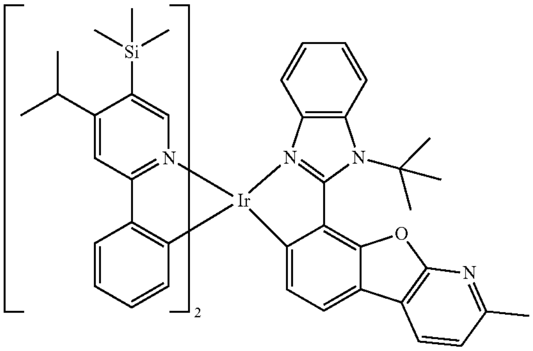
223
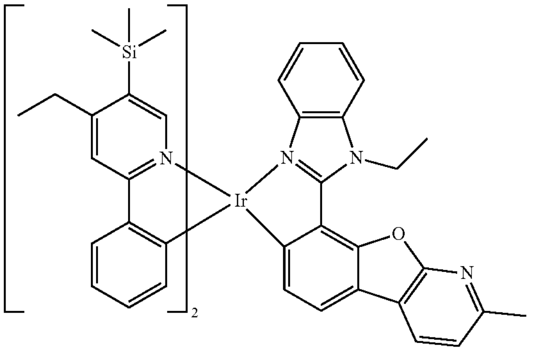
224
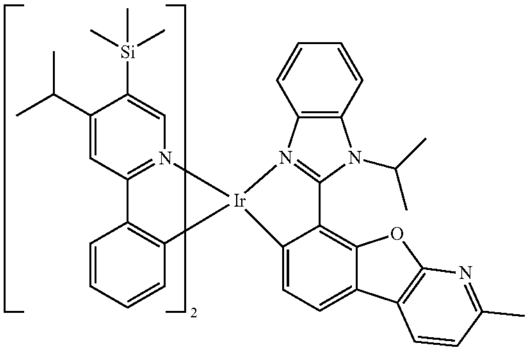
225
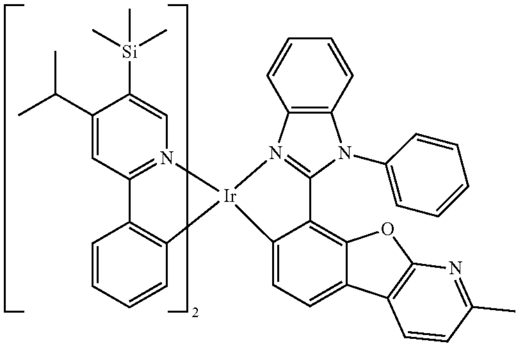
226
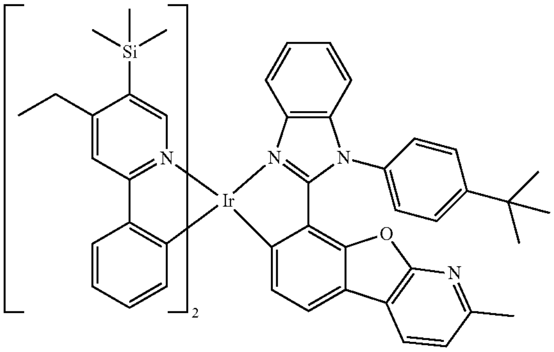
227
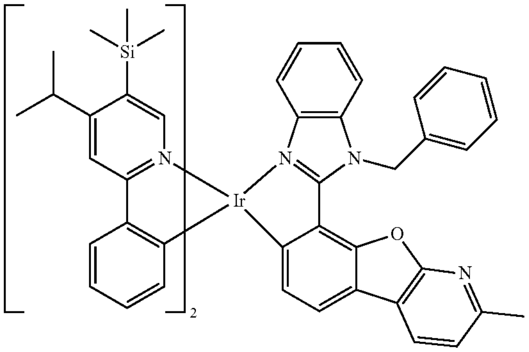
228
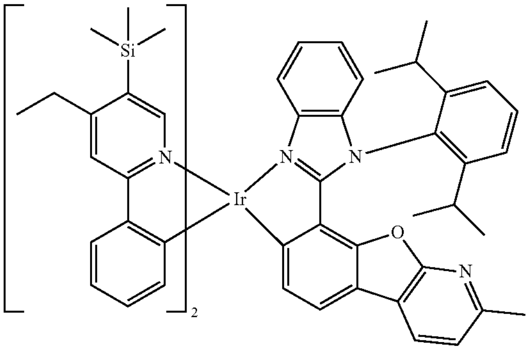

-continued
229
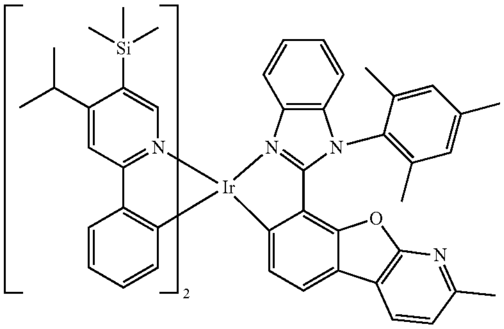
230
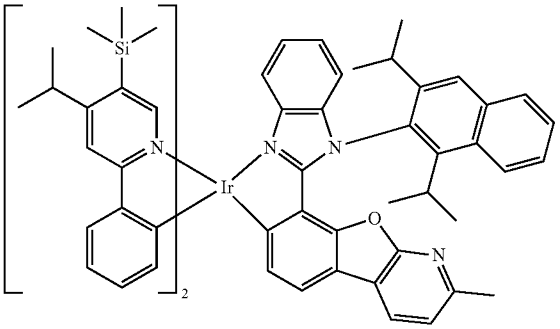
231
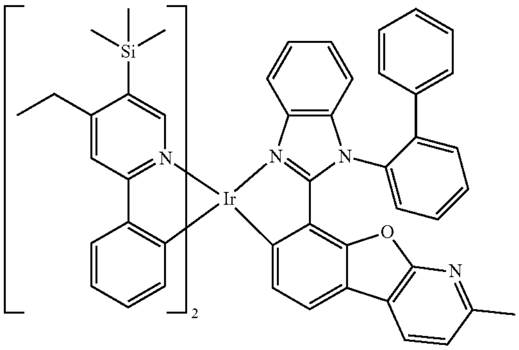
232
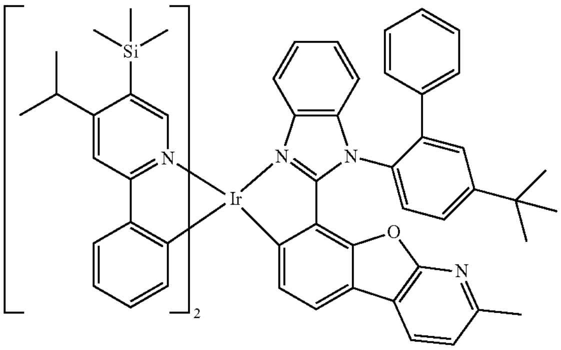
233
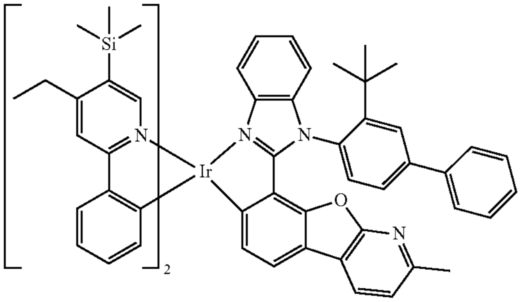
234
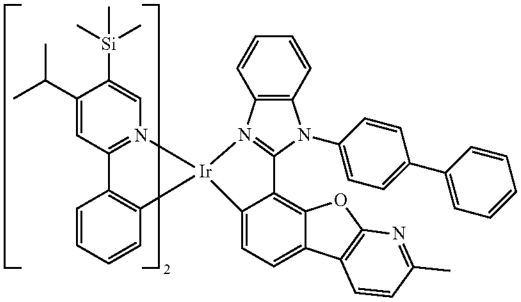
235
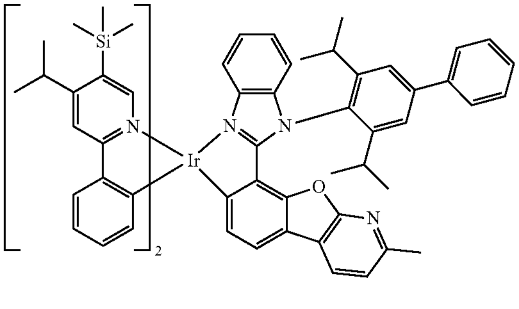
236
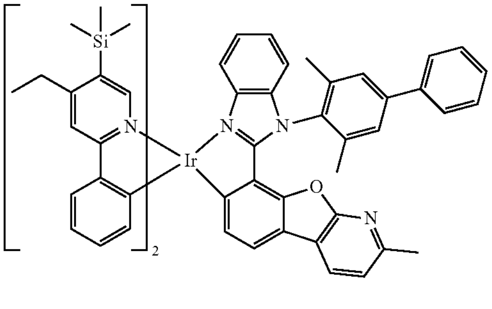

-continued
237
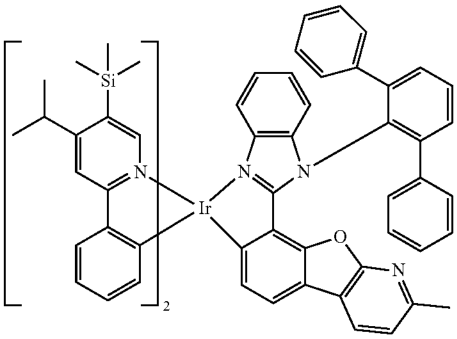
238
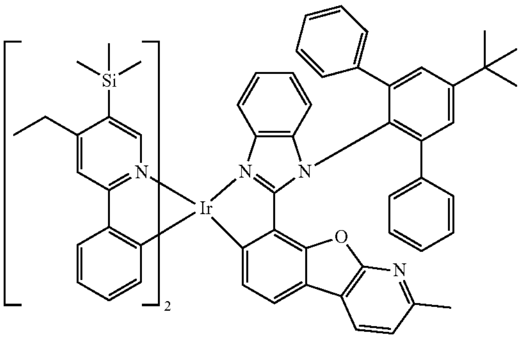
239
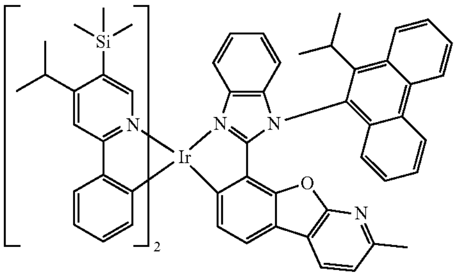
240
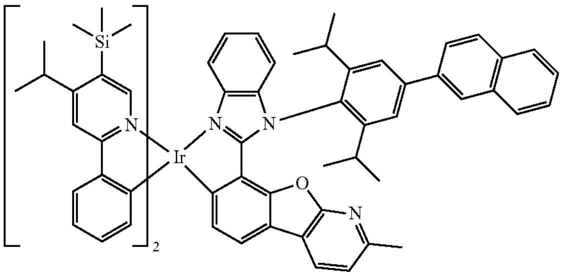
241
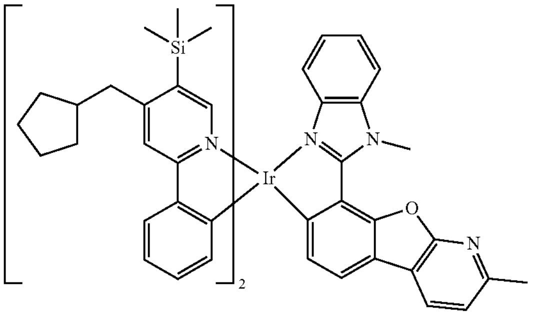
242
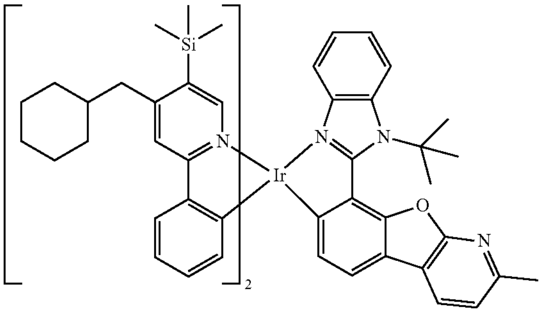
243
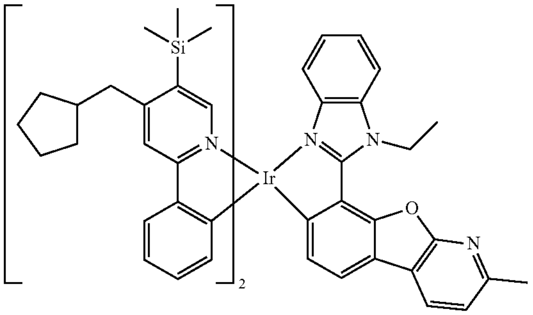
244
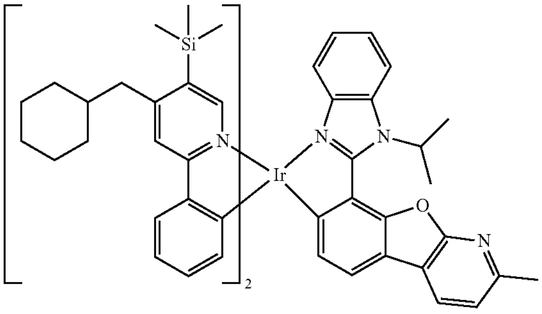
245
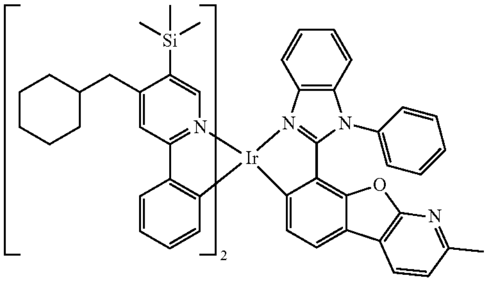
246
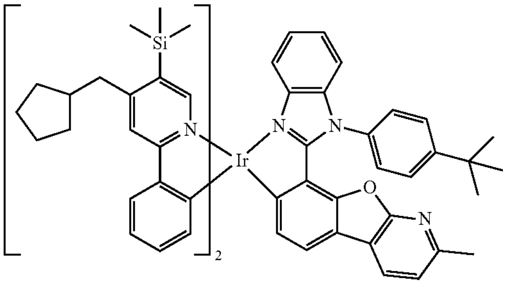

-continued
247
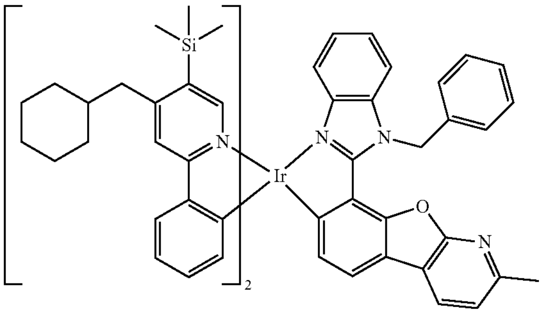
248
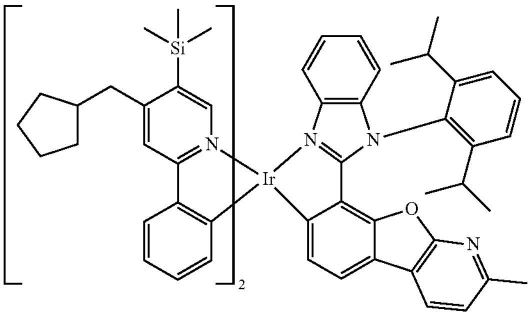
249
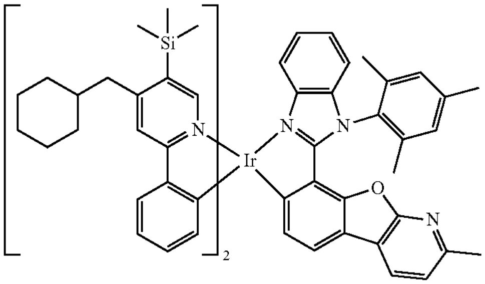
250
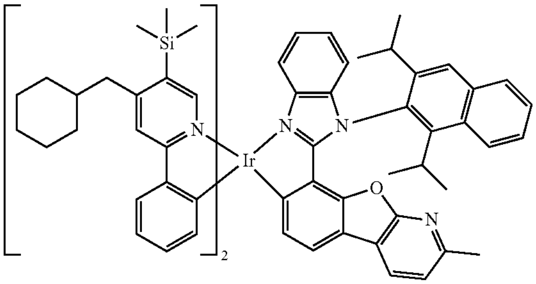
251
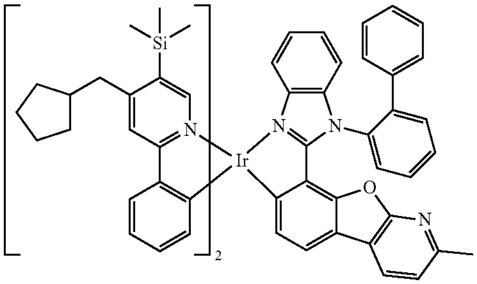
252
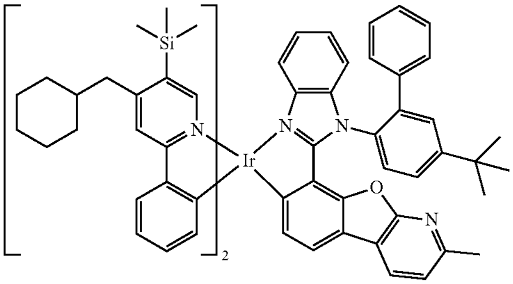
253
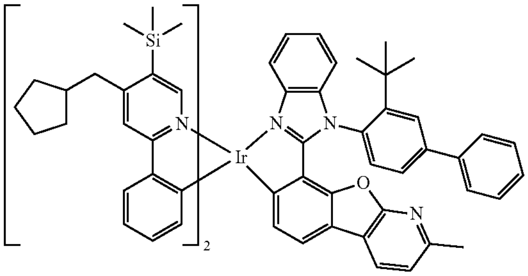
254
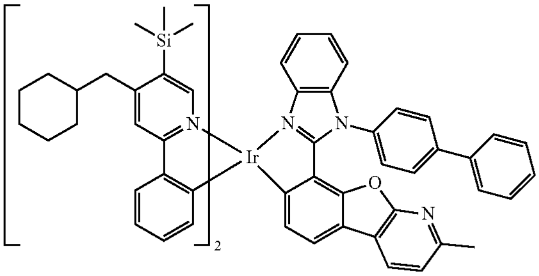
255
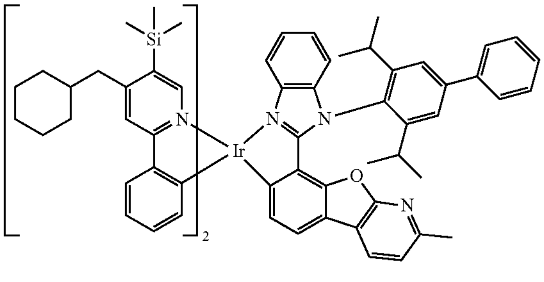
256
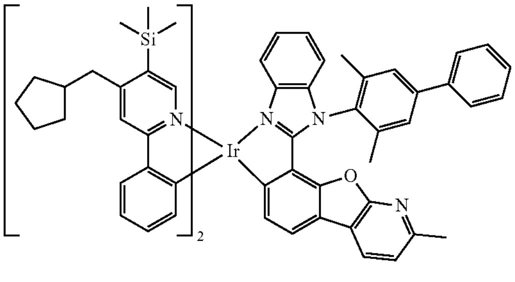

-continued
257
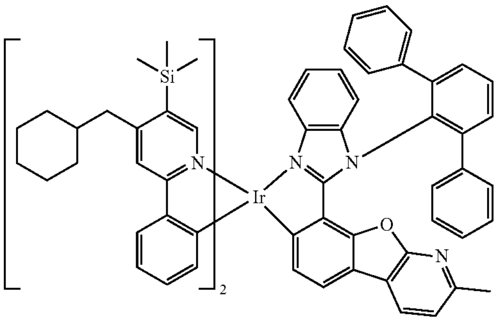
258
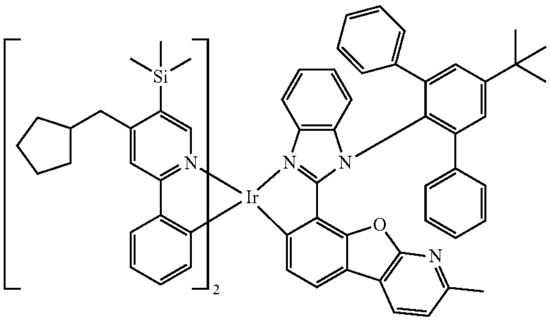
259
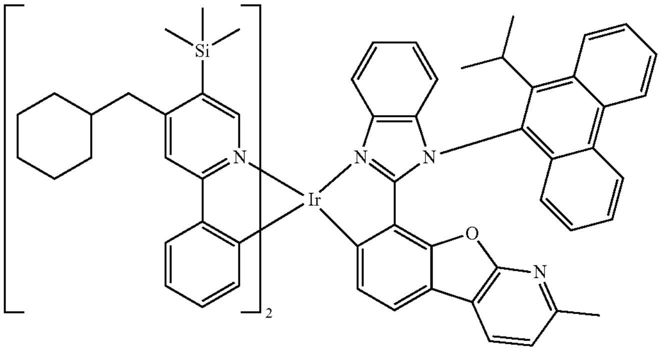
260
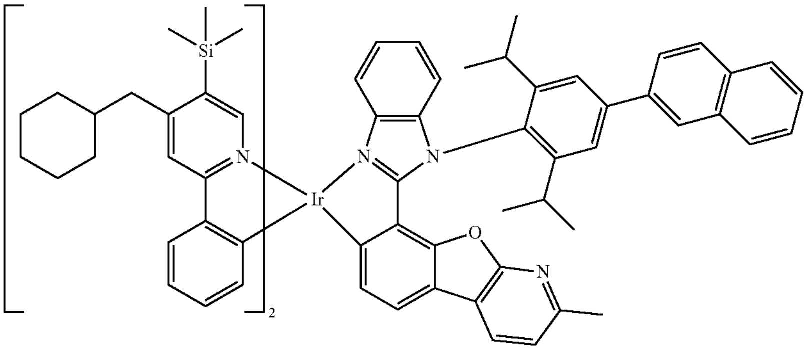
261
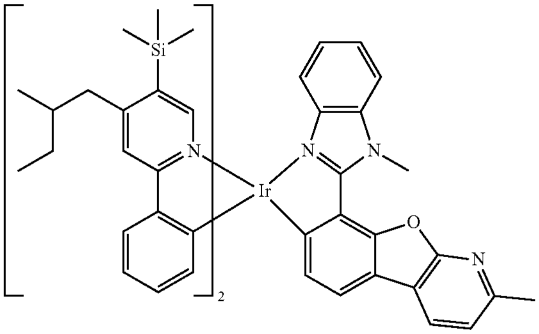
262
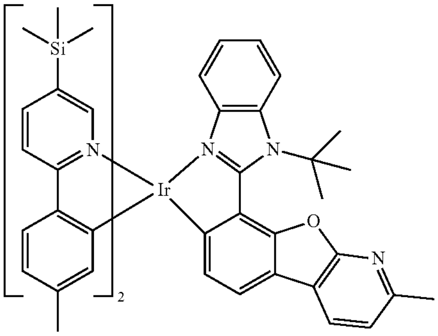

-continued
263
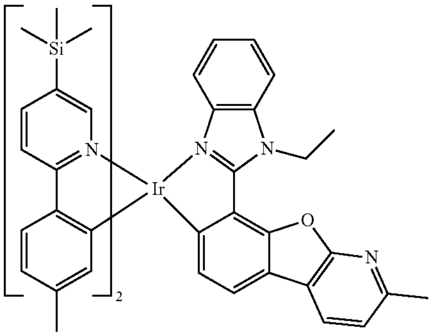
264
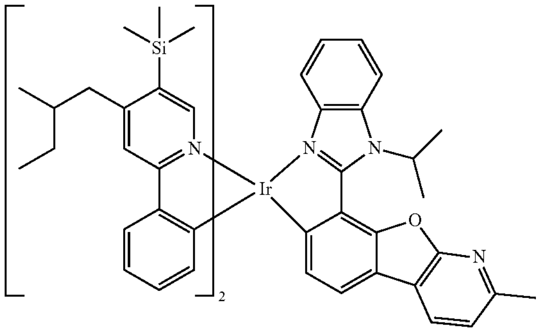
265
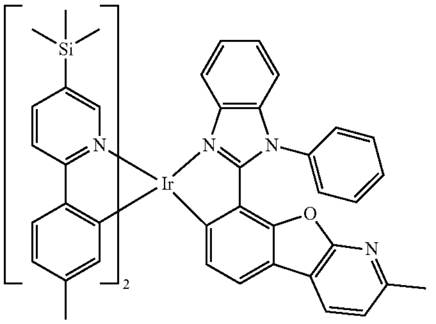
266
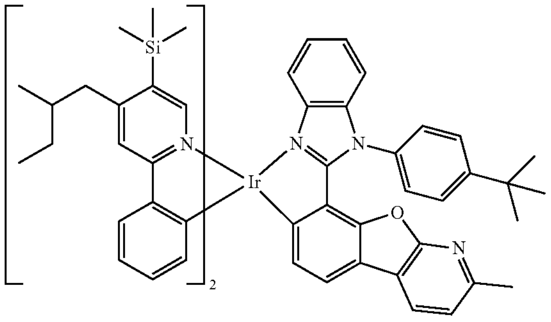
267
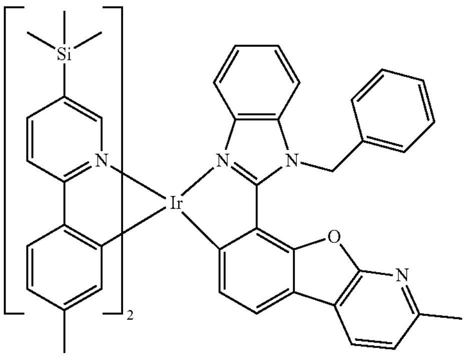
268
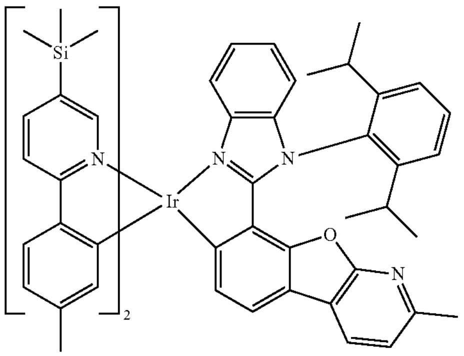
269
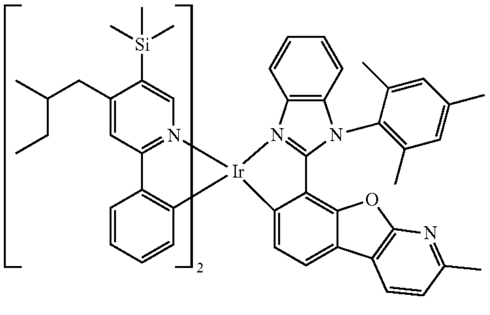
270
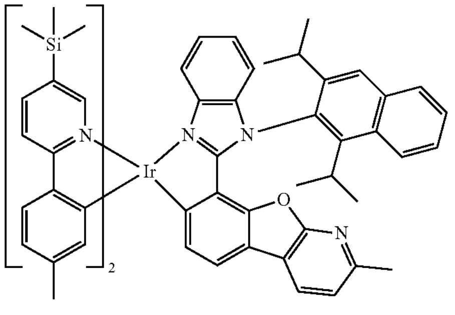

-continued
271
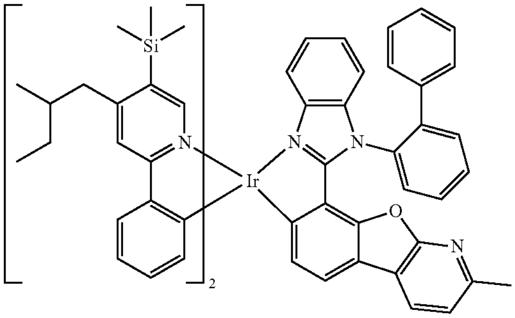
272
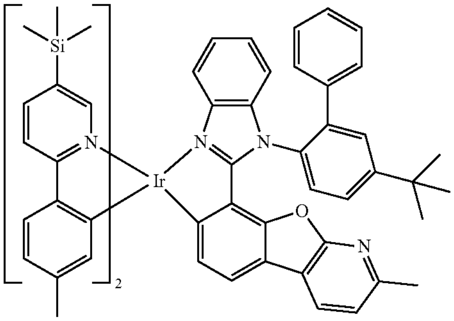
273
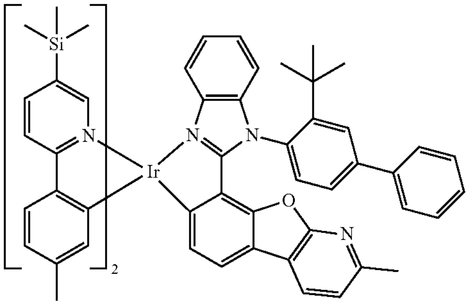
274
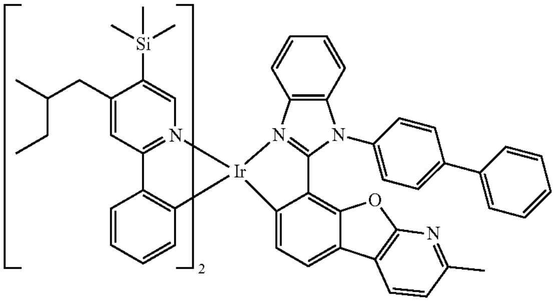
275
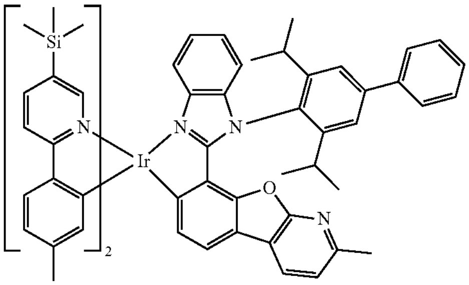
276
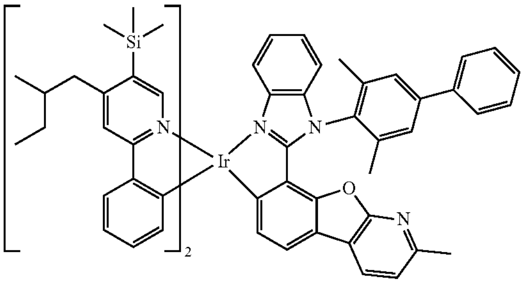
277
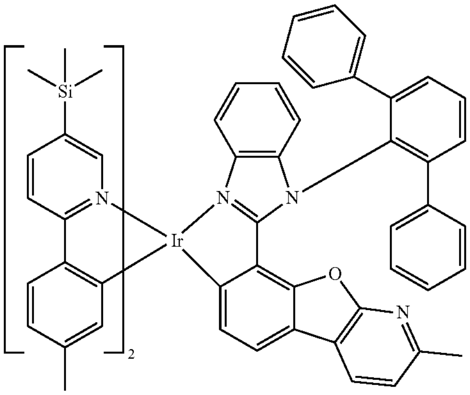
278
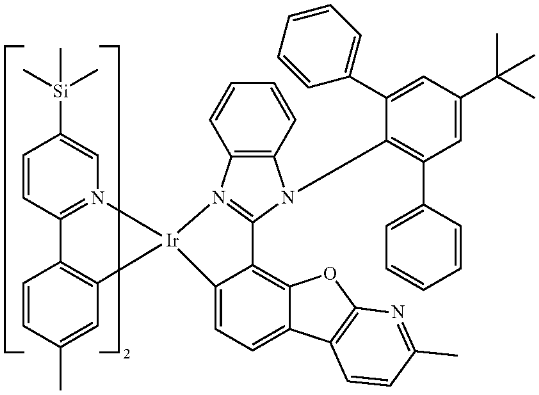

-continued
279
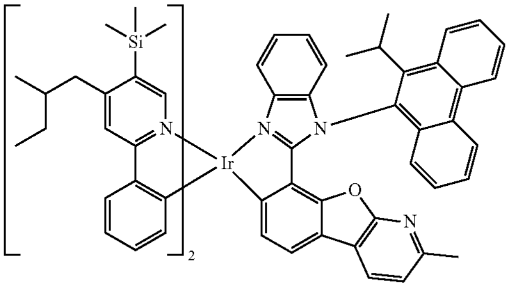
280
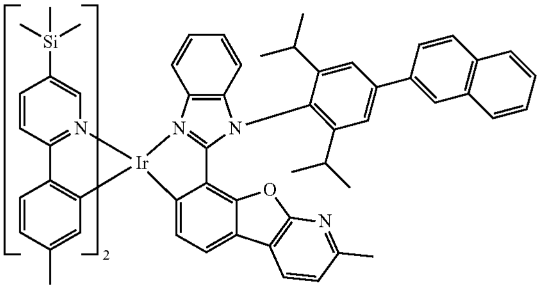
281
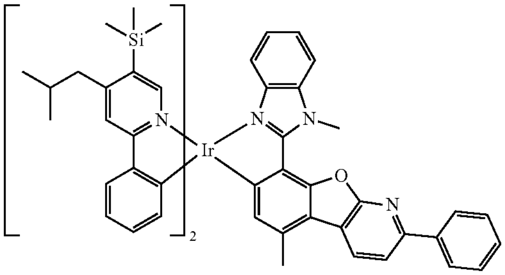
282
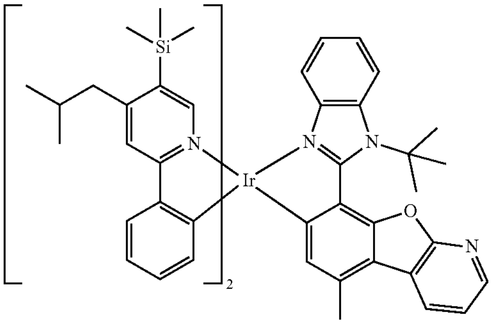
283
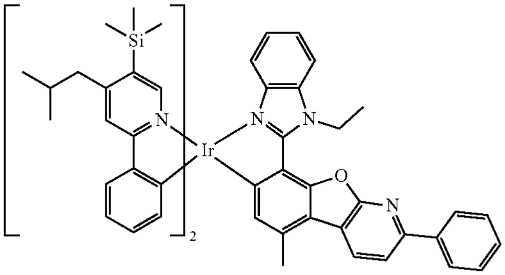
284
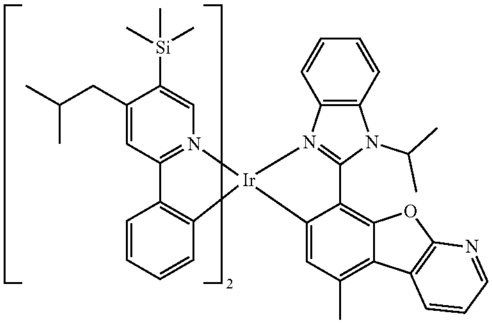
285
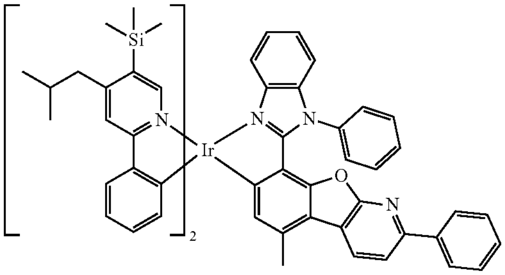
286
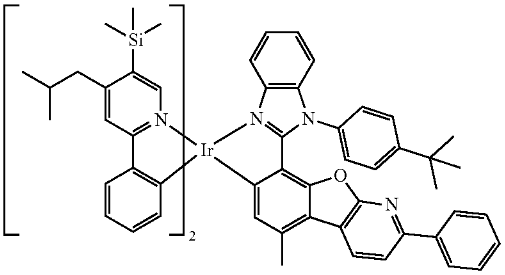

-continued
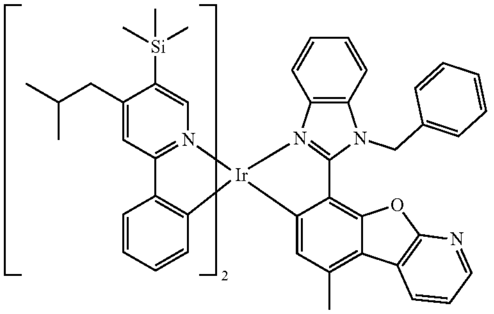
287
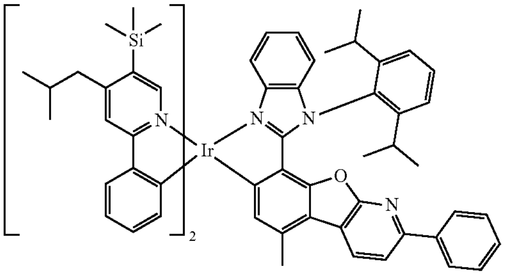
288
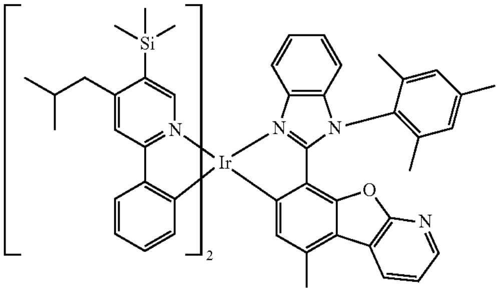
289
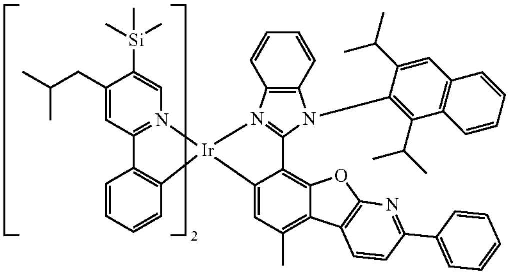
290
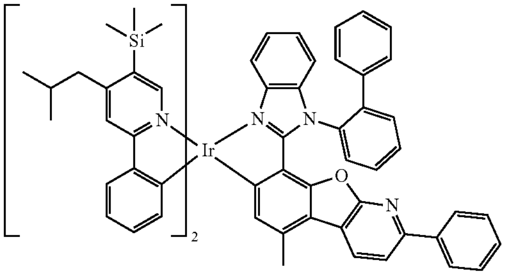
291
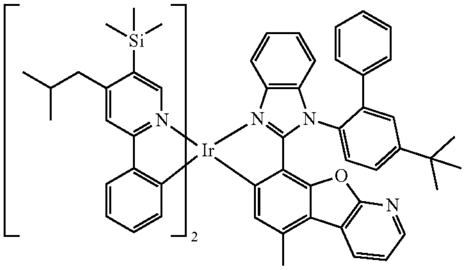
292
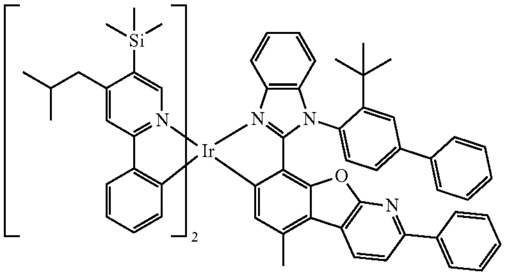
293
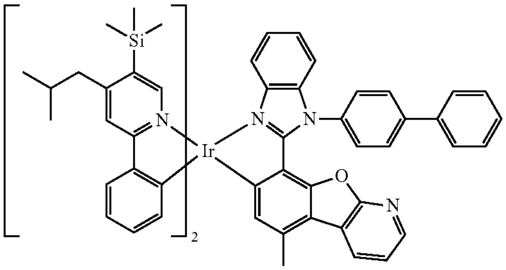
294
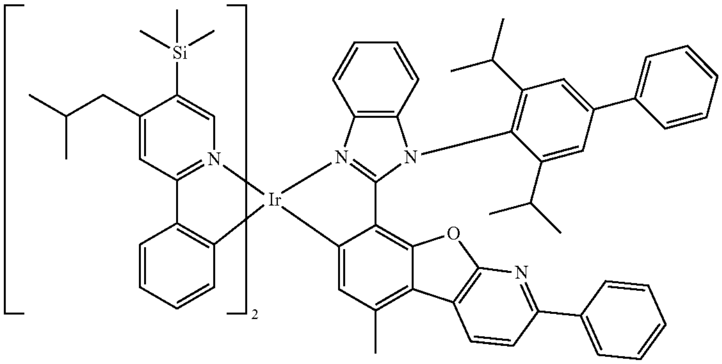
295

-continued
296
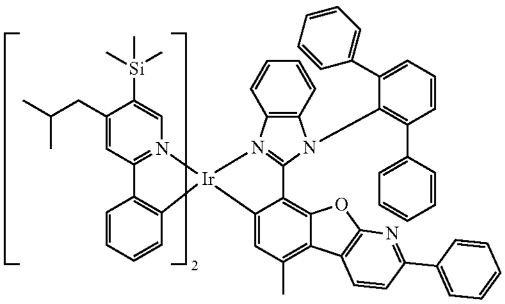
297
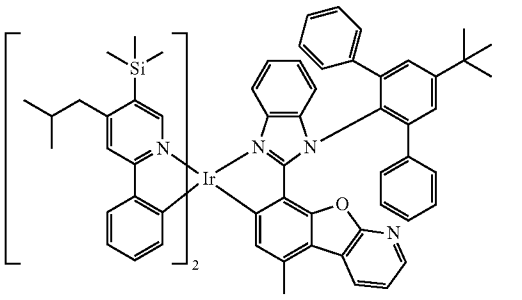
298
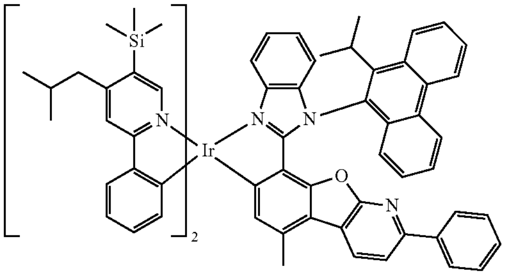
299
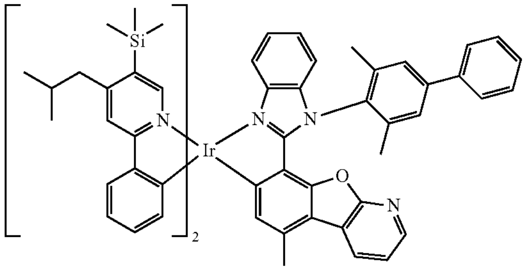
300
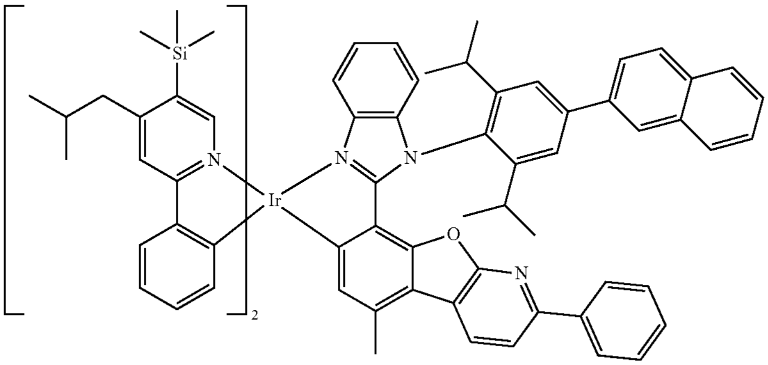
301
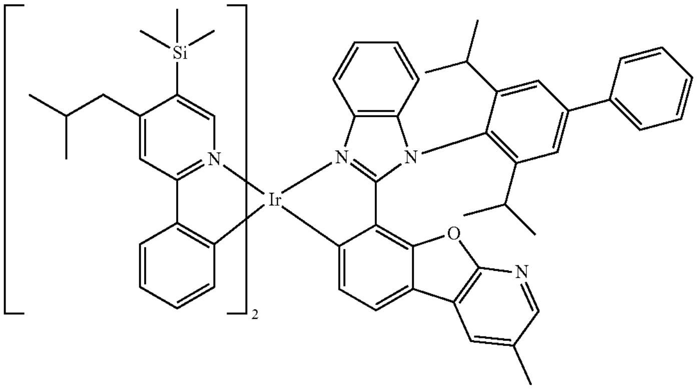

-continued
302
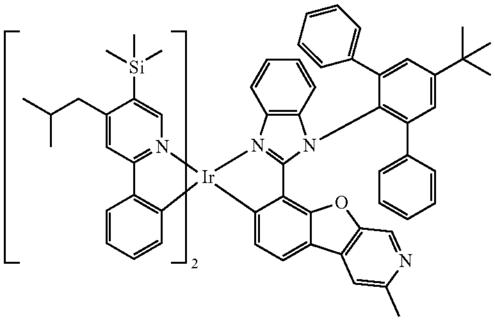
303
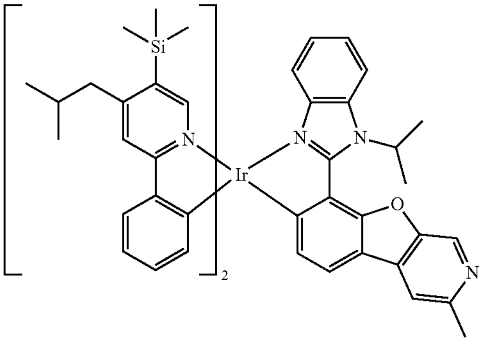
304
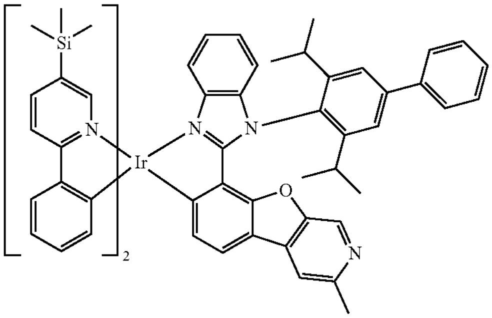
305
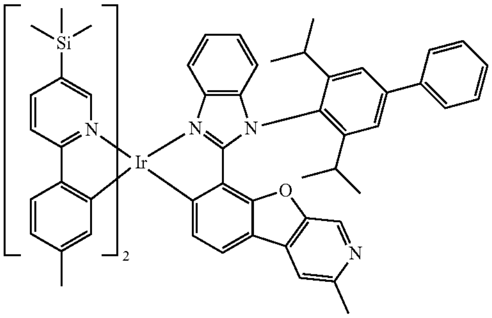
306
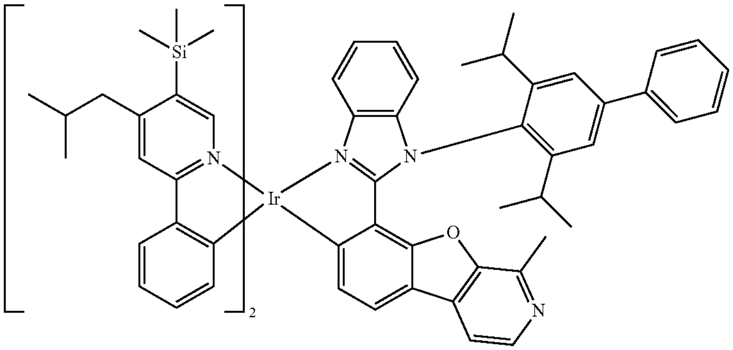
307
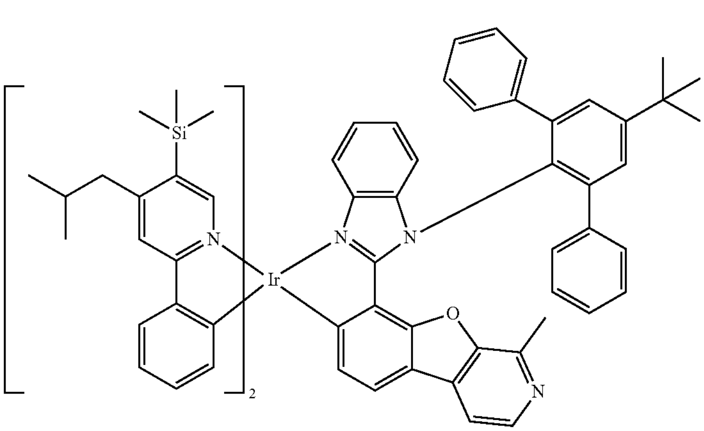

-continued
308
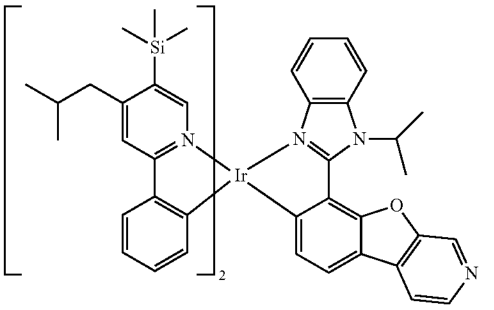
309
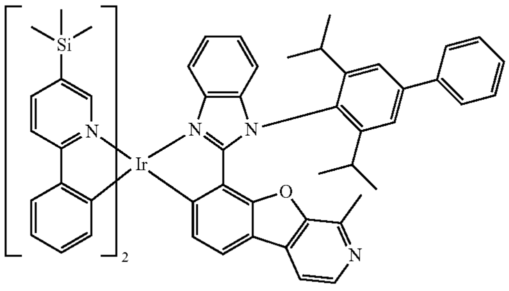
310
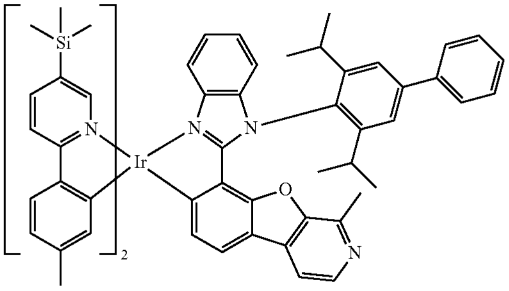
311
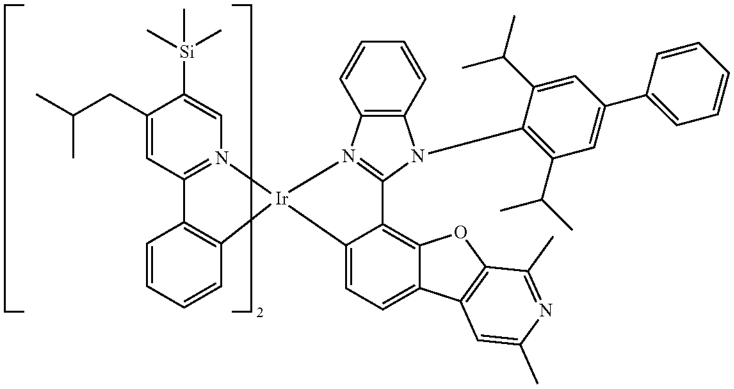
312
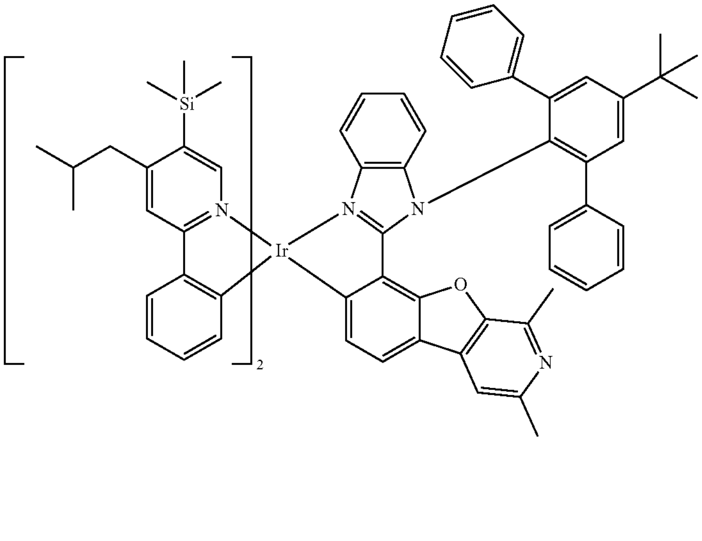

-continued
313
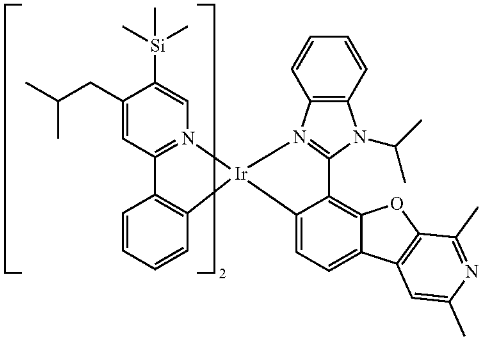
314
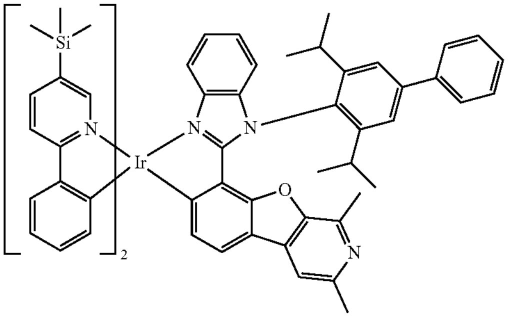
315
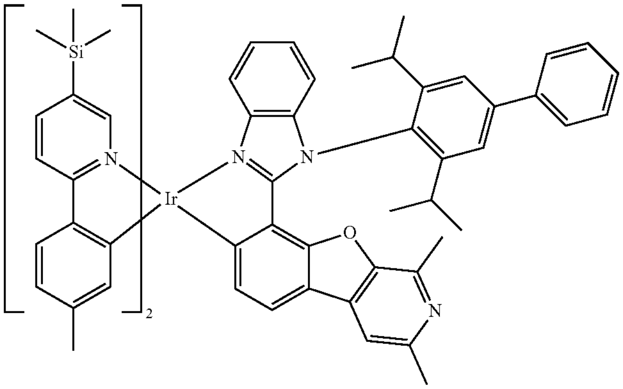
316
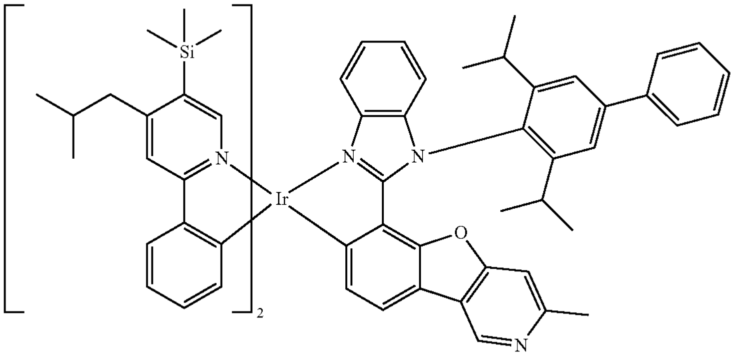
317
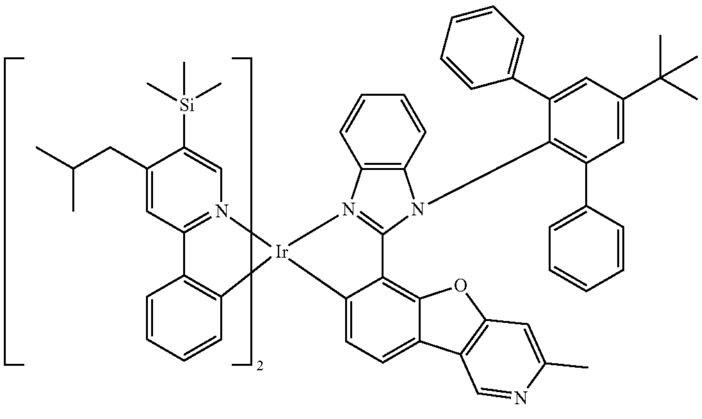

-continued
318
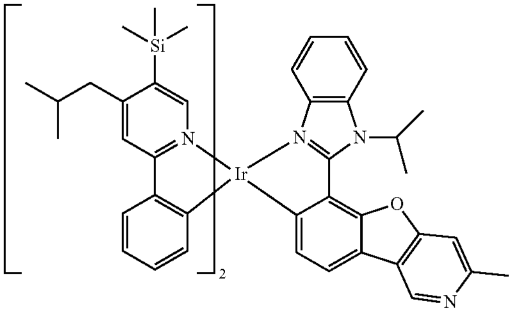
319
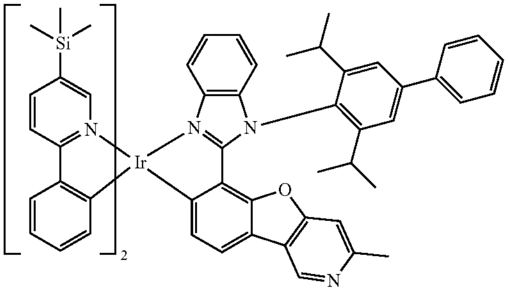
320
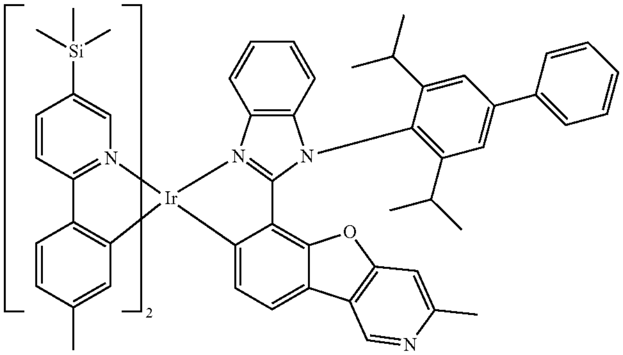
321
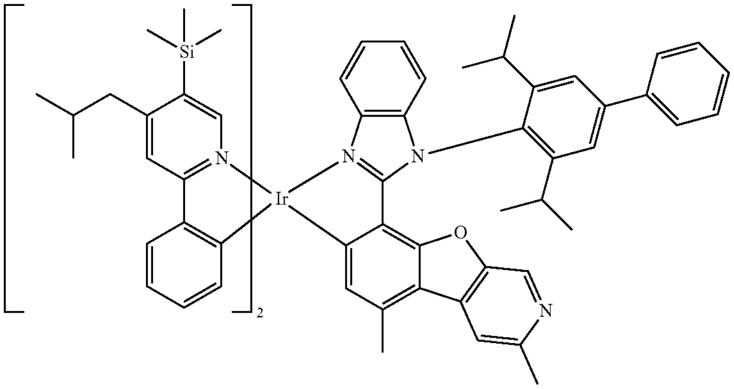
322
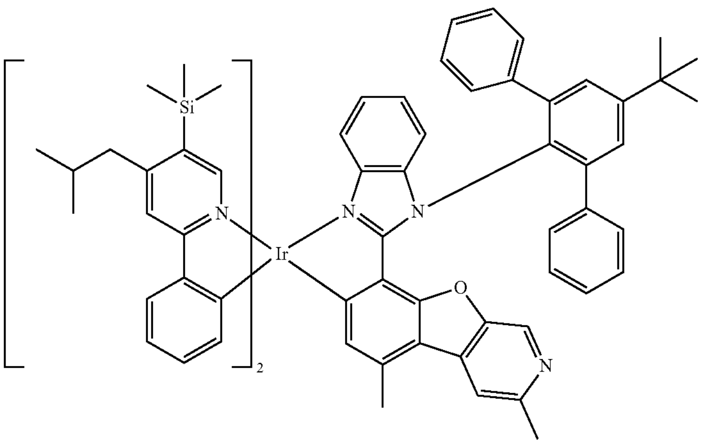

-continued
323
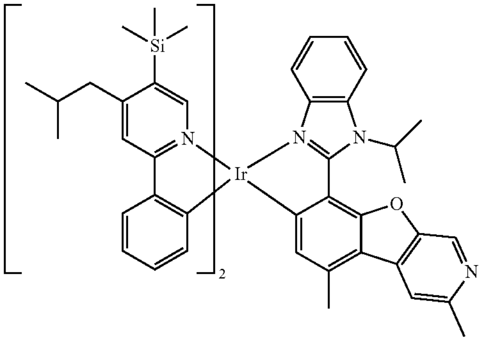
324
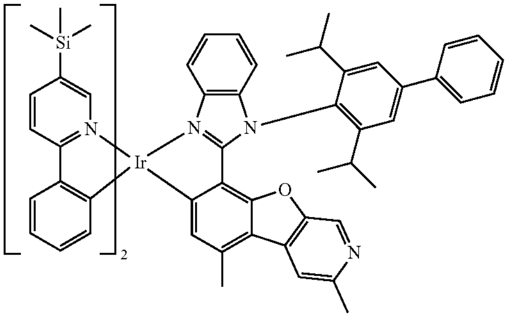
325
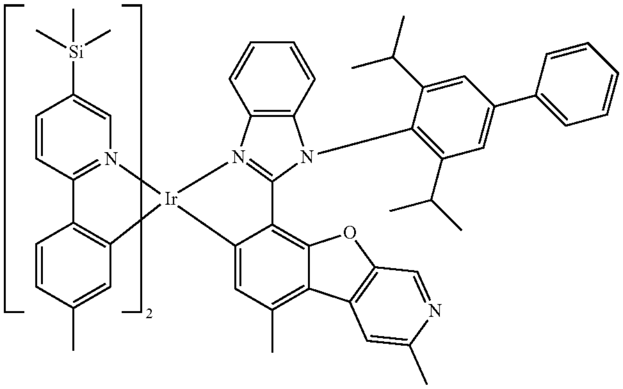
326
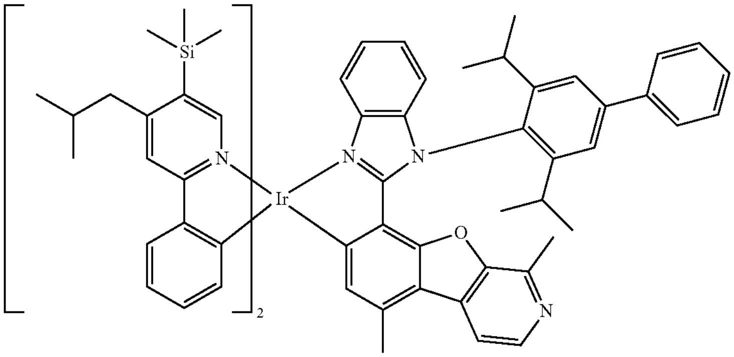
327
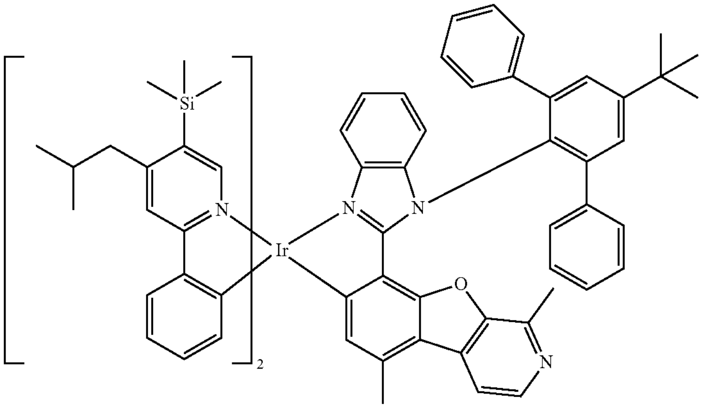

-continued
328
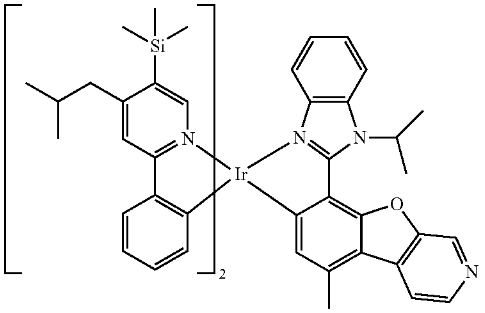
329
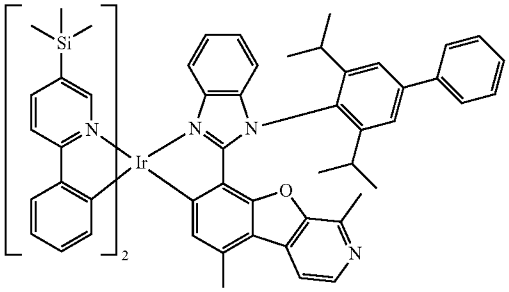
330
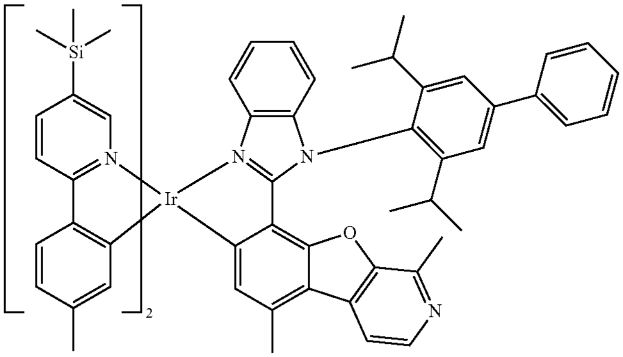
331
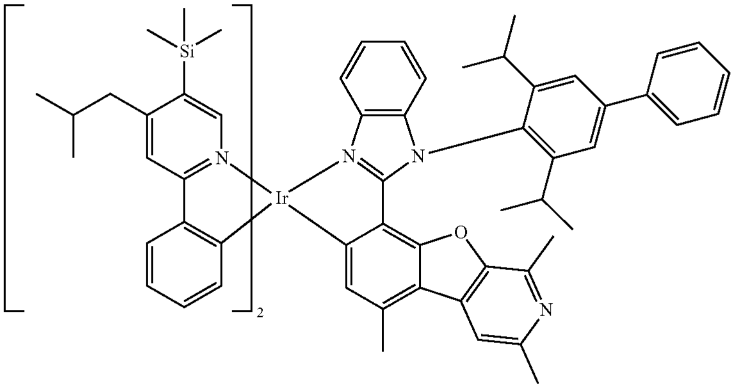
332
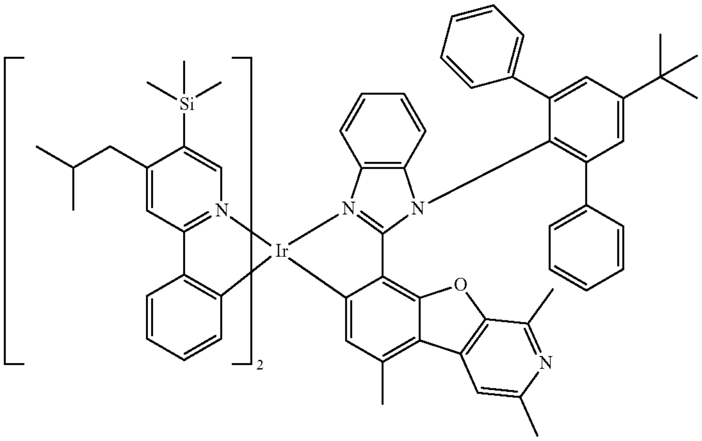

-continued
333
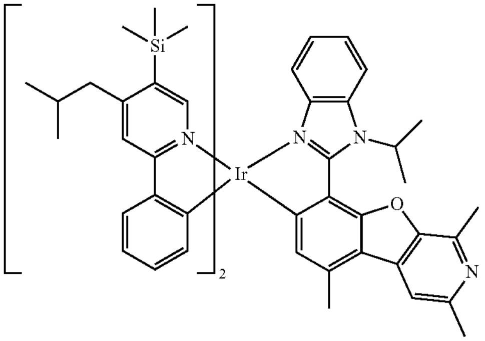
334
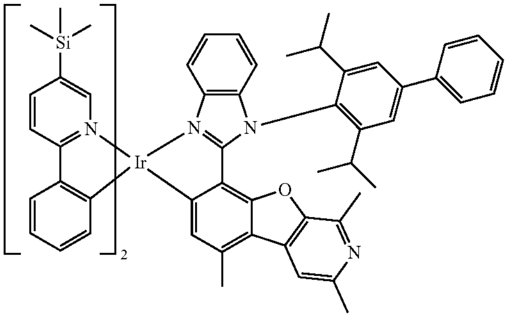
335
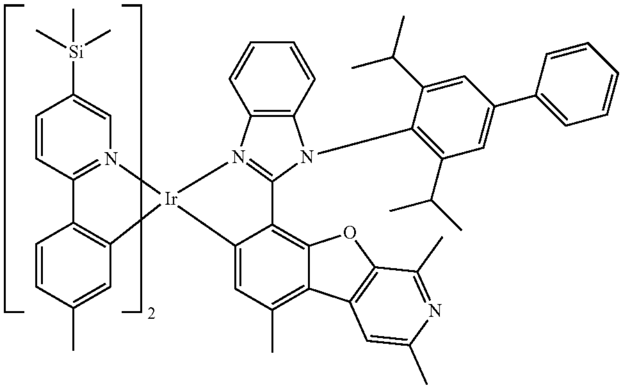
336
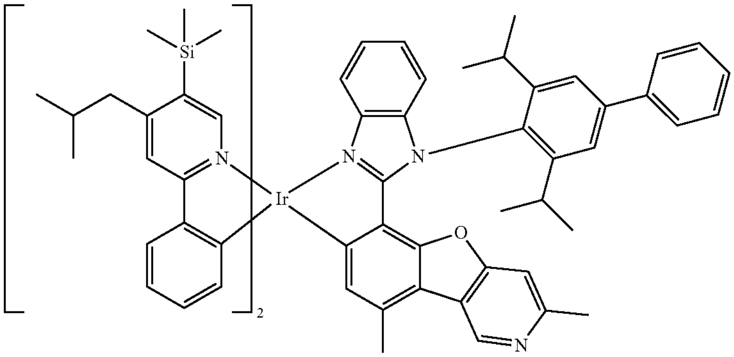
337
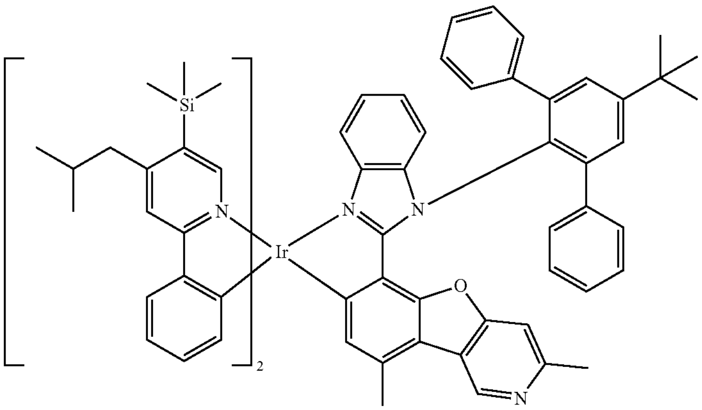

-continued
338
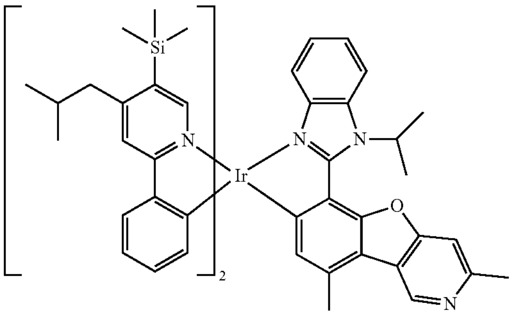
339
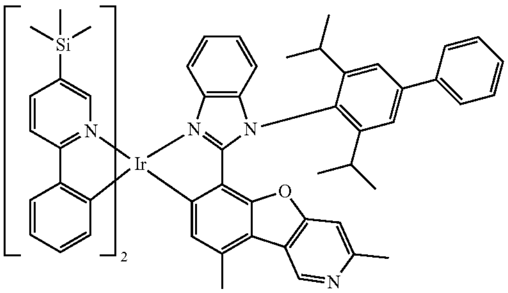
340
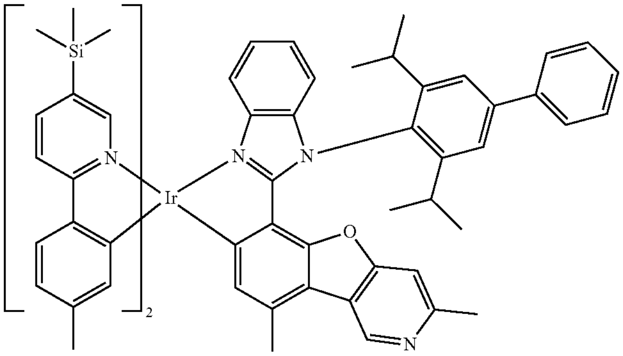
341
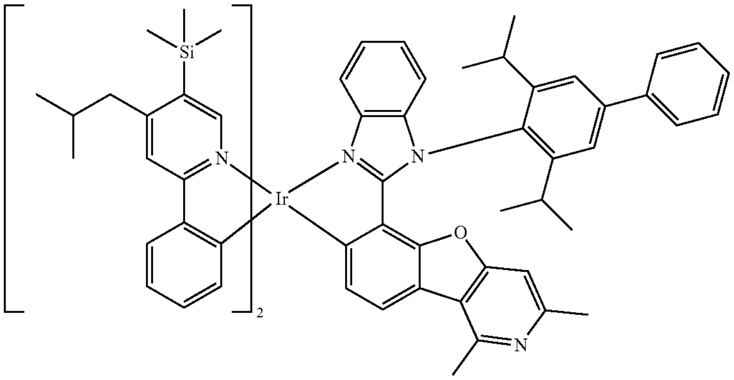
342
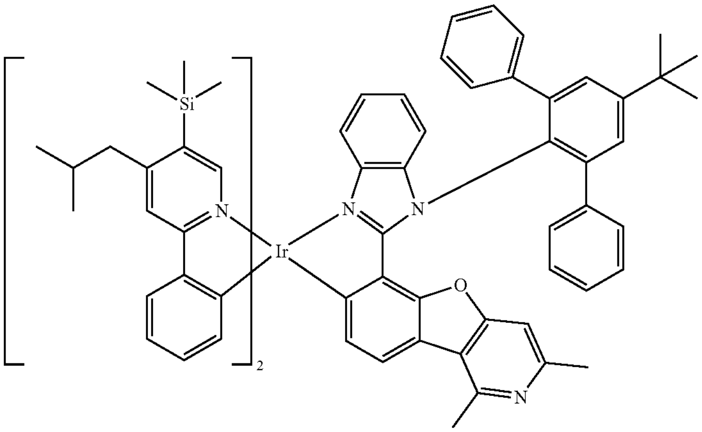

-continued
343
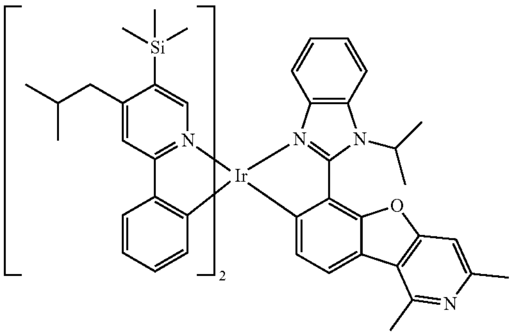
344
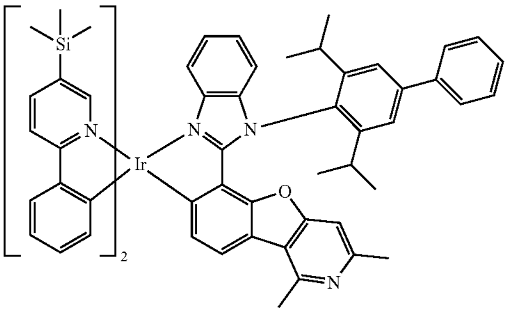
345
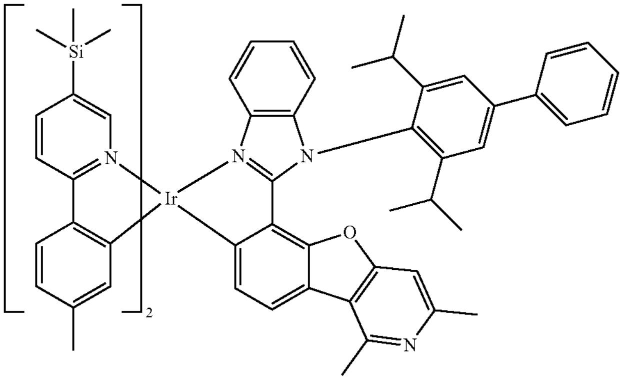
346
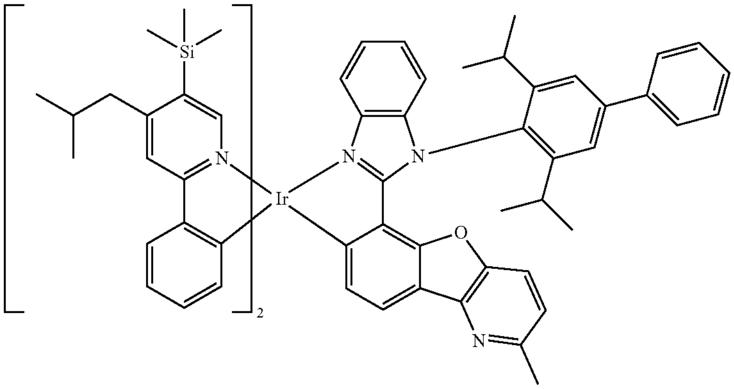
347
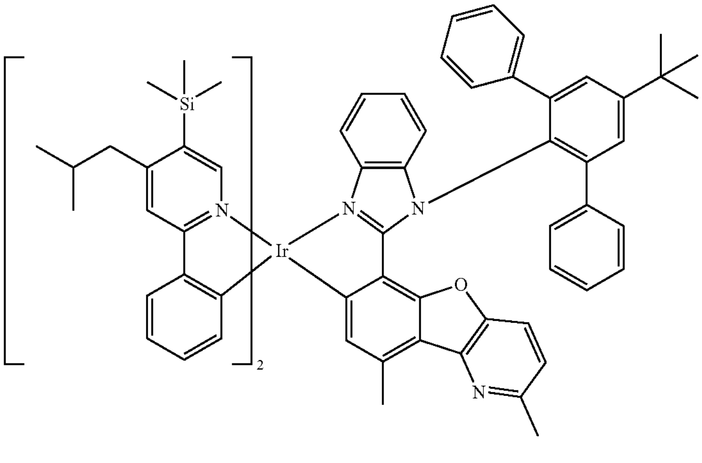

-continued
348
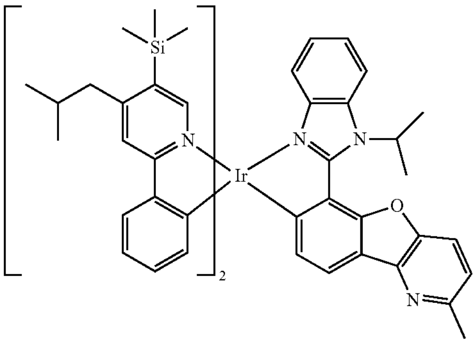
349
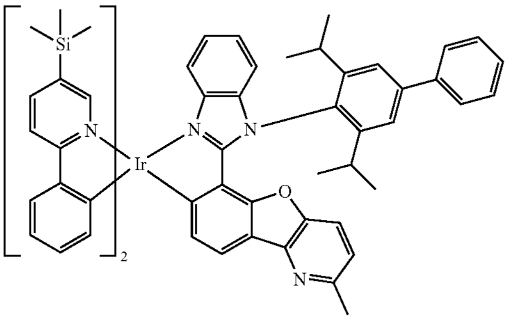
350
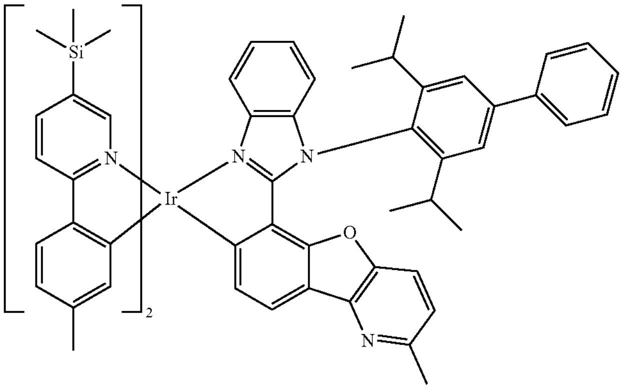
351
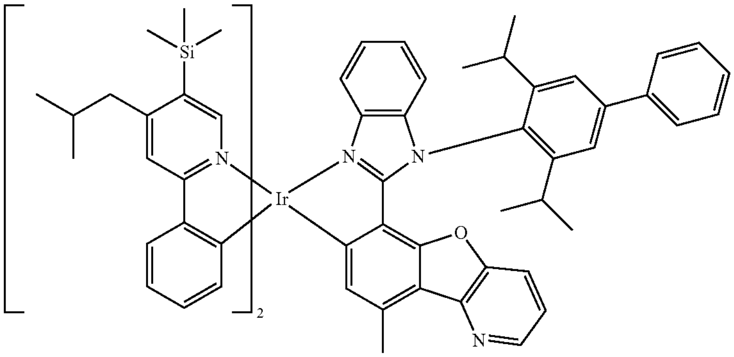
352
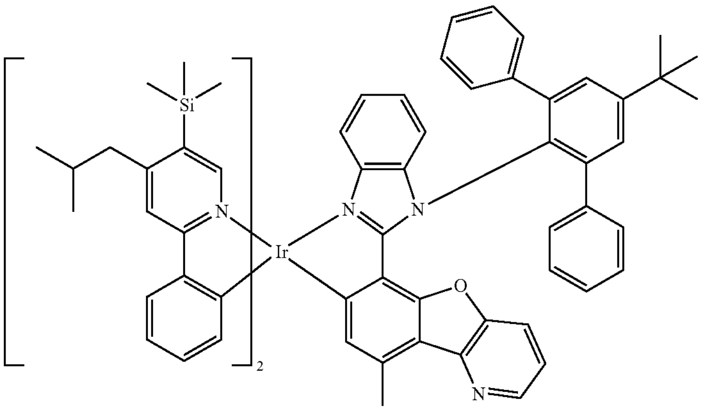

-continued
353
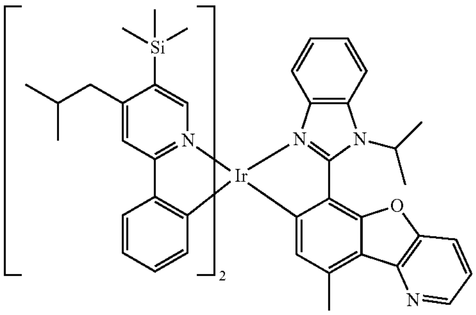
354
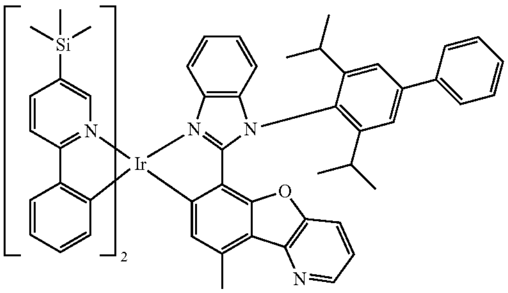
355
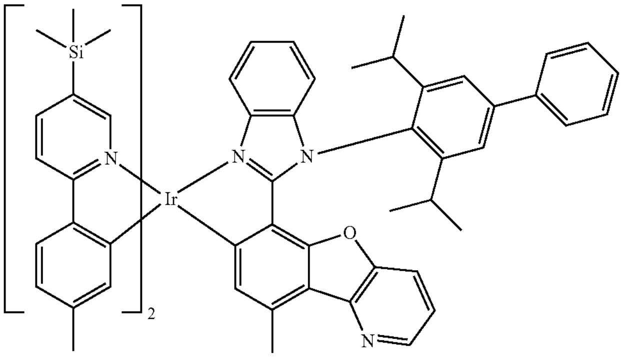
356
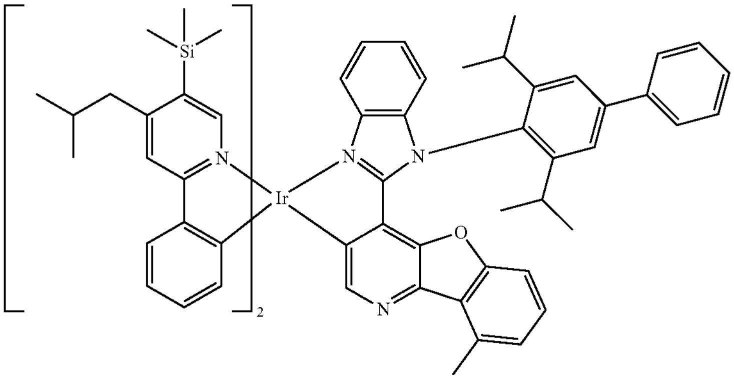
357
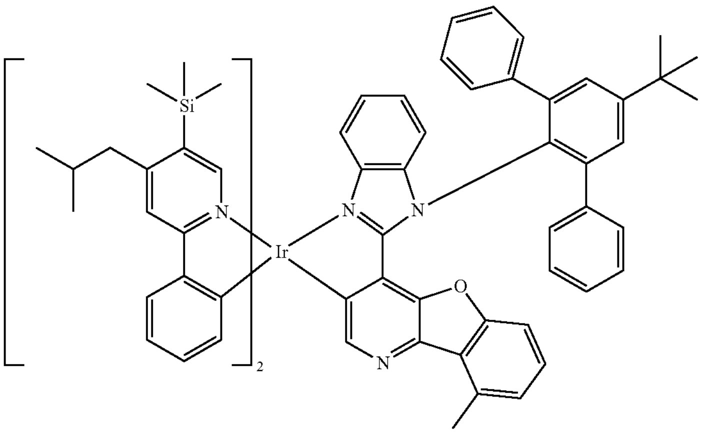

-continued
358
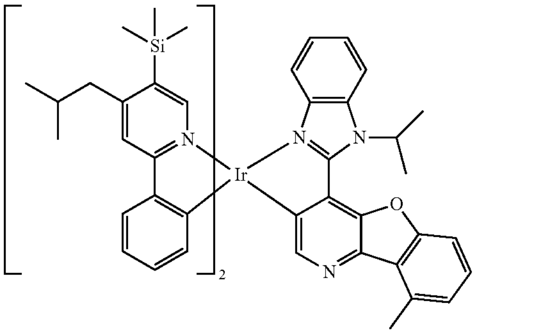
359
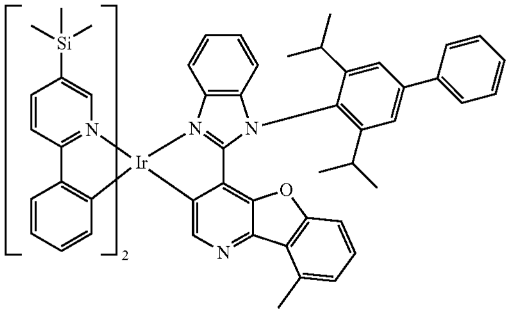
360
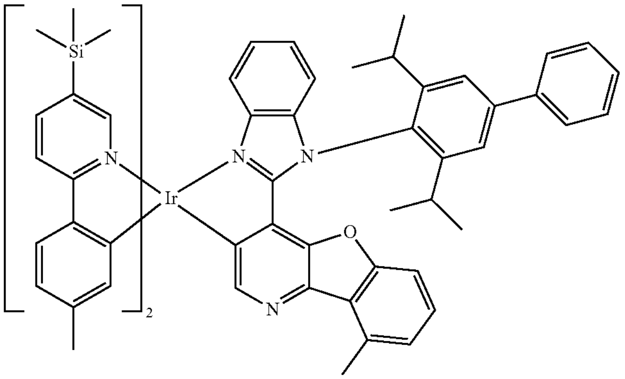
361
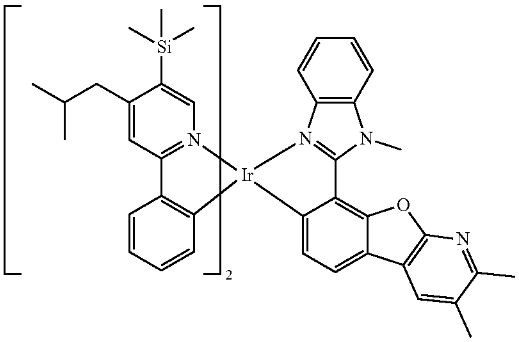
362
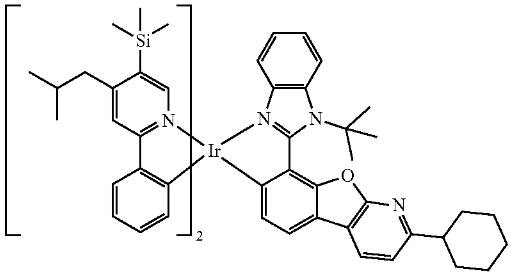
363
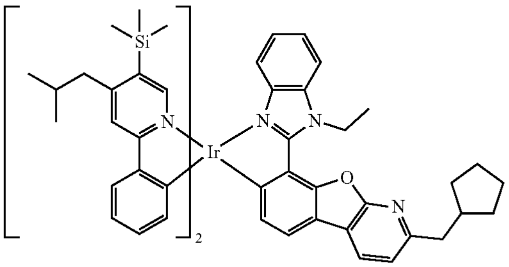
364
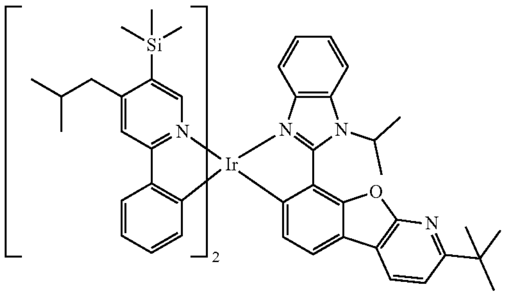
365
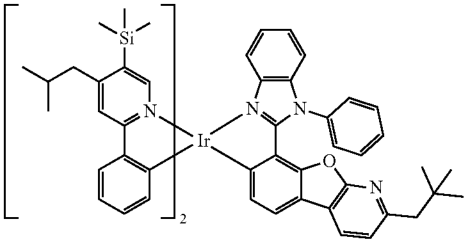
366
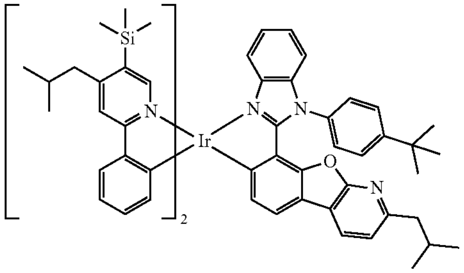

-continued
367
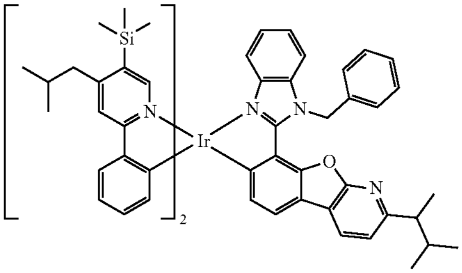
368
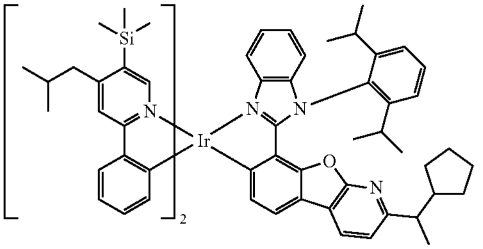
369
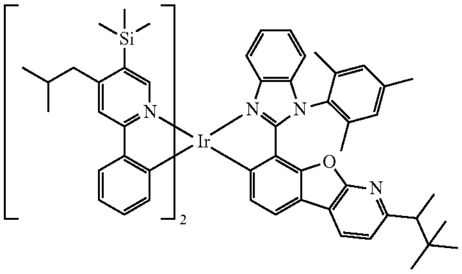
370
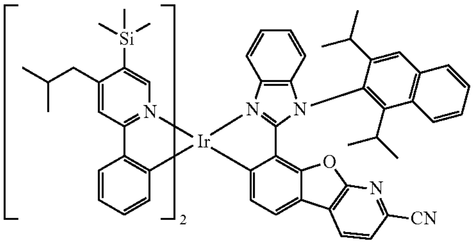
371
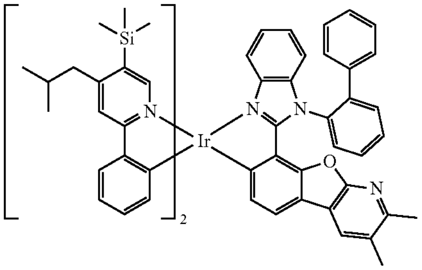
372
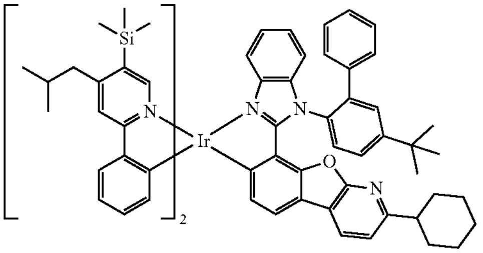
373
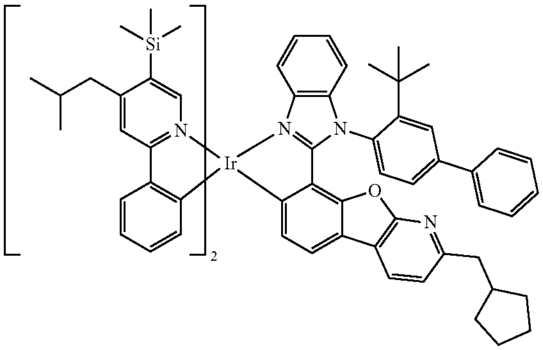
374
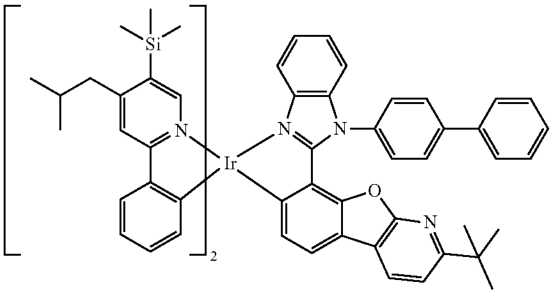
375
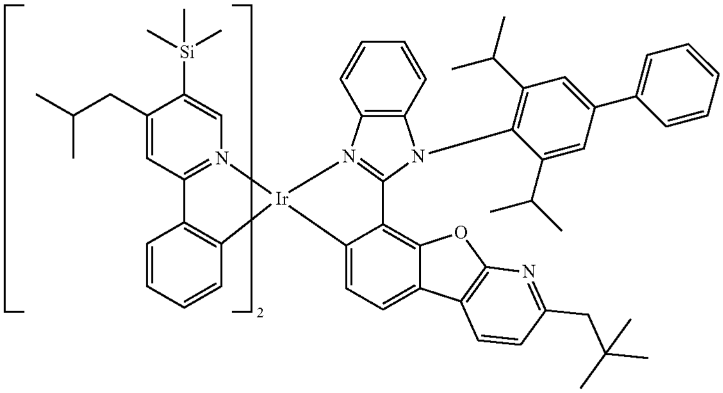

-continued
376
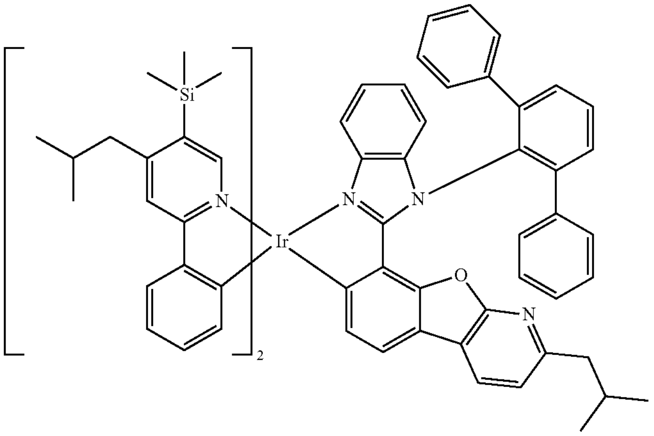
377
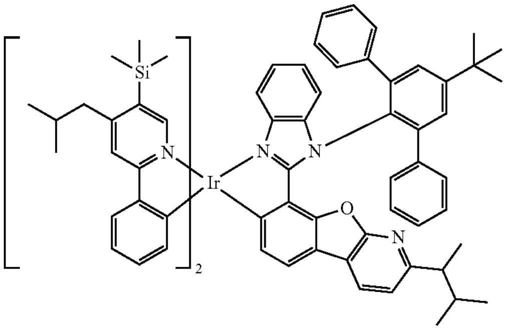
378
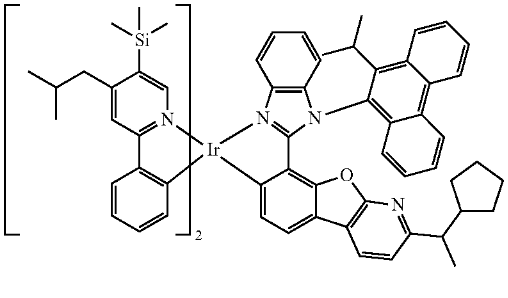
379
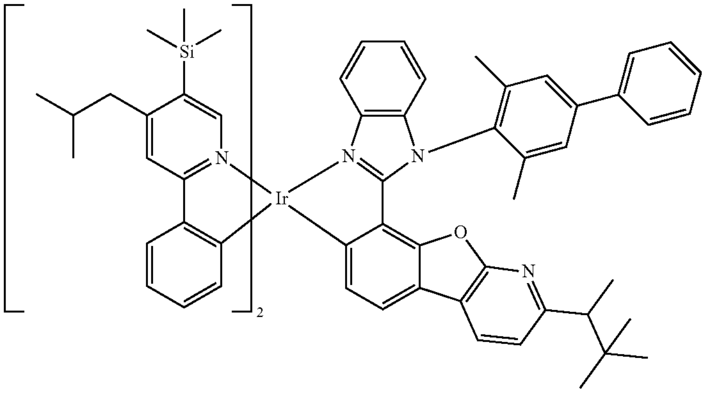
380
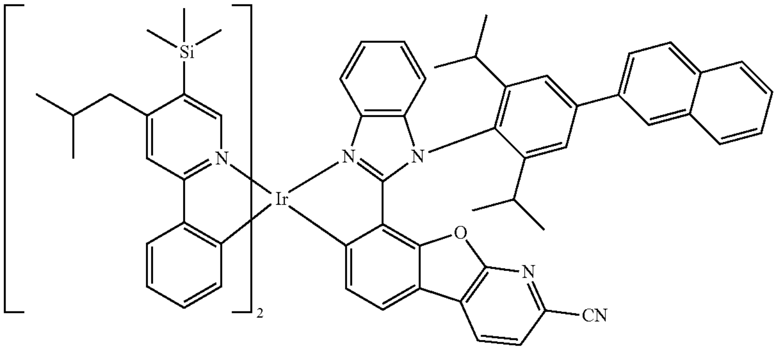

-continued
381
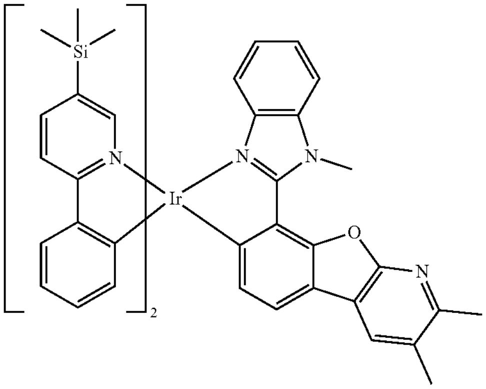
382
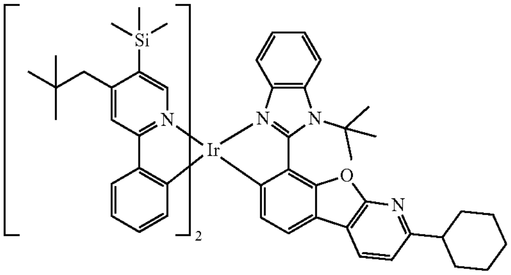
383
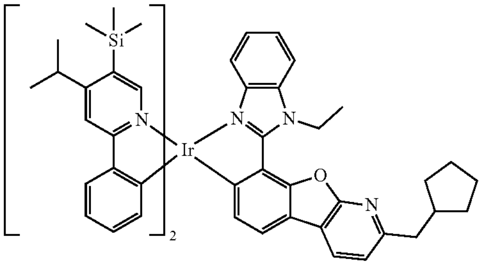
384
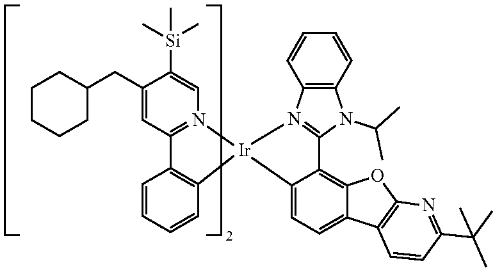
385
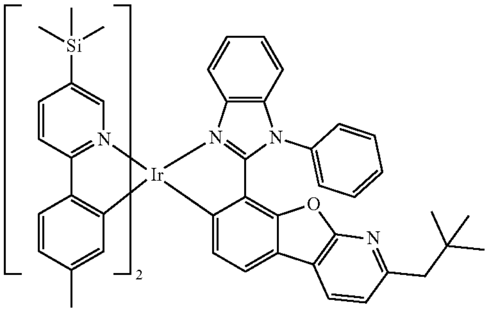
386
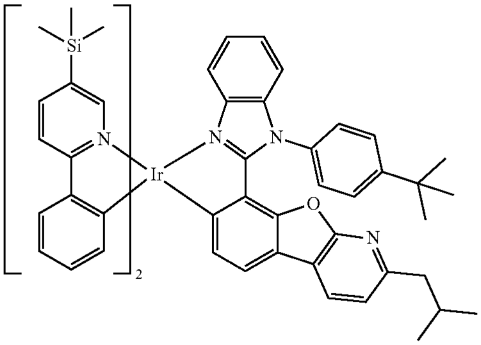
387
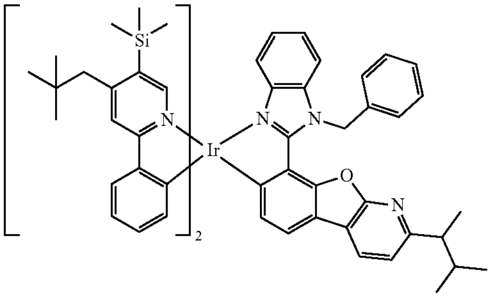
388
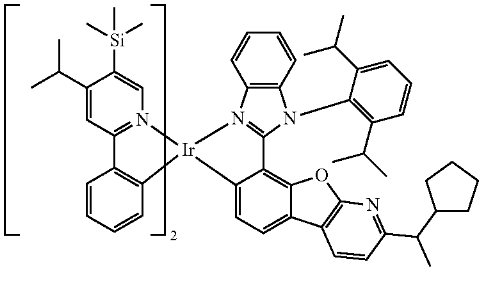
389
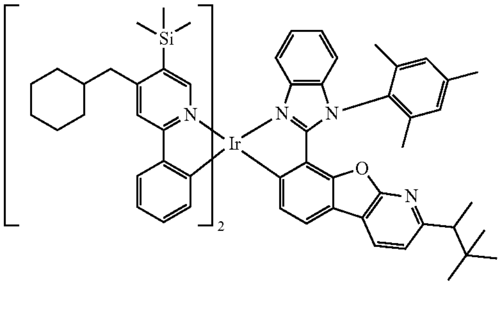
390
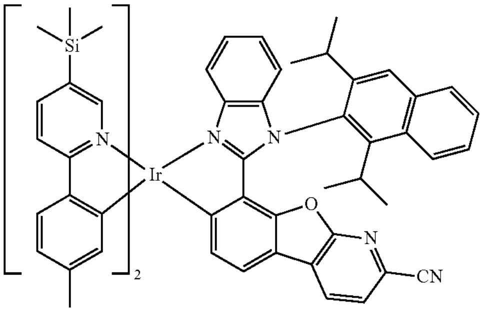

-continued
391
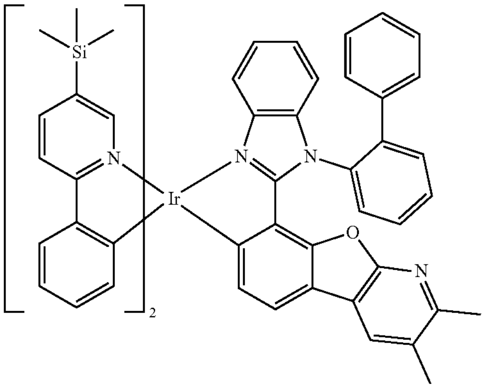
392
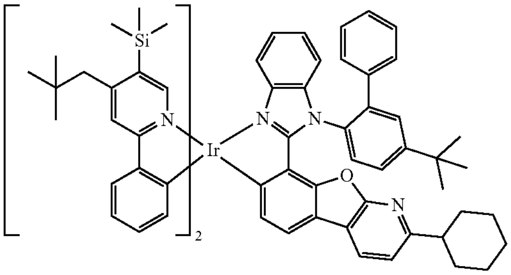
393
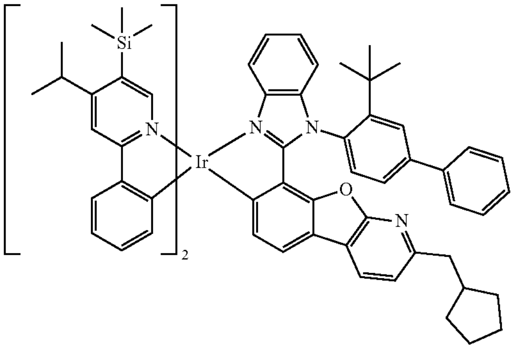
394
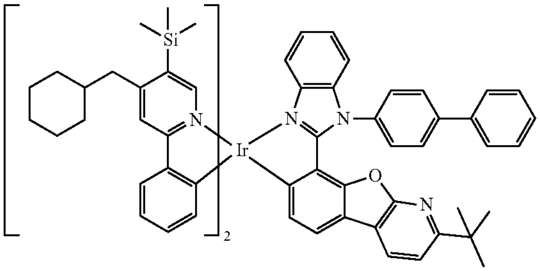
395
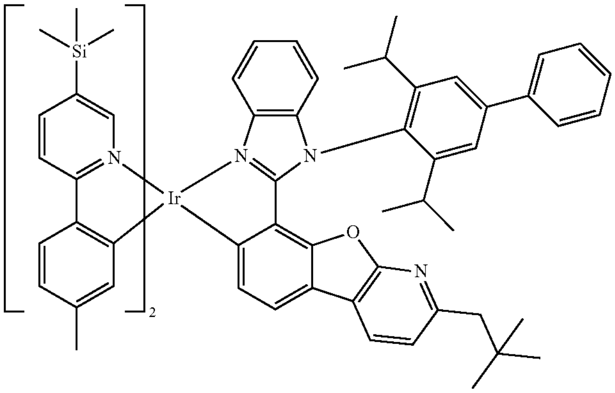
396
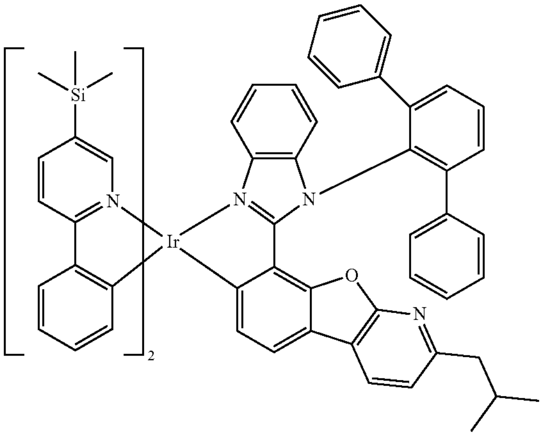

-continued
397
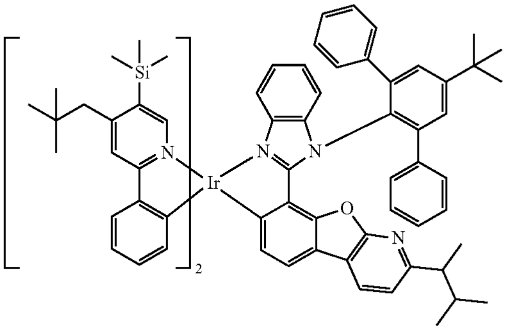
398
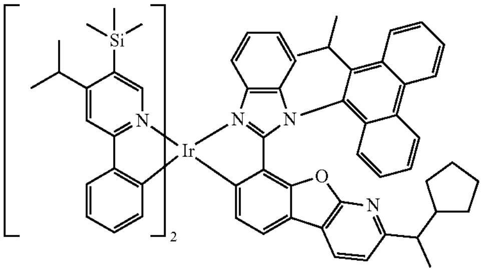
399
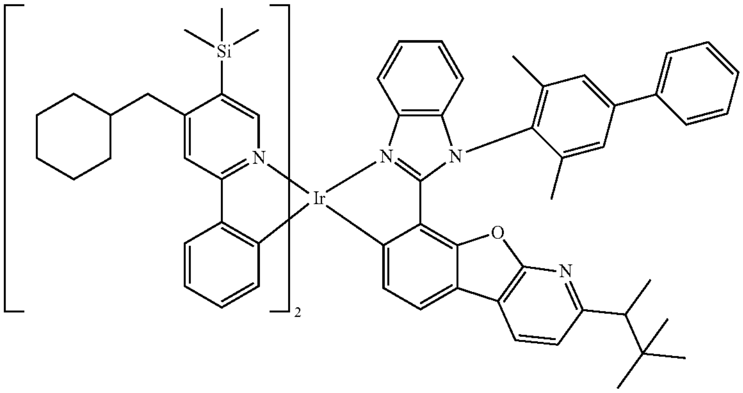
400
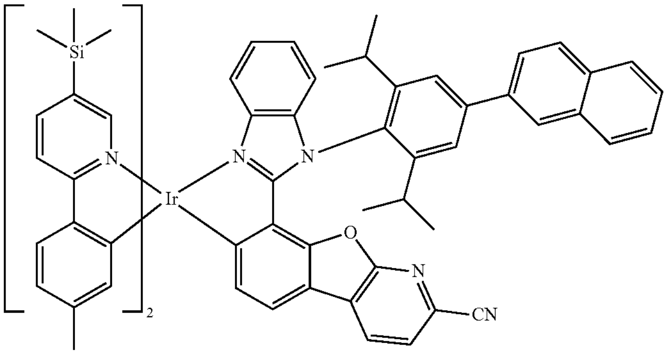
401
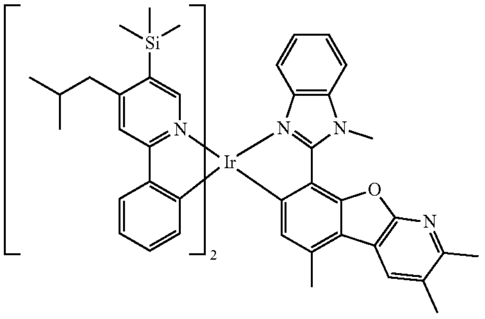
402
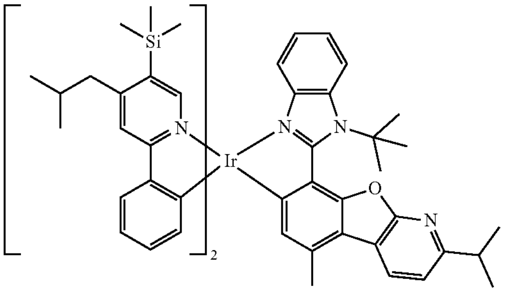

-continued
403
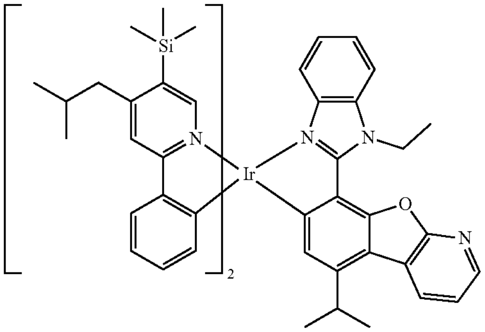
404
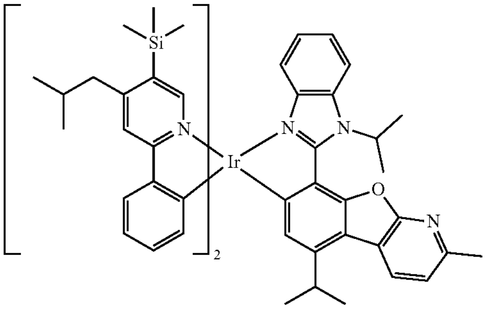
405
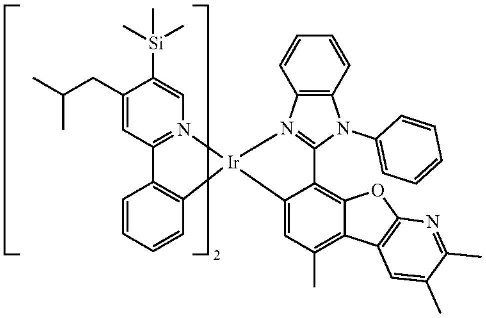
406
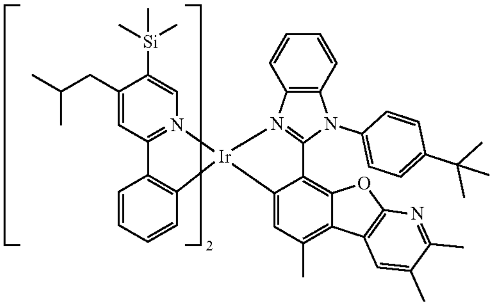
407
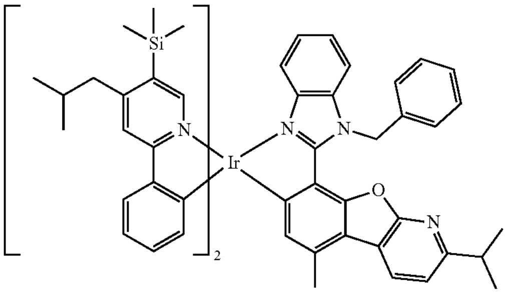
408
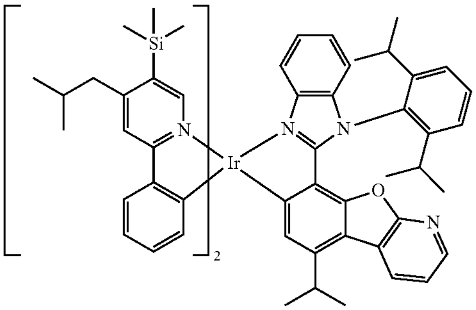
409
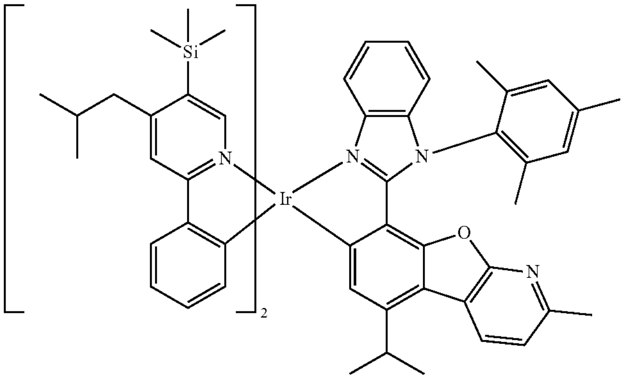

-continued
410
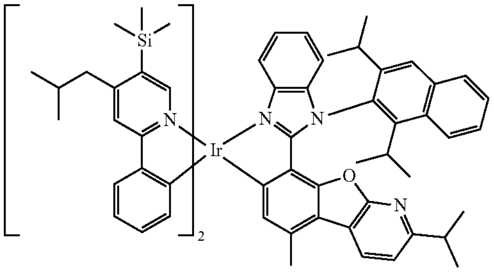
411
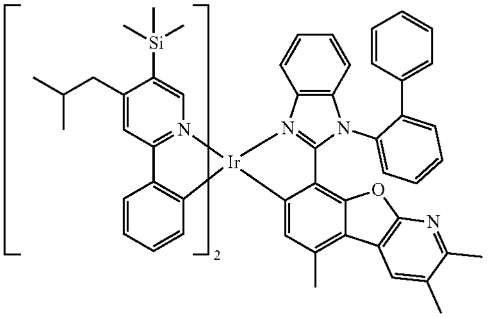
412
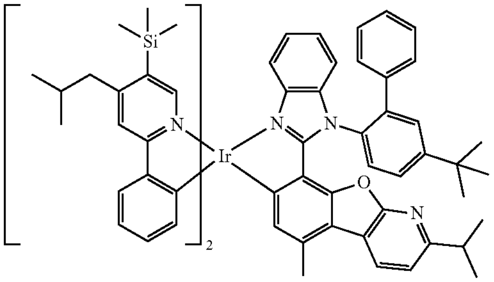
413
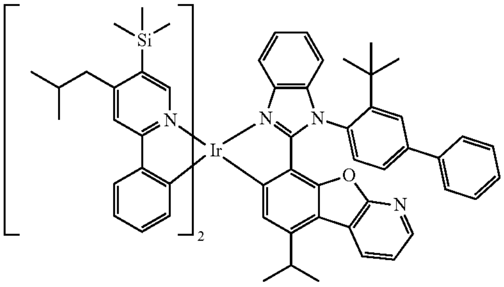
414
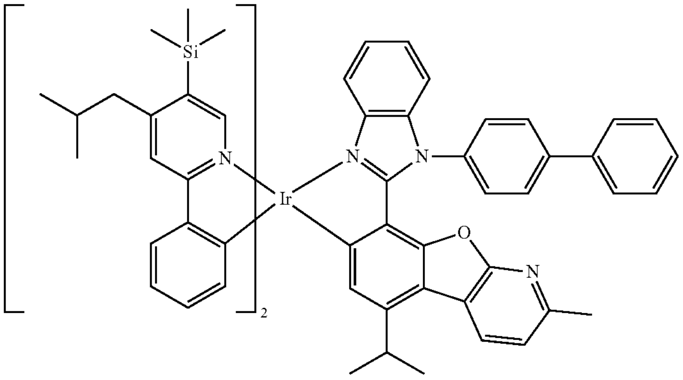
415
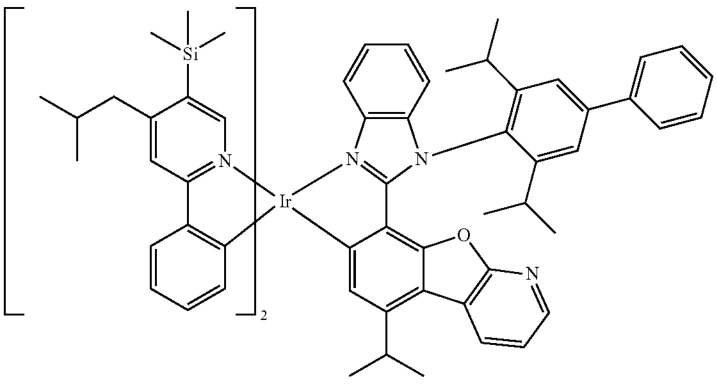

-continued
416
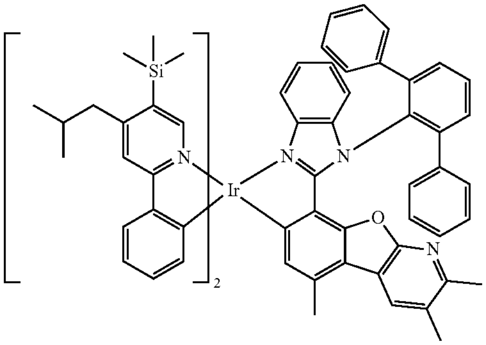
417
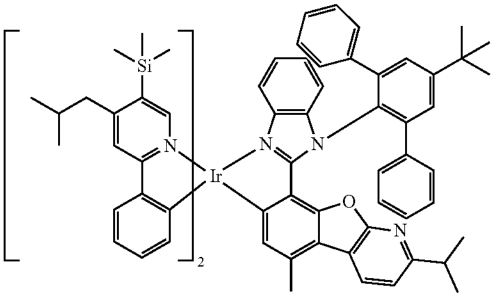
418
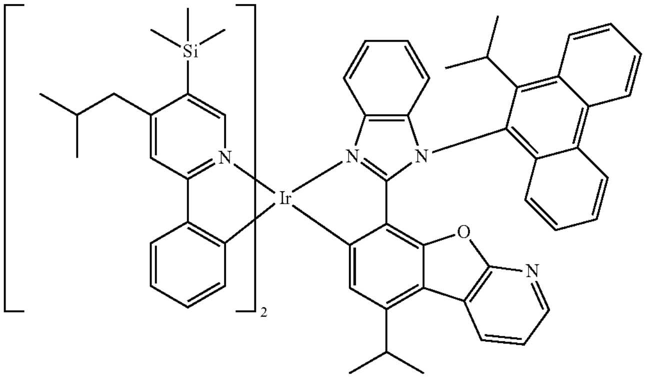
419
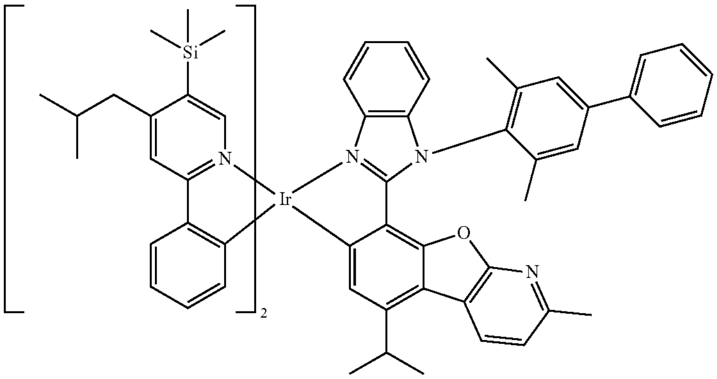
420
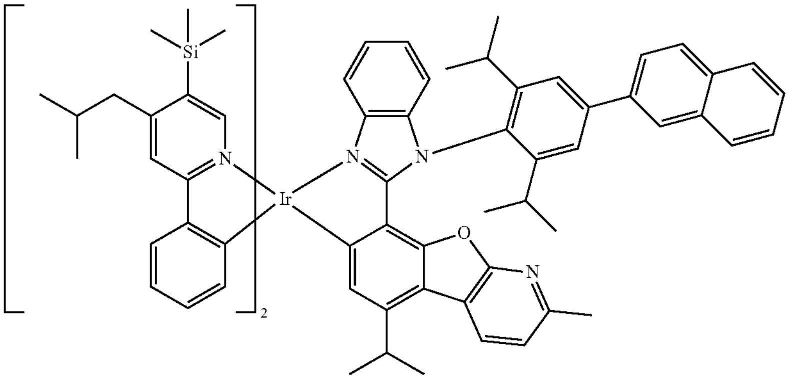

-continued
421
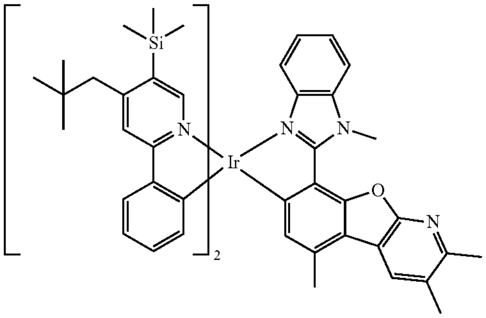
422
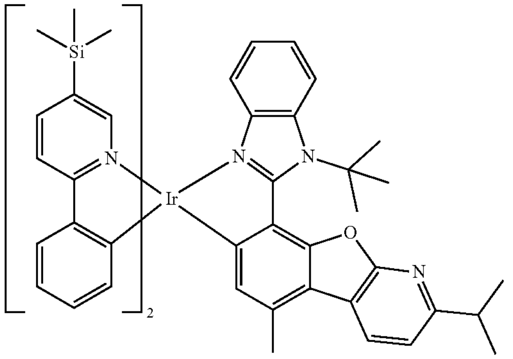
423
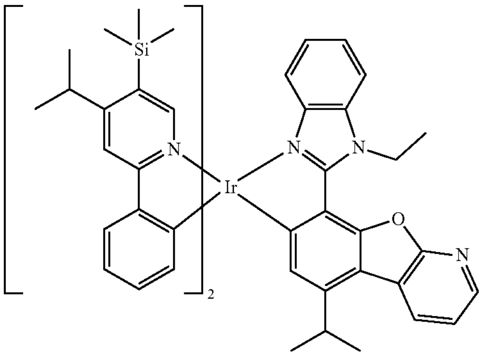
424
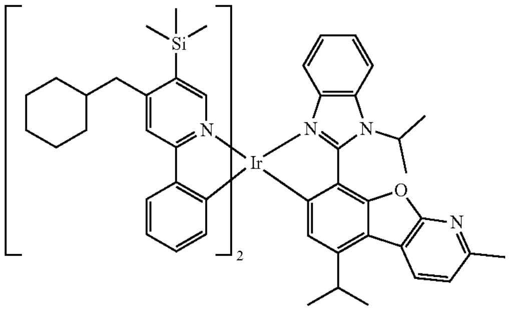
425
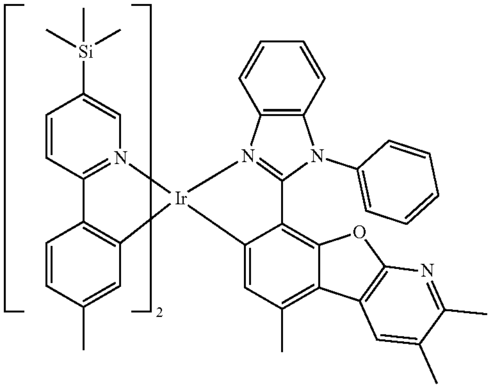
426
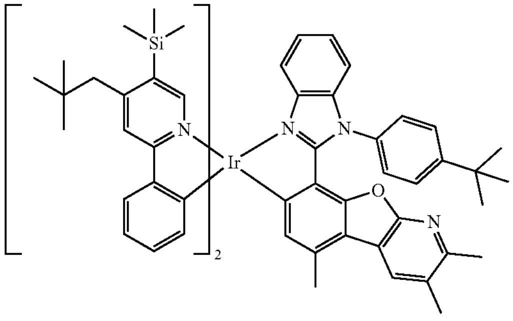
427
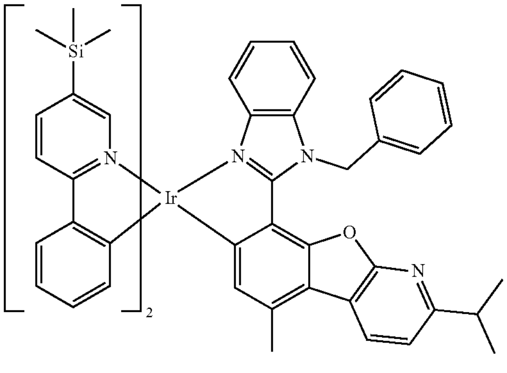
428
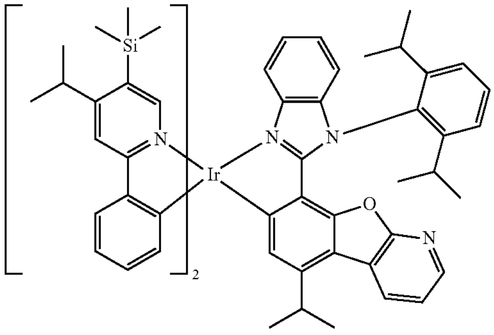

-continued
429
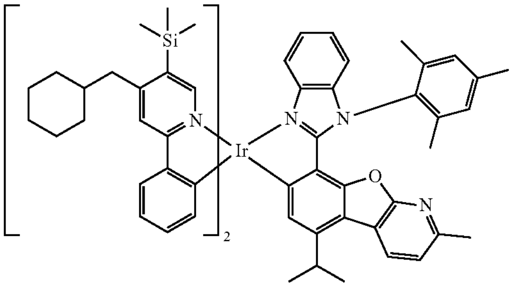
430
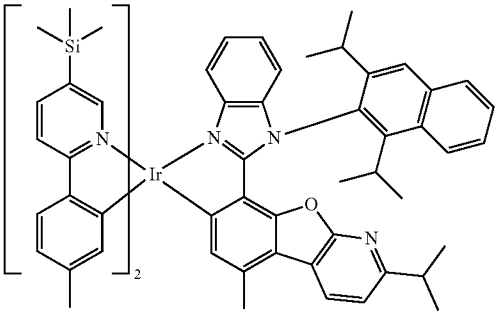
431
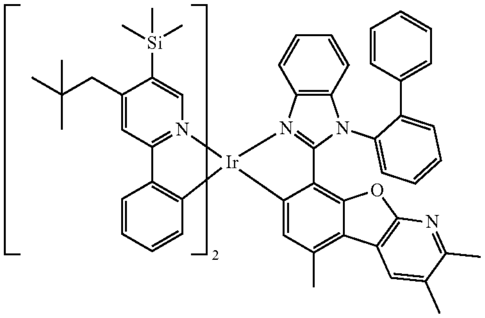
432
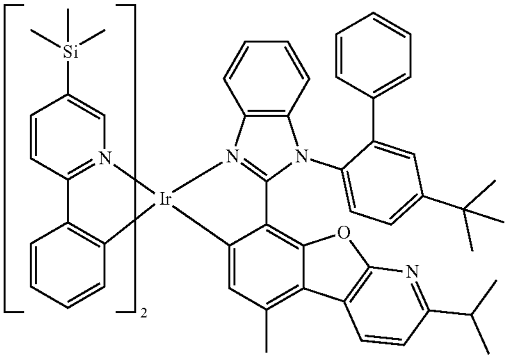
433
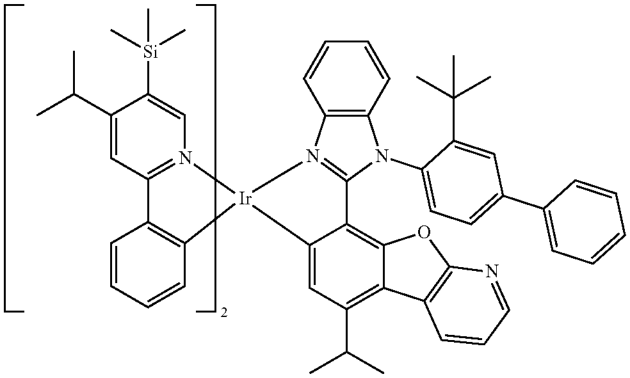
434
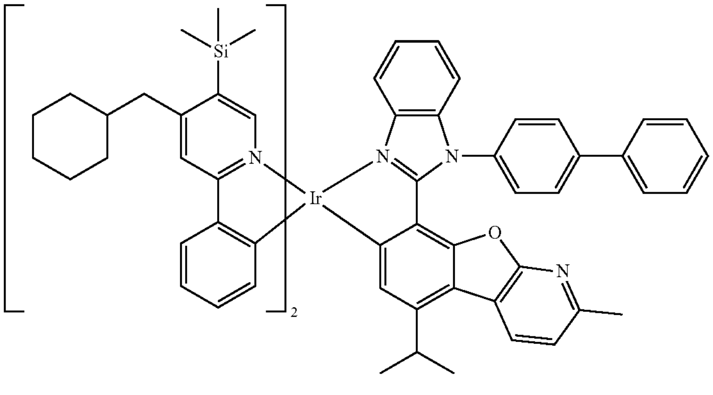

-continued
435
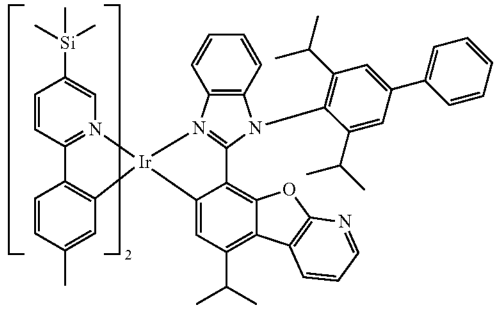
436
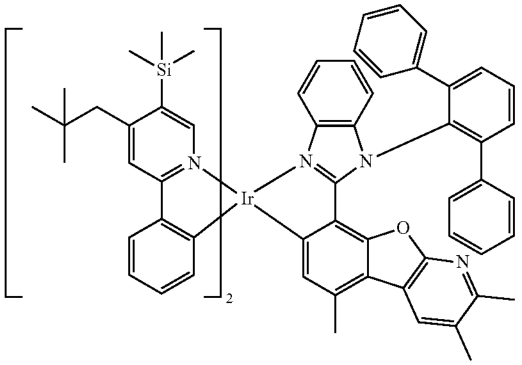
437
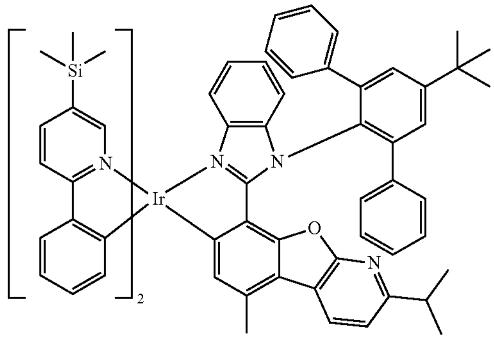
438
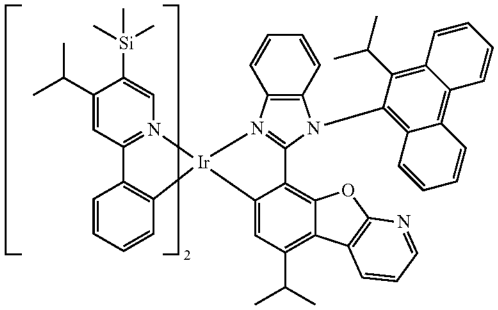
439
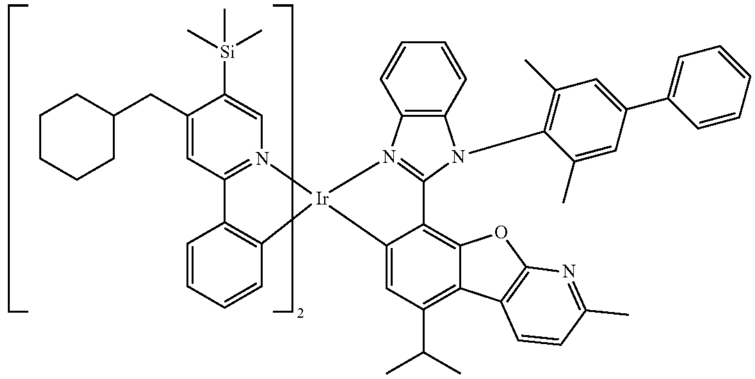
440
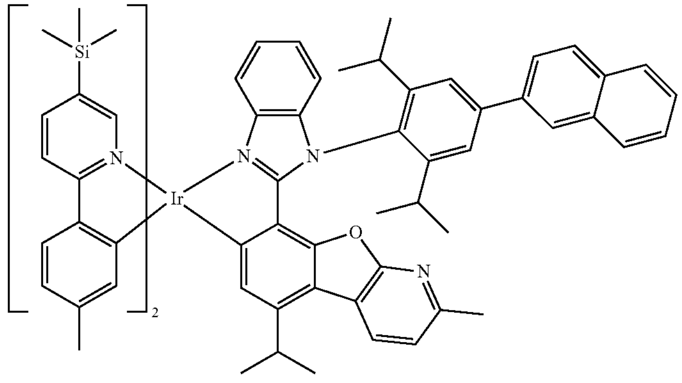

-continued
441
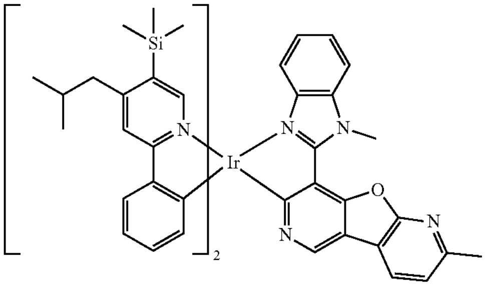
442
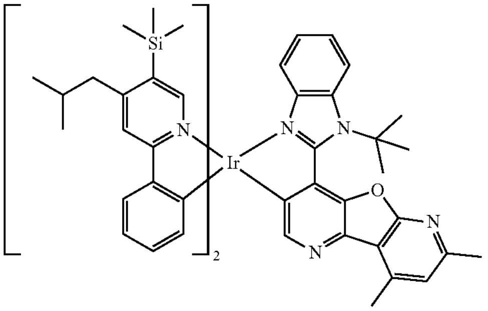
443
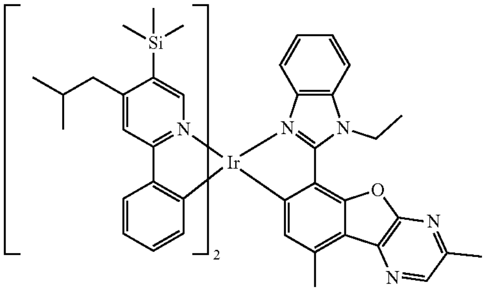
444
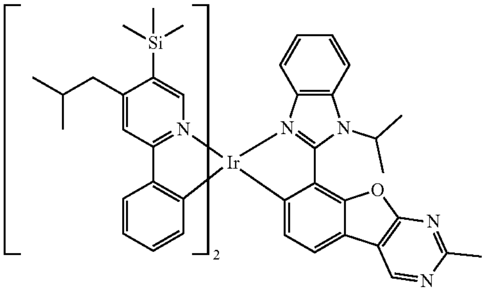
445
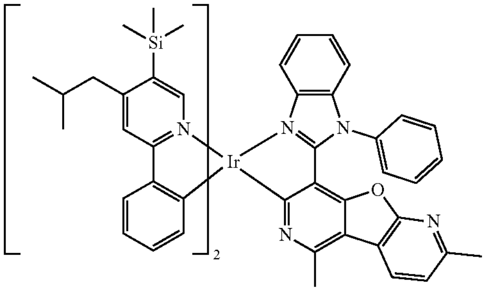
446
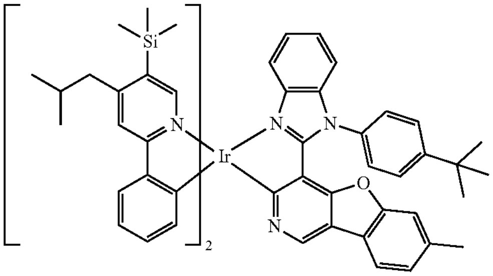
447
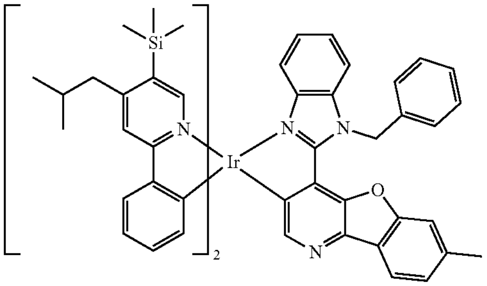
448
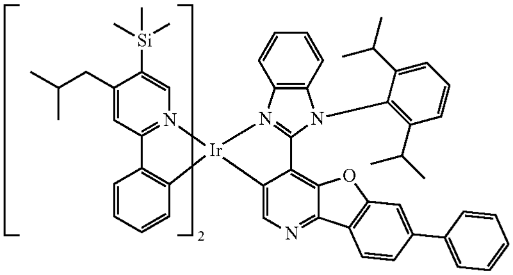
449
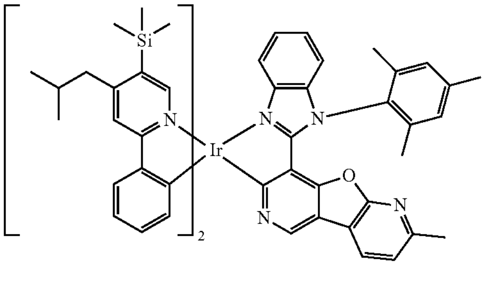
450
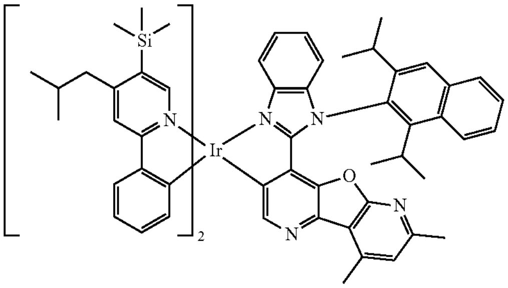

-continued
451
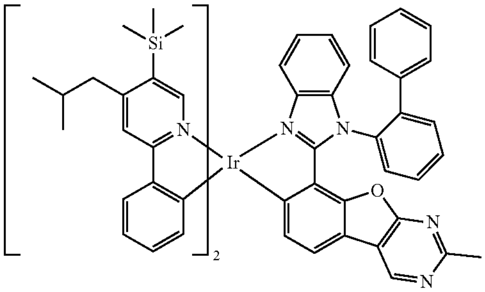
452
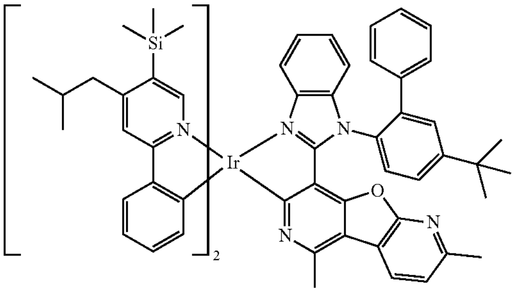
453
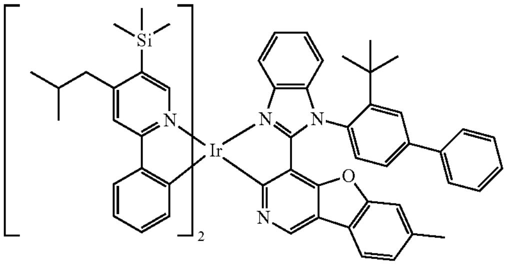
454
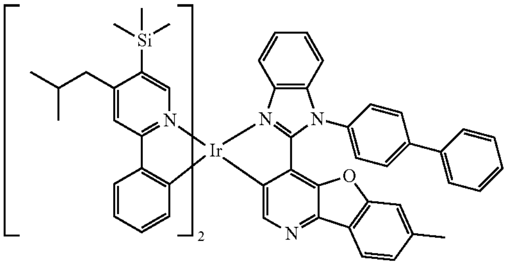
455
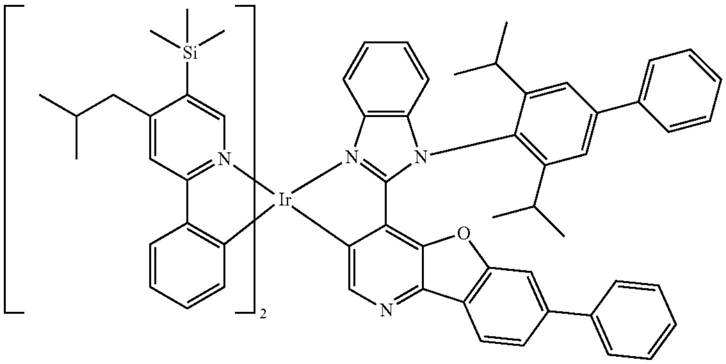
456
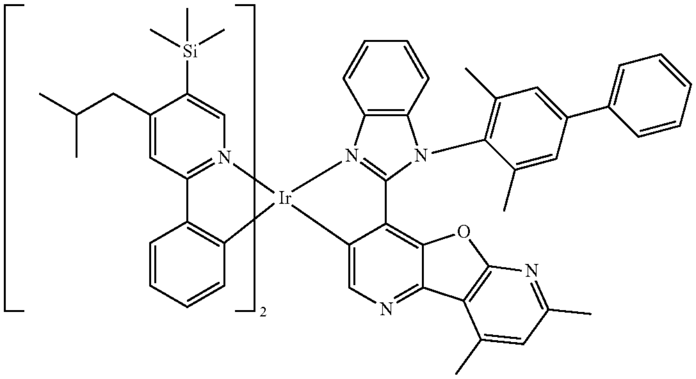
457
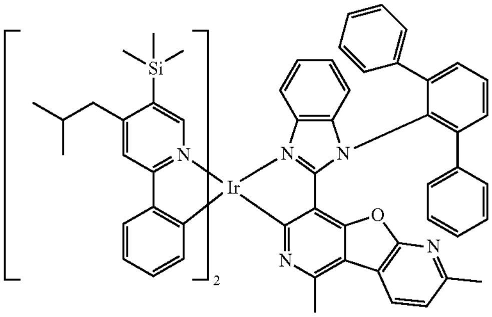
458
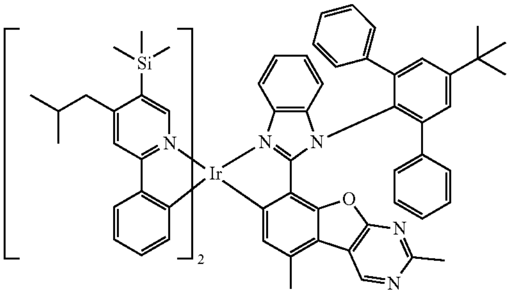

-continued
459
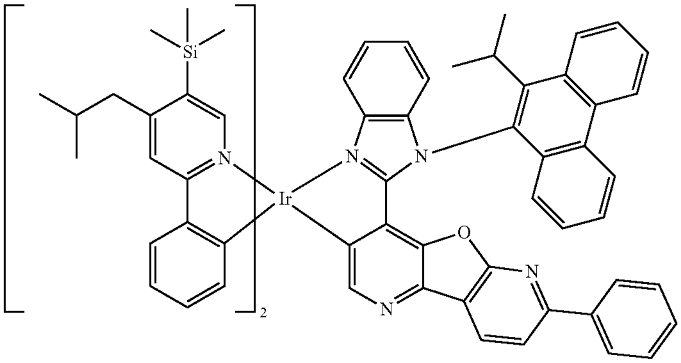
460
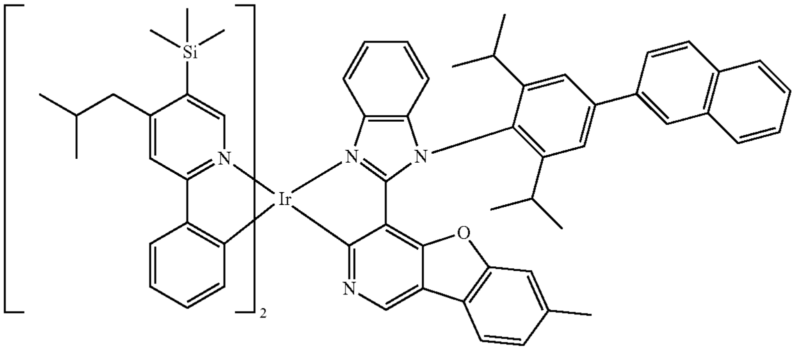
461
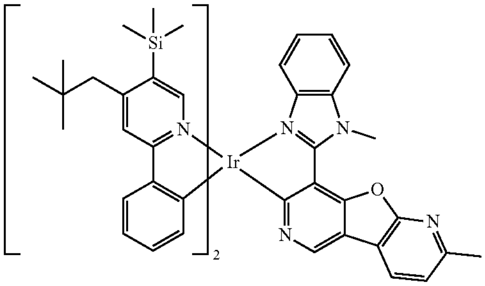
462
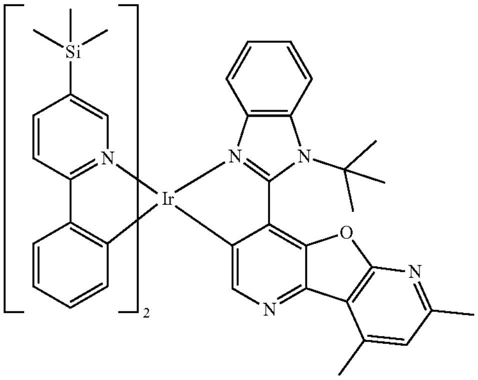
463
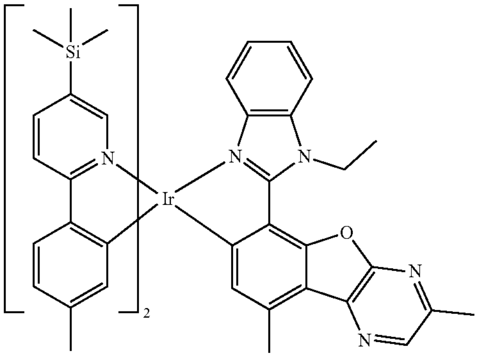
464
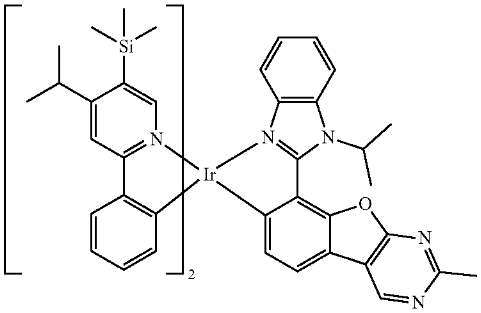

-continued
465
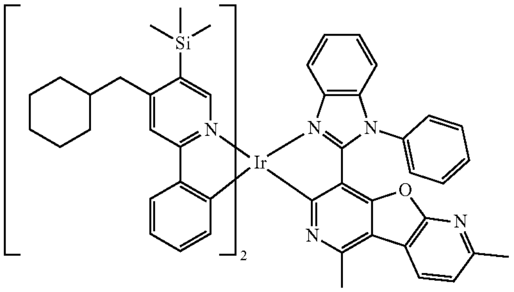
466
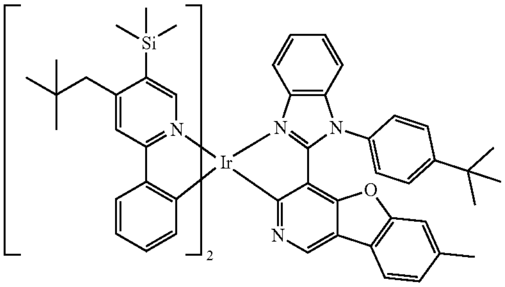
467
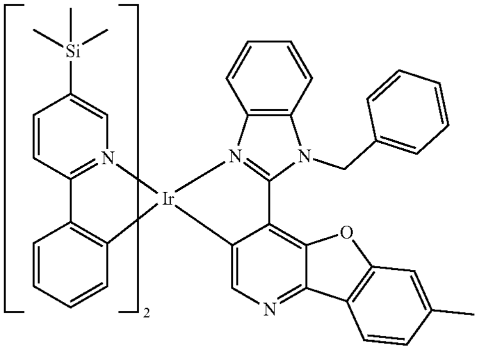
468
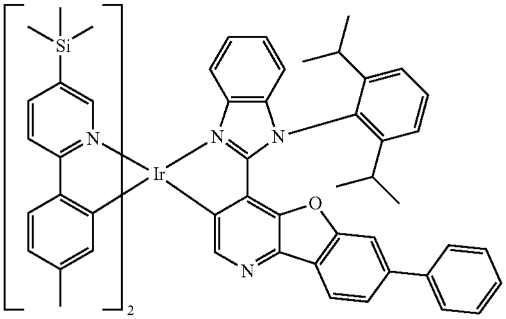
469
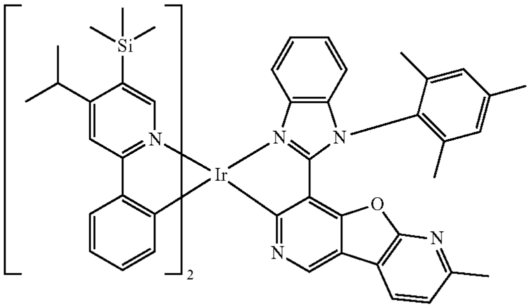
470
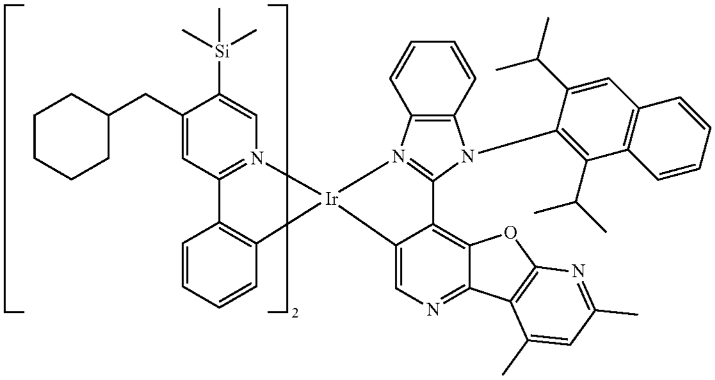

-continued
471
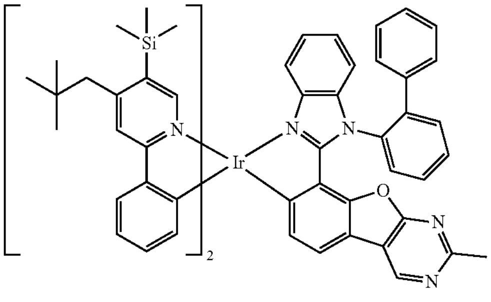
472
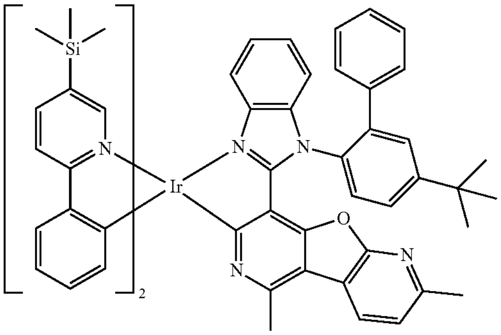
473
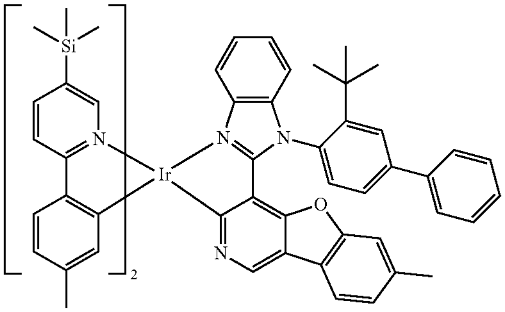
474
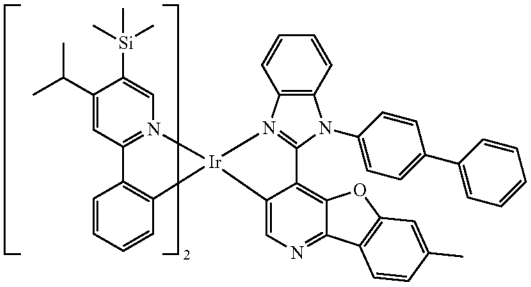
475
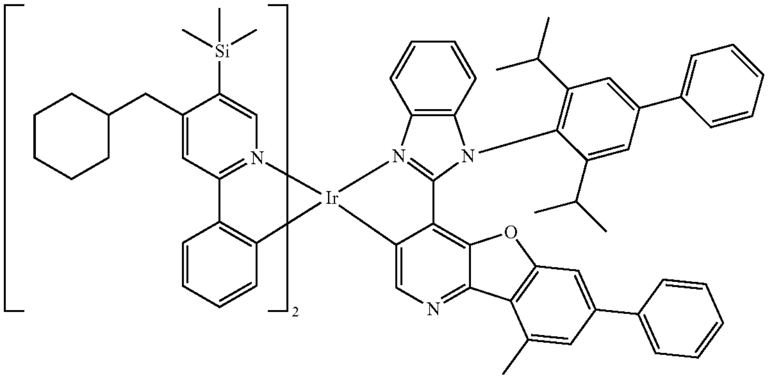
476
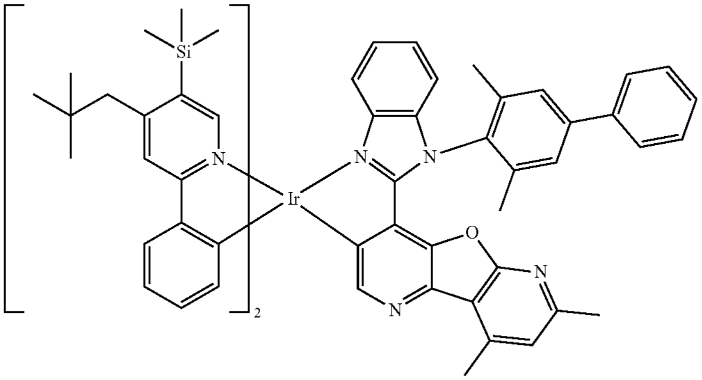

-continued
477
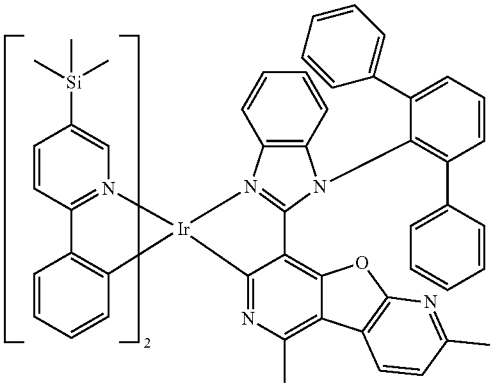
478
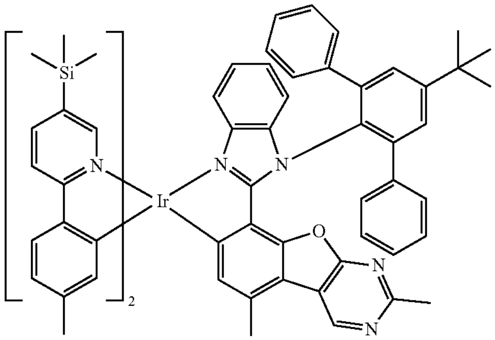
479
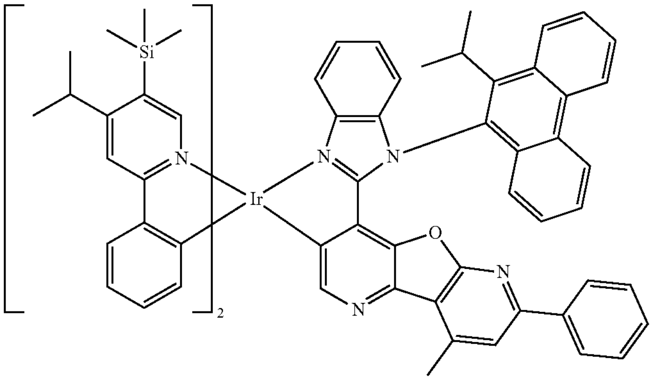
480
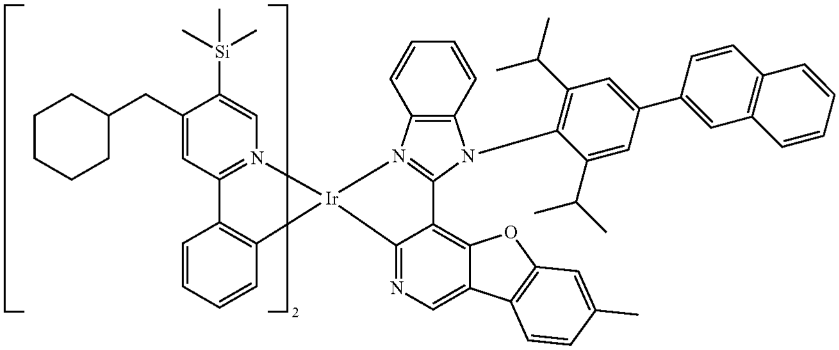
481
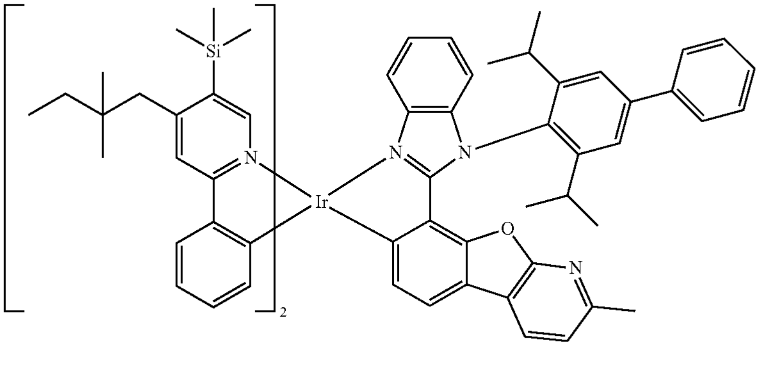

-continued
482
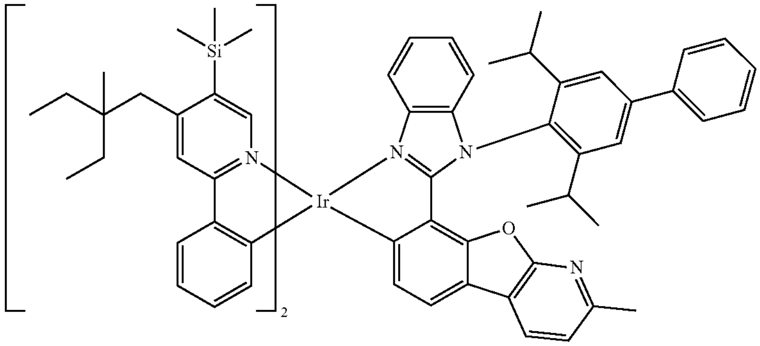
483
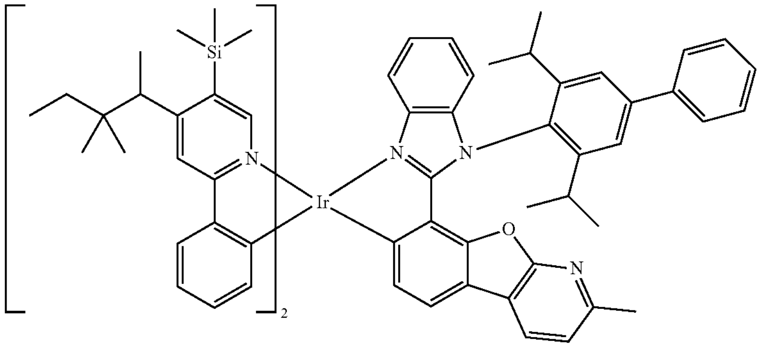
484
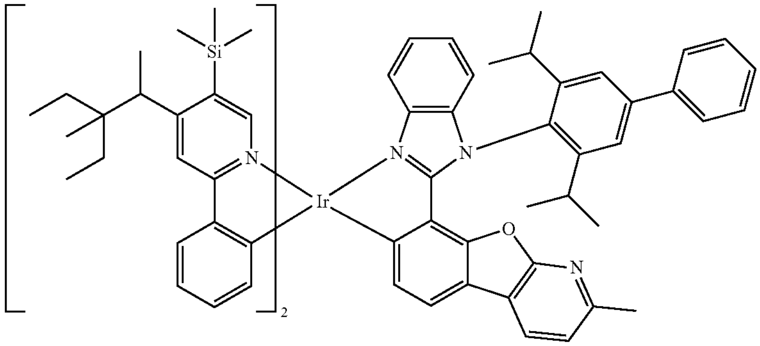
485
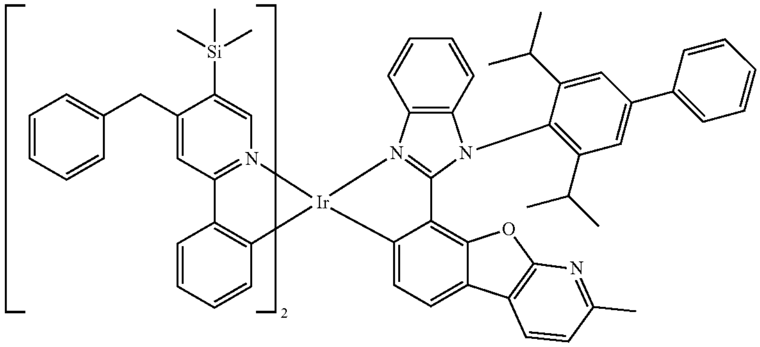

-continued
486
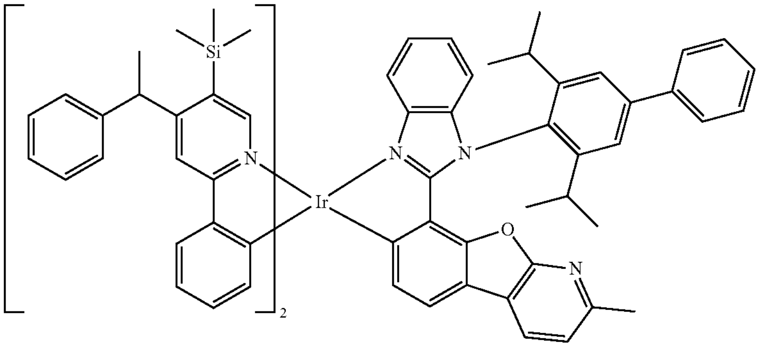
487
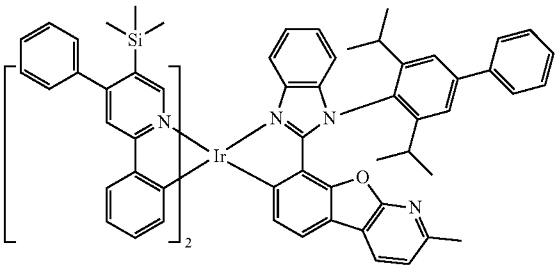
488
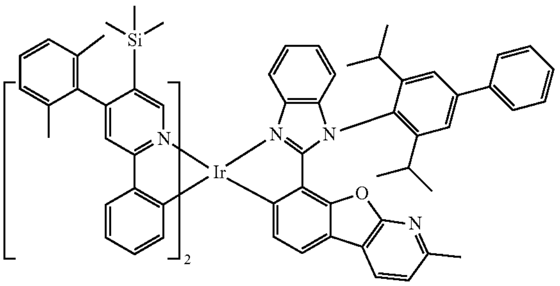
489
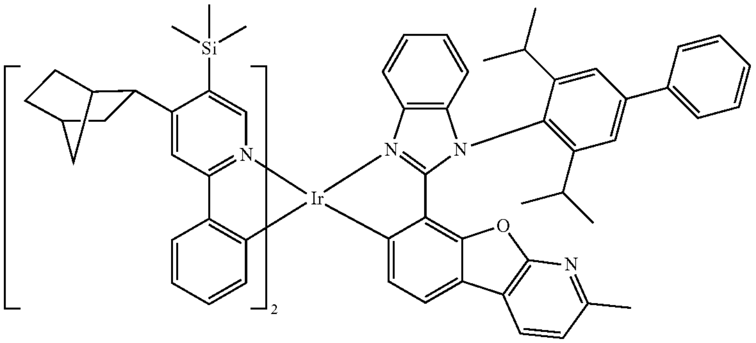
490
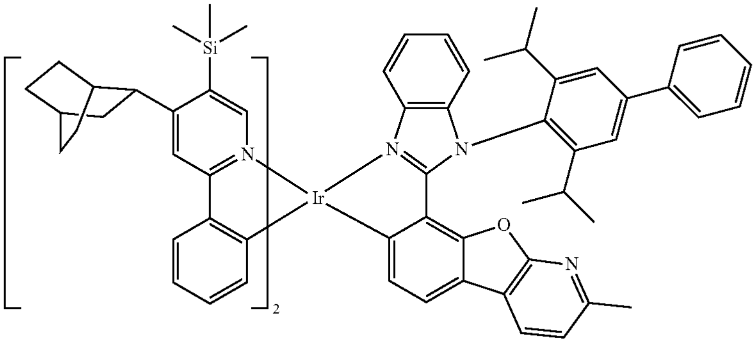

-continued
491
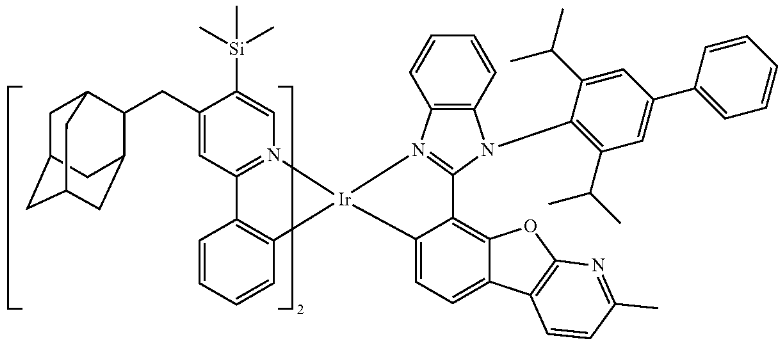
492
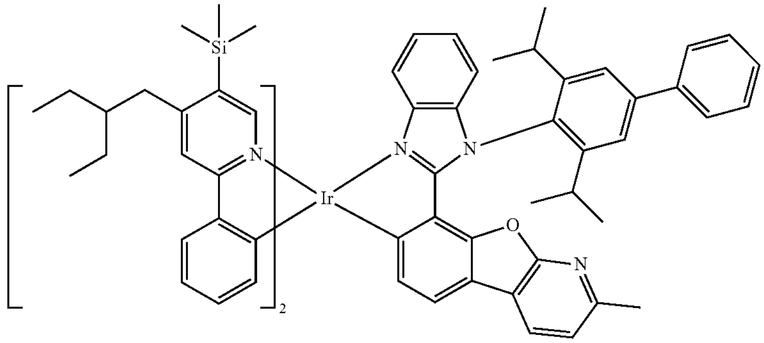
493
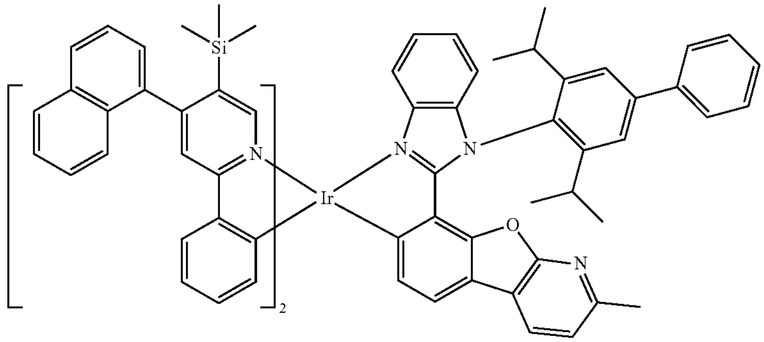
494
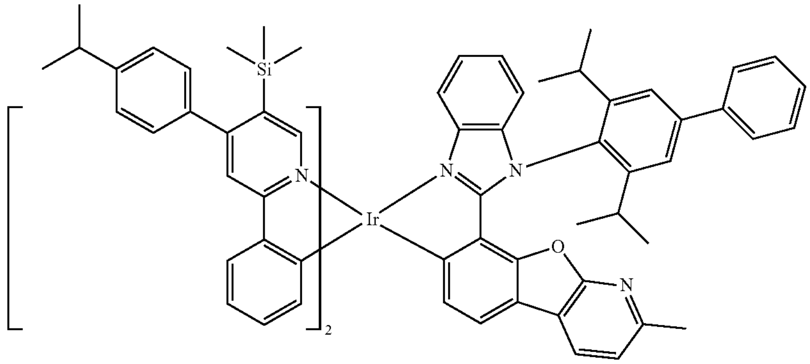

-continued
495
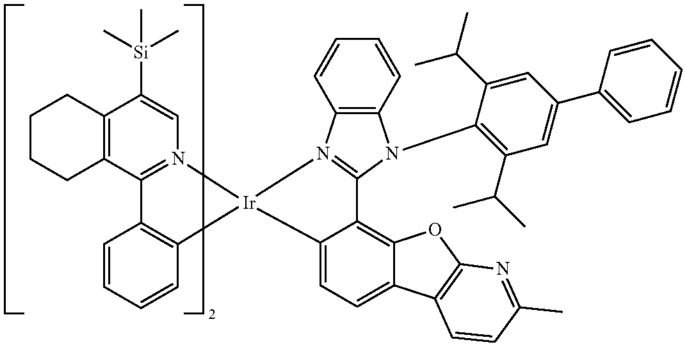
496
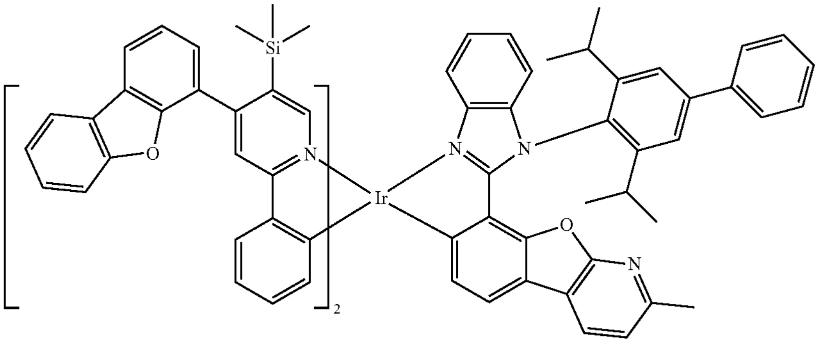
497
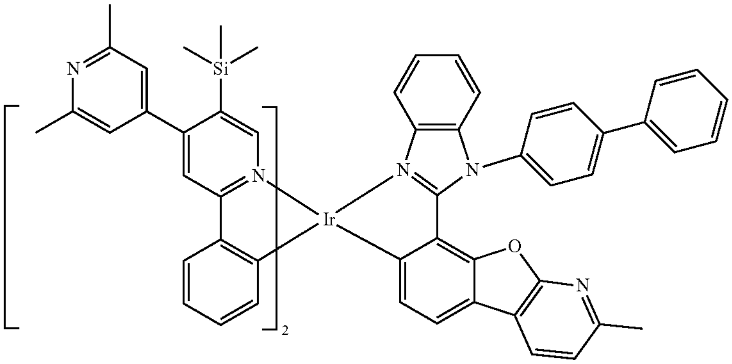
498
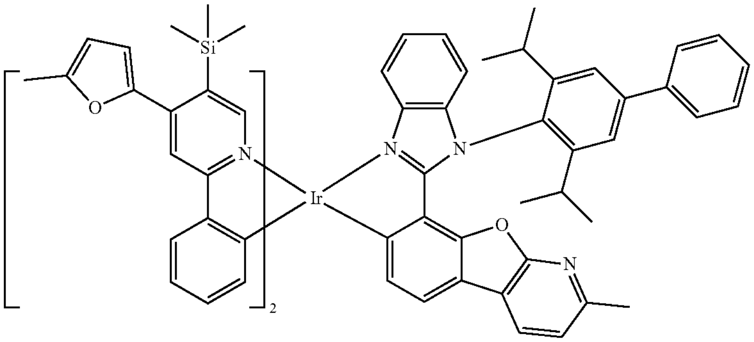

-continued
499
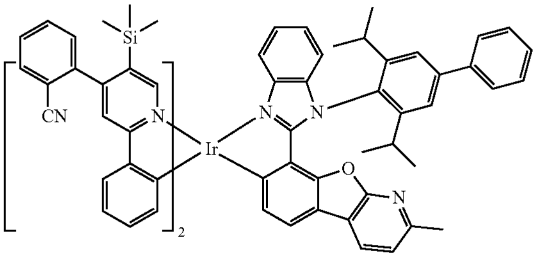
500
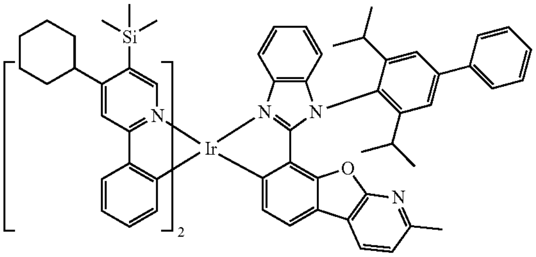
501
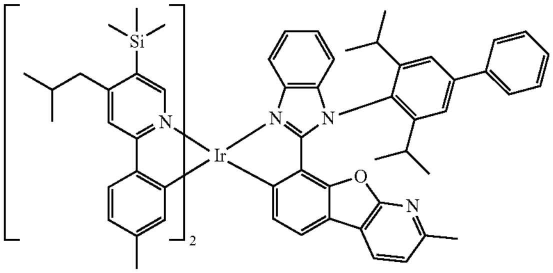
502
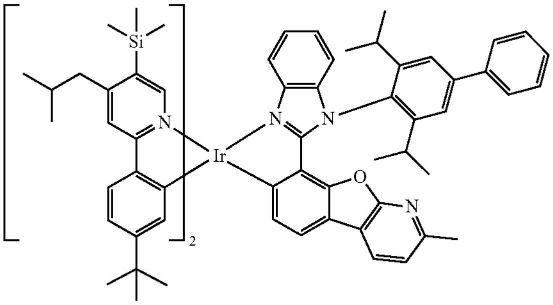
503
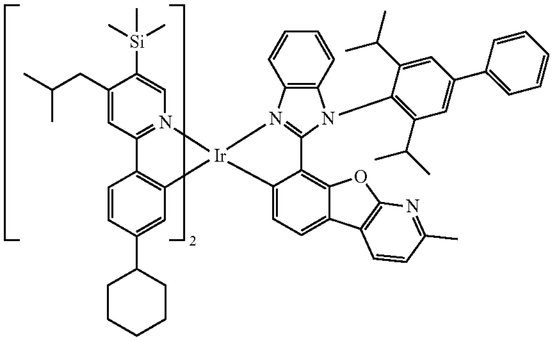
504
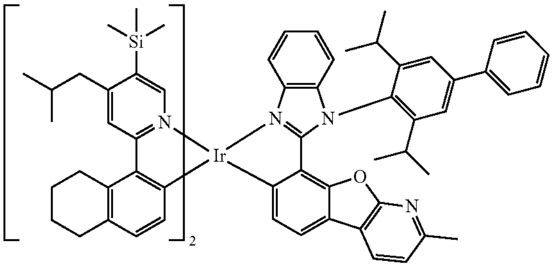
505
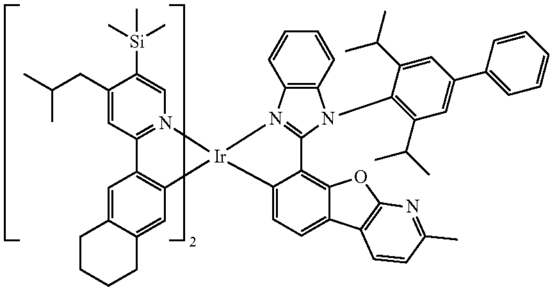
506
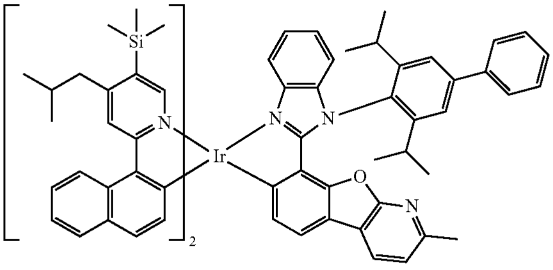

-continued
507
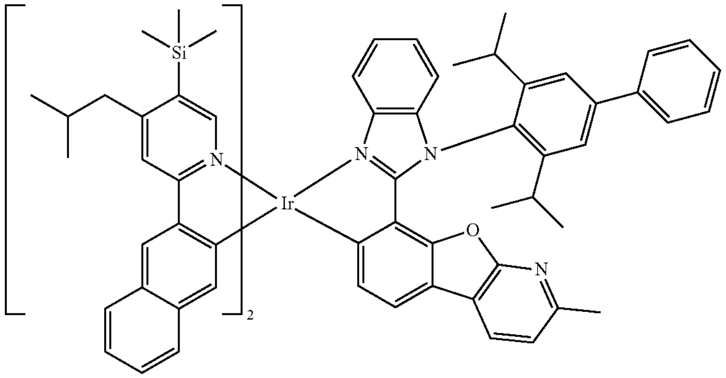
508
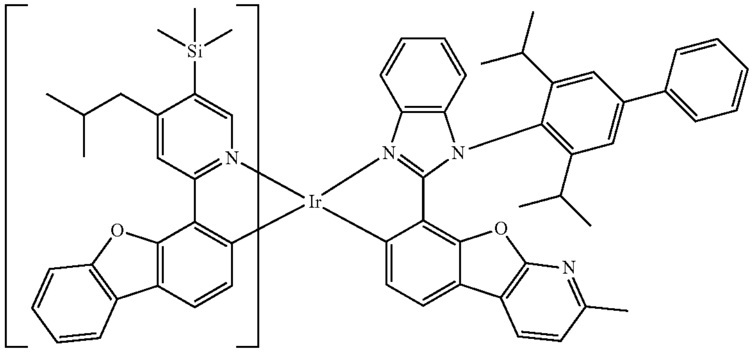
509
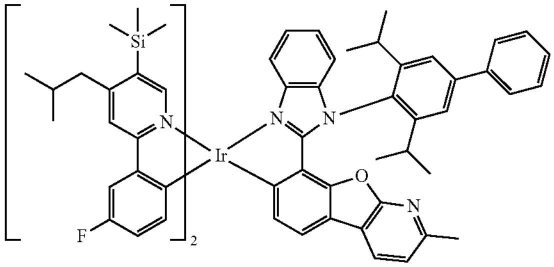
510
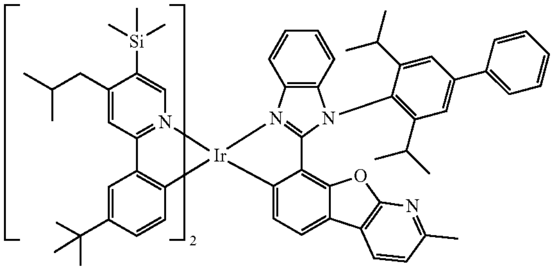
511
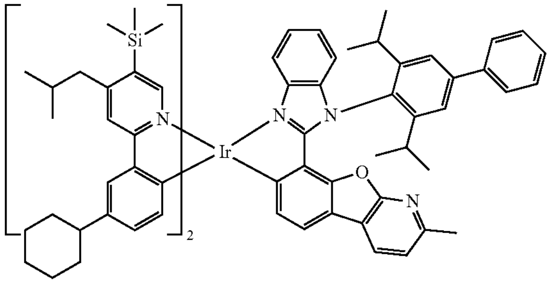
512
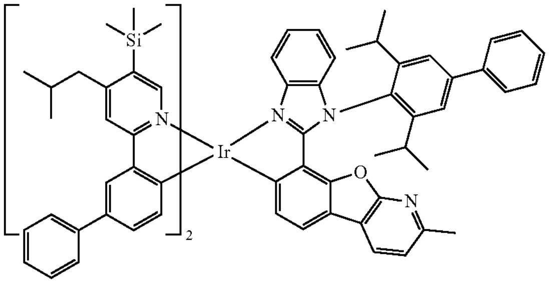
513
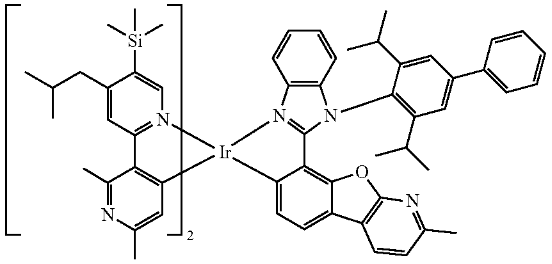
514
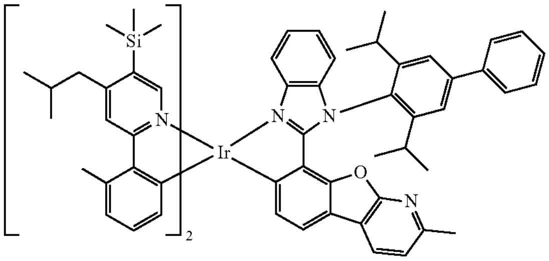

-continued
515
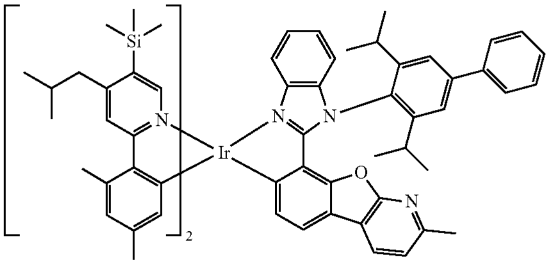
516
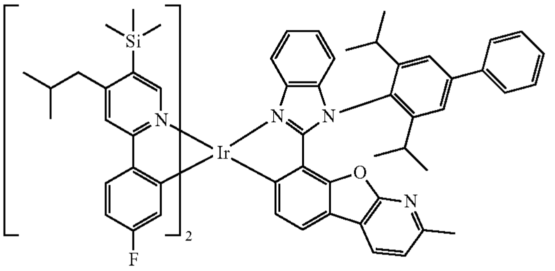
517
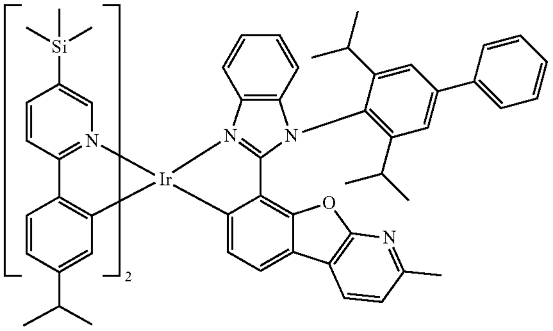
518
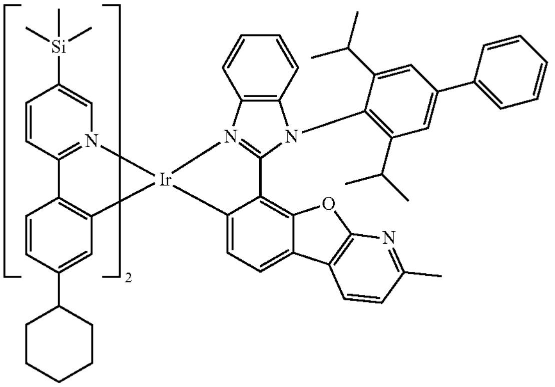
519
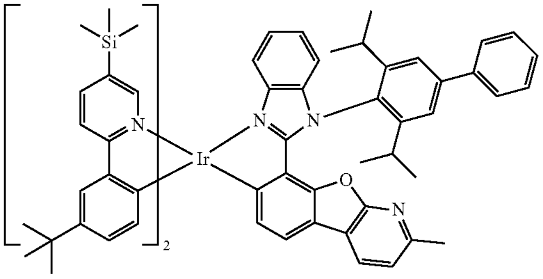
520
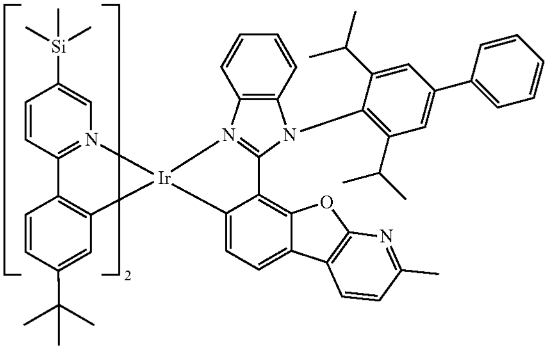
521
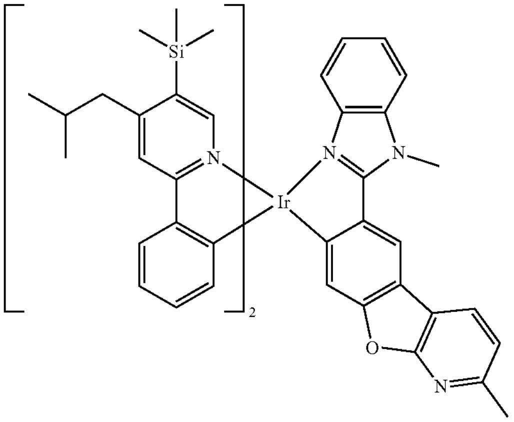
522
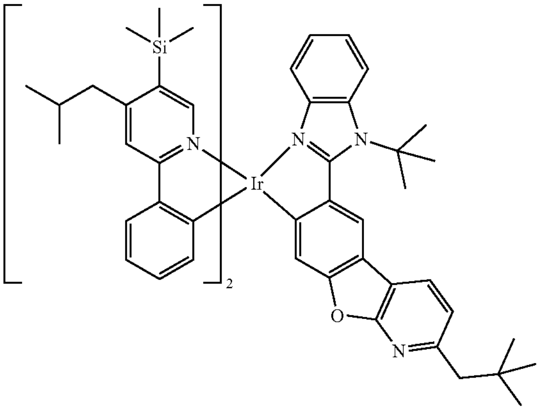

-continued
523
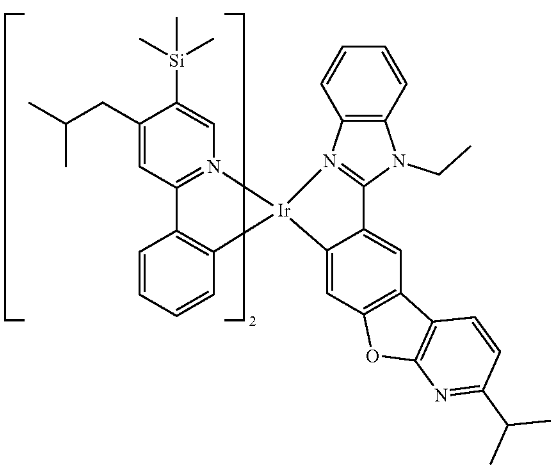
524
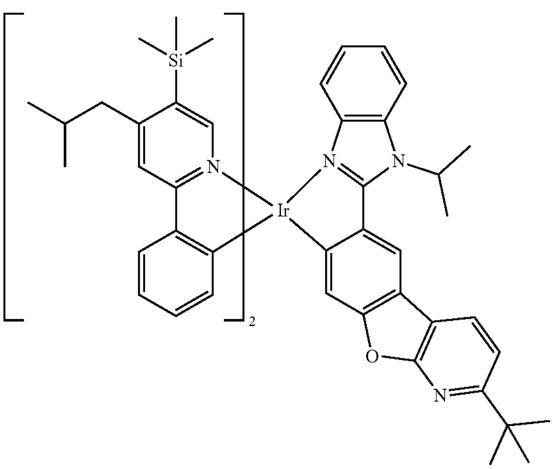
225
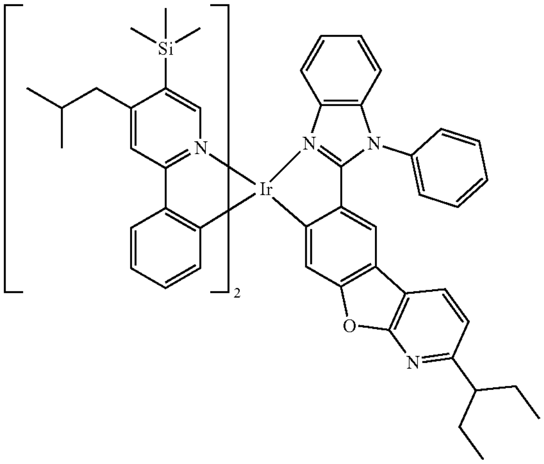
526
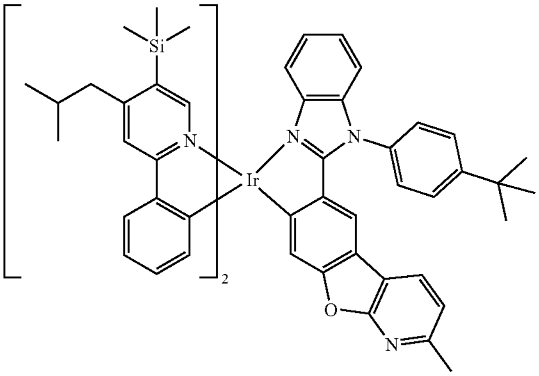
527
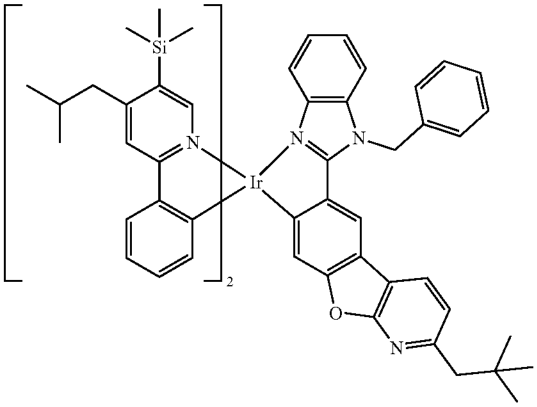
528
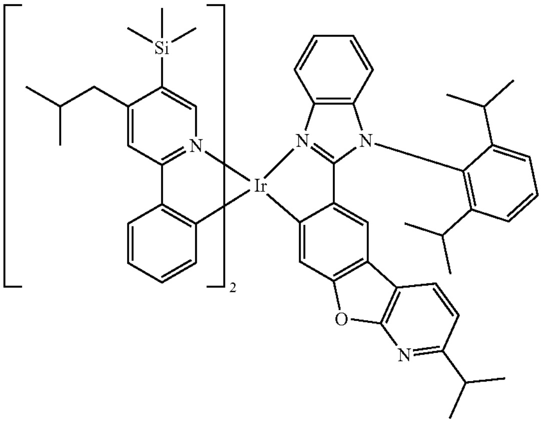

-continued
529
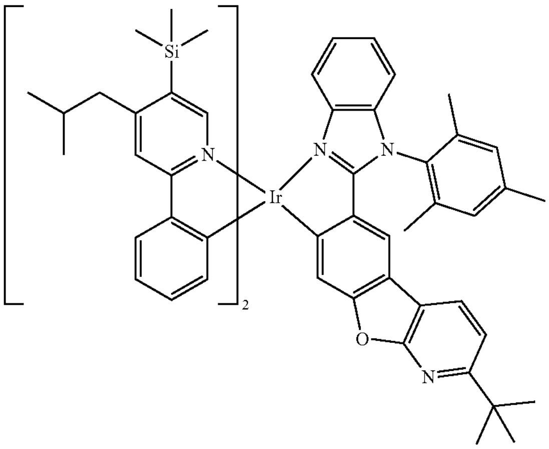
530
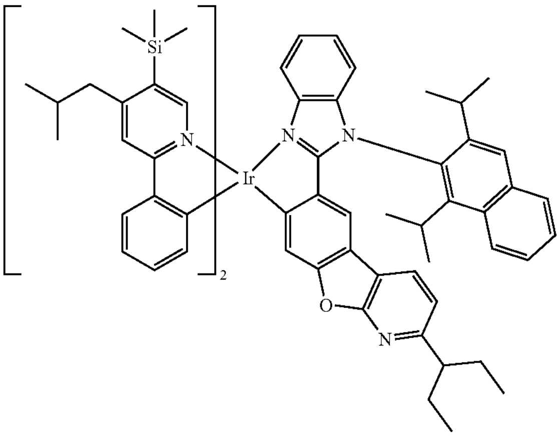
531
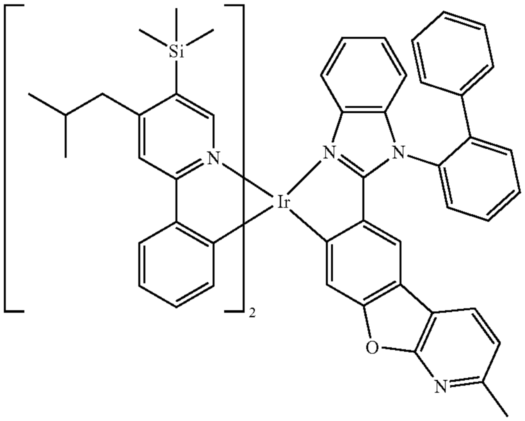
532
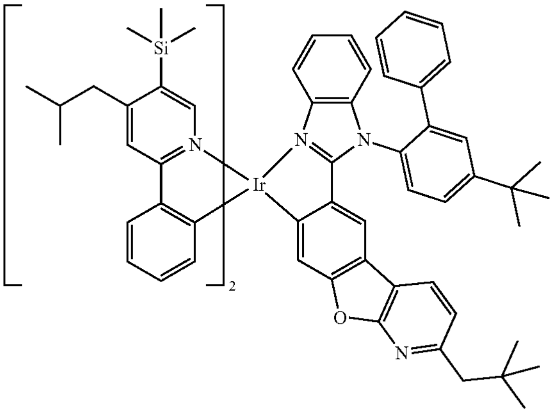
533
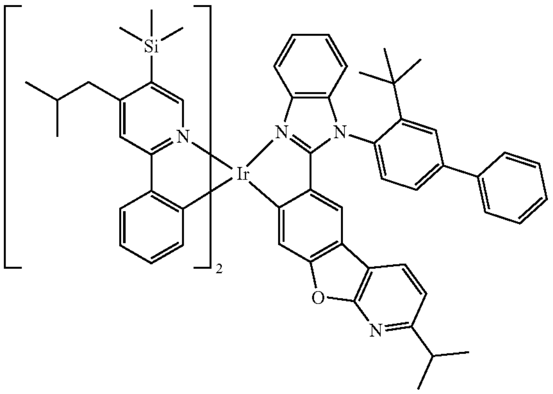
534
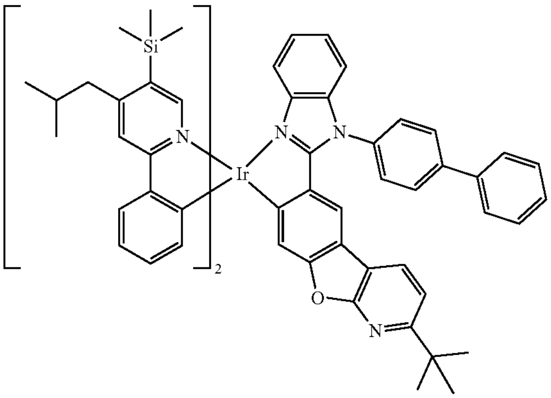

-continued
535
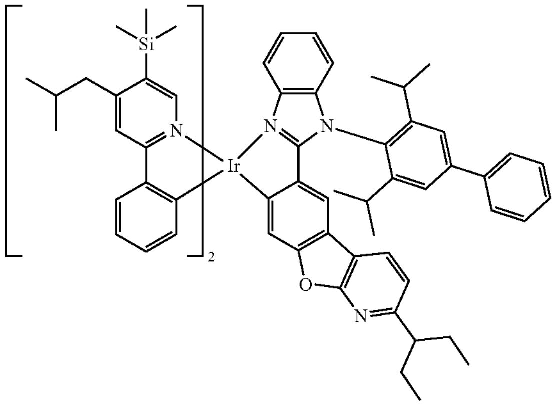
536
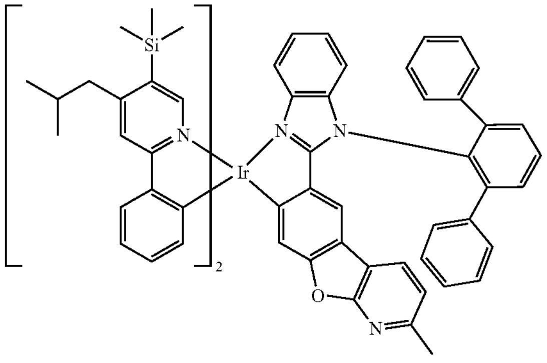
537
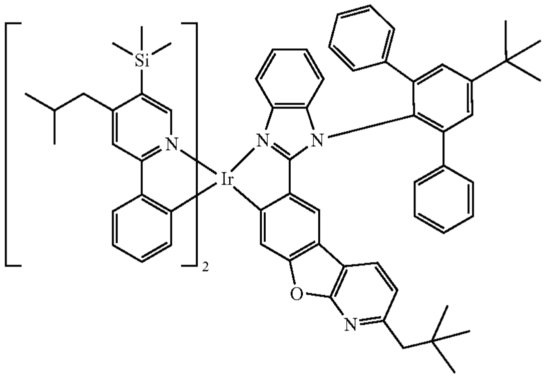
538
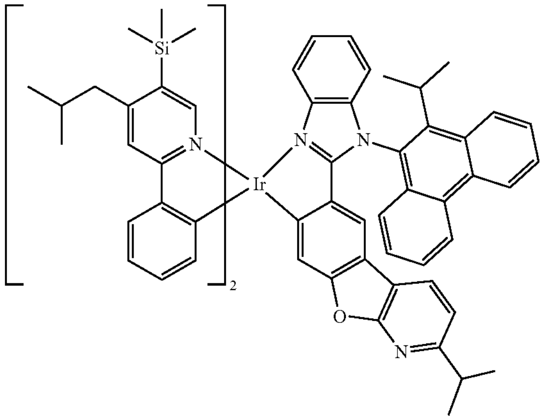
539
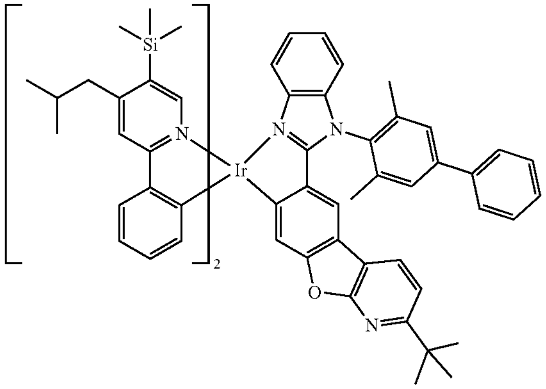
540
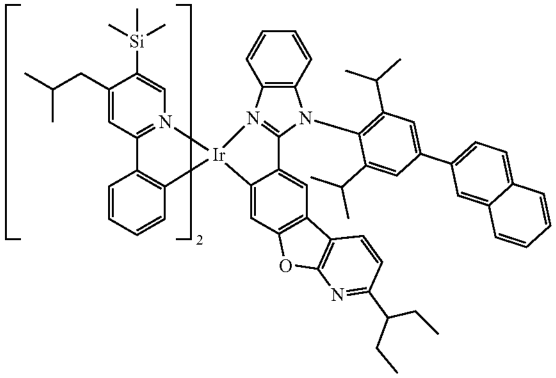

-continued
541
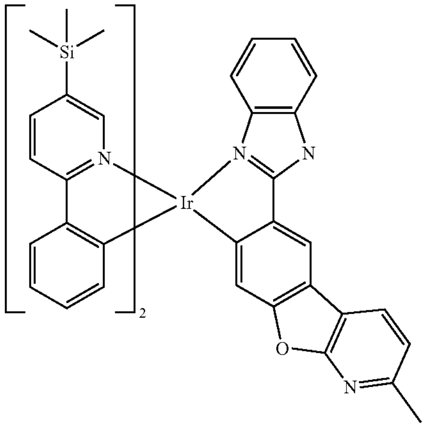
542
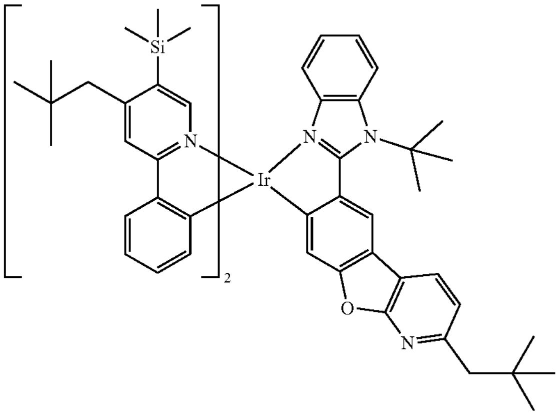
543
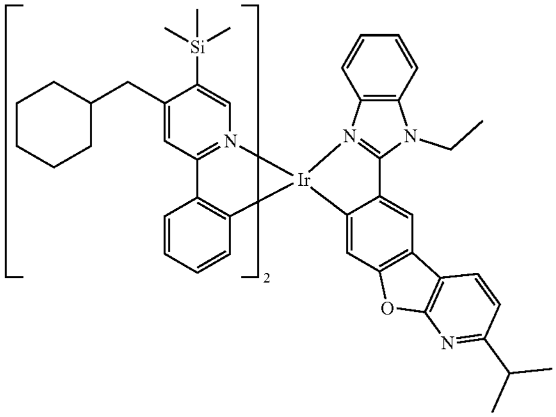
544
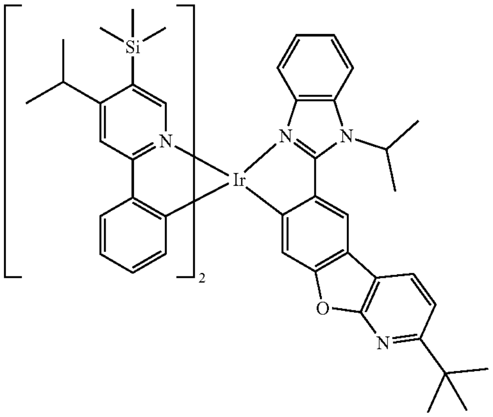
545
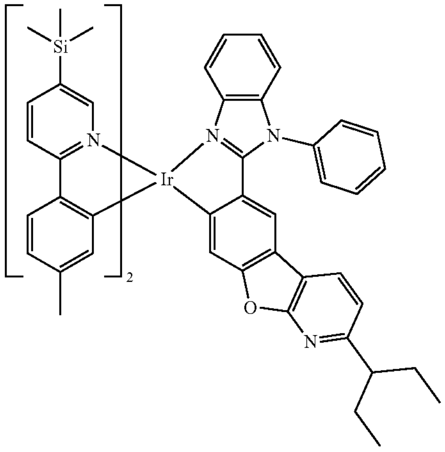
546
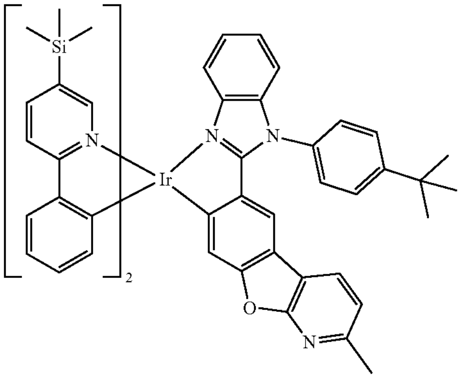

-continued
547
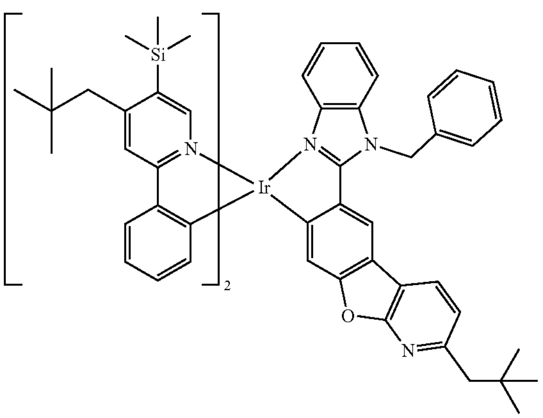
548
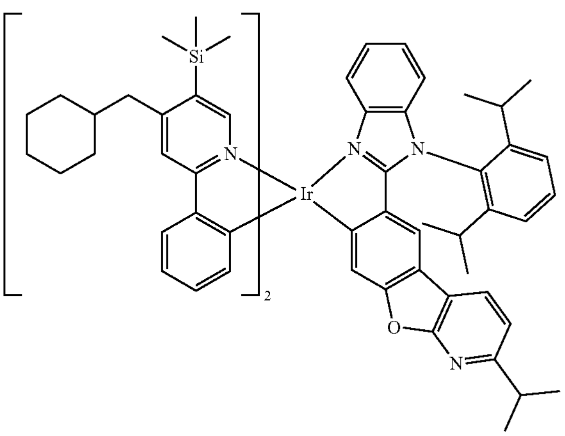
549
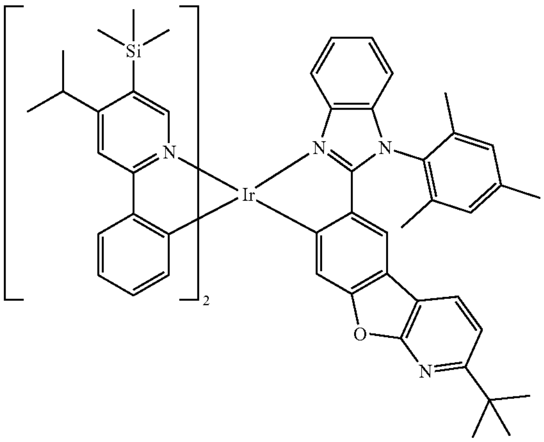
550
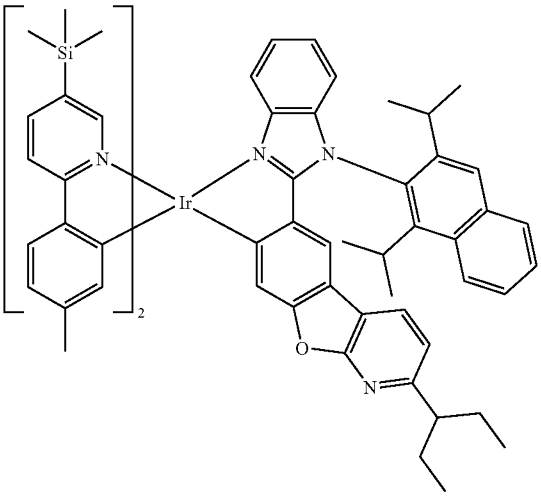
551
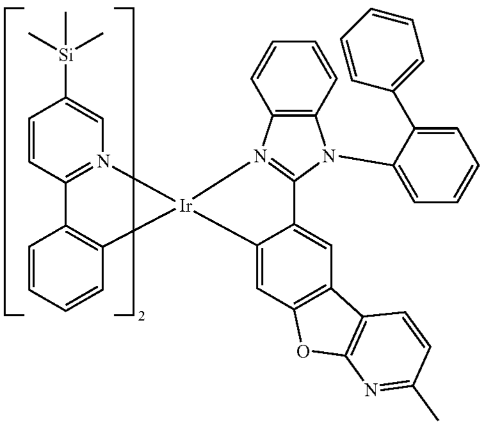
552
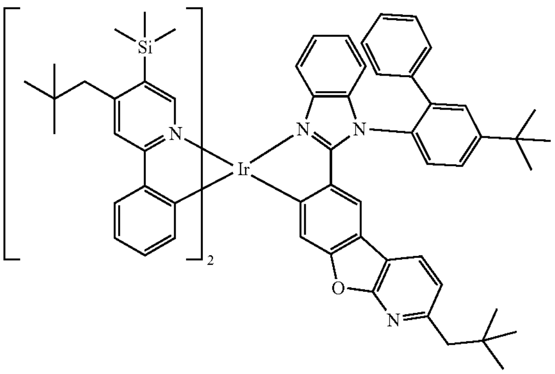

-continued
553
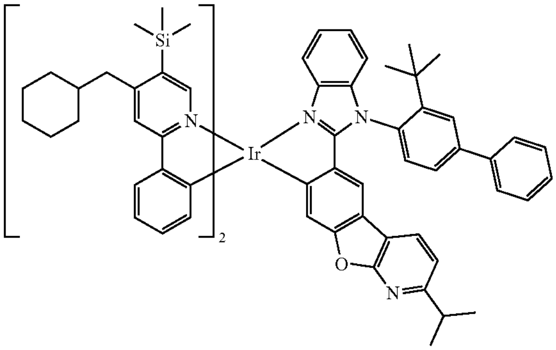
554
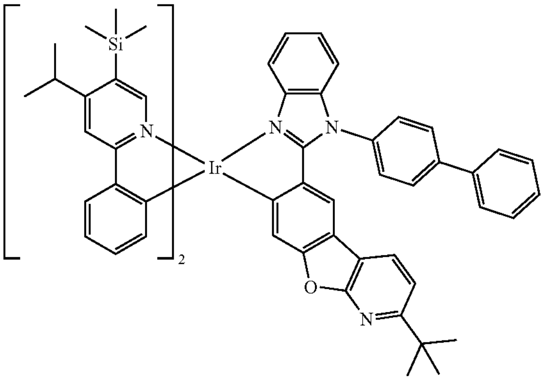
555
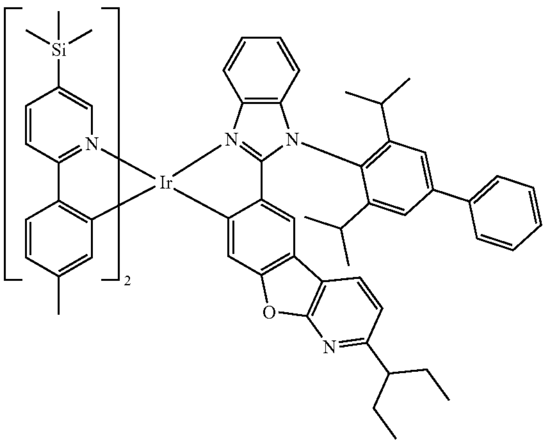
556
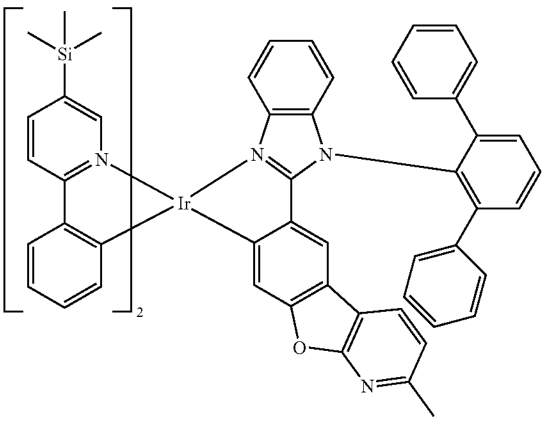
557
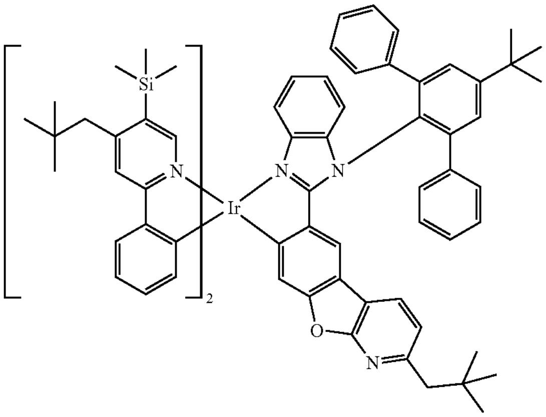
558
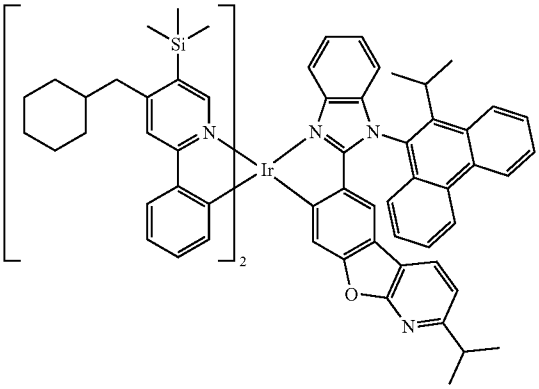

-continued
559
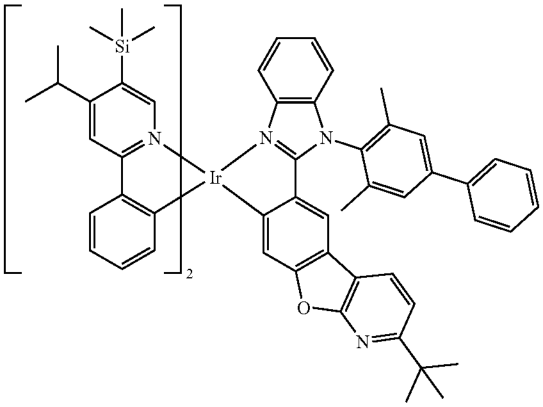
560
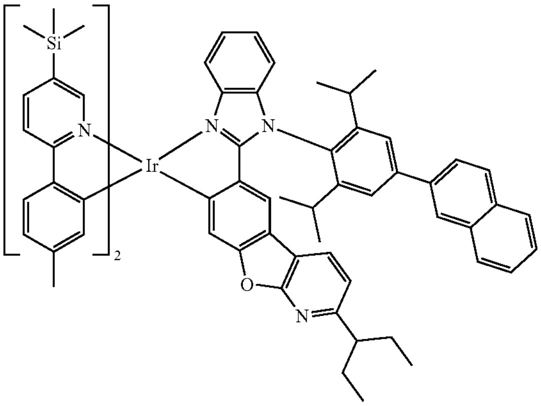
561
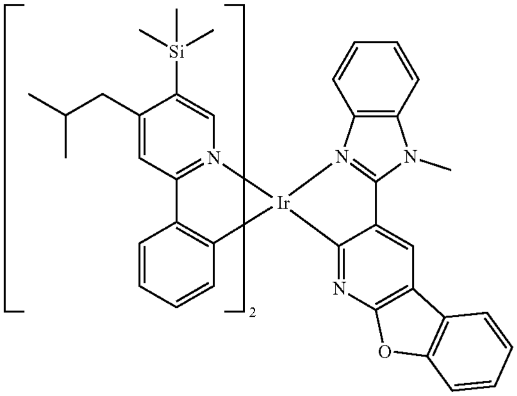
562
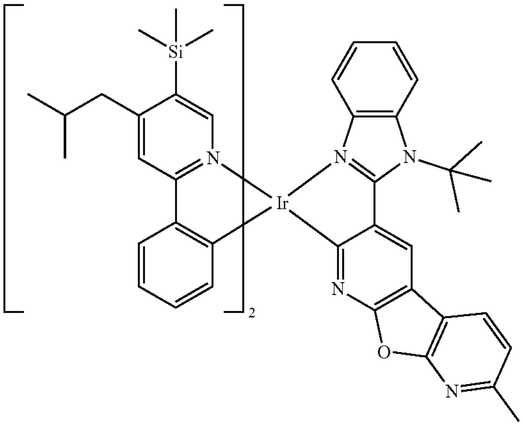
563
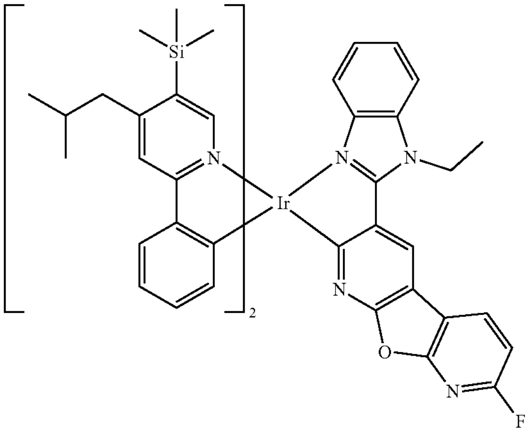
564
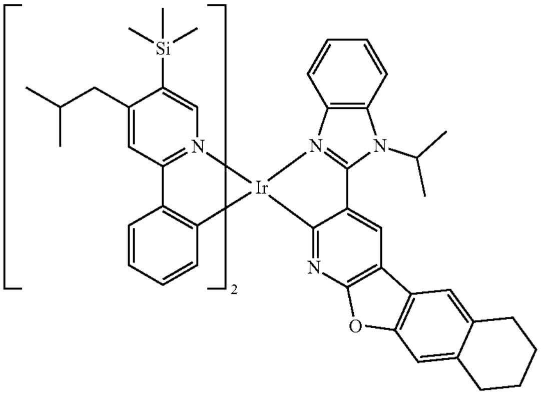

-continued
565
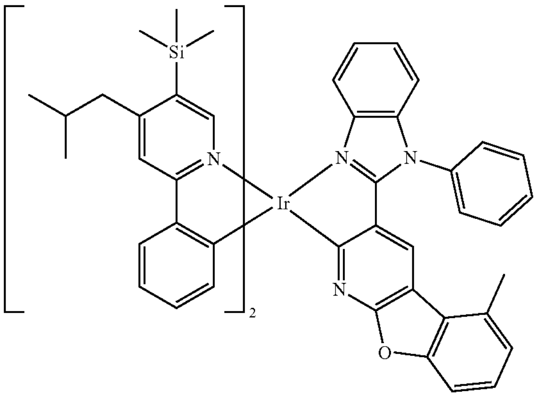
566
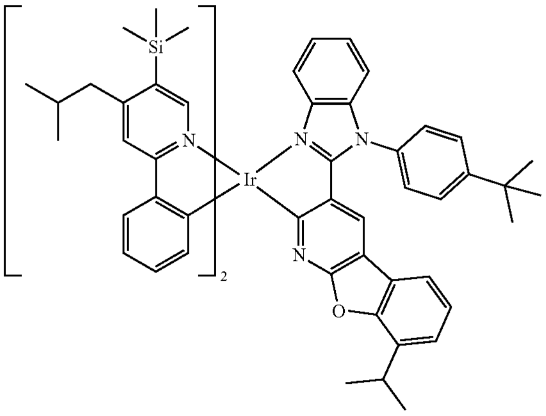
567
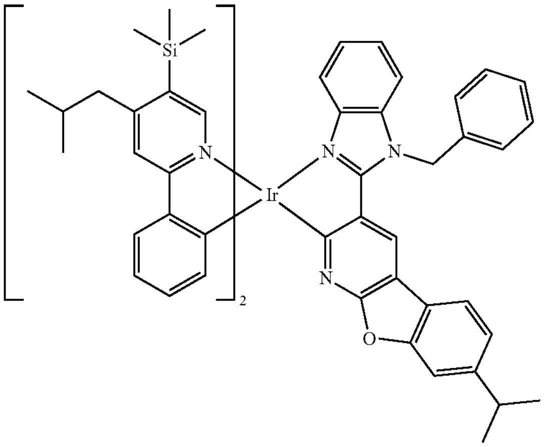
568
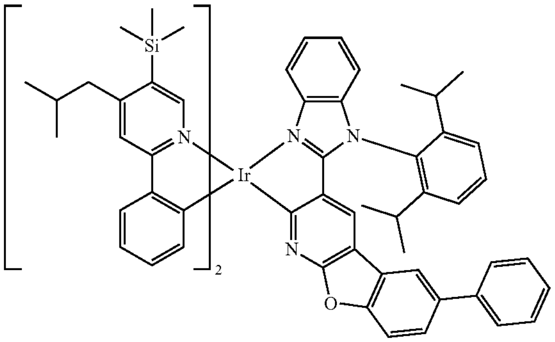
569
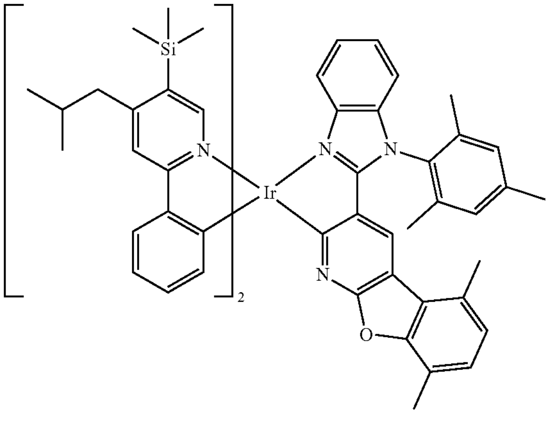
570
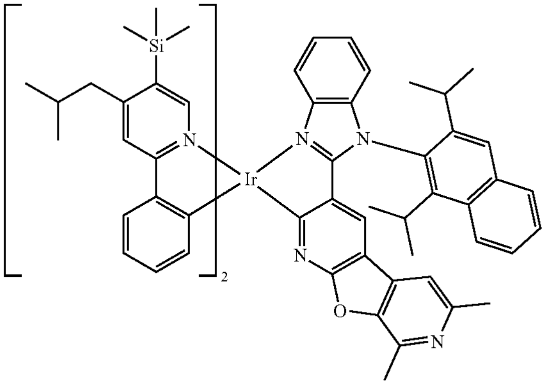

-continued
571
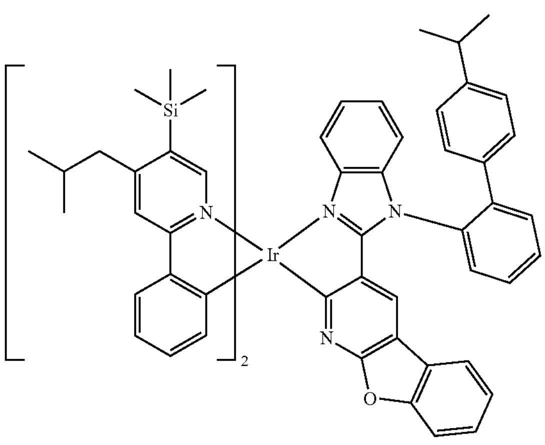
572
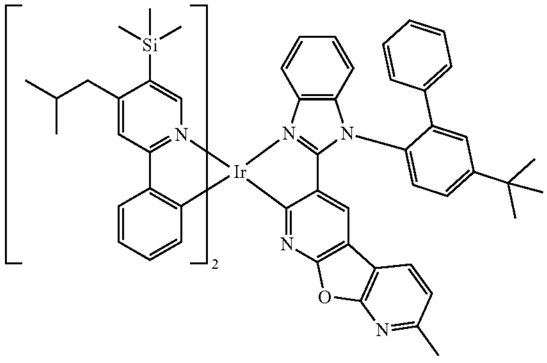
573
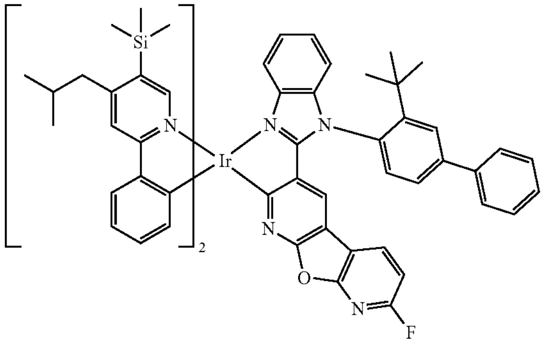
574
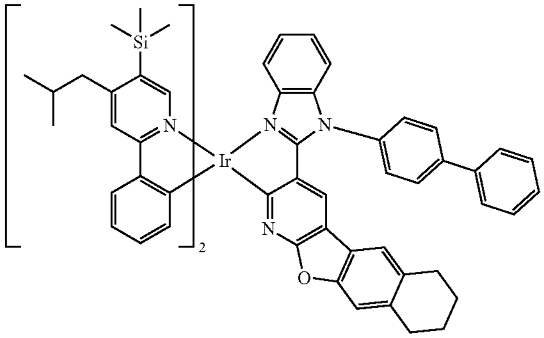
575
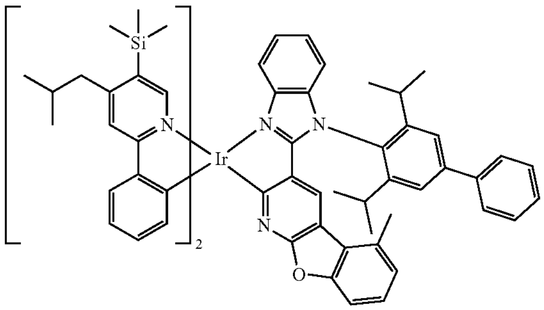
576
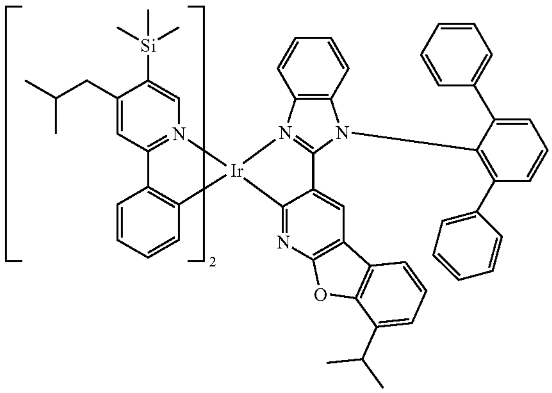

-continued
577
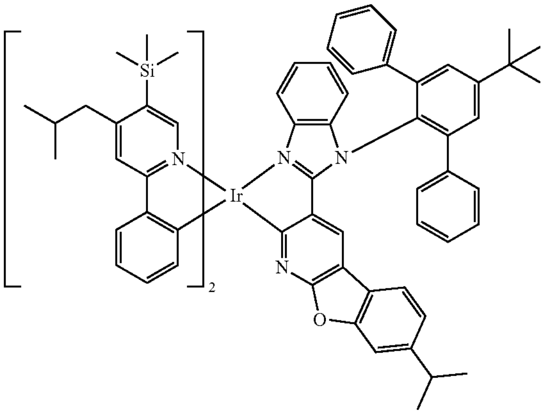
578
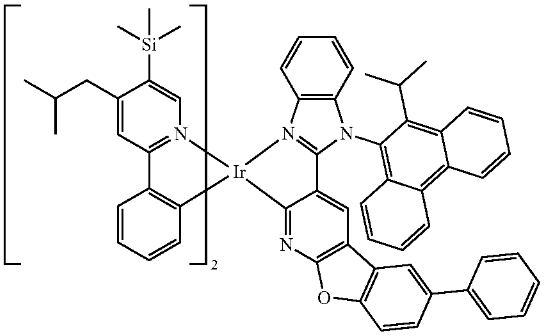
579
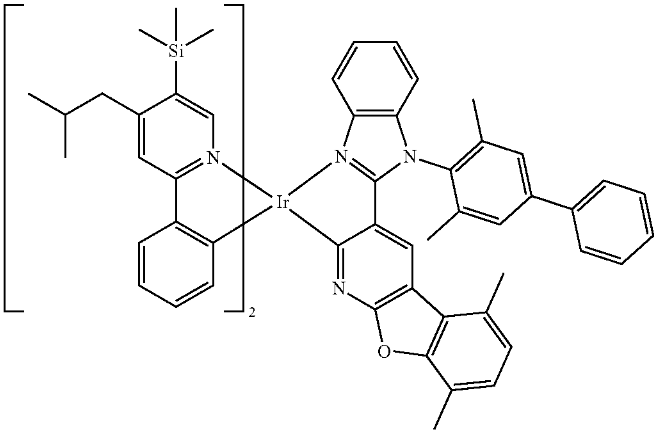
580
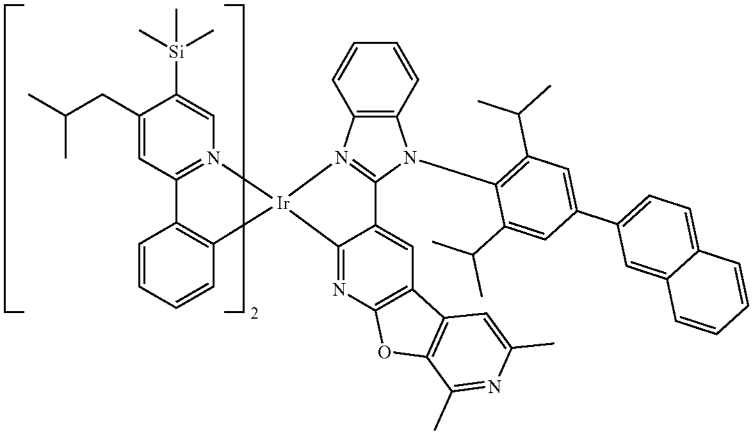

-continued
581
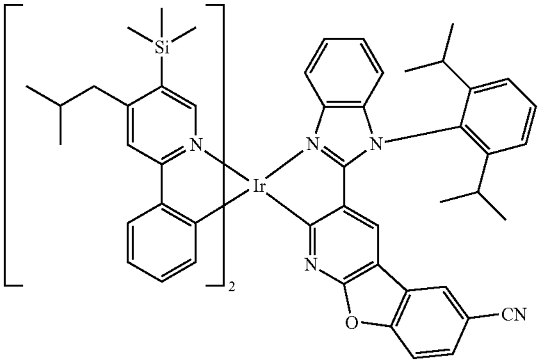
582
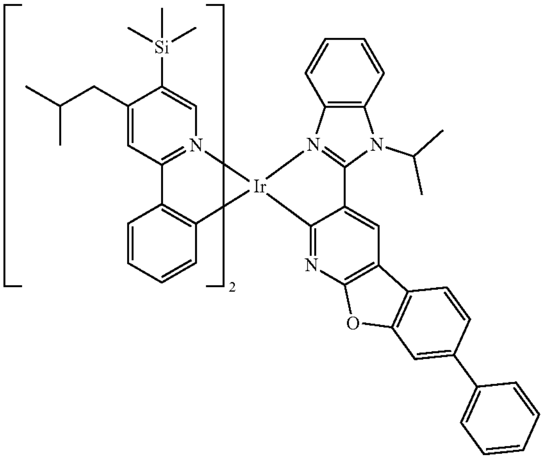
583
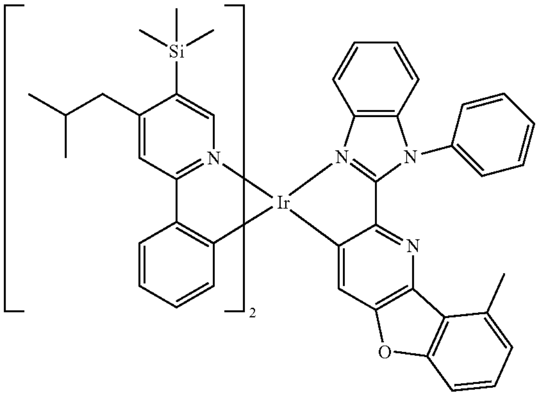
584
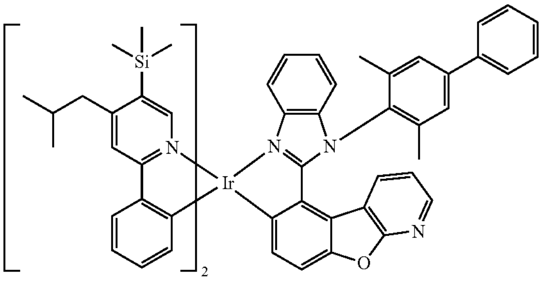
585
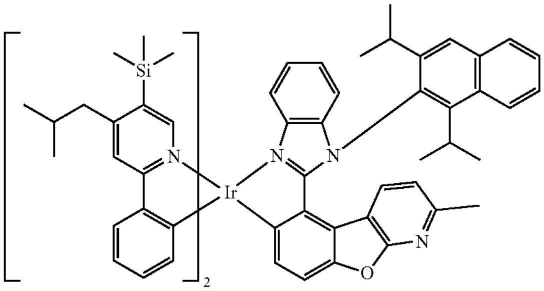
586
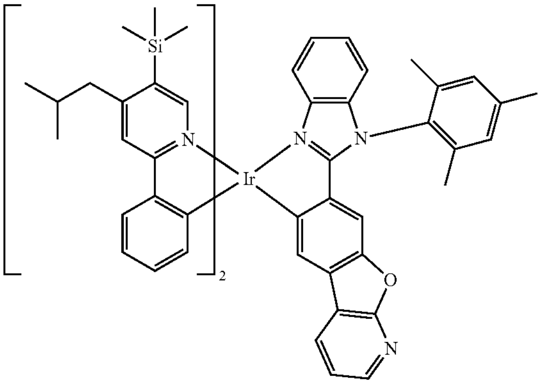

-continued
587
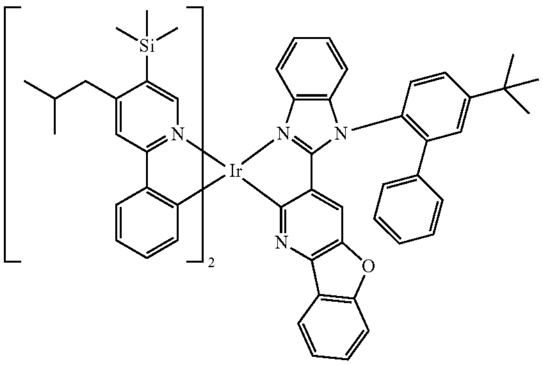
588
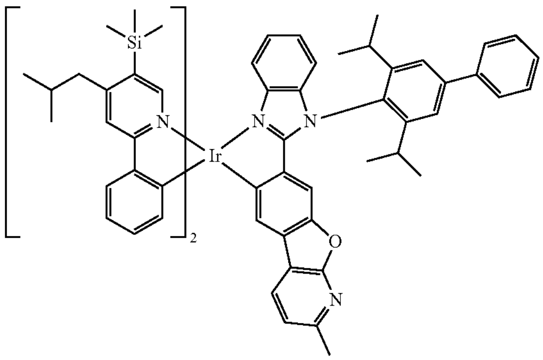
589
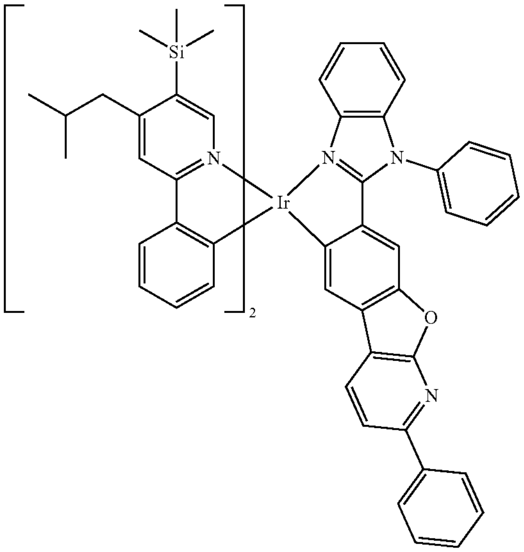
590
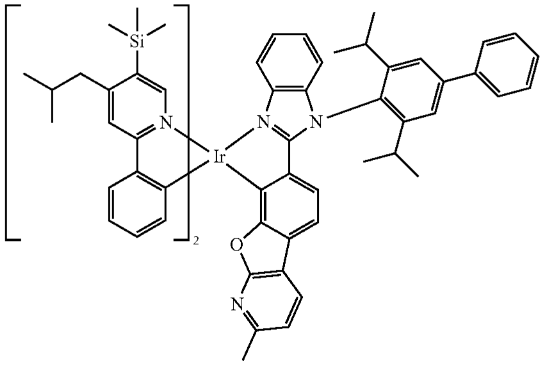
591
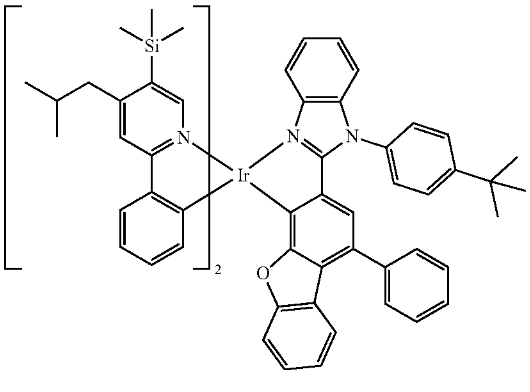
592
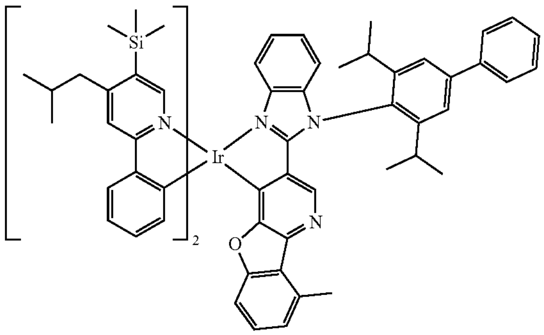

-continued
593
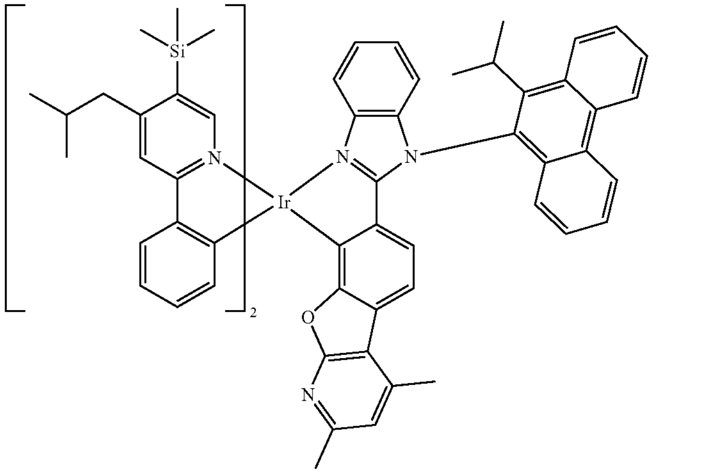
594
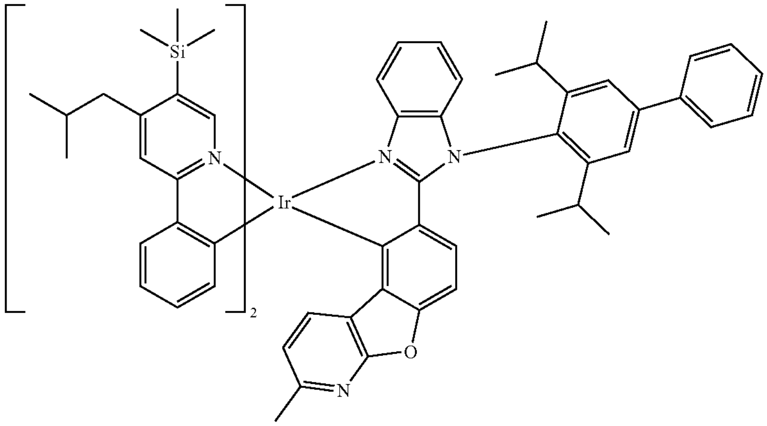
595
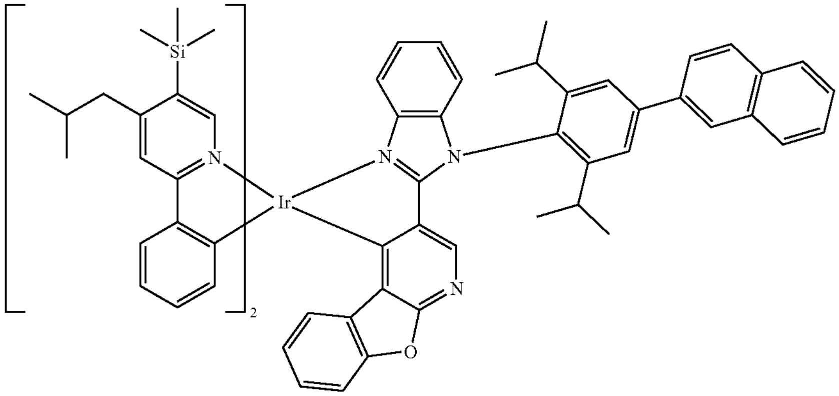

-continued
596
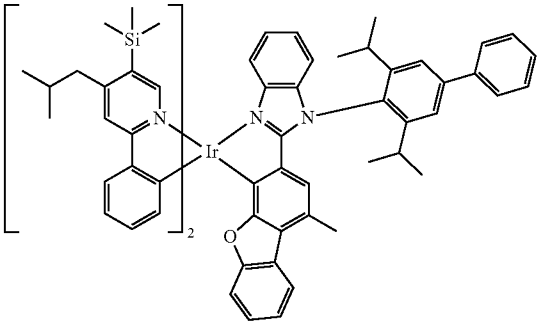
597
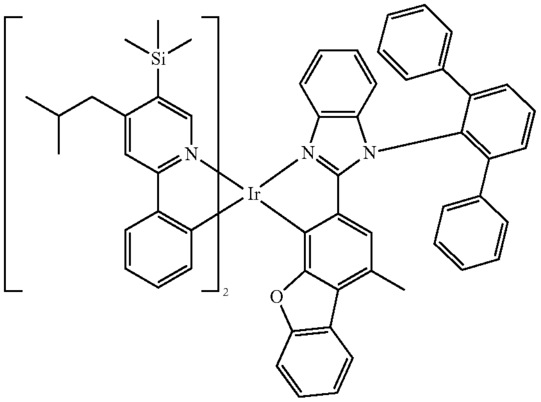
598
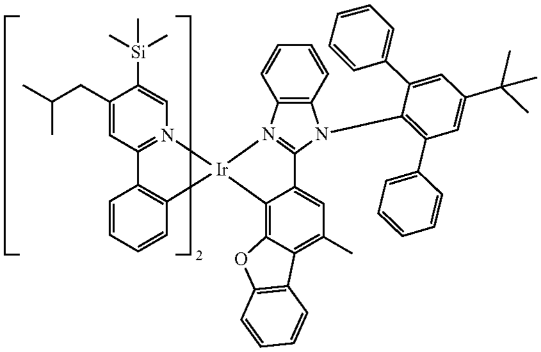
599
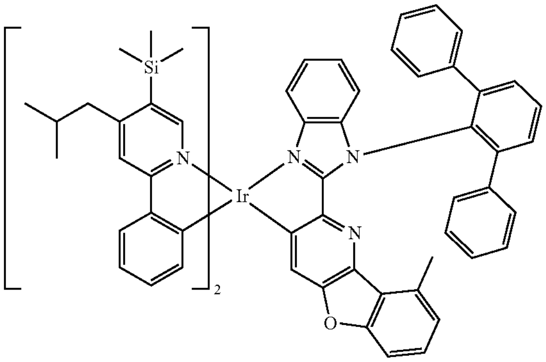
600
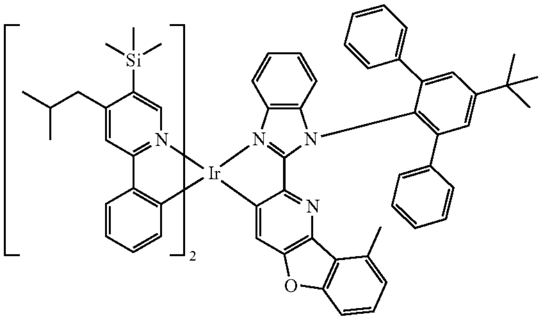
601
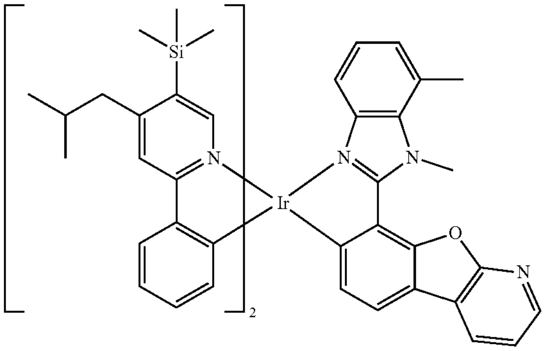
602
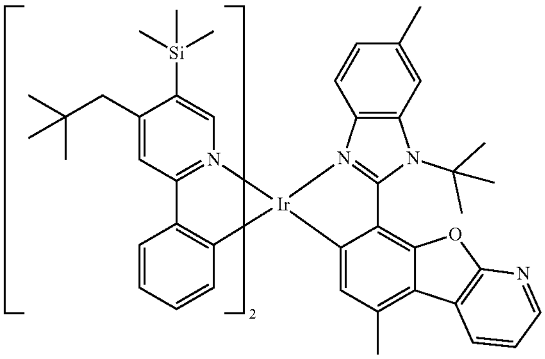
603
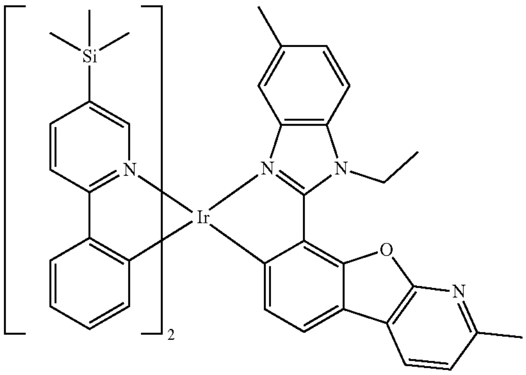

-continued
604
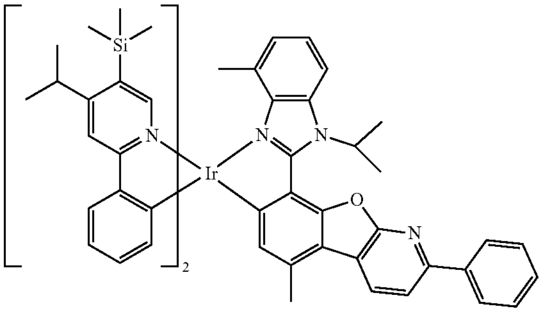
605
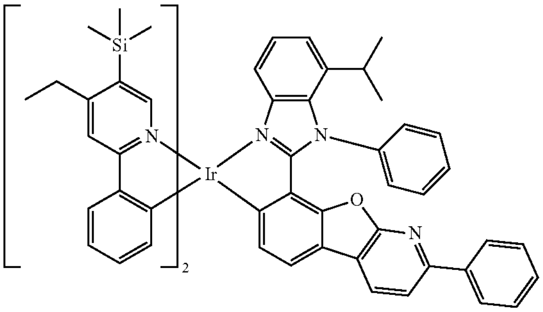
606
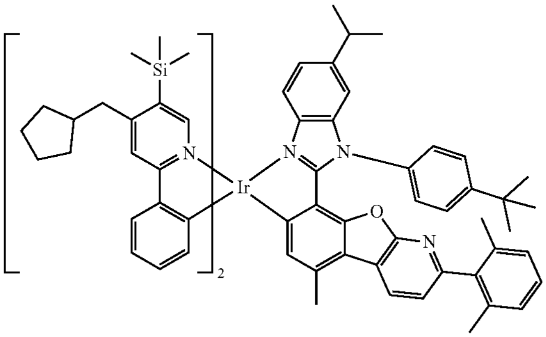
607
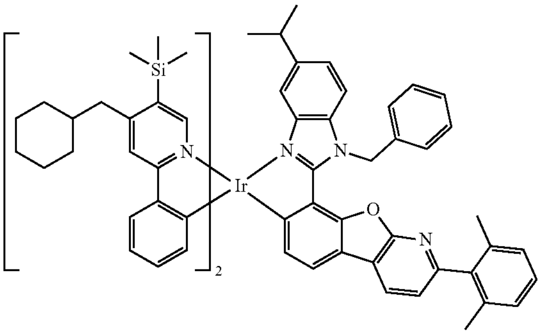
608
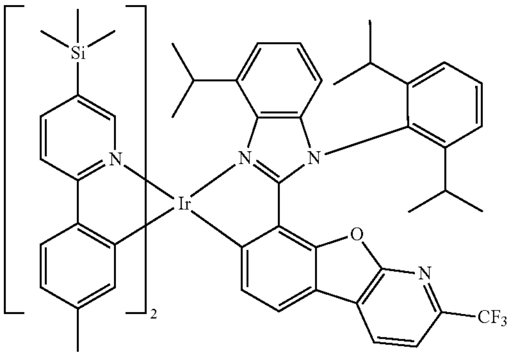
609
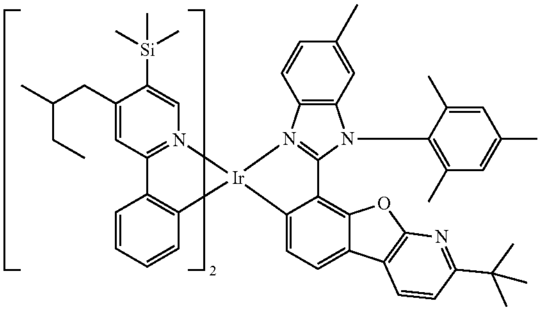
610
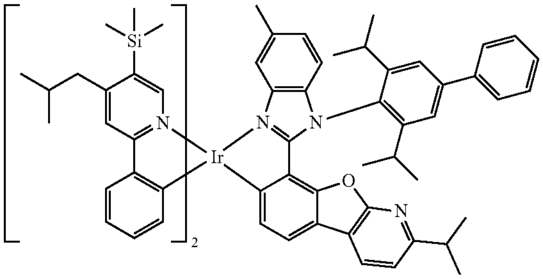
611
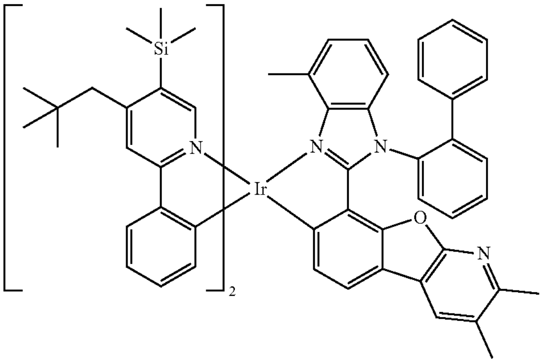

-continued
612
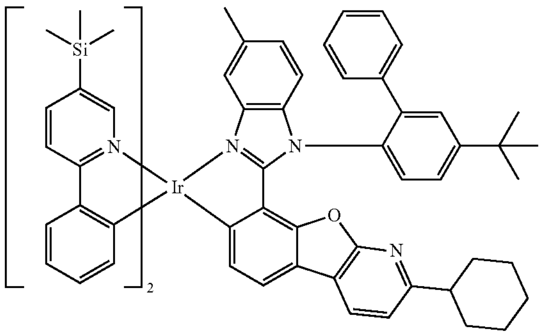
613
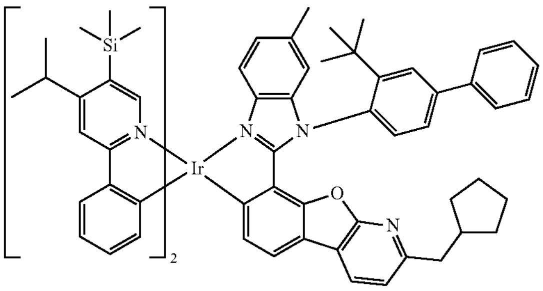
614
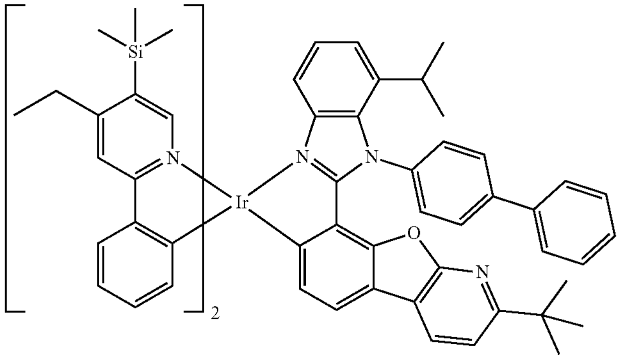
615
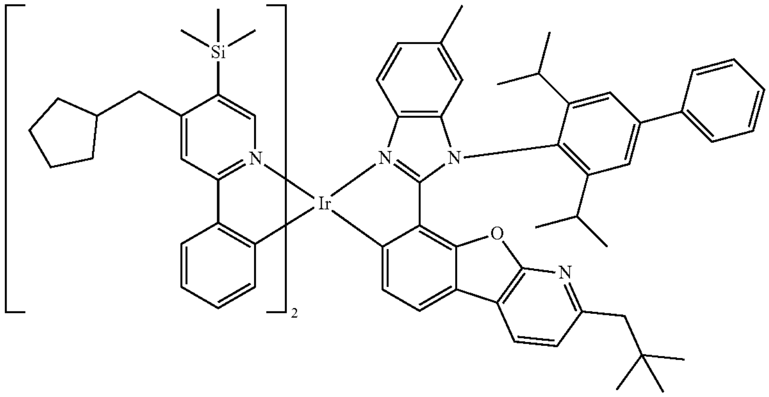
616
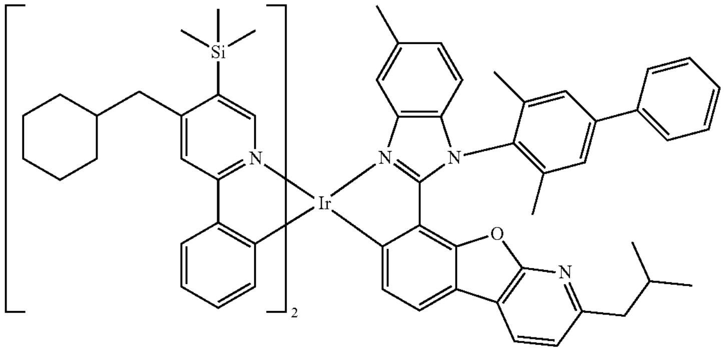

-continued
617
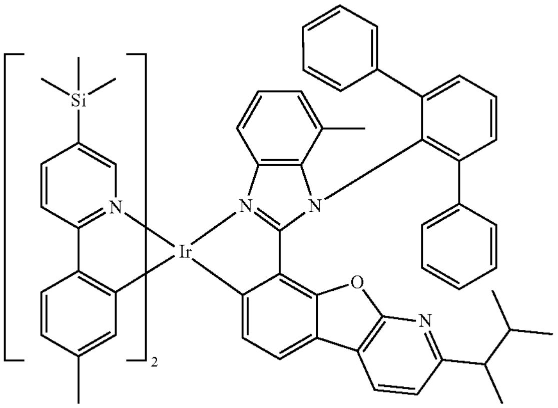
618
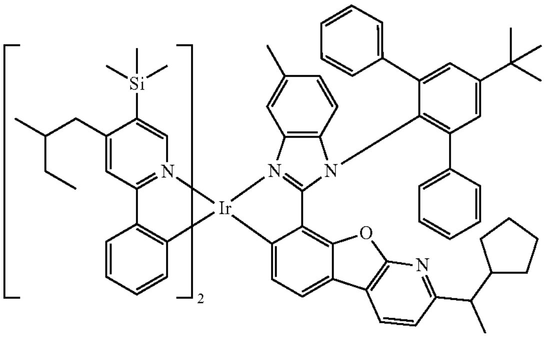
619
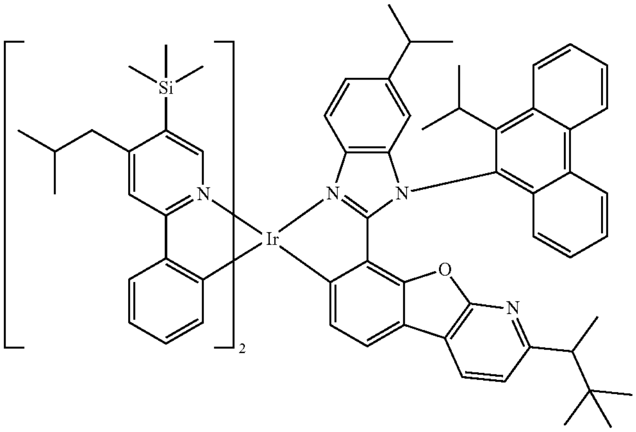
620
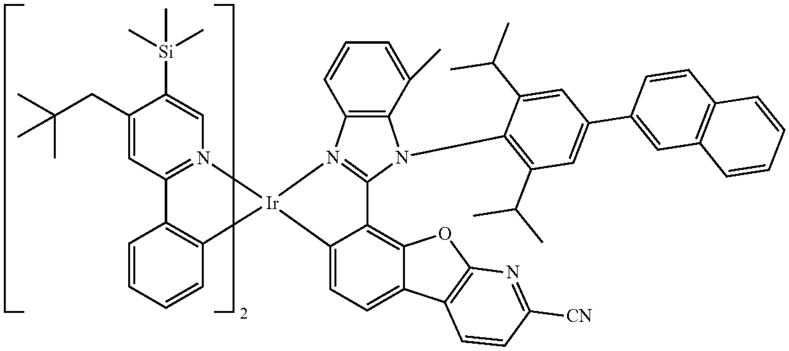
621
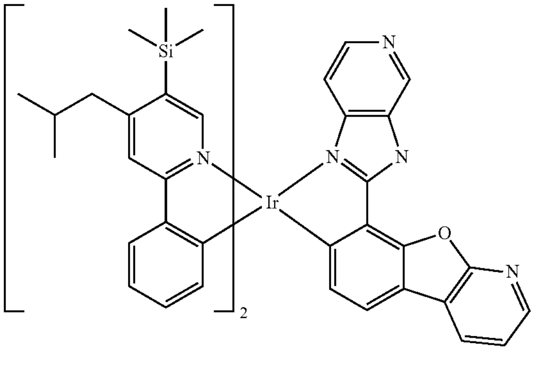
622
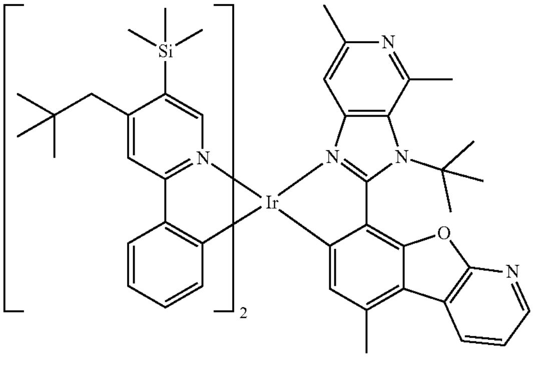

-continued
623
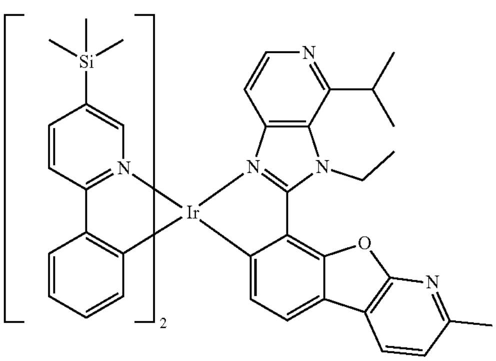
624
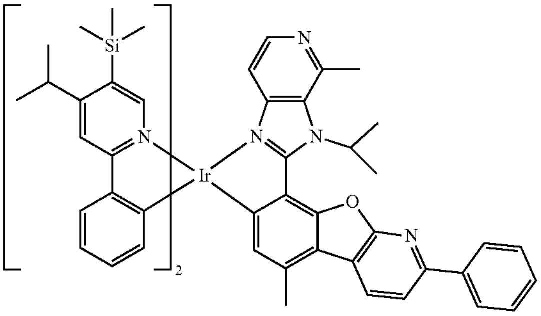
625
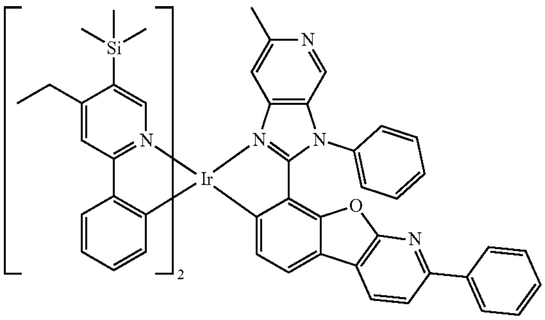
626
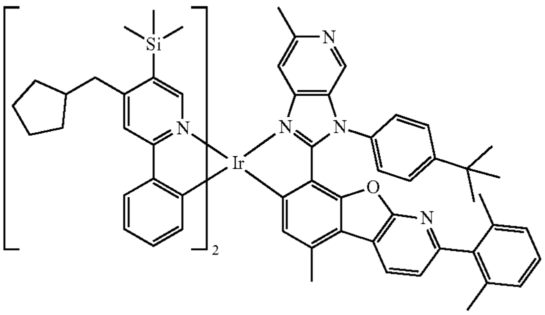
627
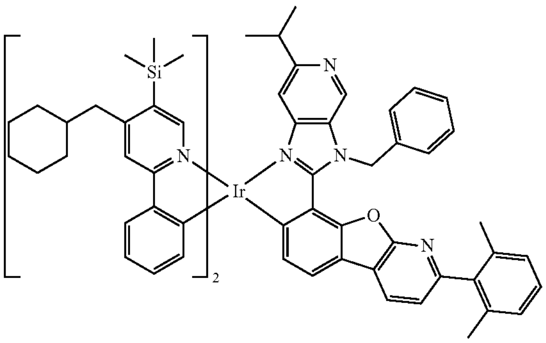
628
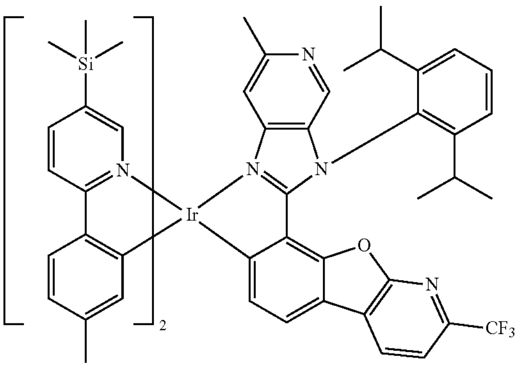
629
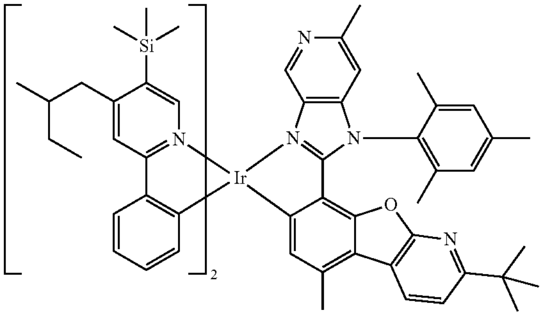
630
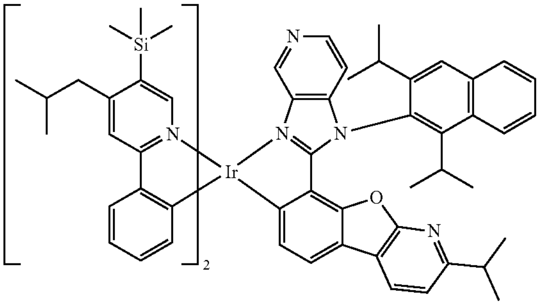

-continued
631
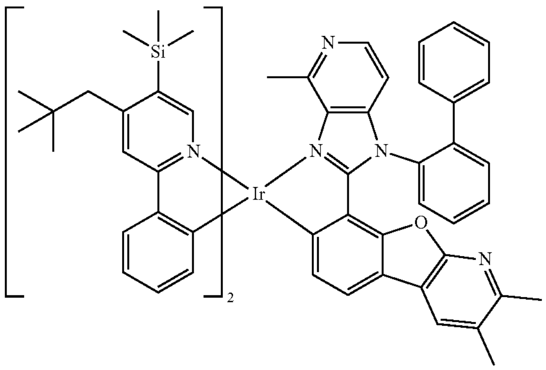
632
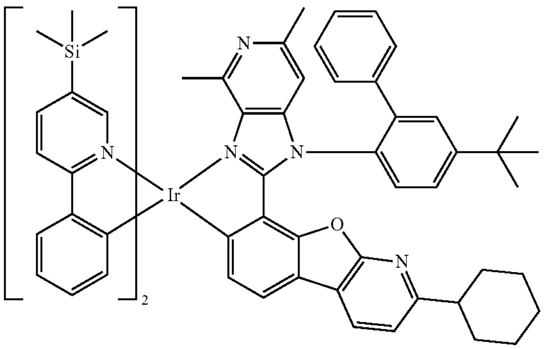
633
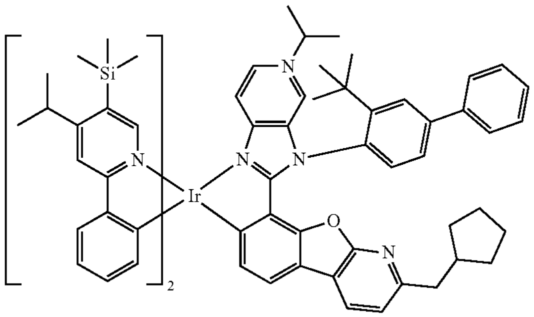
634
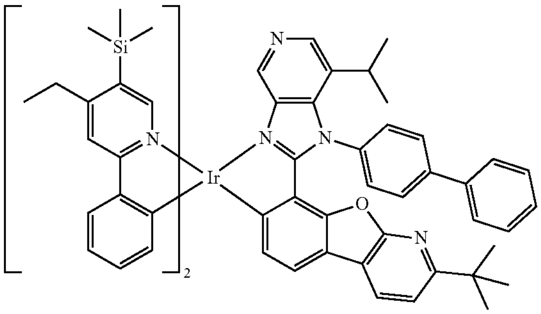
635
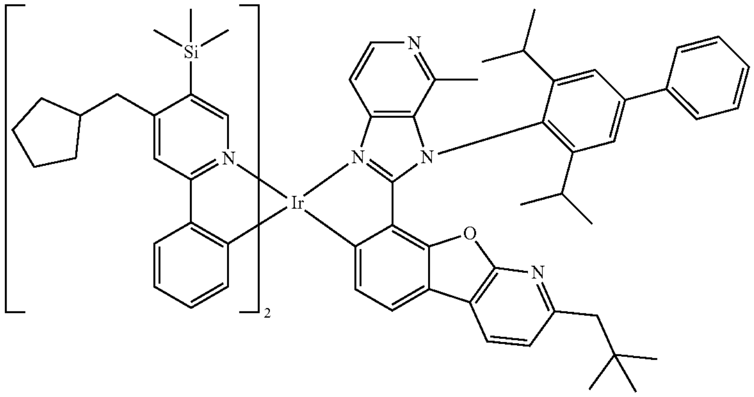
636
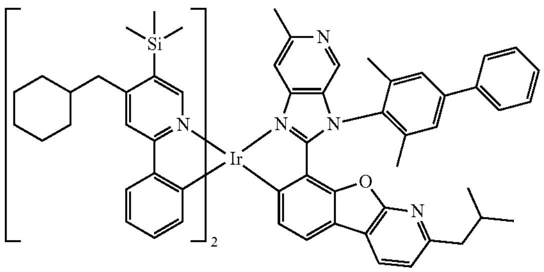
637
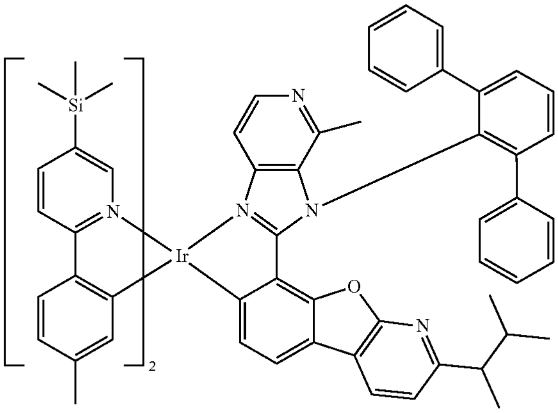

-continued
638
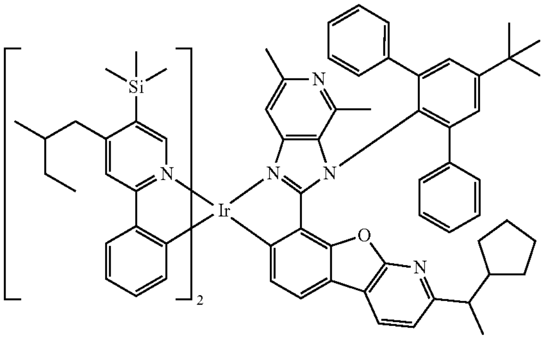
639
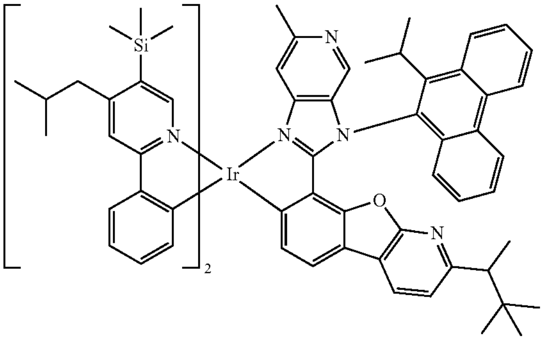
640
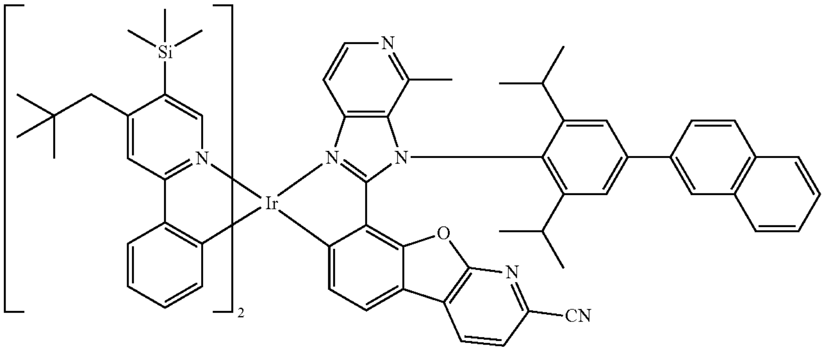
641
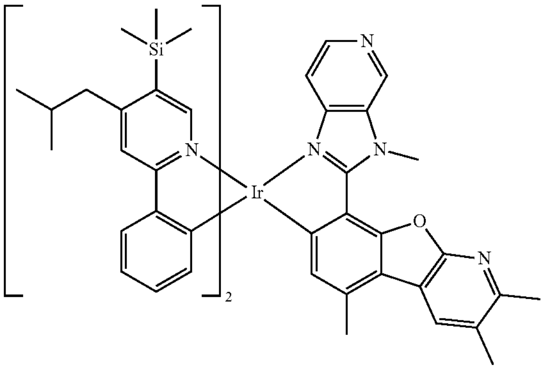
642
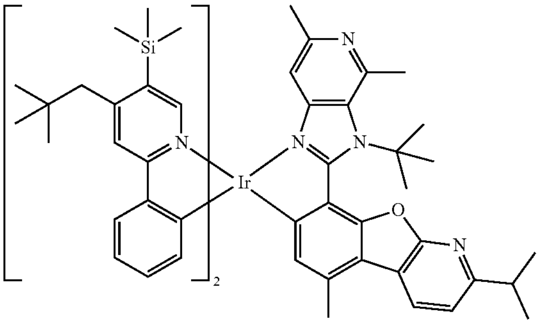
643
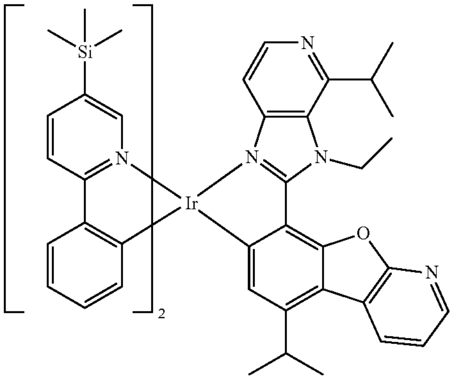
644
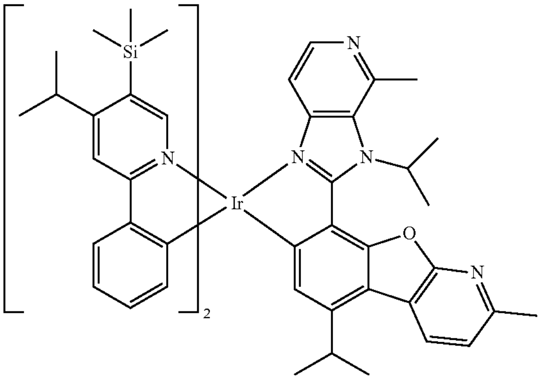

-continued
645
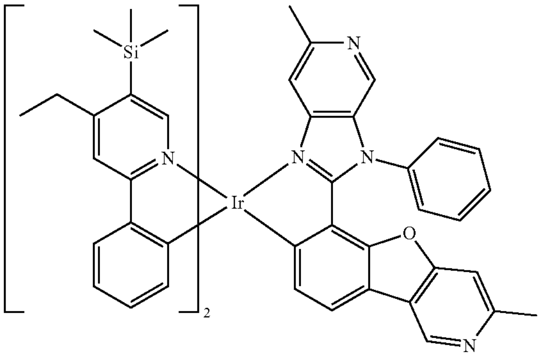
646
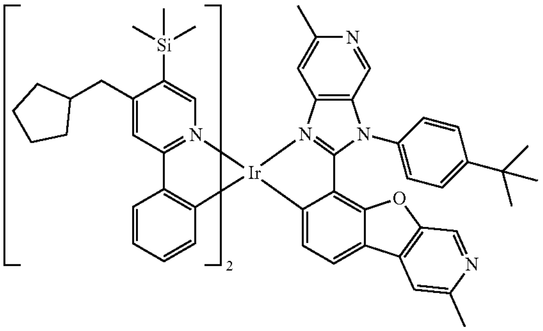
647
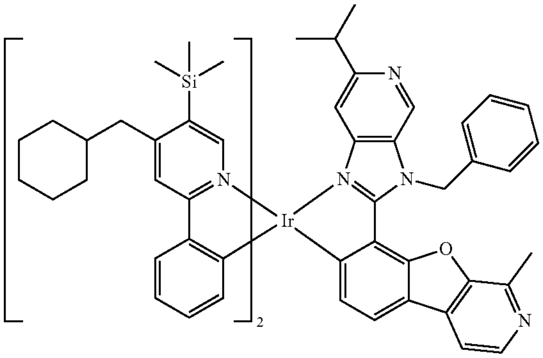
648
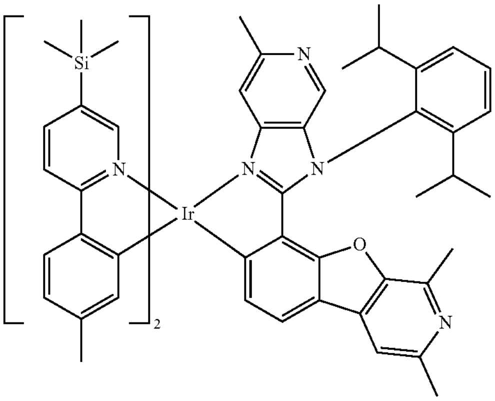
649
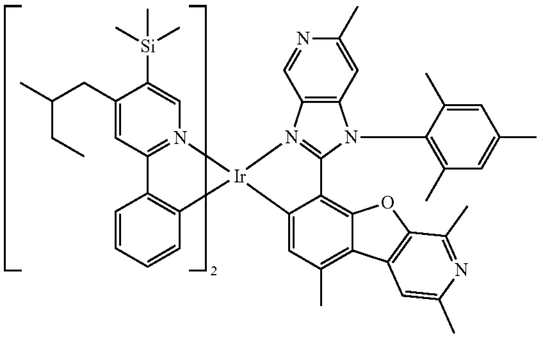
650
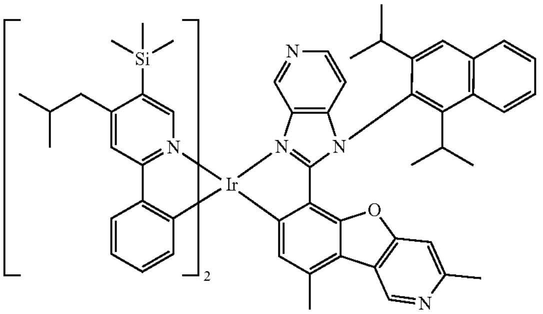
651
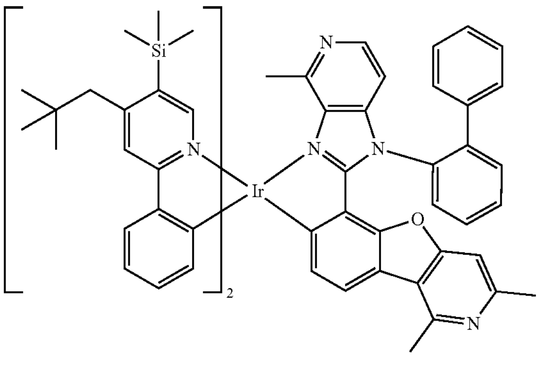
652
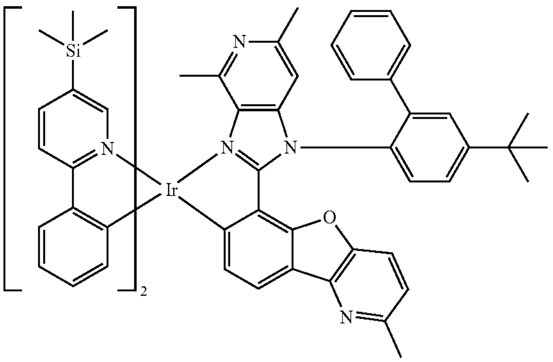

-continued
653
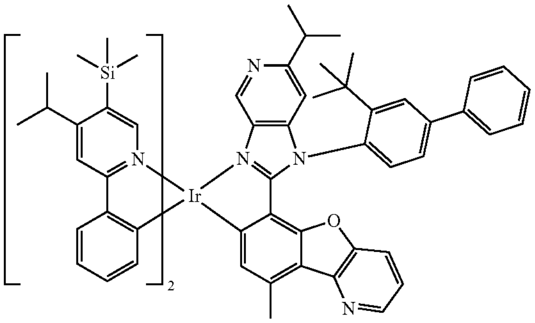
654
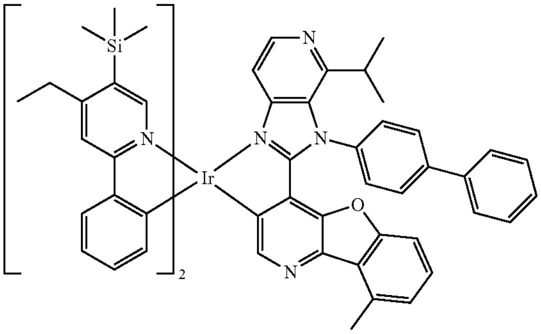
655
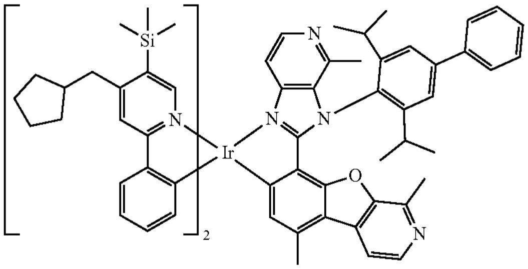
656
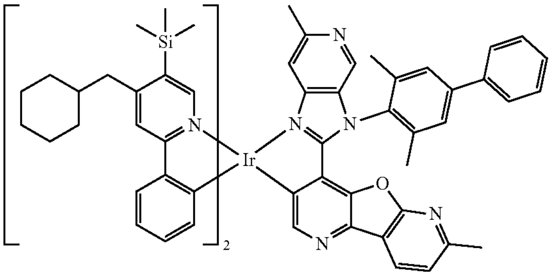
657
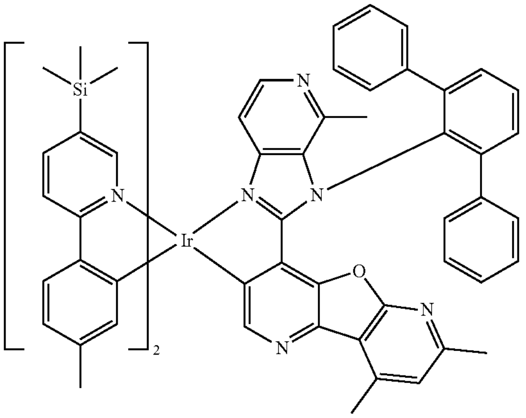
658
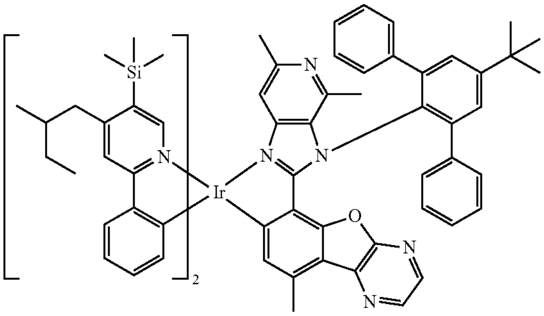
659
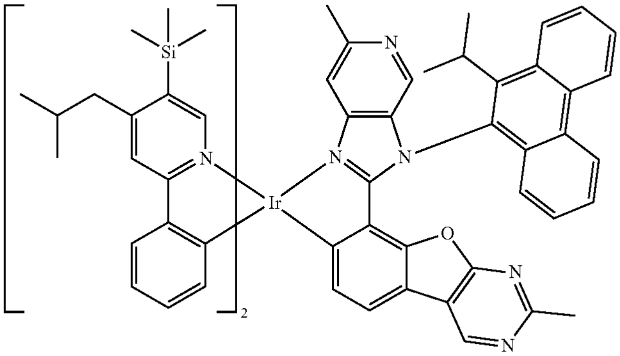

-continued
660
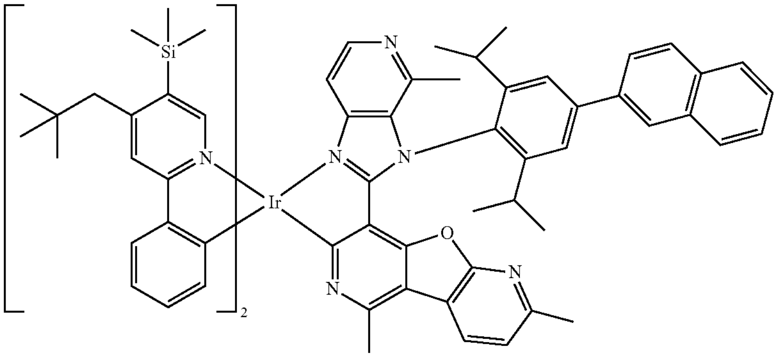
661
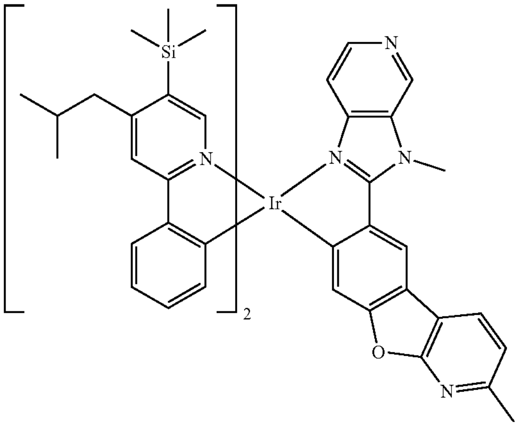
662
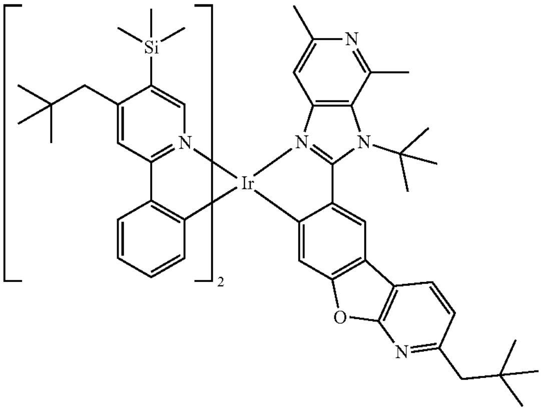
663
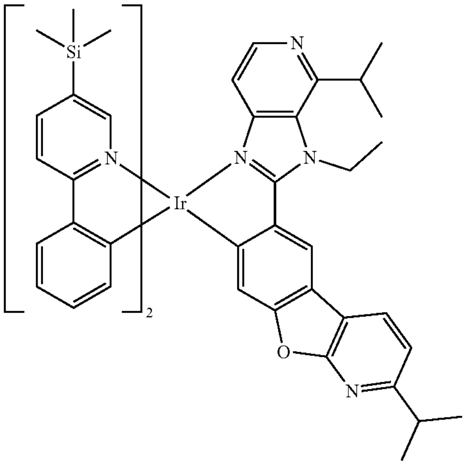
664
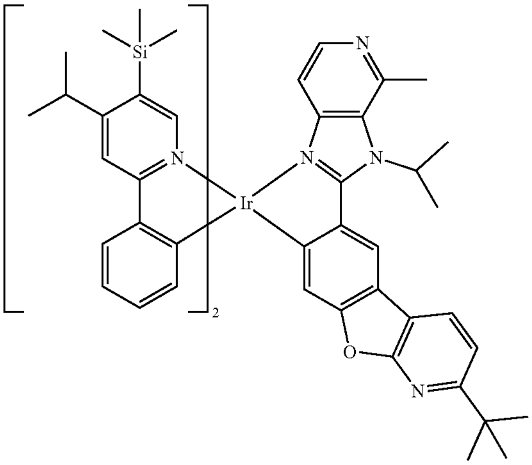

-continued
665
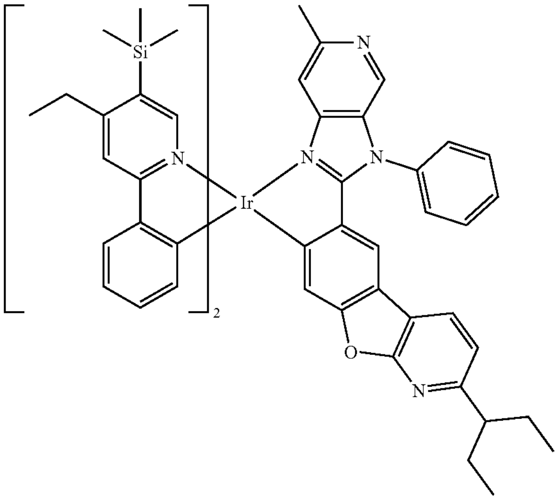
666
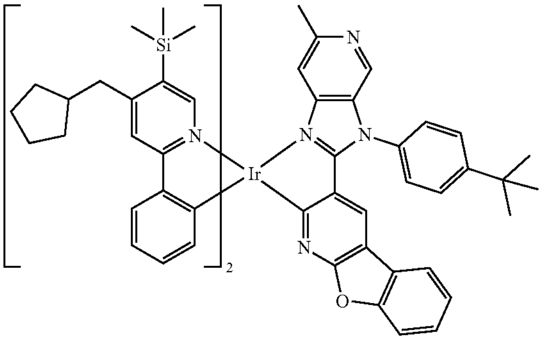
667
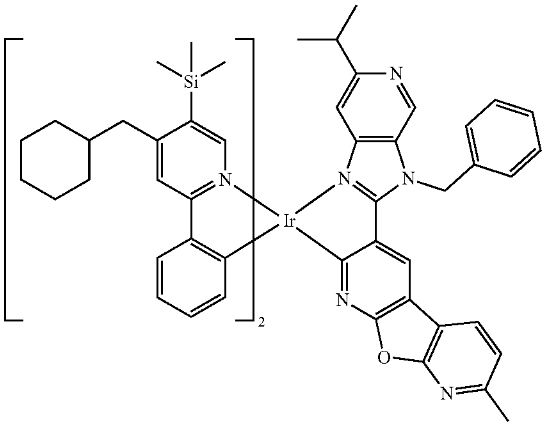
668
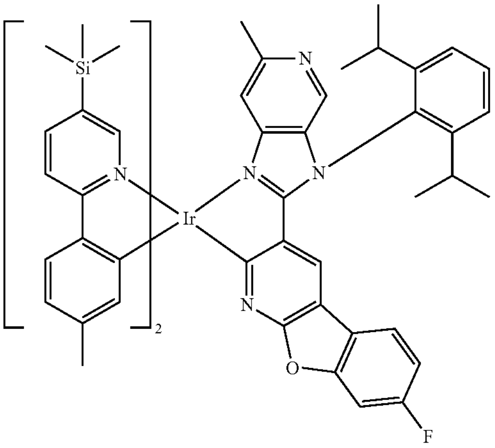
669
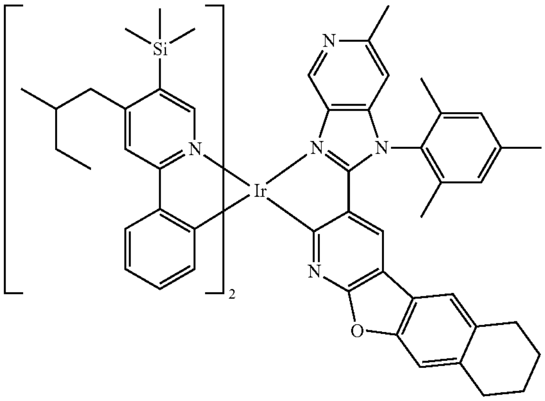
670
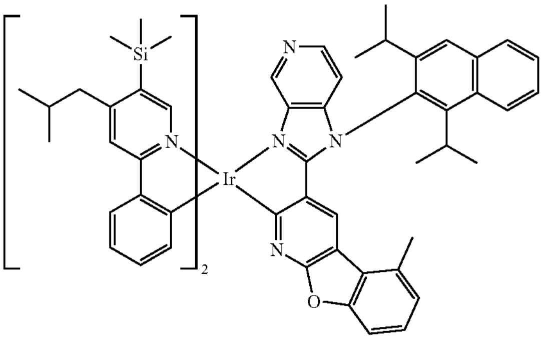

-continued
671
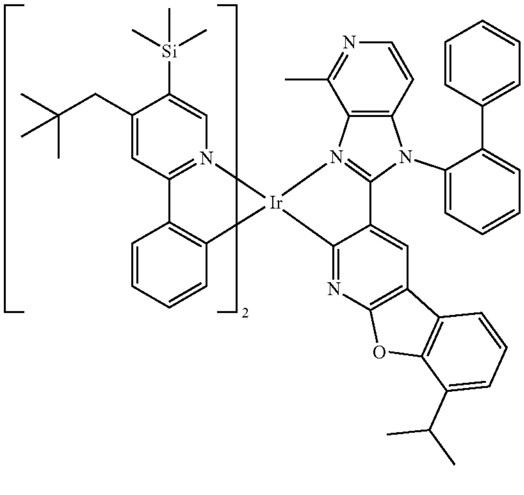
672
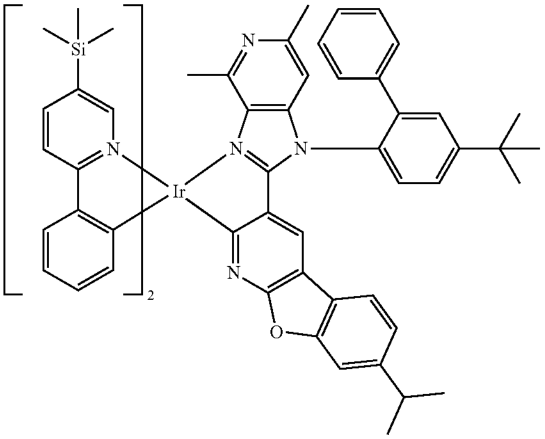
673
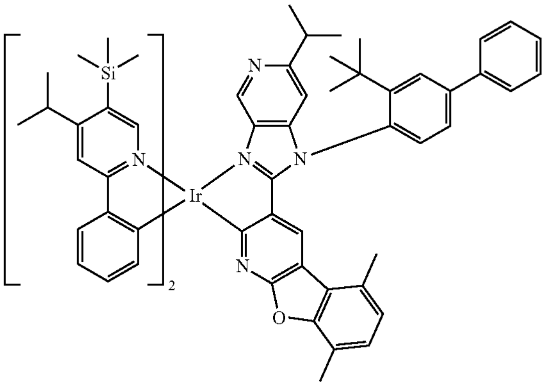
674
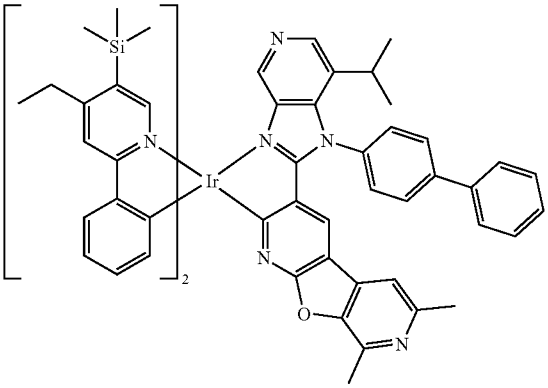
675
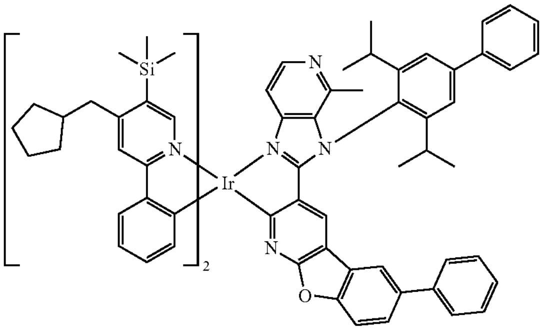
676
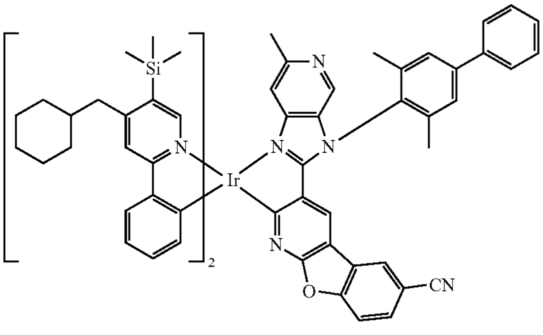

-continued
677
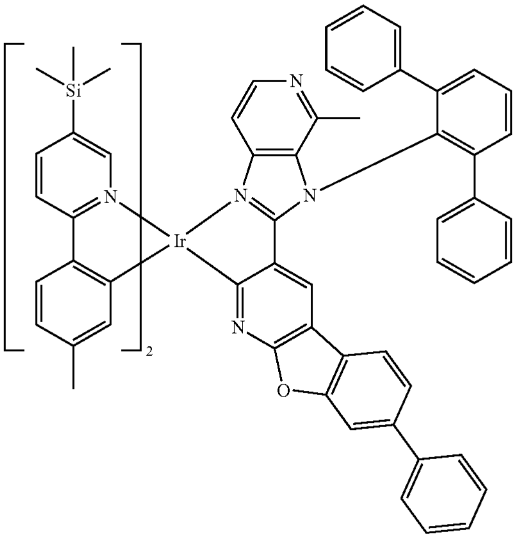
678
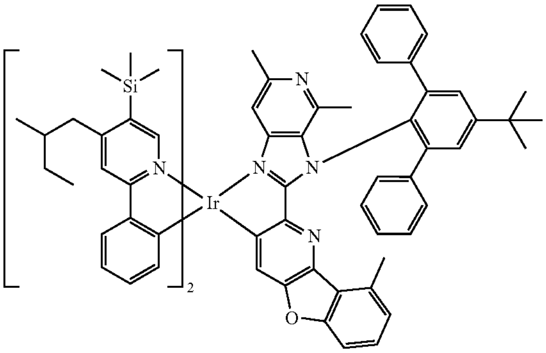
679
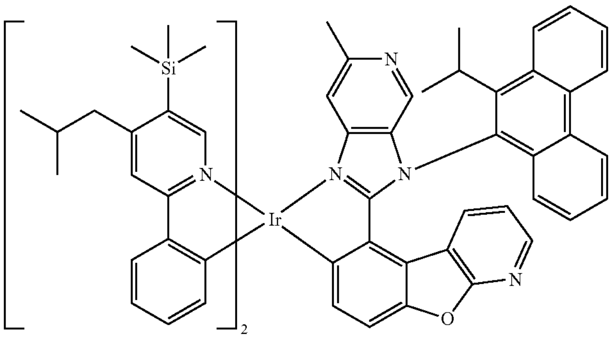
680
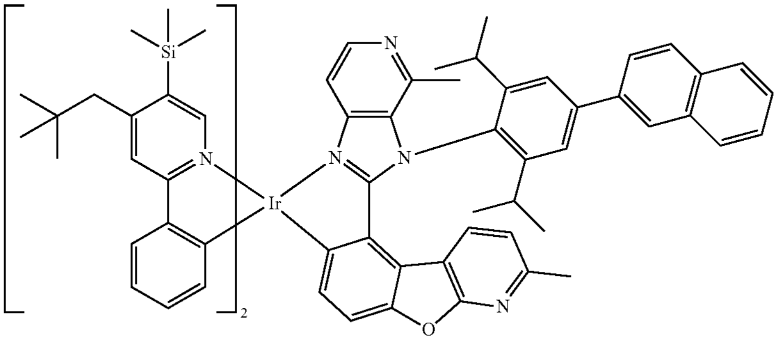

-continued
681
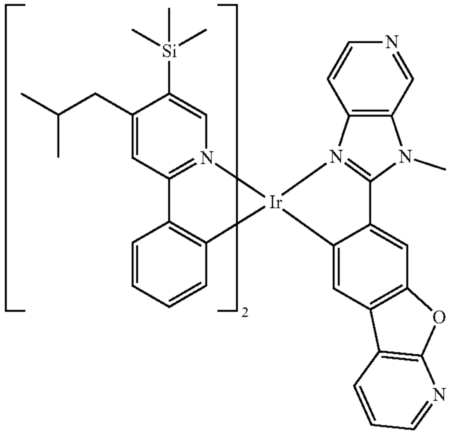
682
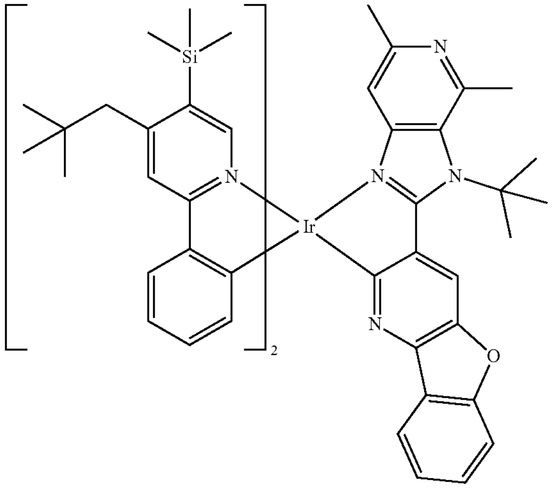
683
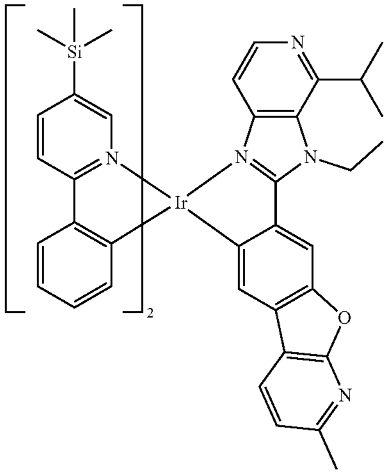
684
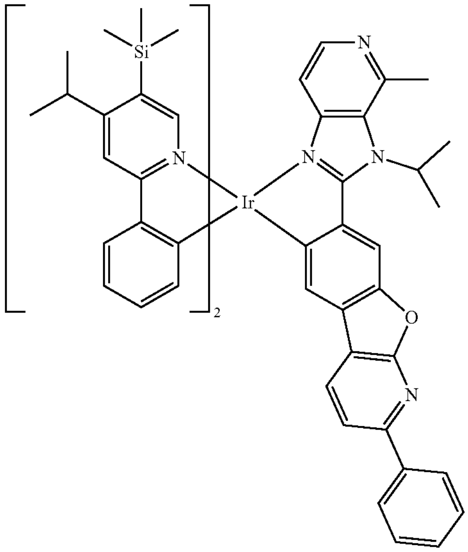
685
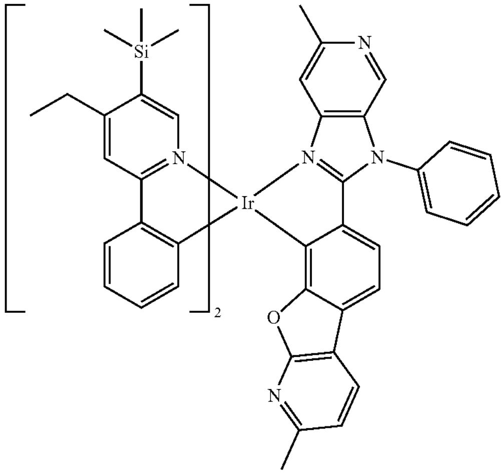
686
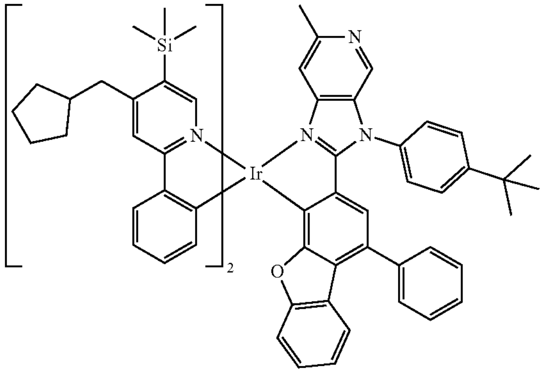

-continued
687
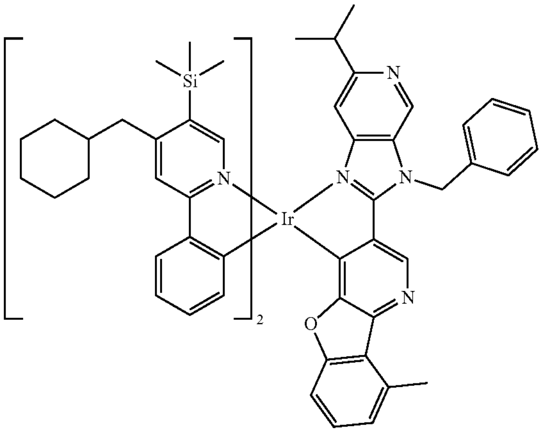
688
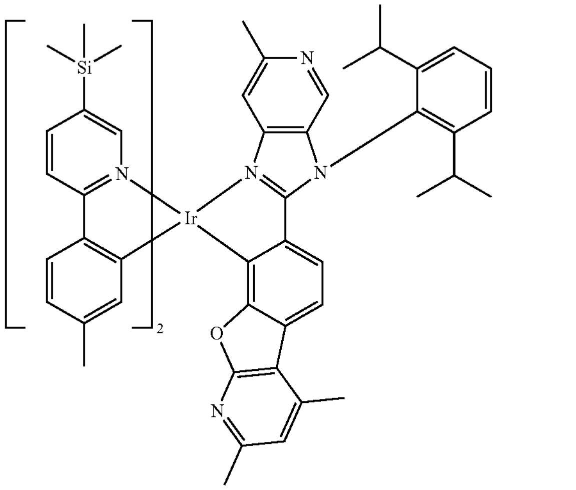
689
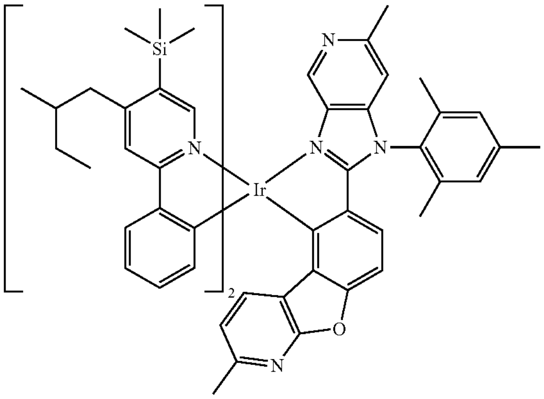
690
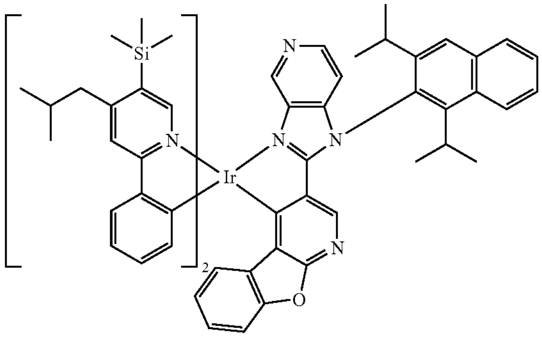
691
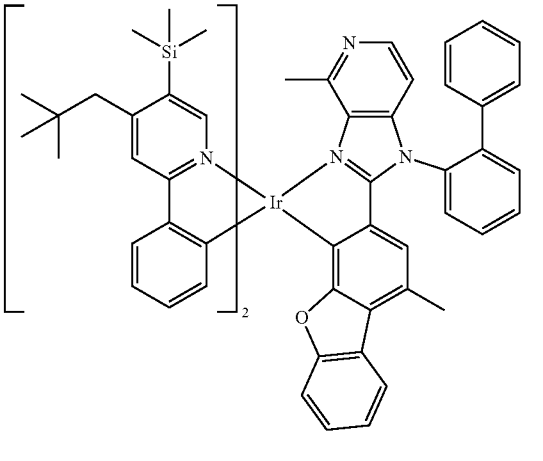
692
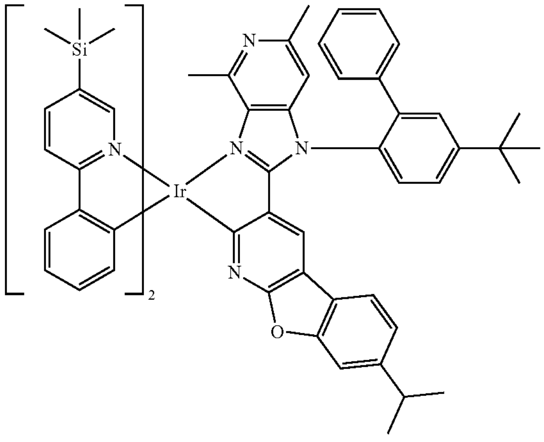

-continued
693
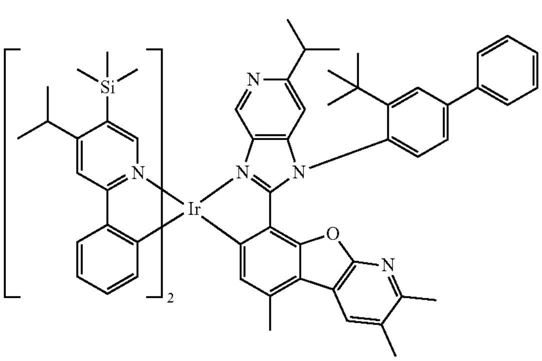
694
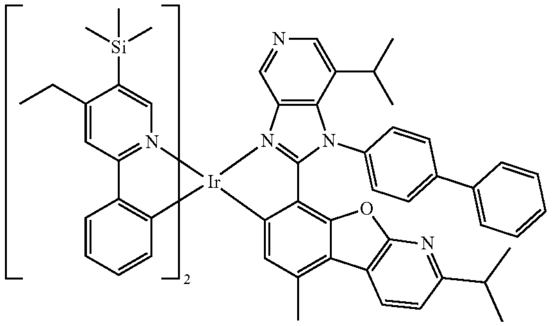
695
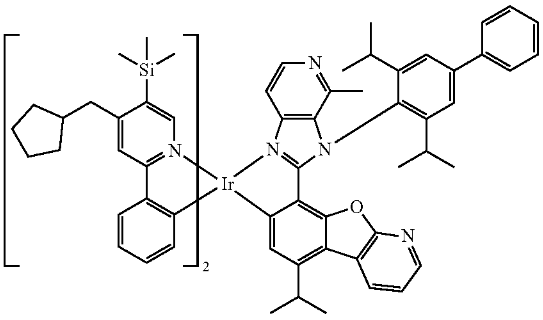
696
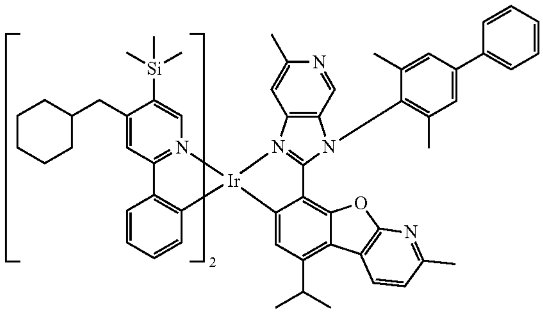
697
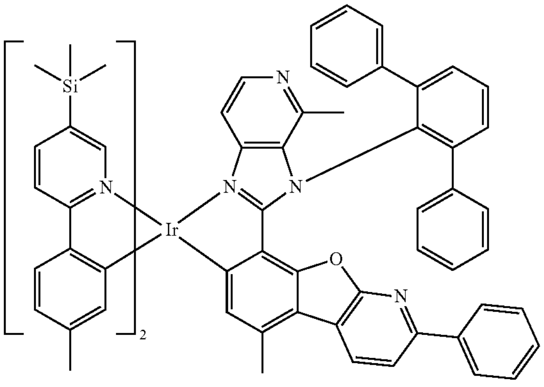
698
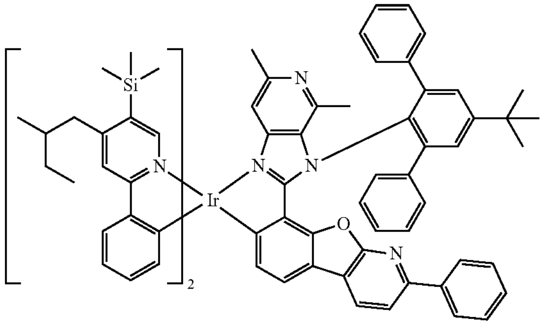
699
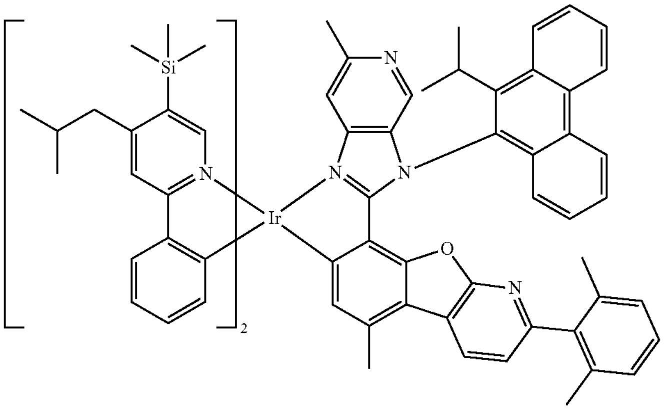

-continued
700
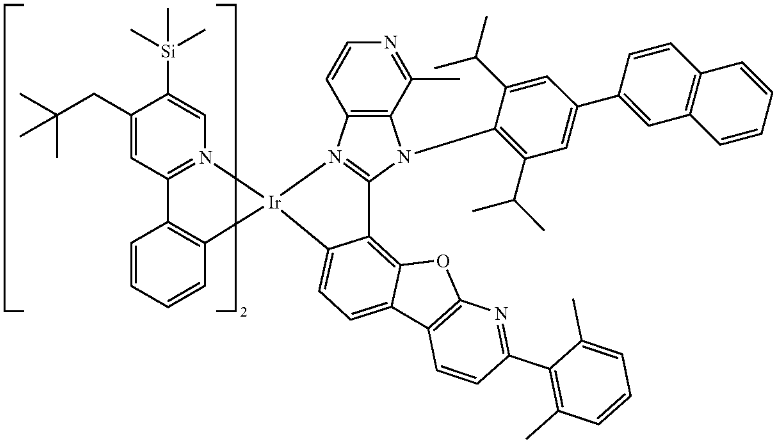
701
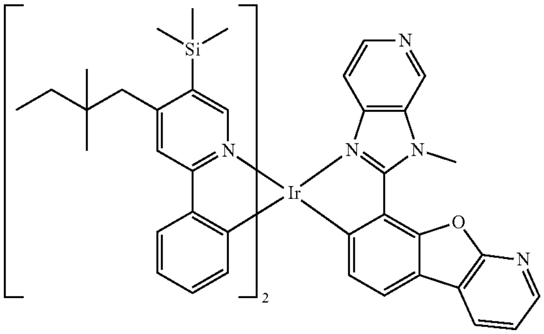
702
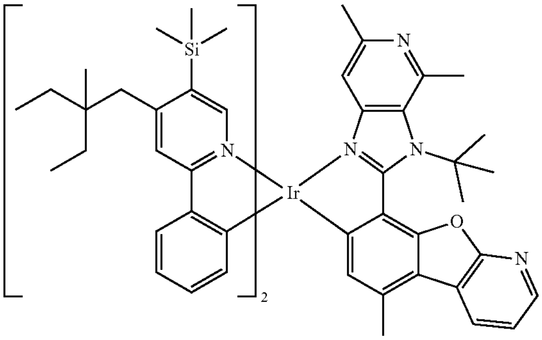
703
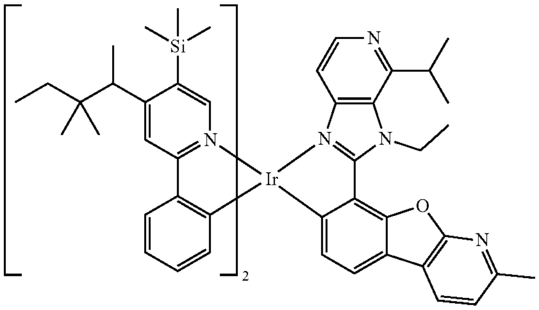
704
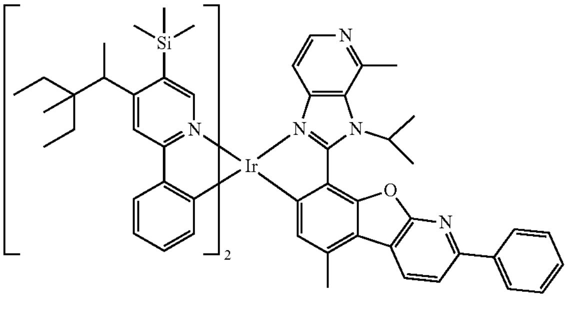
705
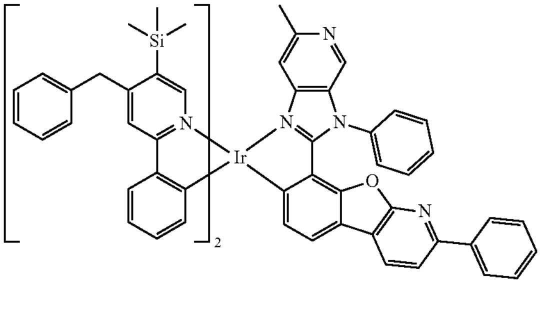
706
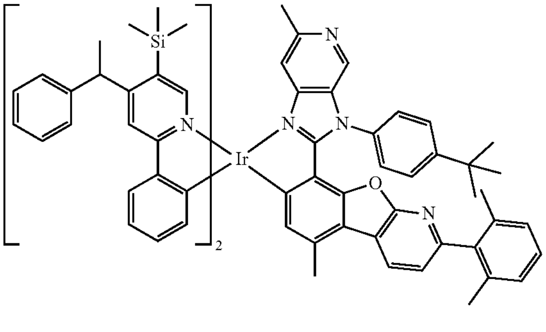

-continued
707
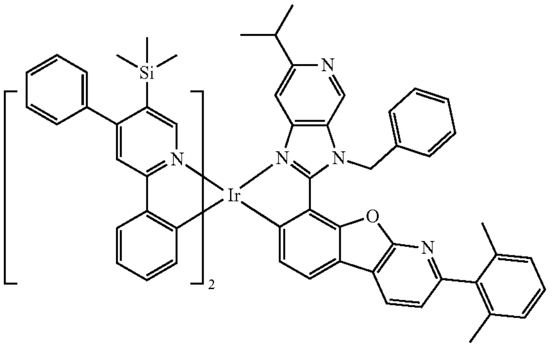
708
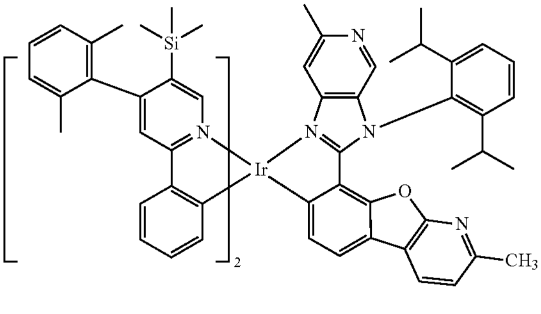
709
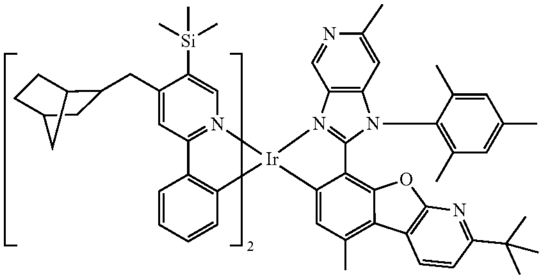
710
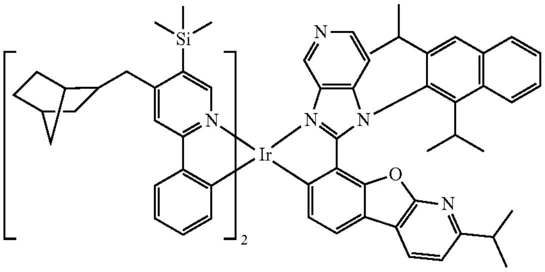
711
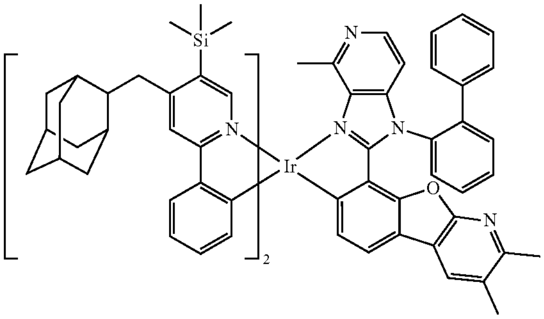
712
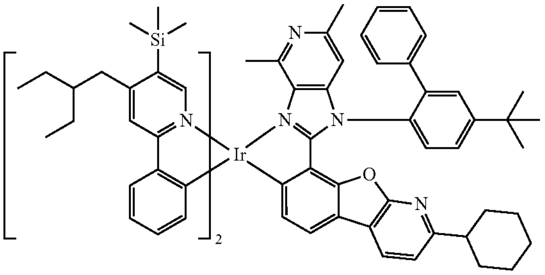
713
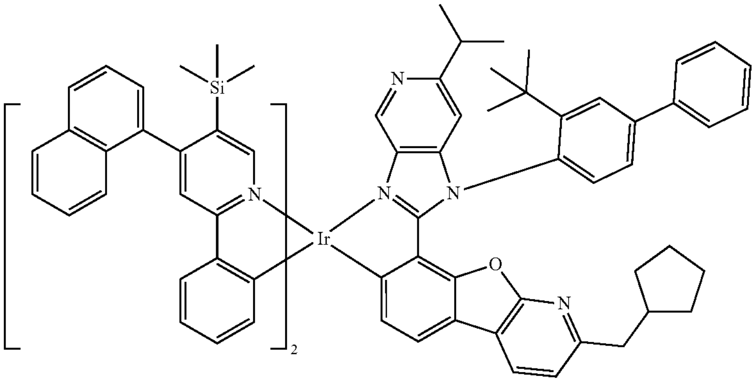

-continued
714
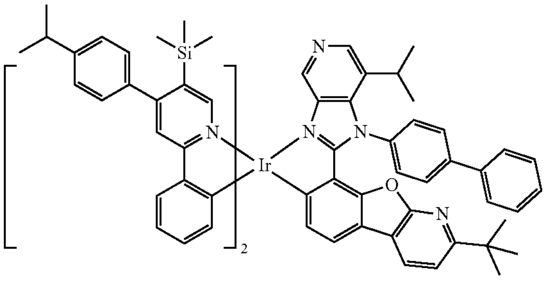
715
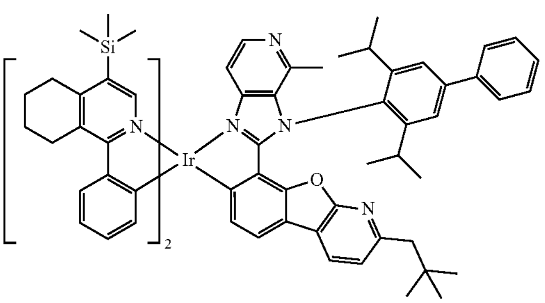
716
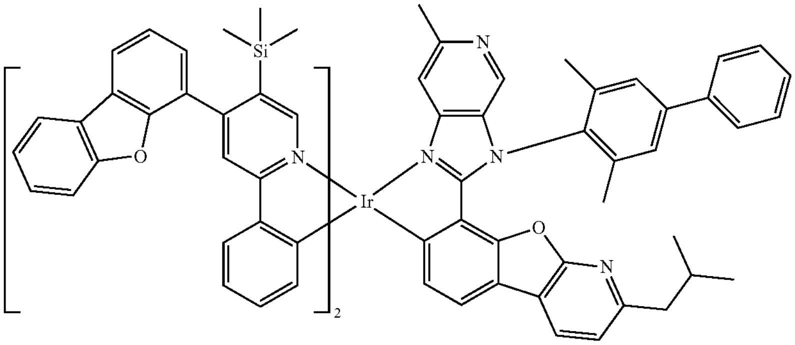
717
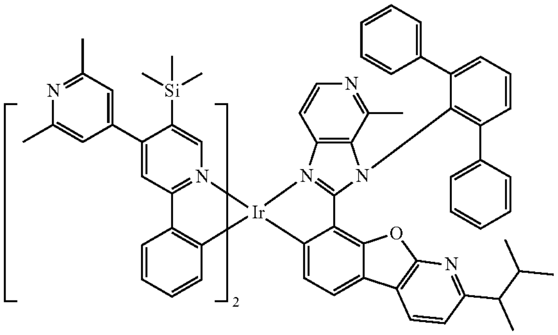
718
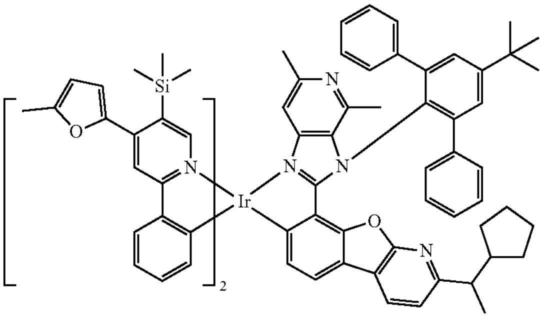
719
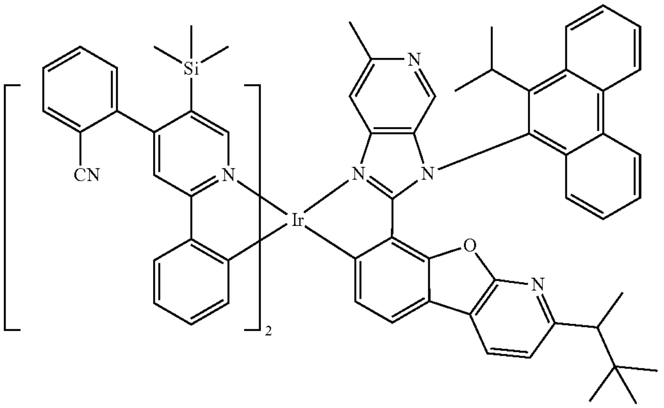

-continued
720
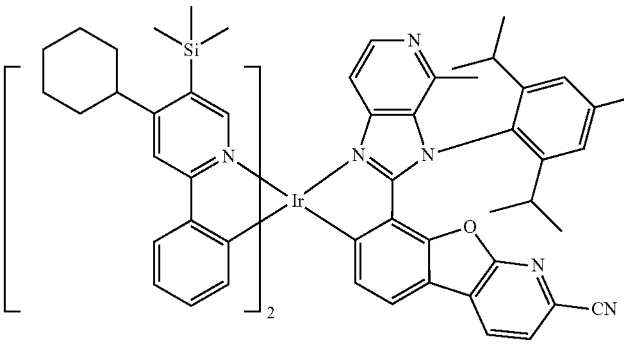
721
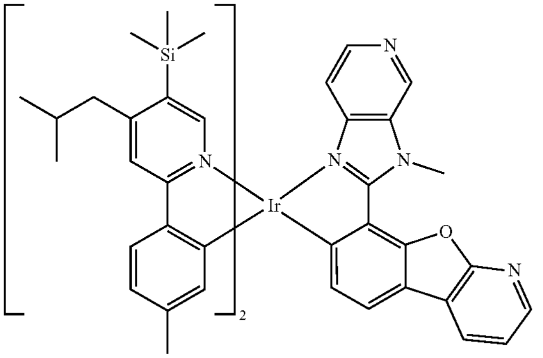
722
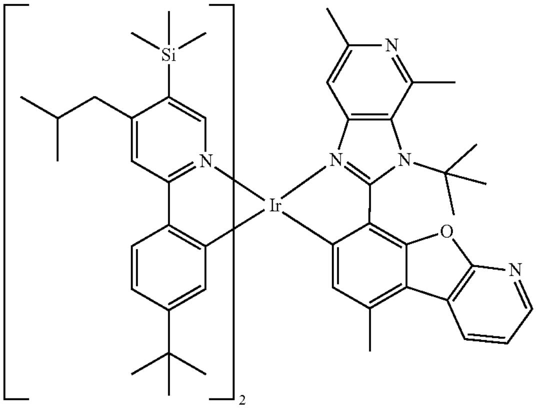
723
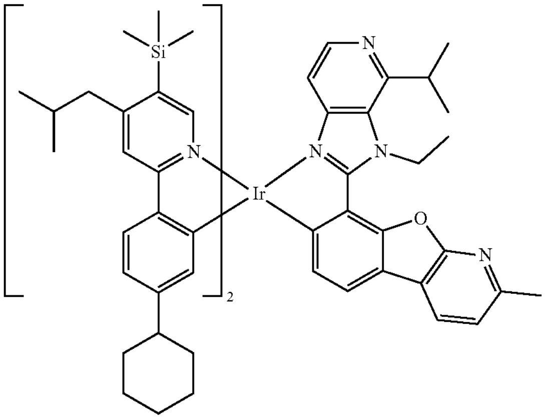
724
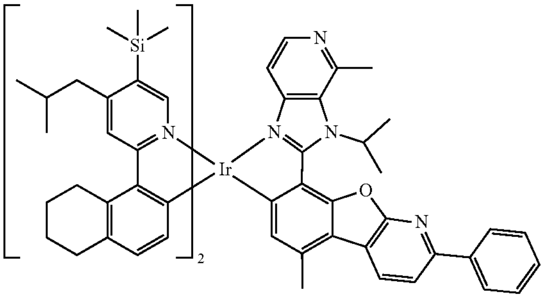
725
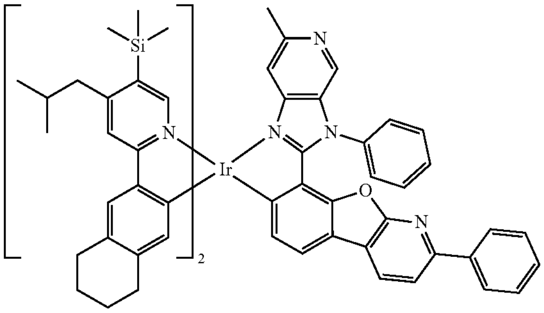
726
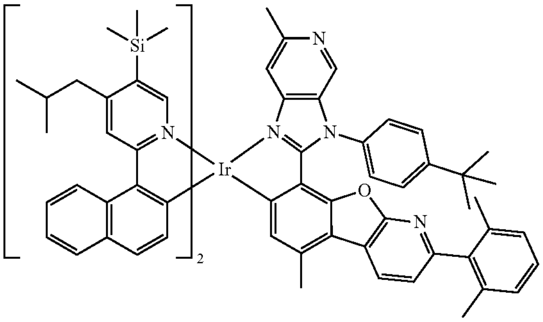

-continued
727
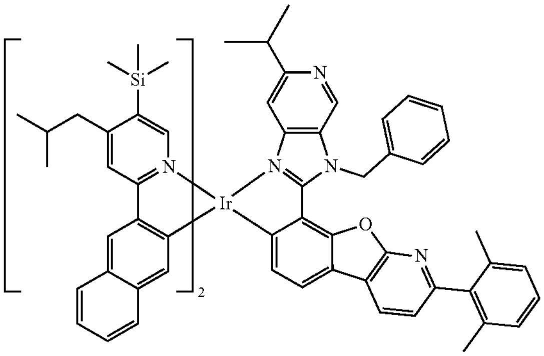
728
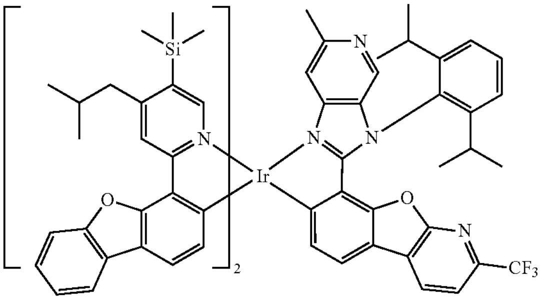
729
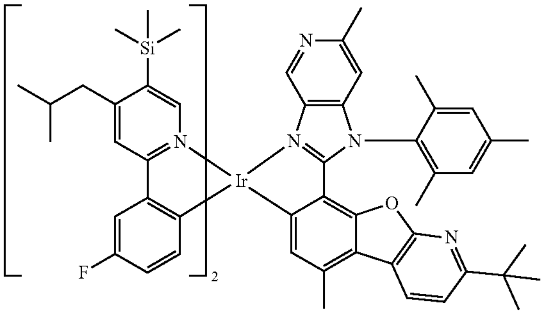
730
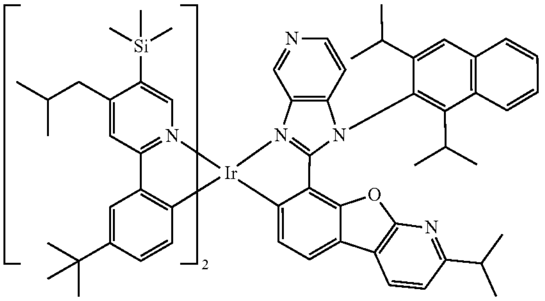
731
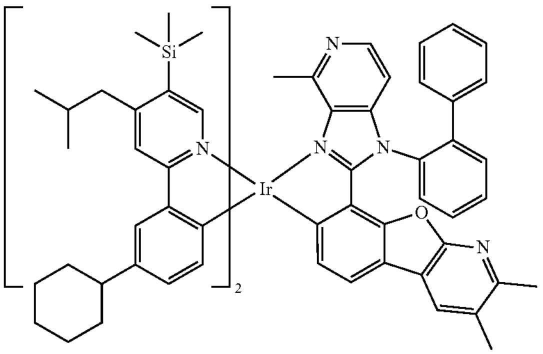
732
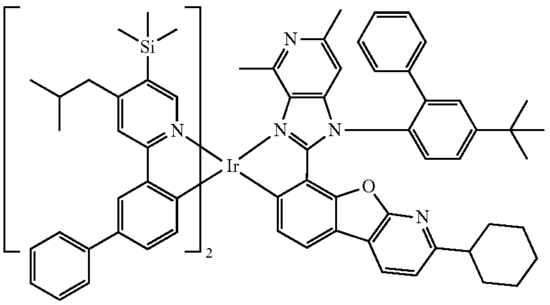
733
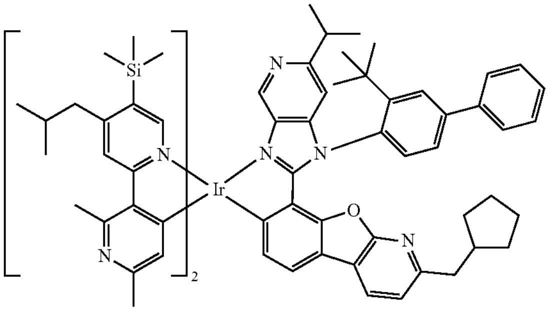
734
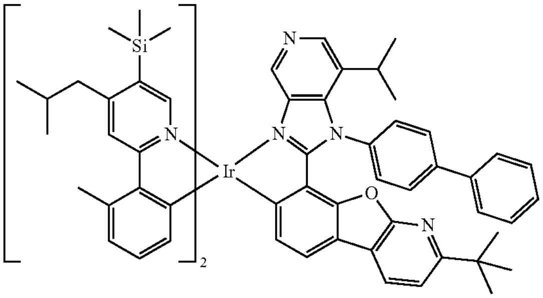

-continued
735
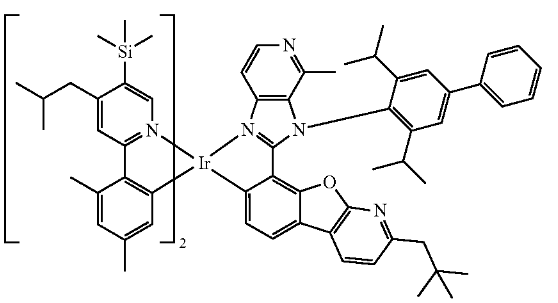
736
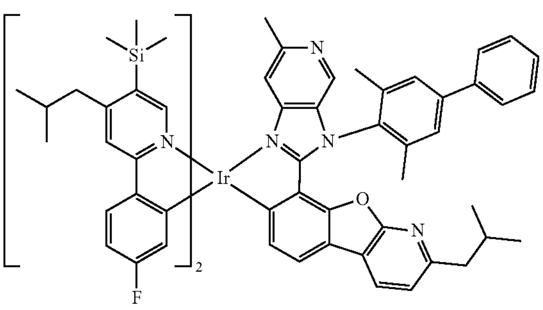
737
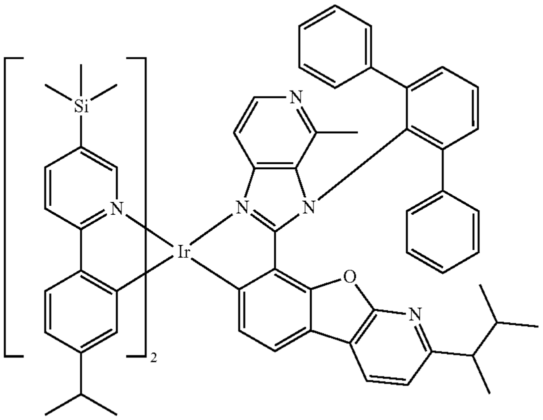
738
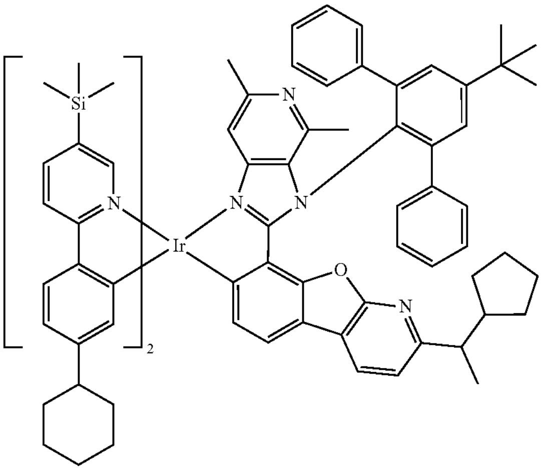
739
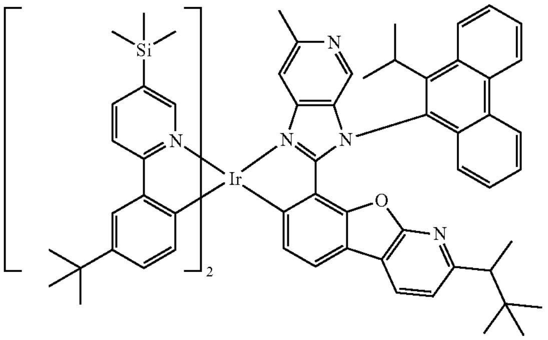
740
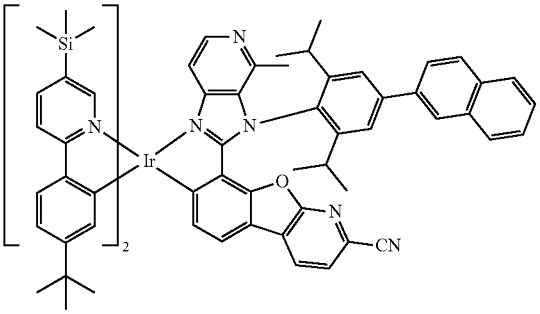
741
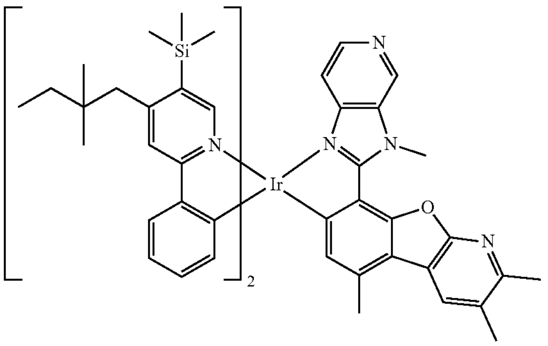
742
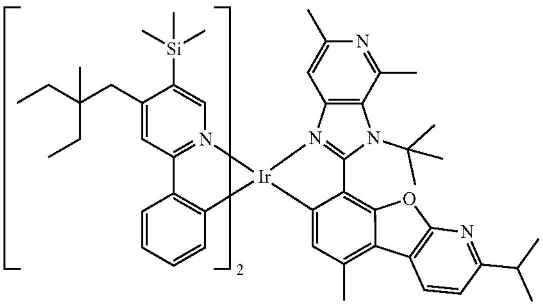

-continued
743
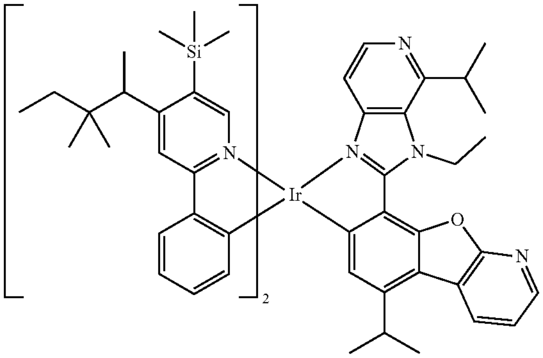
744
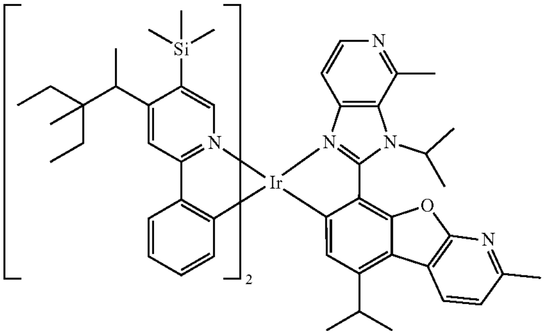
745
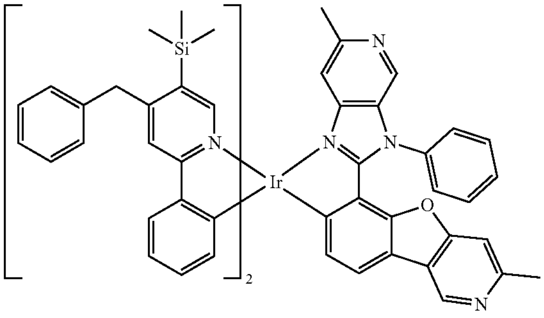
746
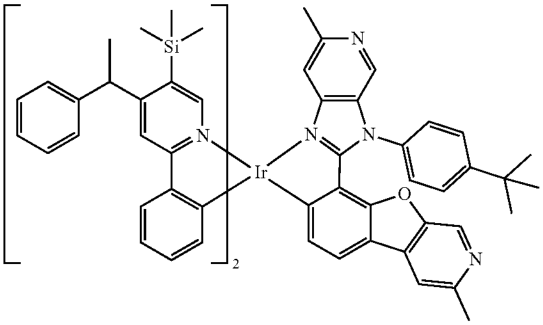
747
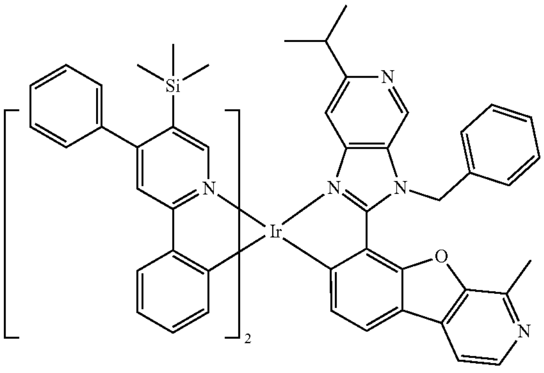
748
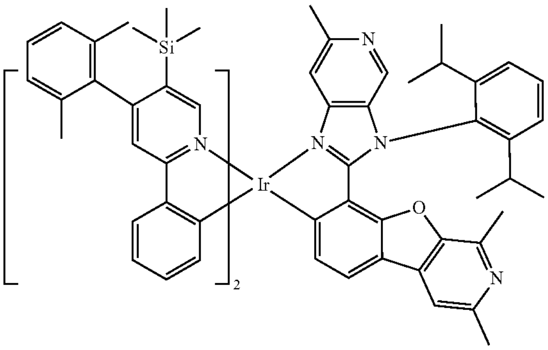
749
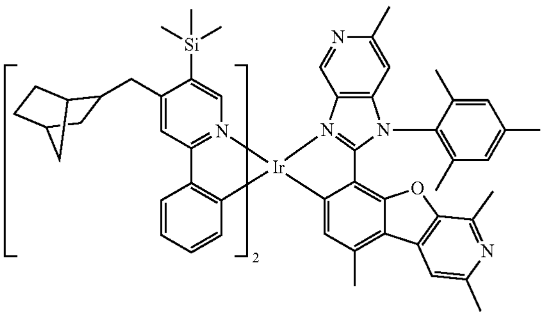
750
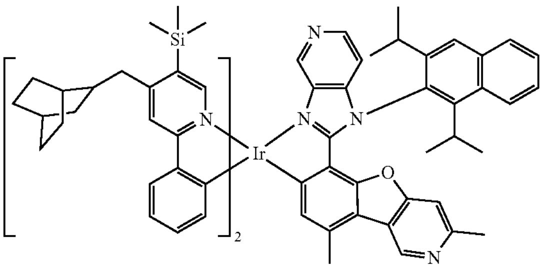

-continued
751
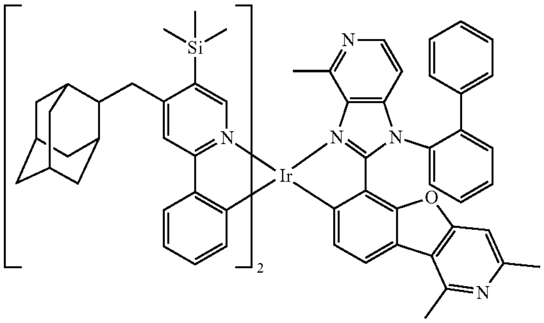
752
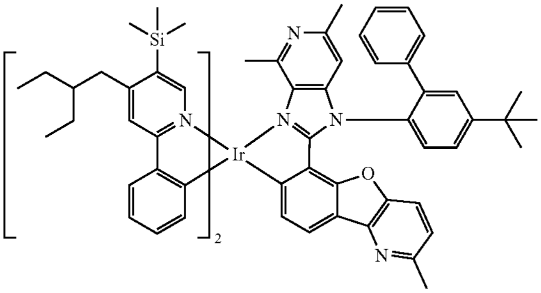
753
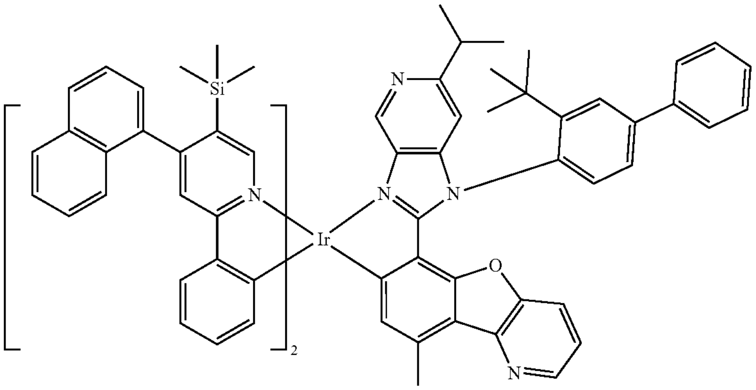
754
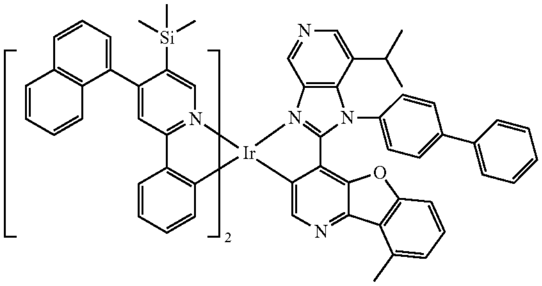
755
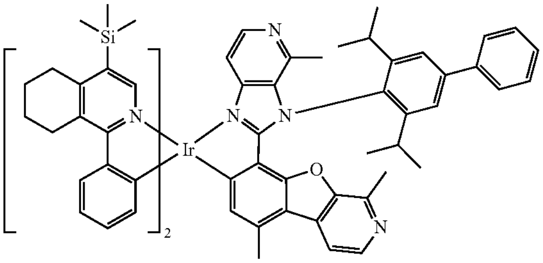
756
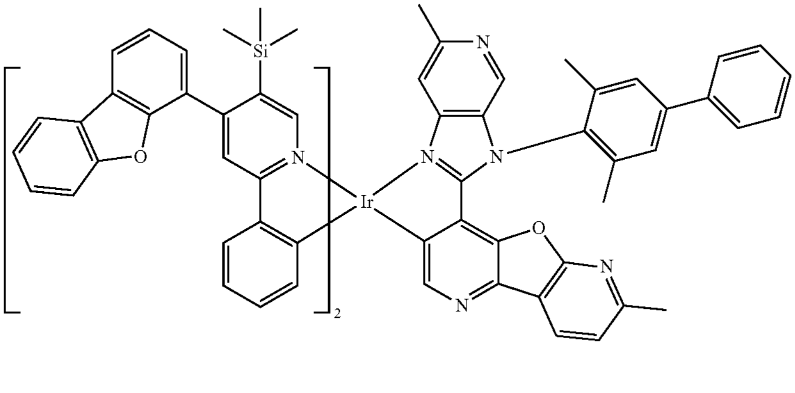

-continued
757
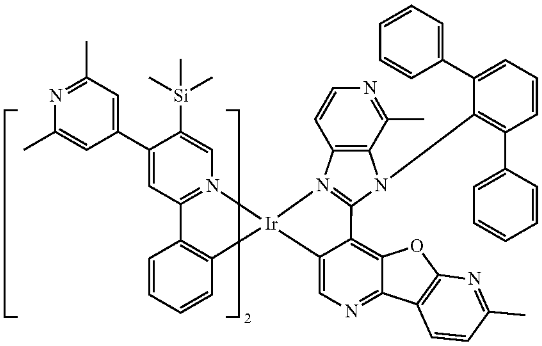
758
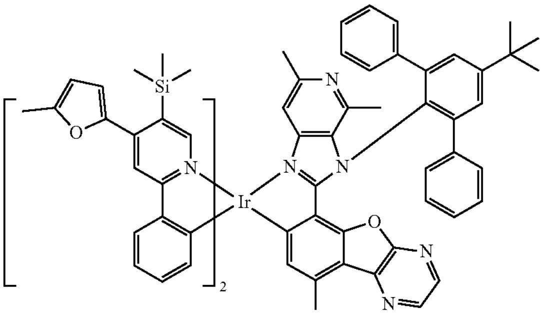
759
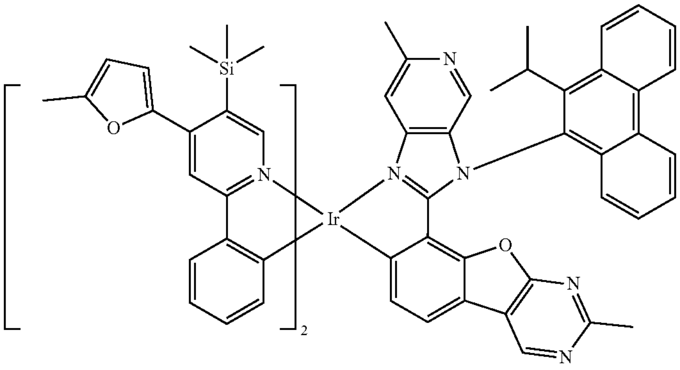
760
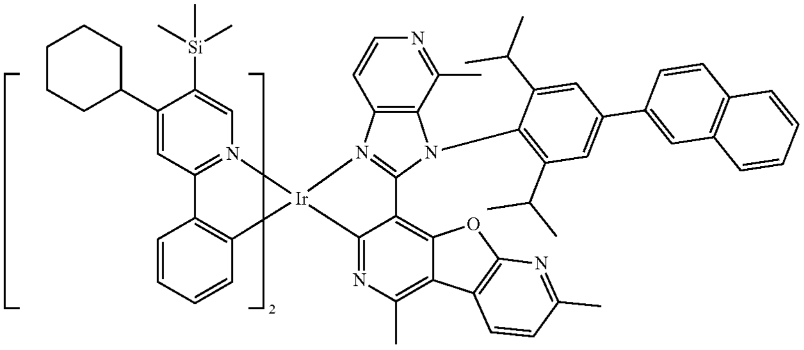
-continued
761
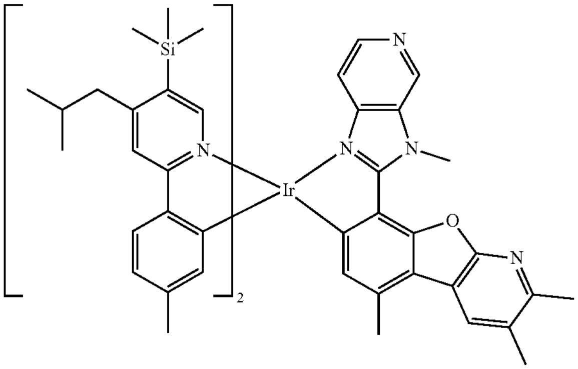
762
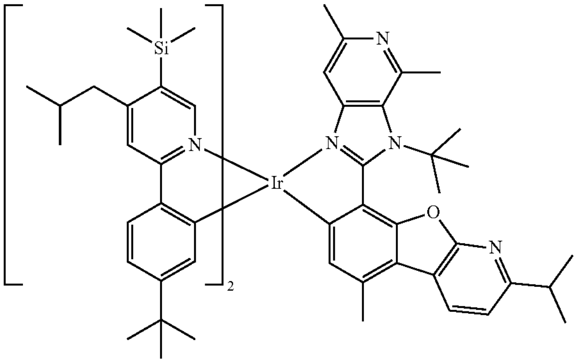

-continued
763
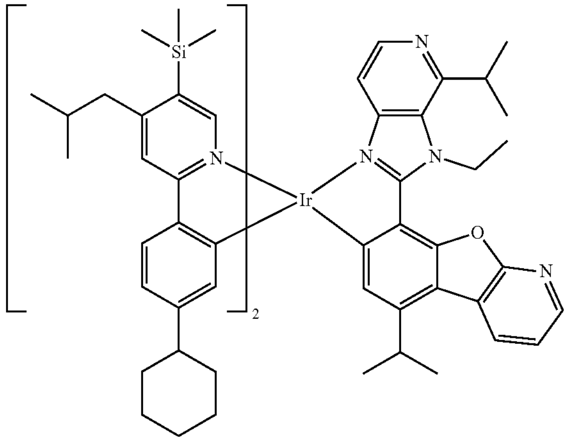
764
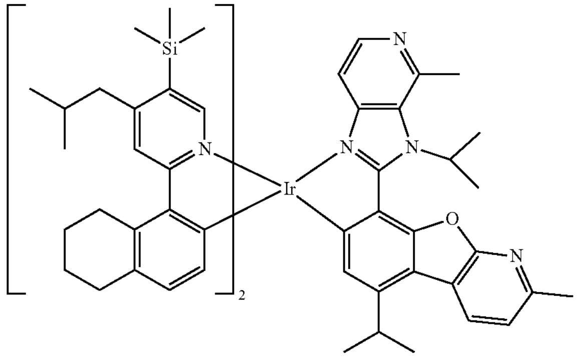
765
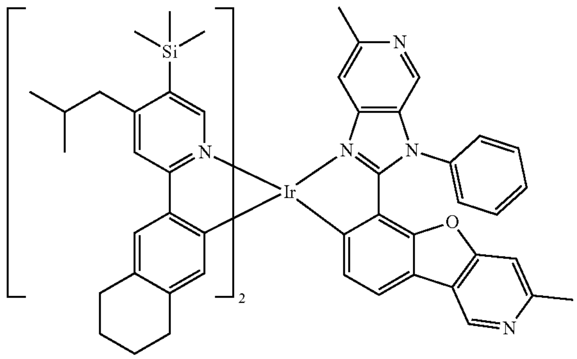
766
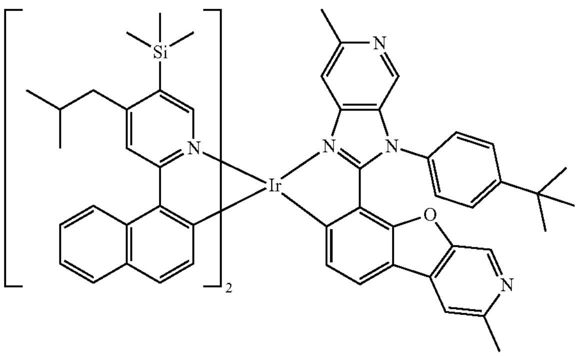
-continued
767
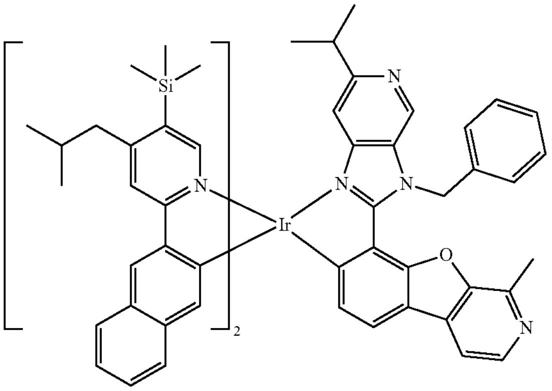
768
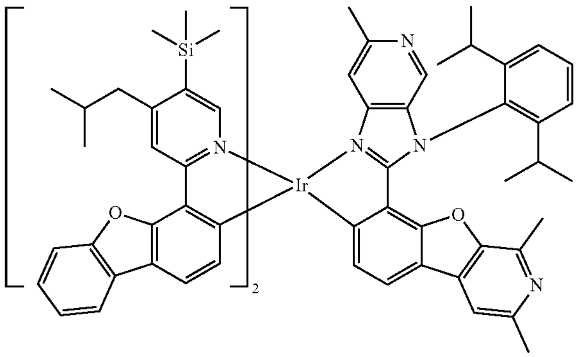
769
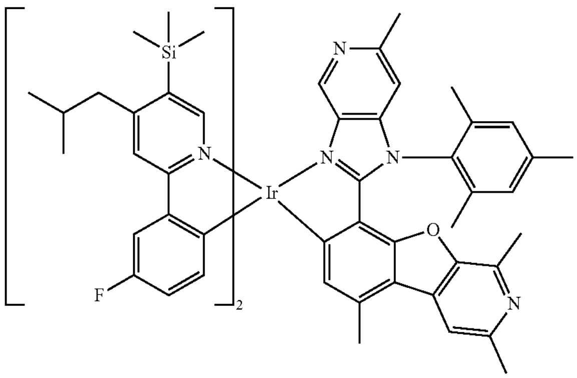
770
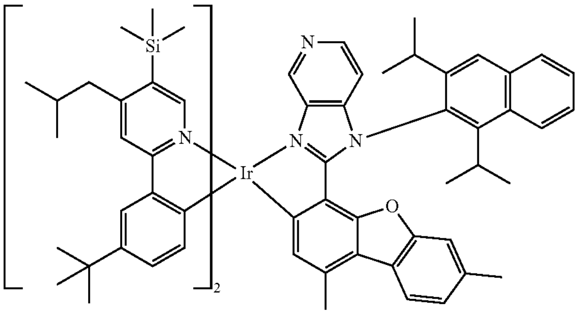

-continued
771
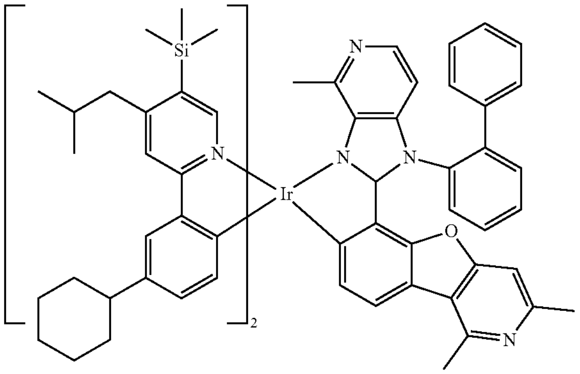
772
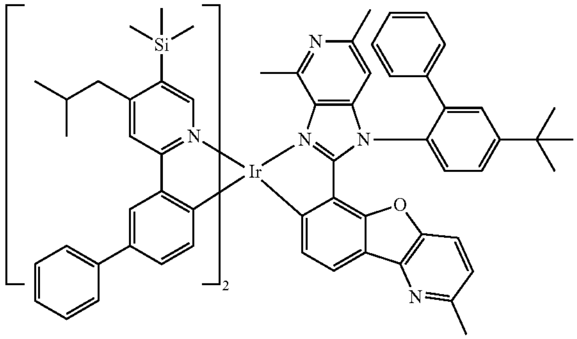
773
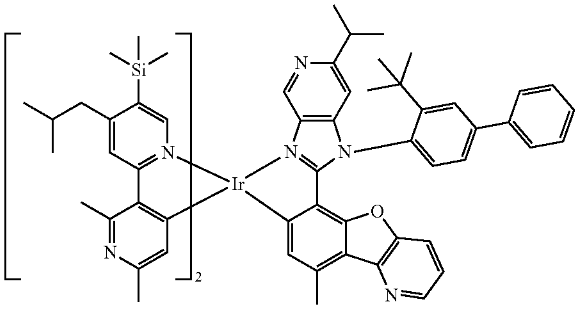
774
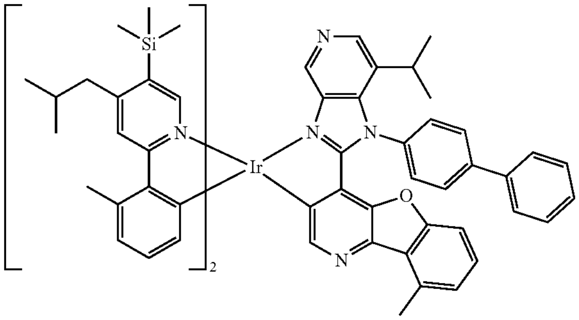
-continued
775
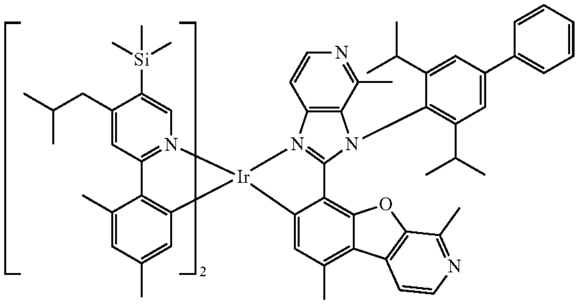
776
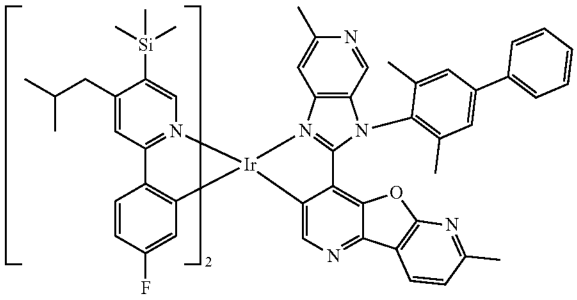
777
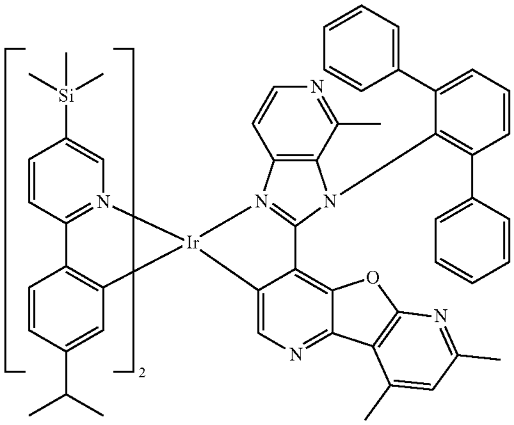
778
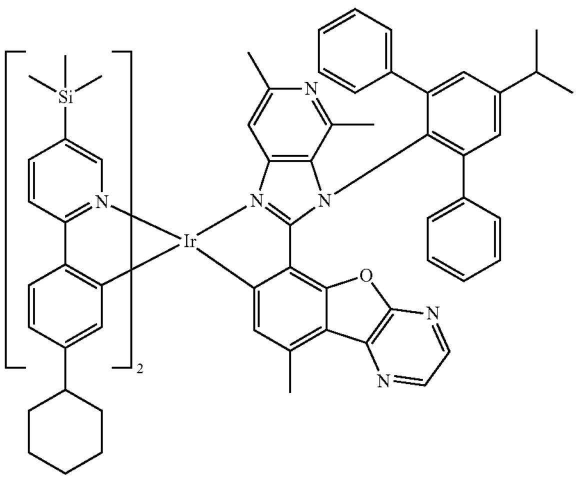

-continued
779
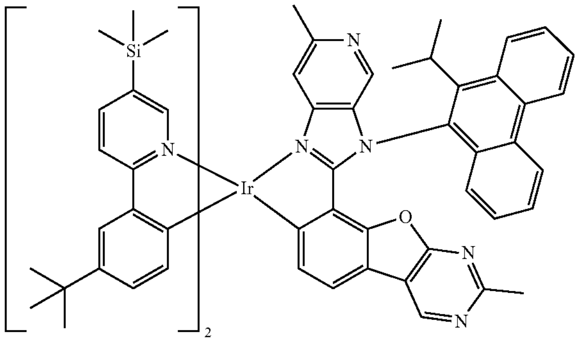
780
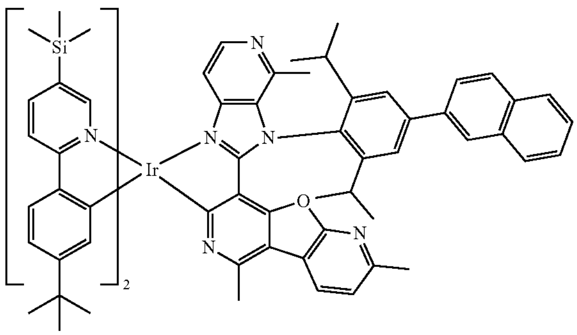
781
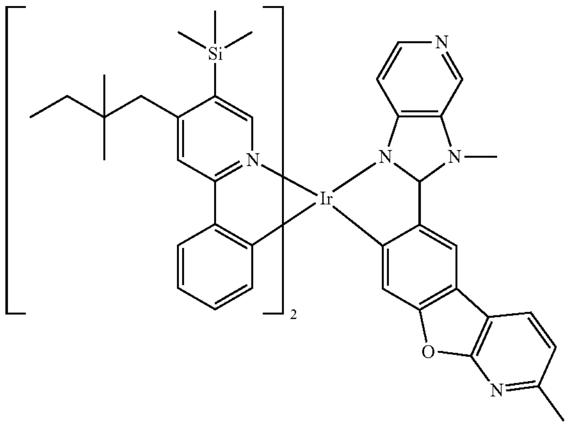
782
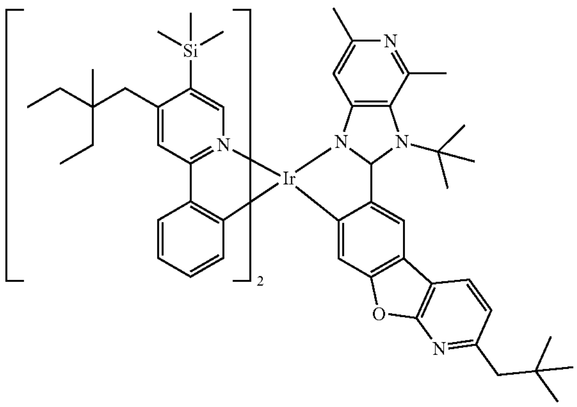
-continued
783
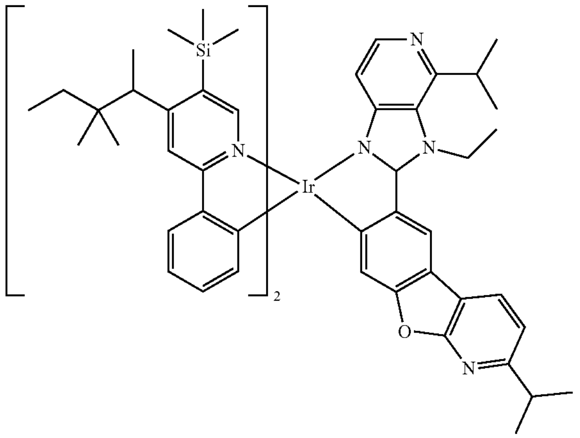
784
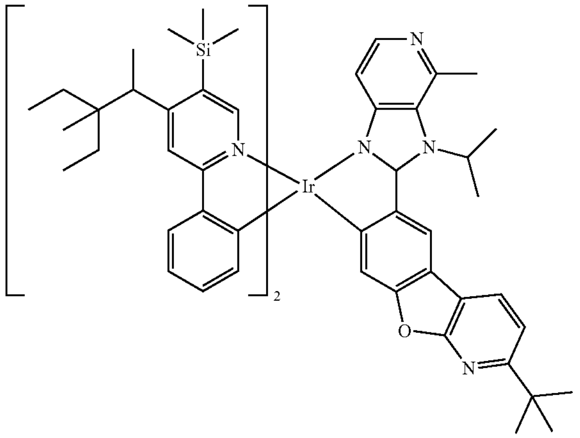
785
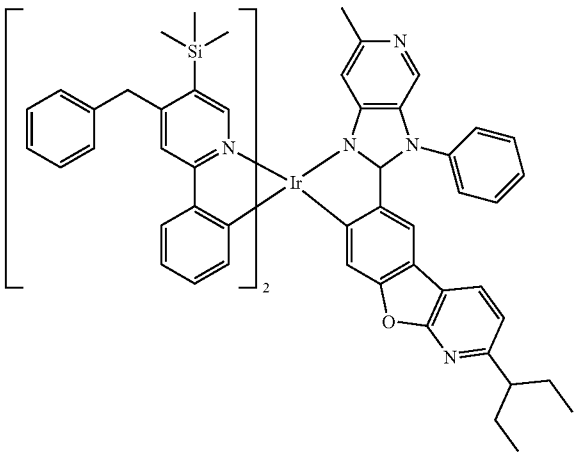

-continued
786
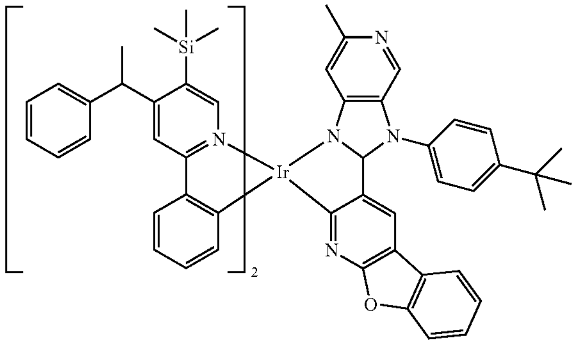
787
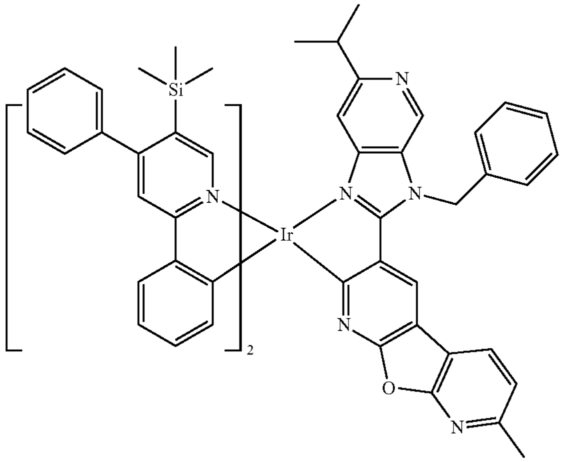
788
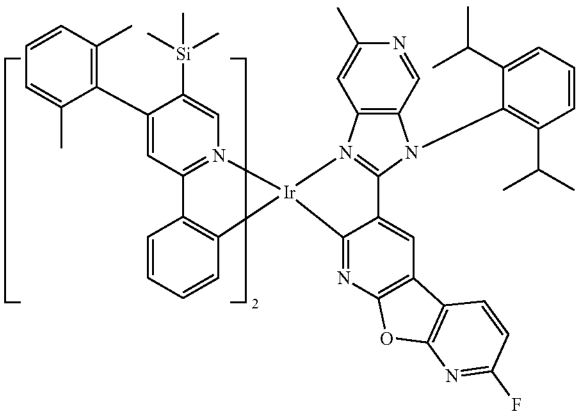
-continued
789
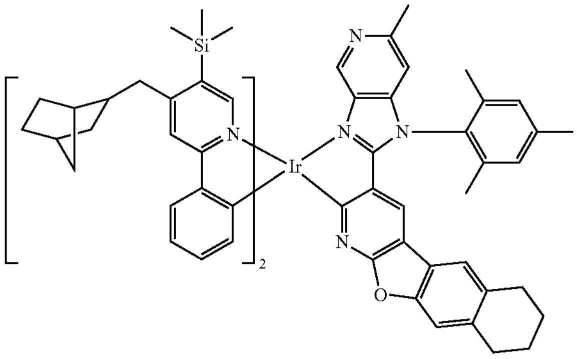
790
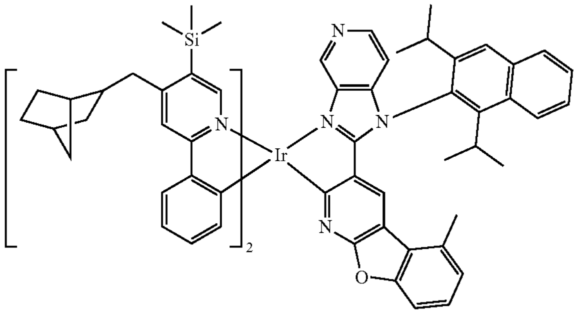
791
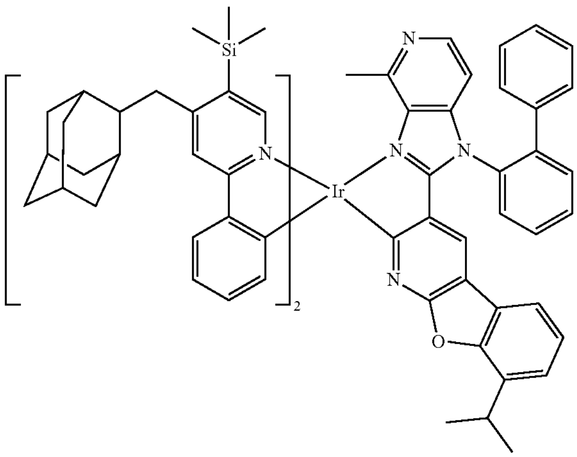
792
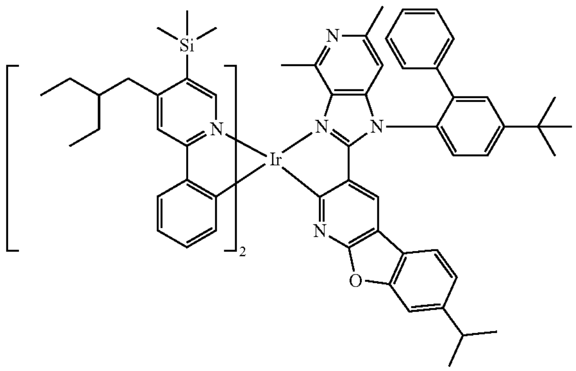

-continued
793
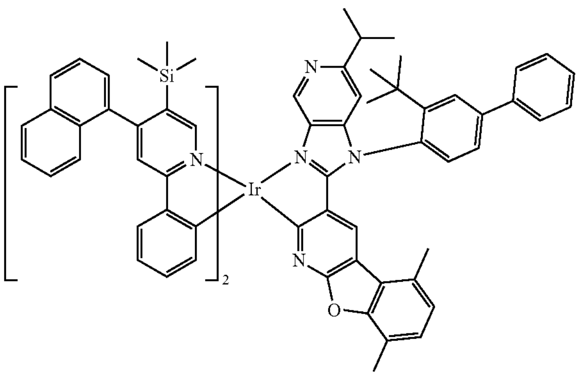
794
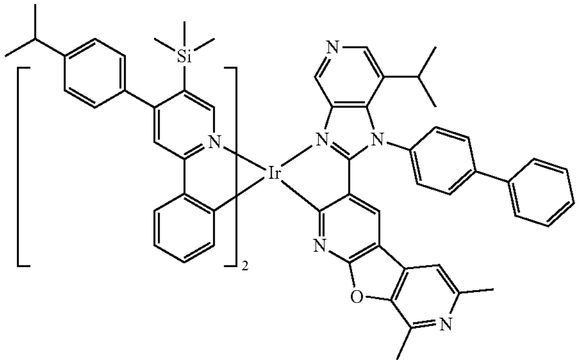
795
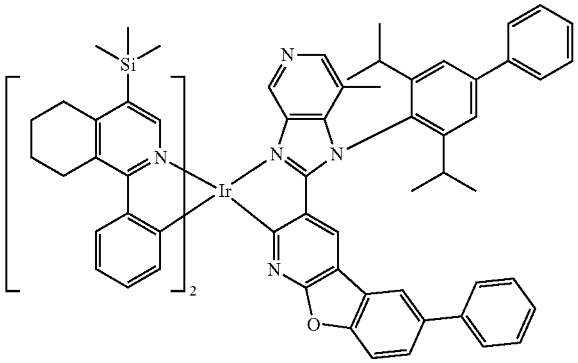
796
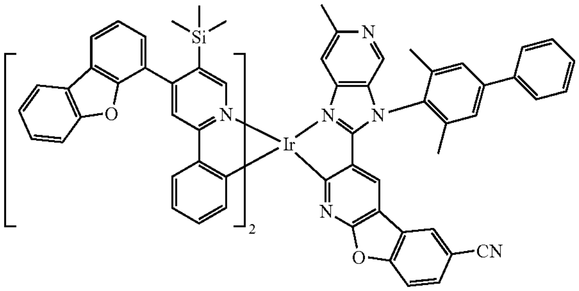
-continued
797
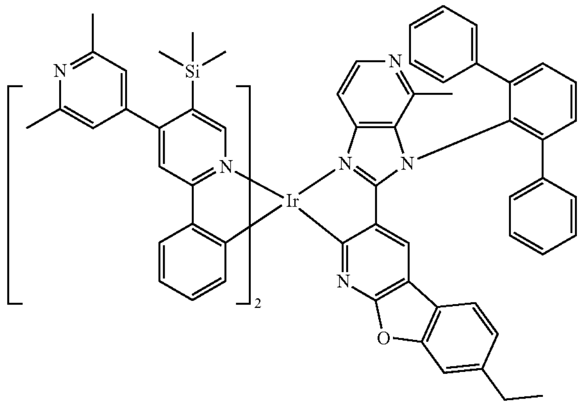
798
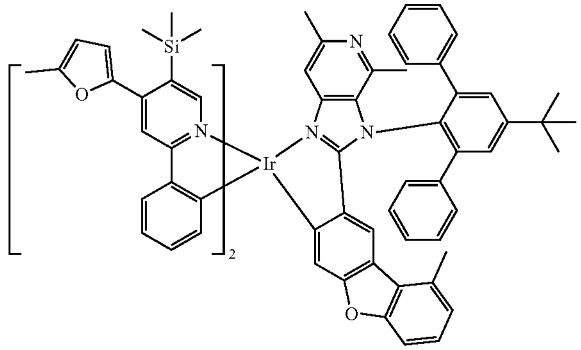
799
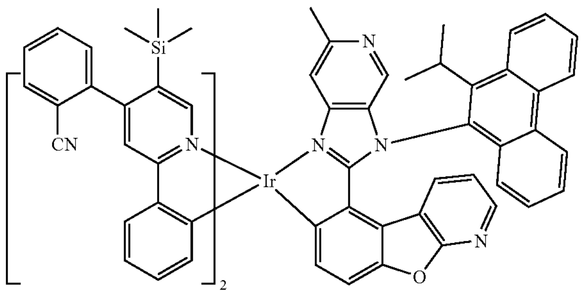
800
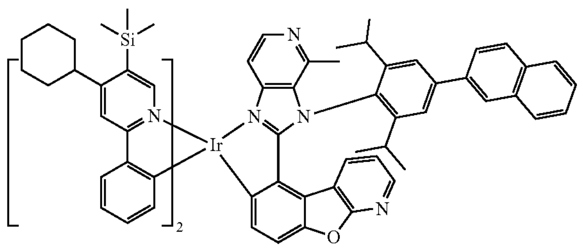

801
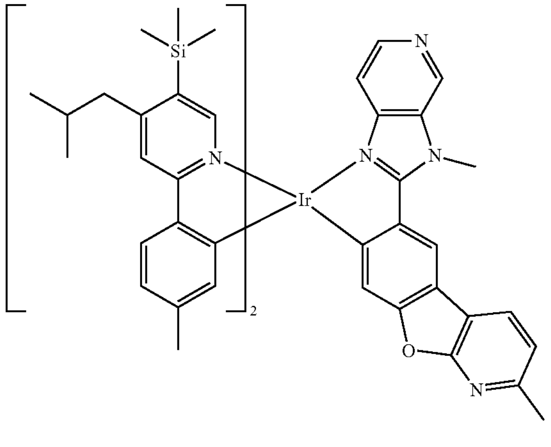
802
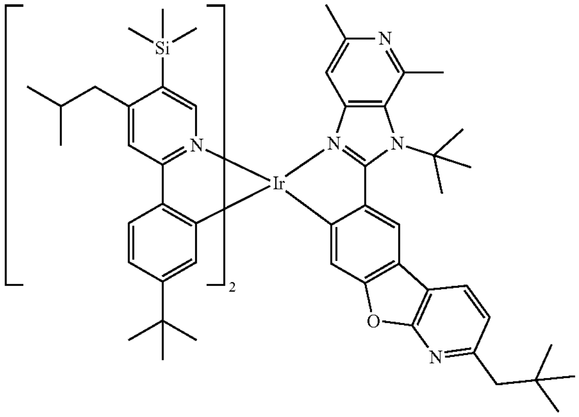
803
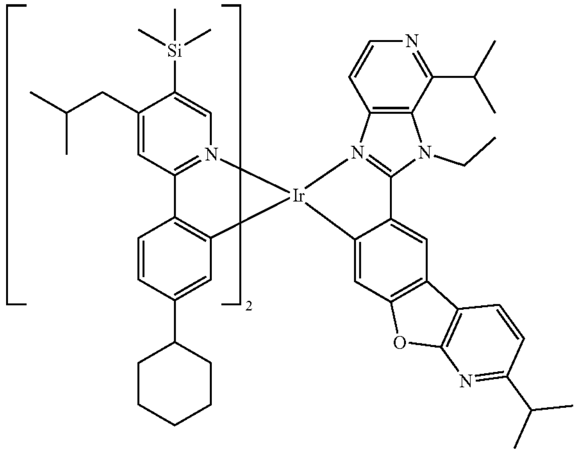
804
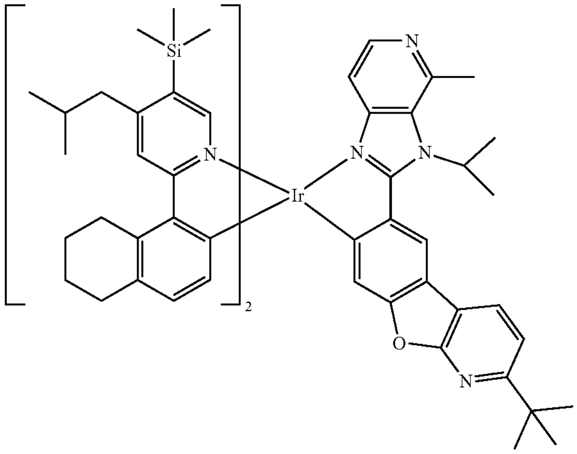
805
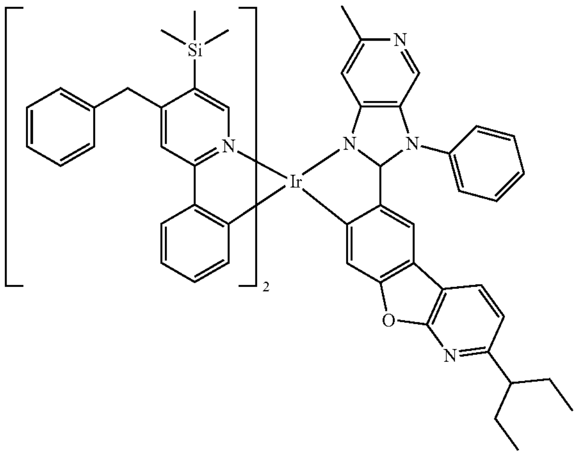
806
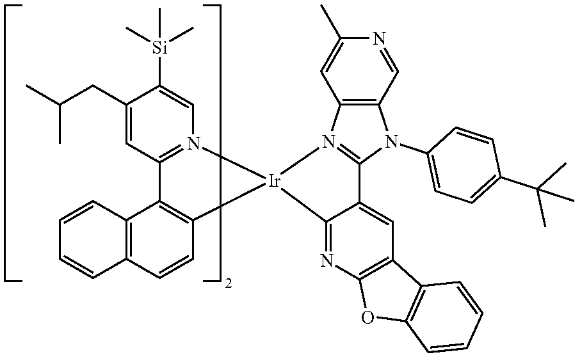

-continued
807
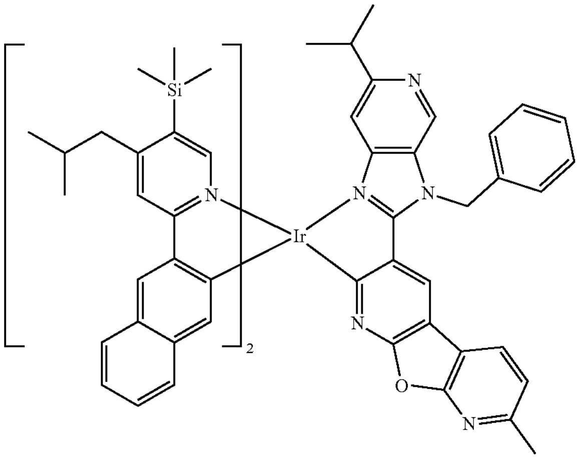
808
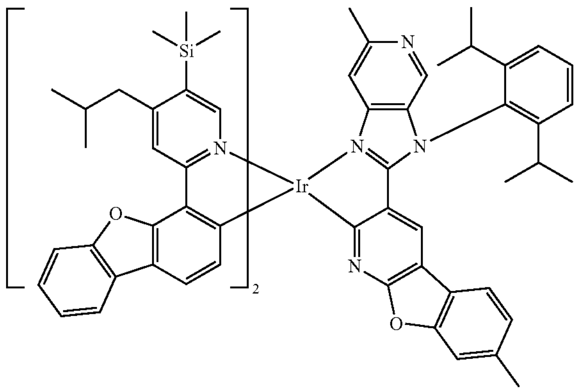
809
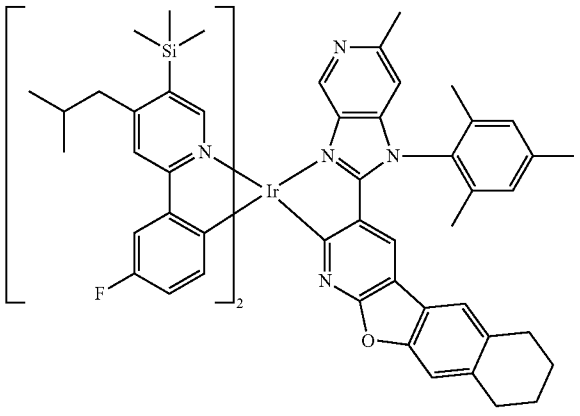
-continued
810
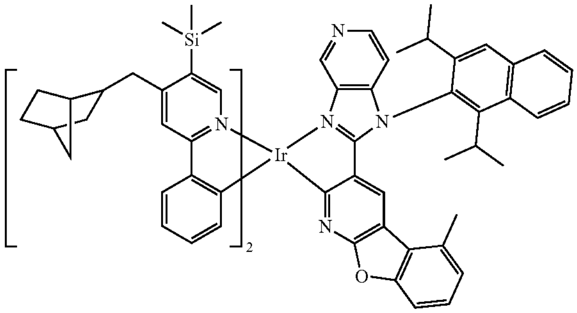
811
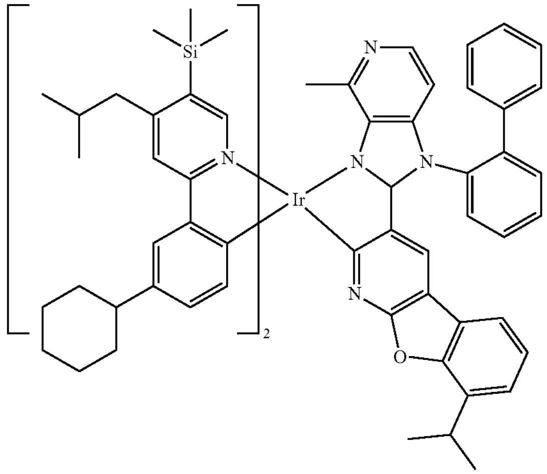
812
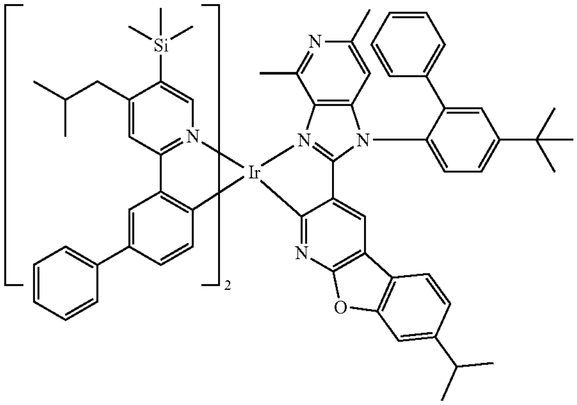
813
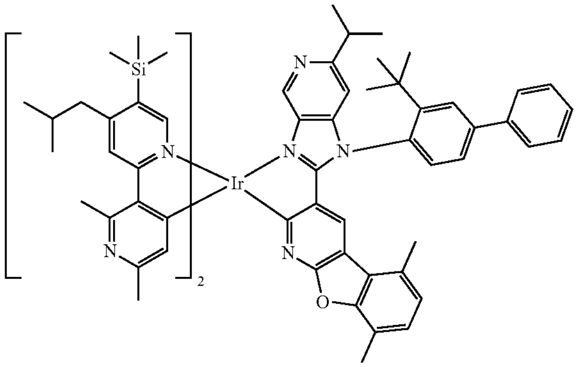

-continued
814
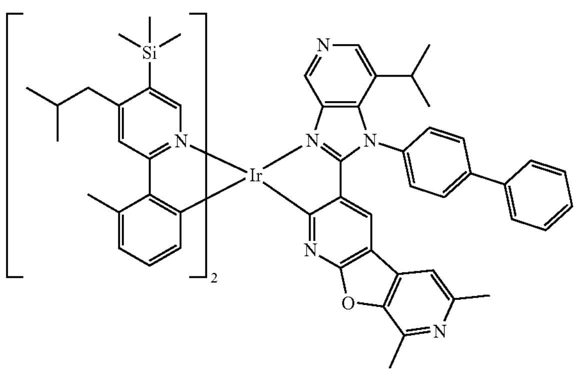
815
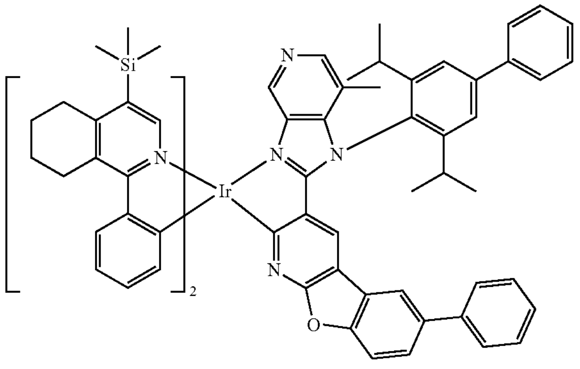
816
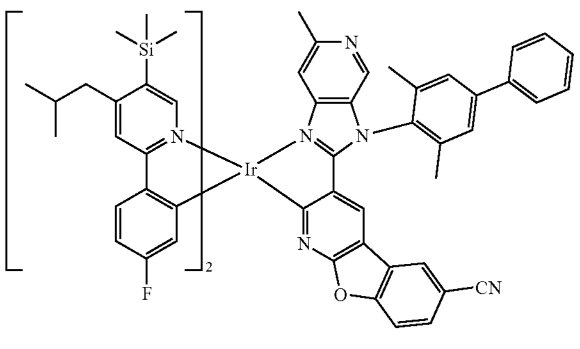
-continued
817
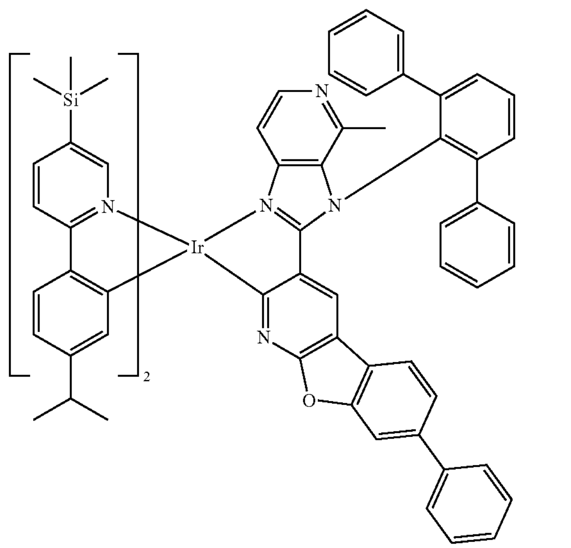
818
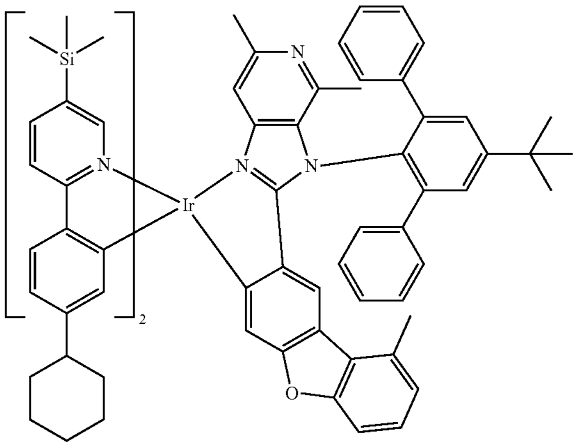
819
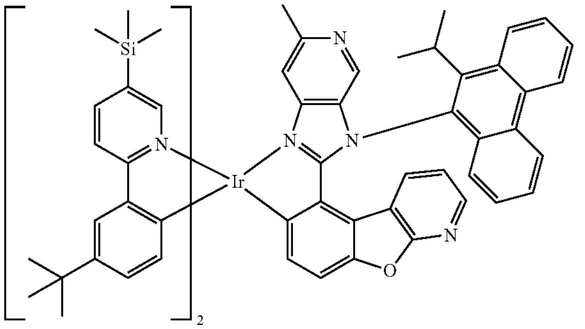
820
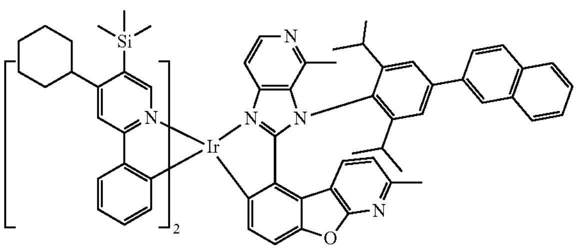

821
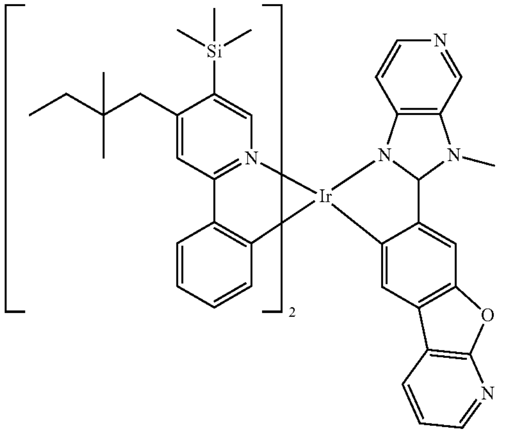
822
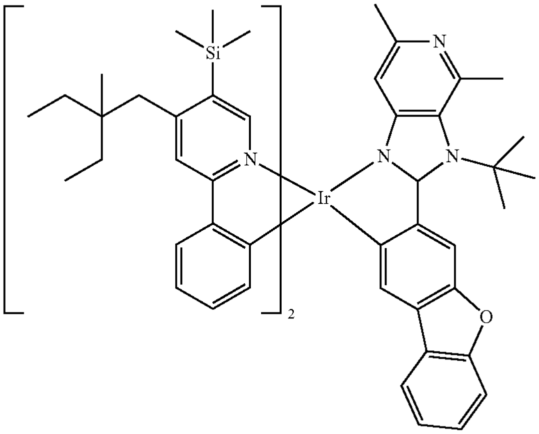
823
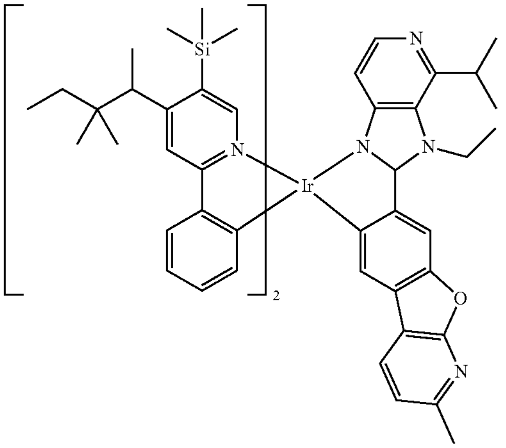
824
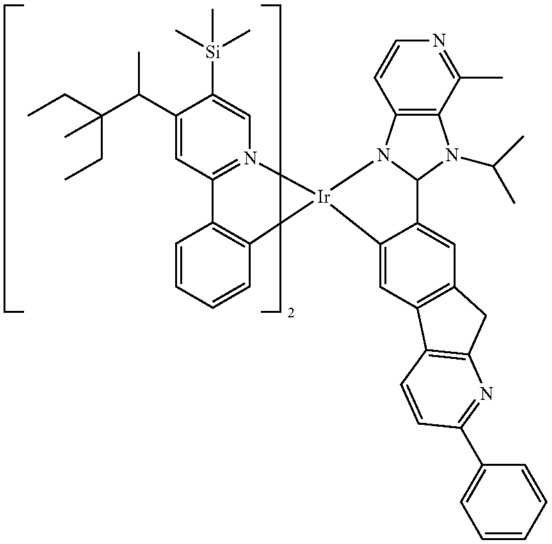
825
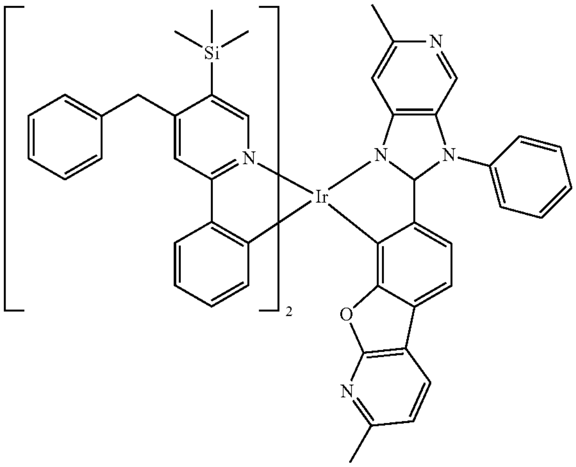
826
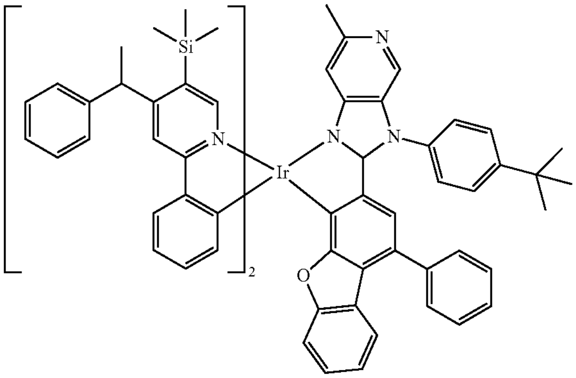

-continued
827
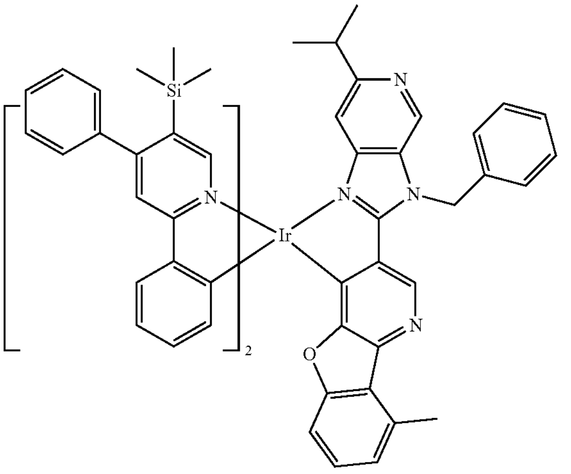
828
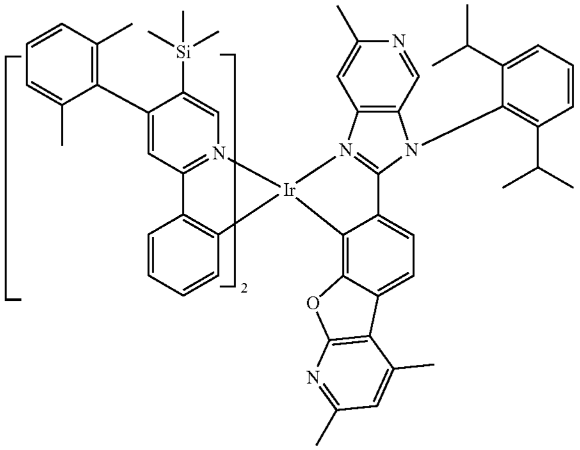
829
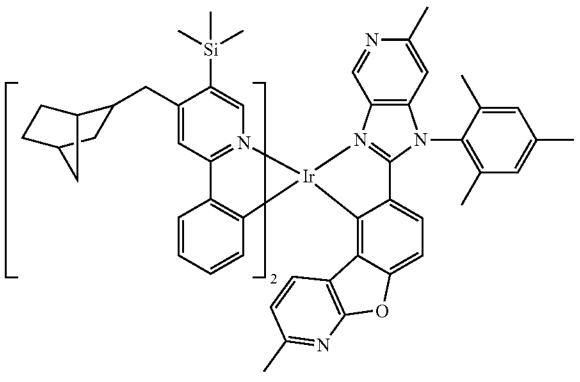
-continued
830
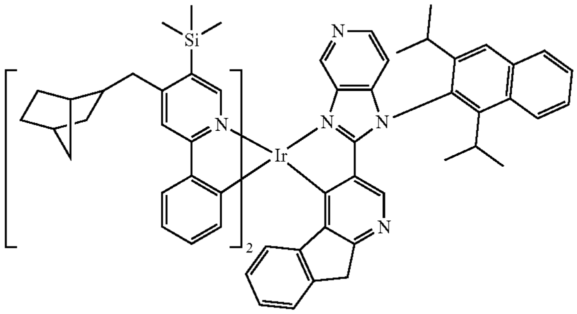
831
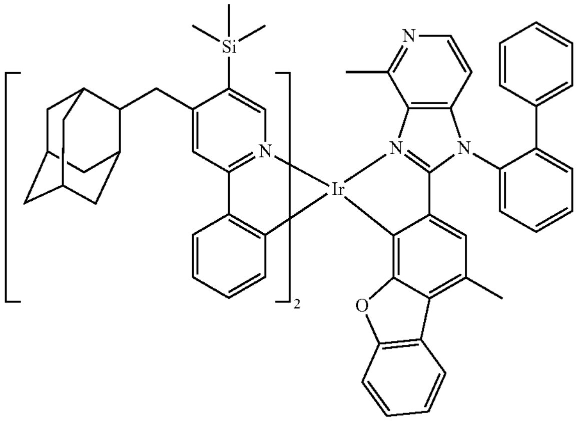
832
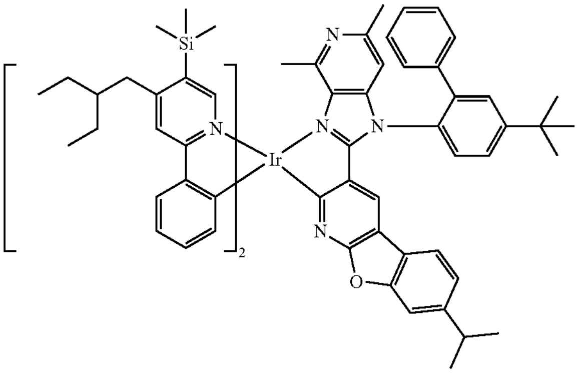
833
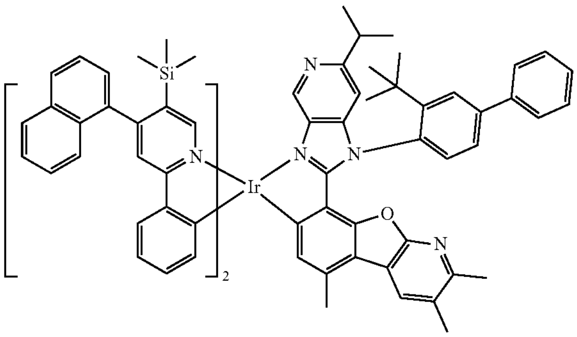

-continued
834
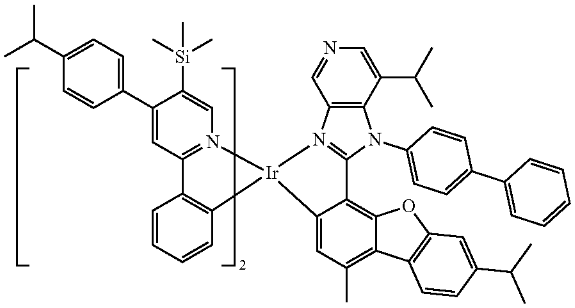
835
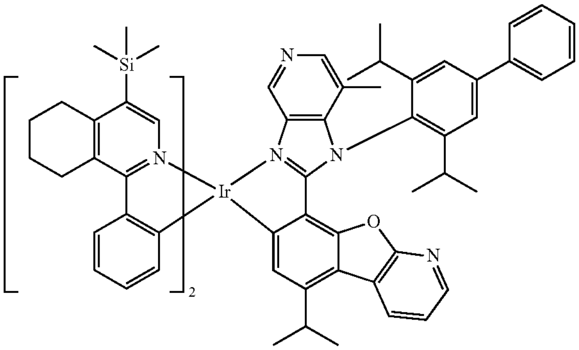
836
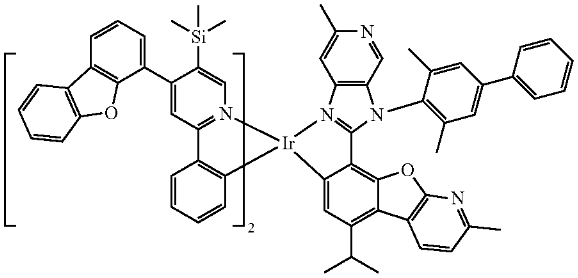
837
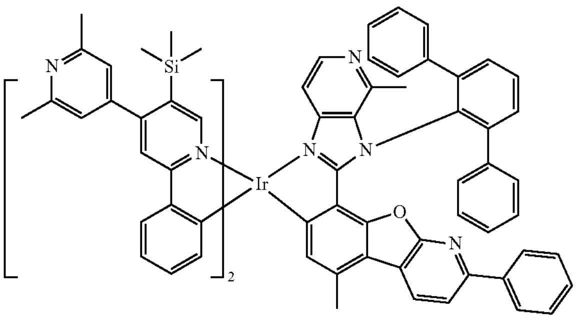
-continued
838
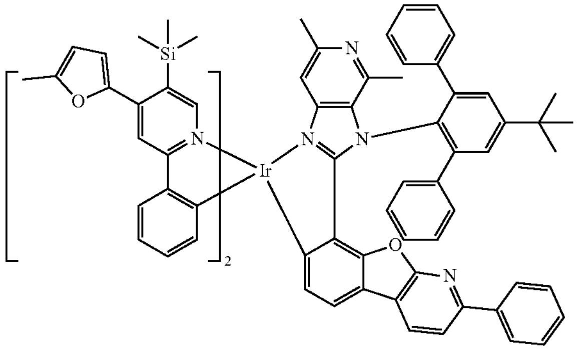
839
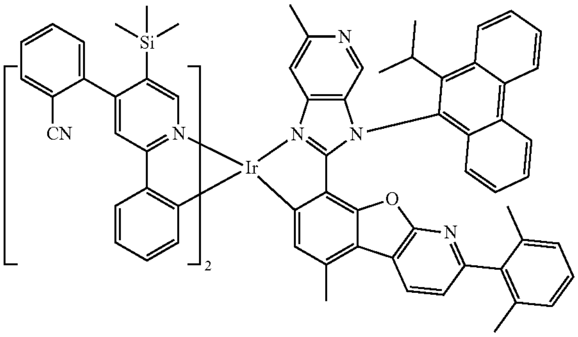
840
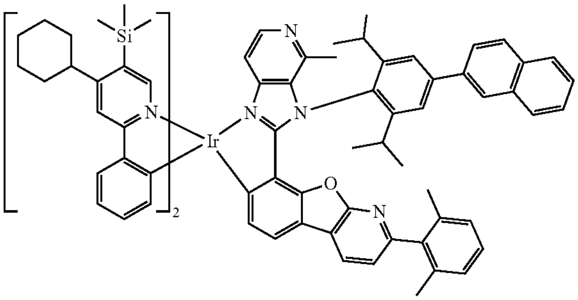
841
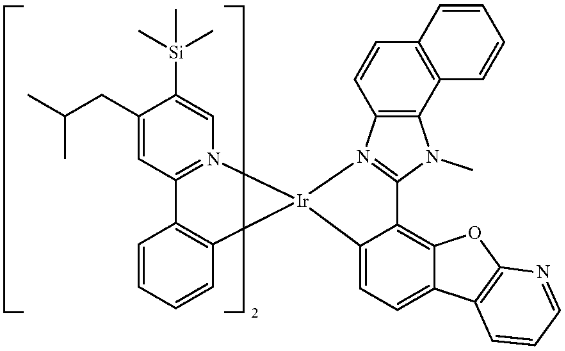

-continued
842
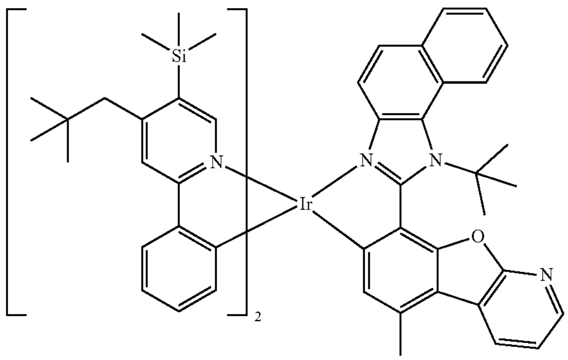
843
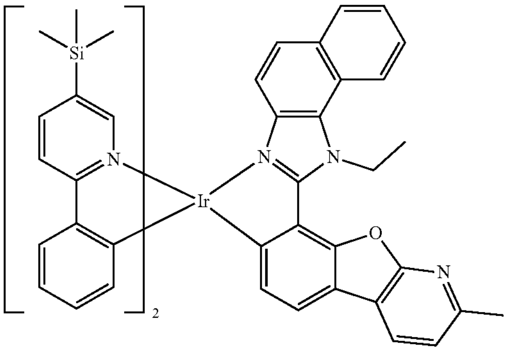
844
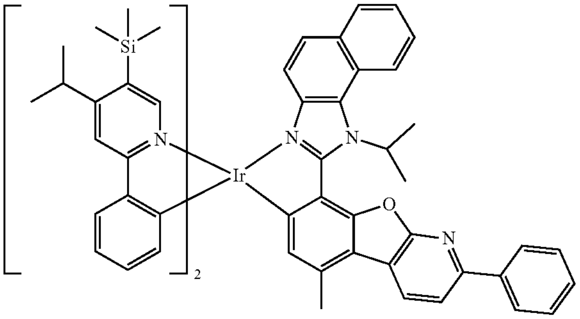
845
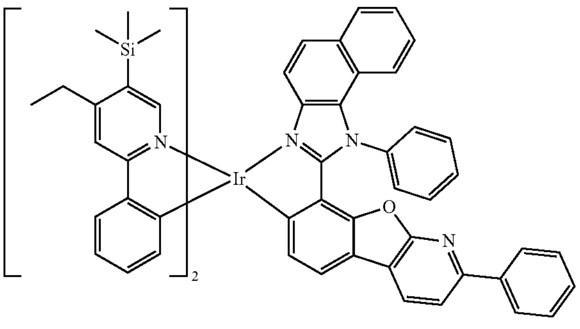
-continued
846
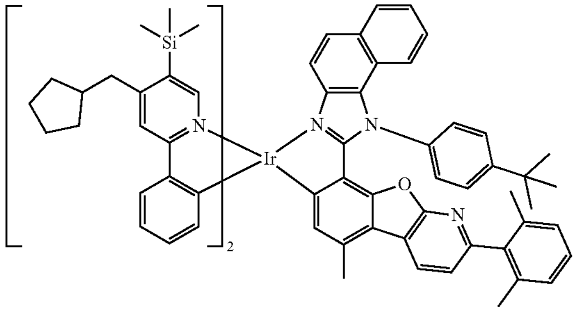
847
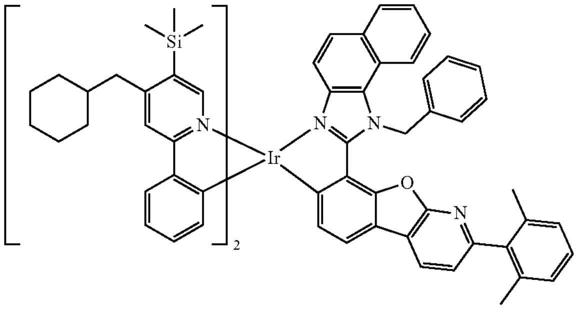
848
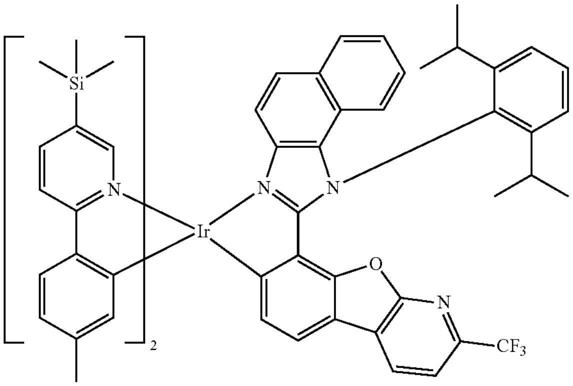
849
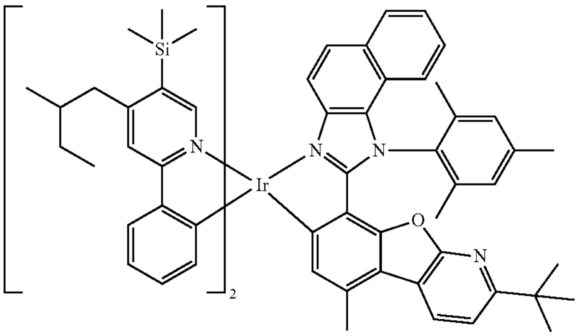

-continued
850
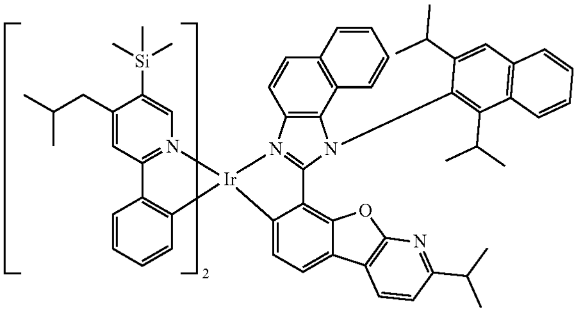
851
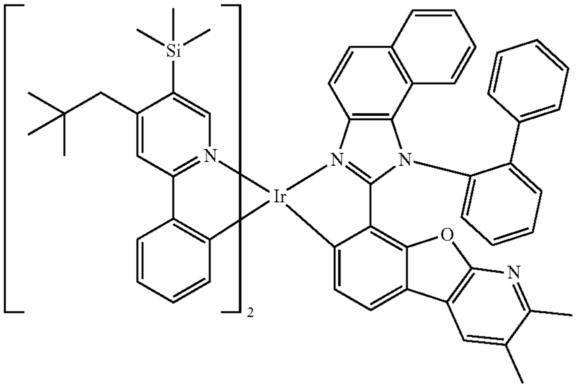
852
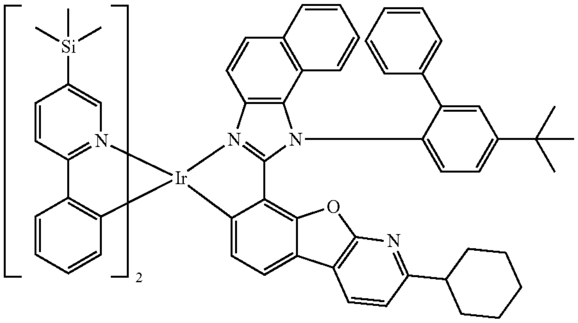
853
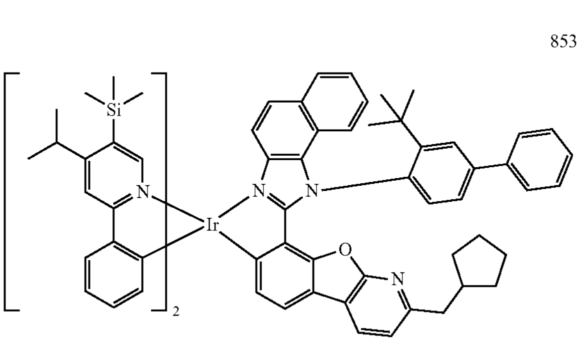
-continued
854
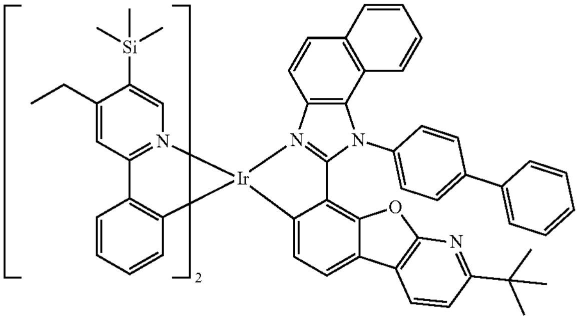
855
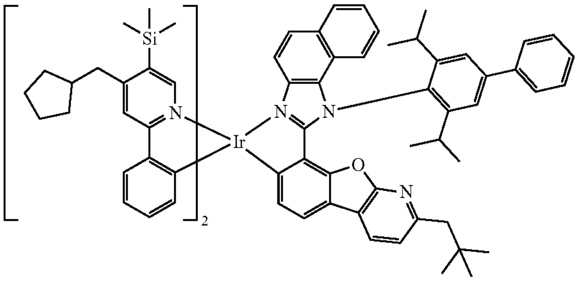
856
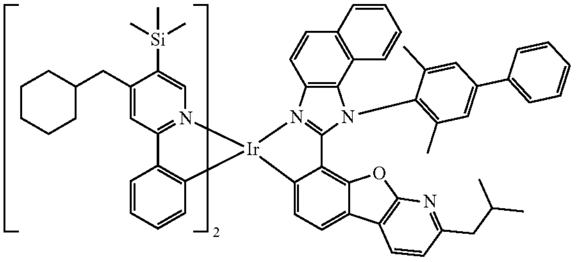
857
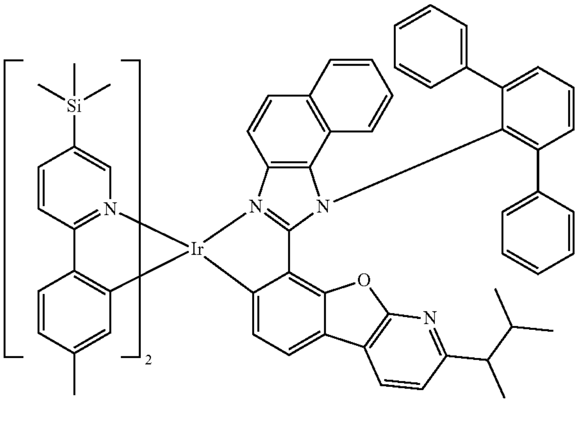

-continued
858
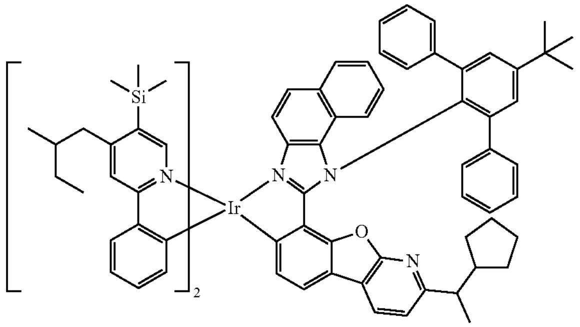
859
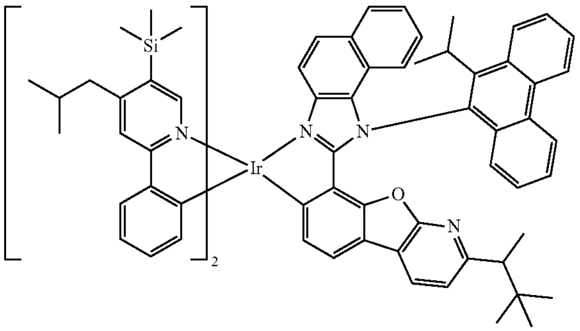
860
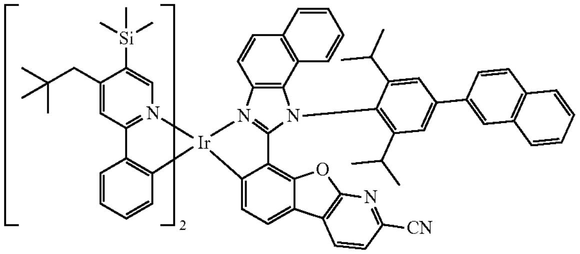
861
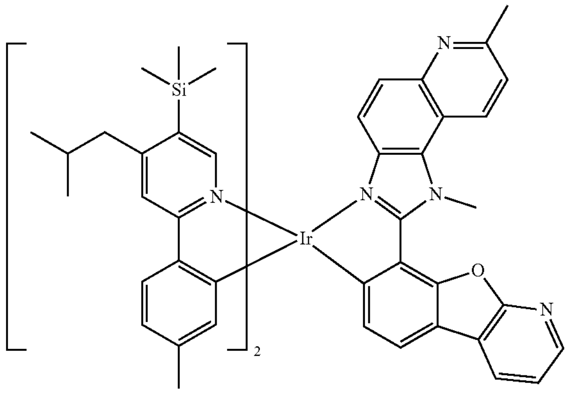
-continued
862
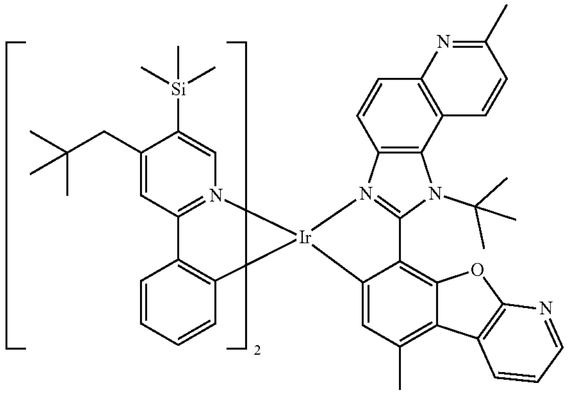
863
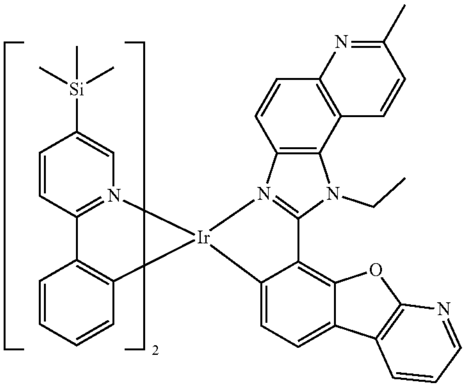
864
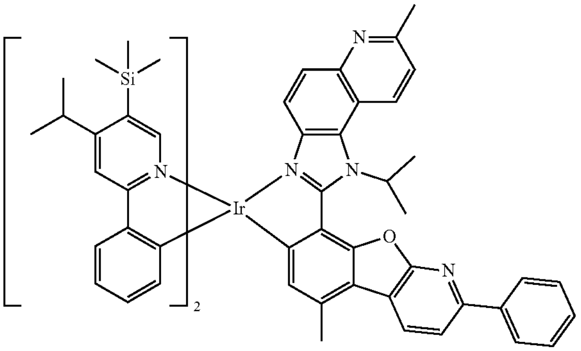
865
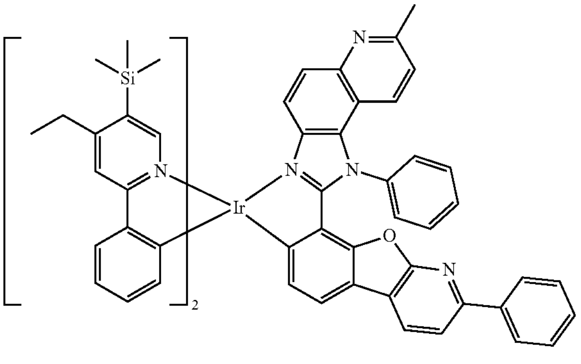

-continued
866
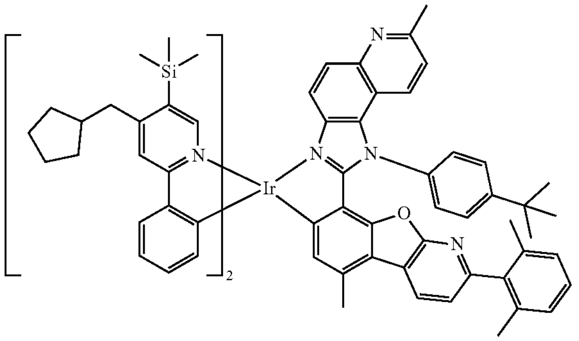
867
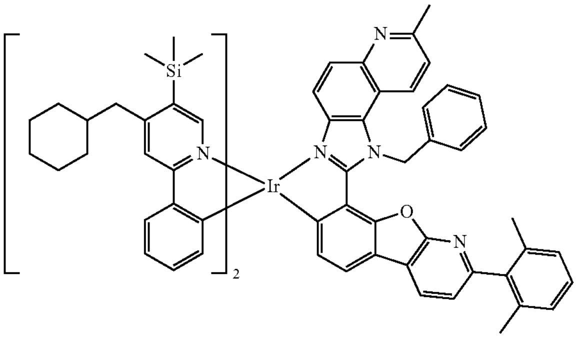
868
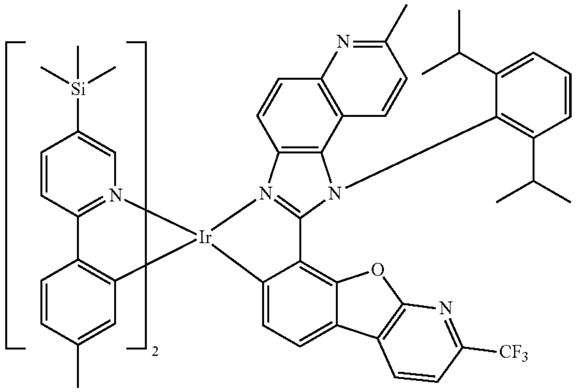
869
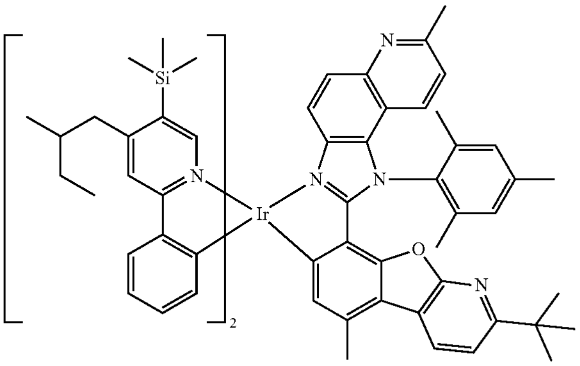
-continued
870
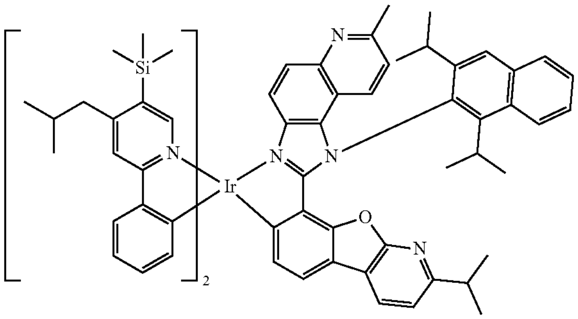
871
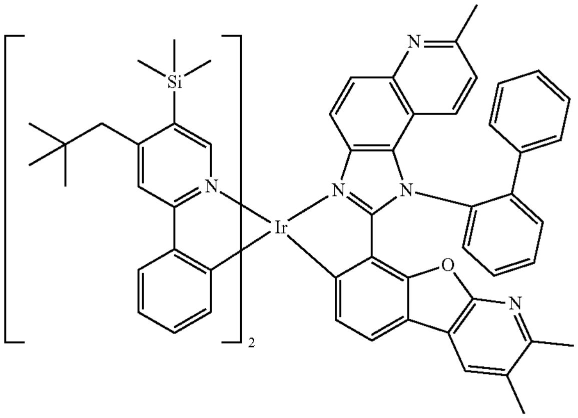
872
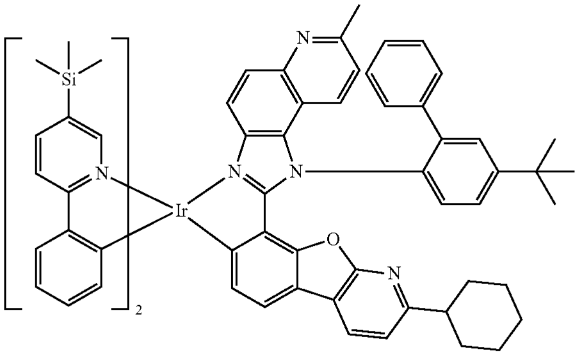
873
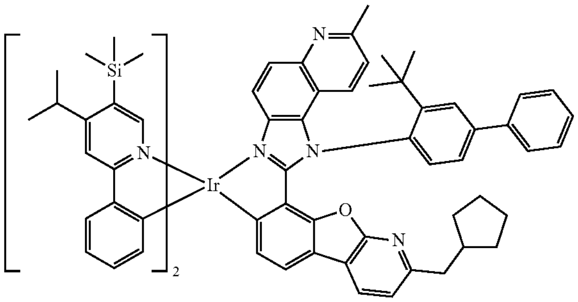

-continued
874
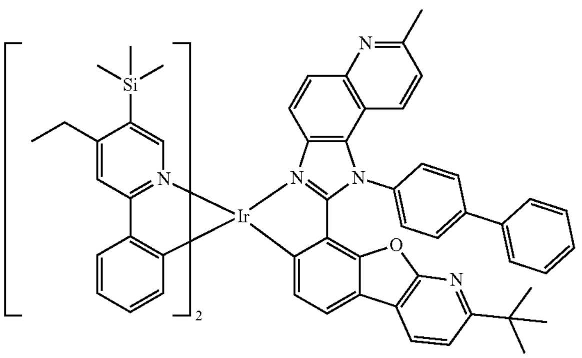
875
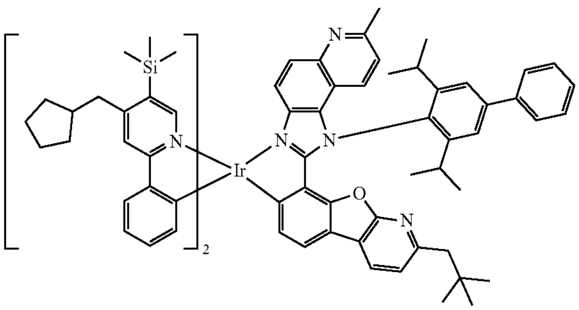
876
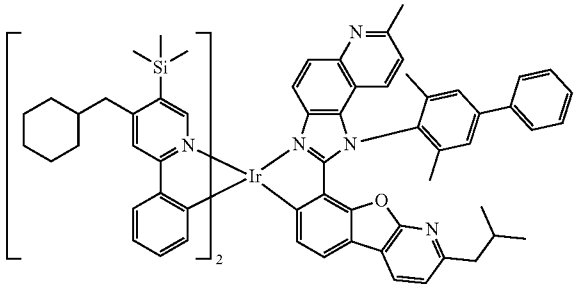
877
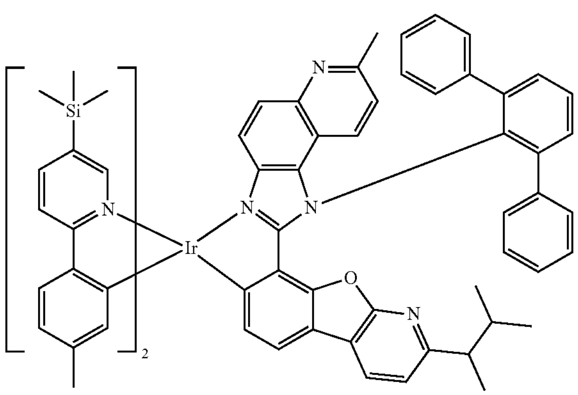
-continued
878
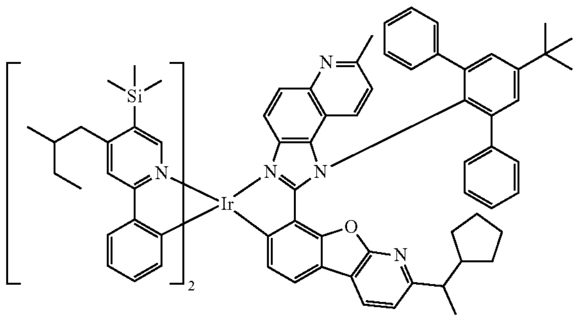
879
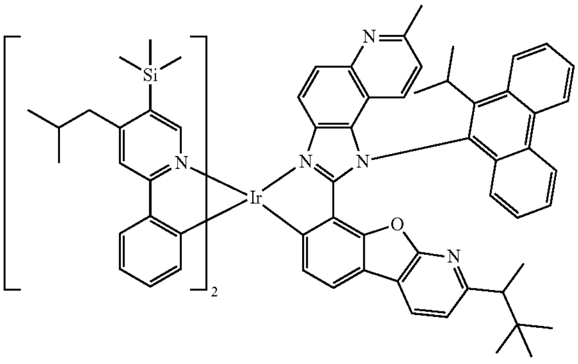
880
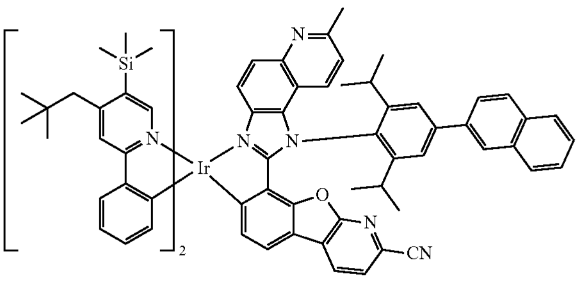
881
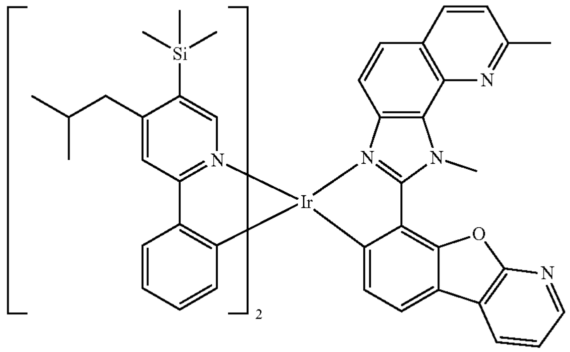

-continued
882
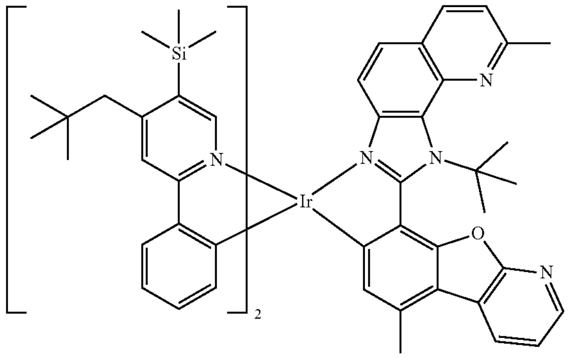
883
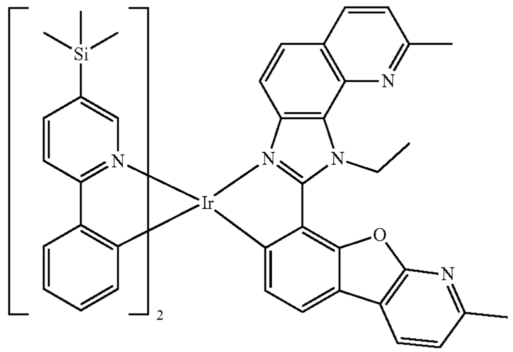
884
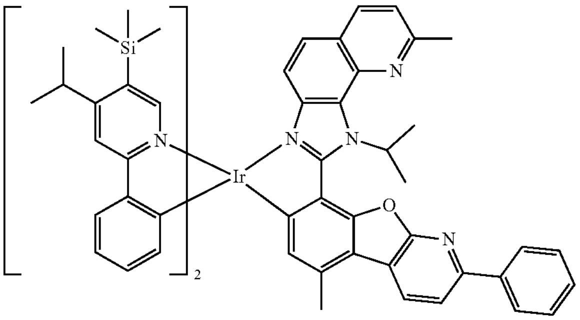
885
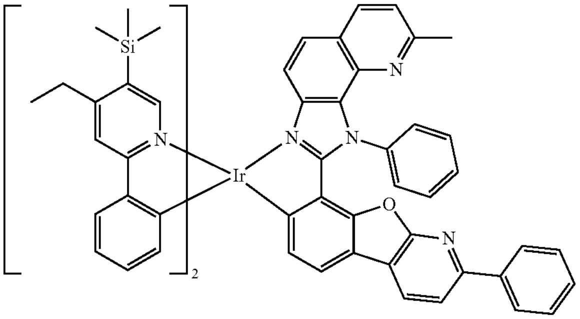
-continued
886
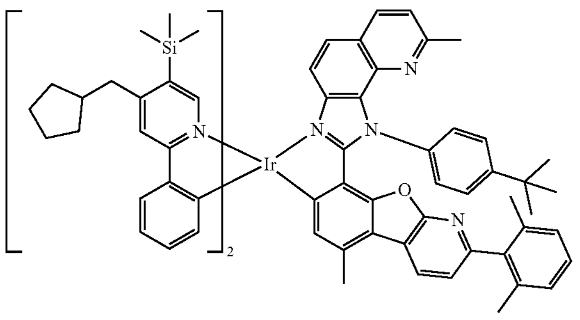
887
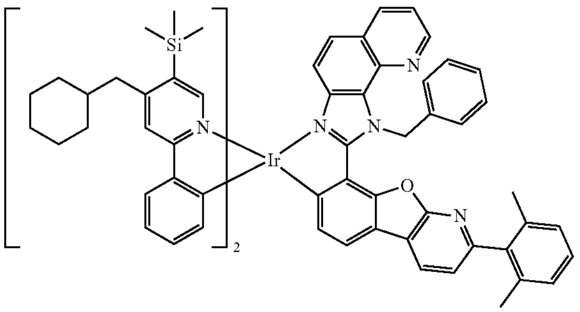
888
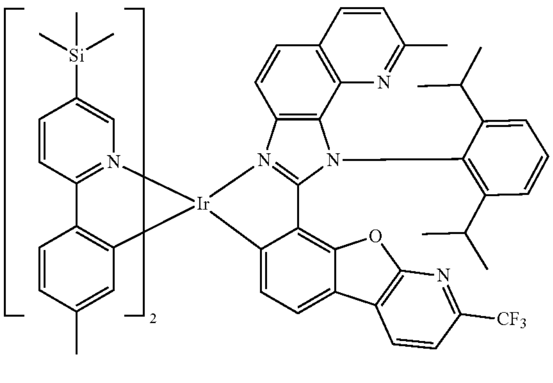
889
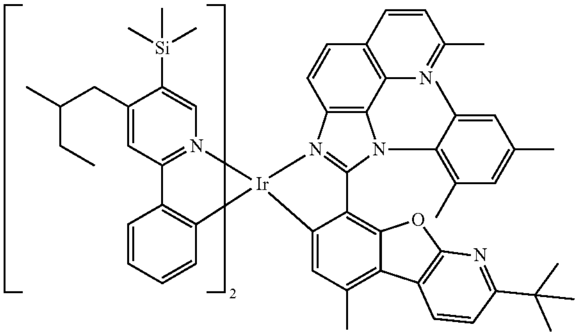

890
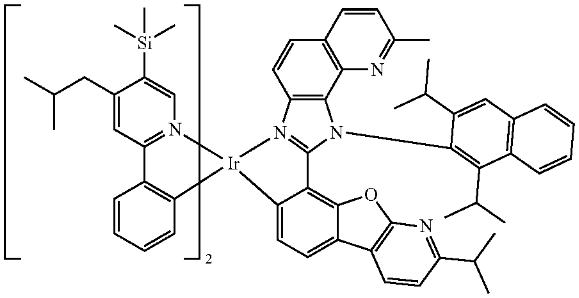
891
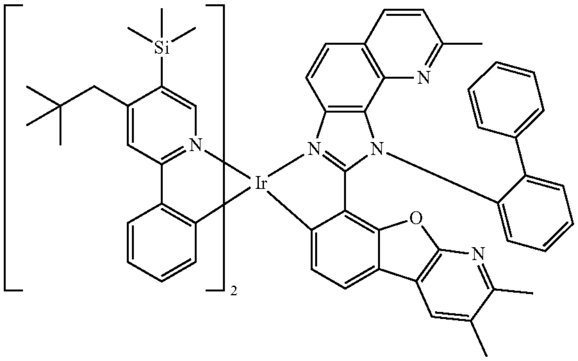
892
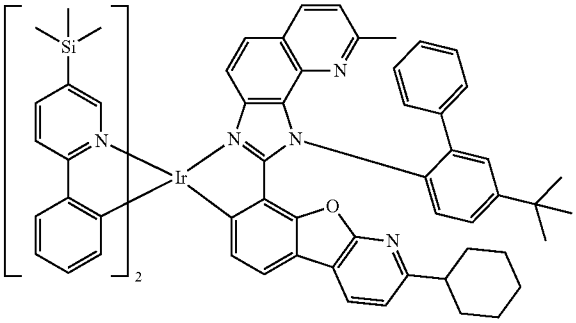
893
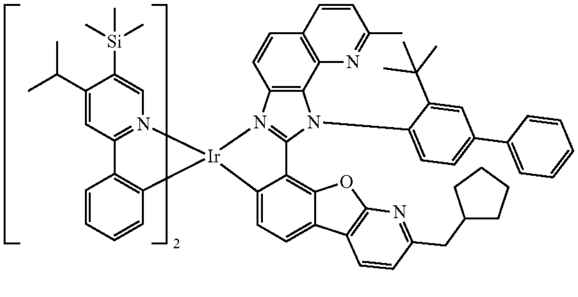
894
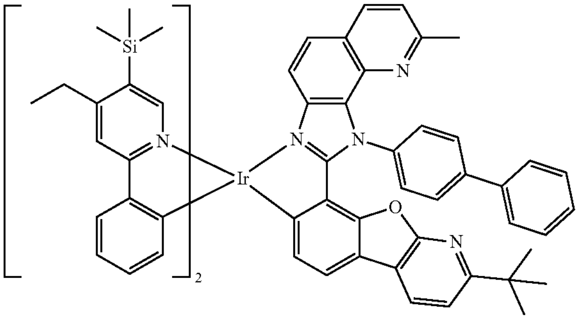
895
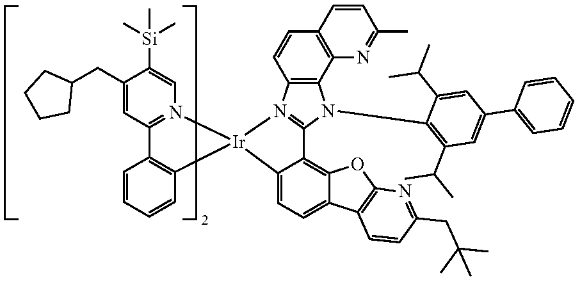
896
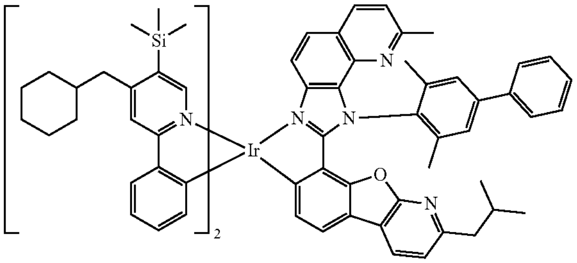
897
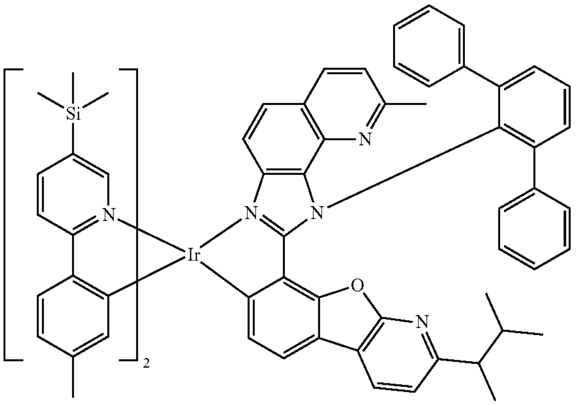

-continued
898
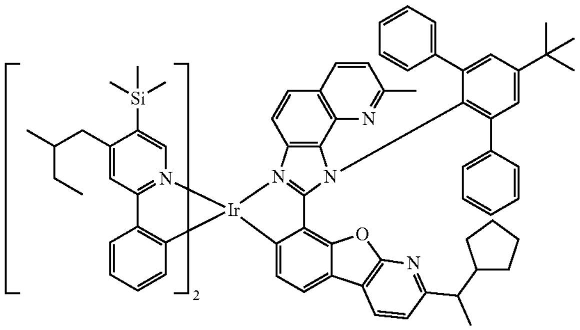
899
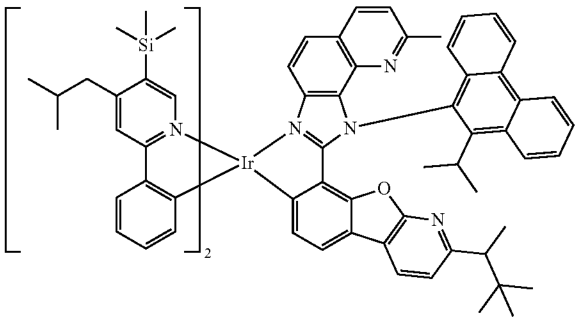
900
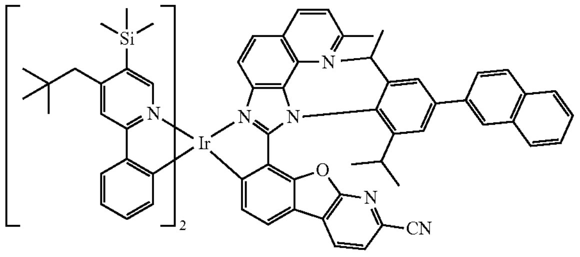
901
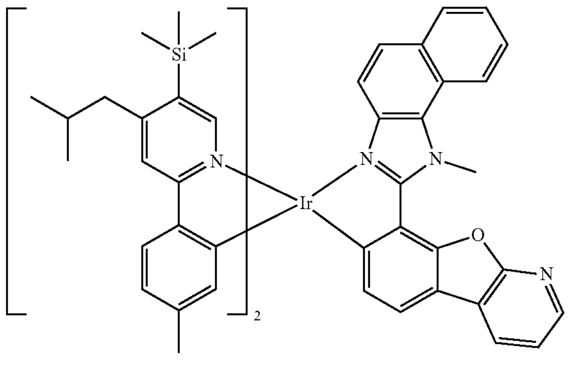
-continued
902
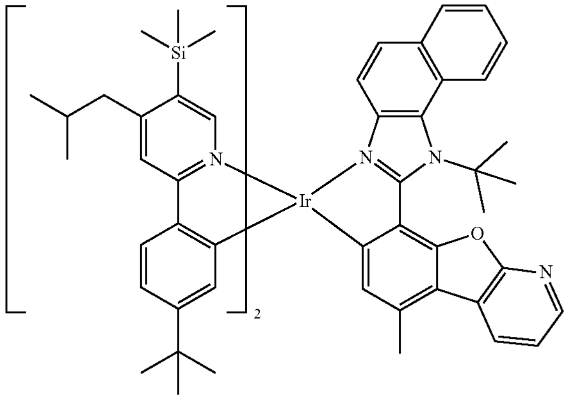
903
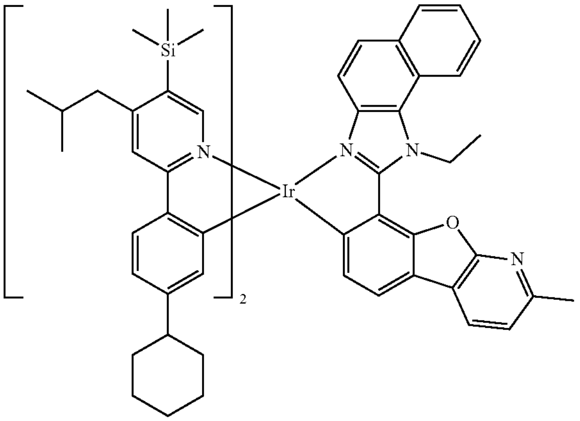
904
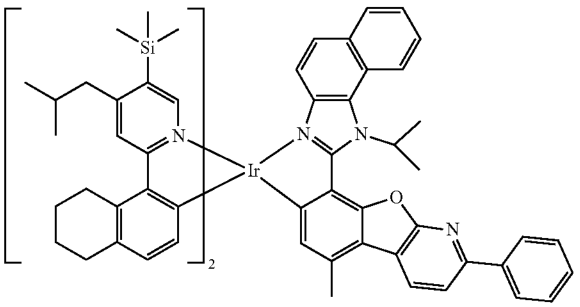
905
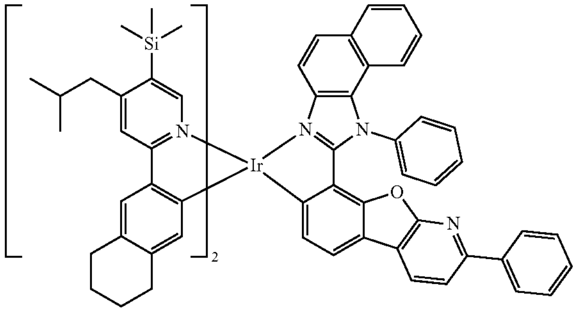

-continued
906
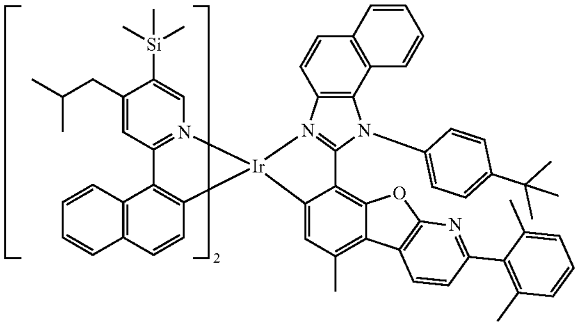
907
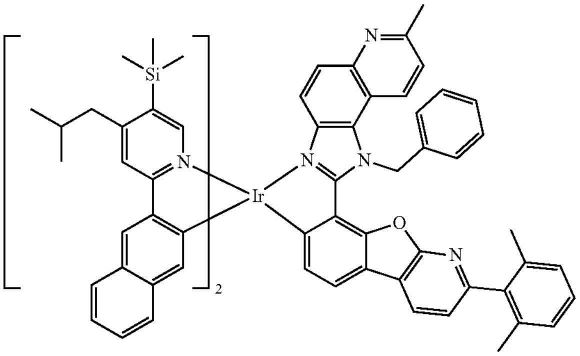
908
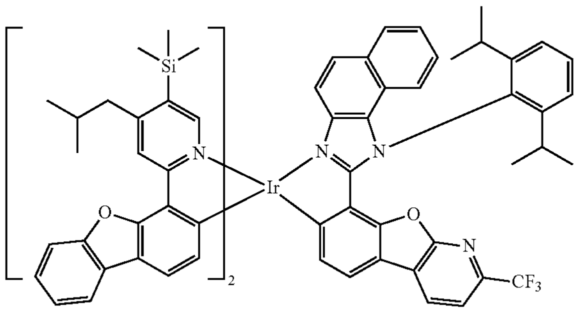
909
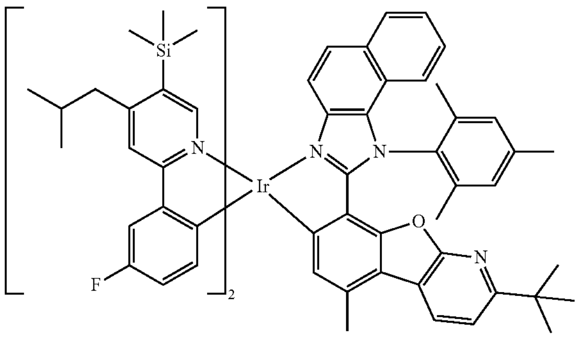
-continued
910
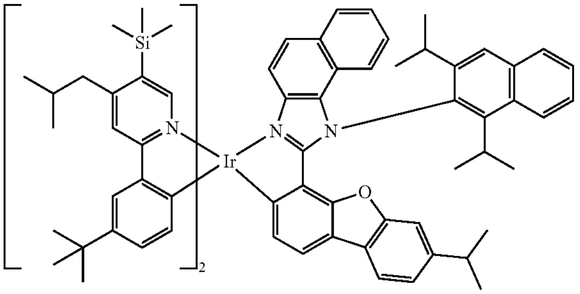
911
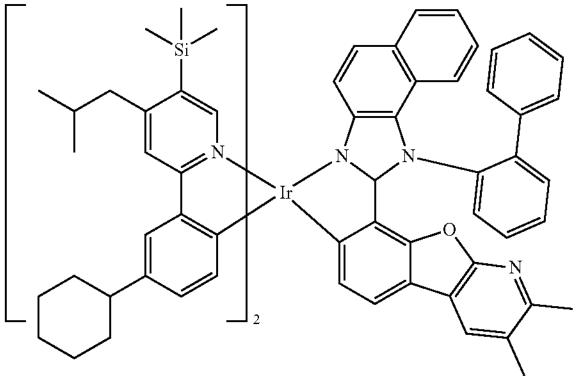
912
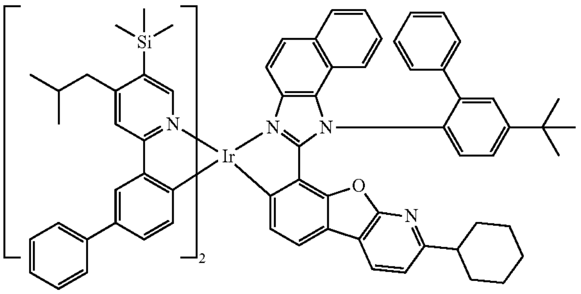
913
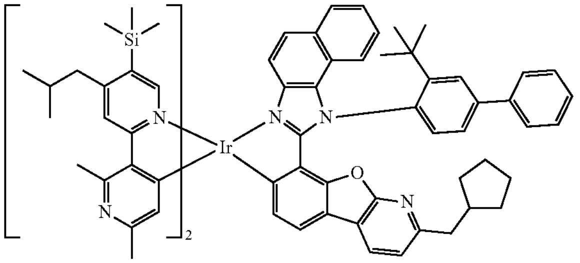

-continued
914
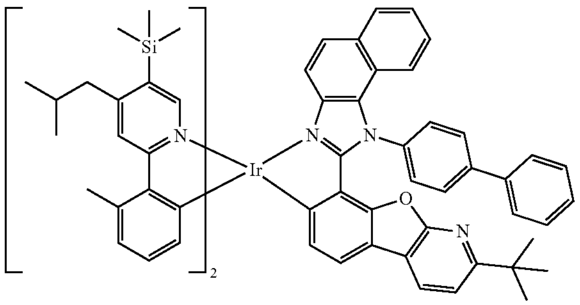
915
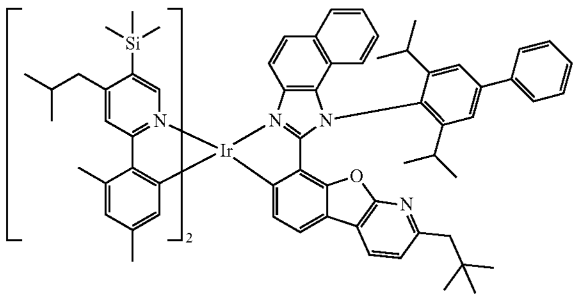
916
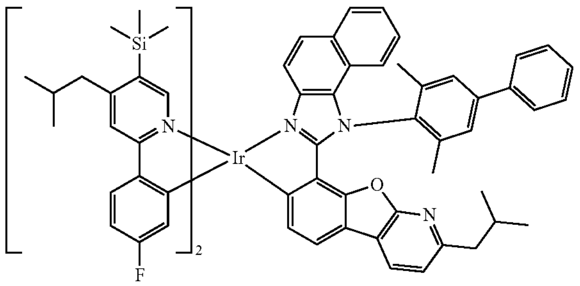
917
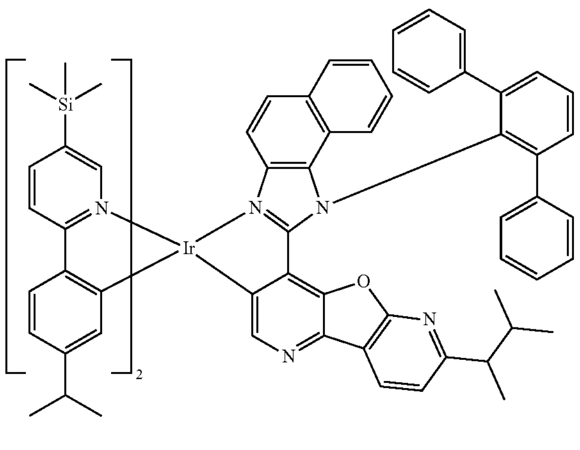
-continued
918
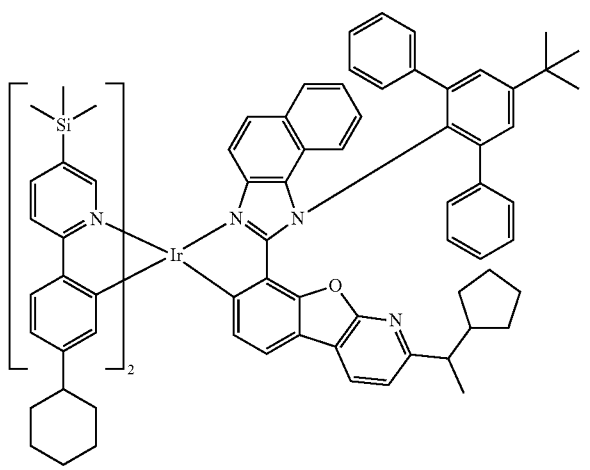
919
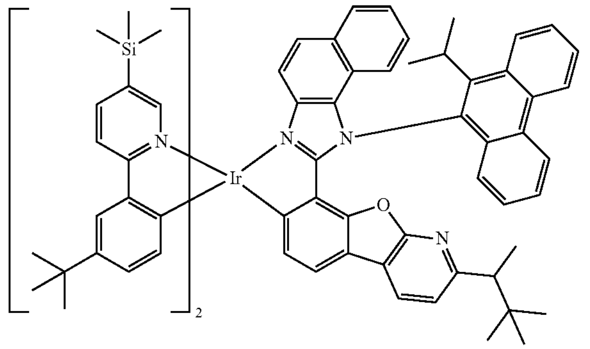
920
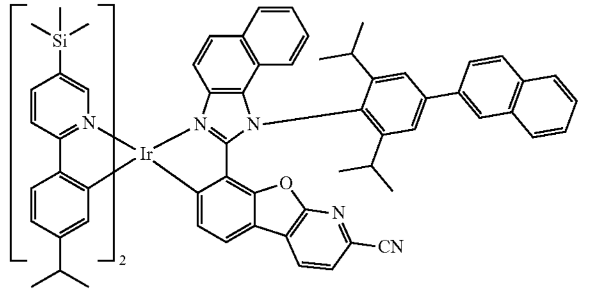
921
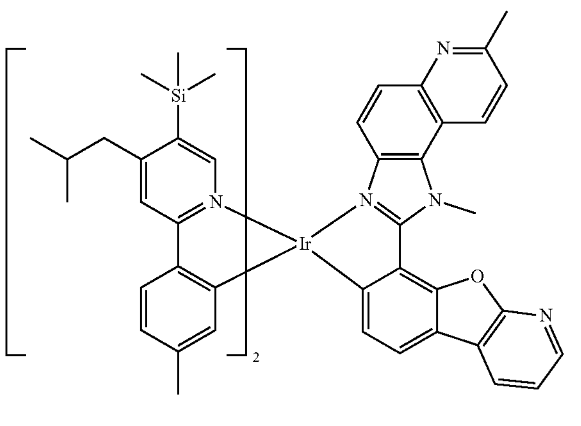

-continued
922
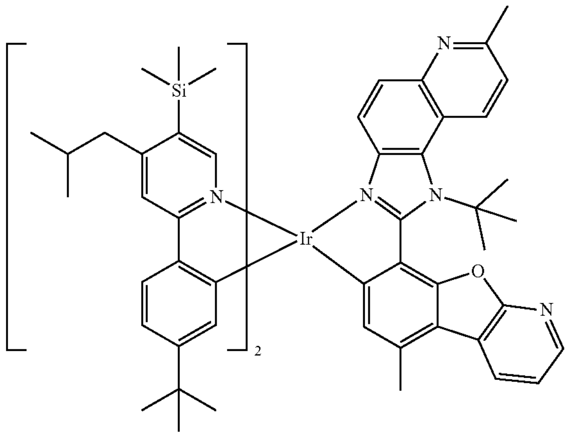
923
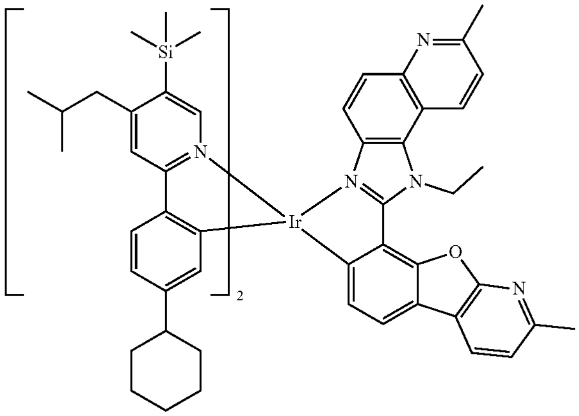
924
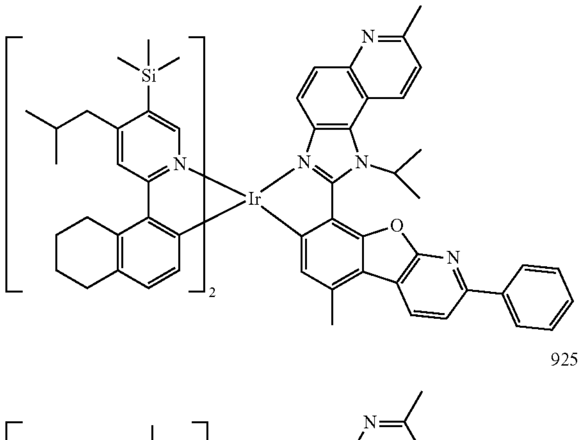
925
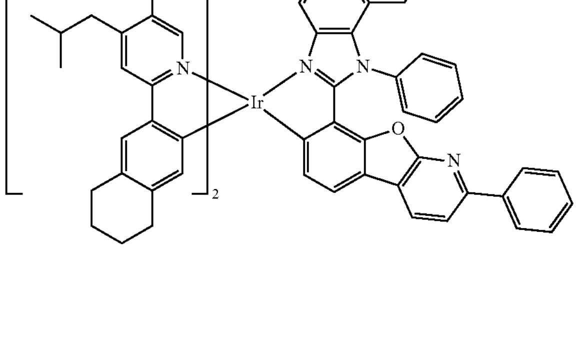
-continued
926
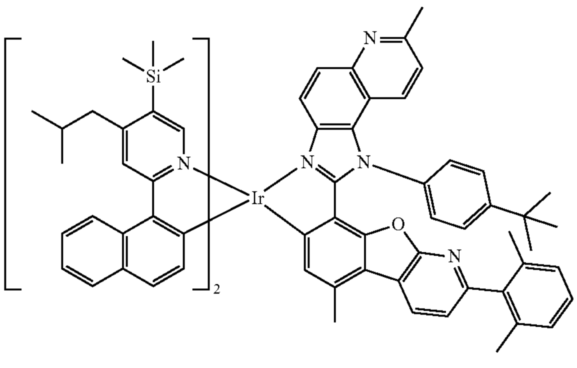
927
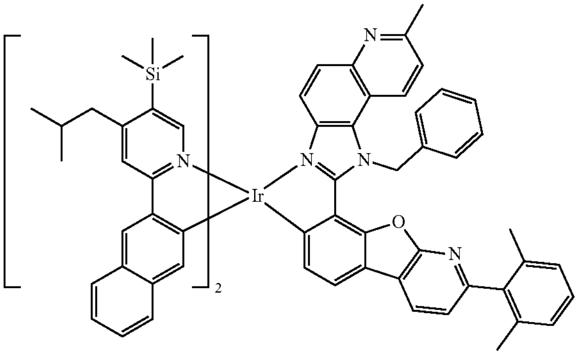
928
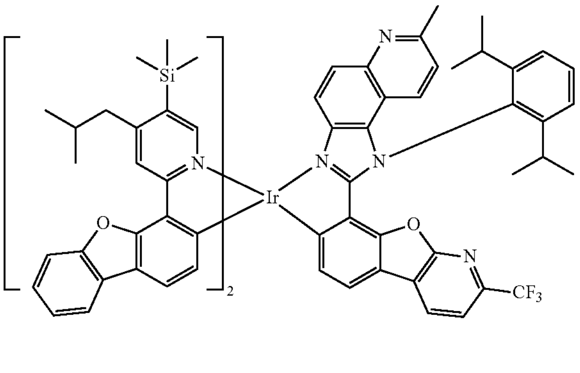
929
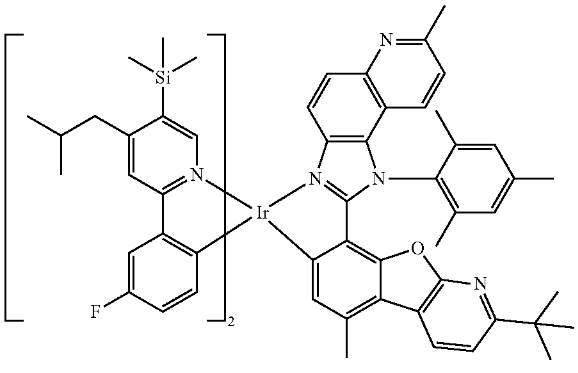

-continued
930
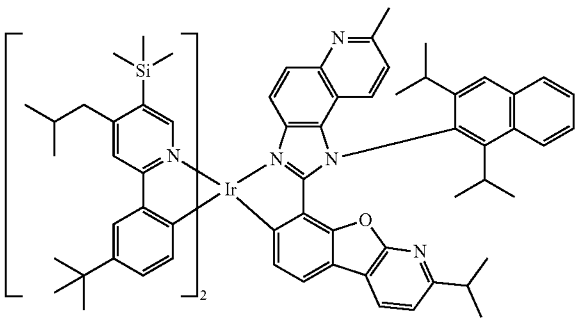
931
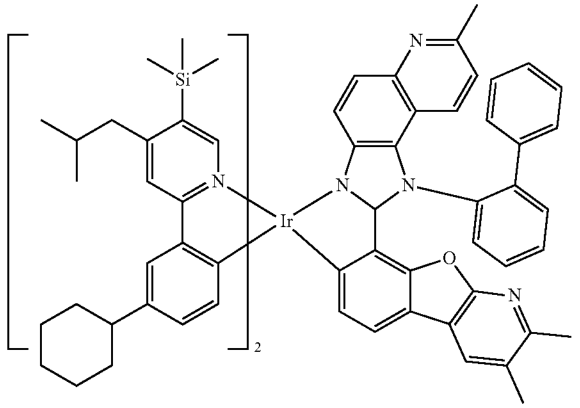
932
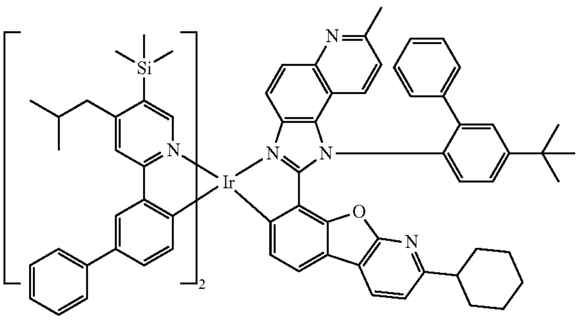
933
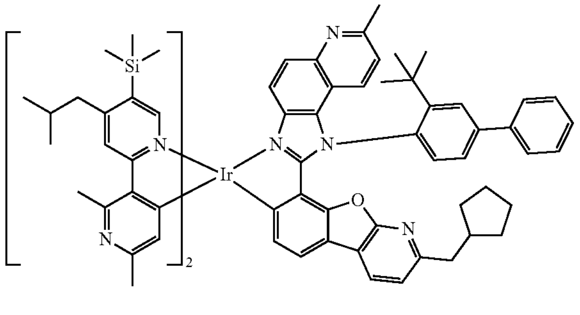
-continued
934
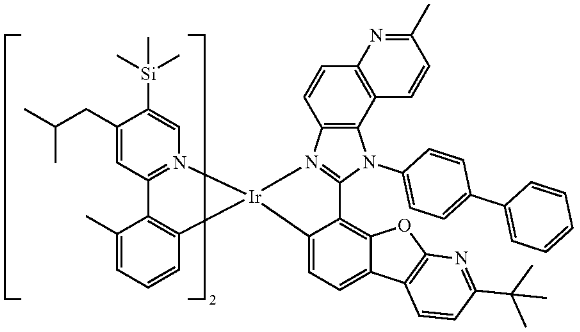
935
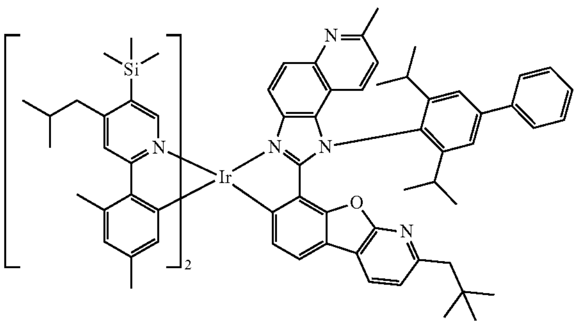
936
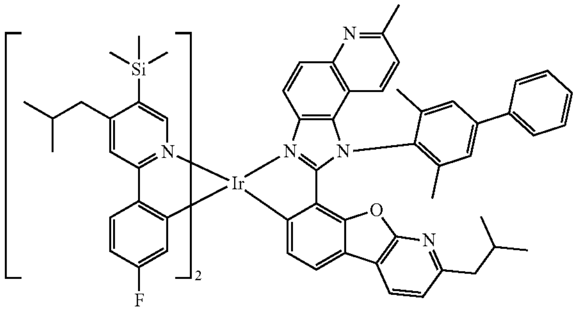
937
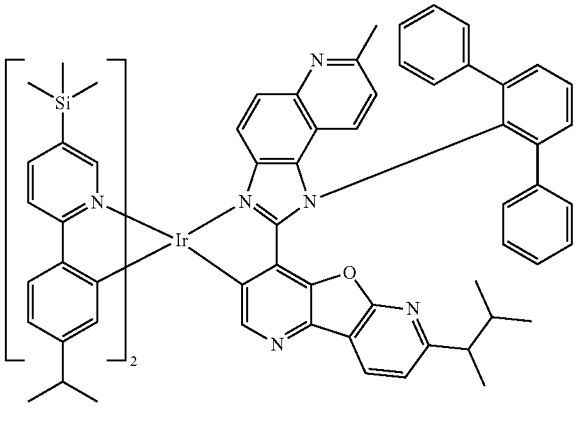

-continued
938
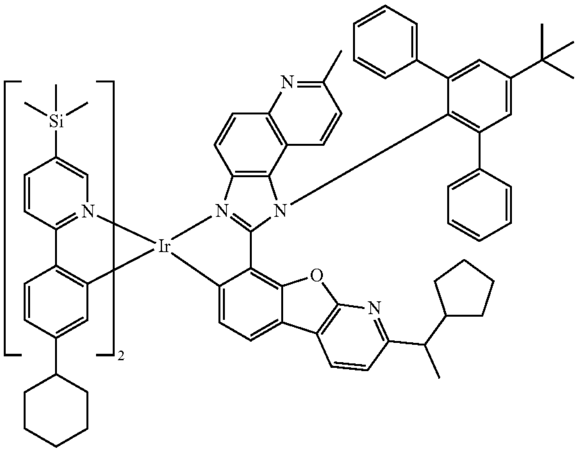
939
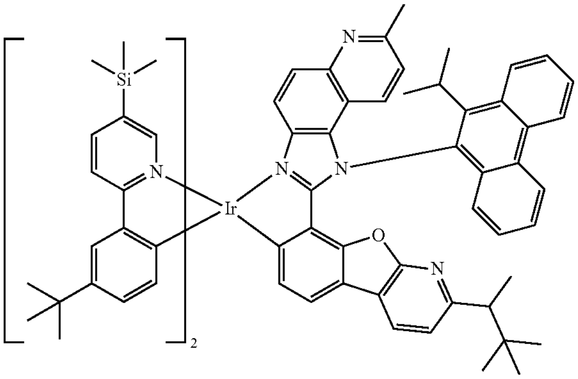
940
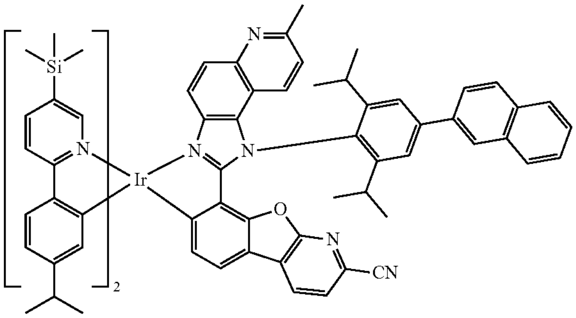
941
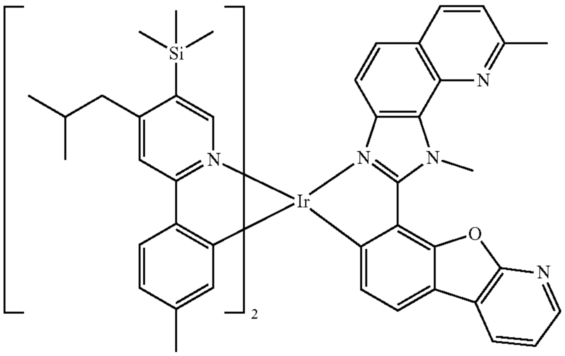
-continued
942
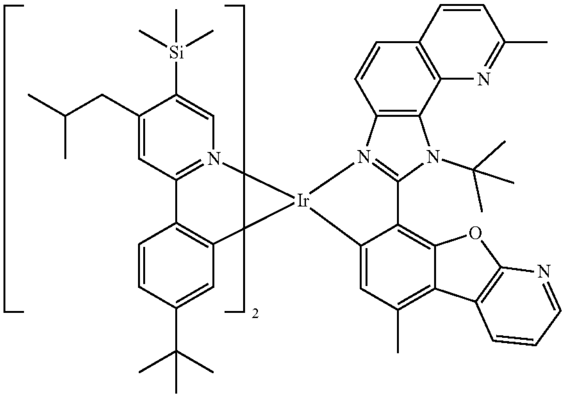
943
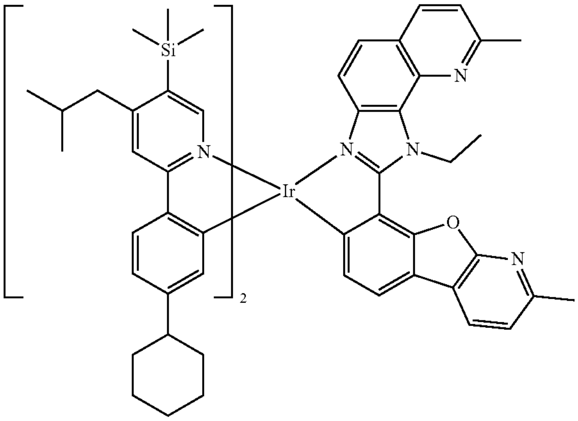
944
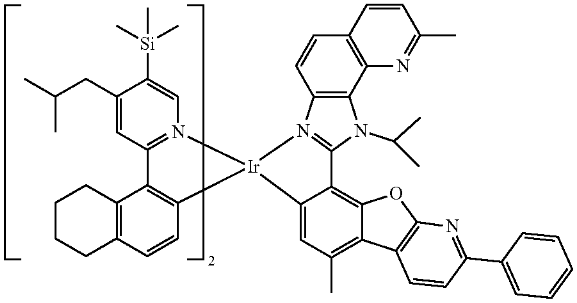
945
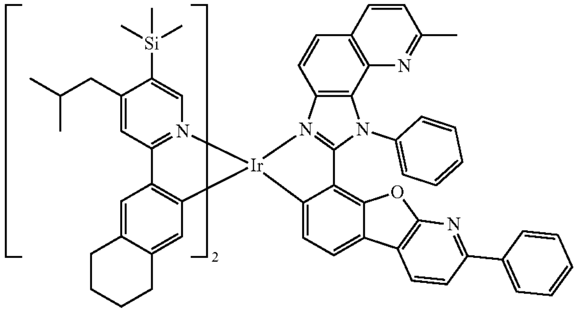

-continued
946
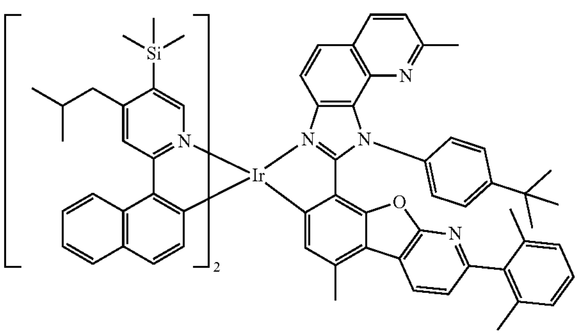
947
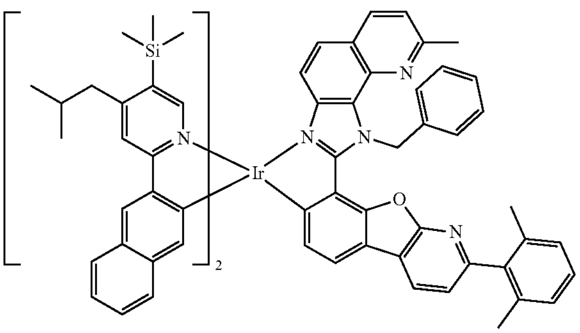
948
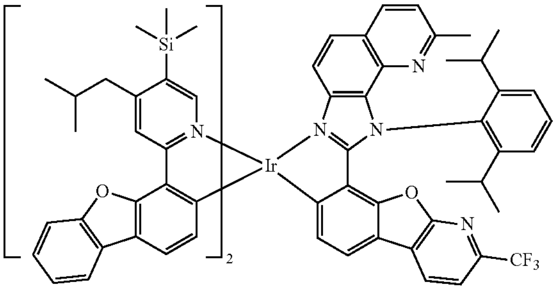
949
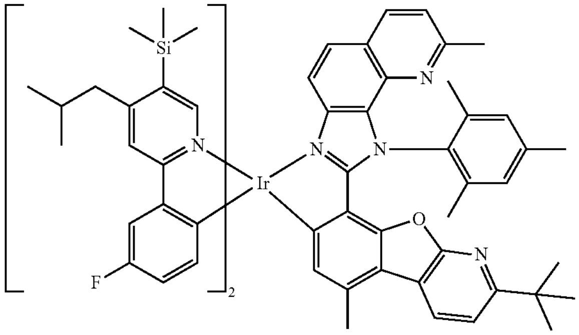
-continued
950
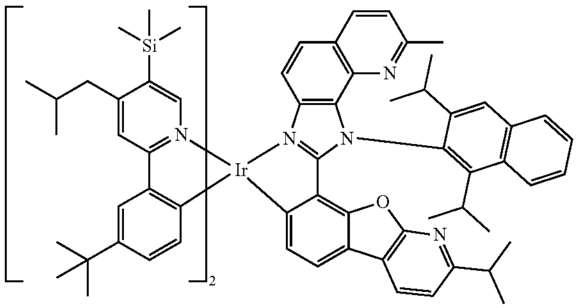
951
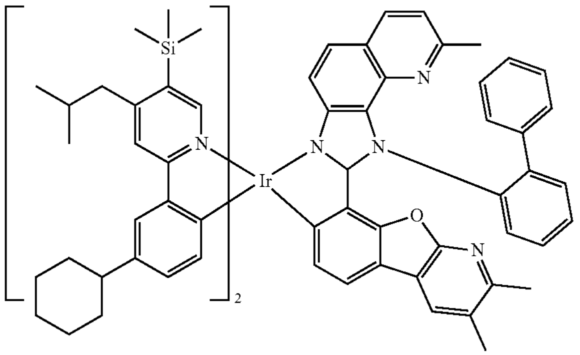
952
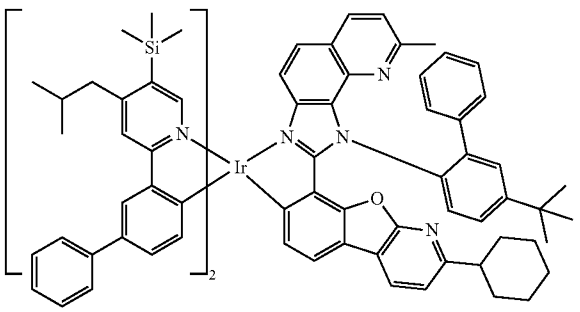
953
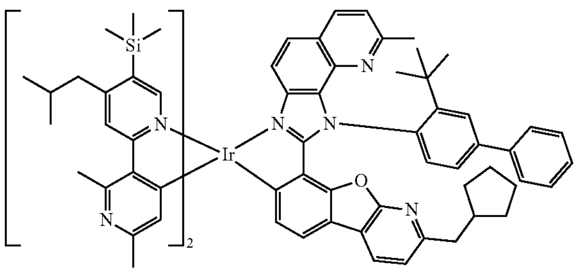

954
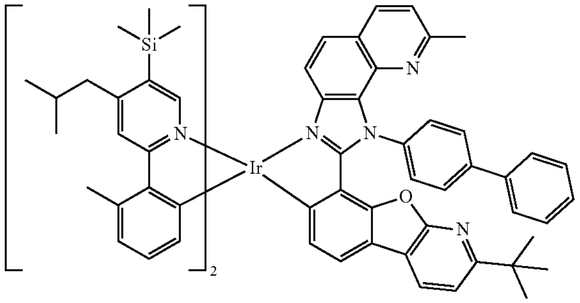
955
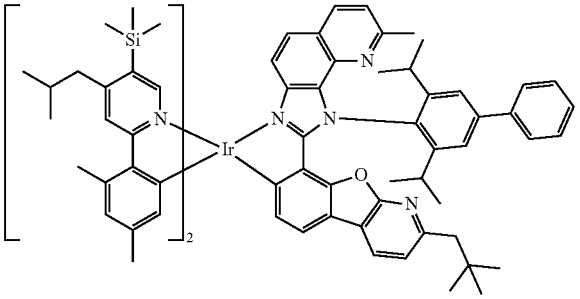
956
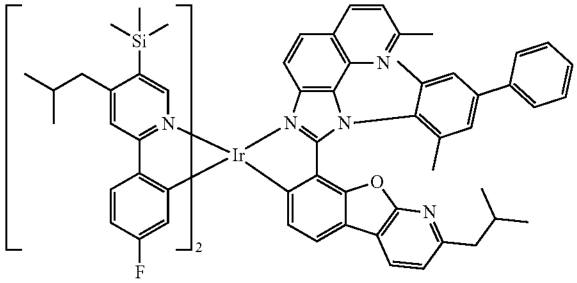
957
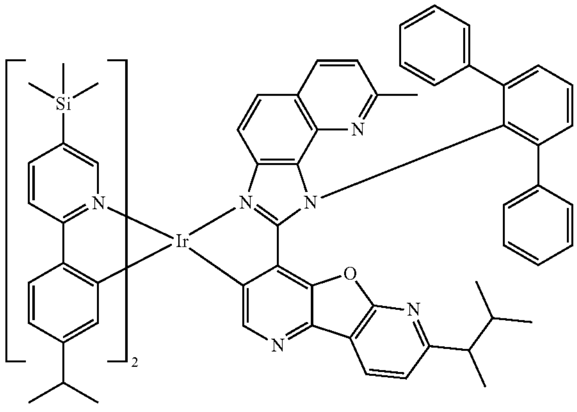
958
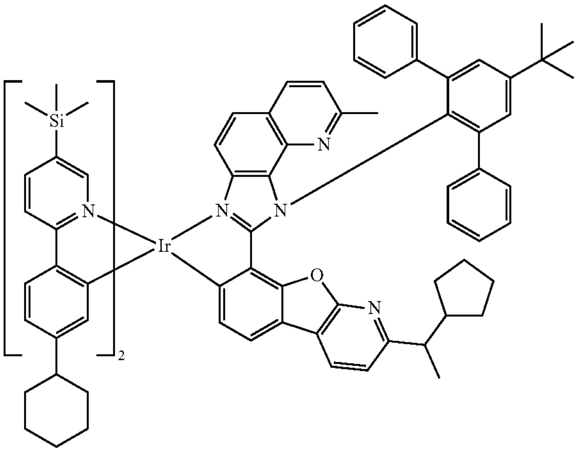
959
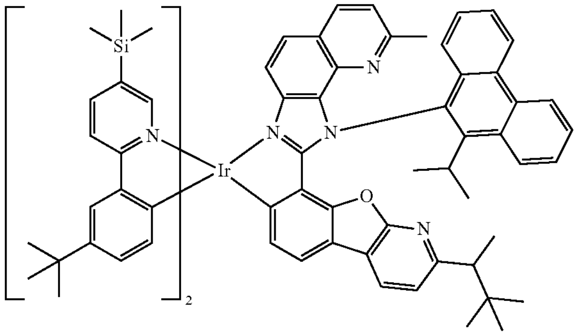
960
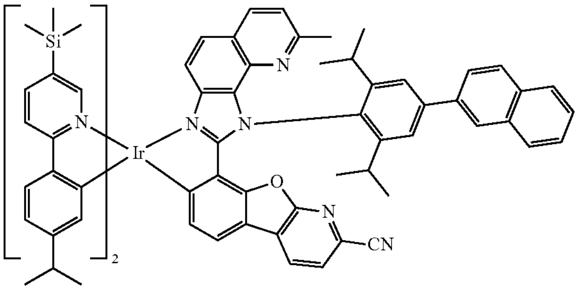
961
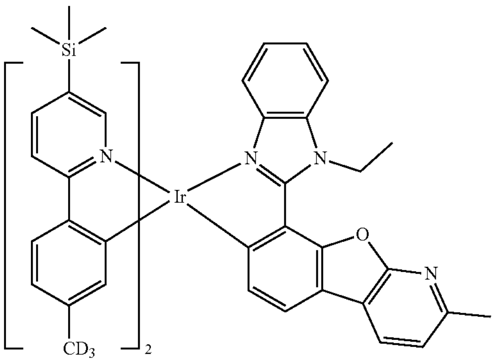

-continued
962
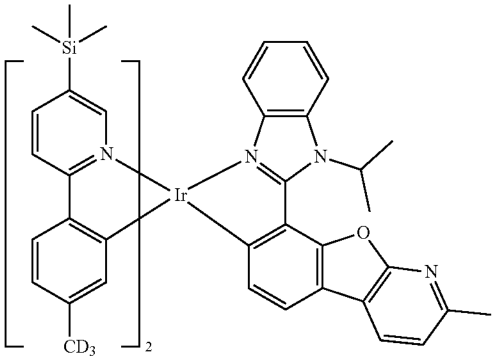
963
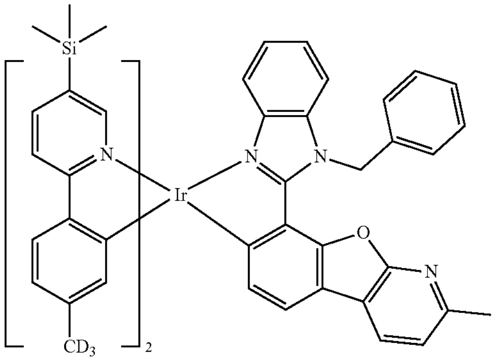
964
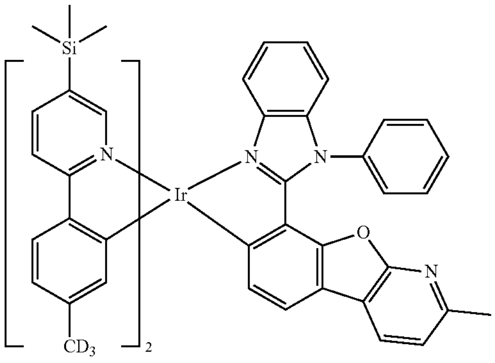
965
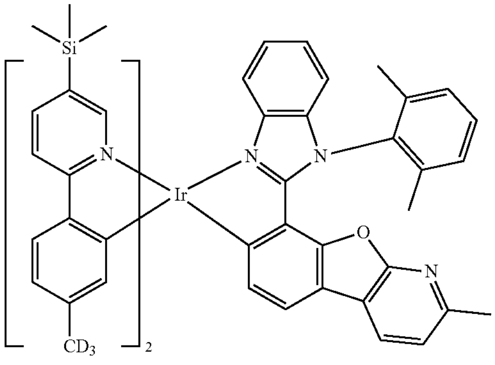
-continued
966
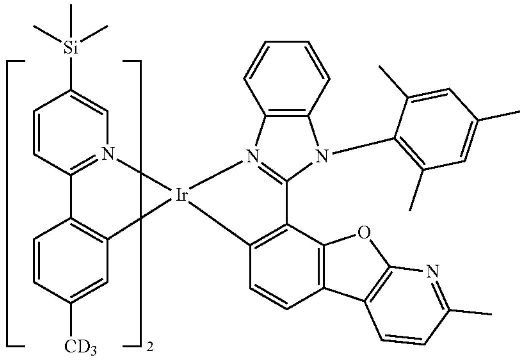
967
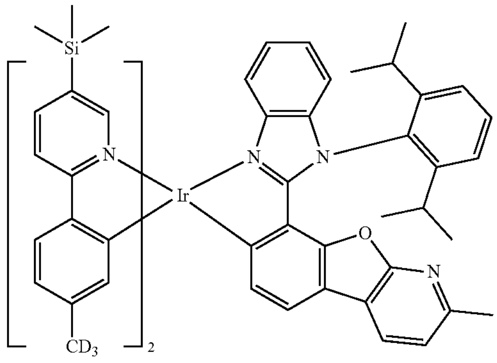
968
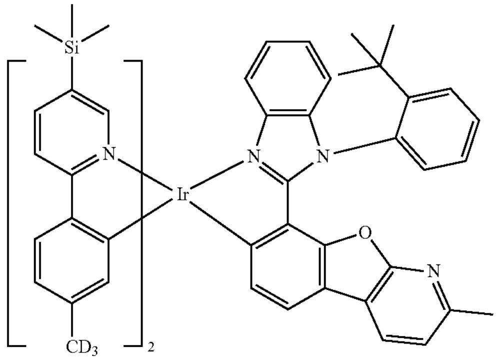
969
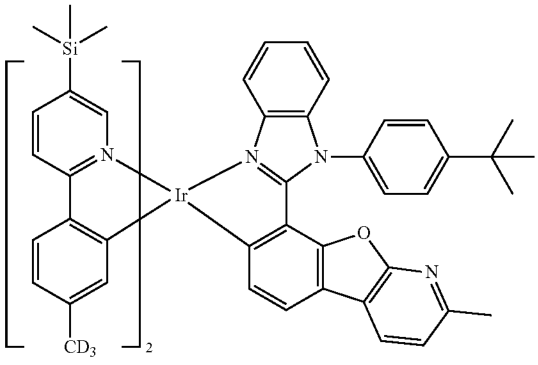

-continued
970
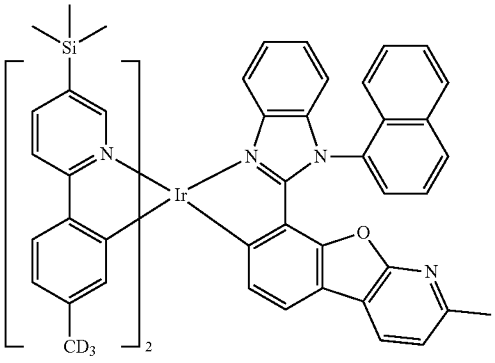
971
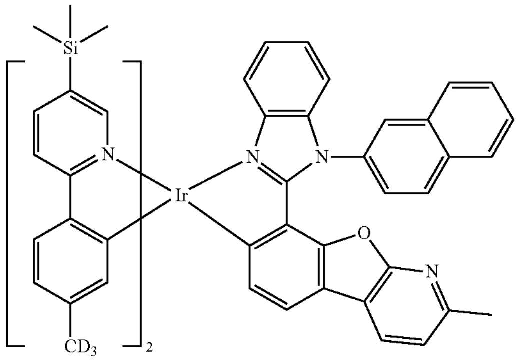
972
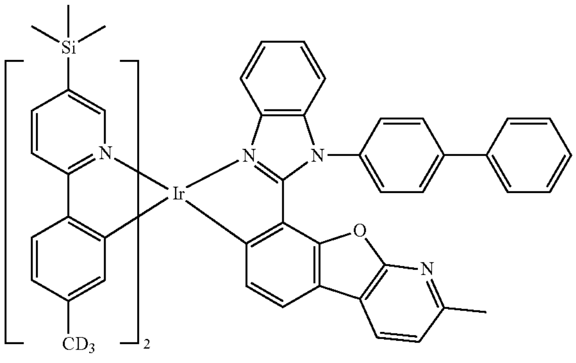
973
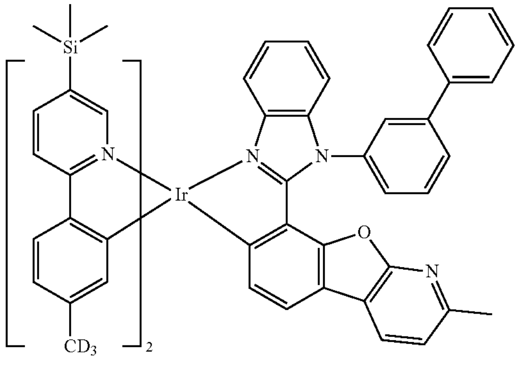
-continued
974
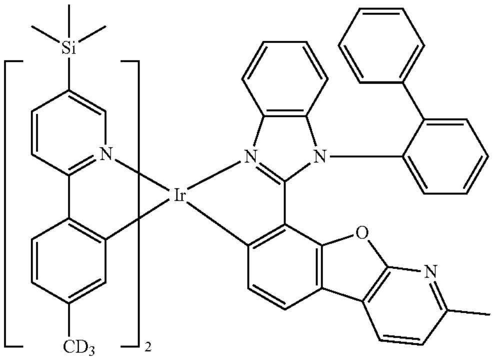
975
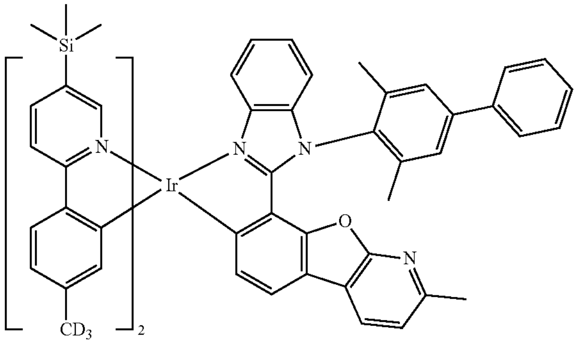
976
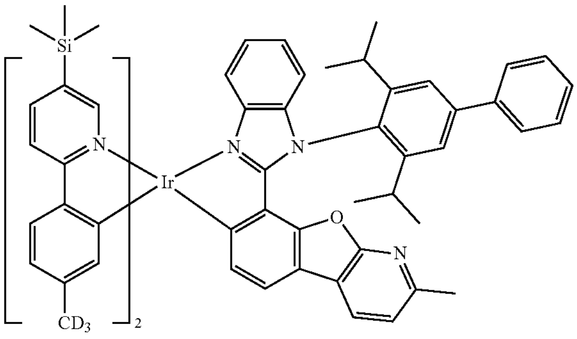
977
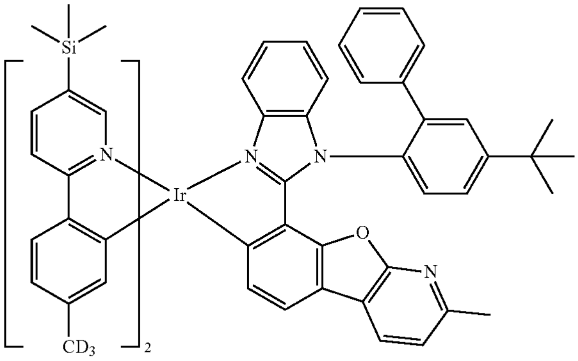

-continued
978
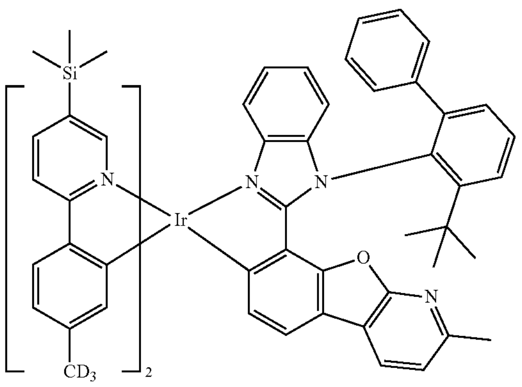
979
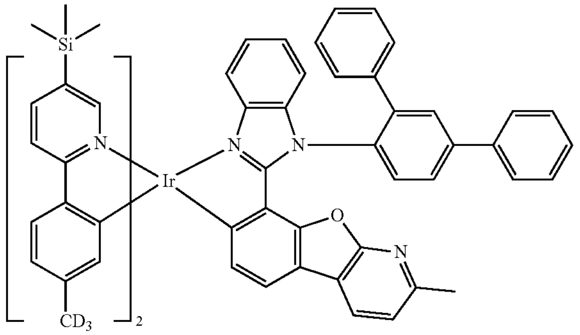
980
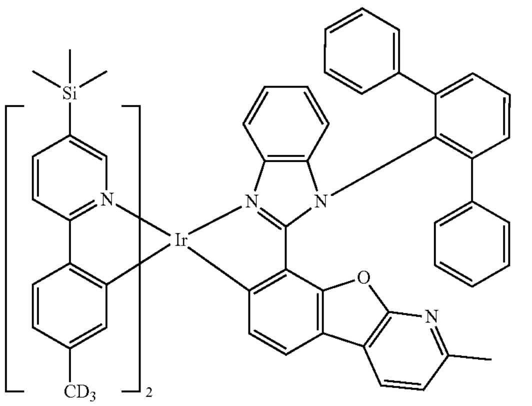
981
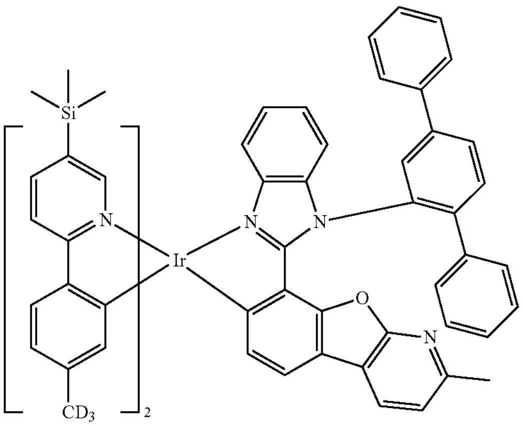
-continued
982
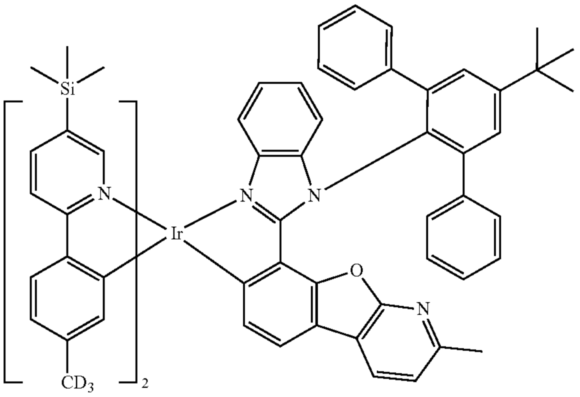
983
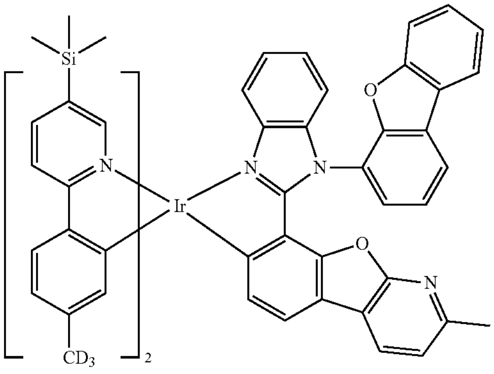
984
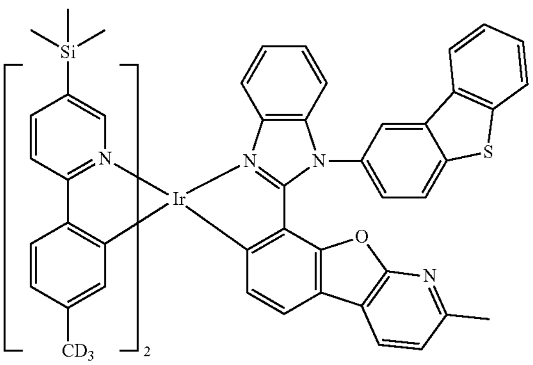
985
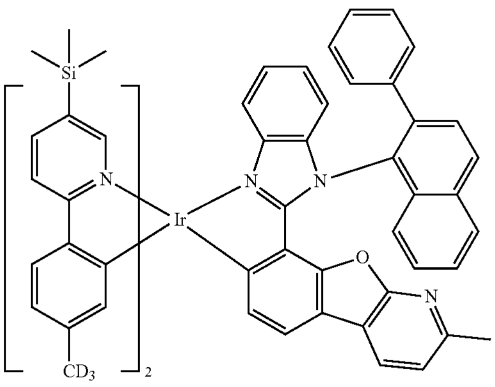

-continued
986
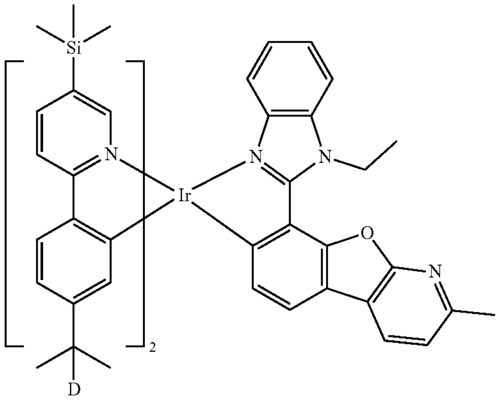
987
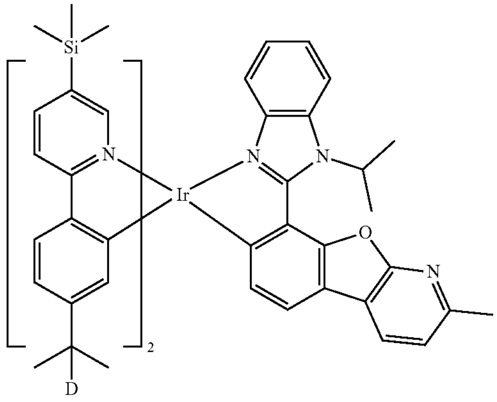
988
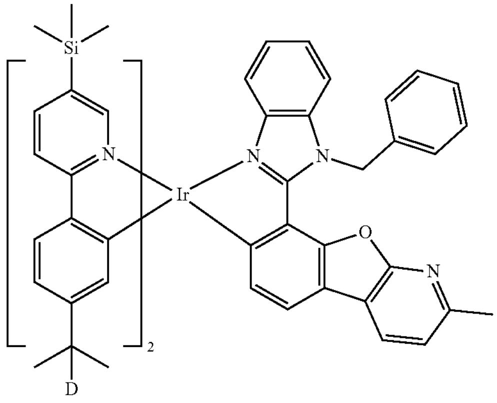
-continued
989
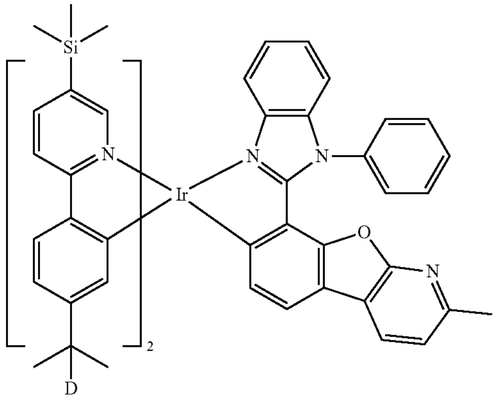
990
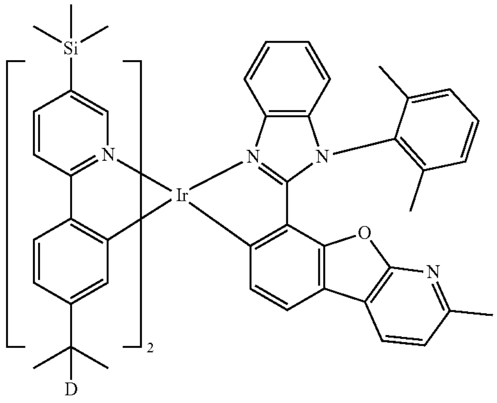
991
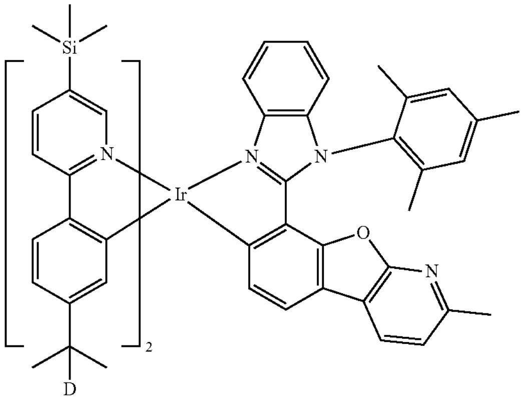

-continued
992
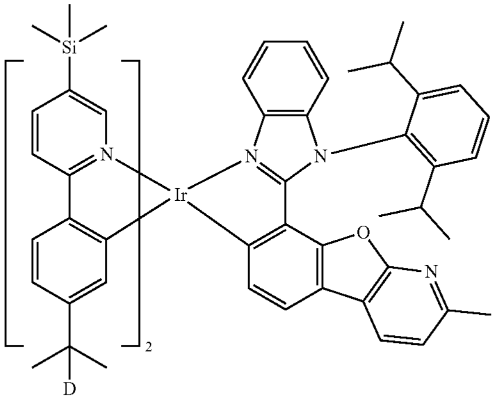
993
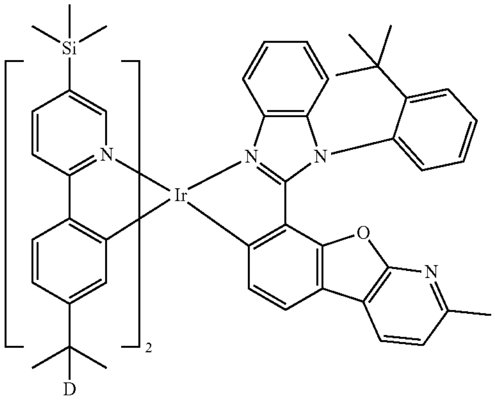
994
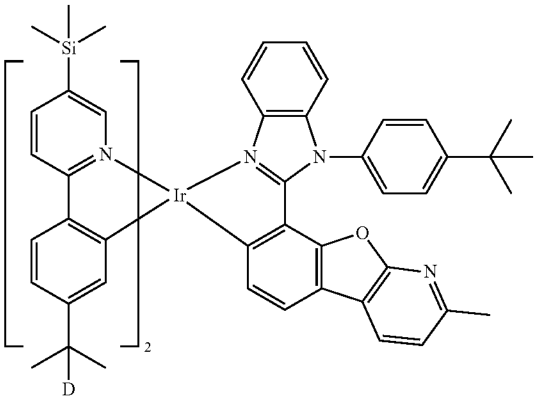
-continued
995
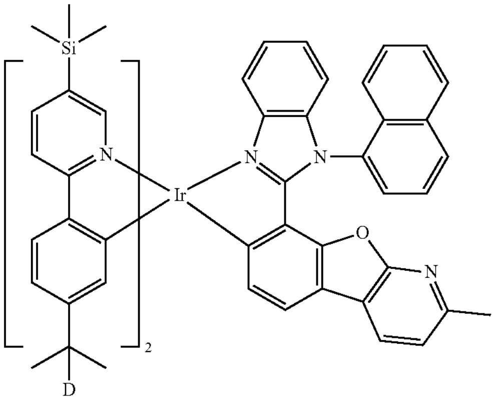
996
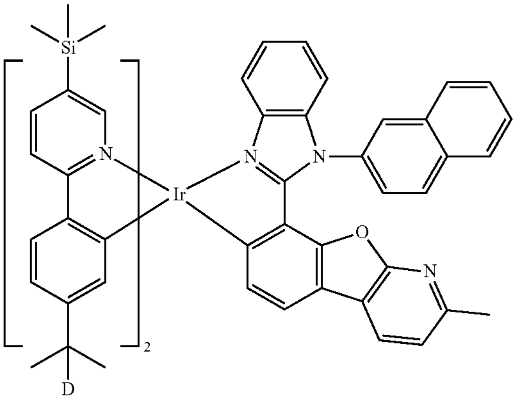
997
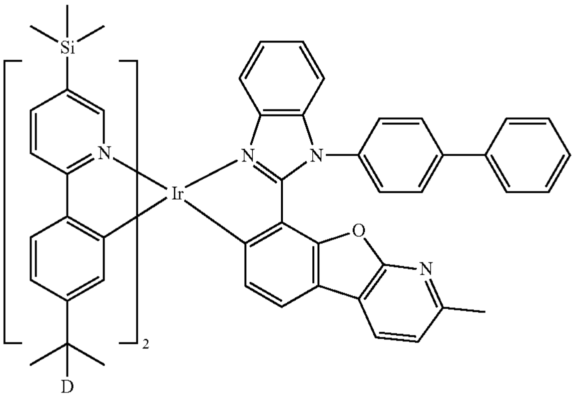

-continued
998
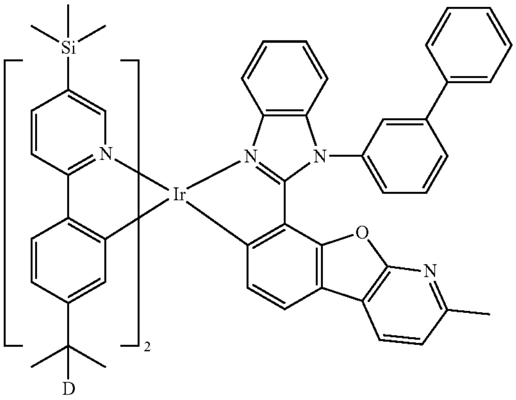
999
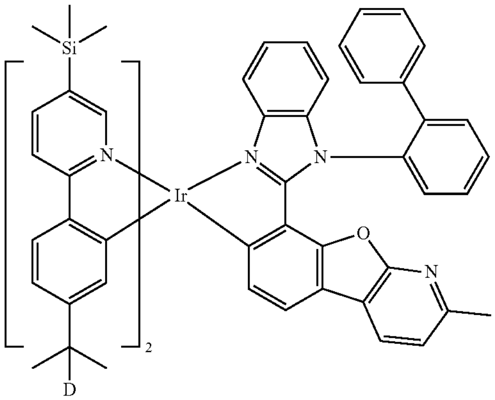
1000
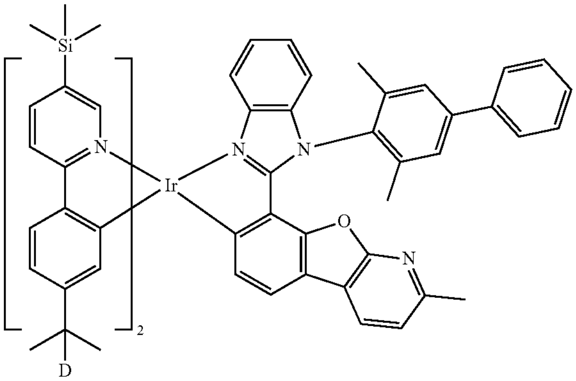
1001
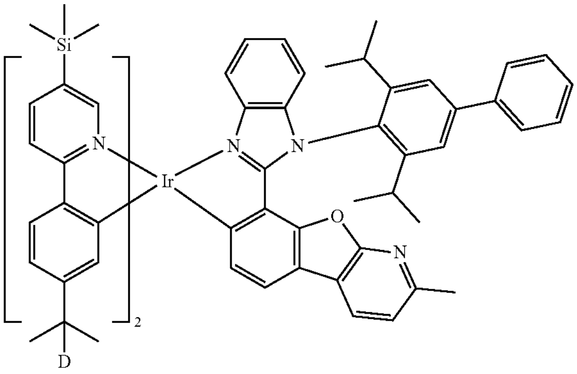
-continued
1002
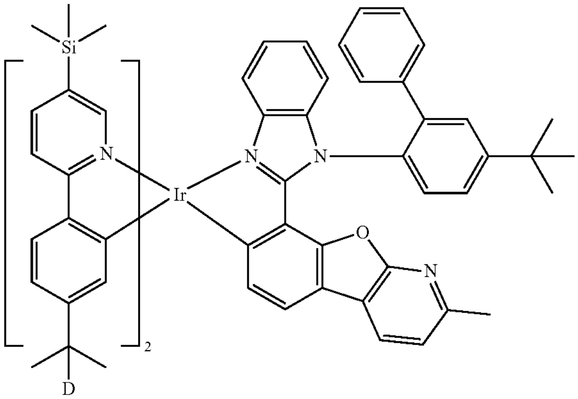
1003
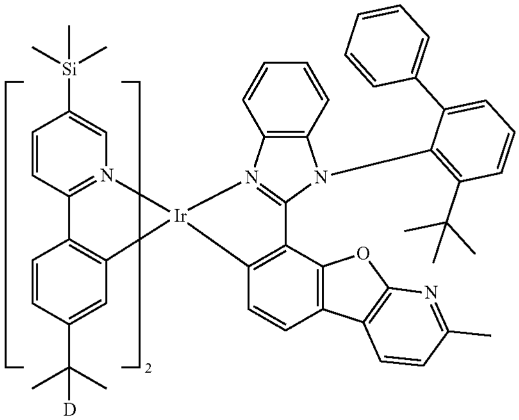
1004
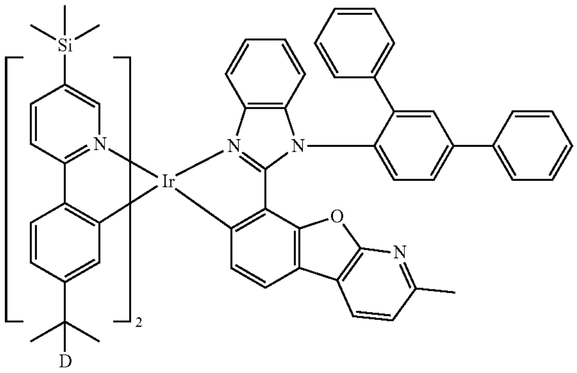

-continued
1005
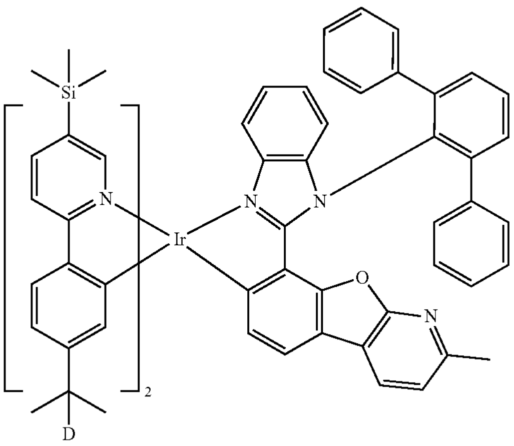
1006
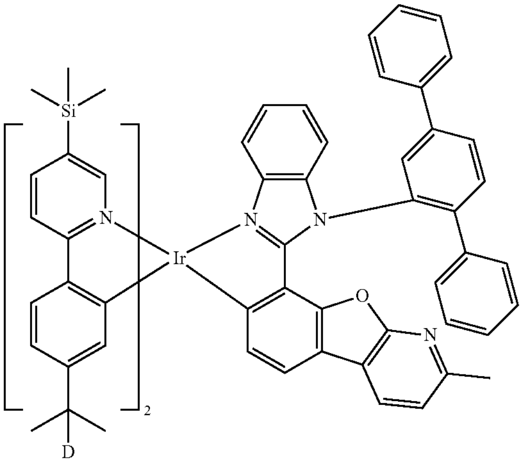
1007
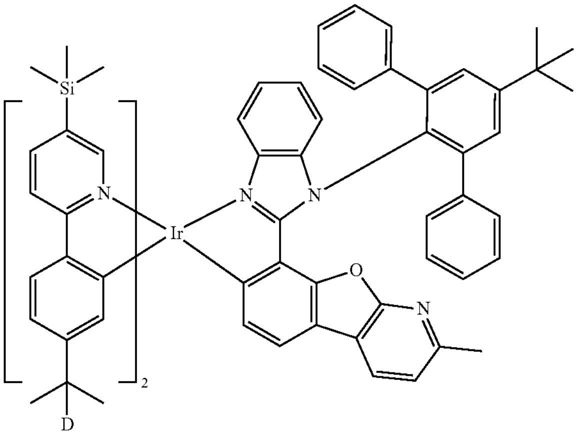
-continued
1008
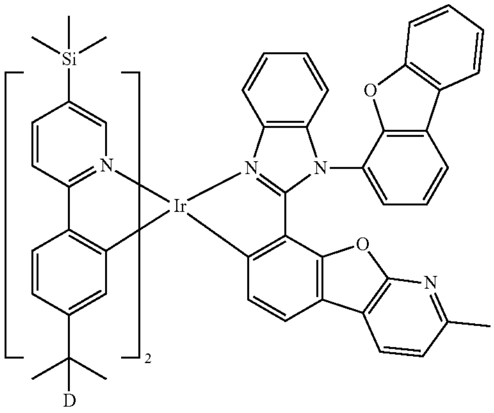
1009
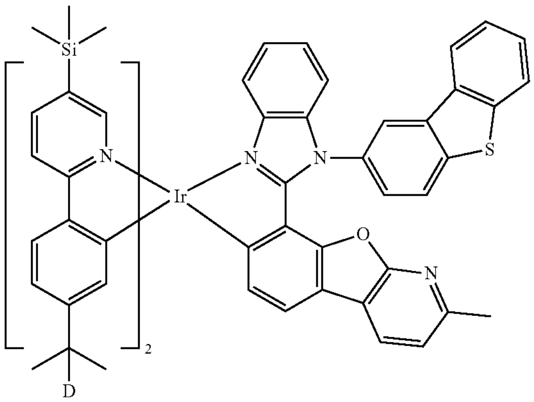
1010
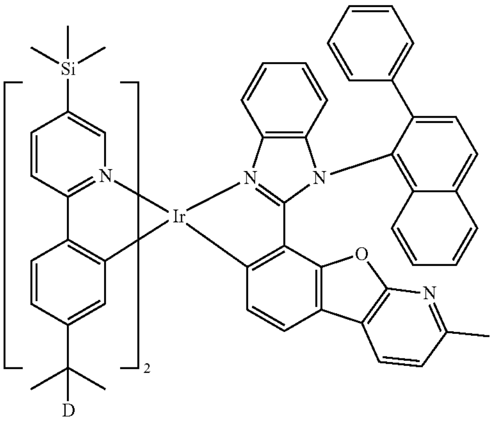

-continued
1011
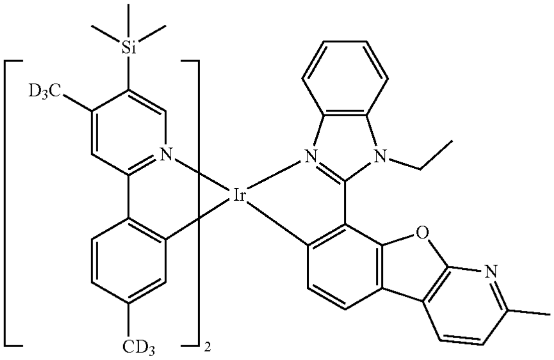
1012
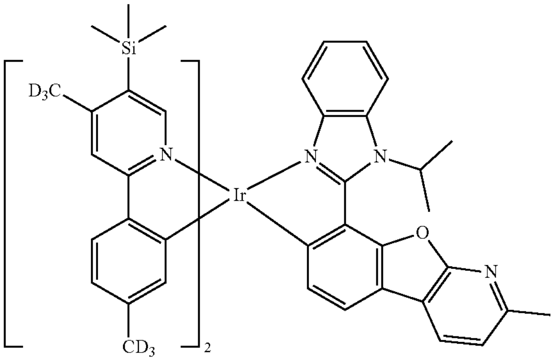
1013
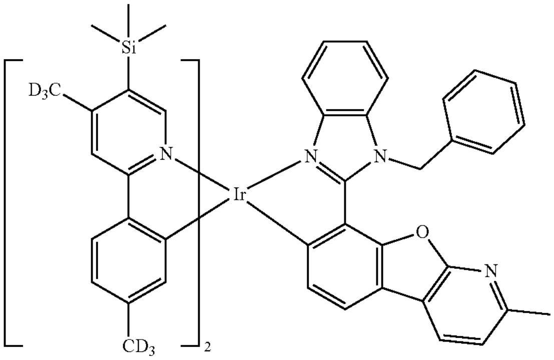
1014
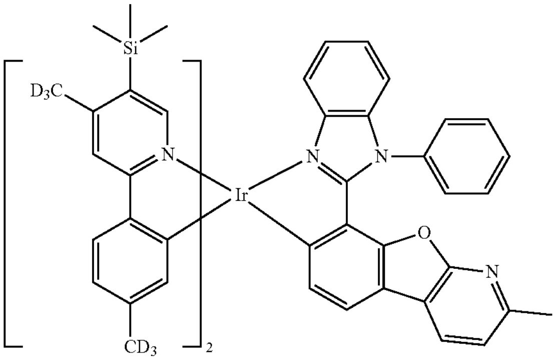
-continued
1015
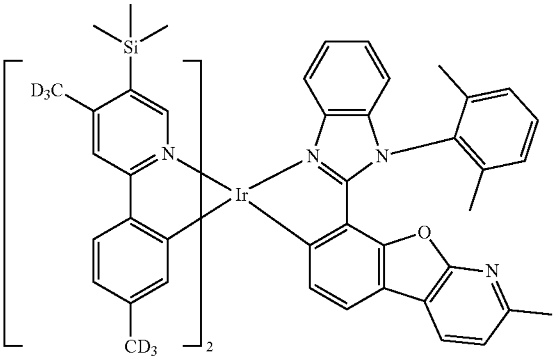
1016
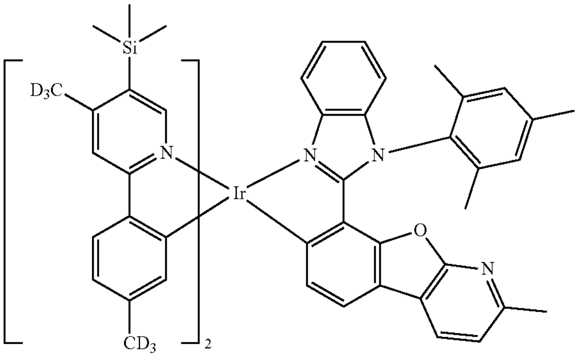
1017
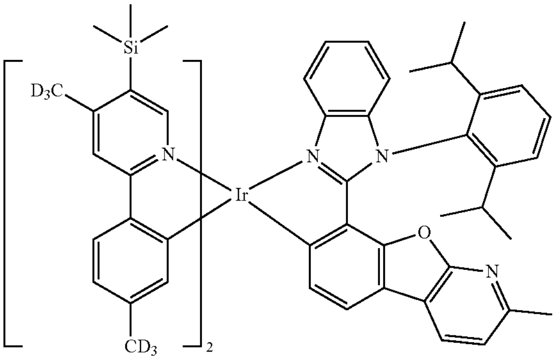
1018
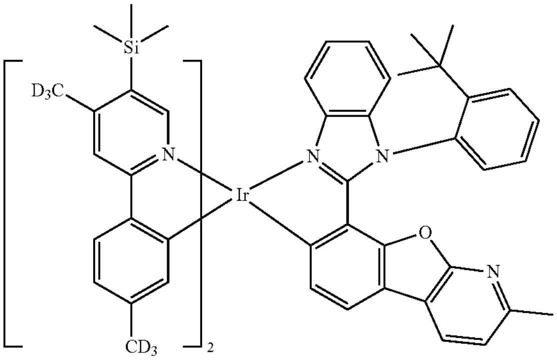

-continued
1019
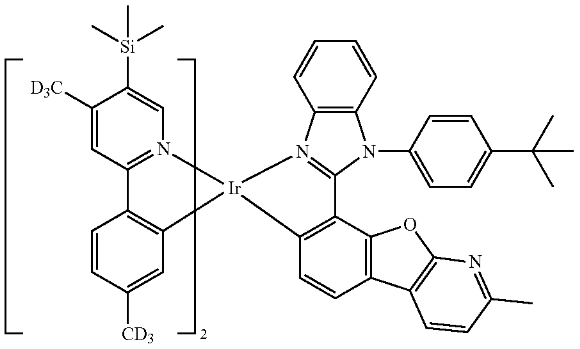
1020
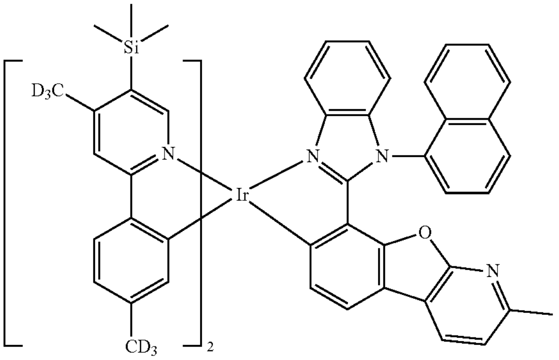
1021
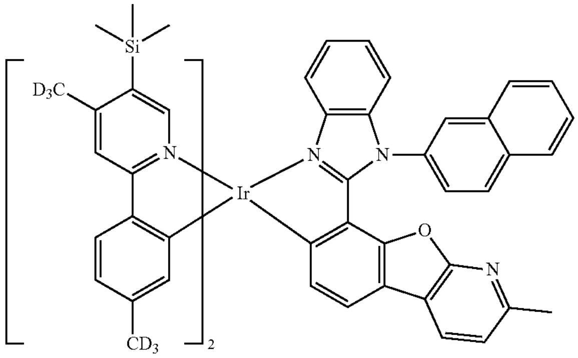
1022
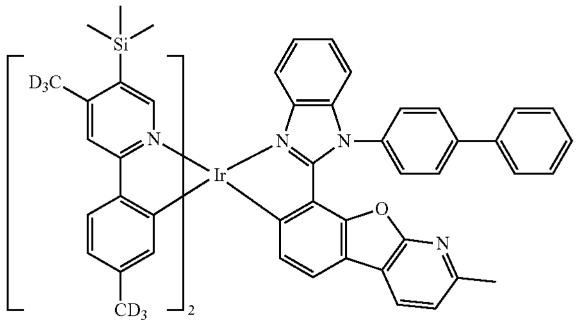
-continued
1023
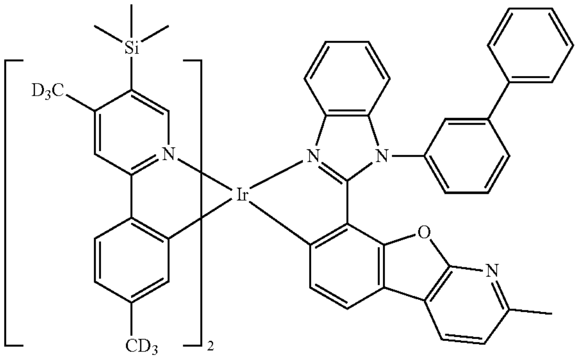
1024
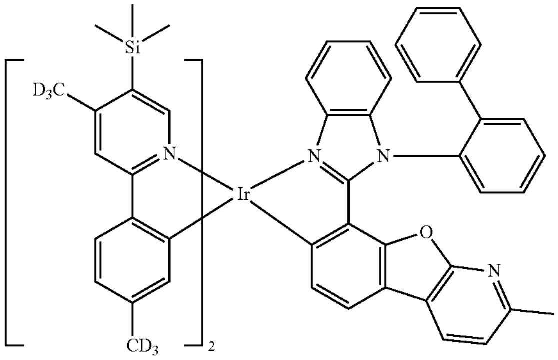
1025
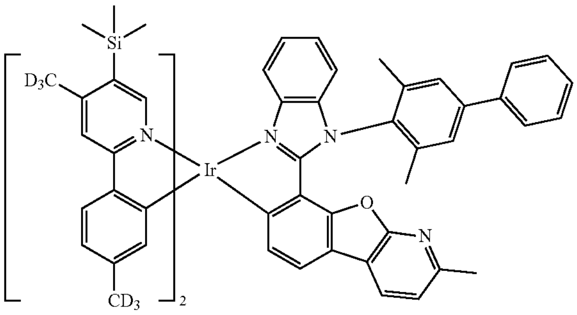
1026
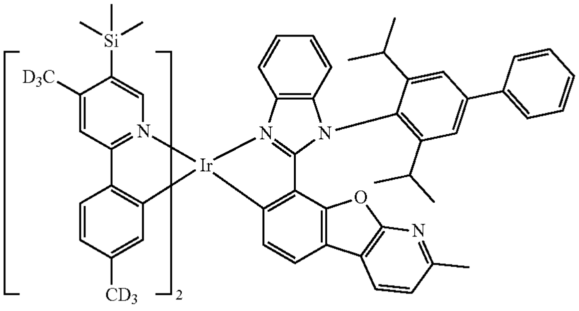

-continued
1027
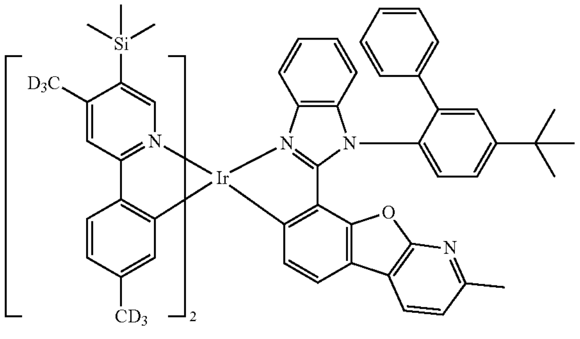
1028
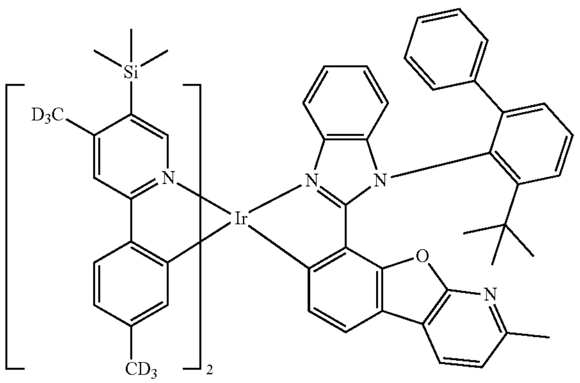
1029
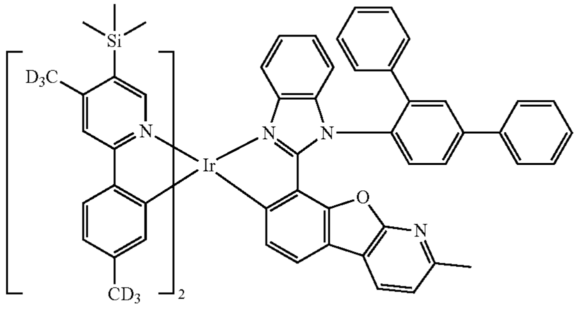
1030
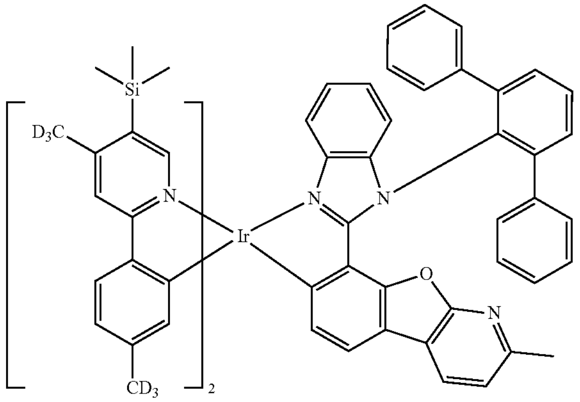
-continued
1031
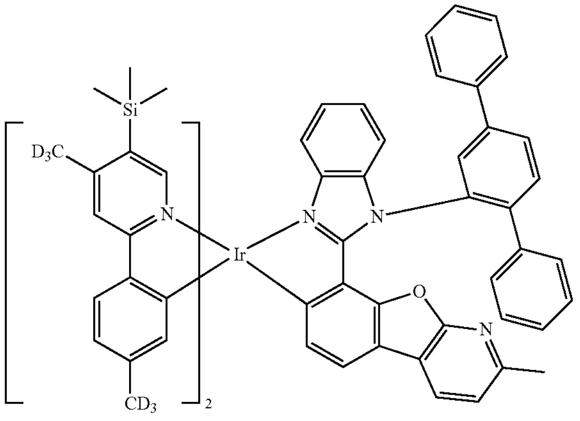
1032
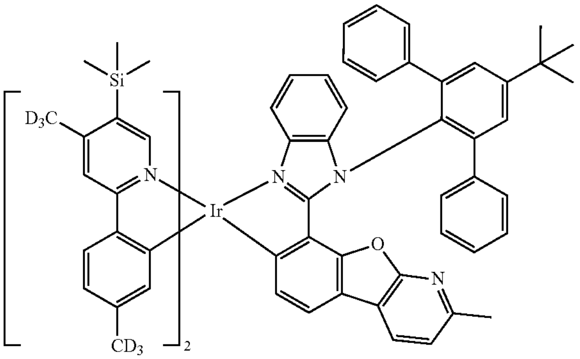
1033
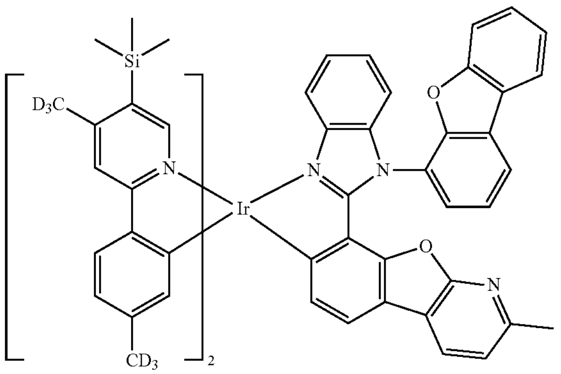
1034
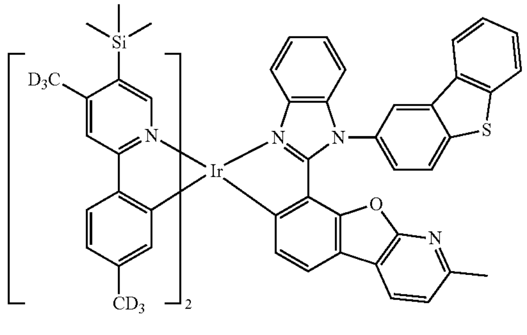

-continued
1035
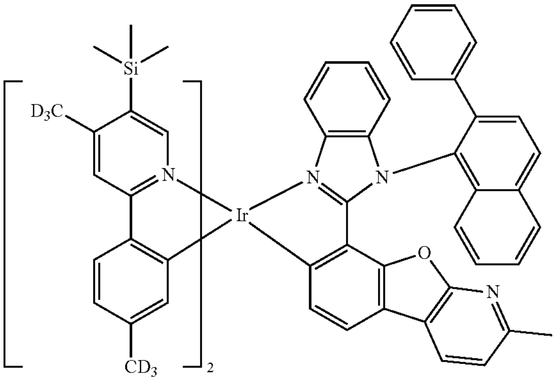
1036
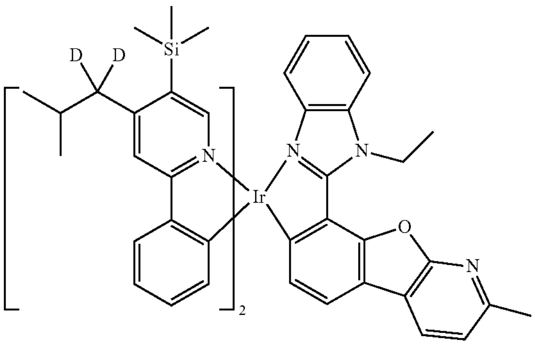
1037
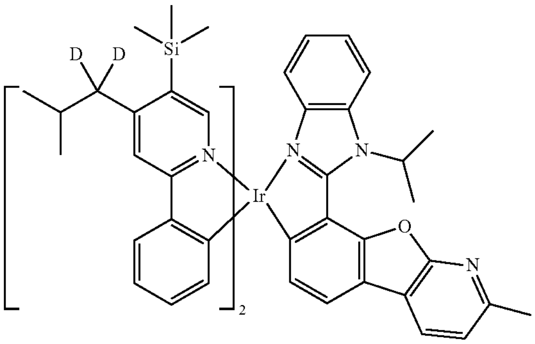
1038
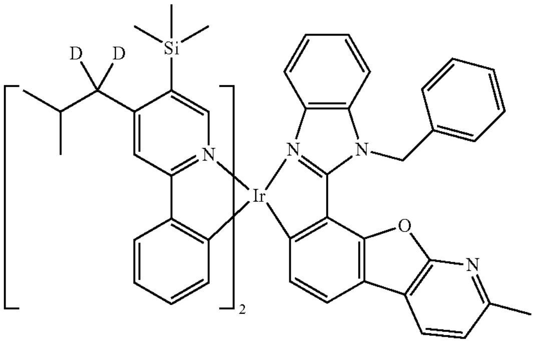
-continued
1039
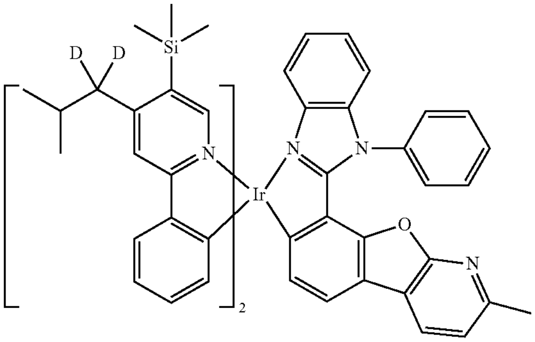
1040
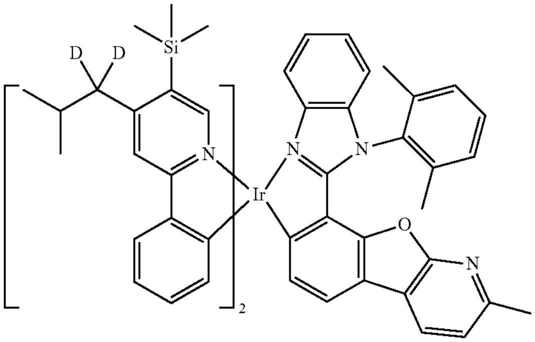
1041
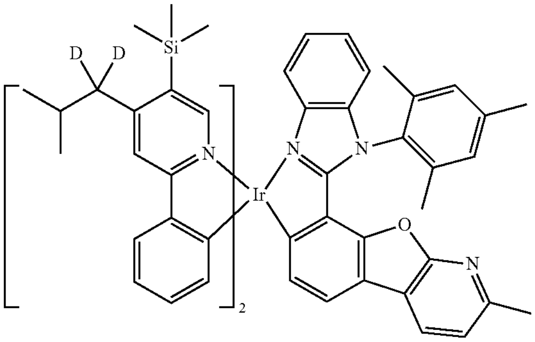
1042
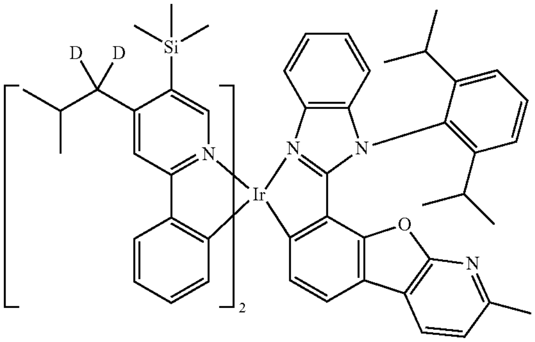

-continued
1043
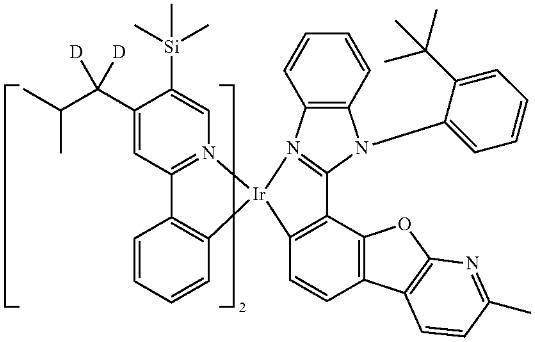
1044
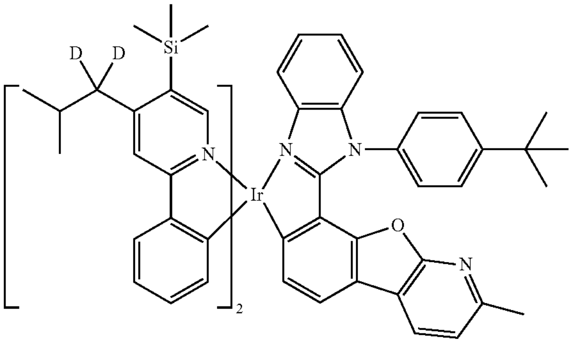
1045
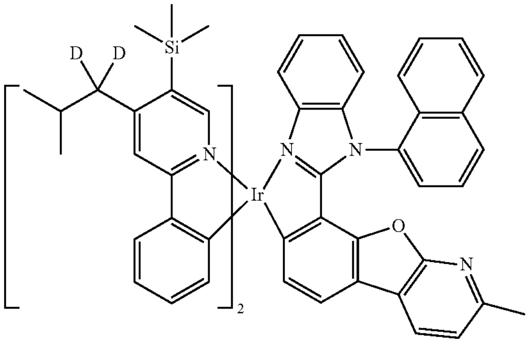
1046
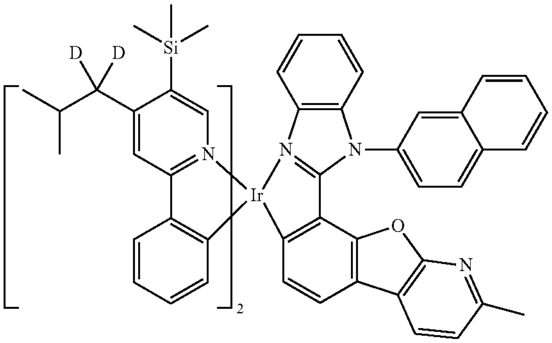
-continued
1047
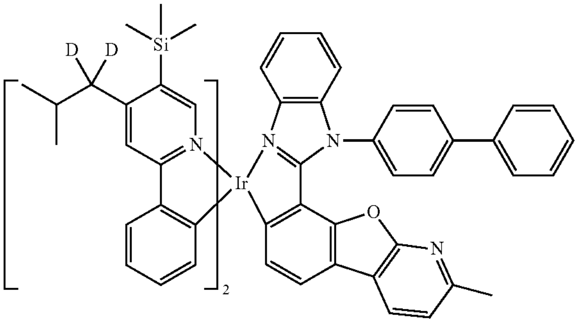
1048
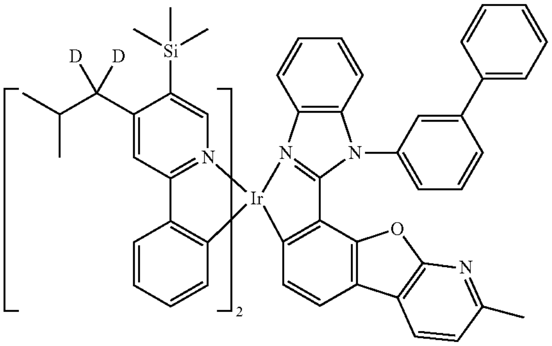
1049
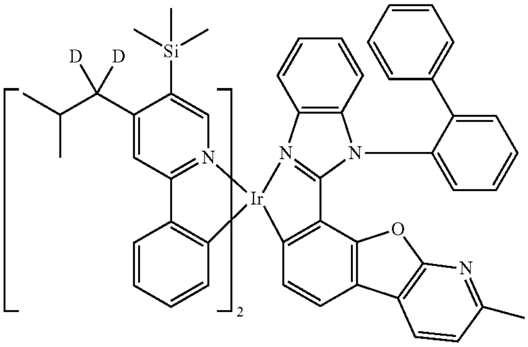
1050
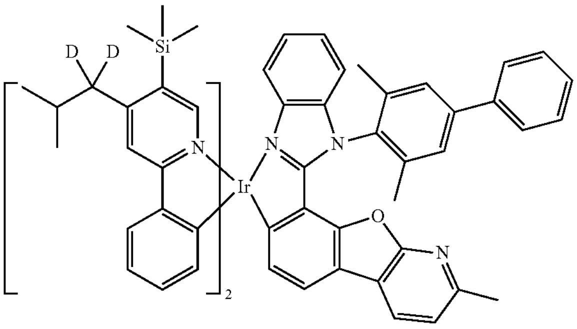

-continued
1051
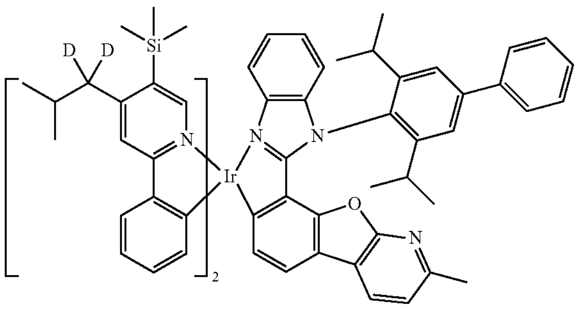
1052
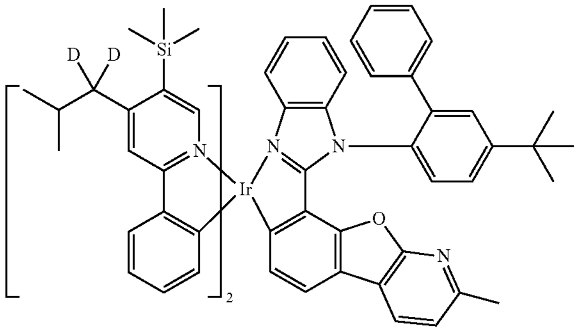
1053
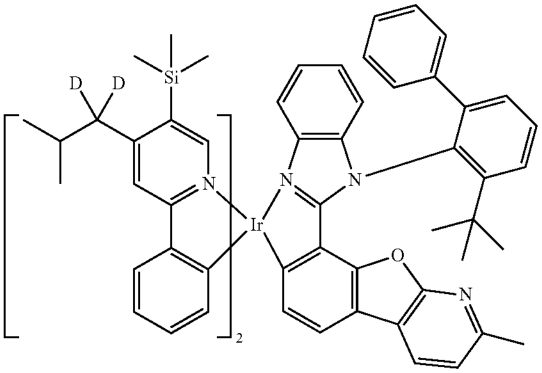
1054
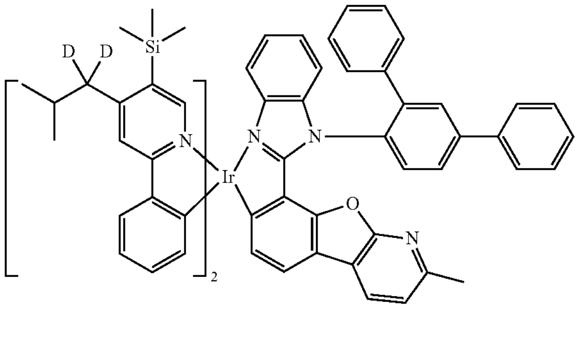
-continued
1055
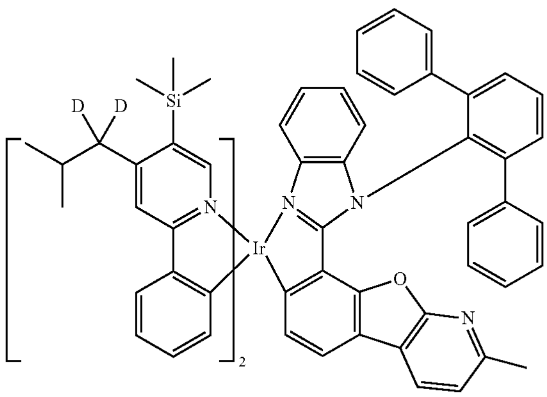
1056
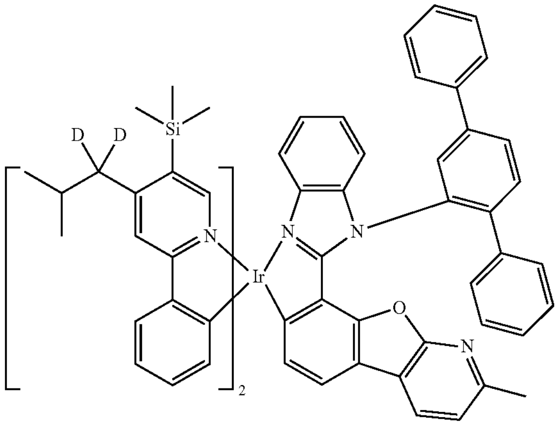
1057
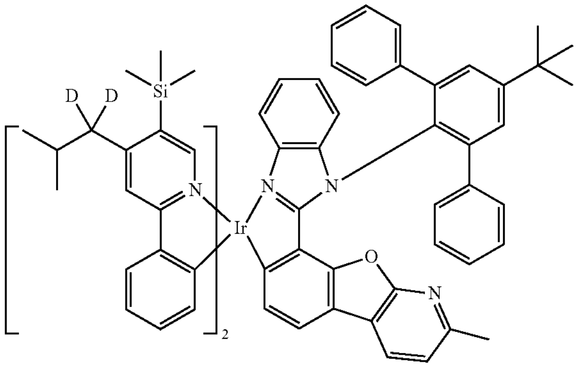
1058
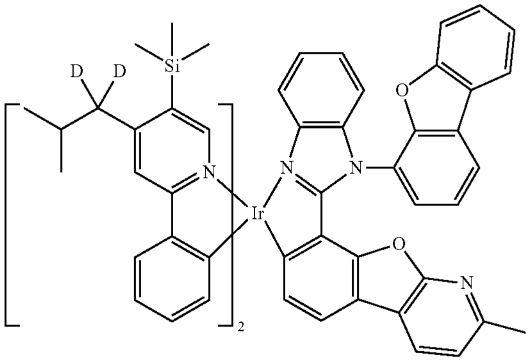

-continued
1059
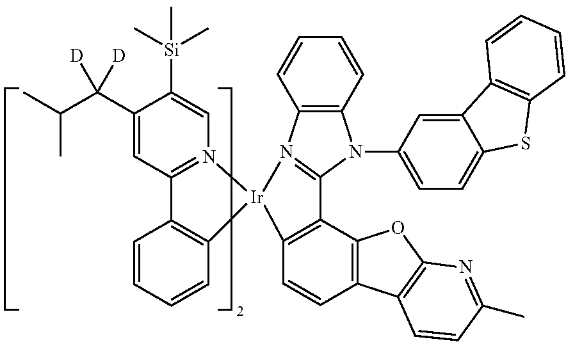
1060
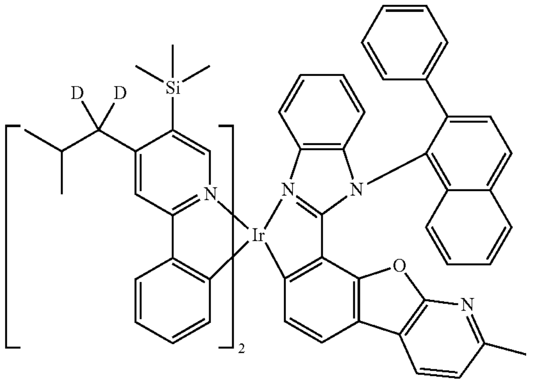
1061
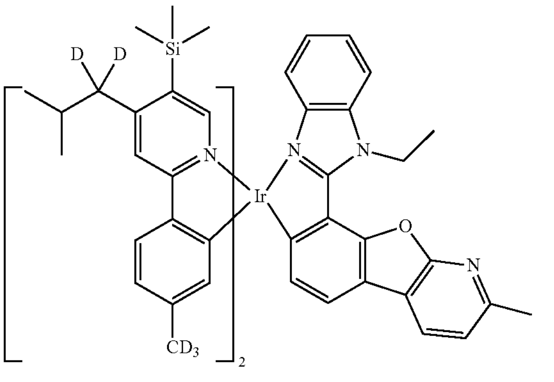
1062
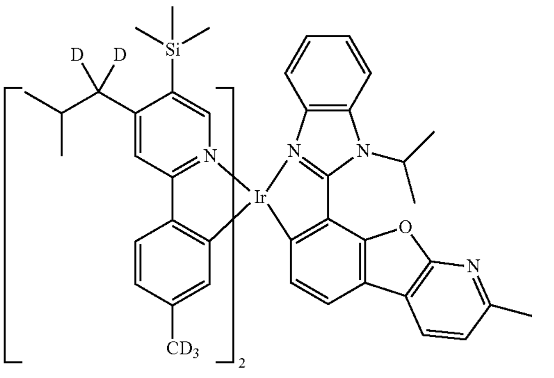
-continued
1063
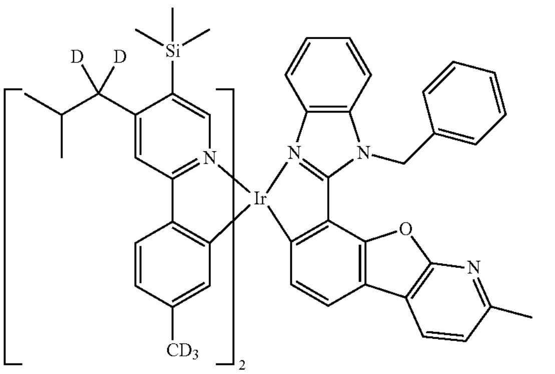
1064
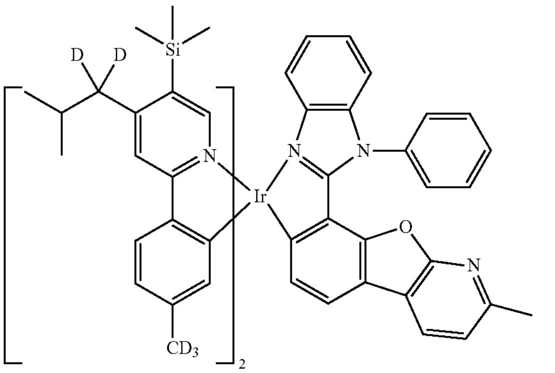
1065
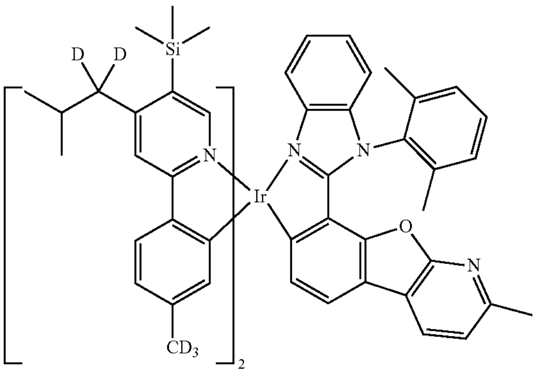
1066
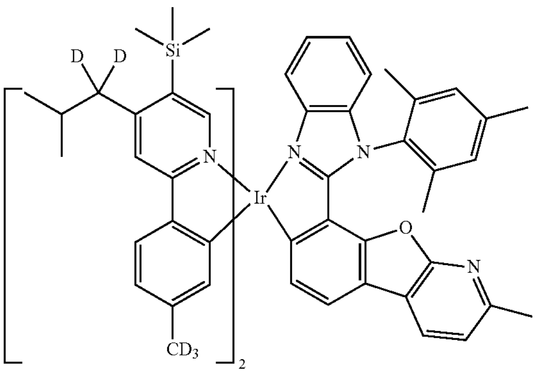

1067
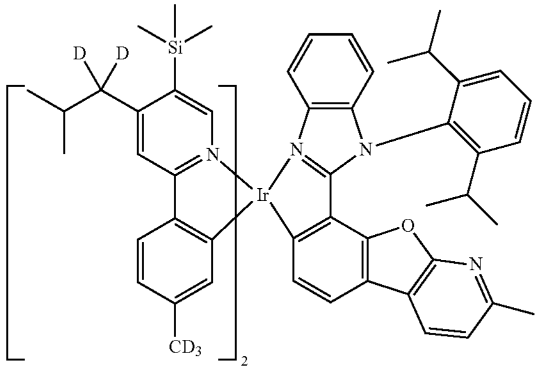
1068
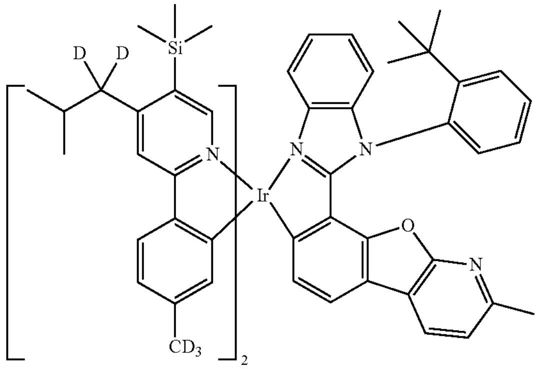
1069
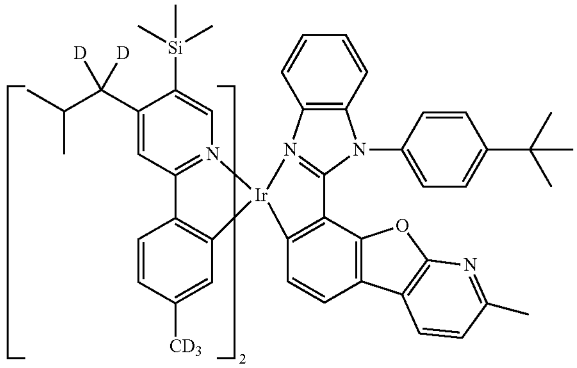
1070
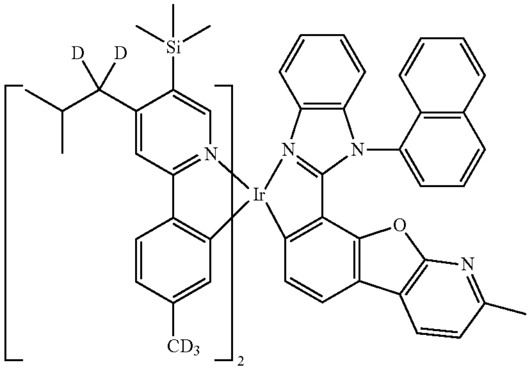
1071
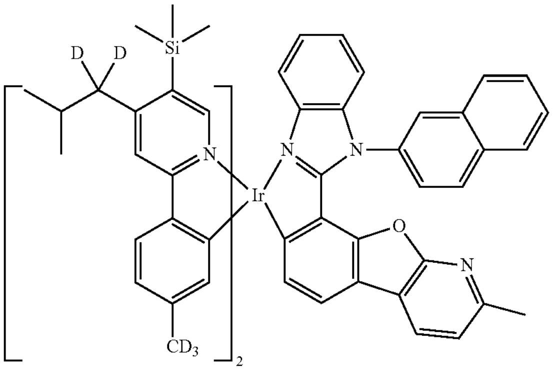
1072
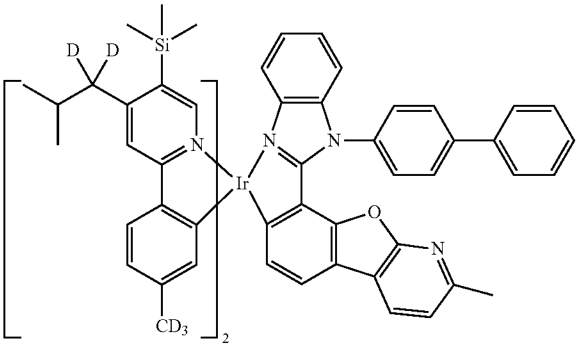
1073
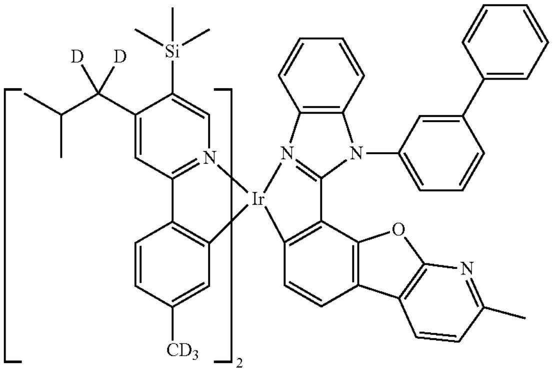
1074
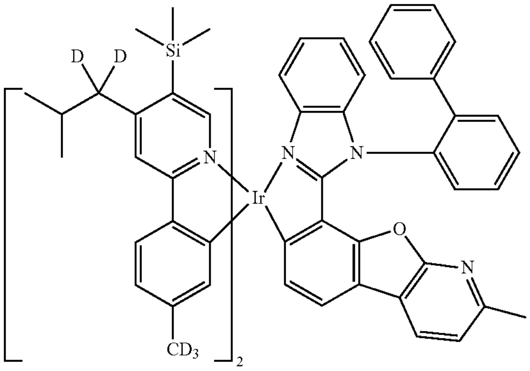

-continued
1075
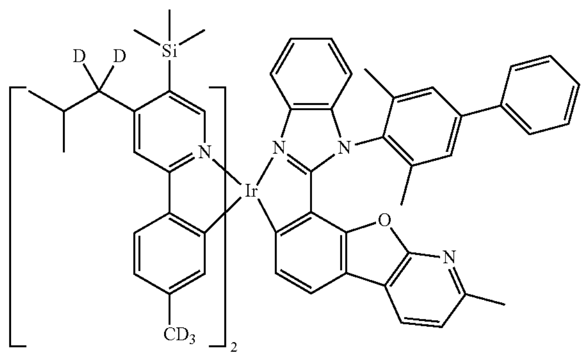
1076
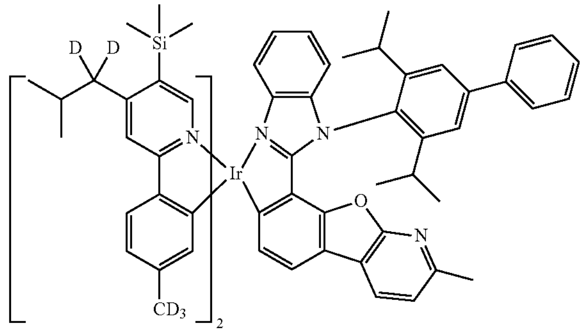
1077
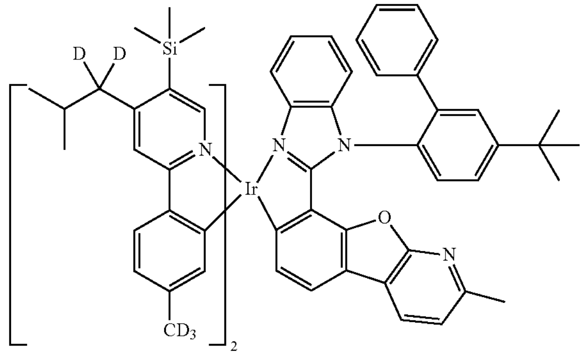
1078
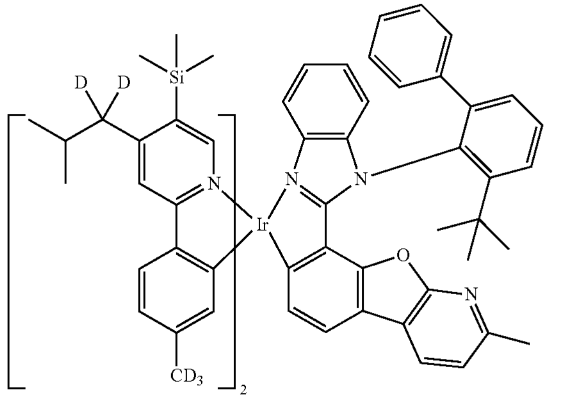
-continued
1079
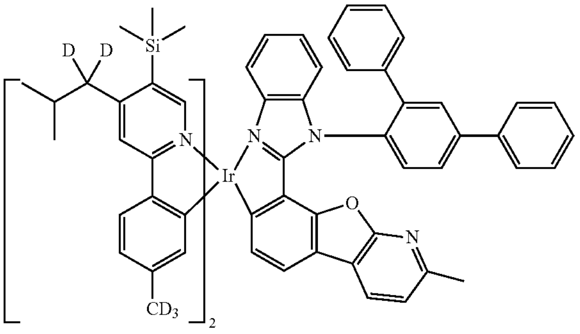
1080
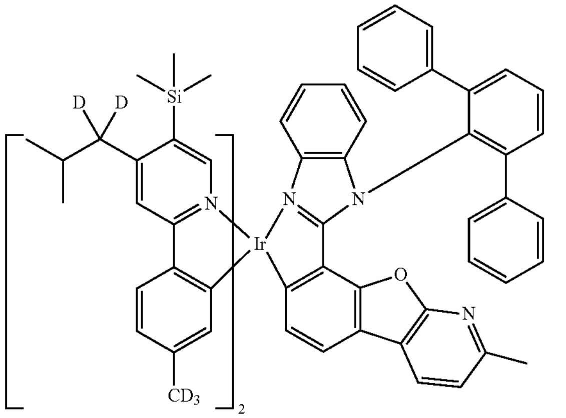
1081
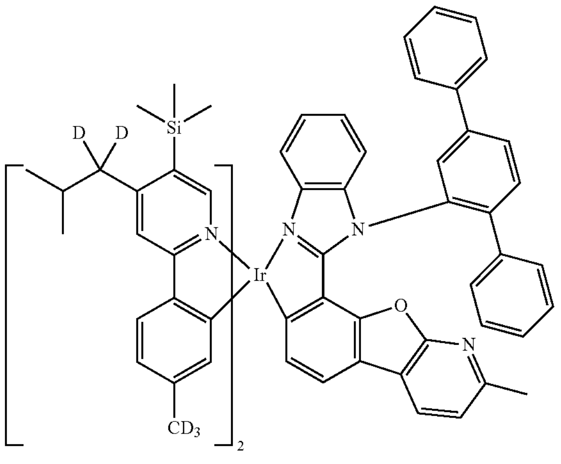

-continued
1082
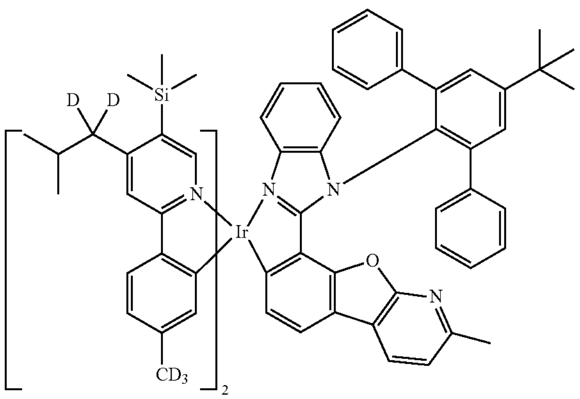
1083
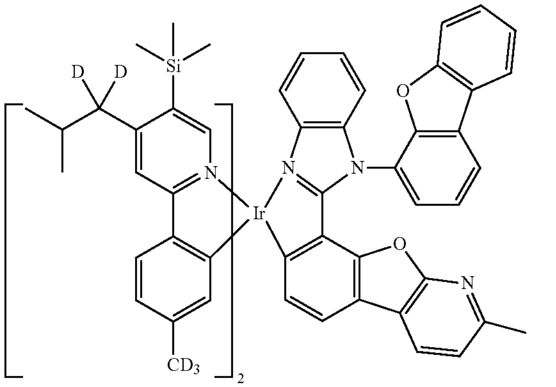
1084
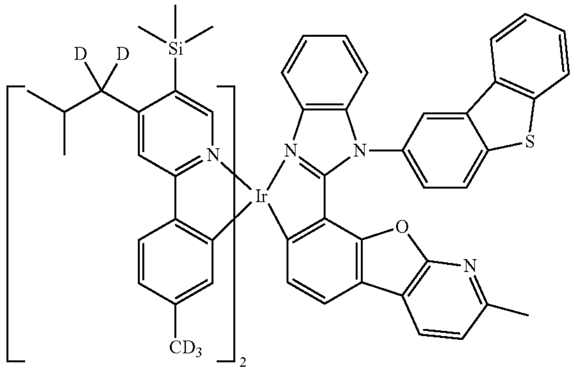
1085
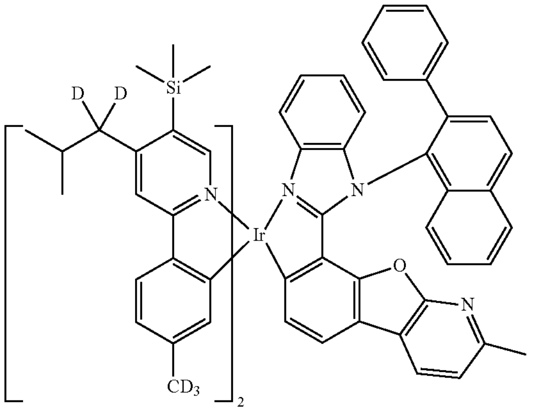
-continued
1086
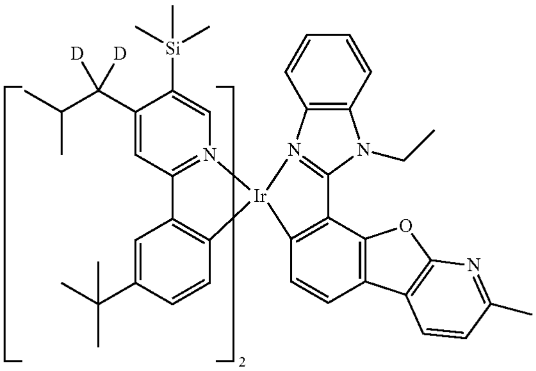
1087
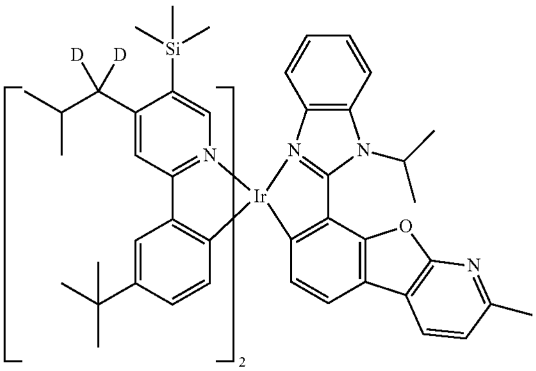
1088
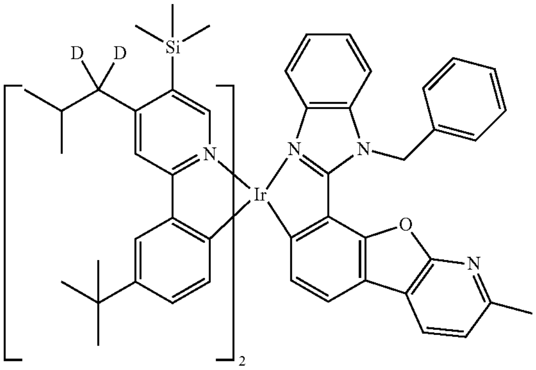
1089
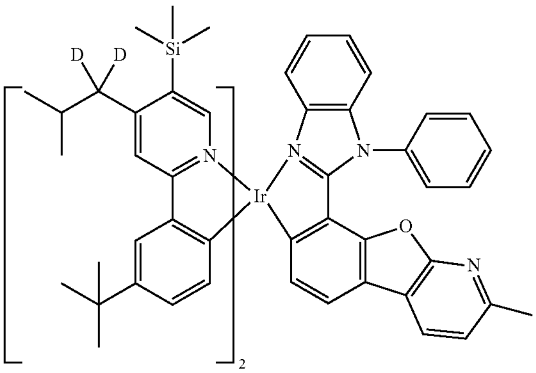

-continued
1090
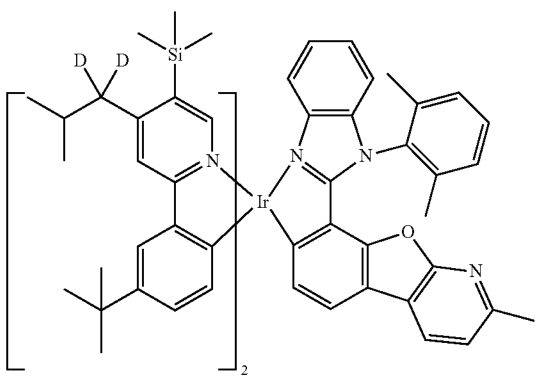
1091
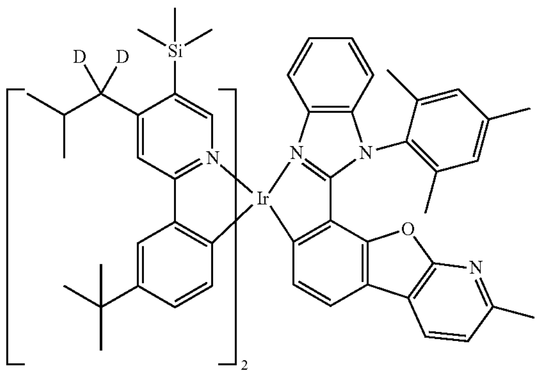
1092
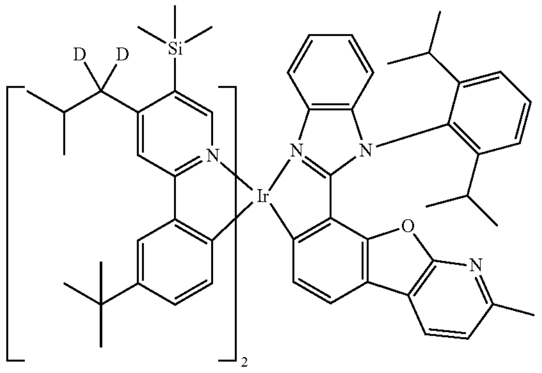
1093
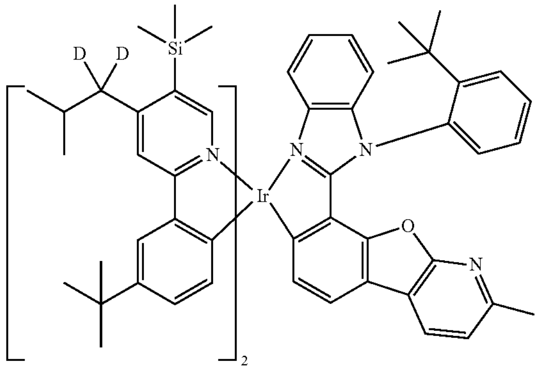
-continued
1094
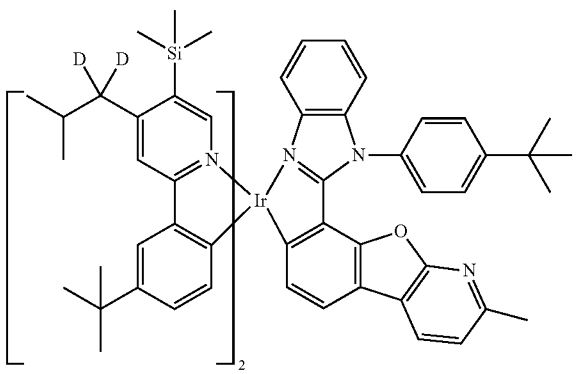
1095
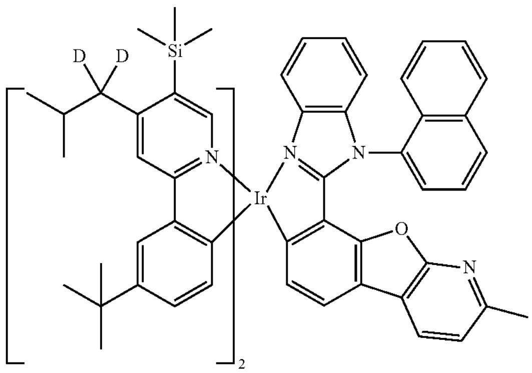
1096
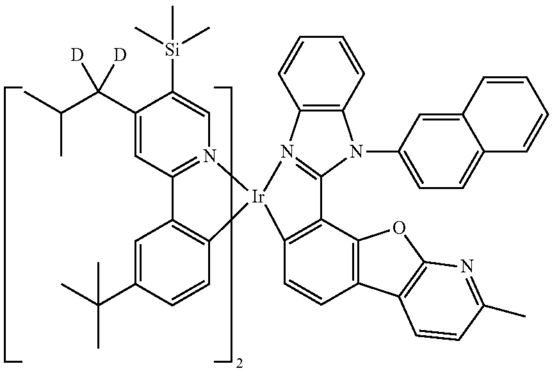
1097
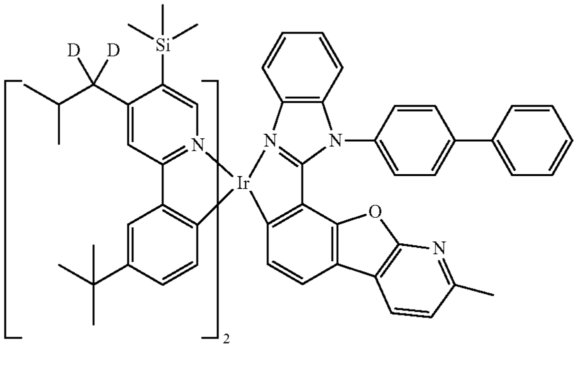

-continued
1098
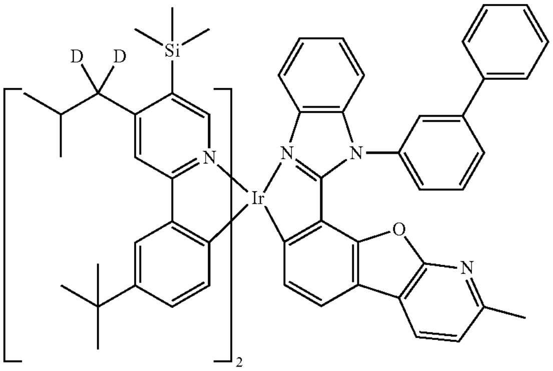
1099
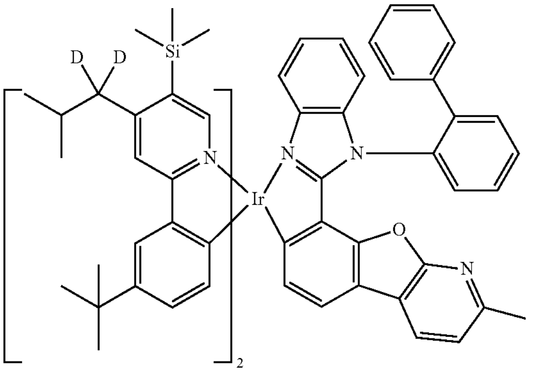
1100
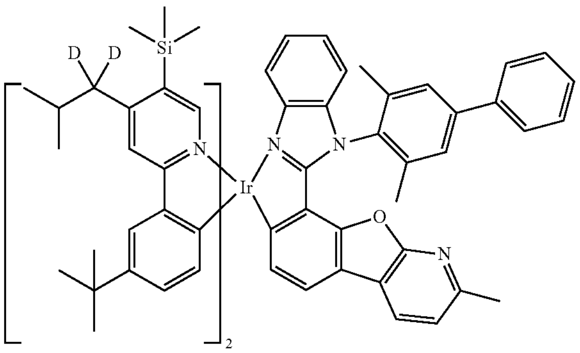
1101
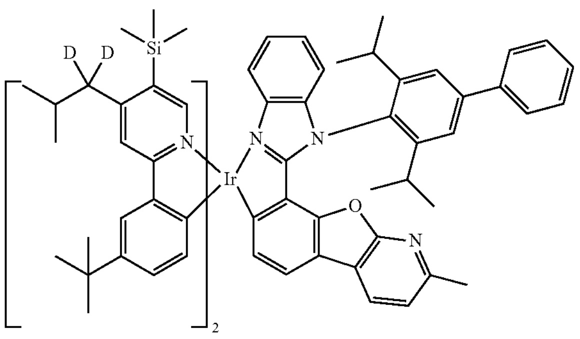
-continued
1102
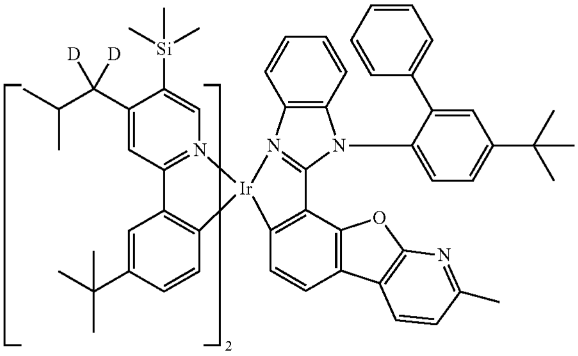
1103
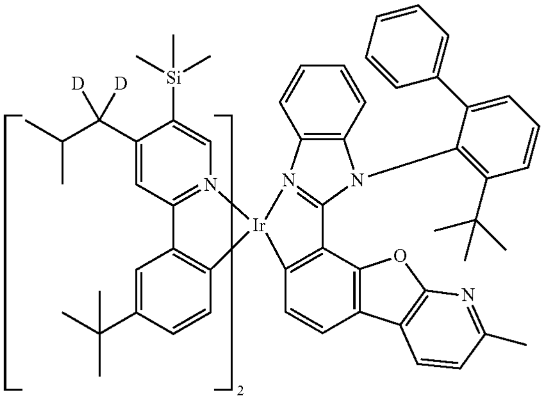
1104
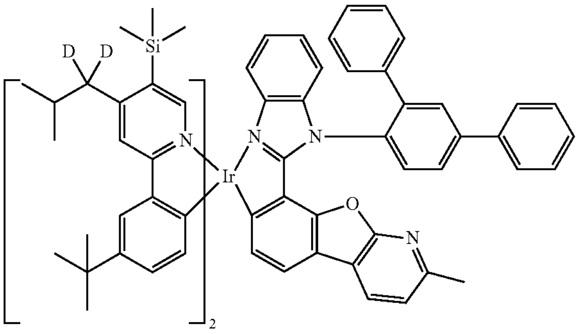
1105
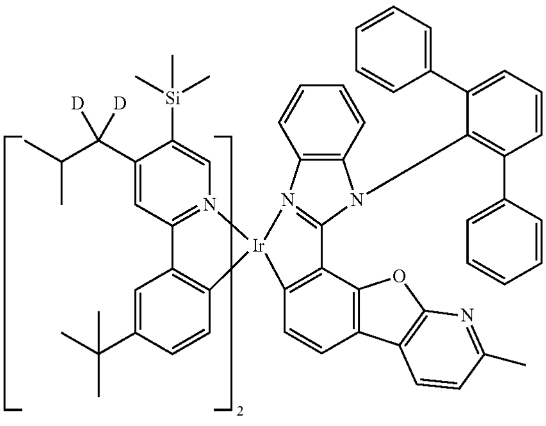

-continued
1106
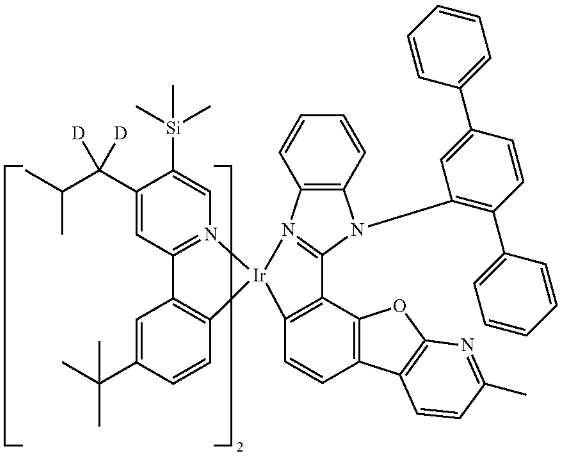
1107
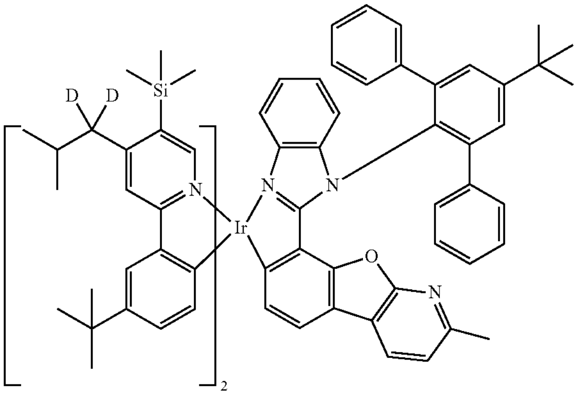
1108
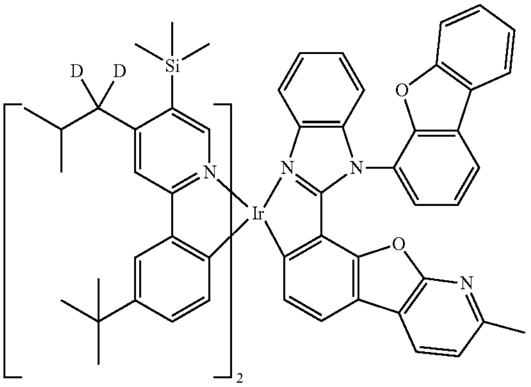
-continued
1109
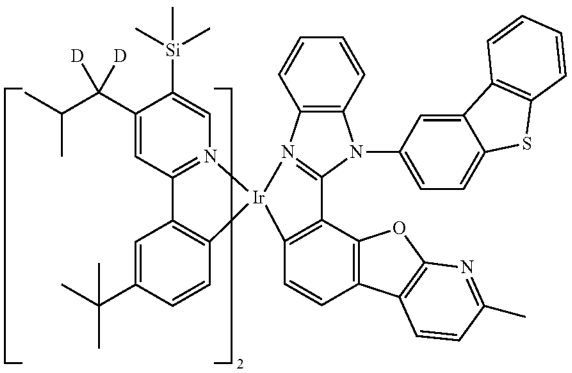
1110
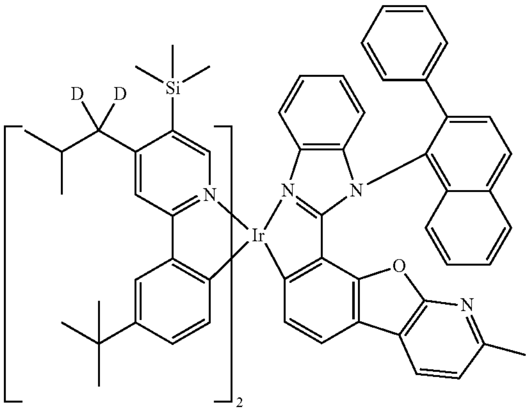
1111
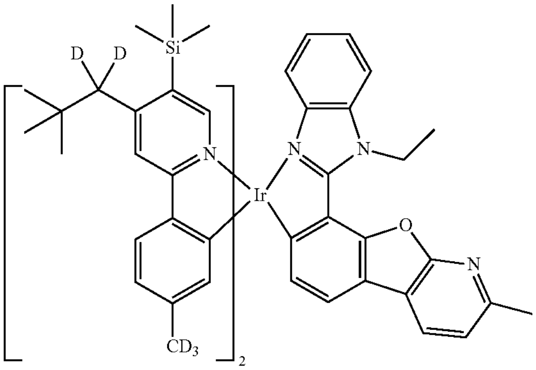
1112
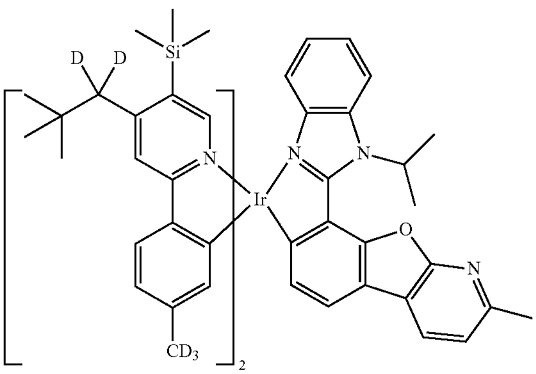

-continued
1113
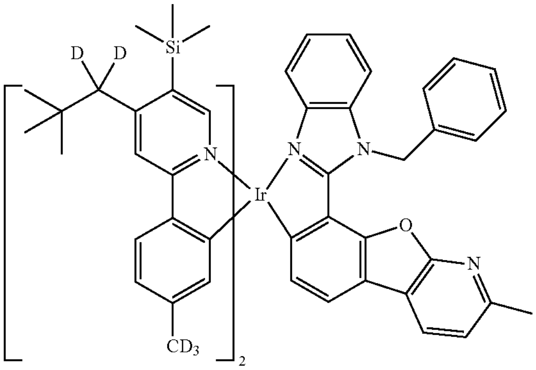
1114
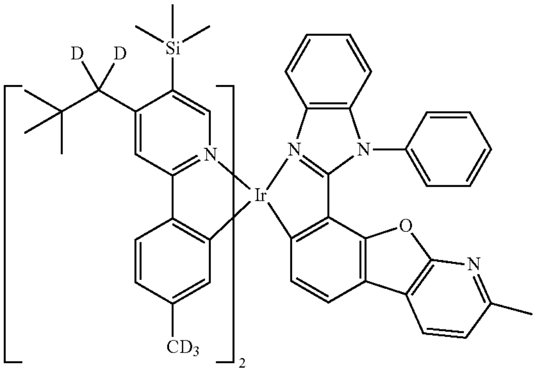
1115
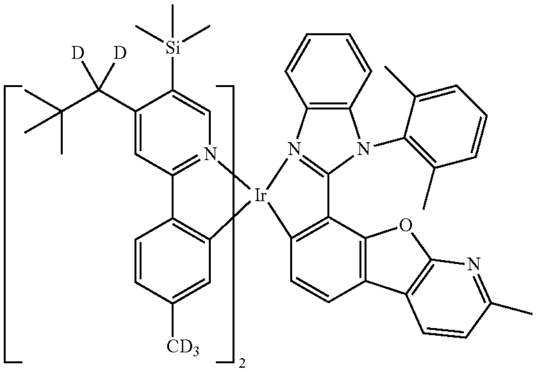
1116
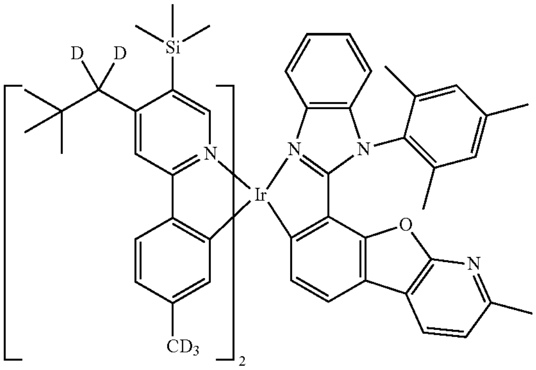
-continued
1117
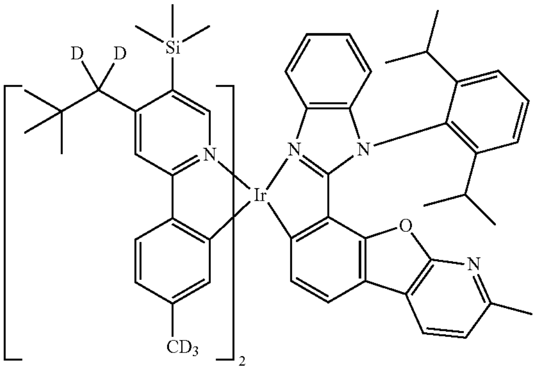
1118
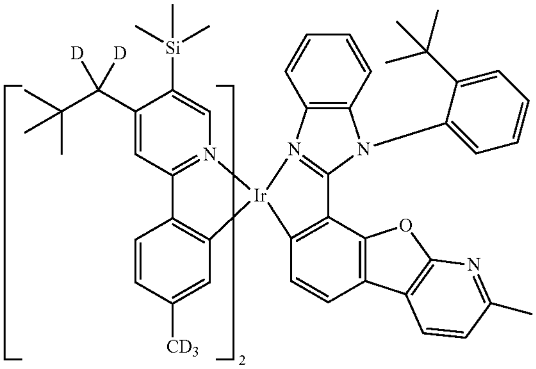
1119
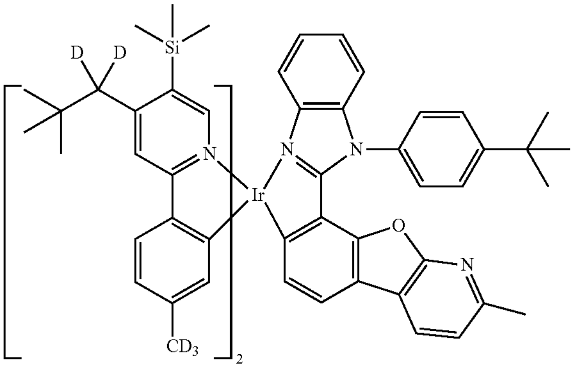
1120
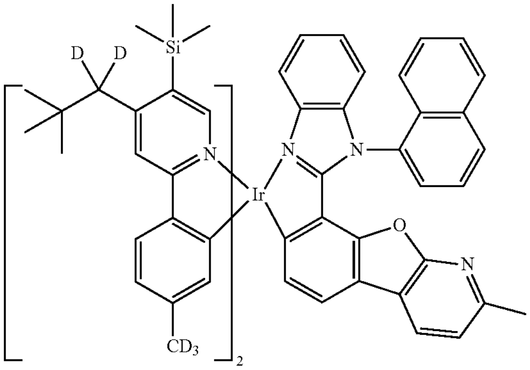

1121
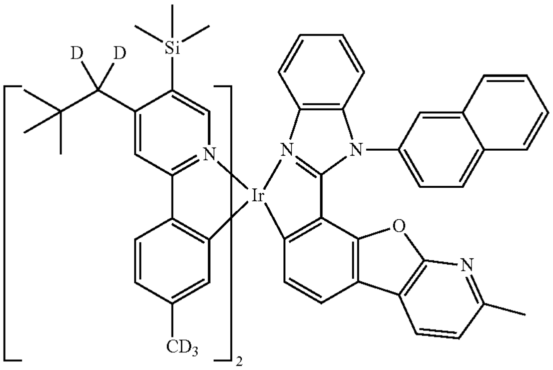
1122
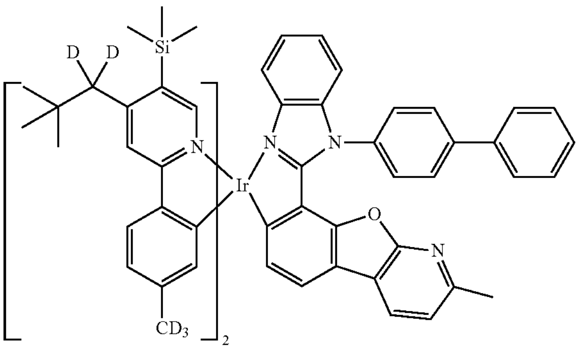
1123
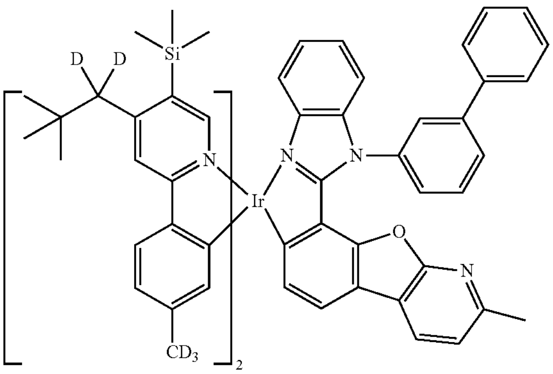
1124
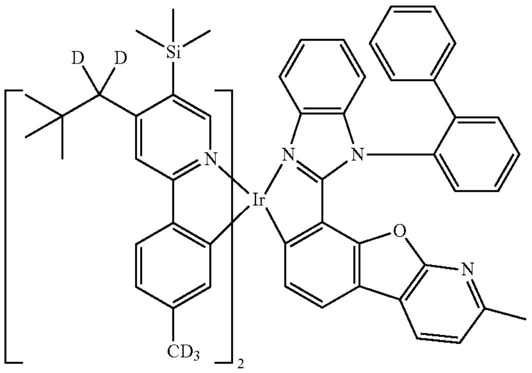
1125
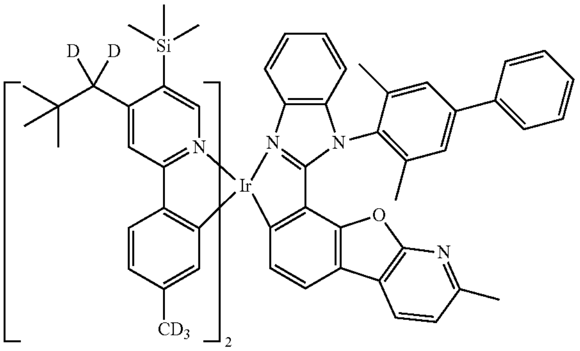
1126
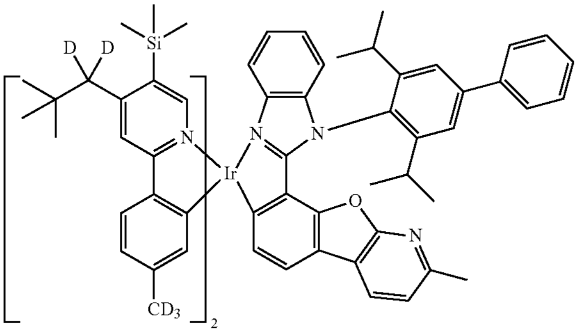
1127
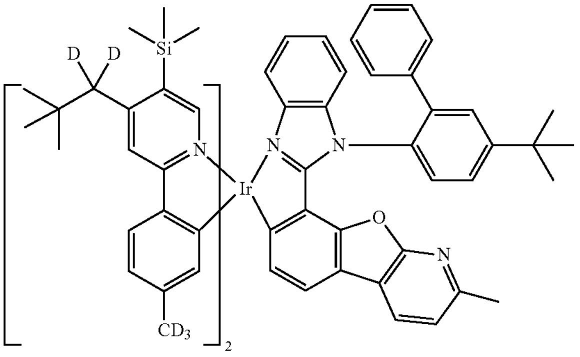
1128
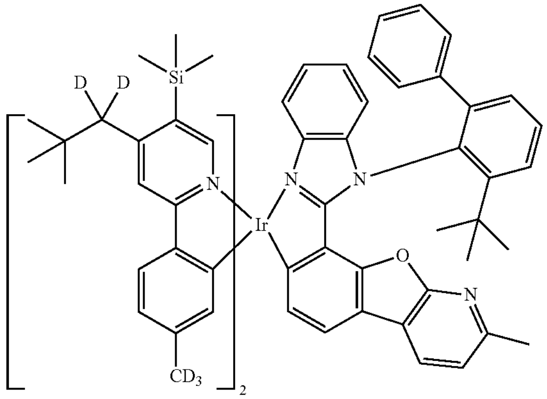

-continued
1129
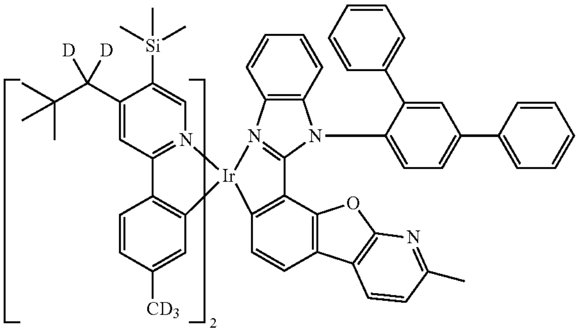
1130
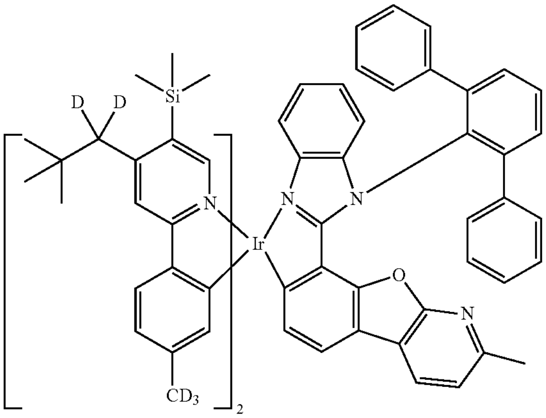
1131
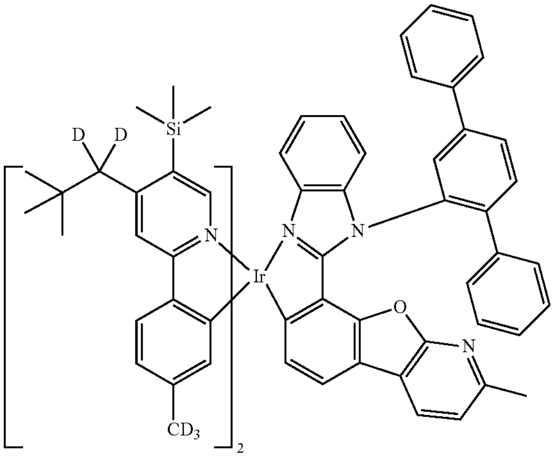
-continued
1132
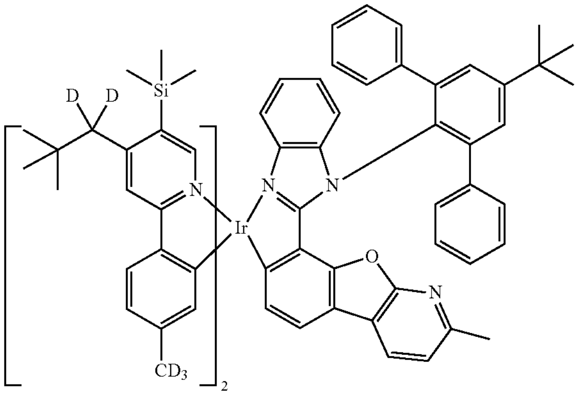
1133
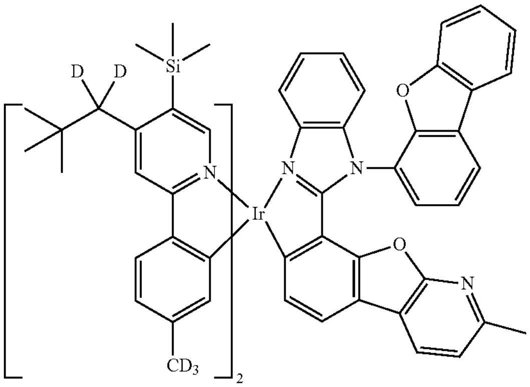
1134
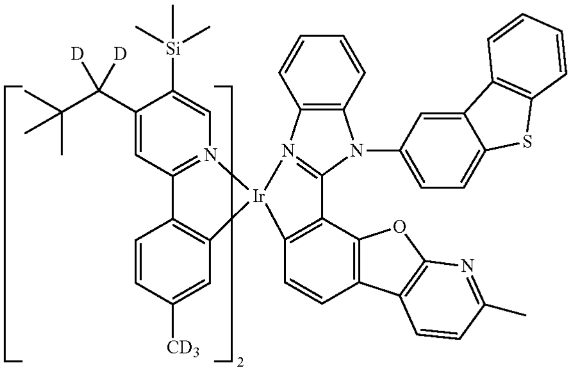
1135
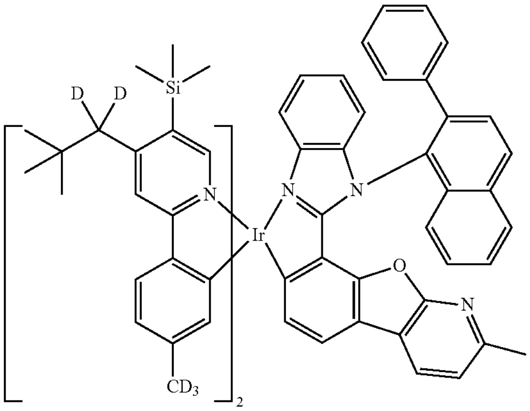

-continued
1136
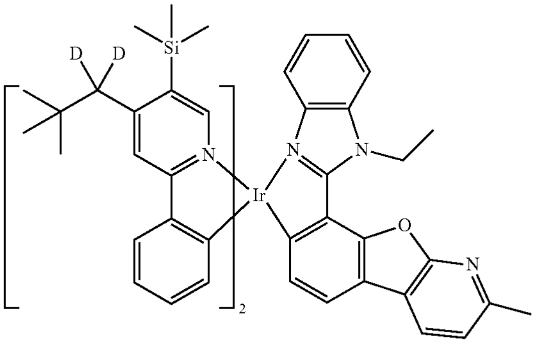
1137
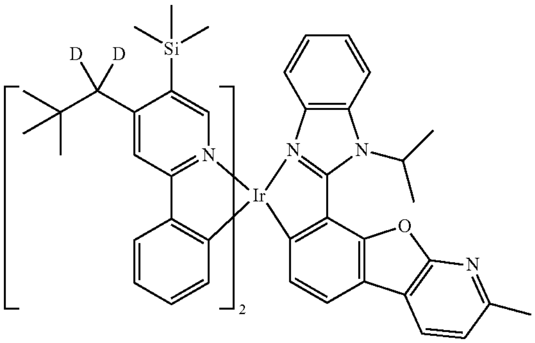
1138
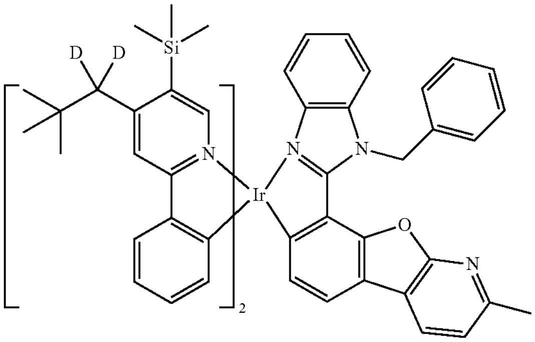
1139
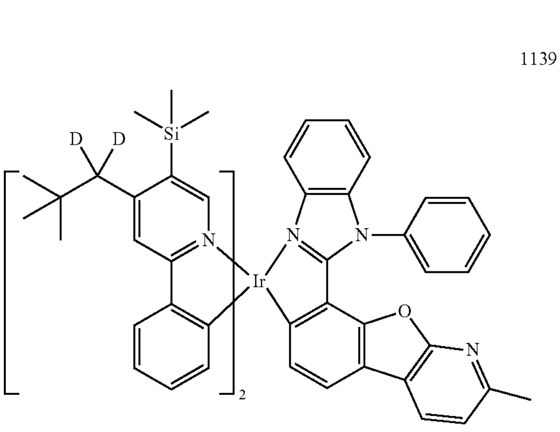
-continued
1140
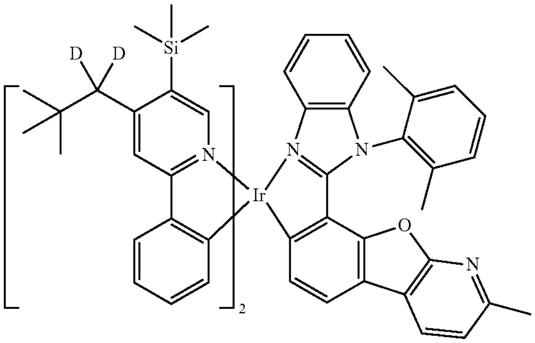
1141
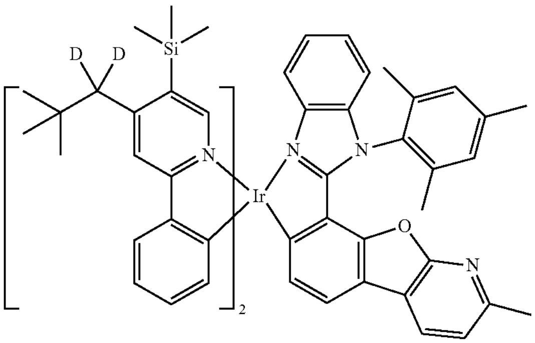
1142
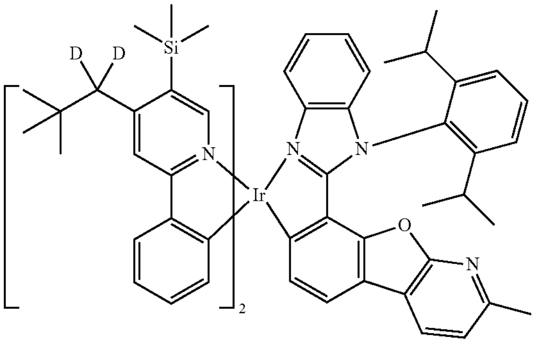
1143
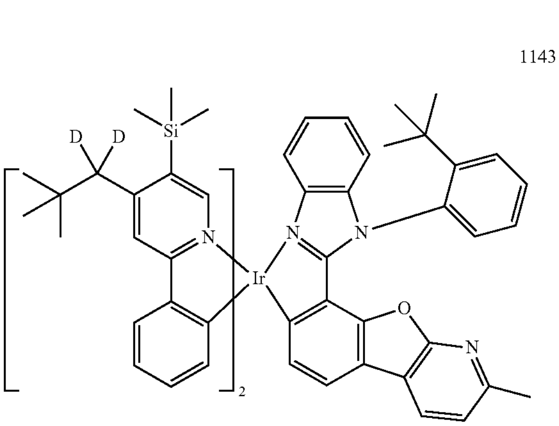

-continued
1144
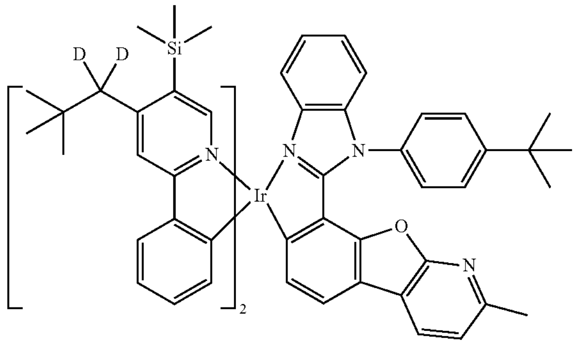
1145
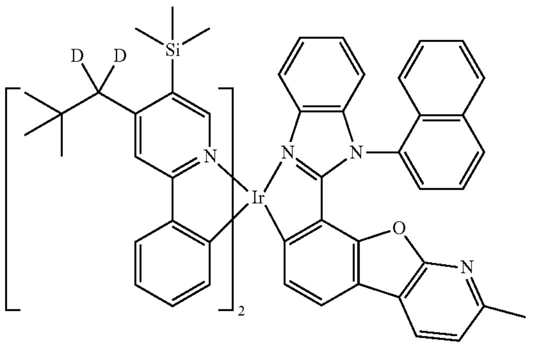
1146
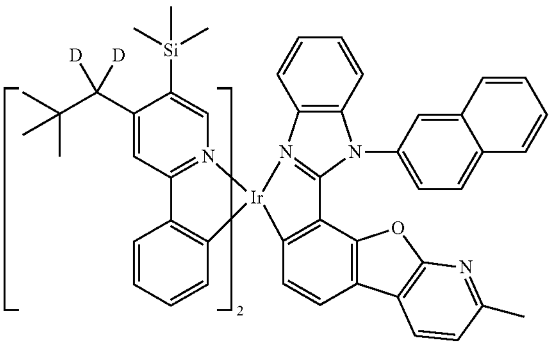
1147
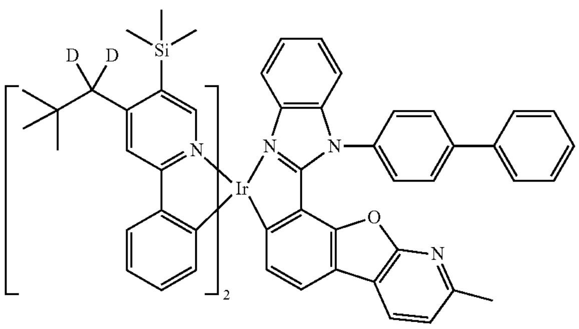
-continued
1148
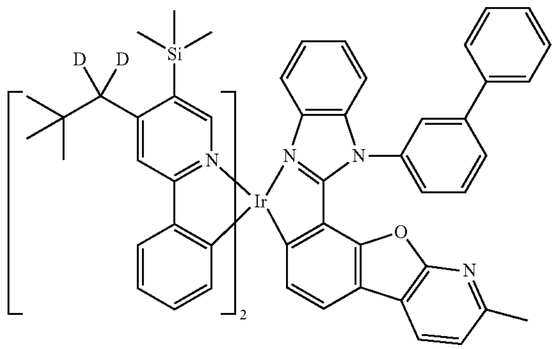
1149
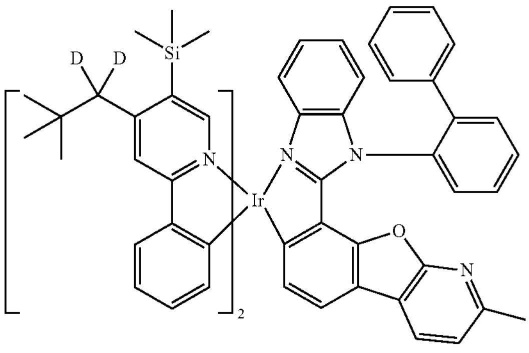
1150
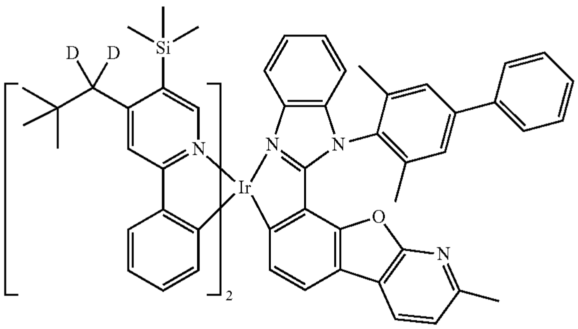
1151
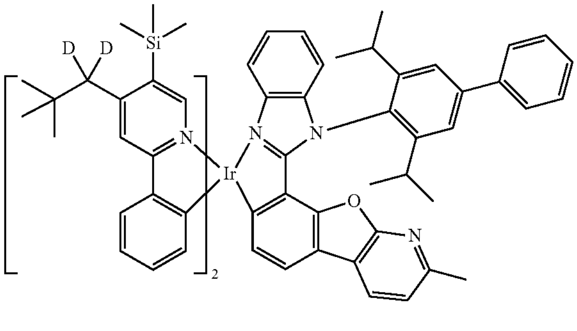

1152
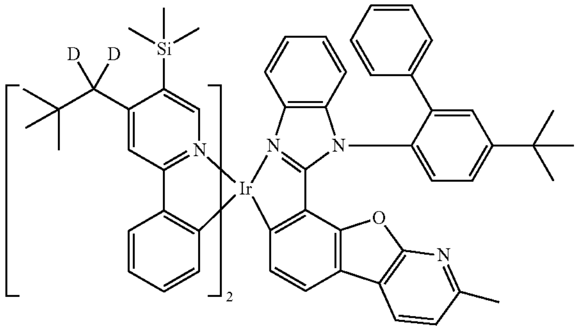
1153
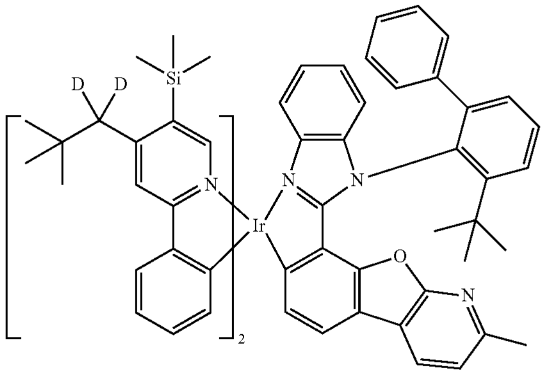
1154
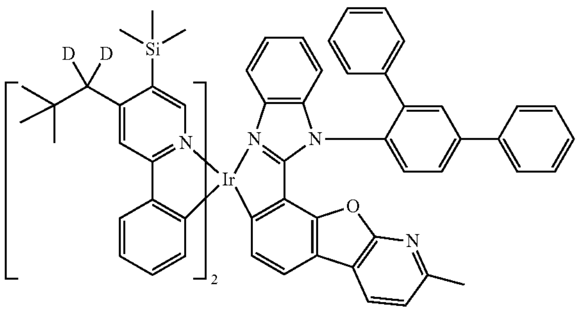
1155
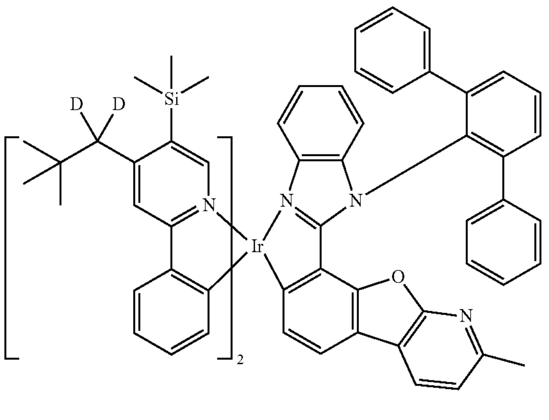
1156
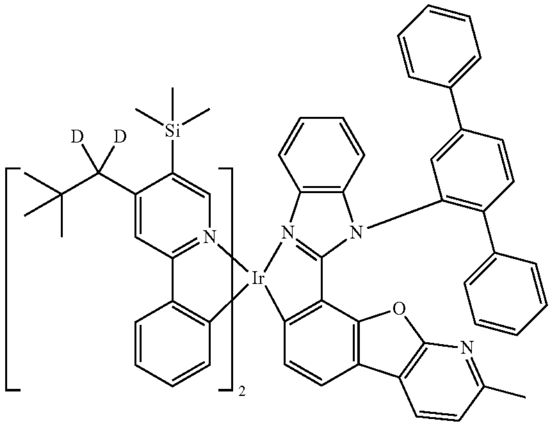
1157
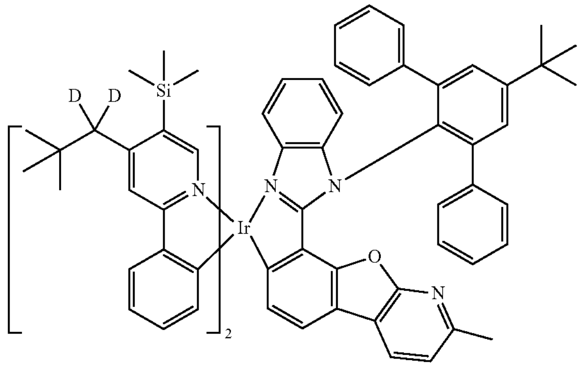
1158
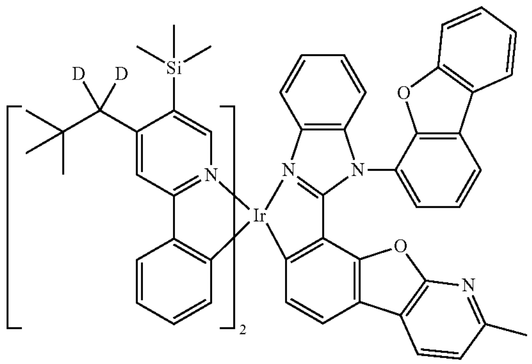
1159
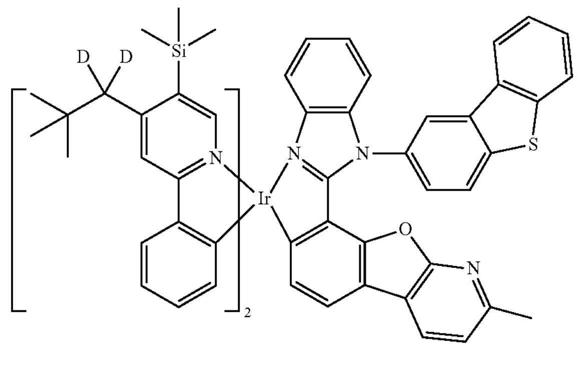

-continued
1160
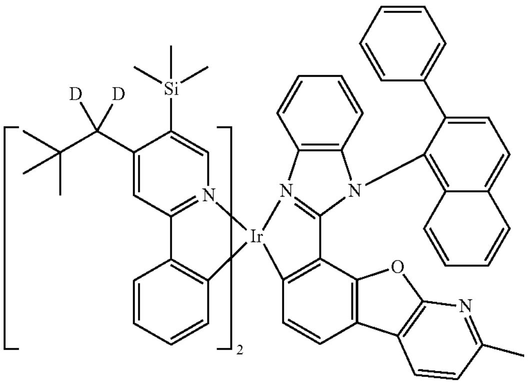
1161
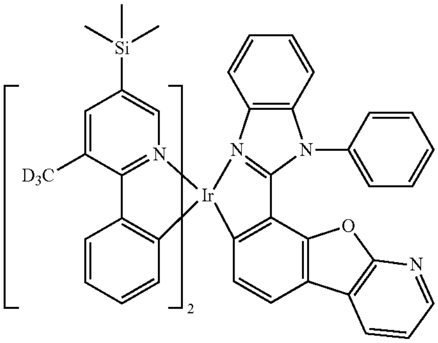
1162
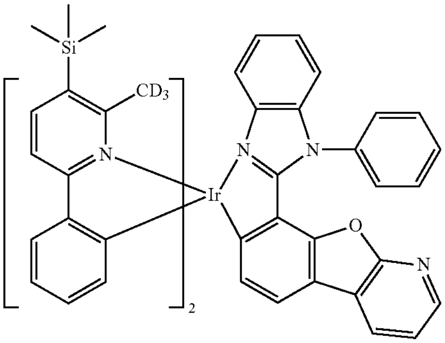
1163
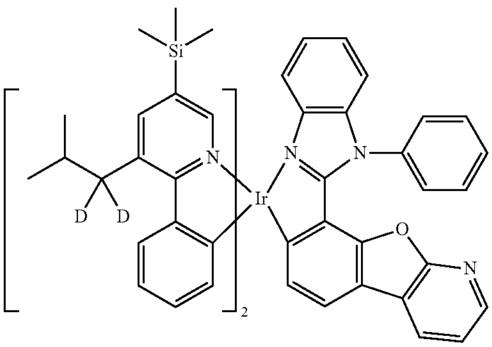
-continued
1164
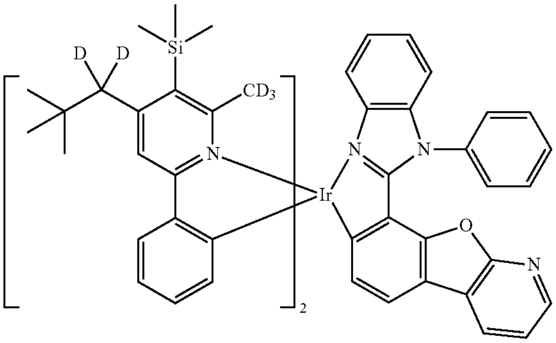
1165
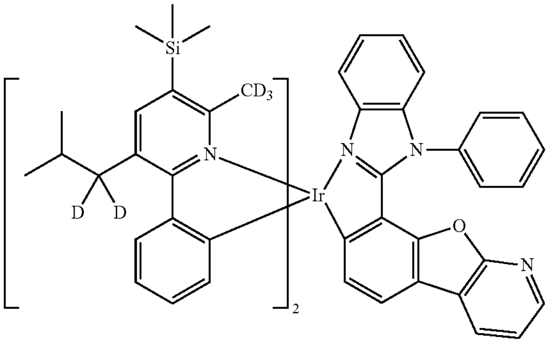
1166
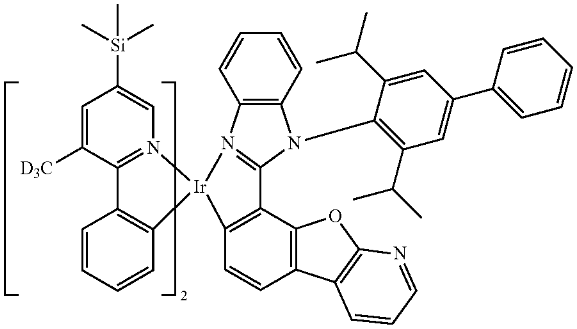
1167
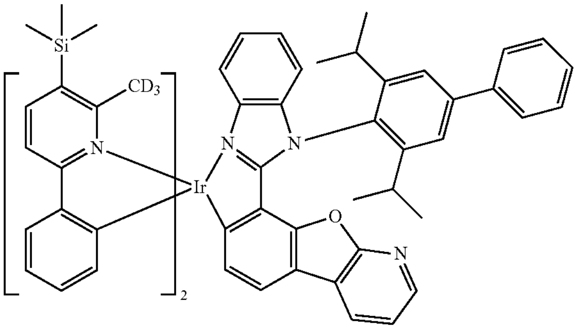

-continued
1168
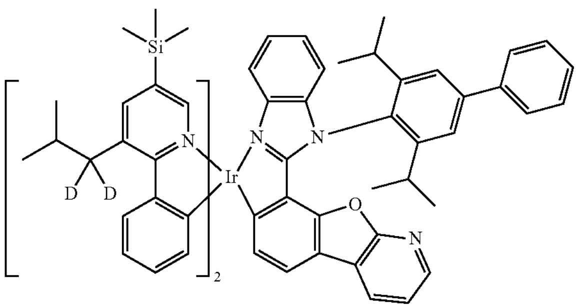
1169
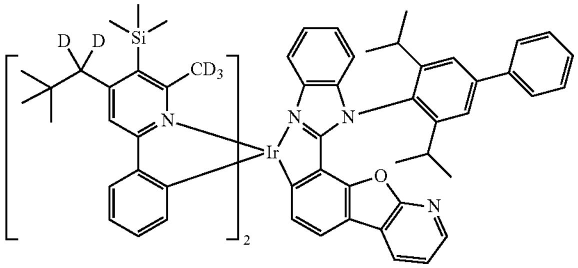
1170
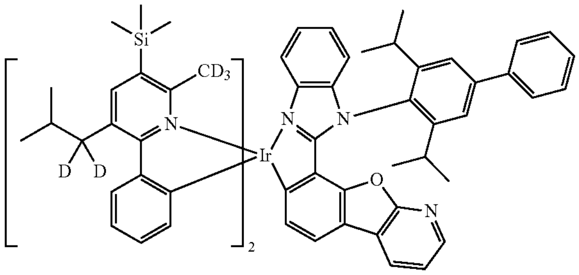
1171
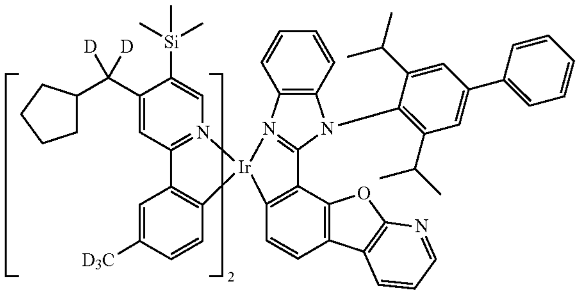
1172
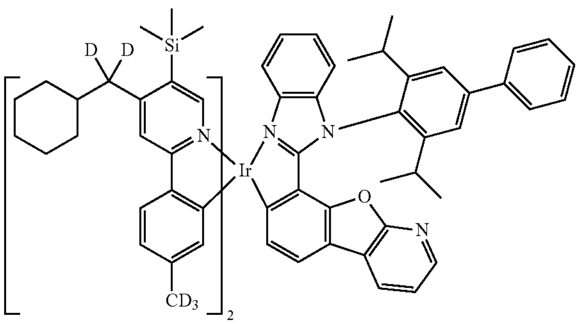
-continued
1173
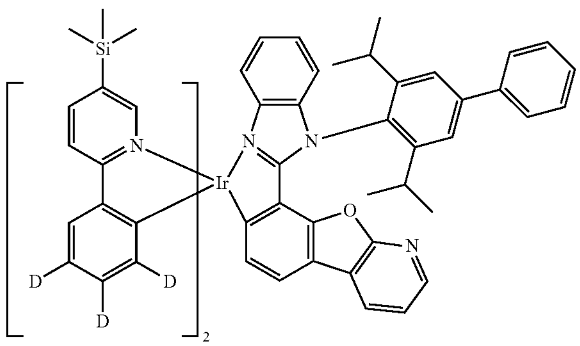
1174
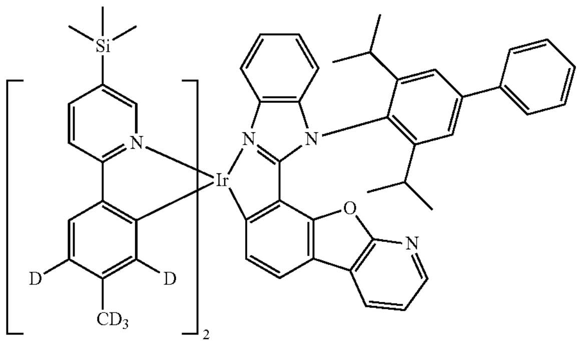
1175
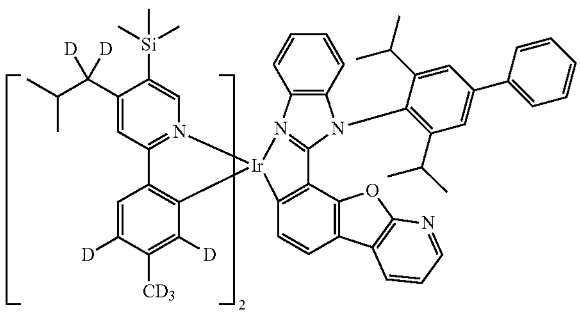
1176
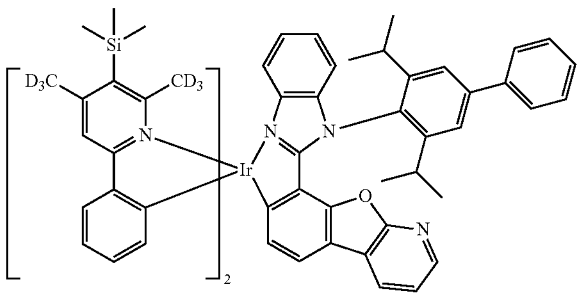

-continued
1177
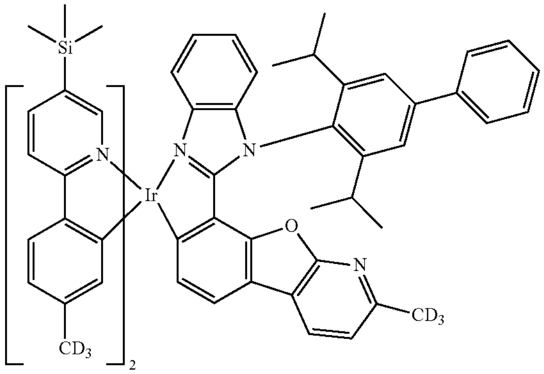
1178
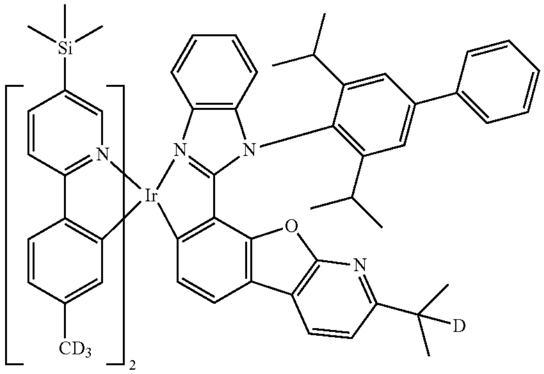
1179
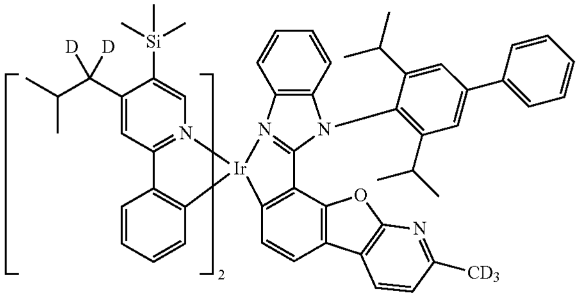
1180
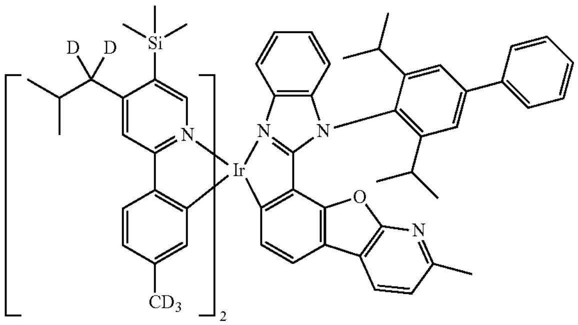
-continued
1181
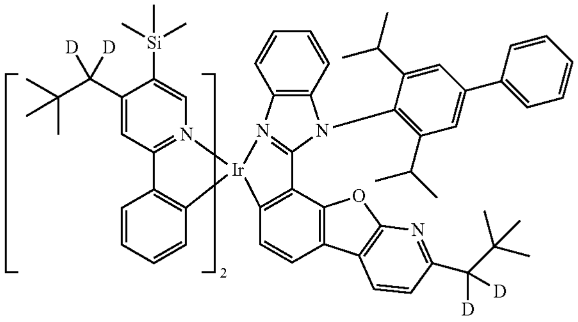
1182
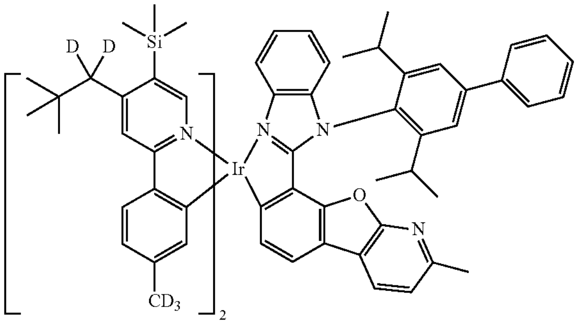
1183
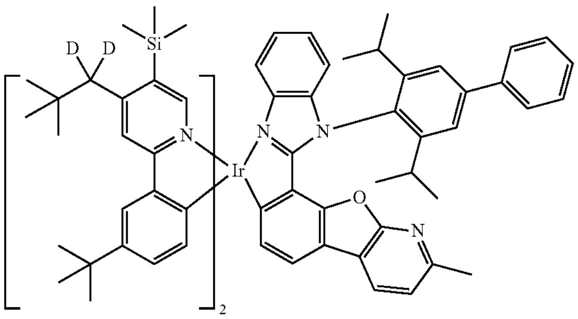
1184
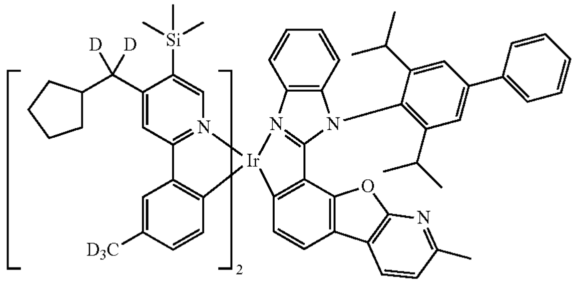

1185
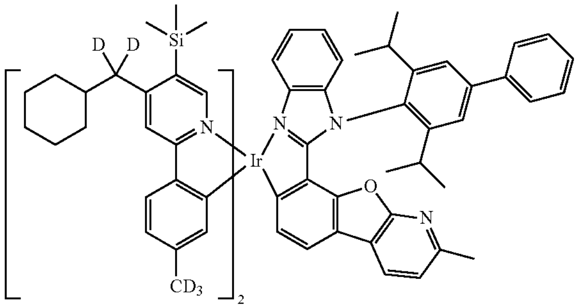
1186
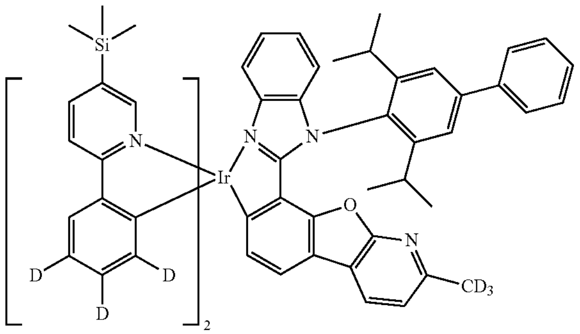
1187
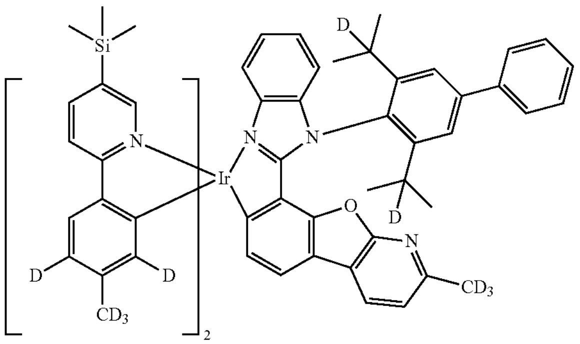
1188
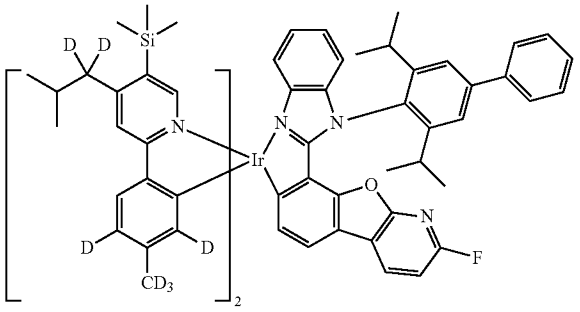
1189
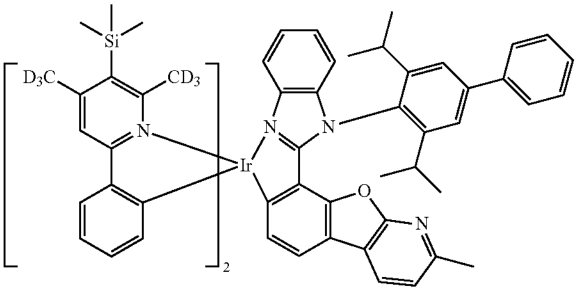
1190
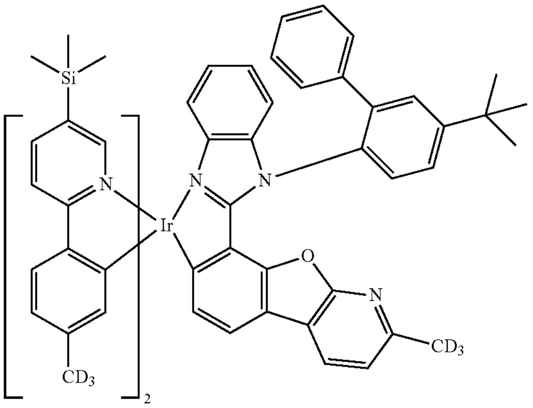
1191
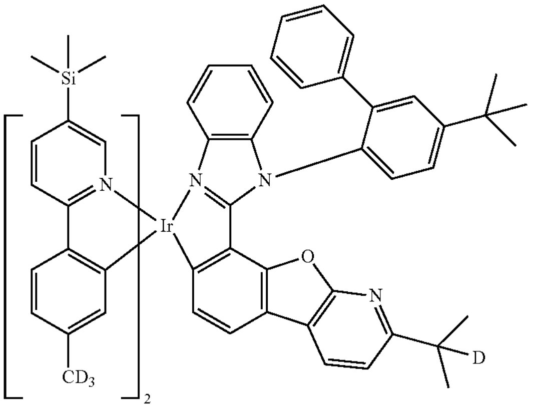
1192
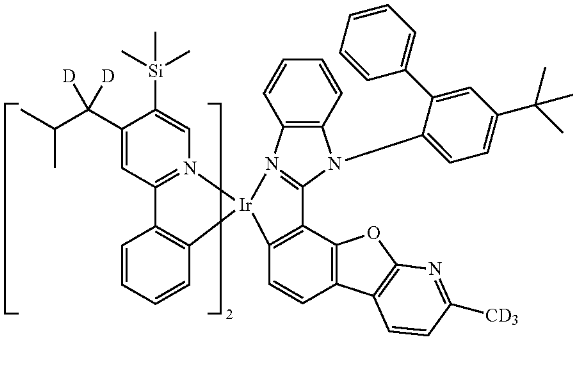

-continued
1193
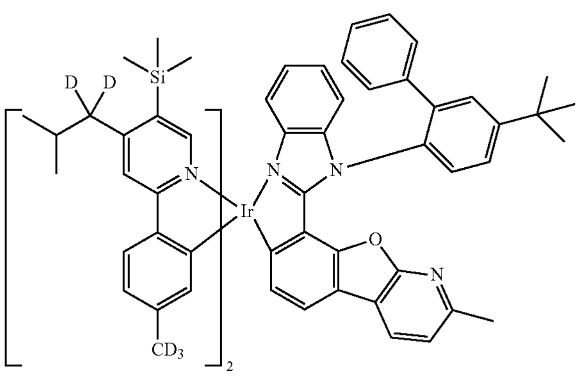
1194
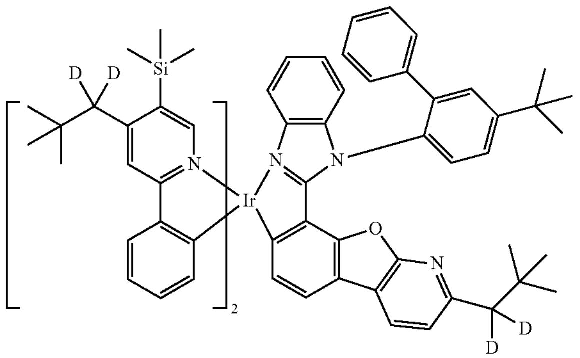
1195
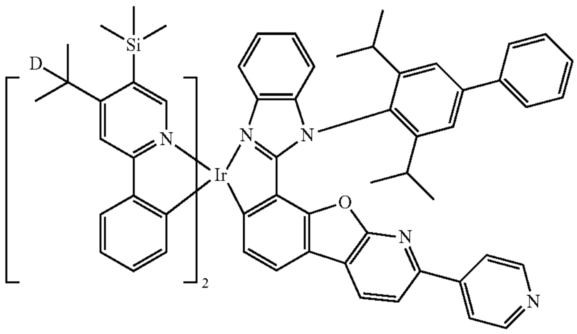
1196
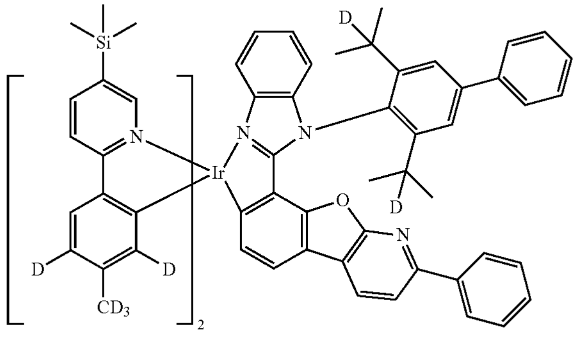
-continued
1197
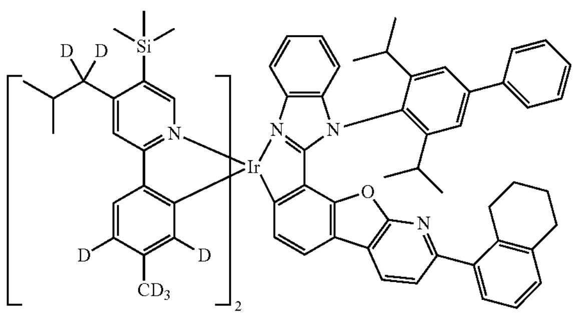
1198
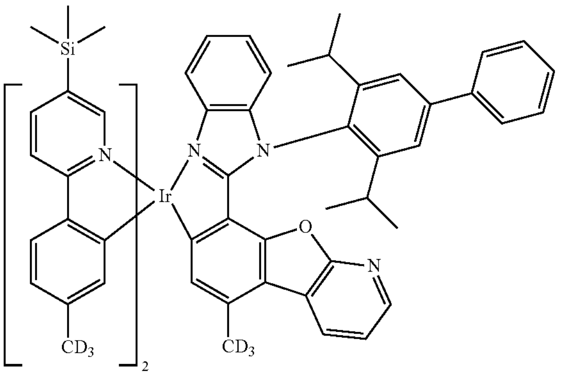
1199
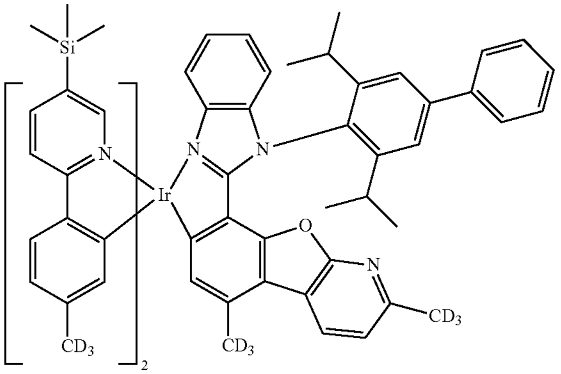
1200
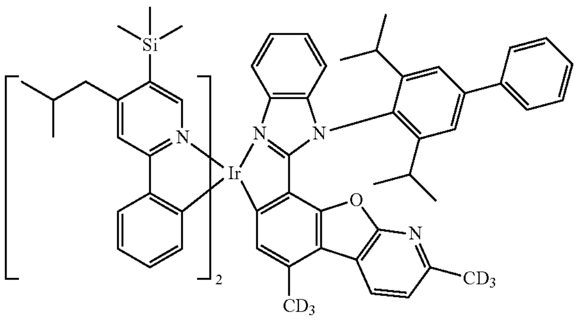

-continued
1201
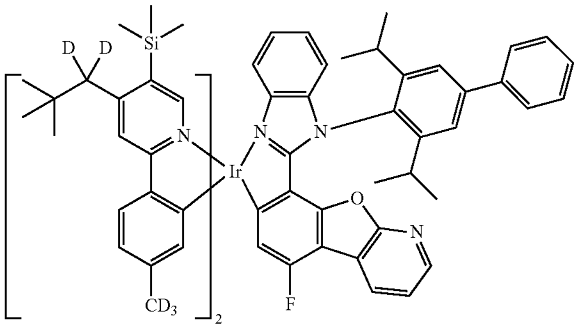
1202
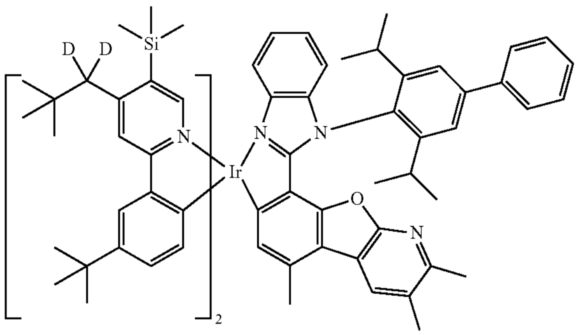
1203
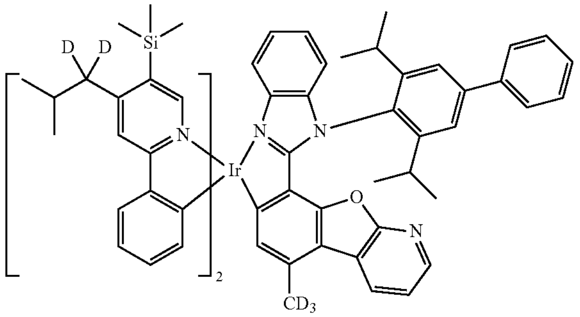
1204
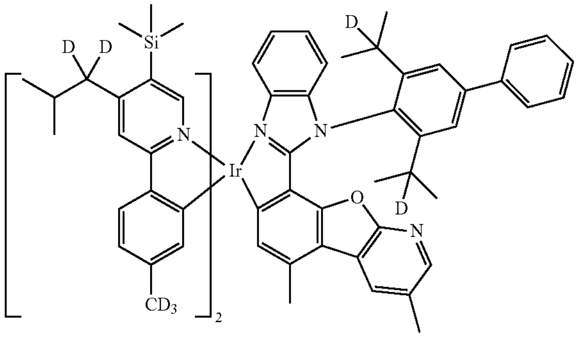
-continued
1205
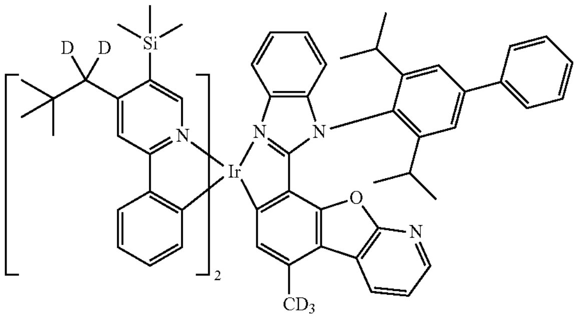
1206
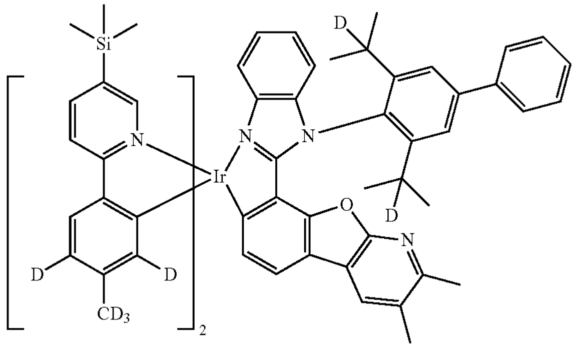
1207
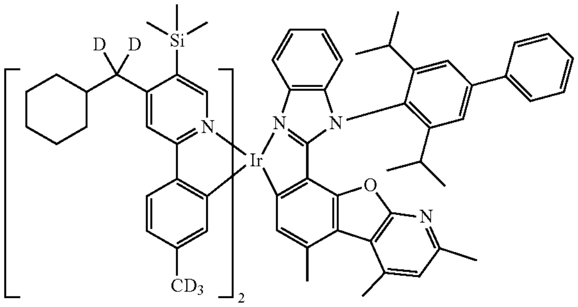
1208
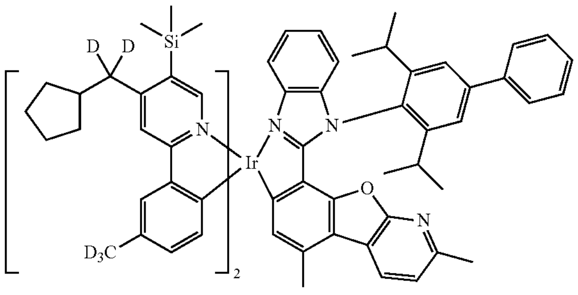

-continued
1209
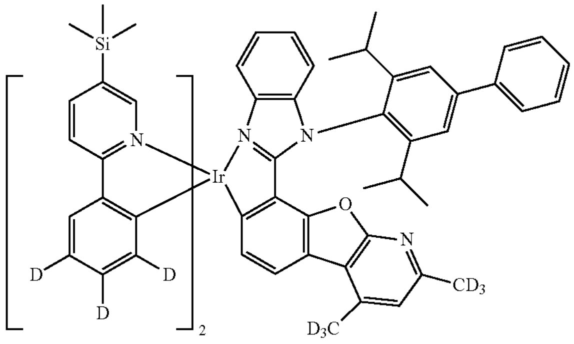
1210
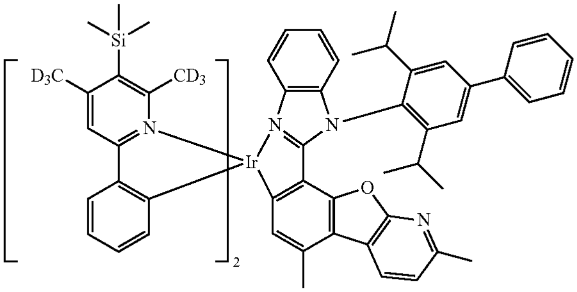
1211
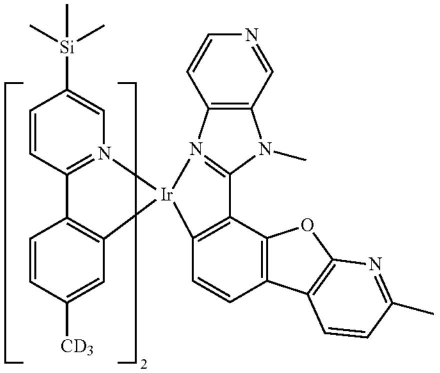
1212
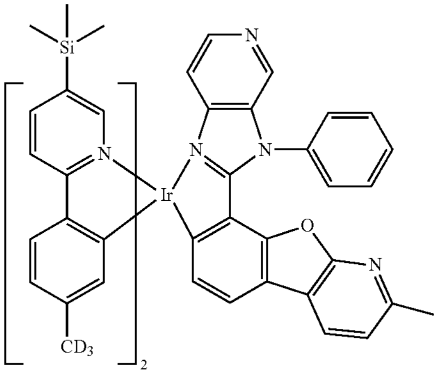
-continued
1213
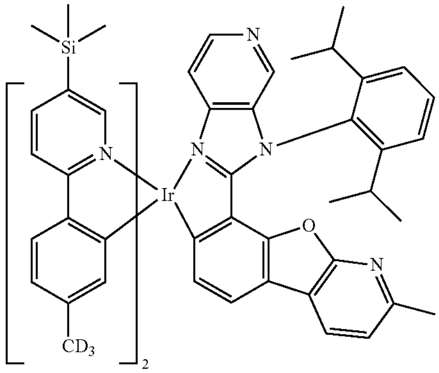
1214
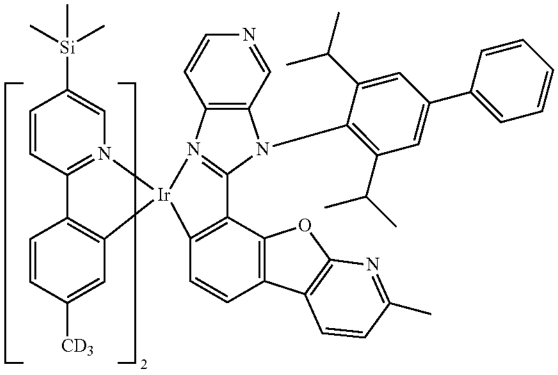
1215
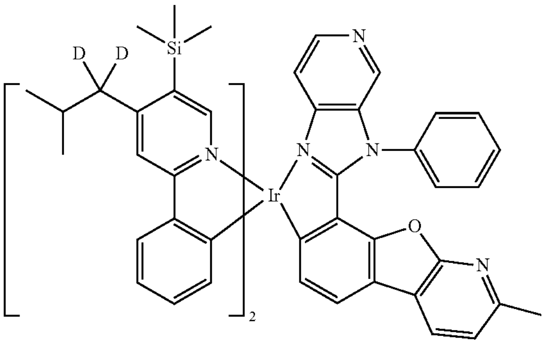
1216
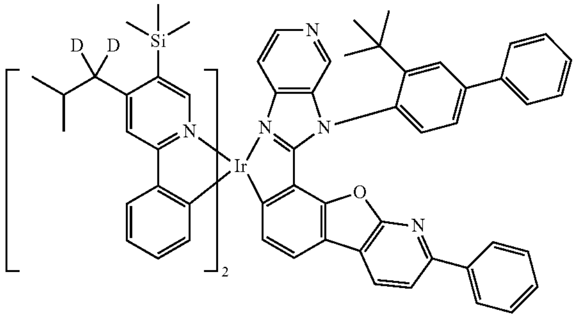

-continued
1217
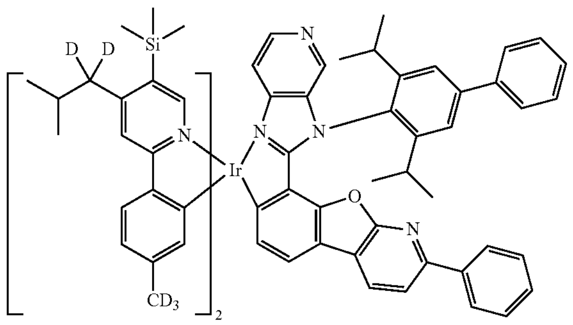
1218
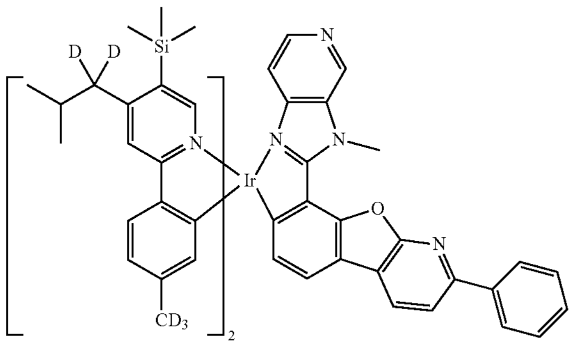
1219
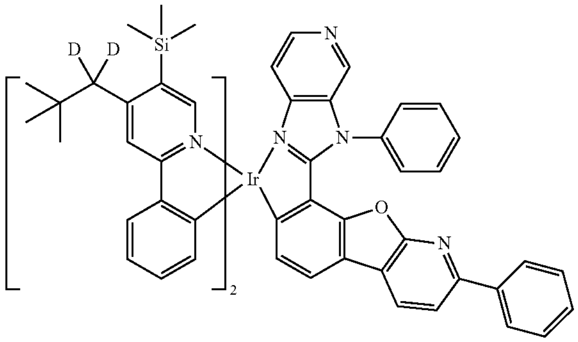
1220
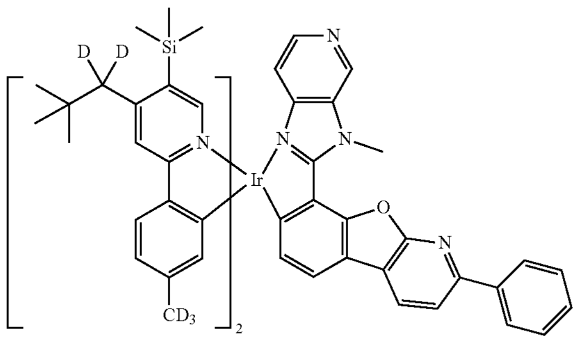
-continued
1221
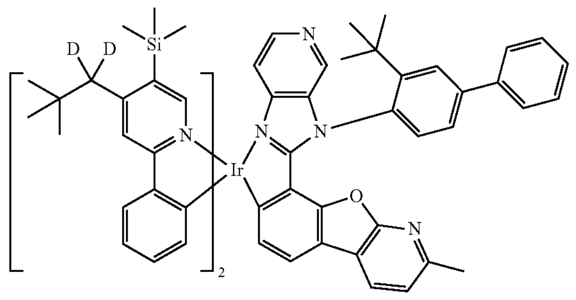
1222
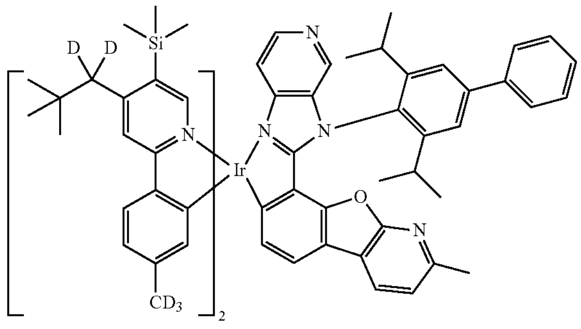
1223
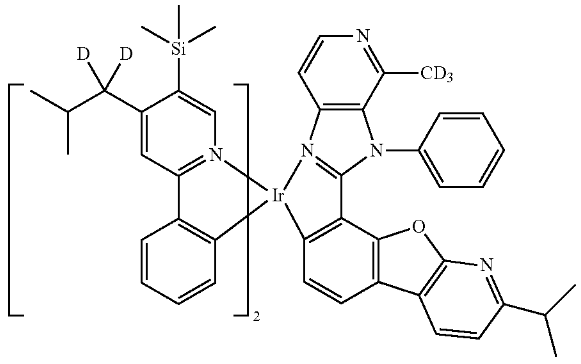
1224
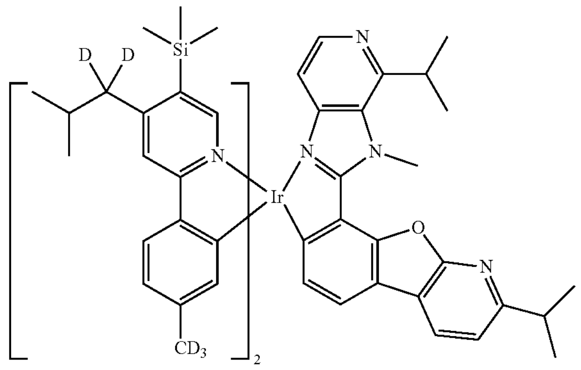

-continued
1225
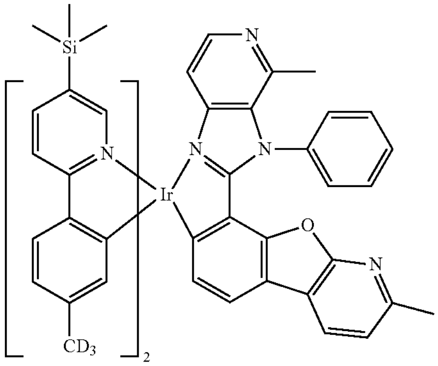
1226
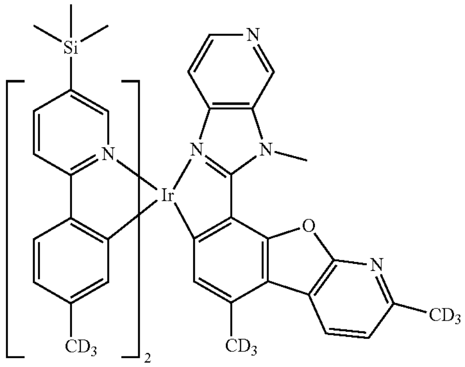
1227
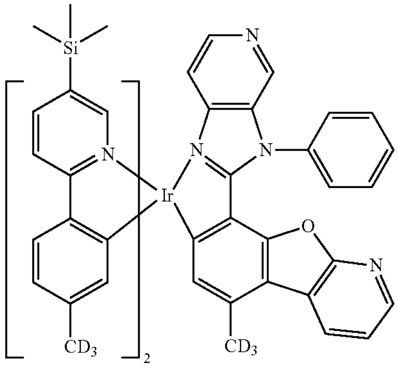
1228
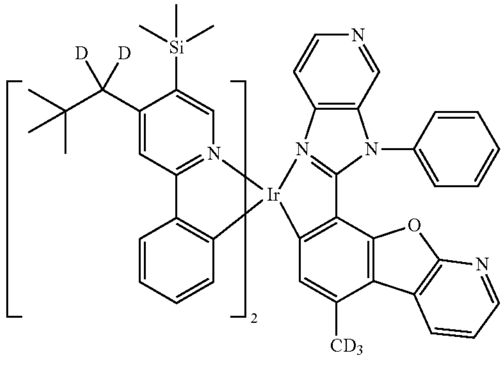
-continued
1229
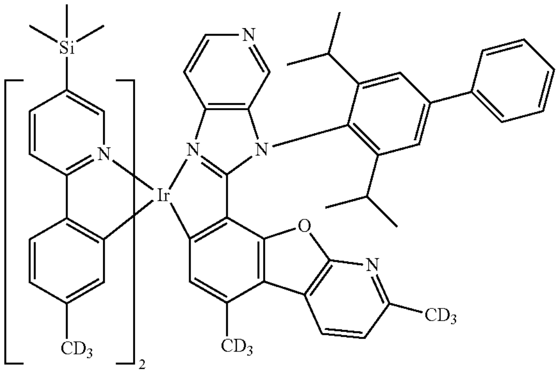
1230
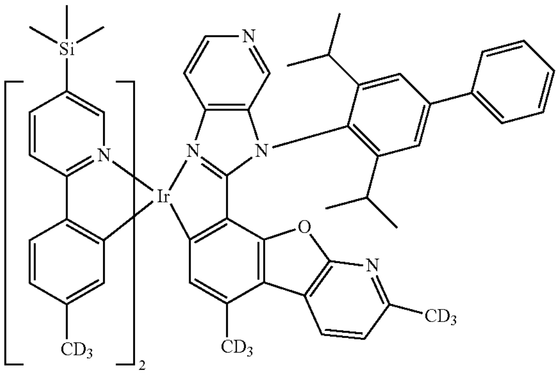
1231
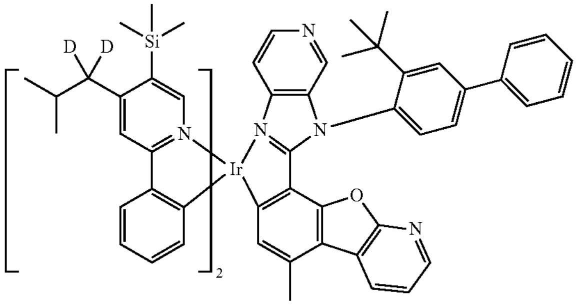
1232
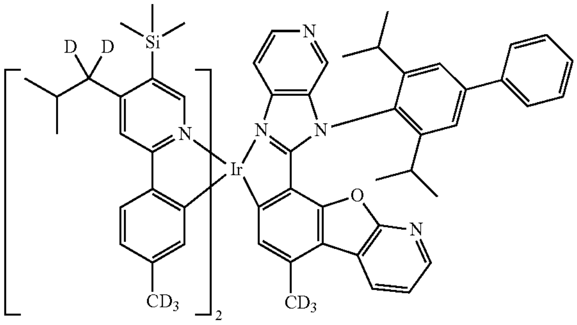

-continued
1233
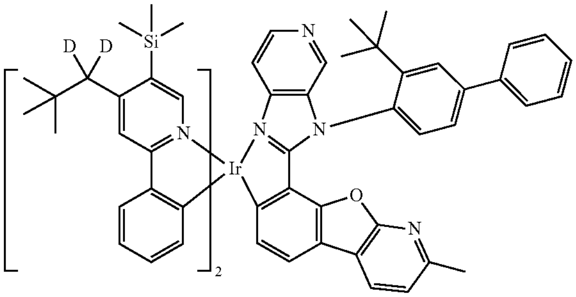
1234
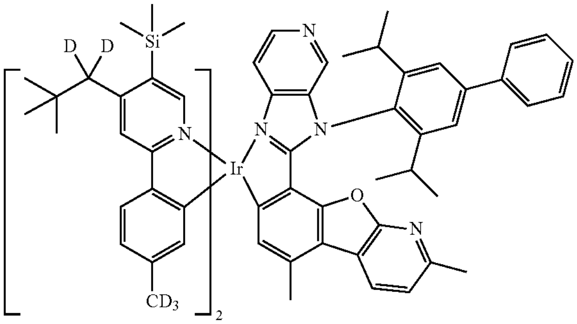
1235
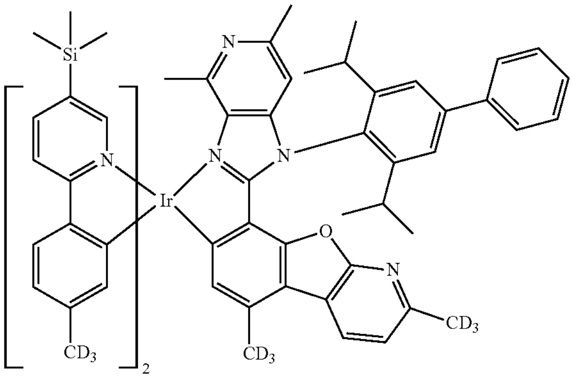
1236
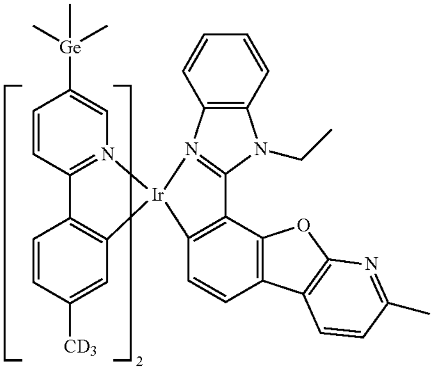
-continued
1237
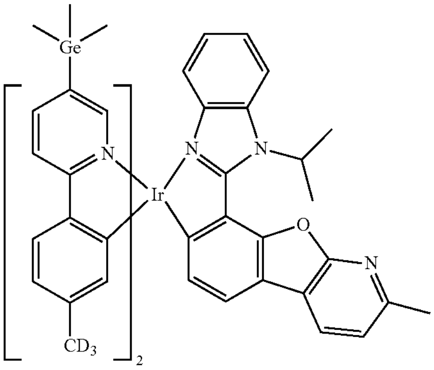
1238
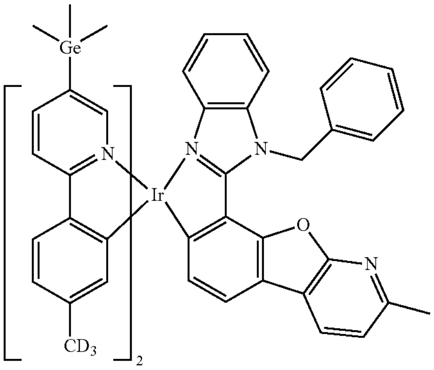
1239
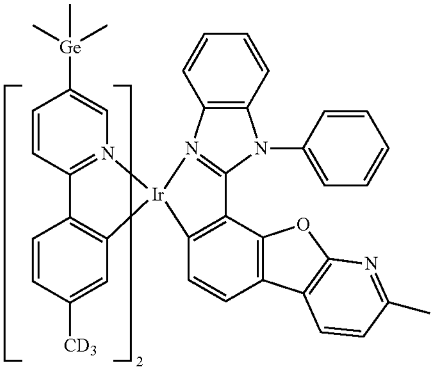
1240
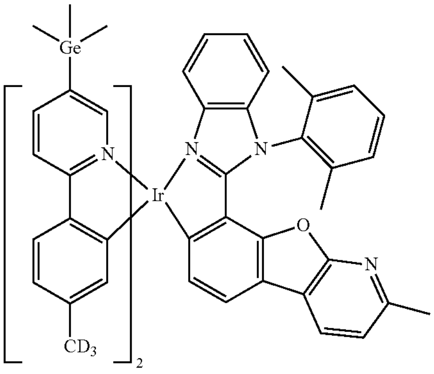

-continued
1241
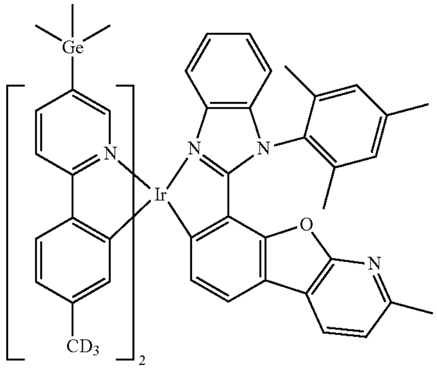
1242
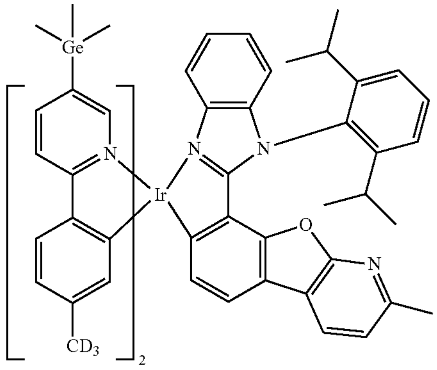
1243
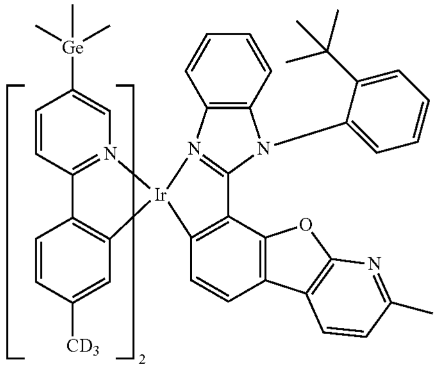
1244
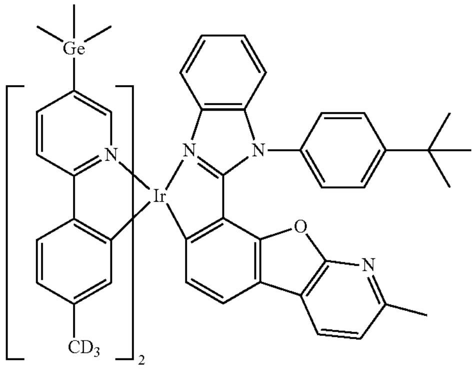
-continued
1245
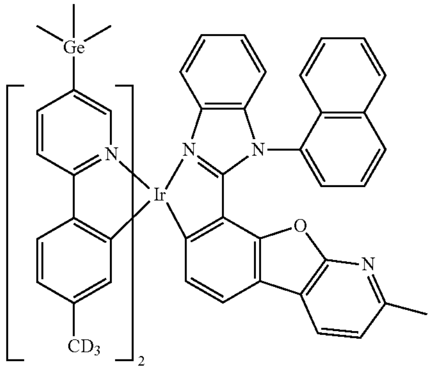
1246
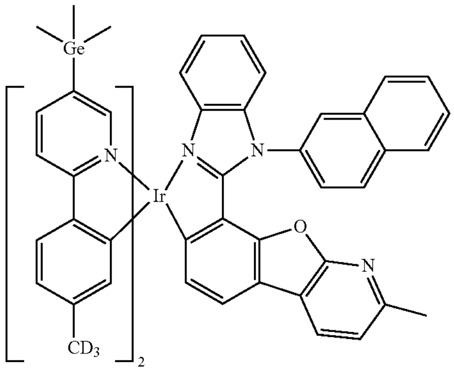
1247
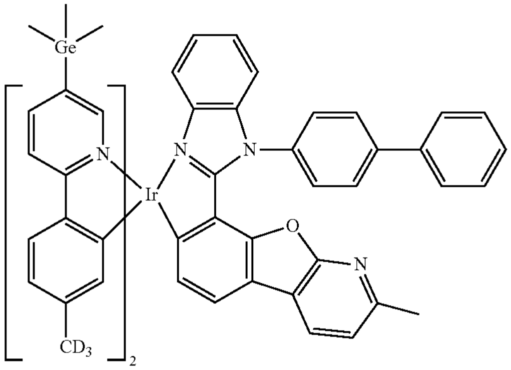
1248
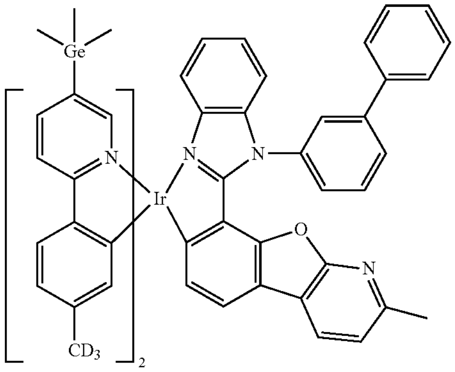

-continued
1249
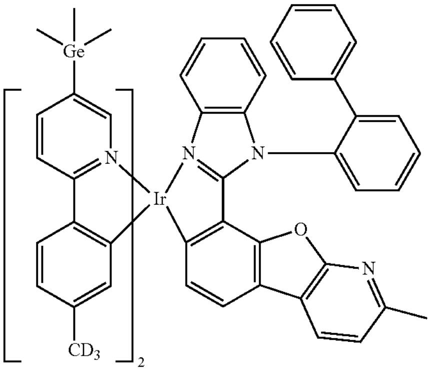
1250
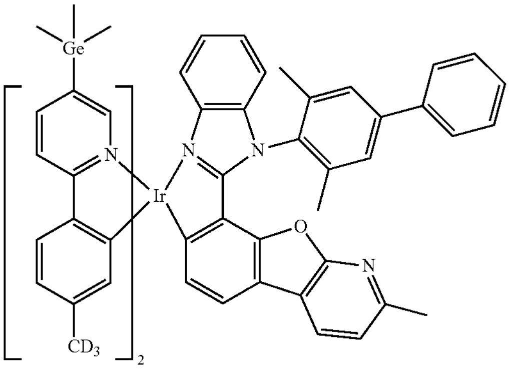
1251
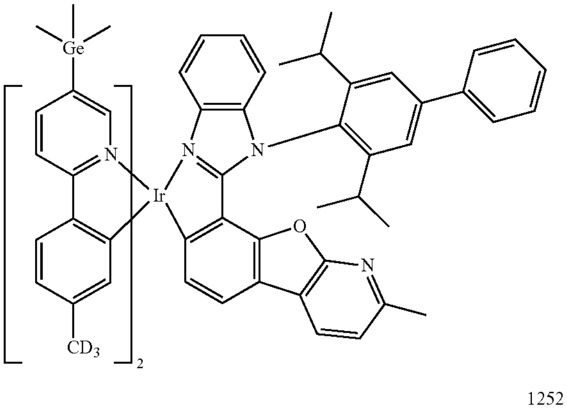
1252
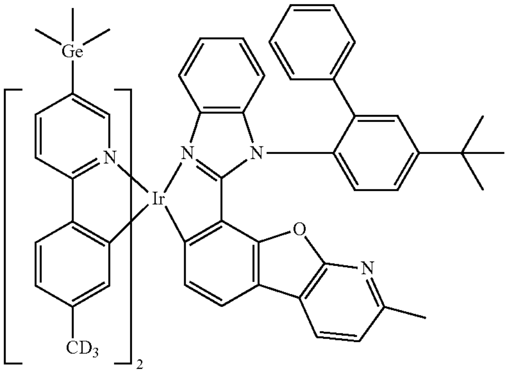
-continued
1253
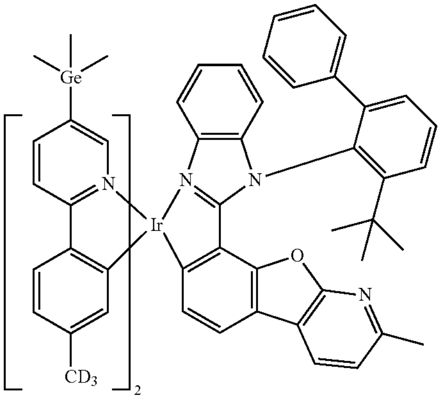
1254
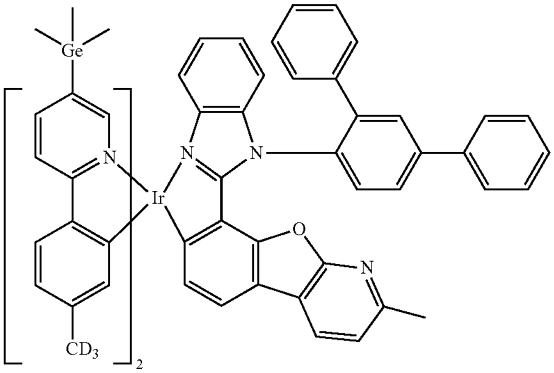
1255
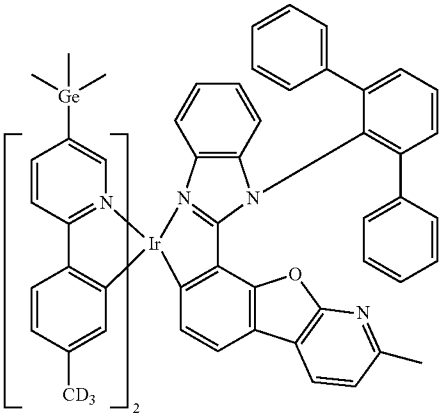

-continued
1256
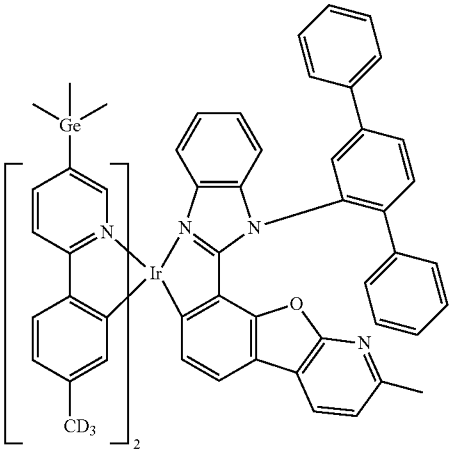
1257
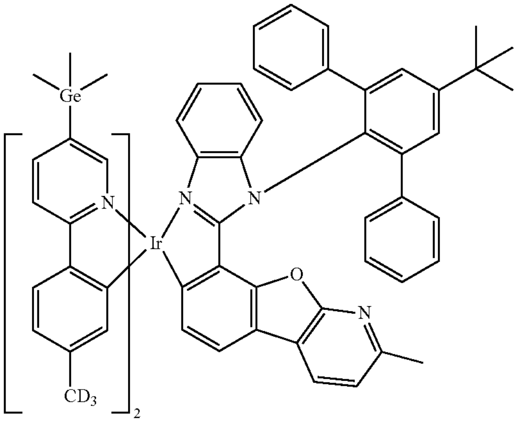
1258
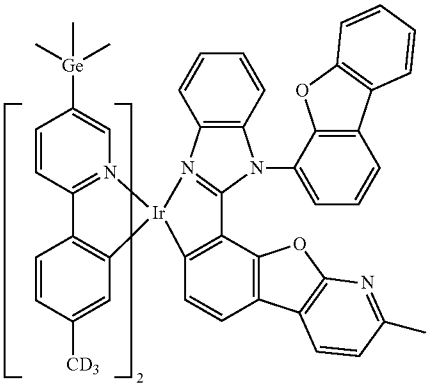
-continued
1259
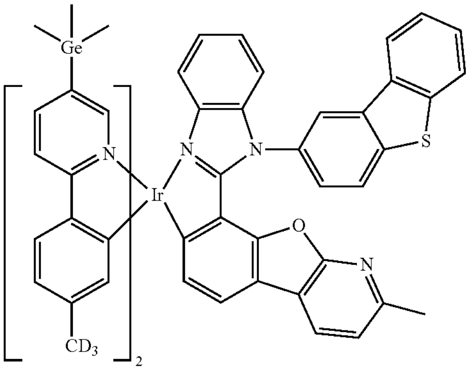
1260
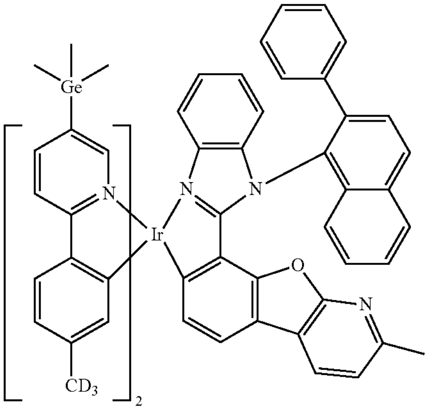
1261
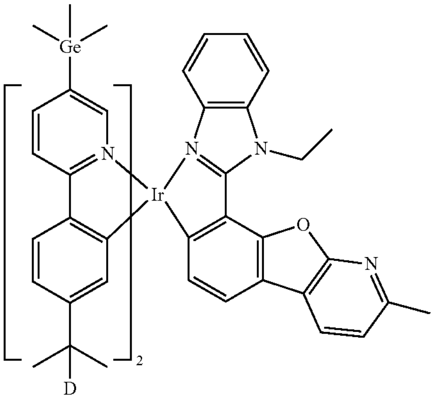
1262
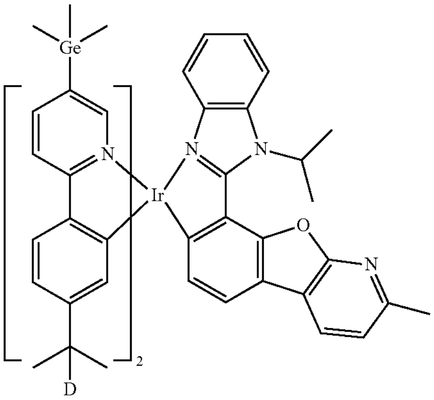

-continued
1263
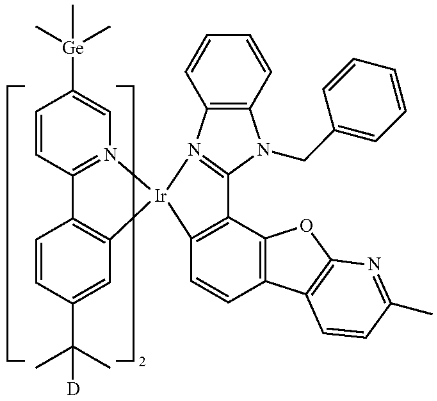
1264
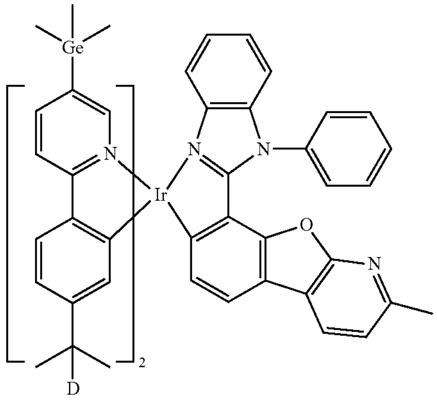
1265
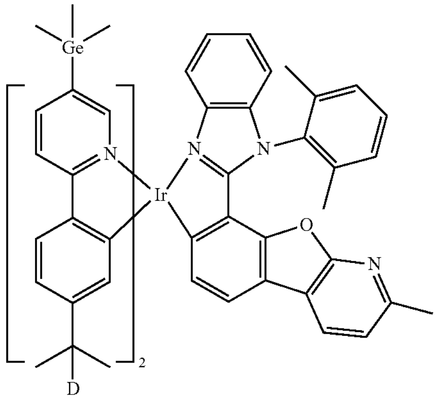
1266
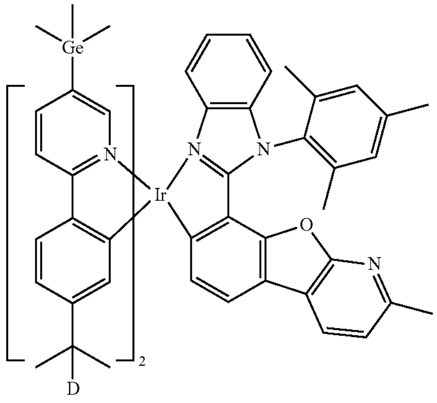
-continued
1267
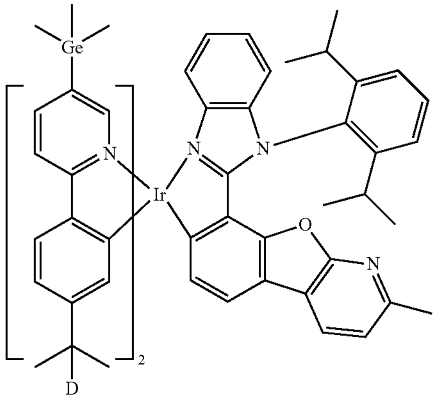
1268
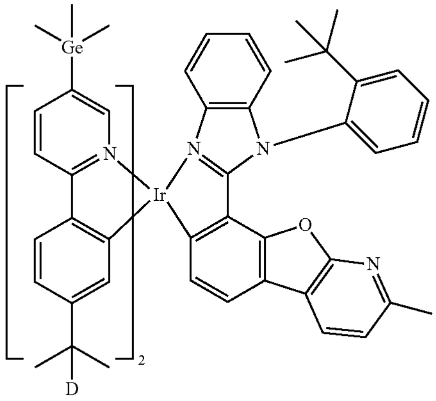
1269
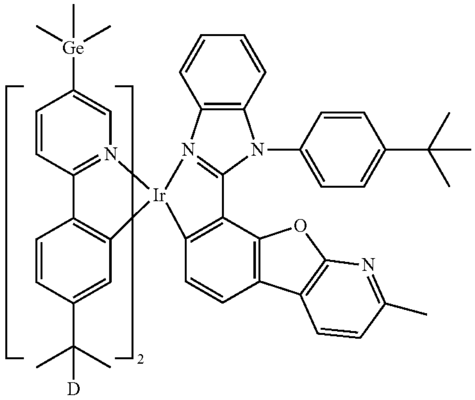
1270
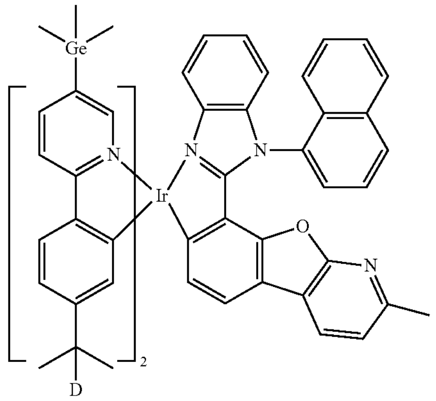

-continued
1271
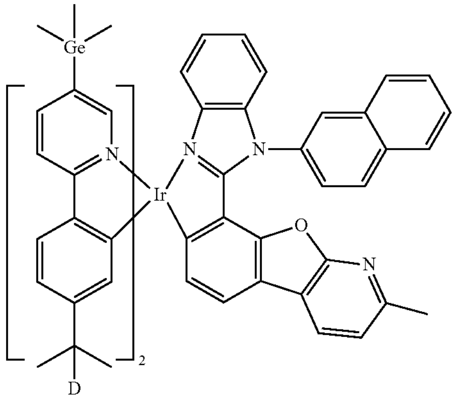
1272
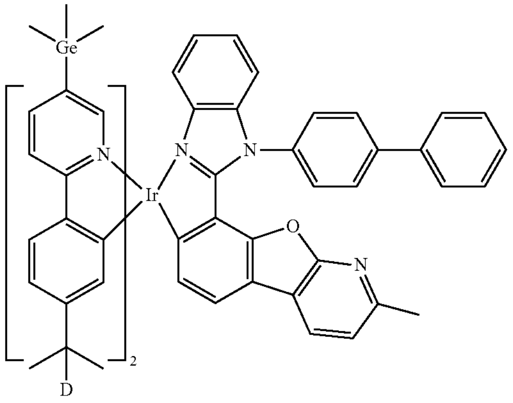
1273
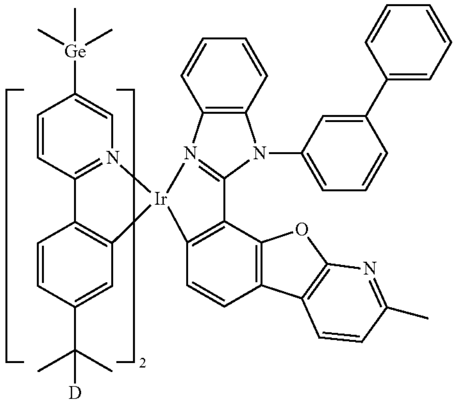
1274
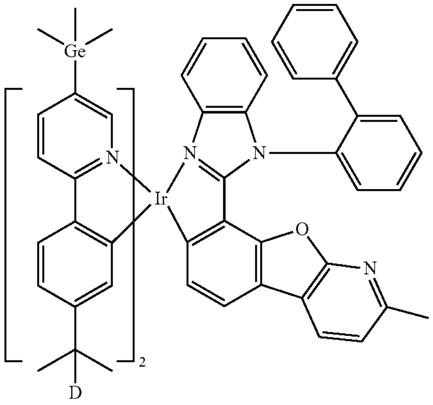
-continued
1275
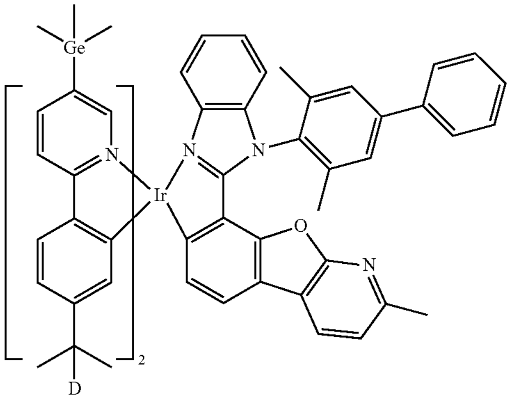
1276
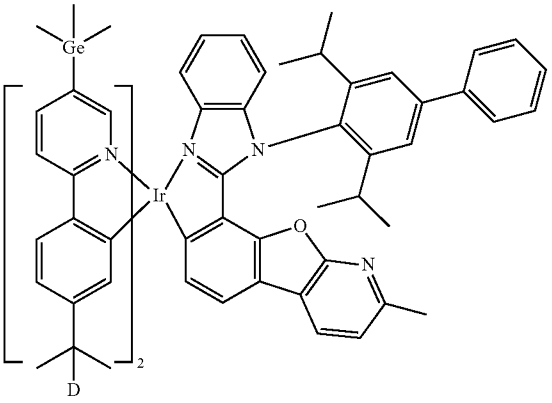
1277
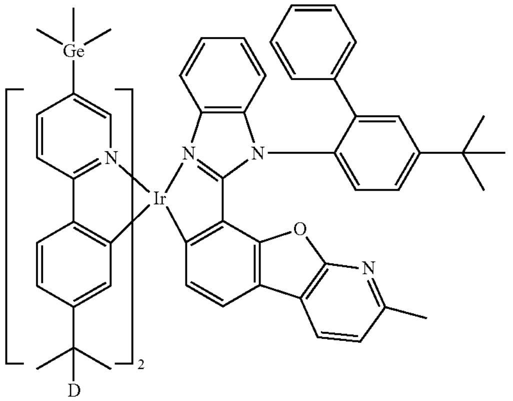

-continued
1278
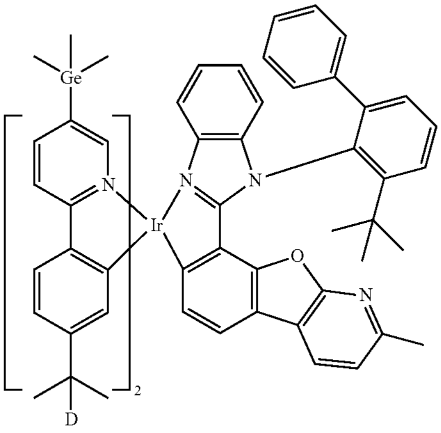
1279
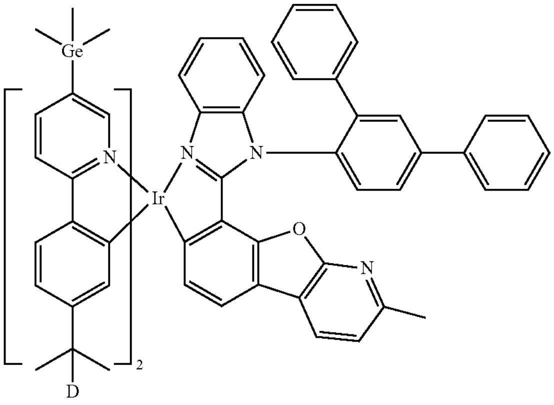
1280
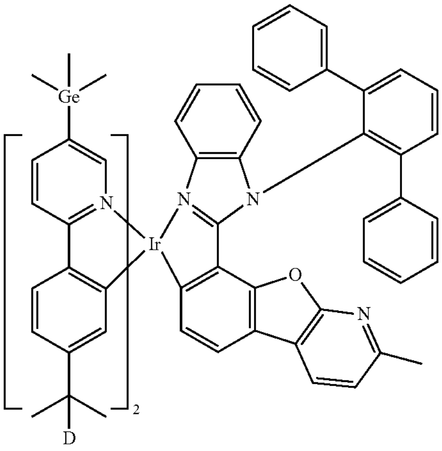
-continued
1281
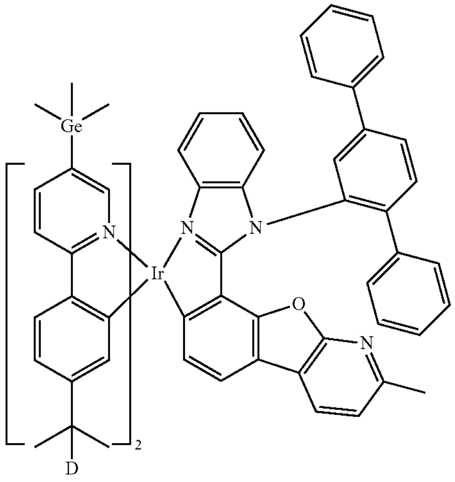
1282
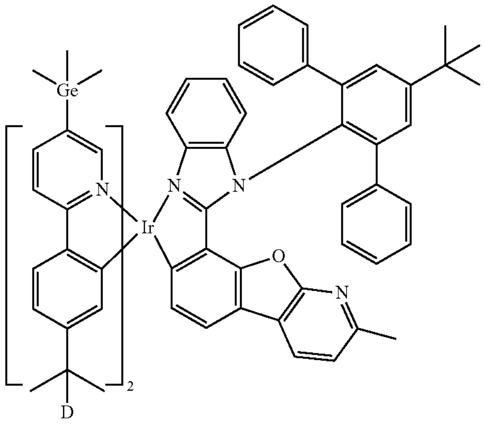
1283
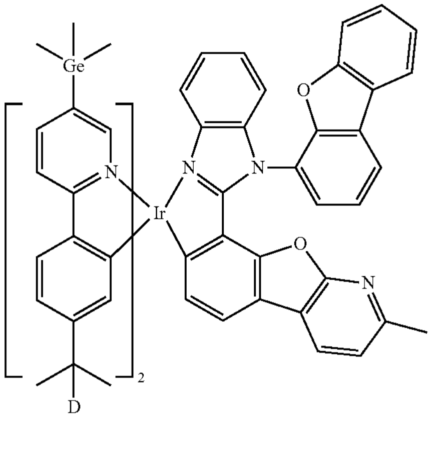

-continued
1284
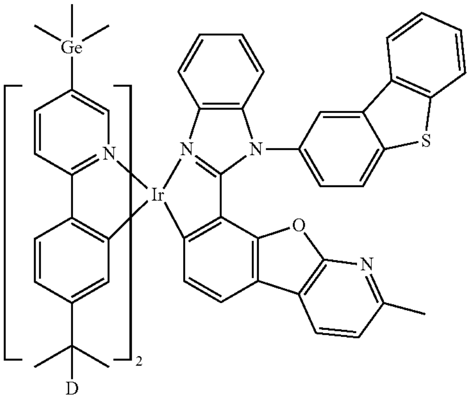
1285
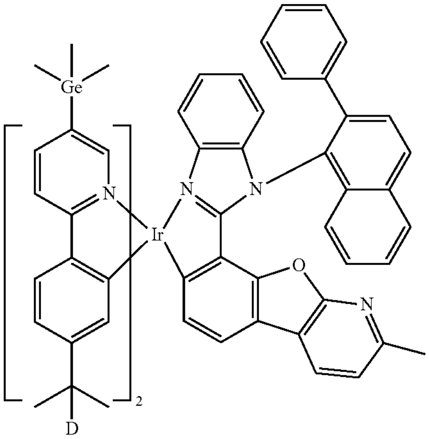
1286
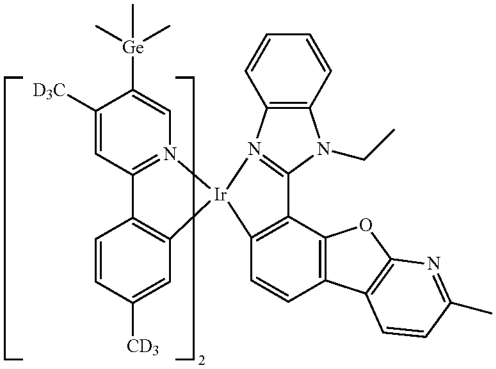
1287
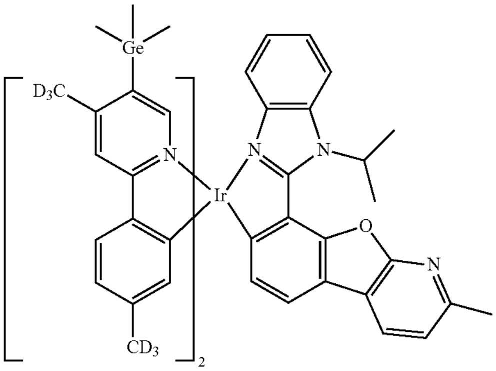
-continued
1288
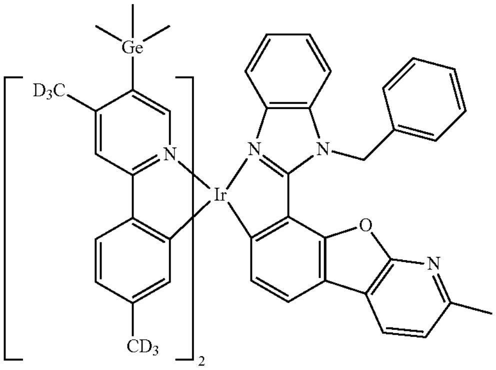
1289
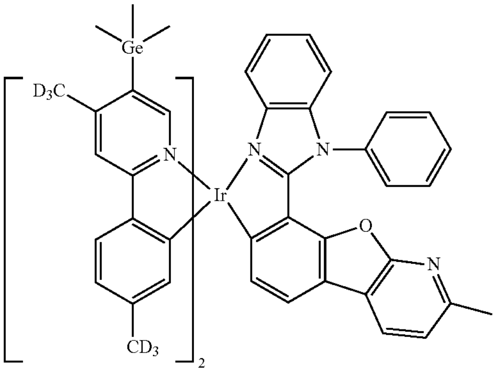
1290
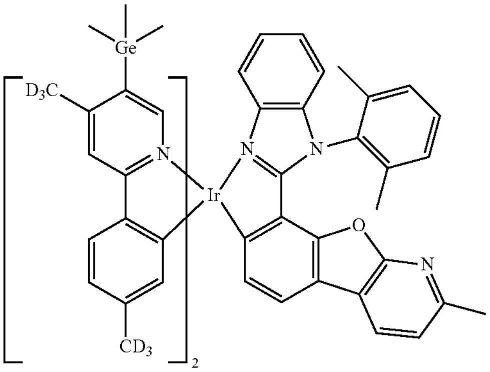
1291
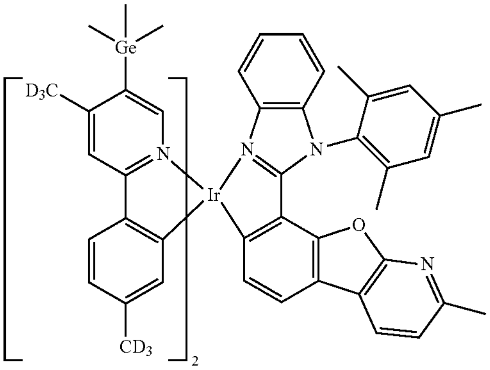

-continued
1292
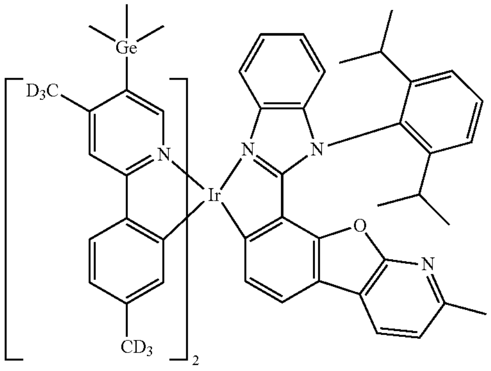
1293
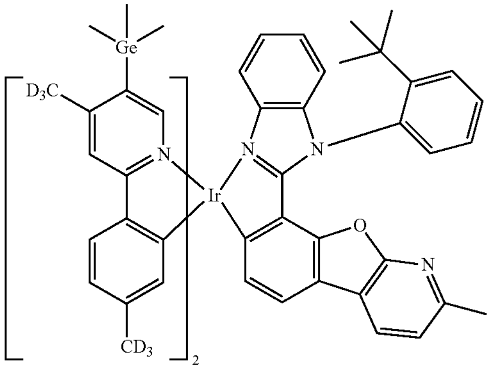
1294
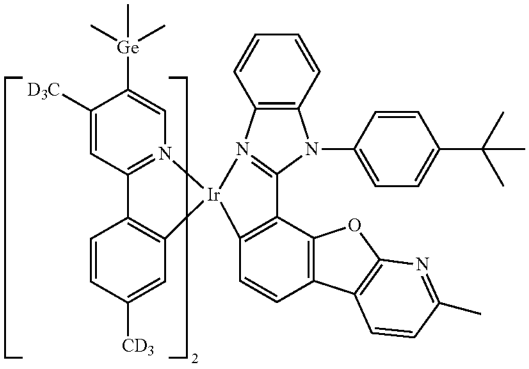
1295
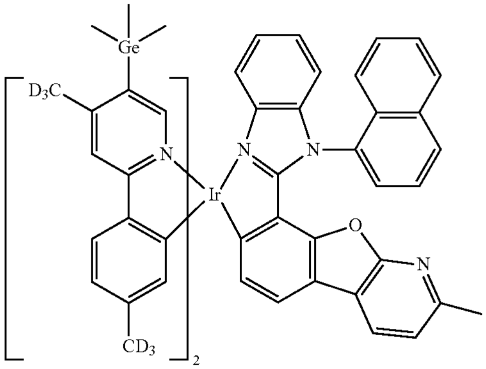
-continued
1296
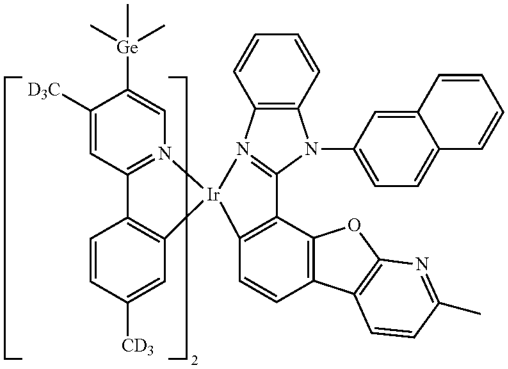
1297
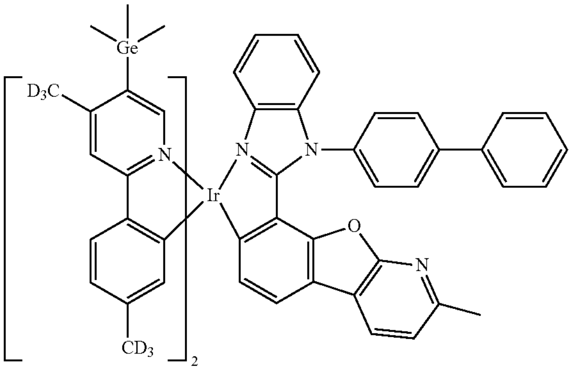
1298
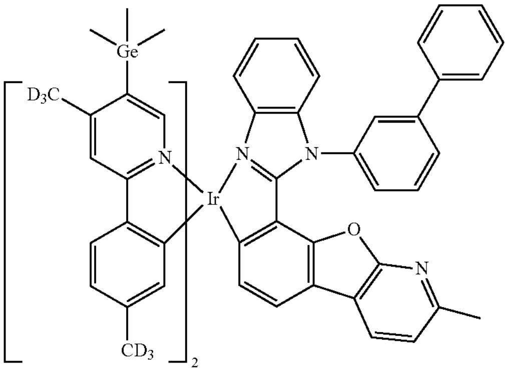
1299
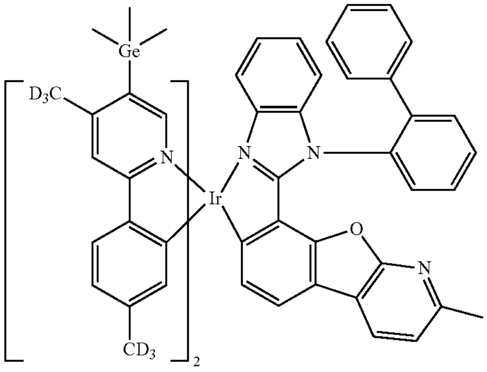

-continued
1300
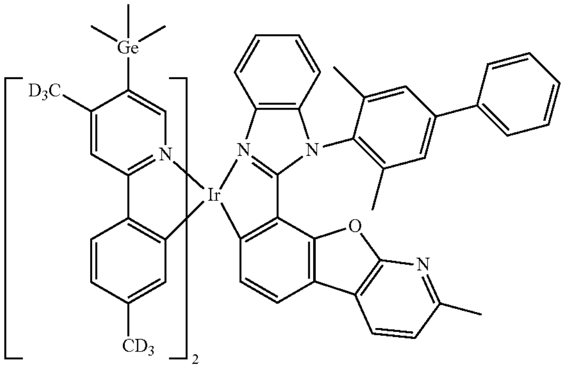
1301
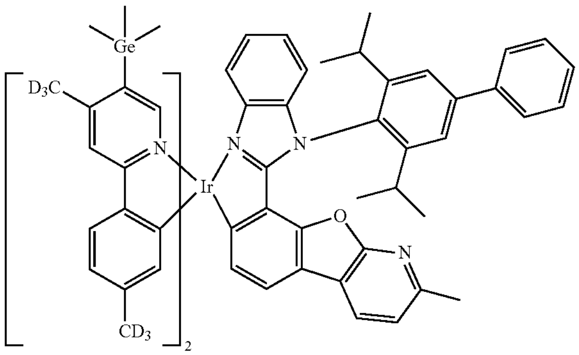
1302
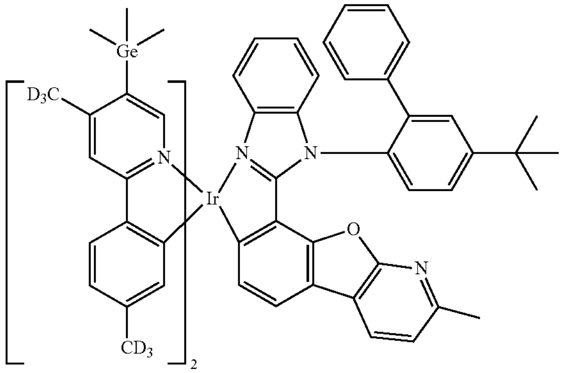
1303
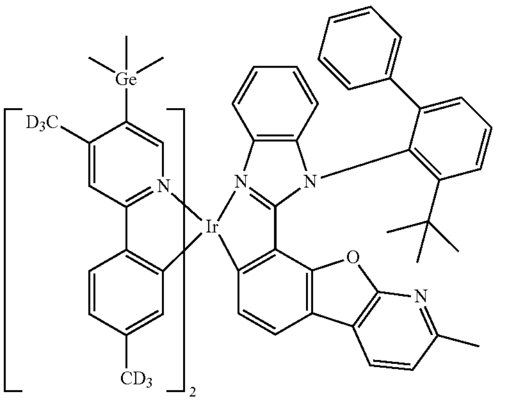
-continued
1304
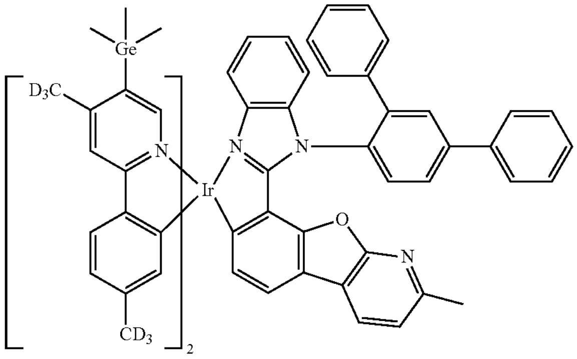
1305
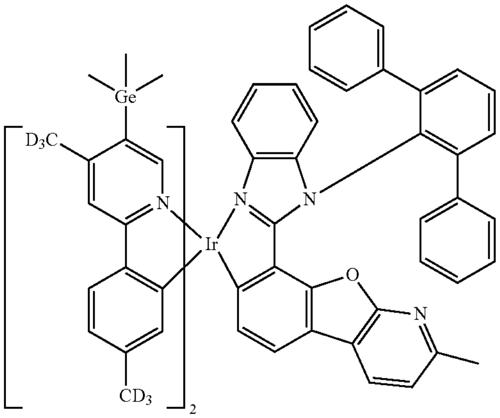
1306
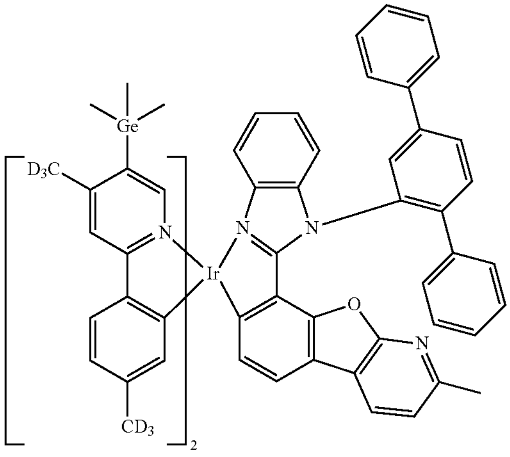

-continued
1307
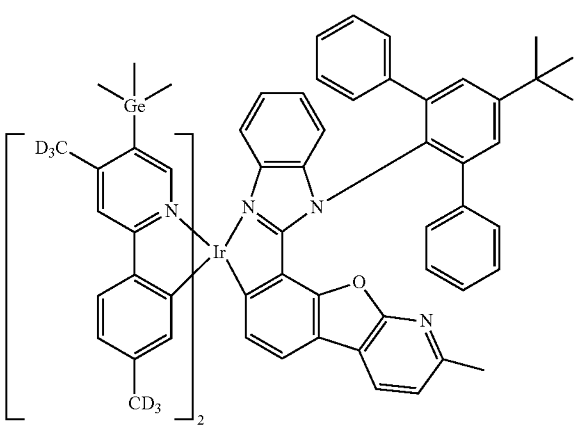
1308
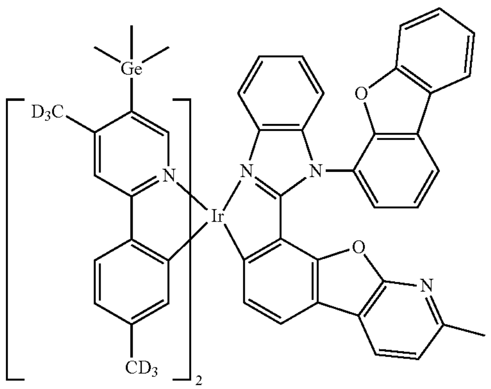
1309
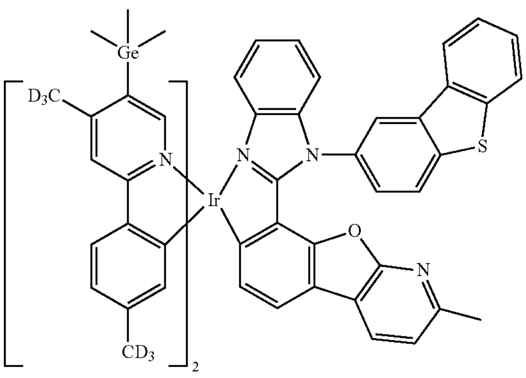
-continued
1310
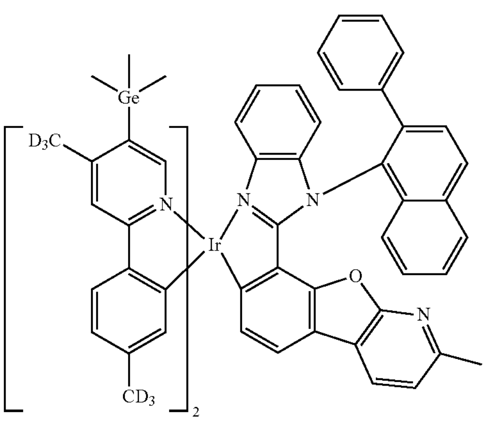
1311
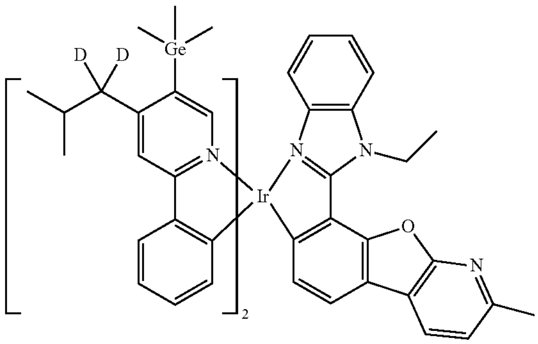
1312
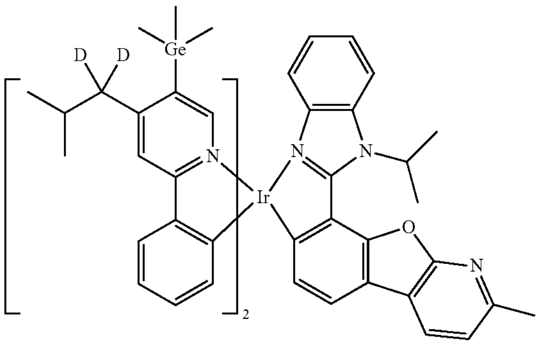
1313
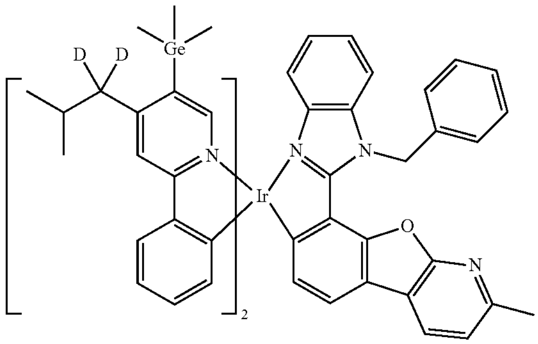

-continued
1314
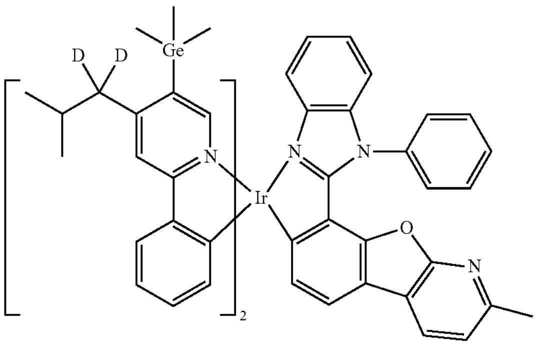
1315
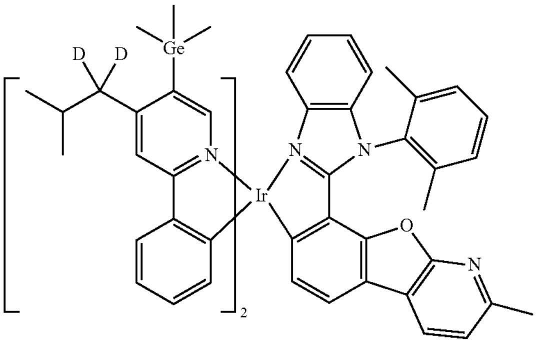
1316
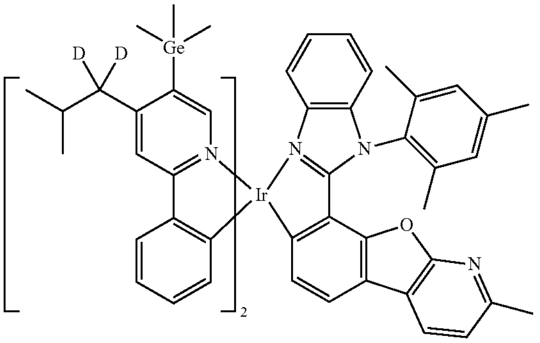
1317
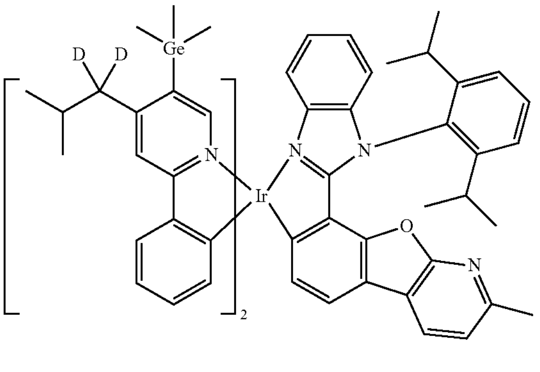
-continued
1318
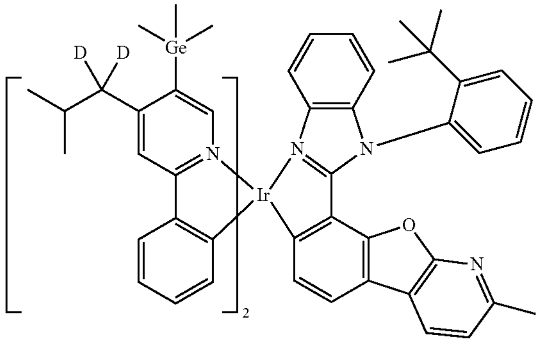
1319
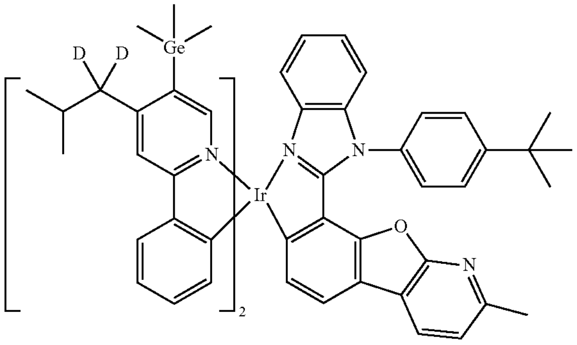
1320
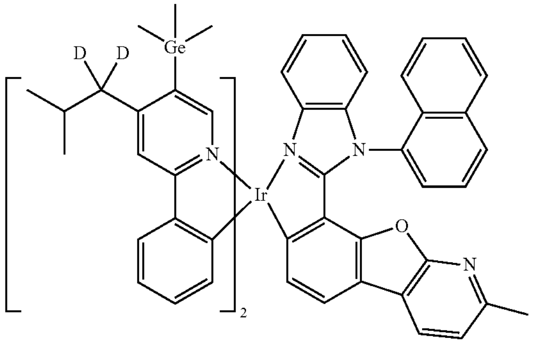
1321
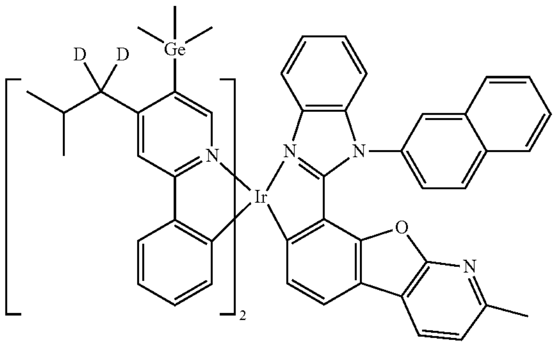

-continued
1322
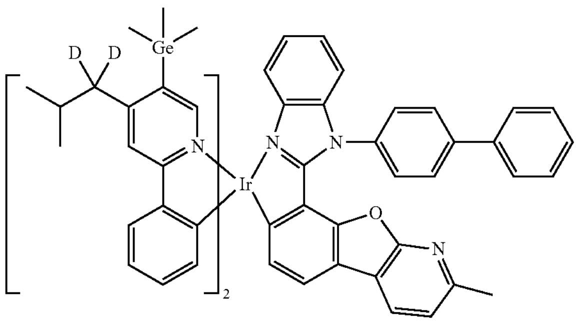
1323
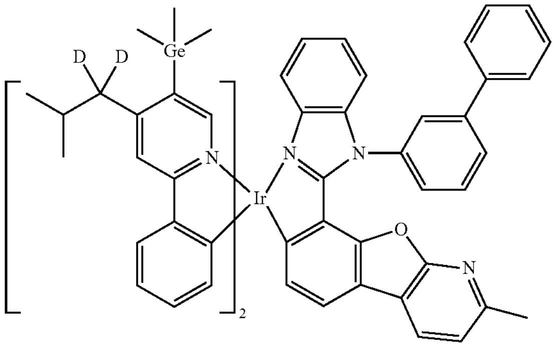
1324
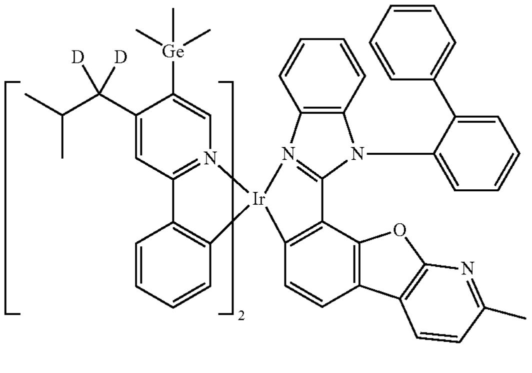
1325
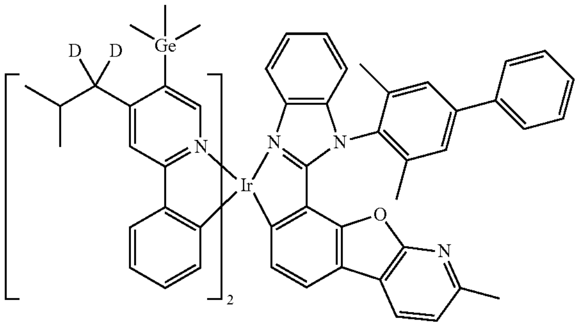
-continued
1326
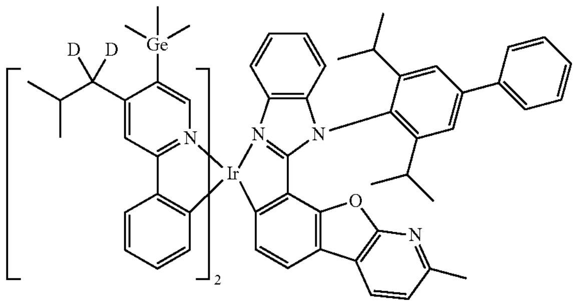
1327
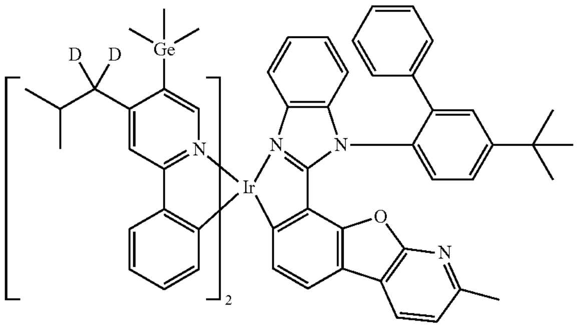
1328
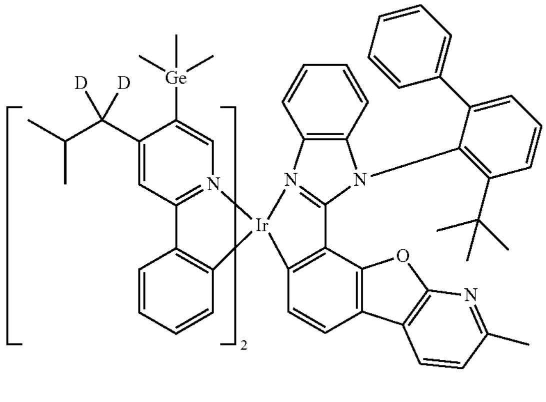
1329
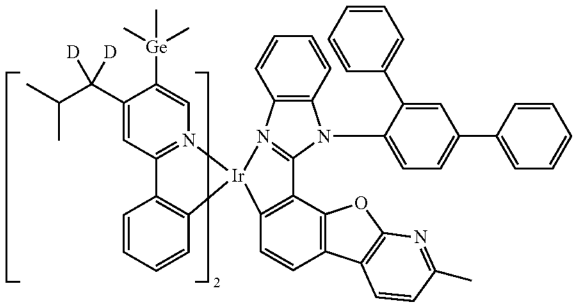

-continued
1330
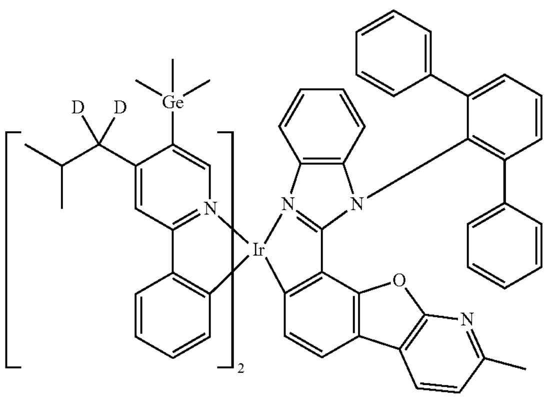
1331
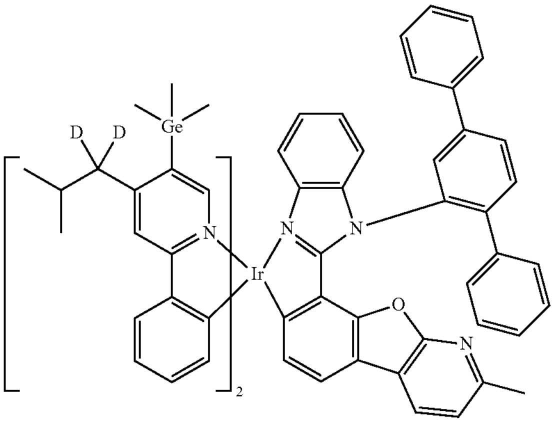
1332
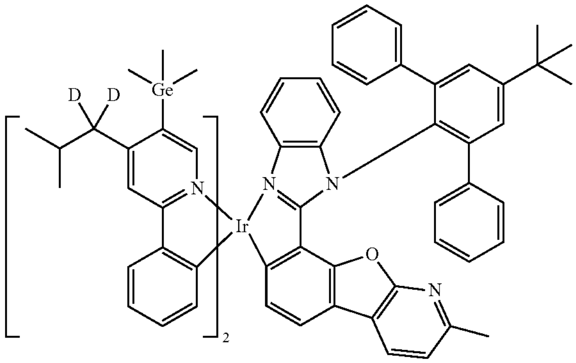
1333
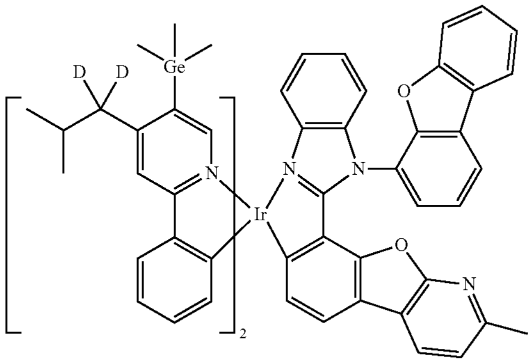
-continued
1334
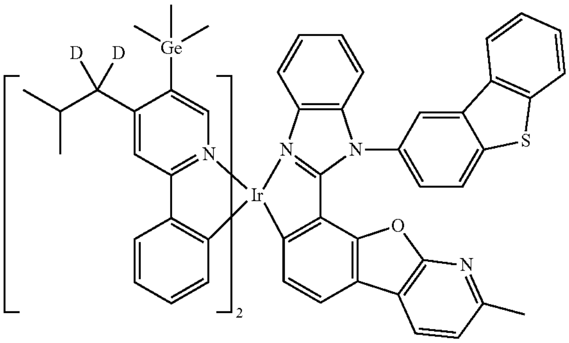
1335
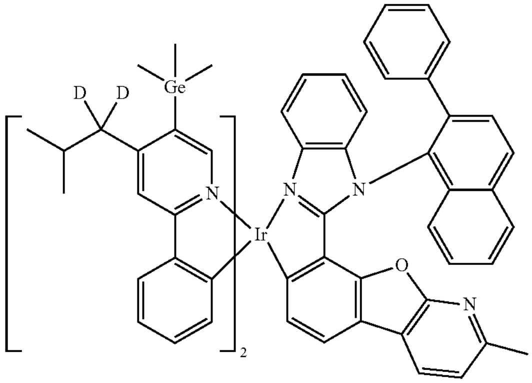
1336
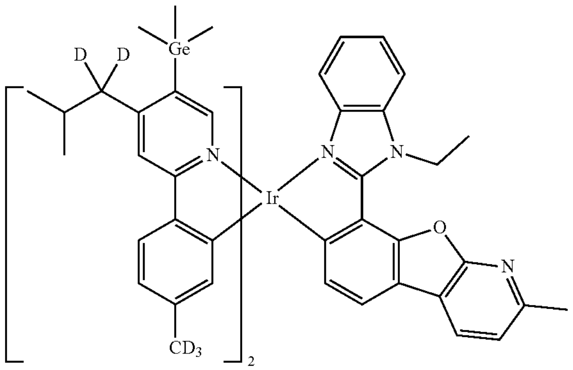
1337
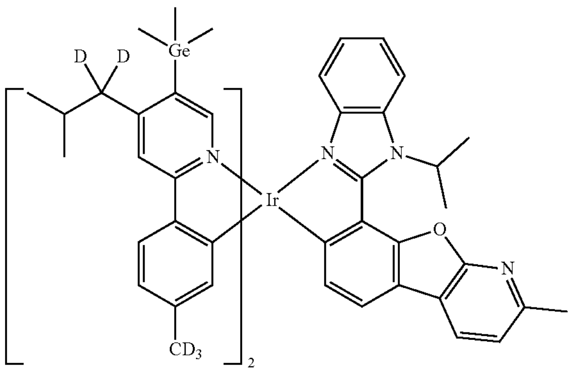

-continued
1338
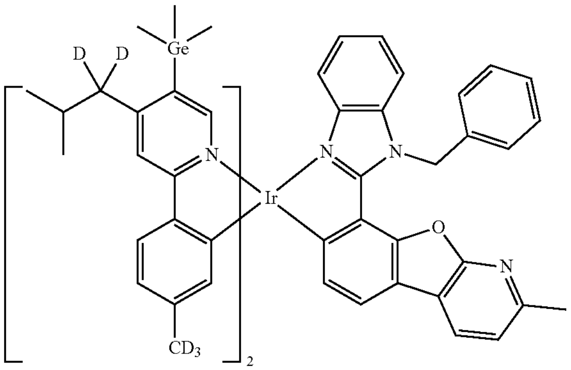
1339
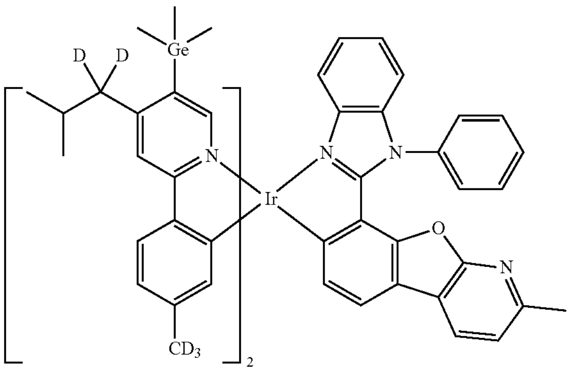
1340
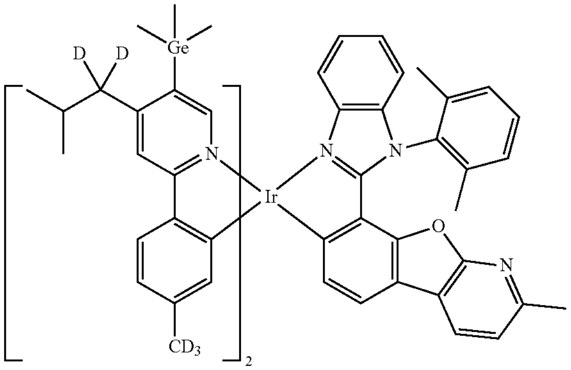
1341
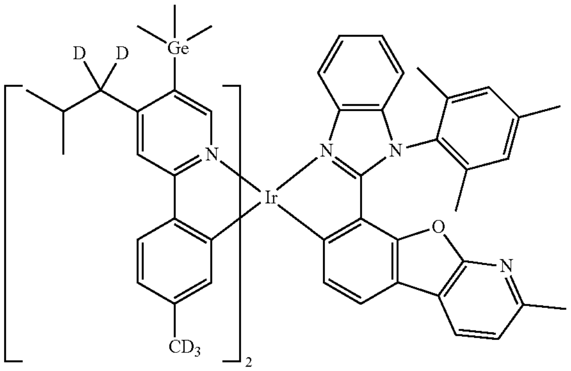
-continued
1342
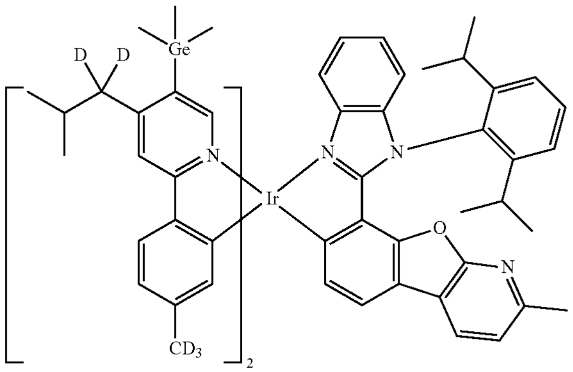
1343
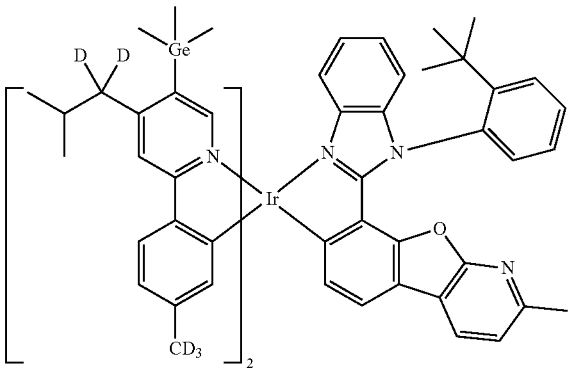
1344
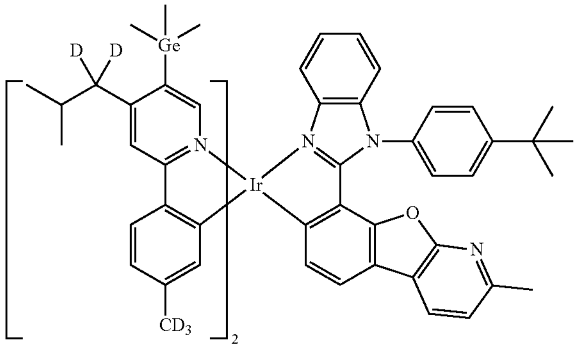
1345
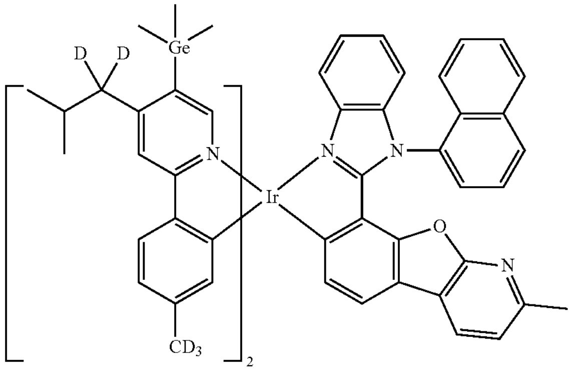

-continued
1346
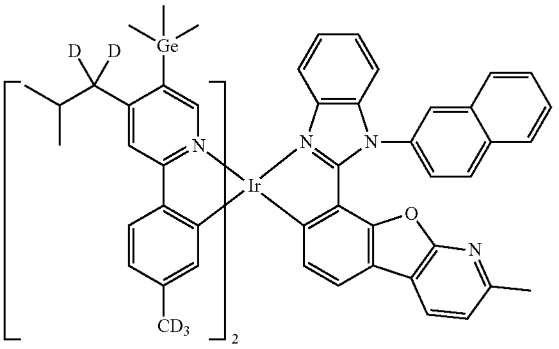
1347
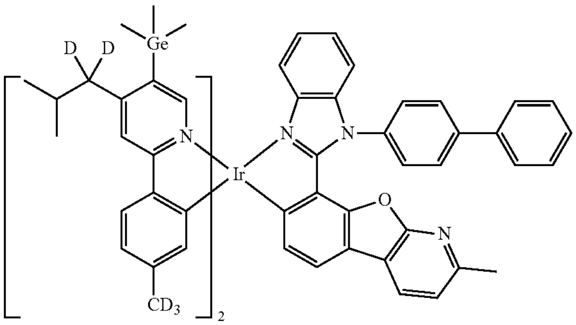
1348
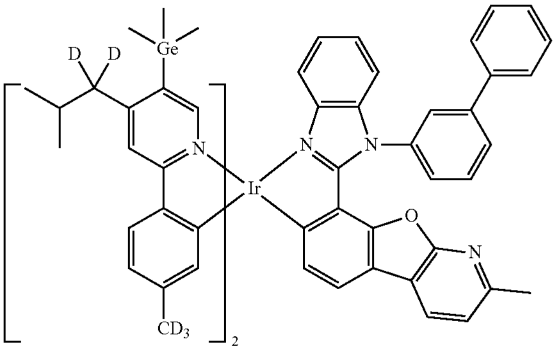
1349
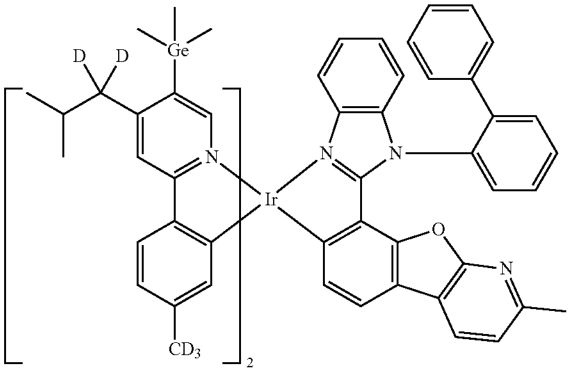
-continued
1350
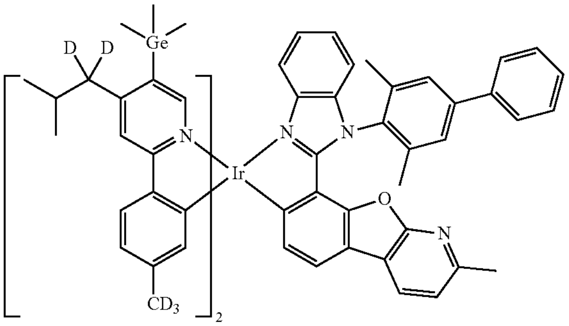
1351
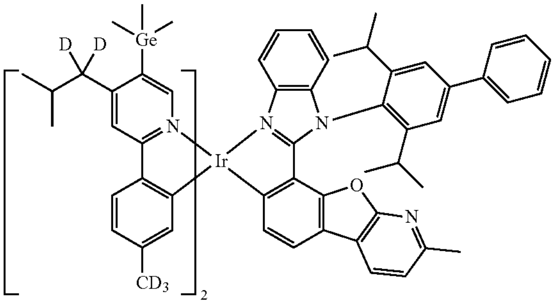
1352
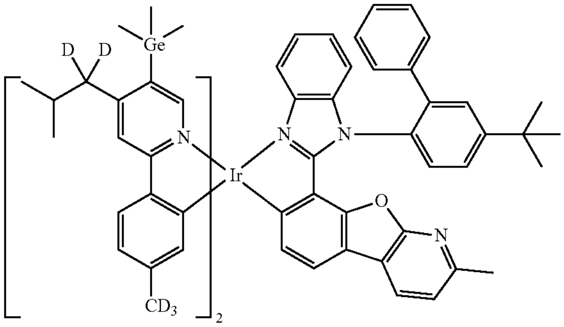
1353
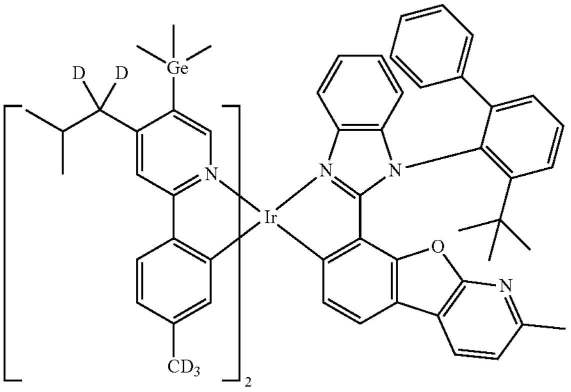

-continued
1354
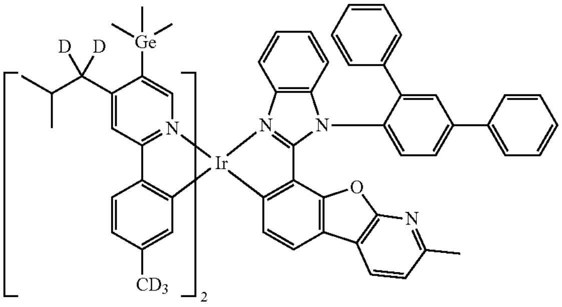
1355
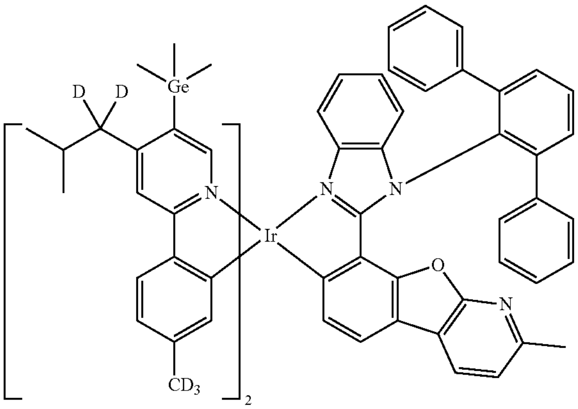
1356
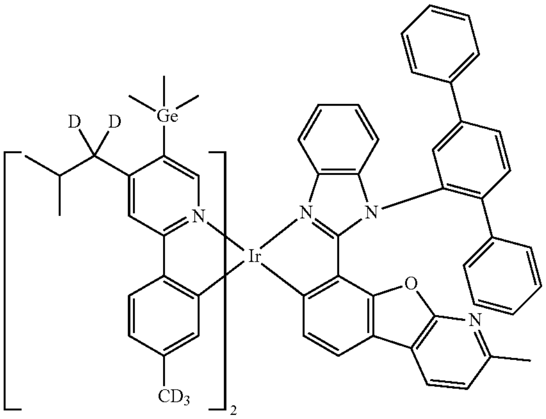
1357
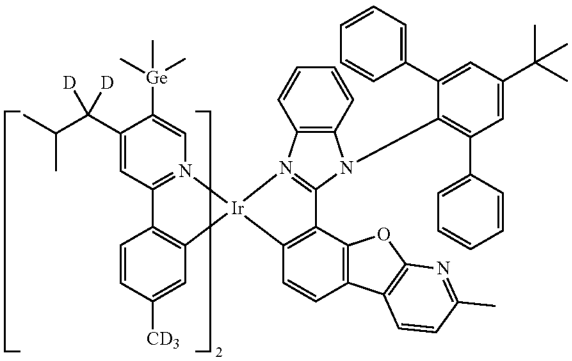
-continued
1358
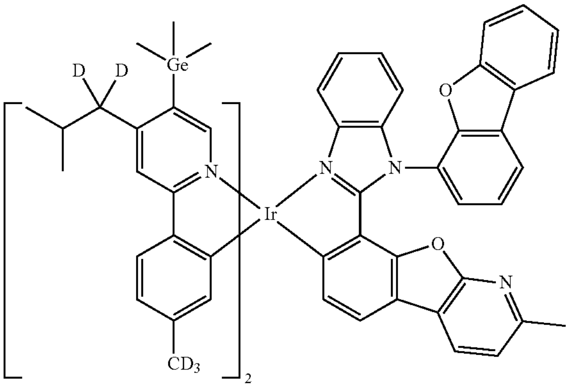
1359
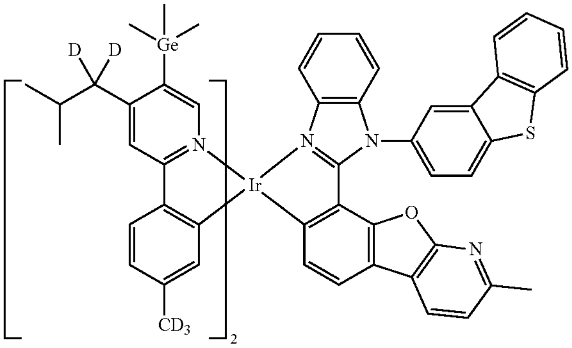
1360
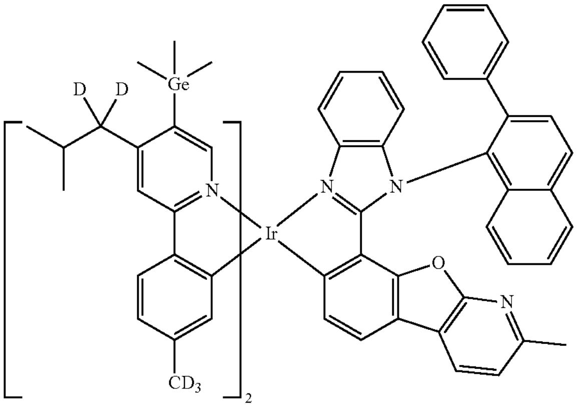
1361
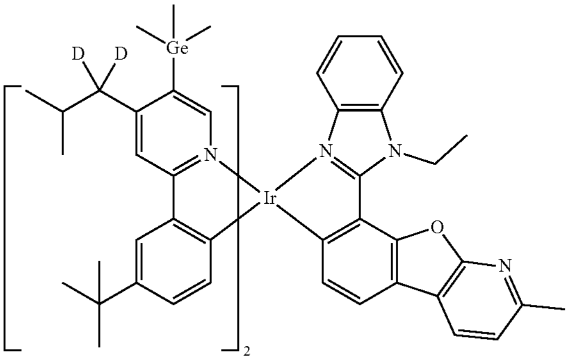

-continued
1362
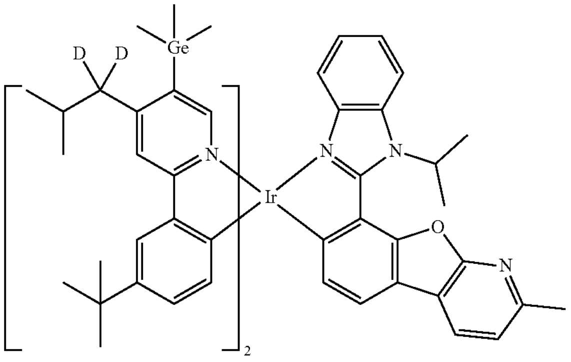
1363
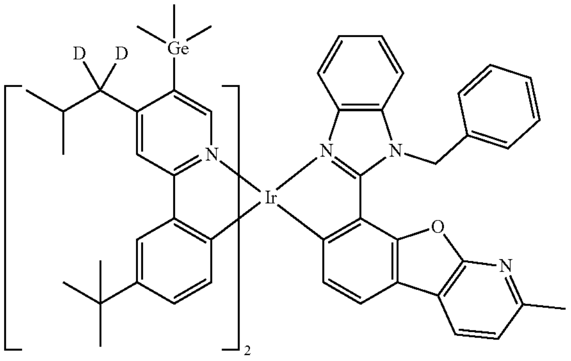
1364
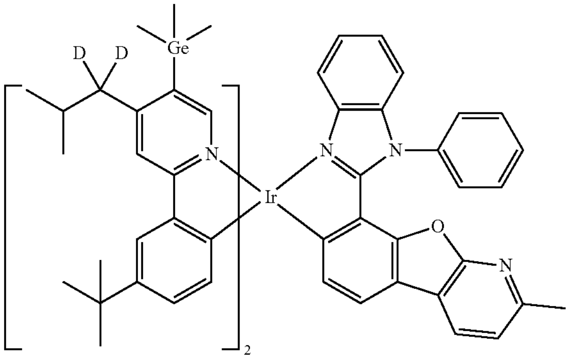
1365
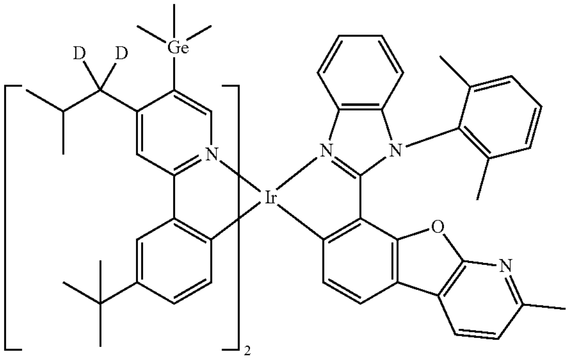
-continued
1366
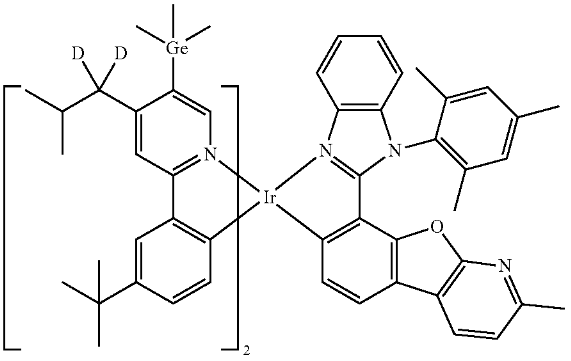
1367
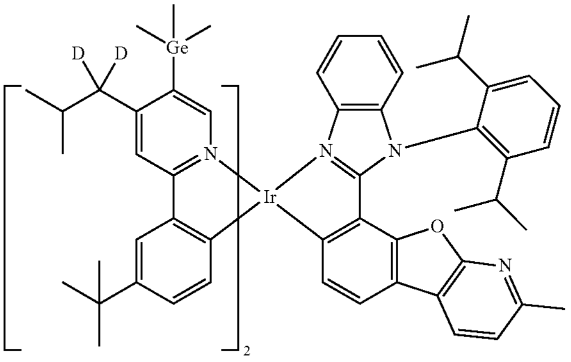
1368
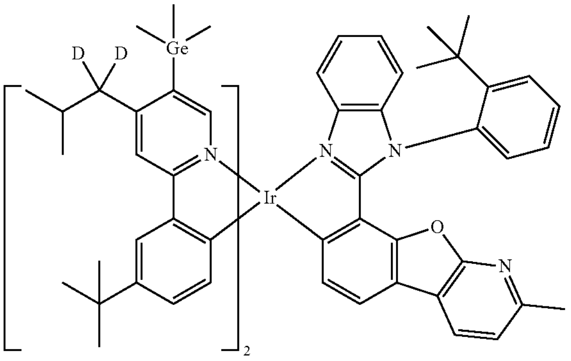
1369
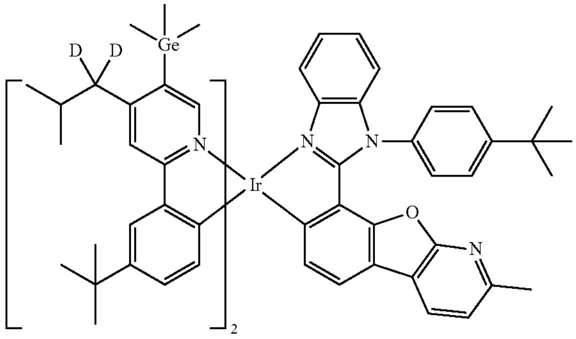

1370
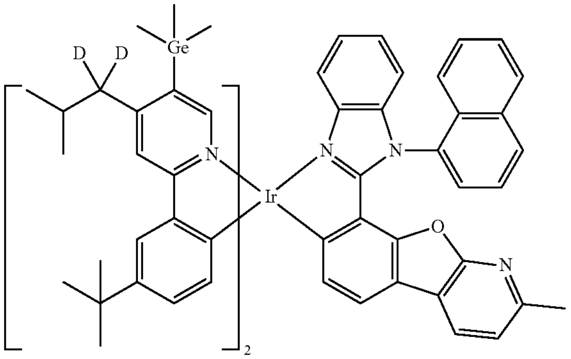
1376
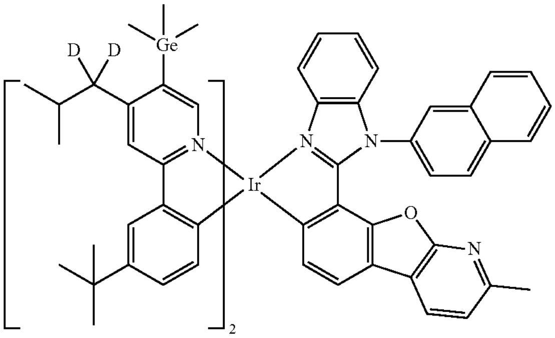
1377
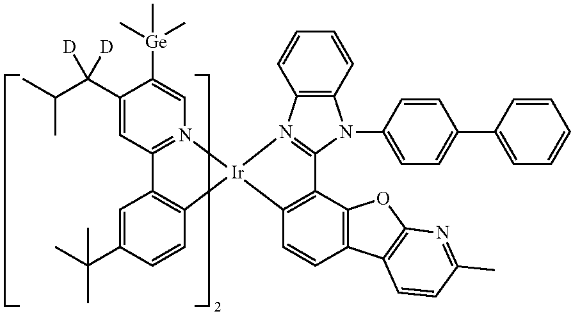
1378
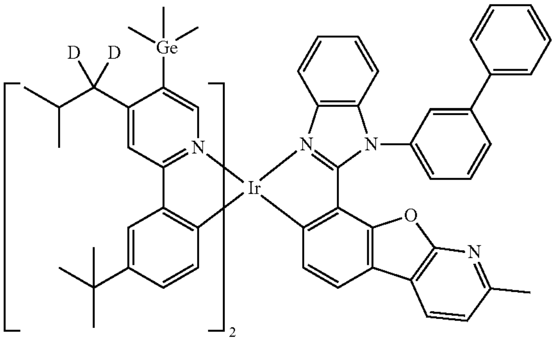
1379
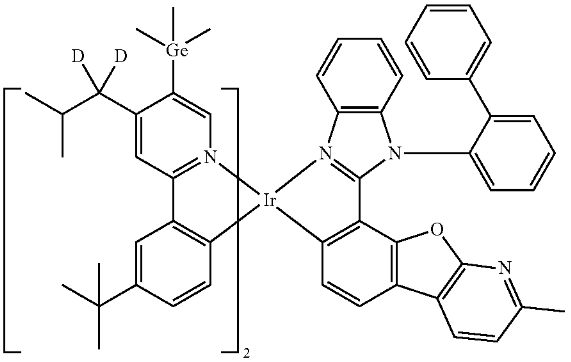
1375
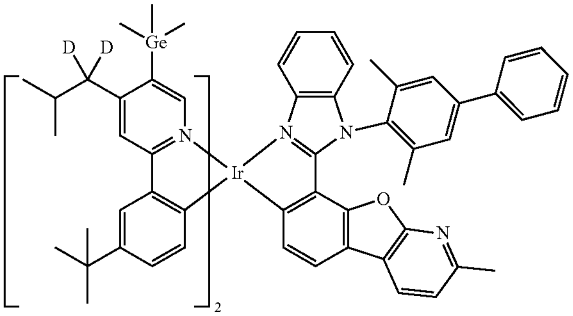
1376
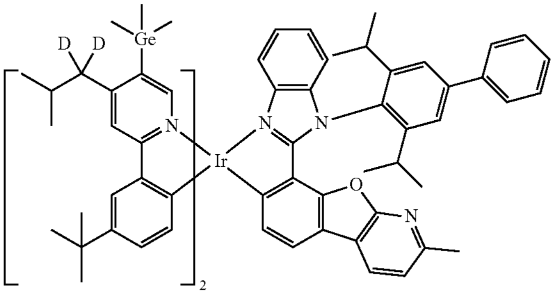
1377
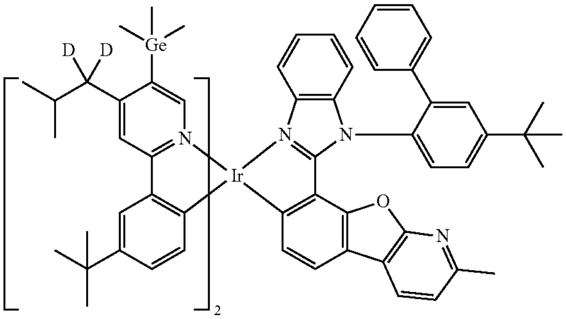

-continued
1378
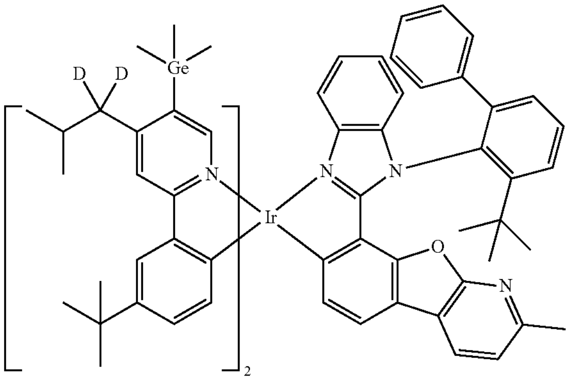
1379
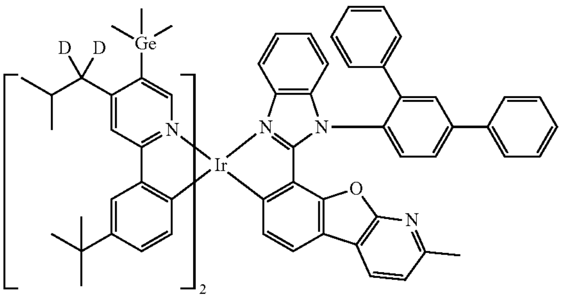
1380
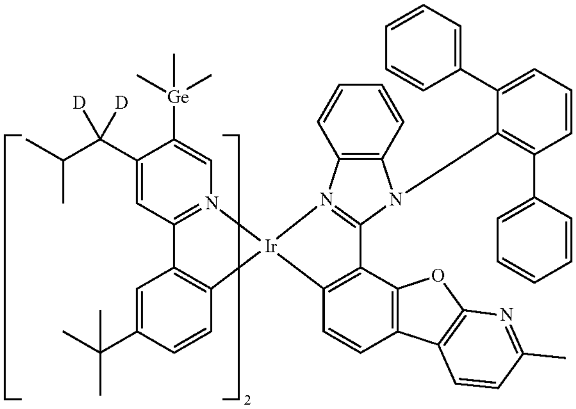
1381
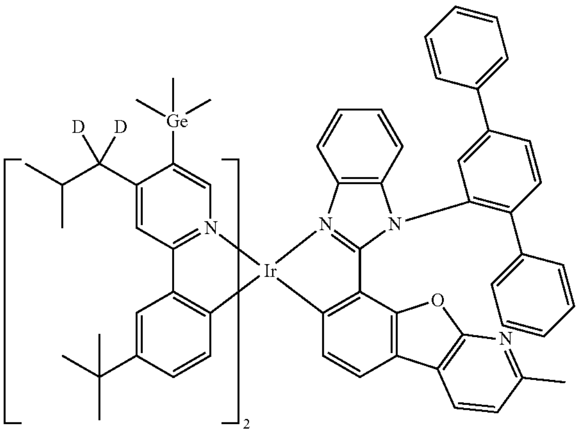
-continued
1382
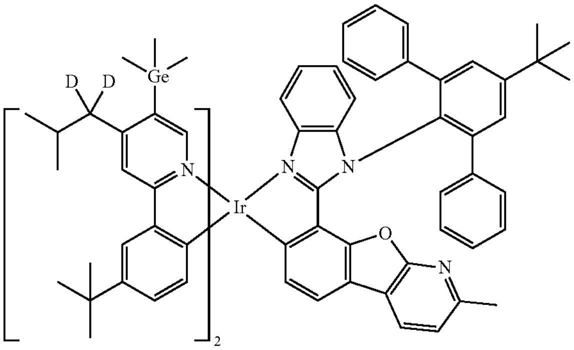
1383
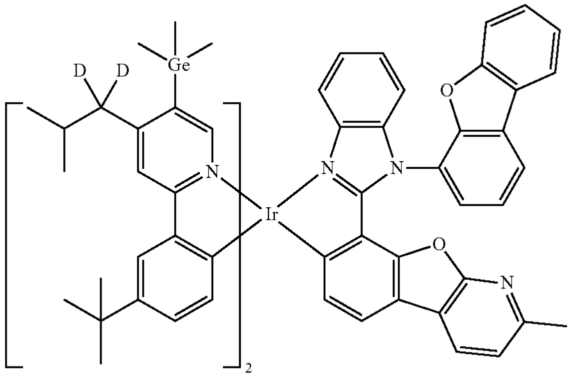
1384
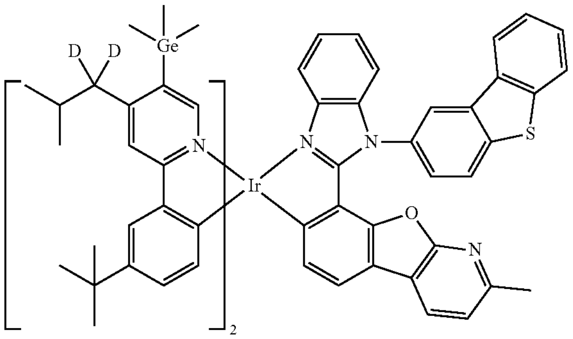
1385
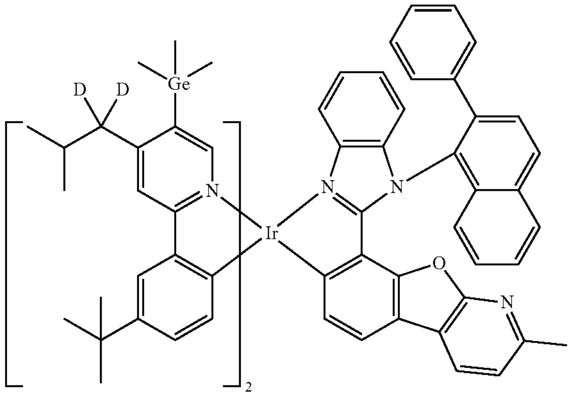

-continued
1386
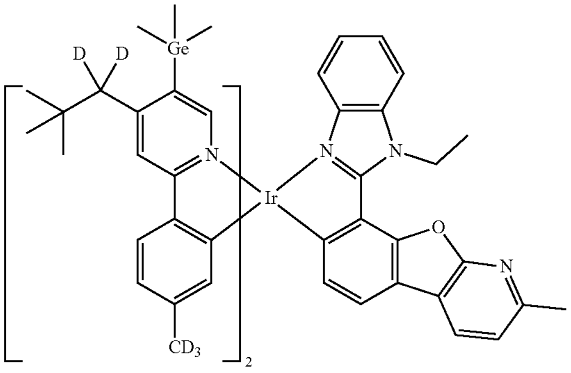
1387
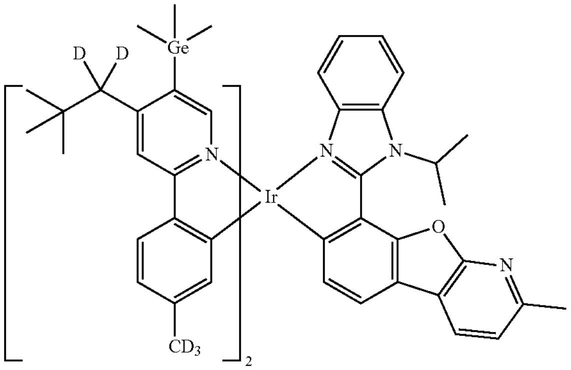
1388
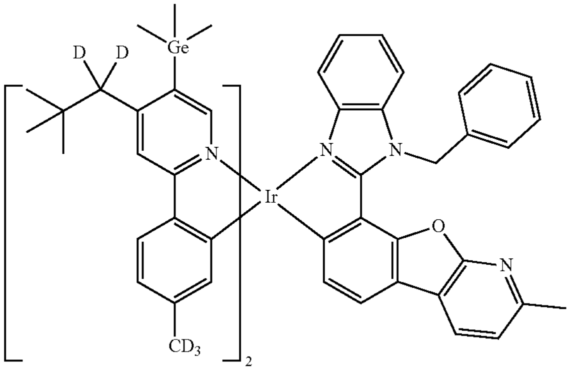
1389
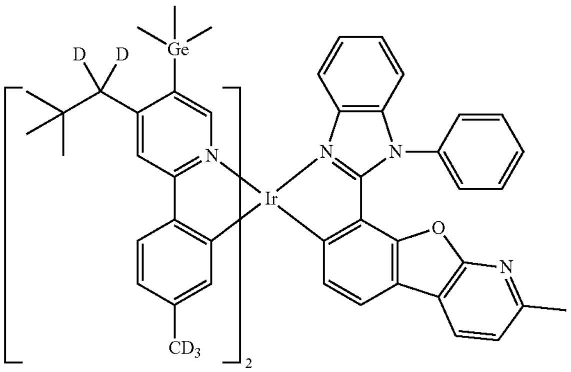
-continued
1390
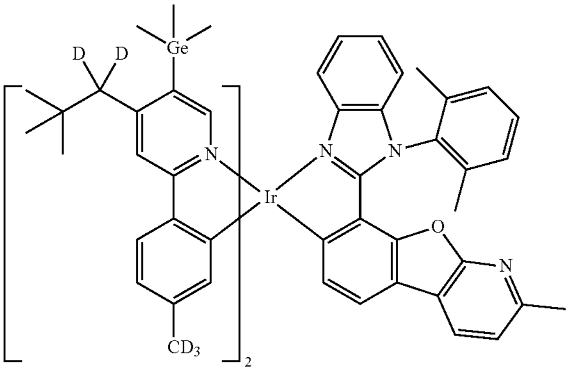
1391
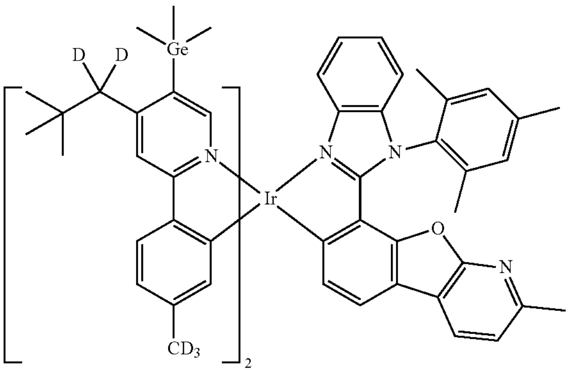
1392
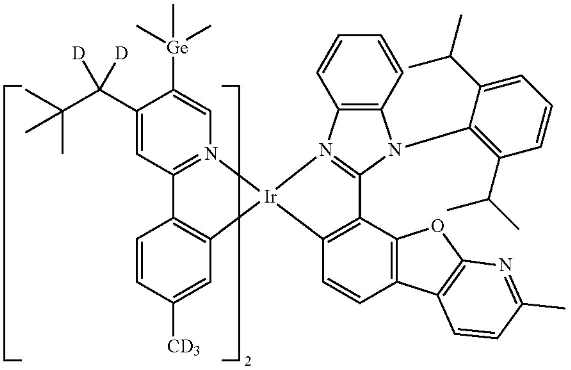
1393
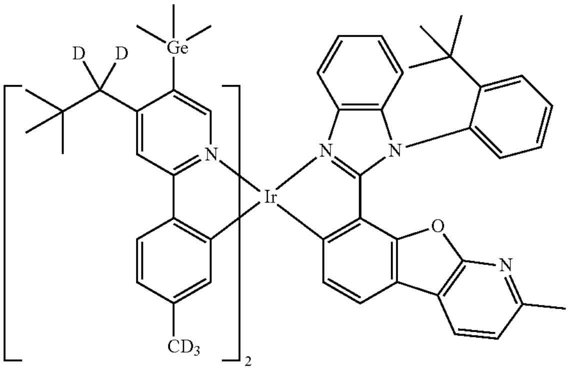

-continued
1394
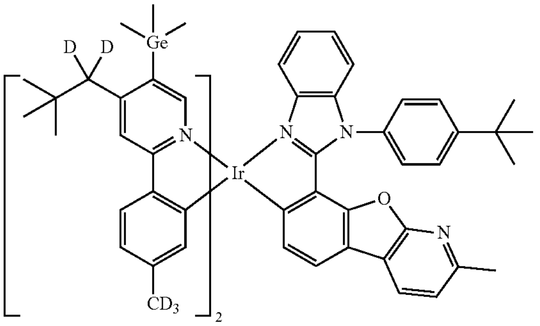
1395
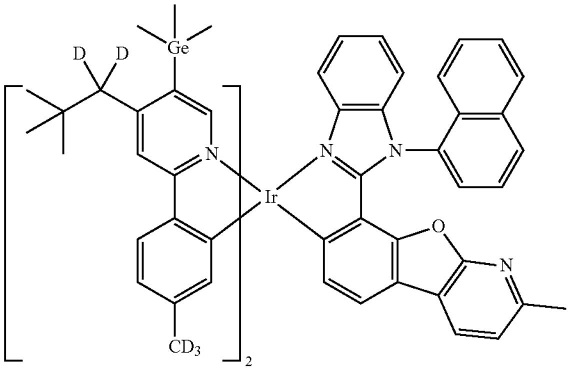
1396
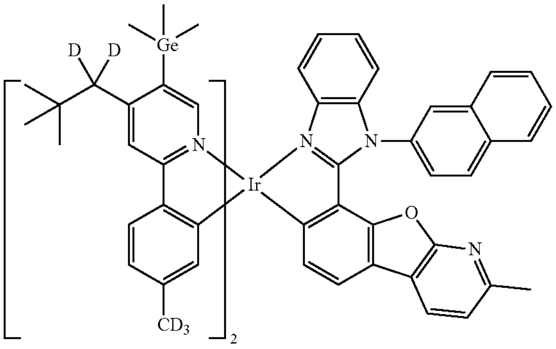
1397
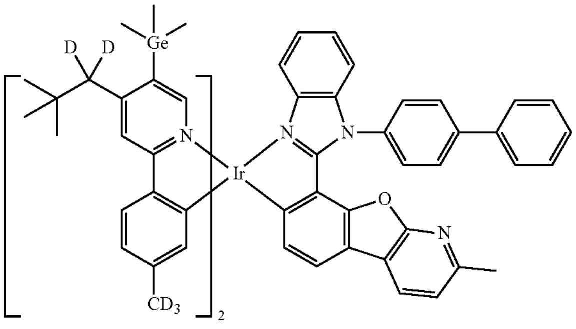
-continued
1398
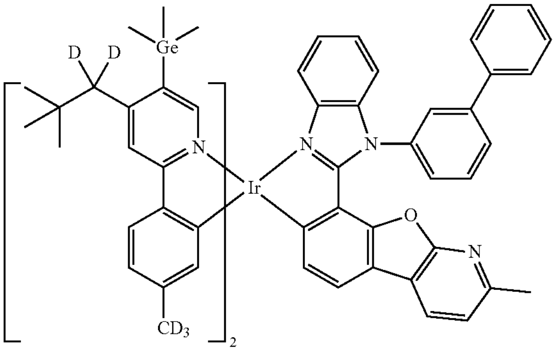
1399
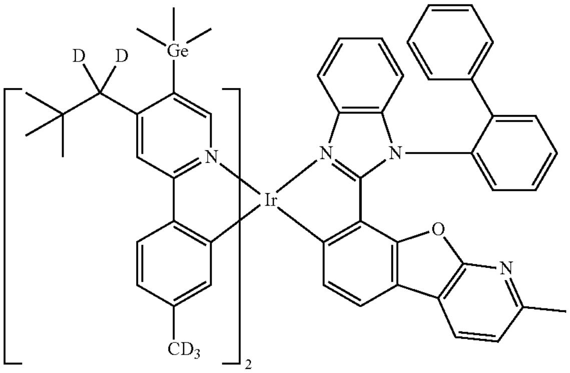
1400
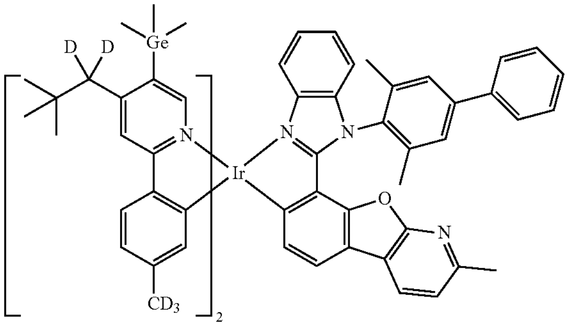
1401
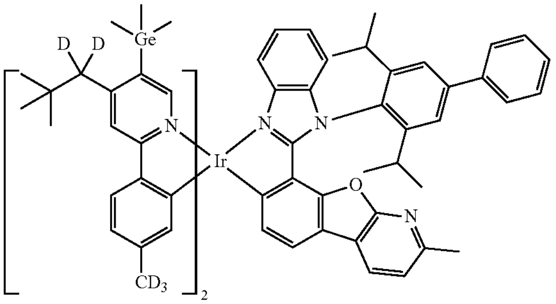

-continued
1402
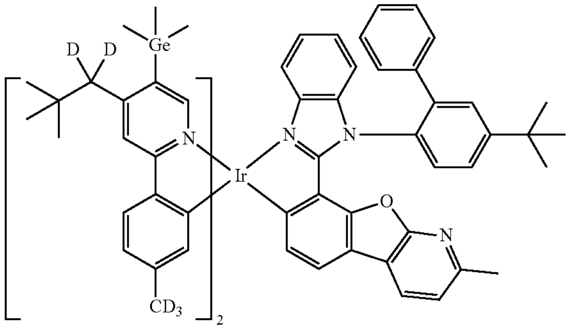
1403
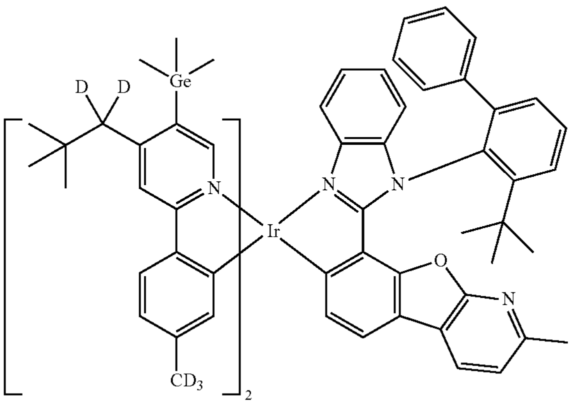
1404
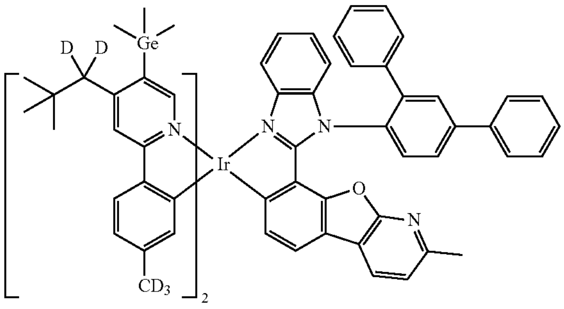
1405
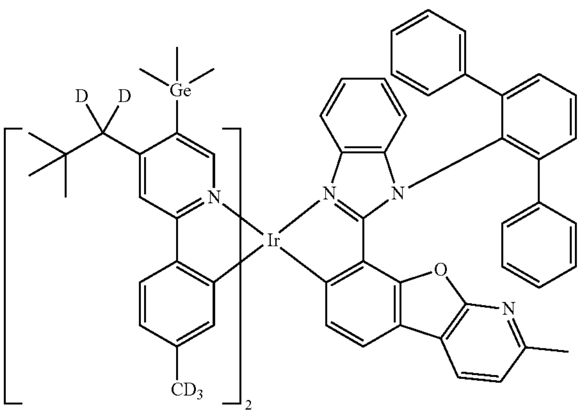
-continued
1406
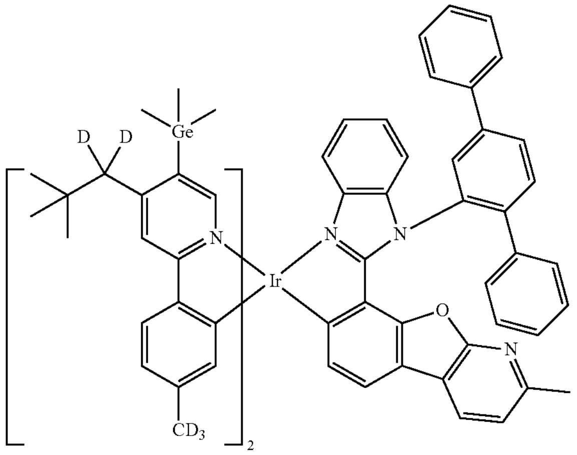
1407
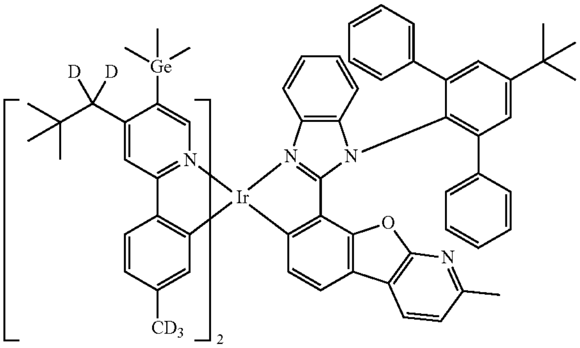
1408
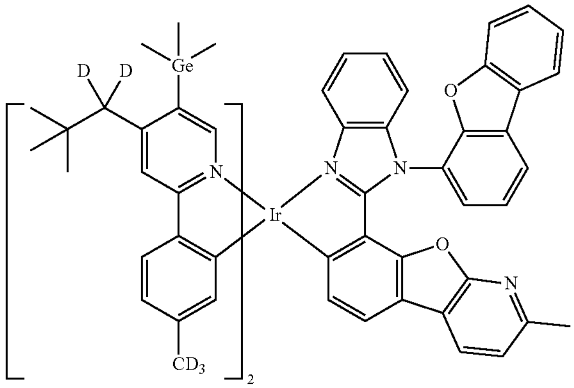
1409
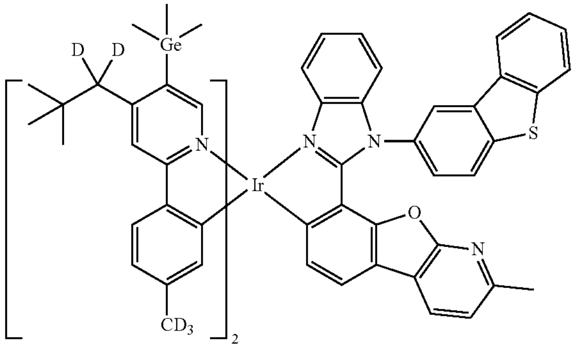

-continued
1410
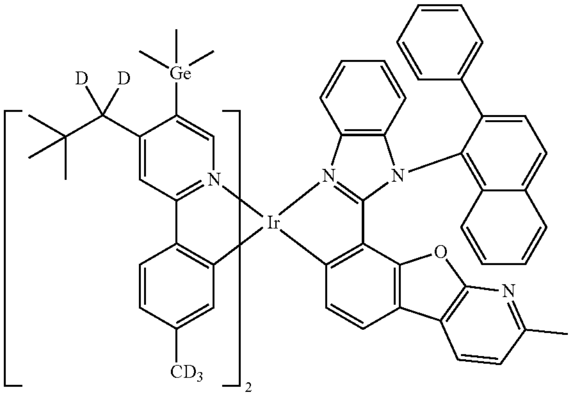
1411
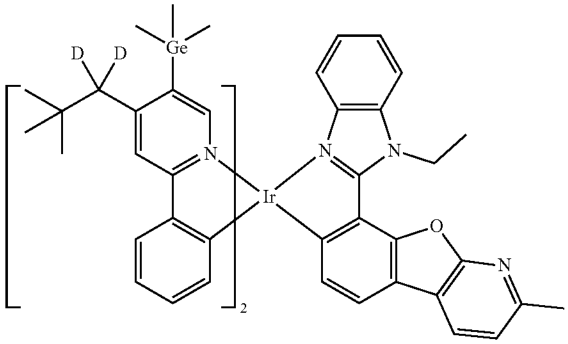
1412
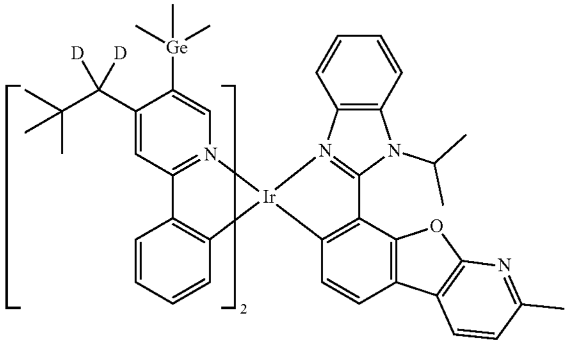
1413
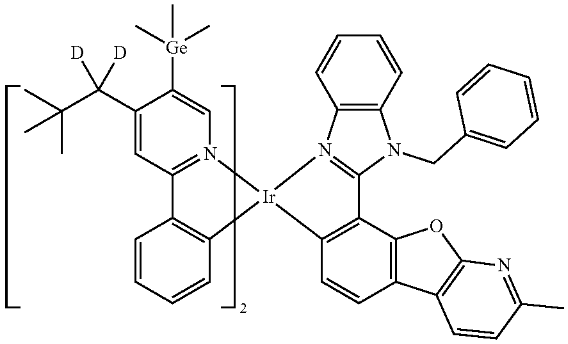
-continued
1414
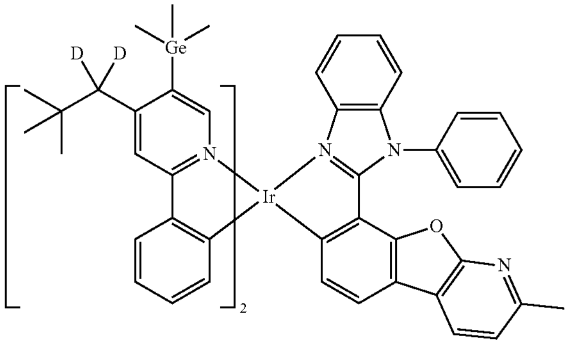
1415
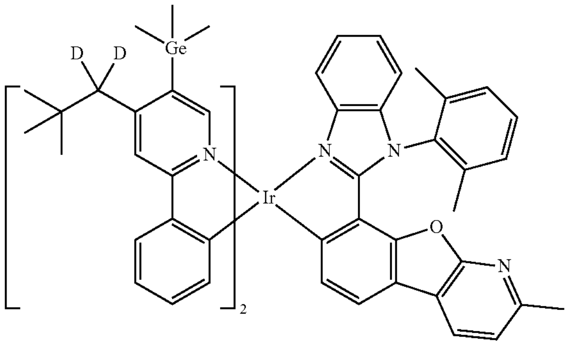
1416
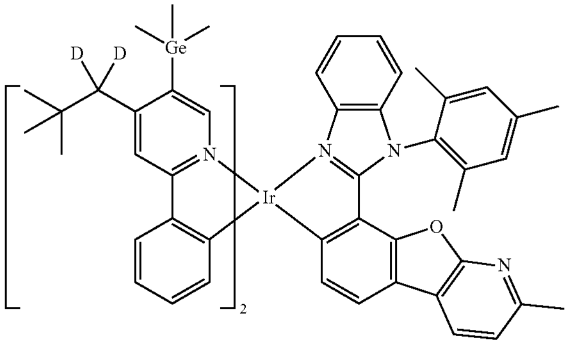
1417
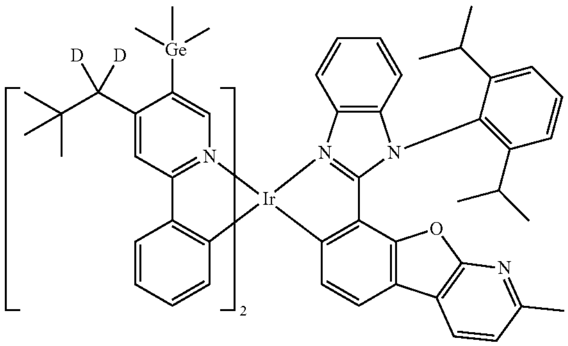

-continued
1418
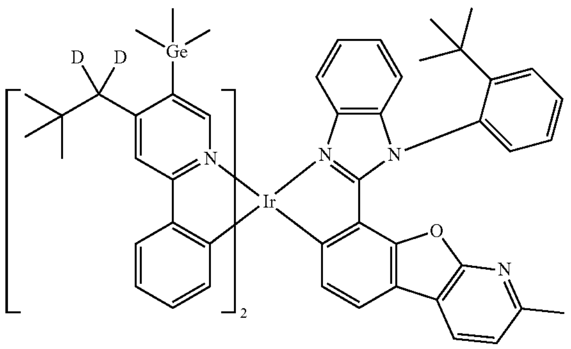
1419
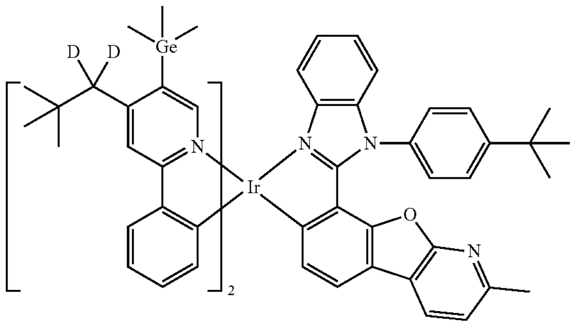
1420
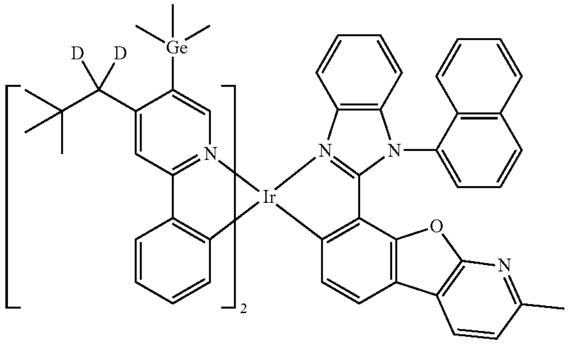
1421
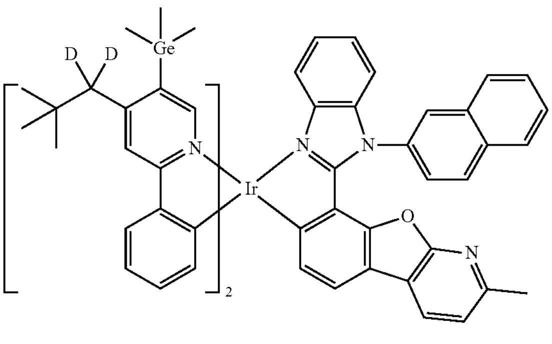
-continued
1422
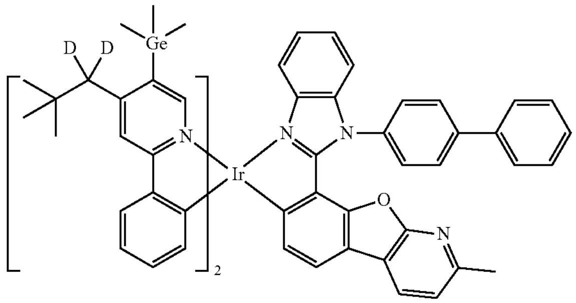
1423
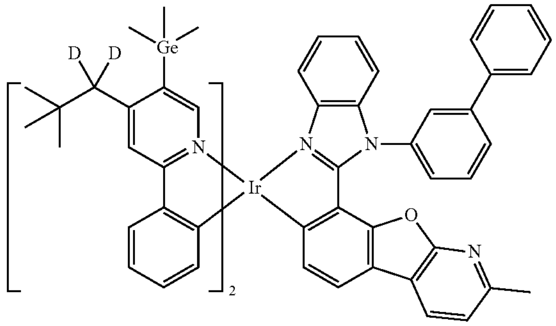
1424
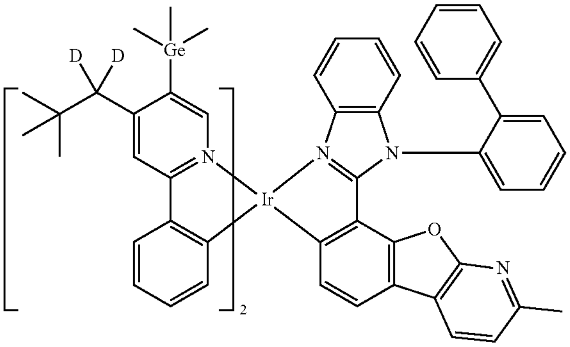
1425
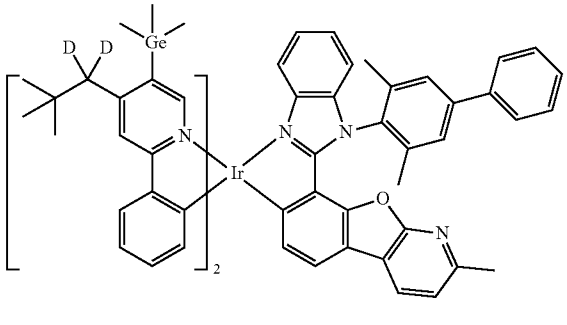

1426
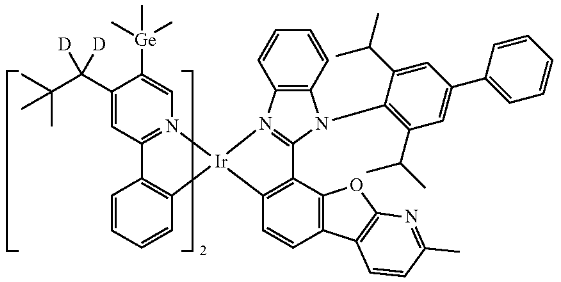
1427
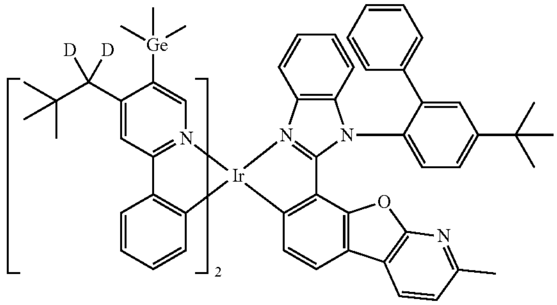
1428
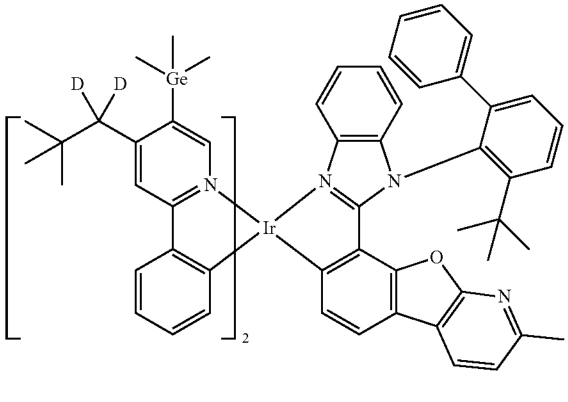
1429
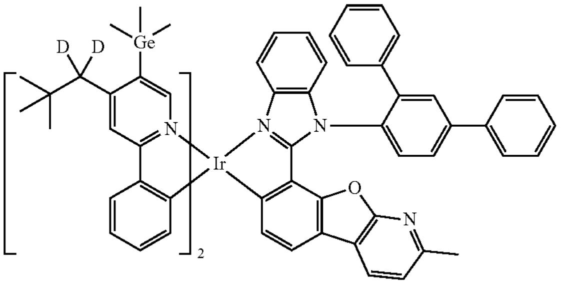
1430
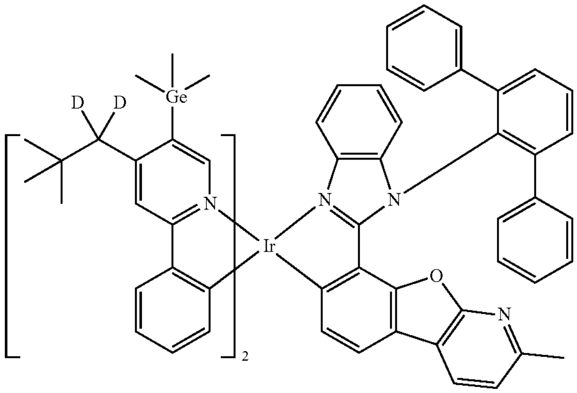
1431
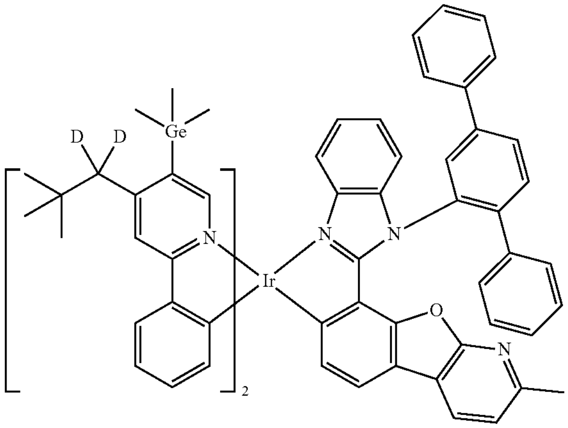
1432
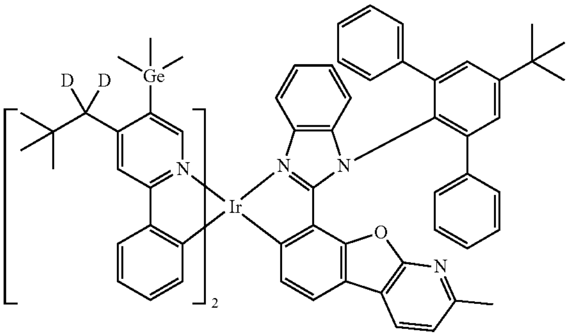
1433
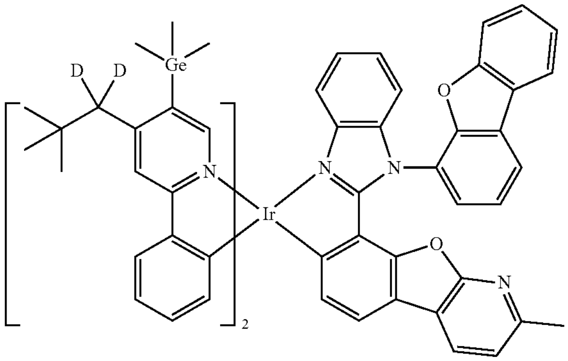

1434
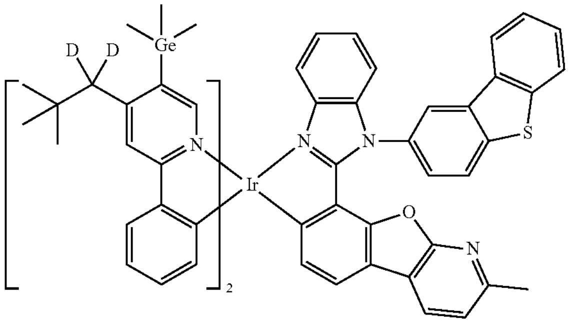
1435
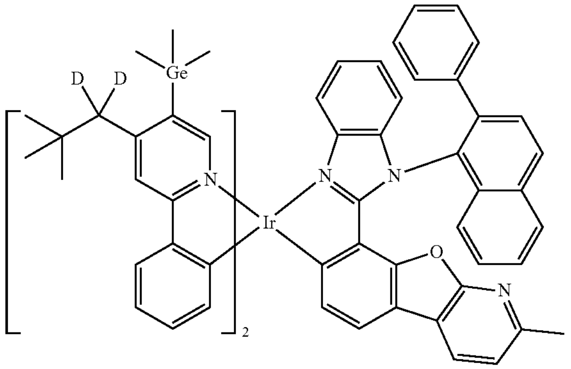
1436
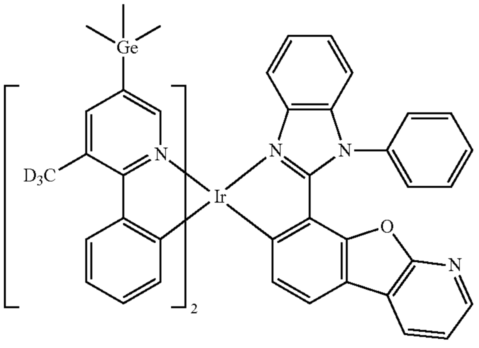
1437
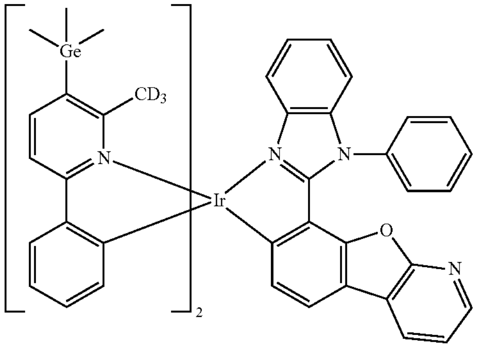
1438
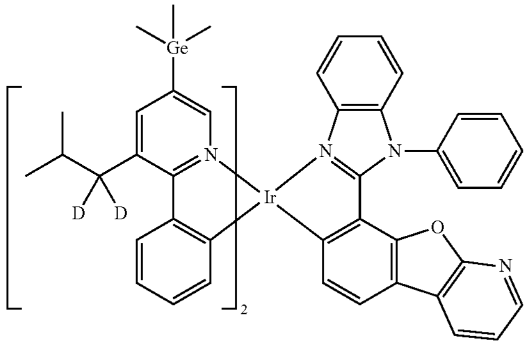
1439
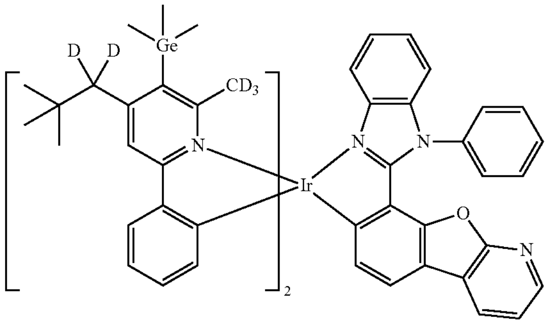
1440
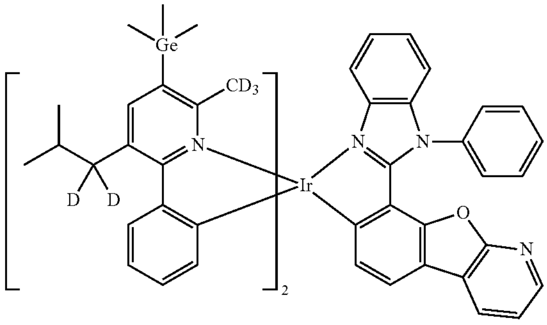
1441
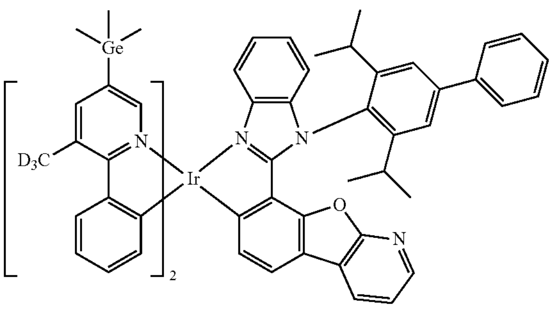

-continued
1442
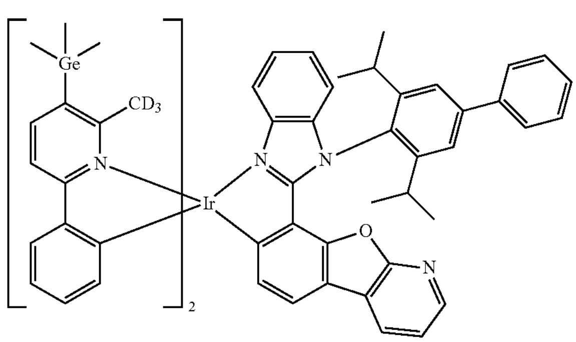
1443
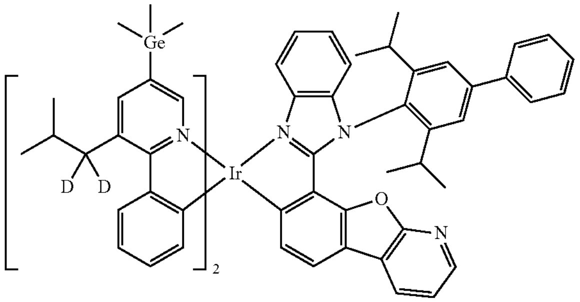
1444
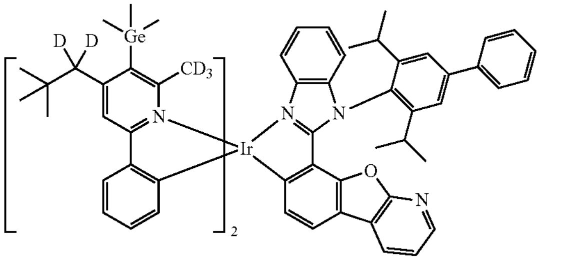
1445
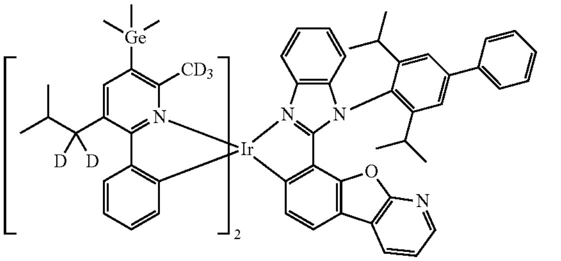
1446
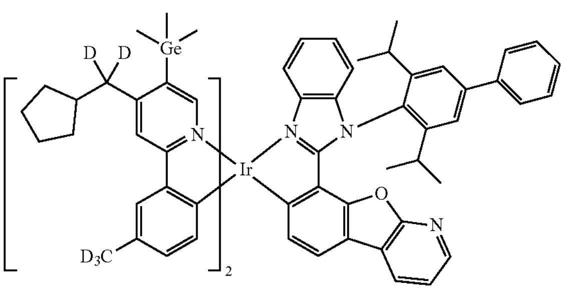
-continued
1447
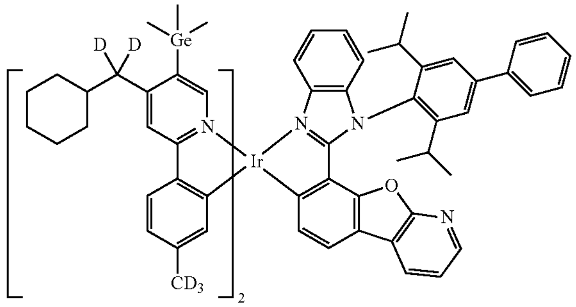
1448
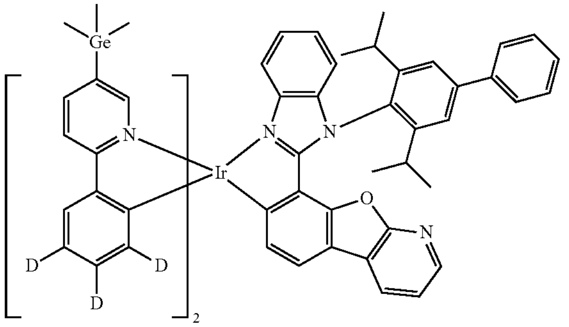
1449
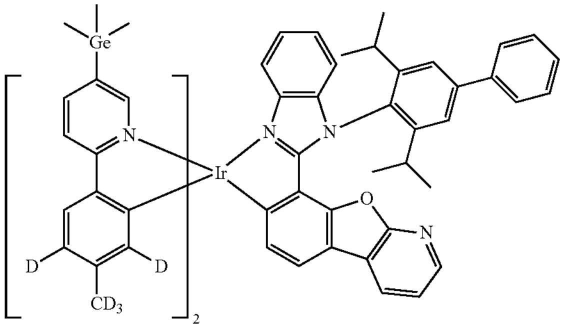
1450
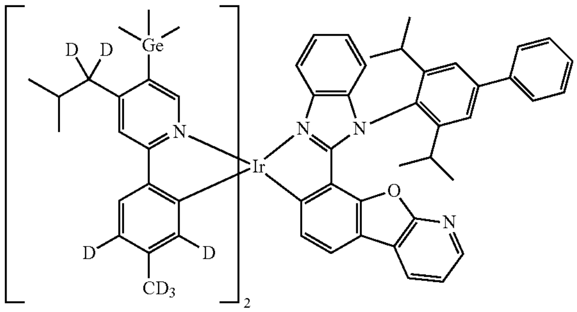

-continued
1451
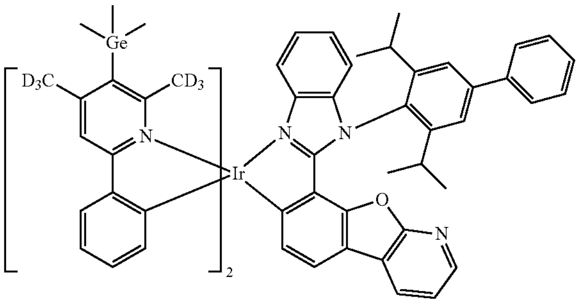
1452
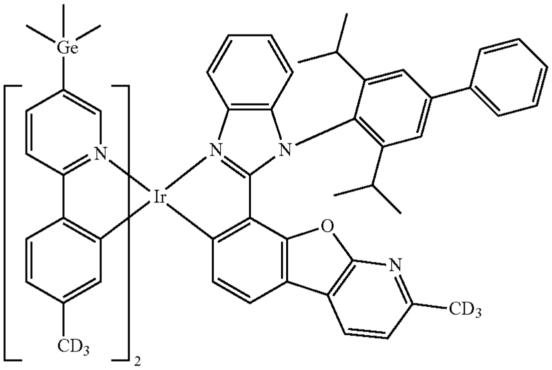
1453
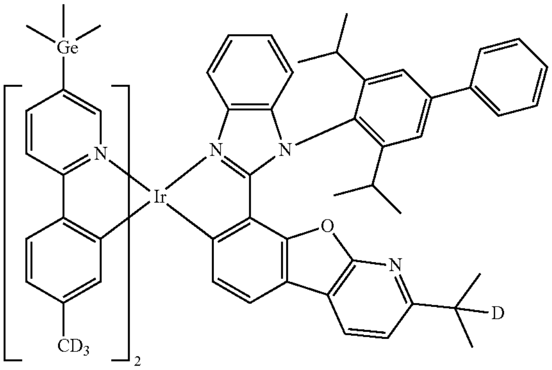
1454
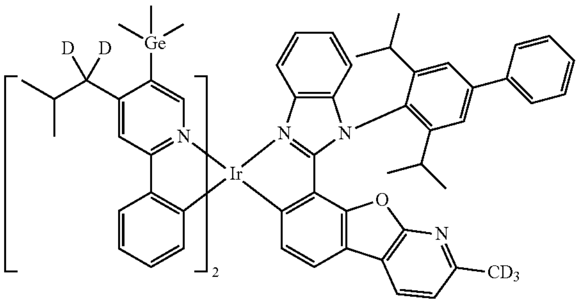
-continued
1455
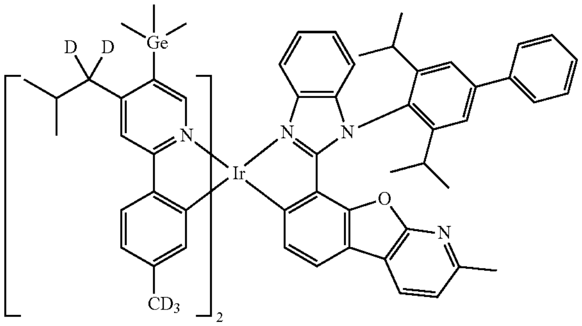
1456
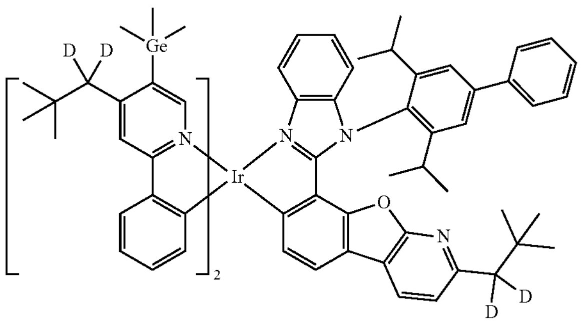
1457
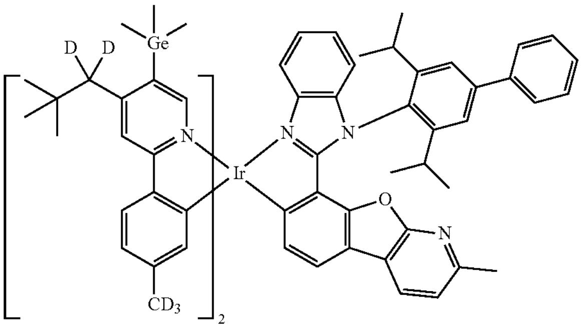
1458
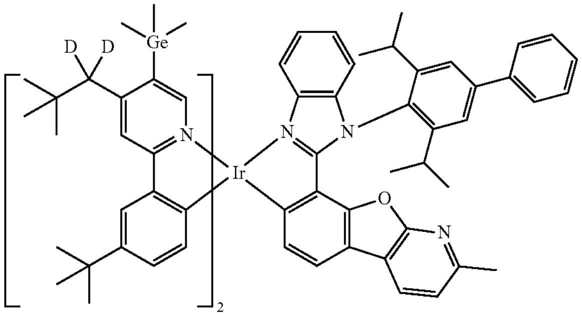

-continued
1459
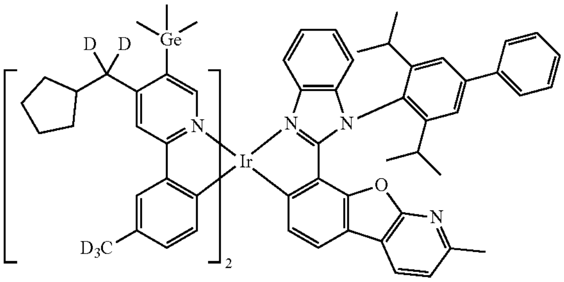
1460
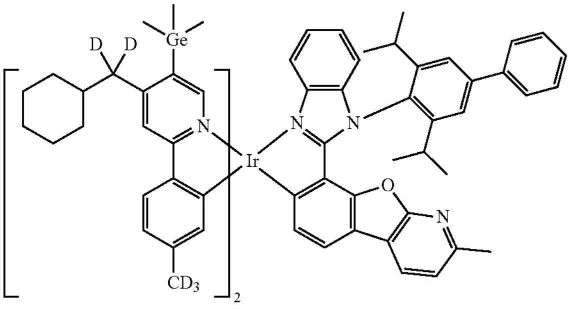
1461
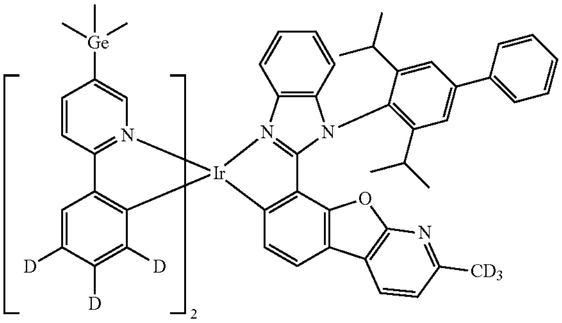
1462
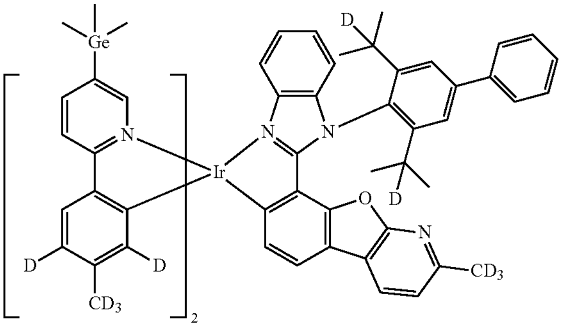
-continued
1463
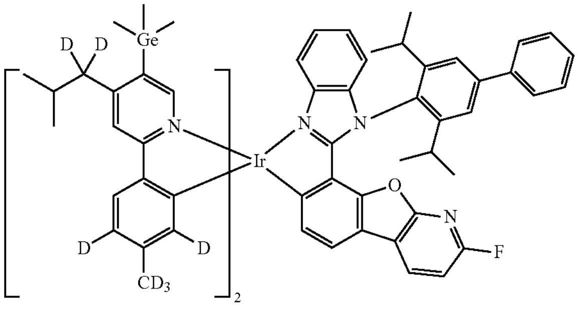
1464
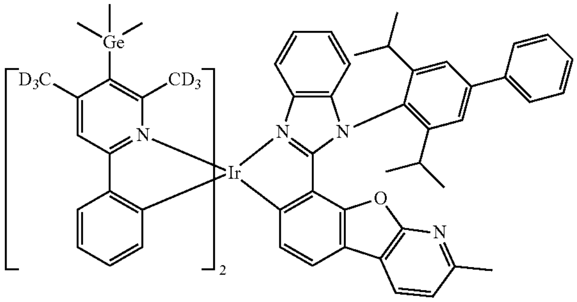
1465
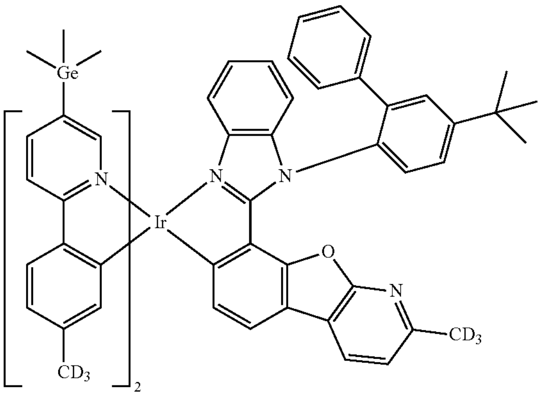
1466
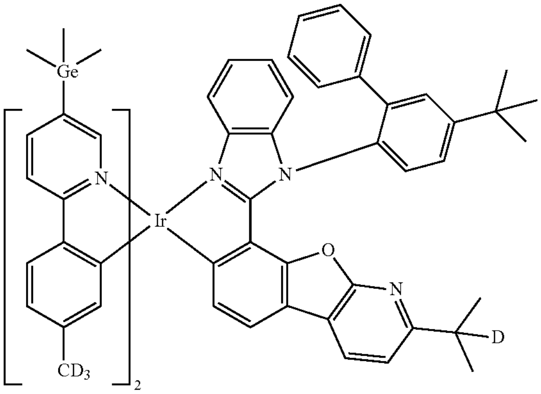

-continued
1467
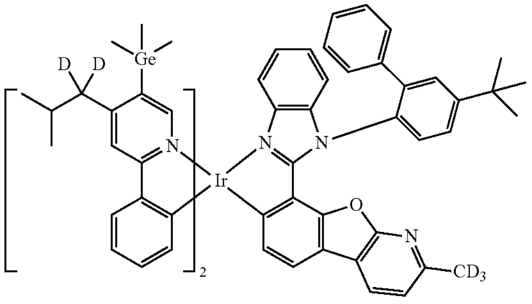
1468
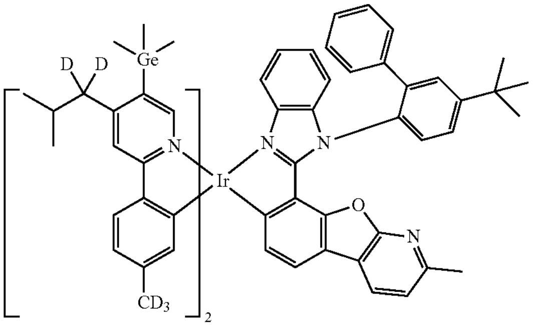
1469
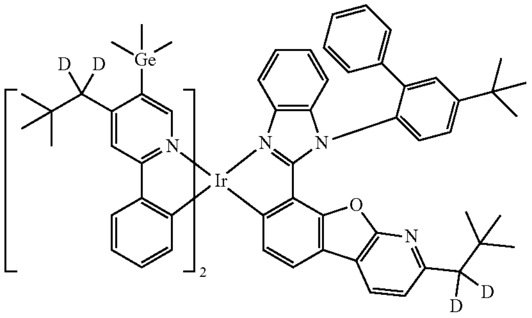
1470
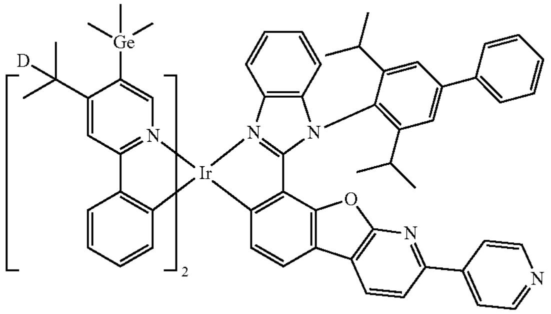
-continued
1471
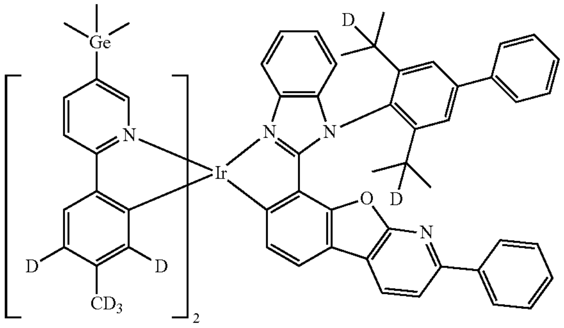
1472
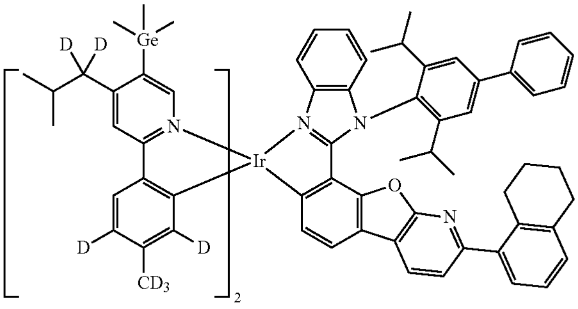
1473
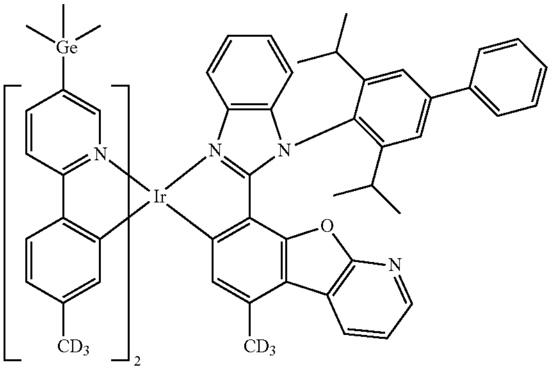
1474
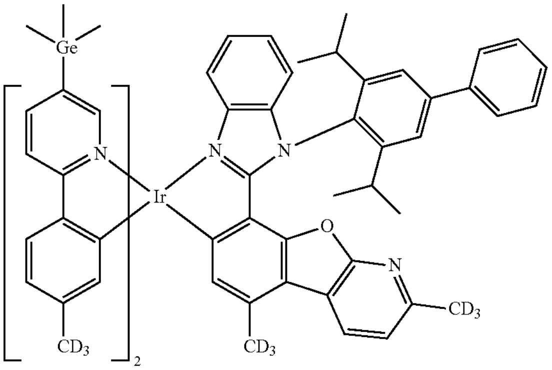

-continued
1475
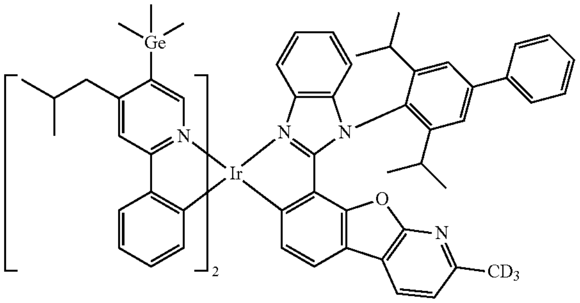
1476
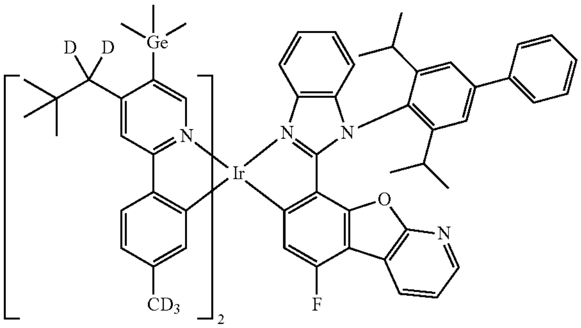
1477
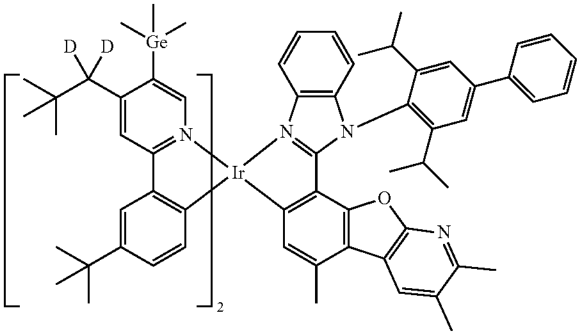
1478
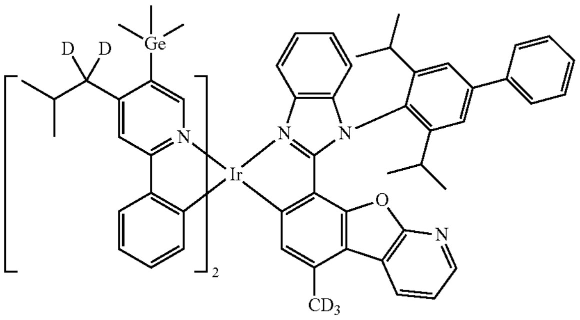
-continued
1479
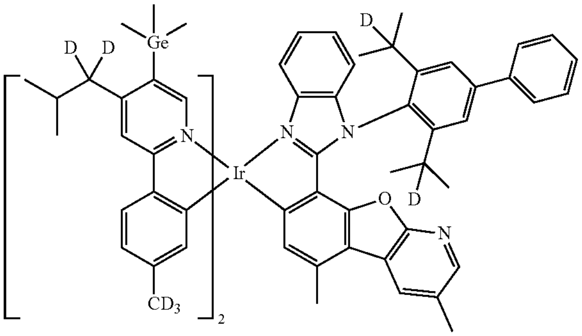
1480
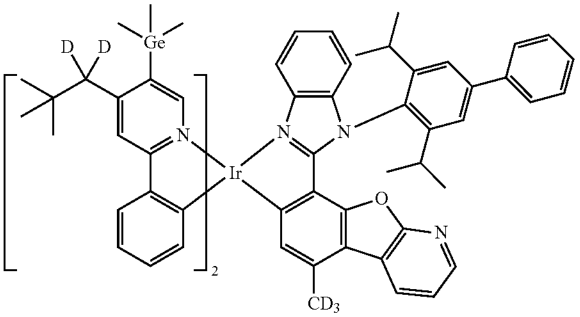
1481
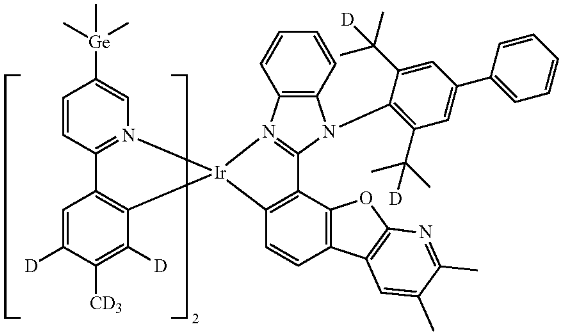
1482
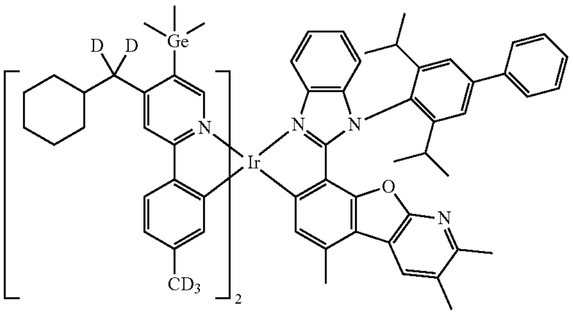

-continued
1483
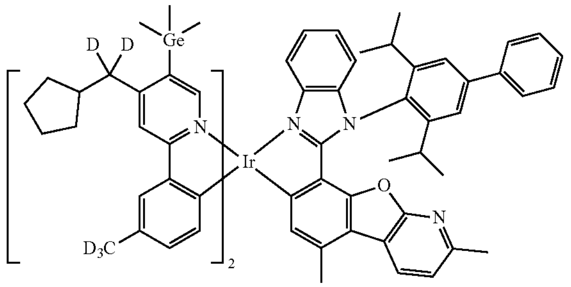
1484
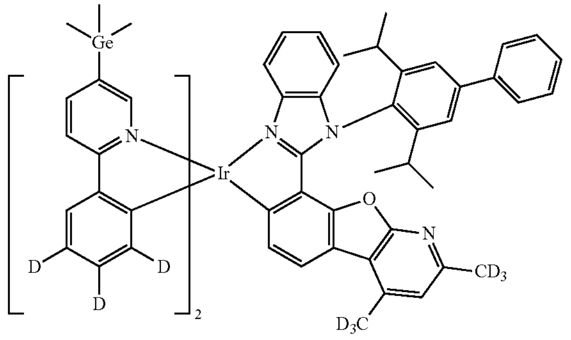
1485
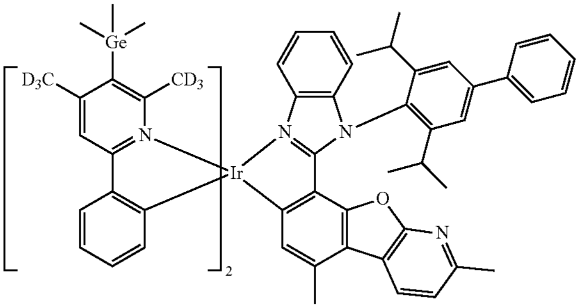
1486
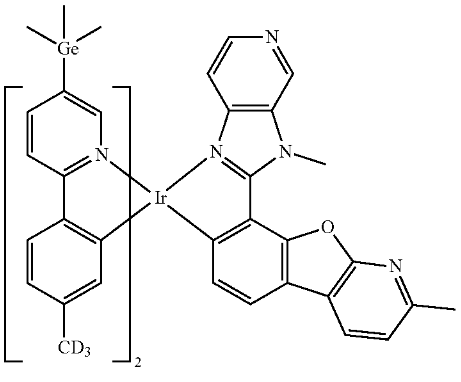
-continued
1487
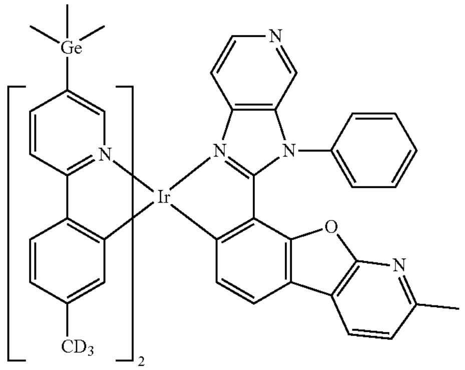
1488
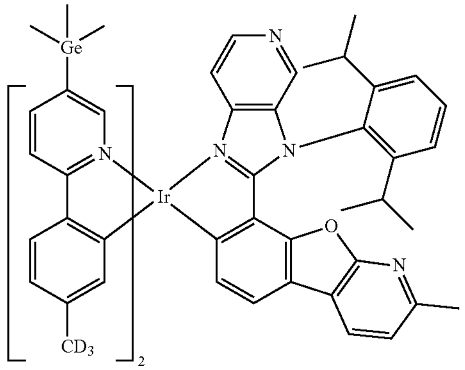
1489
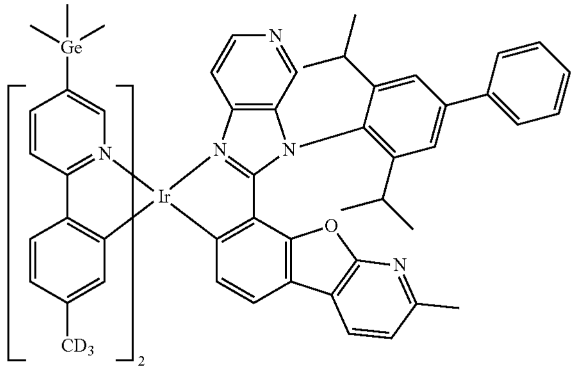
1490
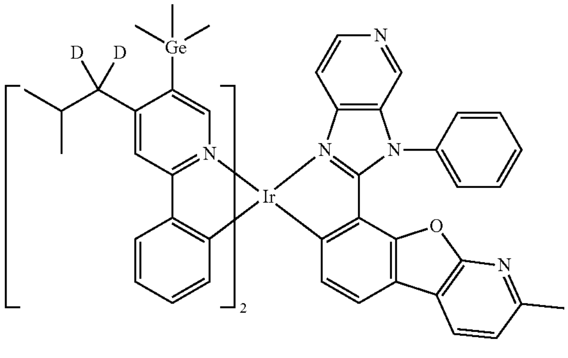

-continued
1491
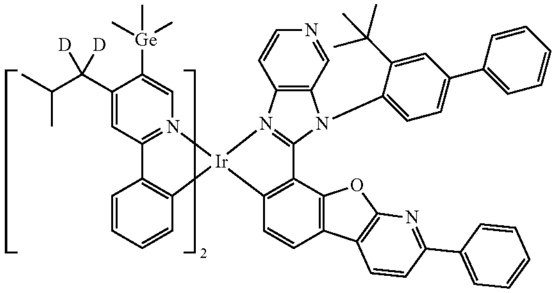
1492
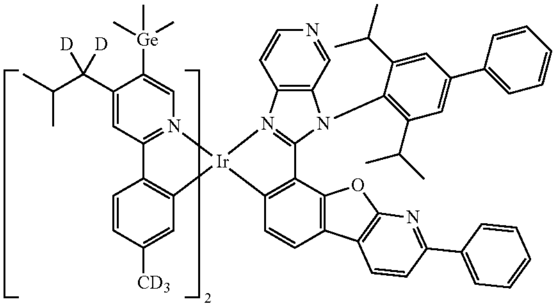
1493
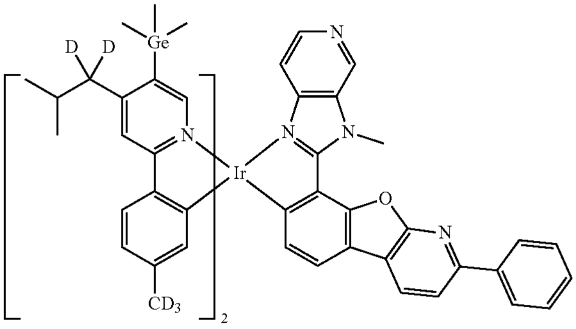
1494
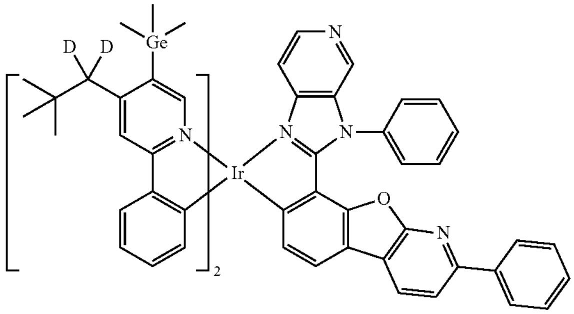
-continued
1495
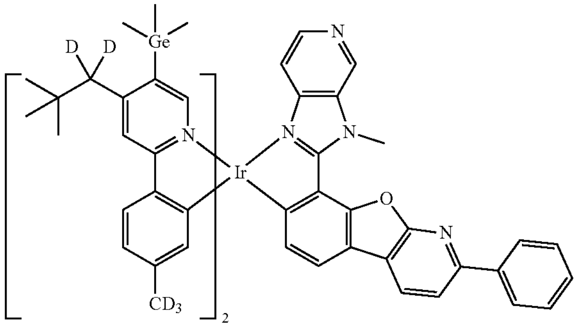
1496
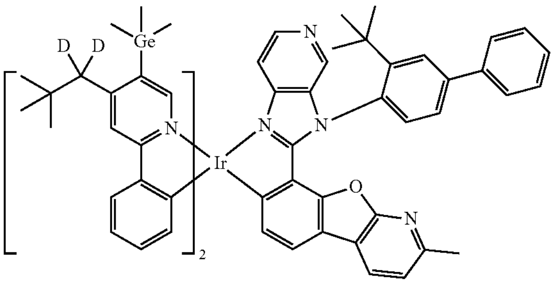
1497
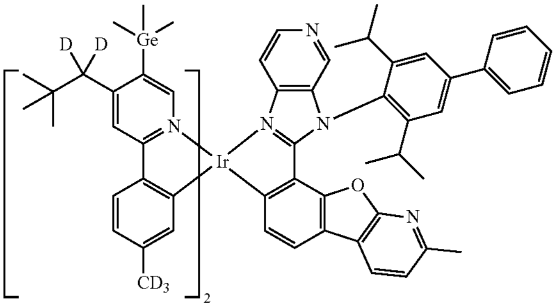
1498
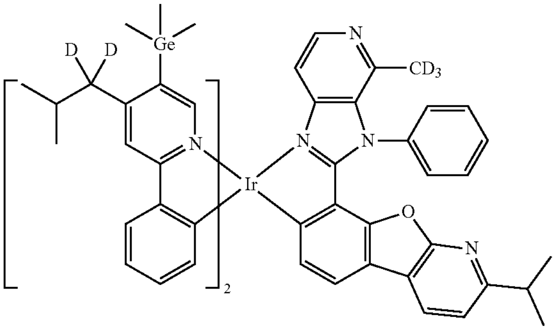

-continued
1499
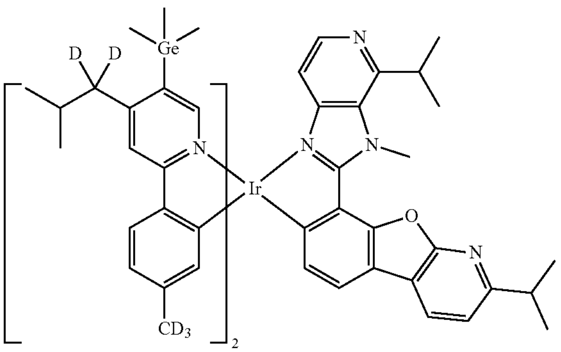
1500
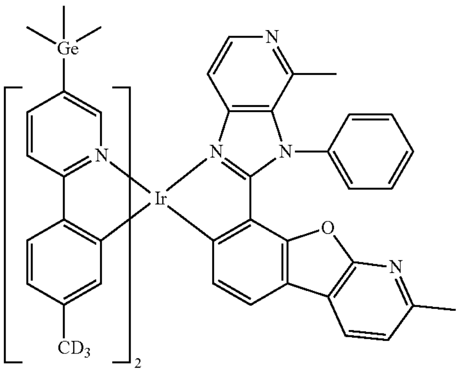
1501
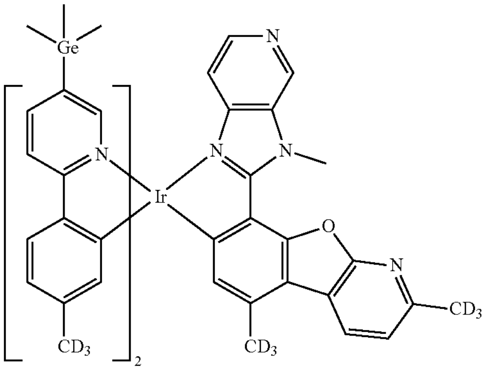
1502
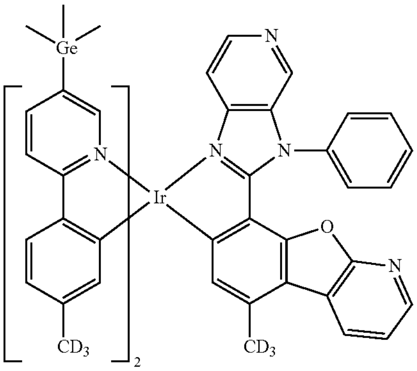
-continued
1503
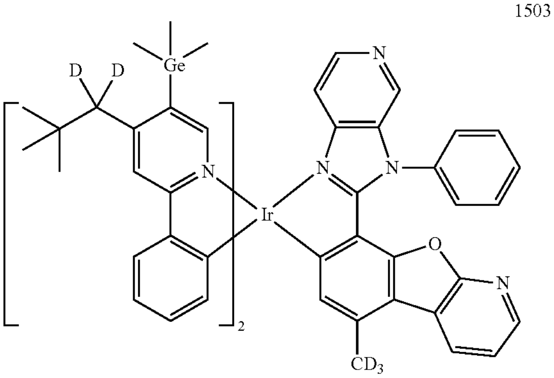
1504
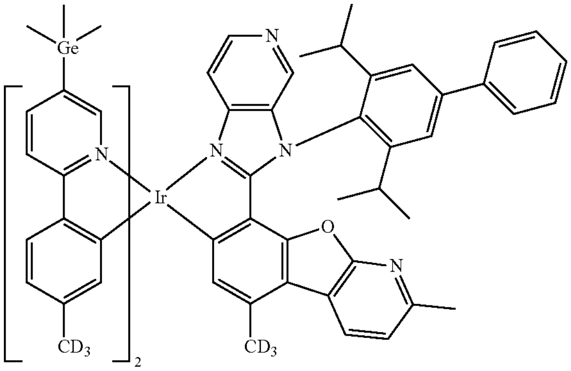
1505
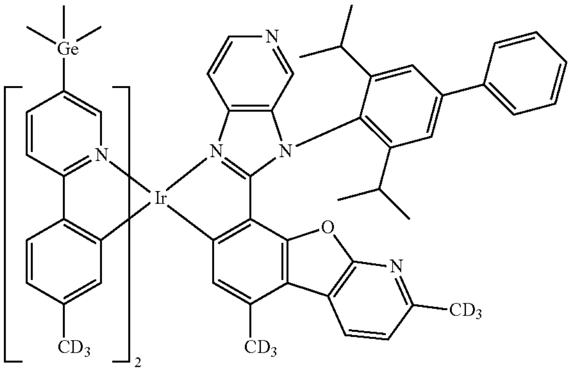
1506
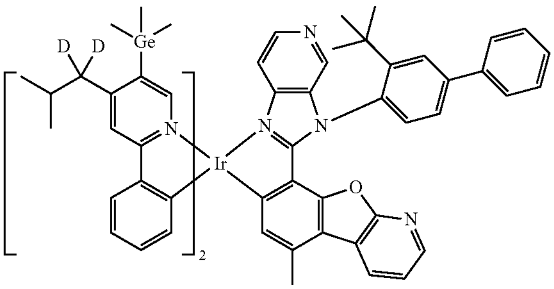

-continued
1507
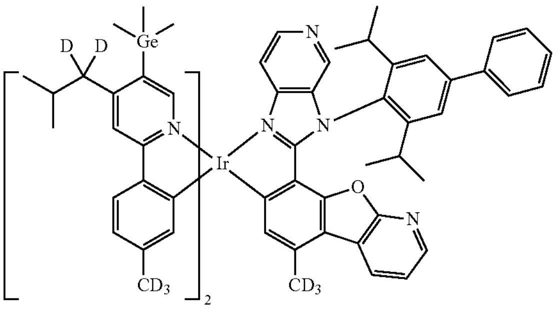
1508
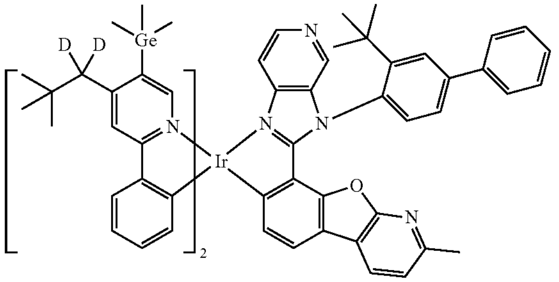
1509
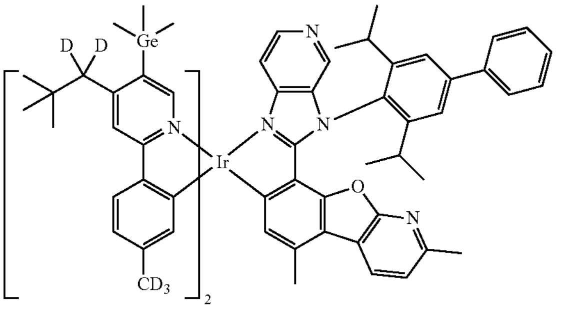
1510
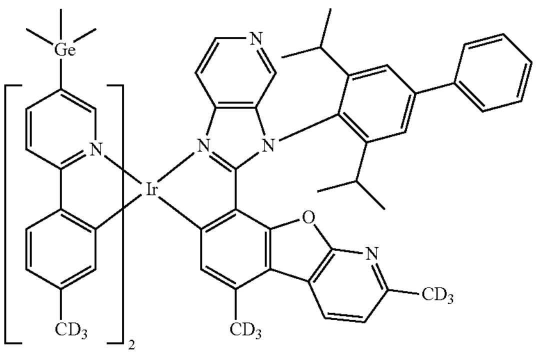
-continued
1511
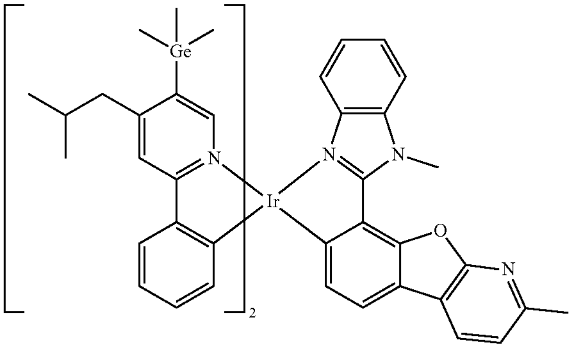
1512
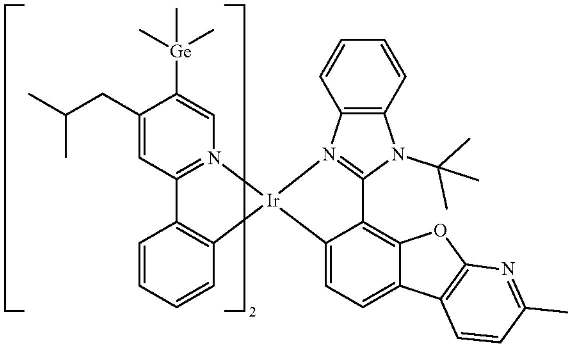
1513
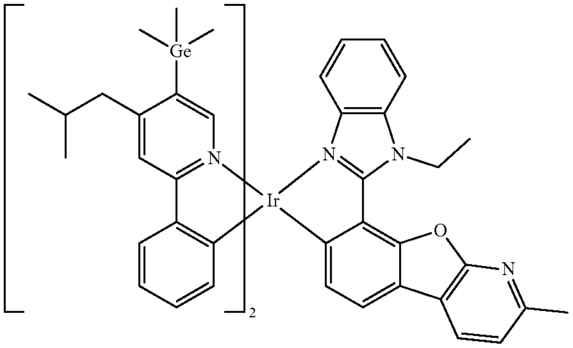
1514
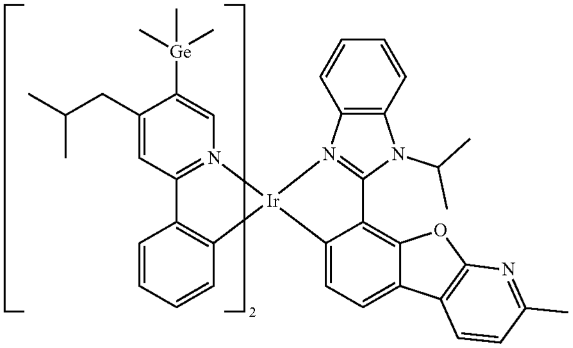

-continued
1515
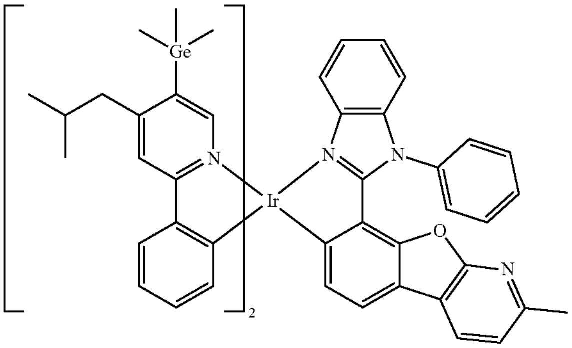
1516
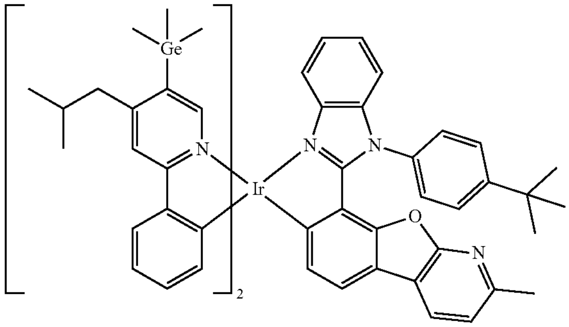
1517
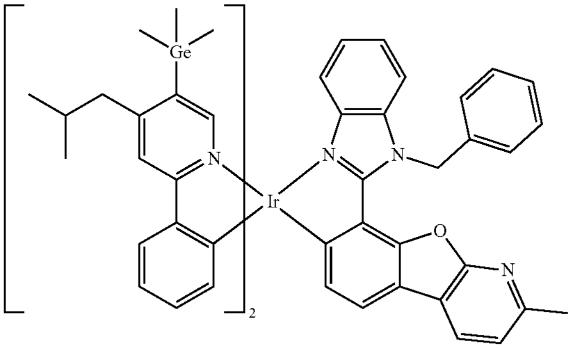
1518
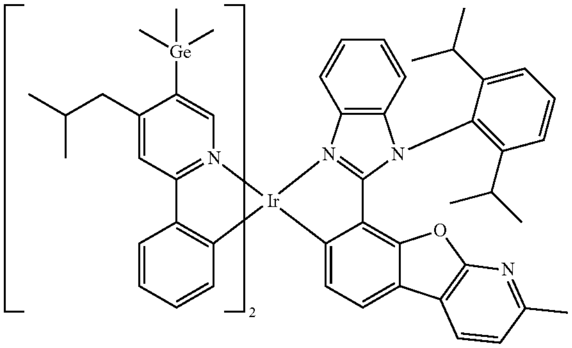
-continued
1519
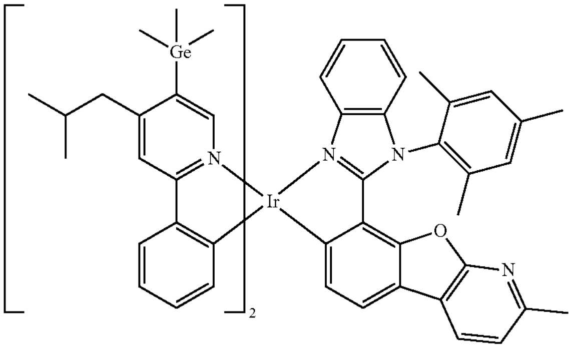
1520
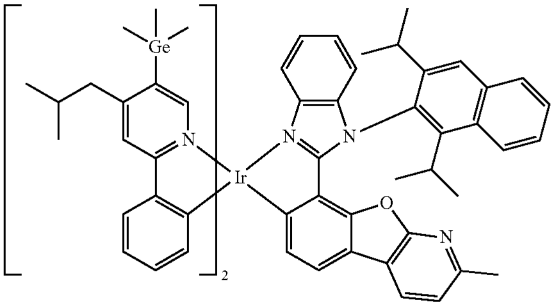
1521
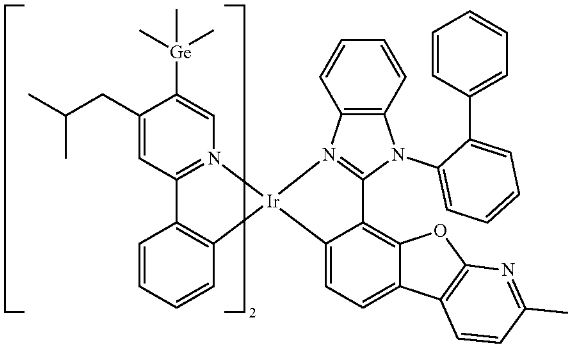
1522
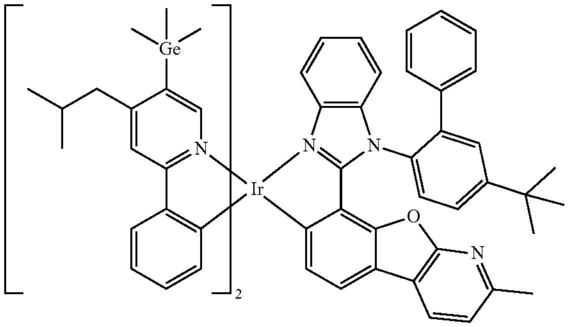

-continued
1523
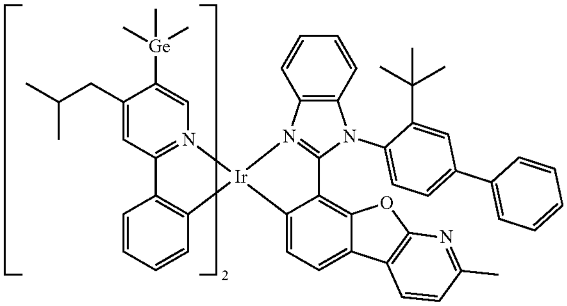
1524
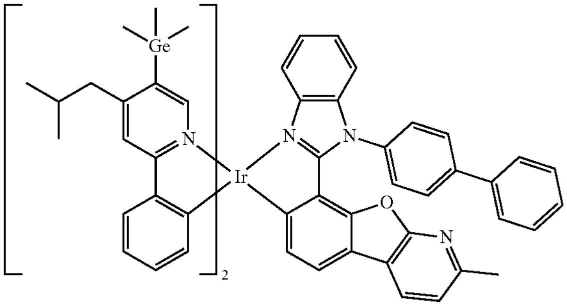
1525
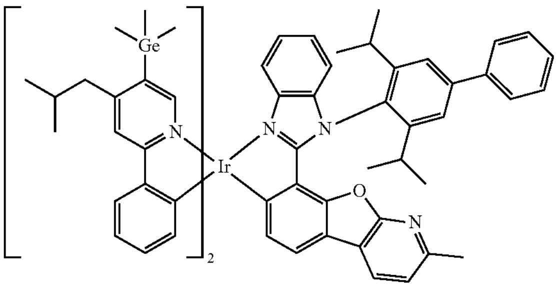
1526
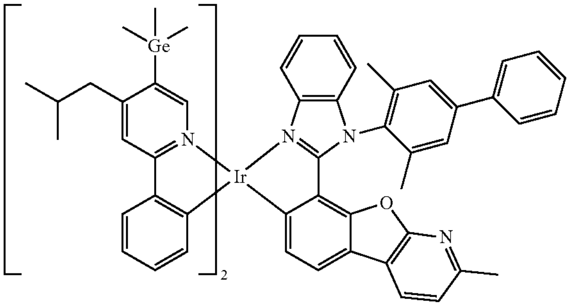
-continued
1527
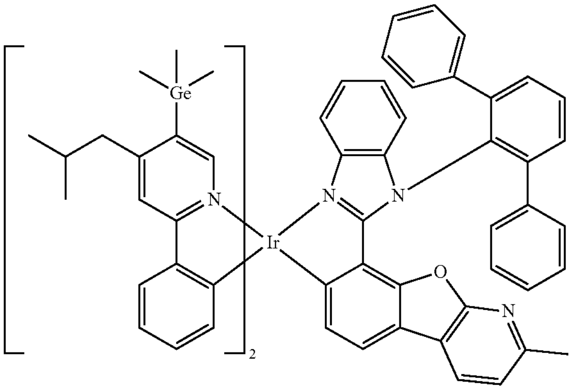
1528
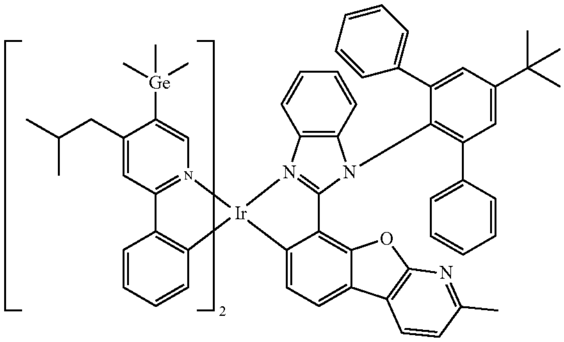
1529
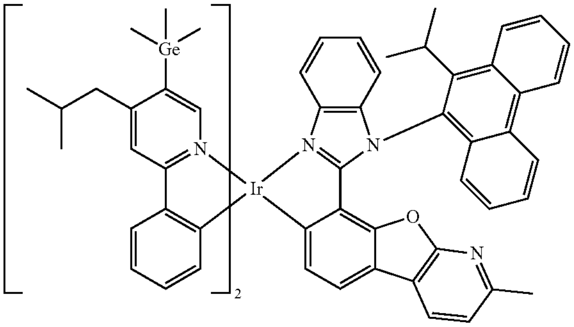
1530
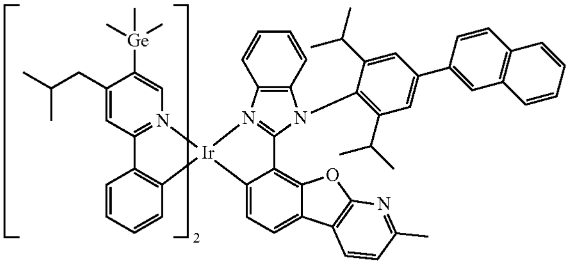

-continued
1531
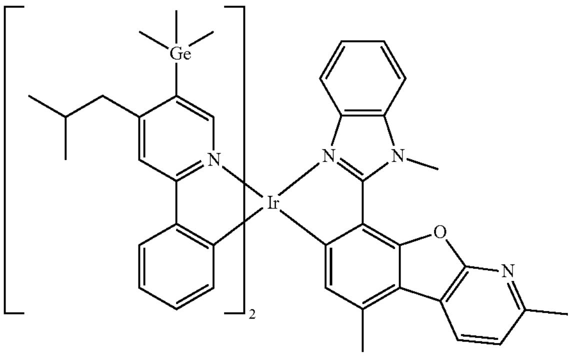
1532
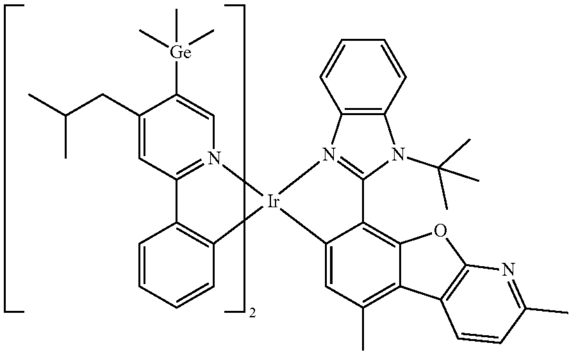
1533
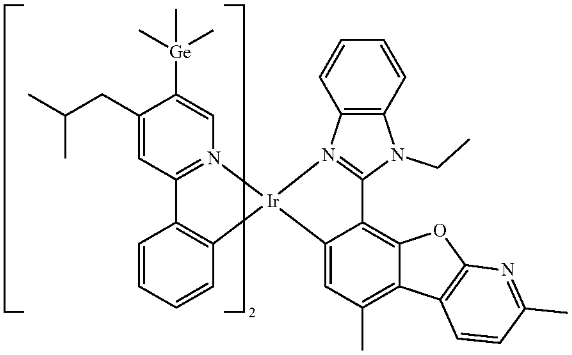
1534
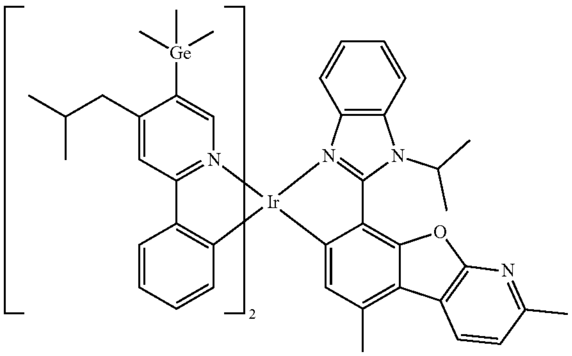
-continued
1535
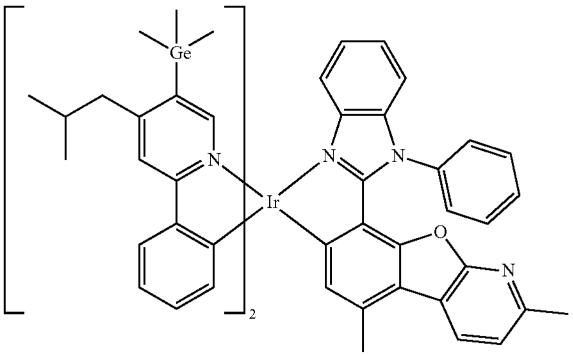
1536
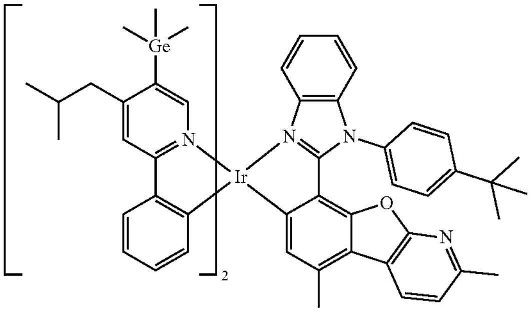
1537
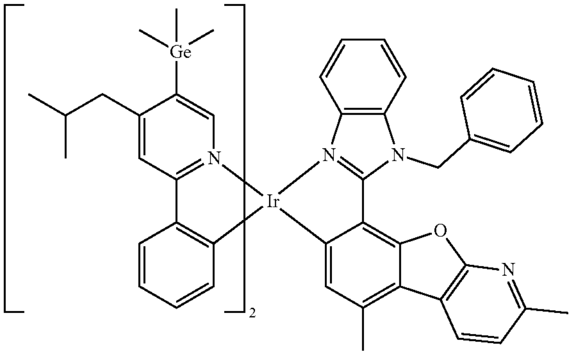
1538
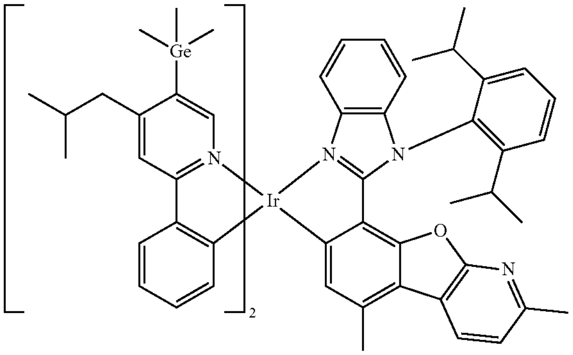

1539
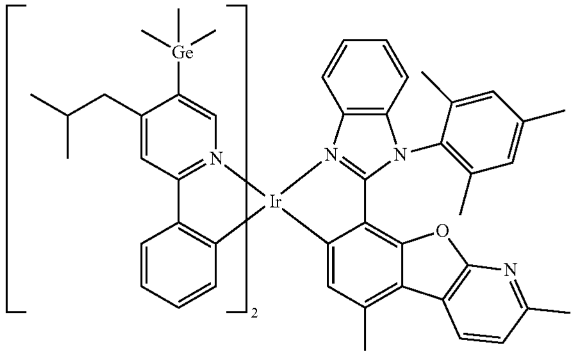
1540
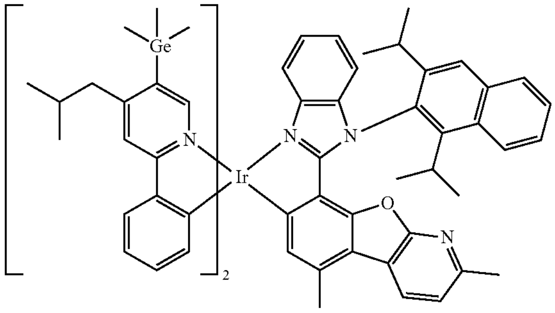
1541
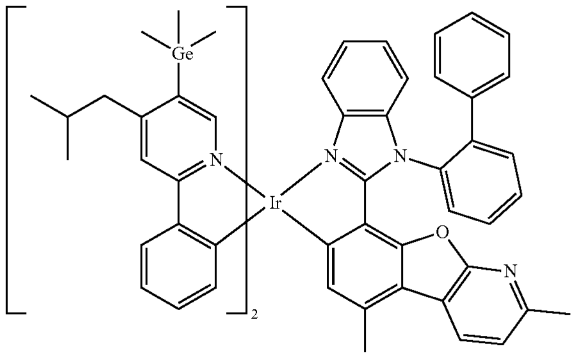
1542
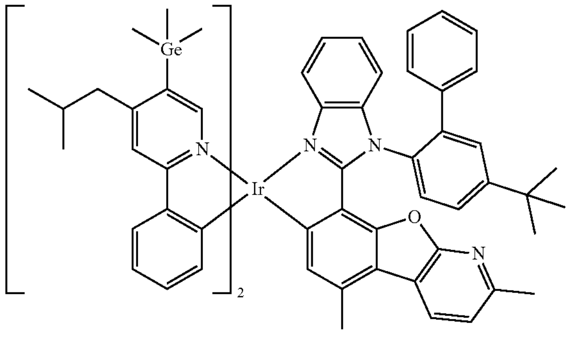
1543
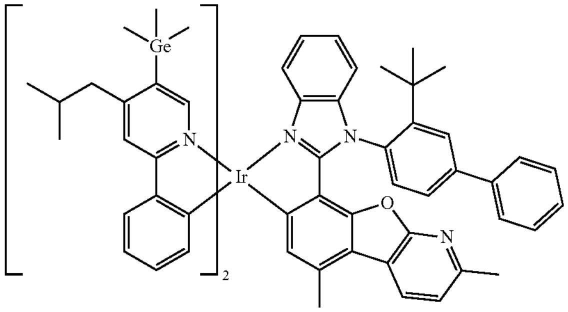
1544
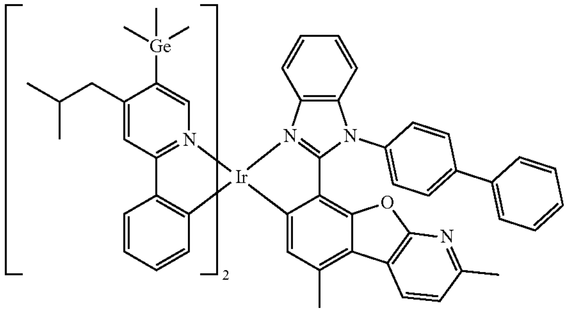
1545
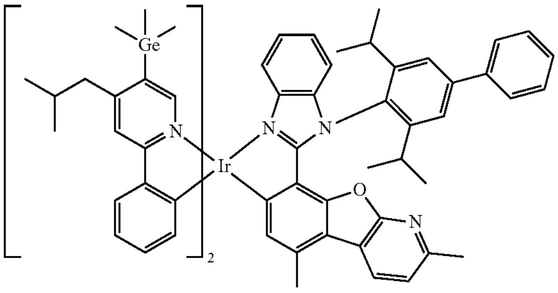
1546
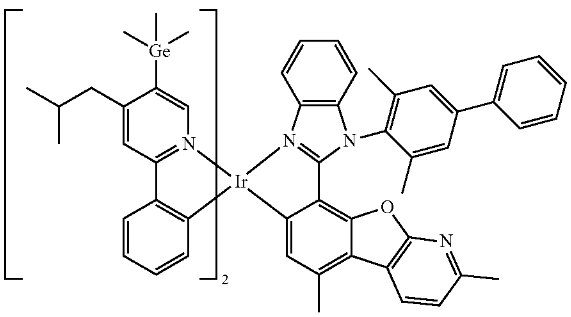

-continued
1547
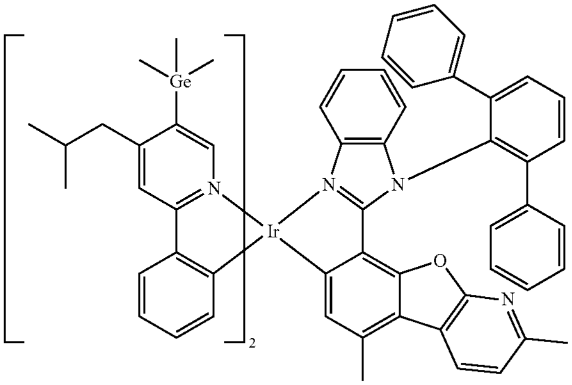
1548
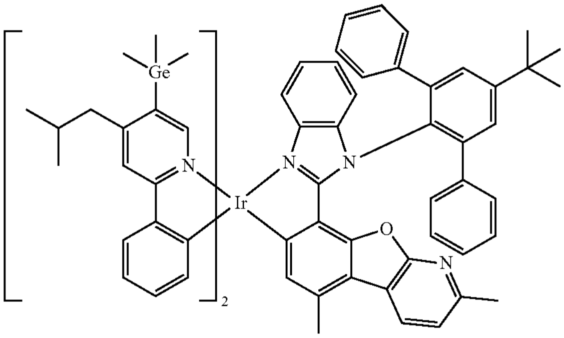
1549
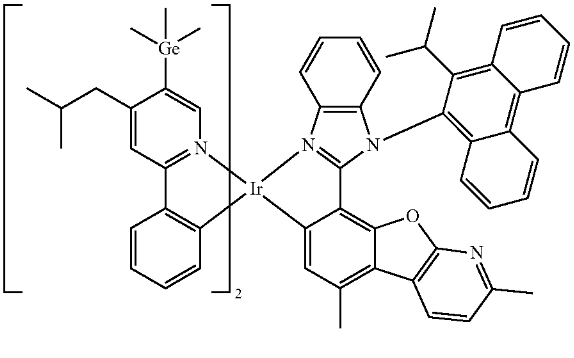
1550
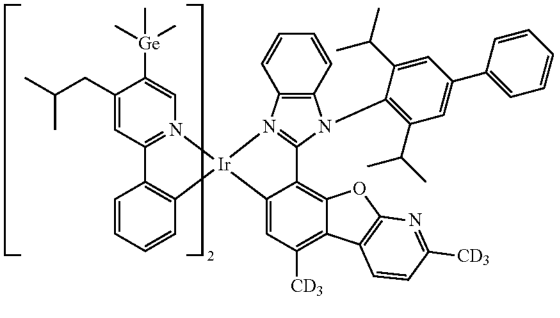
-continued
1551
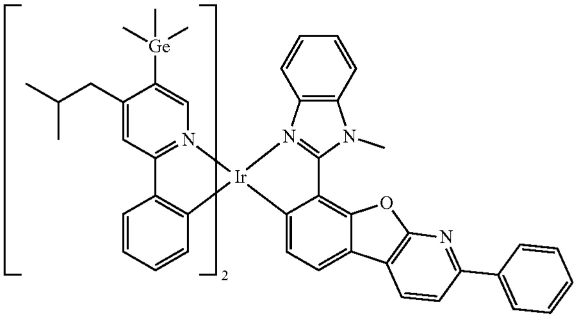
1552
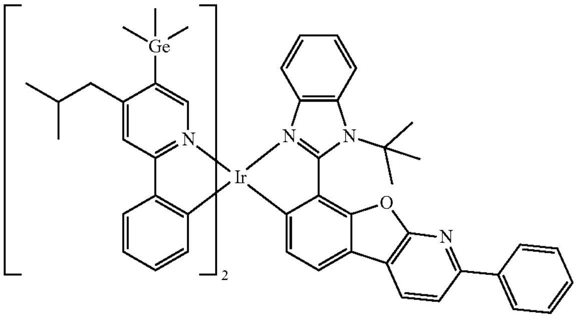
1553
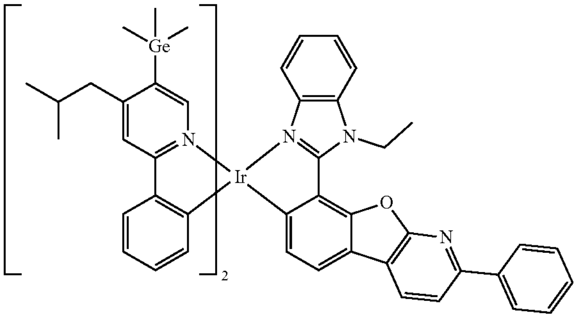
1554
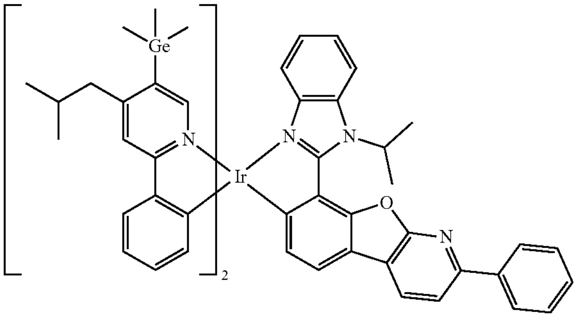

-continued
1555
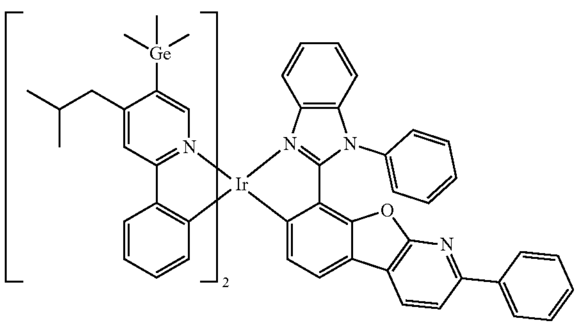
1556
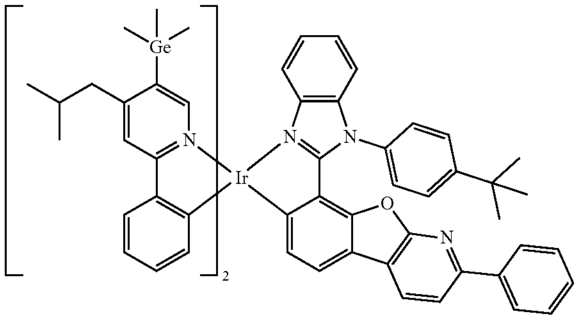
1557
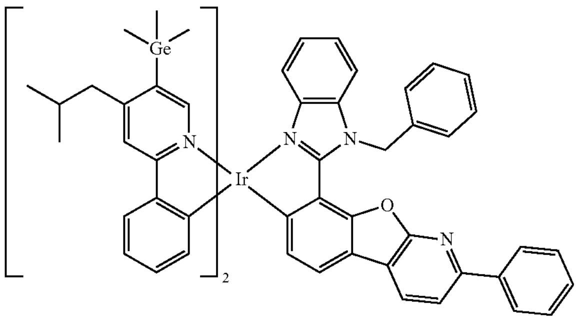
1558
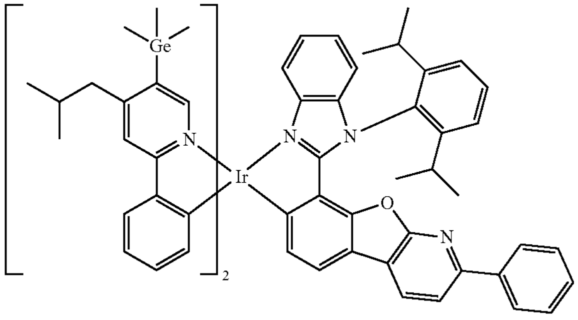
-continued
1559
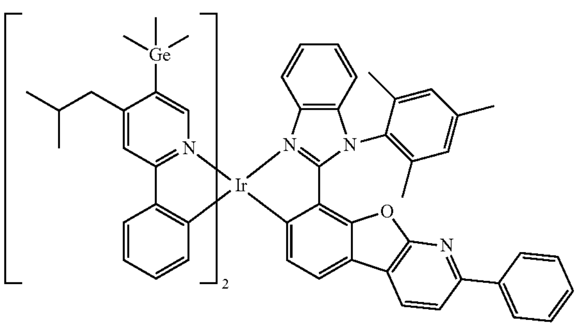
1560
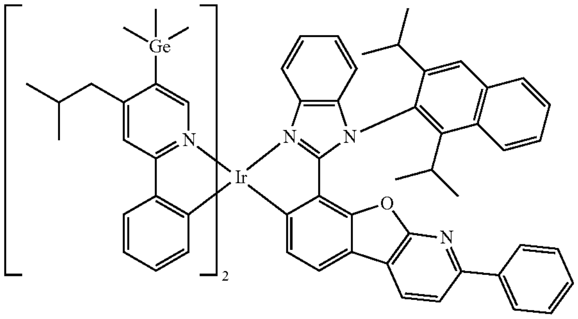
1561
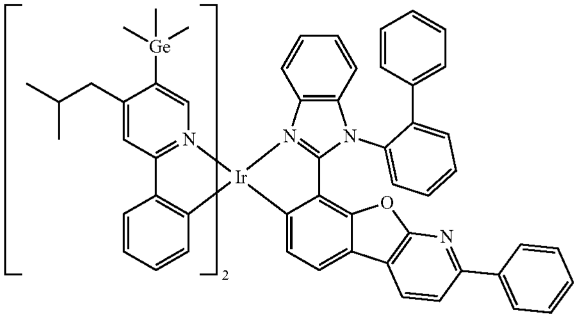
1562
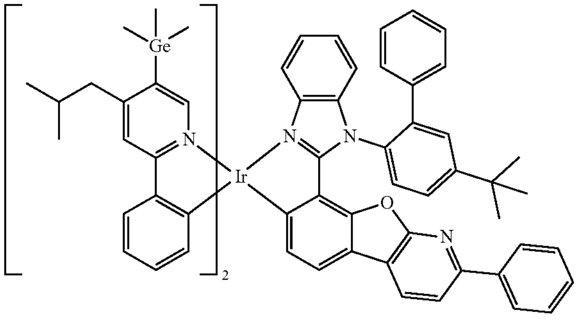

-continued
1563
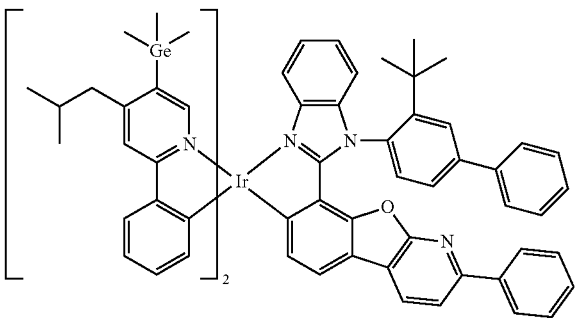
1564
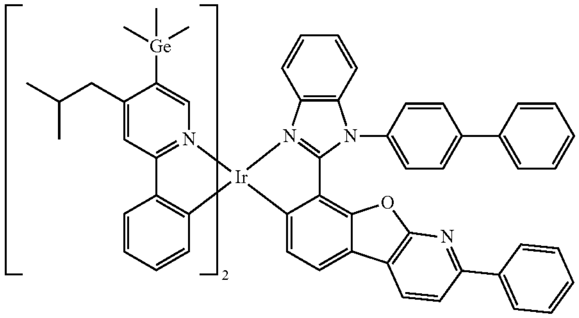
1565
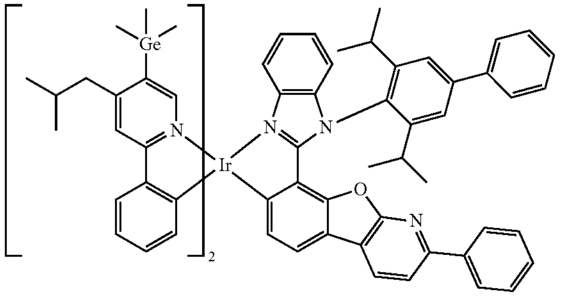
1566
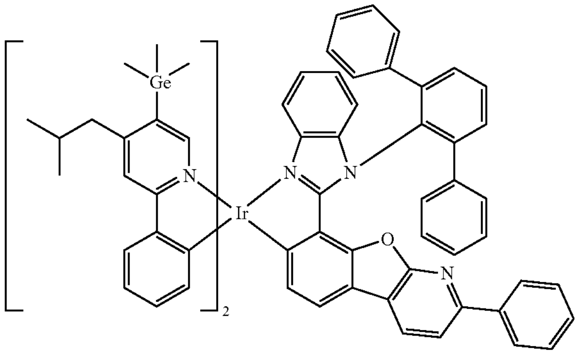
-continued
1567
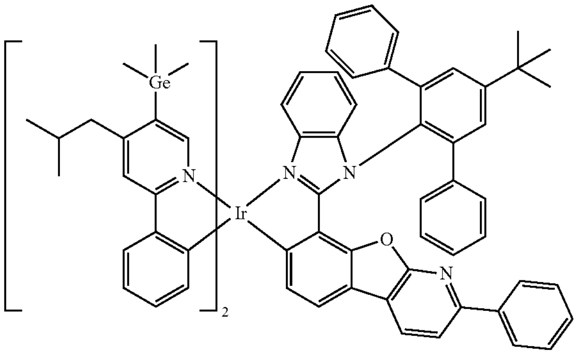
1568
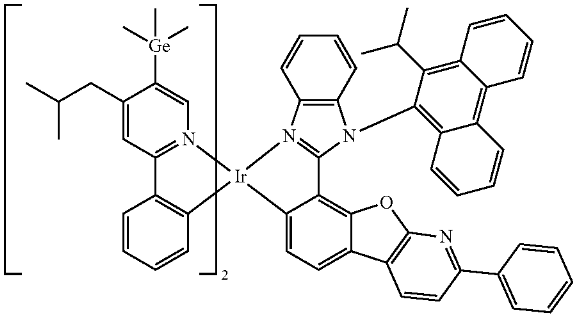
1569
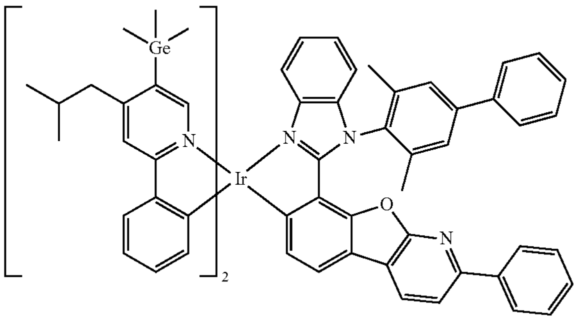
1570
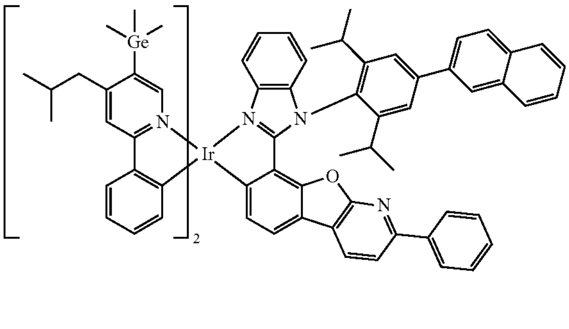

-continued
1571
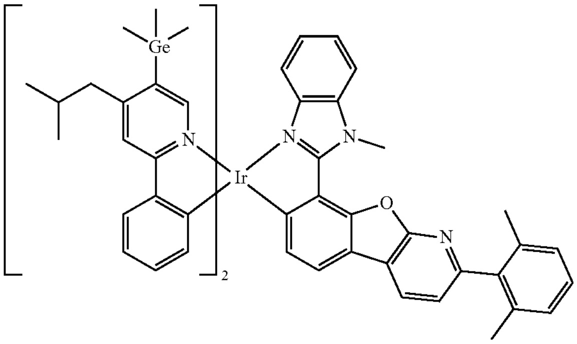
1572
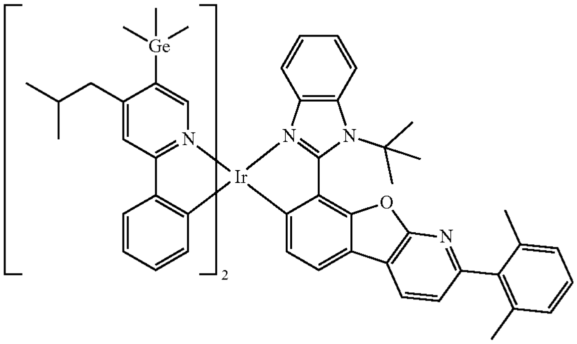
1573
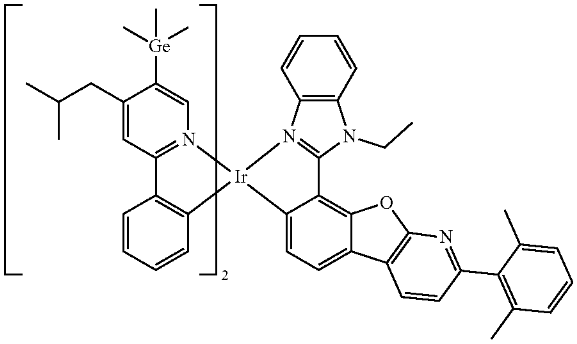
1574
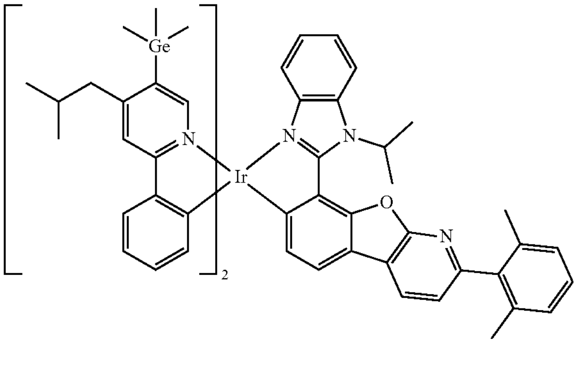
-continued
1575
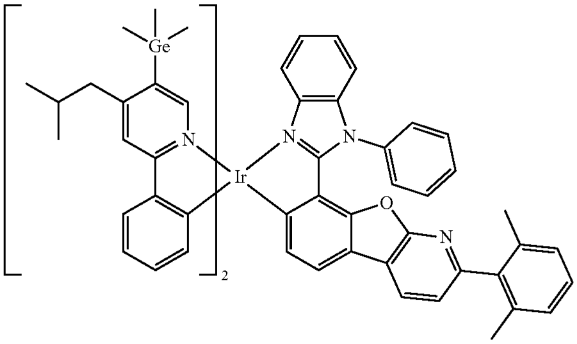
1576
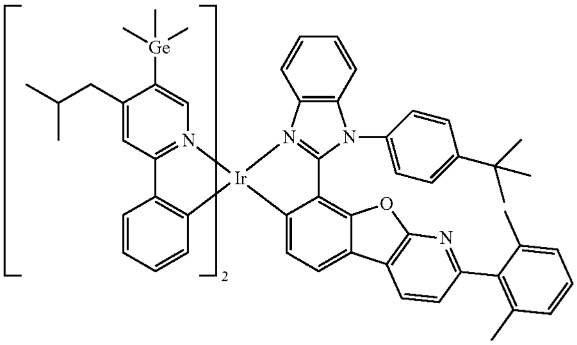
1577
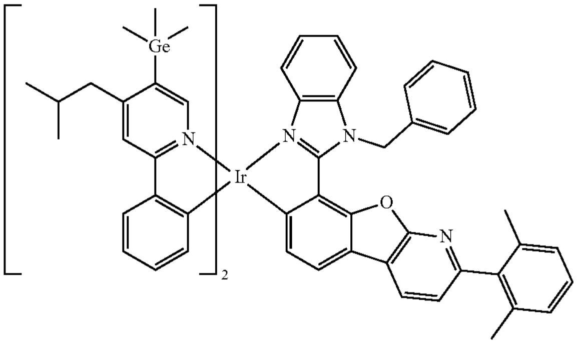
1578
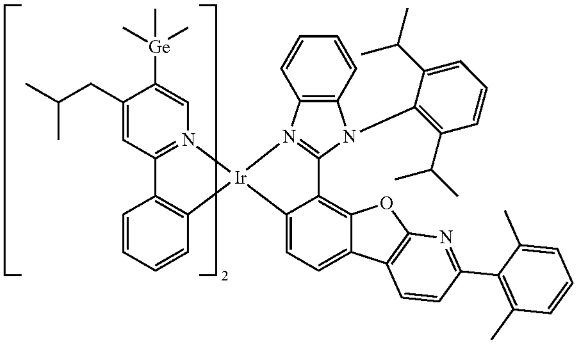

-continued
1579
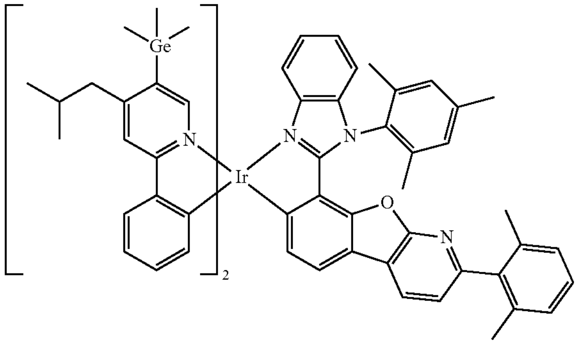
1580
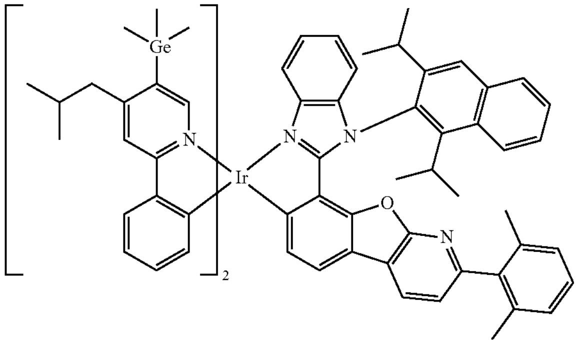
1581
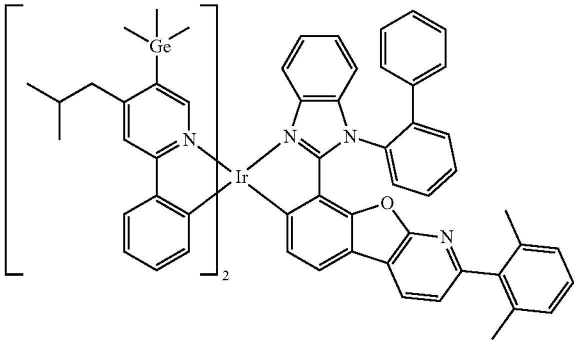
1582
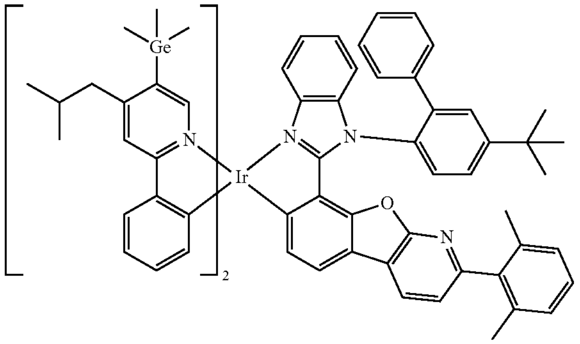
-continued
1583
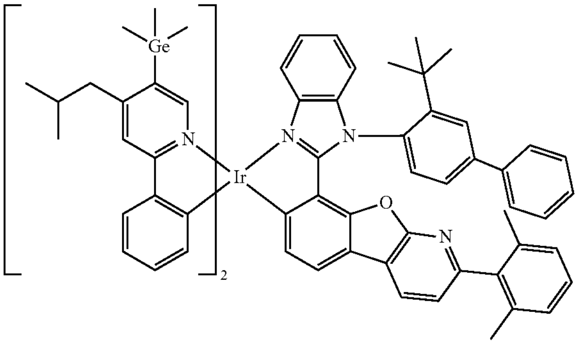
1584
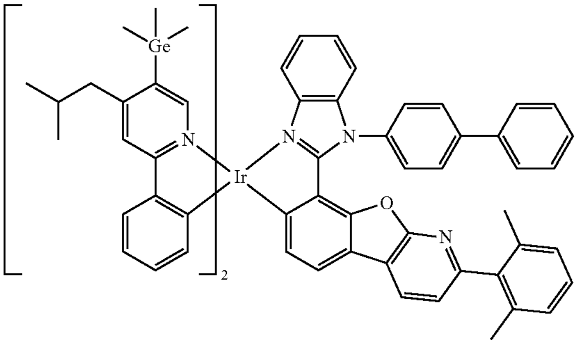
1585
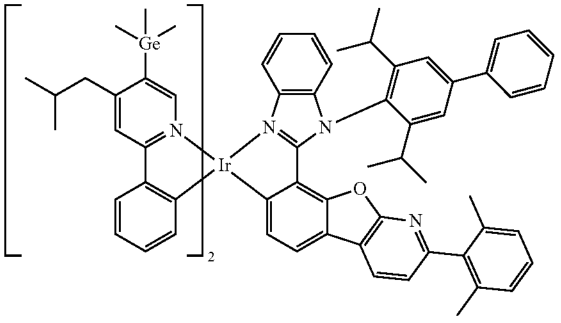
1586
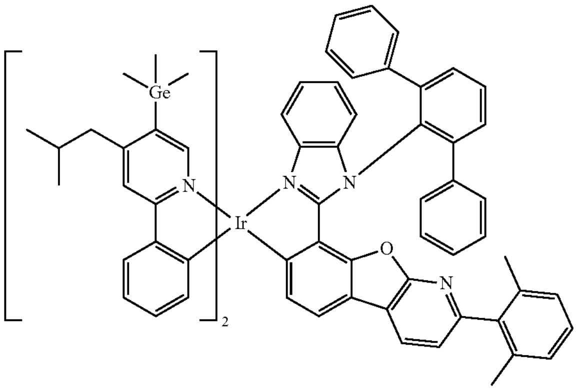

-continued
1587
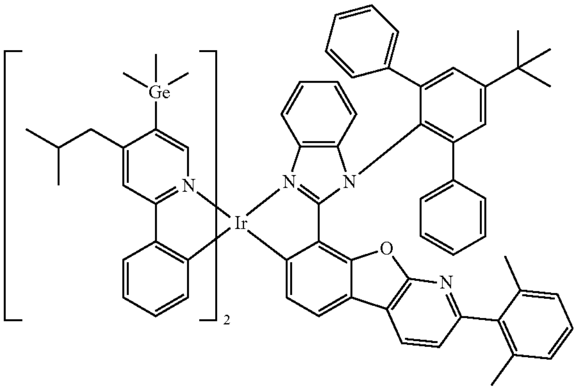
1588
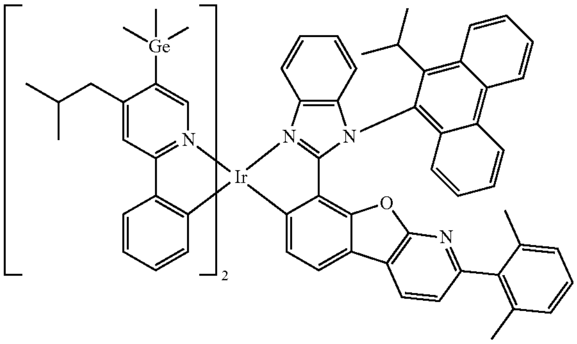
1589
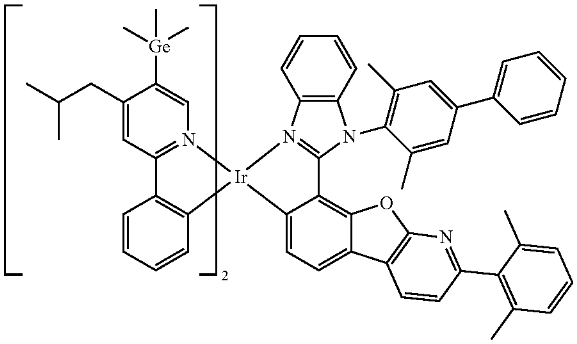
1590
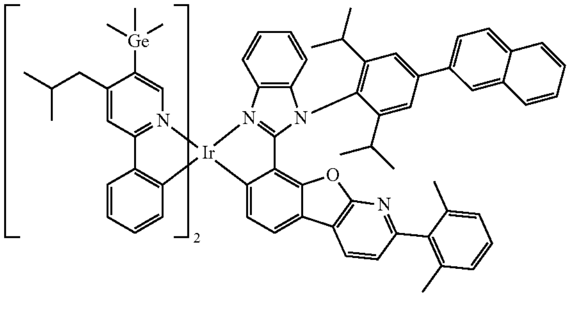
-continued
1591
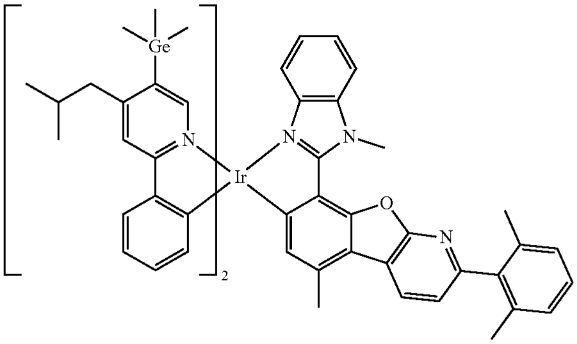
1592
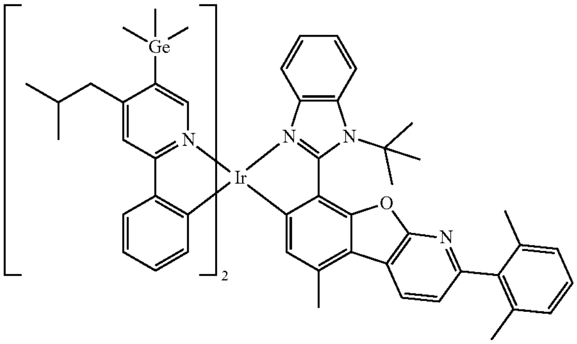
1593
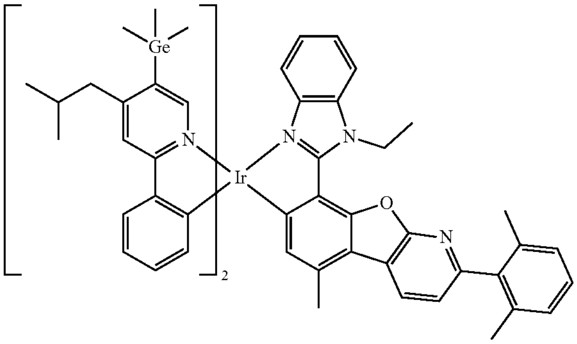
1594
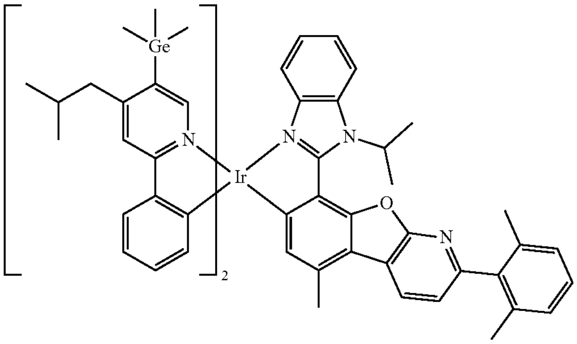

-continued
1595
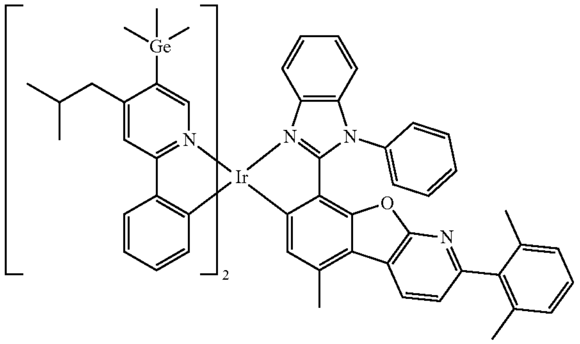
1596
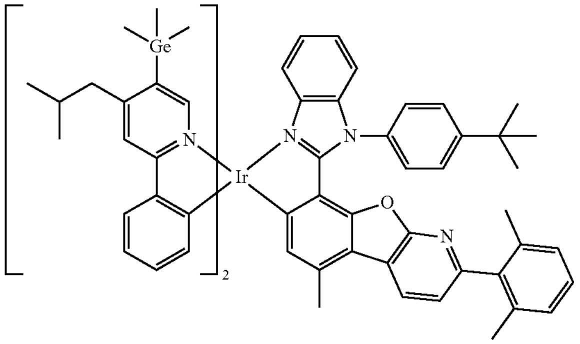
1597
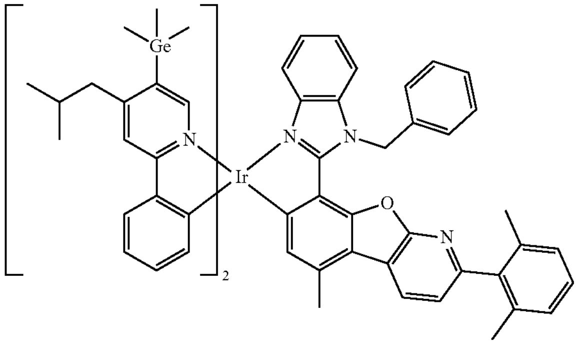
1598
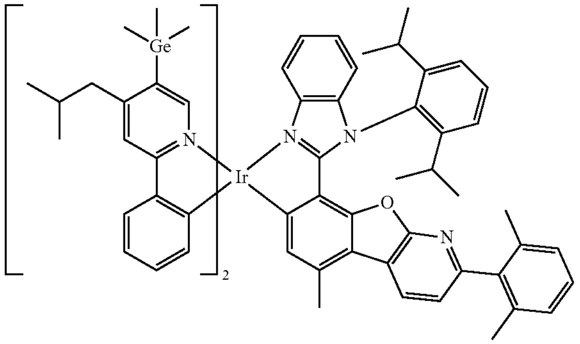
-continued
1599
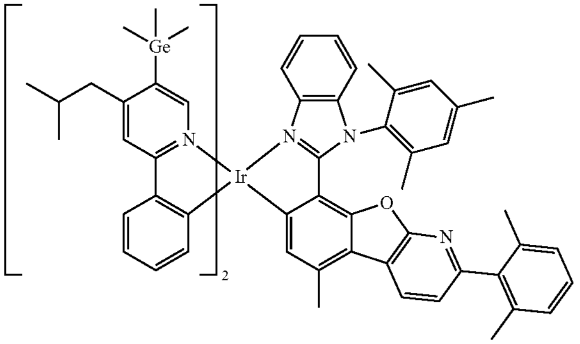
1600
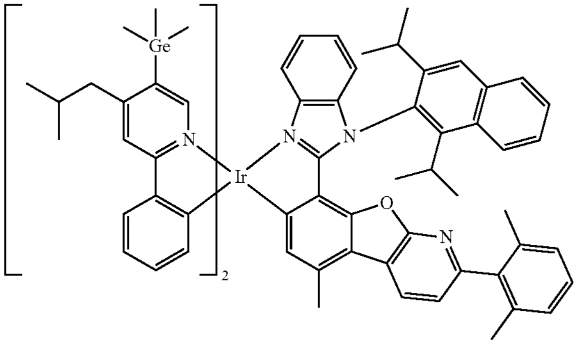
1601
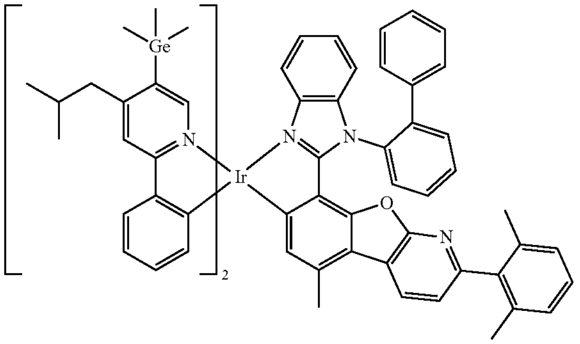
1602
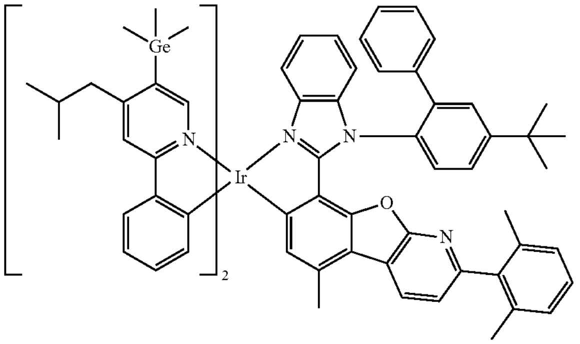

-continued
1603
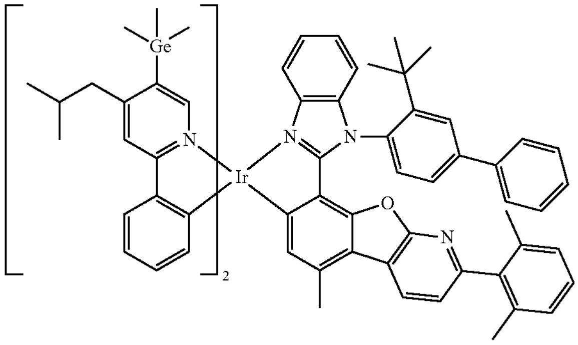
1604
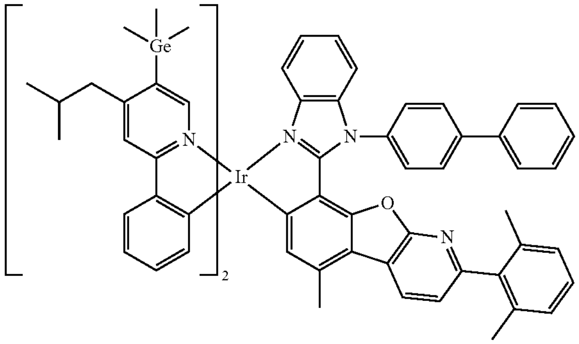
1605
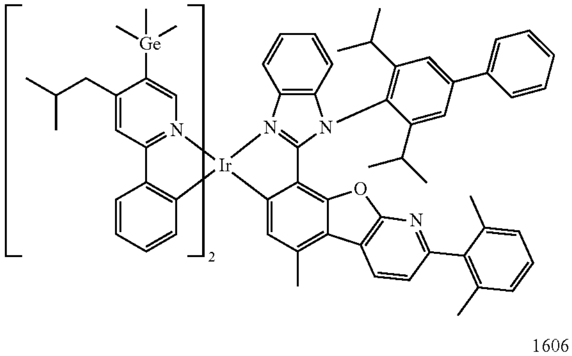
1606
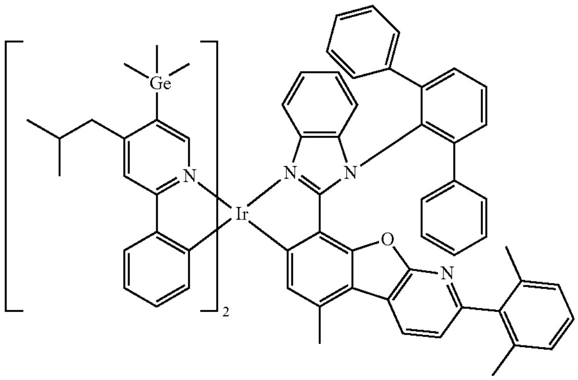
-continued
1607
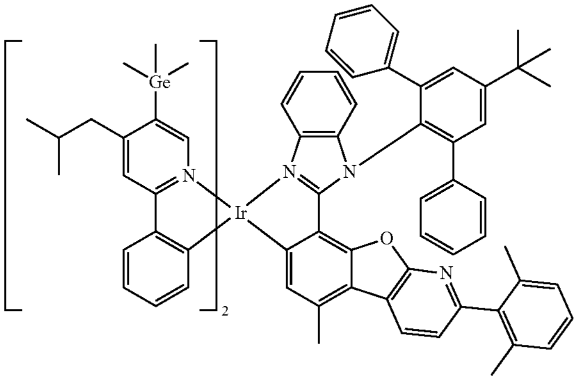
1608
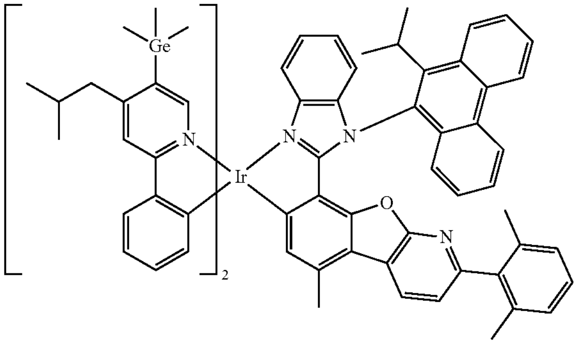
1609
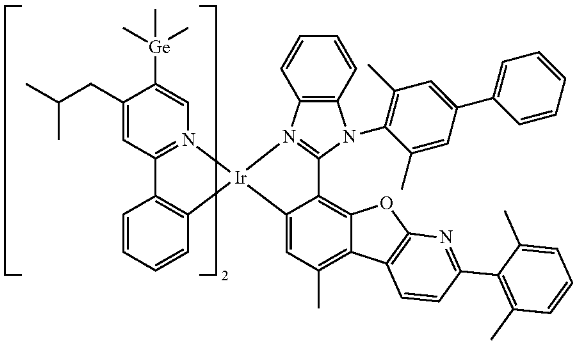
1610
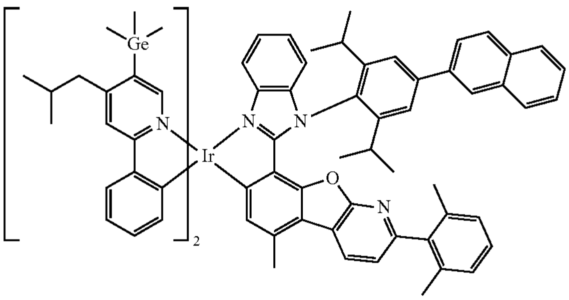

-continued
1611
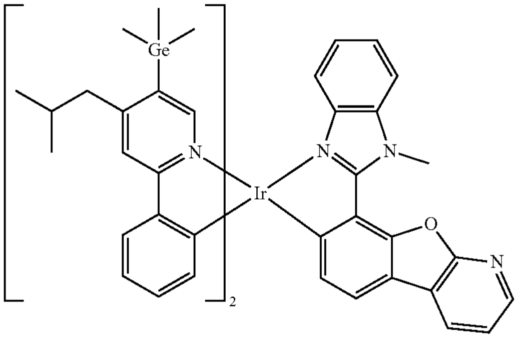
1612
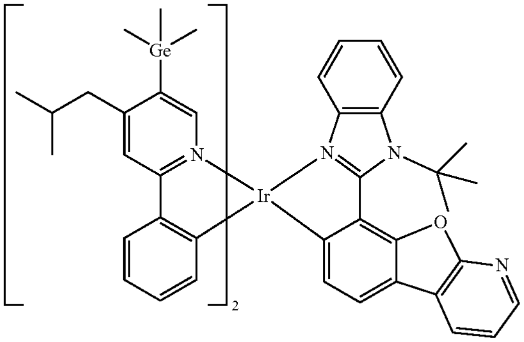
1613
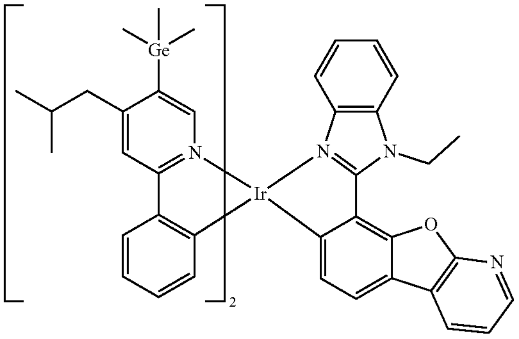
1614
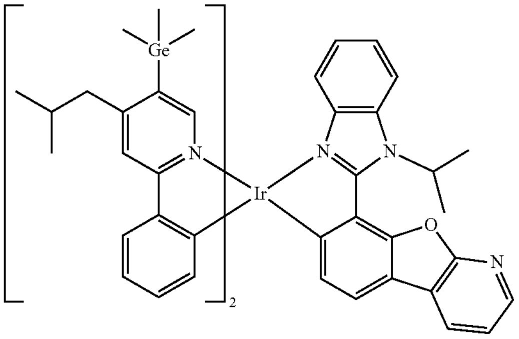
1615
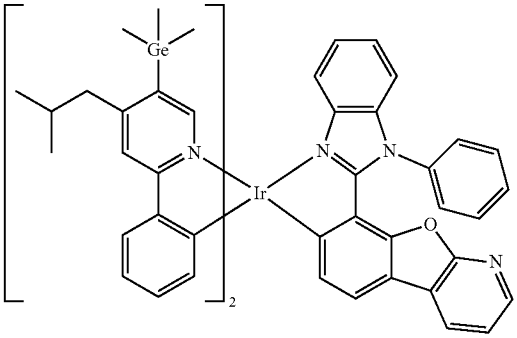
1616
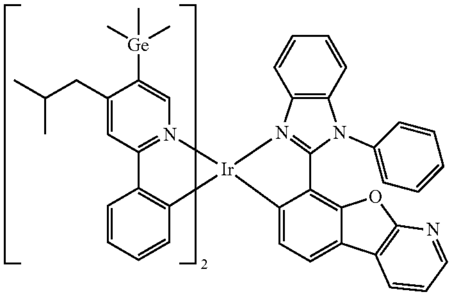
1617
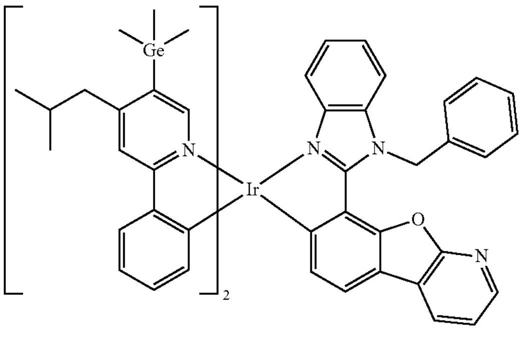
1618
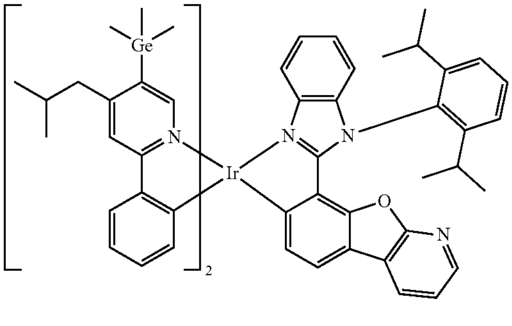

-continued
1619
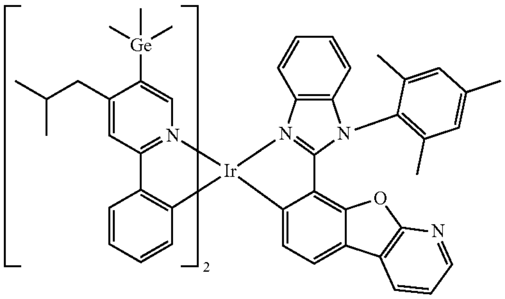
1620
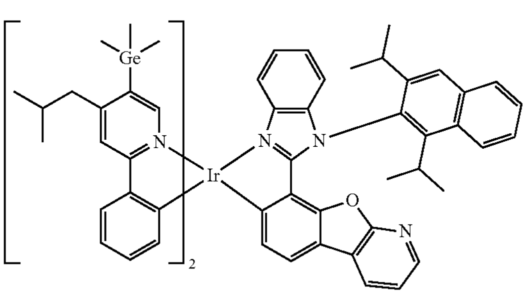
1621
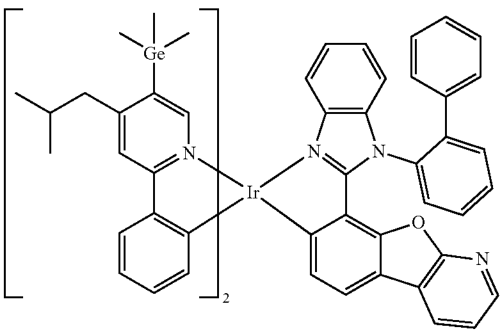
1622
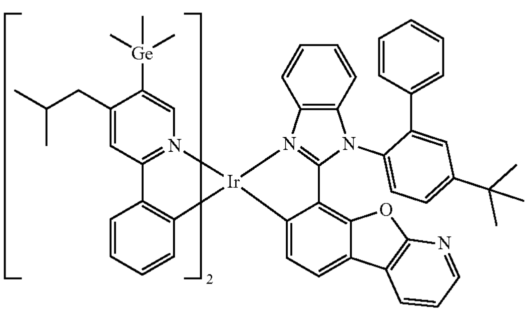
1623
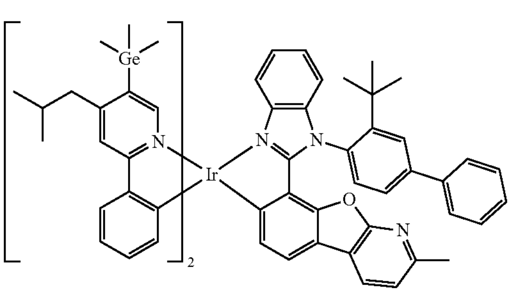
-continued
1624
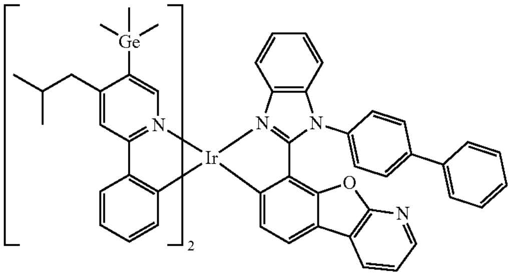
1625
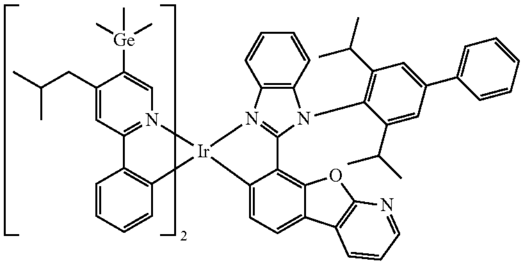
1626
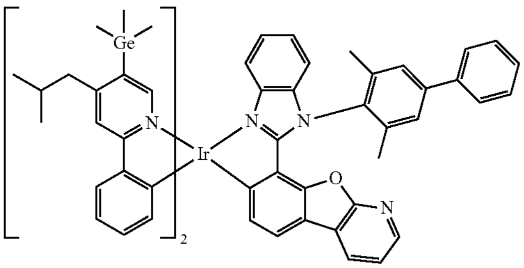
1627
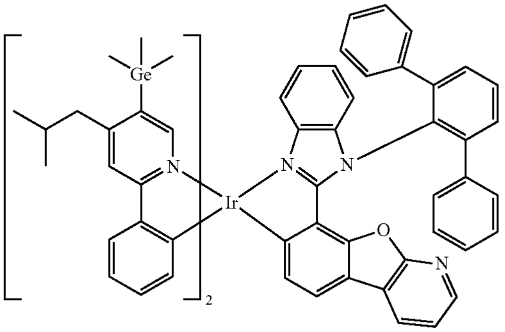
1628
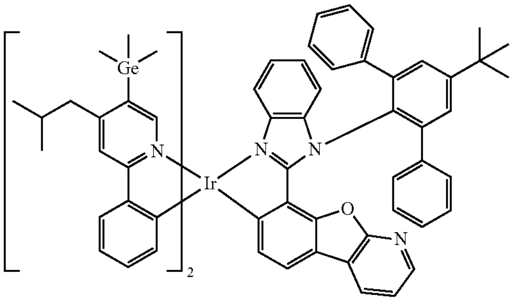

-continued
1629
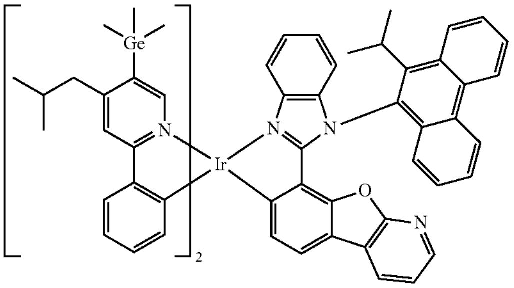
1630
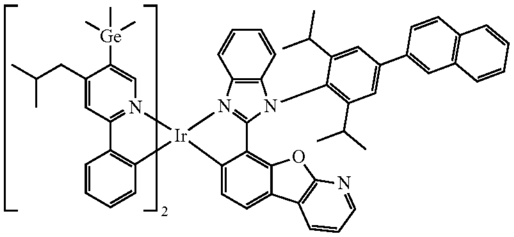
1631
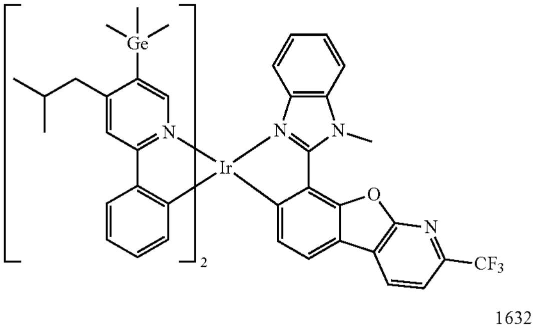
1632
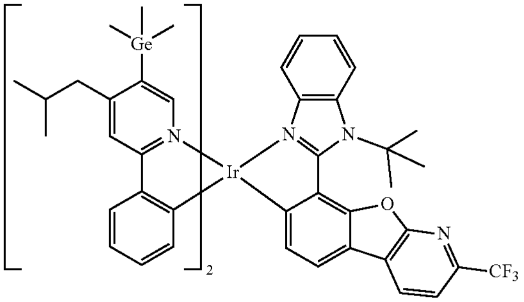
1633
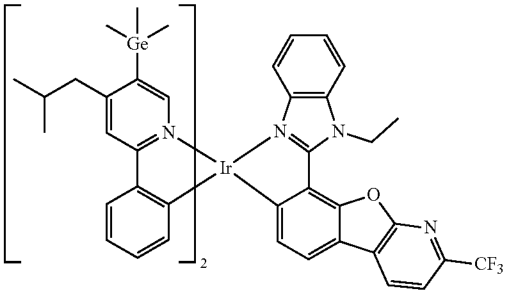
-continued
1634
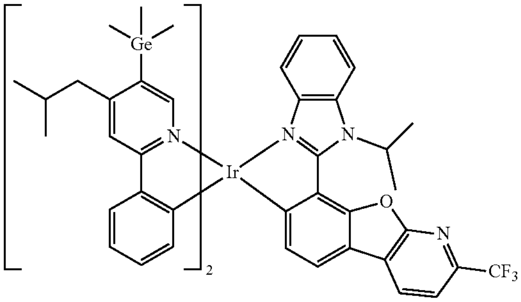
1635
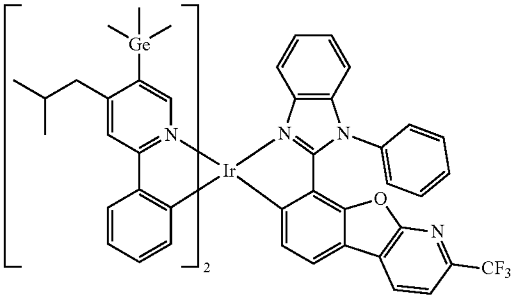
1636
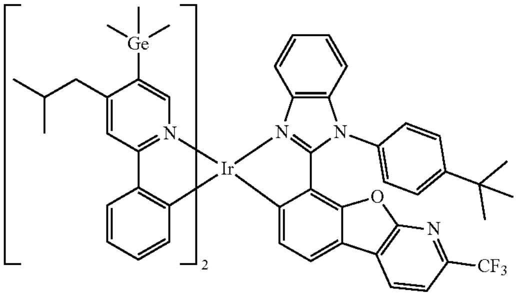
1637
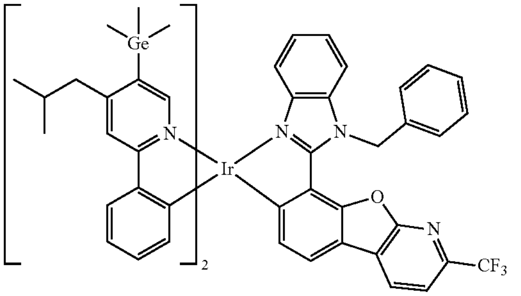
1638
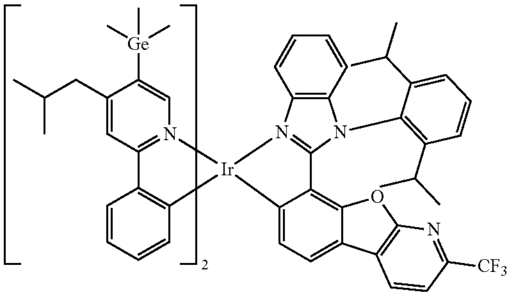

-continued
1639
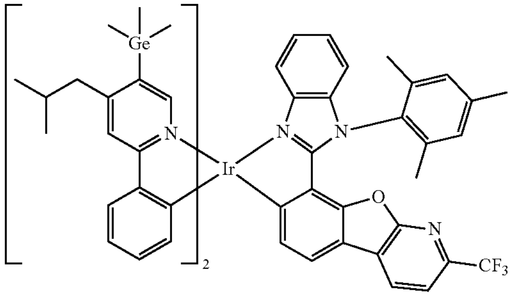
1640
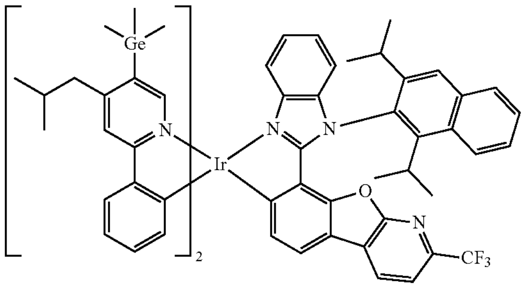
1641
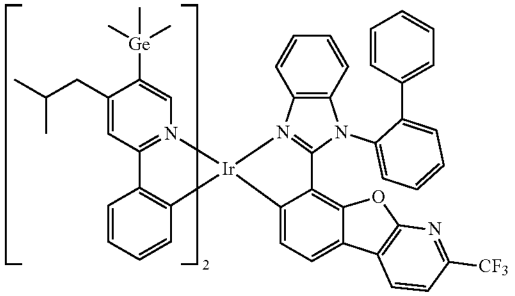
1642
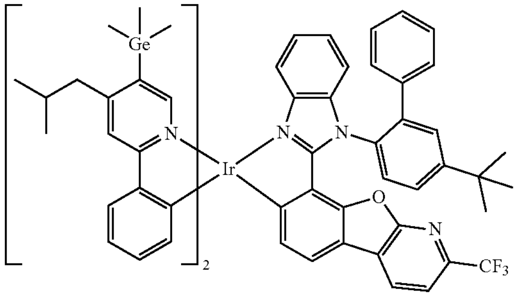
1643
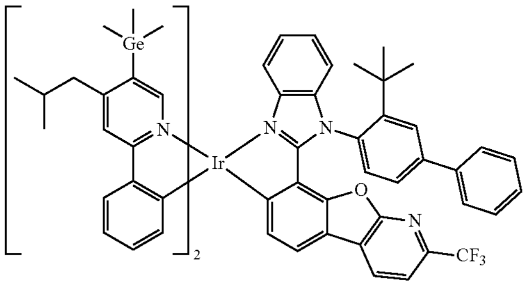
-continued
1644
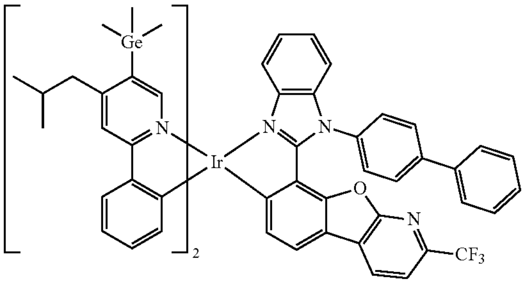
1645
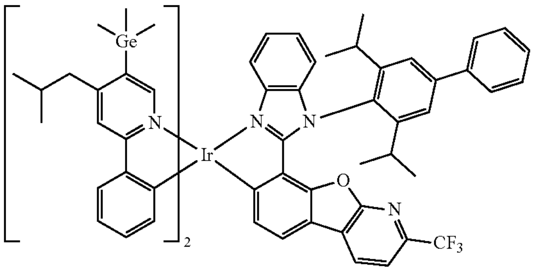
1646
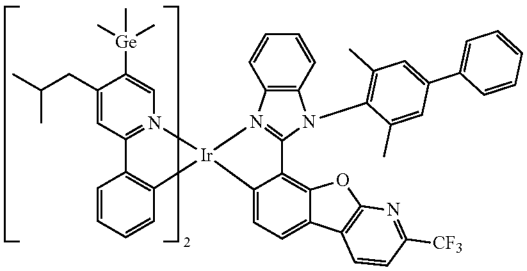
1647
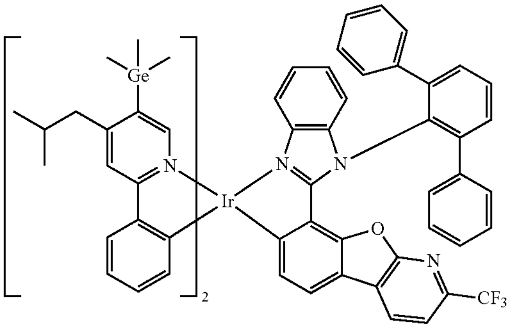
1648
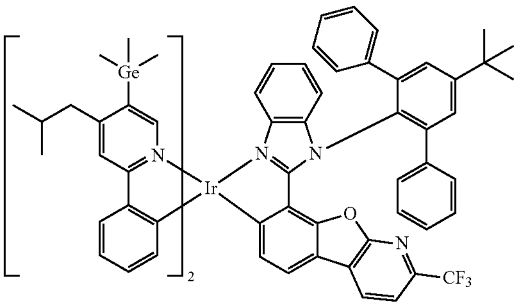

1649
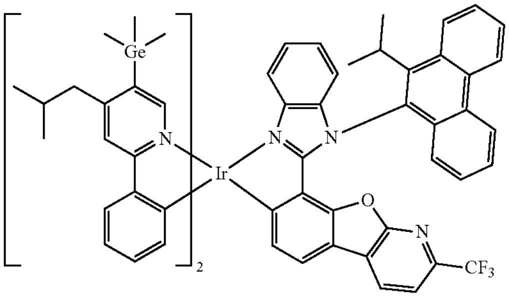
1650
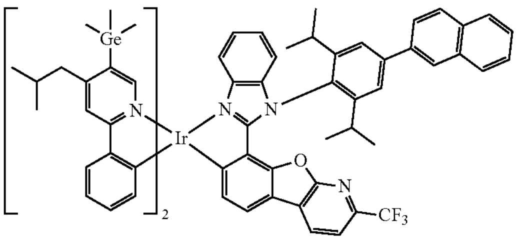
1651
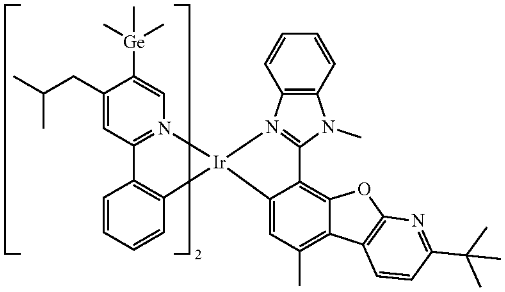
1652
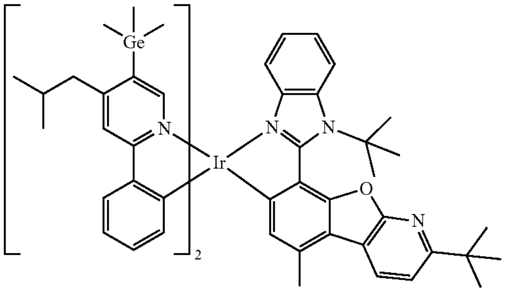
1653
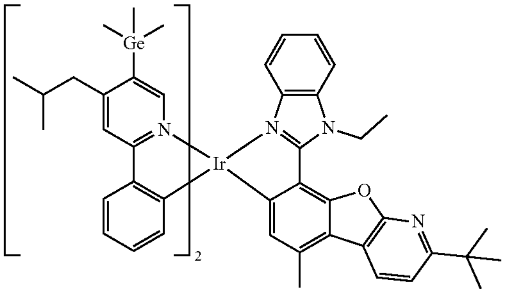
1654
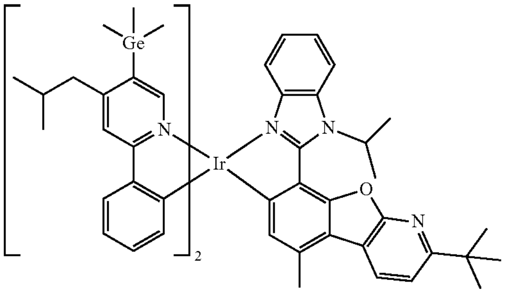
1655
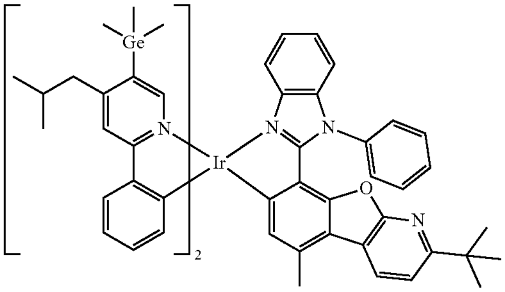
1656
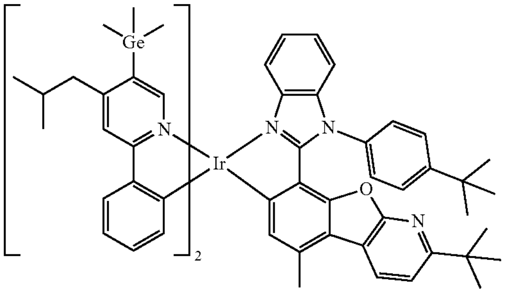
1657
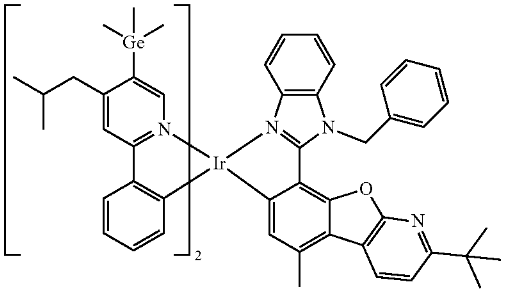
1658
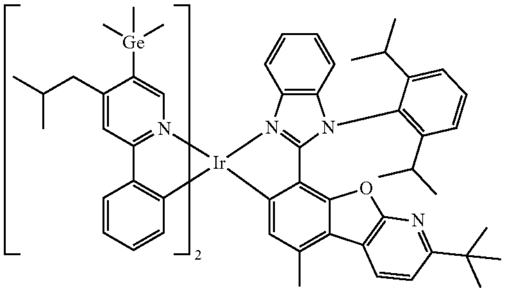

-continued
1659
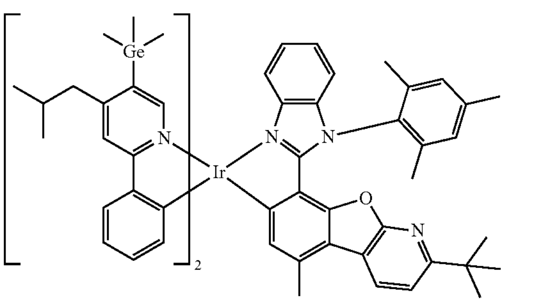
1660
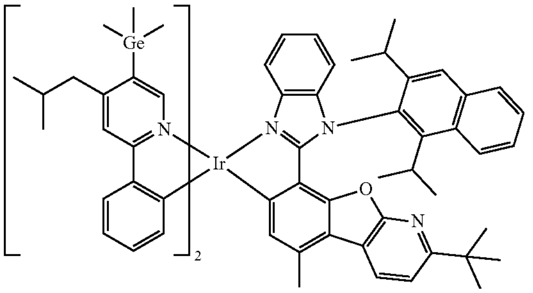
1661
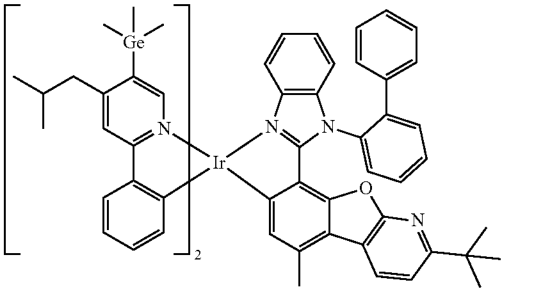
1662
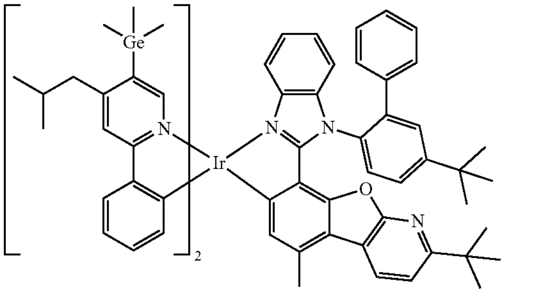
1663
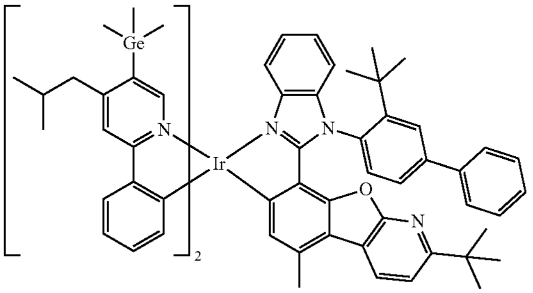
-continued
1664
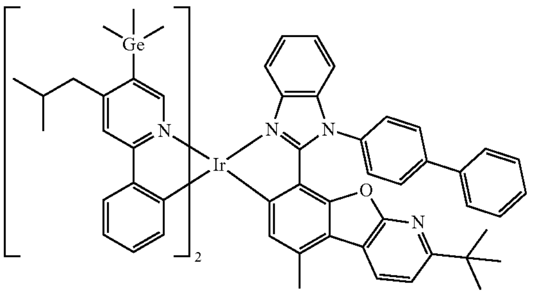
1665
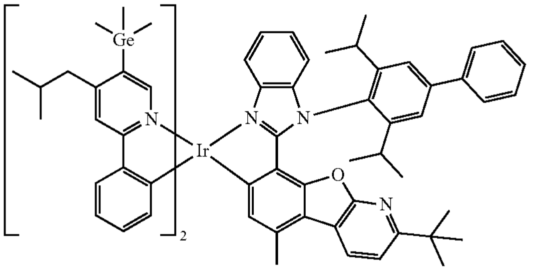
1666
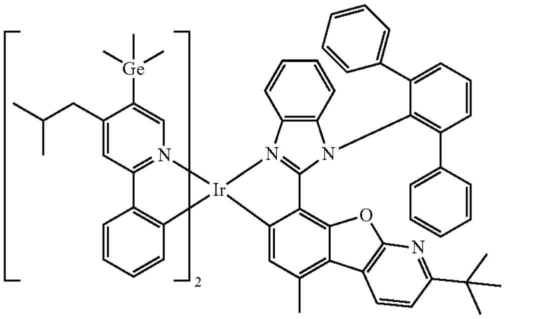
1667
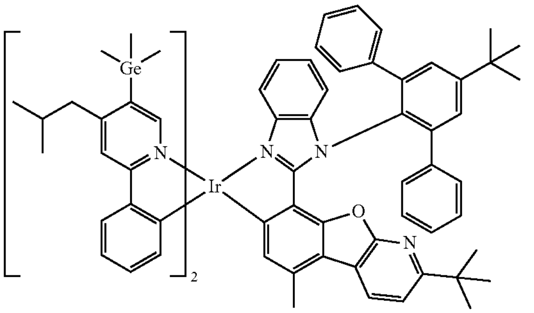
1668
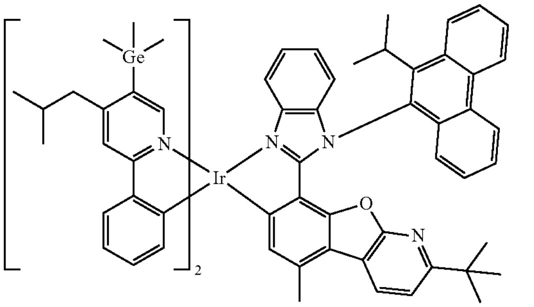

-continued
1669
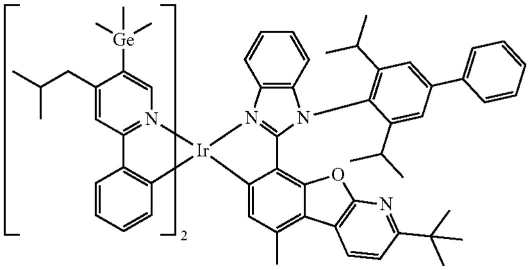
1670
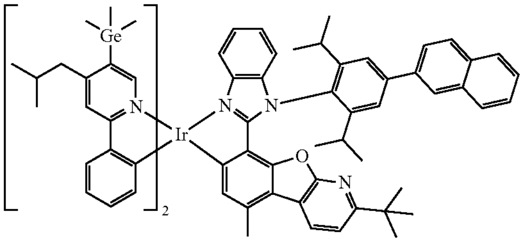
1671
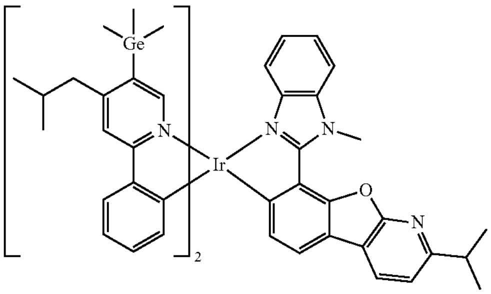
1672
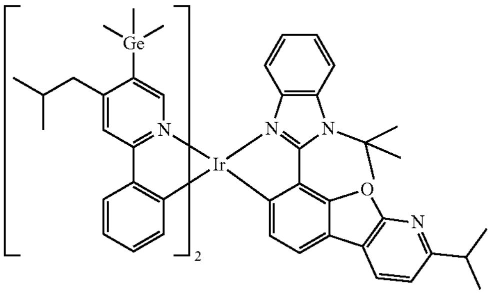
1673
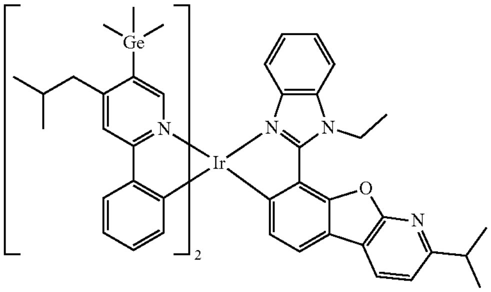
-continued
1674
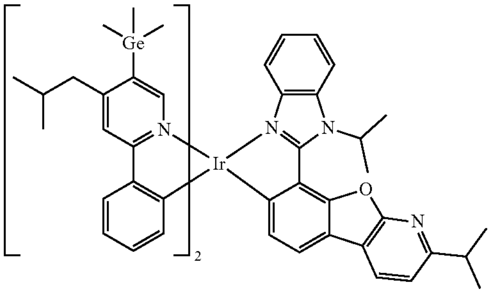
1675
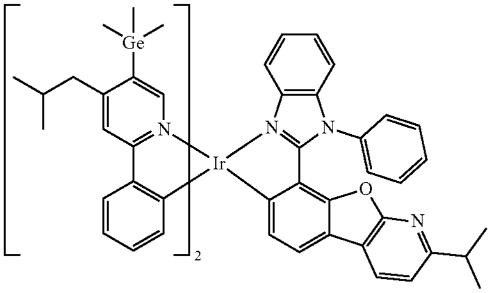
1676
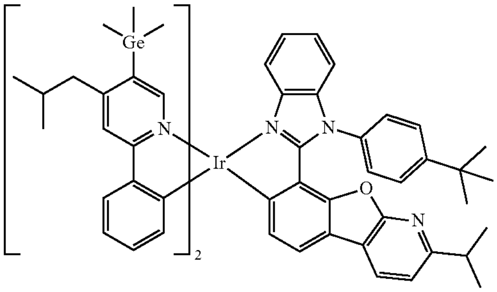
1677
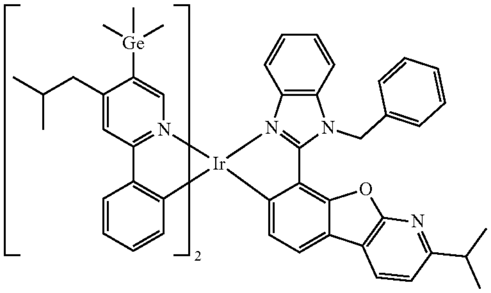
1678
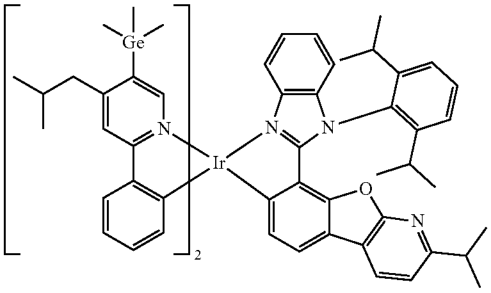

-continued
1679
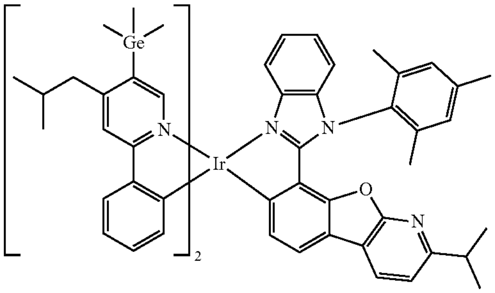
1680
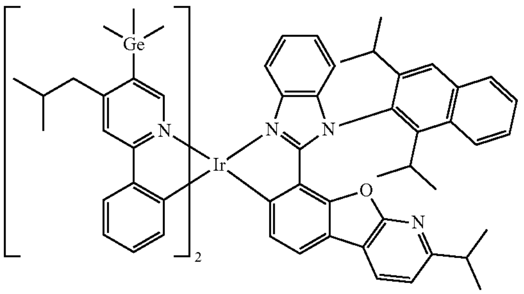
1681
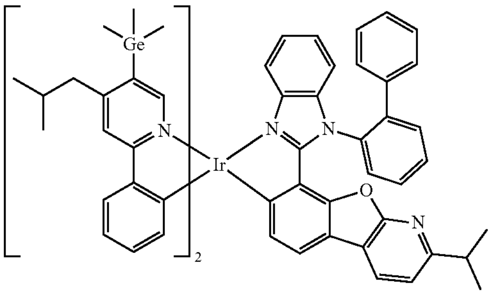
1682
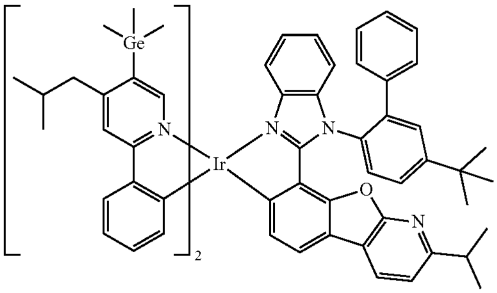
1683
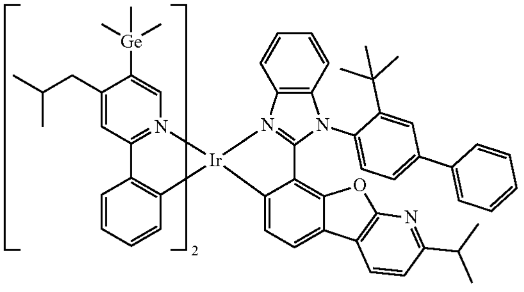
-continued
1684
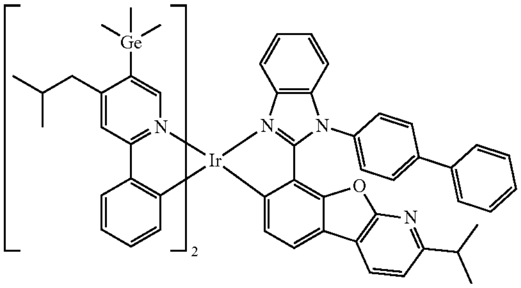
1685
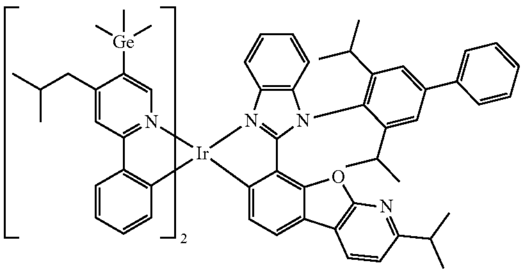
1686
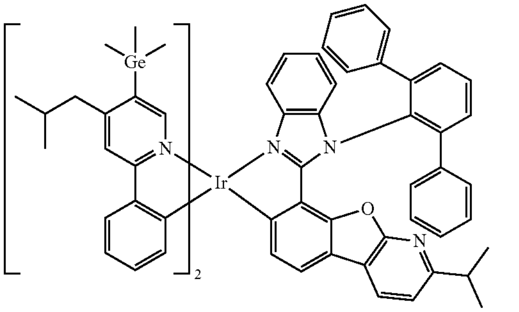
1687
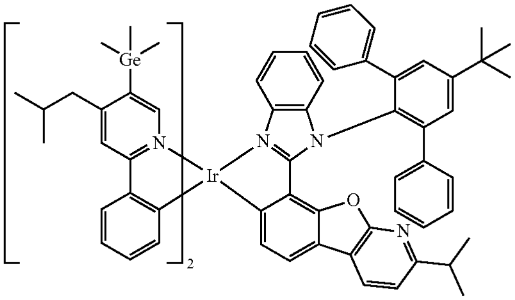
1688
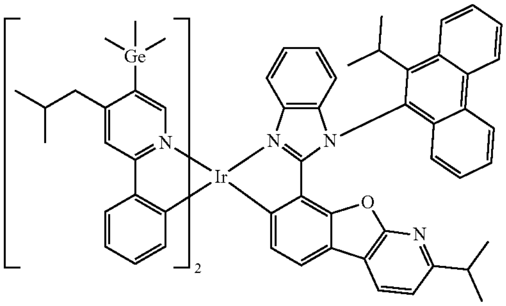

-continued
1689
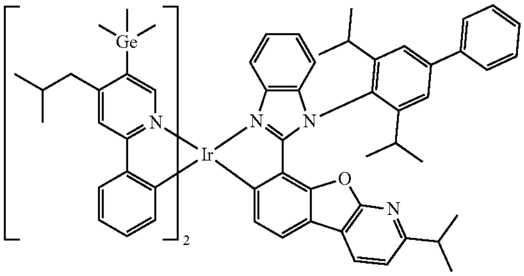
1690
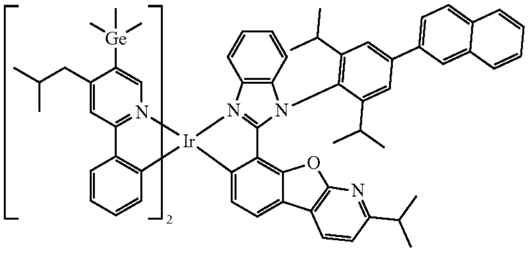
1691
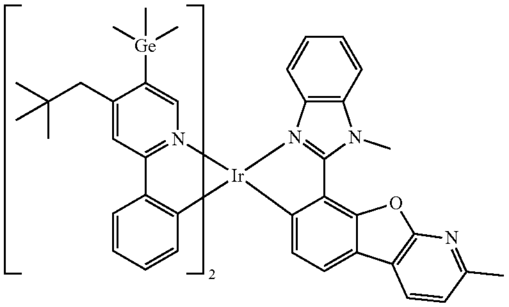
1692
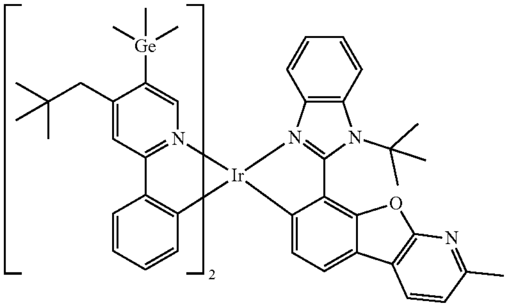
1693
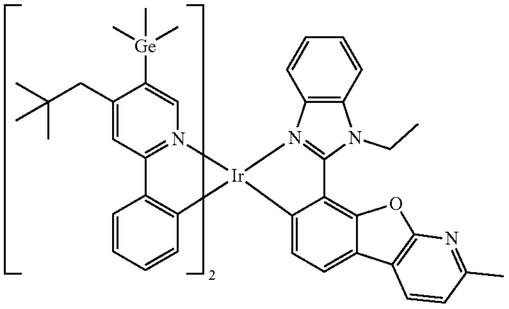
-continued
1694
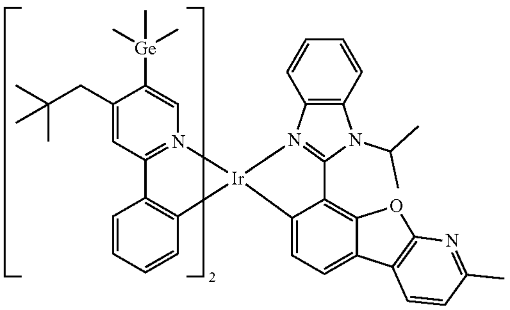
1695
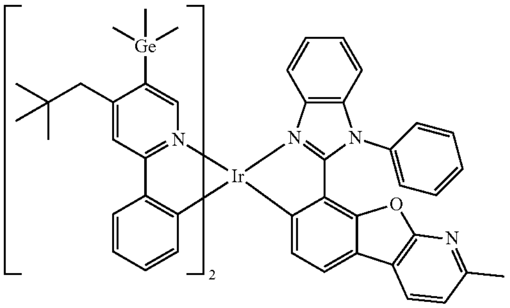
1696
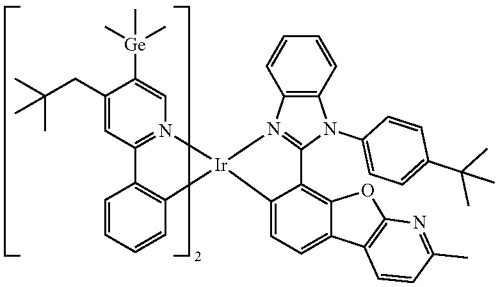
1697
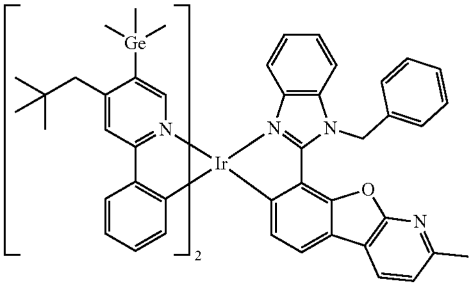
1698
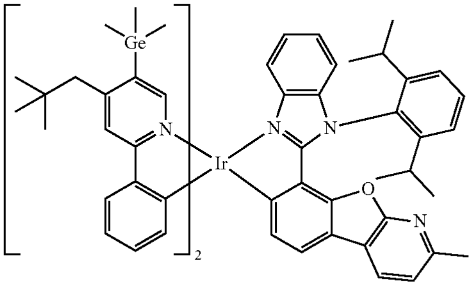

-continued
1699
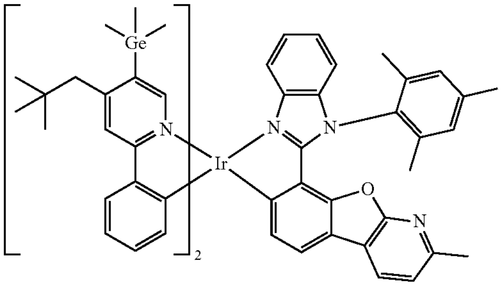
1700
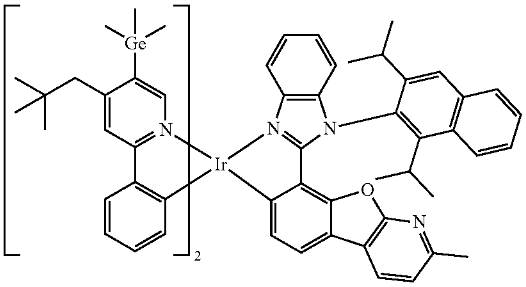
1701
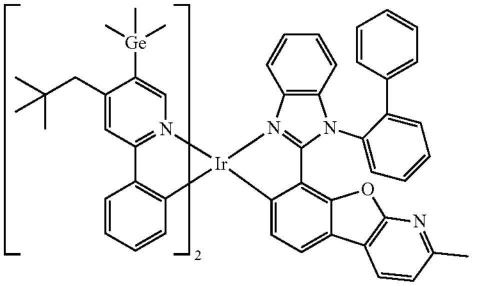
1702
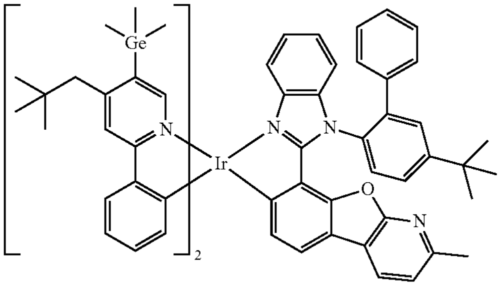
1703
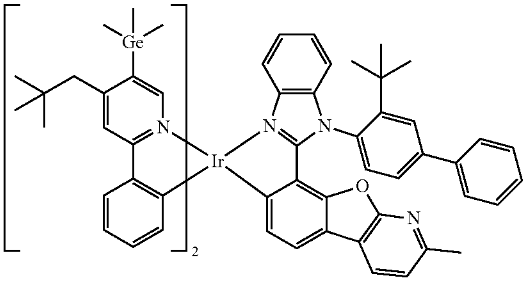
-continued
1704
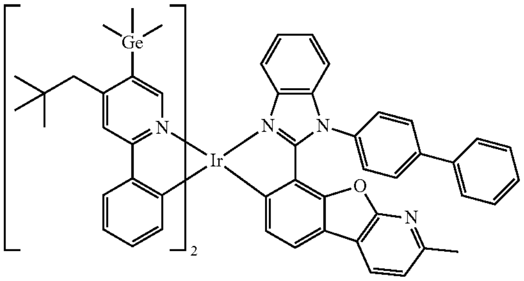
1705
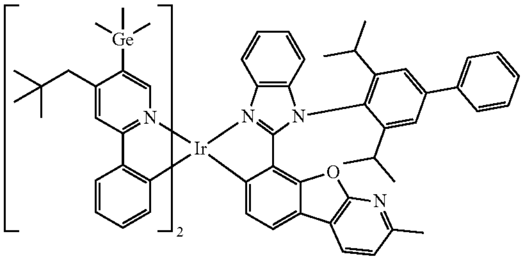
1706
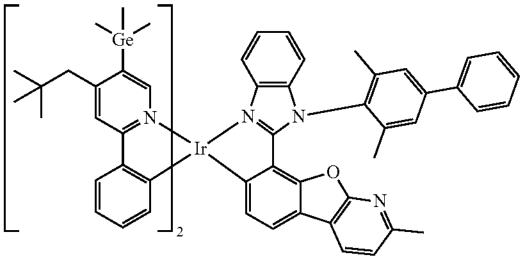
1707
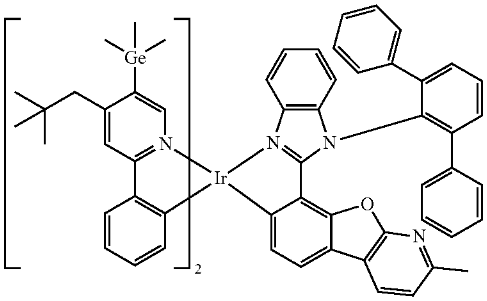
1708
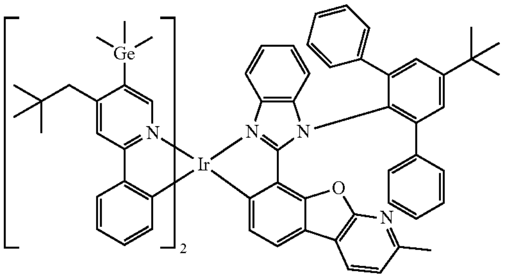

-continued
1709
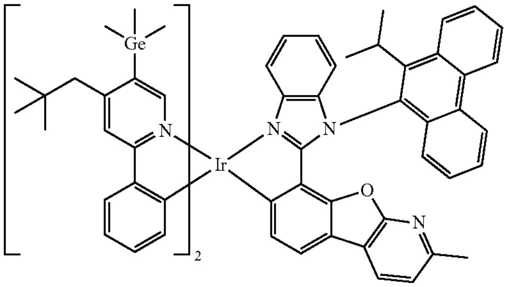
1710
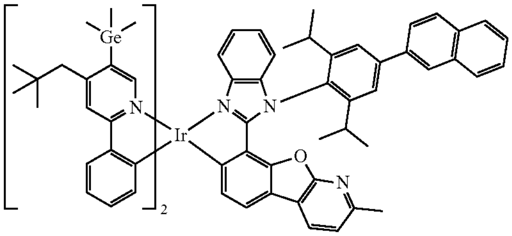
1711
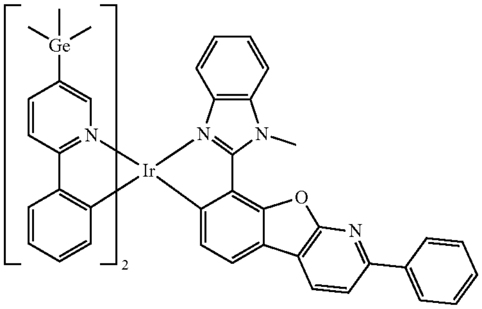
1712
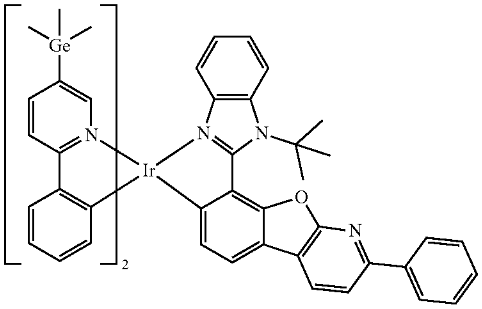
1713
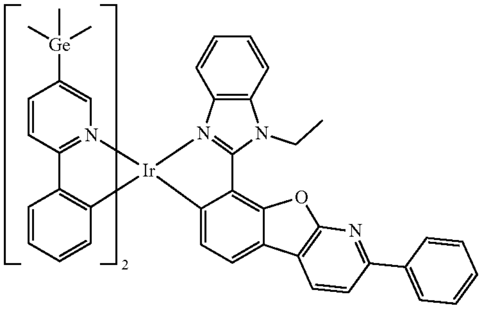
-continued
1714
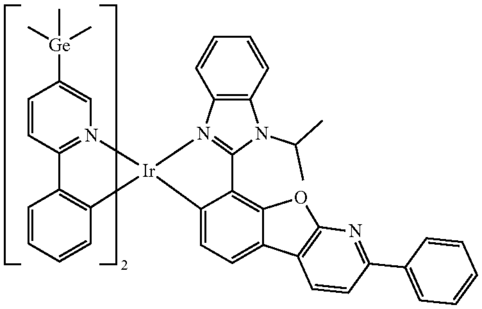
1715
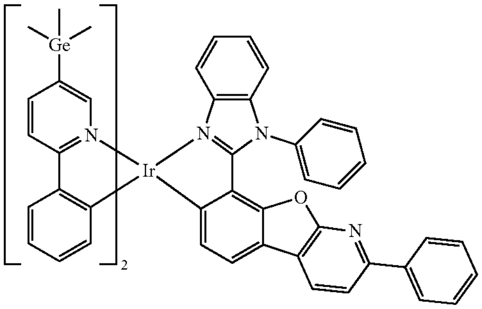
1716
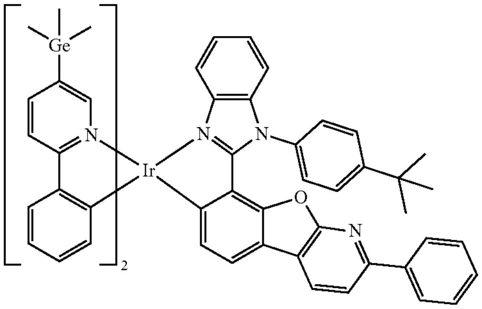
1717
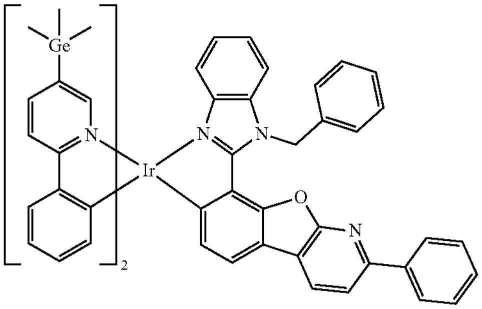

-continued
1718
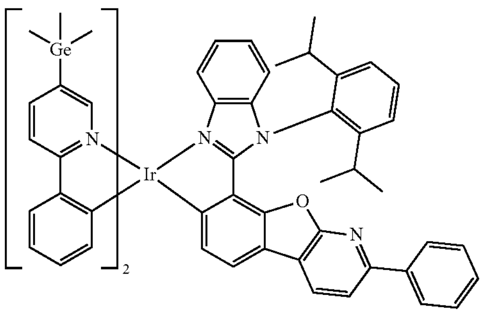
1719
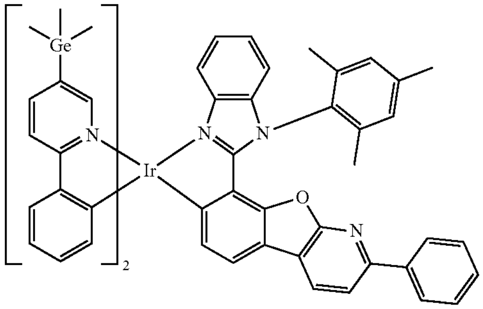
1720
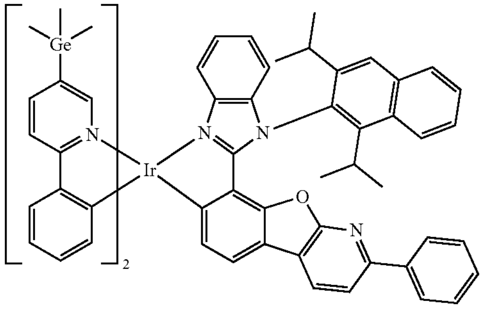
1721
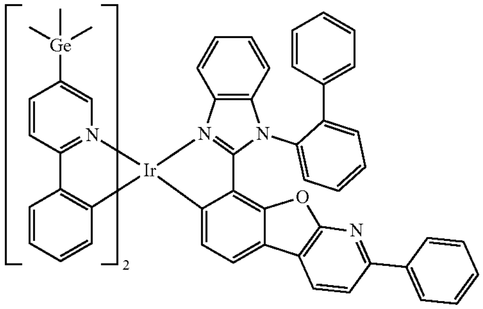
-continued
1722
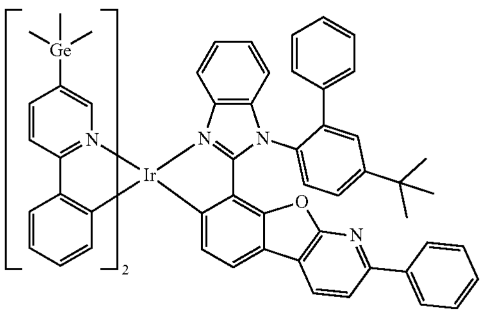
1723
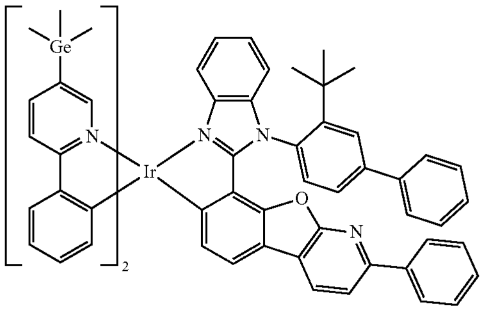
1724
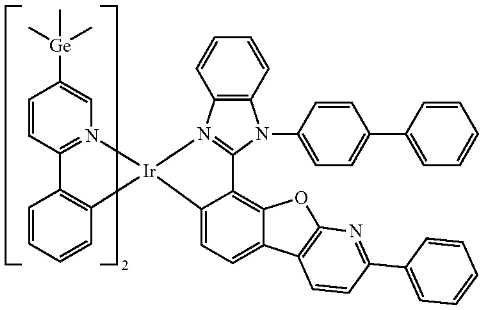
1725
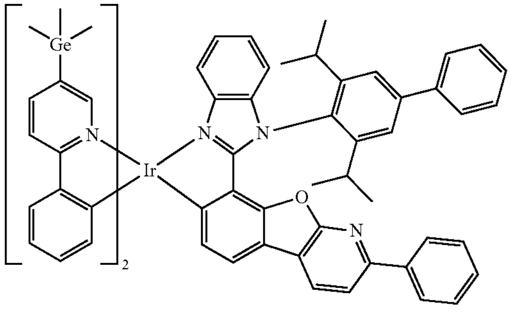

-continued
1726
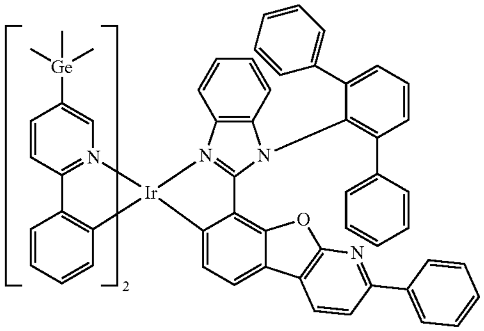
1727
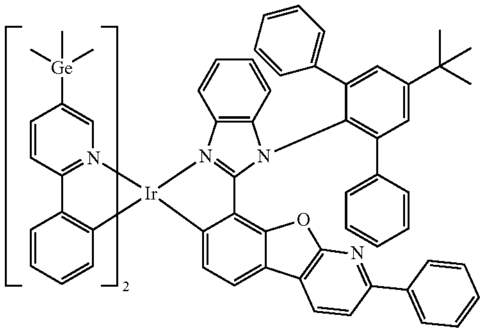
1728
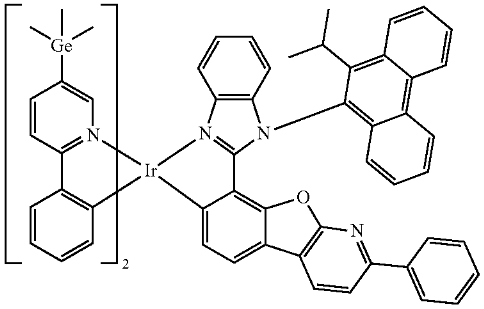
1729
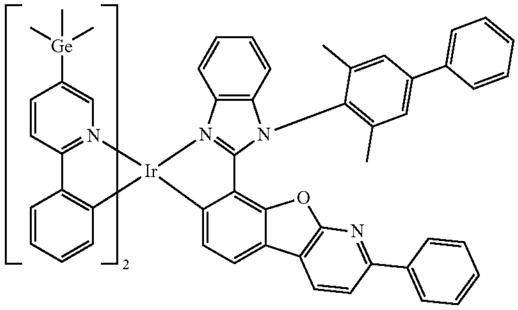
-continued
1730
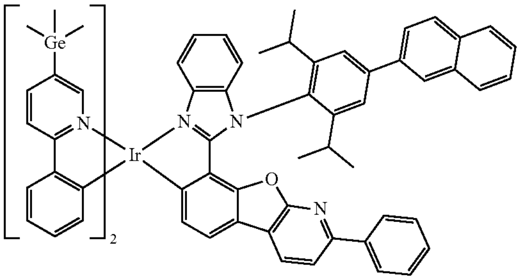
1731
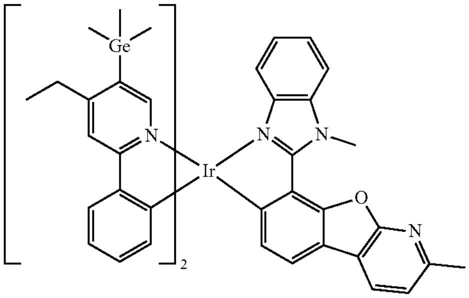
1732
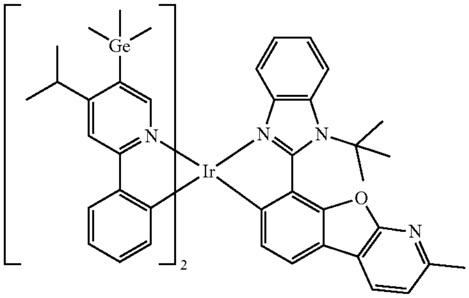
1733
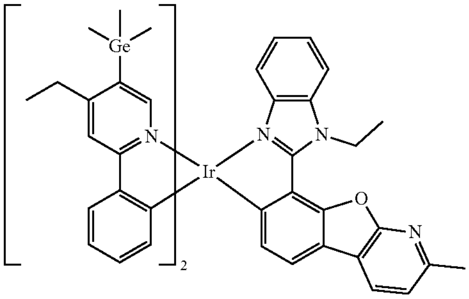
1734
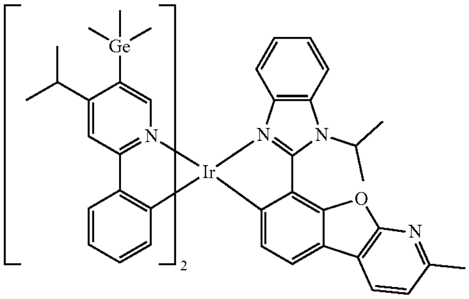

-continued
1735
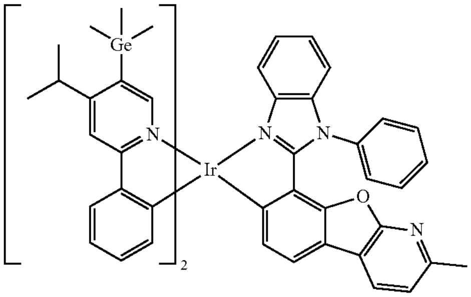
1736
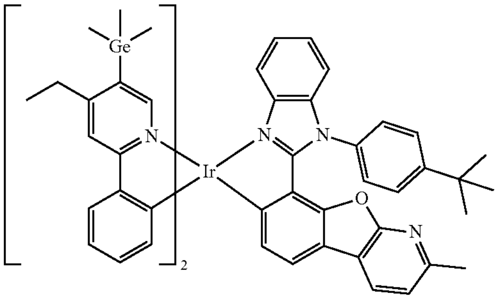
1737
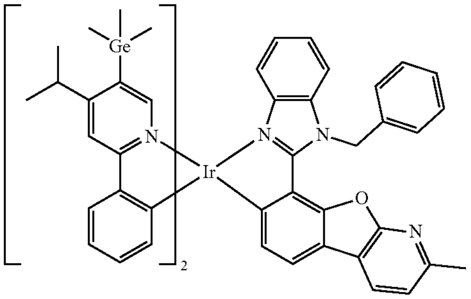
1738
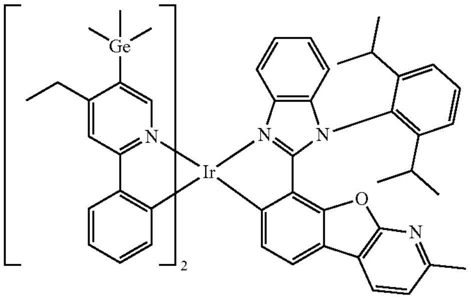
1739
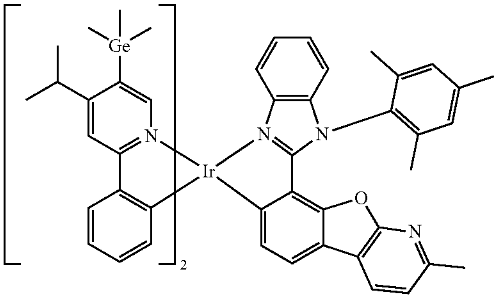
-continued
1740
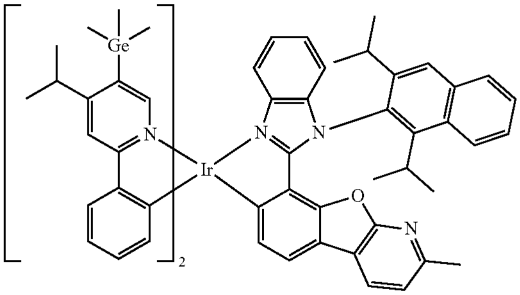
1741
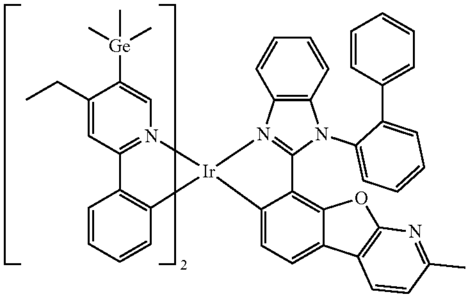
1742
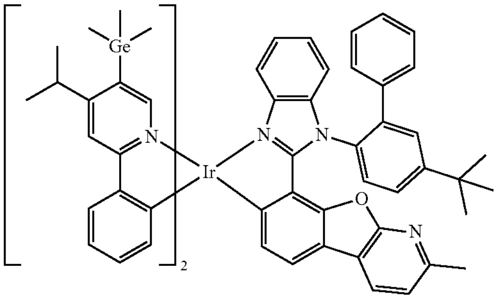
1743
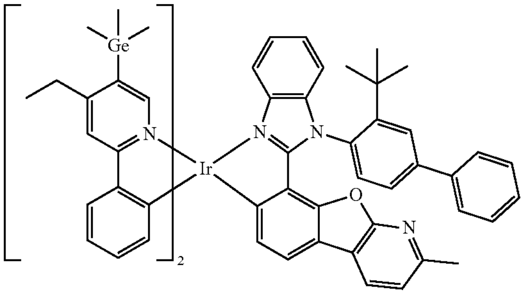
1744
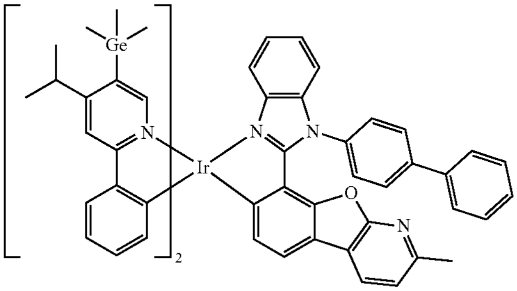

-continued
1745
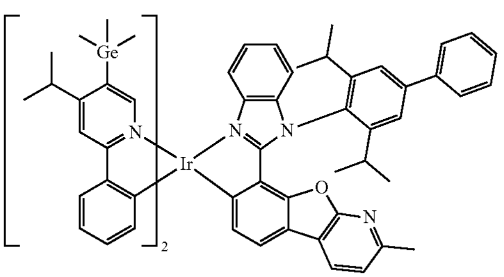
1746
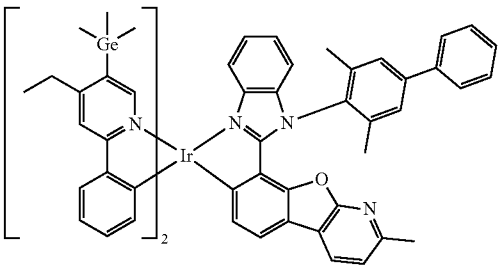
1747
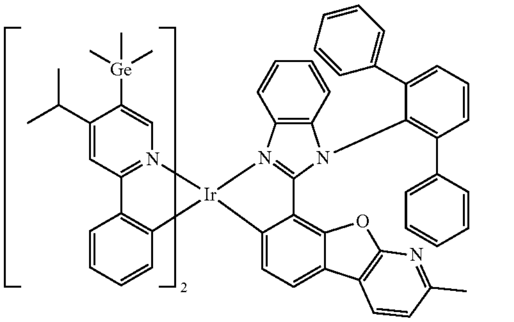
1748
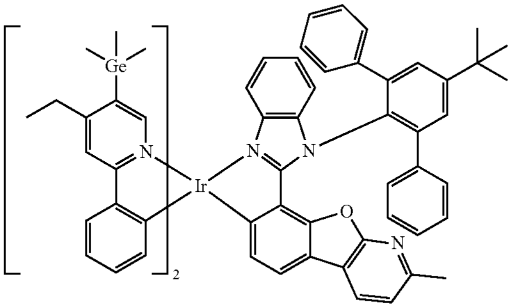
1749
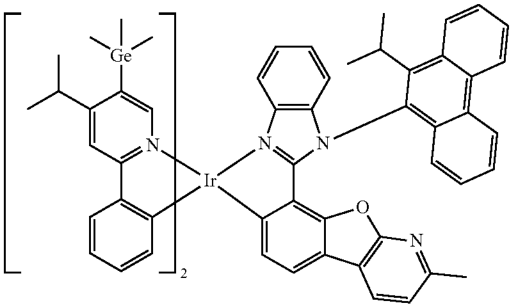
-continued
1750
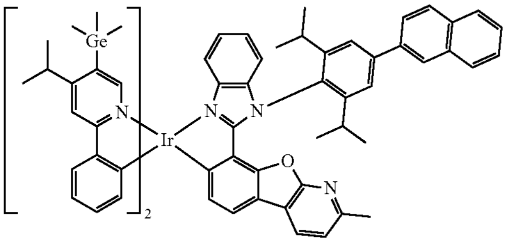
1751
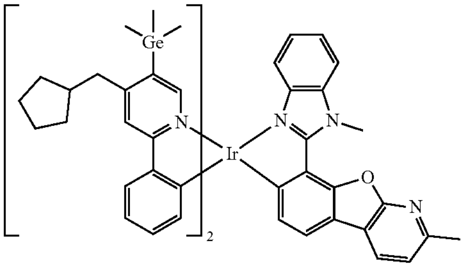
1752
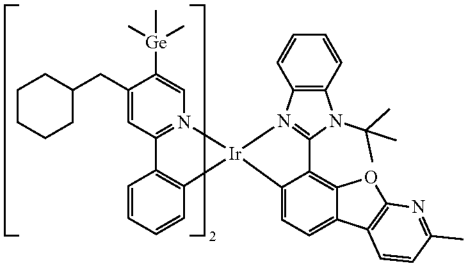
1753
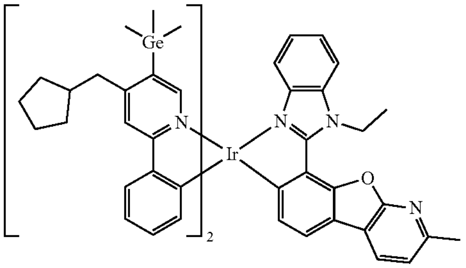
1754
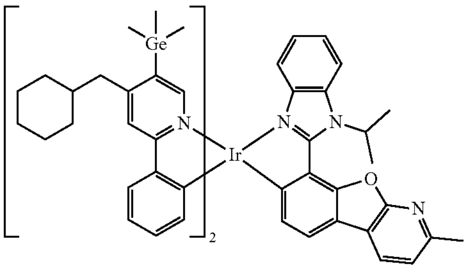
1755
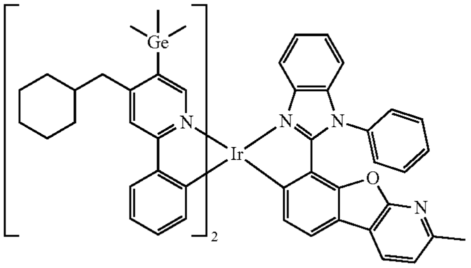

-continued
1756
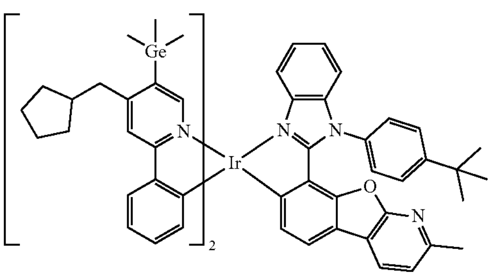
1757
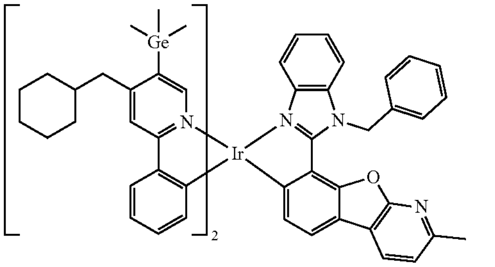
1758
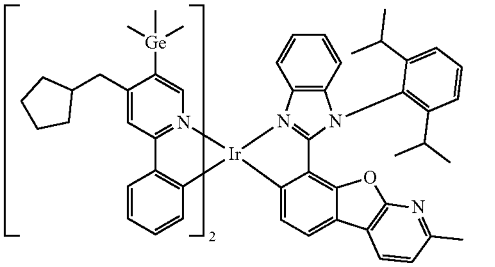
1759
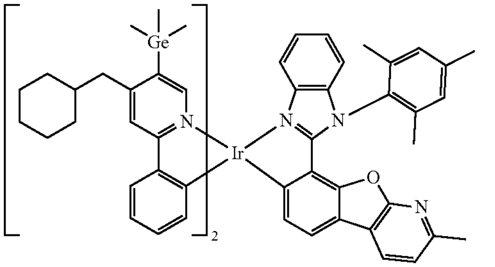
1760
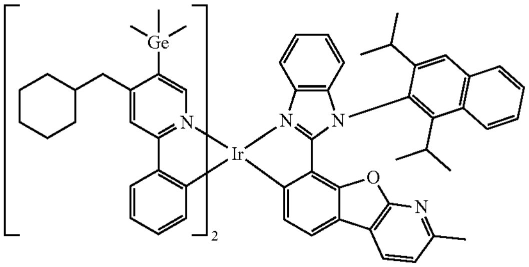
-continued
1761
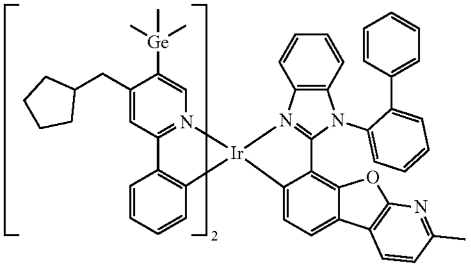
1762
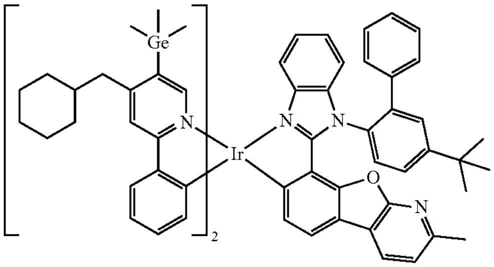
1763
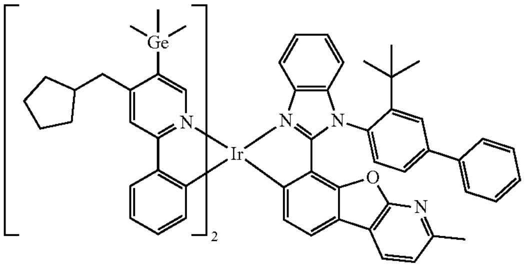
1764
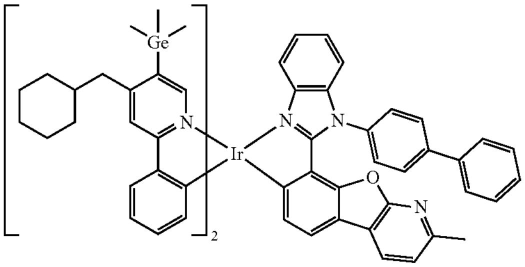
1765
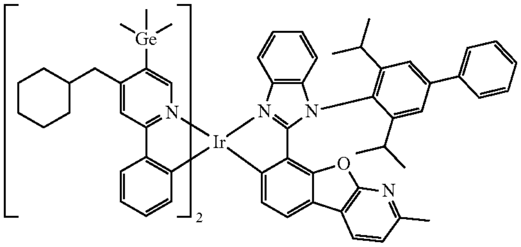

-continued
1766
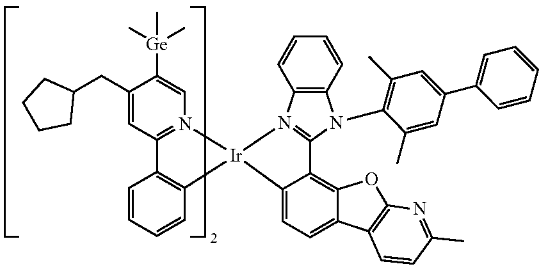
1767
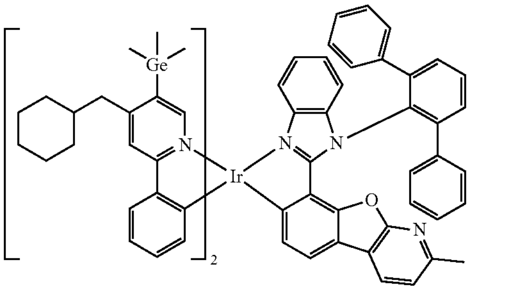
1768
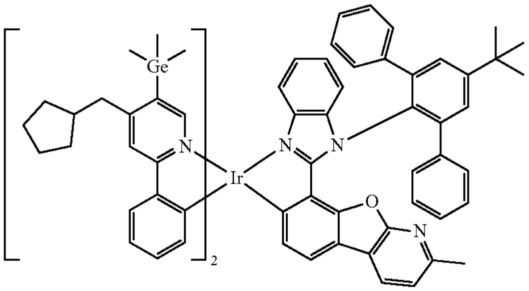
1769
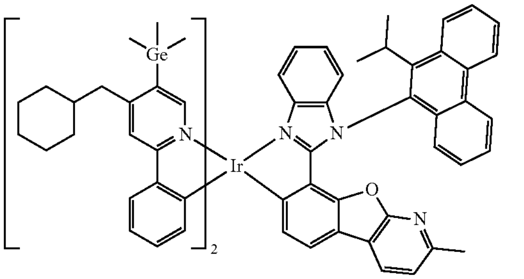
1770
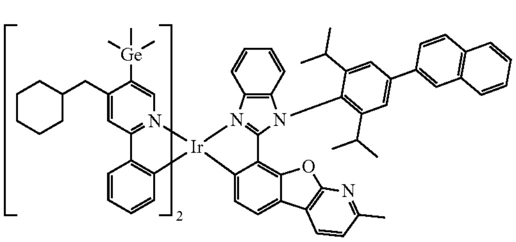
-continued
1771
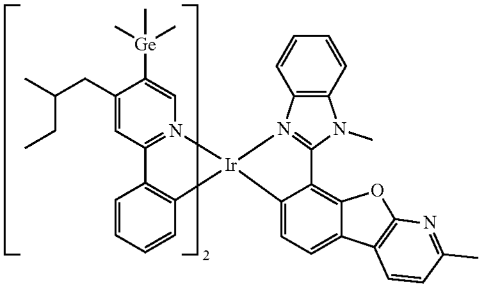
1772
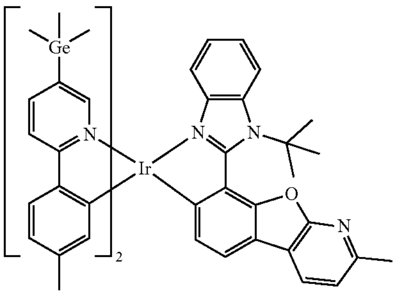
1773
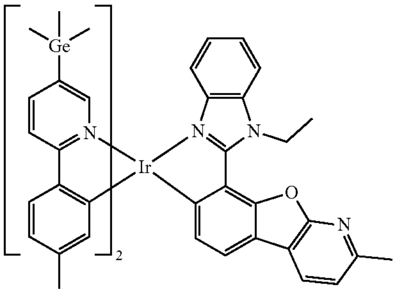
1774
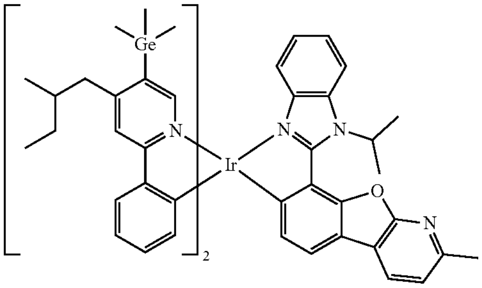
1775
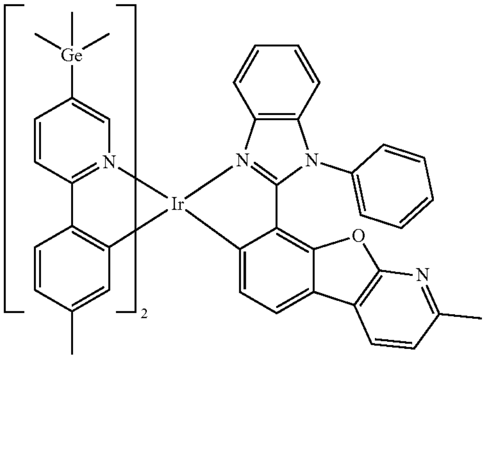

-continued
1776
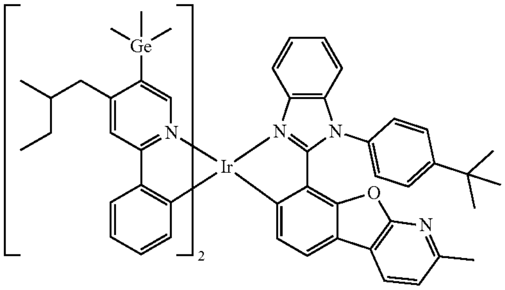
1777
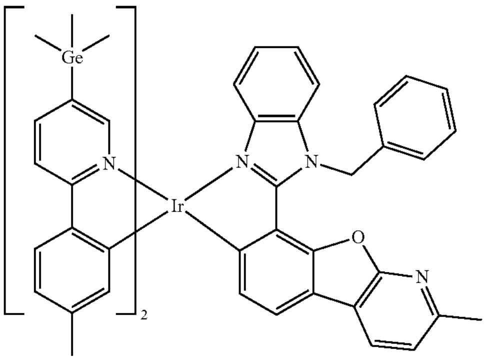
1778
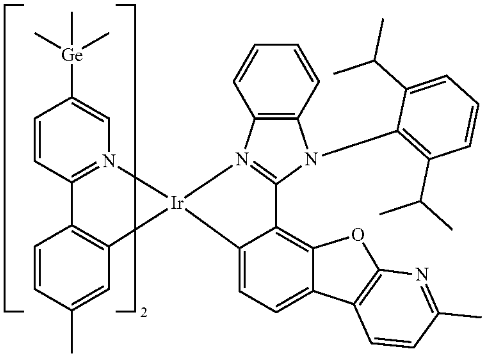
1779
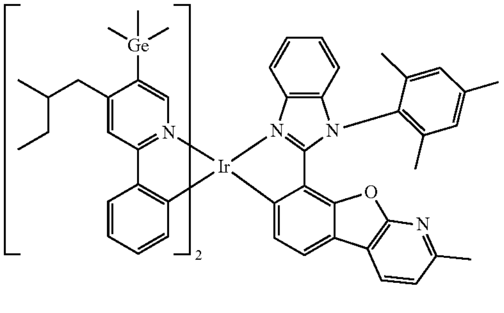
-continued
1780
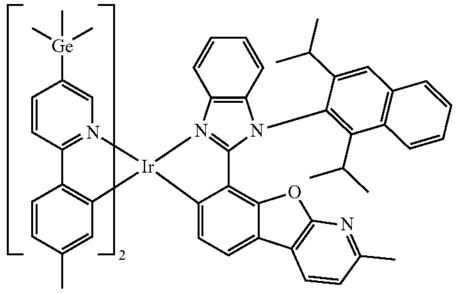
1781
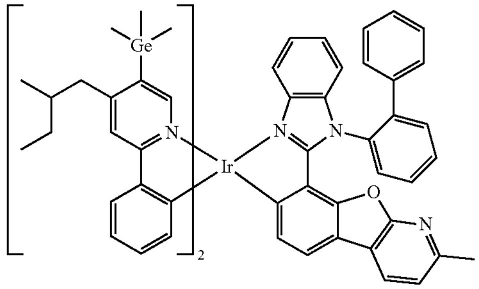
1782
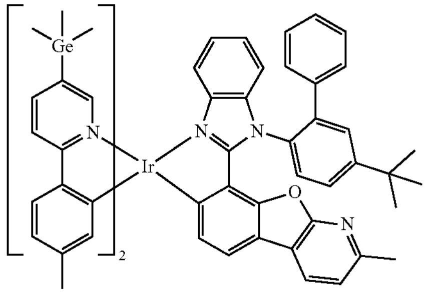
1783
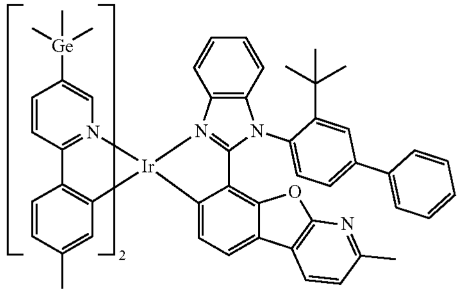
1784
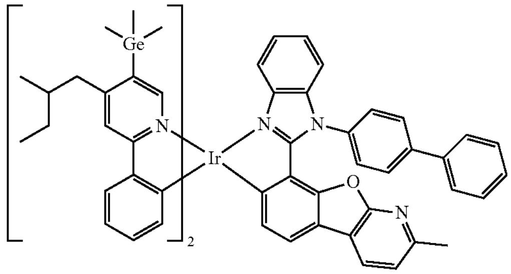

-continued
1785
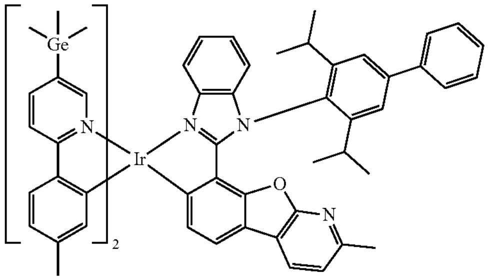
1786
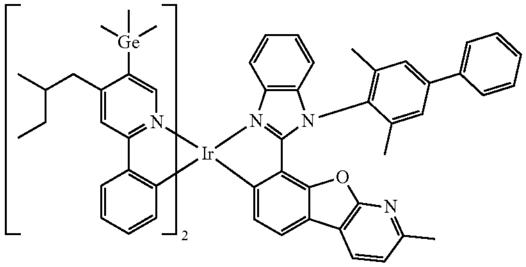
1787
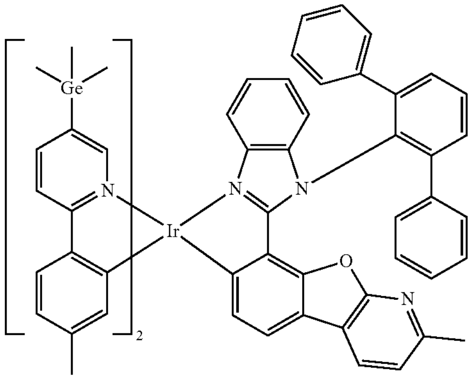
1788
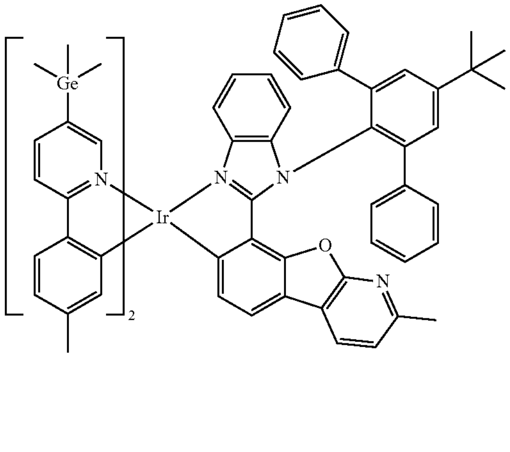
-continued
1789
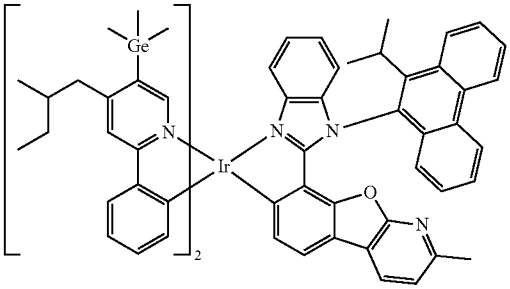
1790
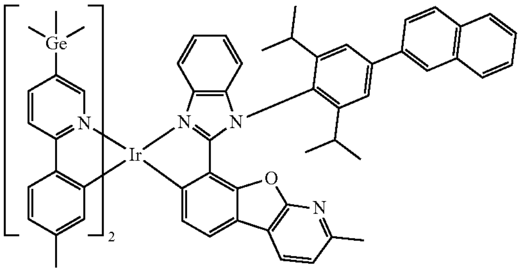
1791
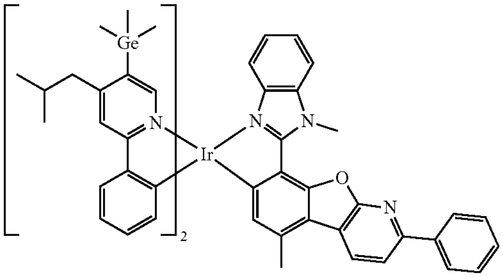
1792
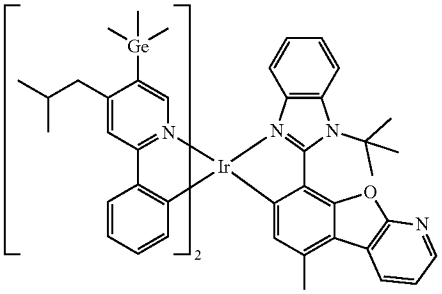
1793
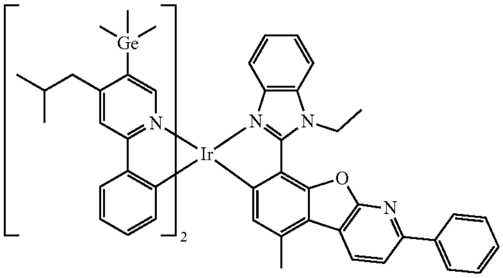

-continued
1794
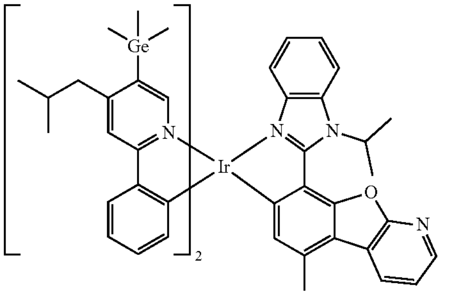
1795
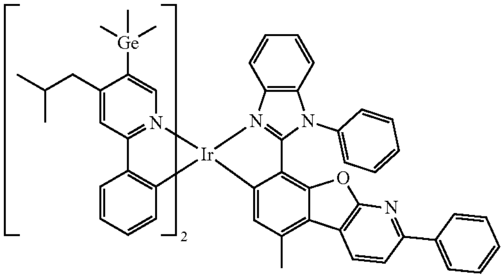
1796
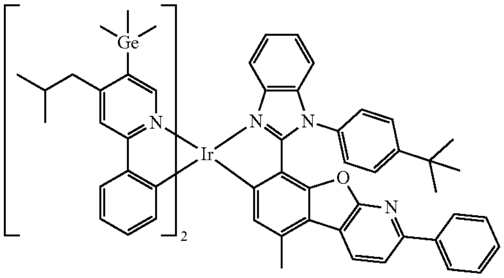
1797
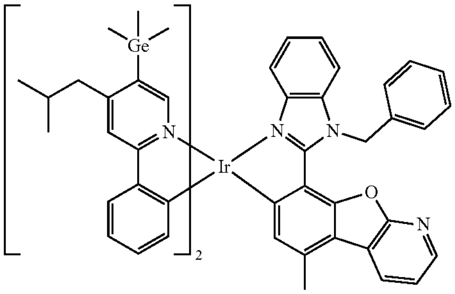
1798
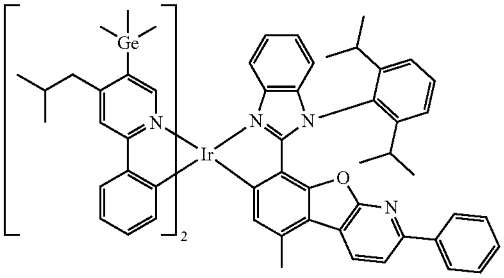
-continued
1799
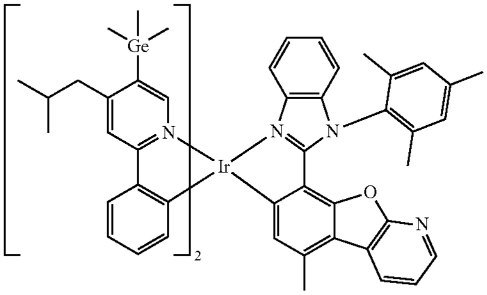
1800
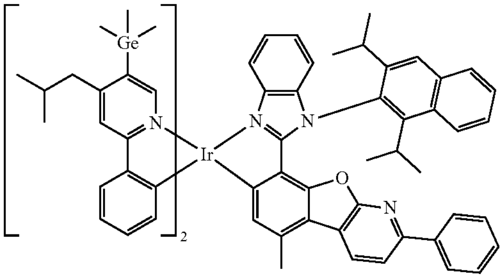
1801
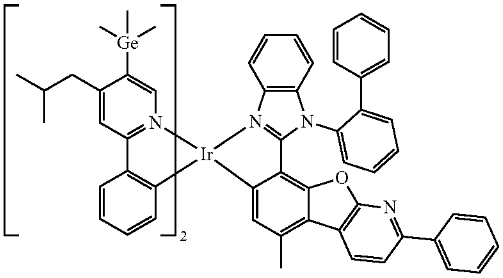
1802
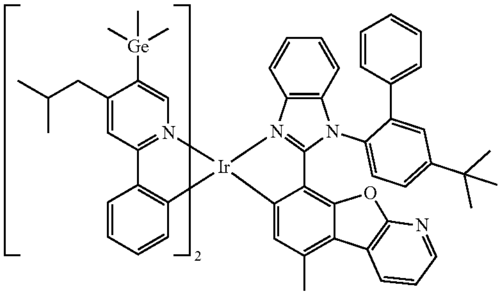
1803
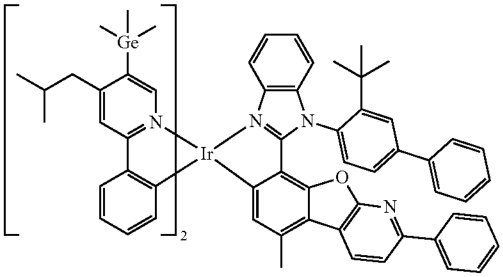

-continued
1804
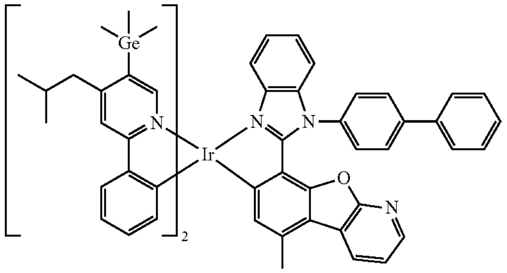
1805
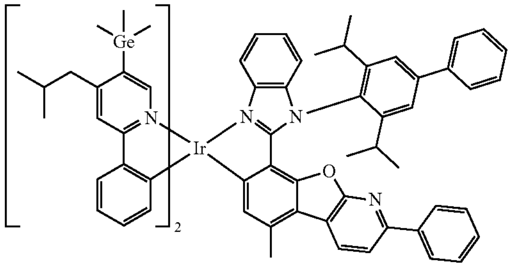
1806
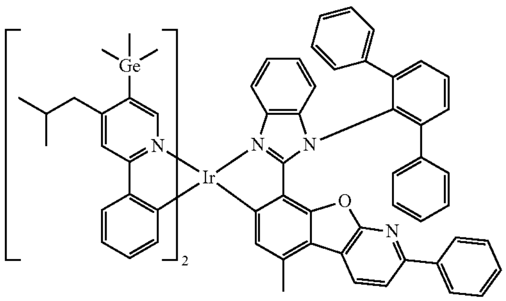
1807
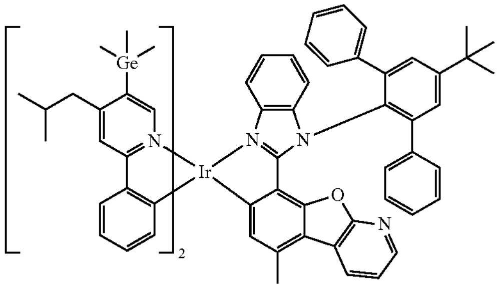
1808
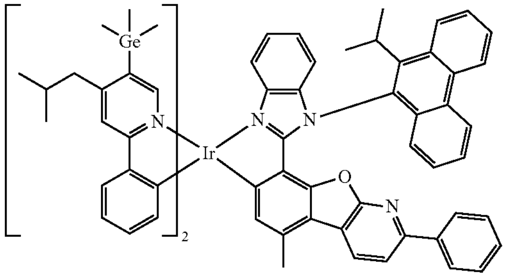
-continued
1809
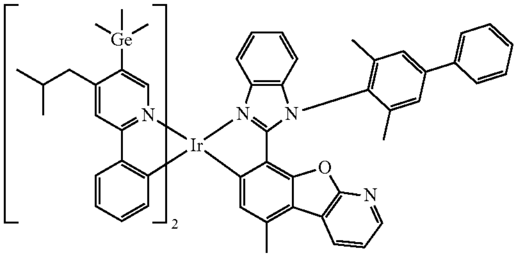
1810
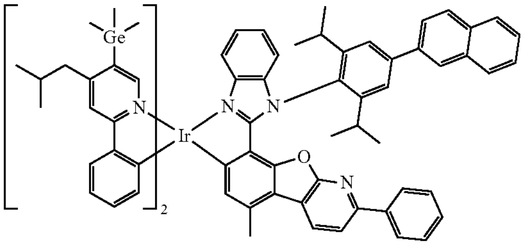
1811
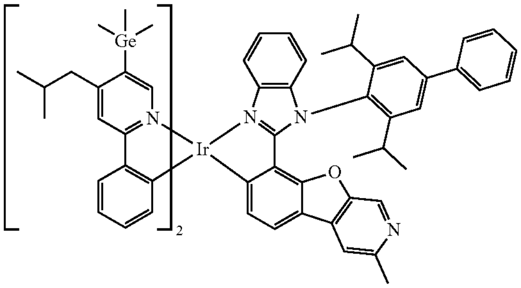
1812
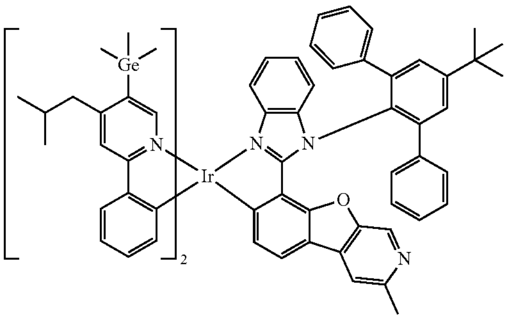
1813
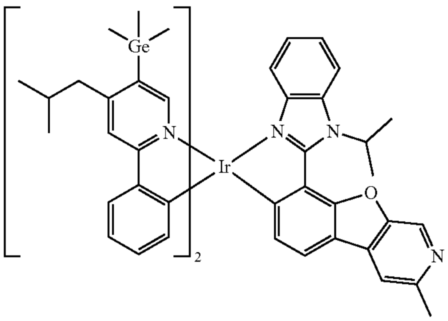

-continued
1814
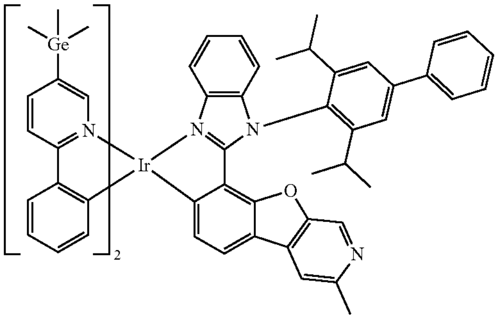
1815
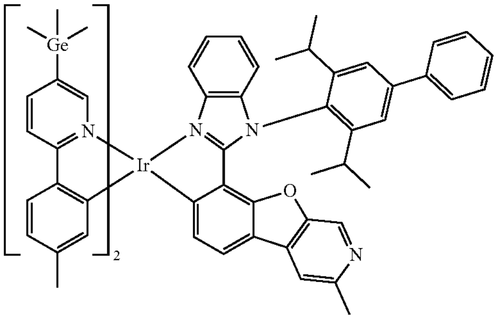
1816
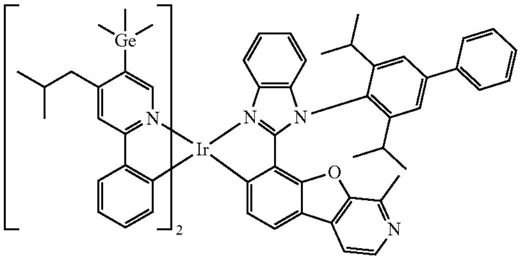
1817
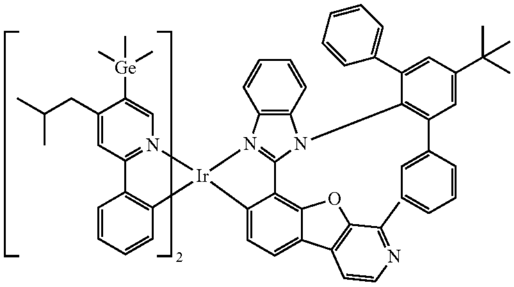
1818
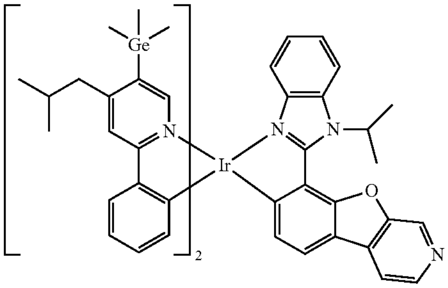
-continued
1819
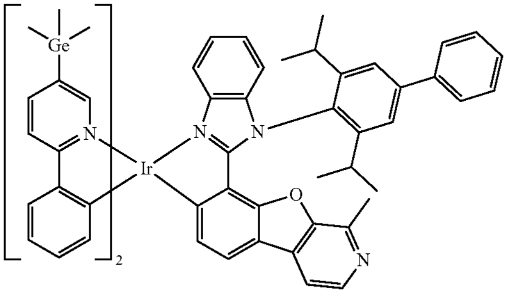
1820
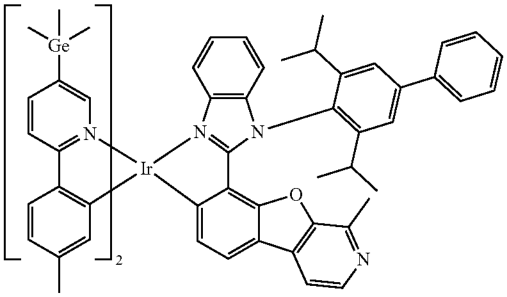
1821
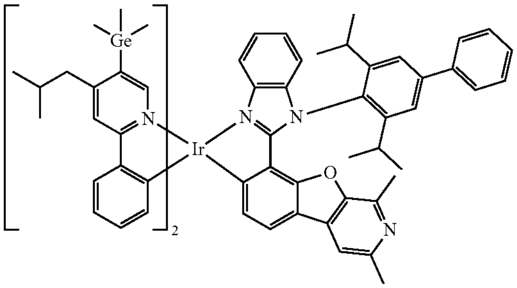
1822
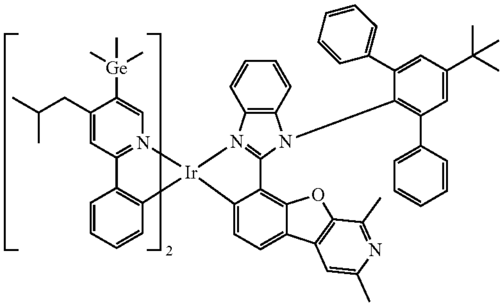
1823
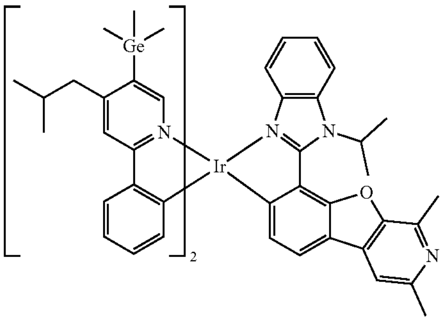

-continued
1824
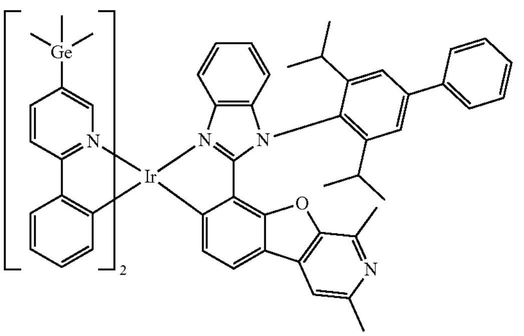
1825
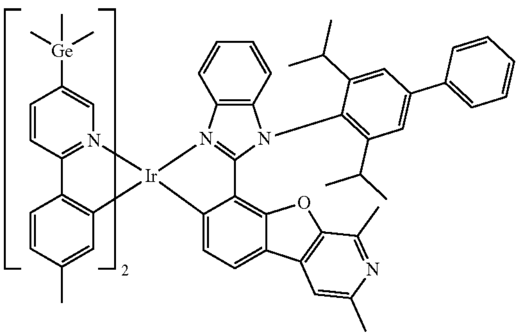
1826
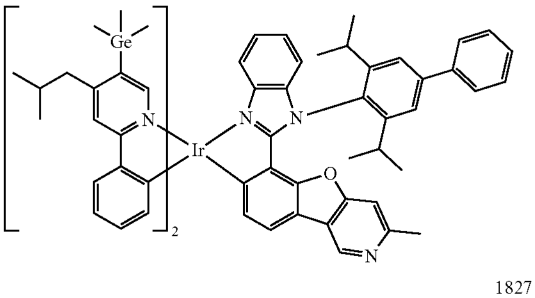
1827
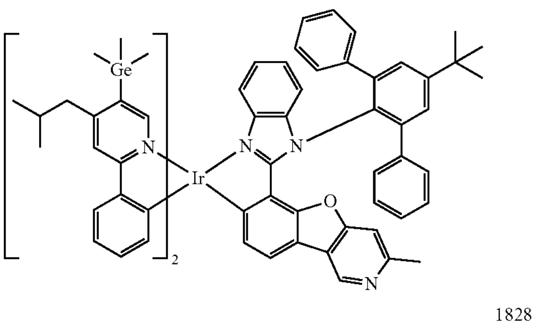
1828
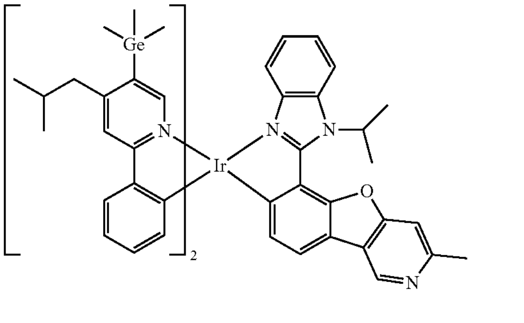
-continued
1829
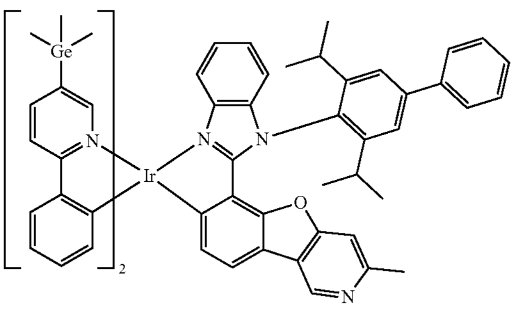
1830
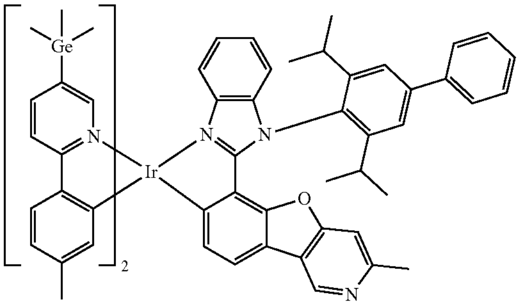
1831
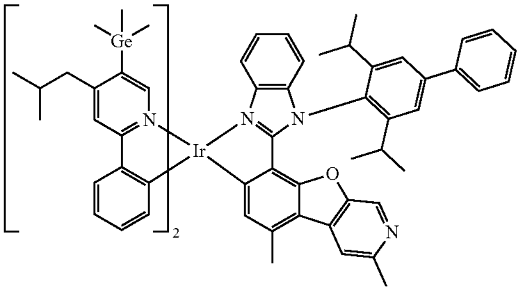
1832
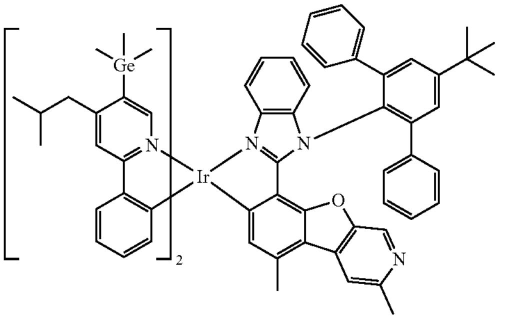
1833
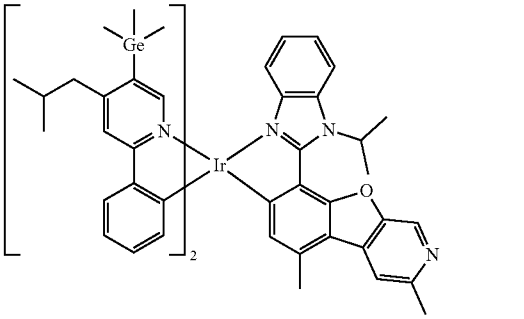

-continued
1834
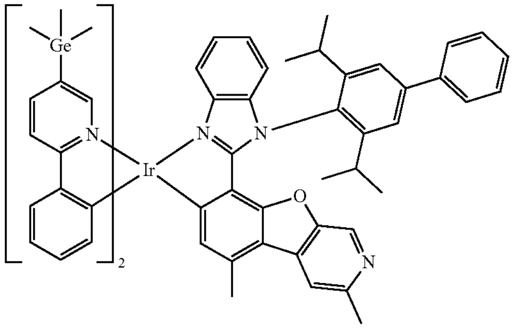
1835
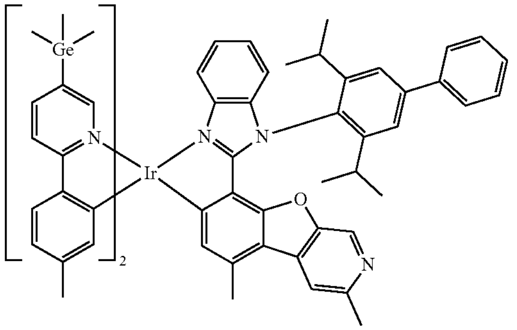
1836
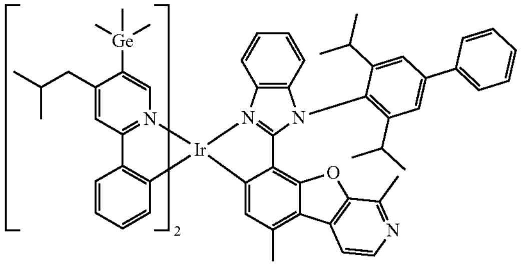
1837
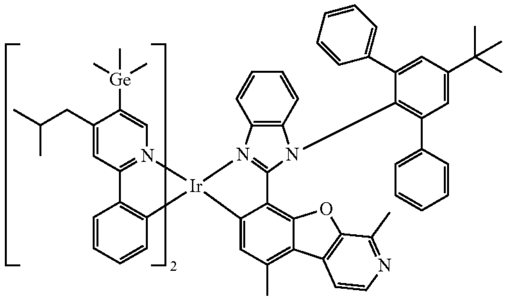
1838
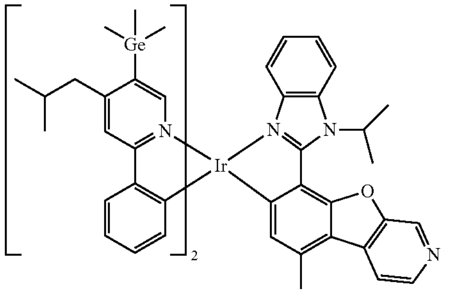
-continued
1839
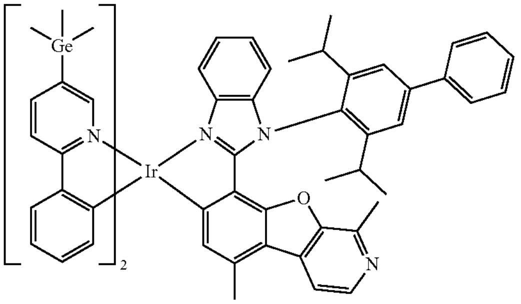
1840
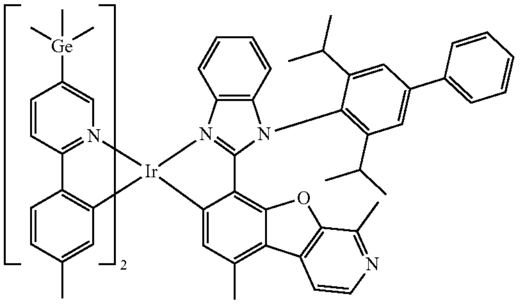
1841
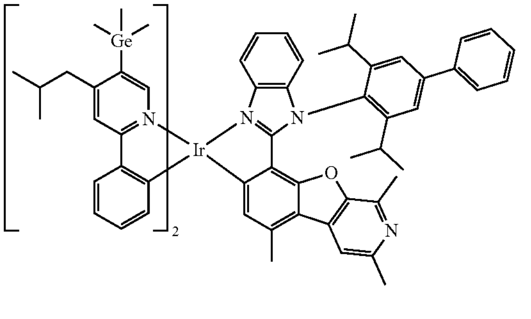
1842
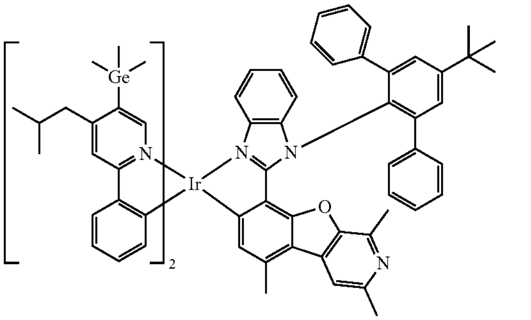

-continued
1843
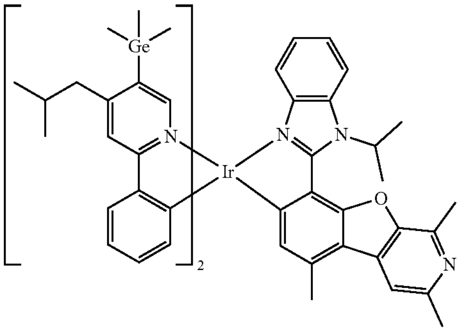
1844
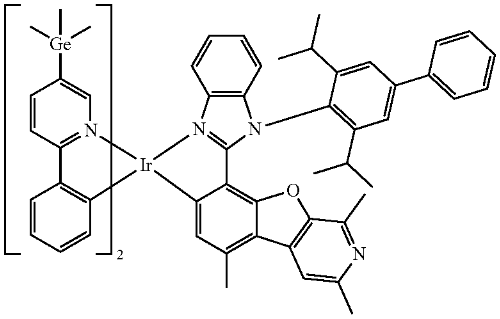
1845
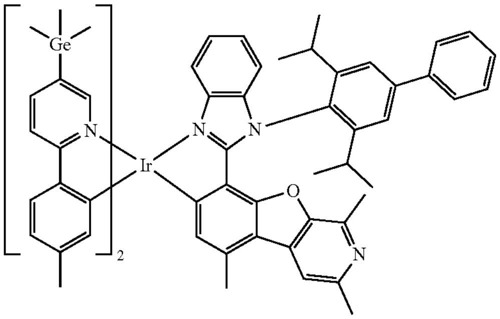
1846
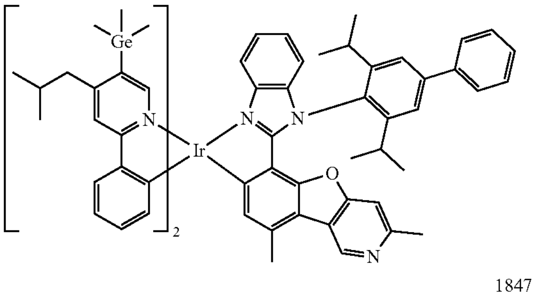
1847
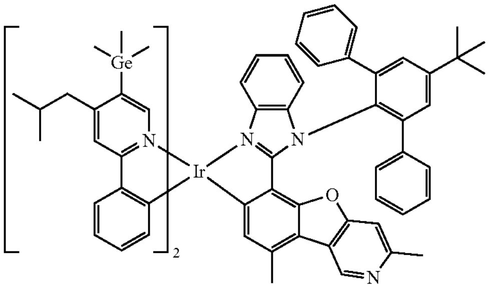
-continued
1848
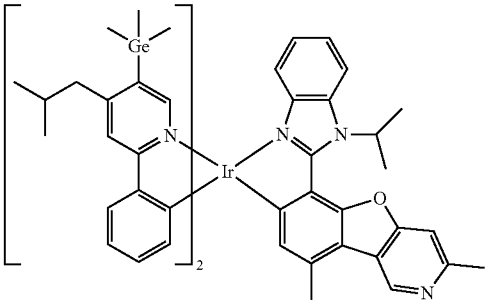
1849
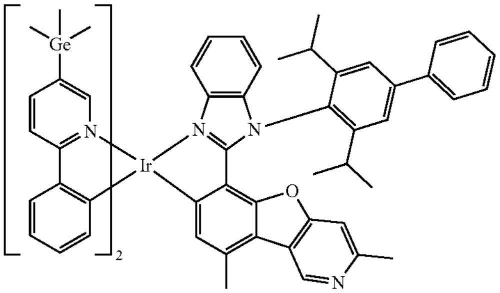
1850
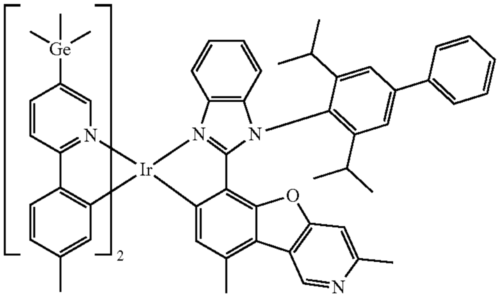
1851
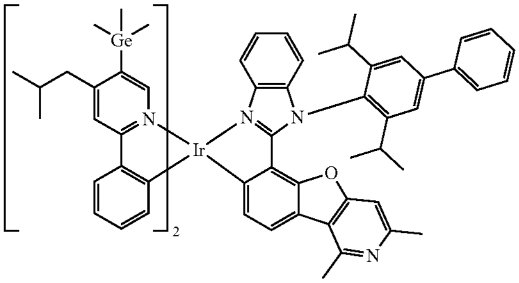
1852
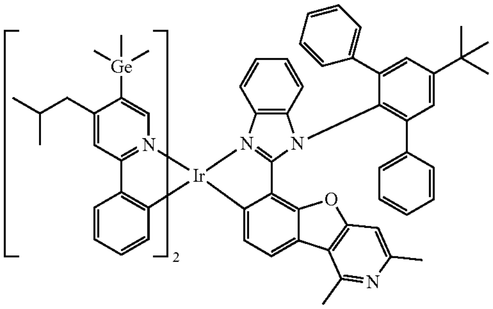

-continued
1853
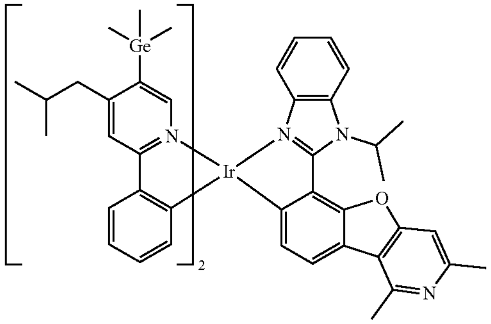
1854
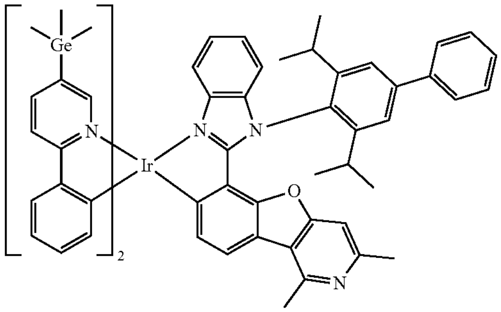
1855
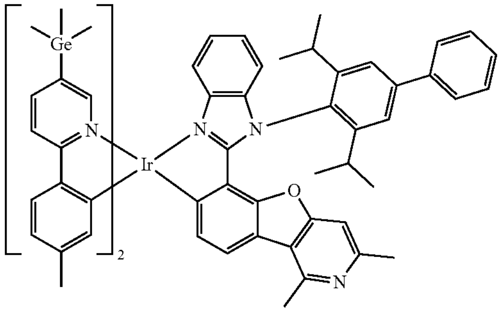
1856
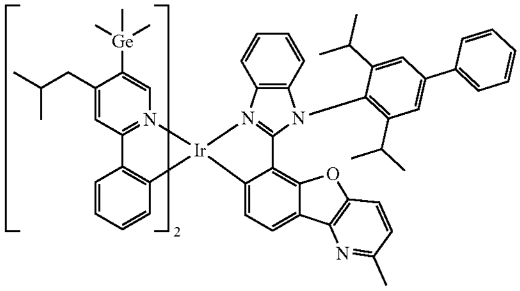
-continued
1857
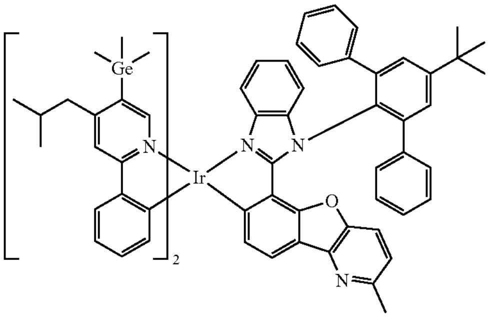
1858
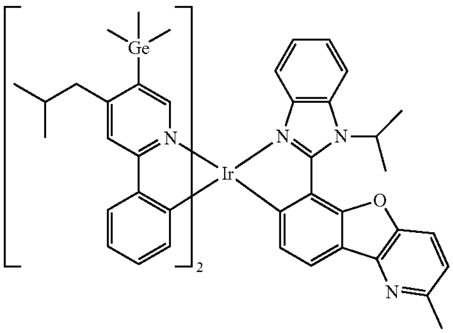
1859
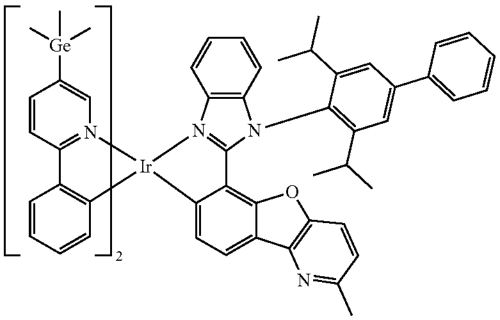
1860
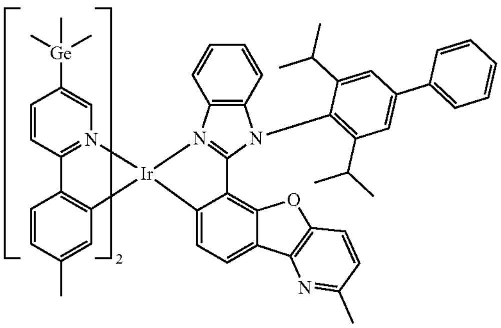

-continued
1861
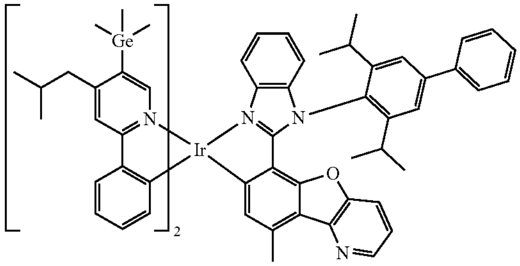
1862
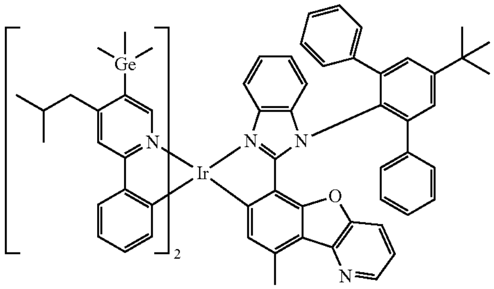
1863
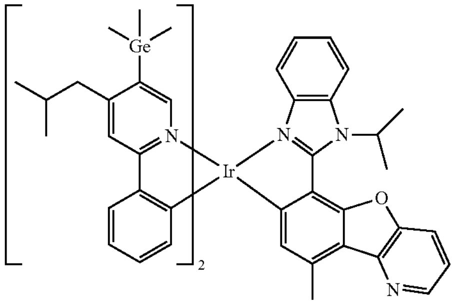
1864
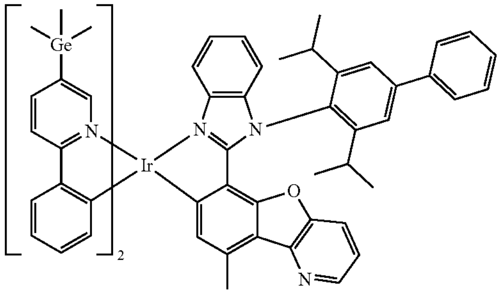
1865
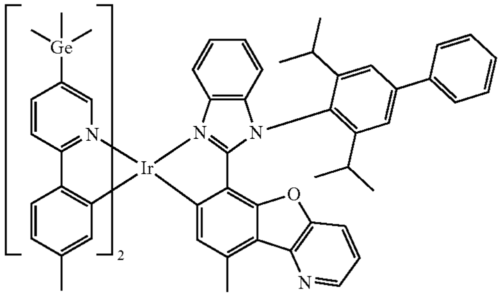
-continued
1866
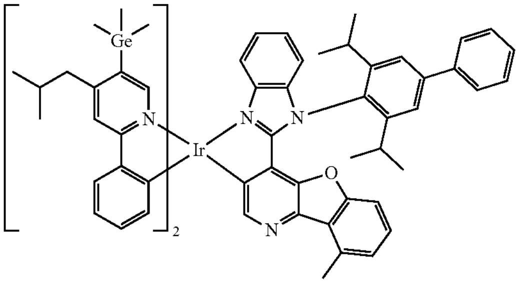
1867
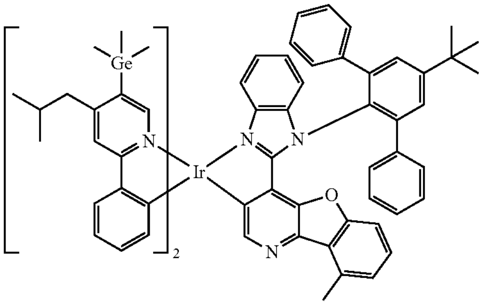
1868
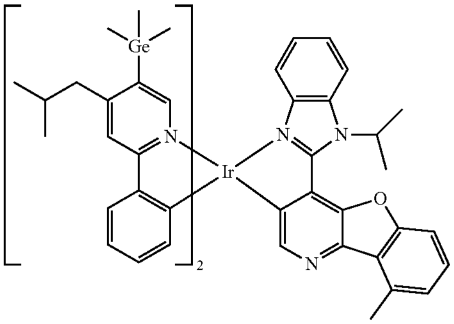
1869
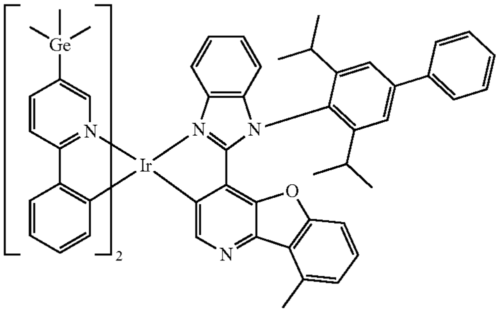
1870
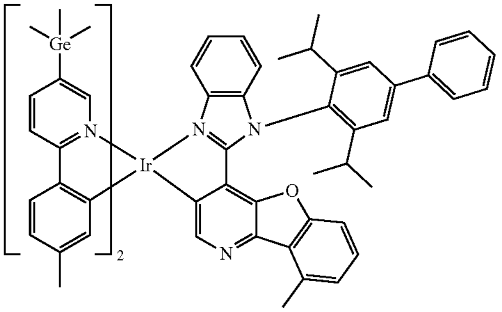

-continued
1871
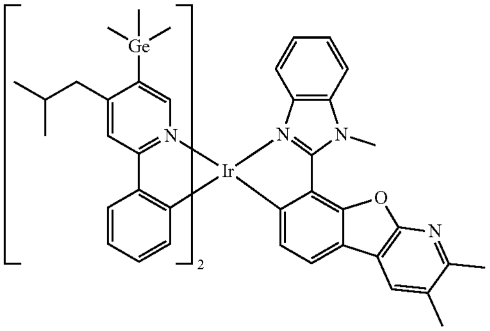
1872
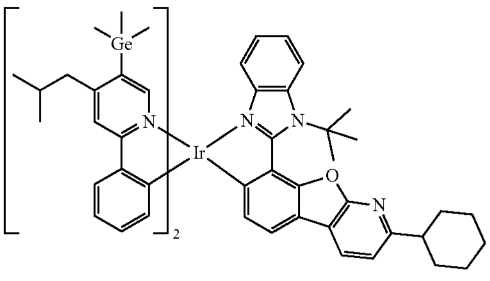
1873
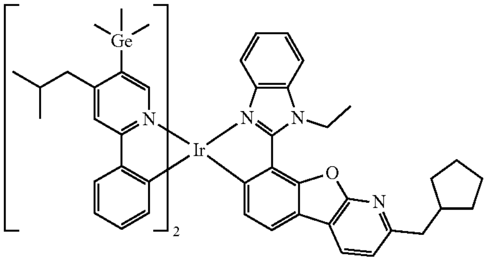
1874
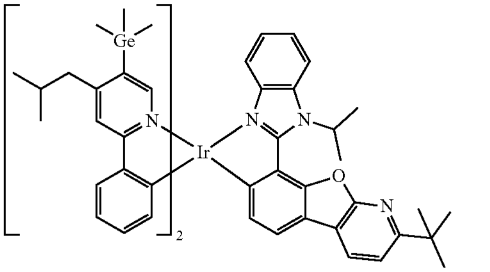
1875
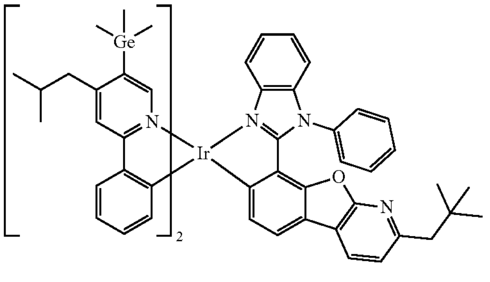
-continued
1876
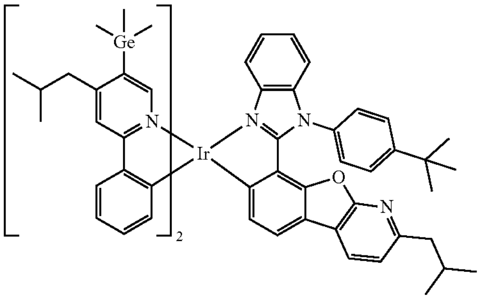
1877
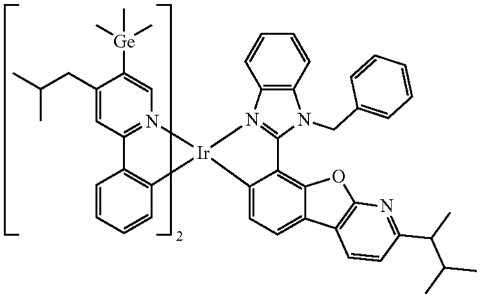
1878
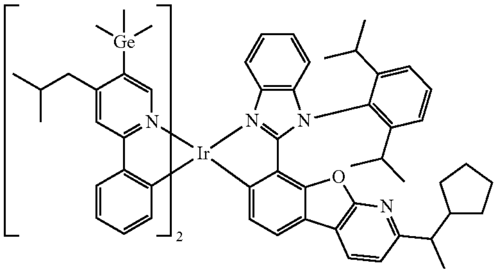
1879
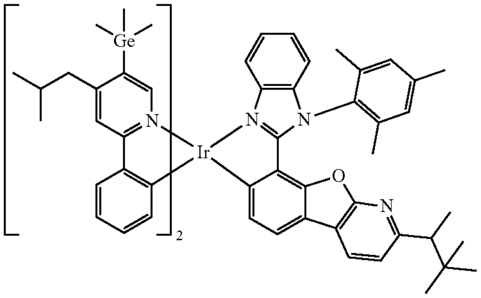
1880
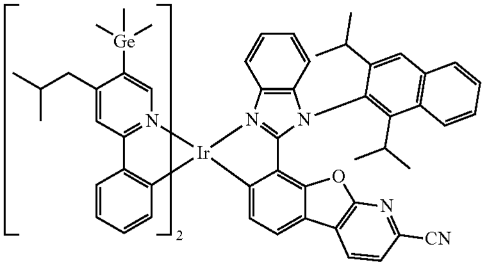

-continued
1881
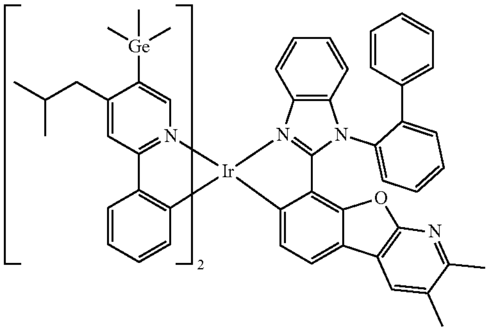
1882
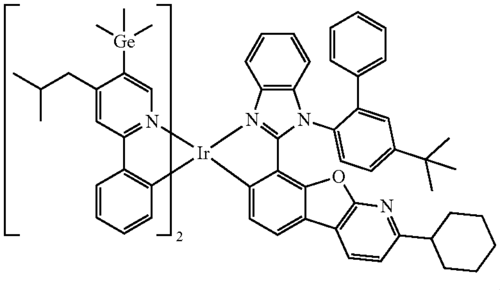
1883
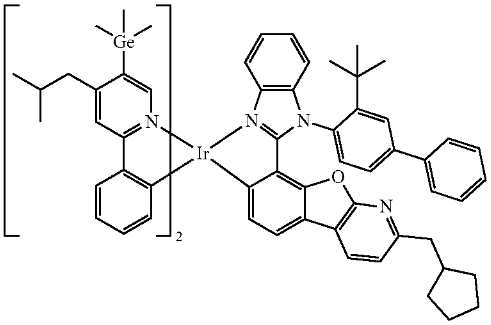
1884
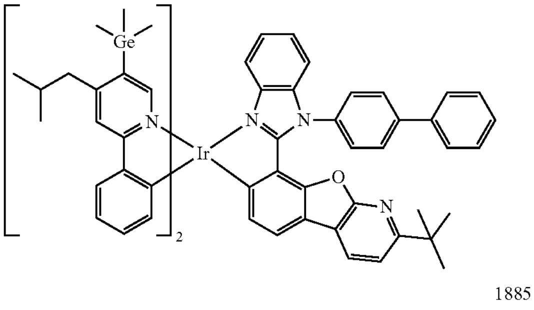
1885
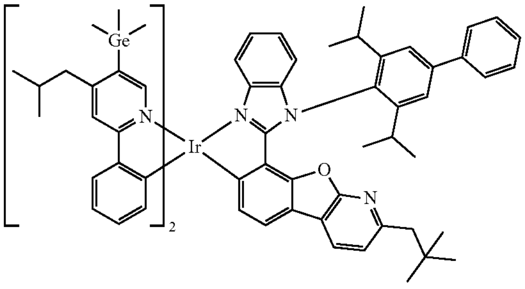
-continued
1886
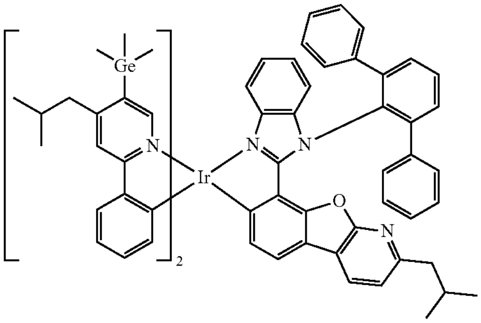
1887
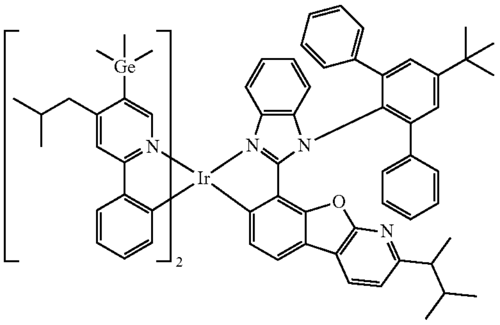
1888
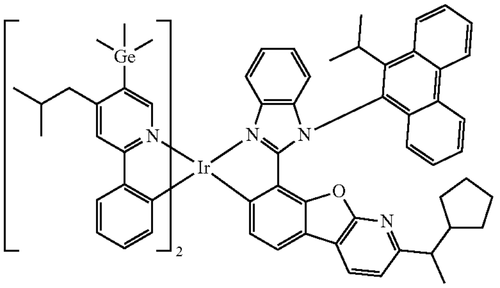
1889
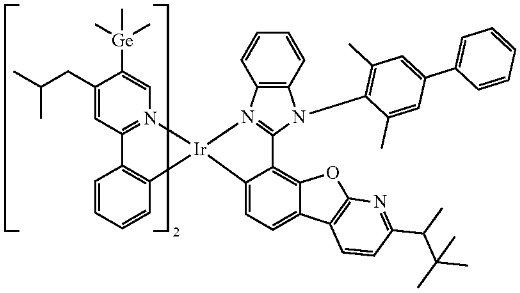
1890
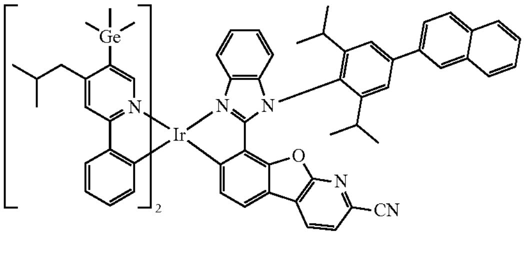

1891
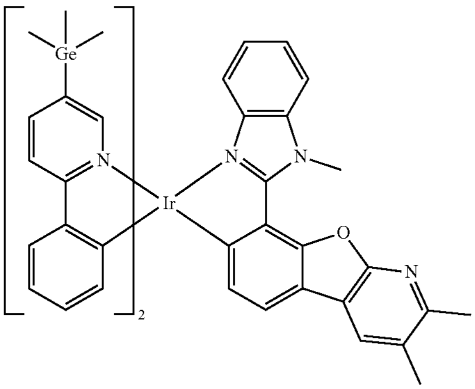
1892
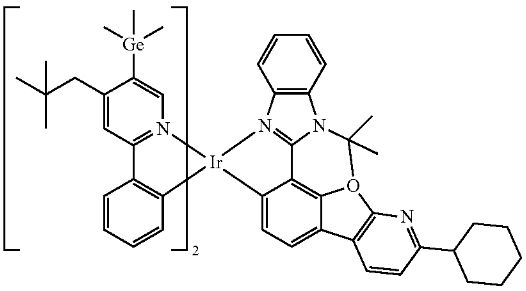
1893
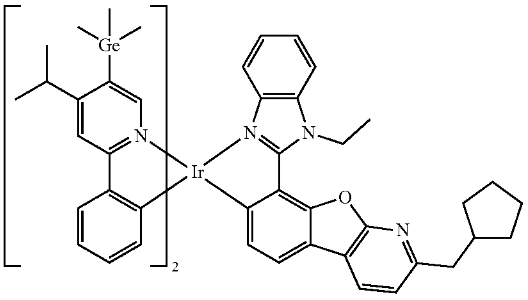
1894
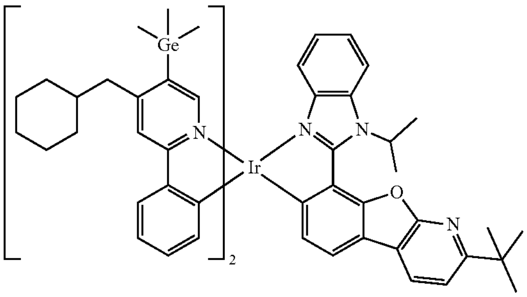
1895
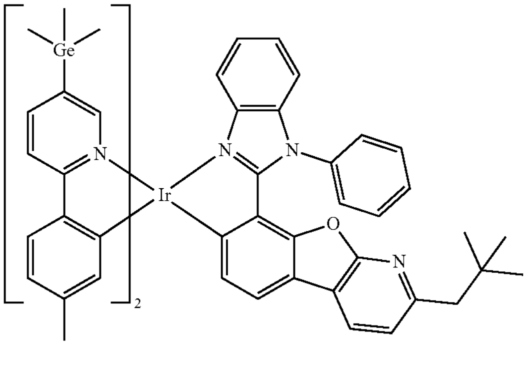
1896
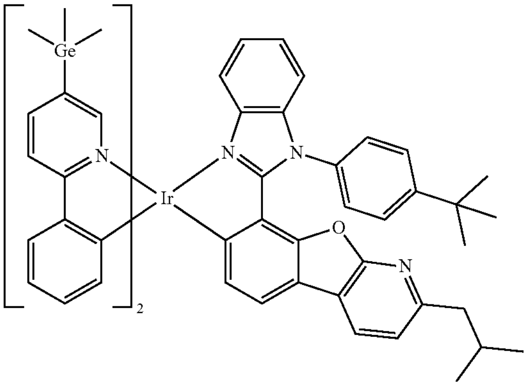
1897
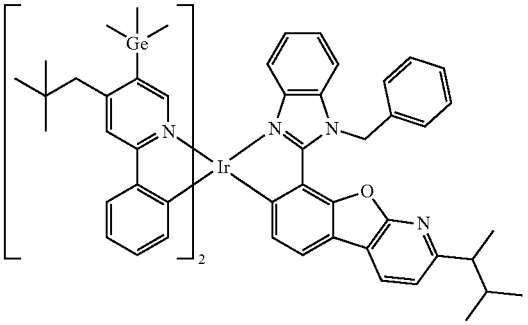
1898
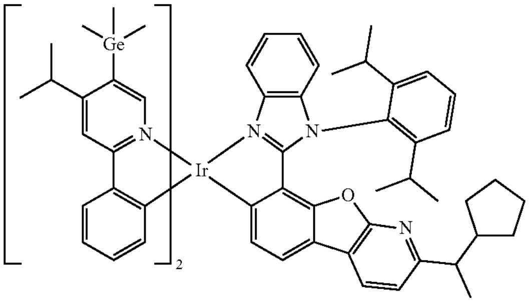

-continued
1899
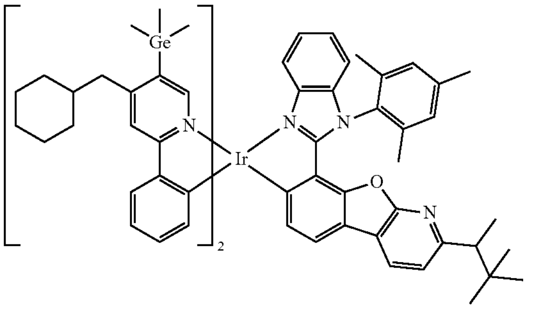
1900
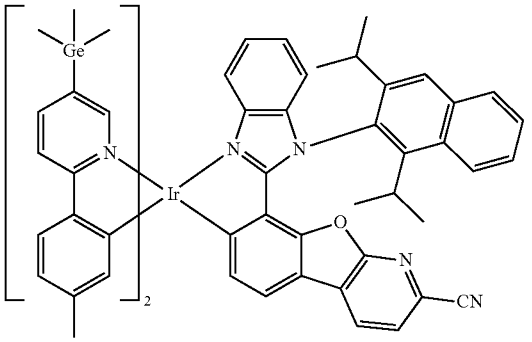
1901
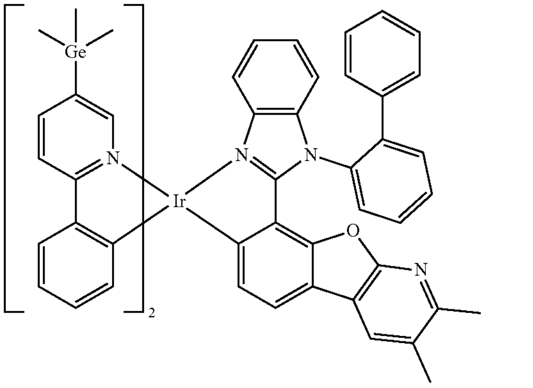
1902
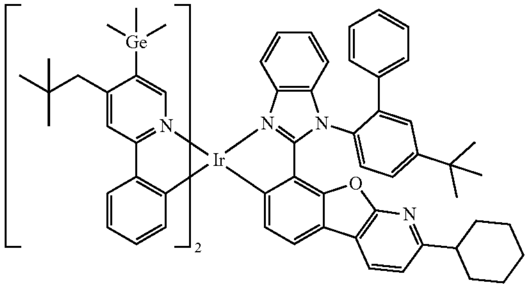
1903
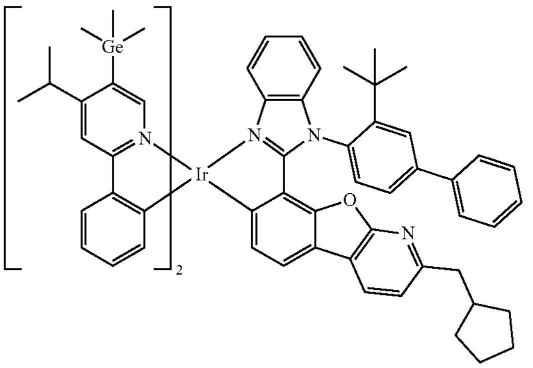
1904
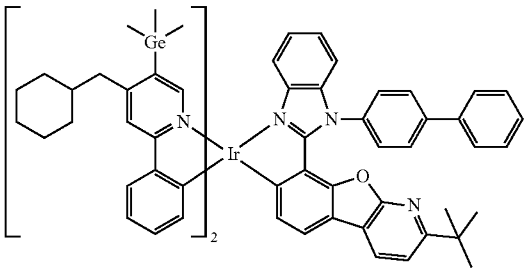
1905
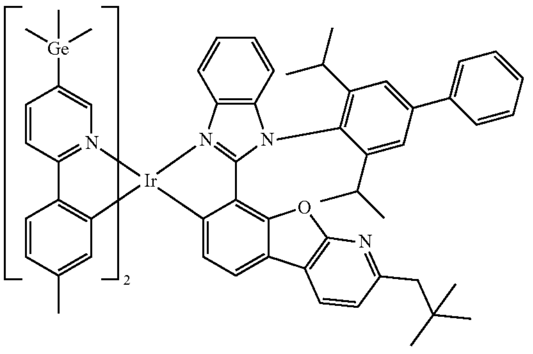
1906
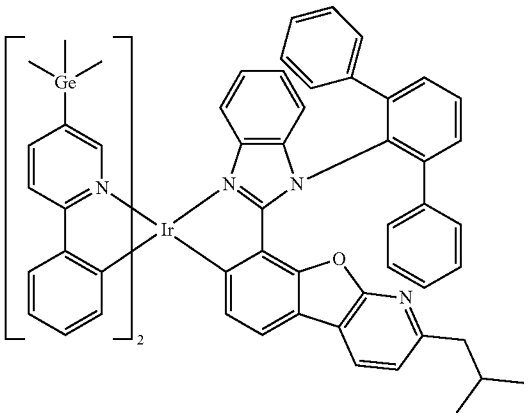

-continued
1907
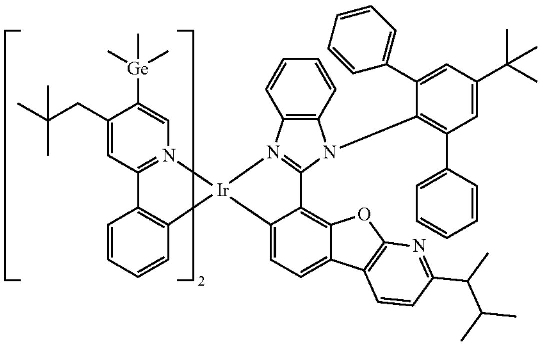
1908
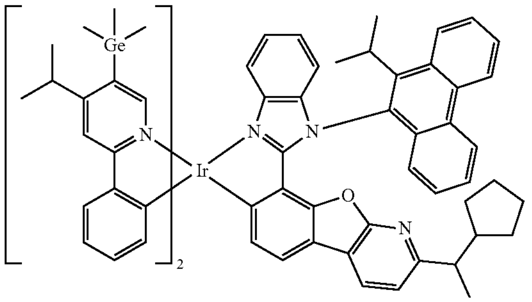
1909
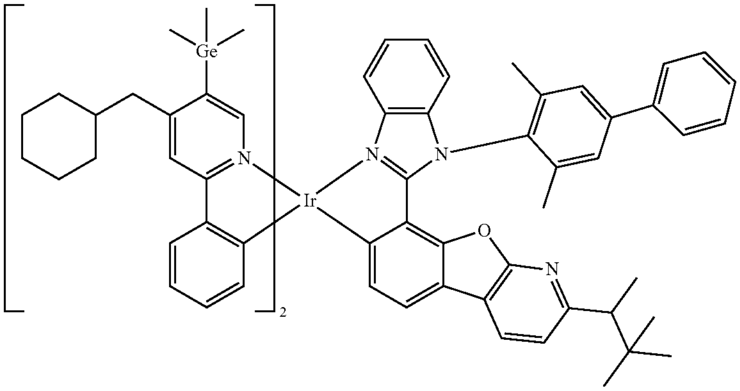
1910
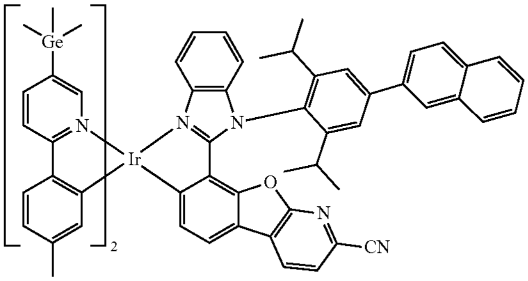
1911
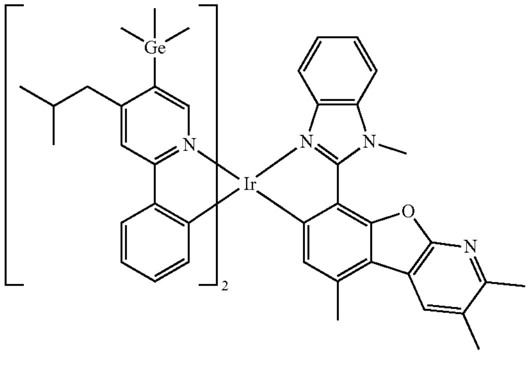
1912
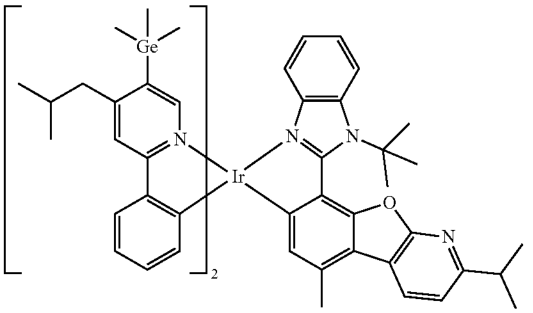
1913
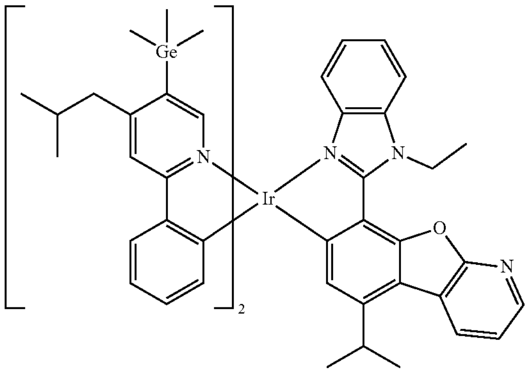

-continued
1914
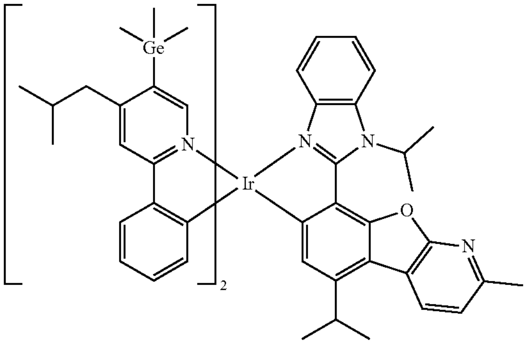
1915
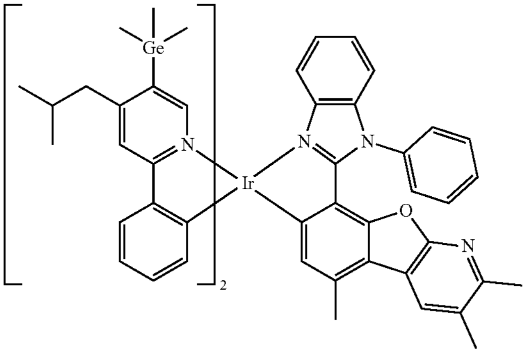
1916
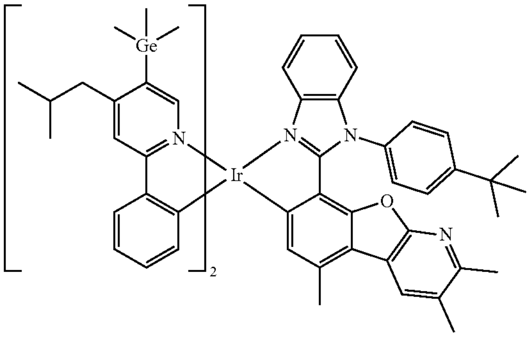
1917
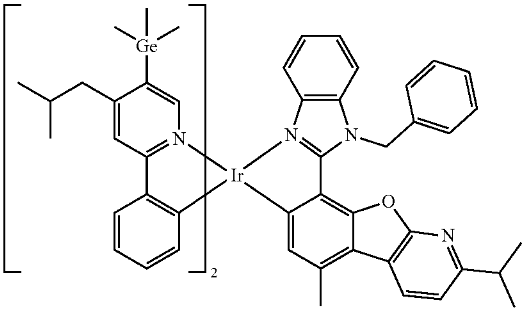
1918
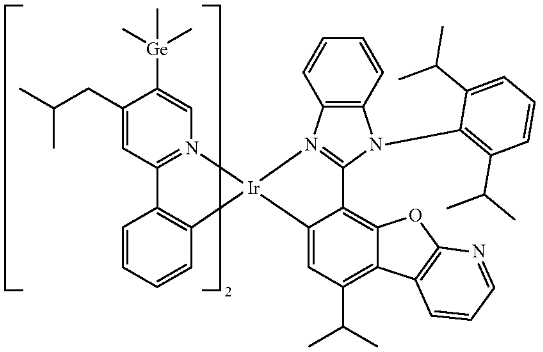
1919
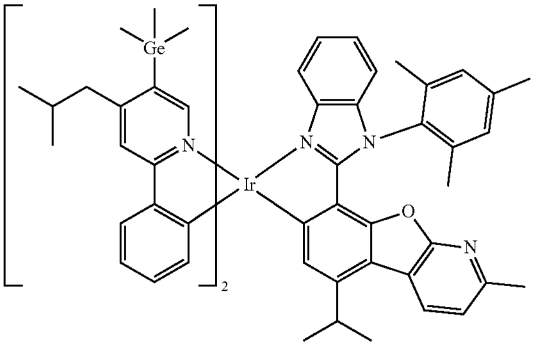
1920
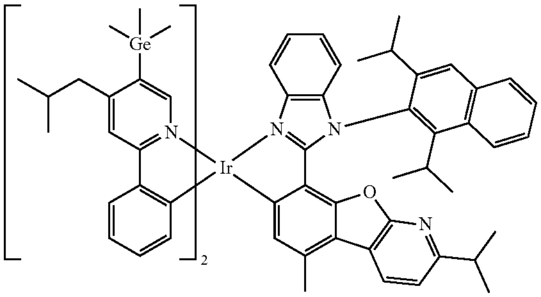
1921
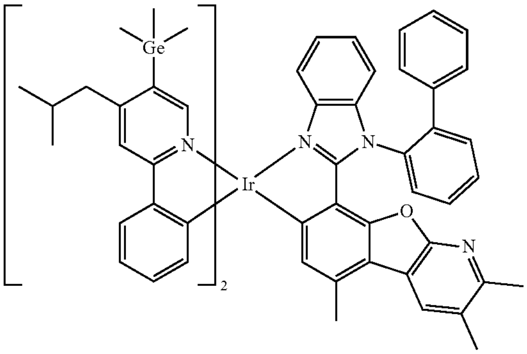

-continued
1922
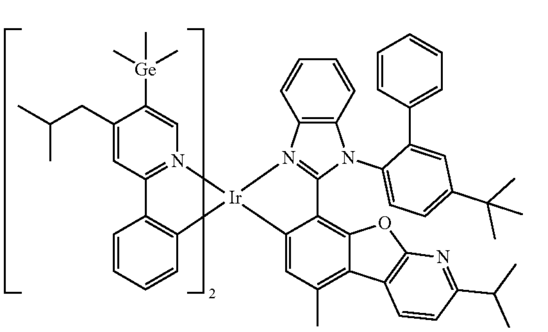
1923
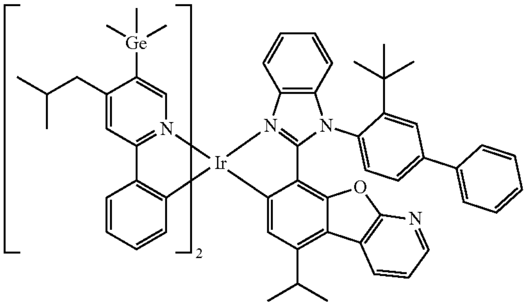
1924
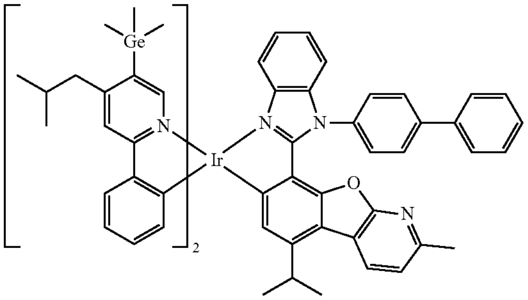
1925
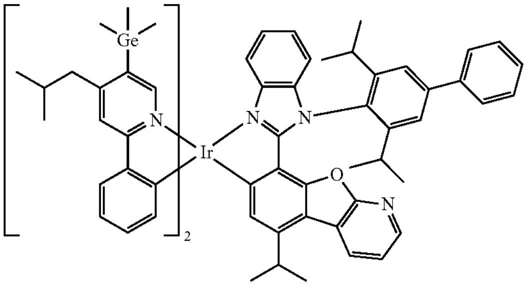
1926
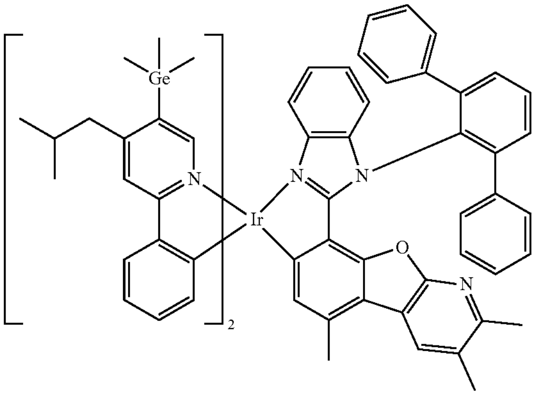
1927
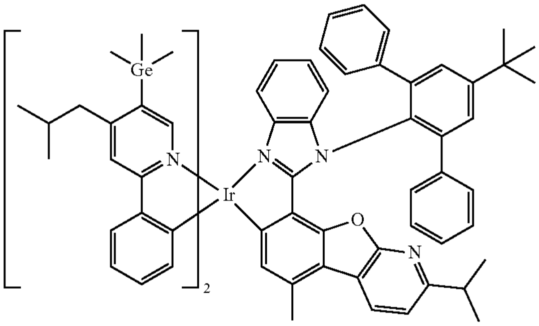
1928
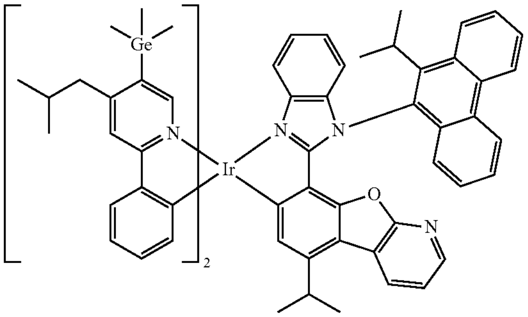
1929
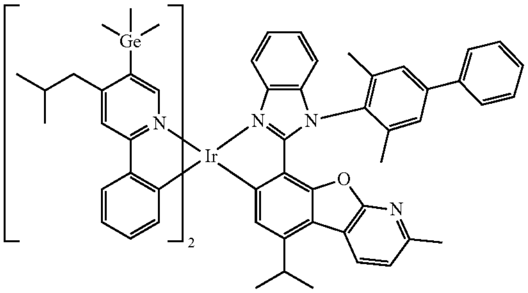

-continued
1930
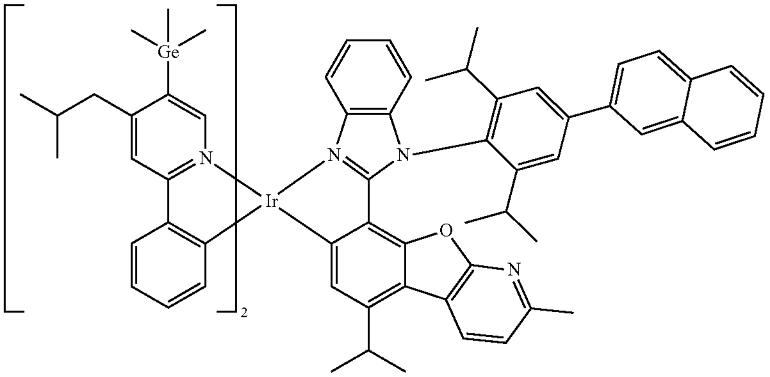
1931
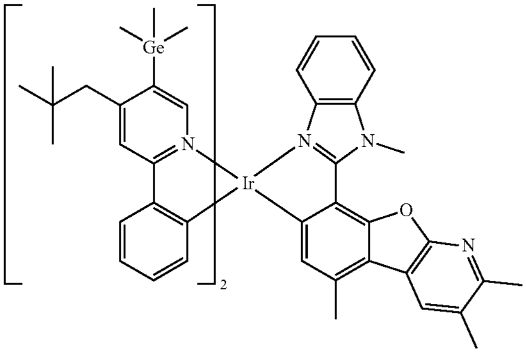
1932
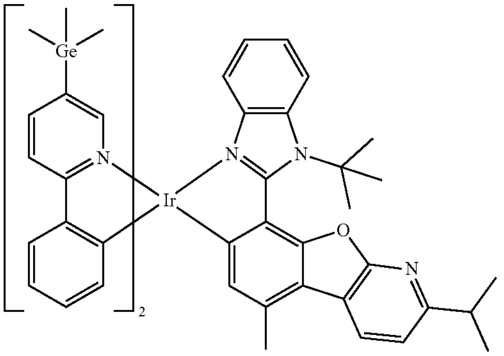
1933
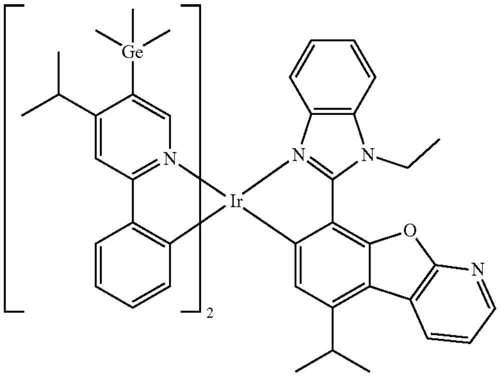
1934
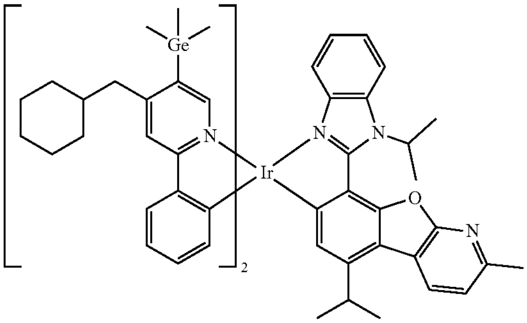
1935
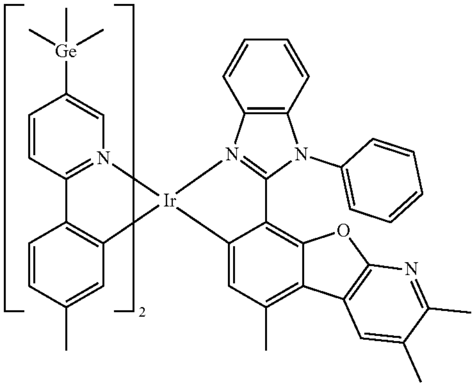
1936
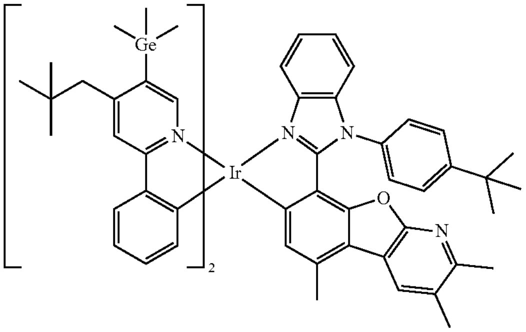

-continued
1937
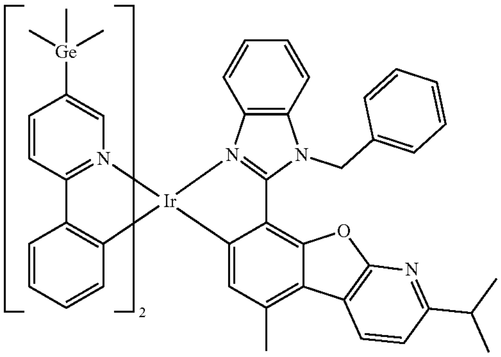
1938
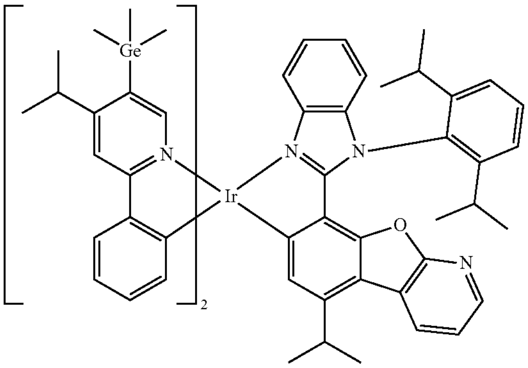
1939
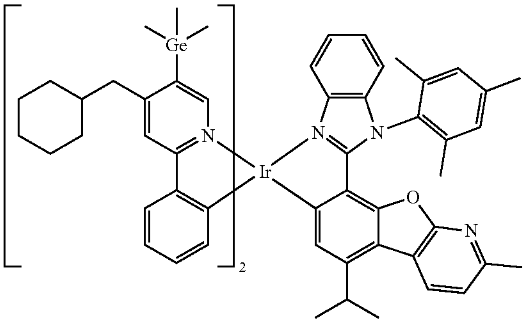
1940
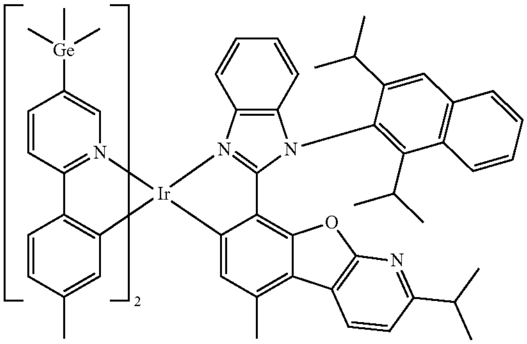
1941
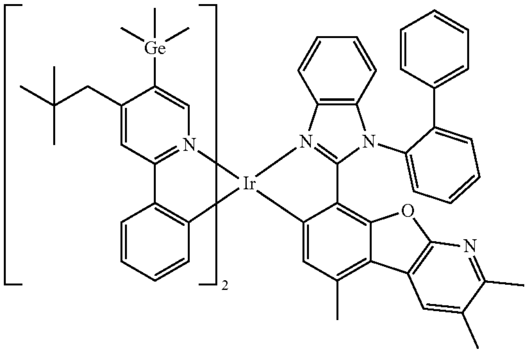
1942
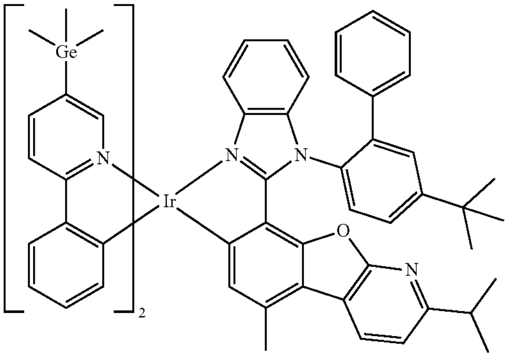
1943
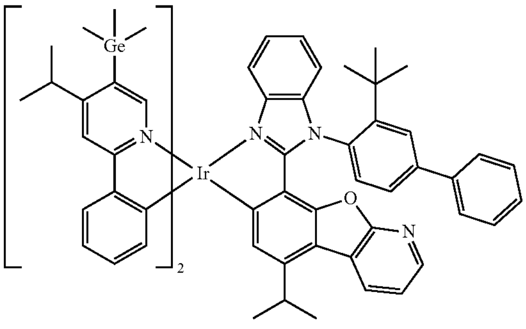
1944
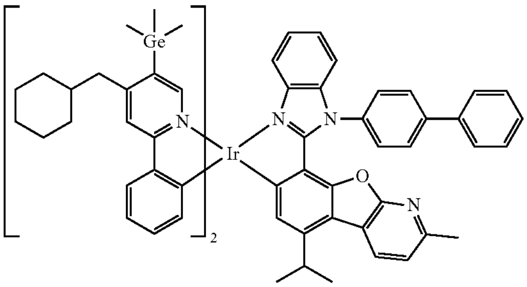

-continued
1945
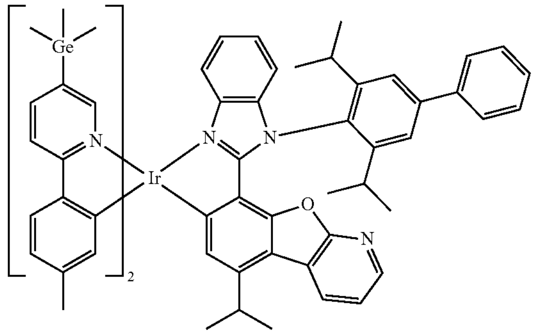
1946
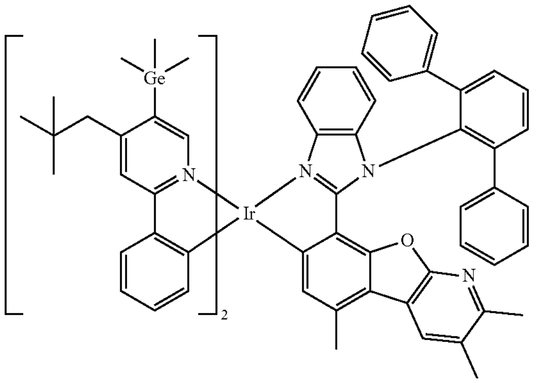
1947
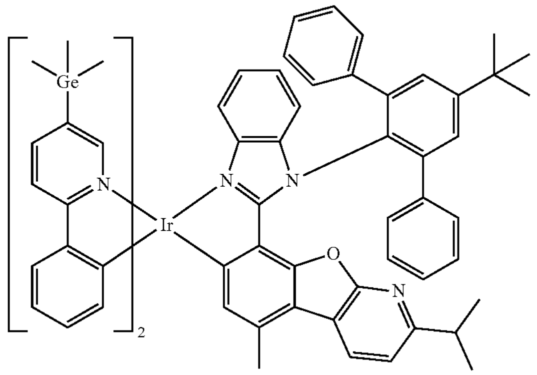
1948
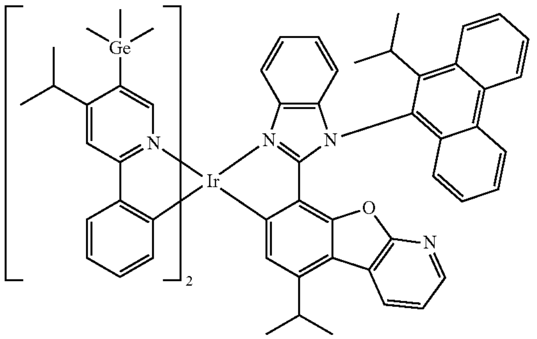
1949
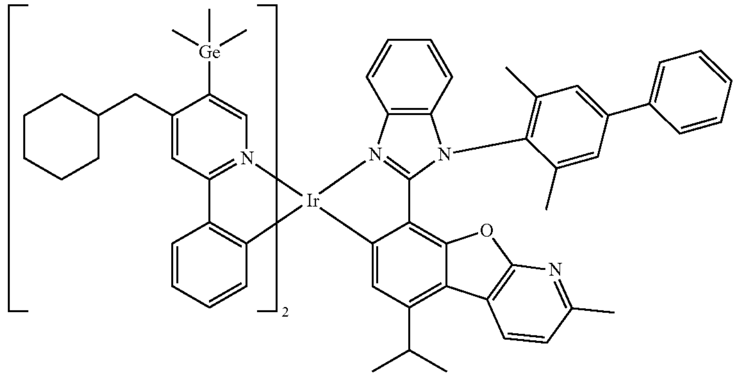
1950
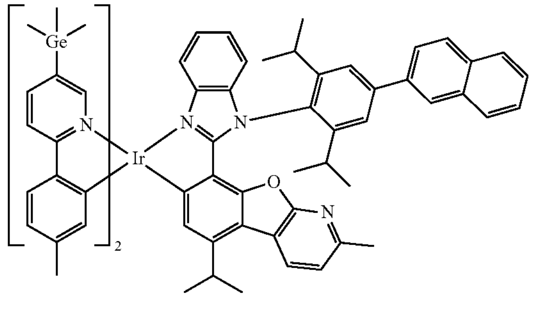
1951
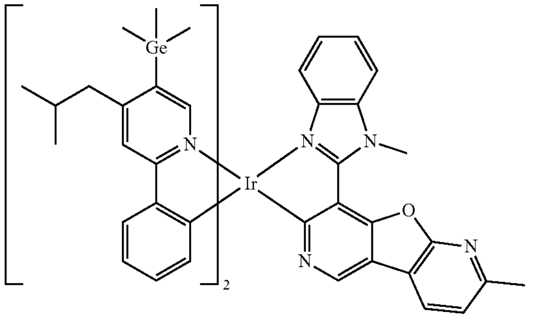

-continued
1952
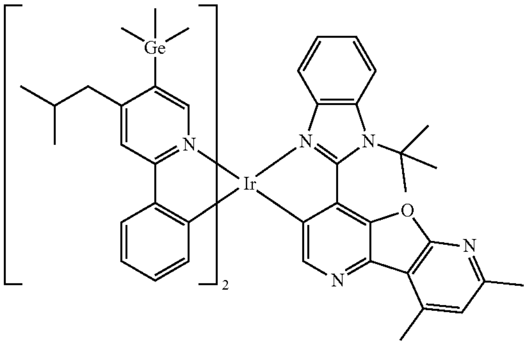
1953
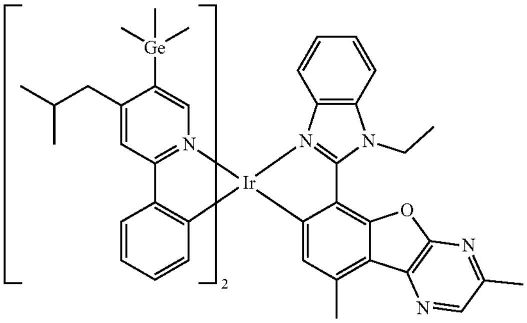
1954
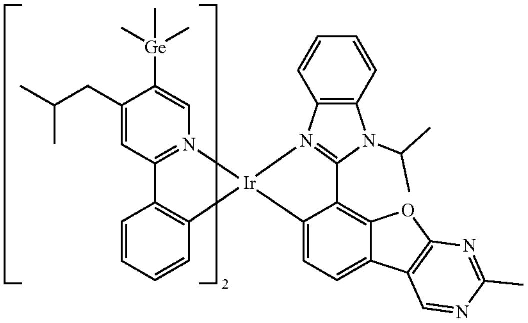
1955
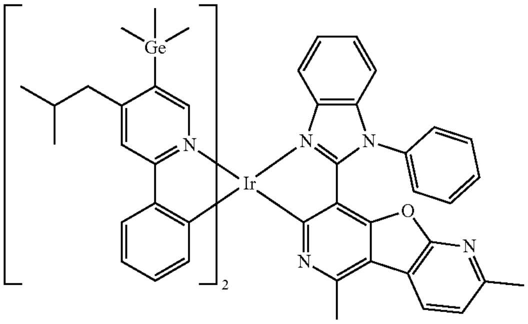
1956
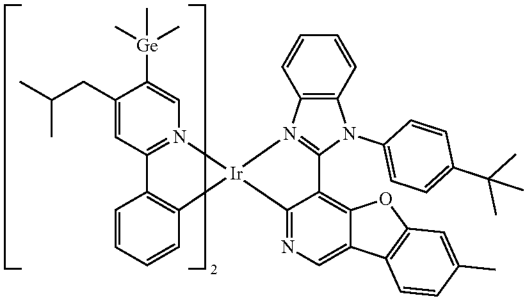
1957
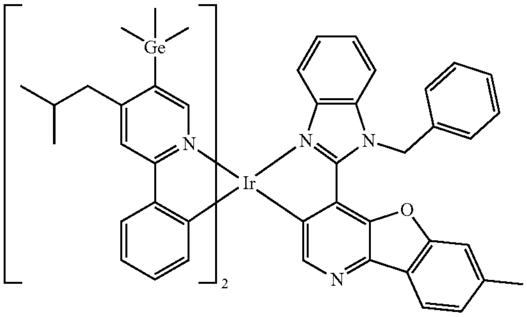
1958
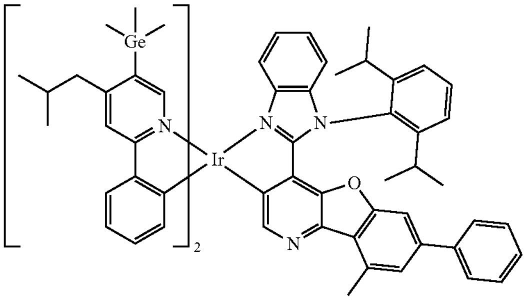
1959
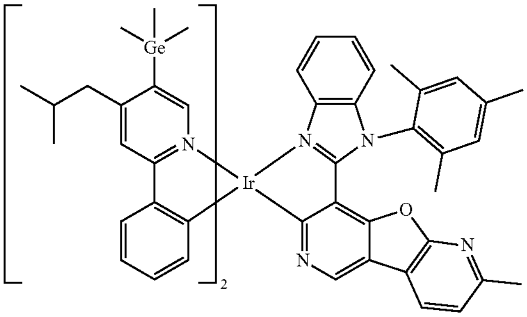
1960
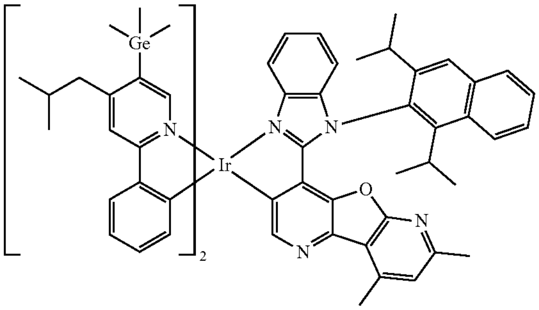
1961
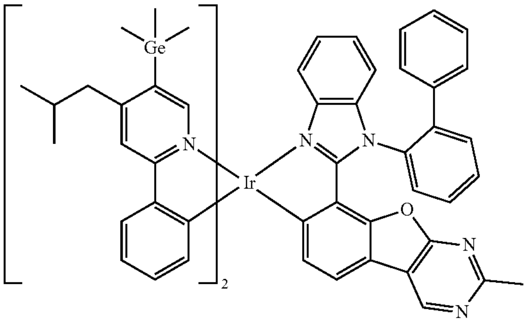

-continued
1962
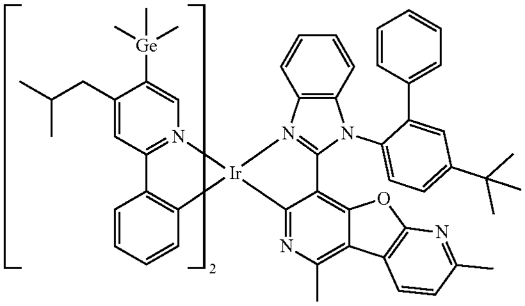
1963
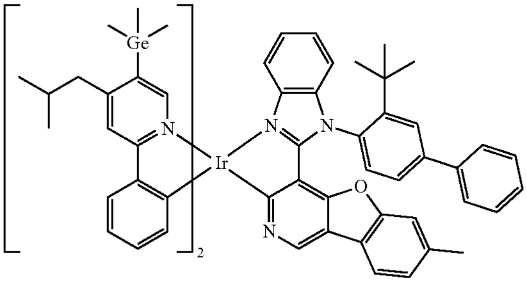
1964
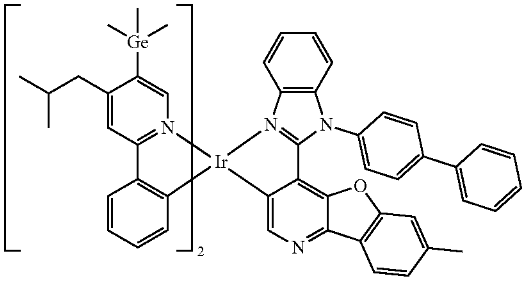
1965
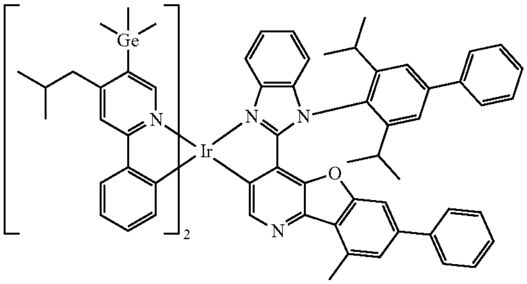
1966
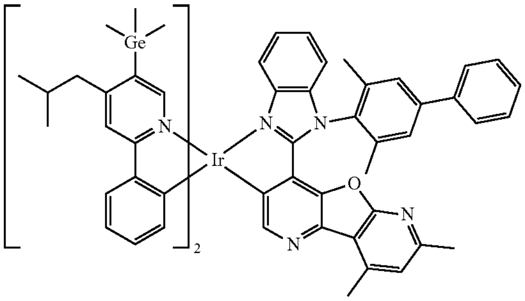
1967
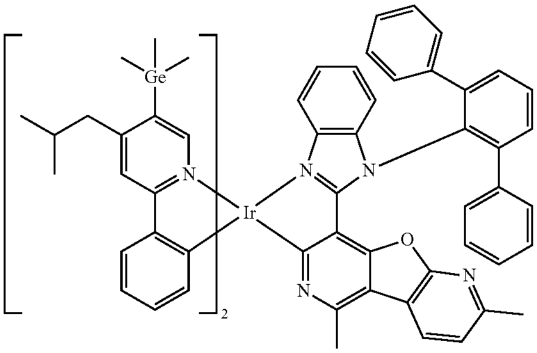
1968
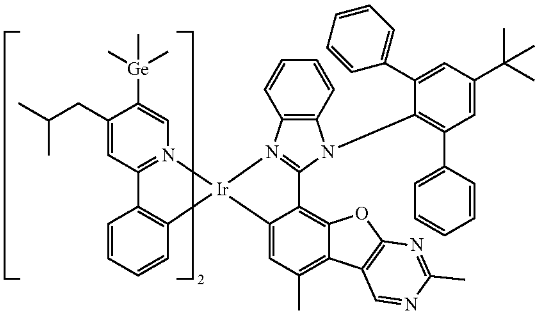
1969
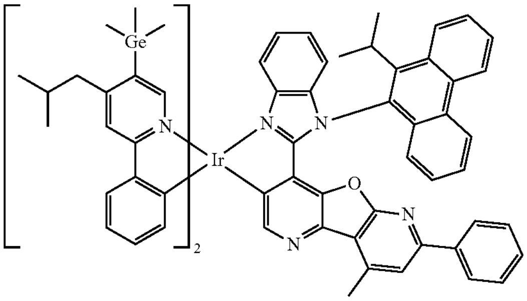
1970
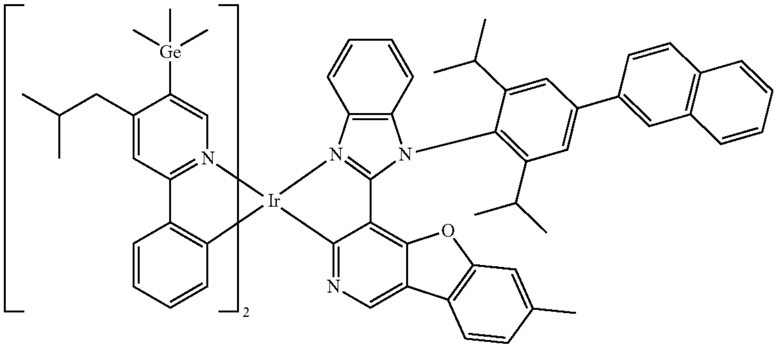

-continued
1971
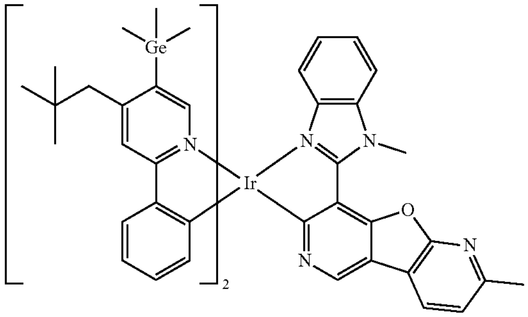
1972
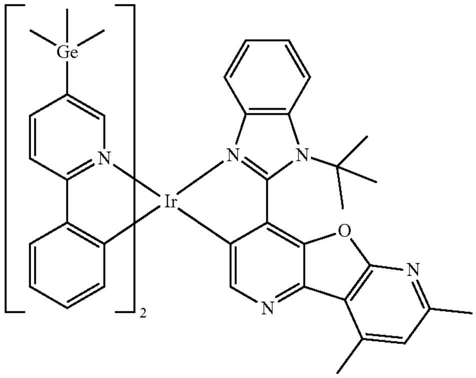
1973
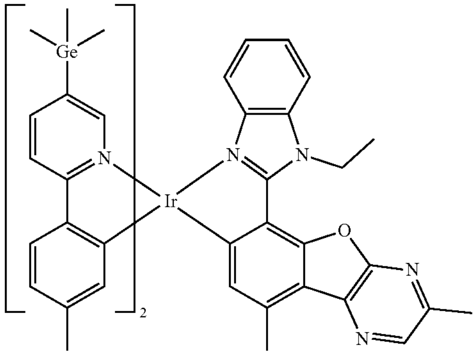
1974
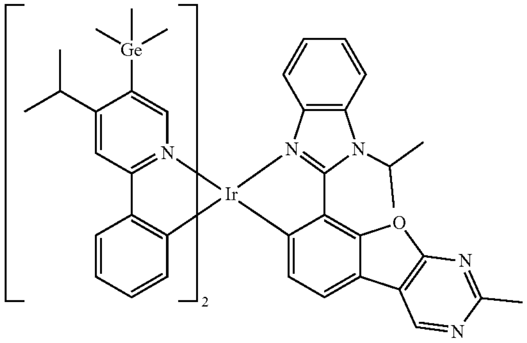
1975
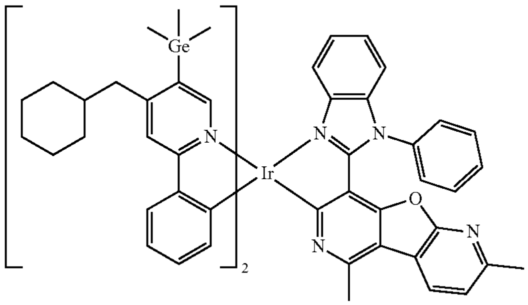
1976
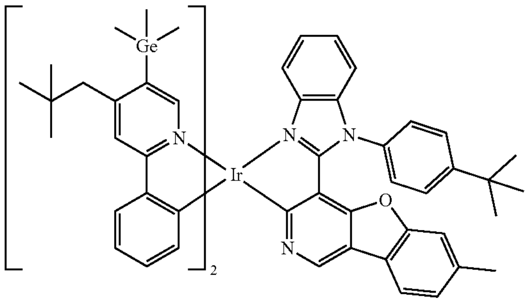
1977
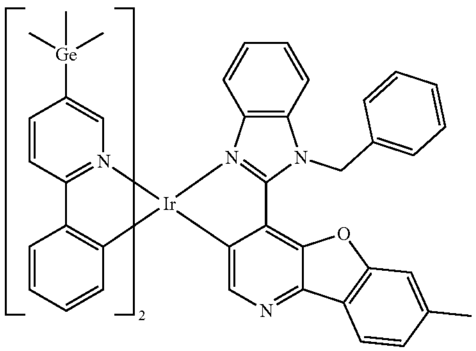
1978
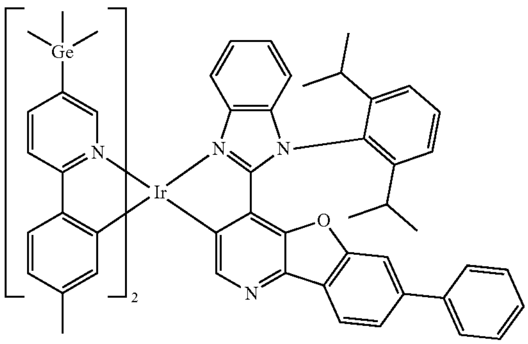

-continued
1979
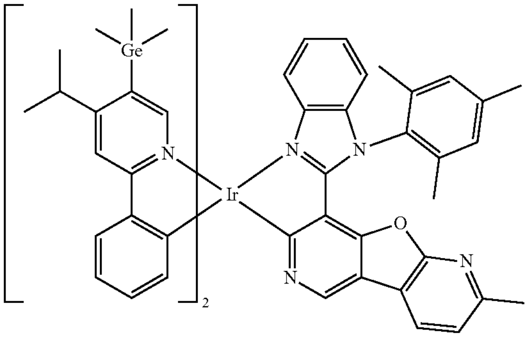
1980
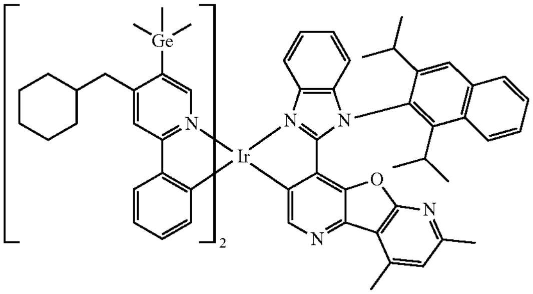
1981
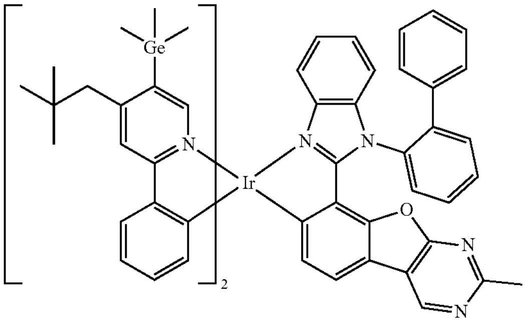
1982
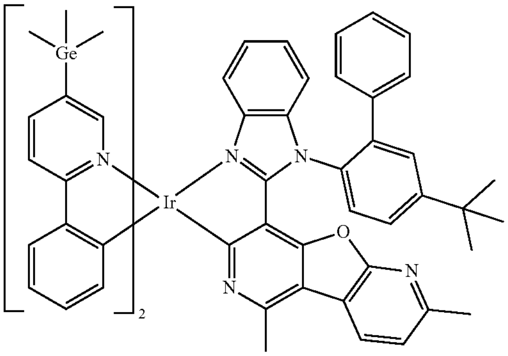
1983
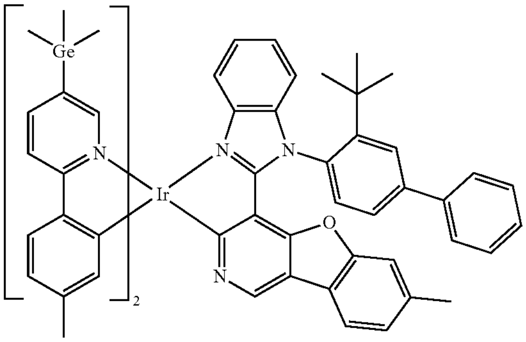
1984
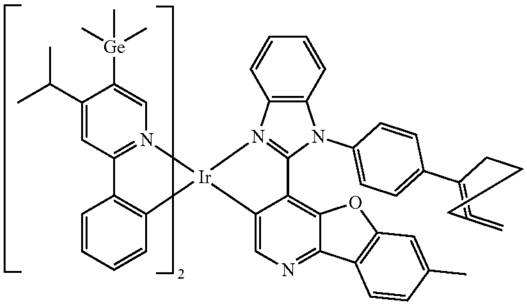
1985
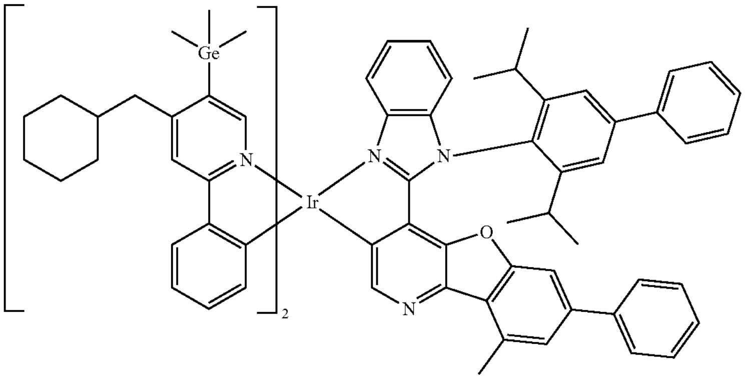

-continued
1986
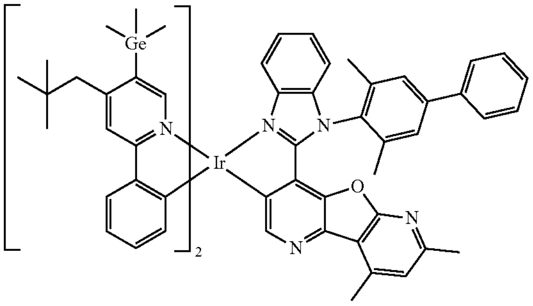
1987
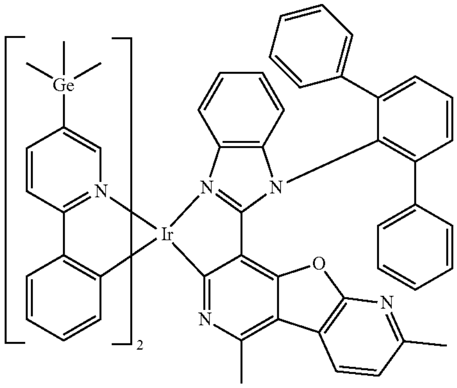
1988
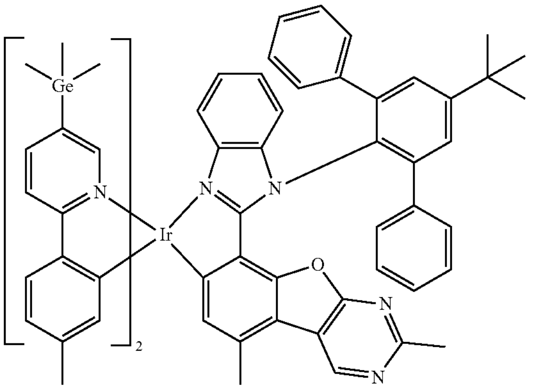
1989
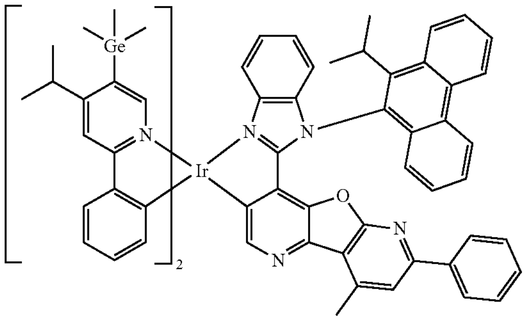
1990
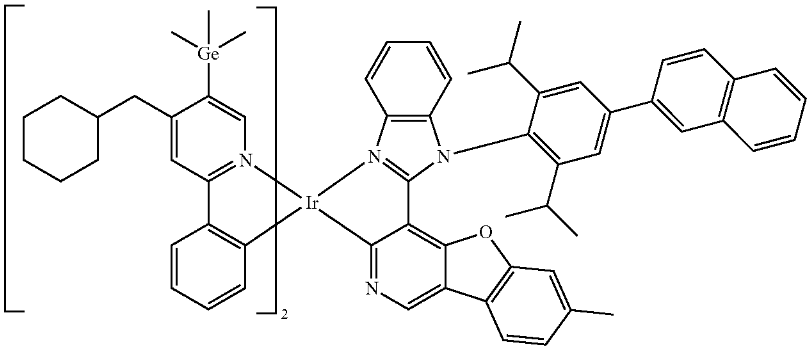
1991
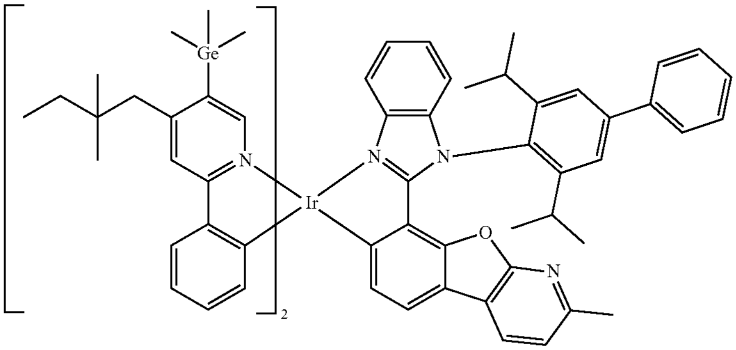

-continued
1992
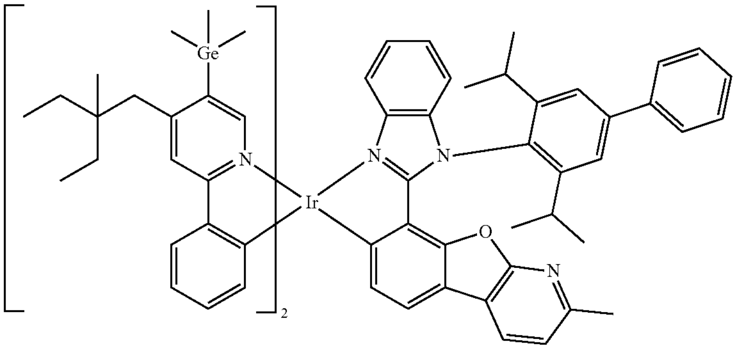
1993
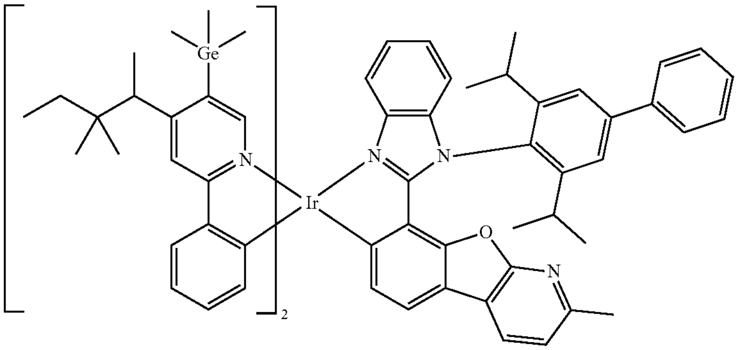
1994
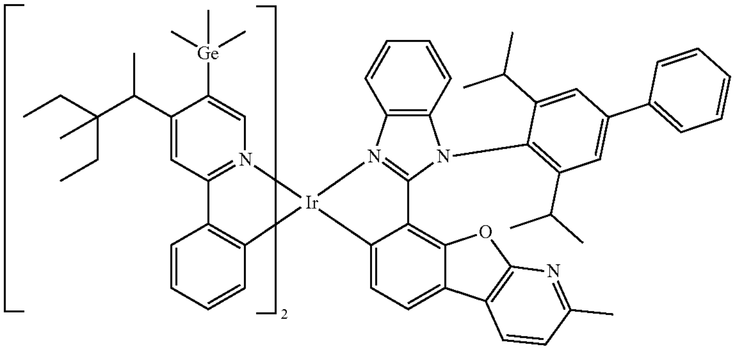
1995
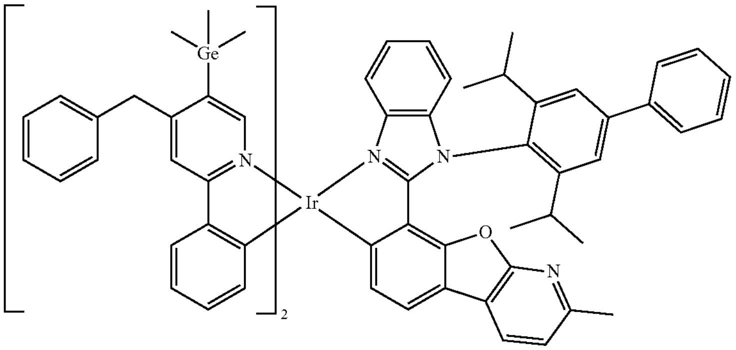

-continued
1996
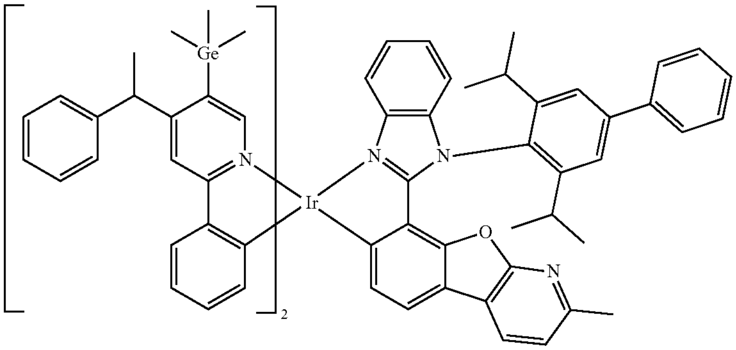
1997
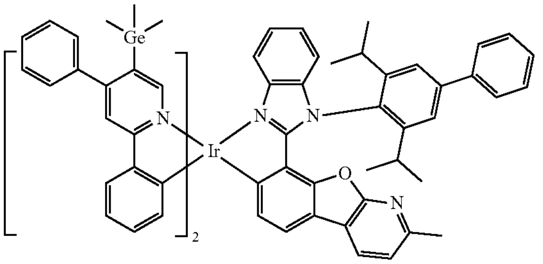
1998
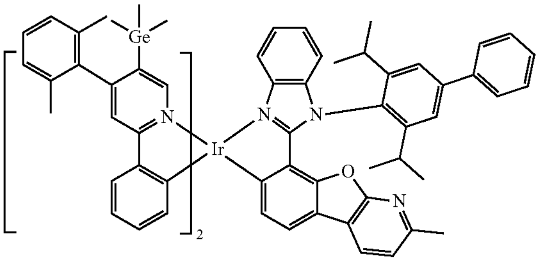
1999
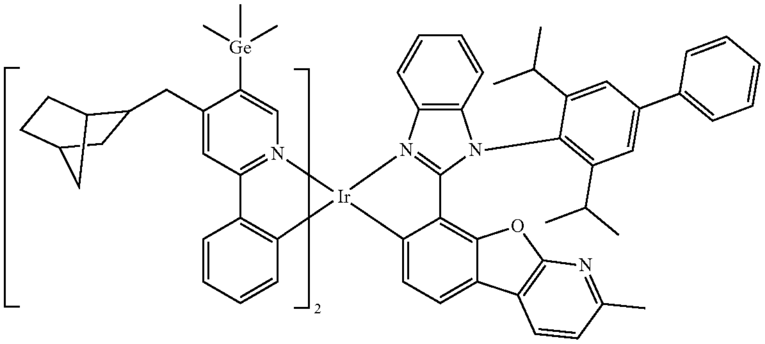
2000
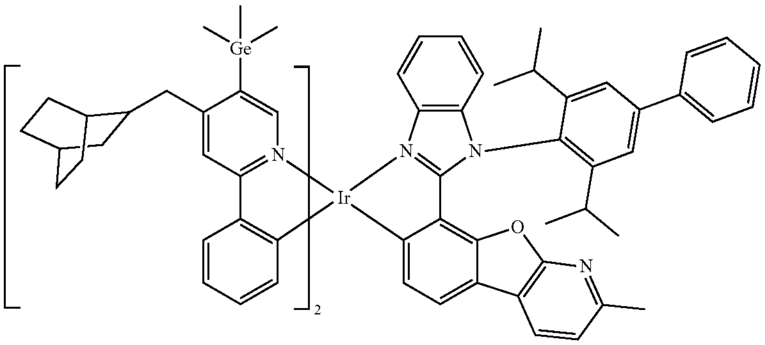

-continued
2001
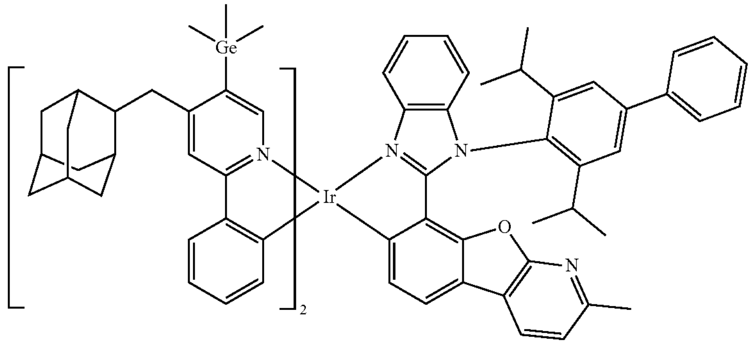
2002
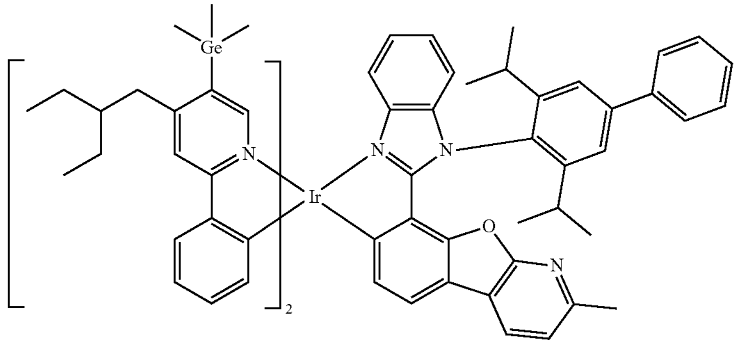
2003
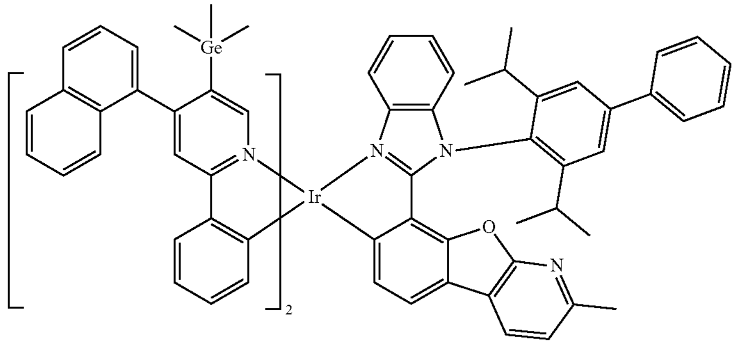
2004
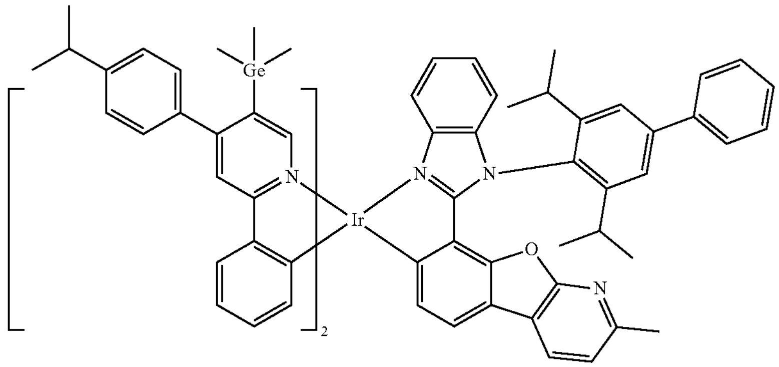

-continued
2005
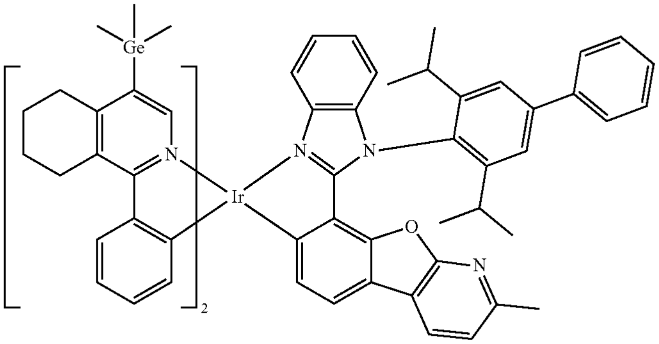
2006
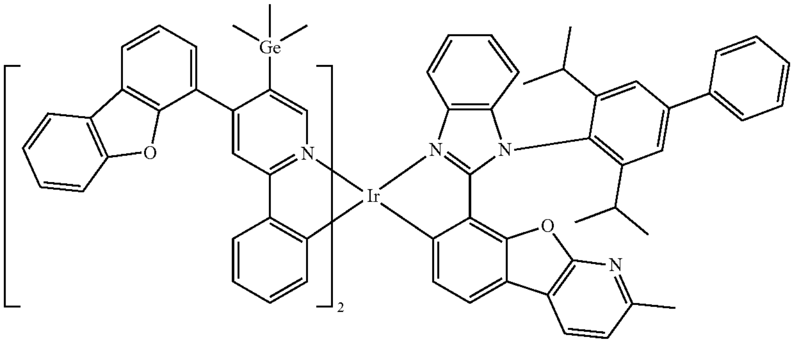
2007
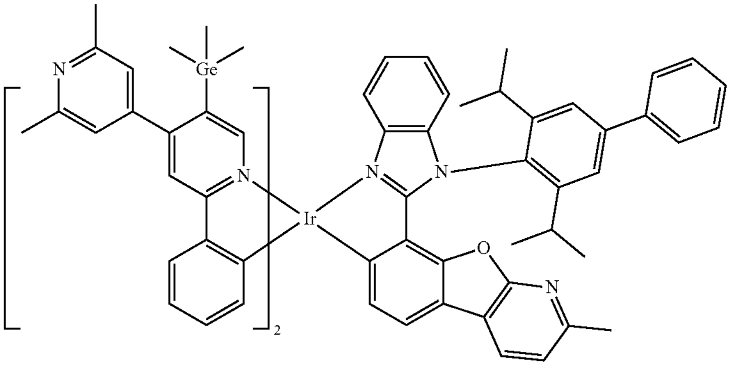
2008
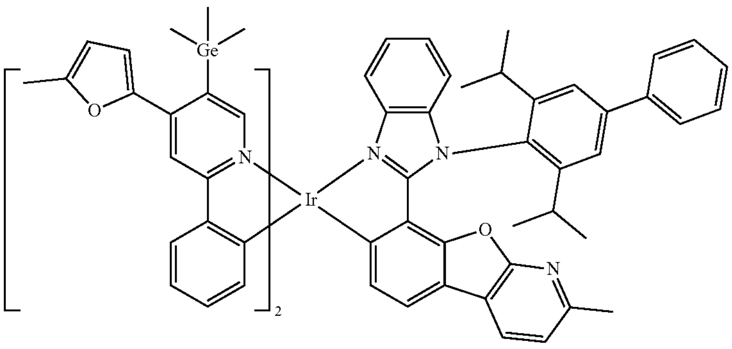

-continued
2009
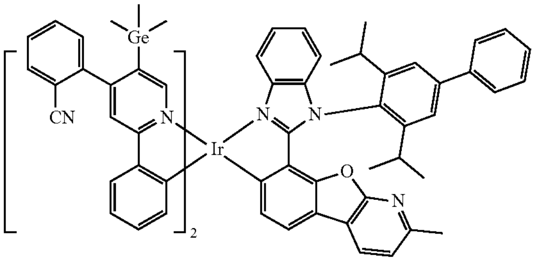
2010
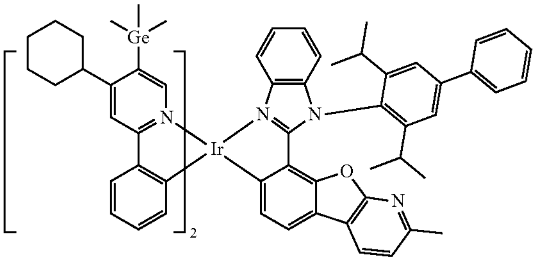
2011
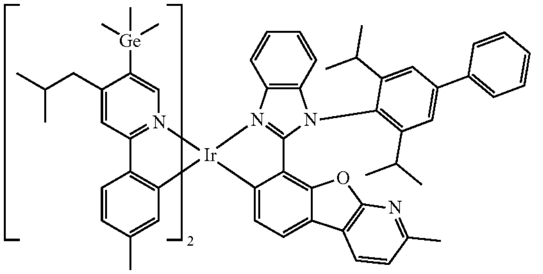
2012
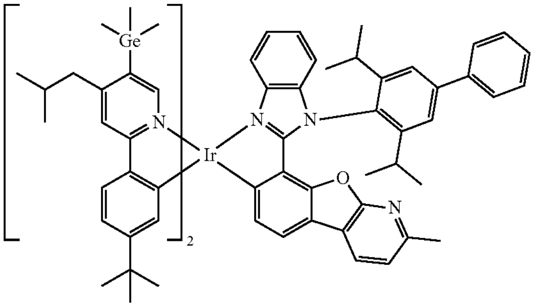
2013
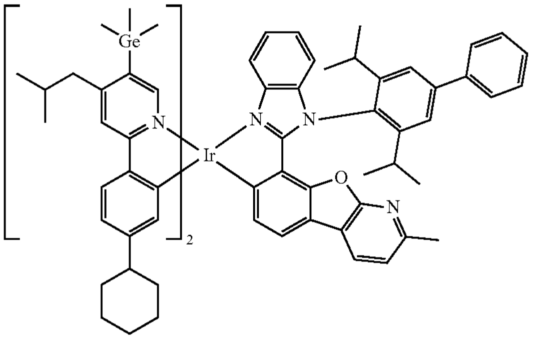
2014
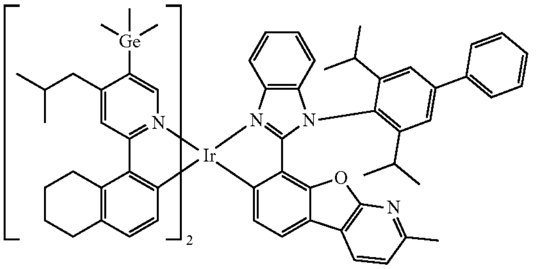
2015
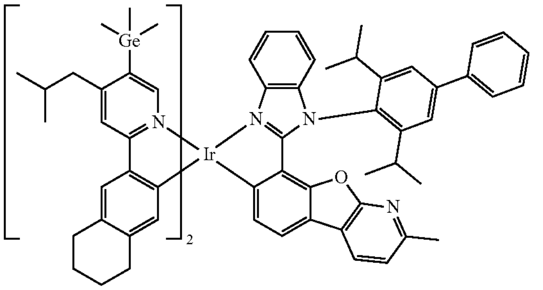
2016
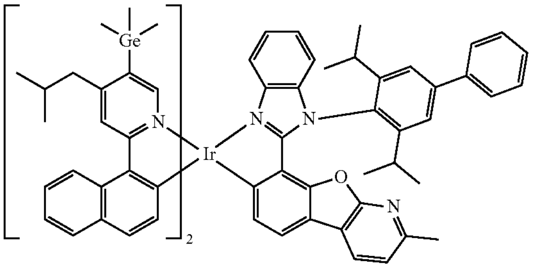
2017
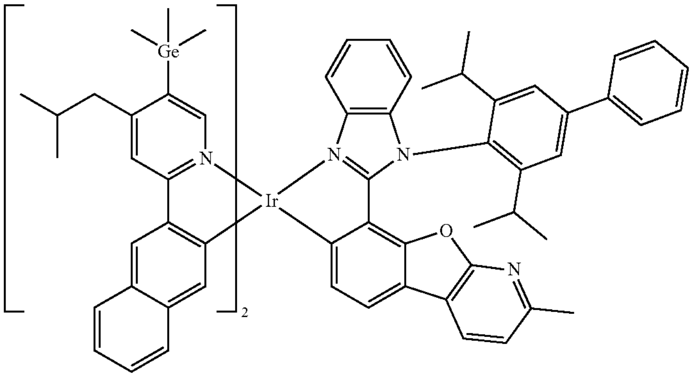

-continued
2018
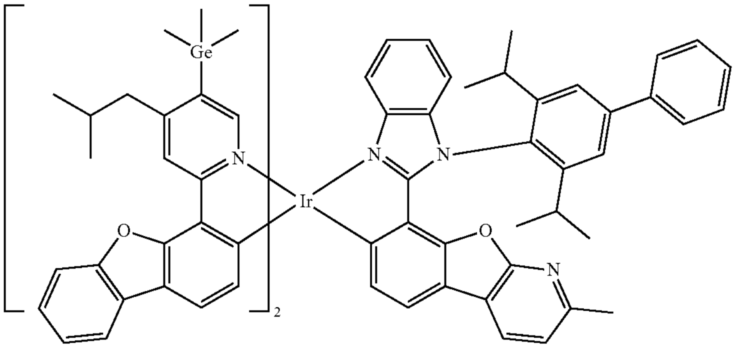
2019
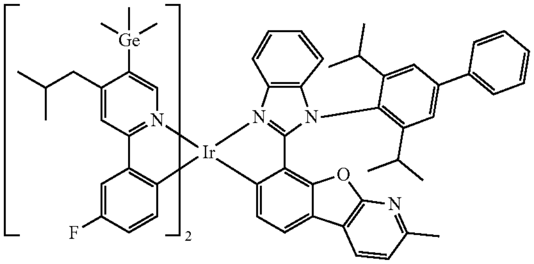
2020
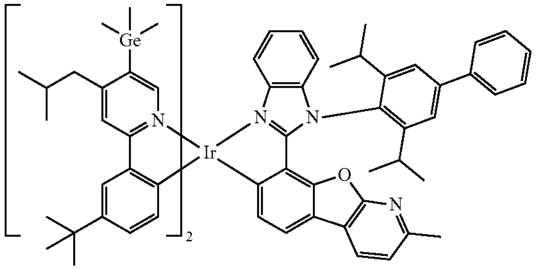
2021
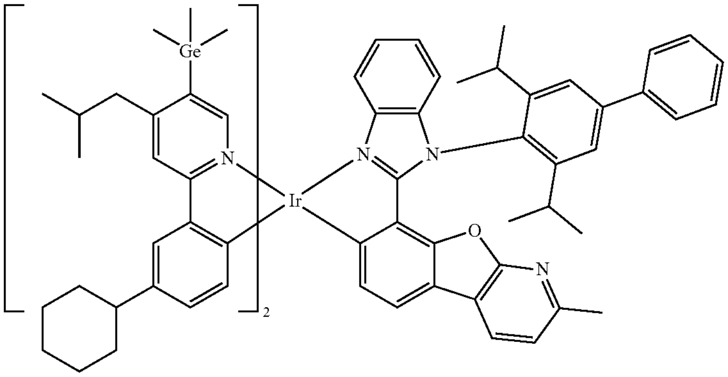
2022
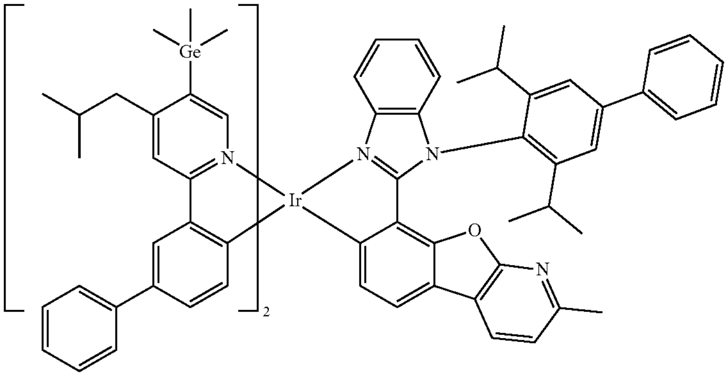

-continued
2023
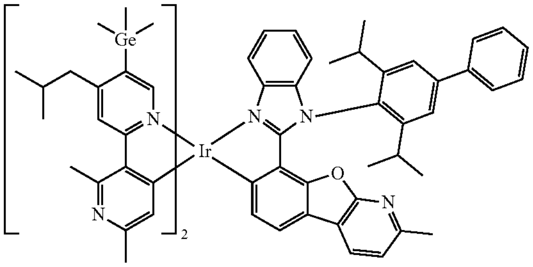
2024
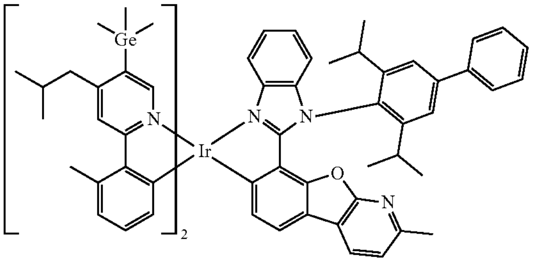
2025
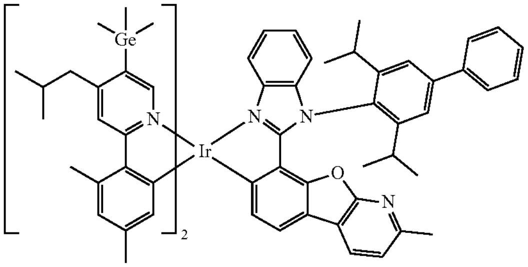
2026
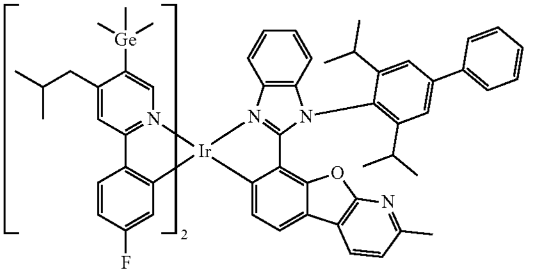
2027
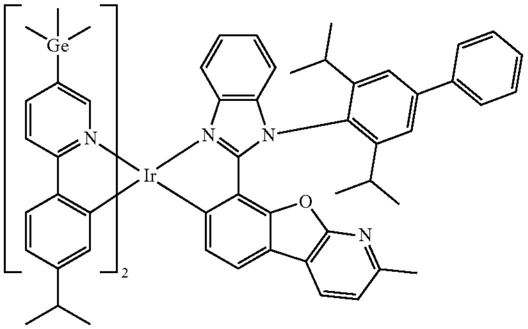
2028
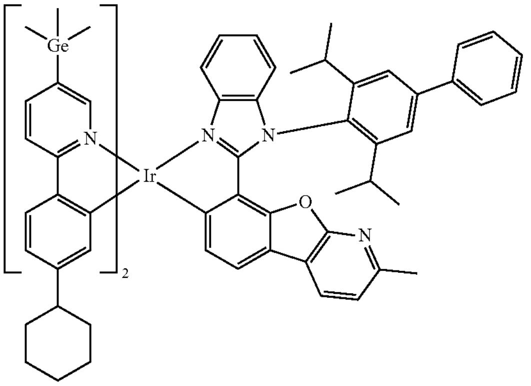
2029
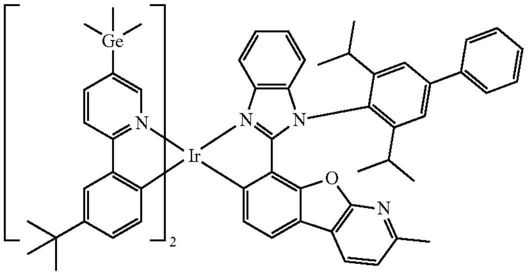
2030
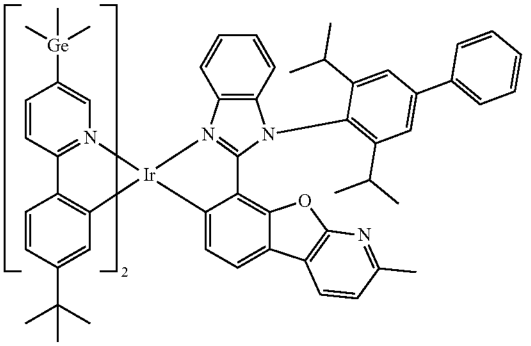

-continued
2031
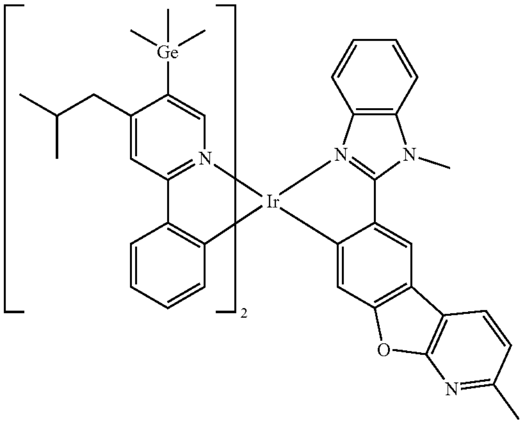
2032
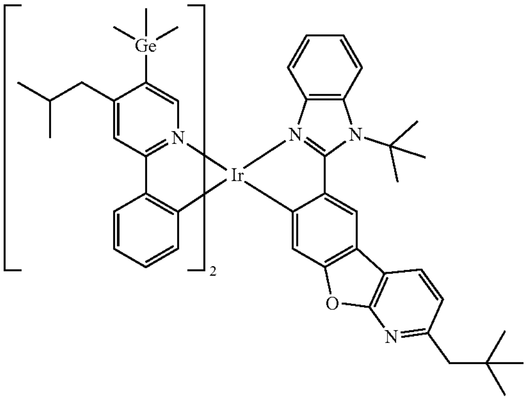
2033
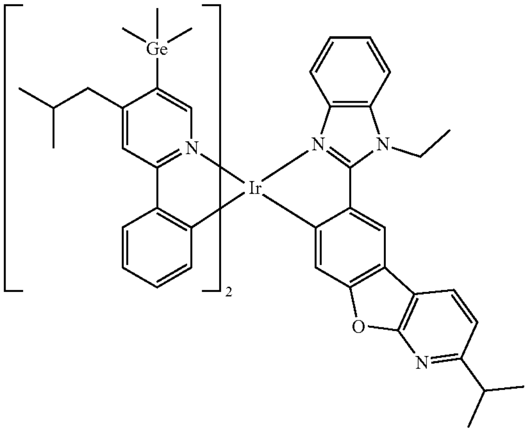
2034
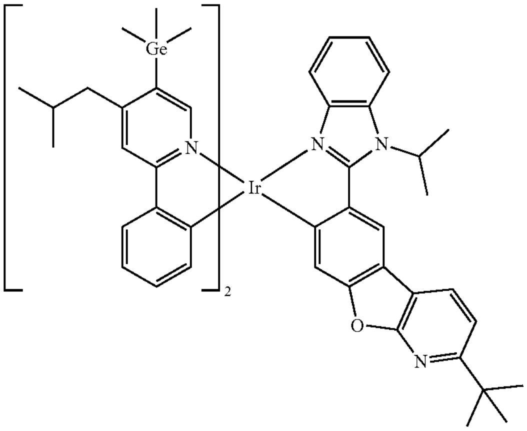
2035
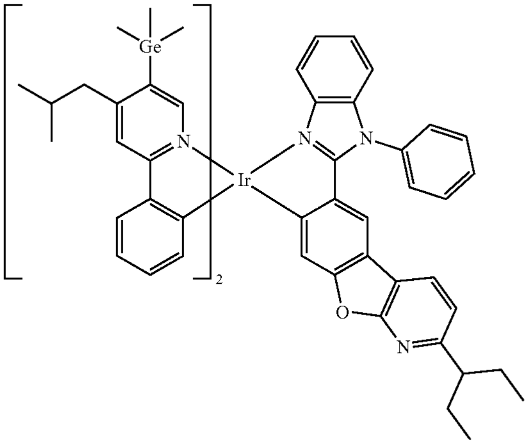
2036
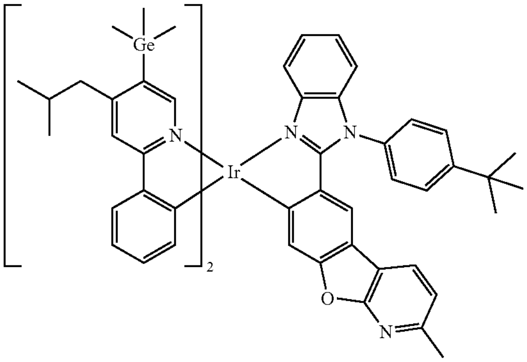

-continued
2037
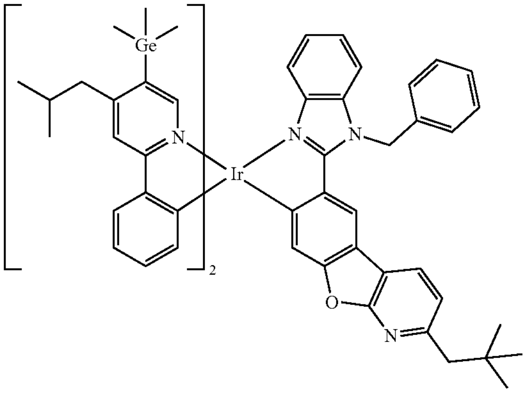
2038
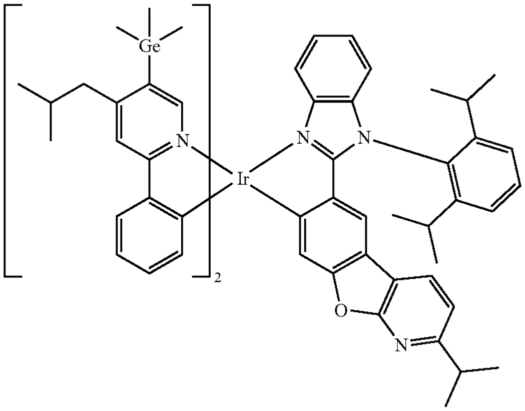
2039
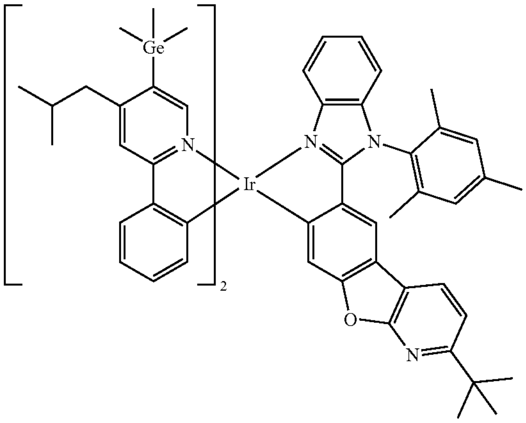
2040
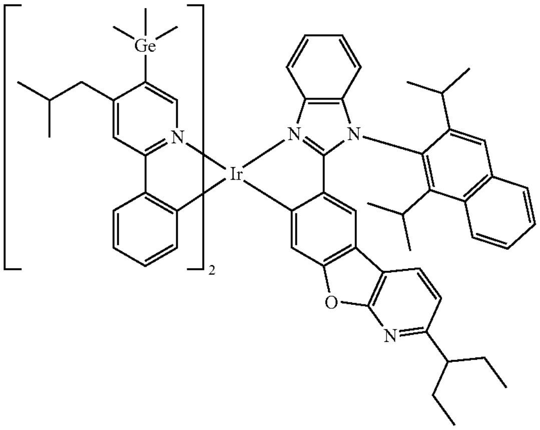
2041
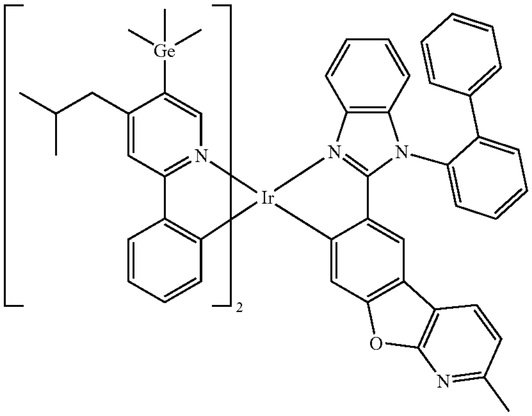
2042
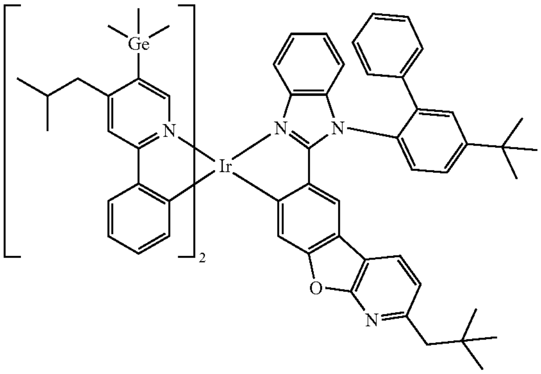
2043
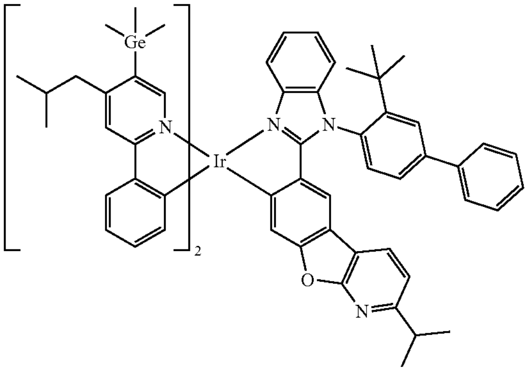
2044
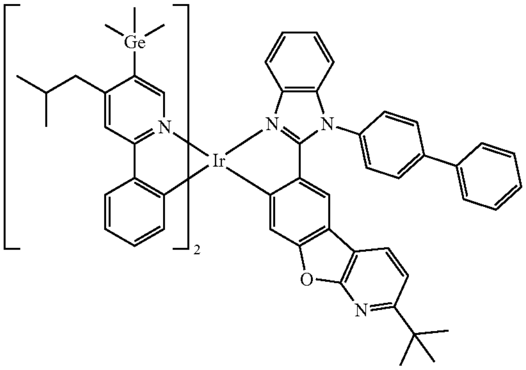

-continued
2045
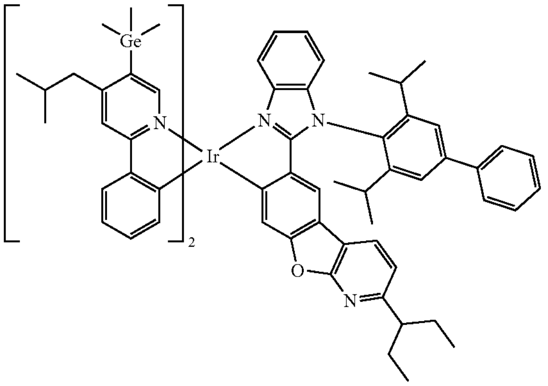
2046
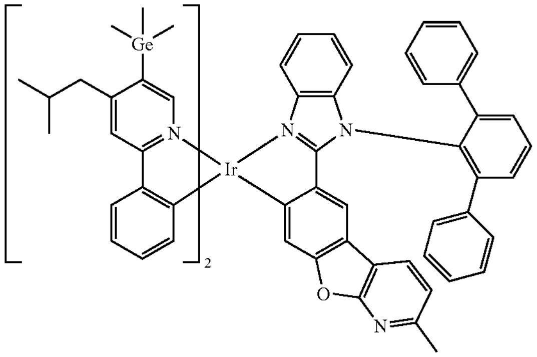
2047
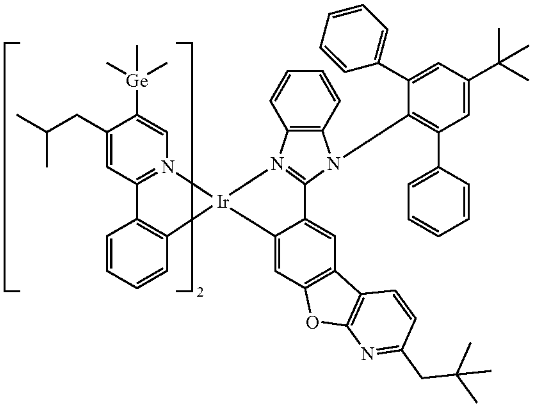
2048
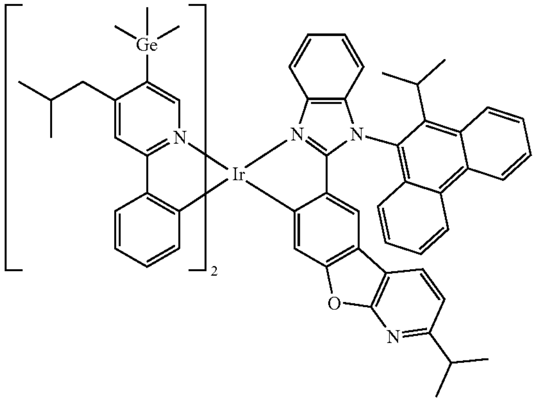
2049
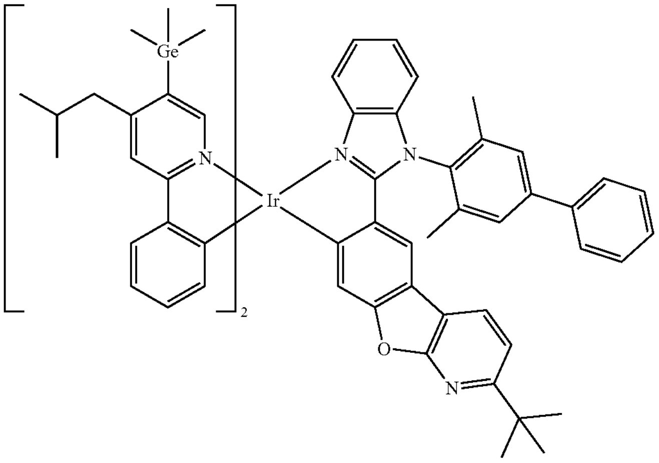

-continued
2050
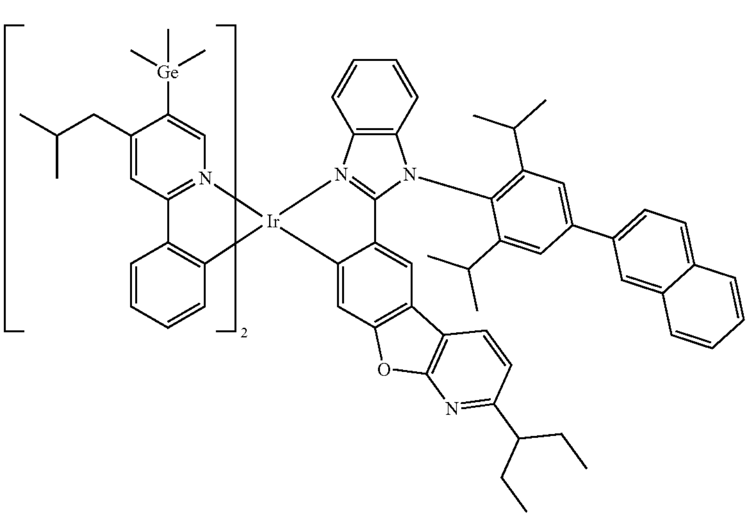
2051
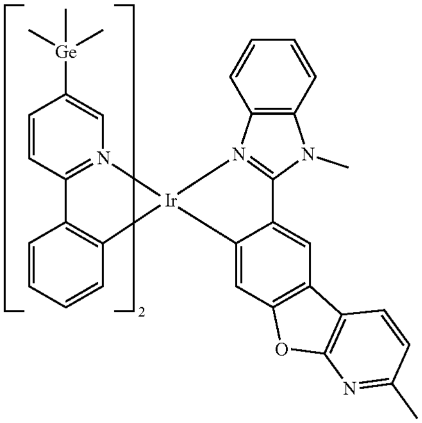
2052
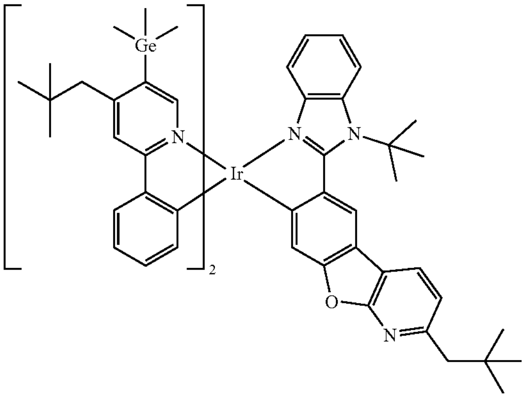
2053
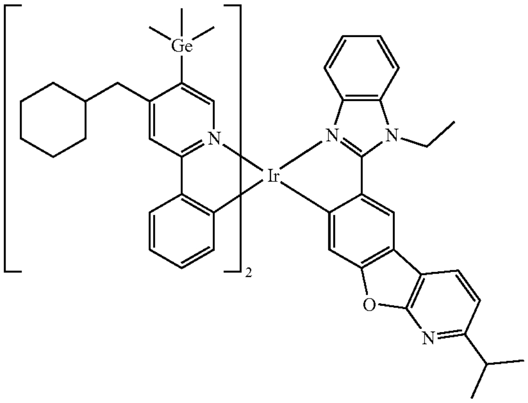
2054
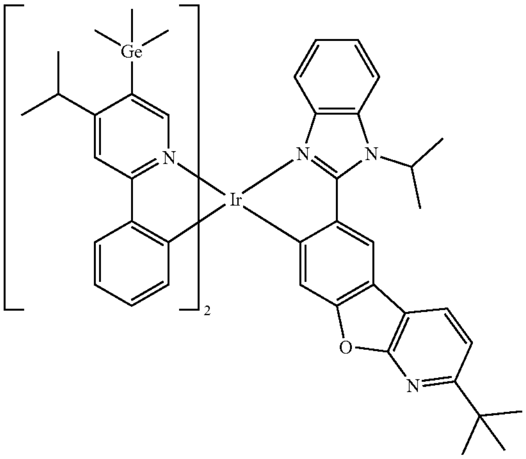

-continued
2055
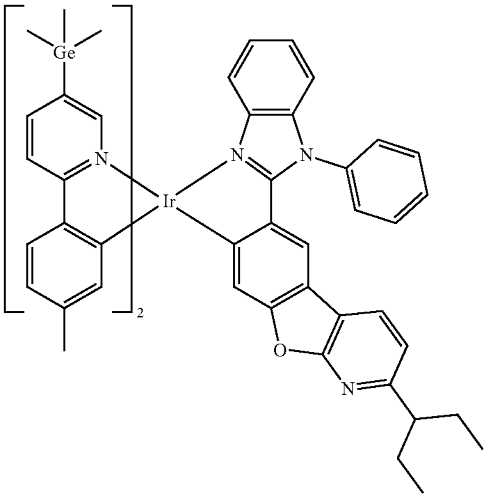
2056
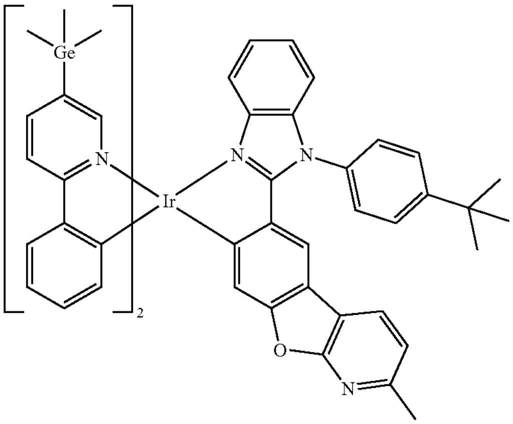
2057
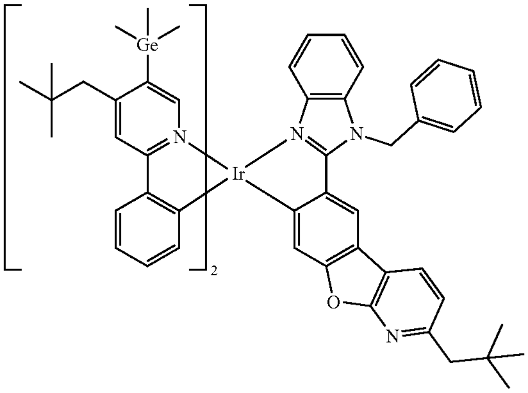
2058
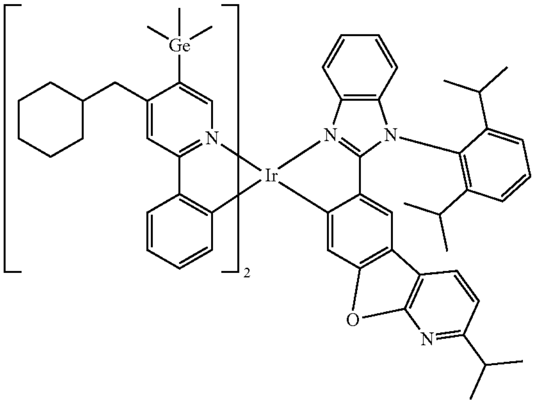
2059
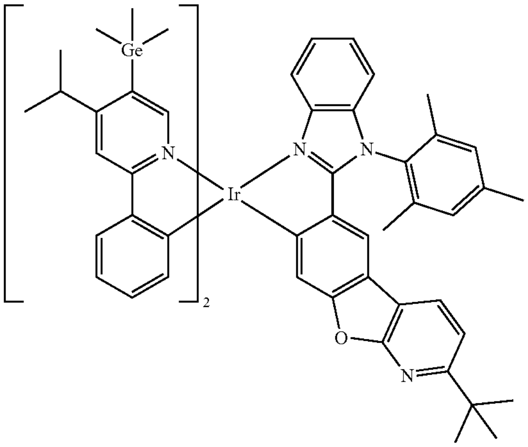
2060
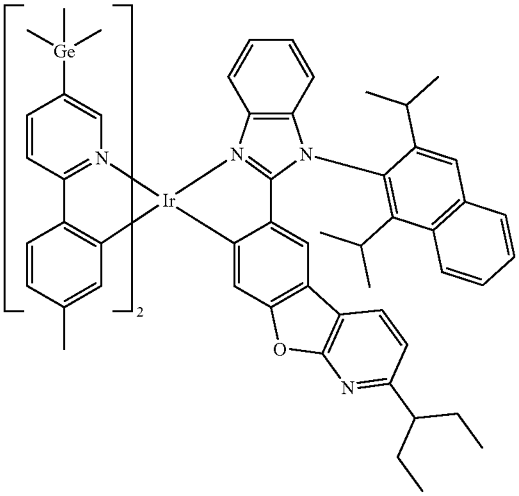

-continued
2061
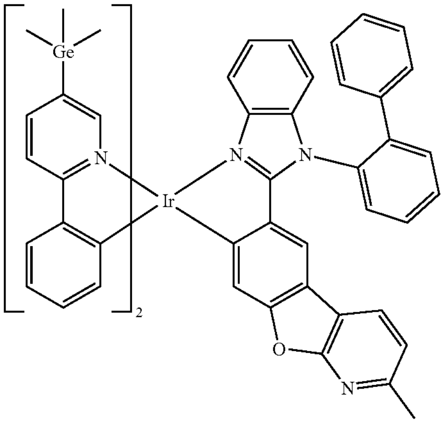
2062
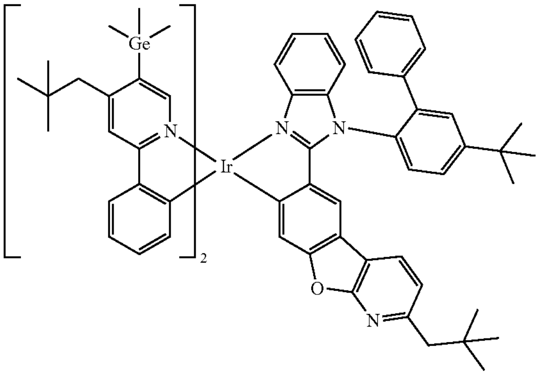
2063
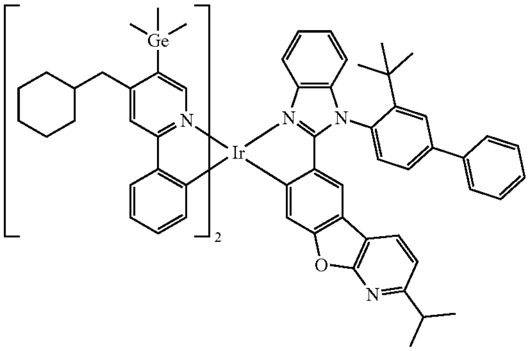
2064
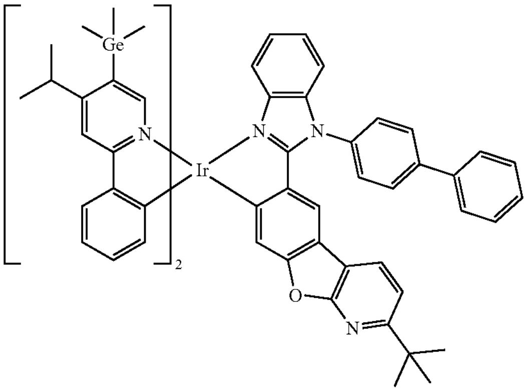
2065
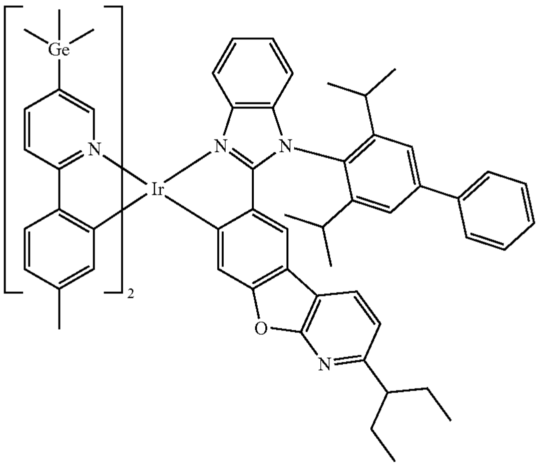
2066
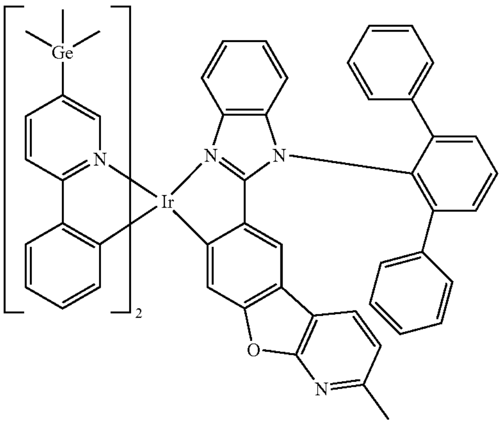

-continued
2067
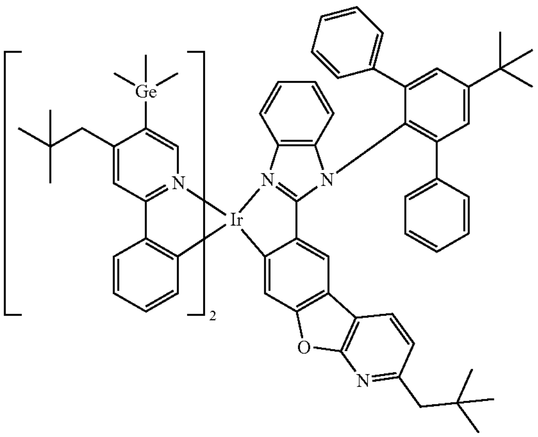
2068
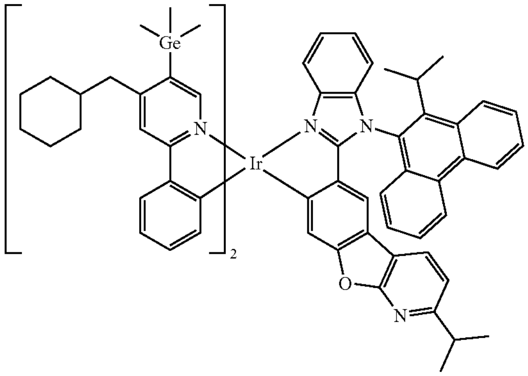
2069
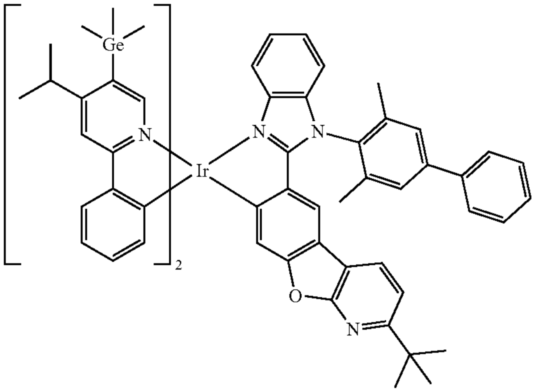
2070
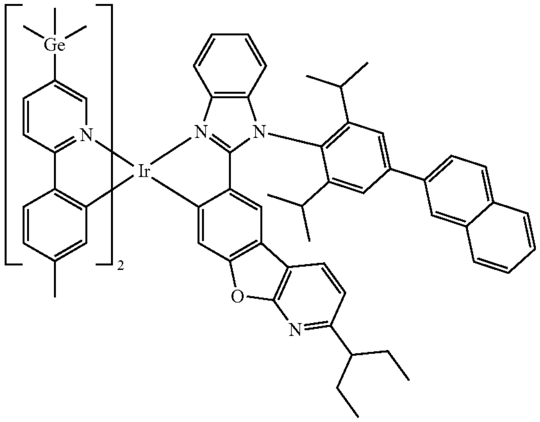
2071
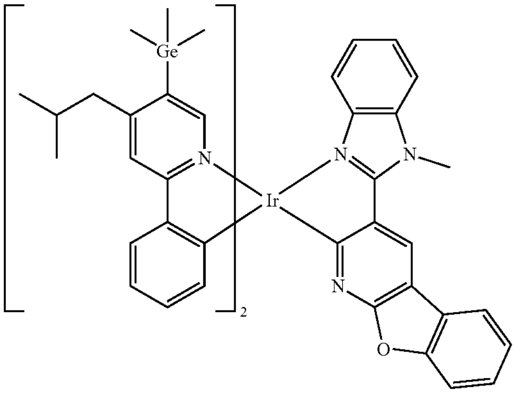
2072
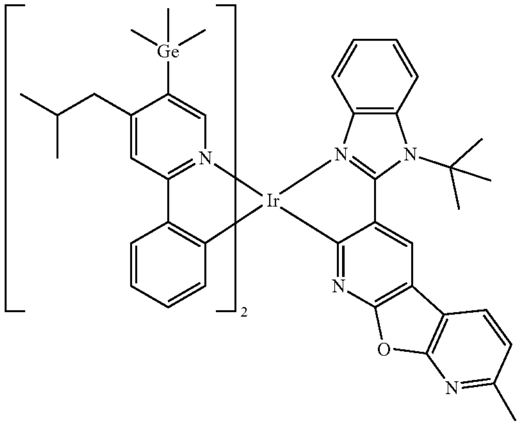

-continued
2073
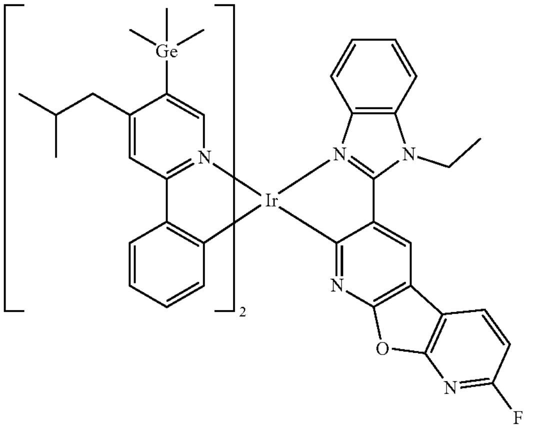
2074
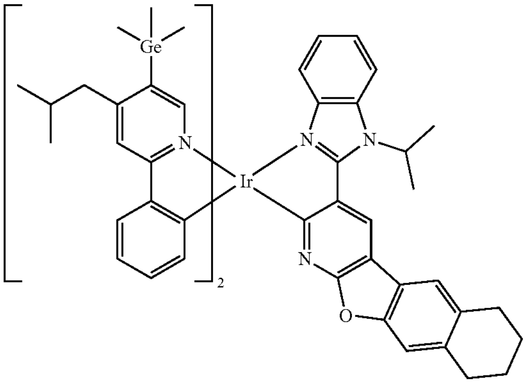
2075
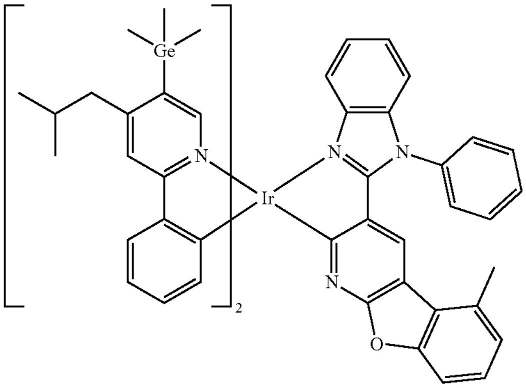
2076
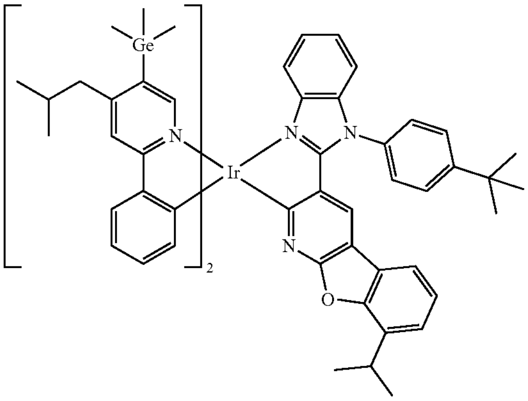
2077
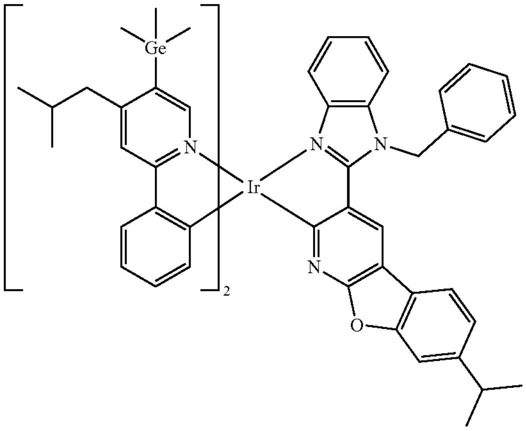
2078
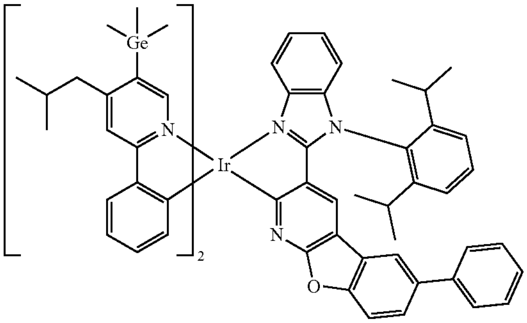

-continued
2079
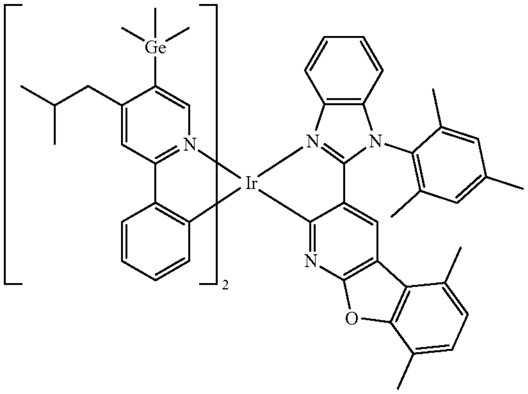
2080
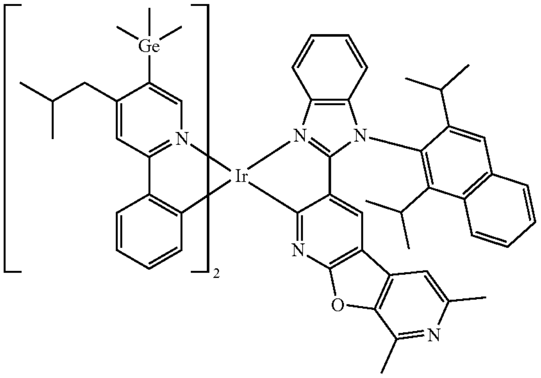
2081
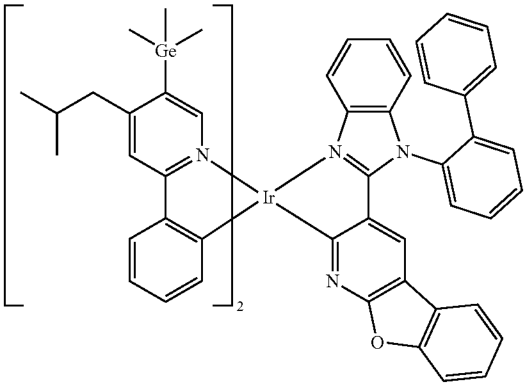
2082
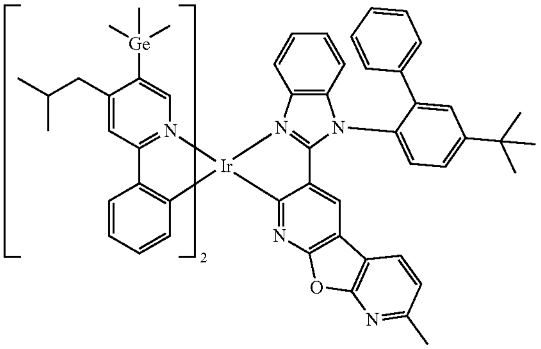
2083
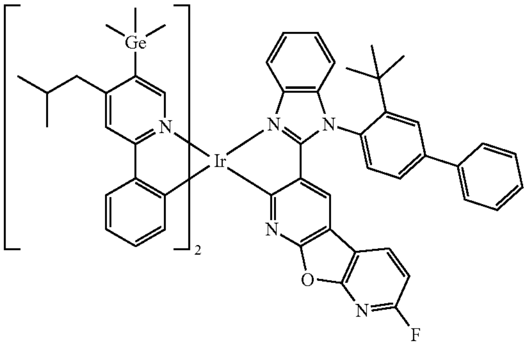
2084
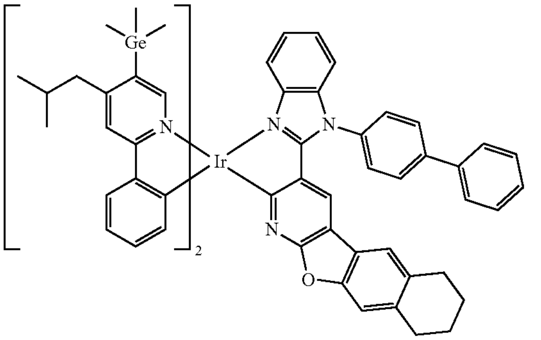
2085
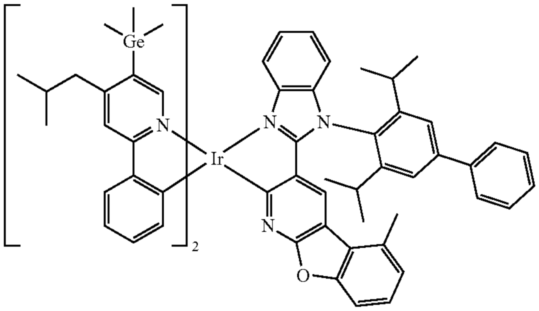
2086
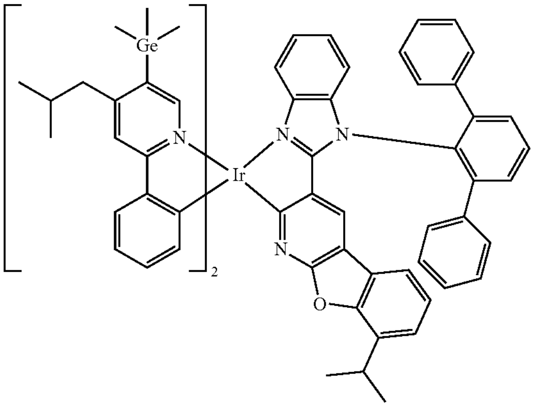

-continued
2087
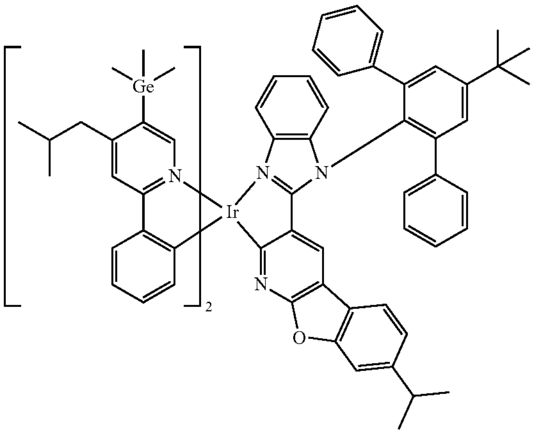
2088
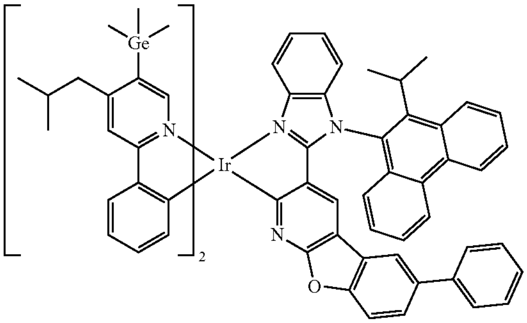
2089
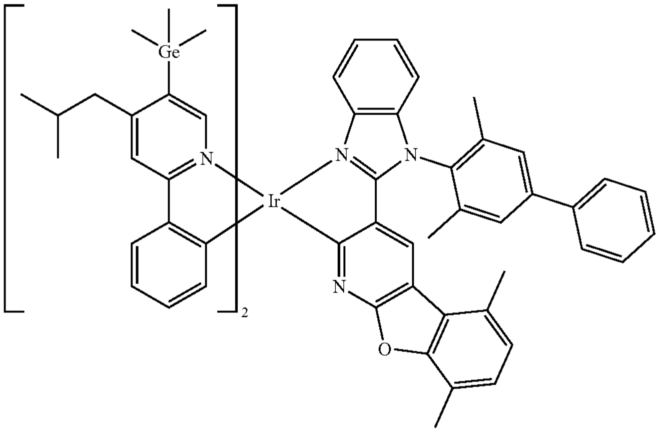
2090
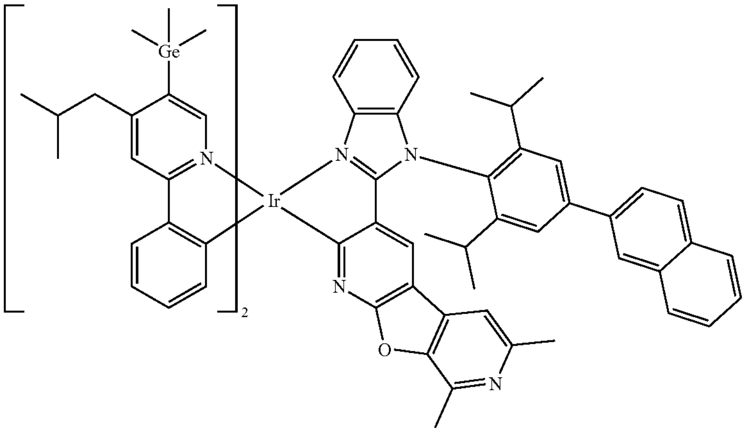

-continued
2091
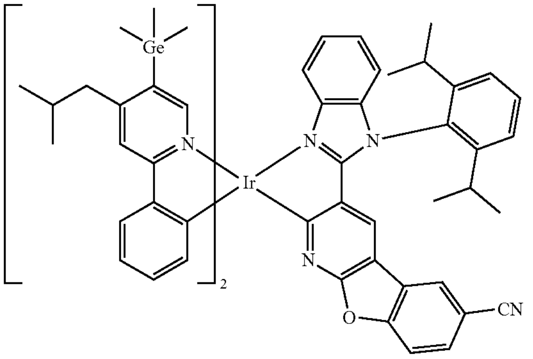
2092
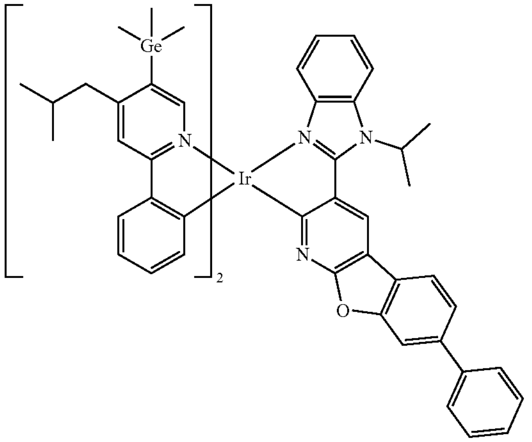
2093
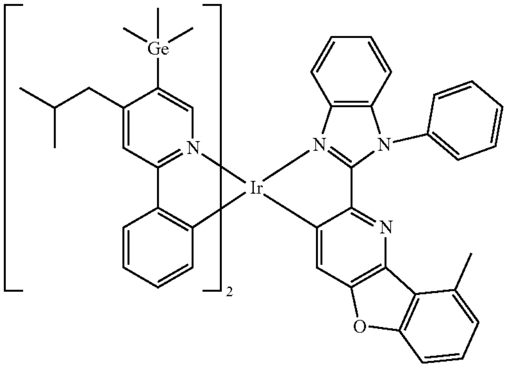
2094
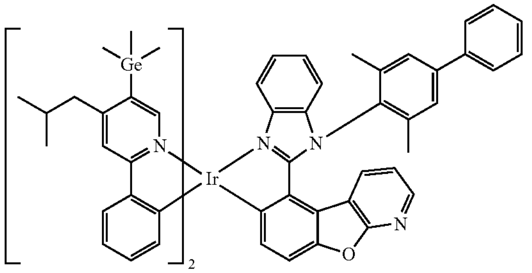
2095
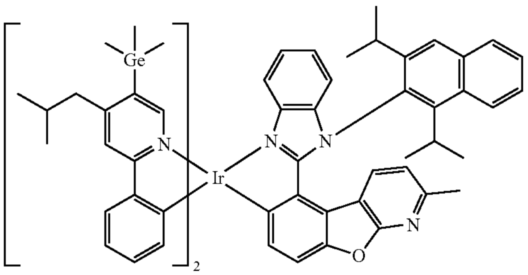
2096
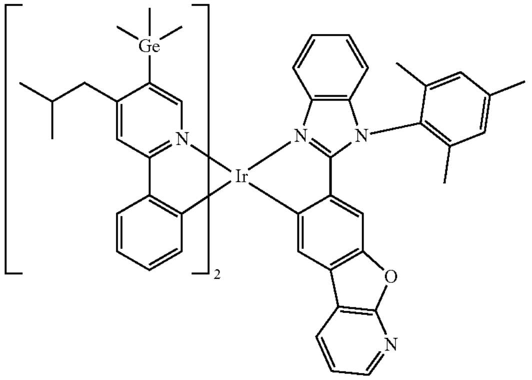
2097
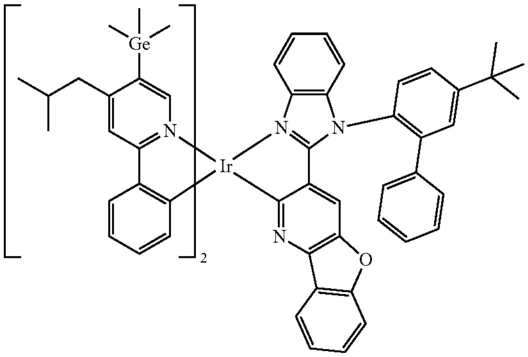
2098
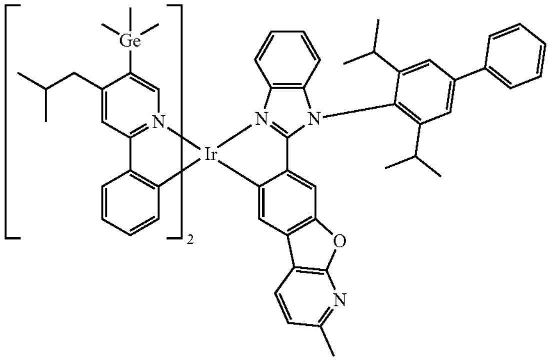

-continued
2099
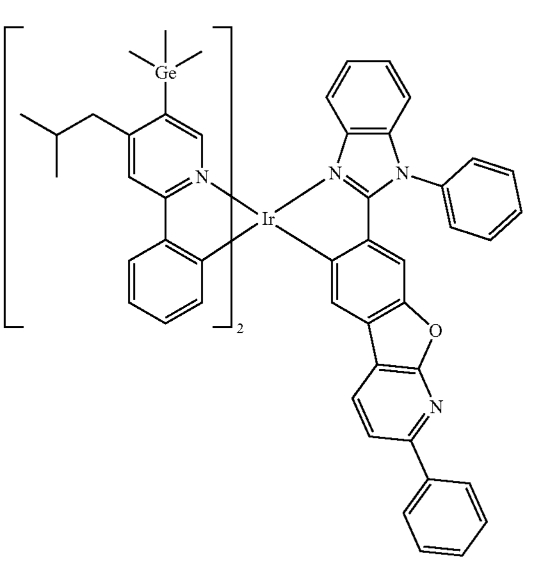
2100
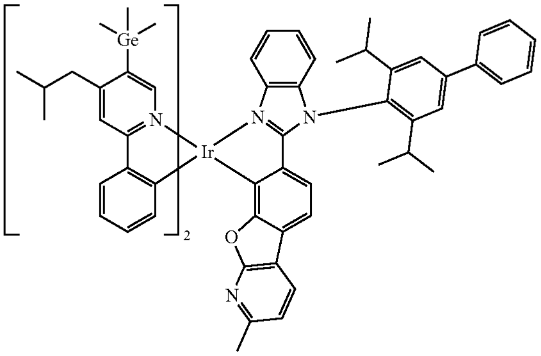
2101
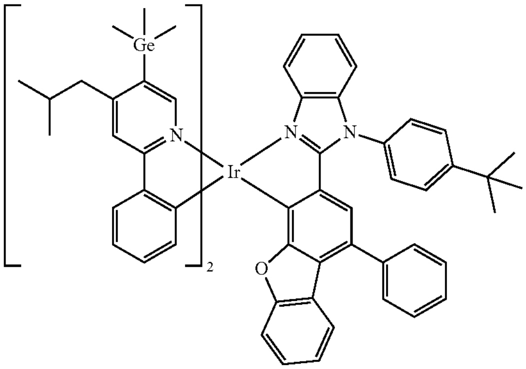
2102
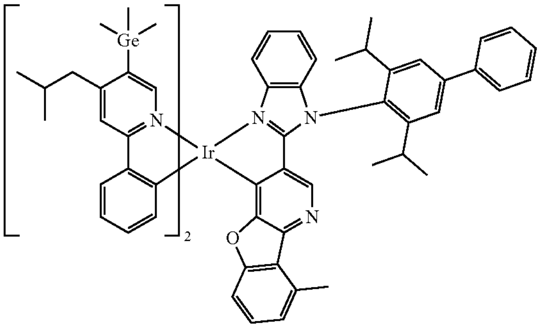
2103
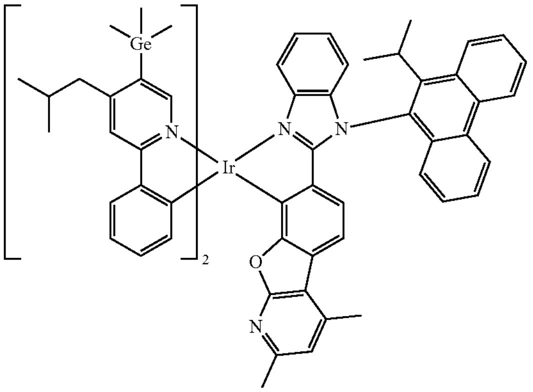
2104
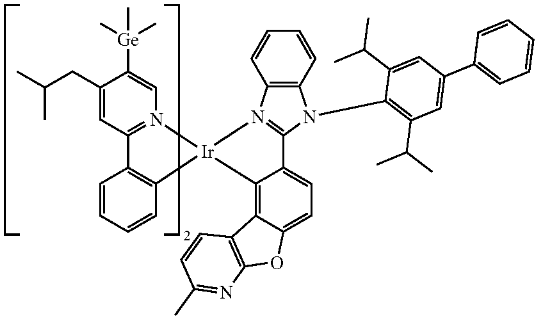

-continued
2105
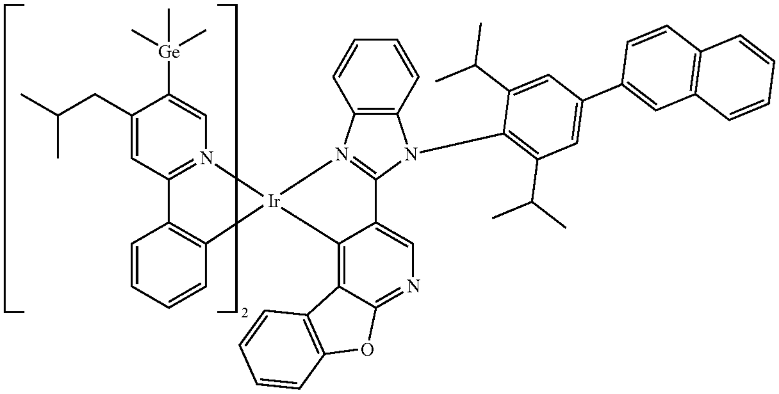
2106
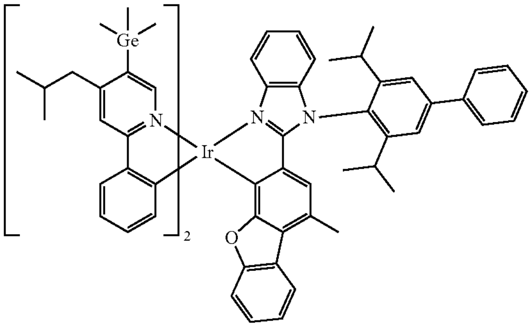
2107
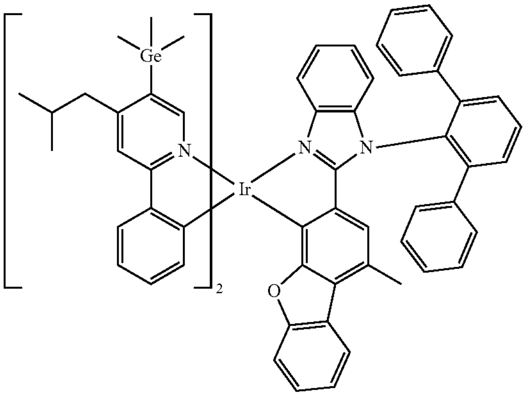
2108
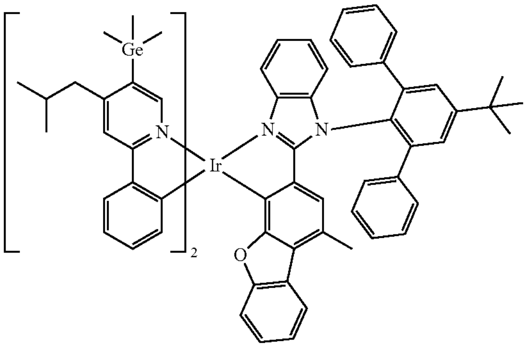
2109
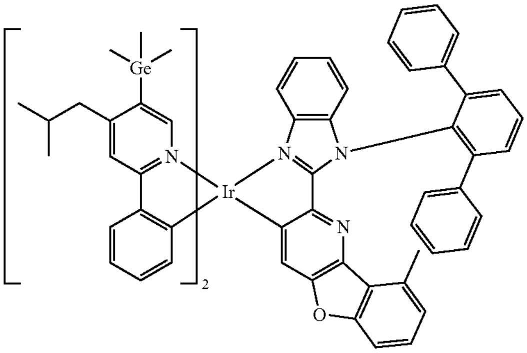
2110
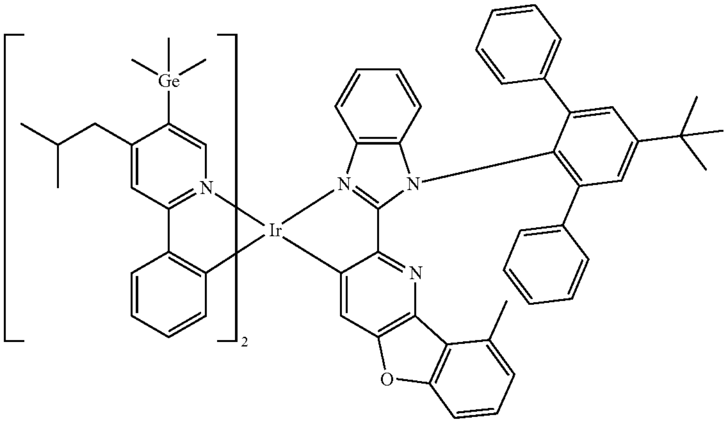

-continued
2111
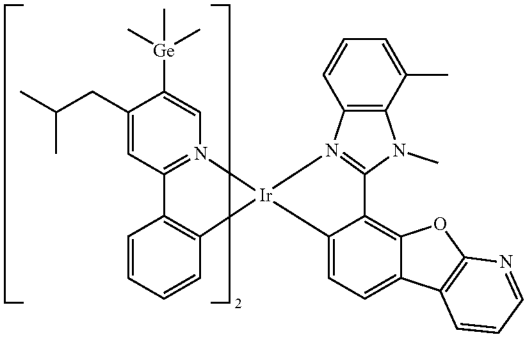
2112
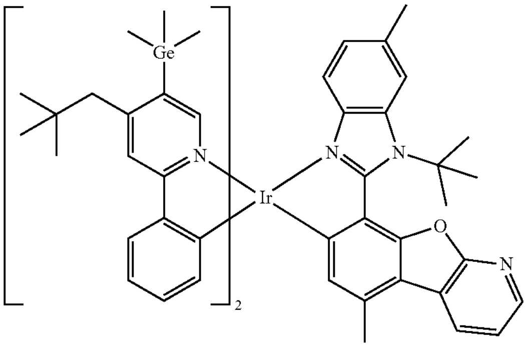
2113
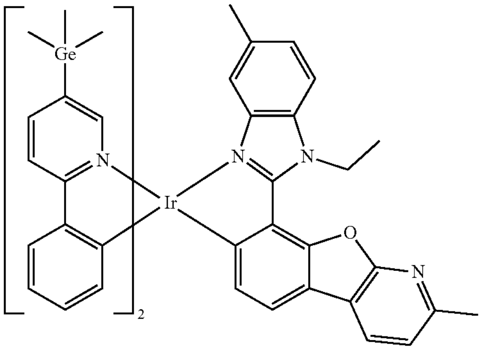
2114
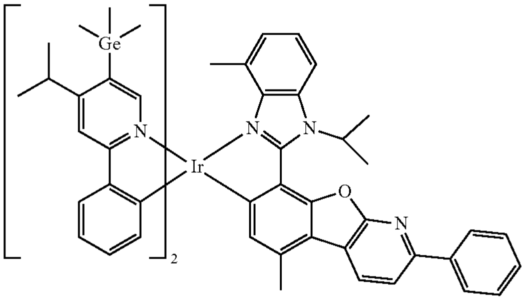
2115
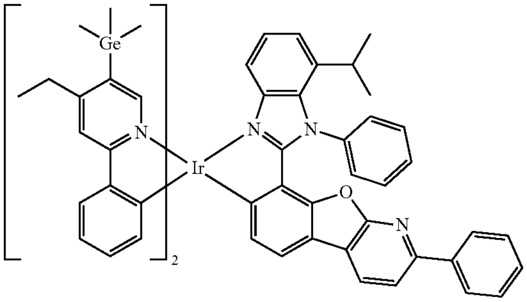
2116
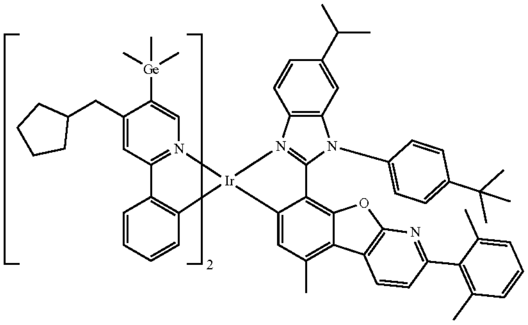
2117
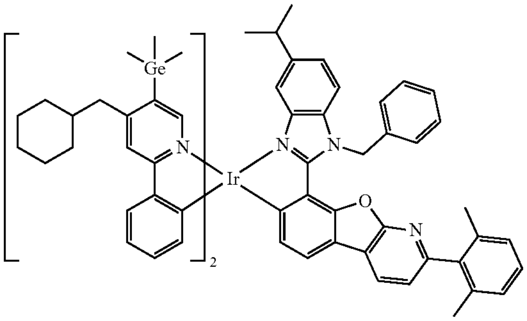
2118
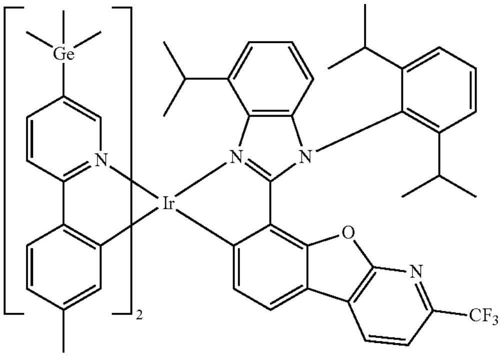

-continued
2119
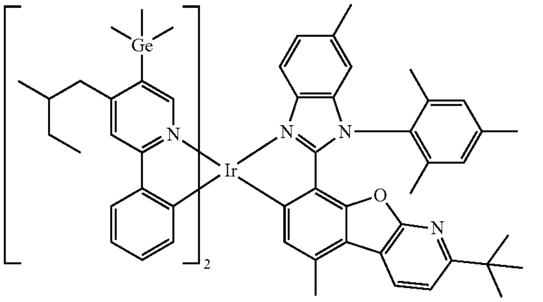
2120
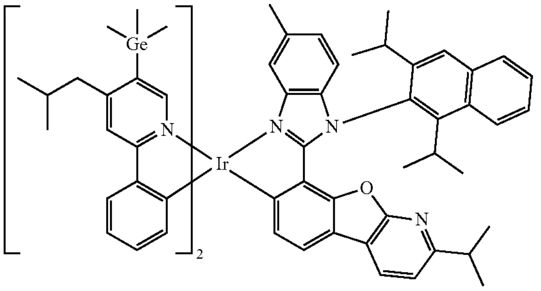
2121
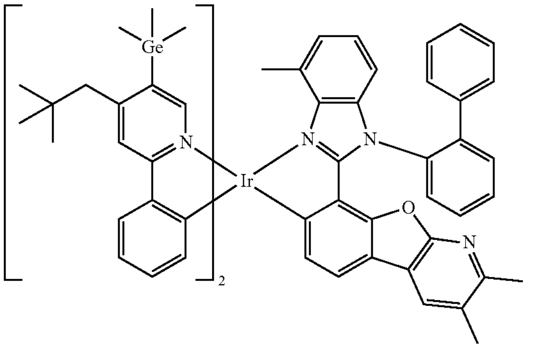
2122
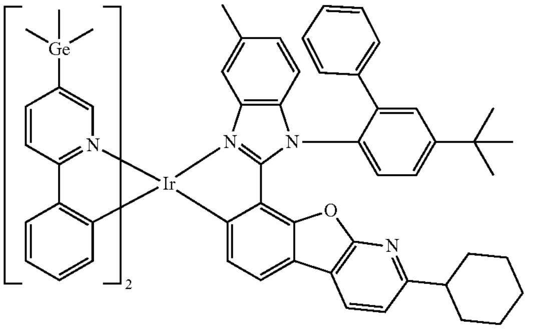
2123
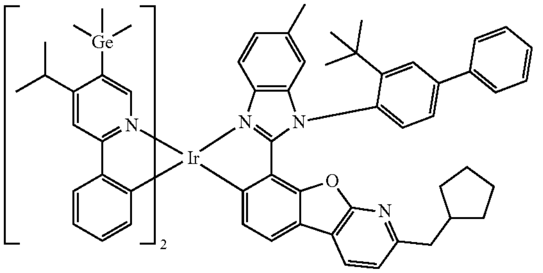
2124
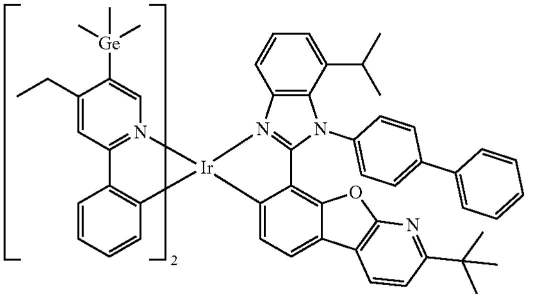
2125
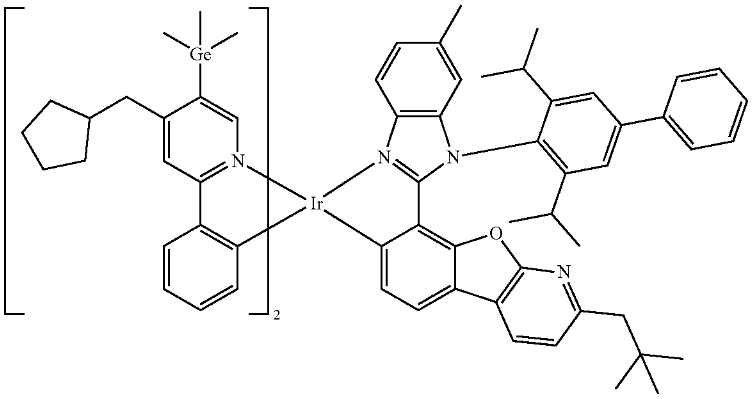

-continued
2126
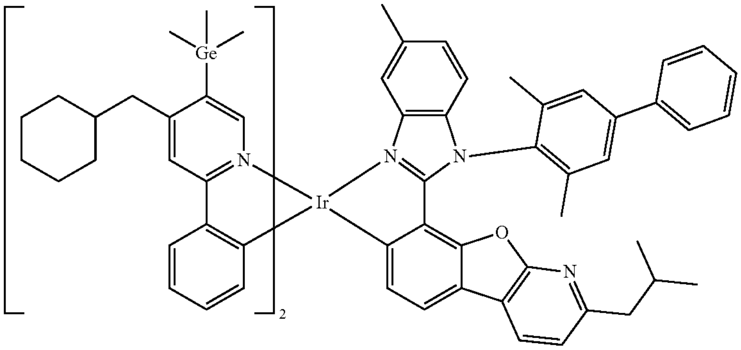
2127
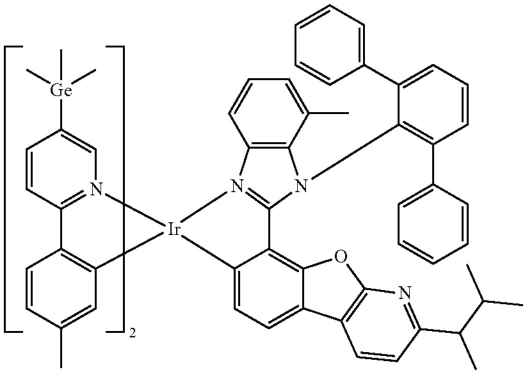
2128
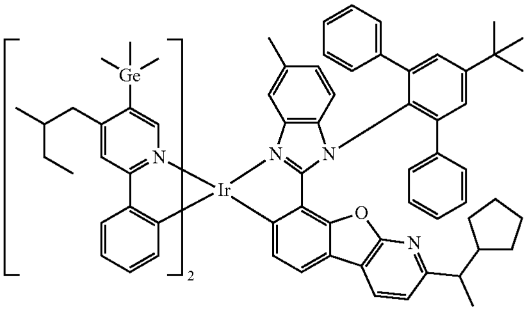
2129
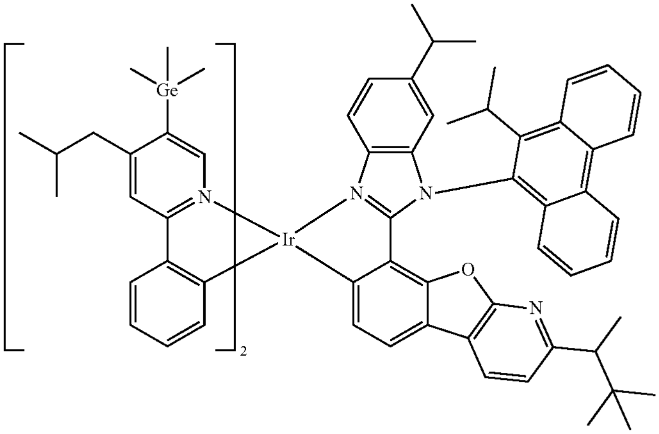
2130
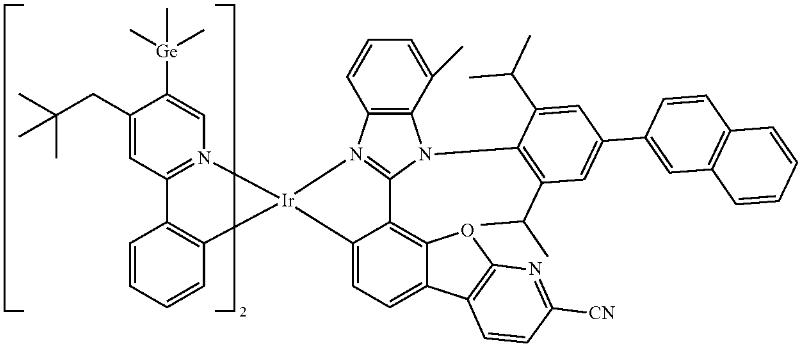

-continued
2131
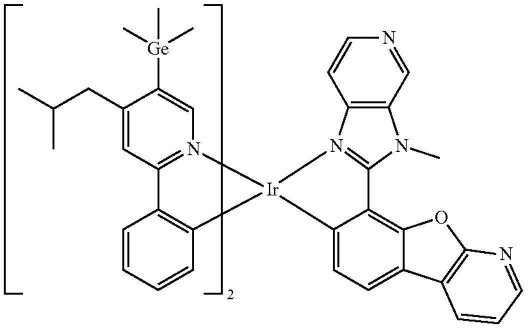
2132
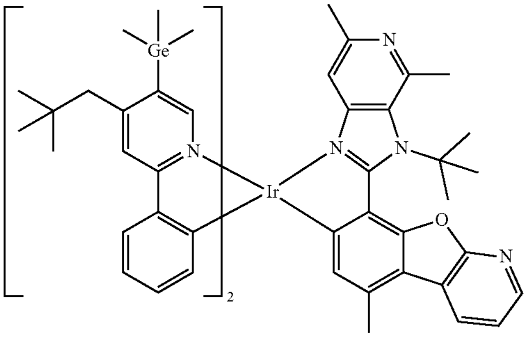
2133
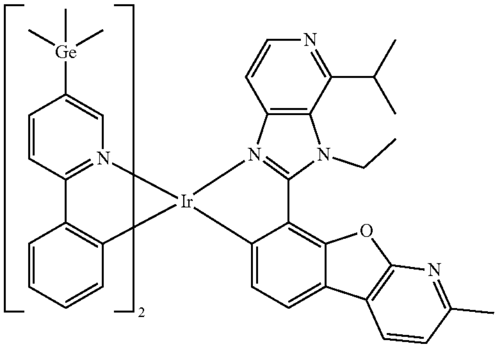
2134
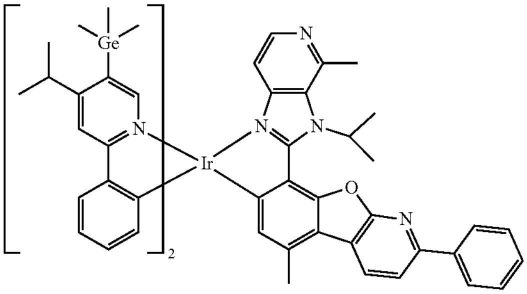
2135
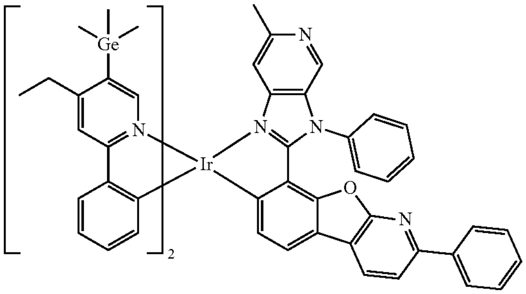
2136
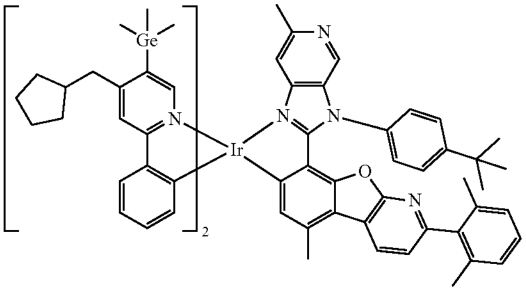
2137
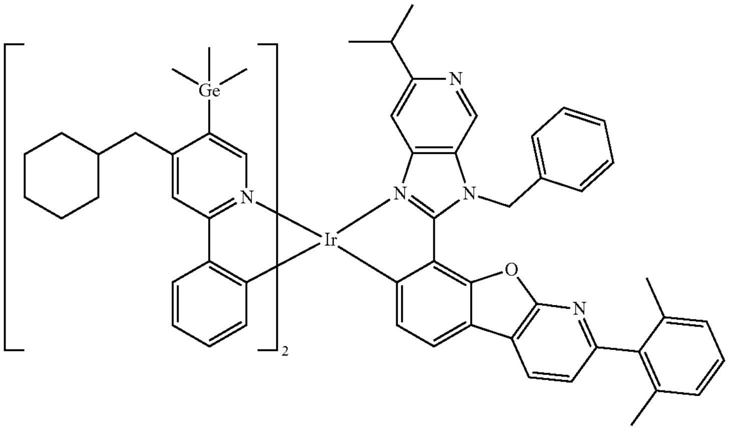

-continued
2138
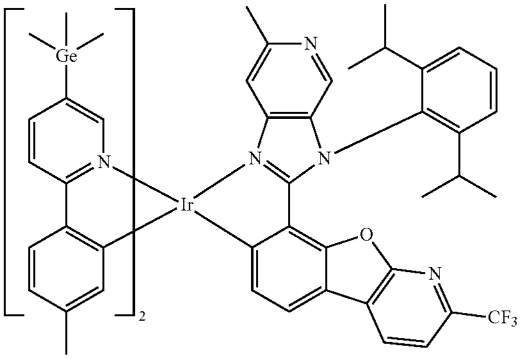
2139
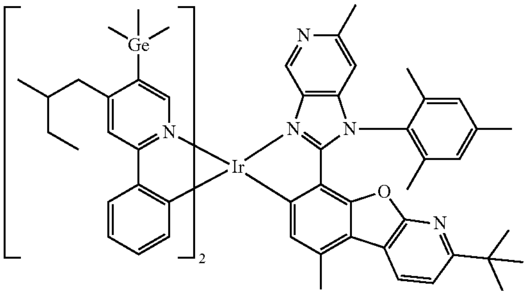
2140
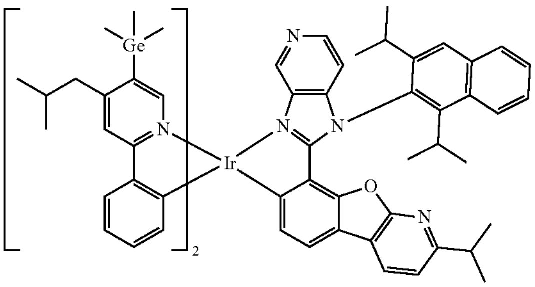
2141
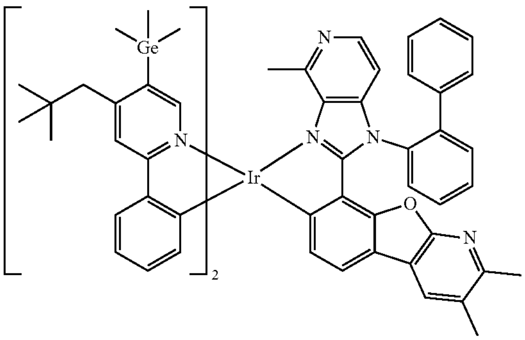
2142
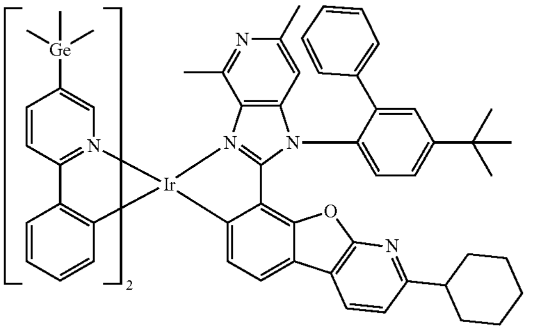
2143
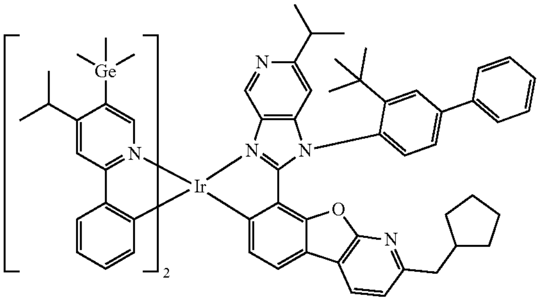
2144
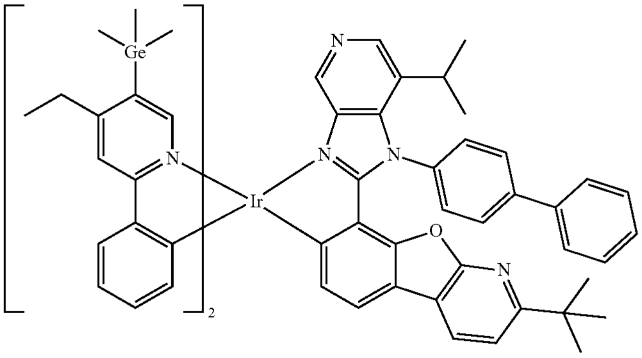

-continued
2145
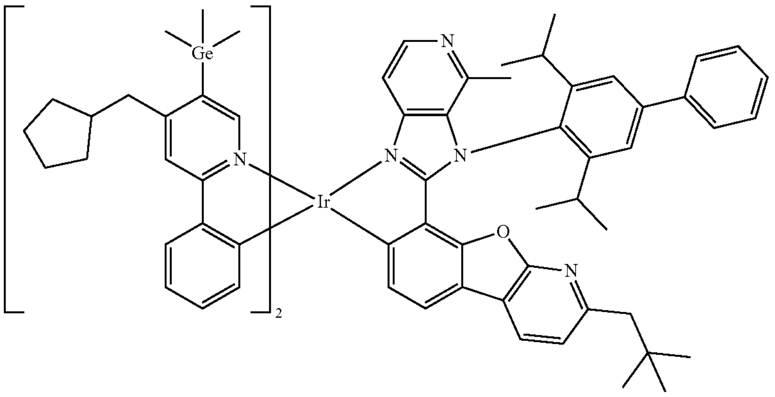
2146
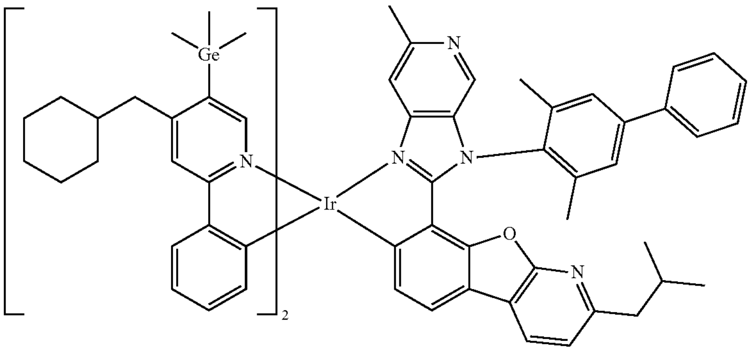
2147
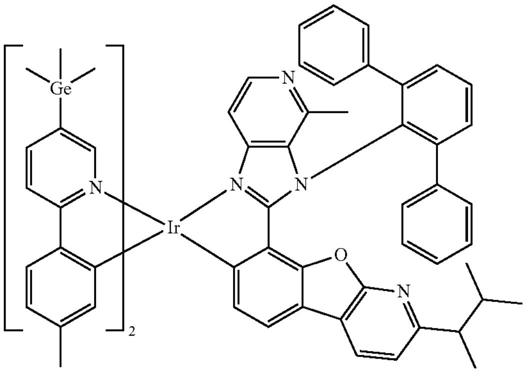
2148
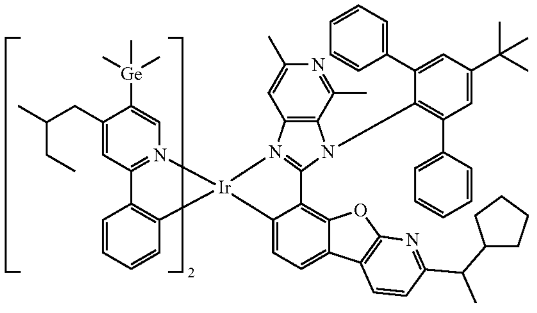
2149
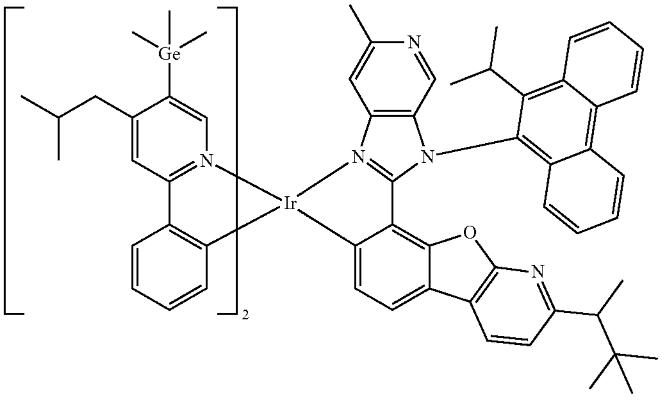

-continued
2150
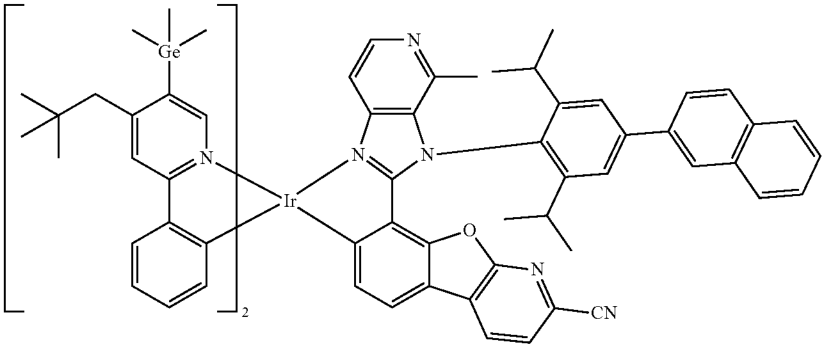
2151
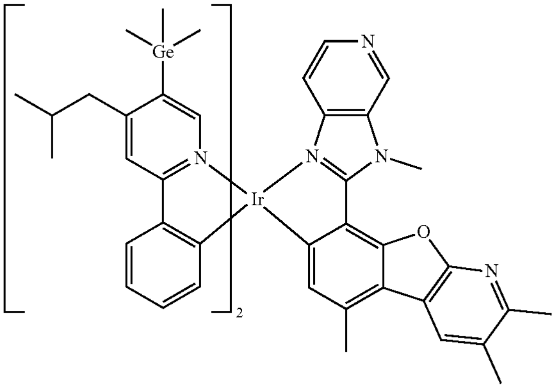
2152
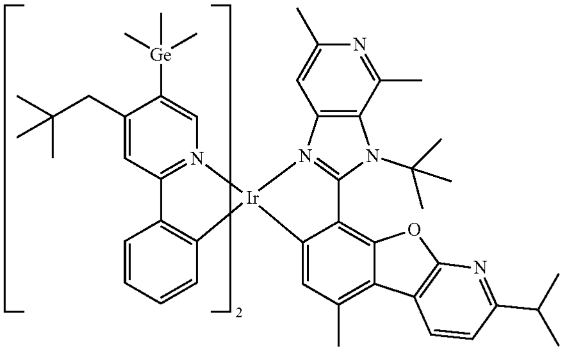
2153
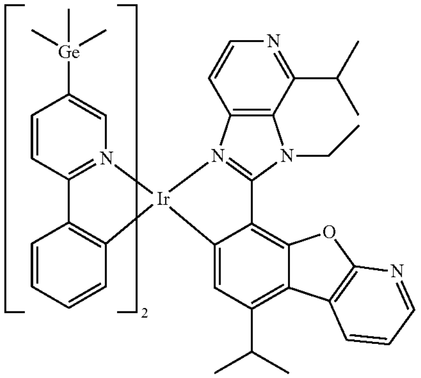
-continued
2154
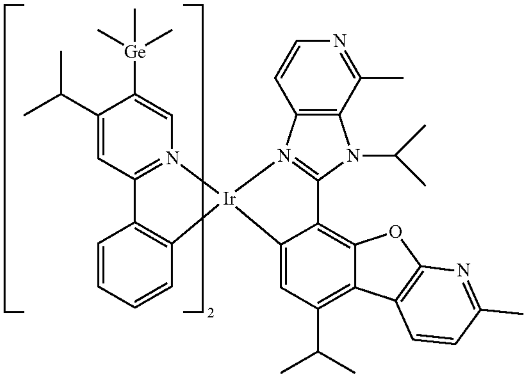
2155
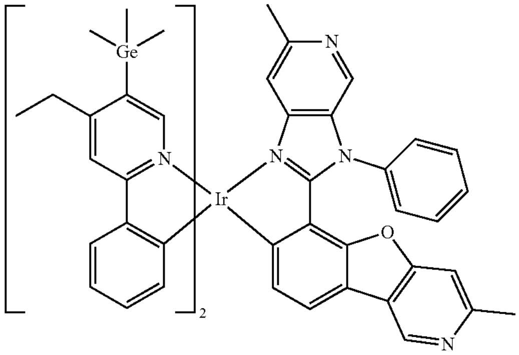
2156
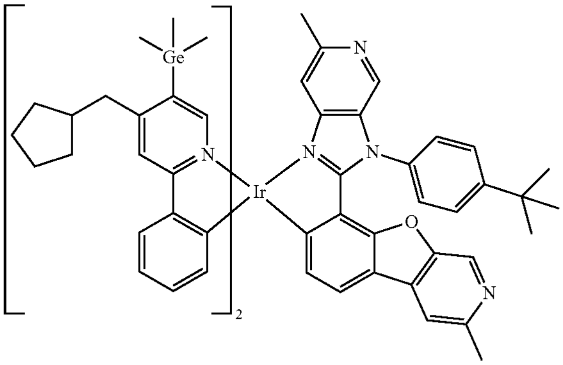

-continued
2157
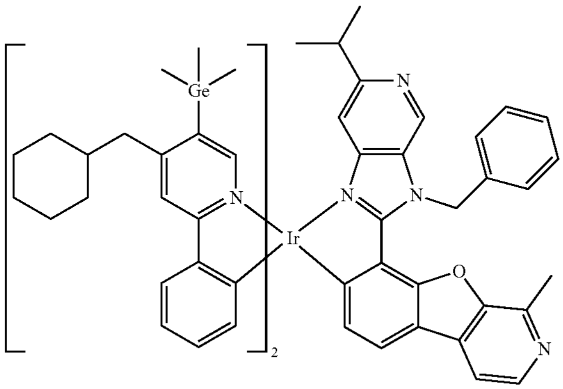
2158
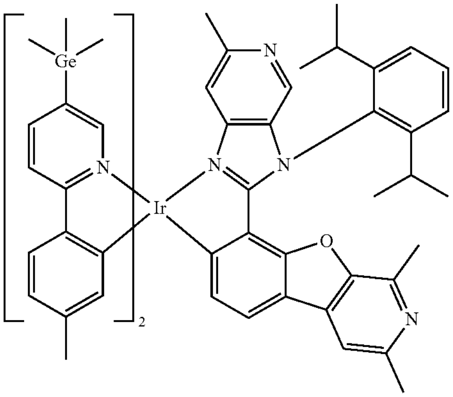
2159
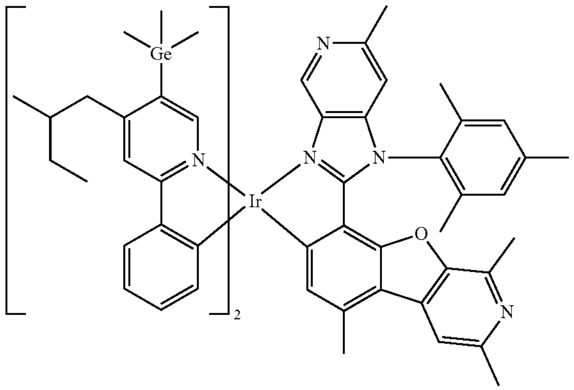
2160
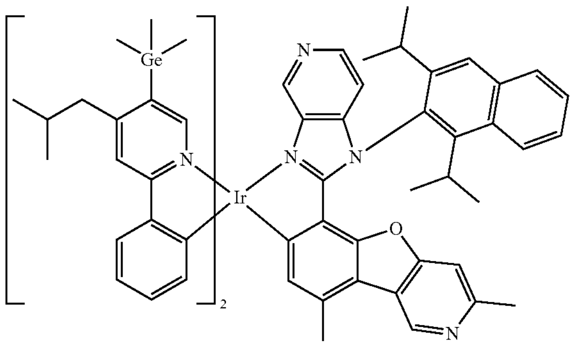
-continued
2161
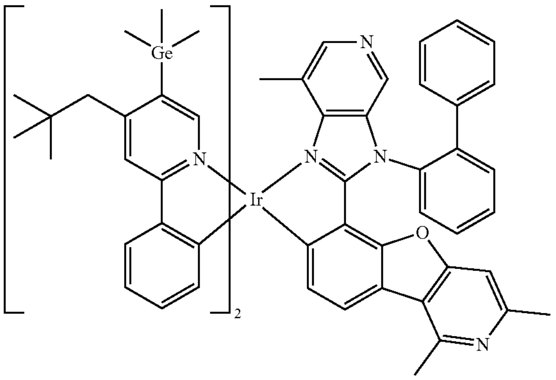
2162
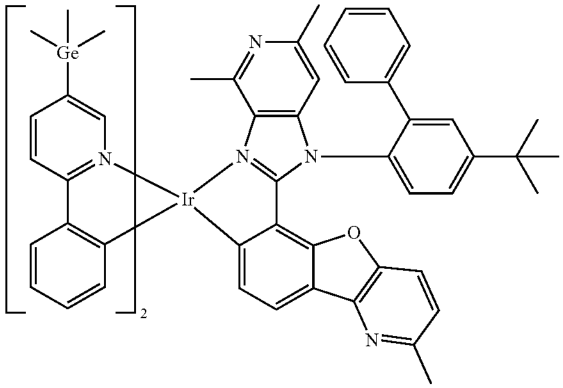
2163
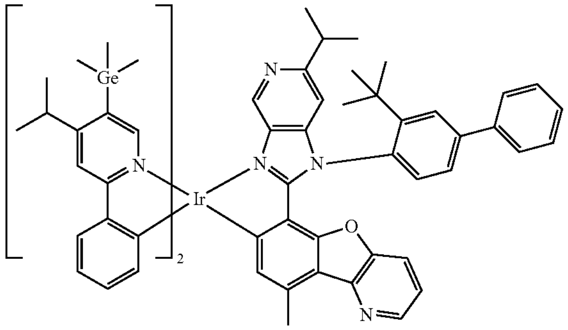
2164
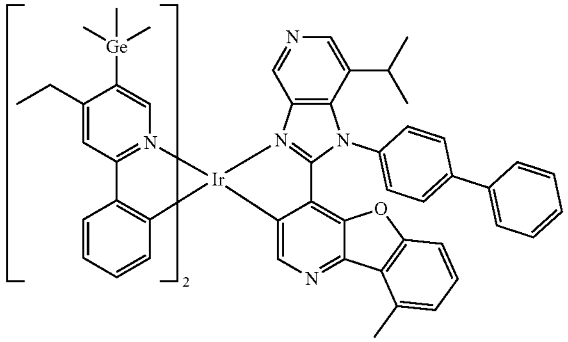

-continued
2165
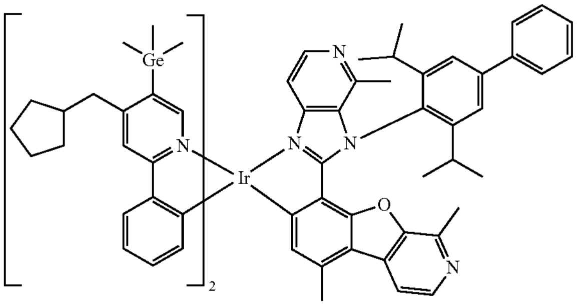
2166
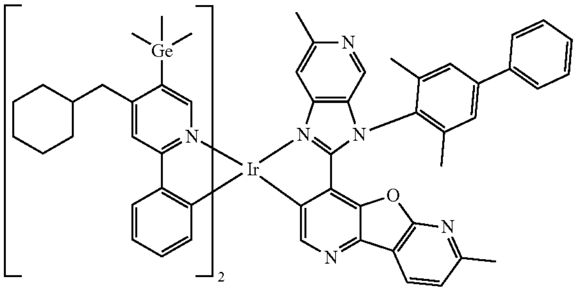
2167
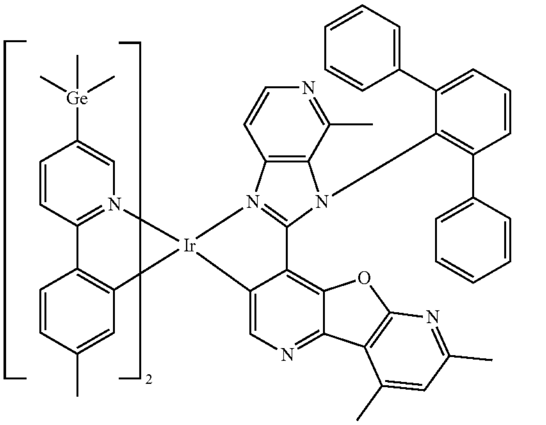
2168
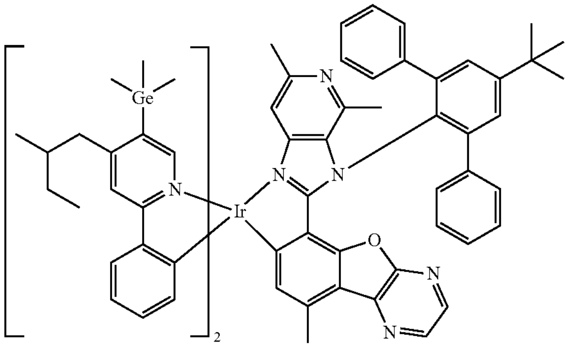
-continued
2169
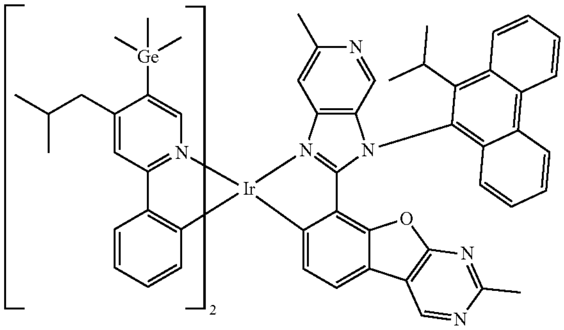
2170
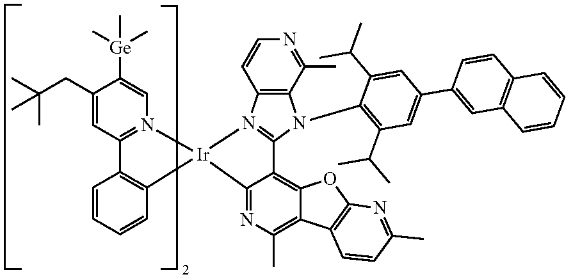
2171
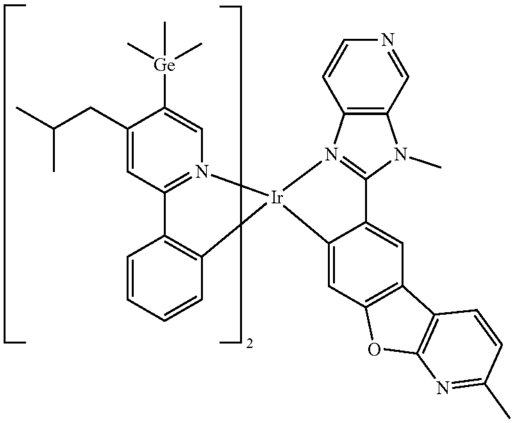
2172
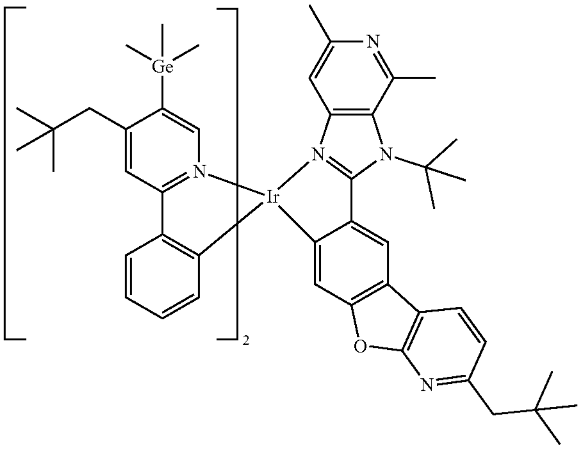

-continued
2173
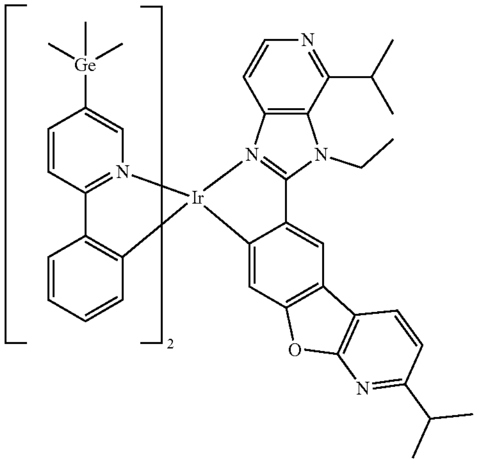
2174
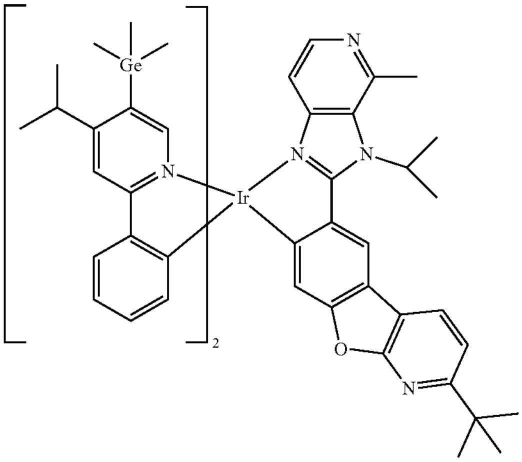
2175
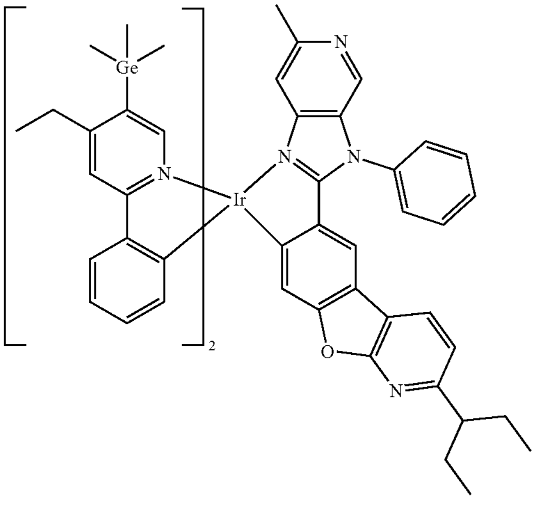
-continued
2176
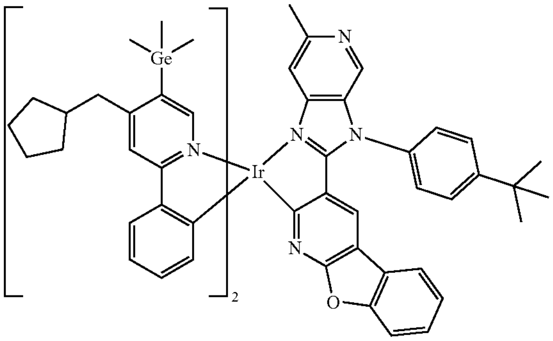
2177
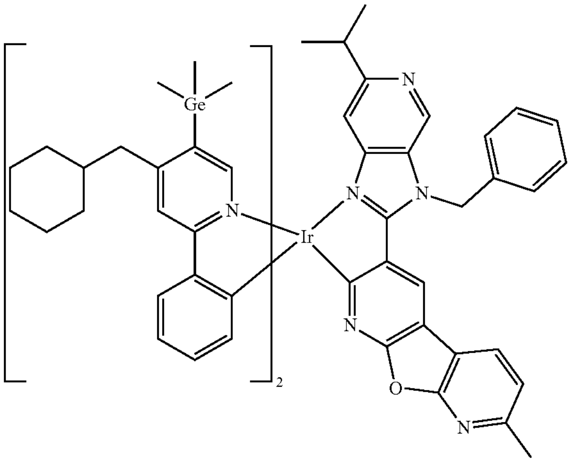
2178
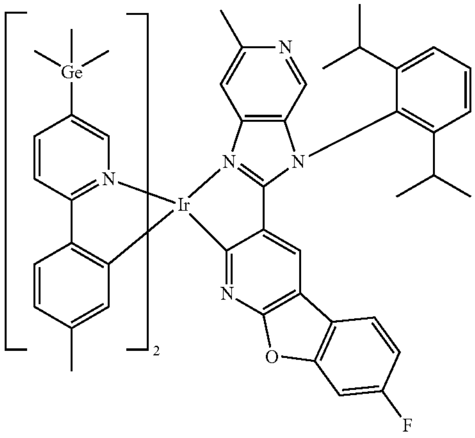

-continued
2179
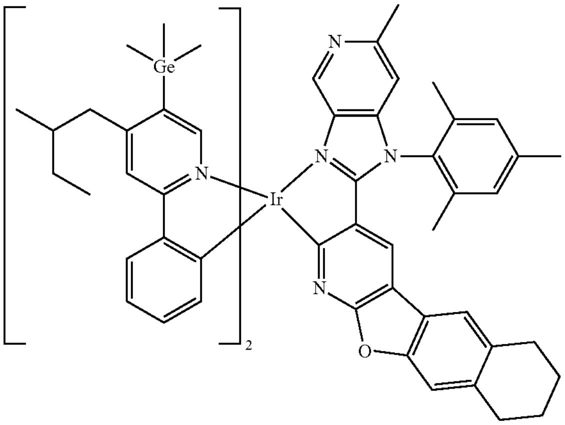
2180
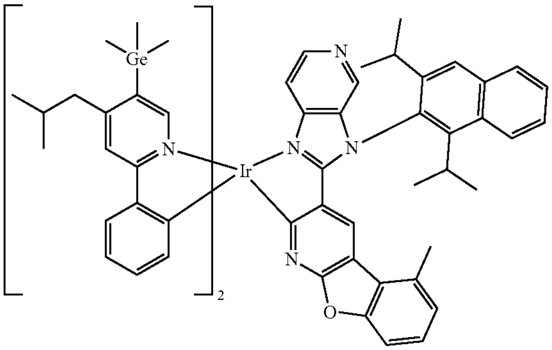
2181
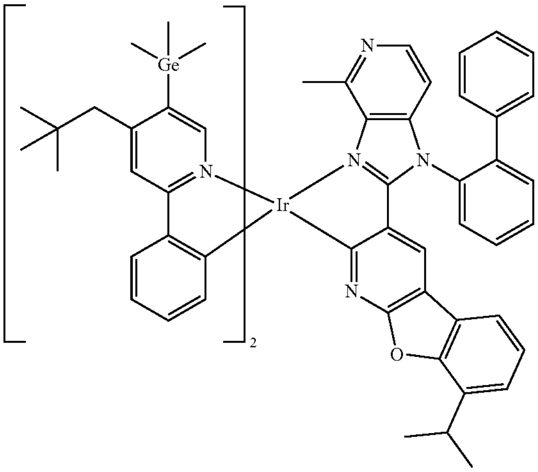
-continued
2182
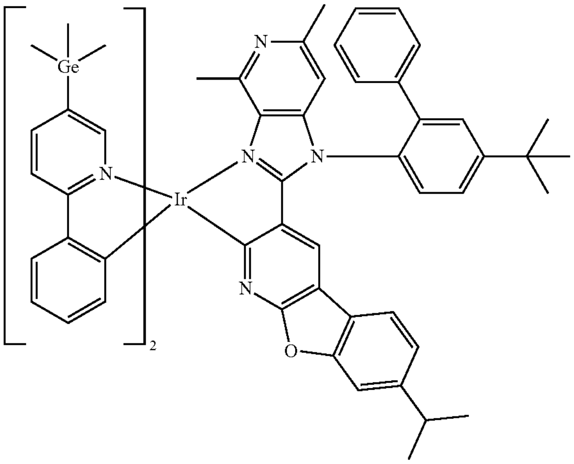
2183
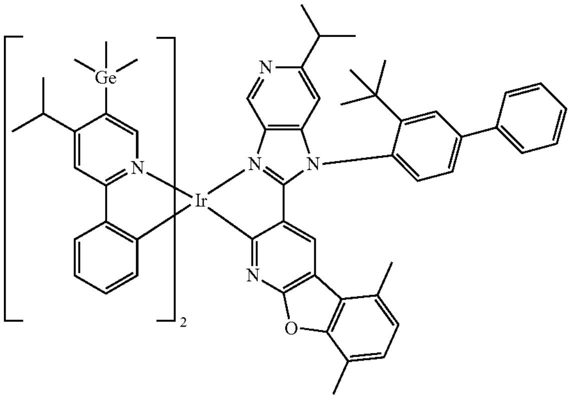
2184
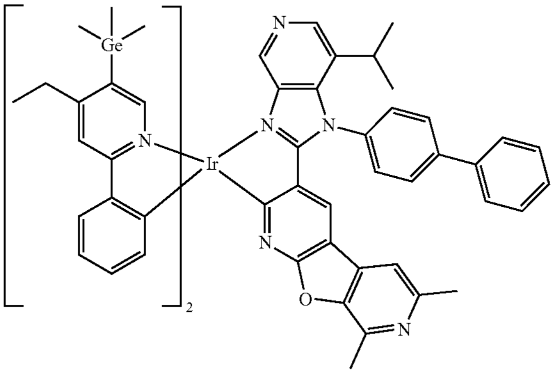

-continued
2185
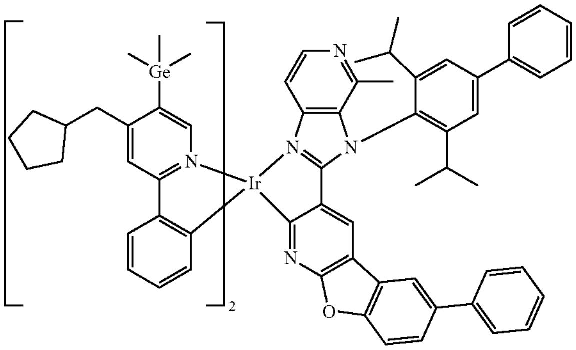
2186
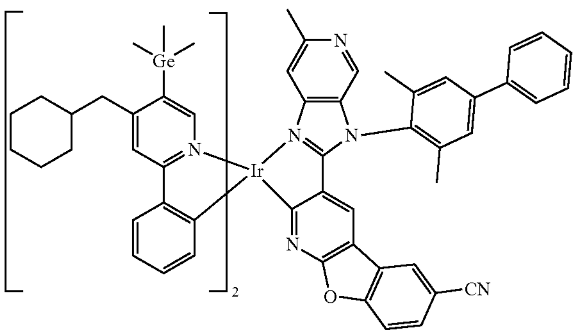
2187
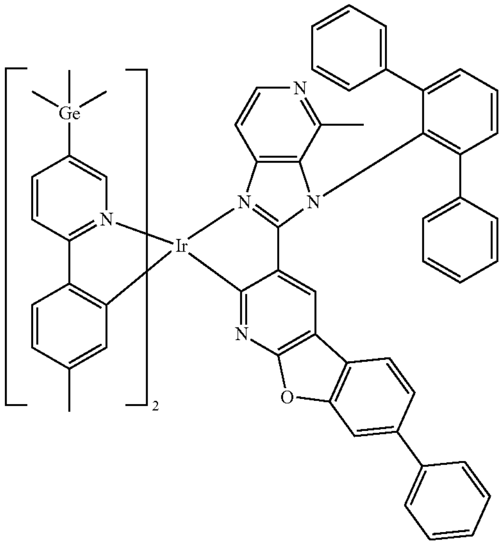
-continued
2188
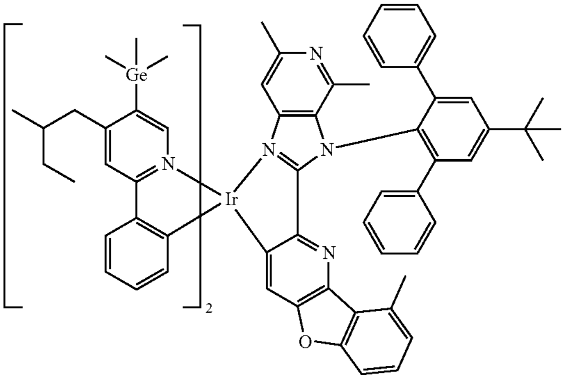
2189
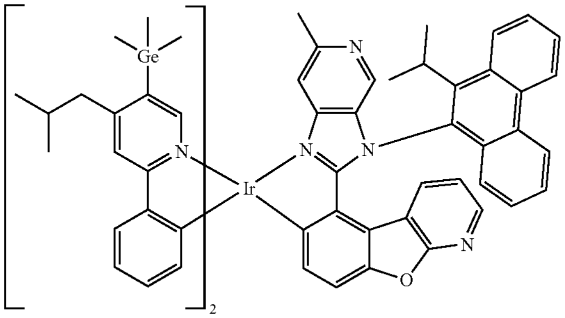
2190
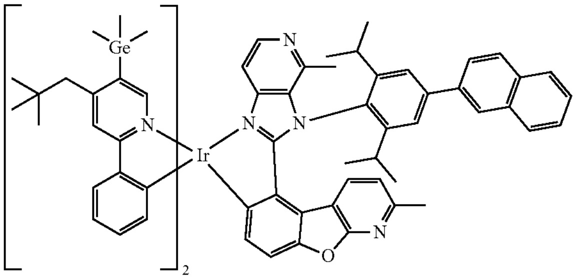
2191
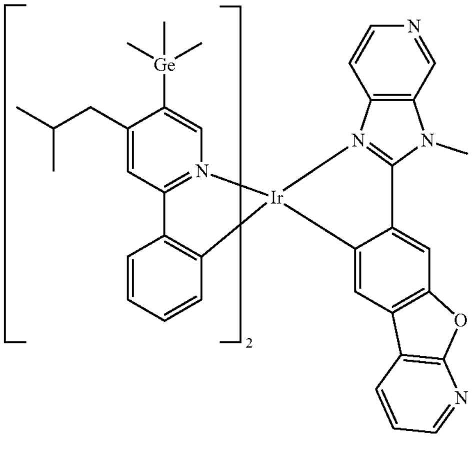

-continued
2192
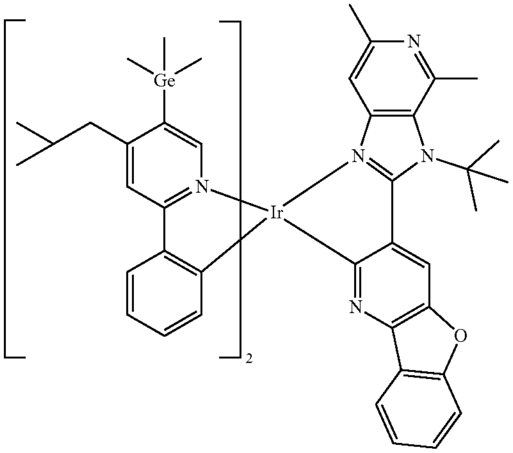
2193
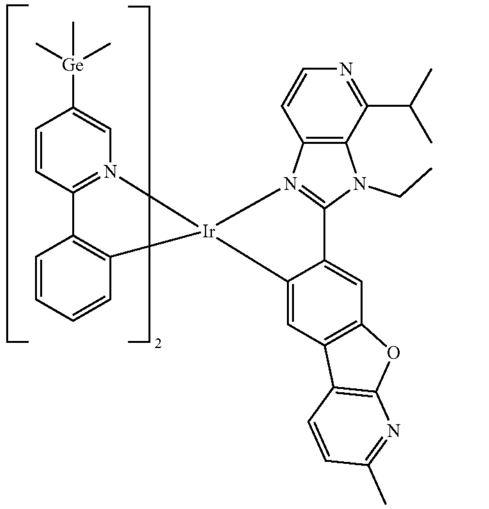
2194
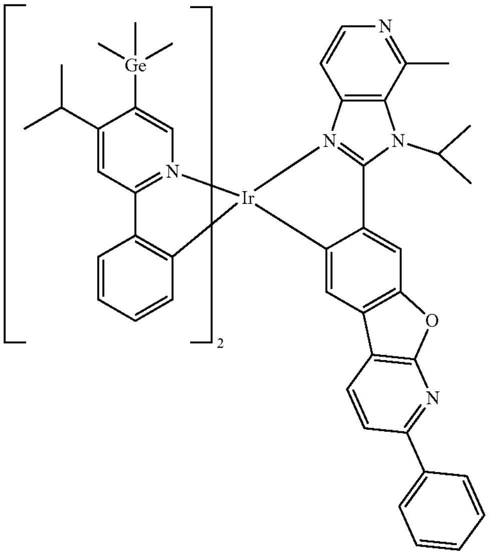
-continued
2195
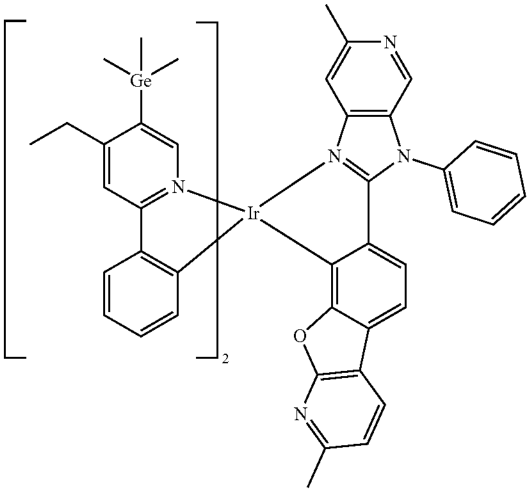
2196
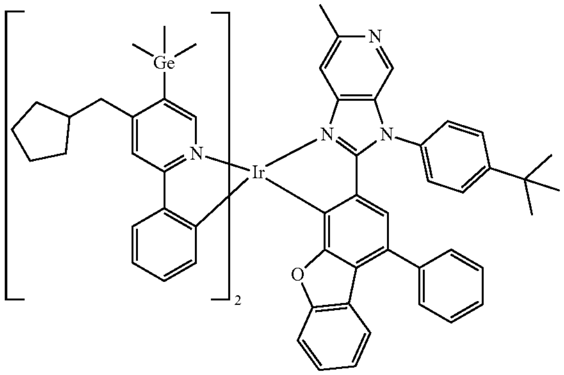
2197
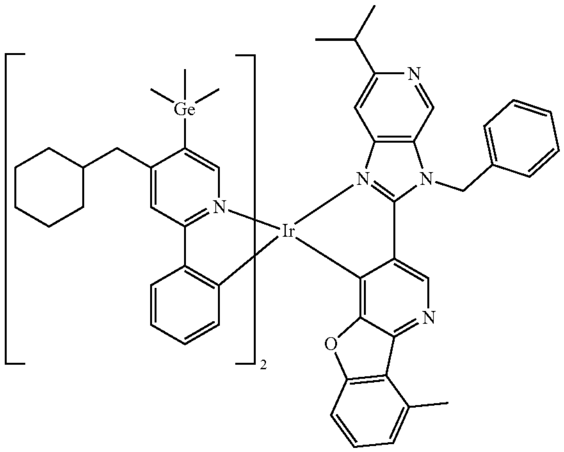

-continued
2198
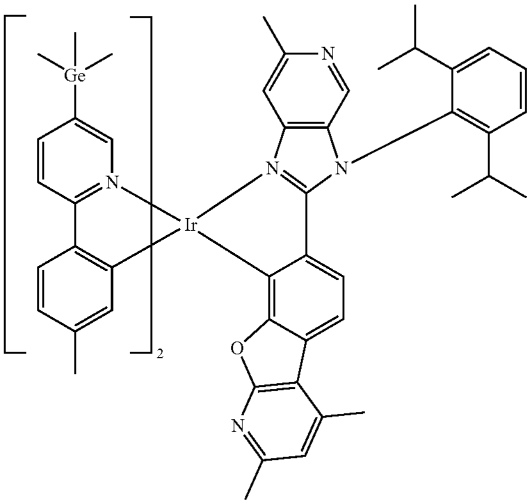
2199
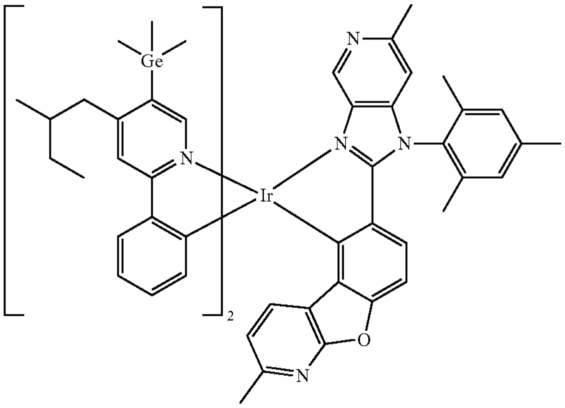
2200
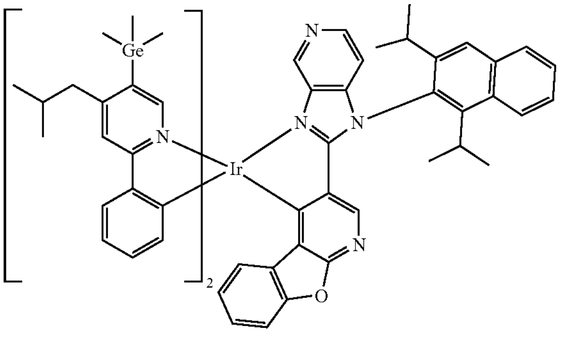
-continued
2201
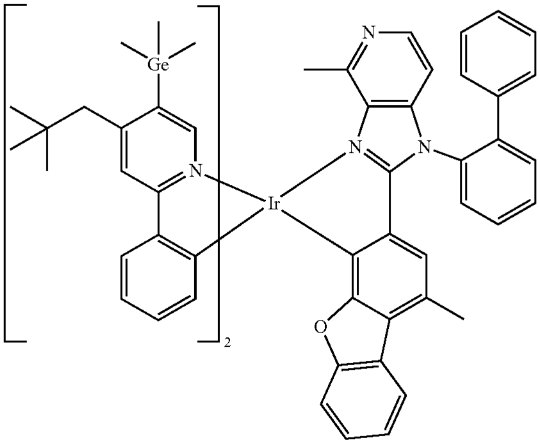
2202
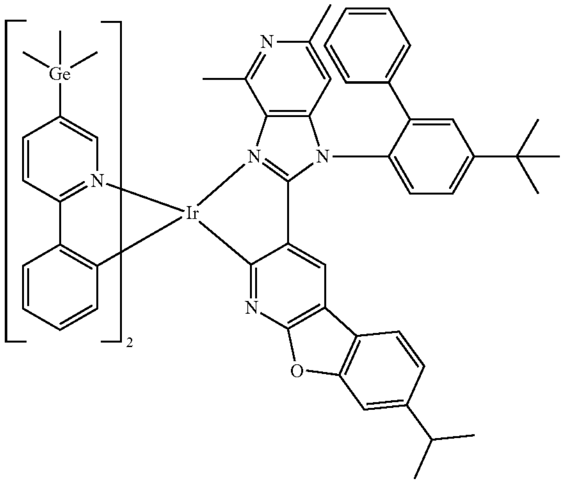
2203
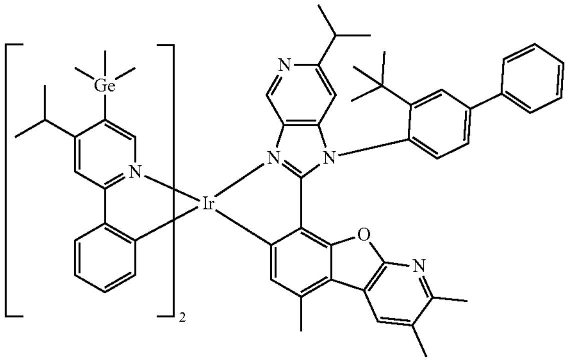

-continued
2204
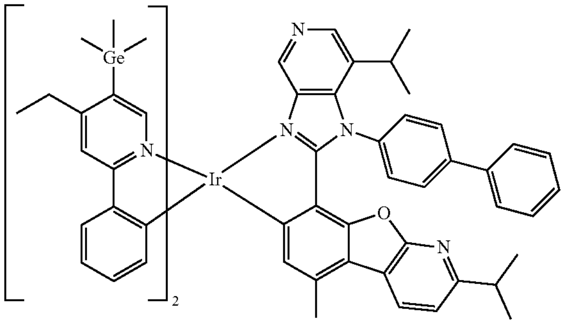
2205
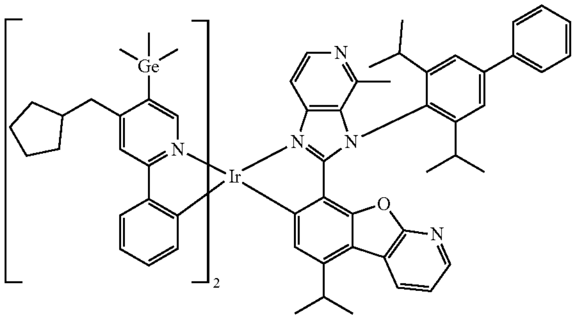
2206
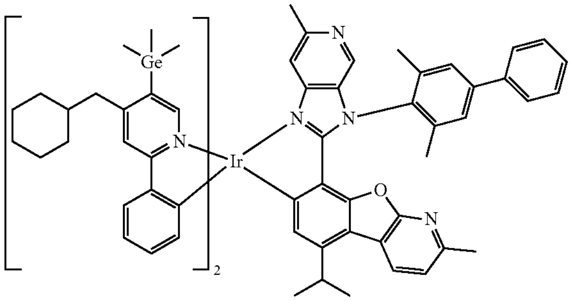
2207
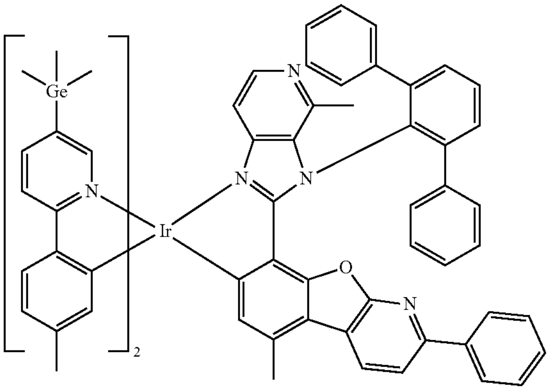
-continued
2208
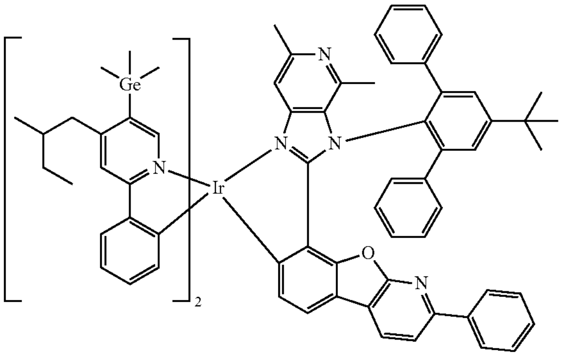
2209
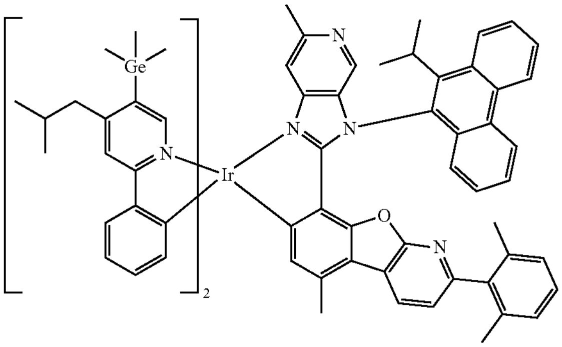
2210
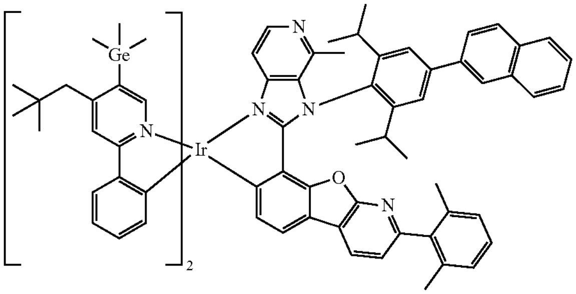
2211
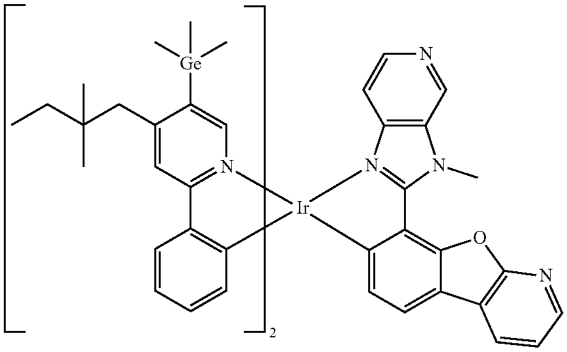

-continued
2212
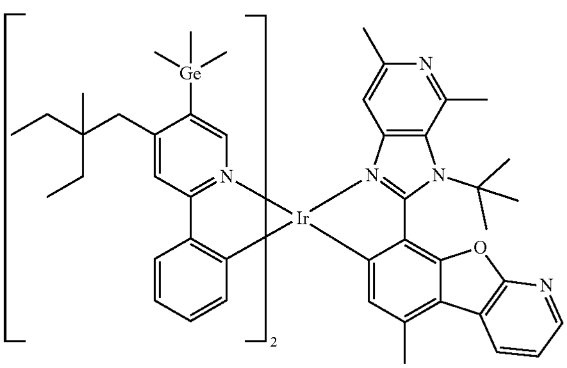
2213
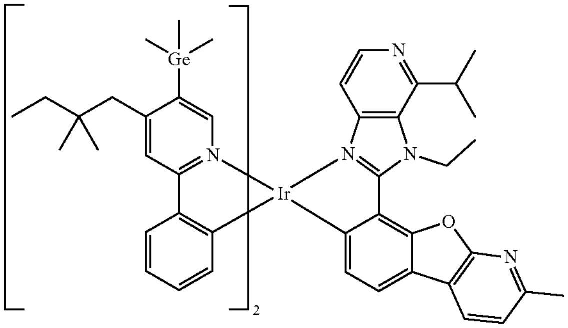
2214
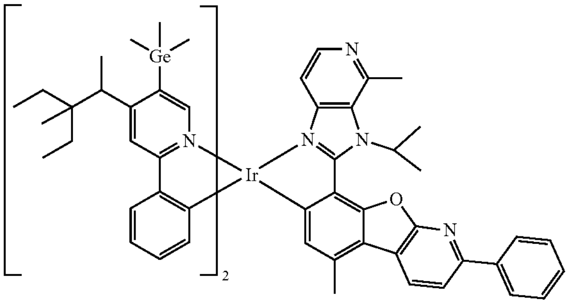
2215
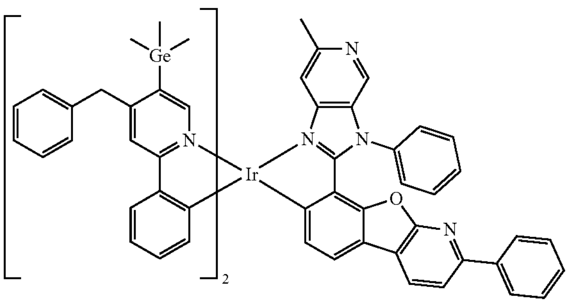
-continued
2216
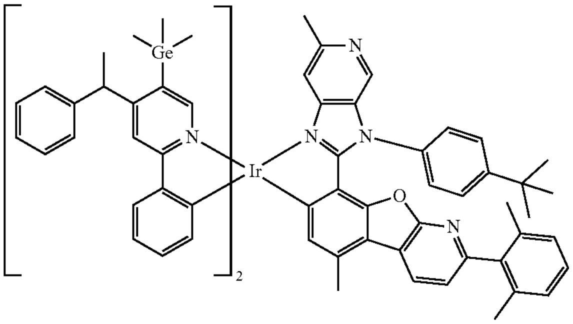
2217
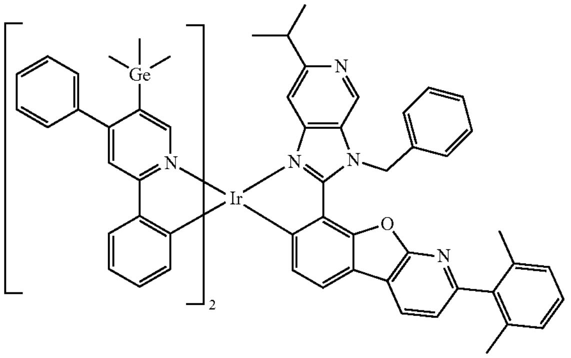
2218
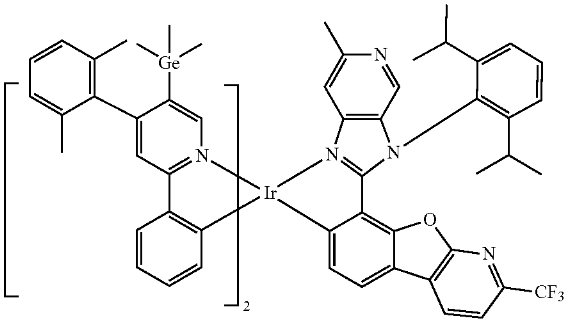
2219
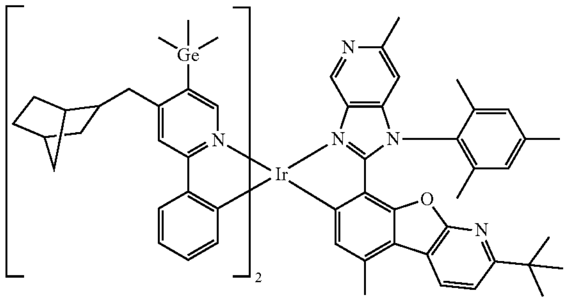

-continued
2220
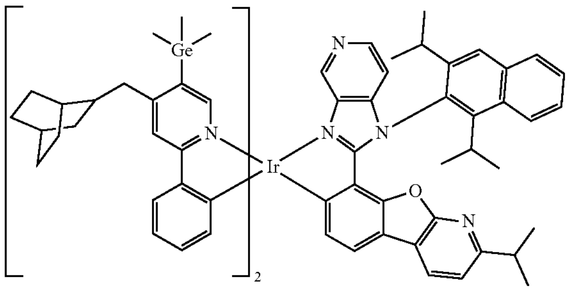
2221
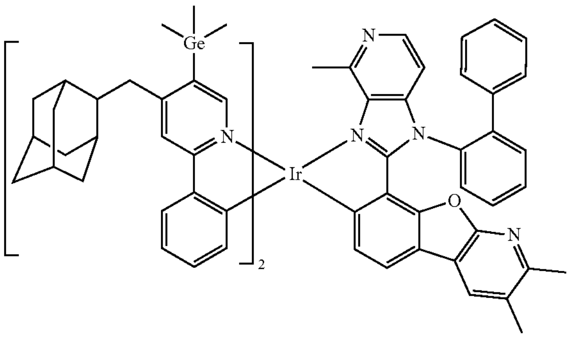
2222
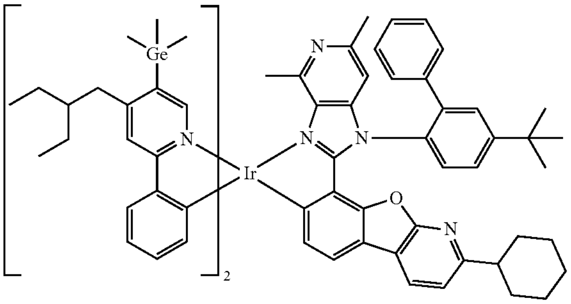
2223
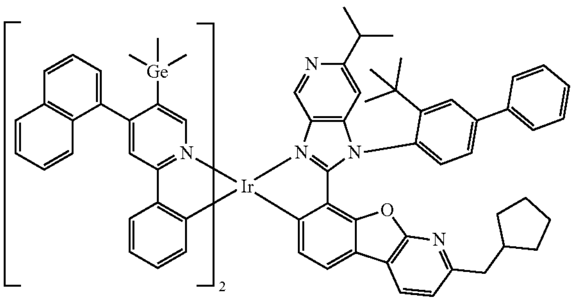
2224
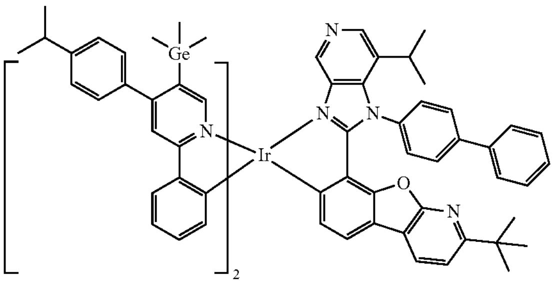
-continued
2225
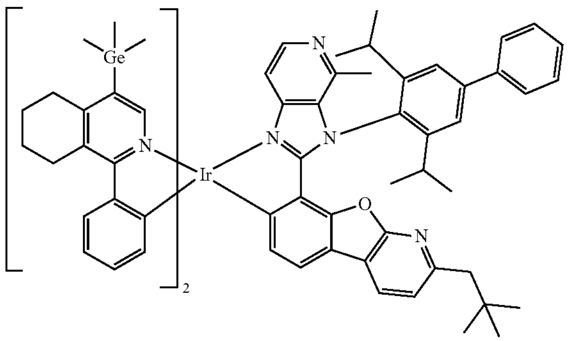
2226
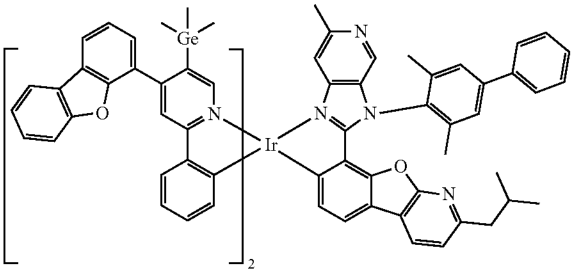
2227
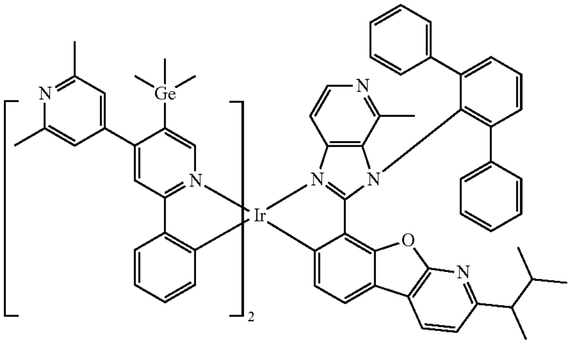
2228
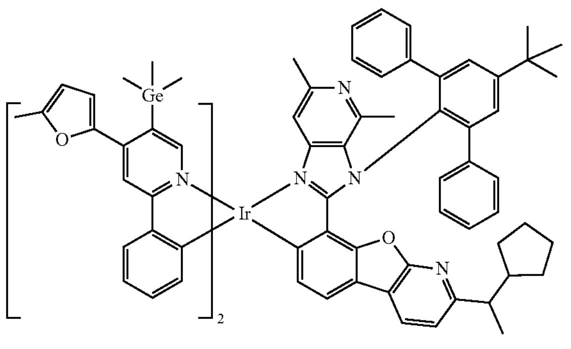

-continued
2229
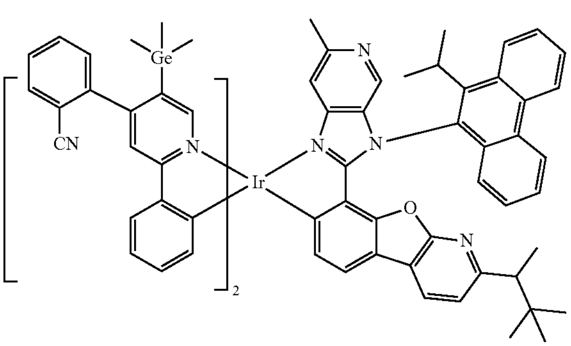
2230
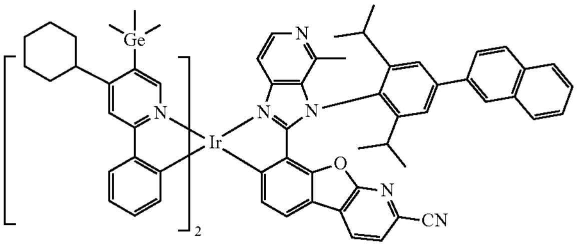
2231
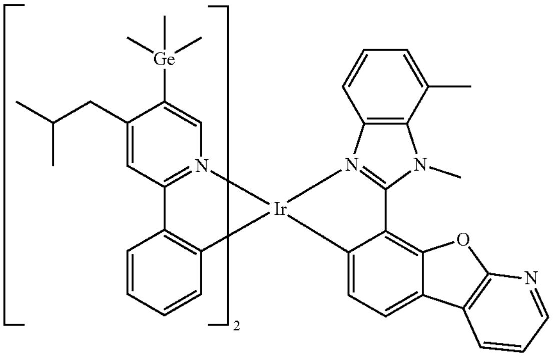
2232
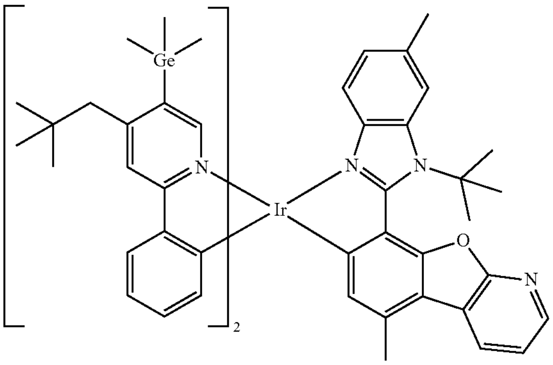
-continued
2233
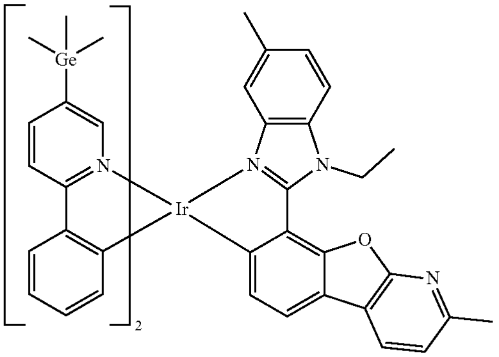
2234
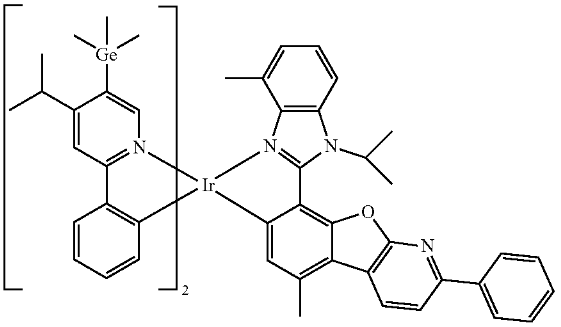
2235
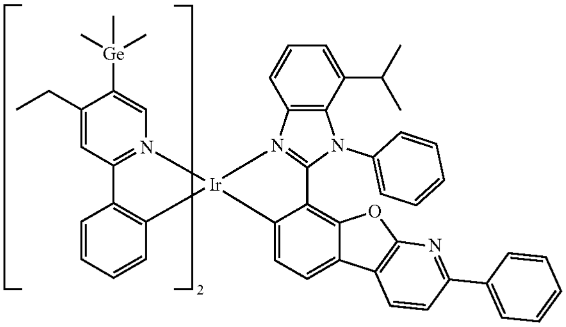
2236
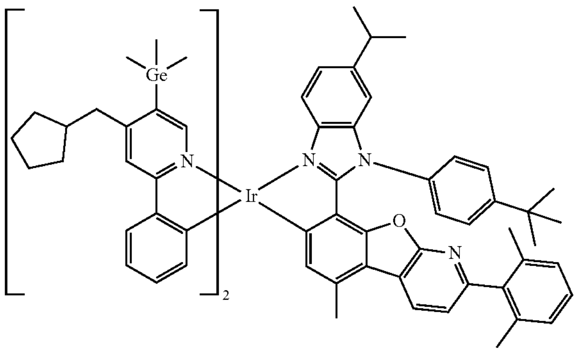

-continued
2237
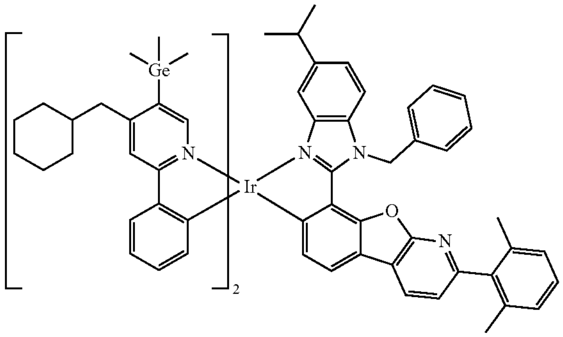
2238
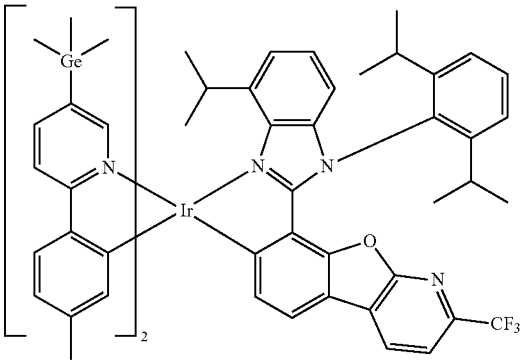
2239
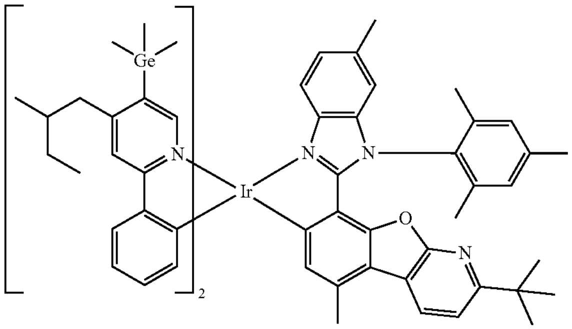
2240
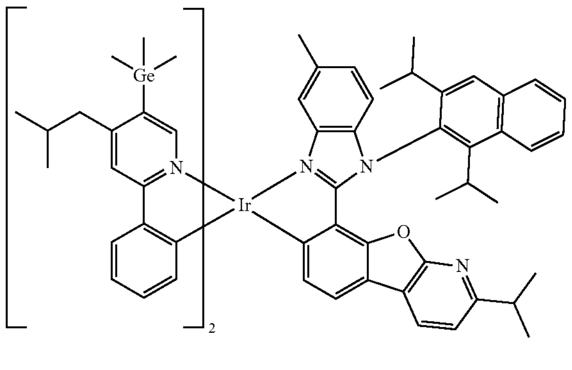
-continued
2241
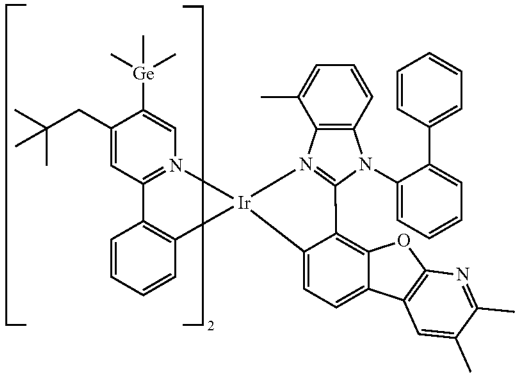
2242
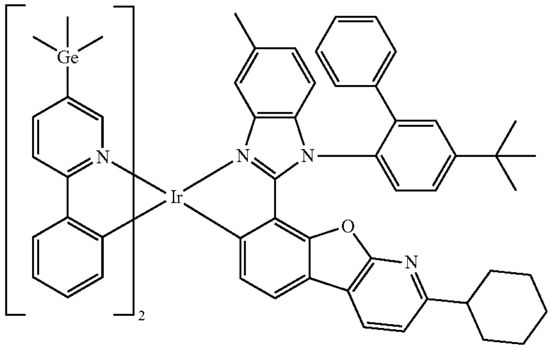
2243
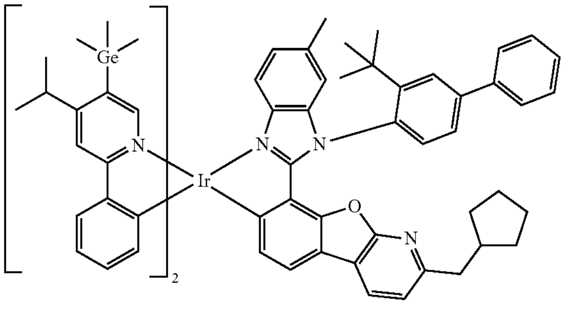
2244
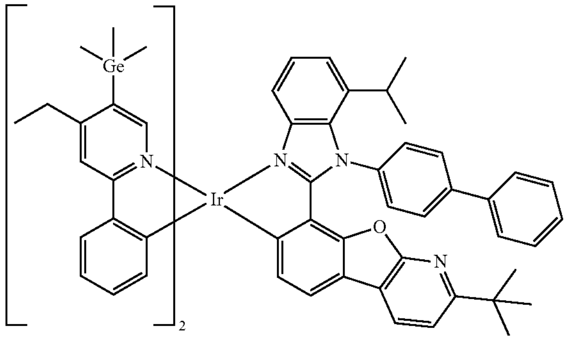

-continued
2245
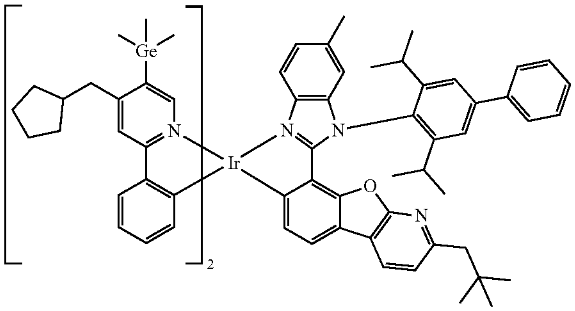
2246
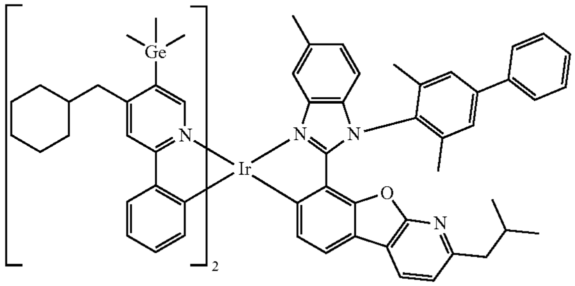
2247
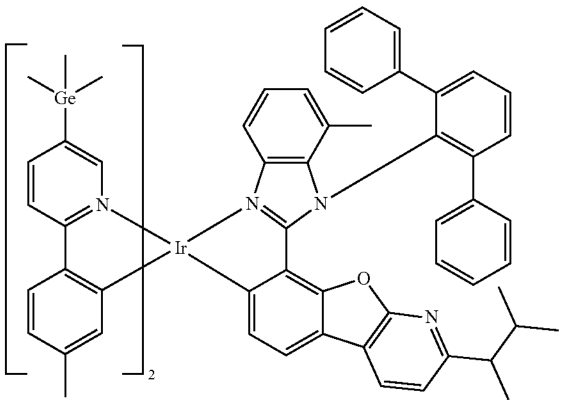
2248
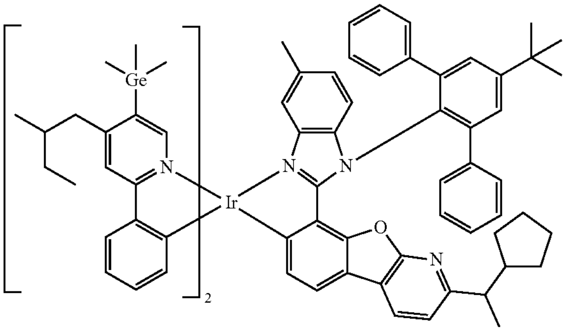
-continued
2249
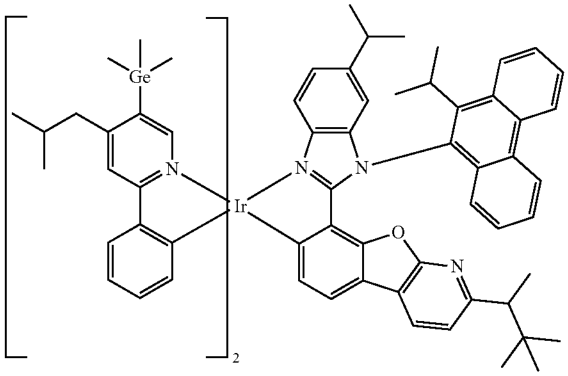
2250
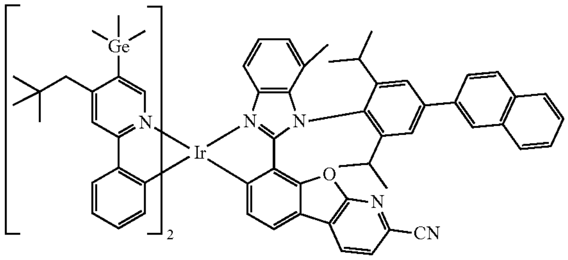
2251
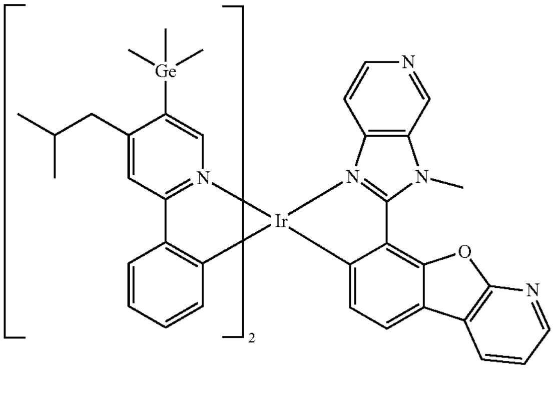
2252
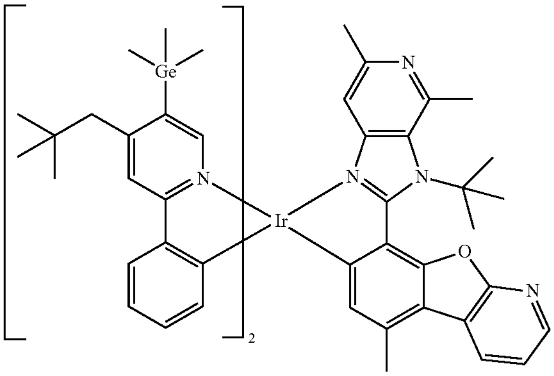

-continued
2253
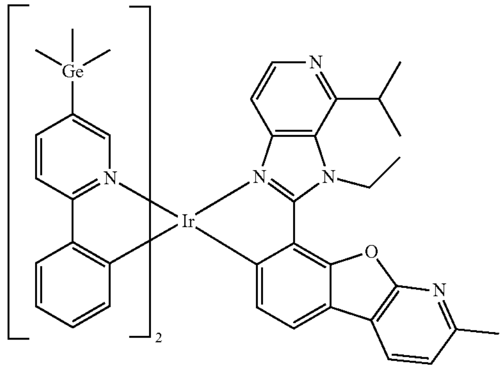
2254
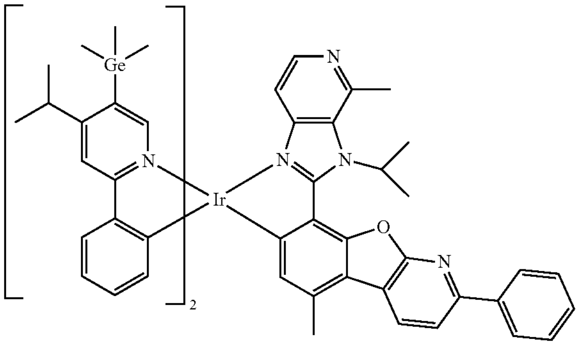
2255
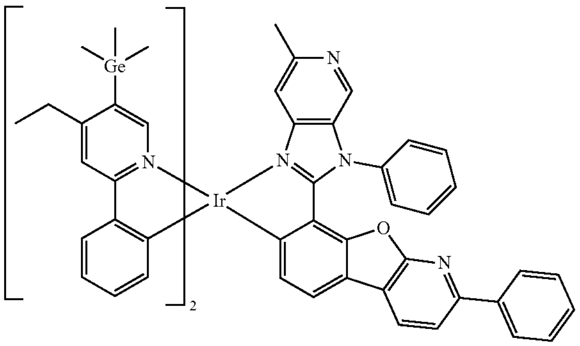
2256
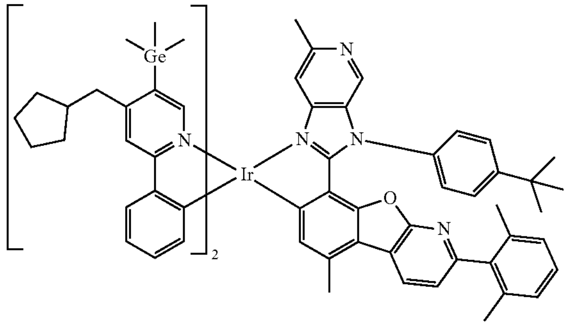
-continued
2257
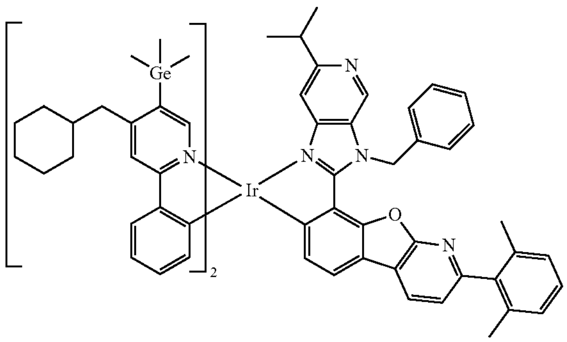
2258
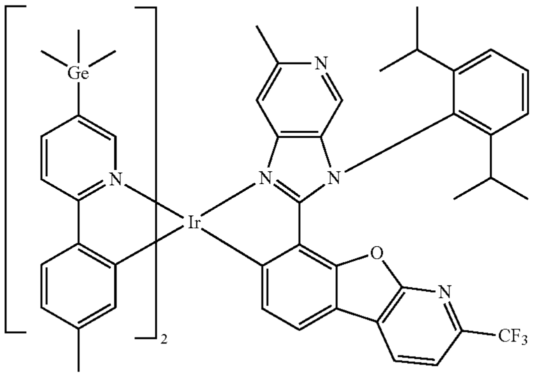
2259
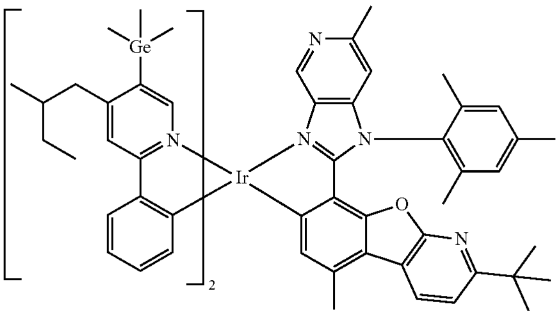
2260
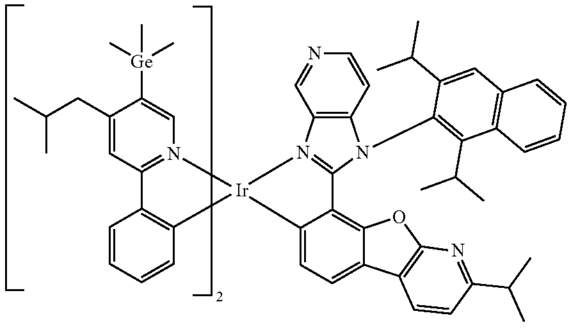

-continued
2261
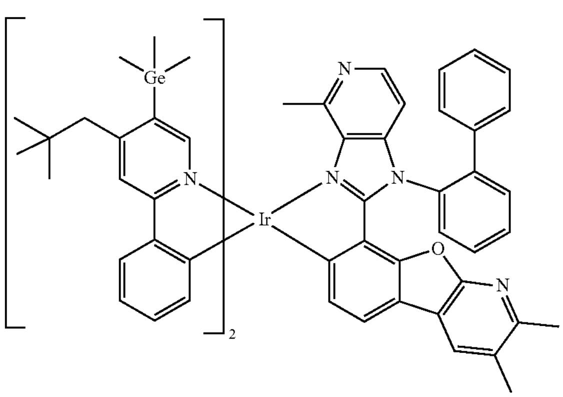
2262
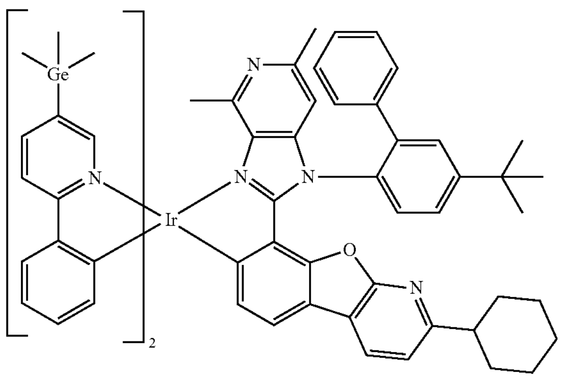
2263
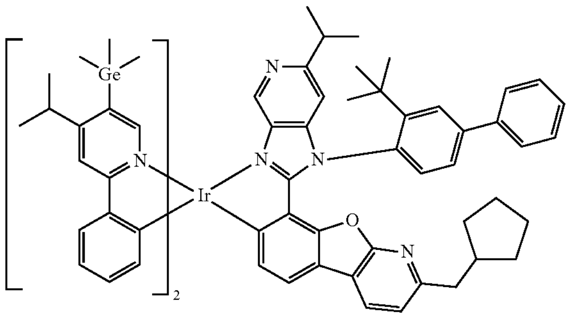
2264
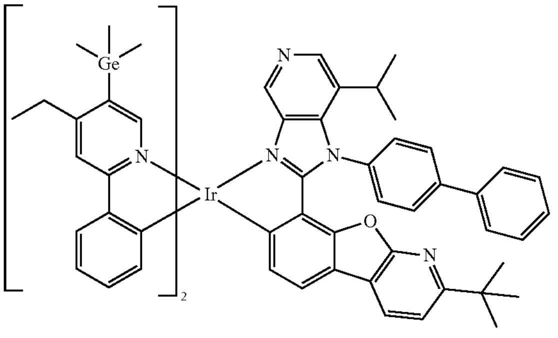
-continued
2265
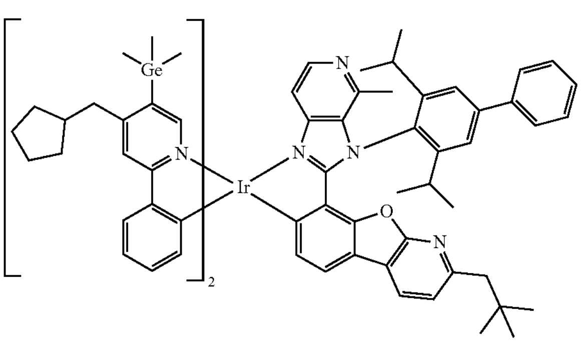
2266
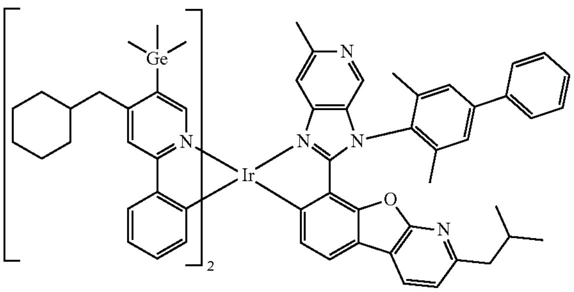
2267
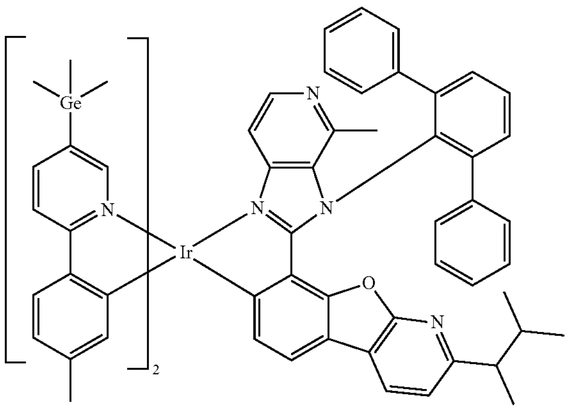
2268
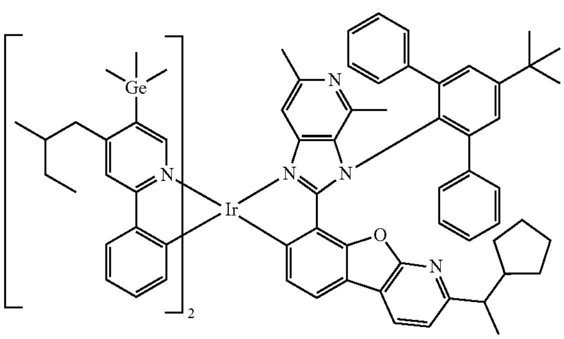

-continued
2269
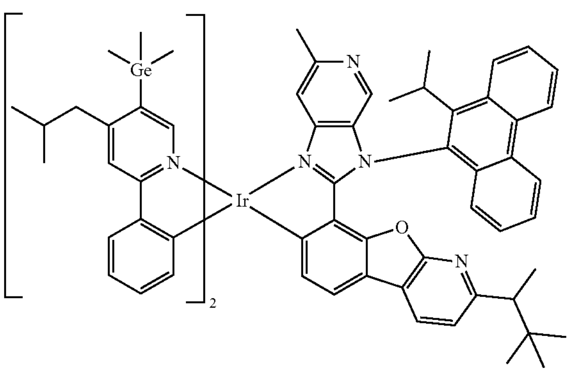
2270
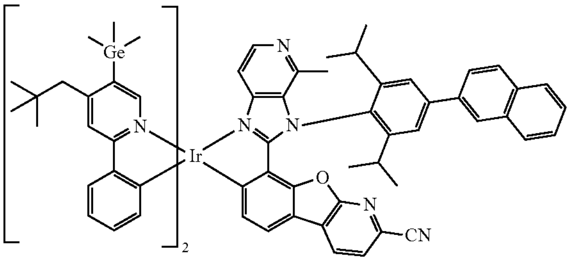
2271
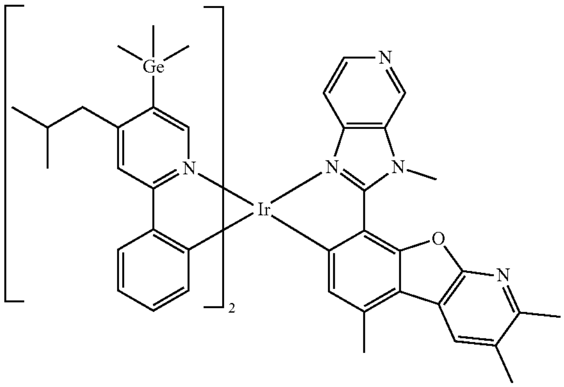
2272
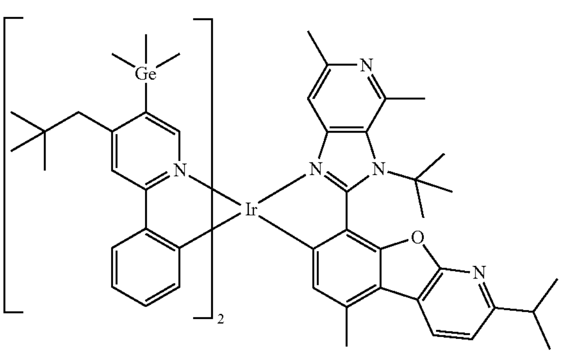
-continued
2273
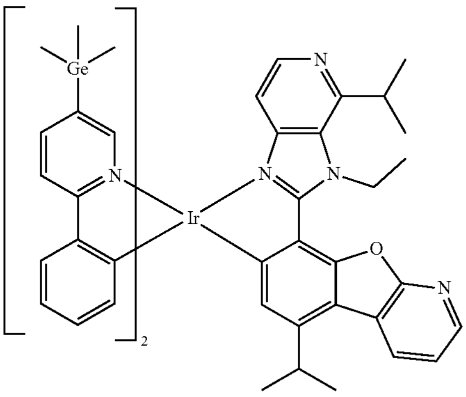
2274
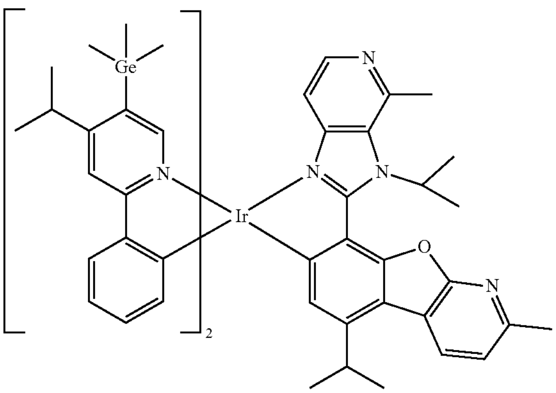
2275
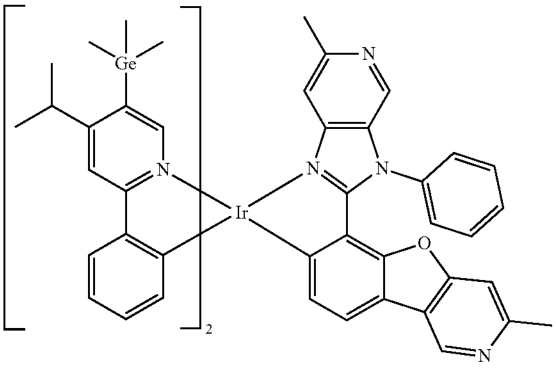
2276
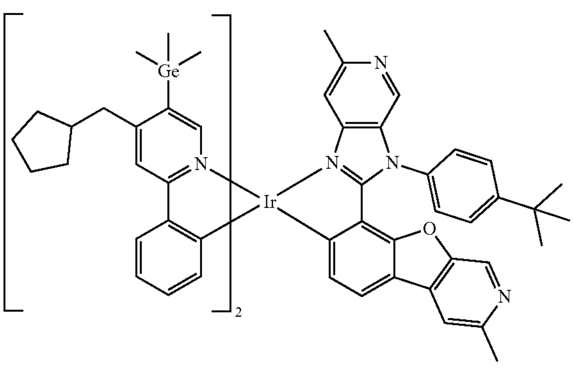

2277
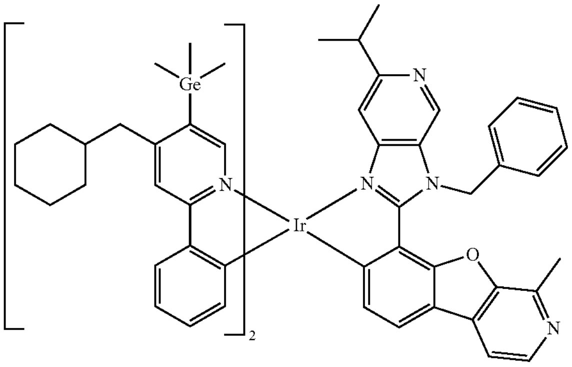
2278
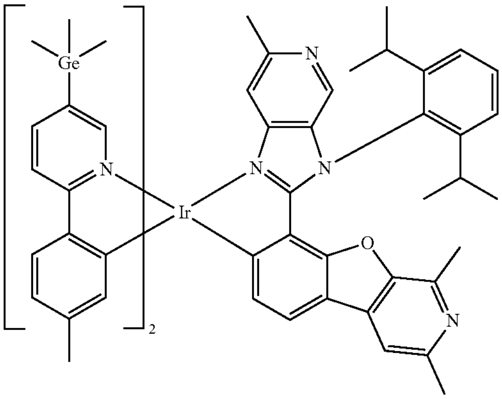
2279
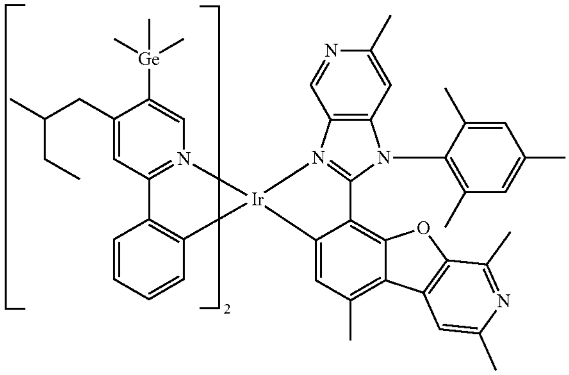
2280
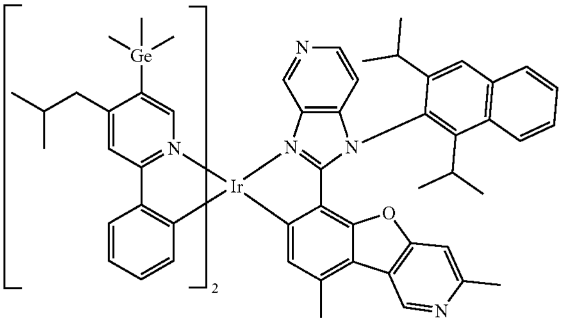
2281
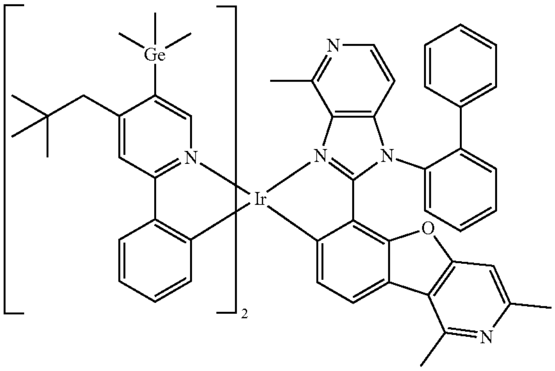
2282
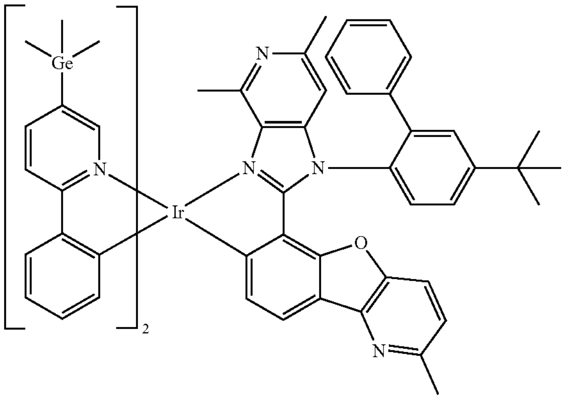
2283
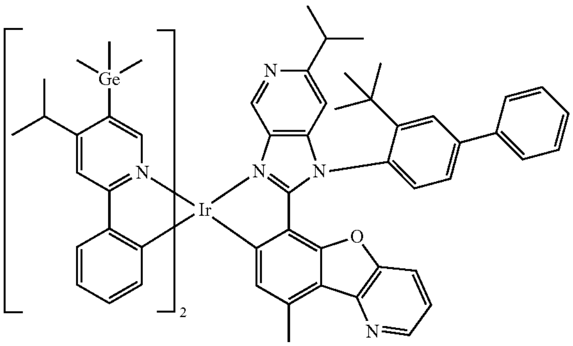
2284
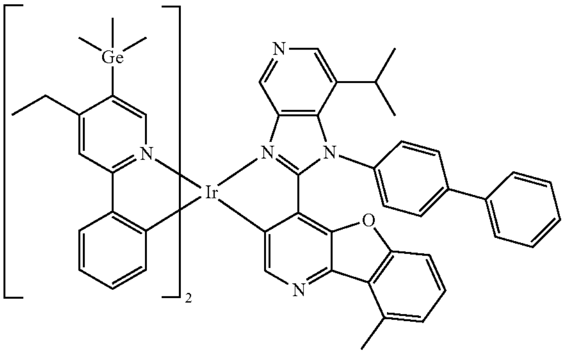

-continued
2285
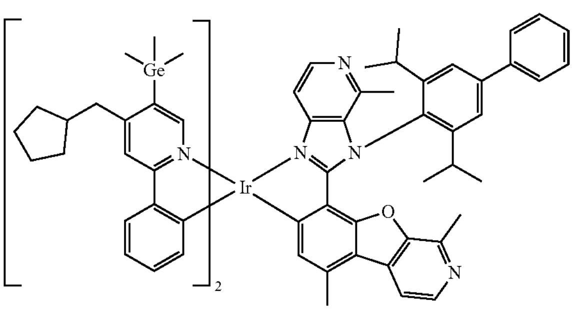
2286
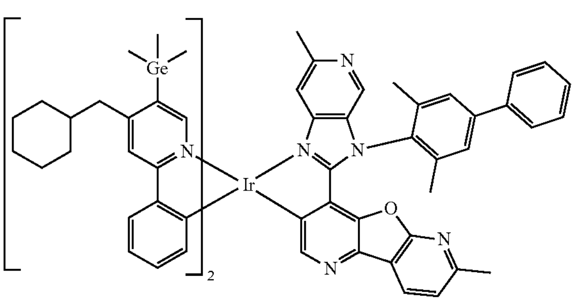
2287
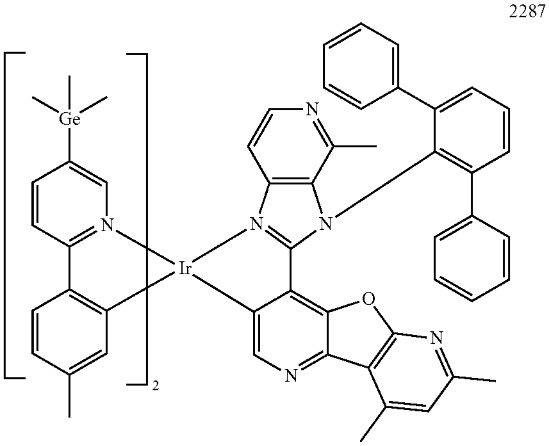
2288
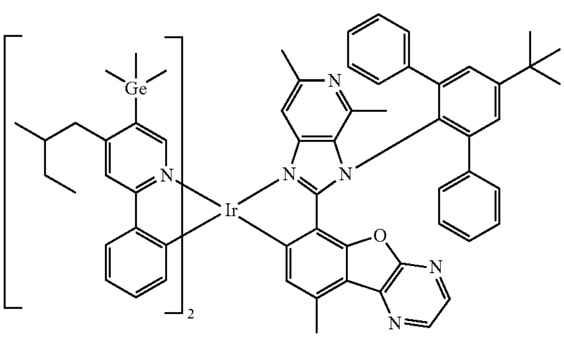
-continued
2289
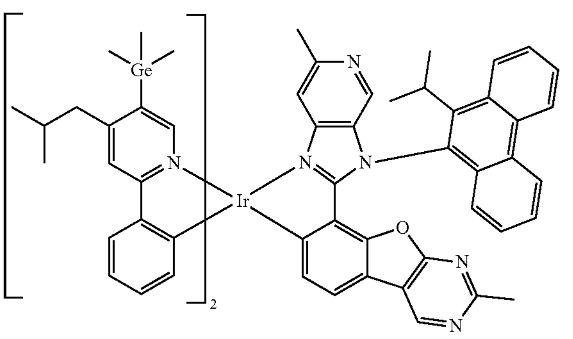
2290
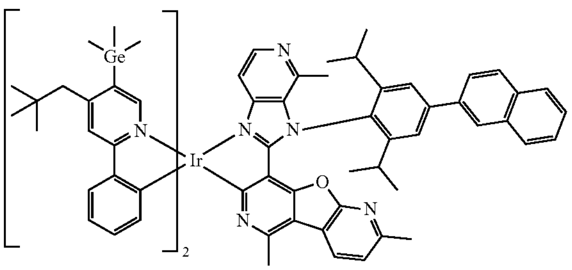
2291
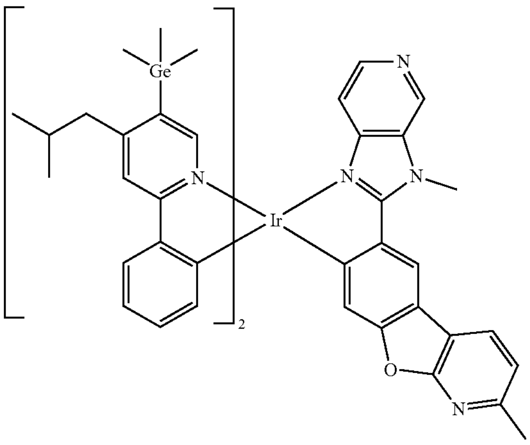
2292
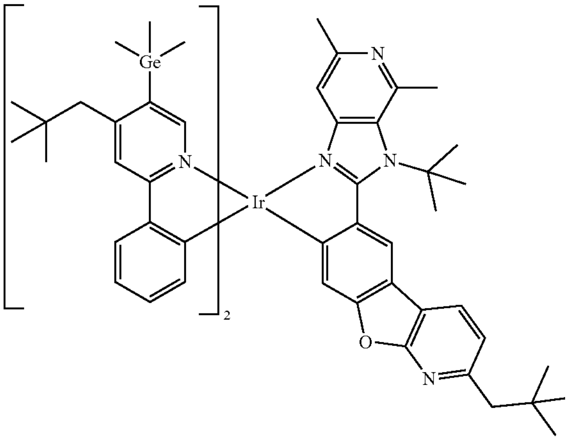

-continued
2293
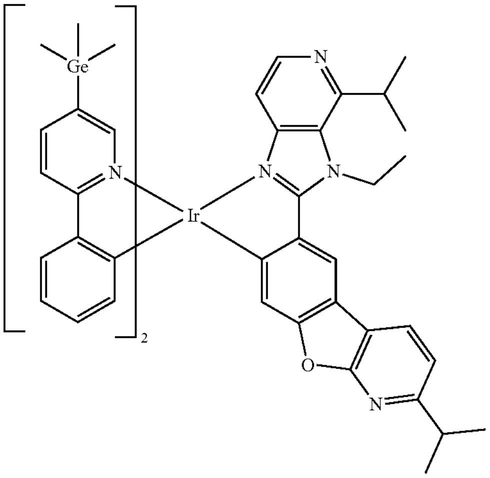
2294
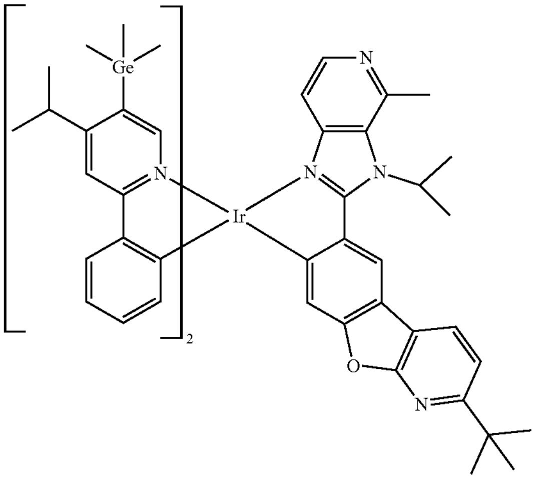
2295
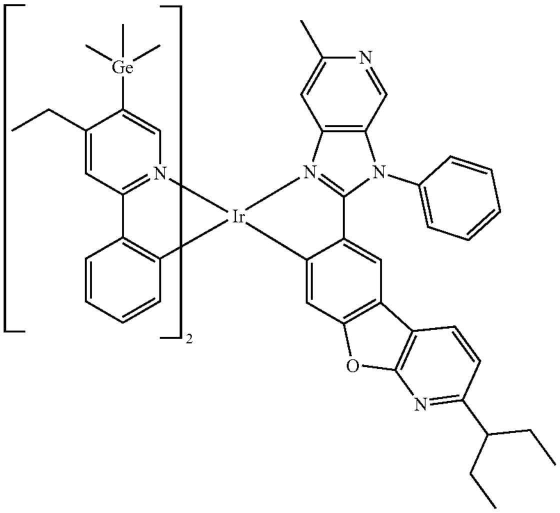
-continued
2296
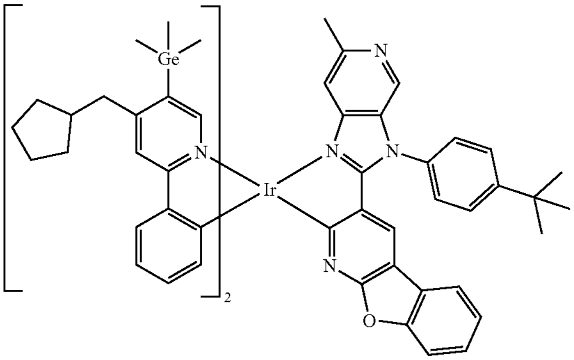
2297
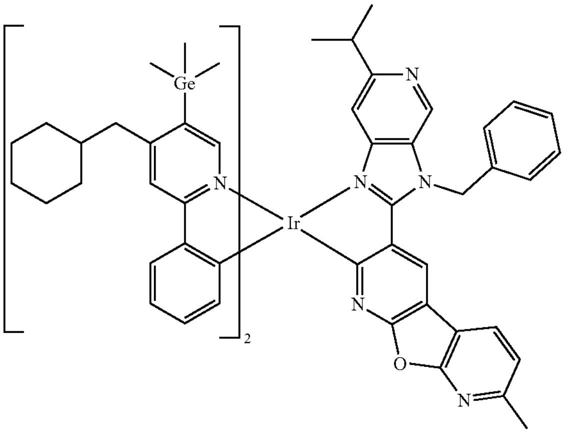
2298
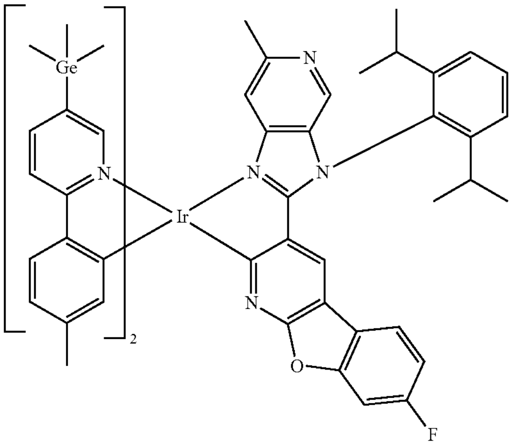

-continued
2299
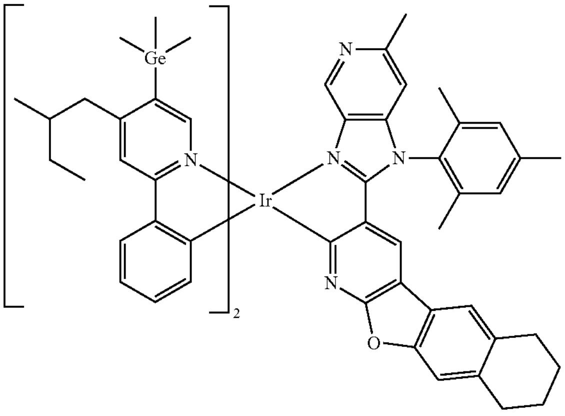
2300
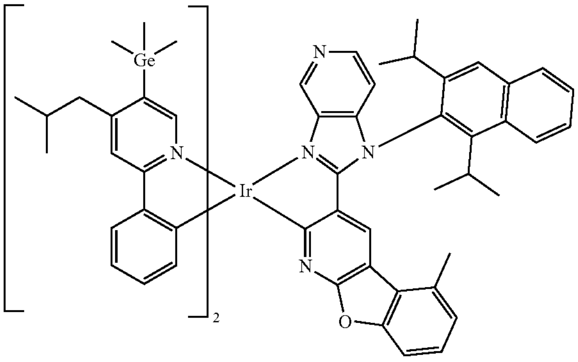
2301
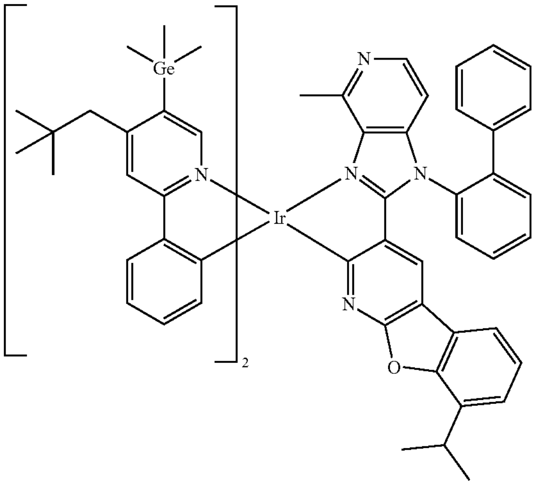
-continued
2302
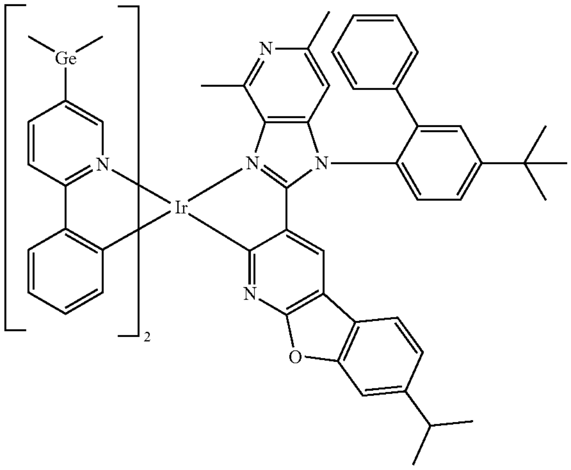
2303
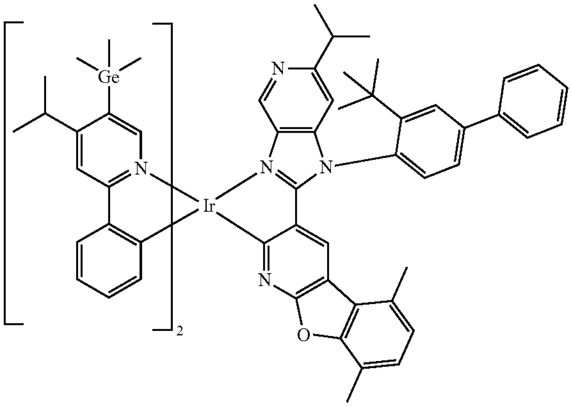
2304
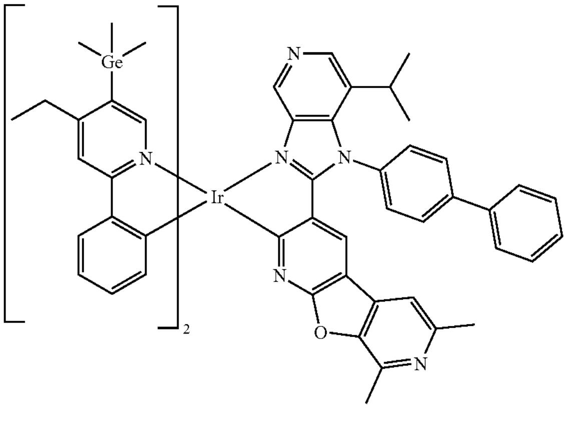

-continued
2305
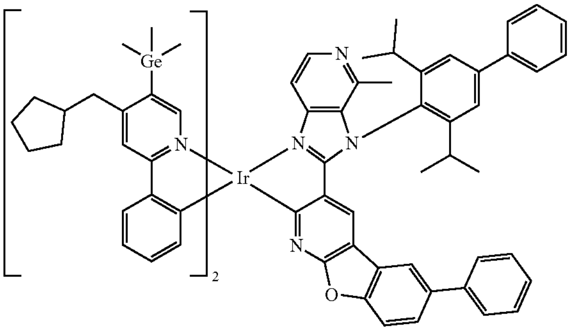
2306
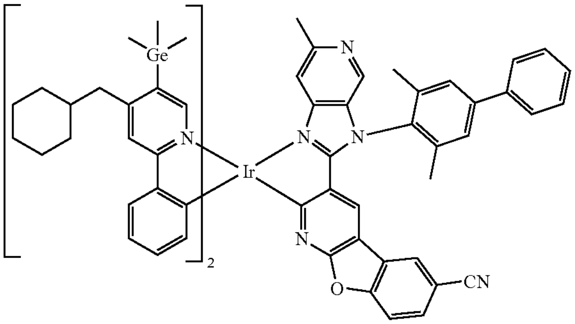
2307
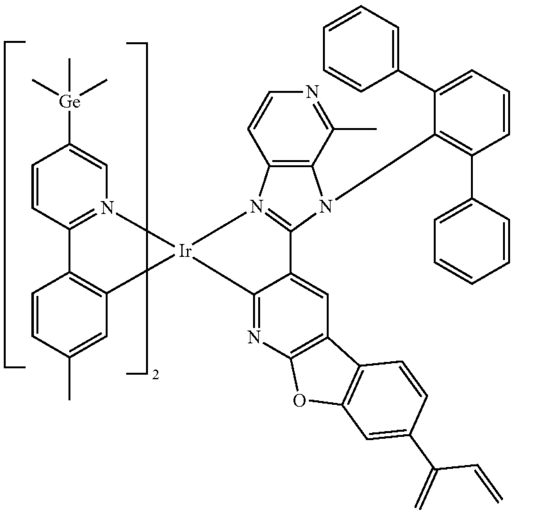
2308
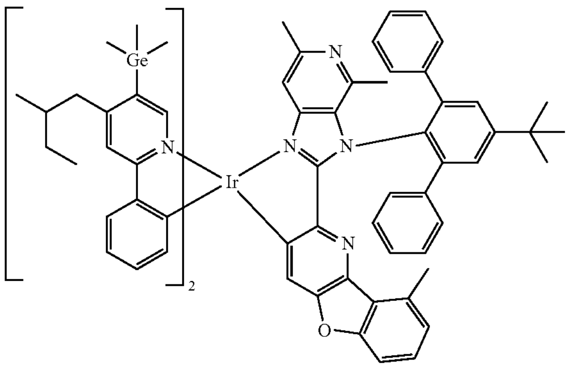
-continued
2309
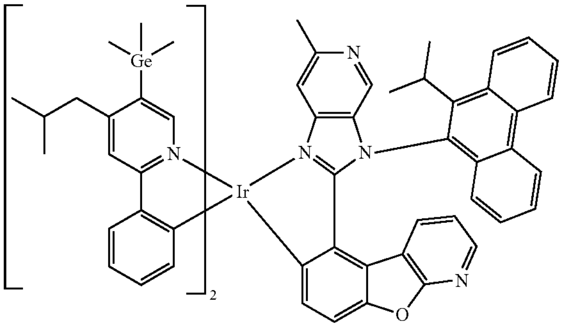
2310
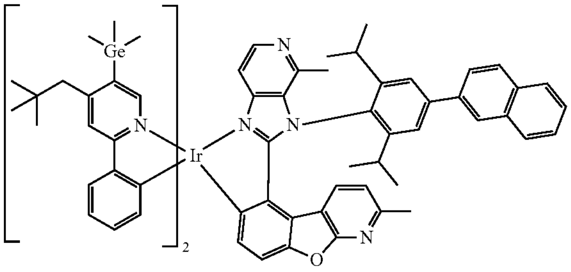
2311
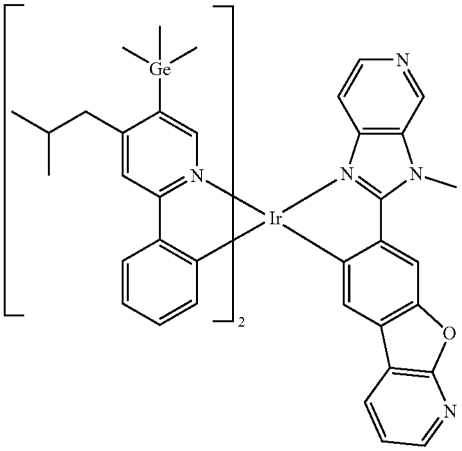
2312
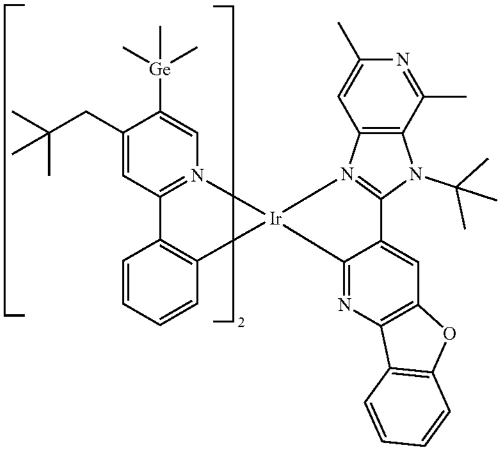

-continued
2313
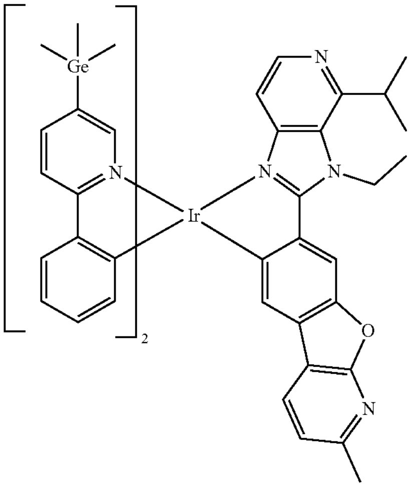
2314
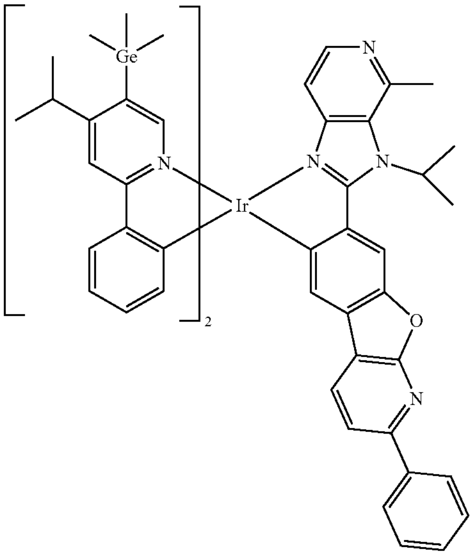
2315
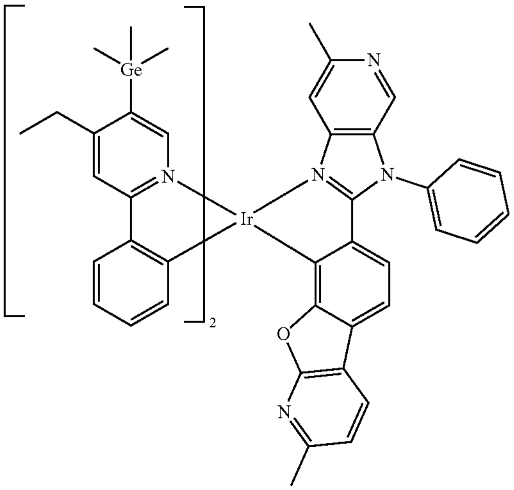
-continued
2316
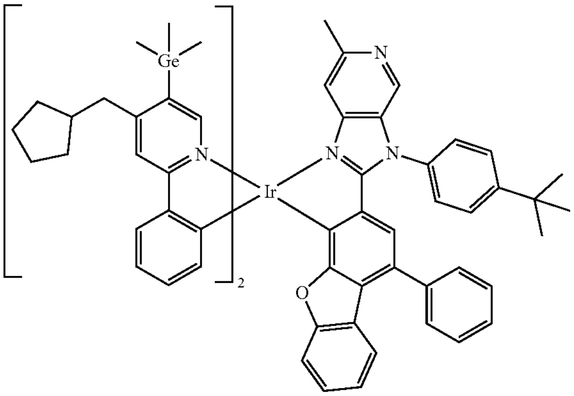
2317
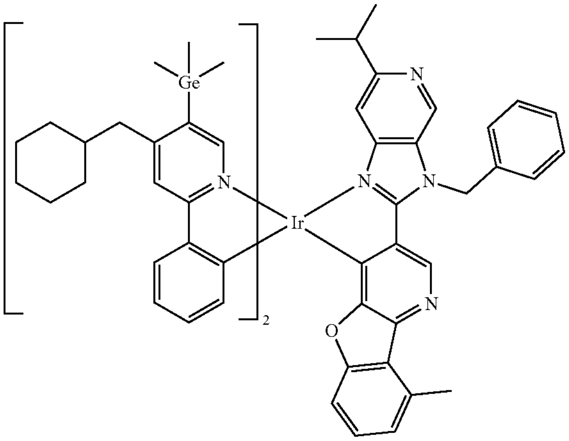
2318
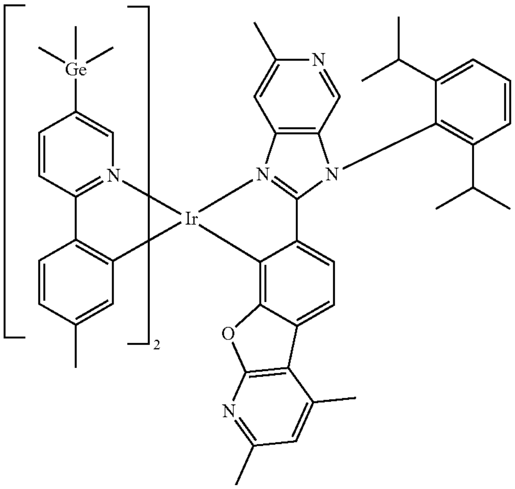

-continued
2319
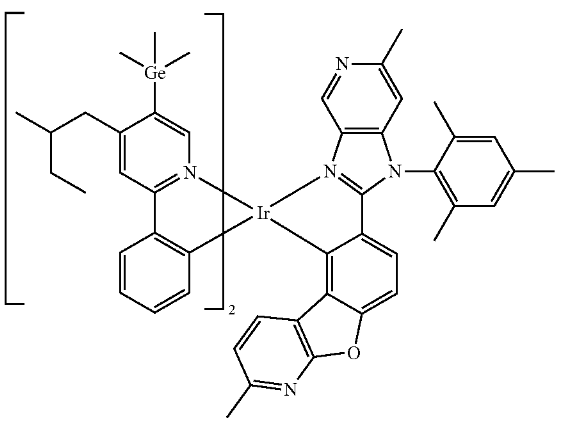
2320
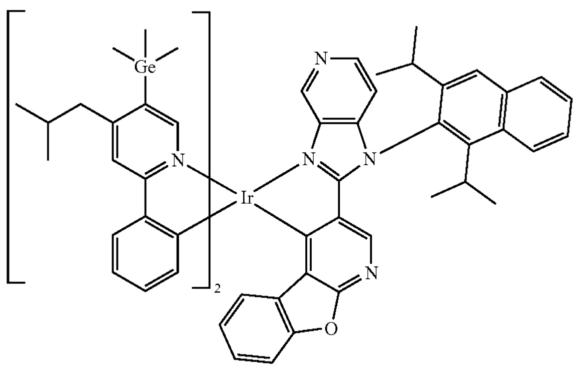
2321
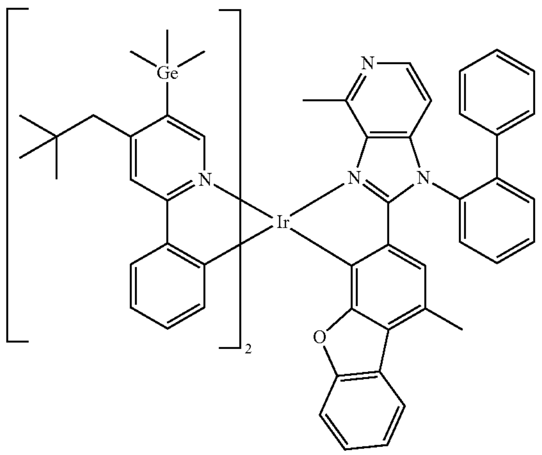
-continued
2322
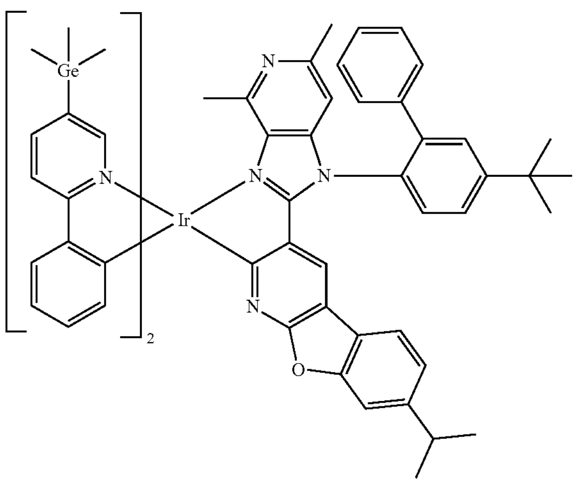
2323
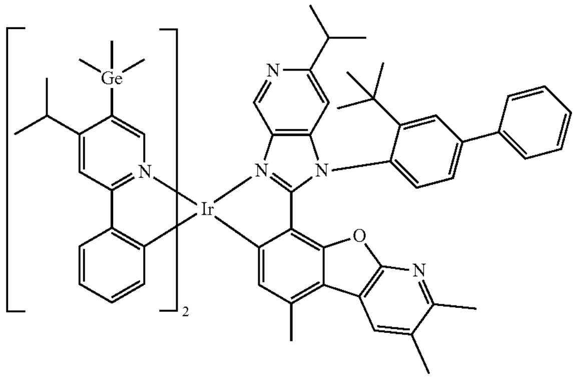
2324
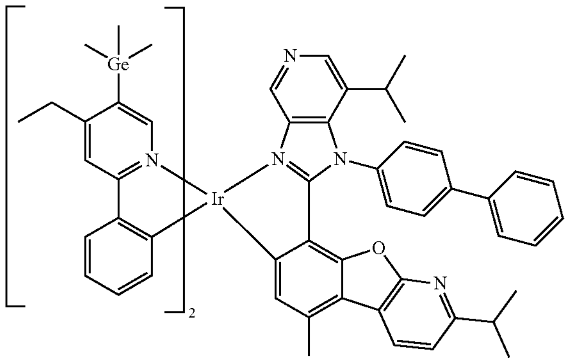
2325
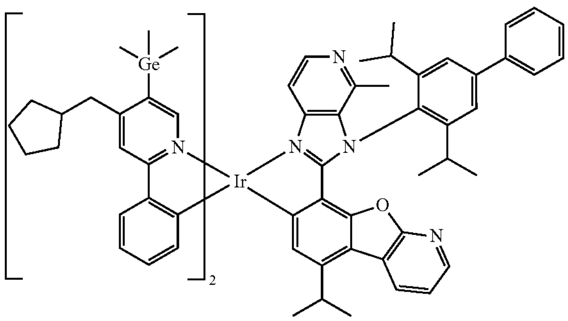

-continued
2326
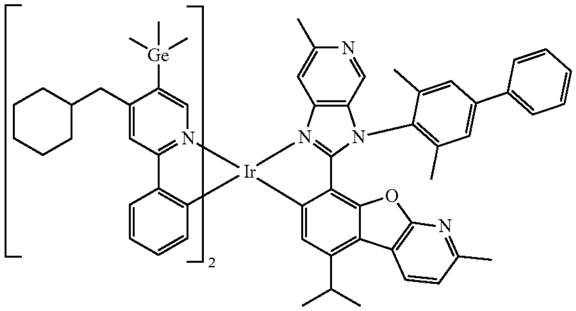
2327
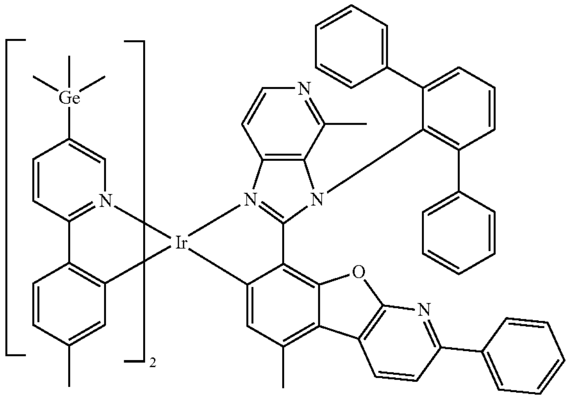
2328
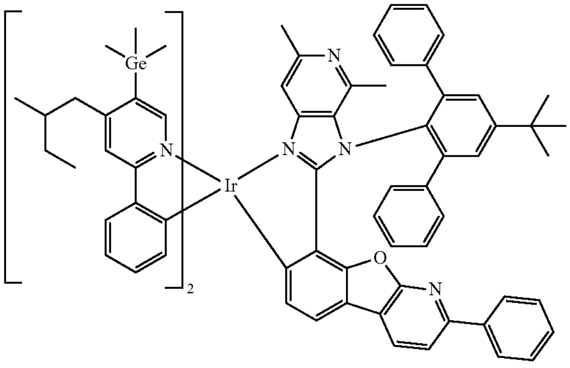
2329
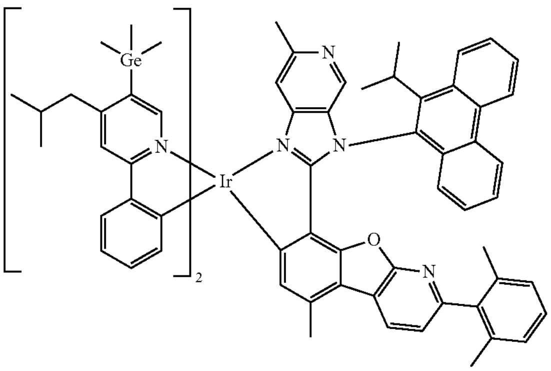
-continued
2330
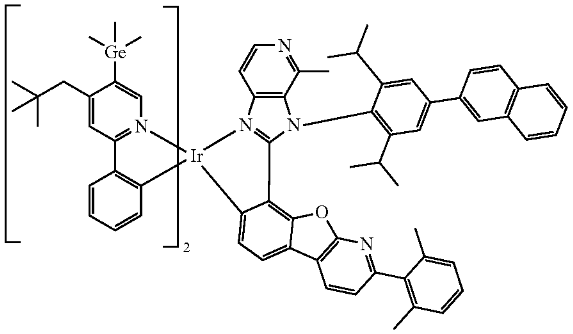
2331
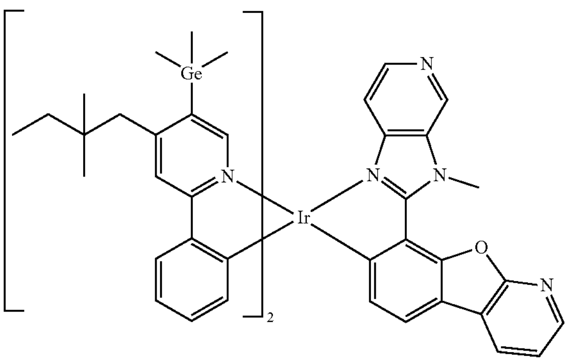
2332
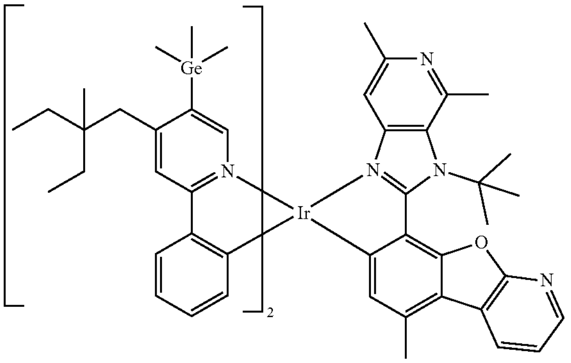
2333
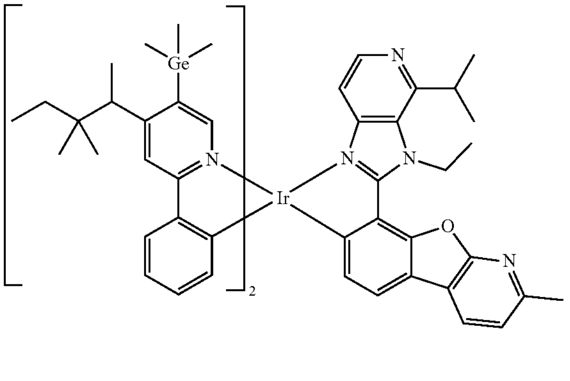

-continued
2334
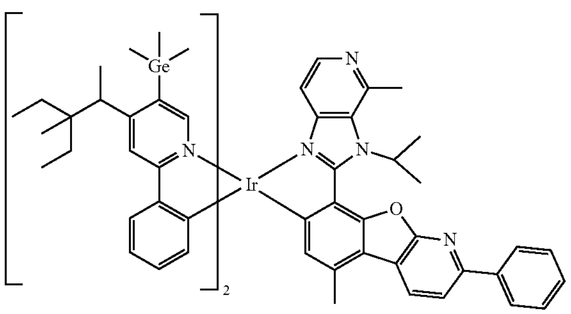
2335
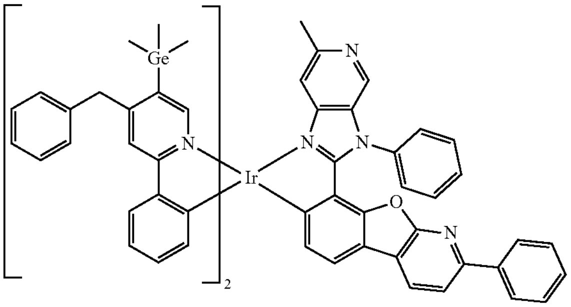
2336
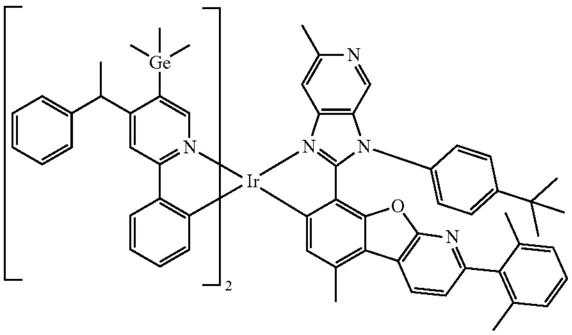
2337
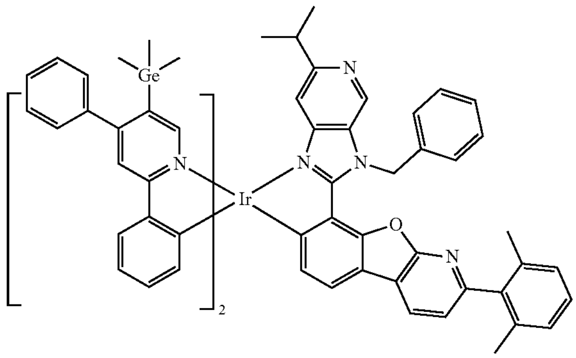
-continued
2338
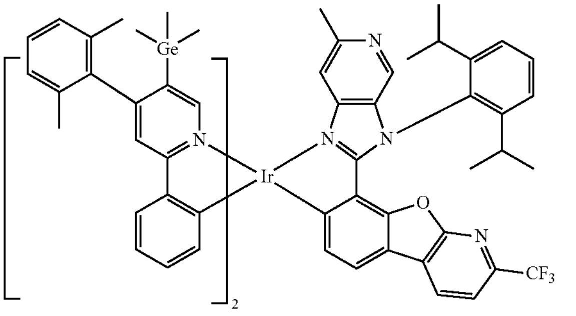
2339
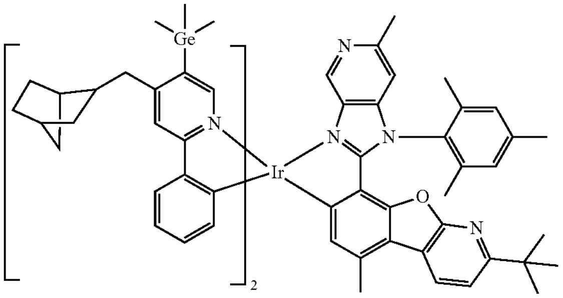
2340
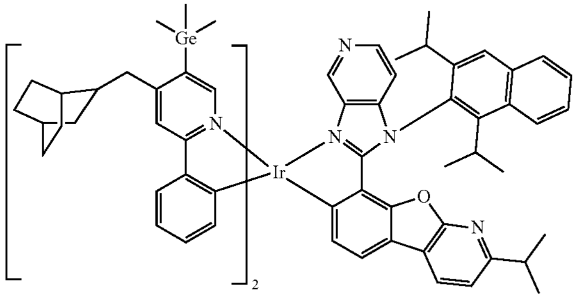
2341
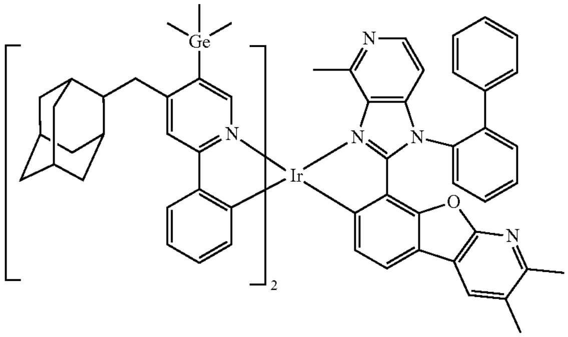

2342
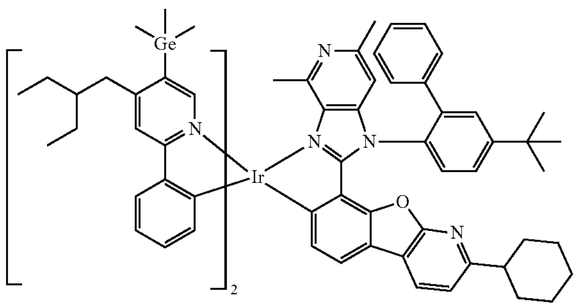
2343
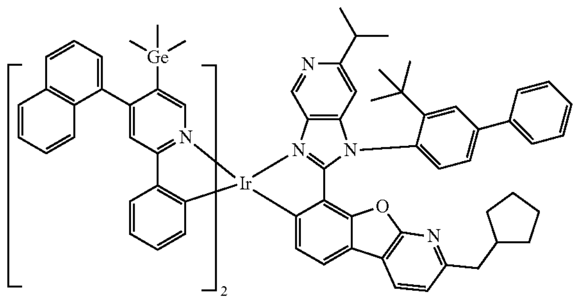
2344
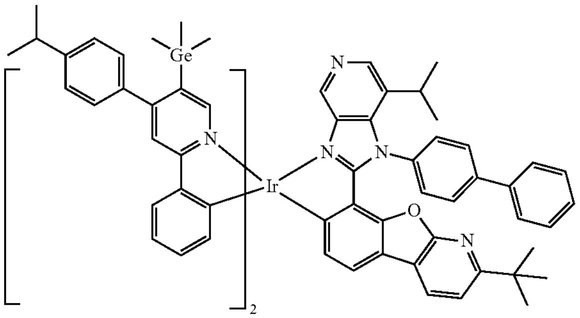
2345
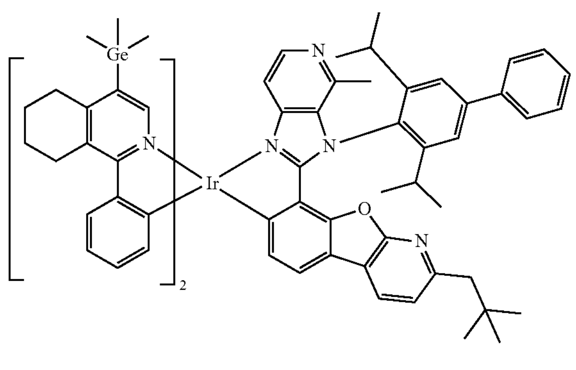
2346
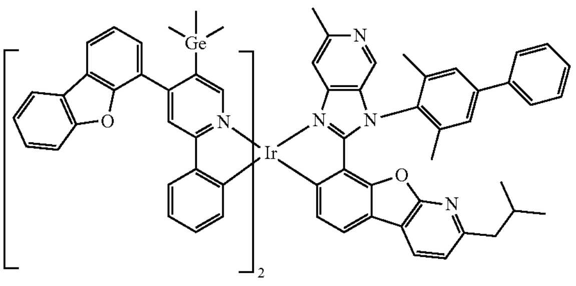
2347
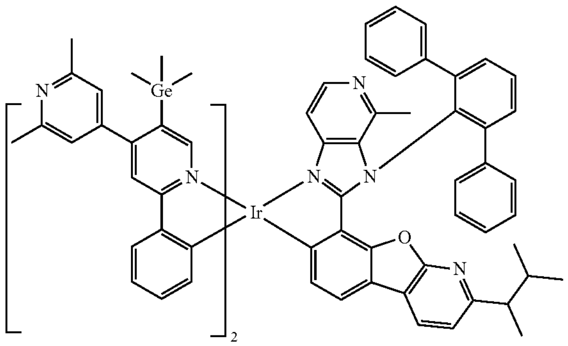
2348
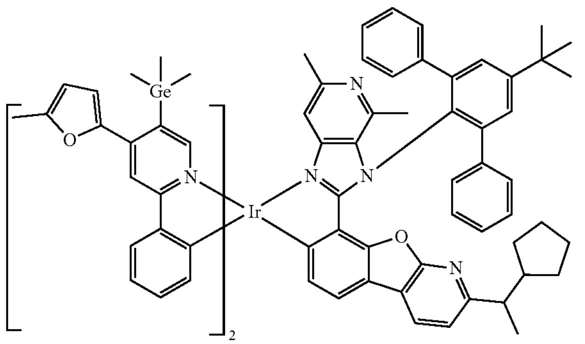
2349
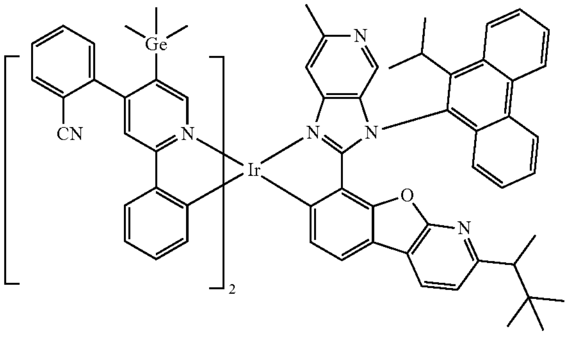

-continued
2350
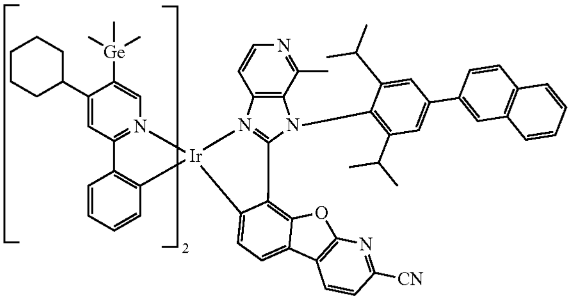
2351
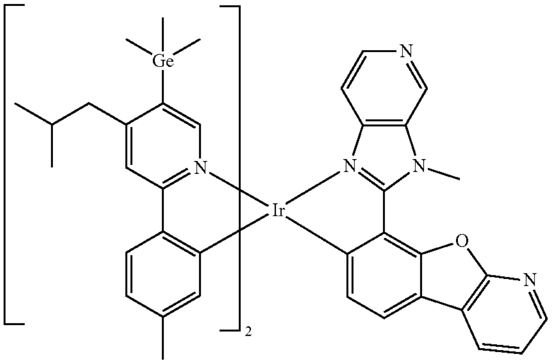
2352
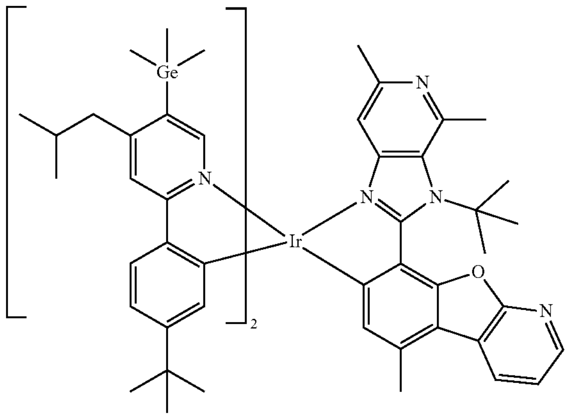
2353
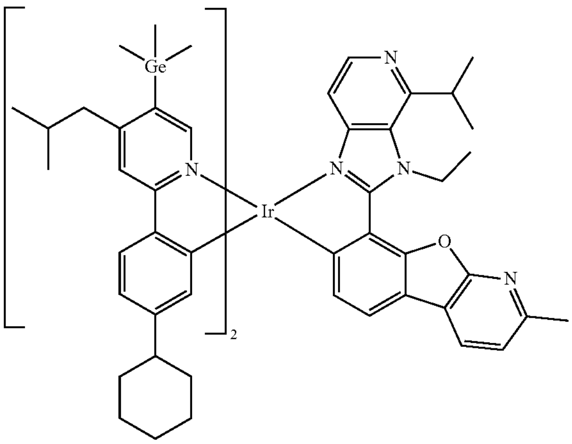
-continued
2354
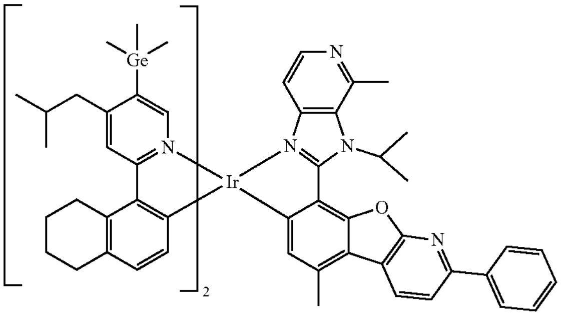
2355
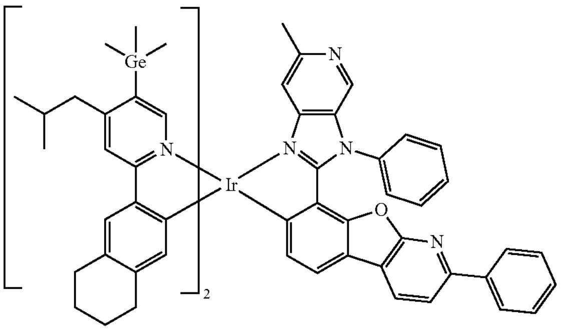
2356
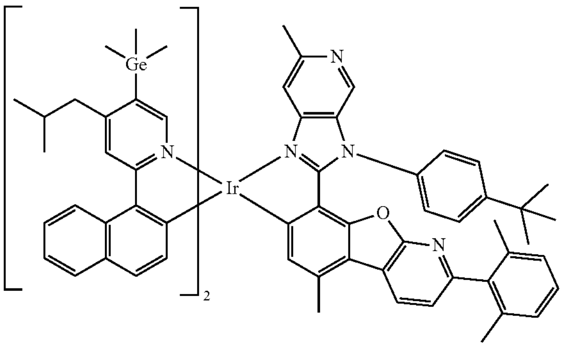
2357
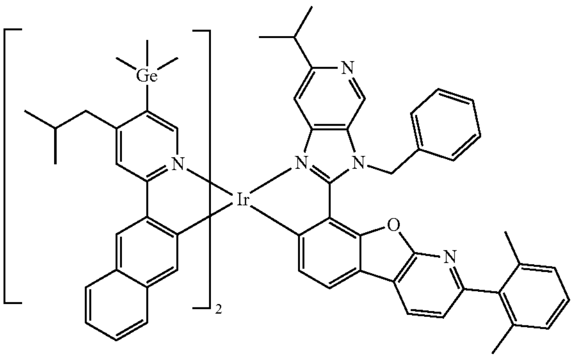

-continued
2358
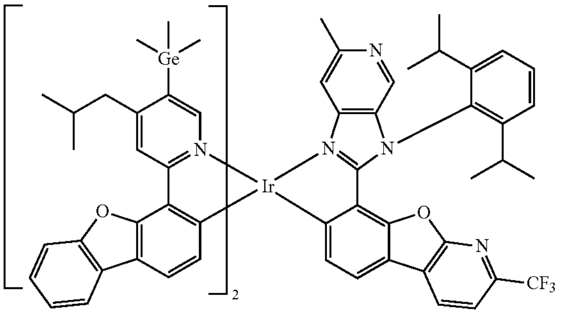
2359
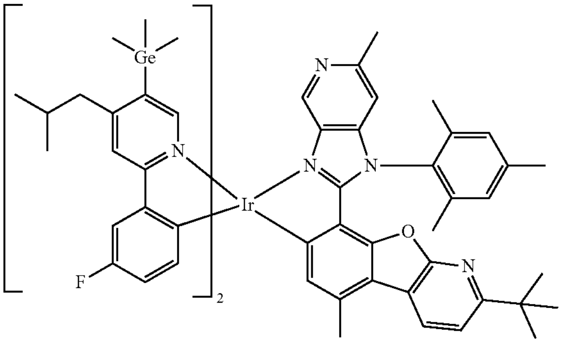
2360
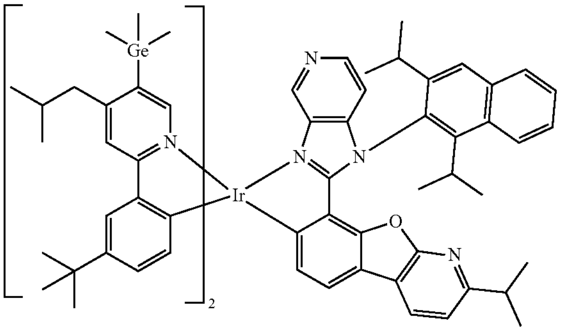
2361
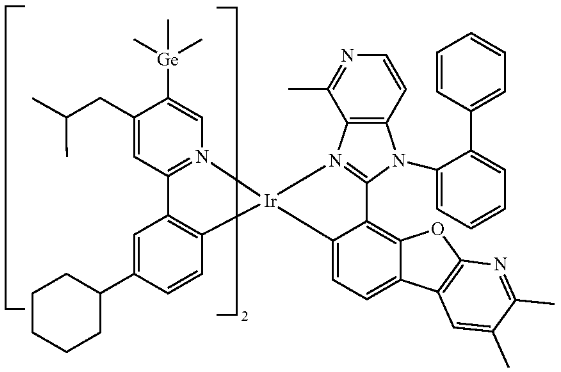
-continued
2362
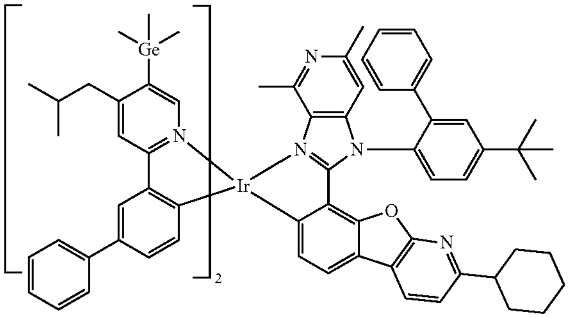
2363
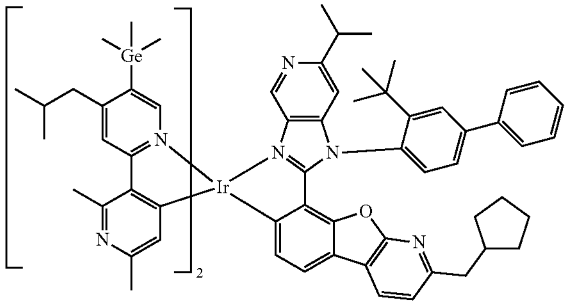
2364
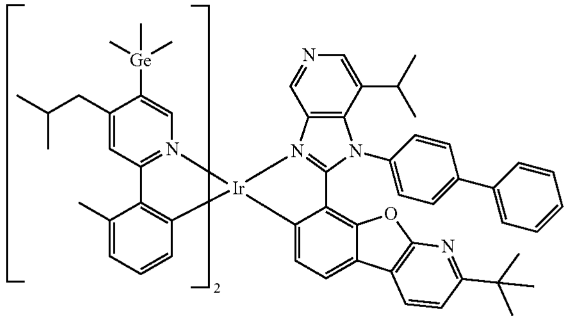
2365
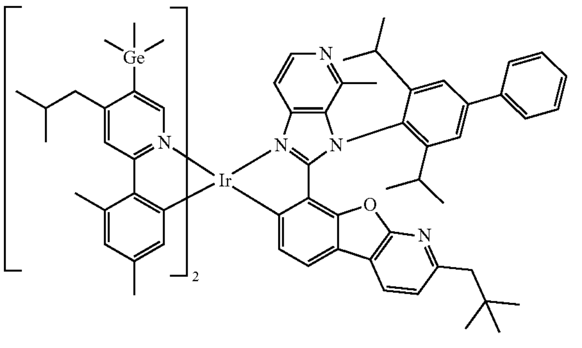

-continued
2366
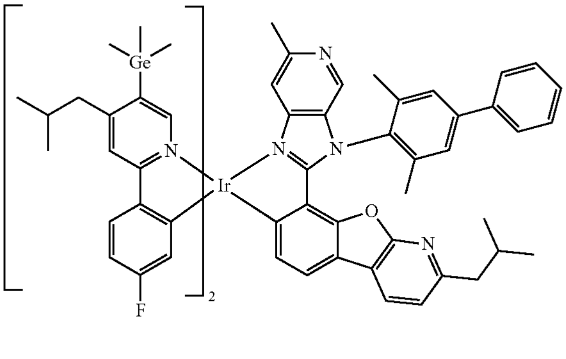
2367
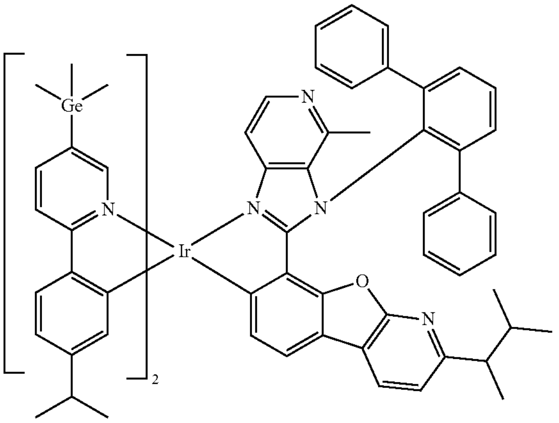
2368
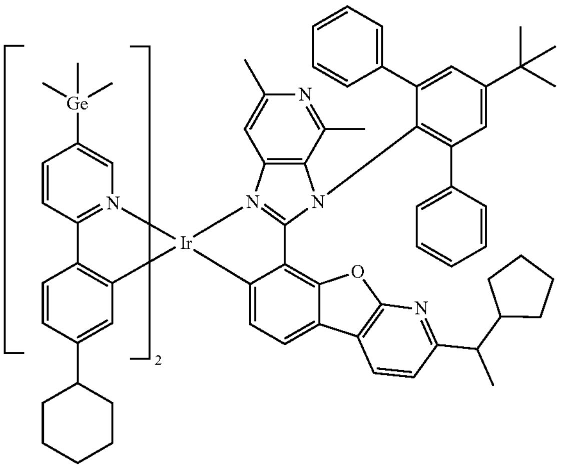
-continued
2369
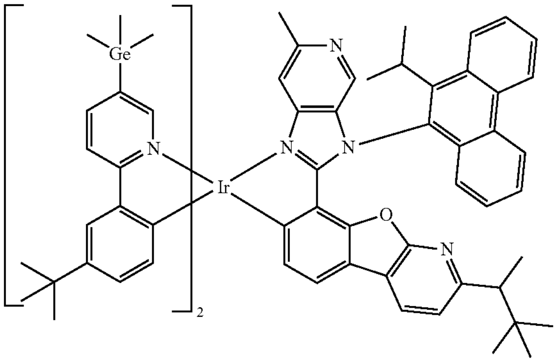
2370
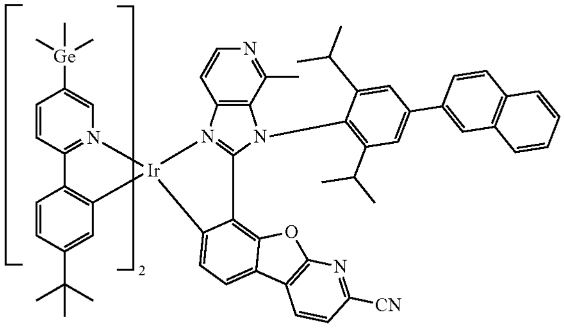
2371
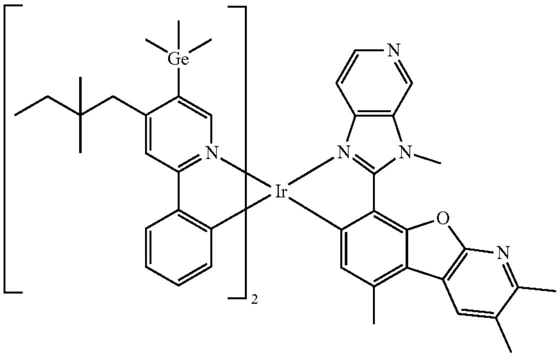
2372
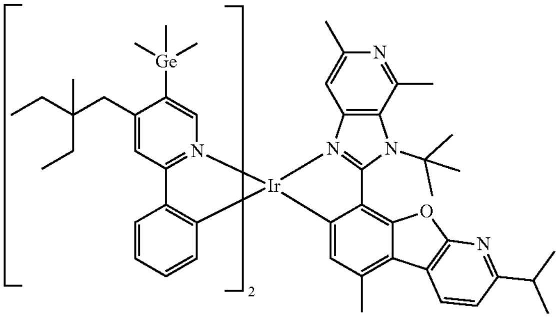

-continued
2373
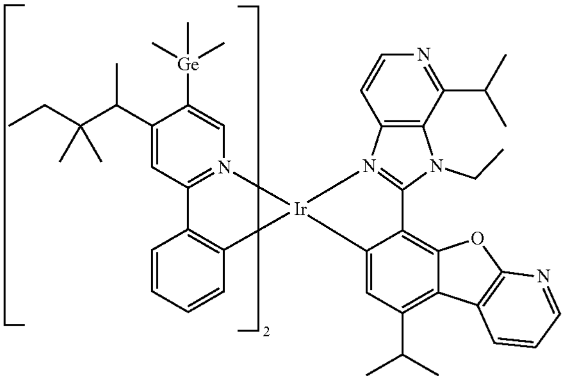
2374
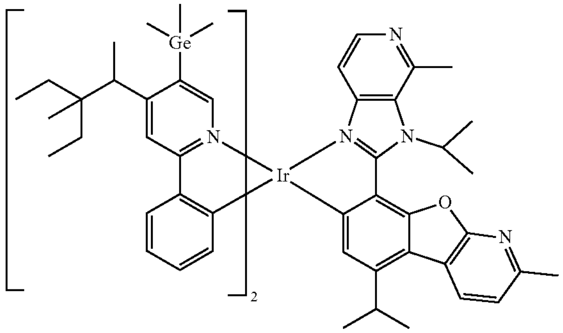
2375
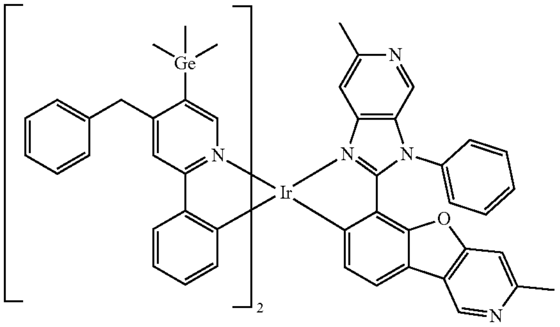
2376
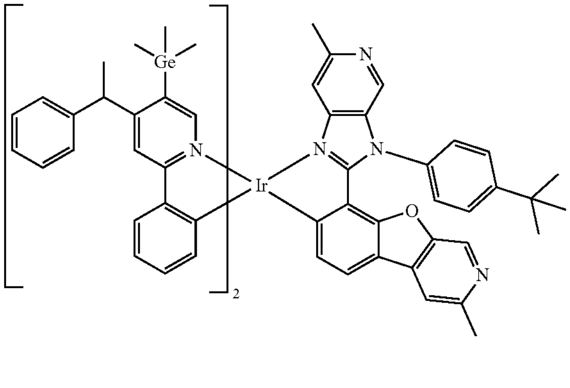
-continued
2377
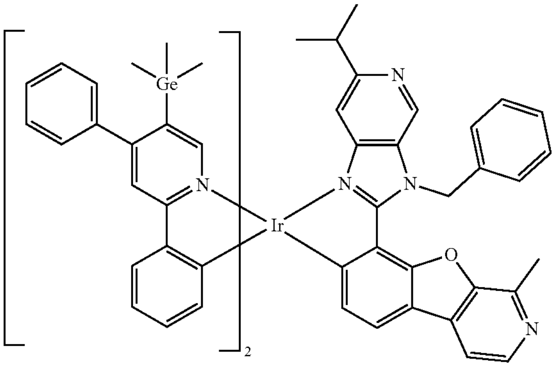
2378
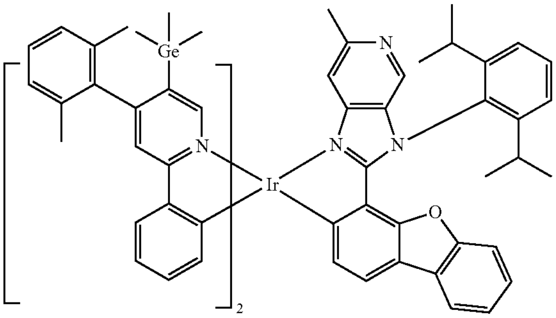
2379
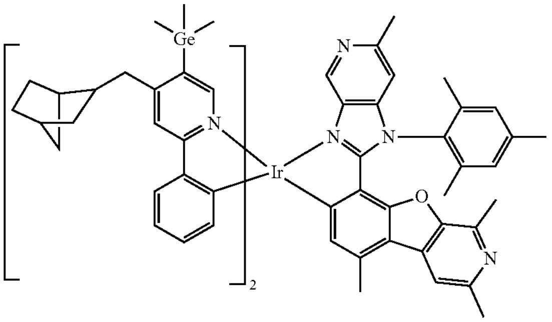
2380
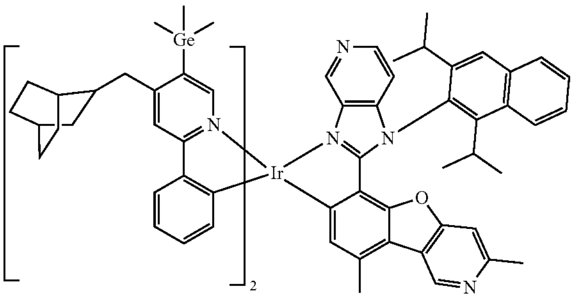

-continued
2381
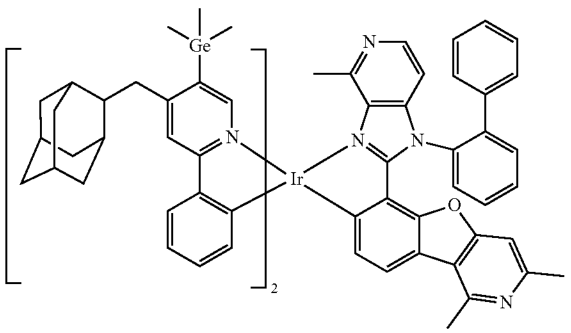
2382
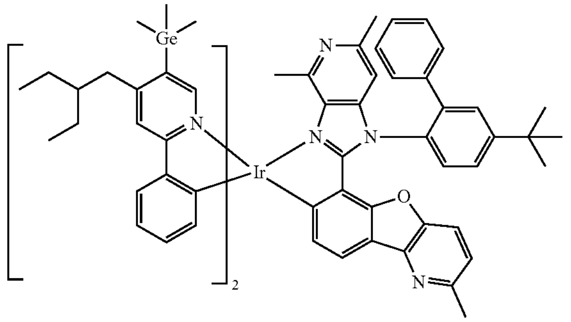
2383
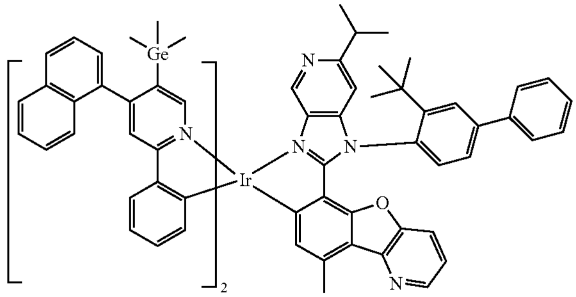
2384
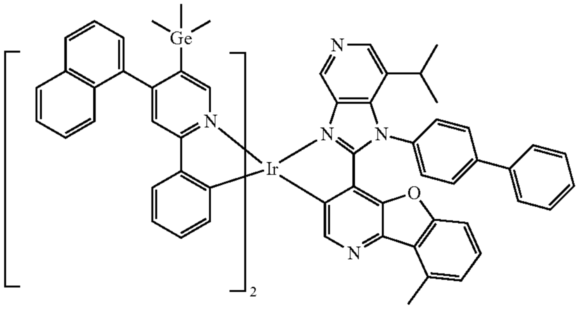
-continued
2385
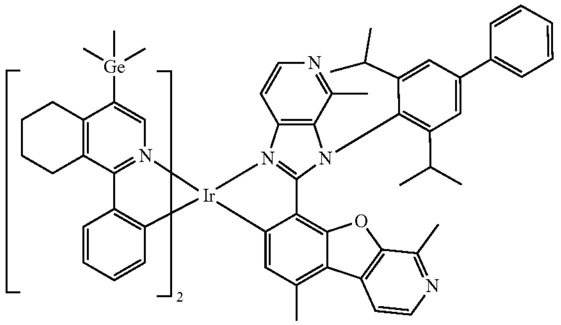
2386
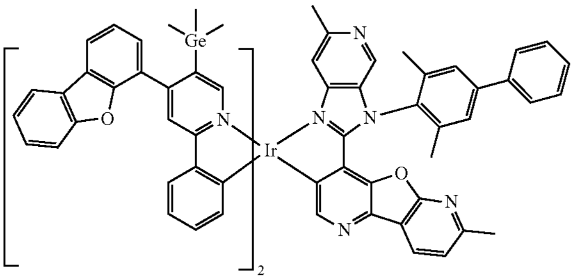
2387
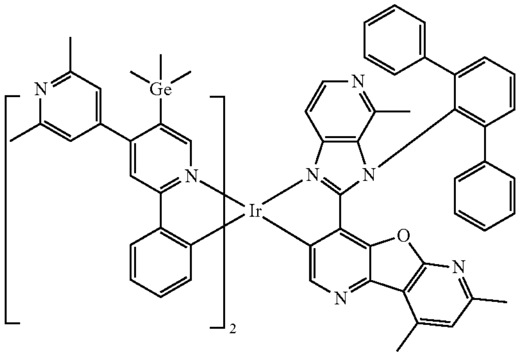
2388
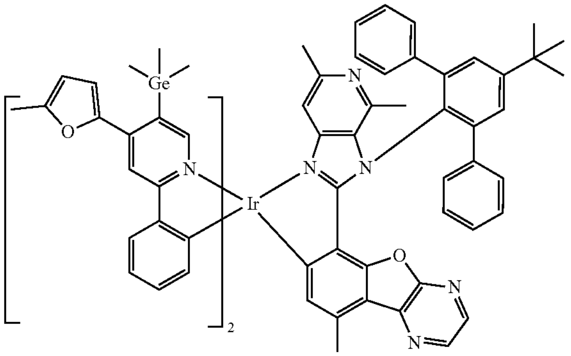

-continued
2389
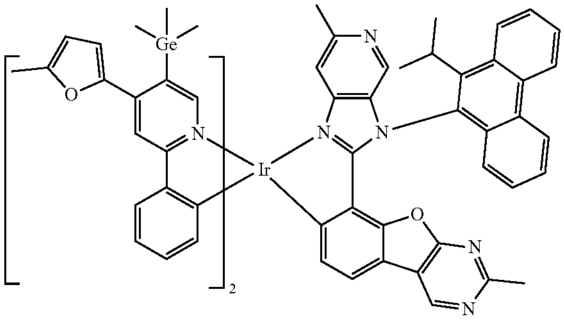
2390
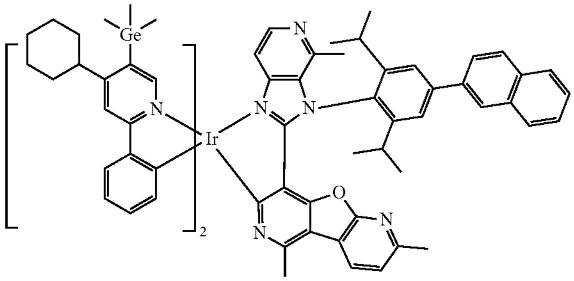
2391
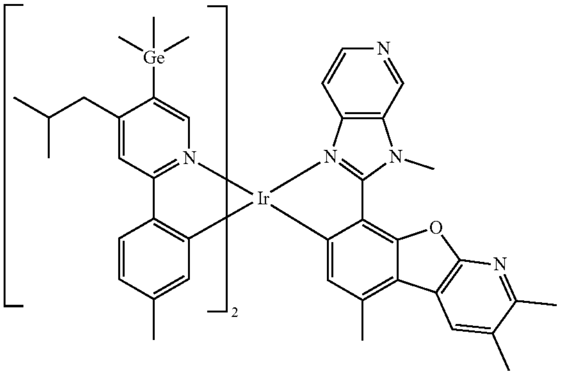
2392
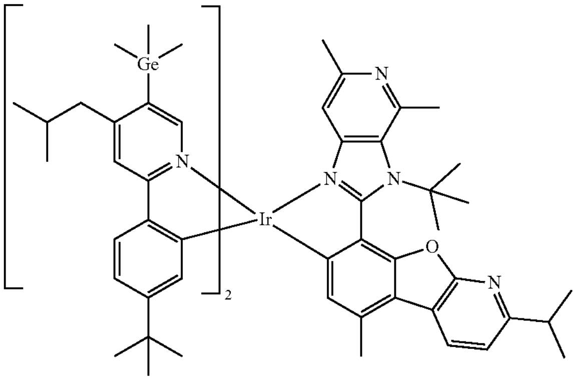
-continued
2393
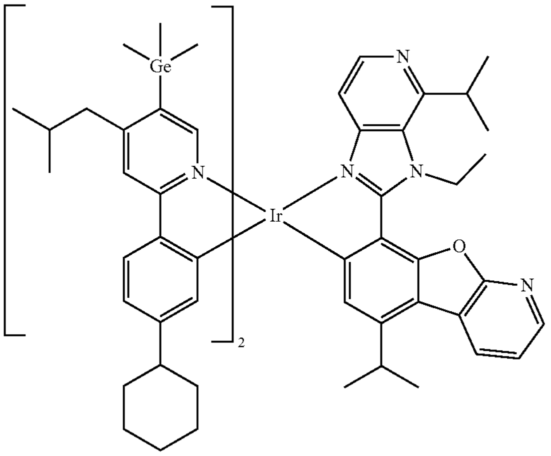
2394
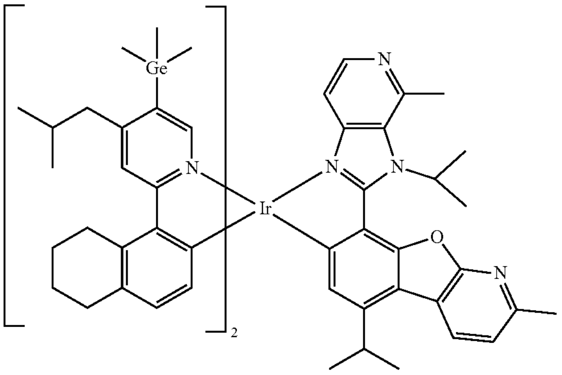
2395
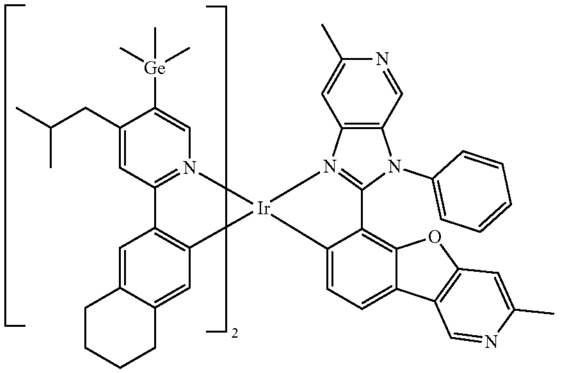
2396
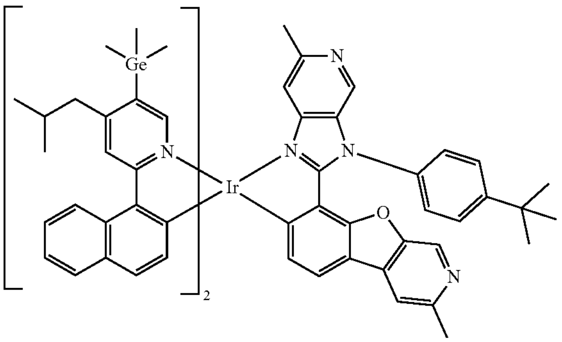

-continued
2397
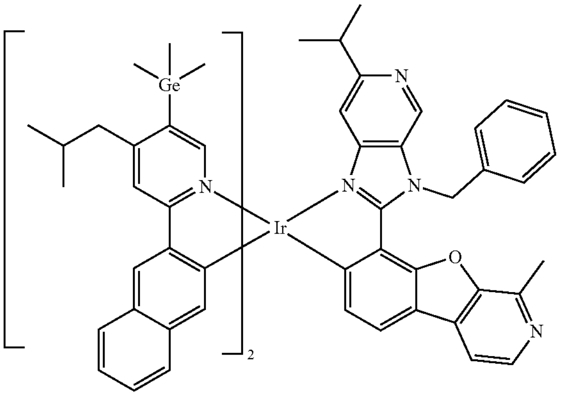
2398
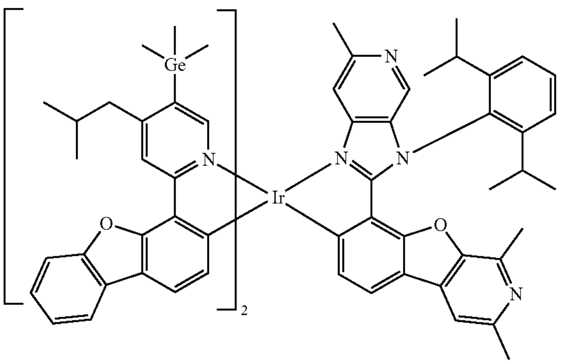
2399
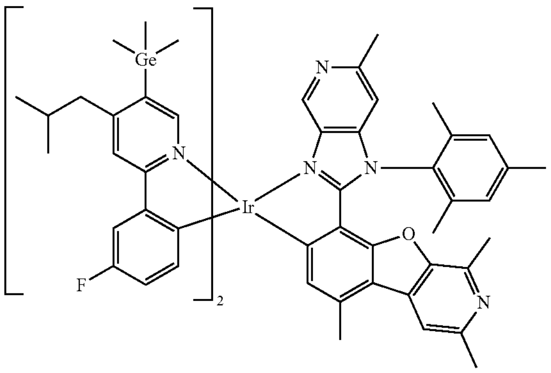
2400
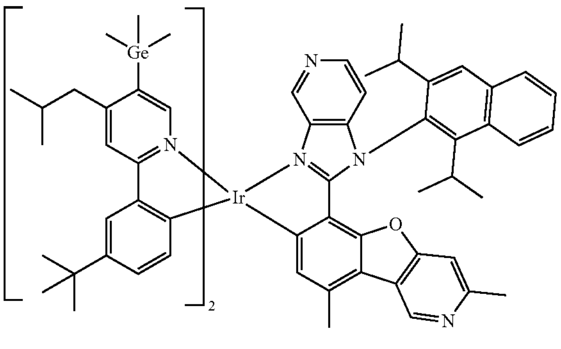
-continued
2401
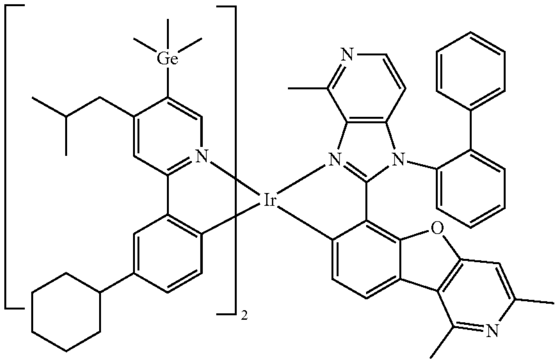
2402
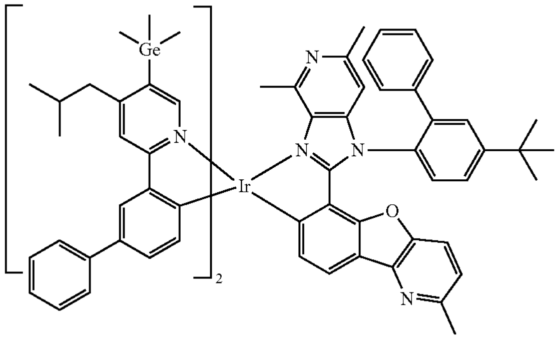
2403
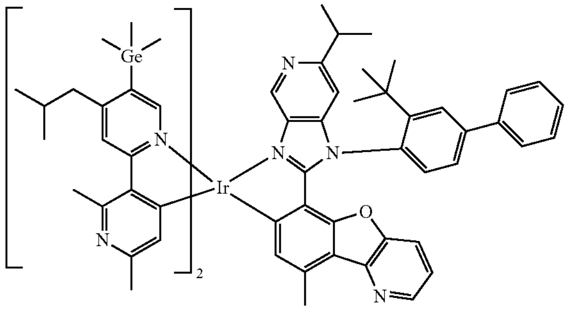
2404
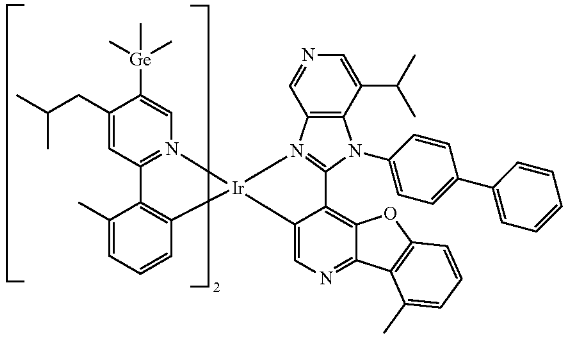

-continued
2405
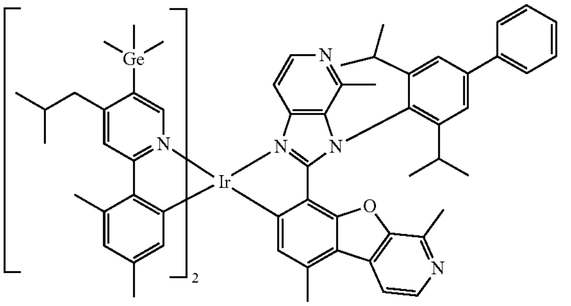
2406
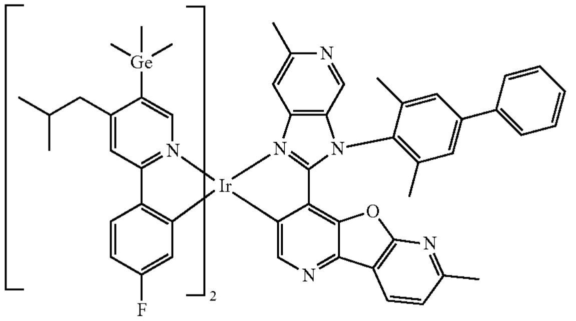
2407
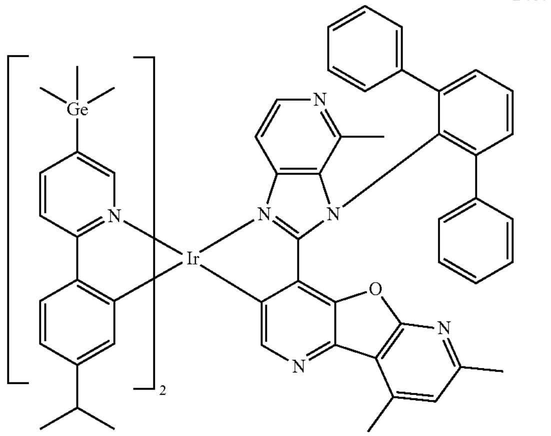
2408
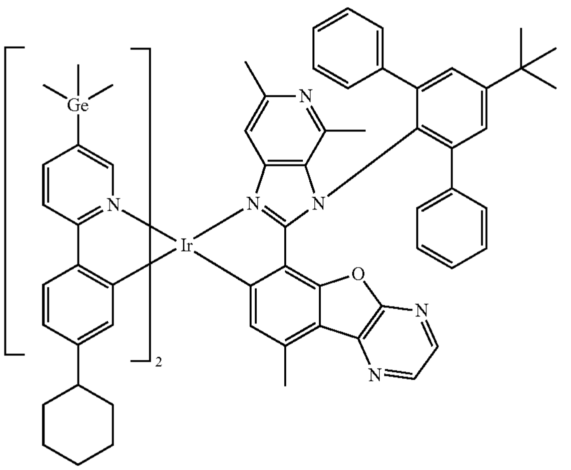
-continued
2409
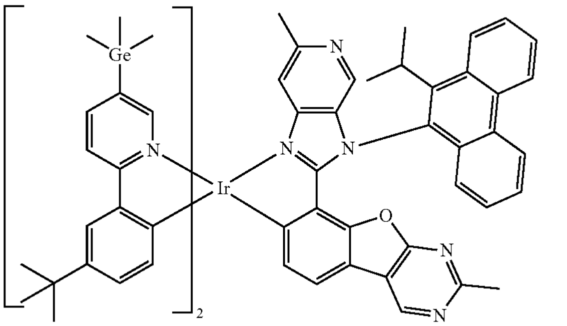
2410
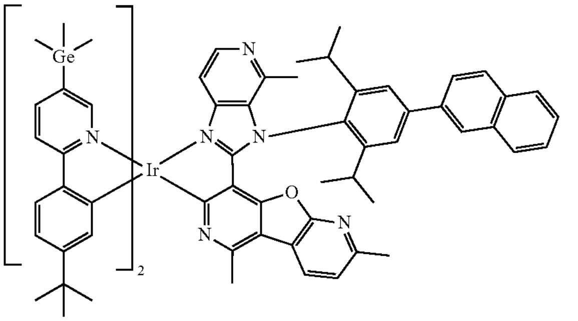
2411
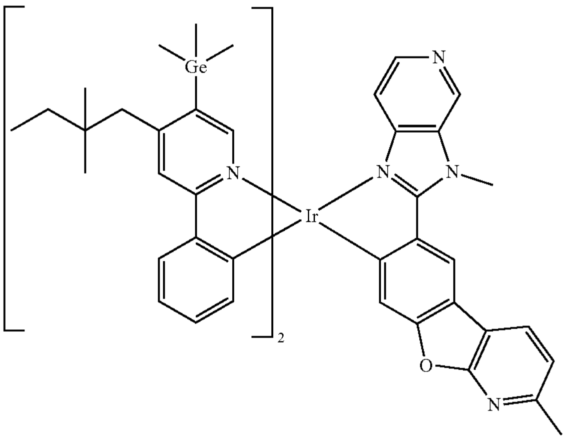
2412
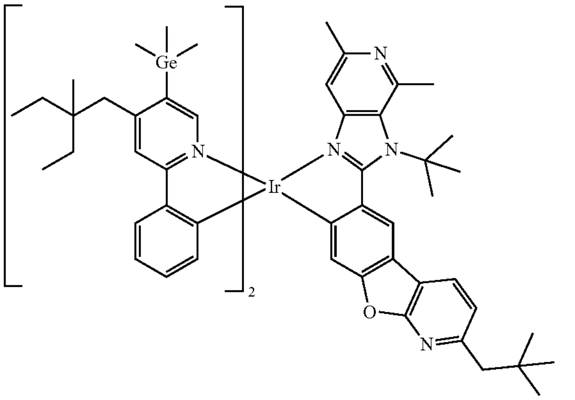

-continued
2413
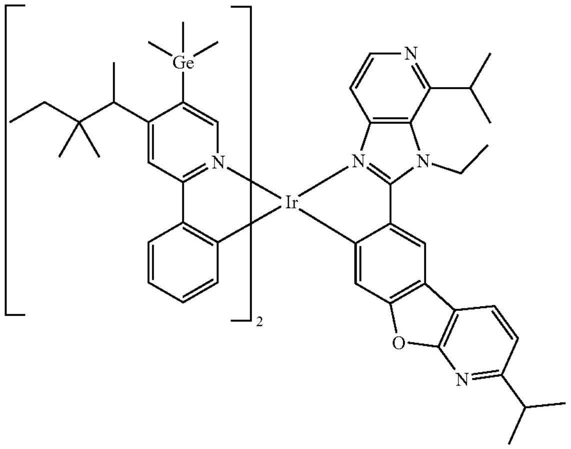
2414
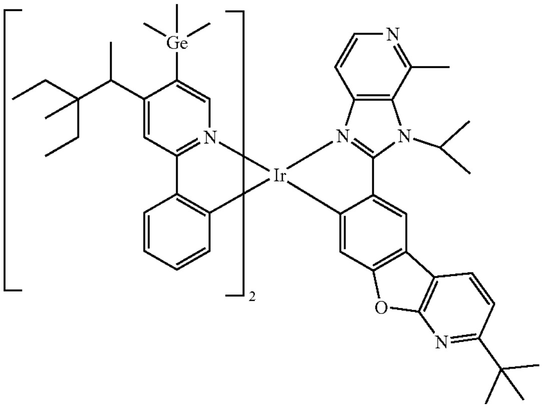
2415
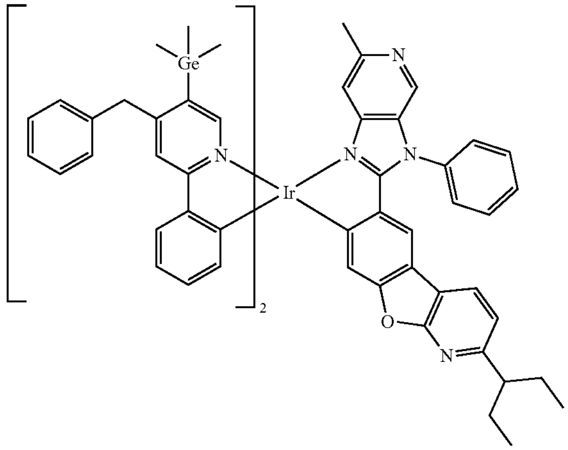
-continued
2416
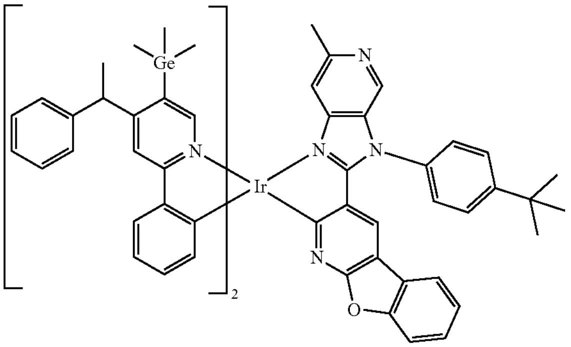
2417
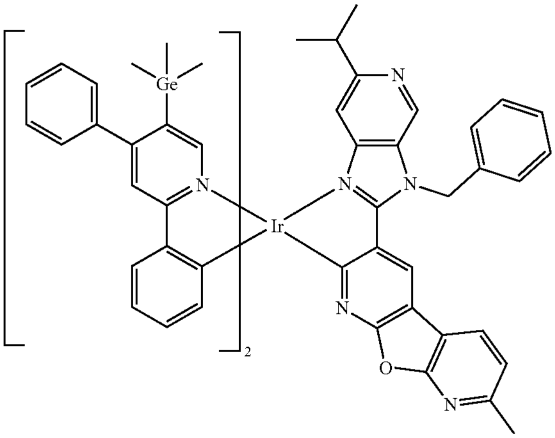
2418
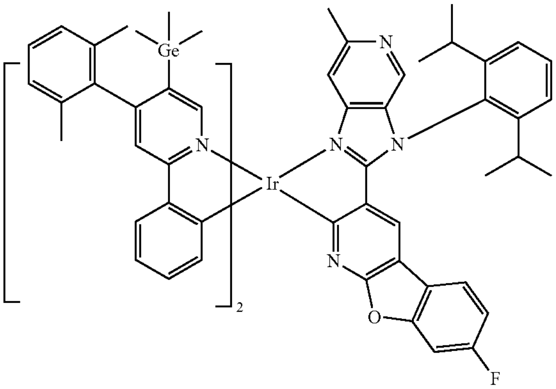
2419
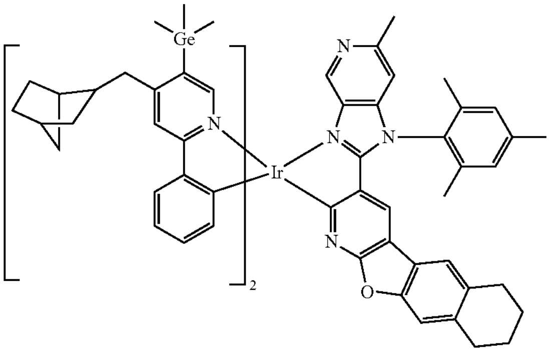

-continued
2420
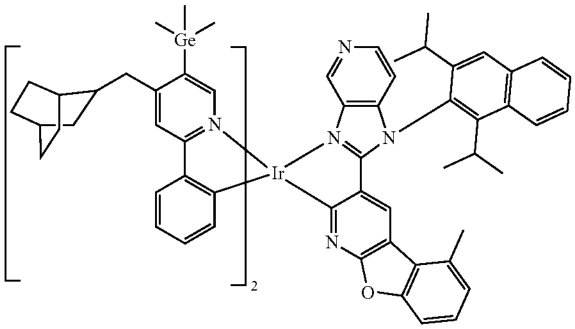
2421
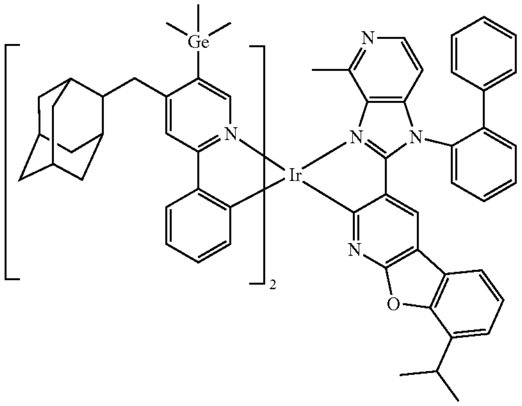
2422
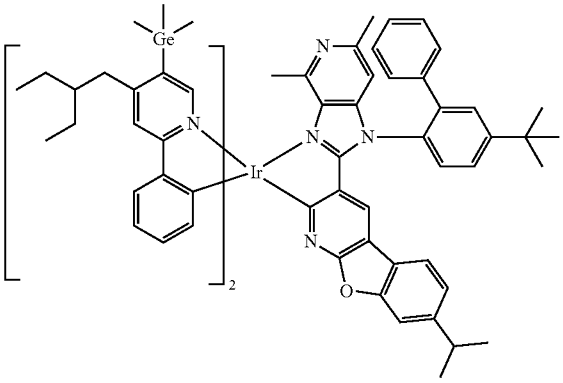
2423
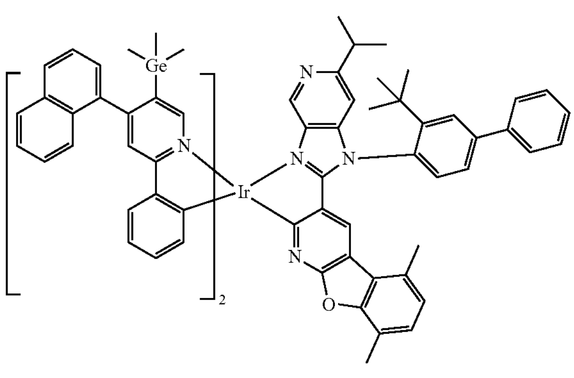
-continued
2424
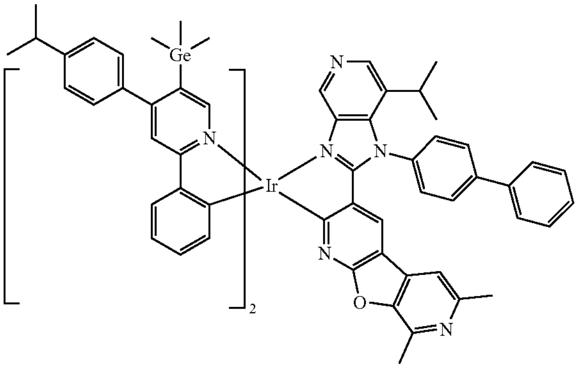
2425
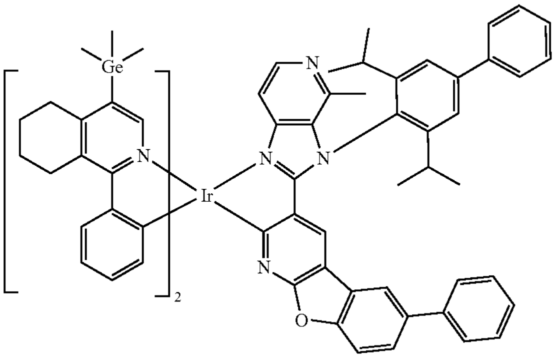
2426
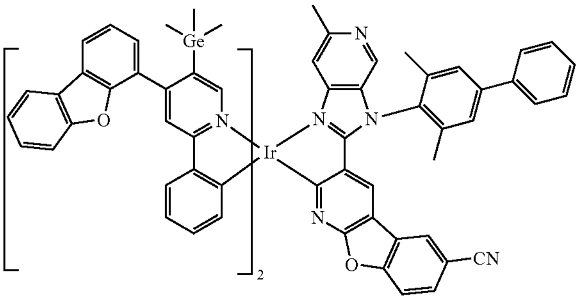
2427
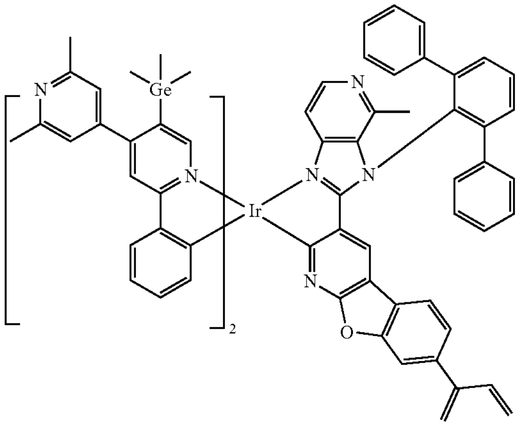

-continued
2428
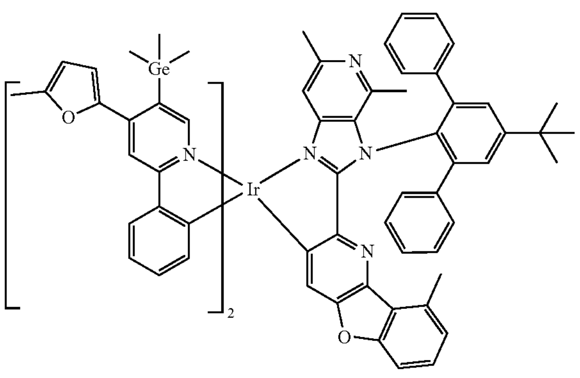
2429
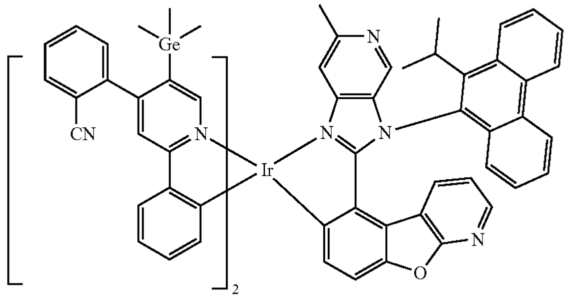
2430
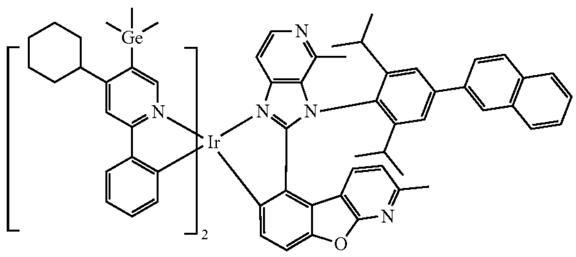
2431
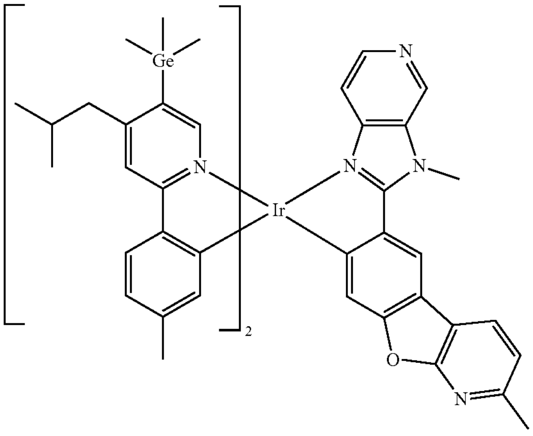
-continued
2432
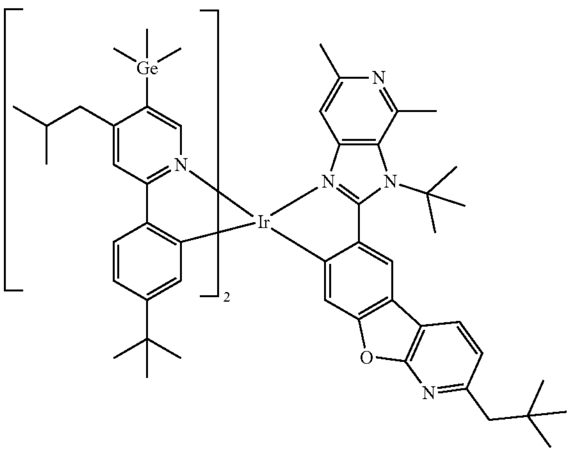
2433
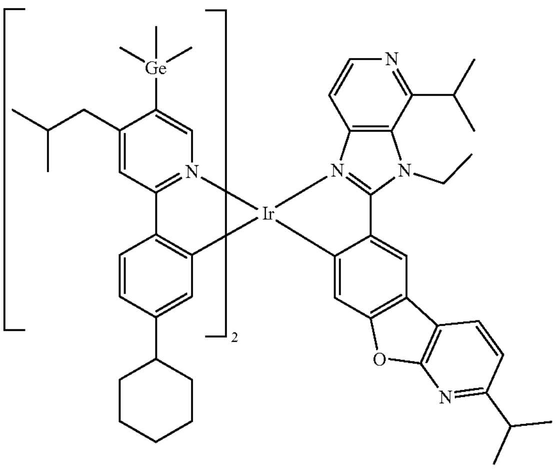
2434
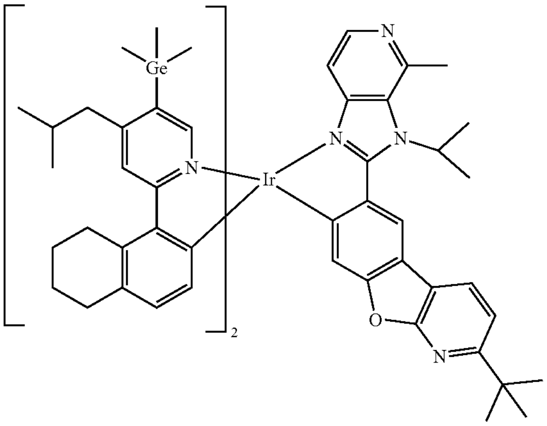

-continued
2435
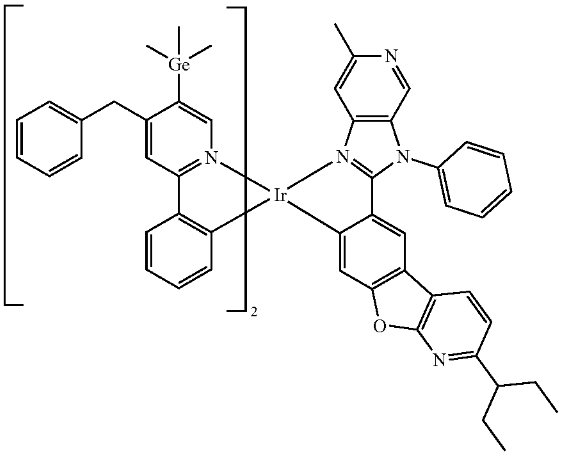
2436
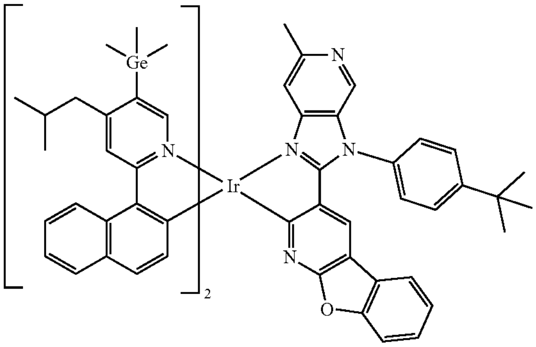
2437
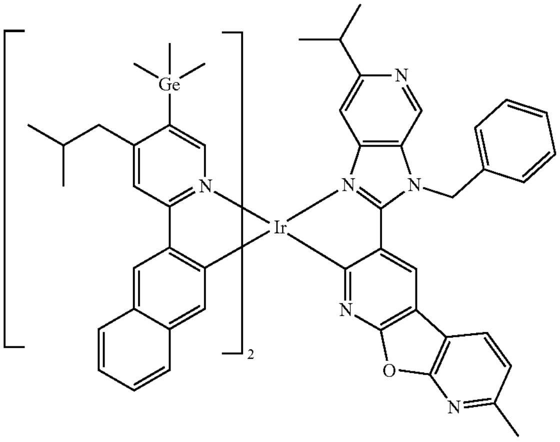
-continued
2438
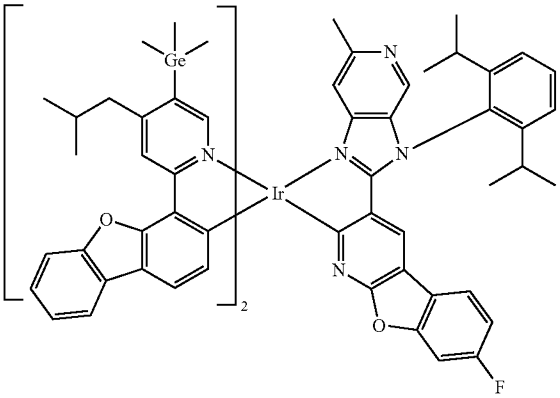
2439
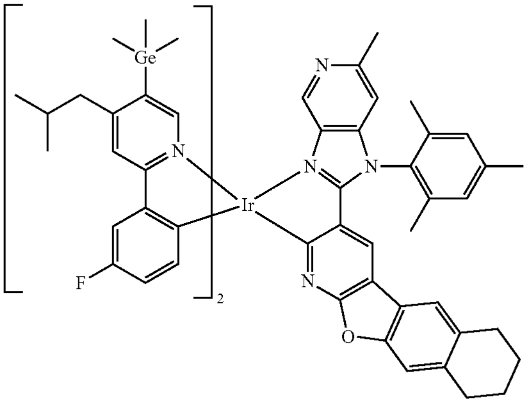
2440
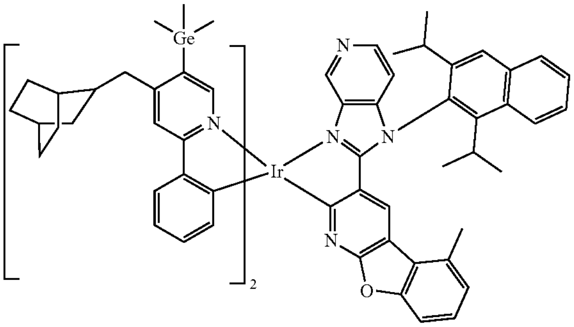

-continued
2441
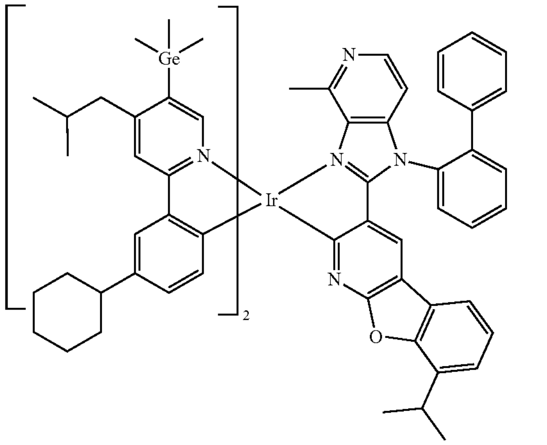
2442
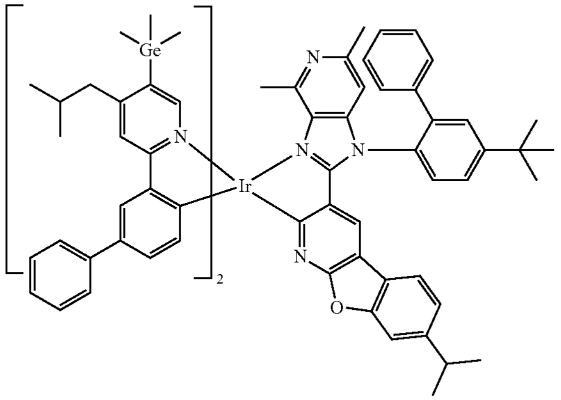
2443
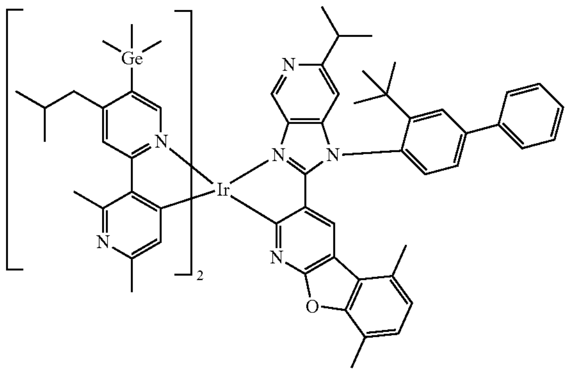
-continued
2444
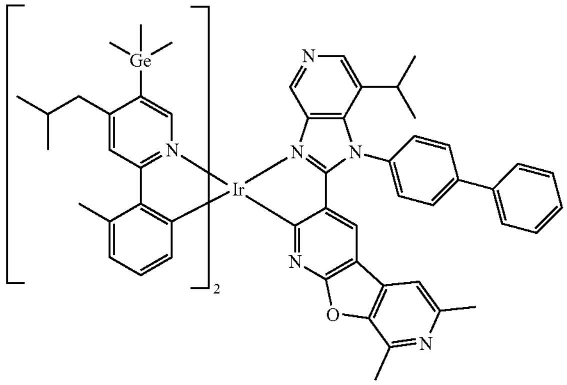
2445
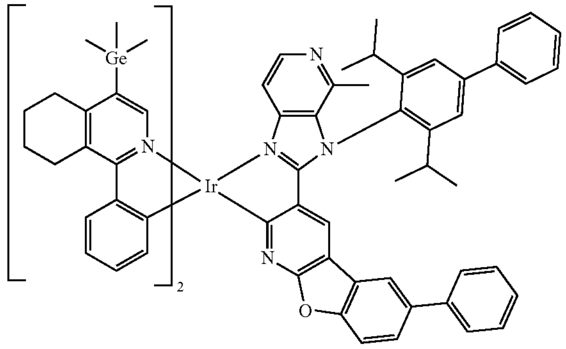
2446
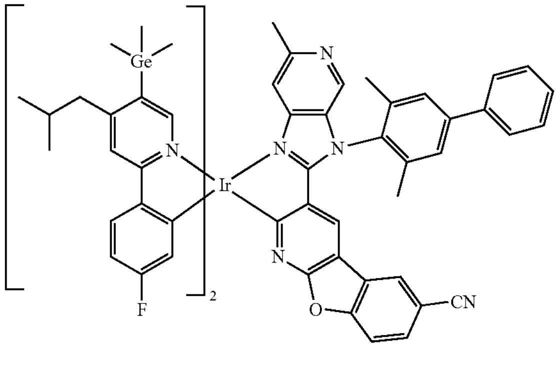

-continued
2447
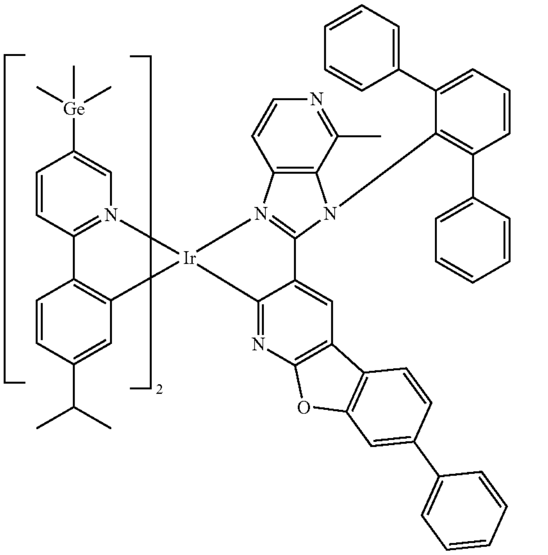
2448
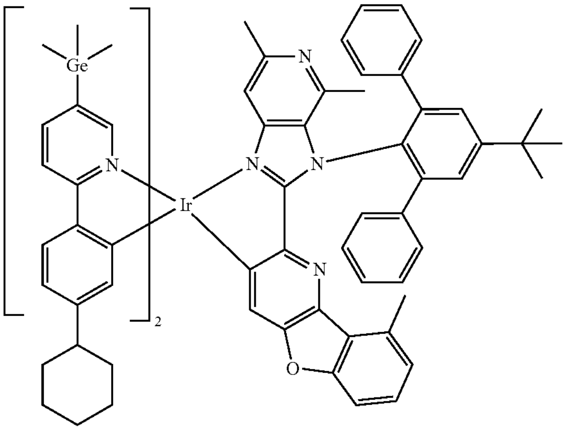
-continued
2449
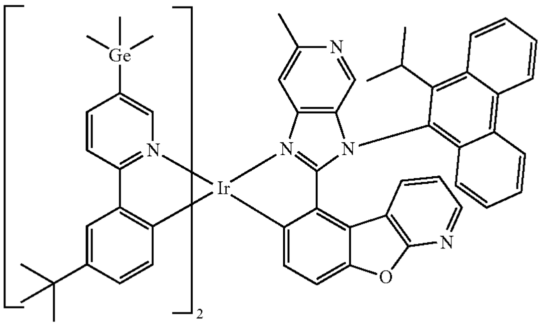
2450
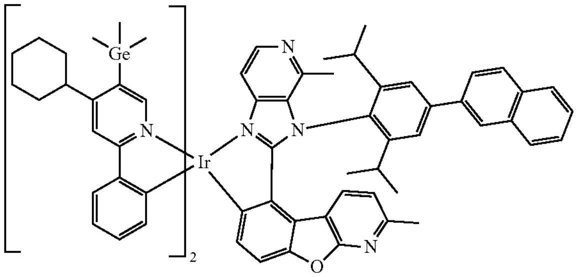
2451
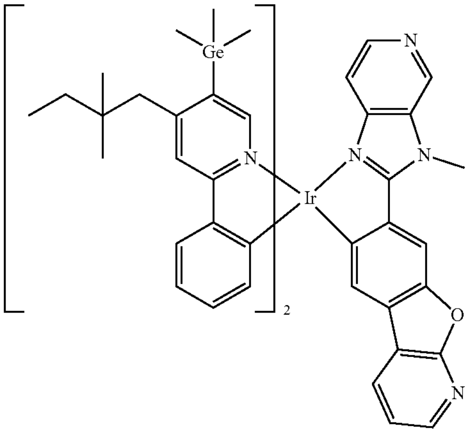
2452
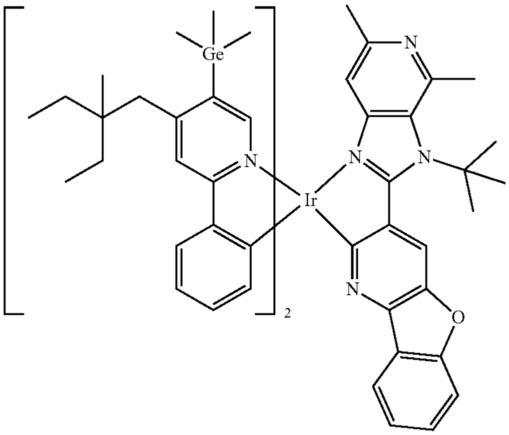

-continued
2453
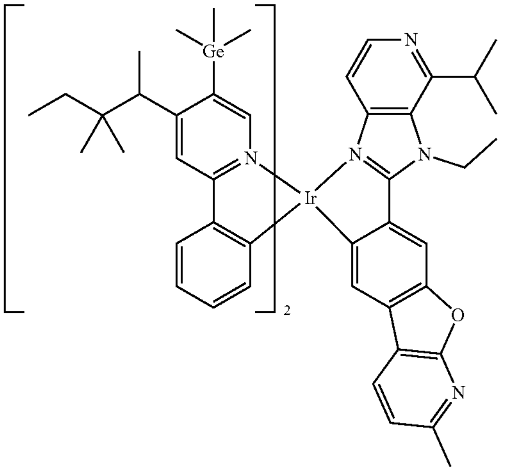
2454
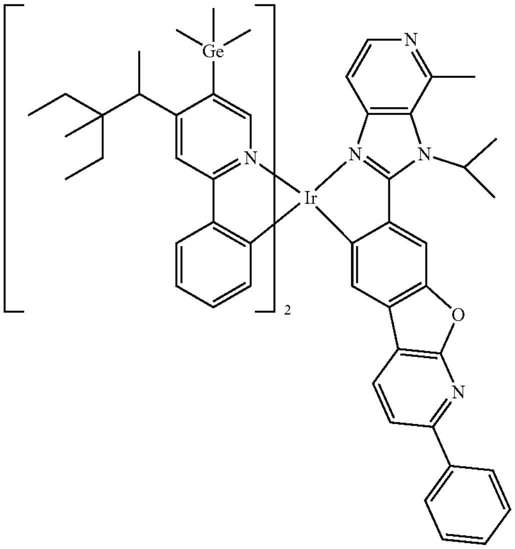
2455
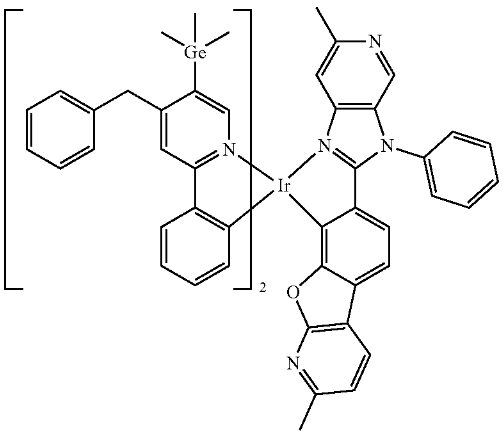
2456
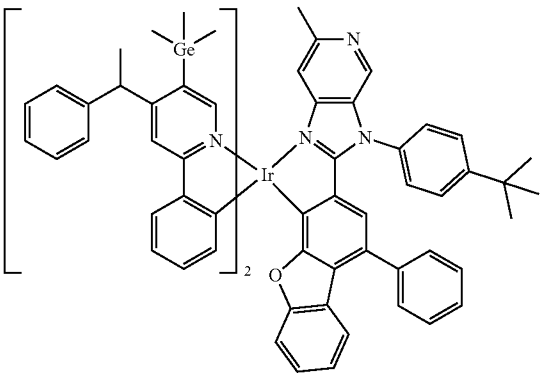
2457
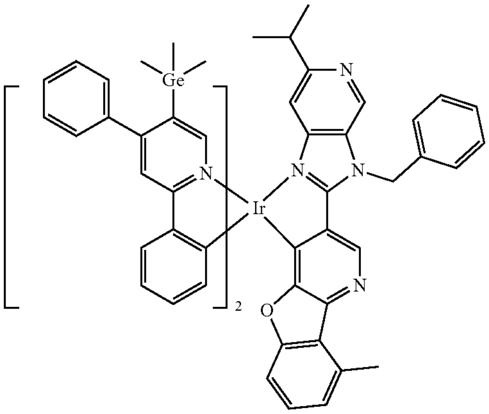
2458
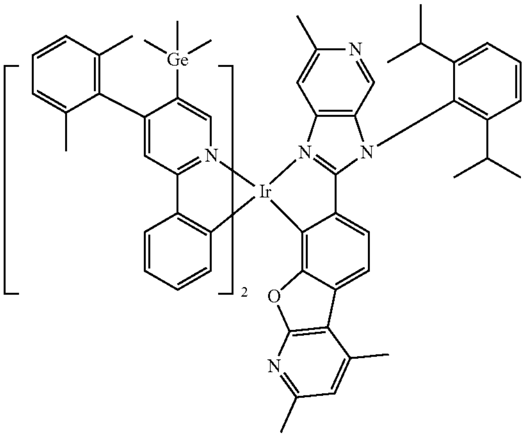

-continued
2459
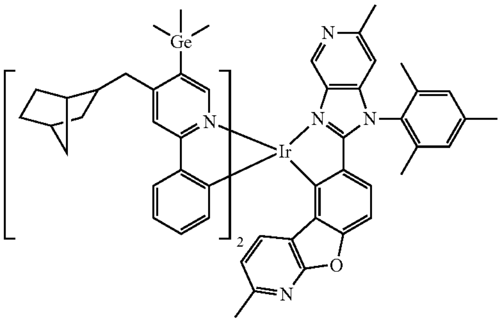
2460
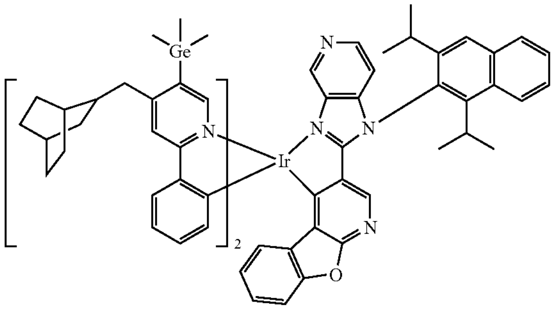
2461
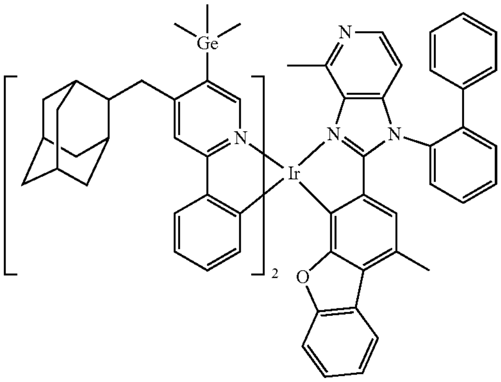
2462
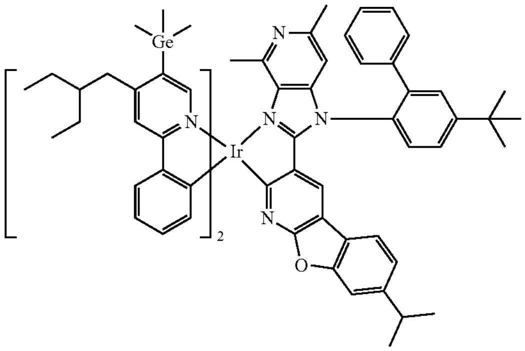
2463
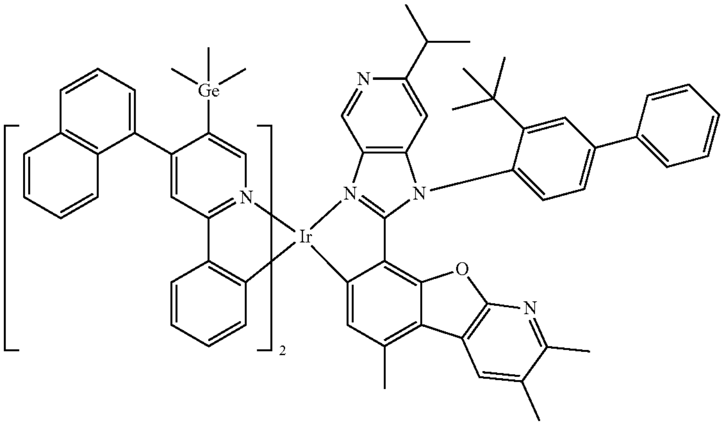
2464
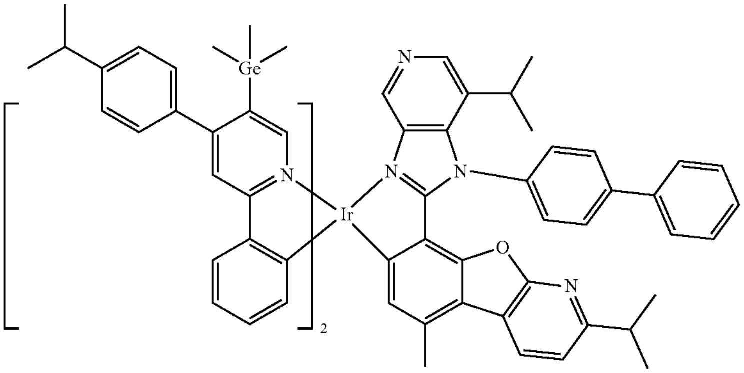

-continued
2465
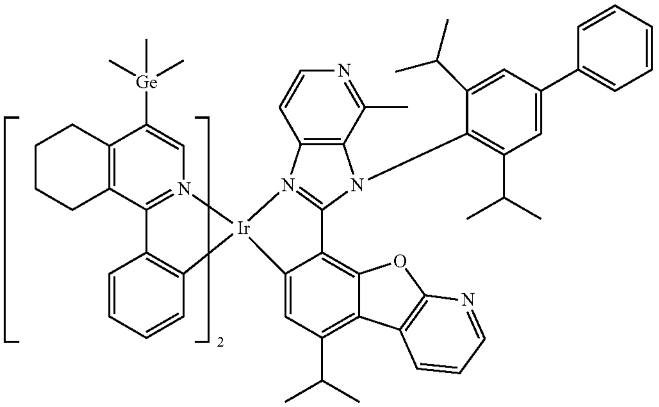
2466
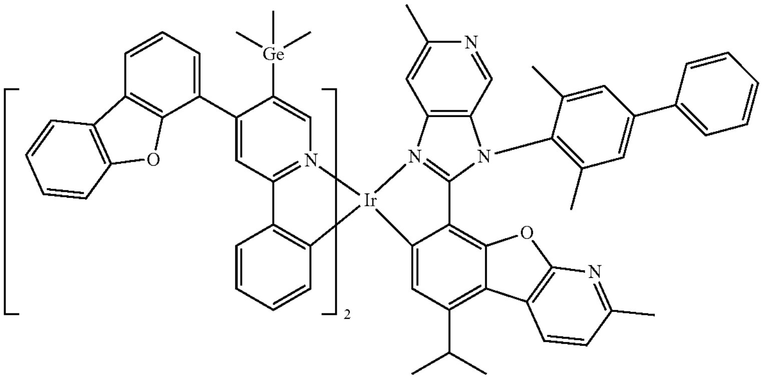
2467
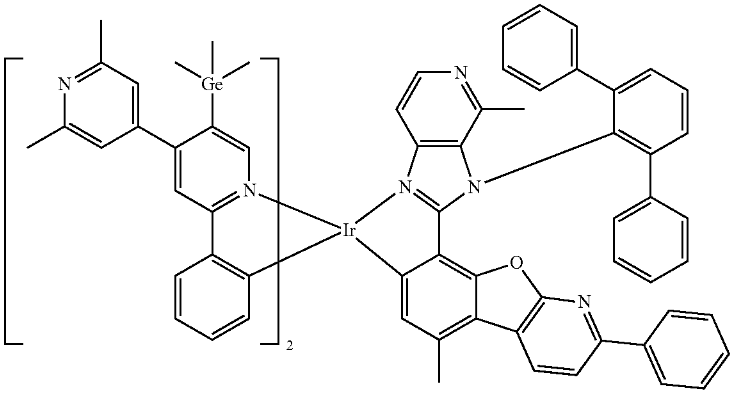
2468
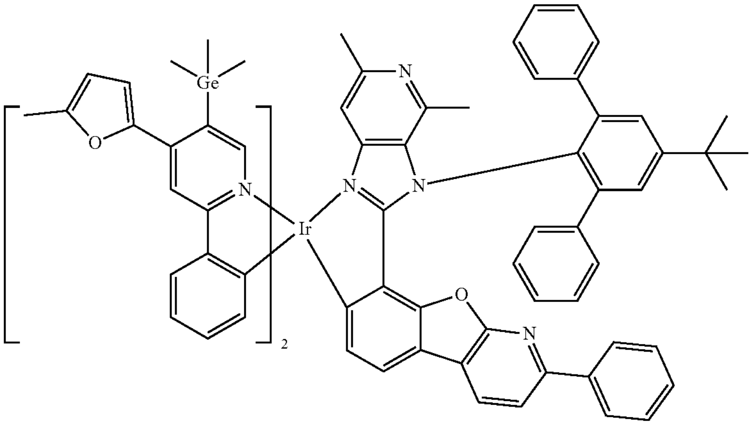

-continued
2469
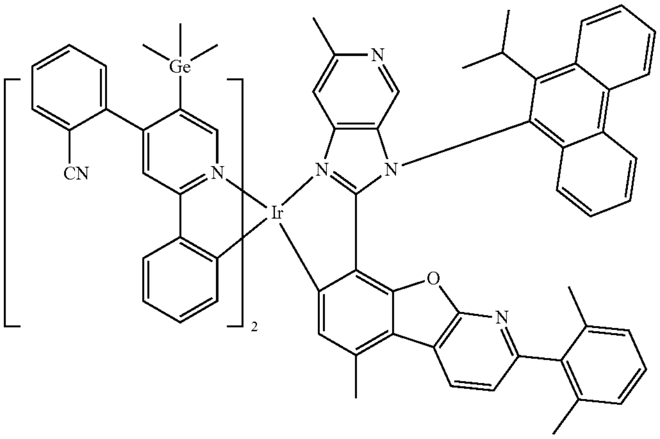
2470
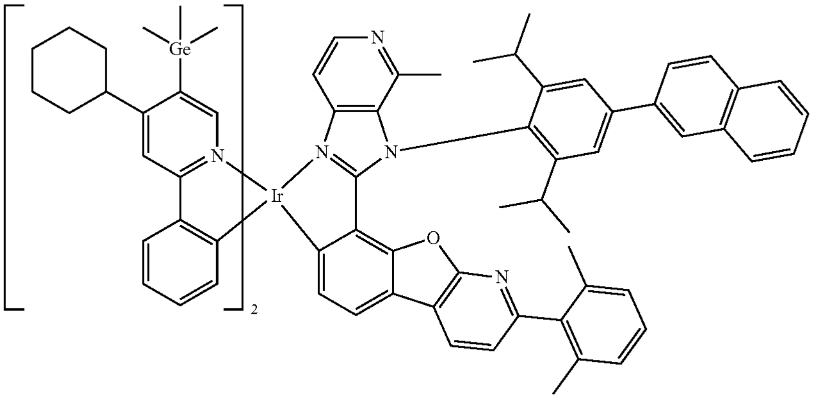
2471
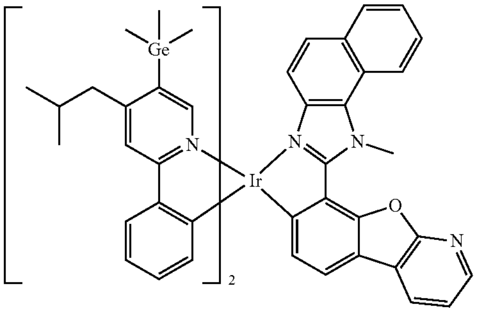
2472
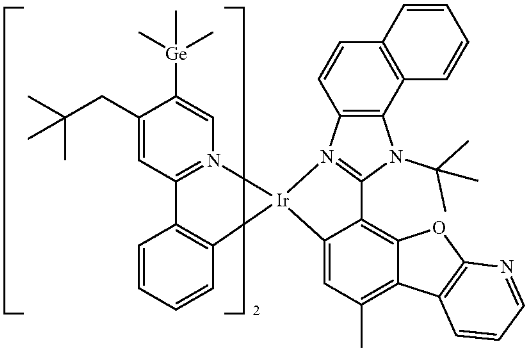
2473
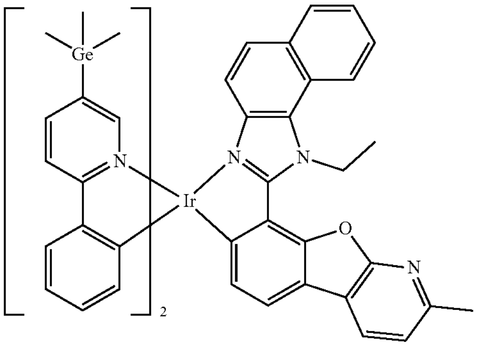
2474
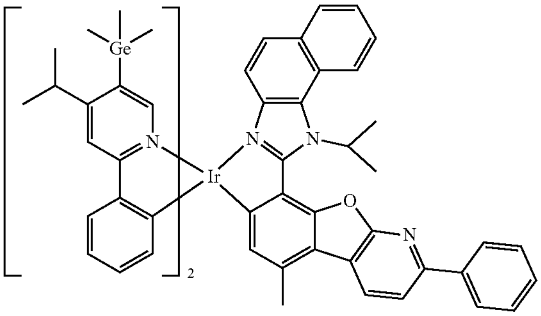

-continued
2475
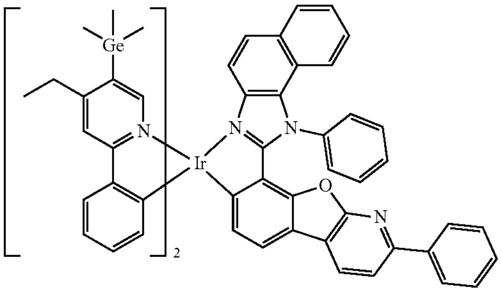
2476
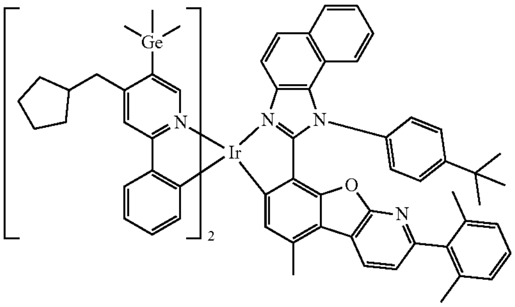
2477
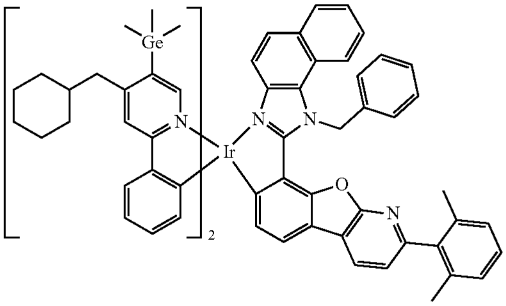
2478
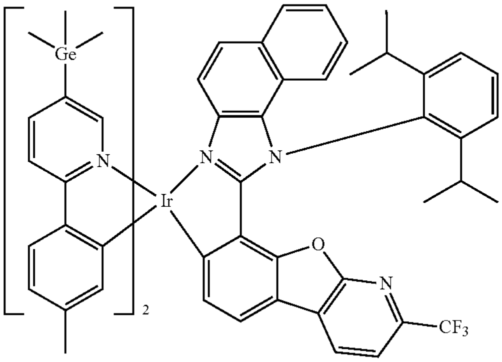
2479
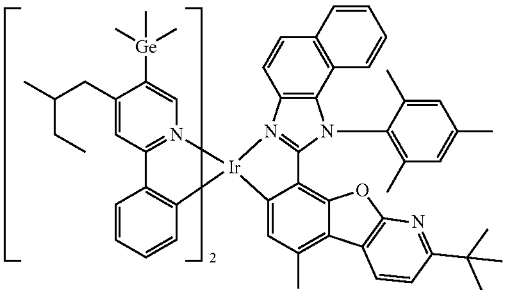
2480
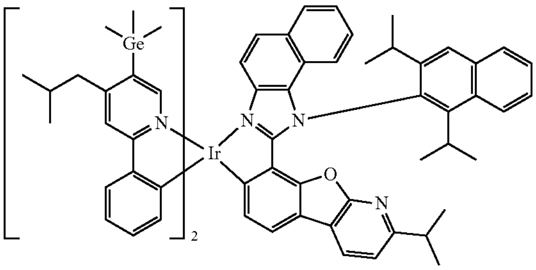
2481
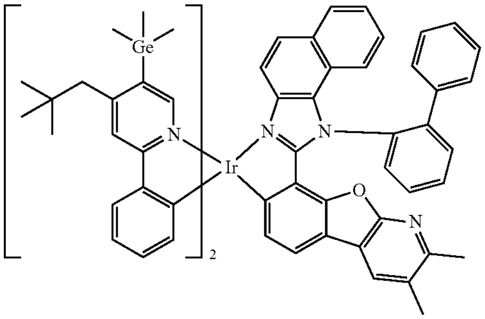
2482
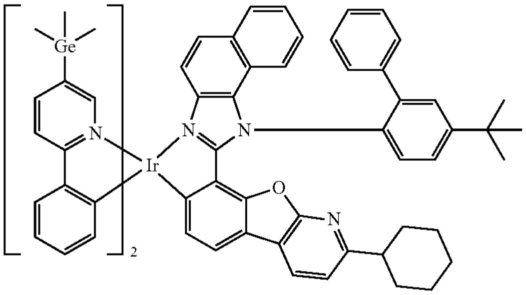
2483
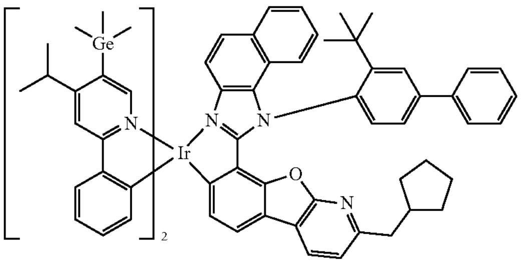
2484
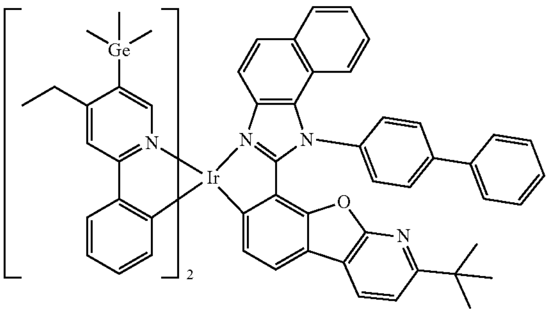

-continued
2485
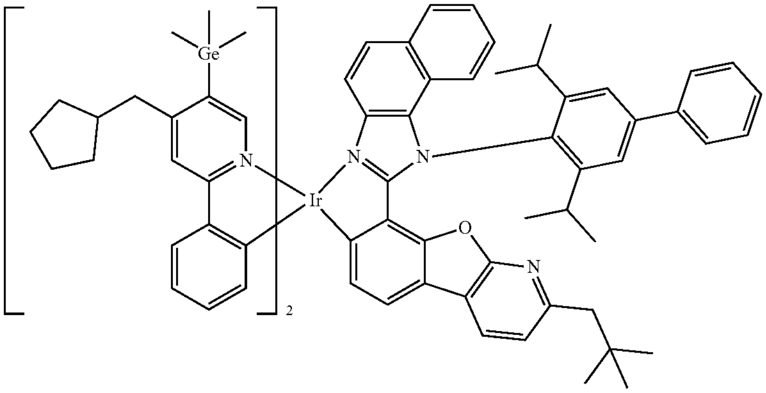
2486
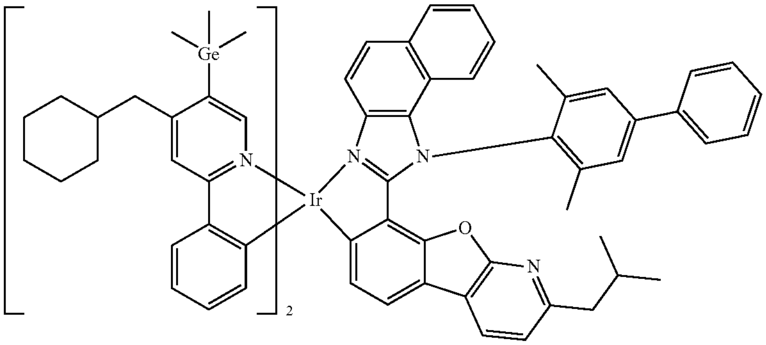
2487
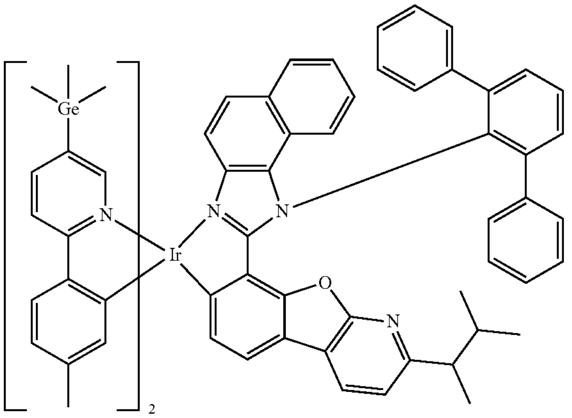
2488
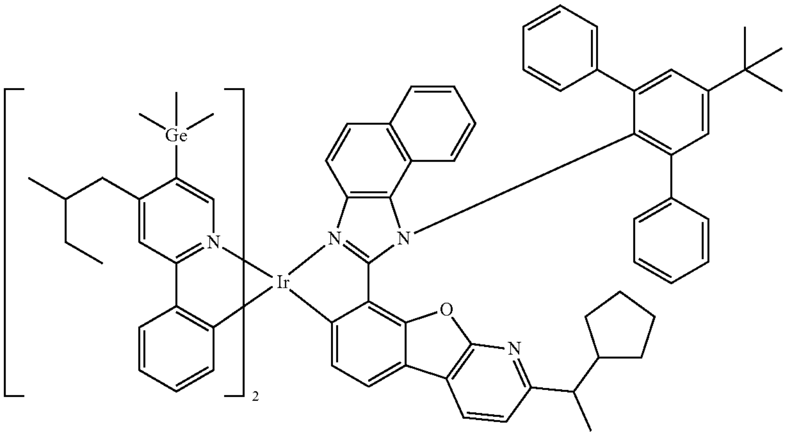

-continued
2489
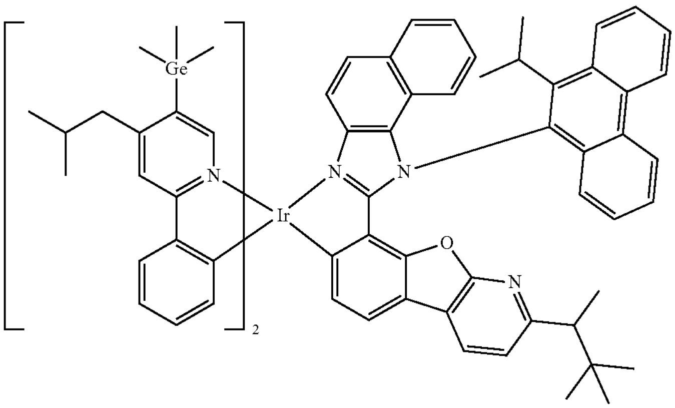
2490
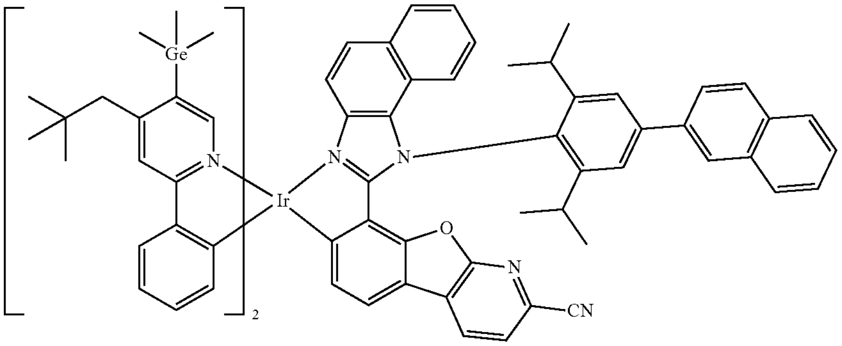
2491
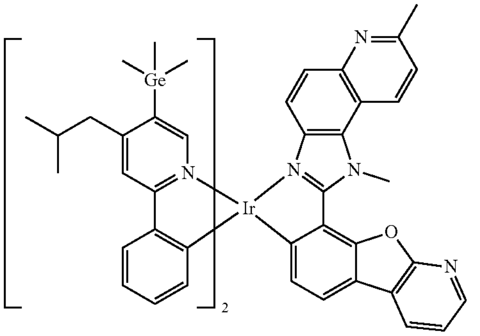
2492
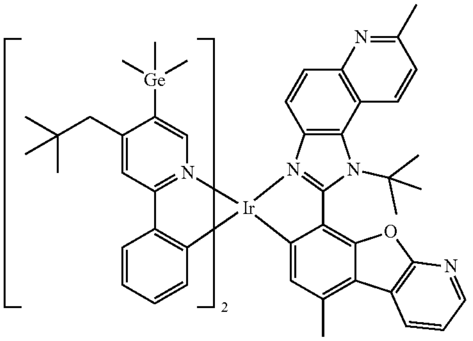
2493
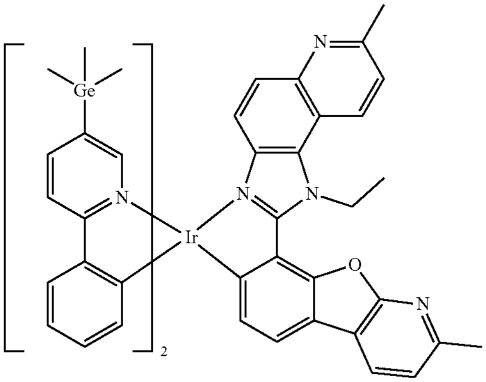
2494
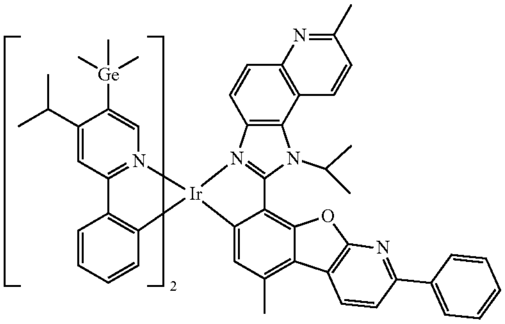

-continued
2495
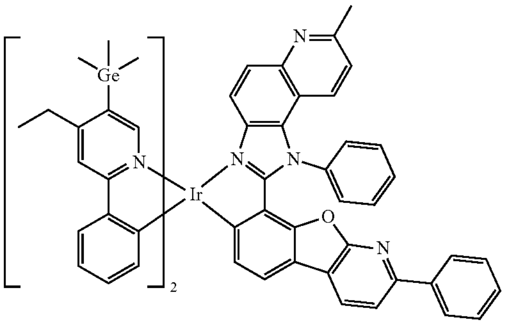
2496
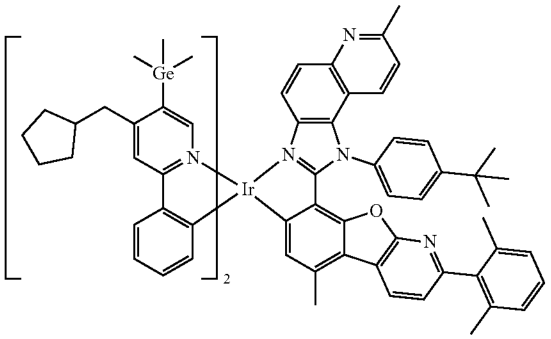
2497
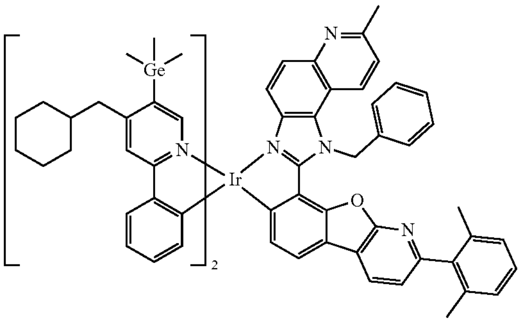
2498
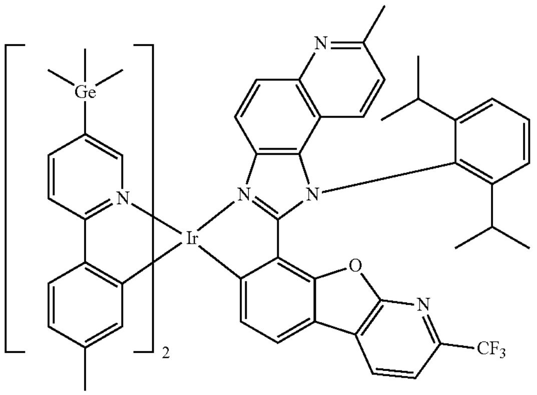
2499
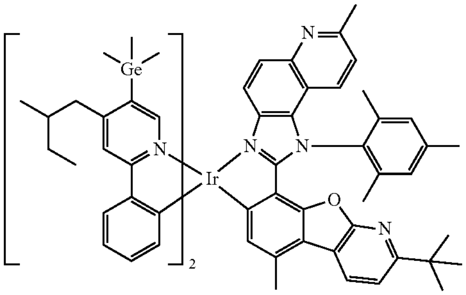
2500
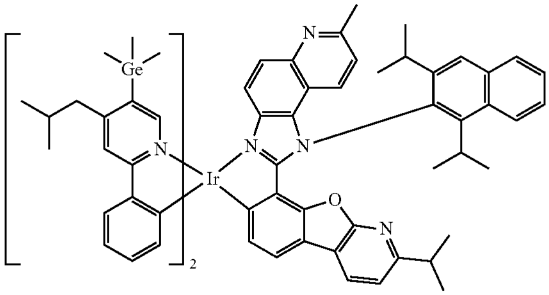
2501
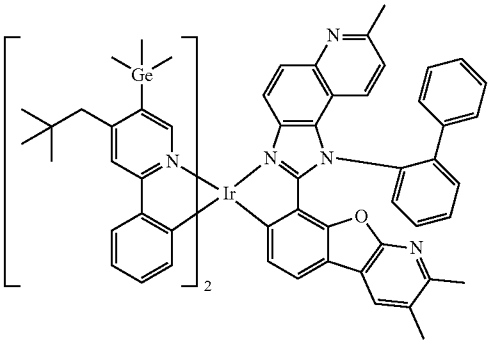
2502
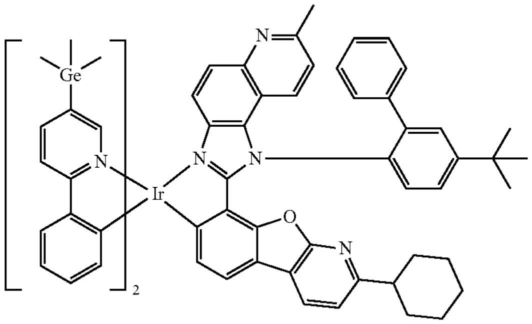

-continued
2503
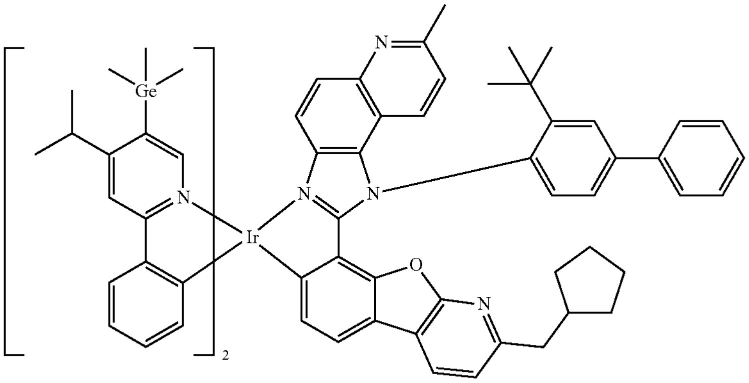
2504
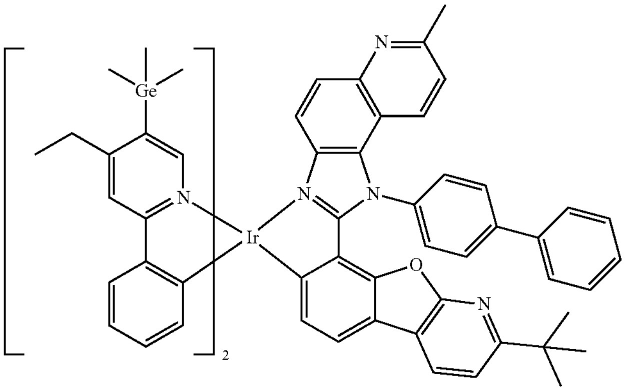
2505
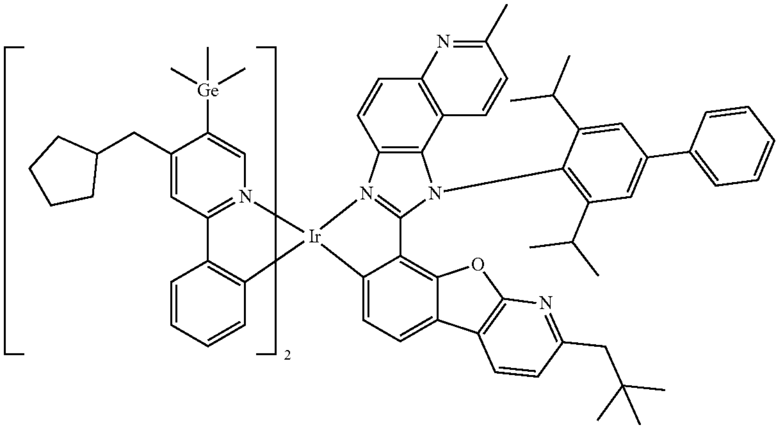
2506
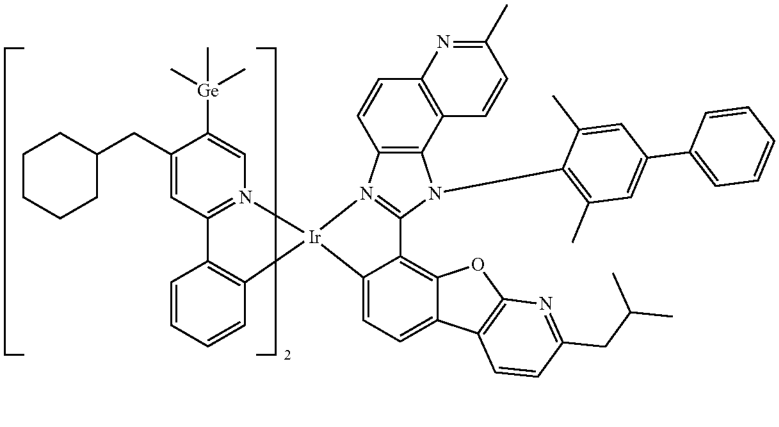

-continued
2507
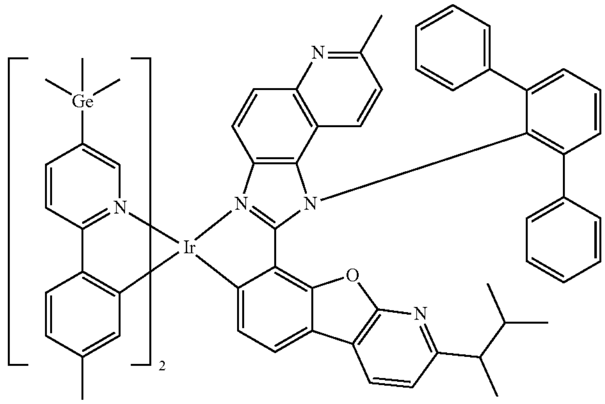
2508
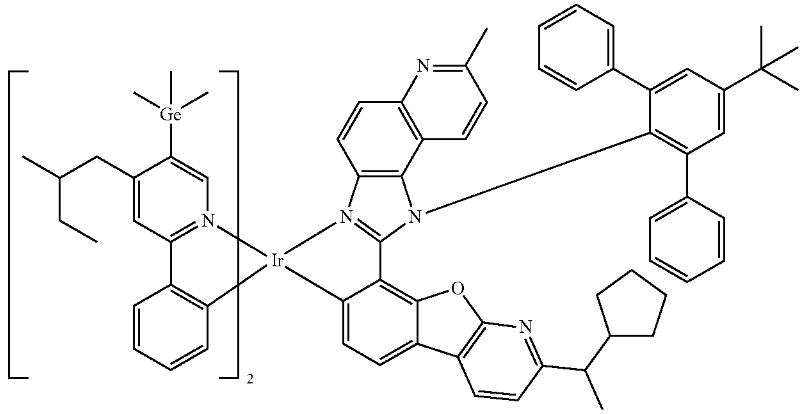
2509
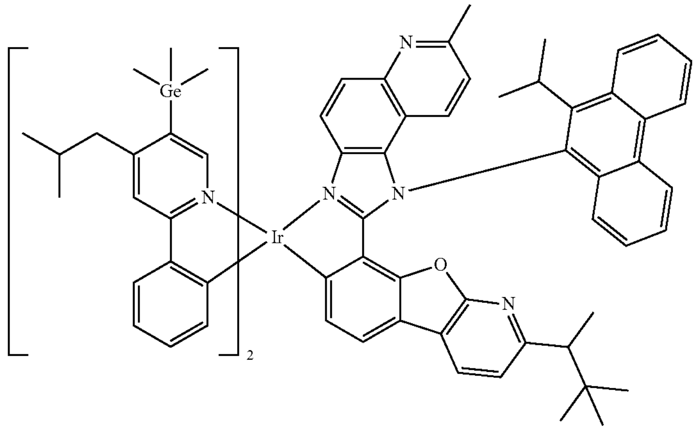
2510
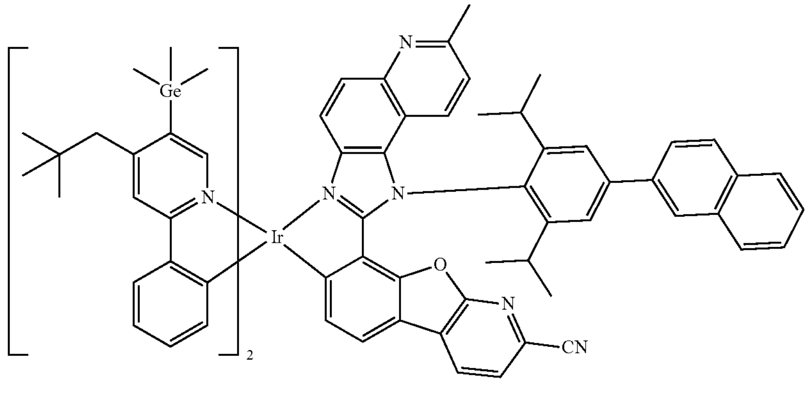

-continued
2511
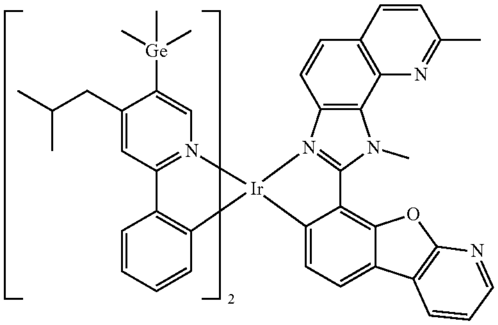
2512
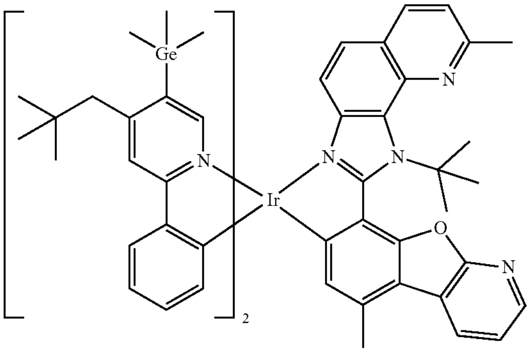
2513
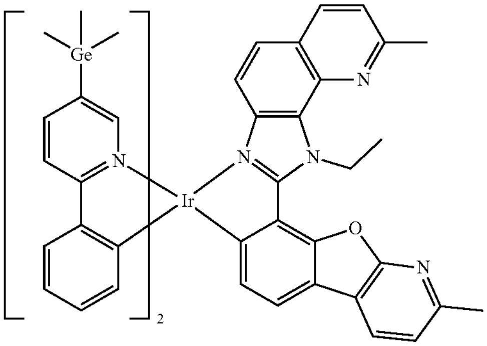
2514
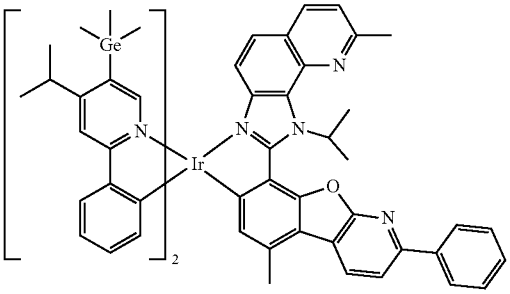
2515
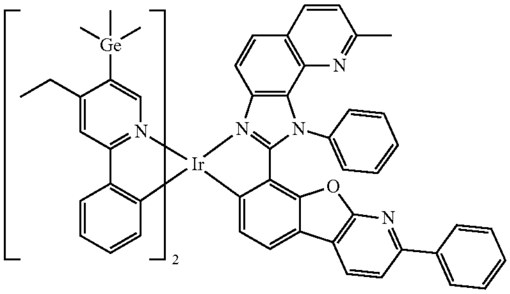
2516
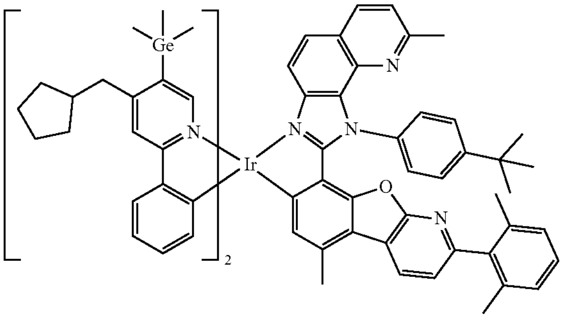
2517
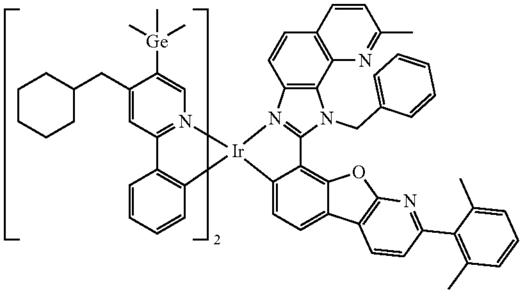
2518
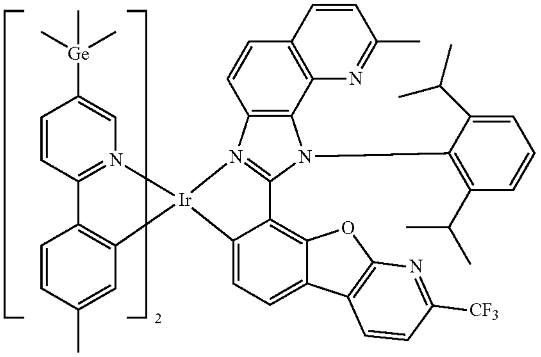

-continued
2519
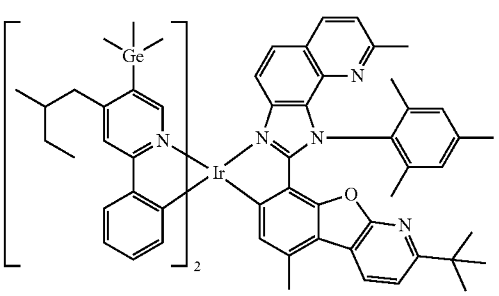
2520
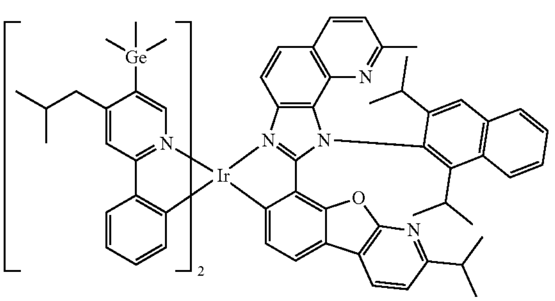
2521
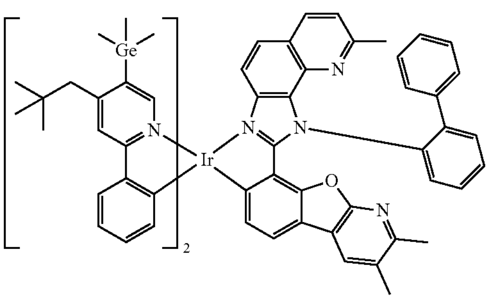
2522
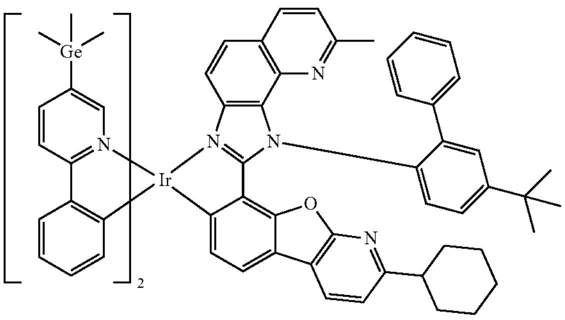
2523
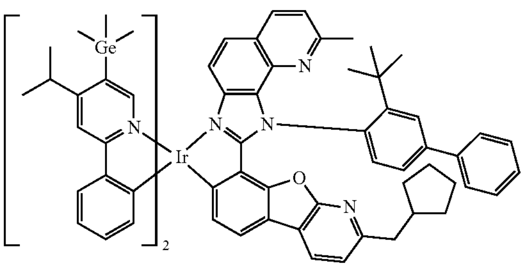
2524
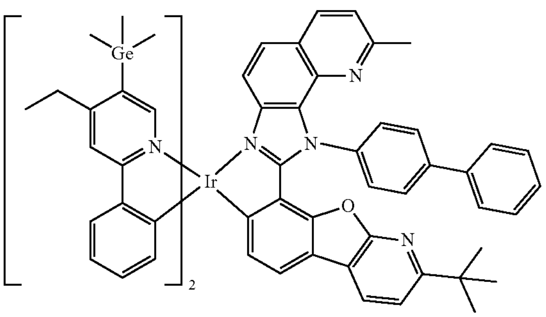
2525
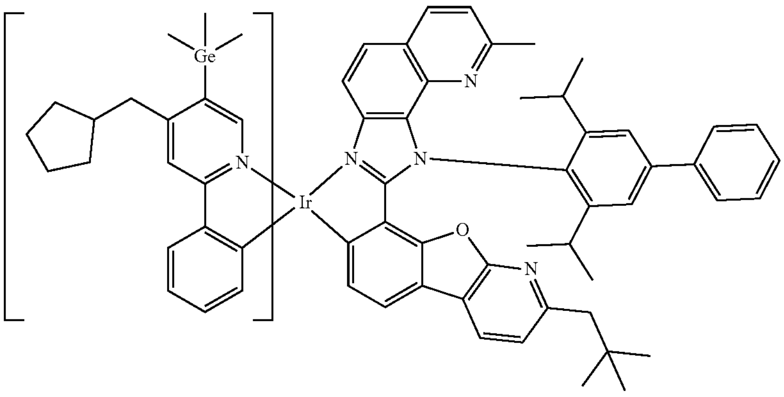

-continued
2526
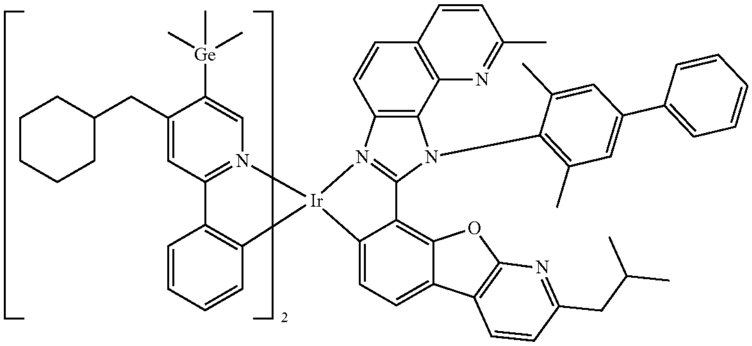
2527
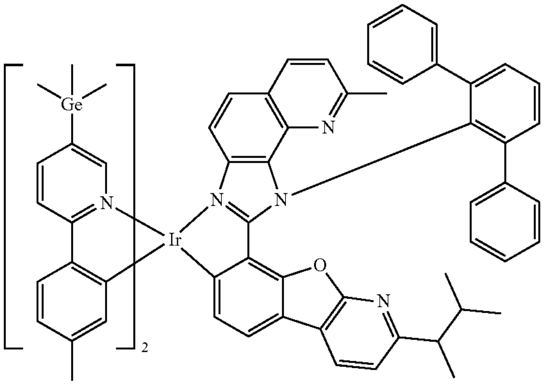
2528
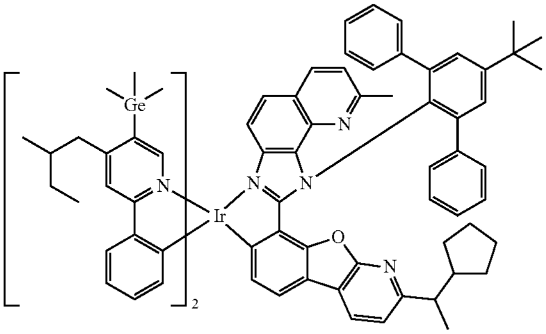
2529
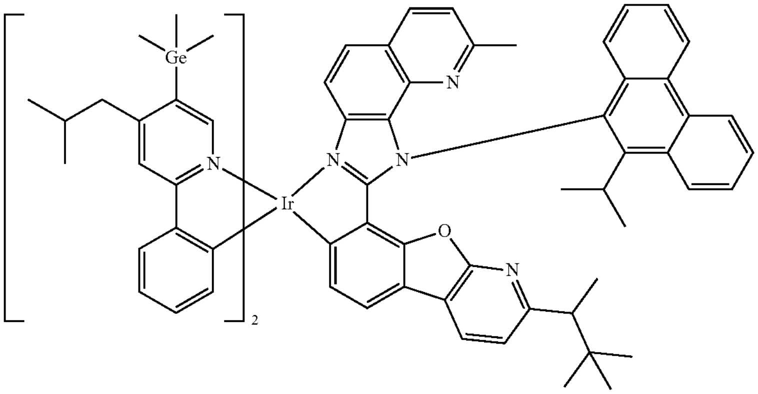
2530
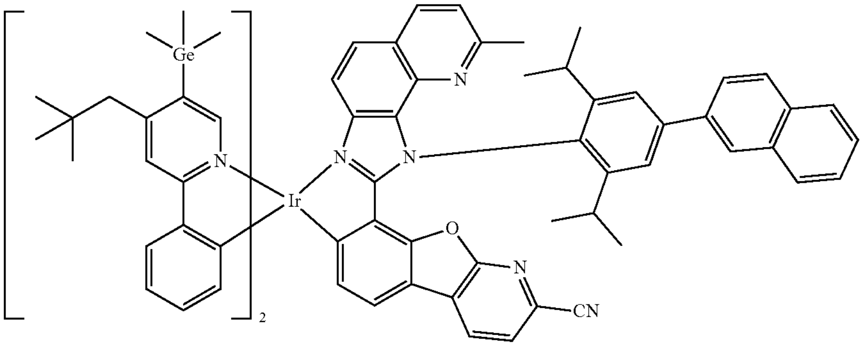

-continued
2531
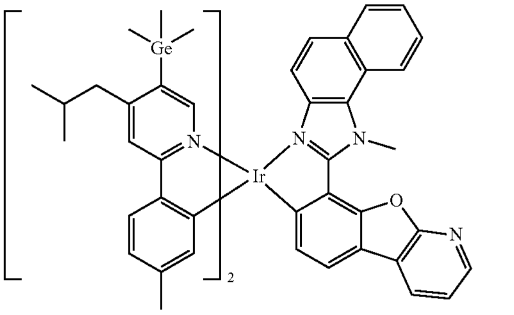
2532
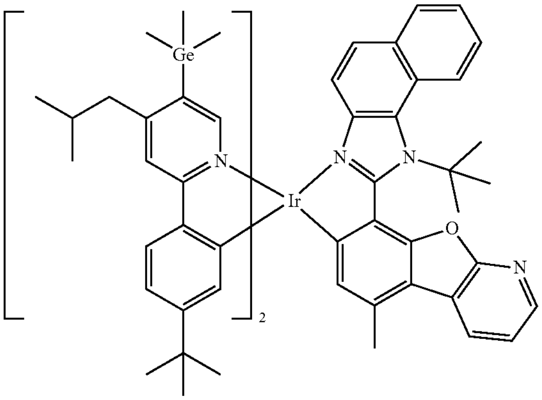
2533
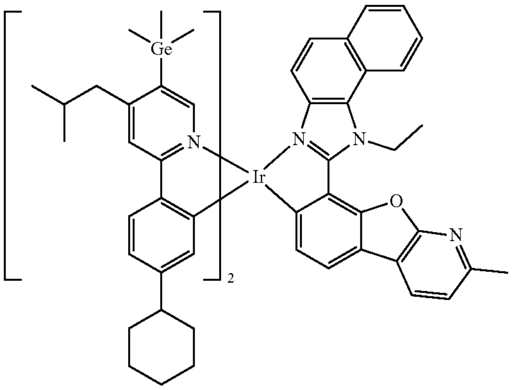
2534
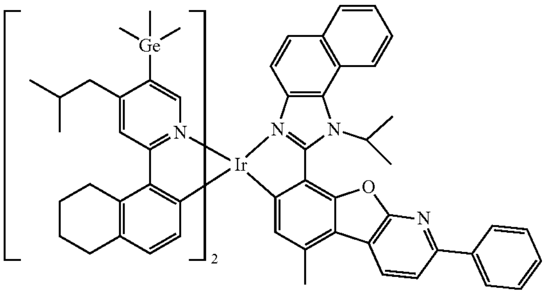
2535
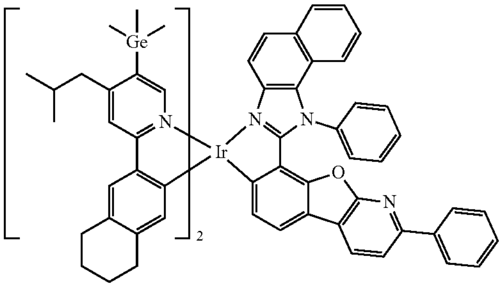
2536
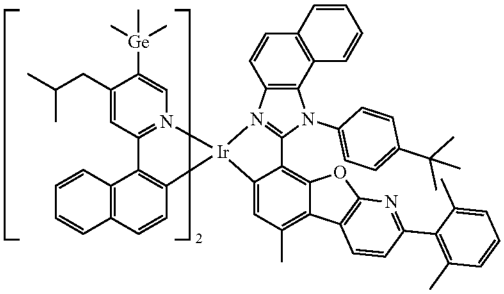
2537
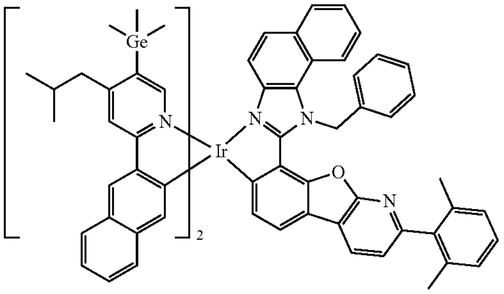
2538
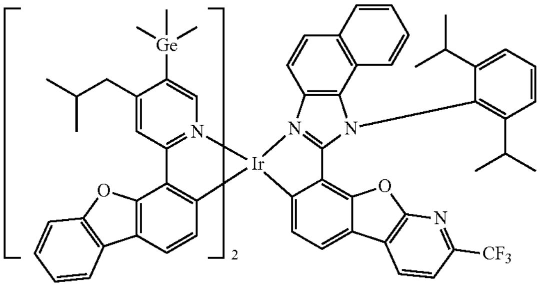

-continued
2539
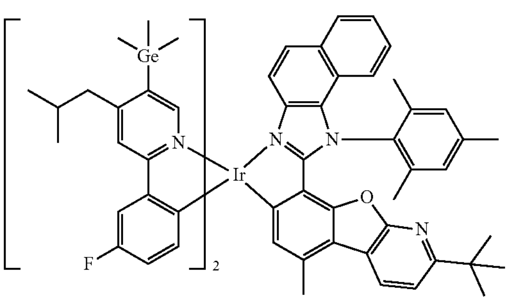
2540
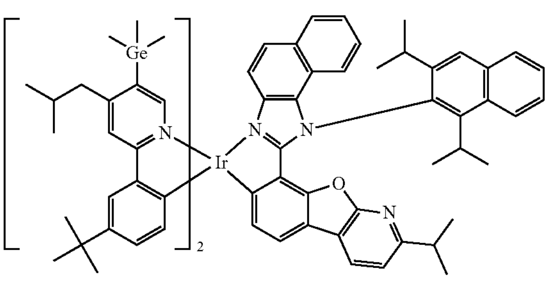
2541
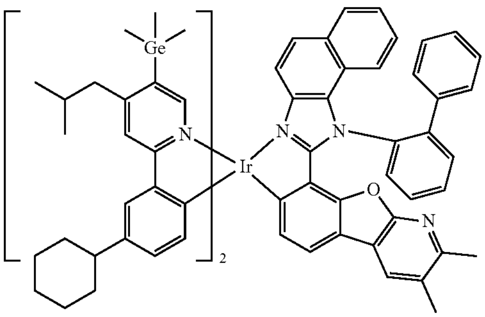
2542
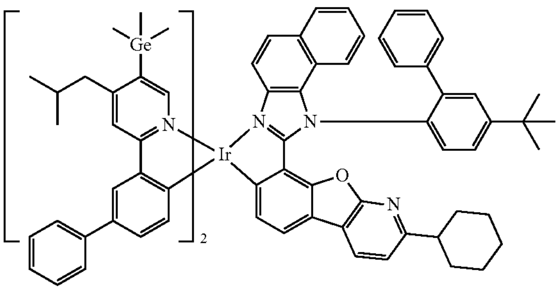
2543
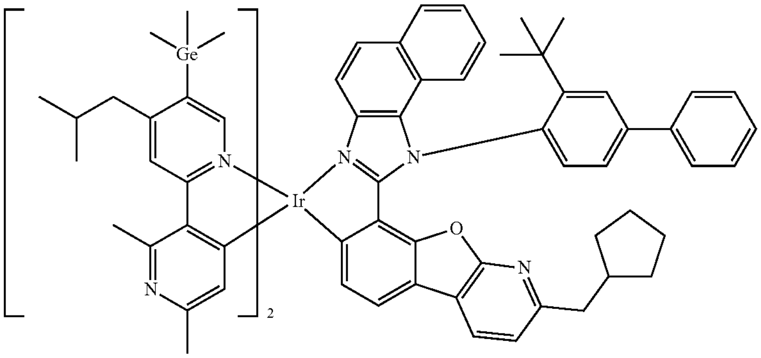
2544
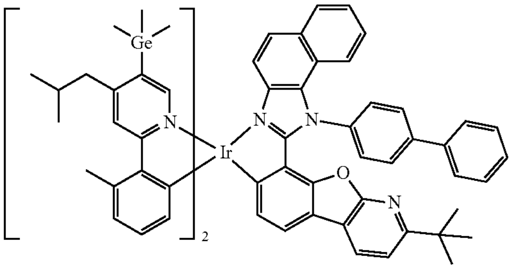
2545
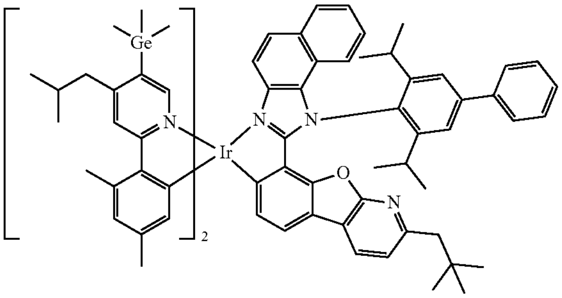

-continued
2546
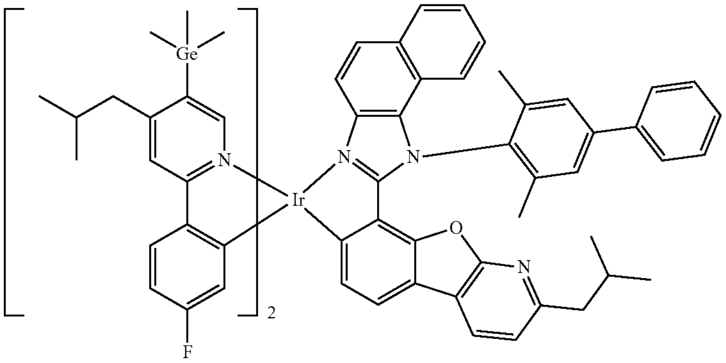
2547
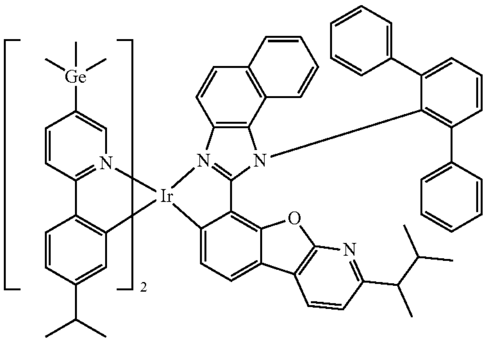
2548
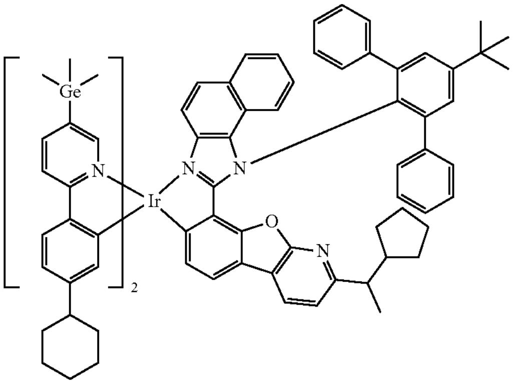
2549
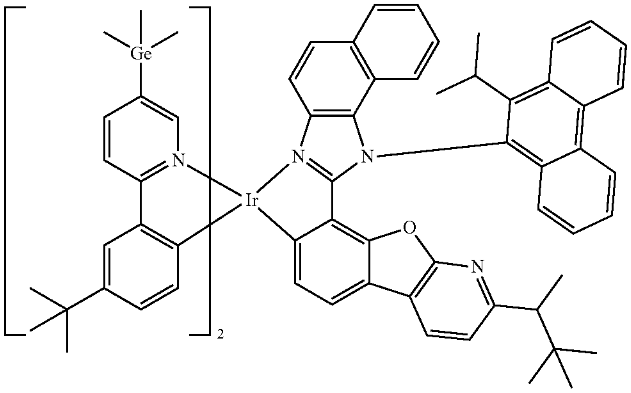
2550
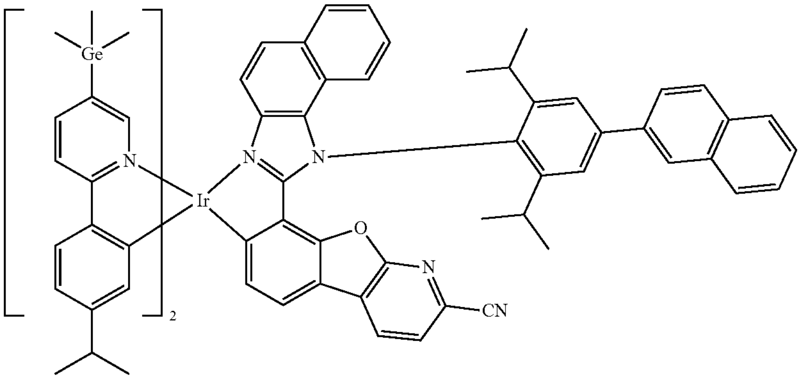

-continued
2551
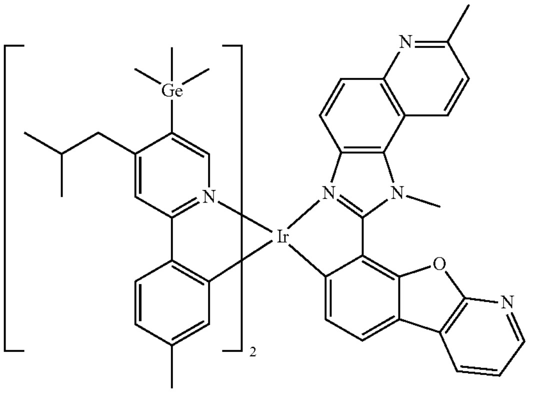
2552
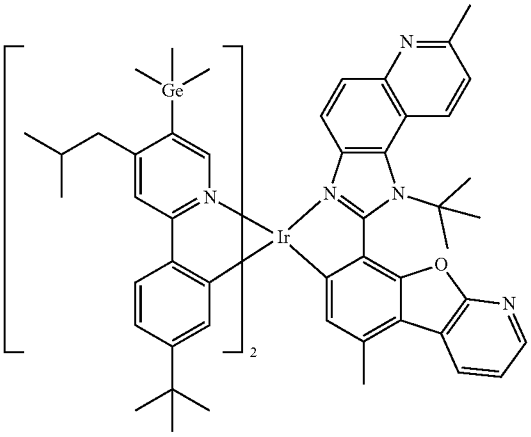
2553
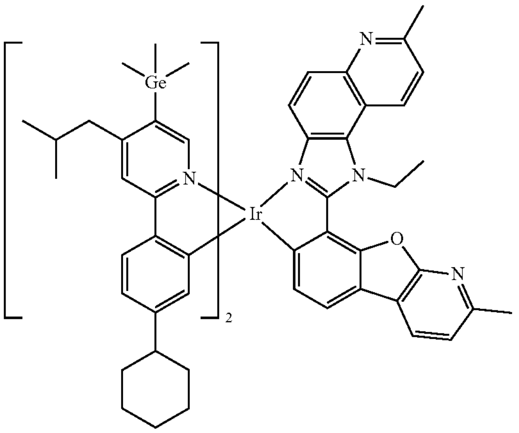
2554
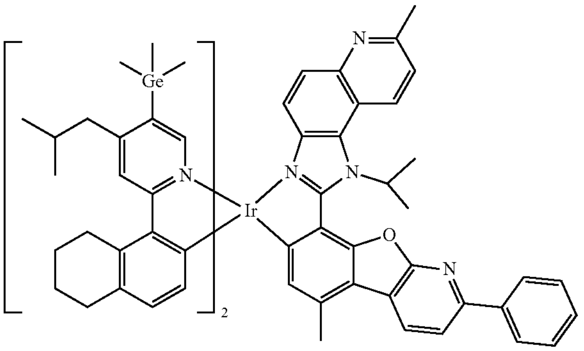
2555
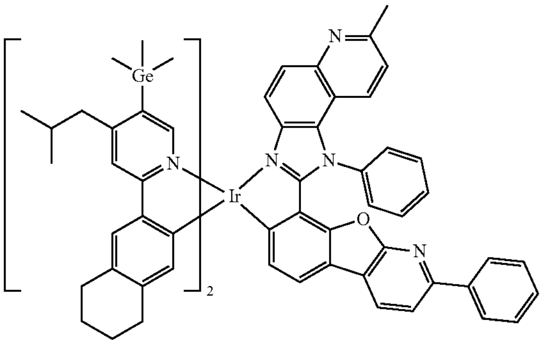
2556
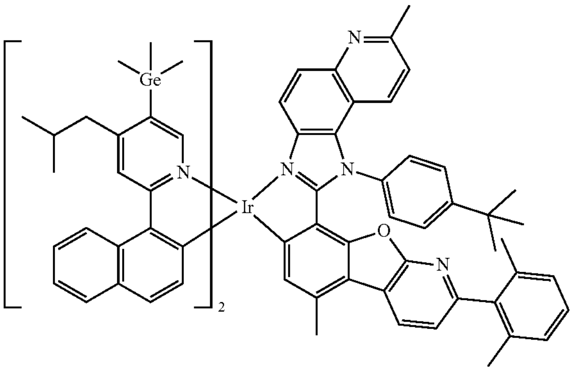
2557
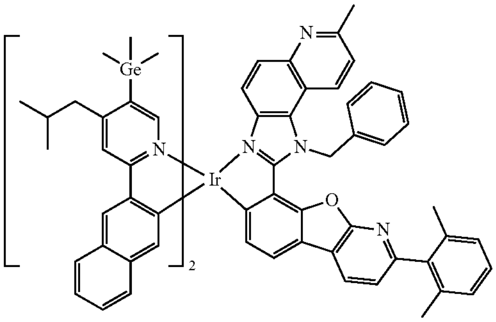
2558
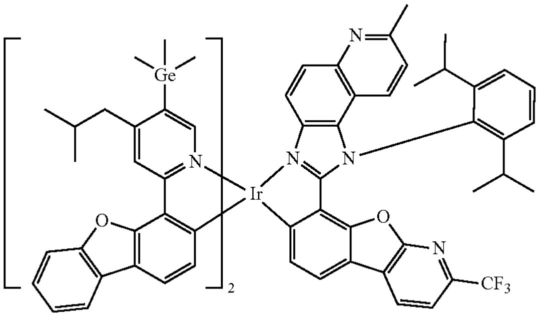

-continued
2559
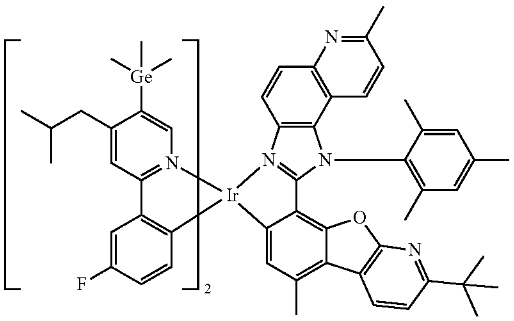
2560
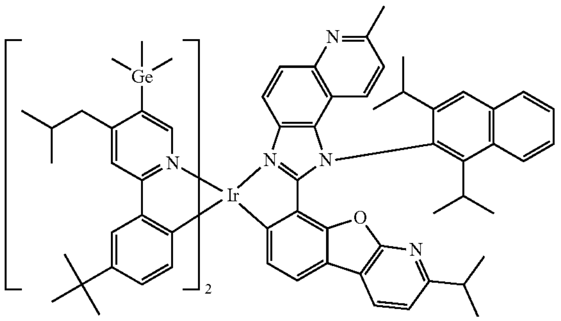
2561
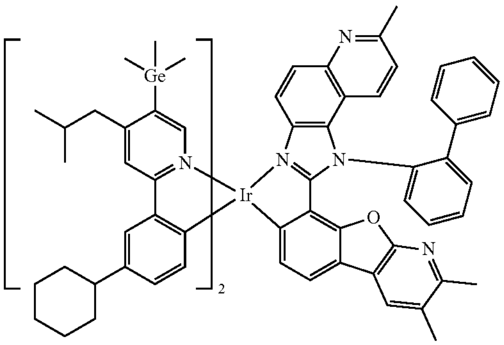
2562
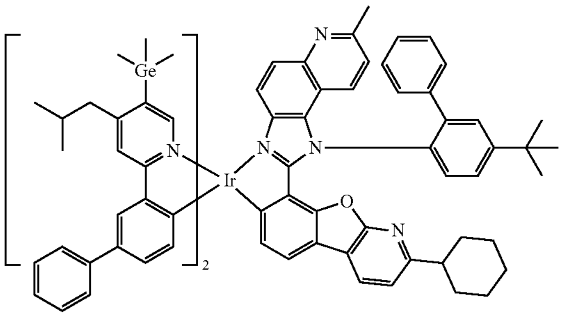
2563
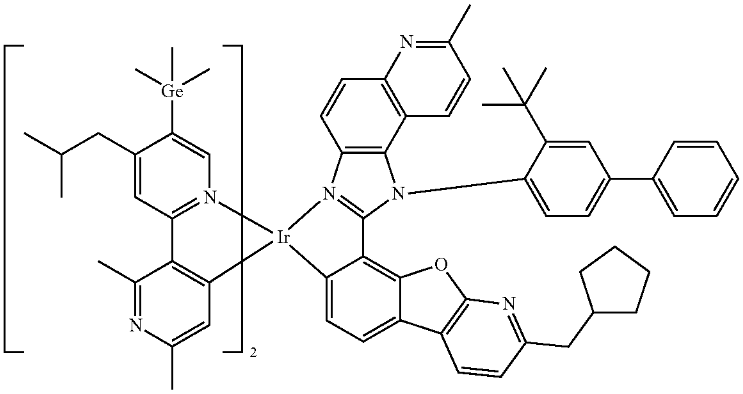
2564
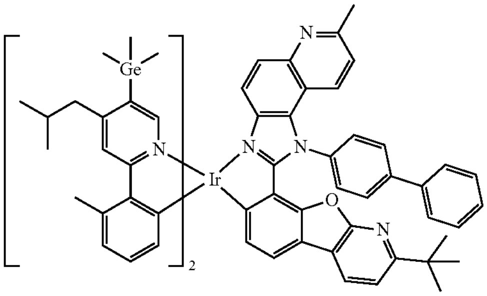
2565
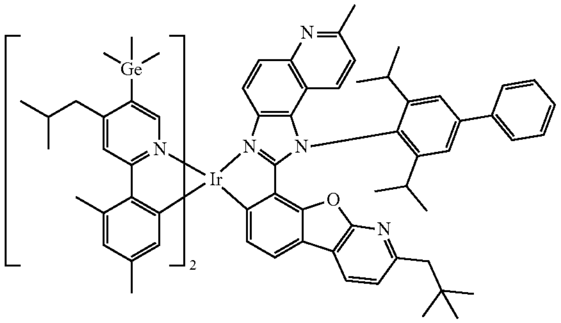

-continued
2566
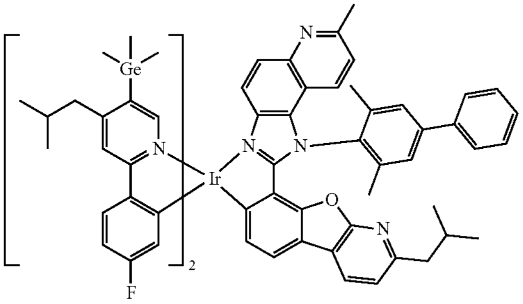
2567
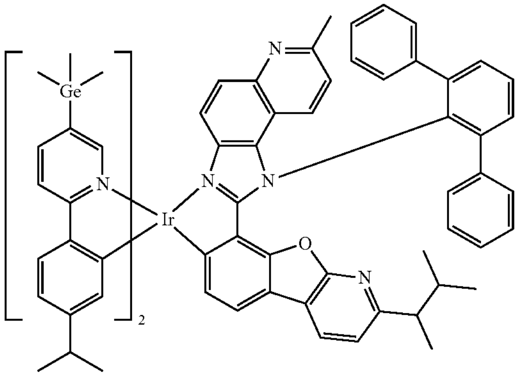
2568
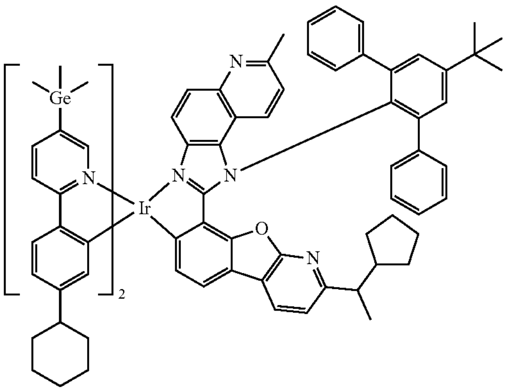
2569
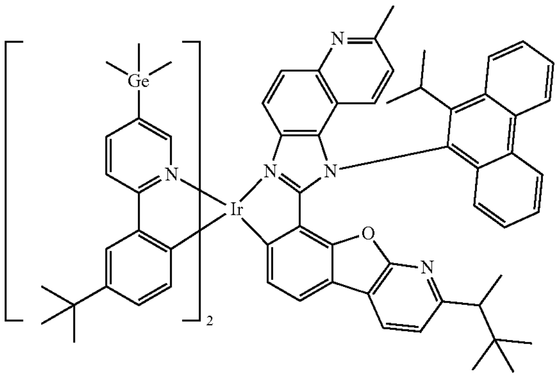
2570
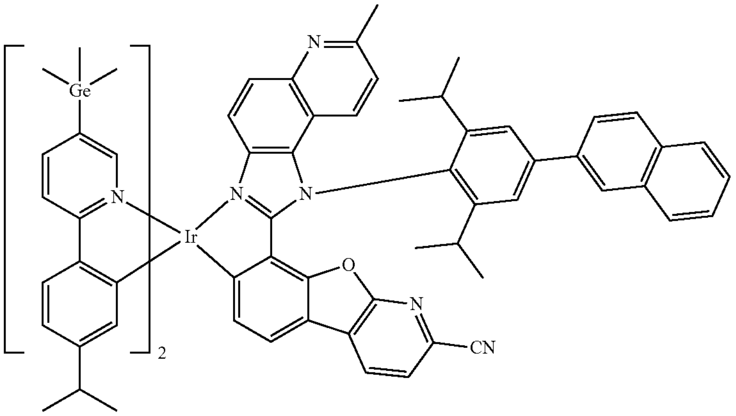
2571
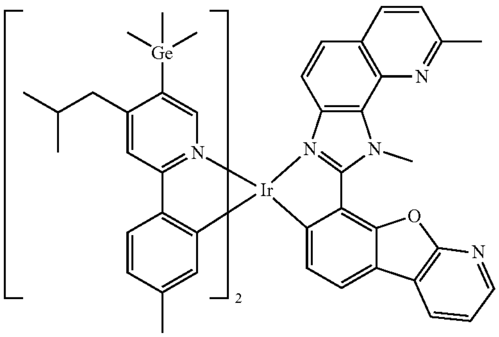
2572
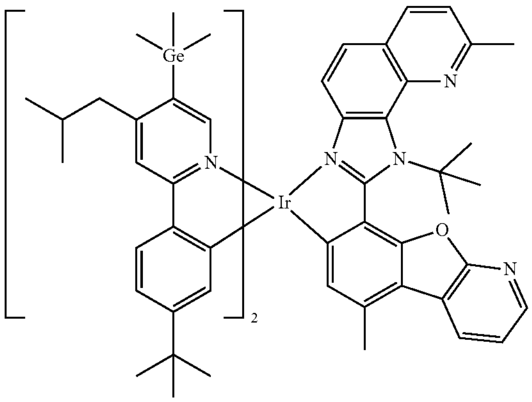

-continued
2573
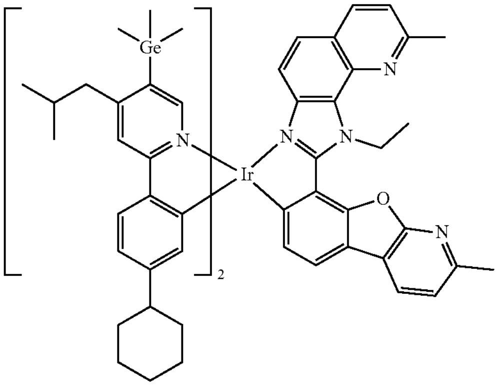
2574
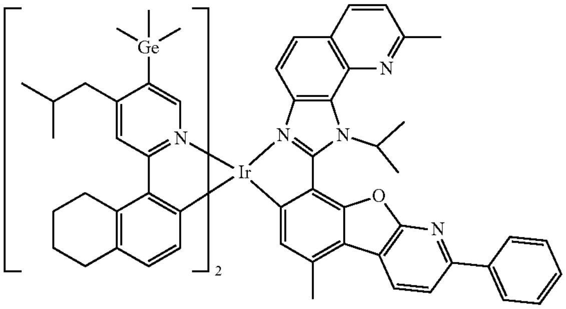
2575
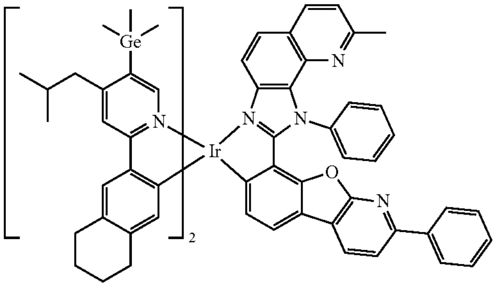
2576
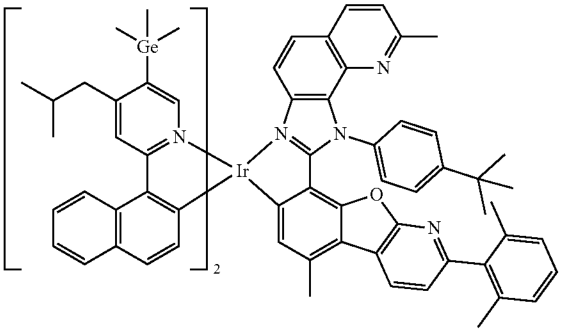
2577
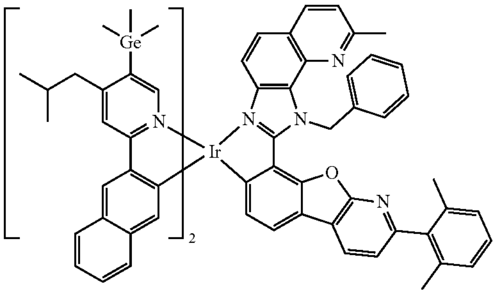
2578
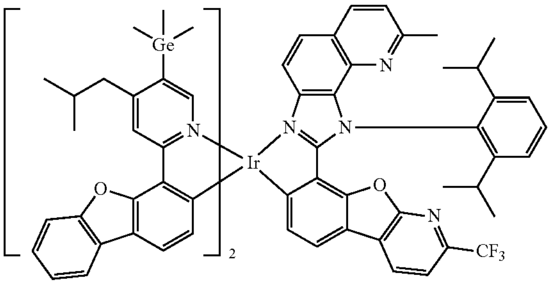
2579
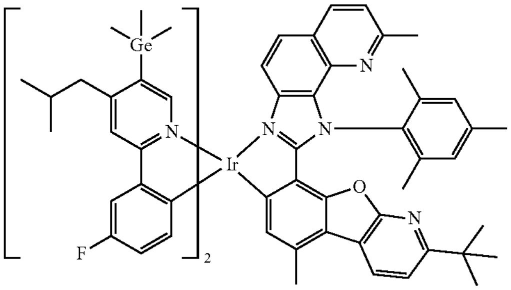
2580
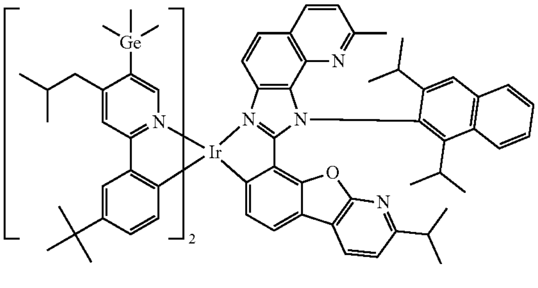

-continued
2581
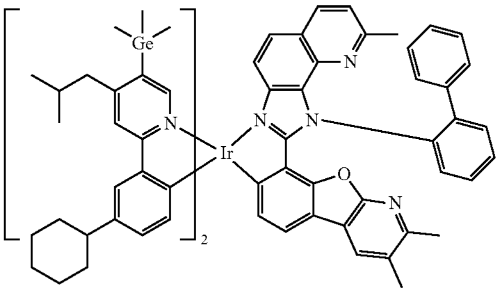
2582
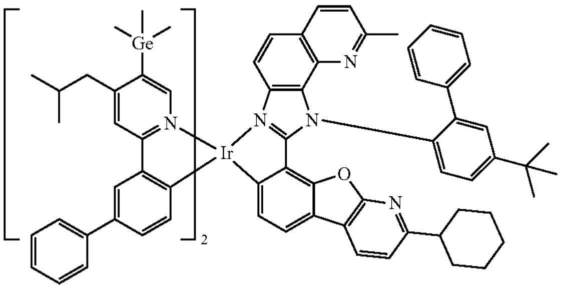
2583
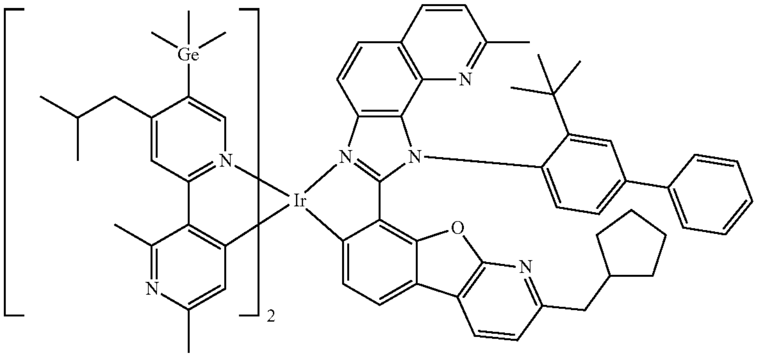
2584
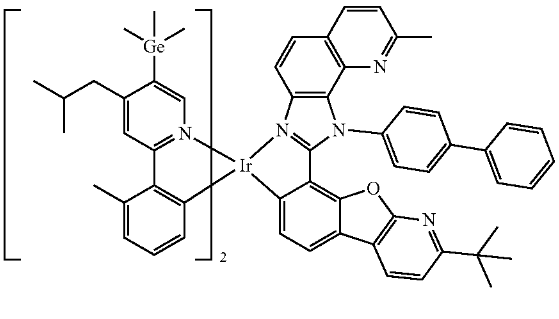
2585
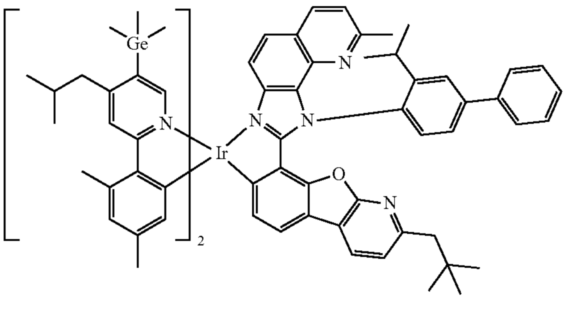
2586
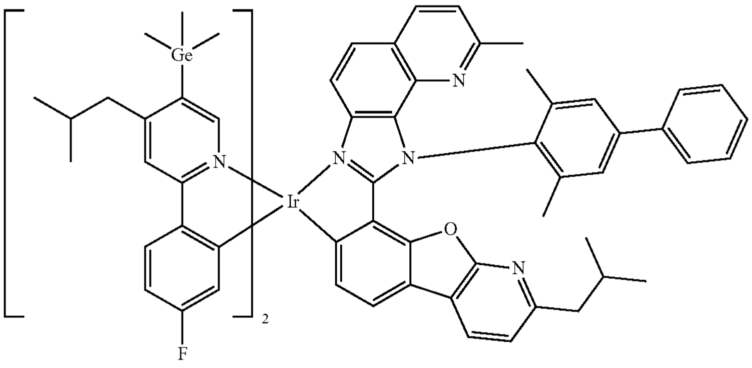

-continued
2587
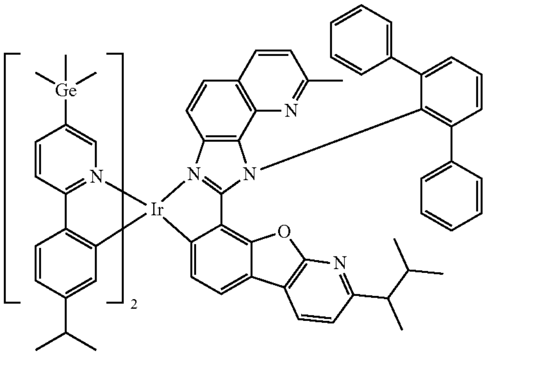
2588
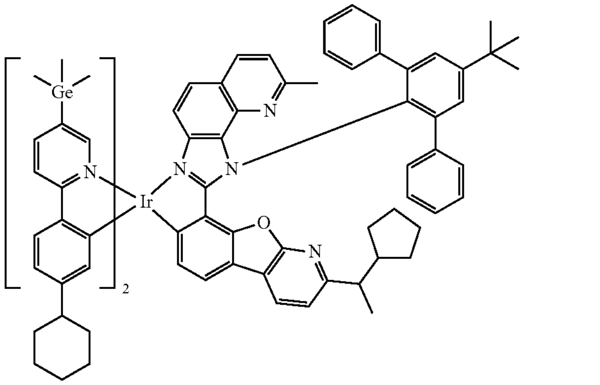
2589
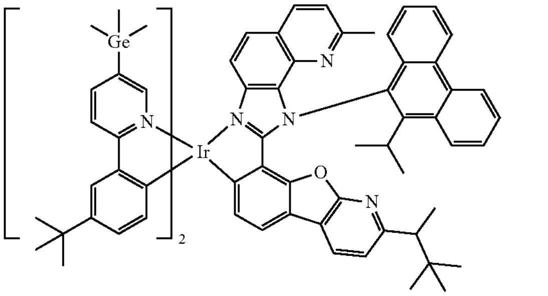
2590
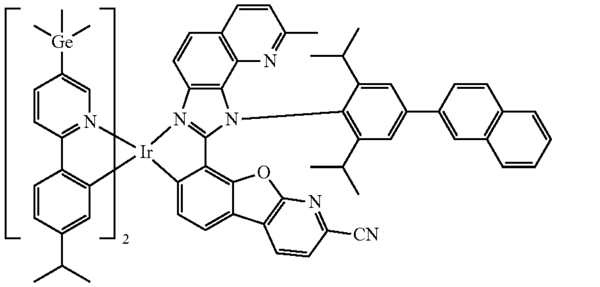
2591
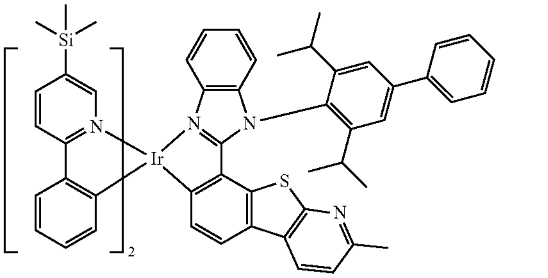
2592
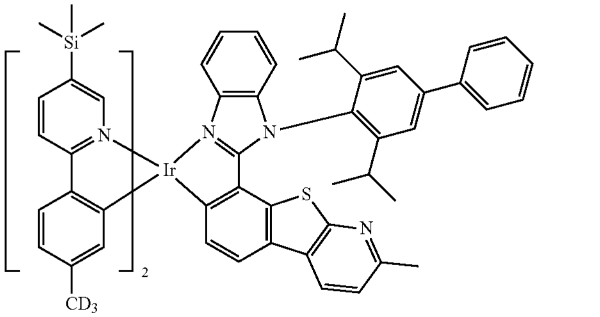
2593
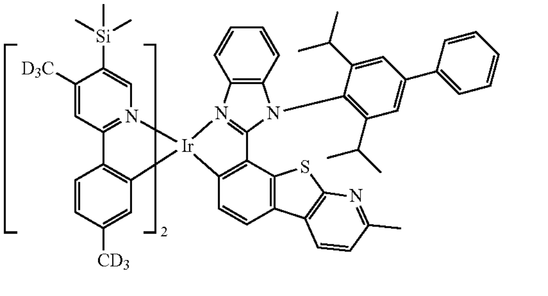
2594
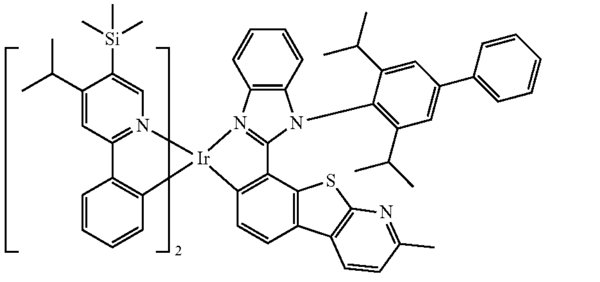
2595
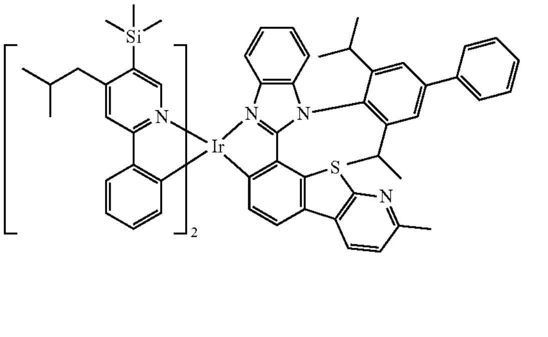
2596
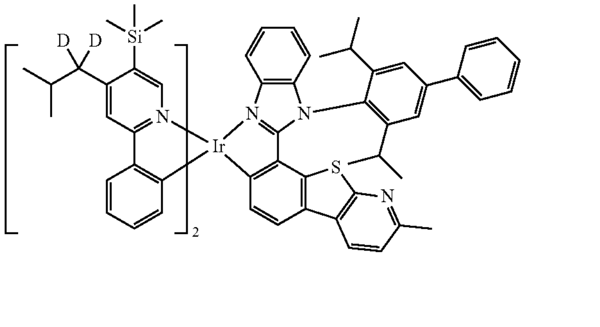

-continued
2597
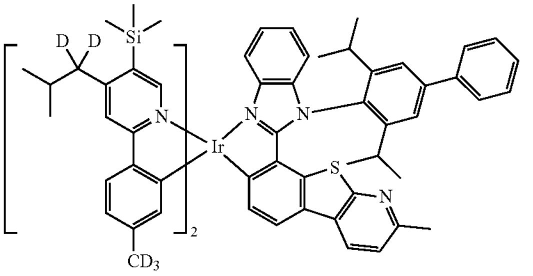
2598
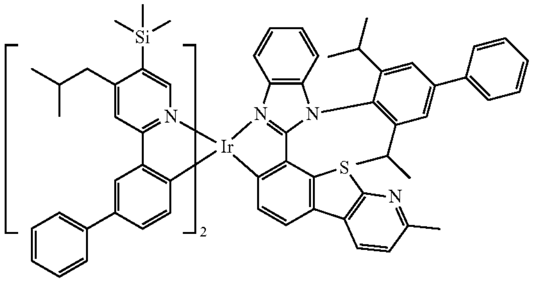
2599
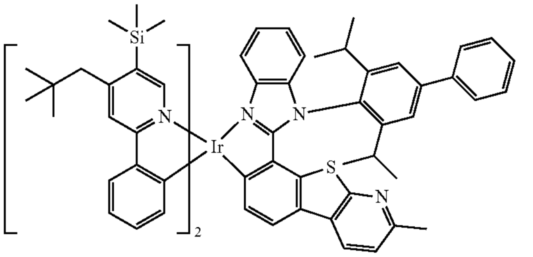
2600
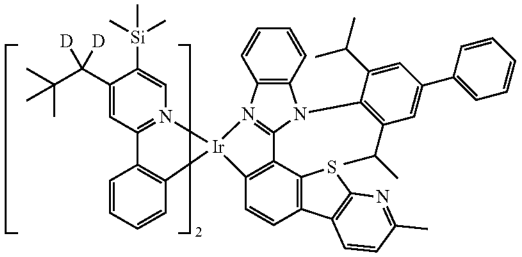
2601
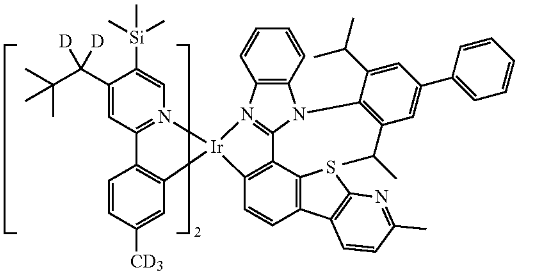
2602
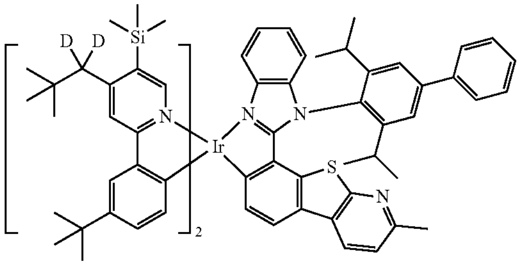
2603
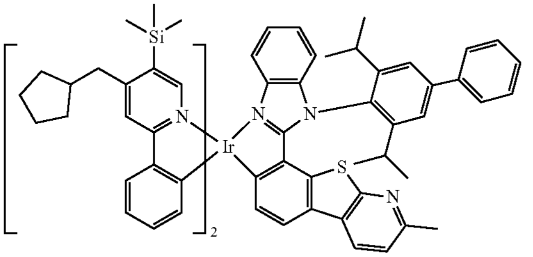
2604
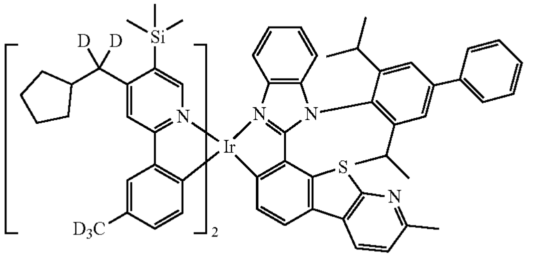
2605
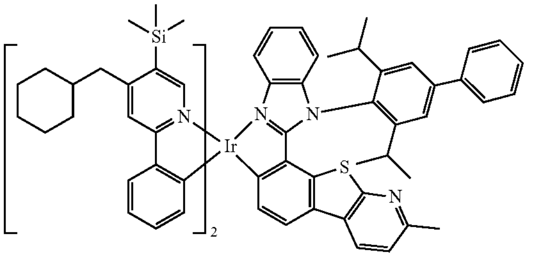
2606
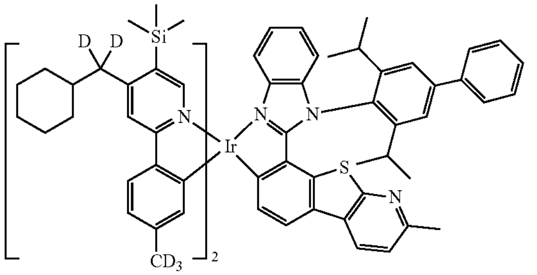

-continued
2607
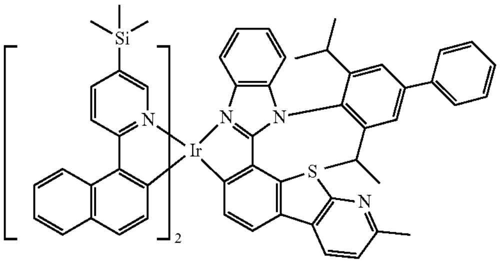
2608
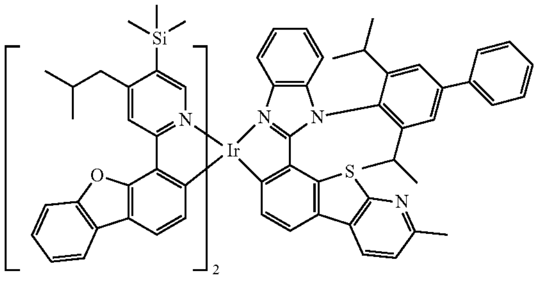
2609
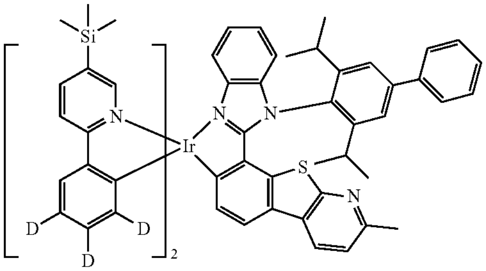
2610
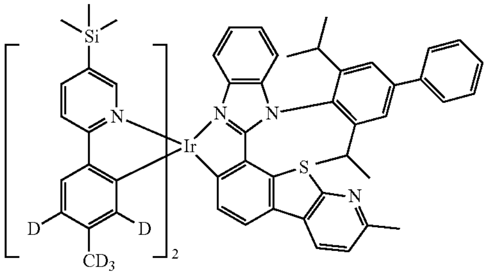
2611
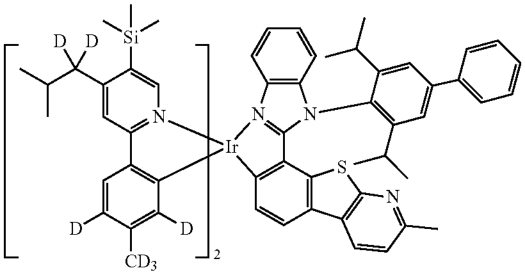
2612
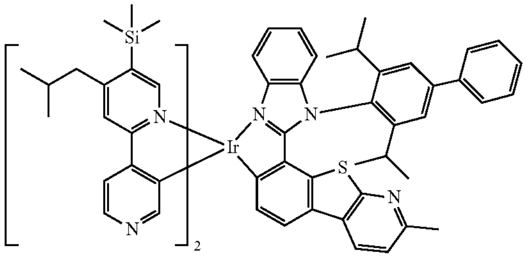
2613
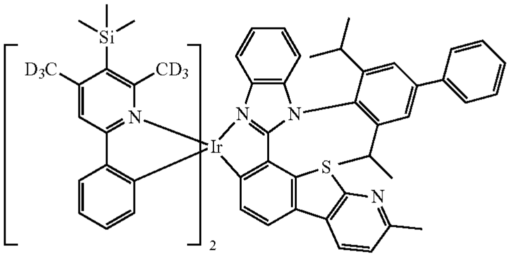
2614
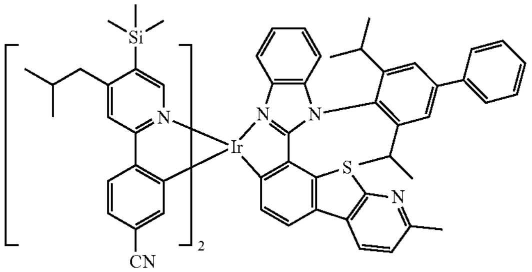
2615
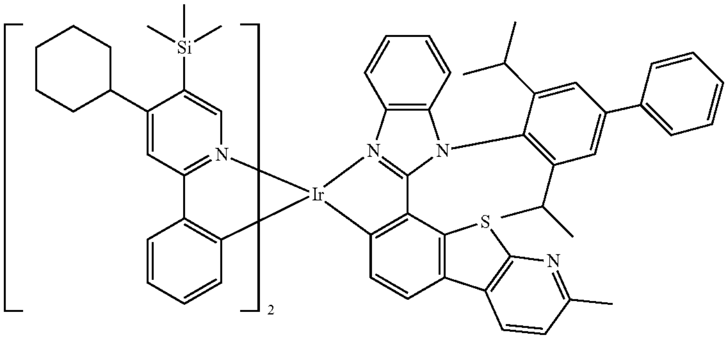

-continued
2616
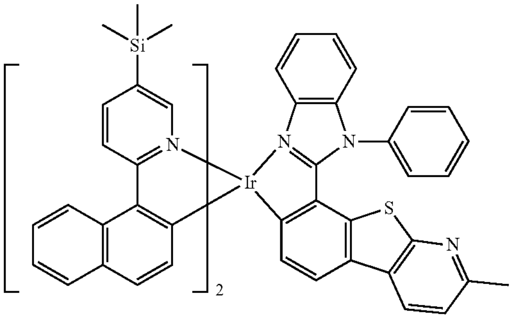
2617
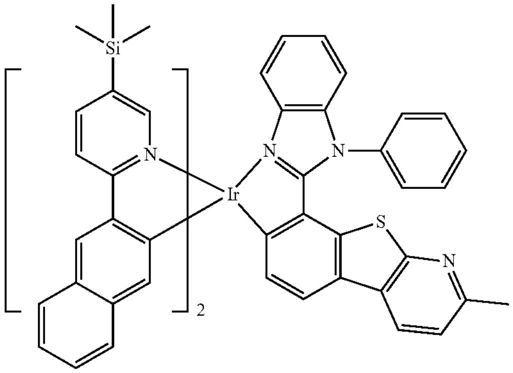
2618
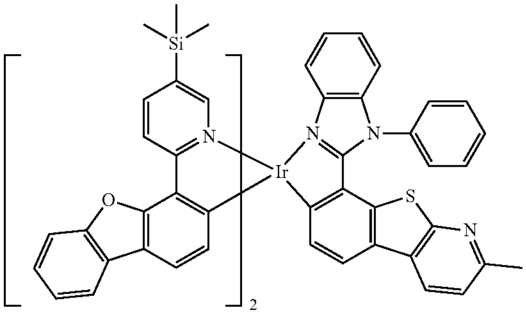
2619
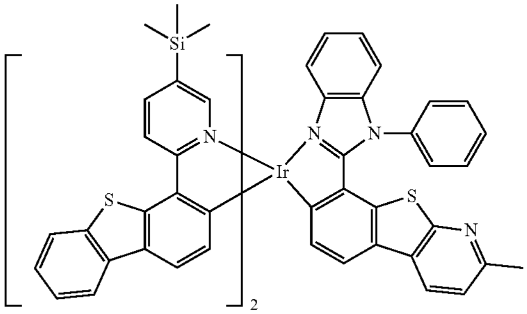
2620
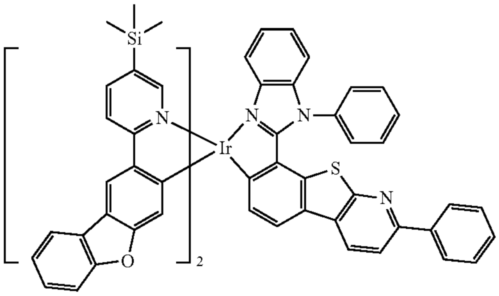
2621
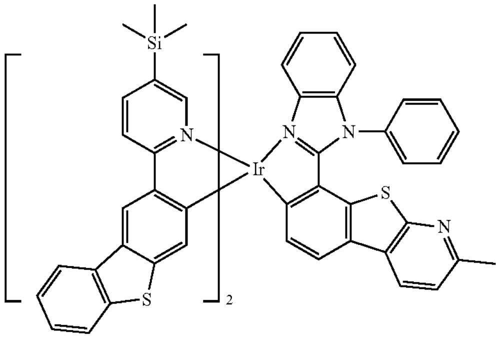
2622
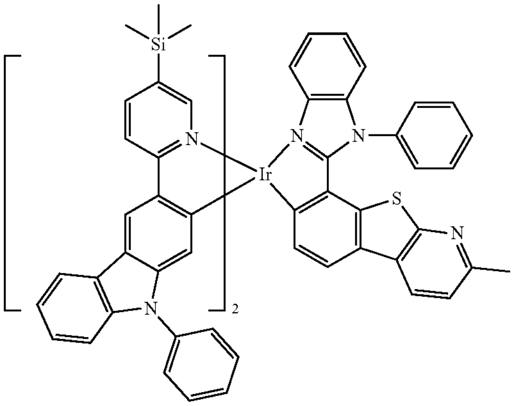
2623
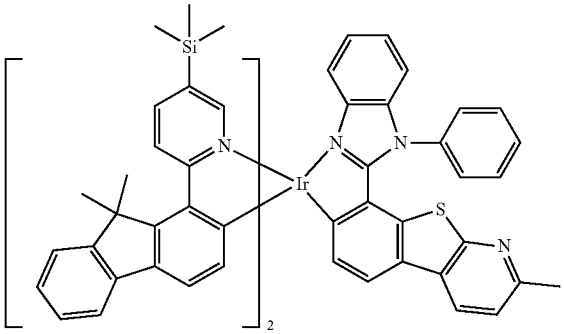

-continued
2624
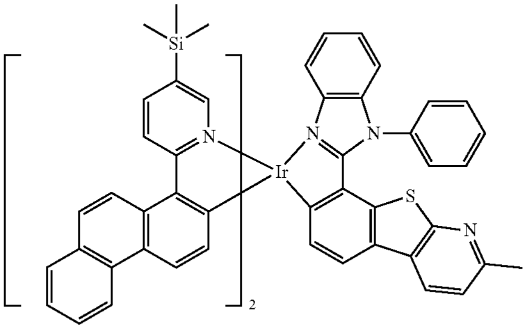
2625
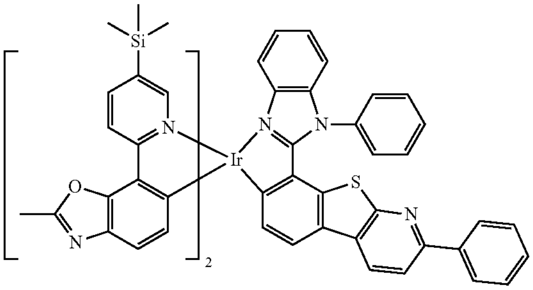
2626
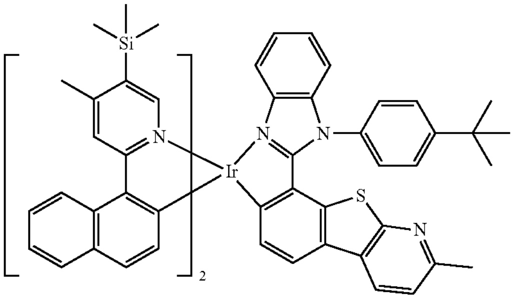
2627
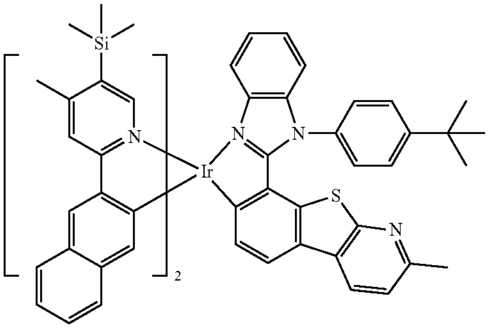
2628
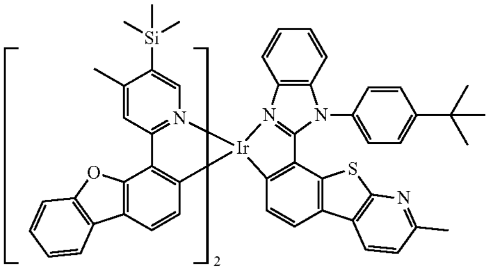
2629
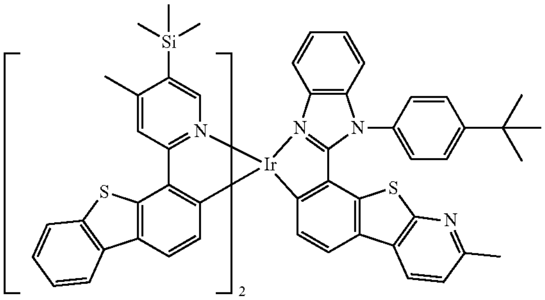
2630
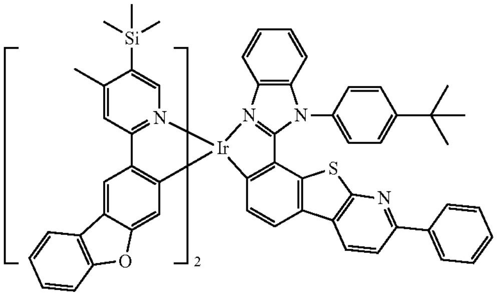
2631
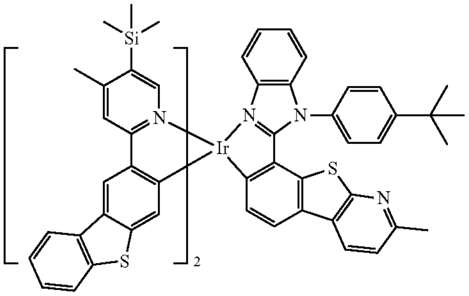

-continued
2632
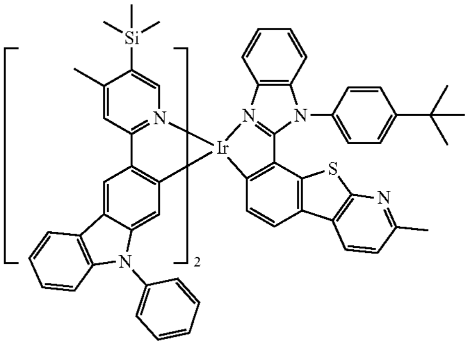
2633
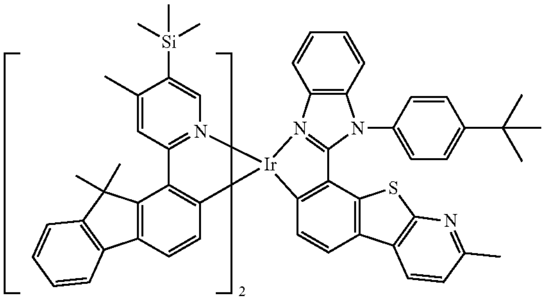
2634
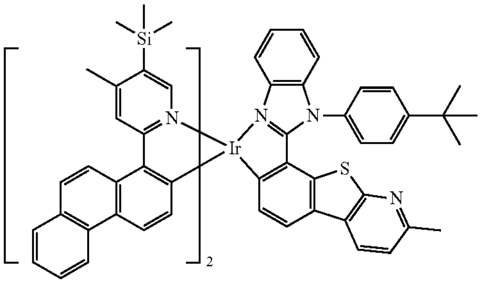
2635
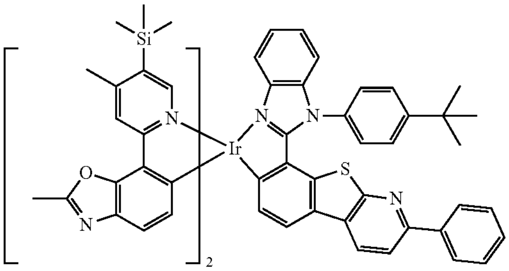
2636
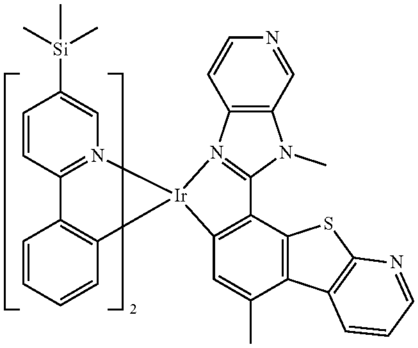
2637
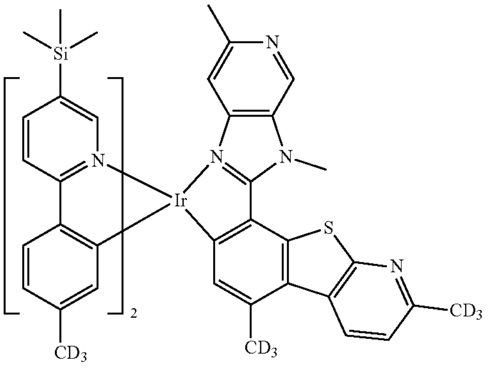
2638
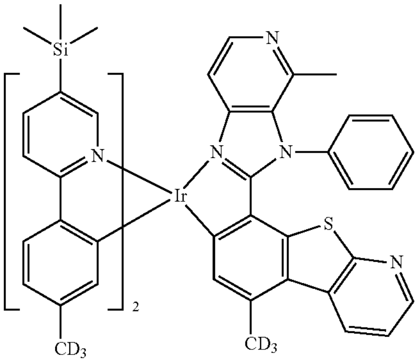
2639
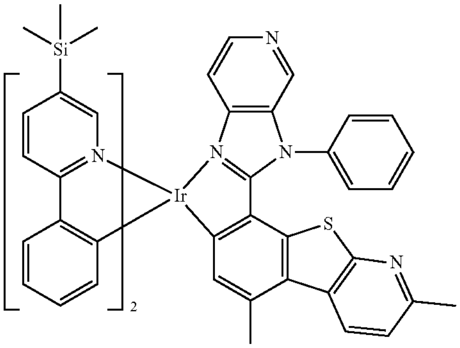

-continued
2640
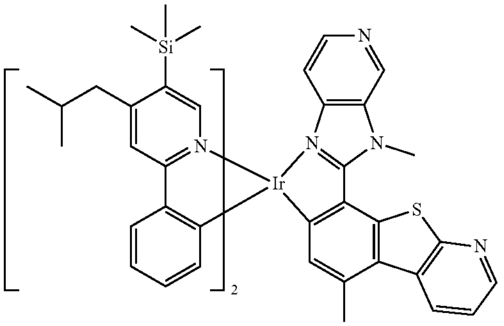
2641
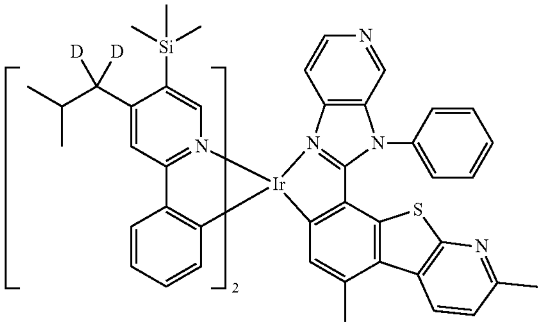
2642
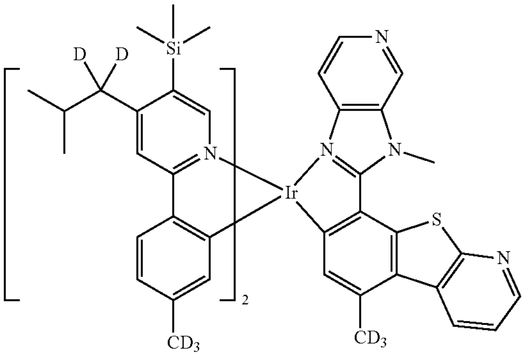
2643
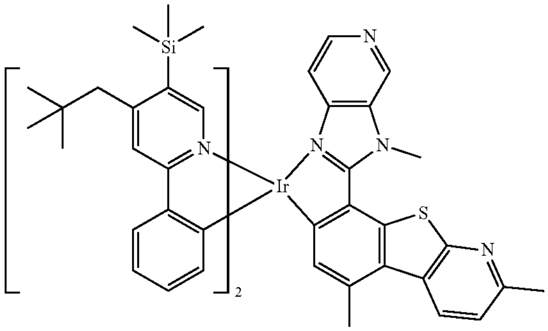
2644
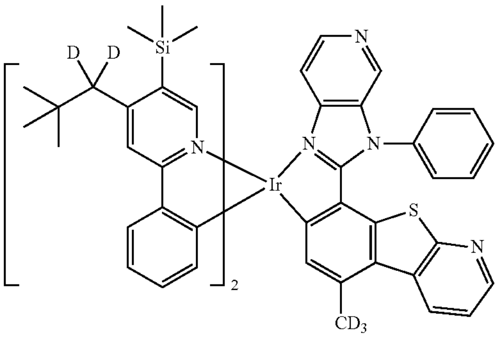
2645
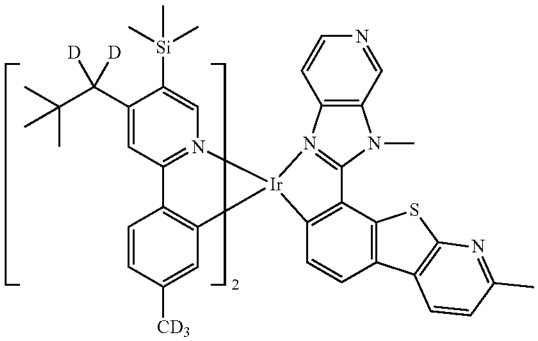
2646
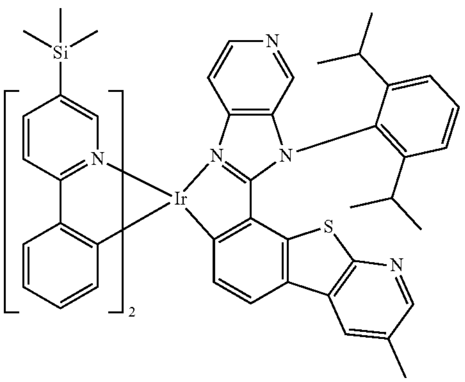
2647
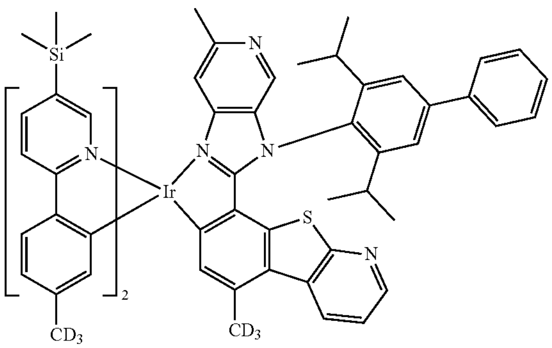

-continued
2648
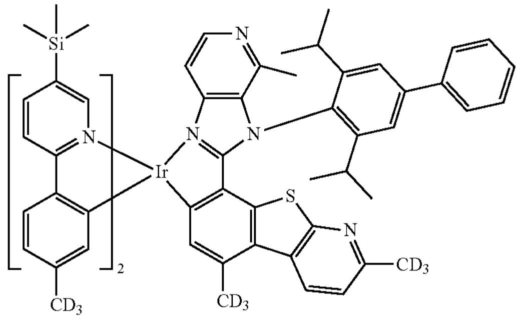
2649
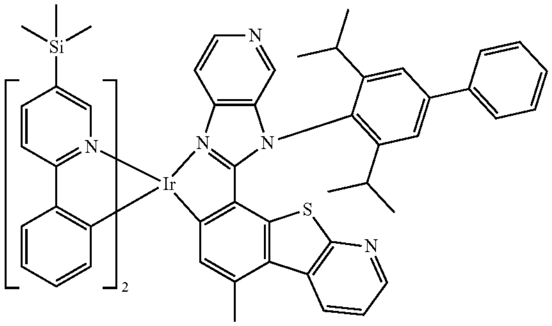
2650
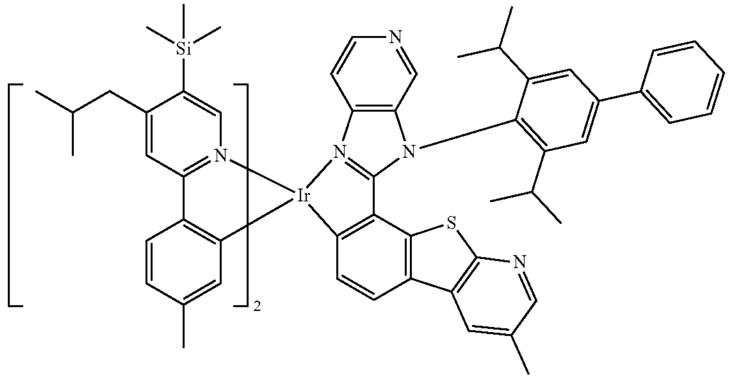
2651
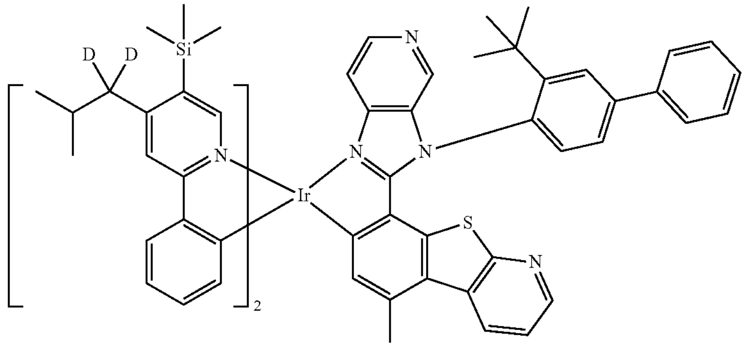
2652
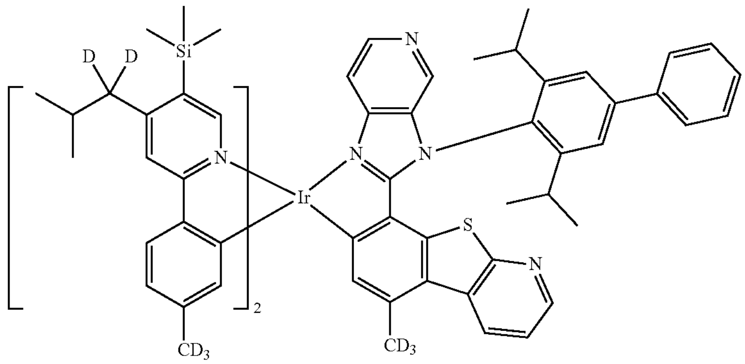

-continued
2653
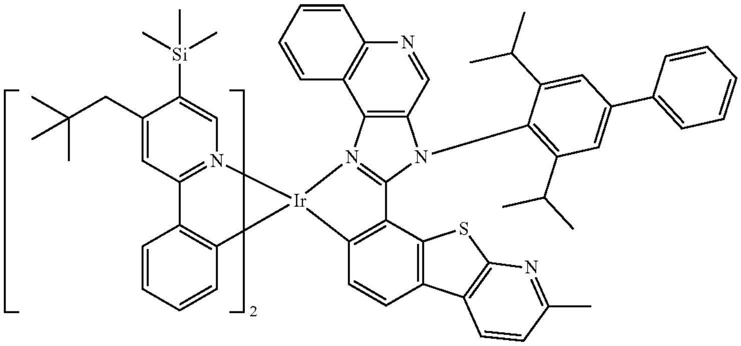
2654
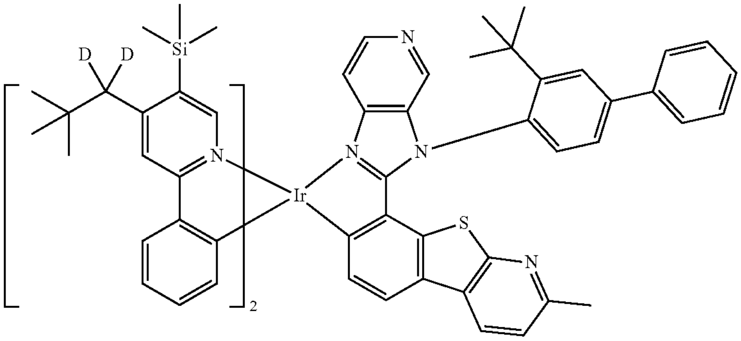
2655
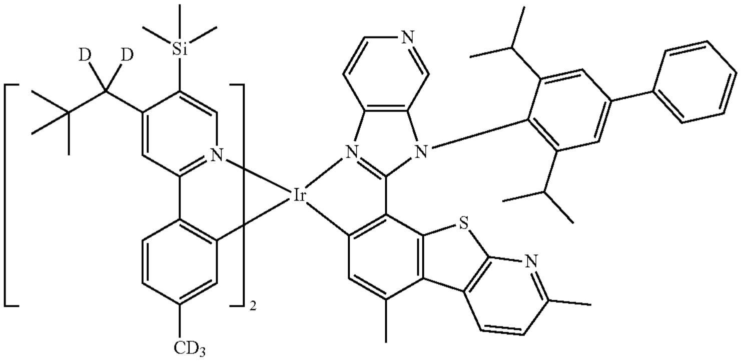
2656
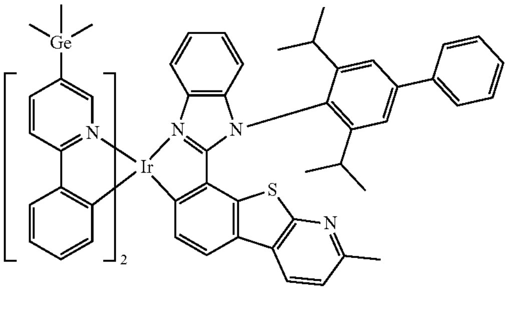
2657
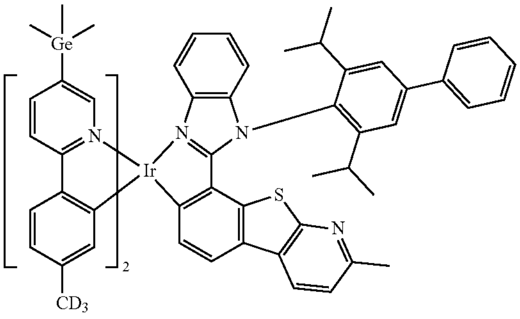

-continued
2658
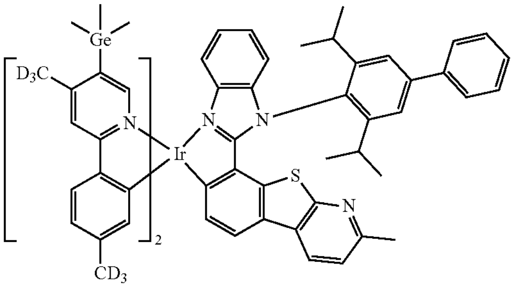
2659
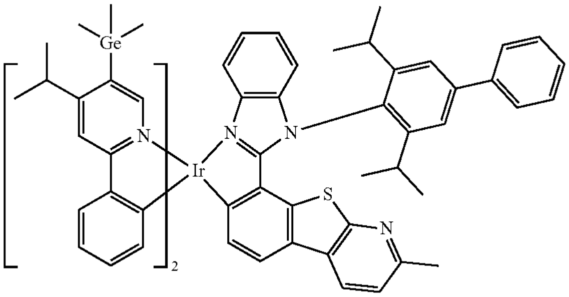
2660
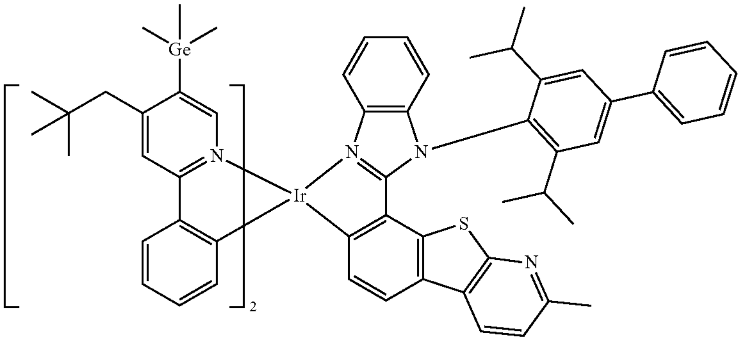
2661
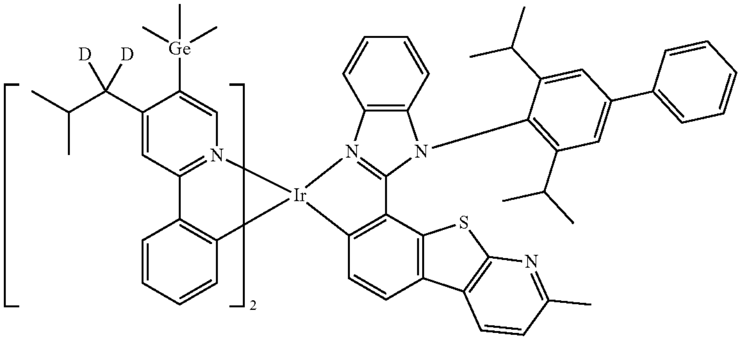
2662
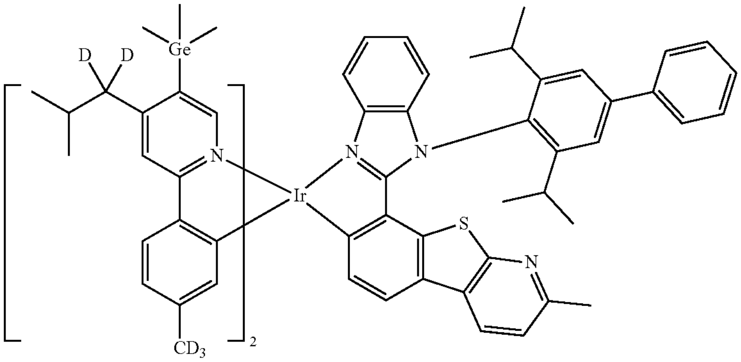

-continued
2663
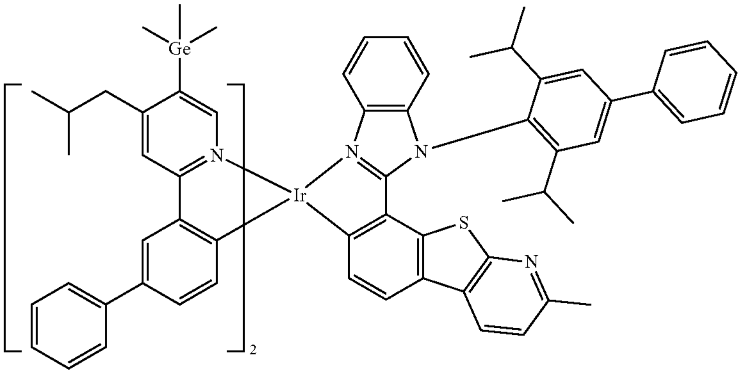
2664
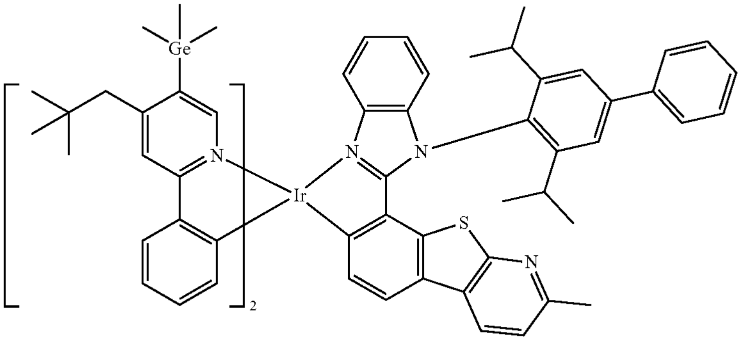
2665
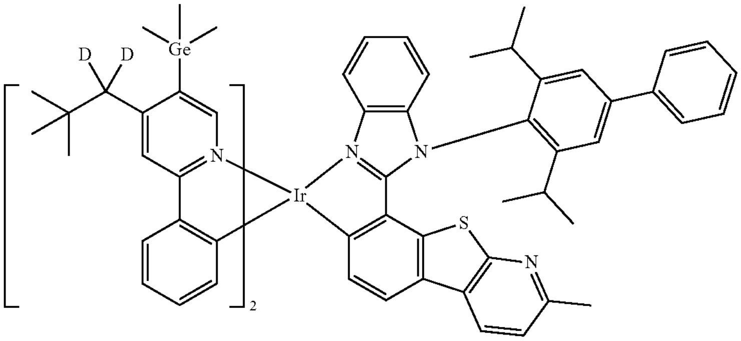
2666
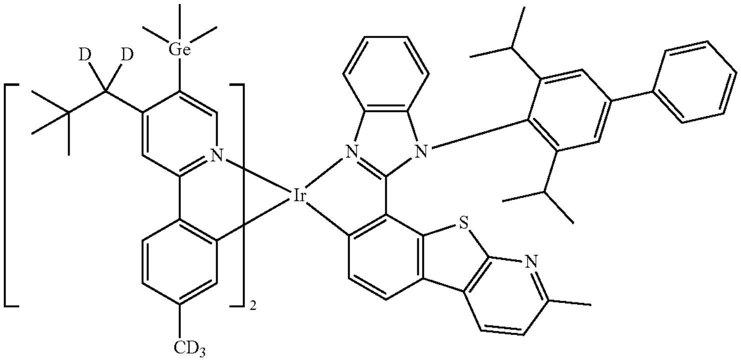

-continued
2667
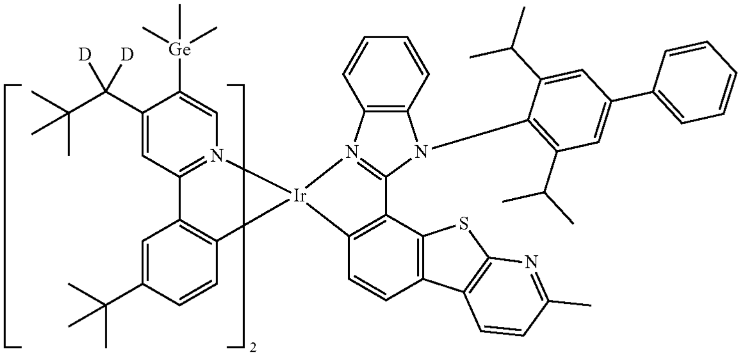
2668
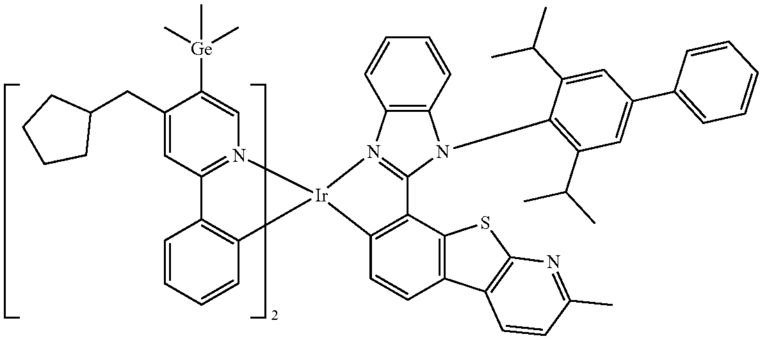
2669
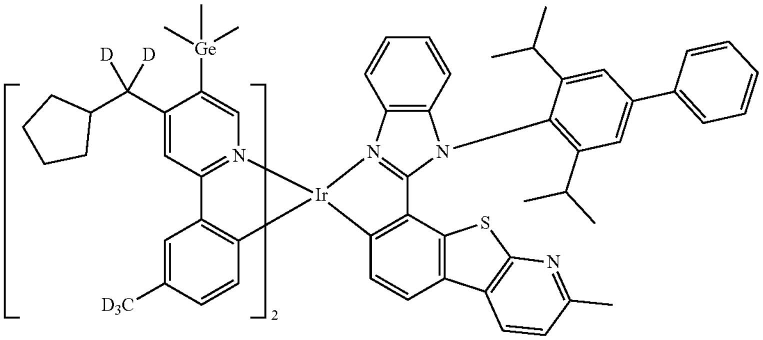
2670
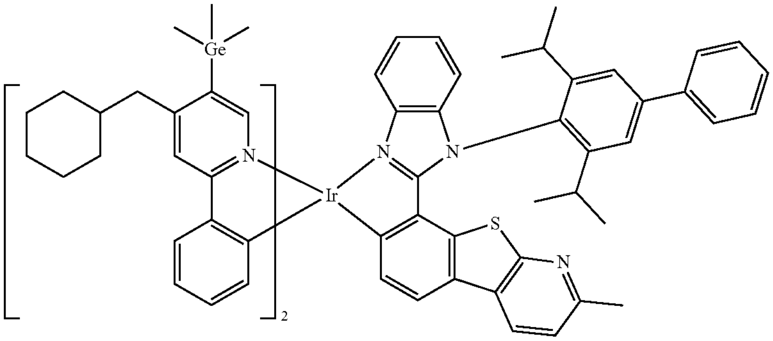

-continued
2671
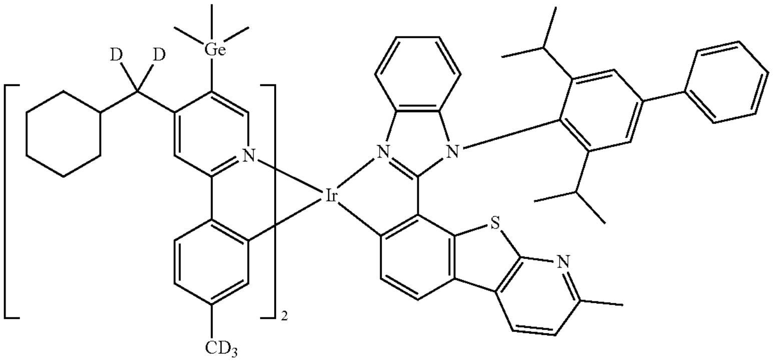
2672
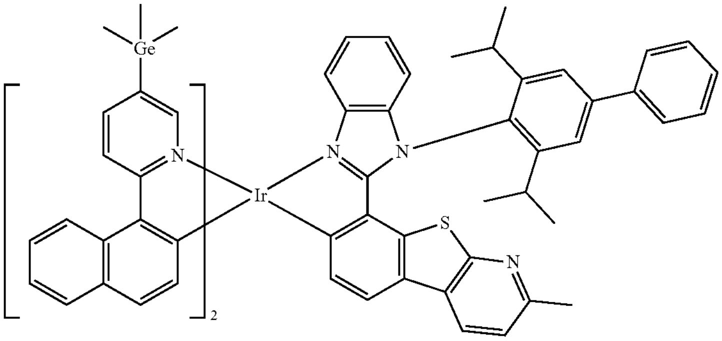
2673
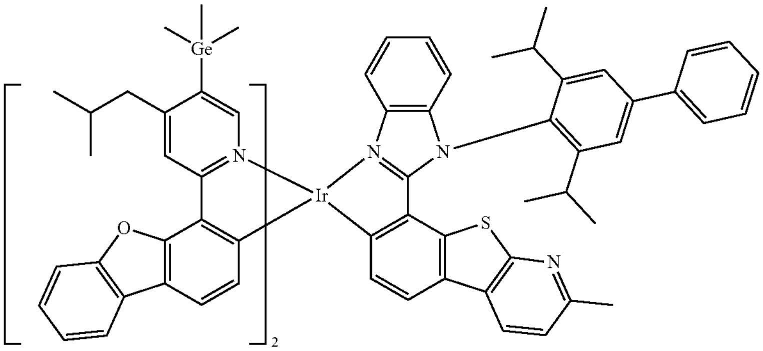
2674
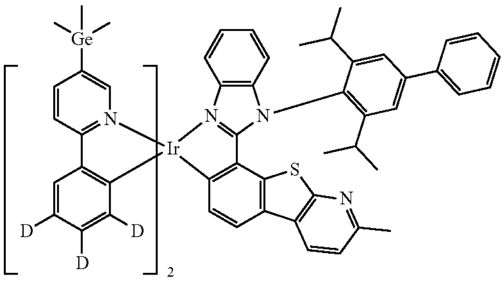
2675
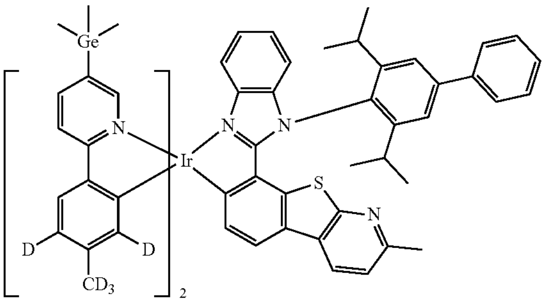

-continued
2676
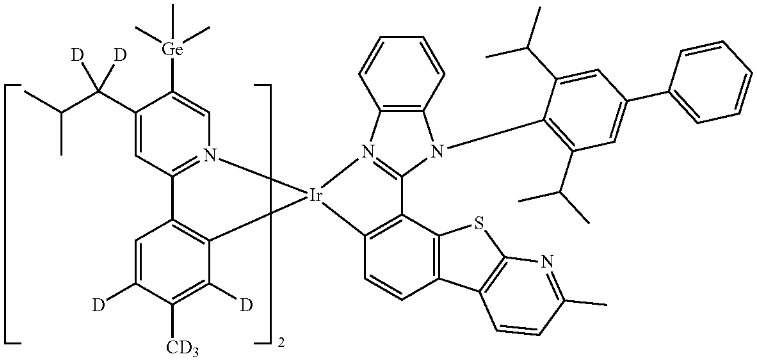
2677
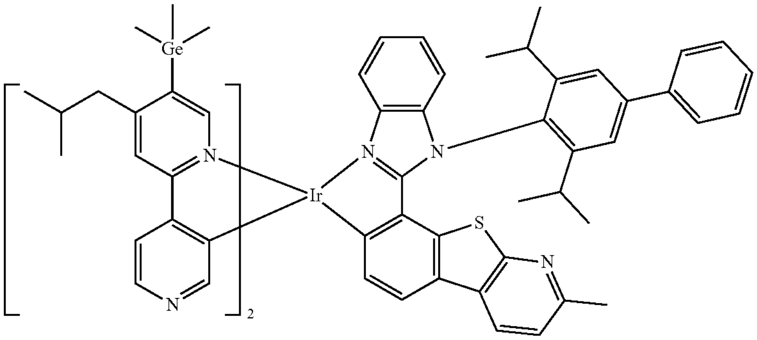
2678
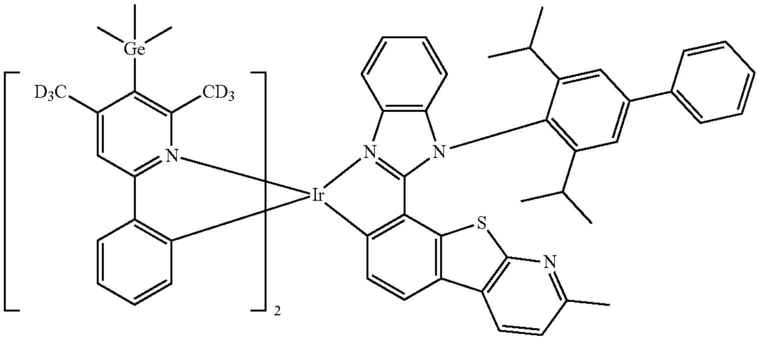
2679
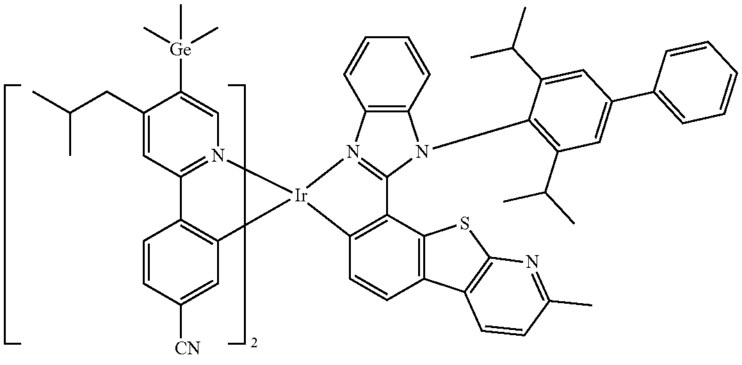

-continued
2680
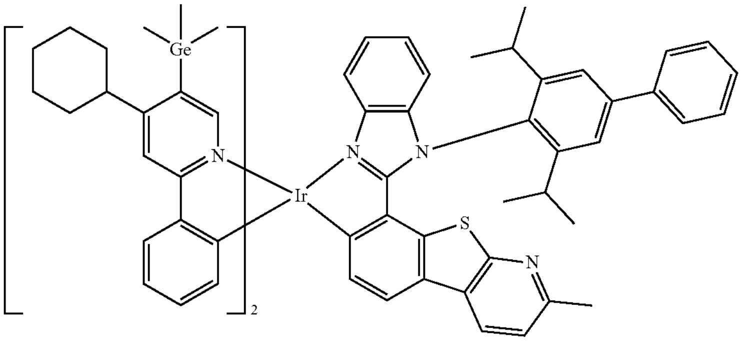
2681
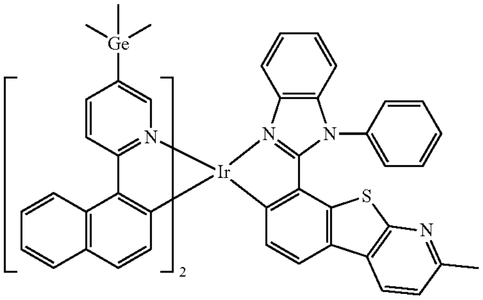
2682
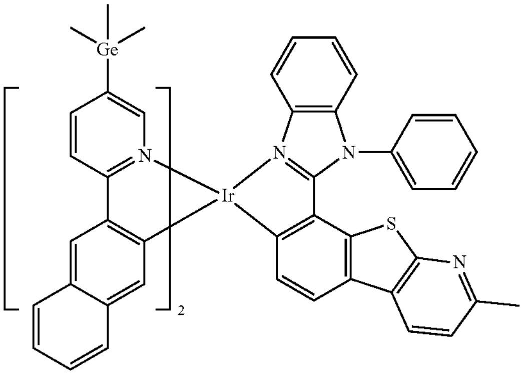
2683
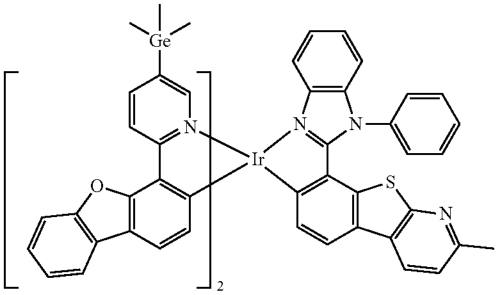
2684
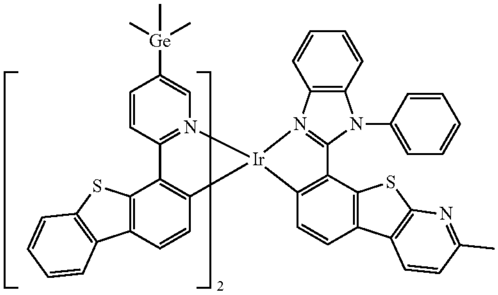
2685
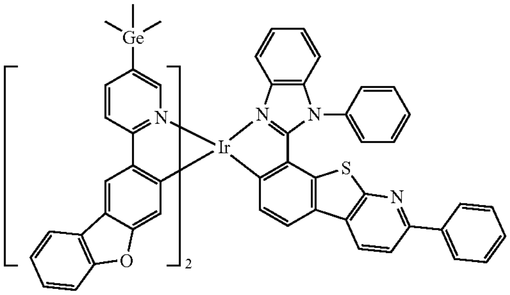
2686
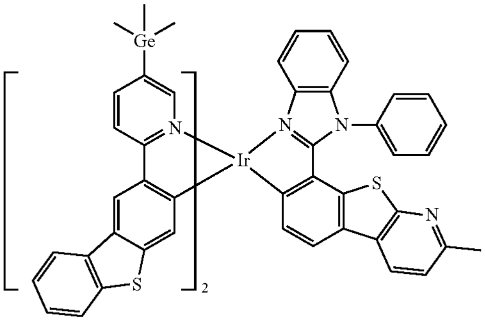

-continued
2687
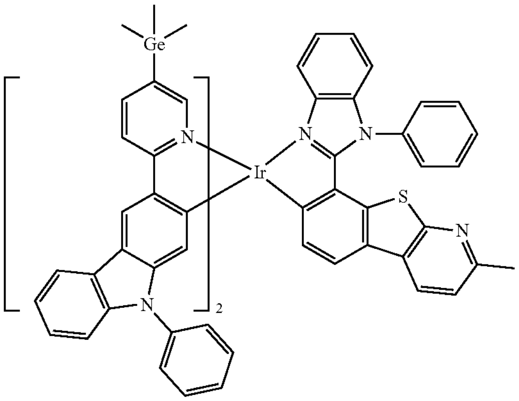
2688
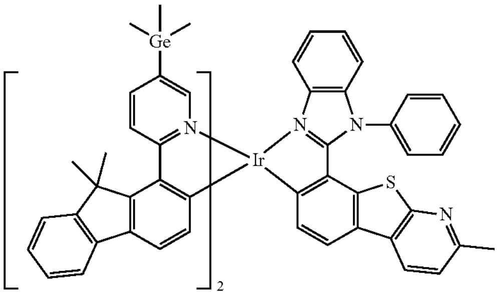
2689
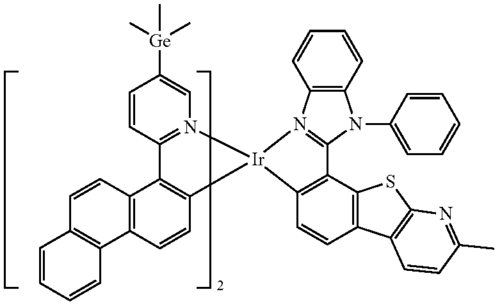
2690
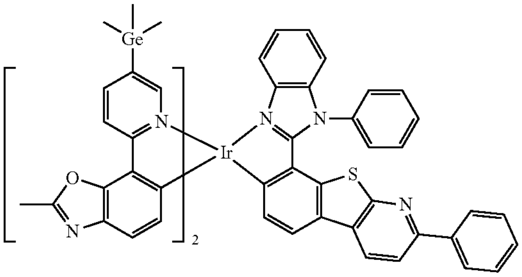
2691
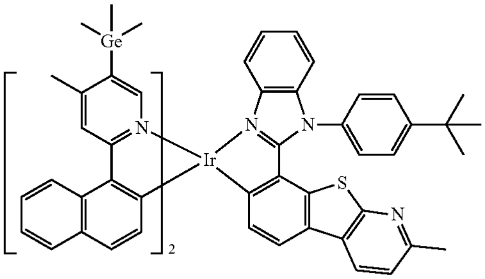
2692
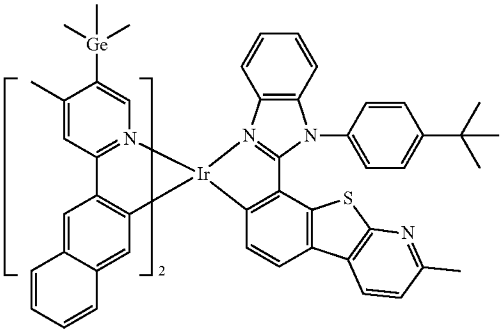
2693
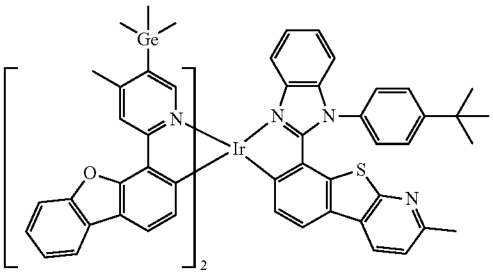
2694
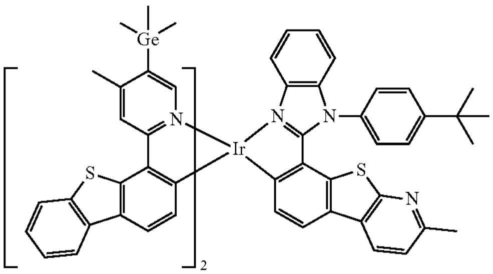
2695
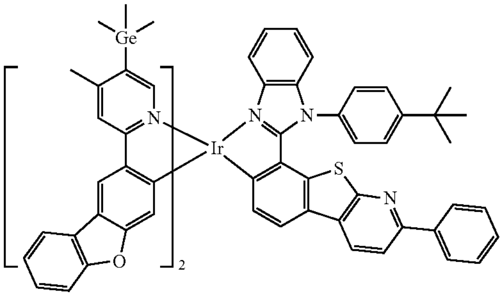
2696
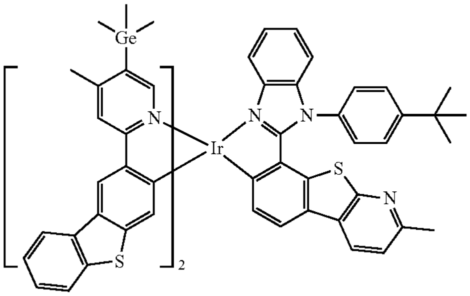

-continued
2697
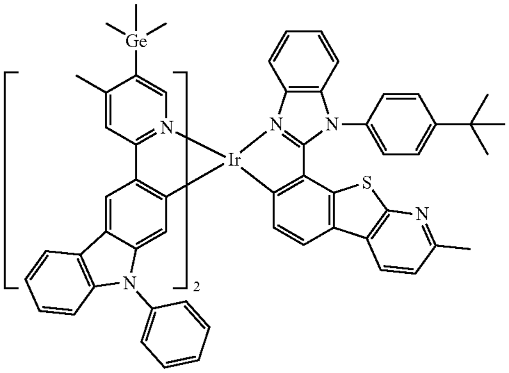
2698
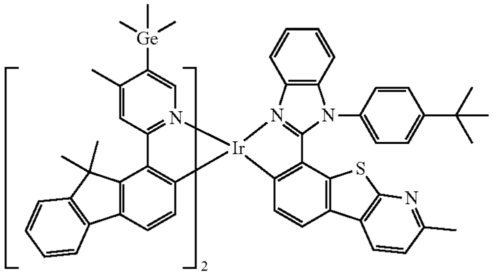
2699
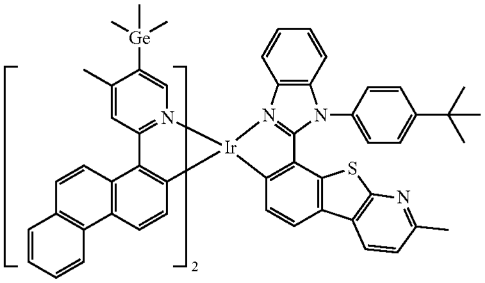
2700
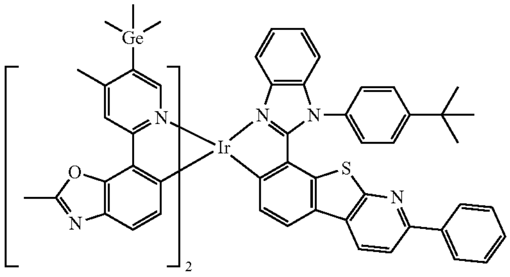
2701
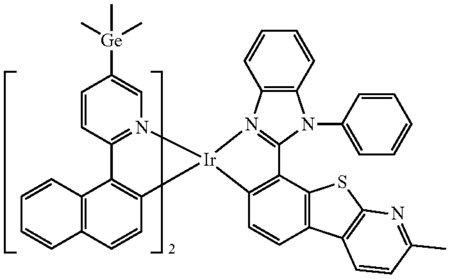
2702
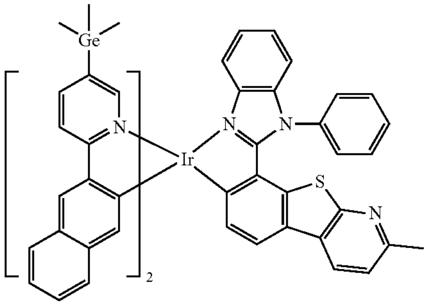
2703
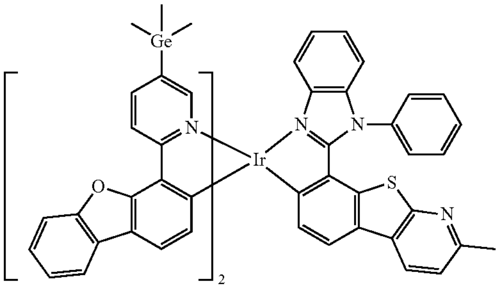
2704
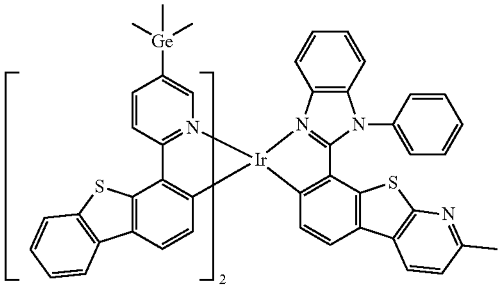
2705
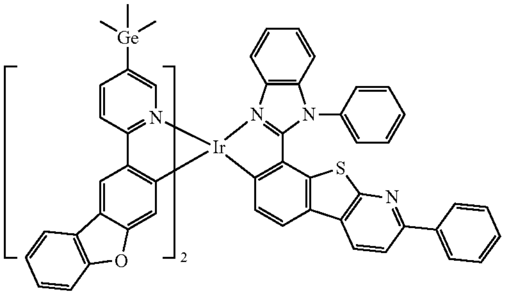
2706
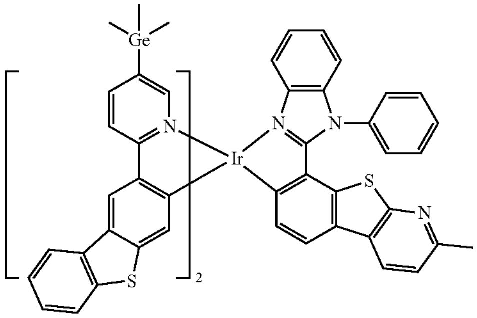

-continued
2707
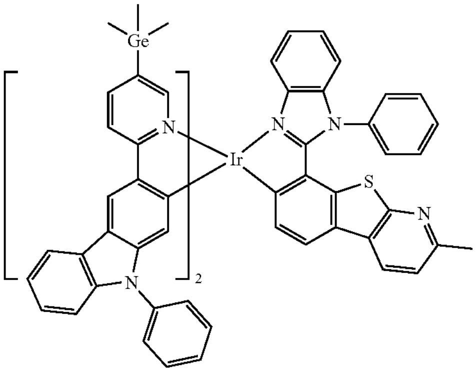
2708
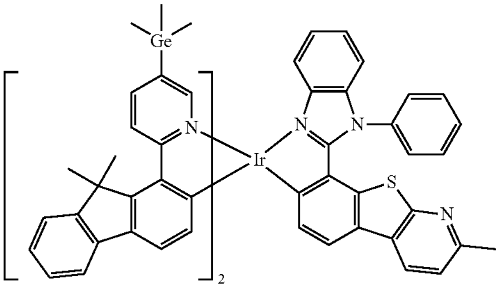
2709
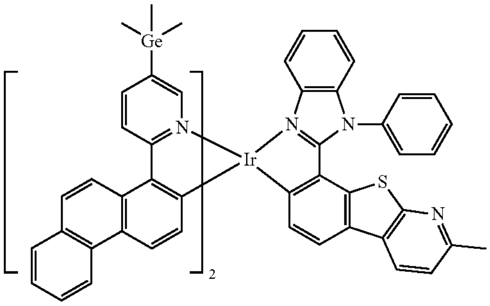
2710
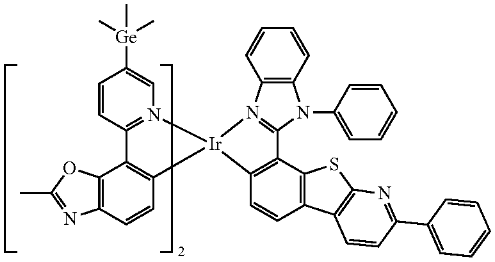
2711
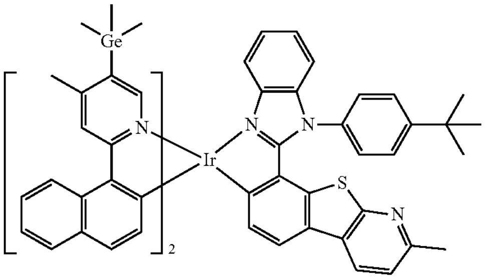
2712
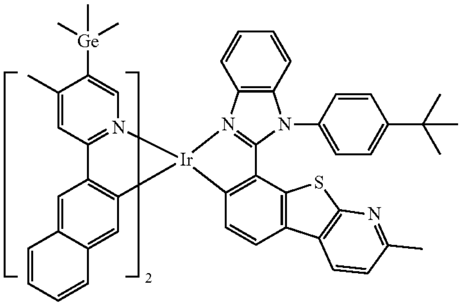
2713
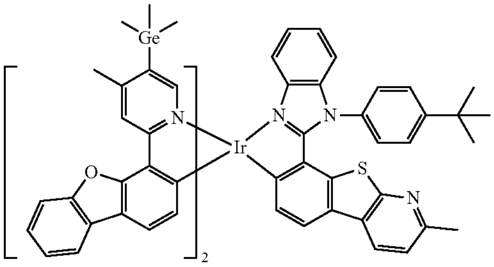
2714
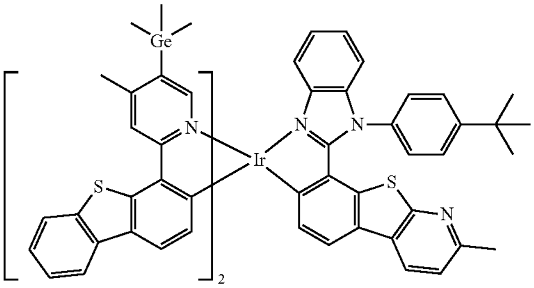
2715
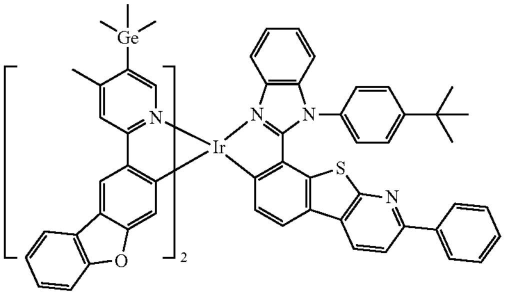
2716
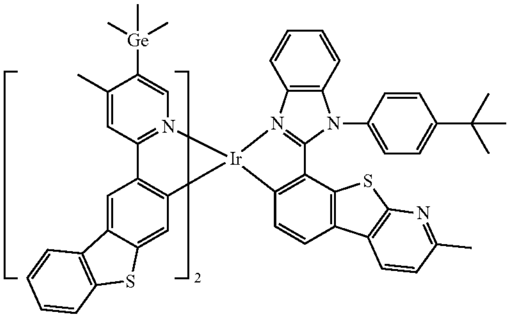

-continued
2717
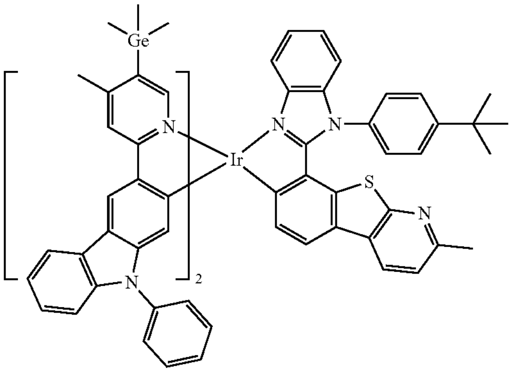
2718
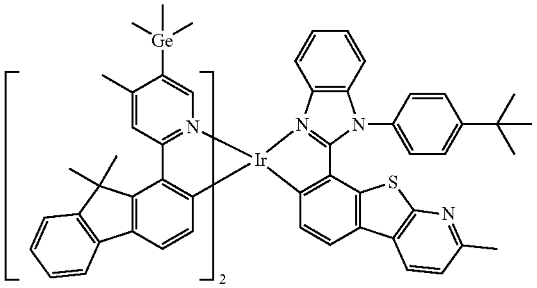
2719
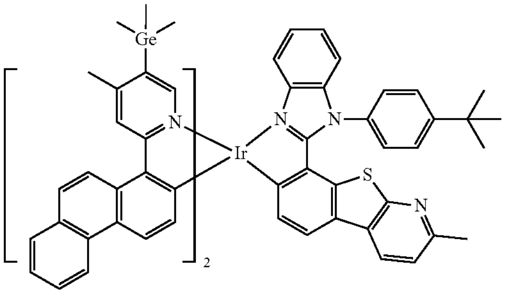
2720
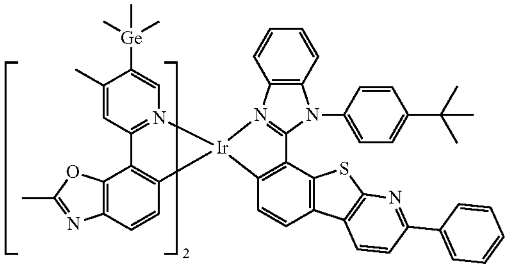
2721
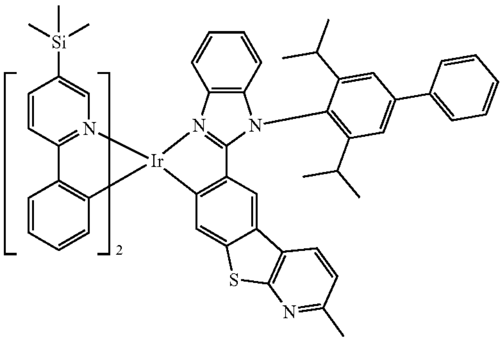
2722
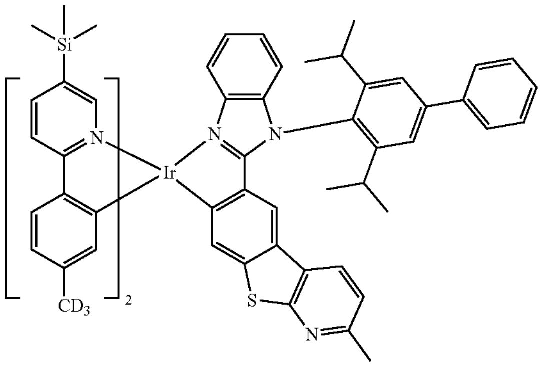
2723
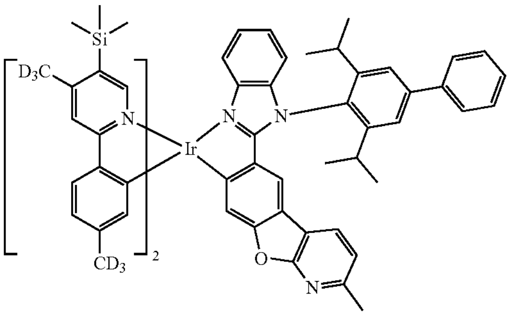
2724
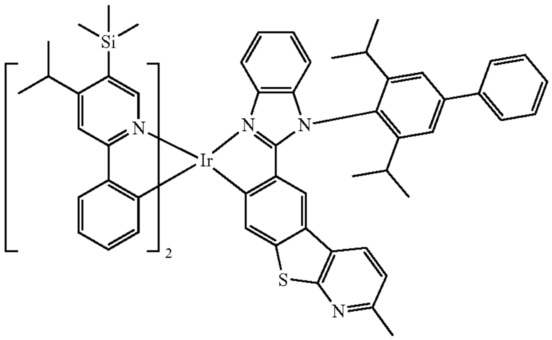

-continued
2725
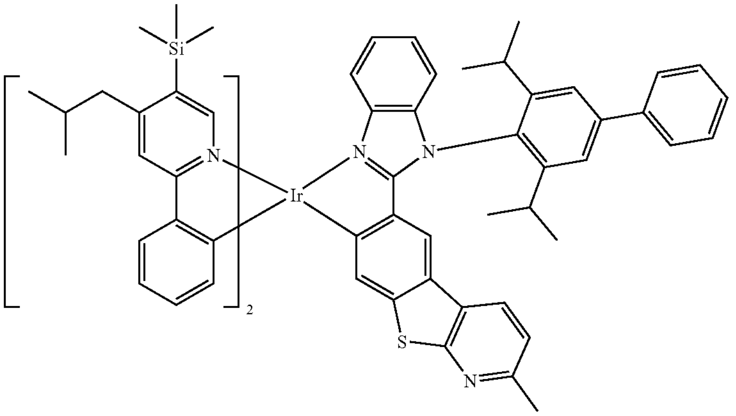
2726
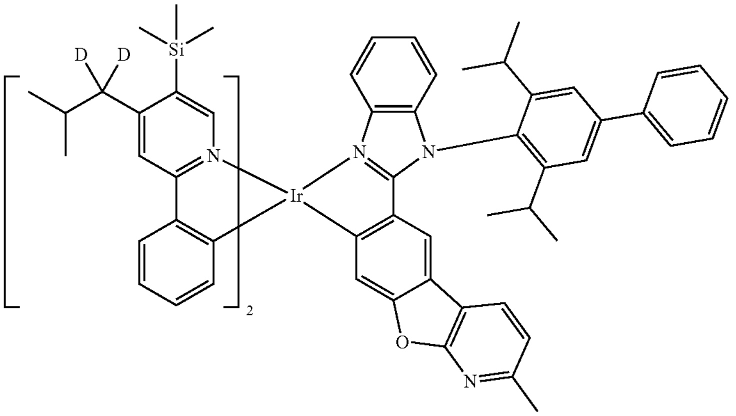
2727
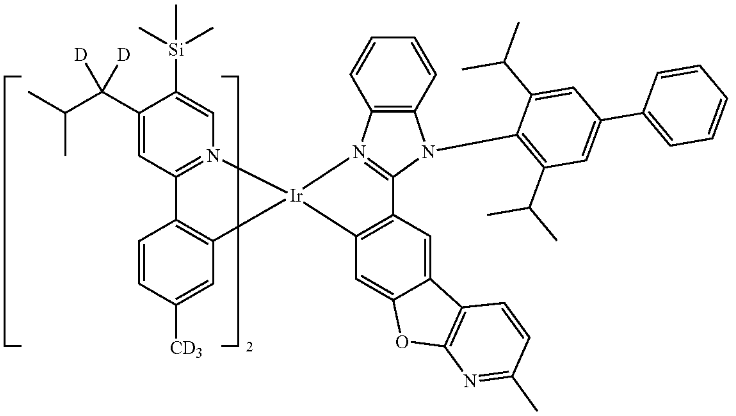

-continued
2728
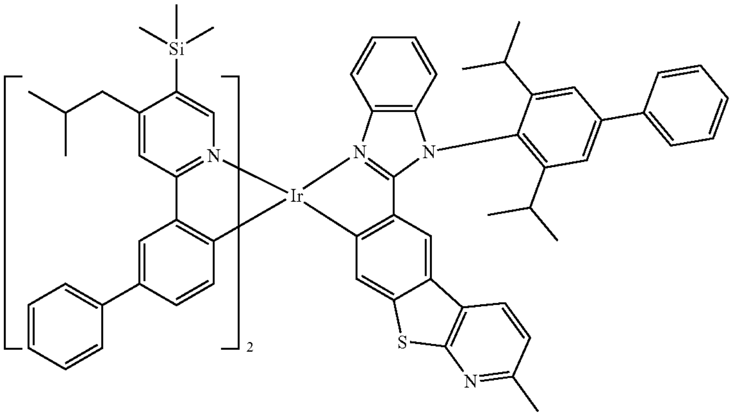
2729
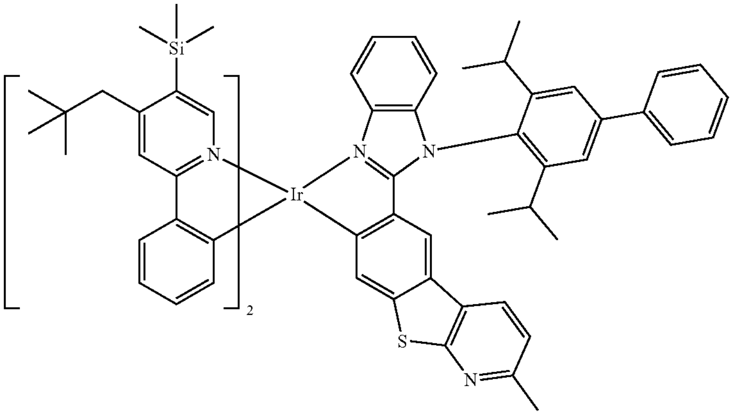
2730
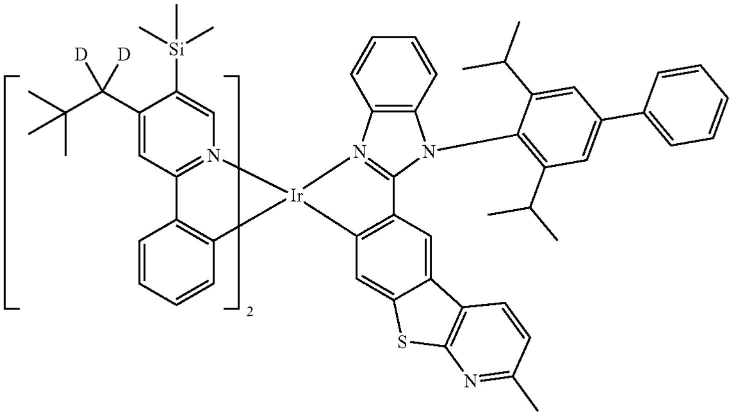

-continued
2731
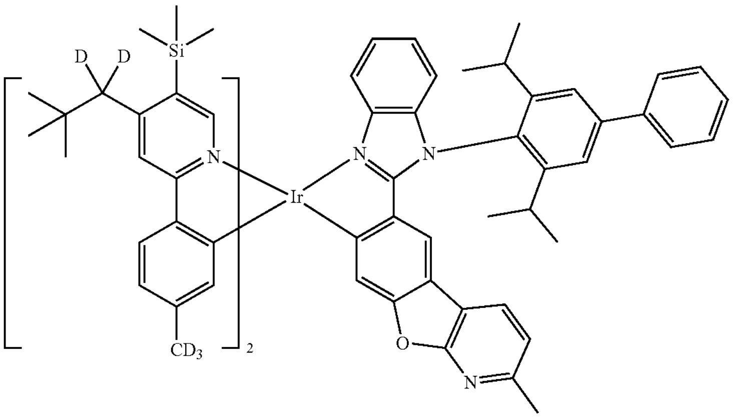
2732
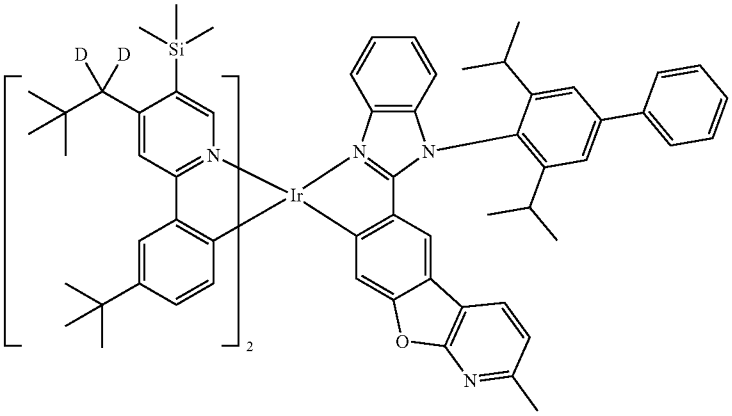
2733
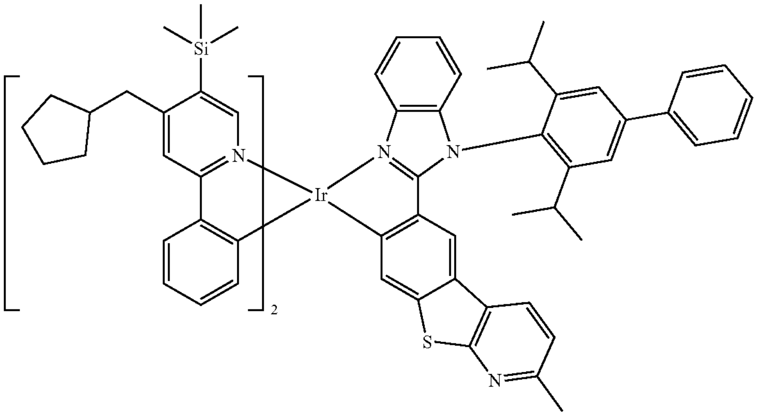

-continued
2734
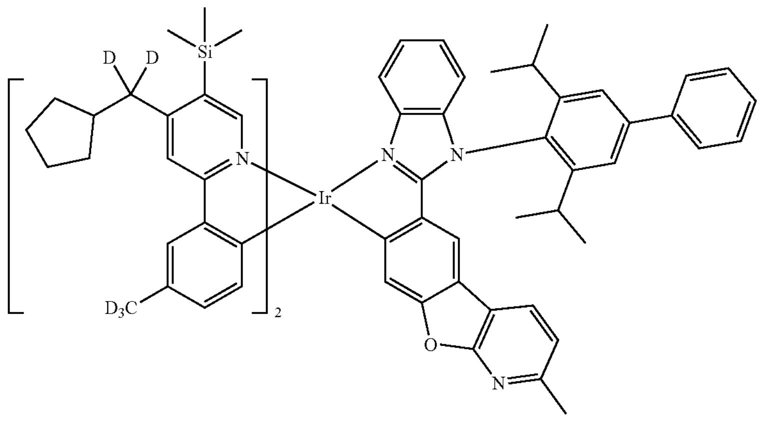
2735
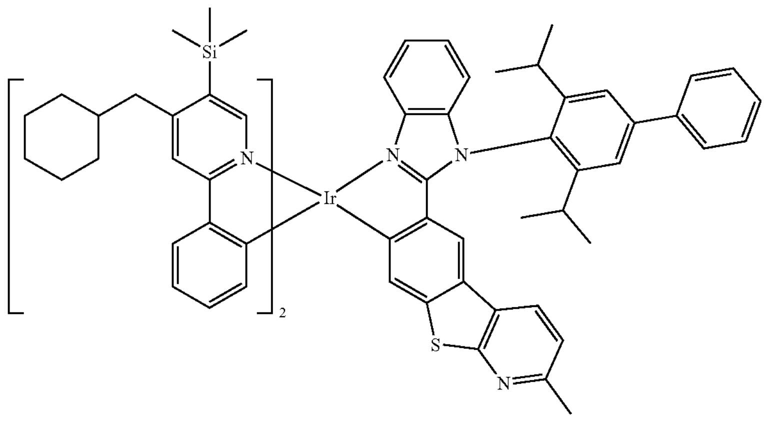
2736
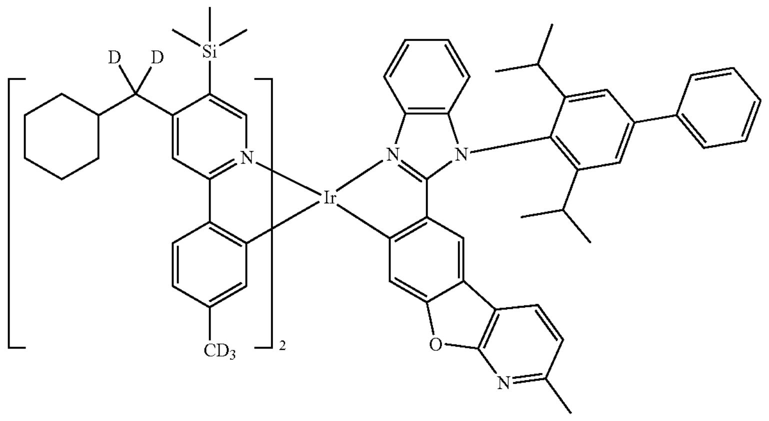

-continued
2737
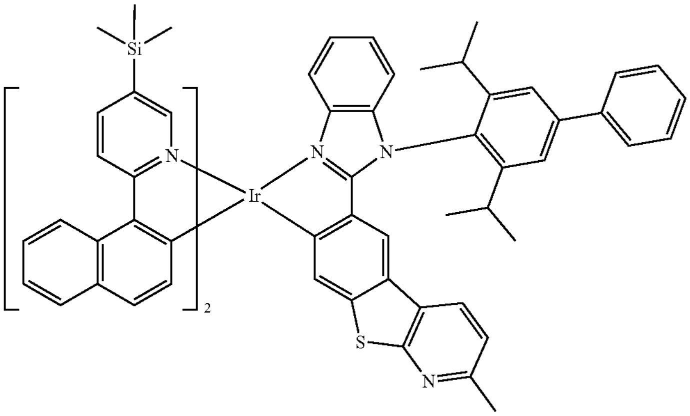
2738
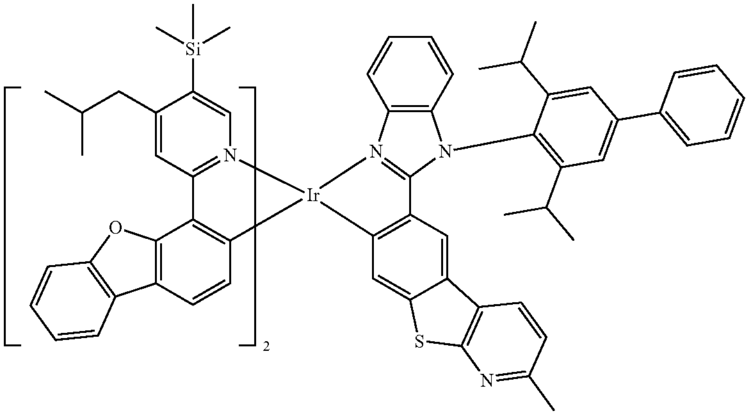
2739
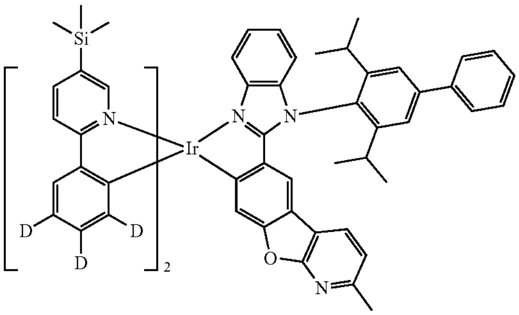
2740
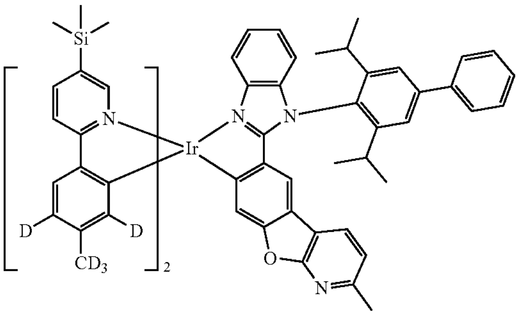
2741
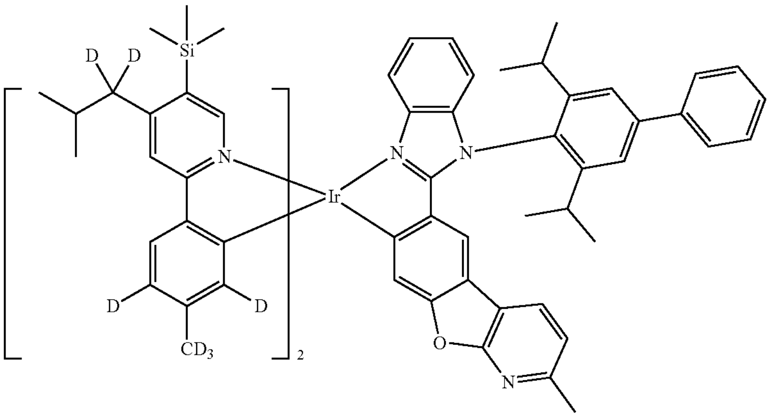

-continued
2742
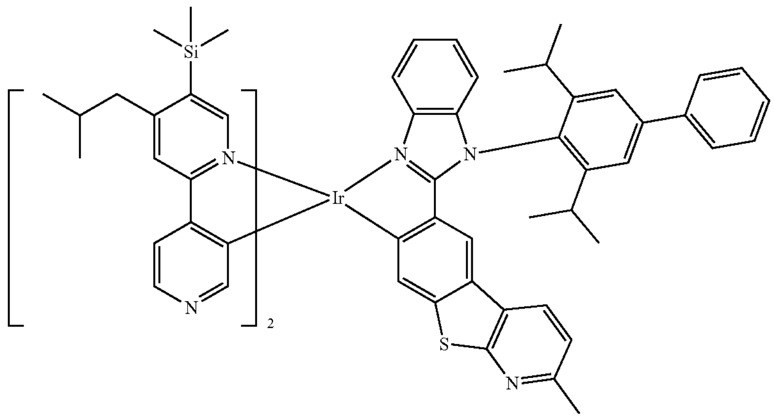
2743
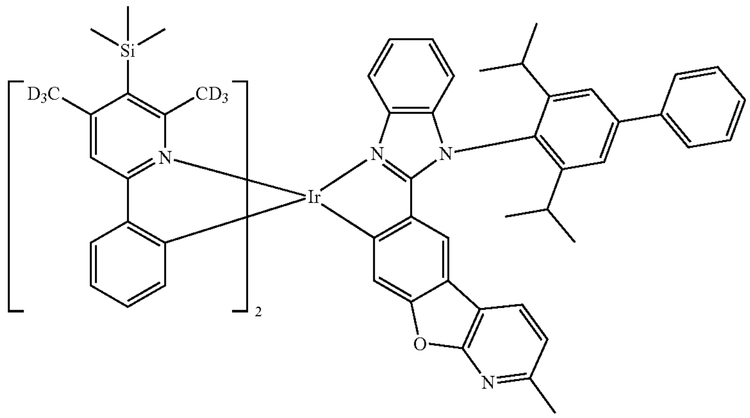
2744
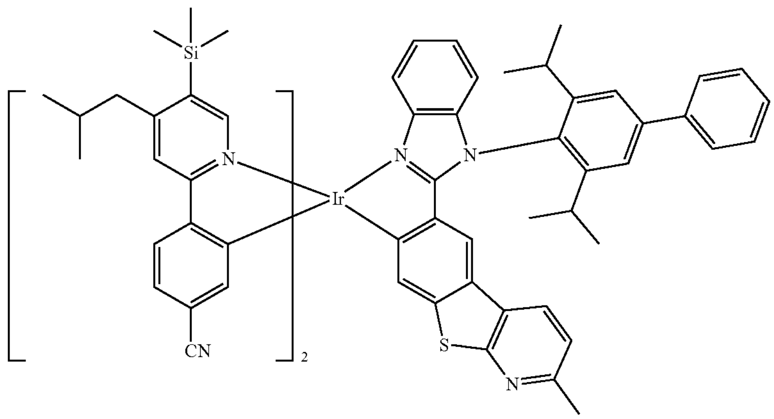

-continued
2745
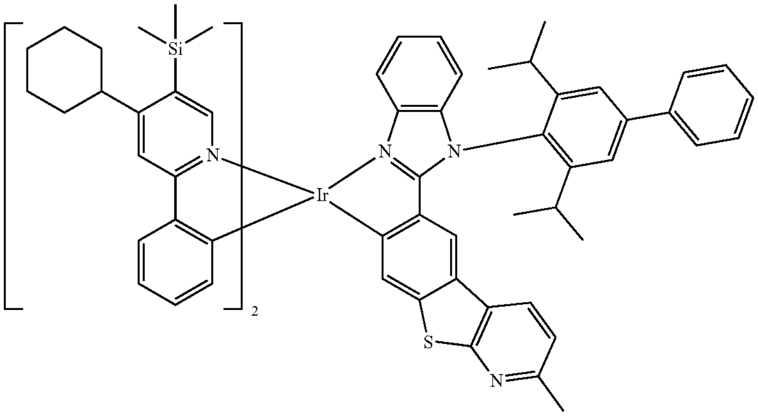
2746
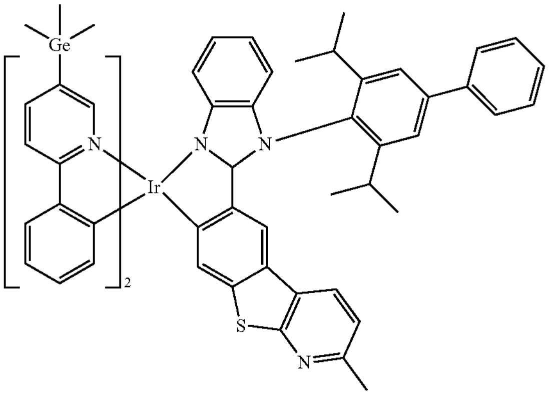
2747
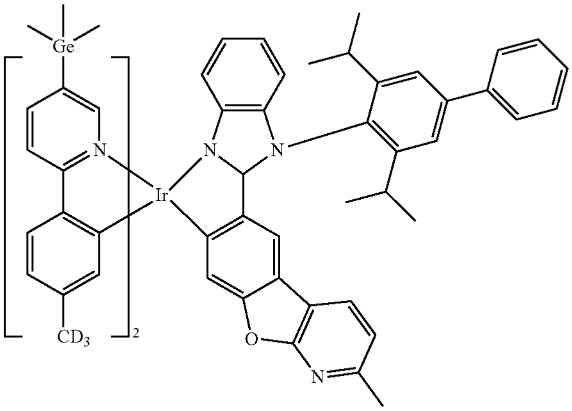
4748
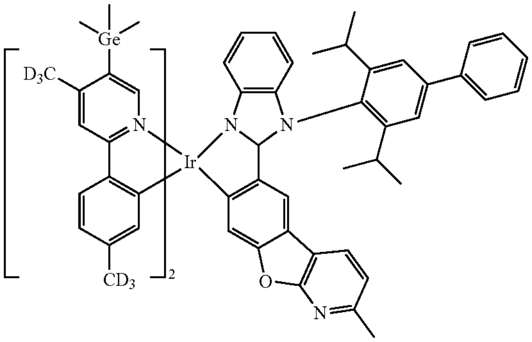
2749
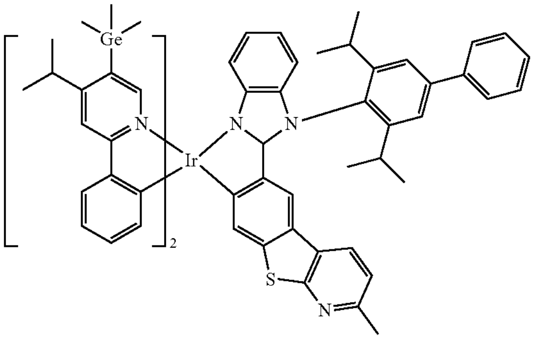

-continued
2750
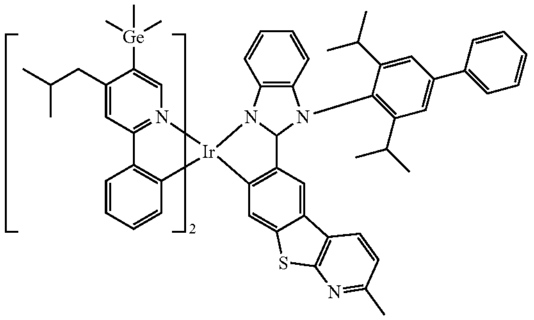
2751
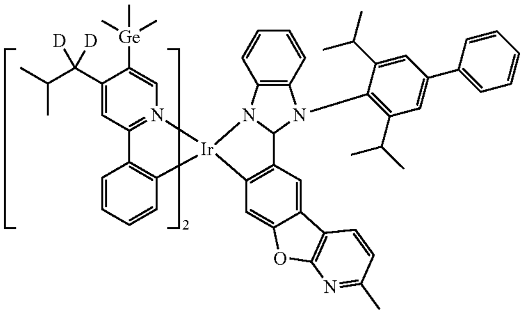
2752
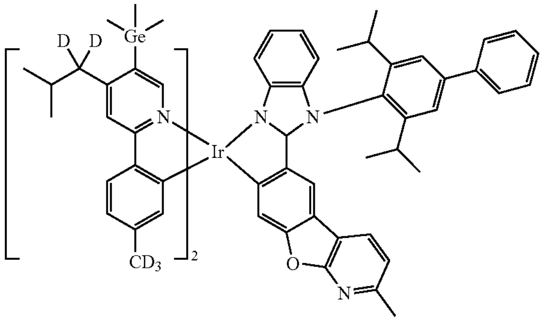
2753
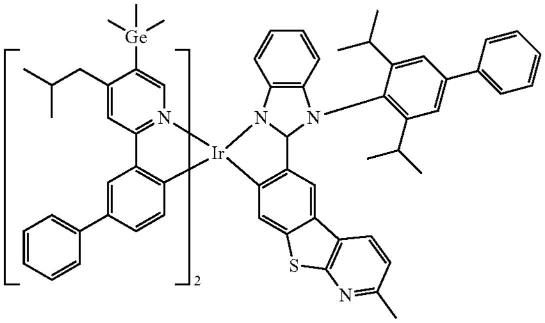
2754
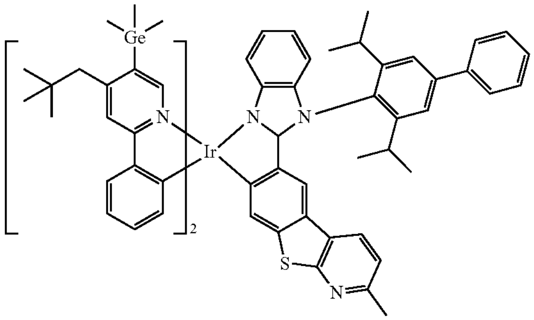
2755
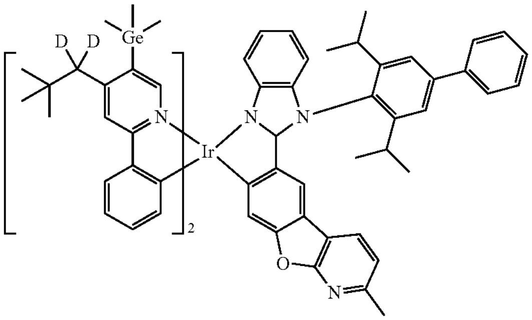
2756
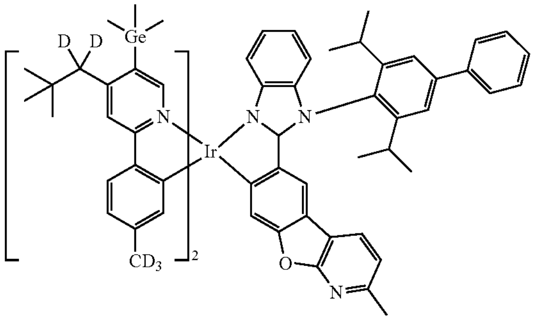
2757
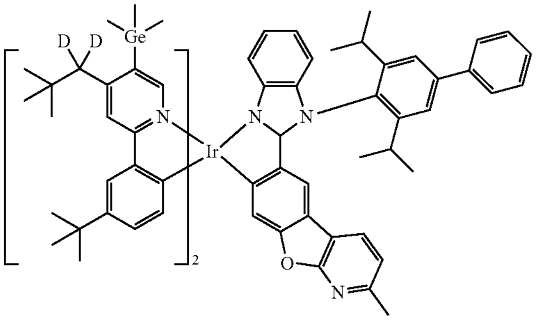

-continued
2758
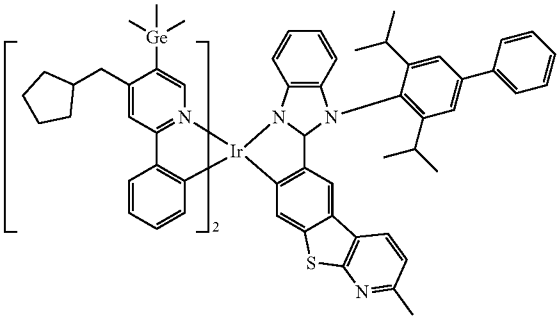
2759
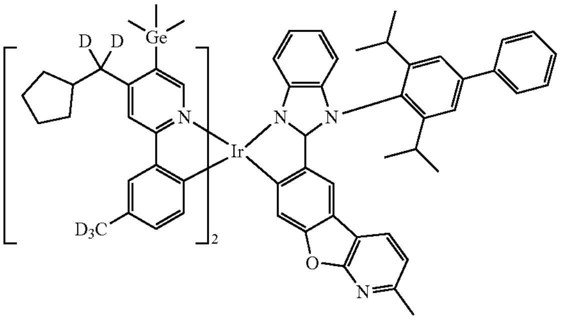
2760
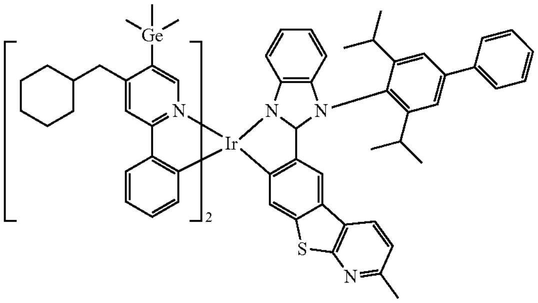
2761
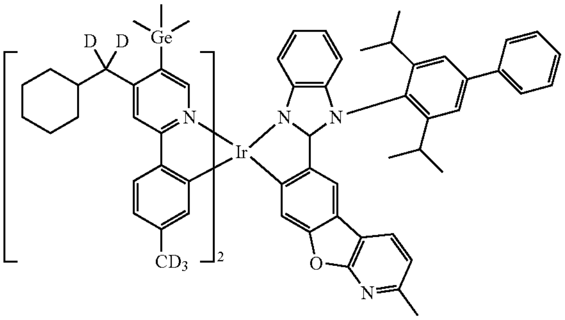
2762
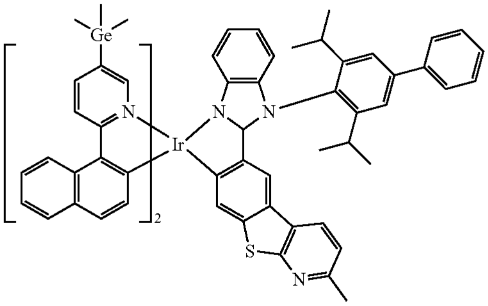
2763
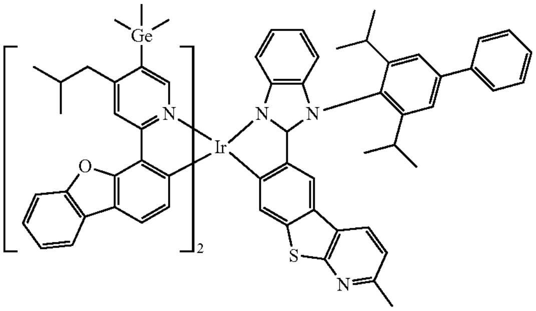
2764
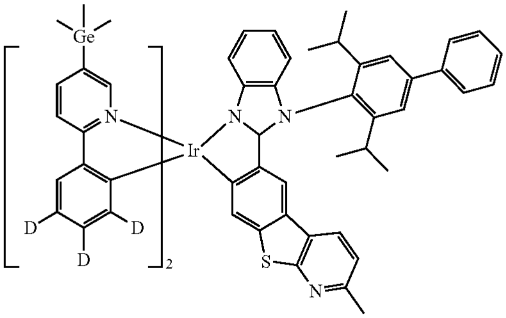
2765
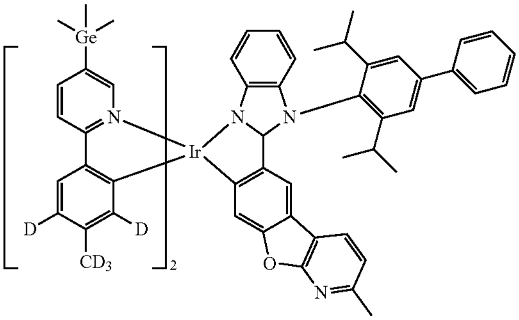

-continued
2766
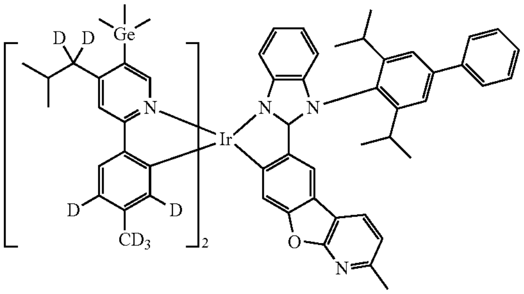
2767
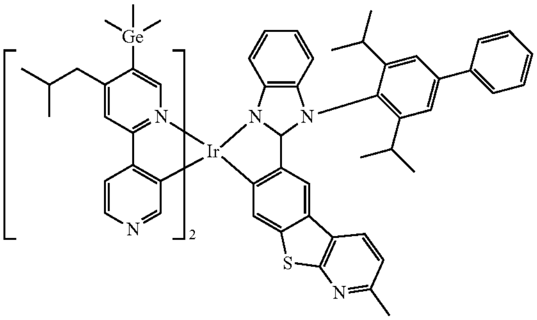
2768
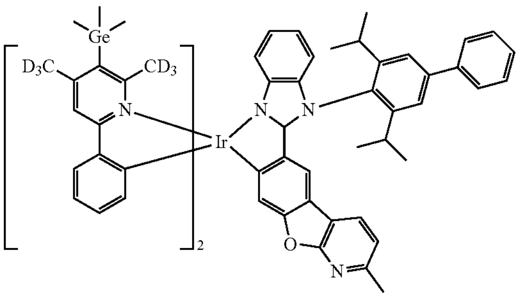
2769
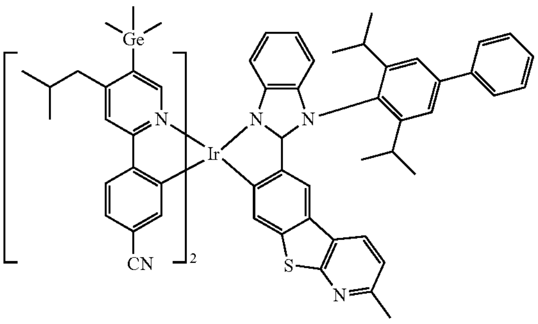
2770
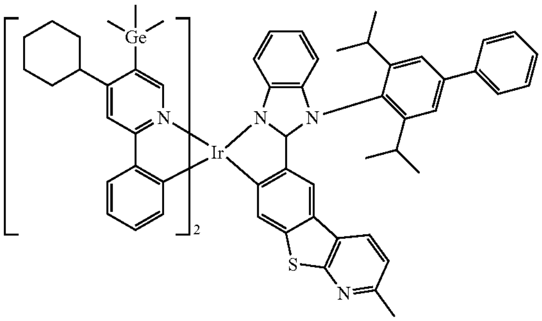
2771
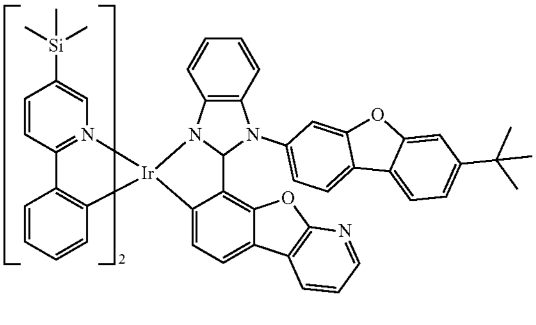
2772
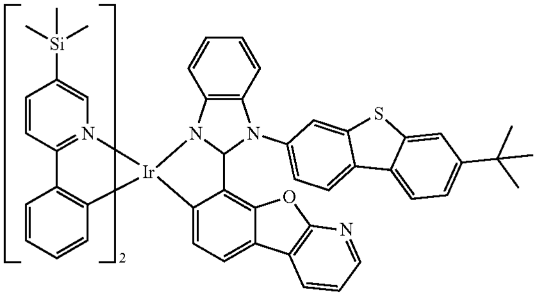
2773
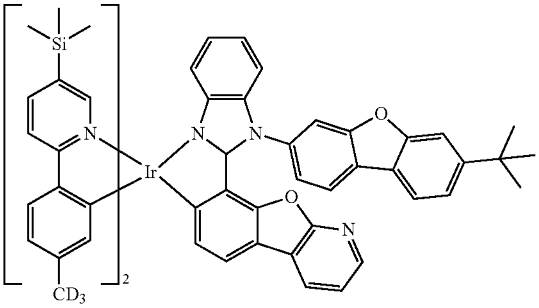

-continued
2774
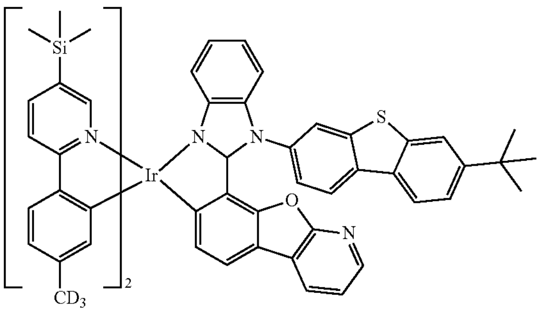
2775
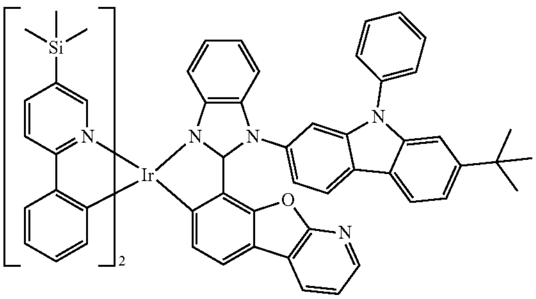
2776
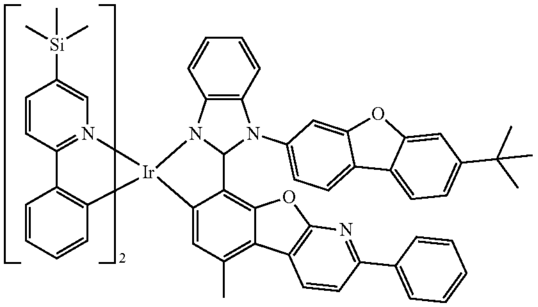
2777
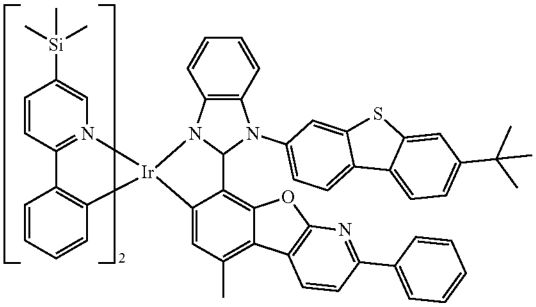
2778
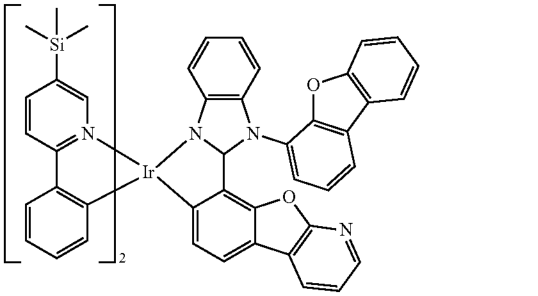
2779
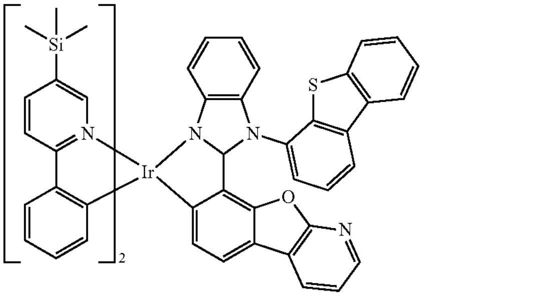
2780
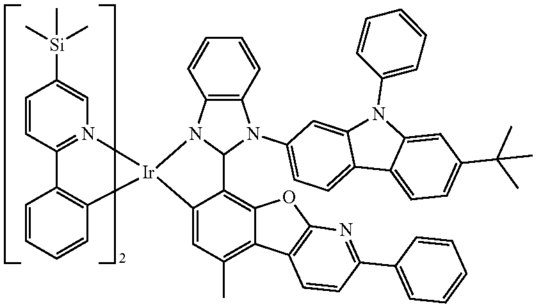
2781
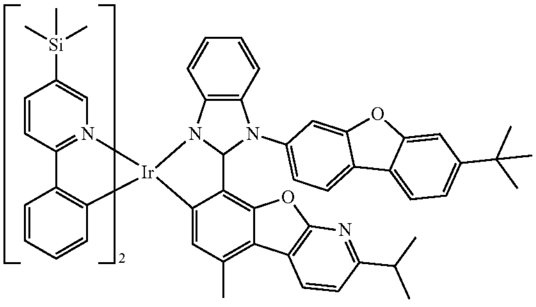
2782
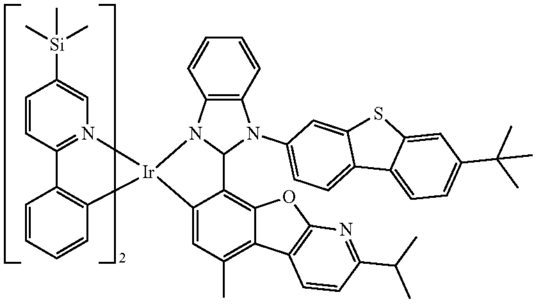
2783
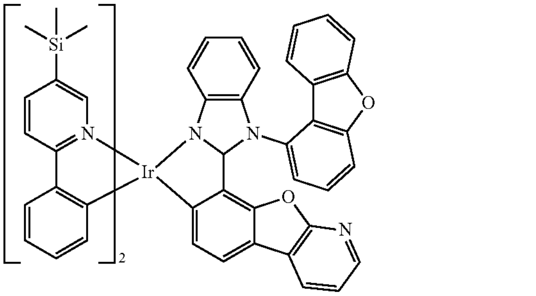

-continued
2784
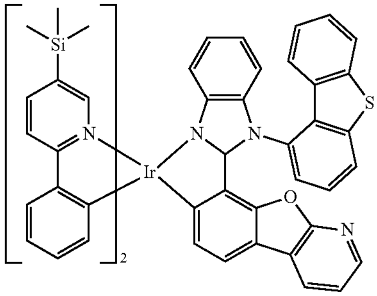
2785
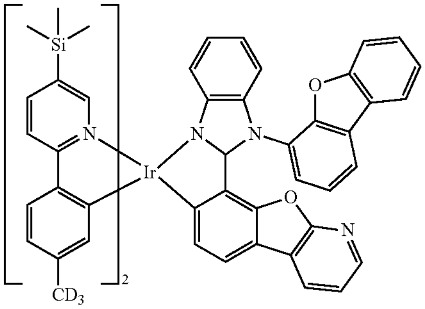
2786
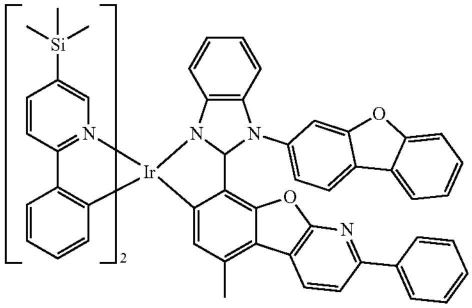
2787
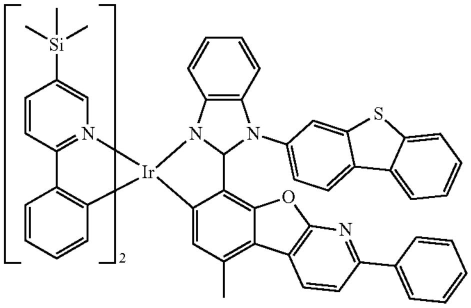
2788
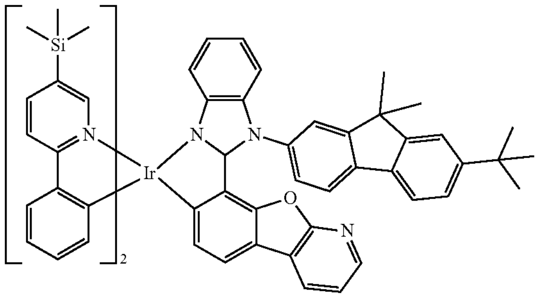
2789
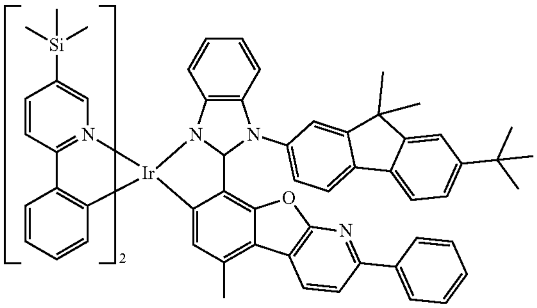
2790
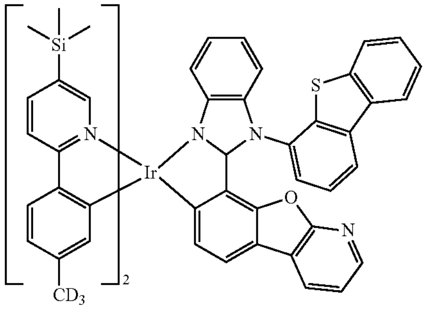
2791
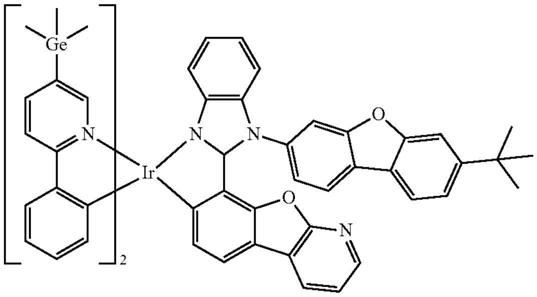
2792
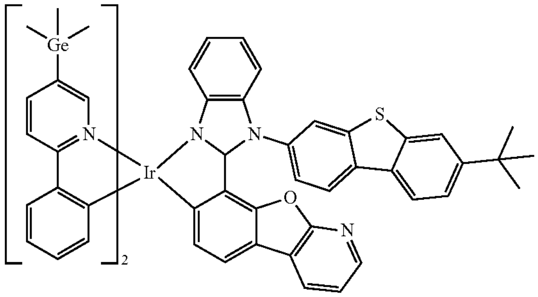
2793
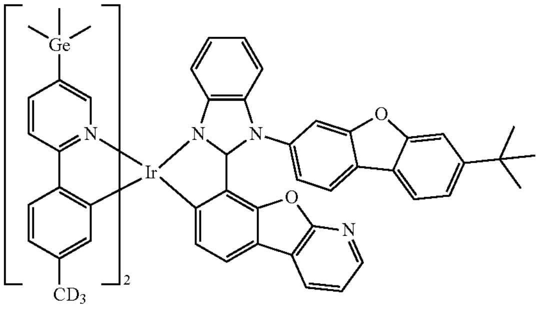

-continued
2794
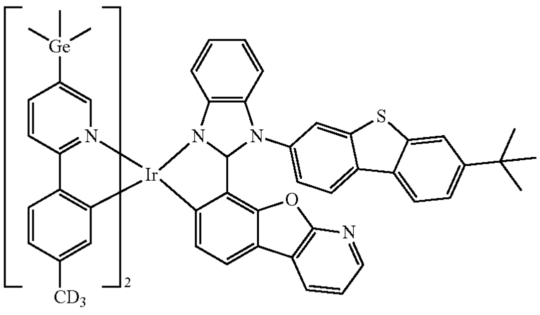
2795
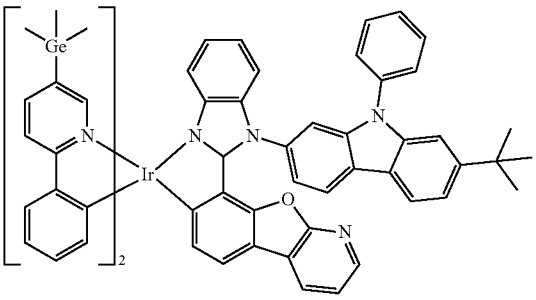
2796
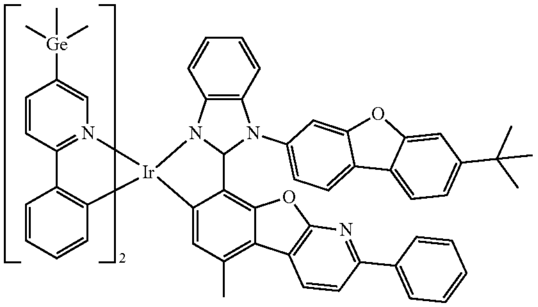
2797
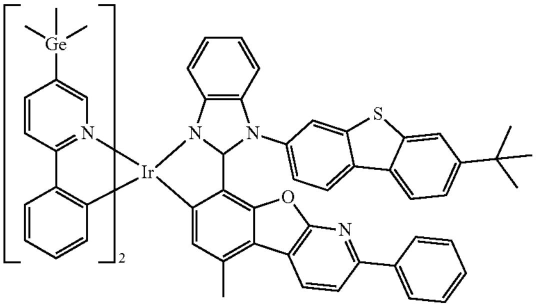
2798
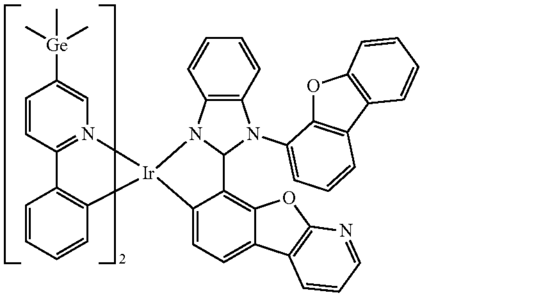
2799
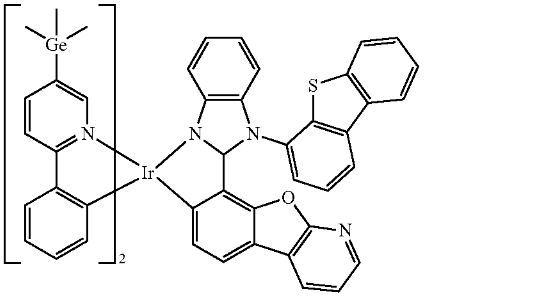
2800
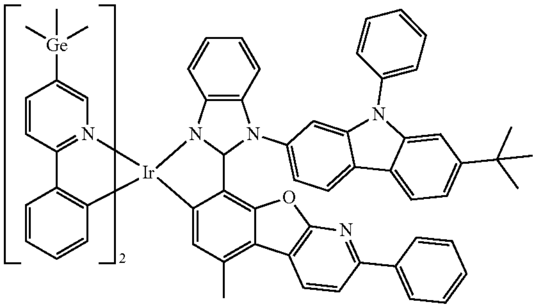
2801
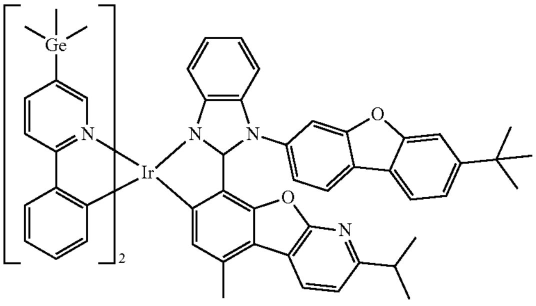
2802
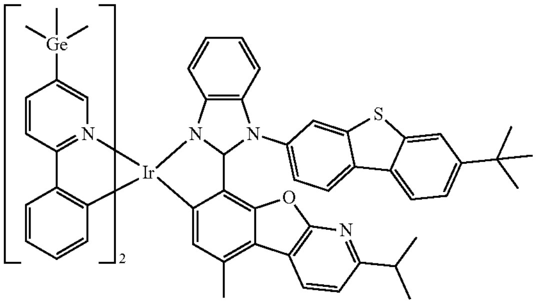
2803
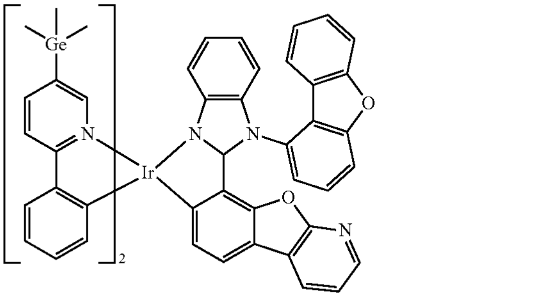

-continued
2804
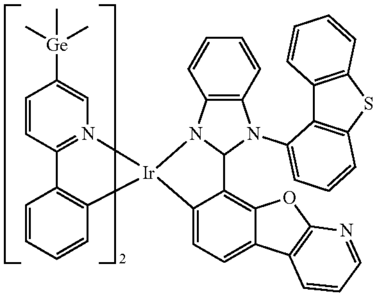
2805
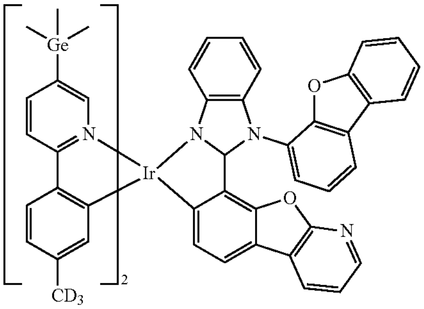
2806
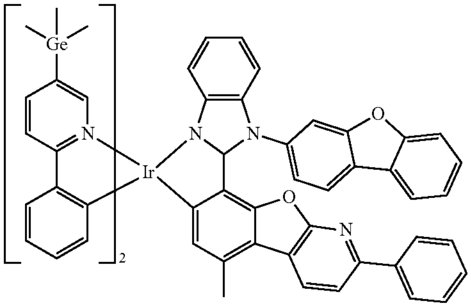
2807
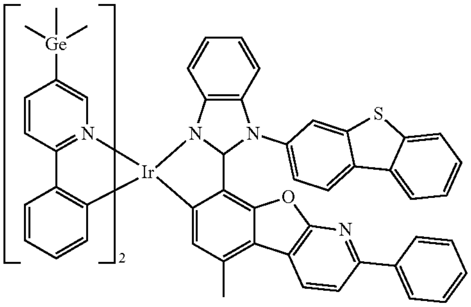
2808
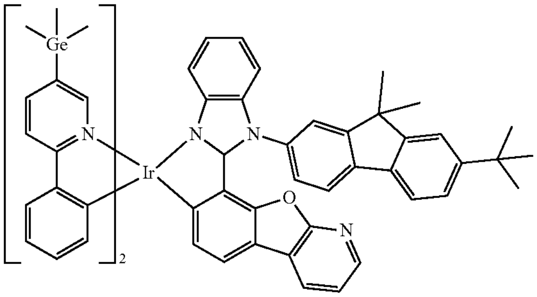
2809
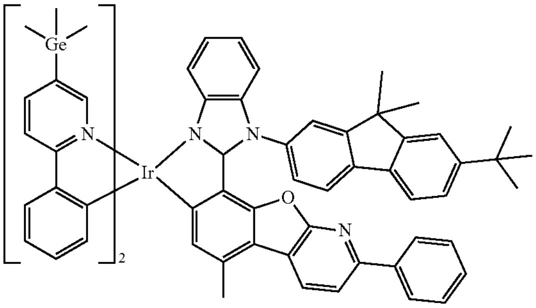
2810
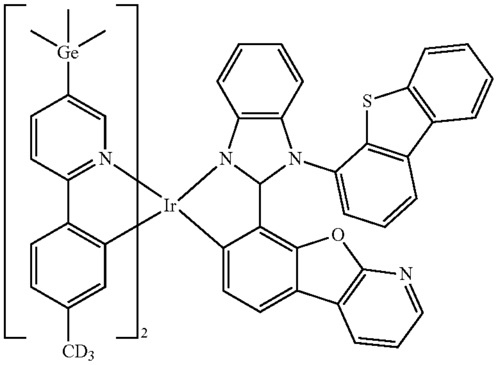

-continued
Group II
1
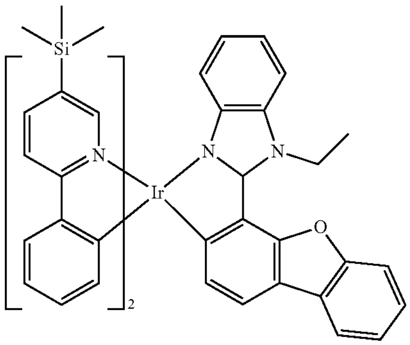
2
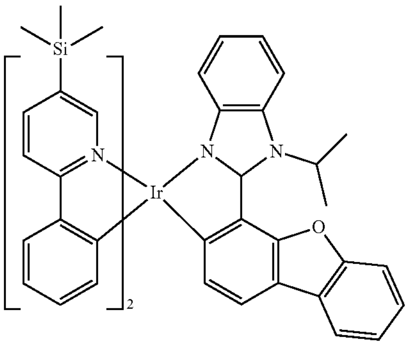
3
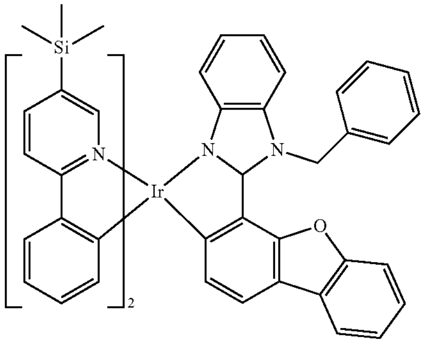
4
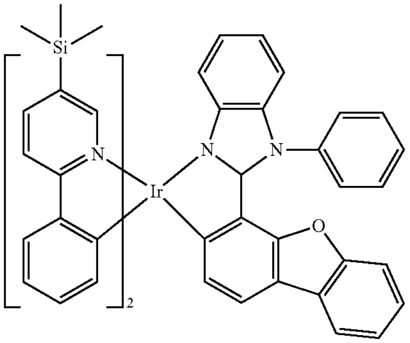
5
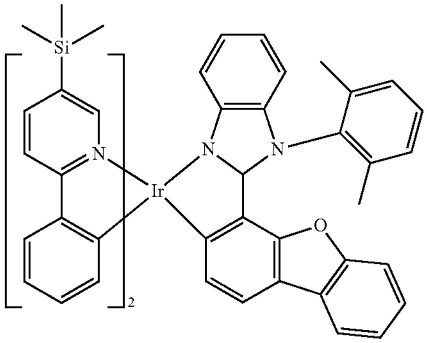
6
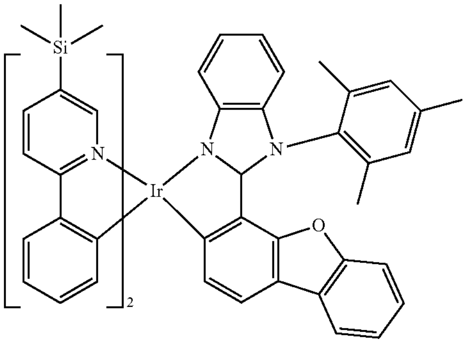
7
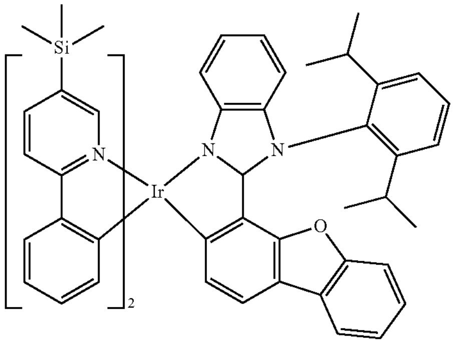
8
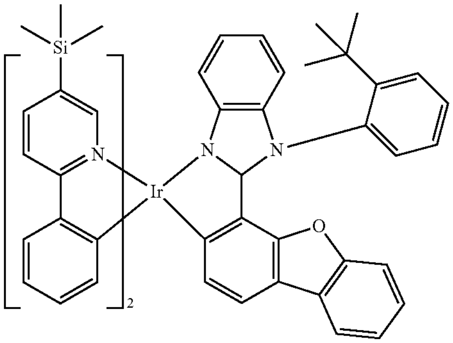

-continued
9
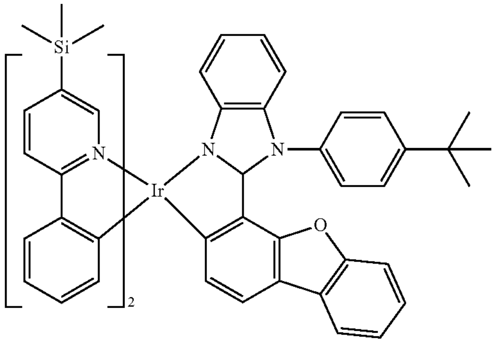
10
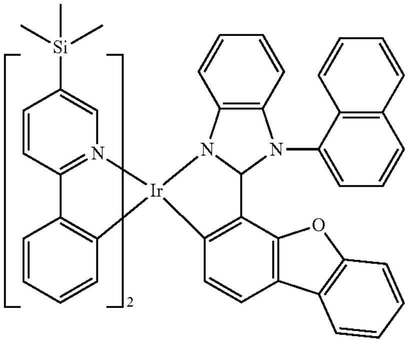
11
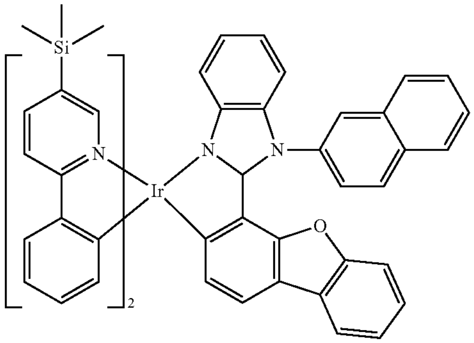
12
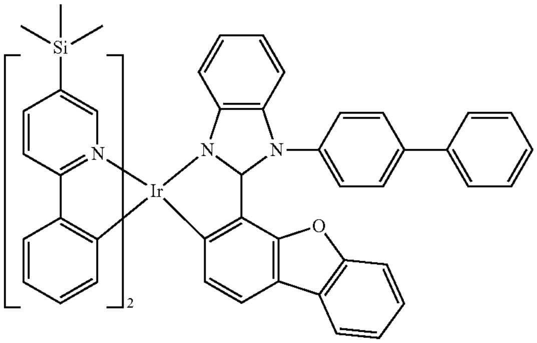
13
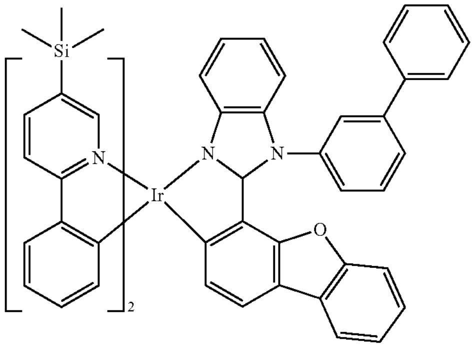
14
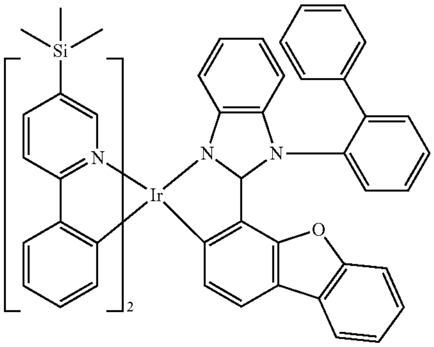
15
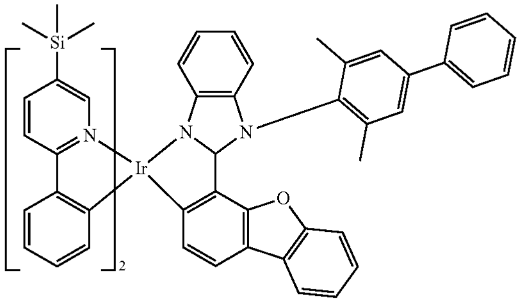
16
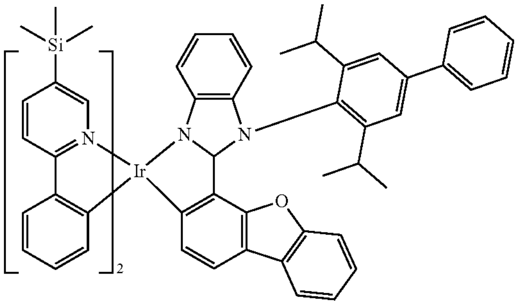

-continued
17
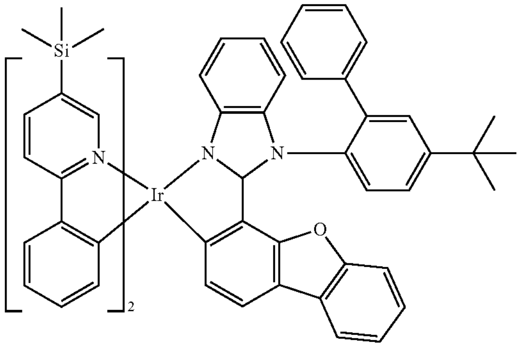
18
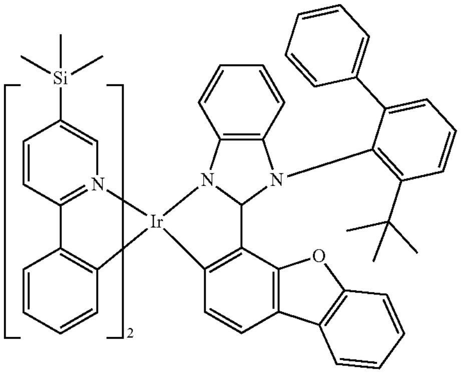
19
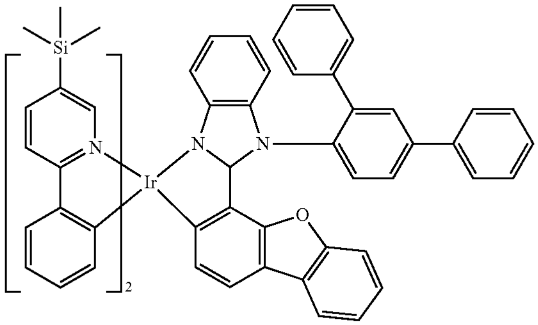
20
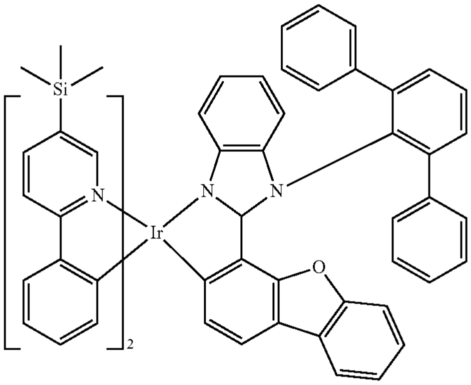
21
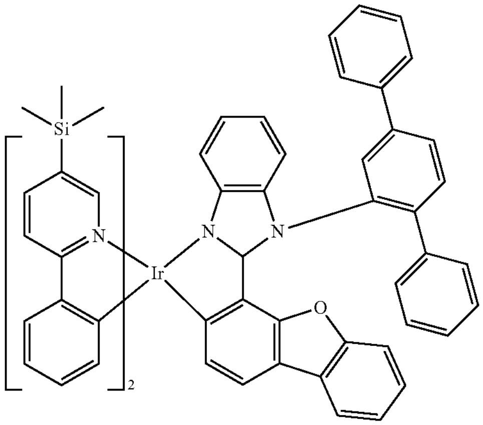
22
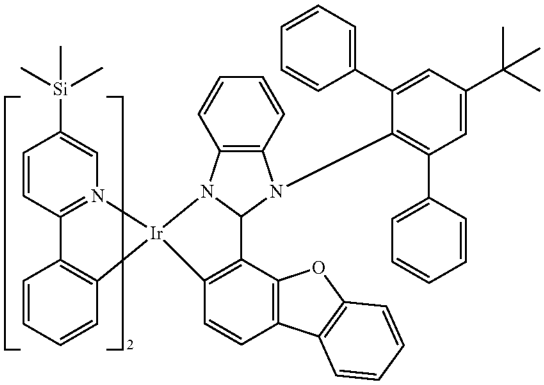
23
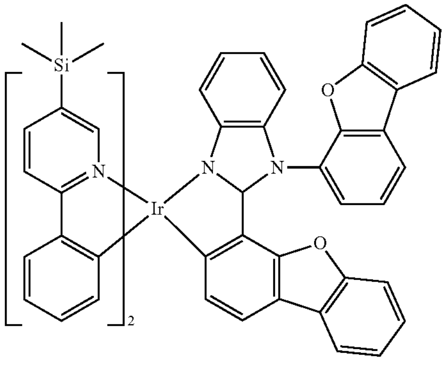
24
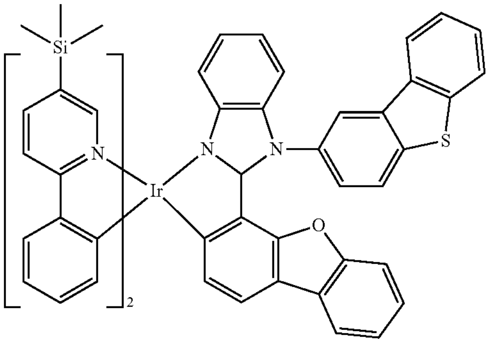

-continued
25
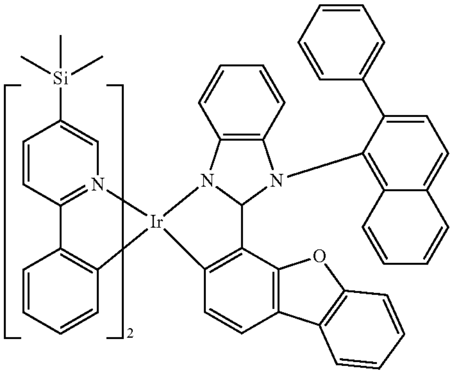
26
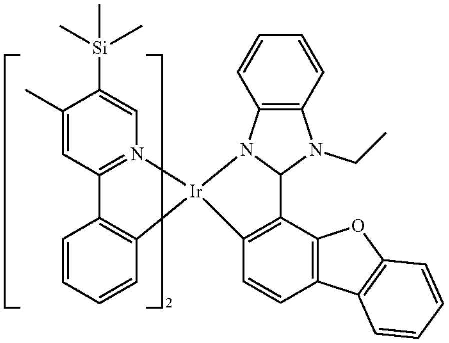
27
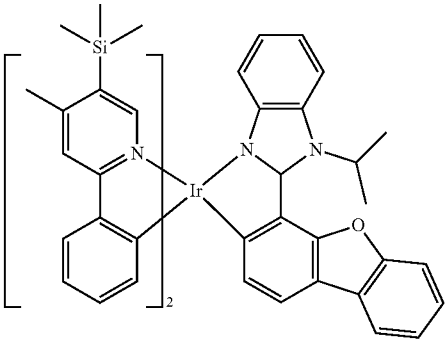
28
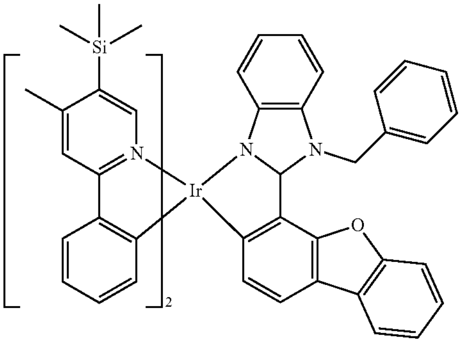
29
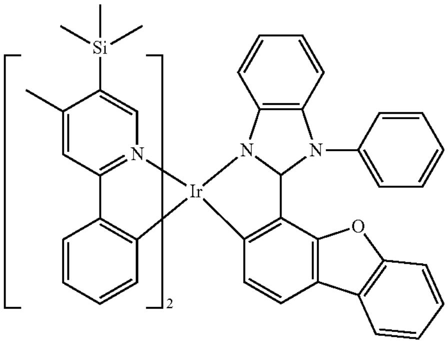
30
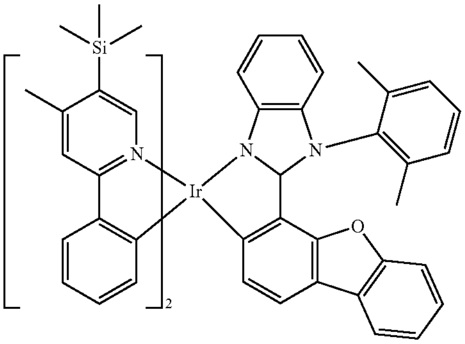
31
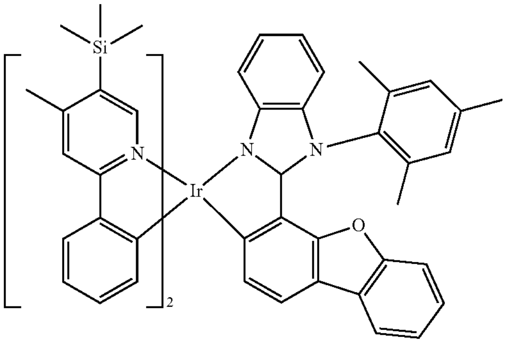
32
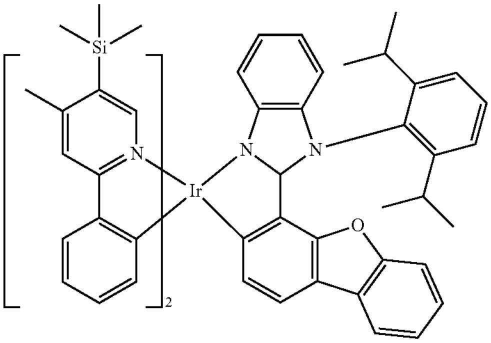

-continued
33
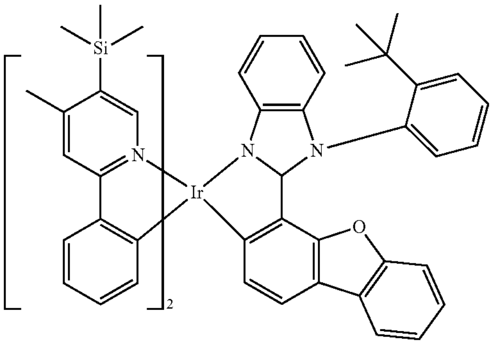
34
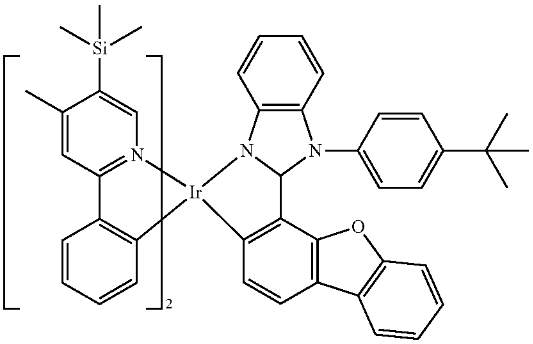
35
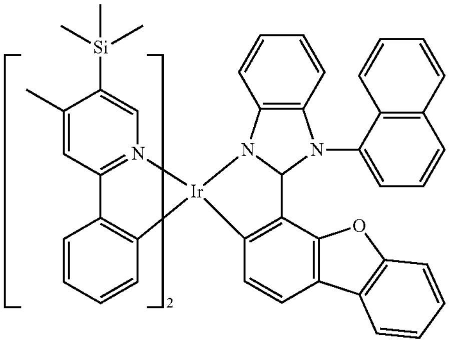
36
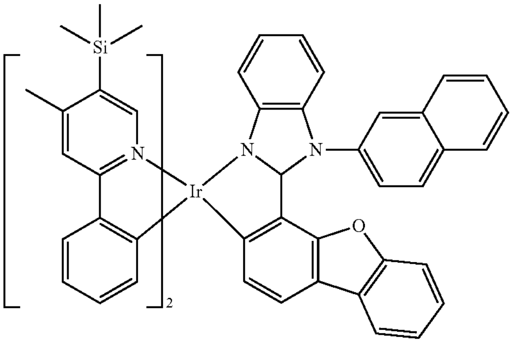
37
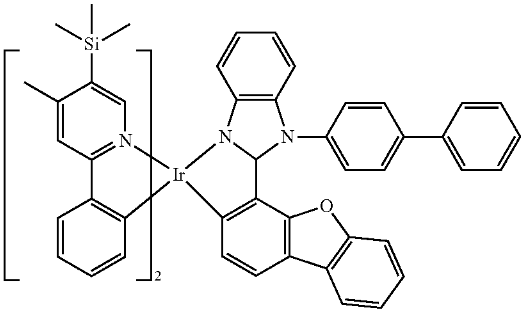
38
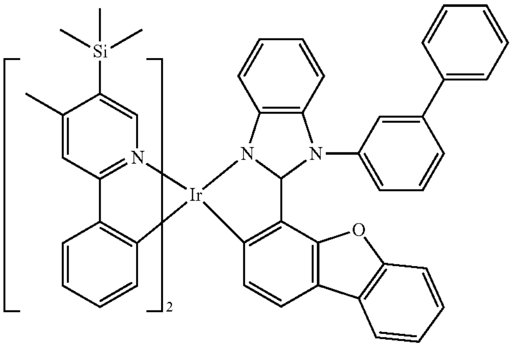
39
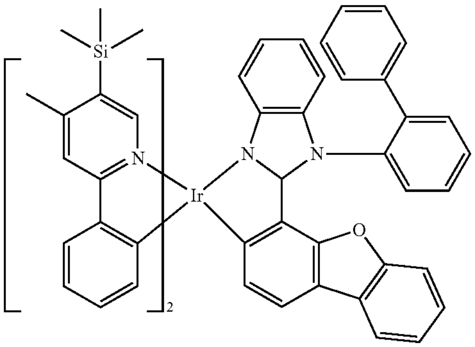
40
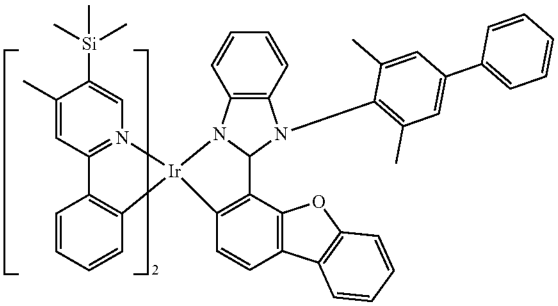

-continued
41
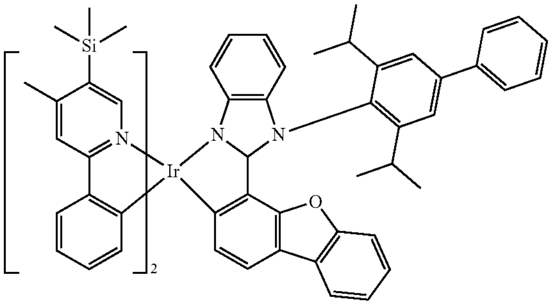
42
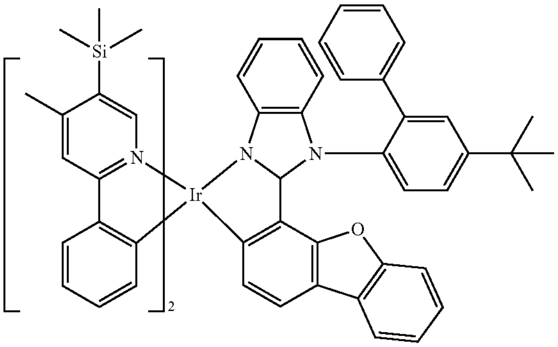
43
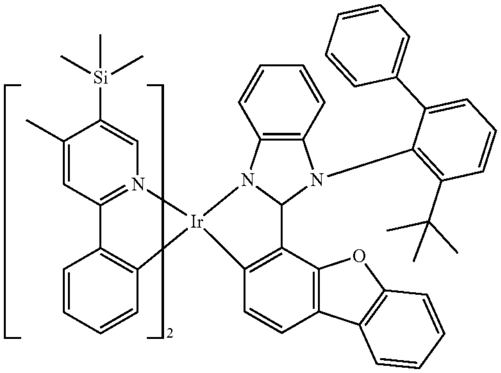
44
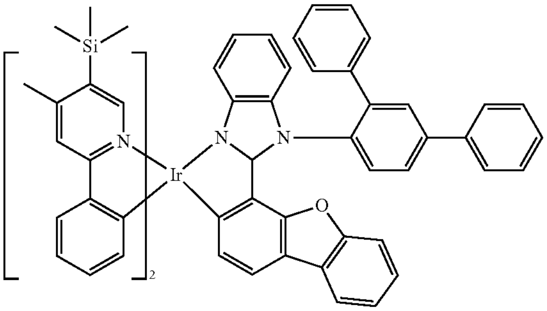
45
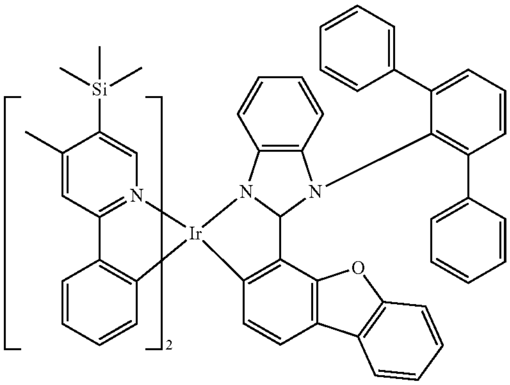
46
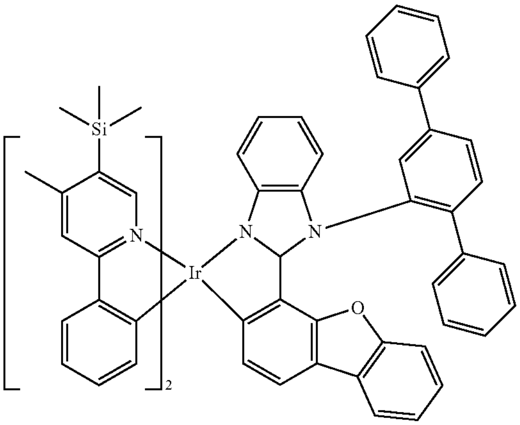
47
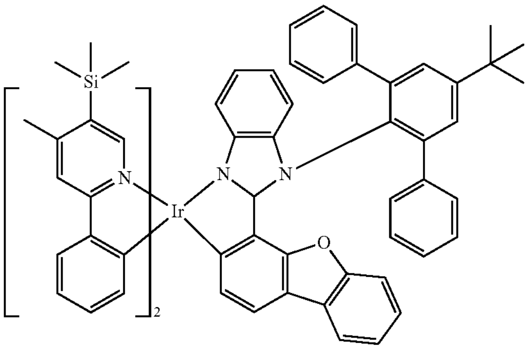
48
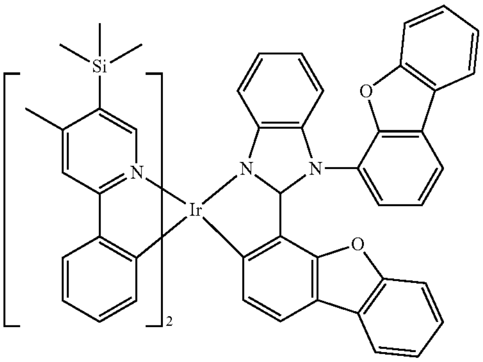

-continued
49
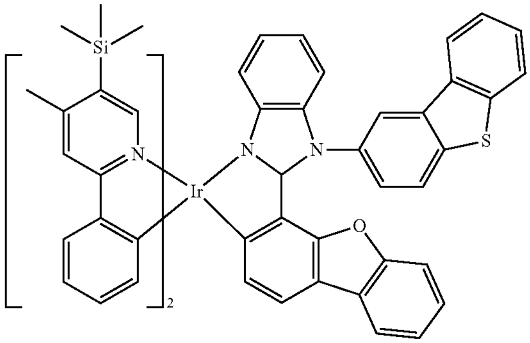
50
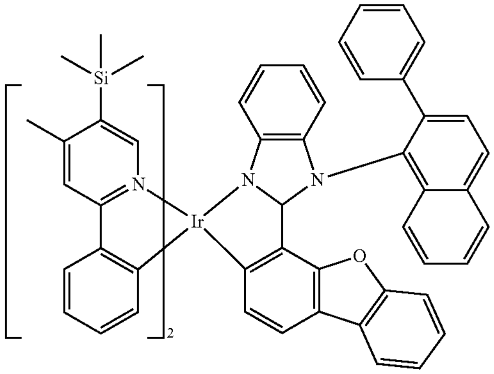
51
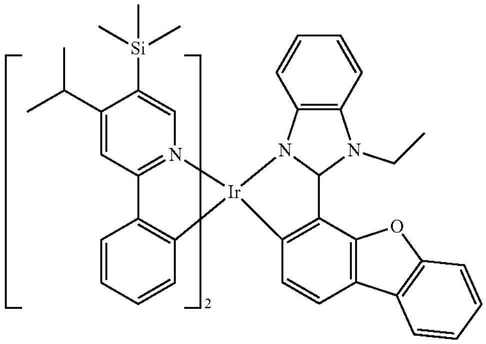
52
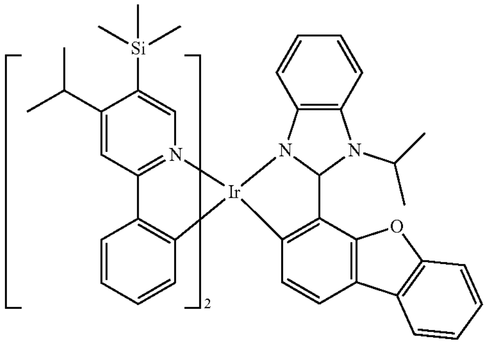
53
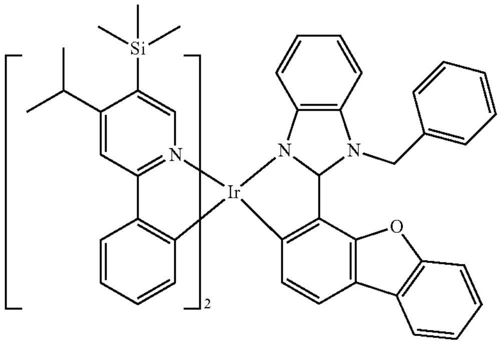
54
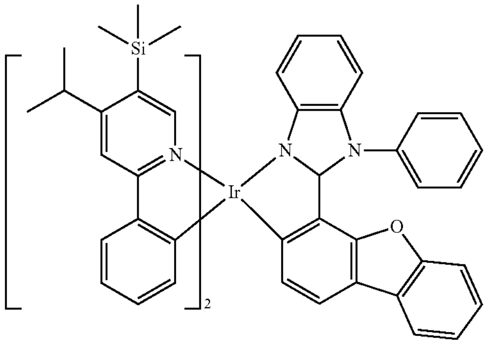
55
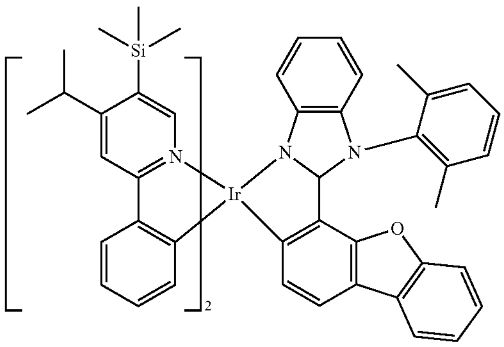
56
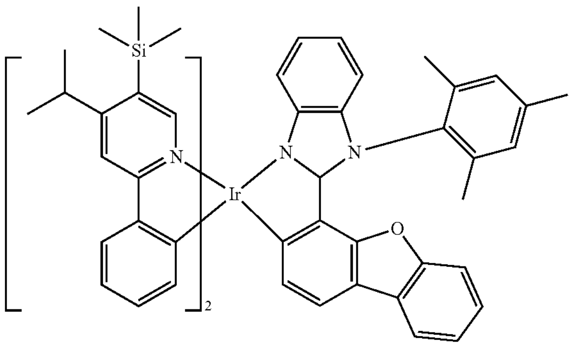

-continued
57
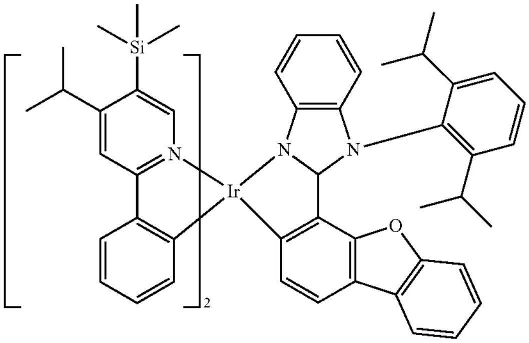
58
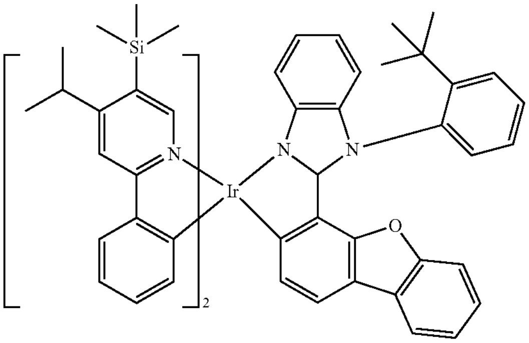
59
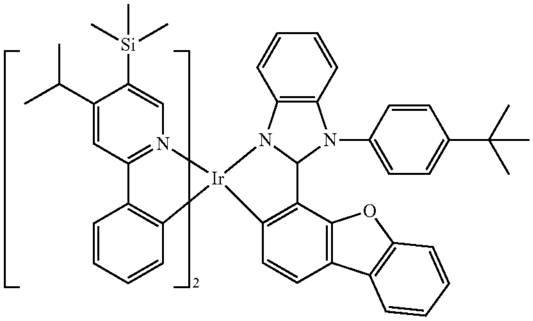
60
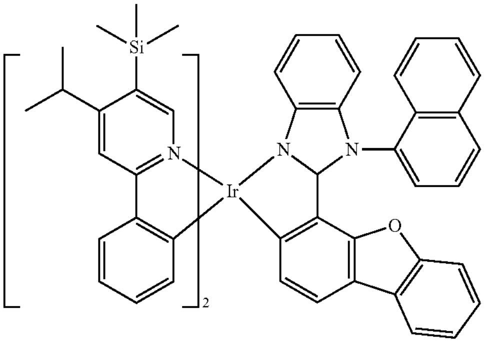
61
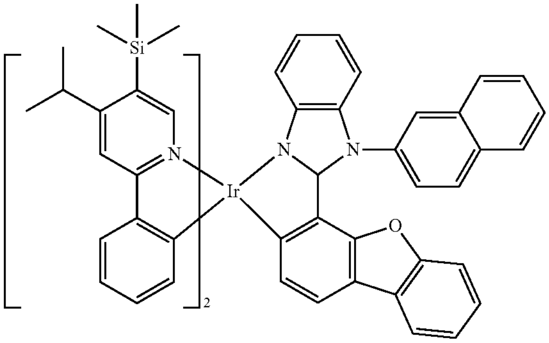
62
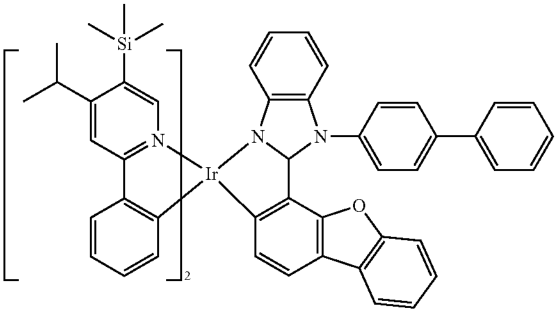
63
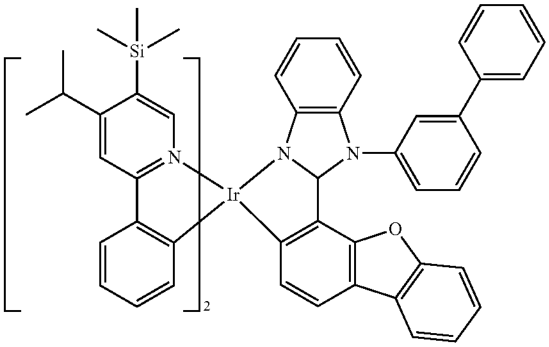
64
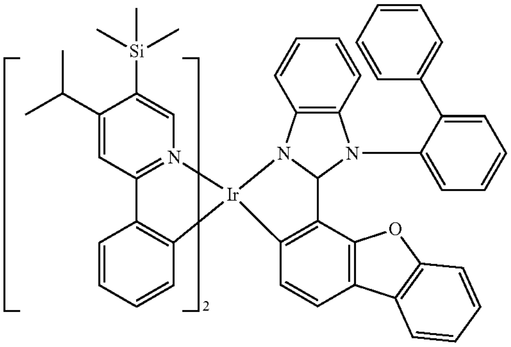

-continued
65
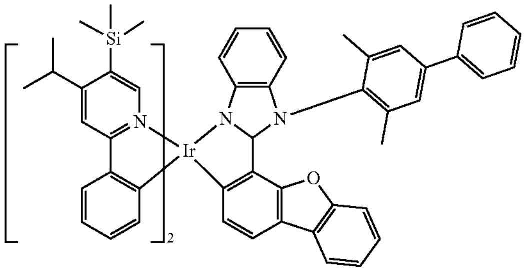
66
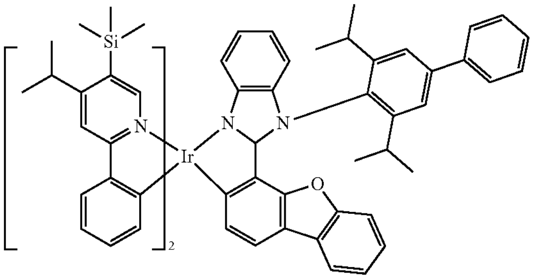
67
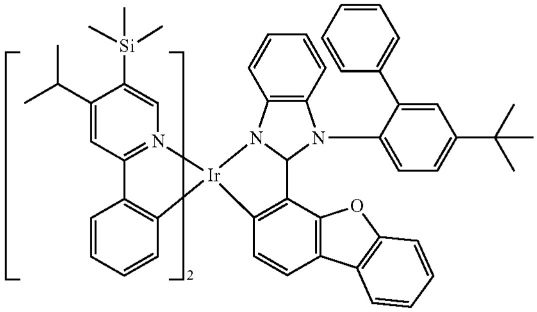
68
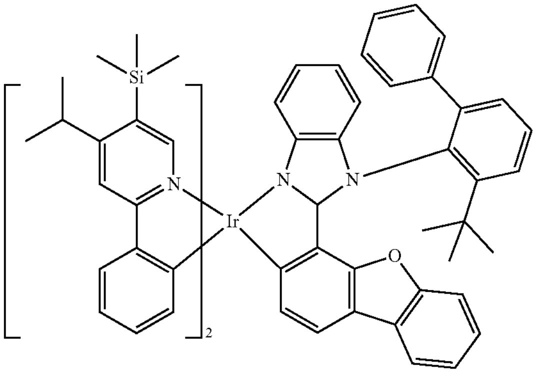
69
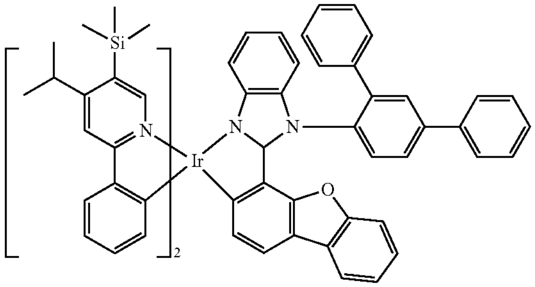
70
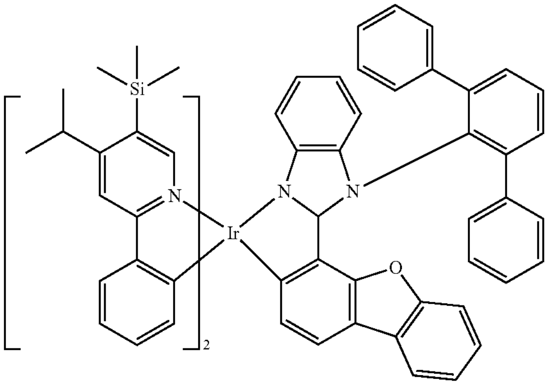
71
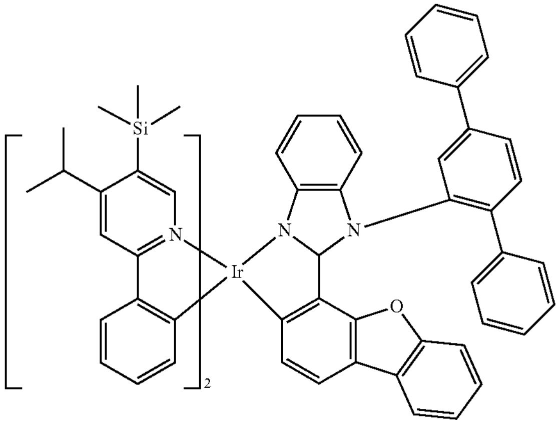
72
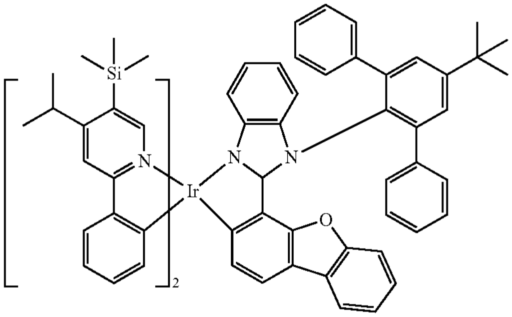

-continued
73
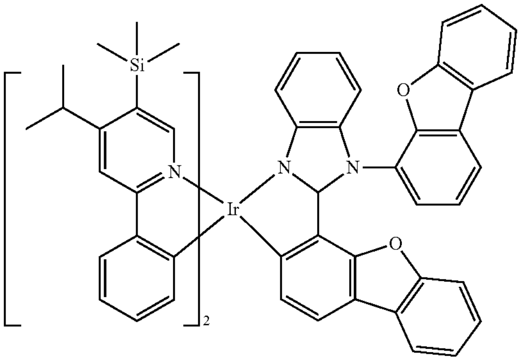
74
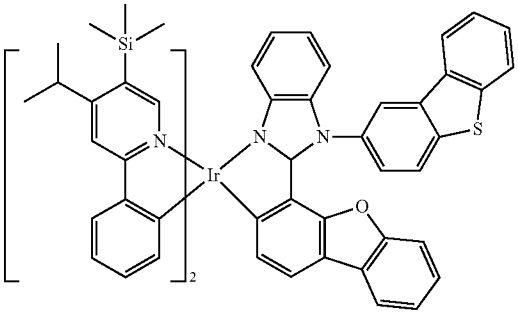
75
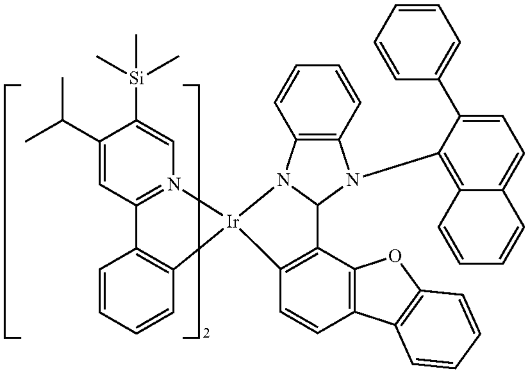
76
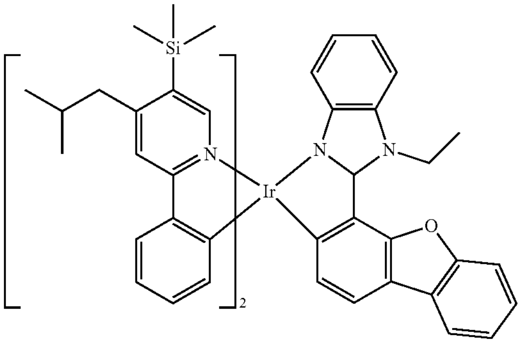
77
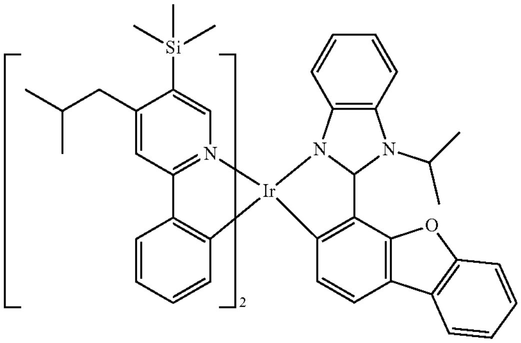
78
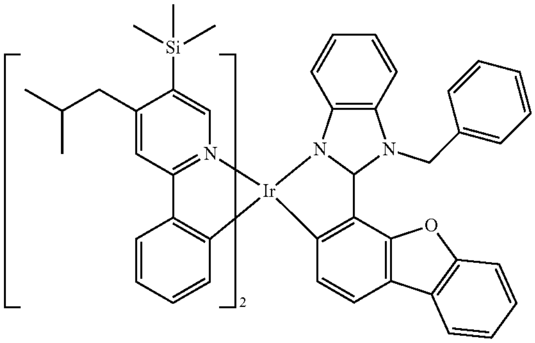
79
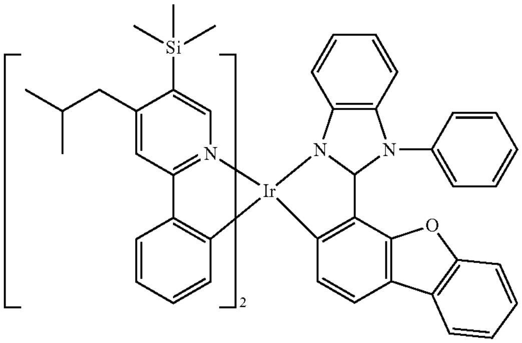
80
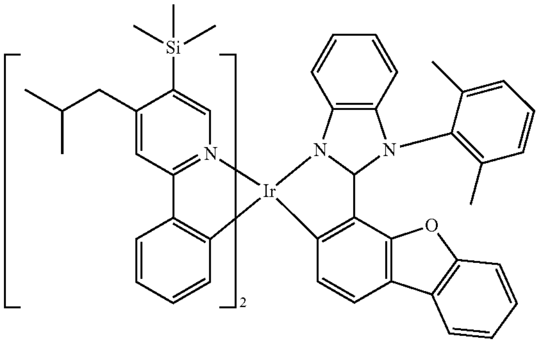

-continued
81
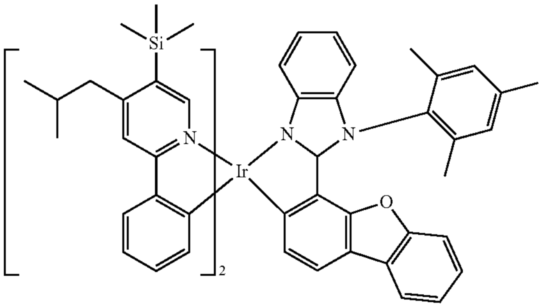
82
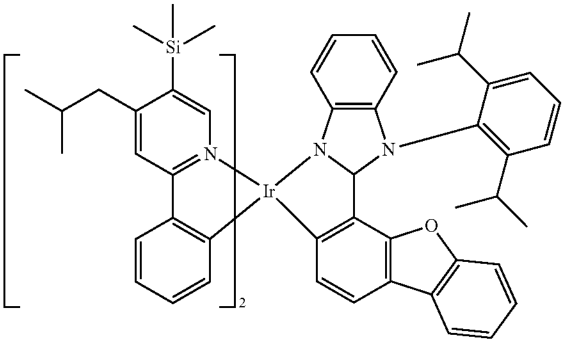
83
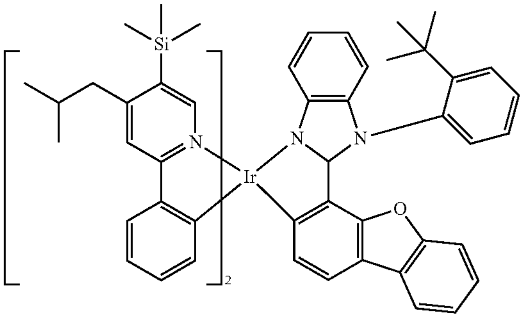
84
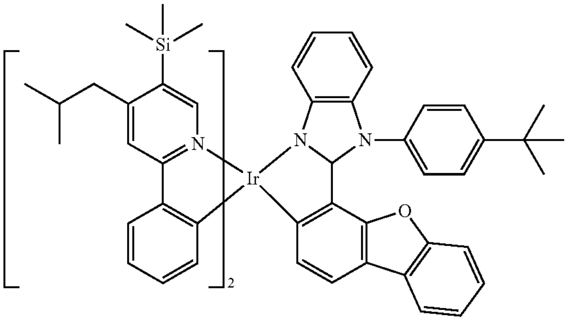
85
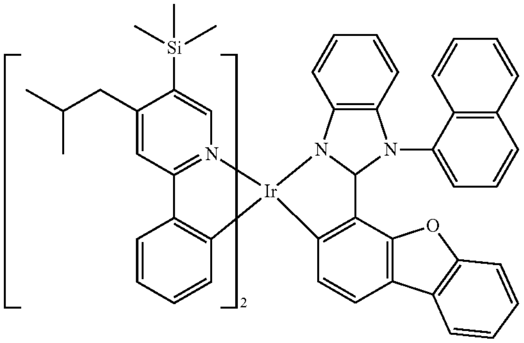
86
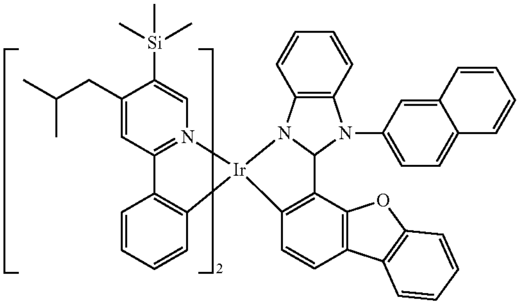
87
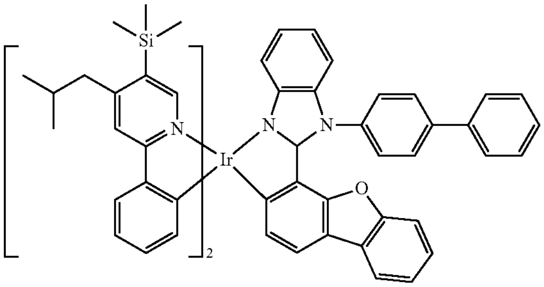
88
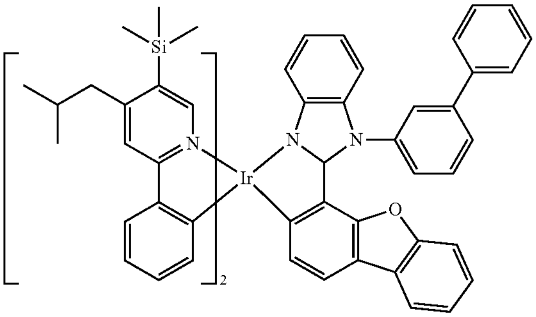

-continued
89
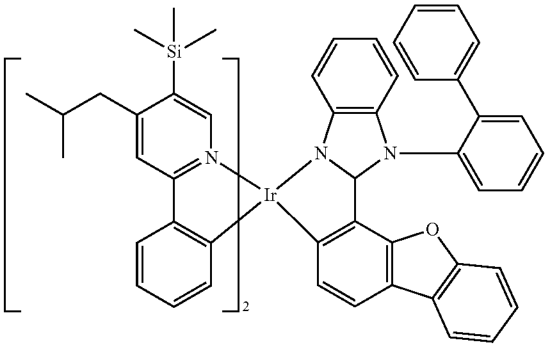
90
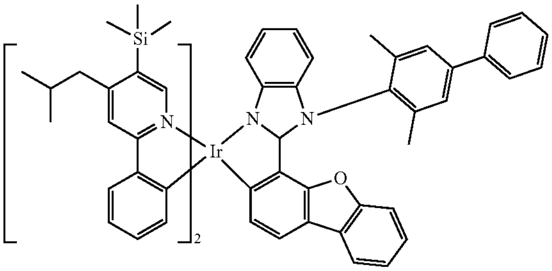
91
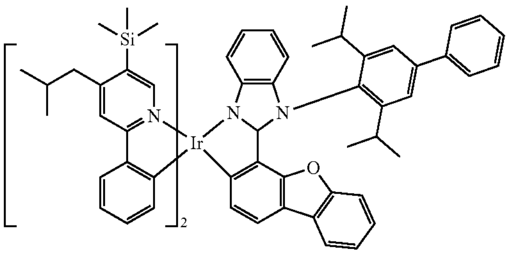
92
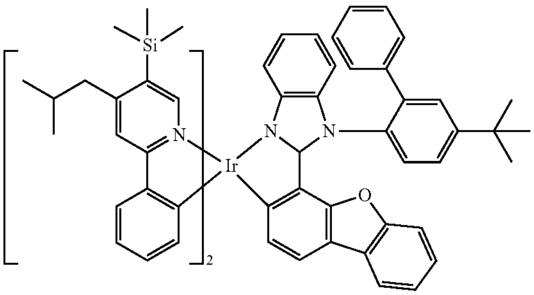
93
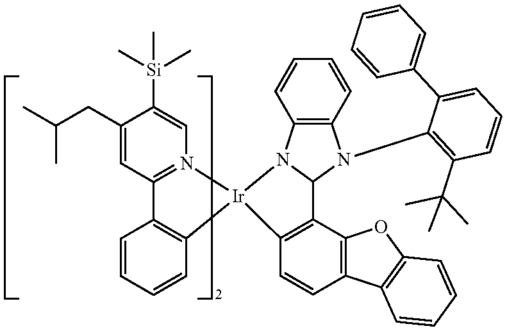
94
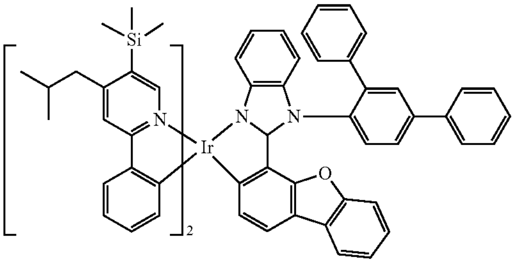
95
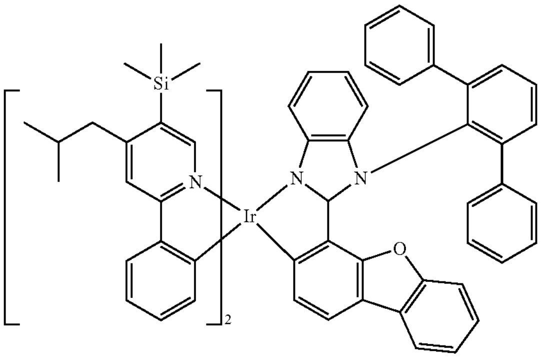
96
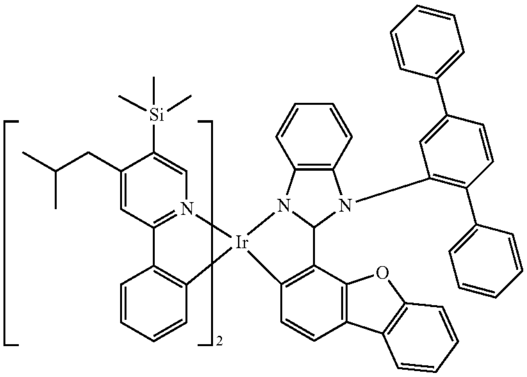

-continued
97
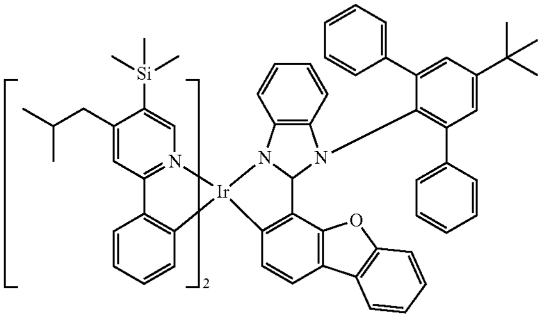
98
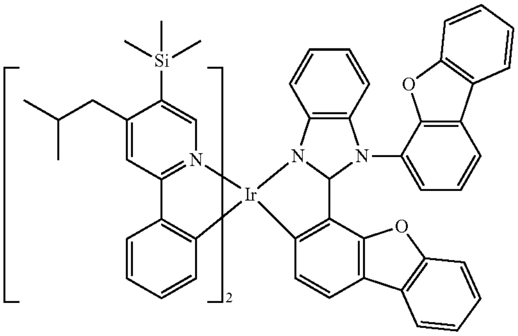
99
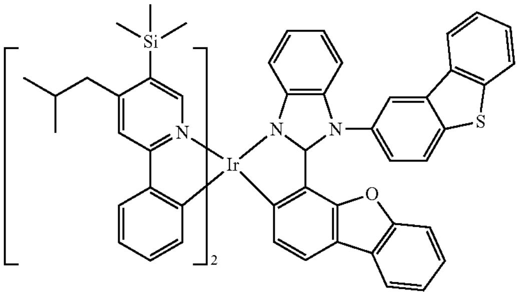
100
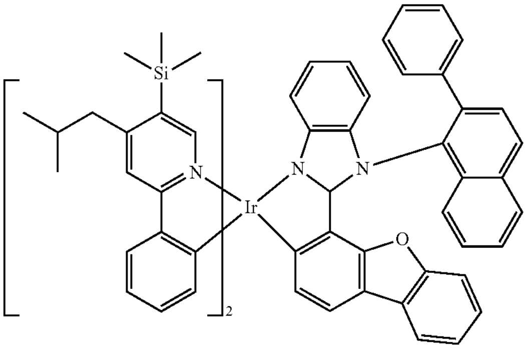
101
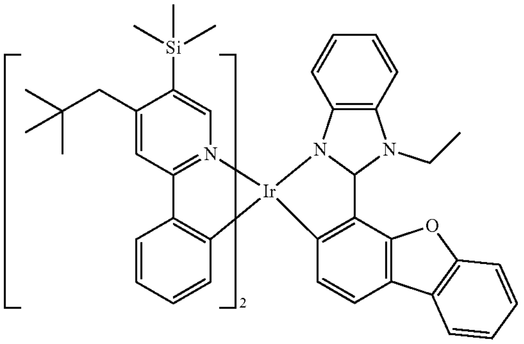
102
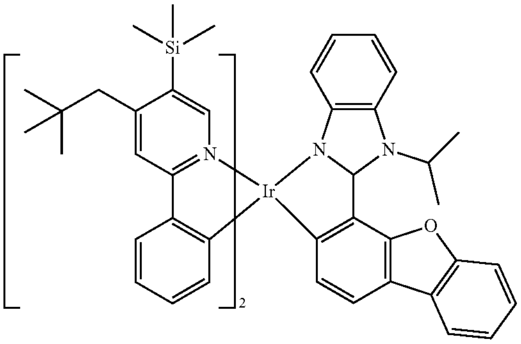
103
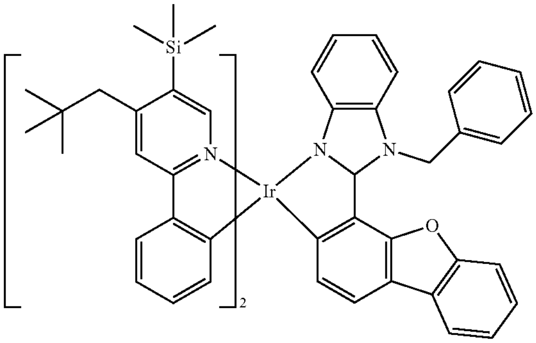
104
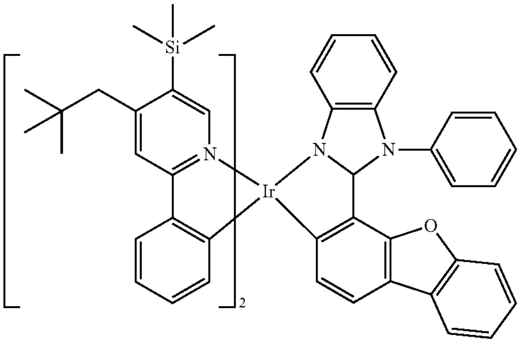

-continued
105
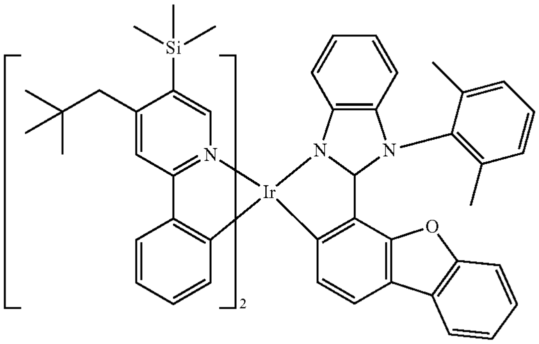
106
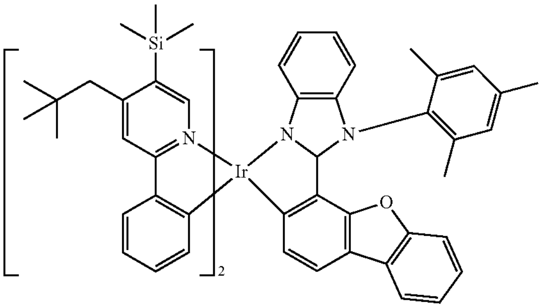
107
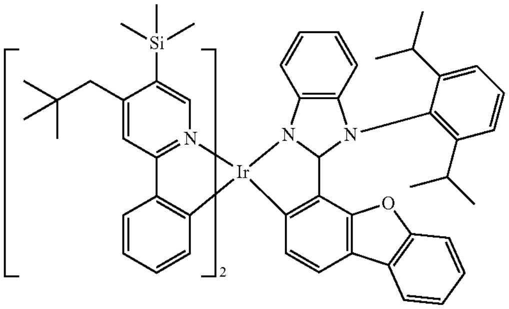
108
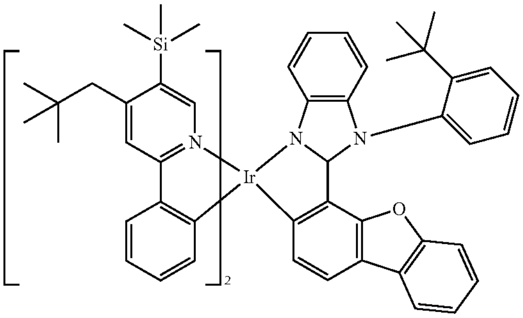
109
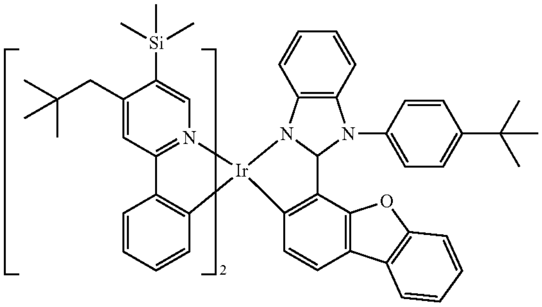
110
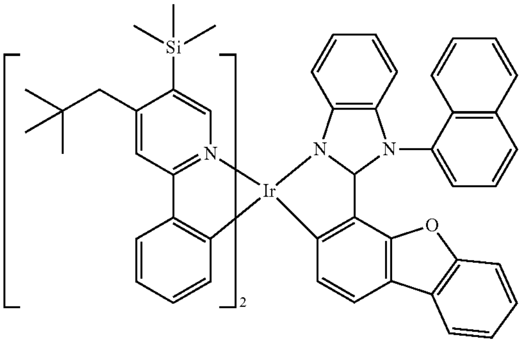
111
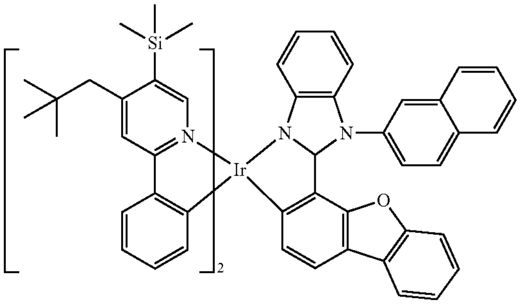
112
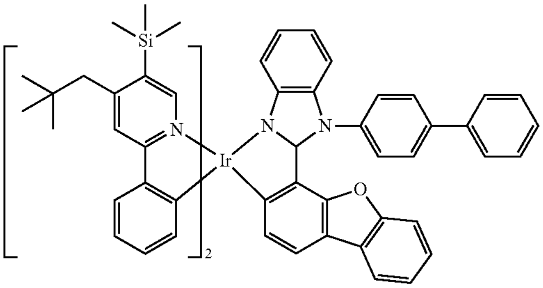

-continued
113
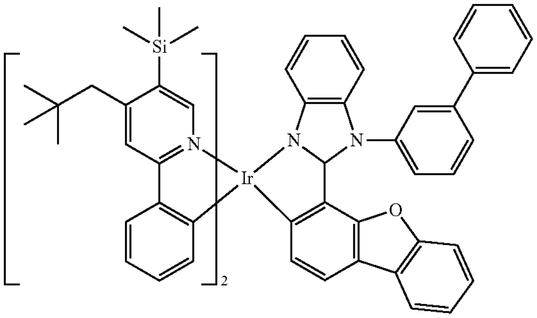
114
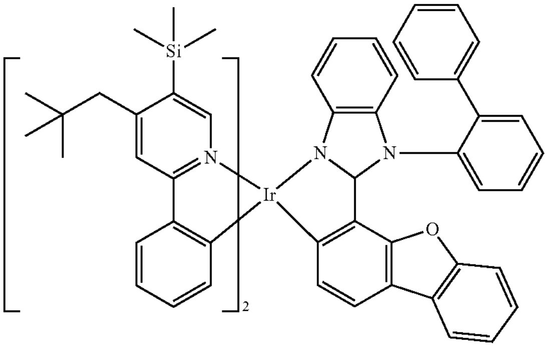
115
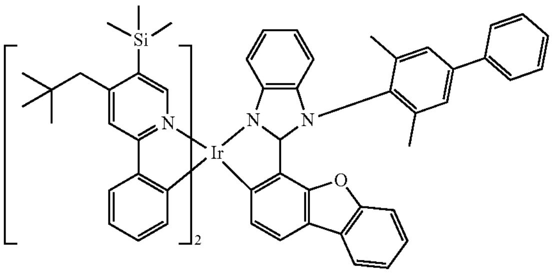
116
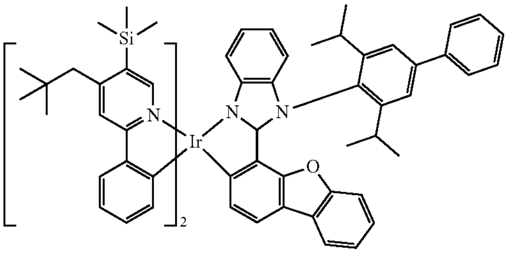
117
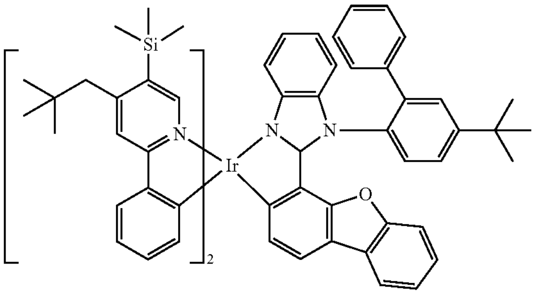
118
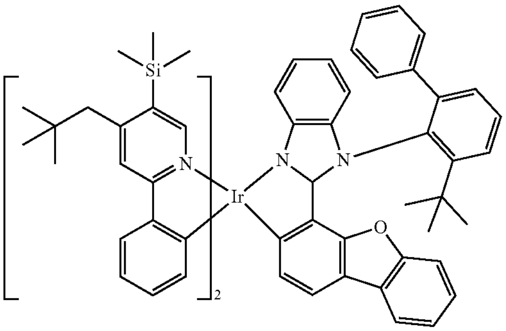
119
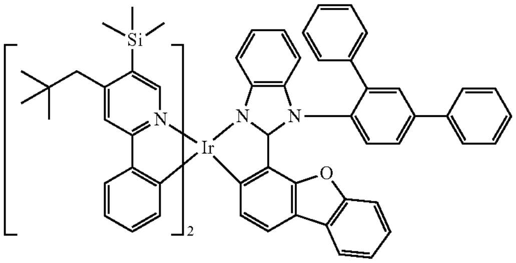
120
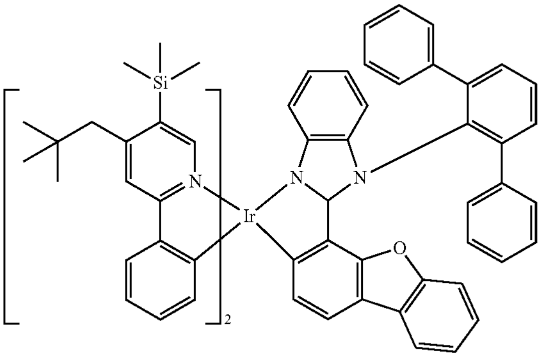

-continued
121
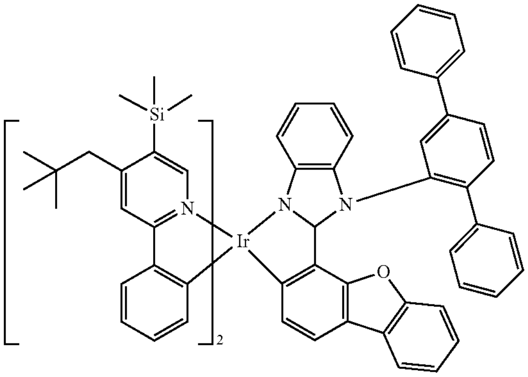
122
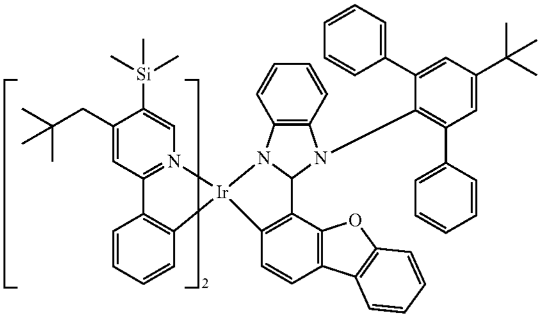
123
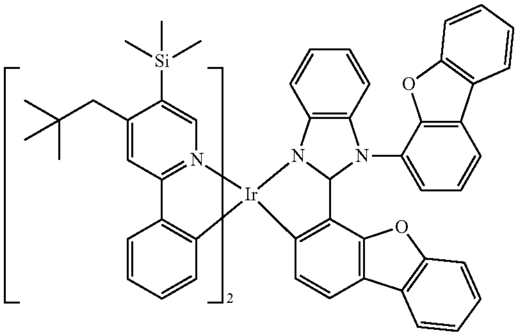
124
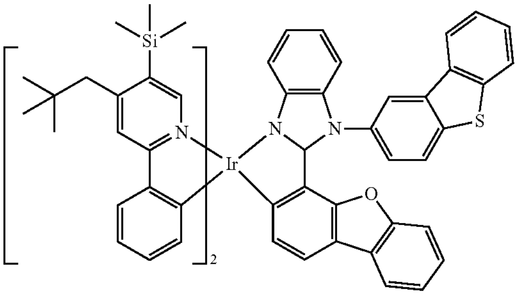
125
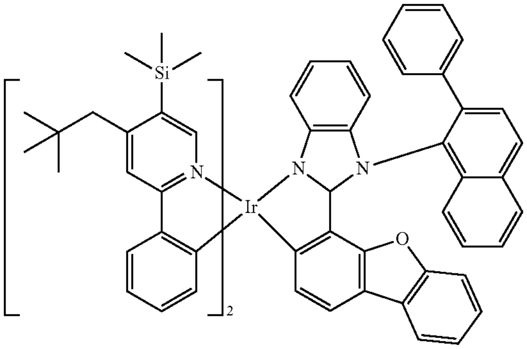
126
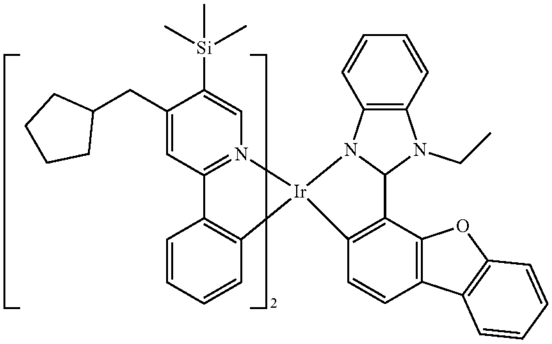
127
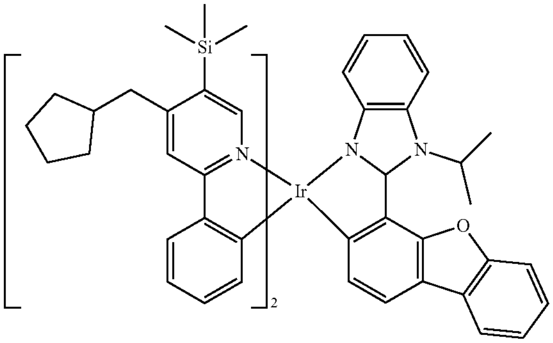
128
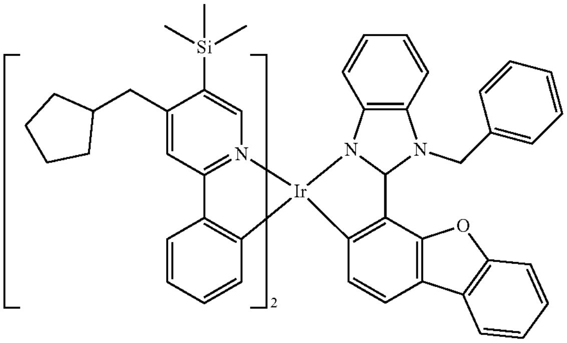

-continued
129
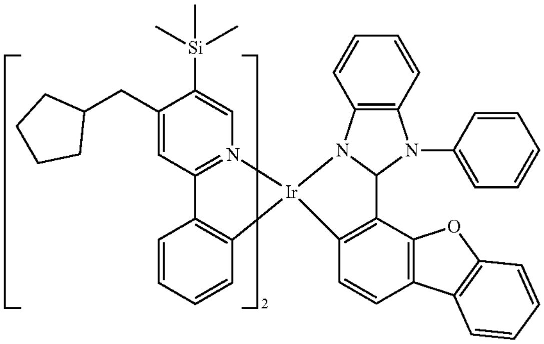
130
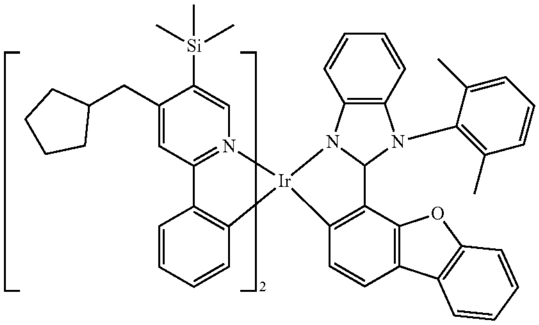
131
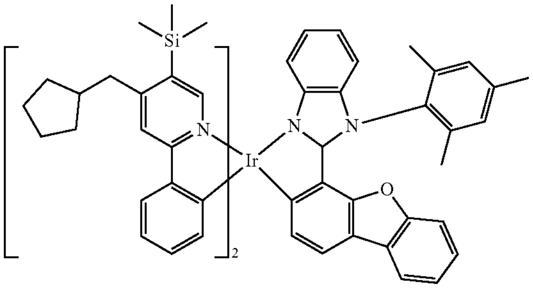
132
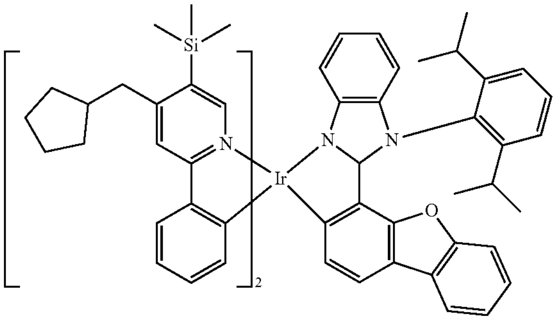
133
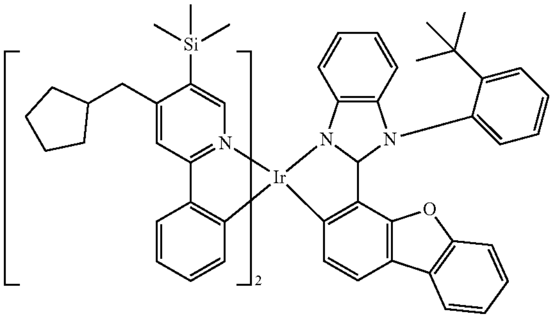
134
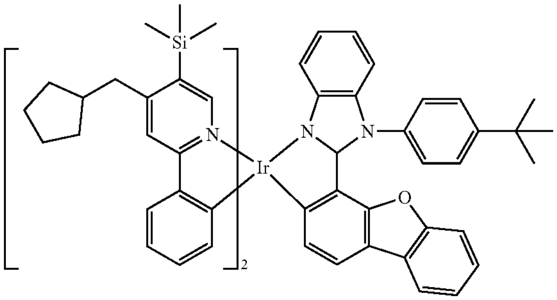
135
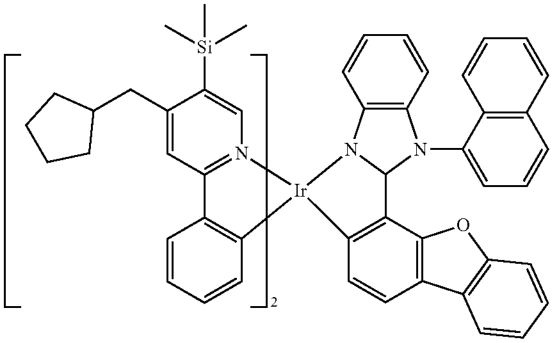
136
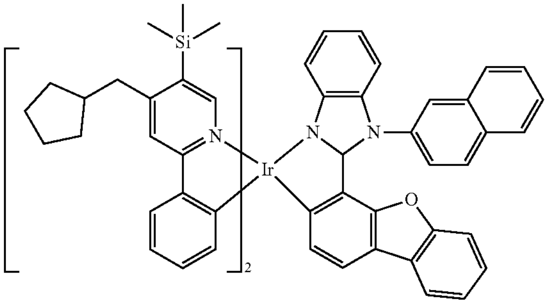

-continued
137
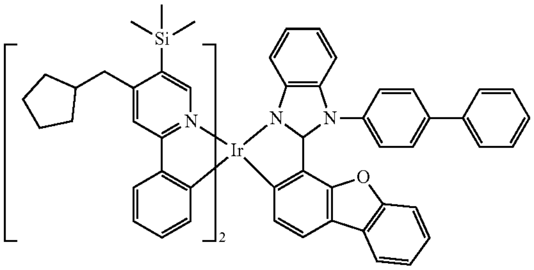
138
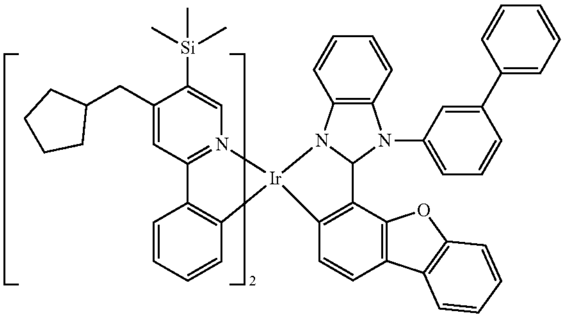
139
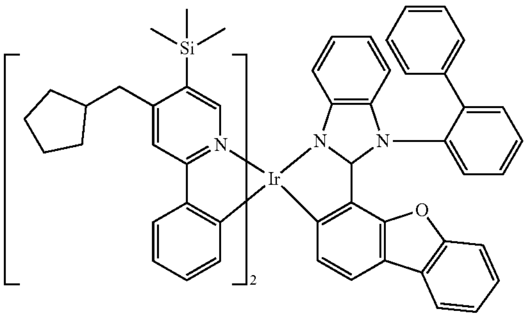
140
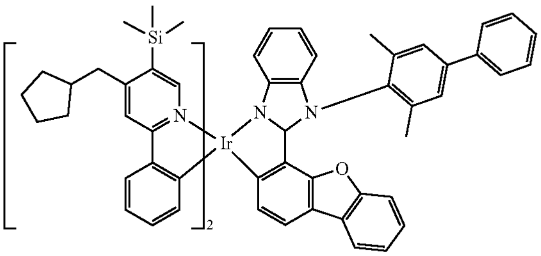
141
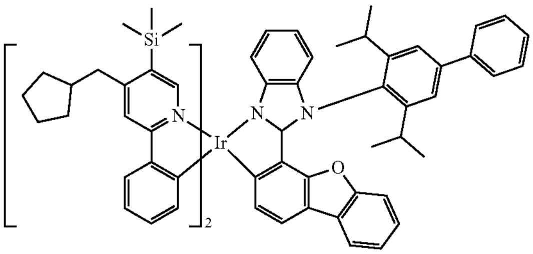
142
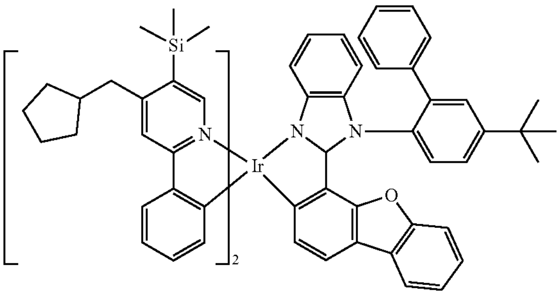
143
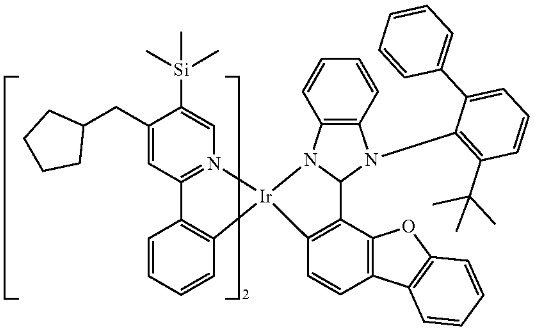
144
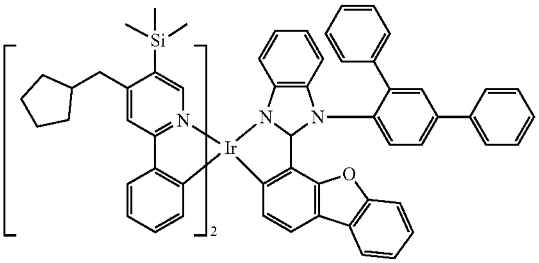

-continued
145
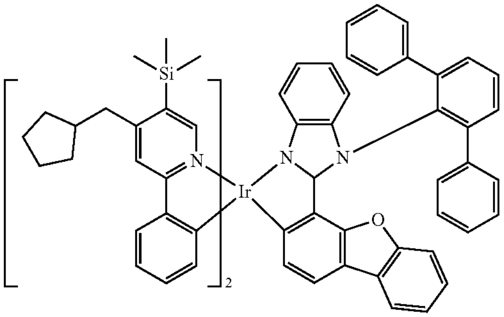
146
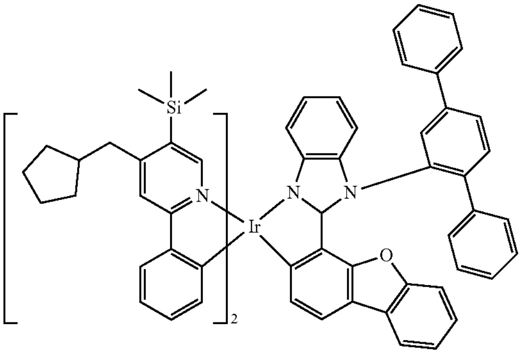
147
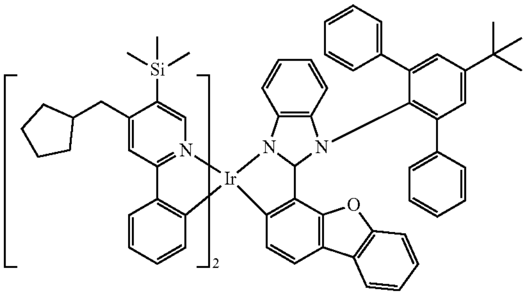
148
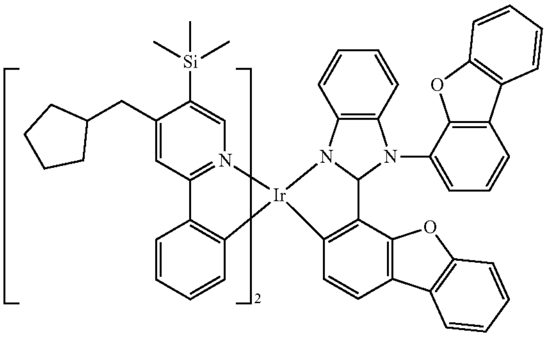
149
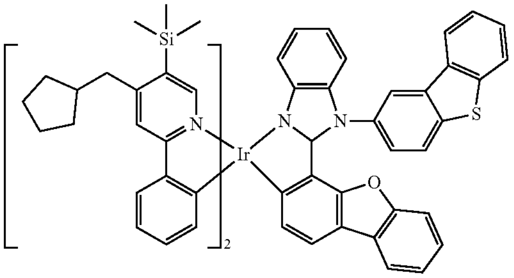
150
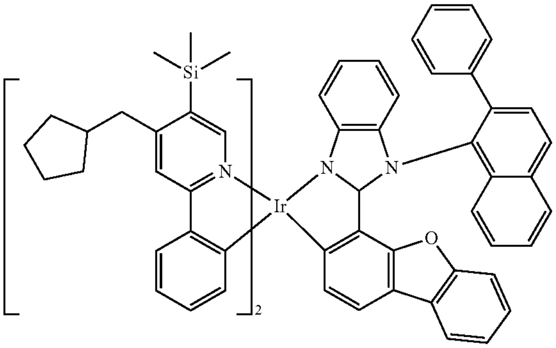
151
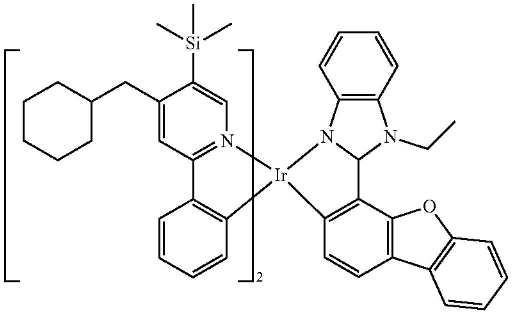
152
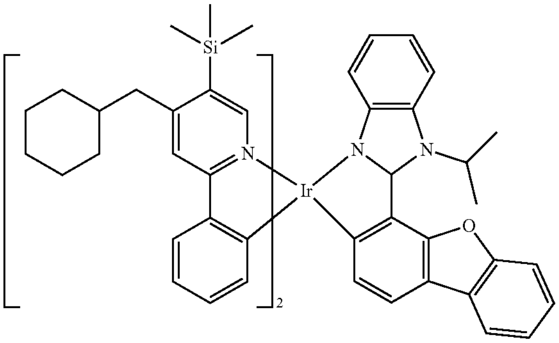

-continued
153
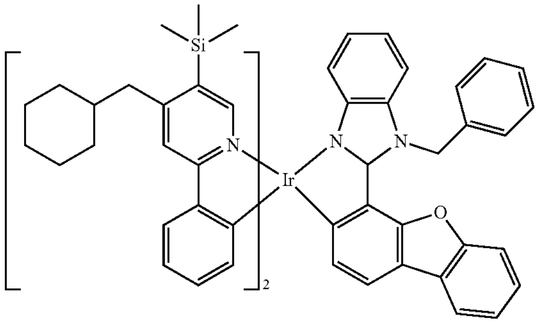
154
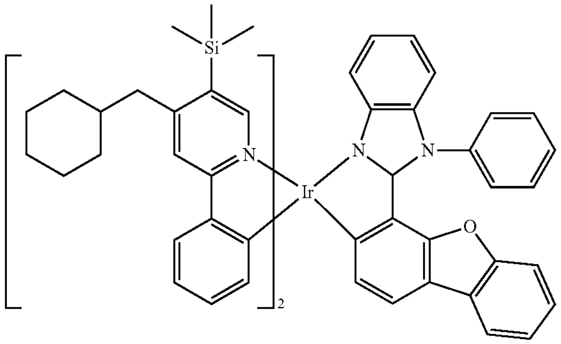
155
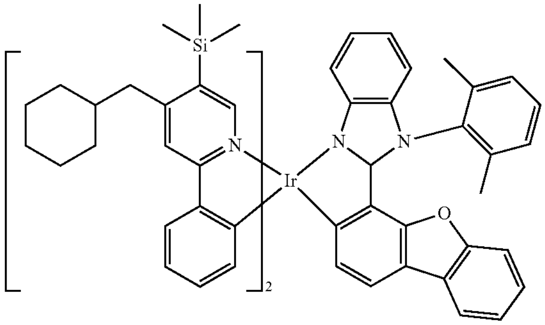
156
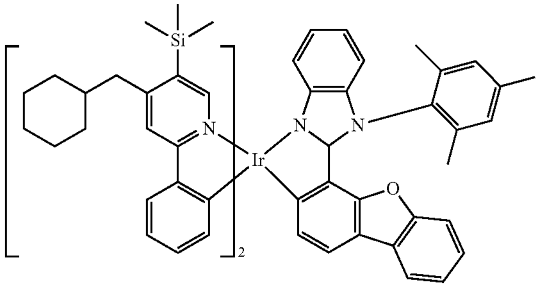
157
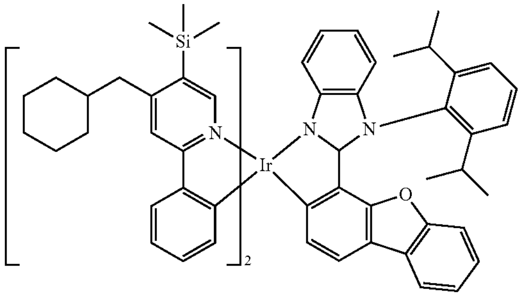
158
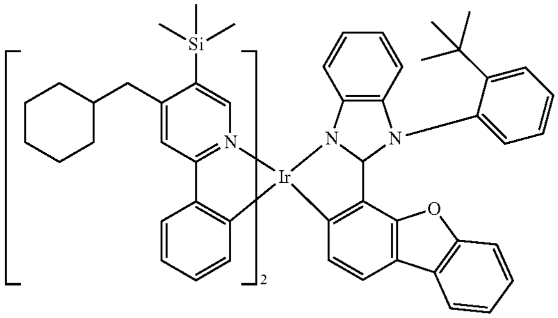
159
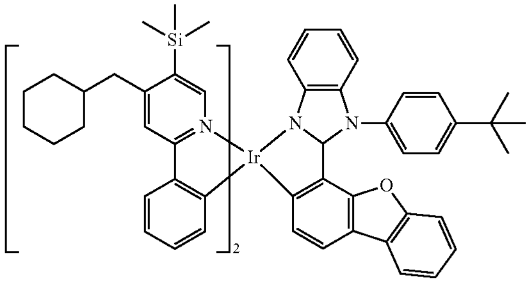
160
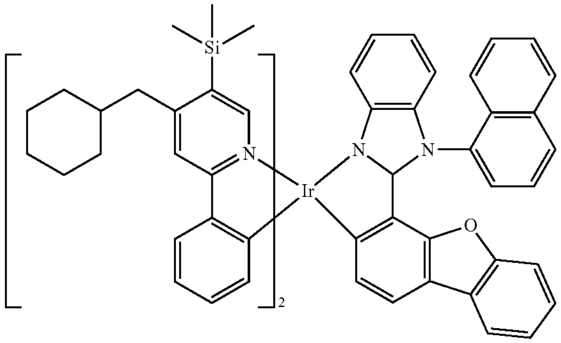

-continued
161
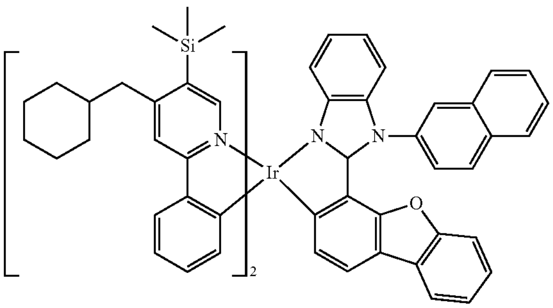
162
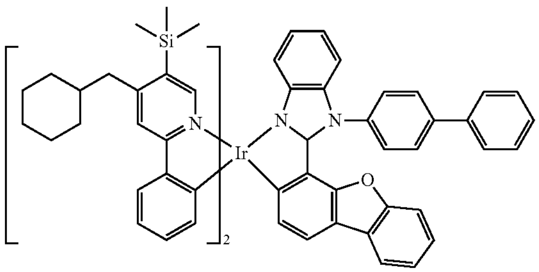
163
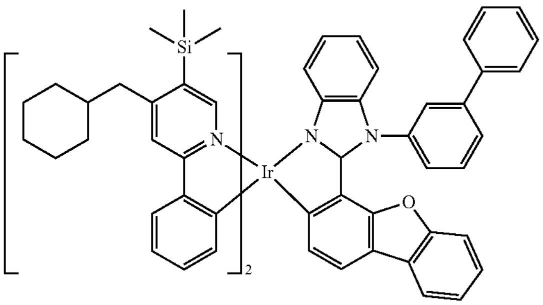
164
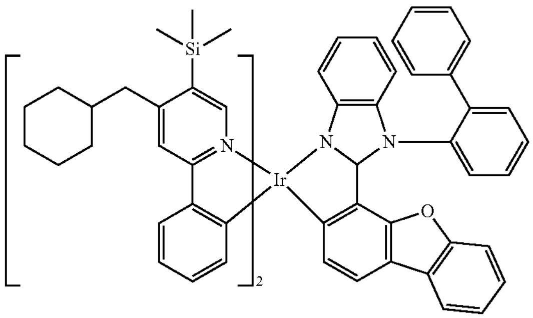
165
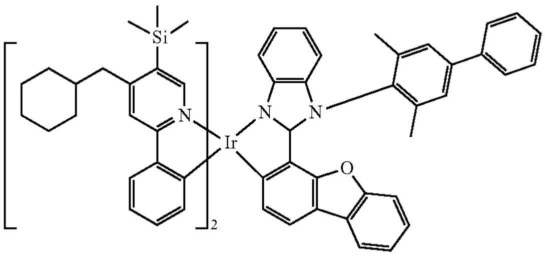
166
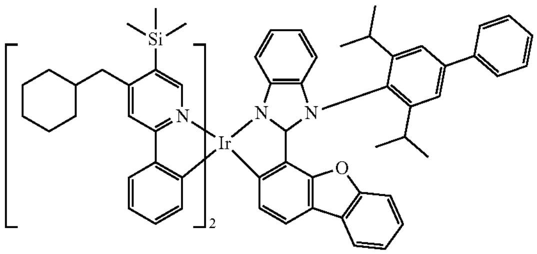
167
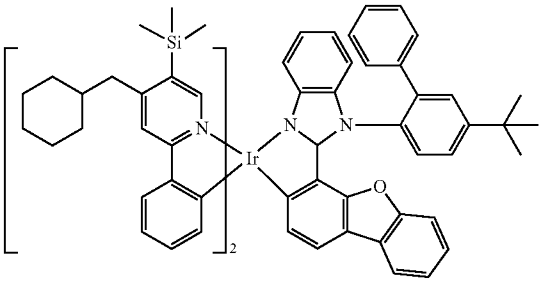
168
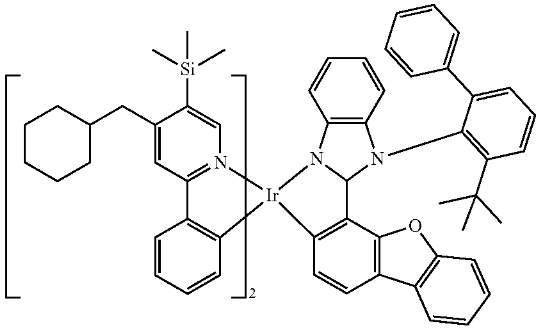
169
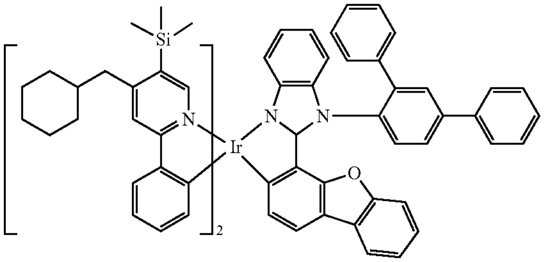
170
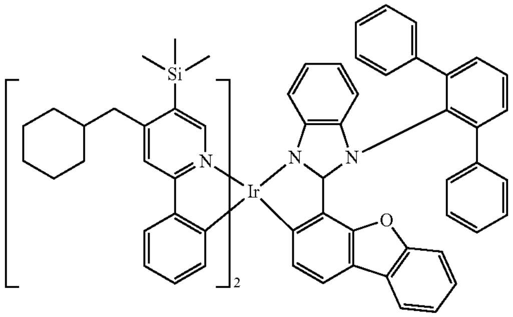

-continued
171
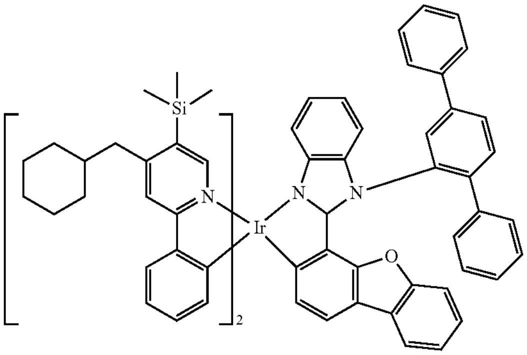
172
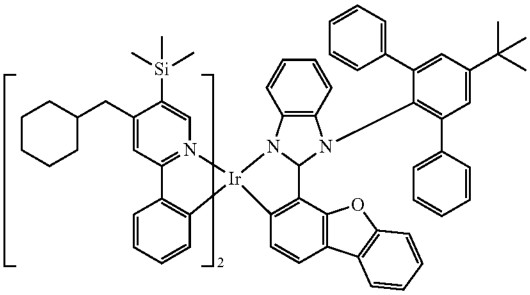
173
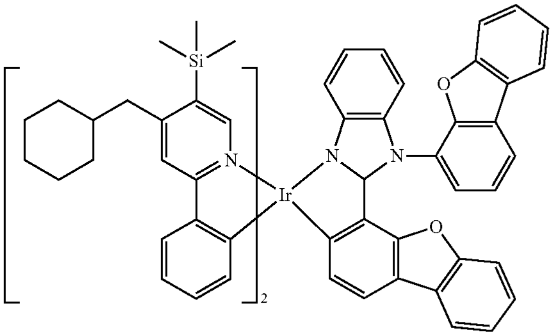
174
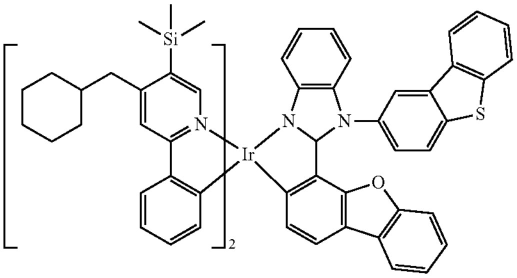
175
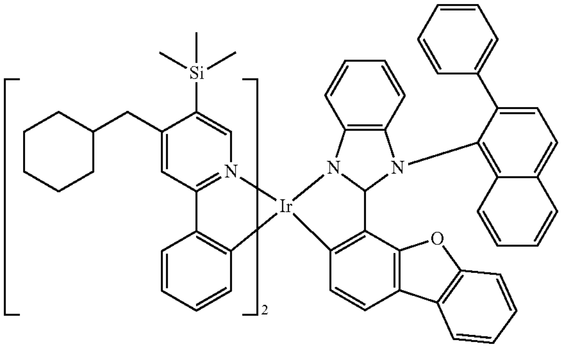
176
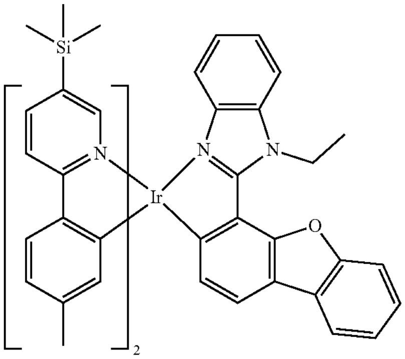
-continued
177
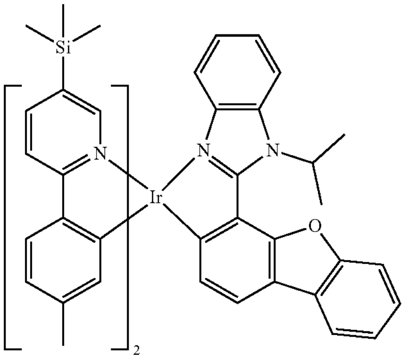

-continued
178
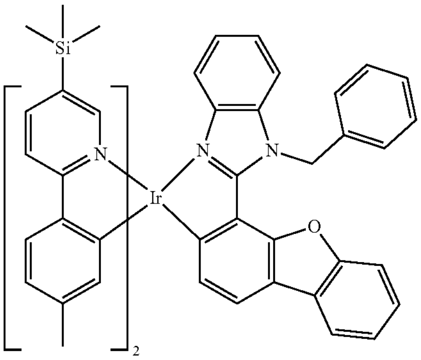
179
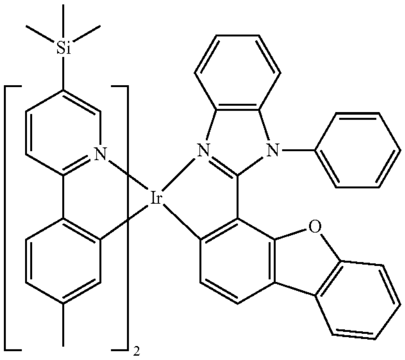
180
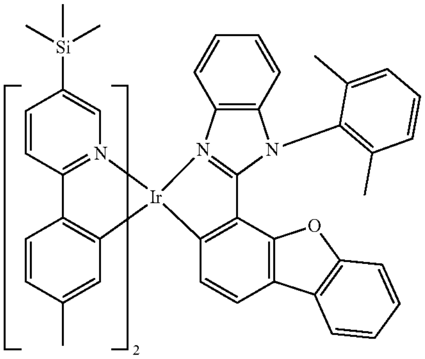
181
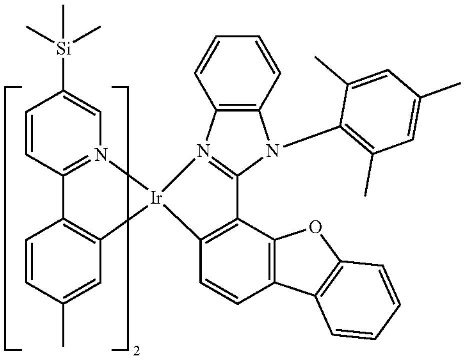
-continued
182
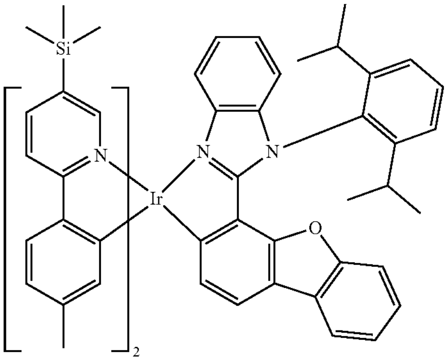
183
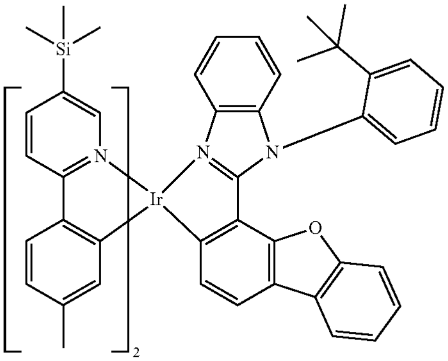
184
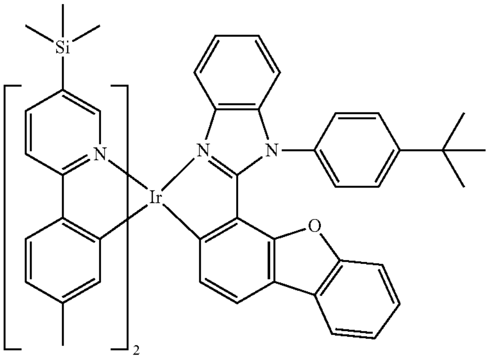
185
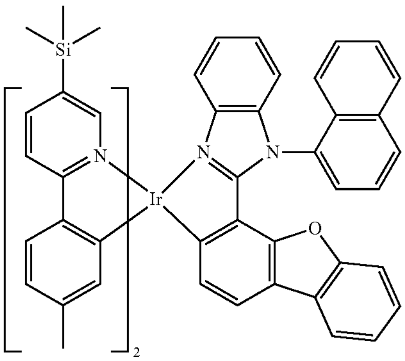

-continued
186
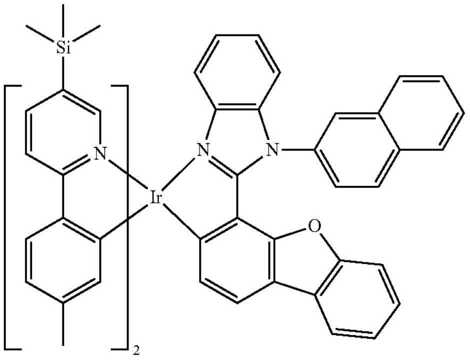
187
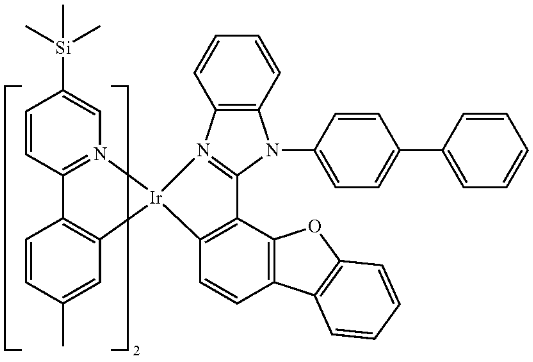
188
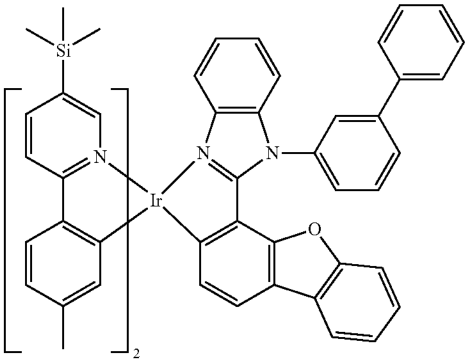
189
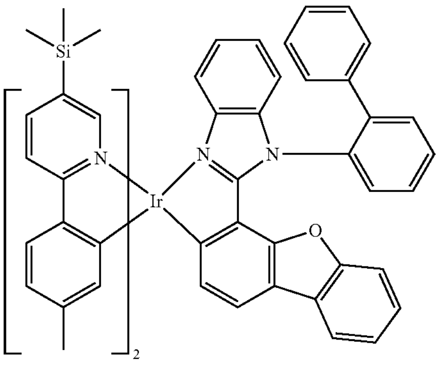
-continued
190
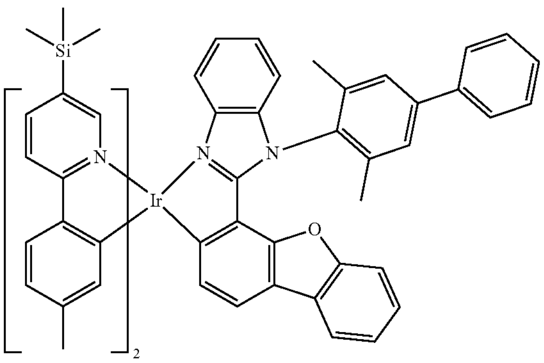
191
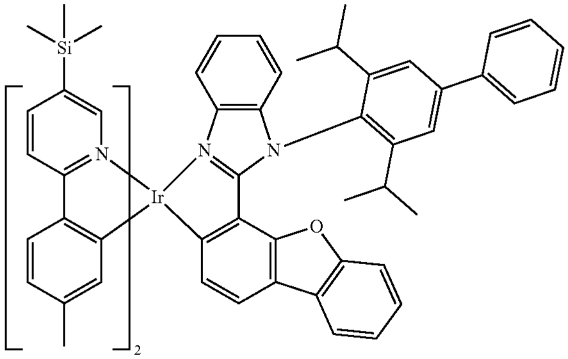
192
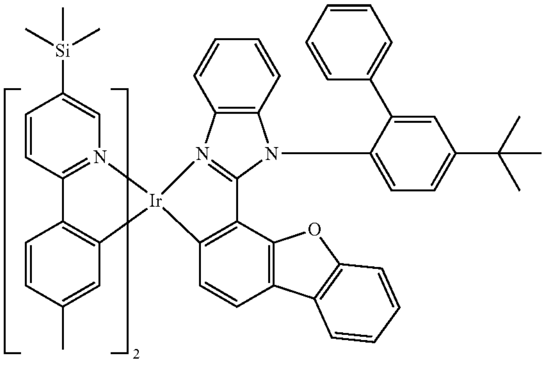
193
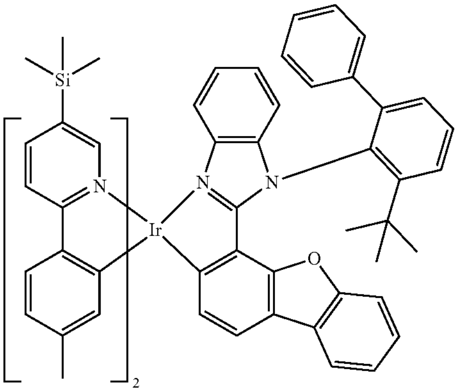

-continued
194
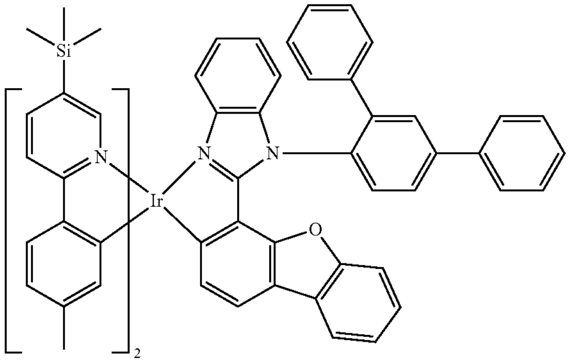
195
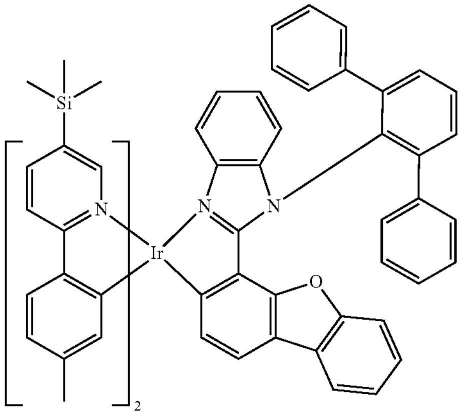
196
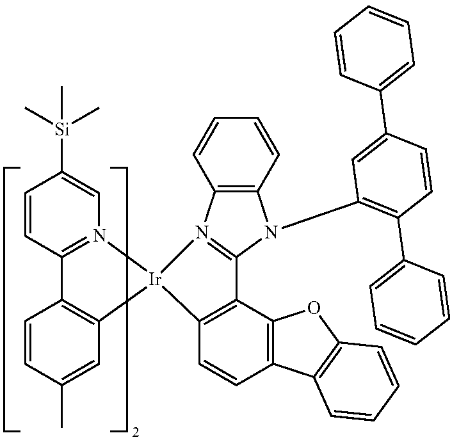
-continued
197
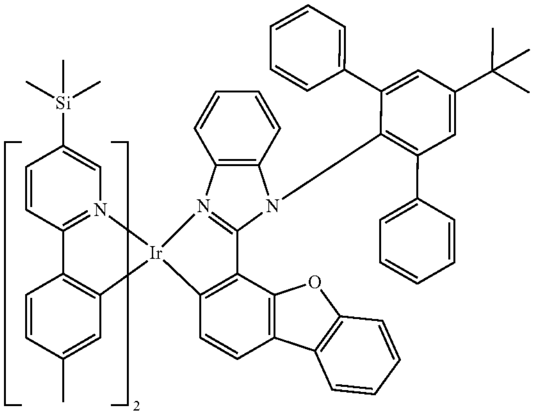
198
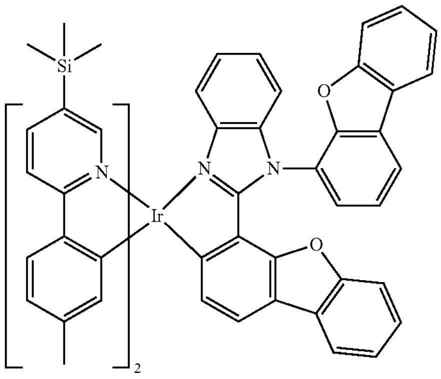
199
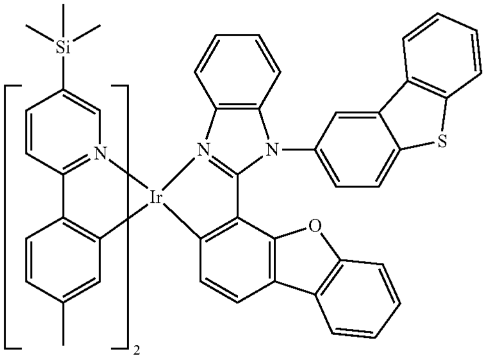
200
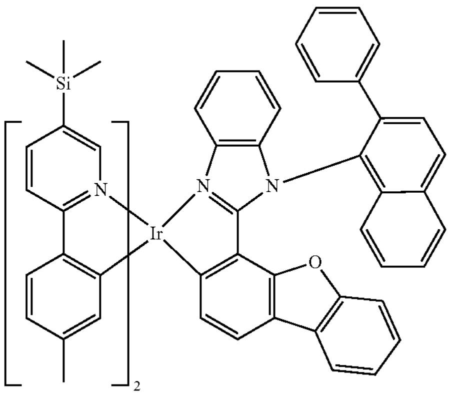

-continued
201
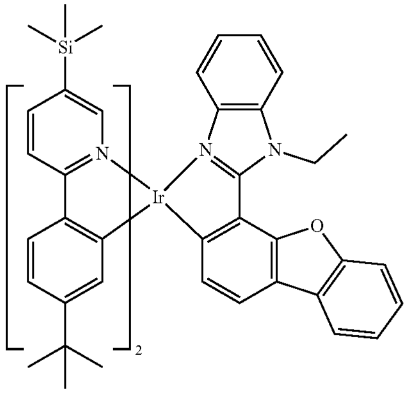
202
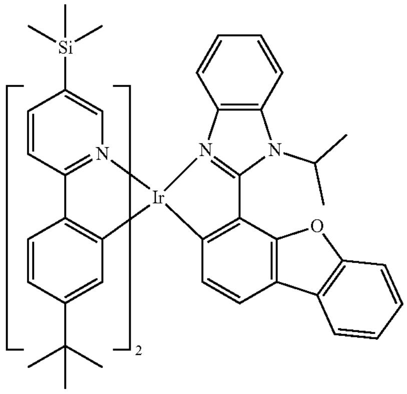
203
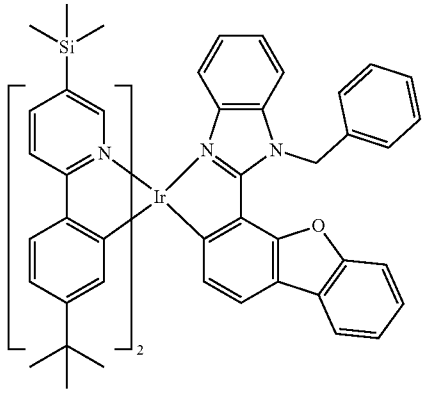
204
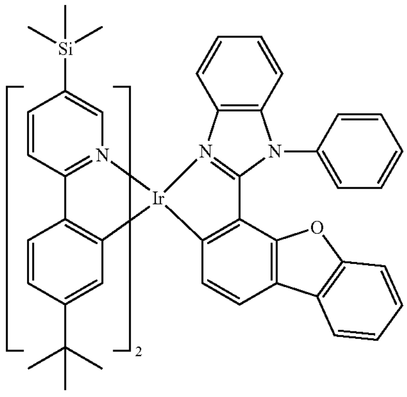
-continued
205
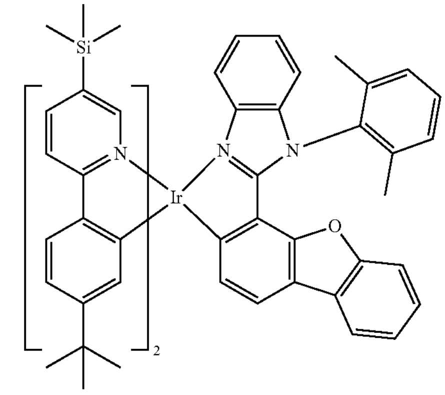
206
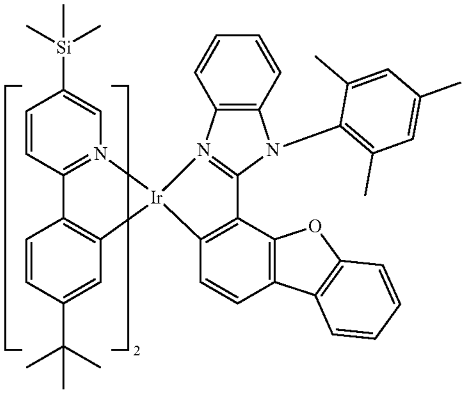
207
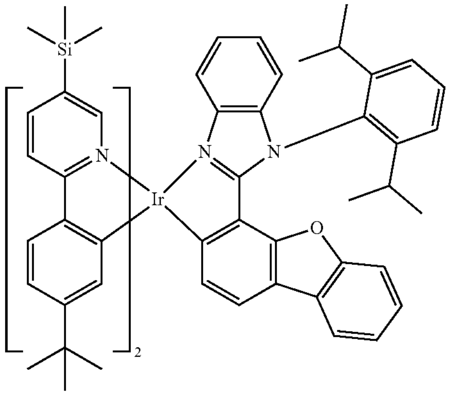
208
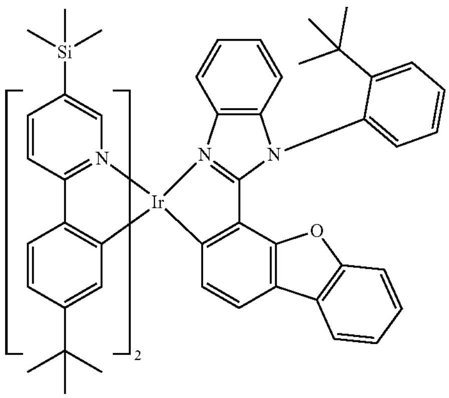

-continued
209
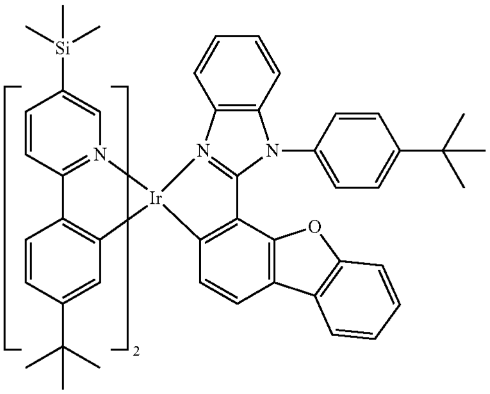
210
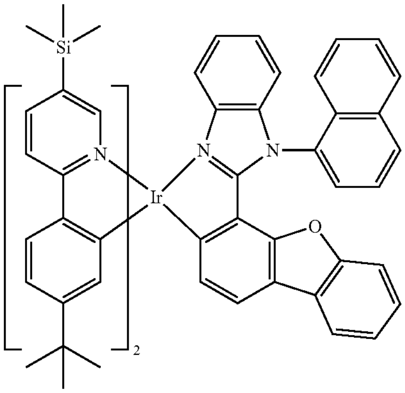
211
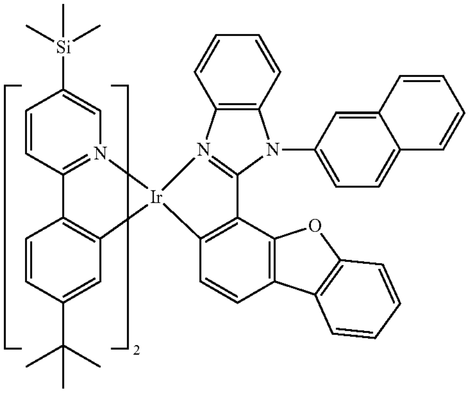
212
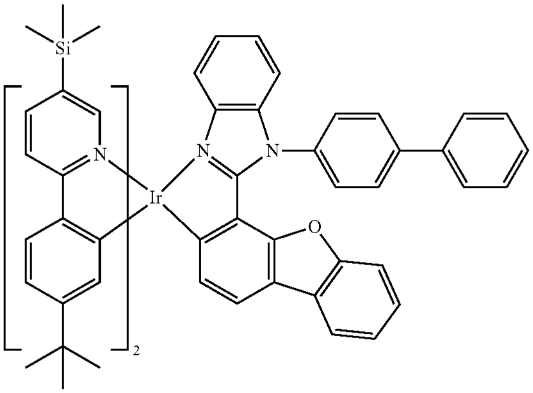
-continued
213
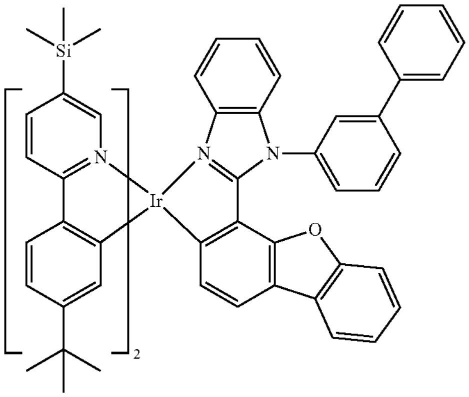
214
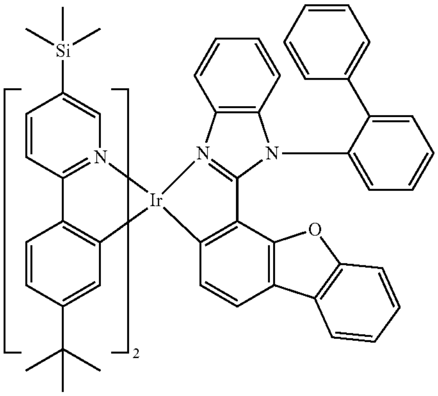
215
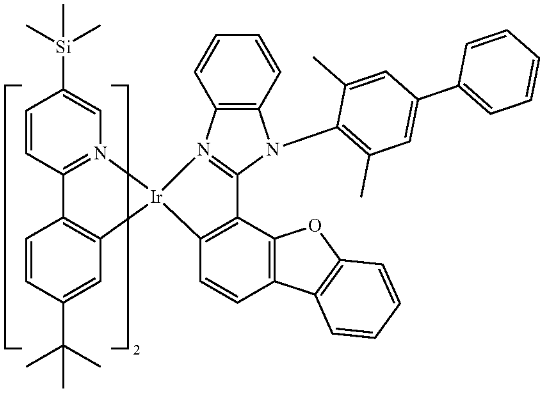
216
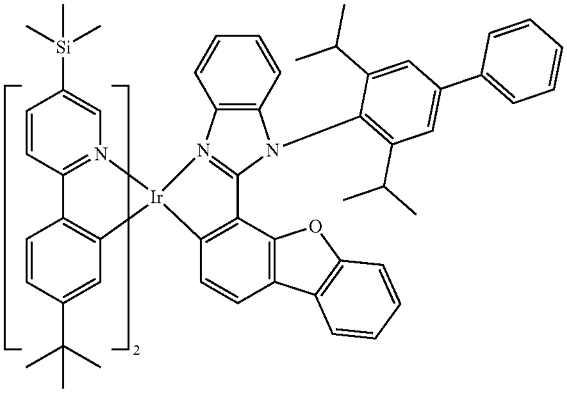

217
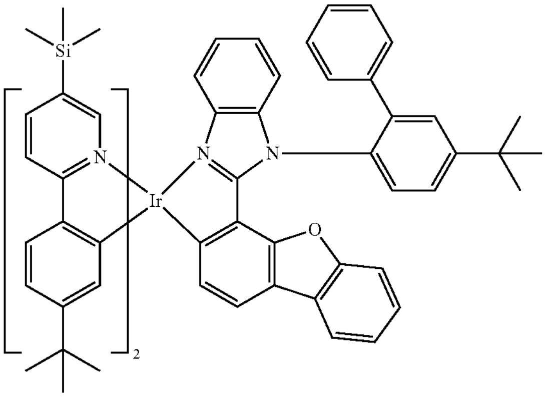
218
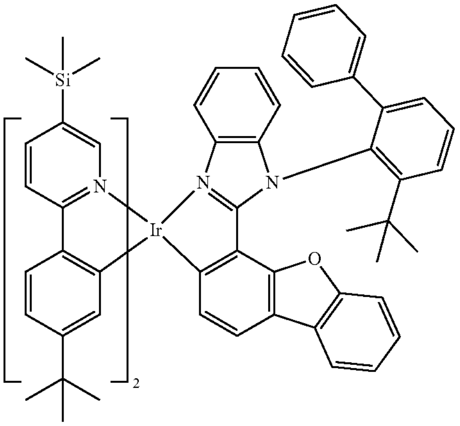
219
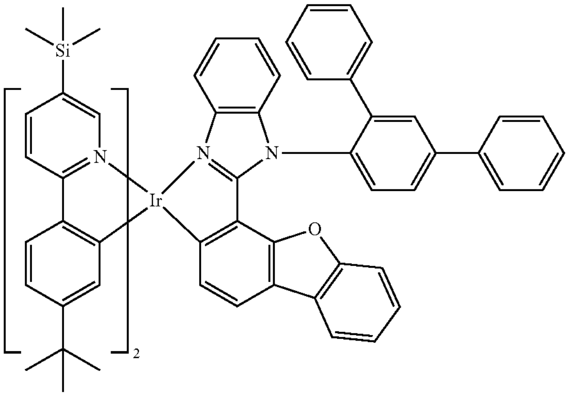
220
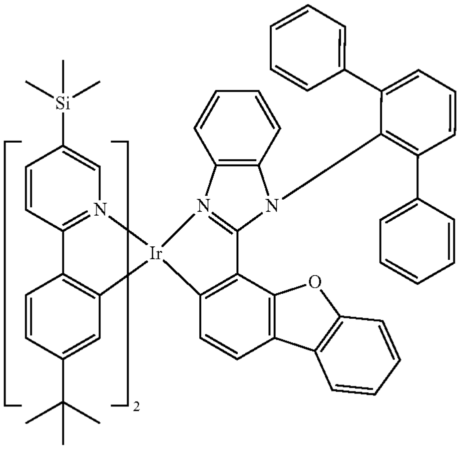
221
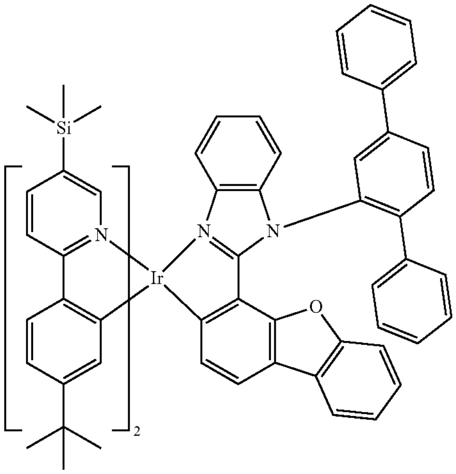
222
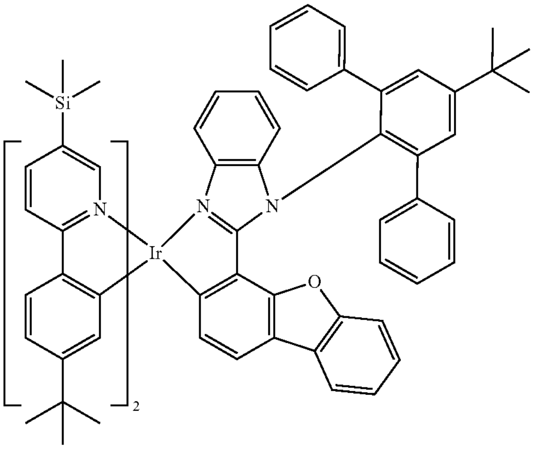

-continued
223
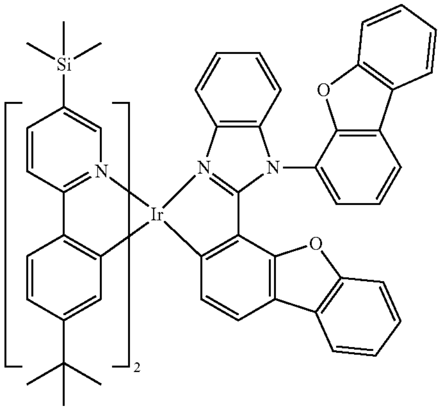
224
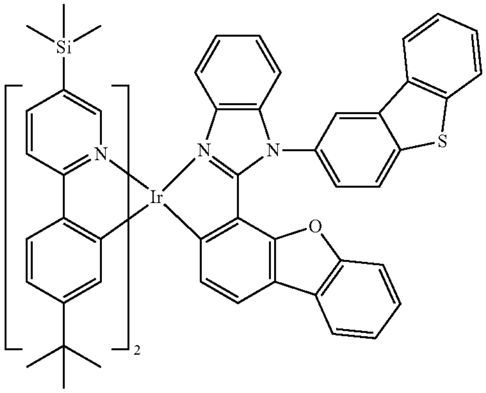
225
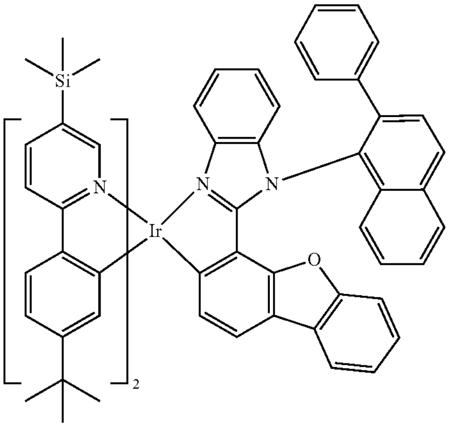
226
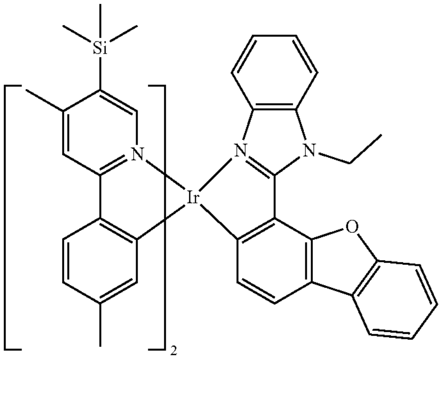
-continued
227
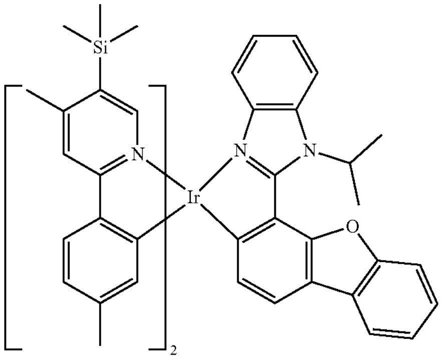
228
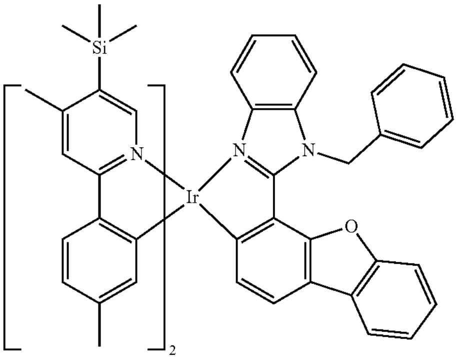
229
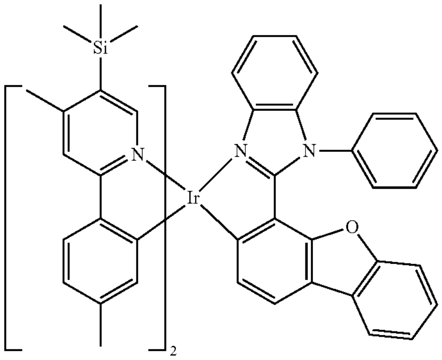
230
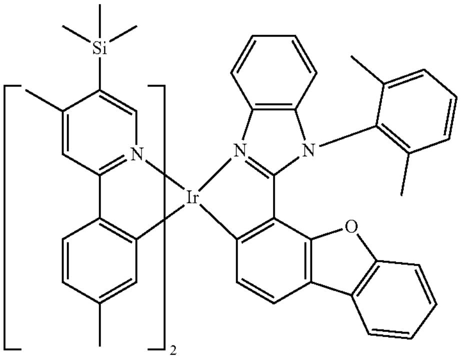

-continued
231
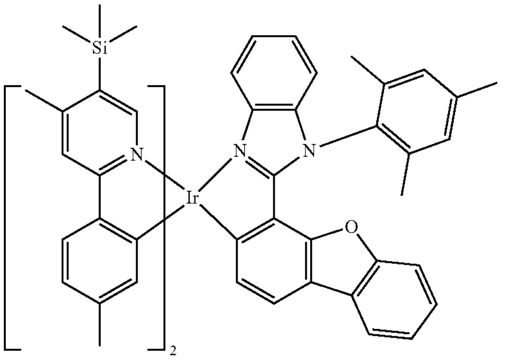
232
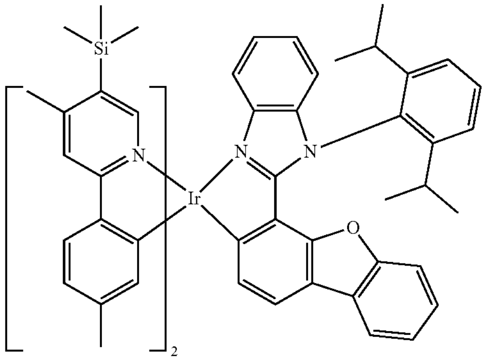
233
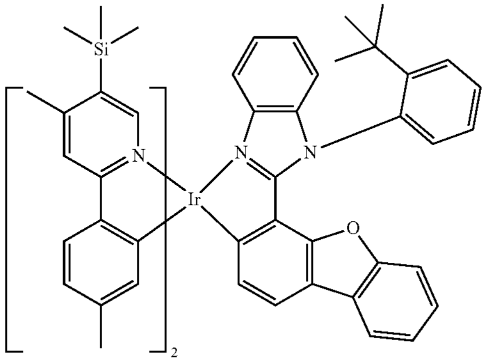
234
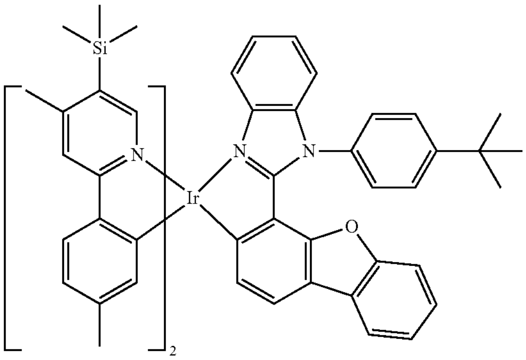
-continued
235
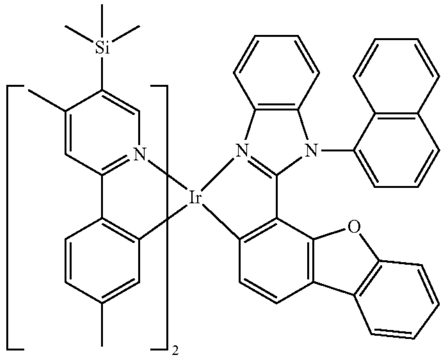
236
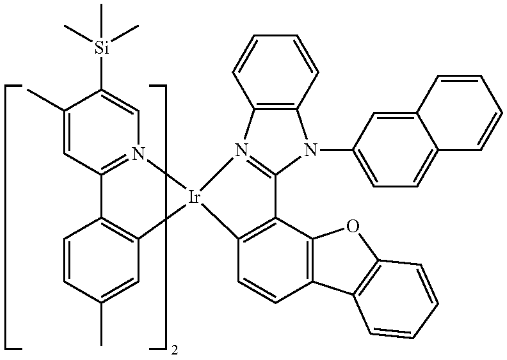
237
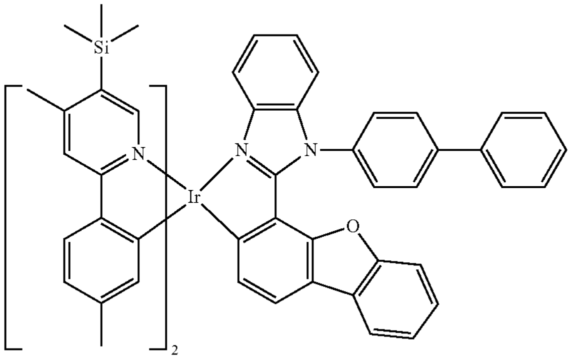
238
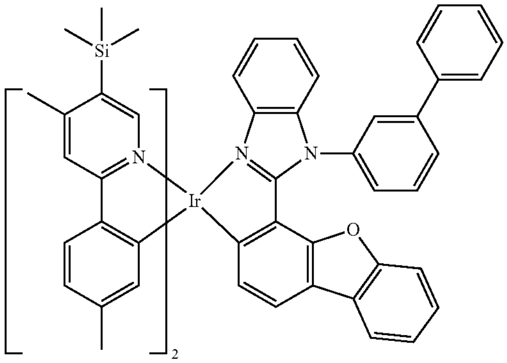

-continued
239
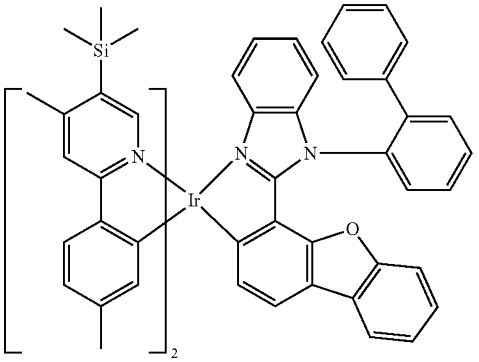
240
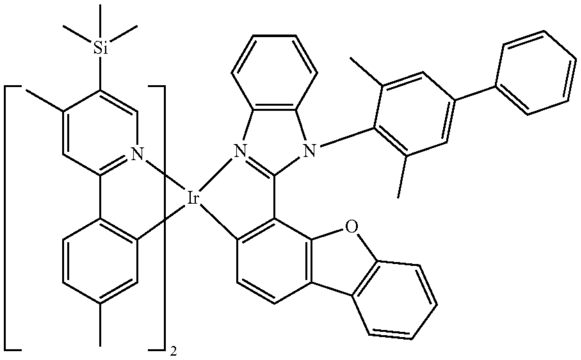
241
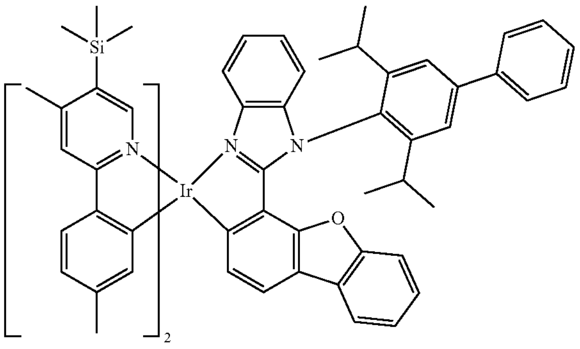
242
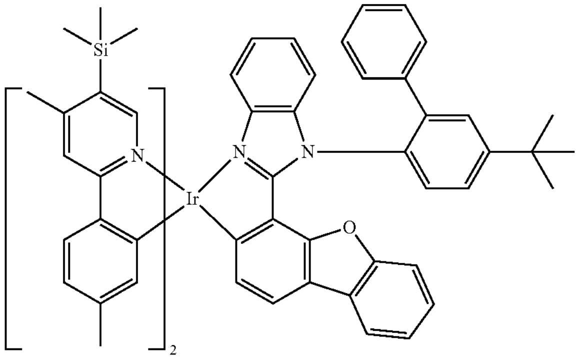
-continued
243
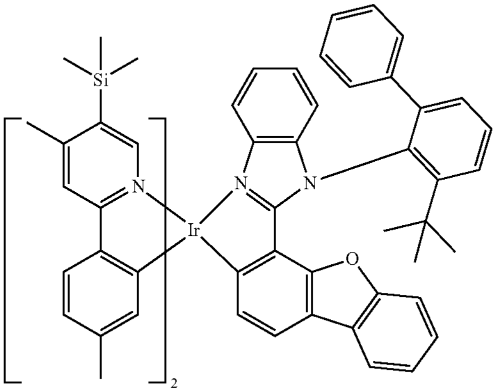
244
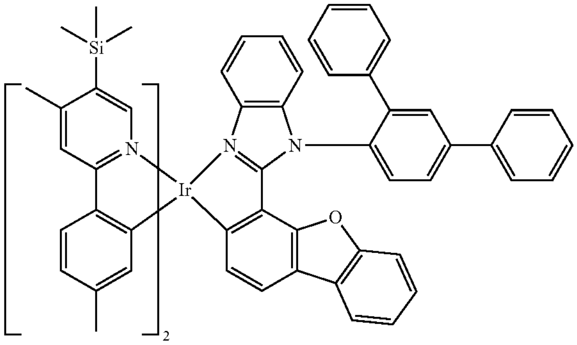
245
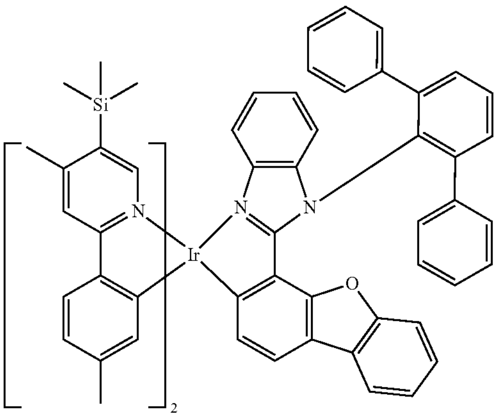

-continued
246
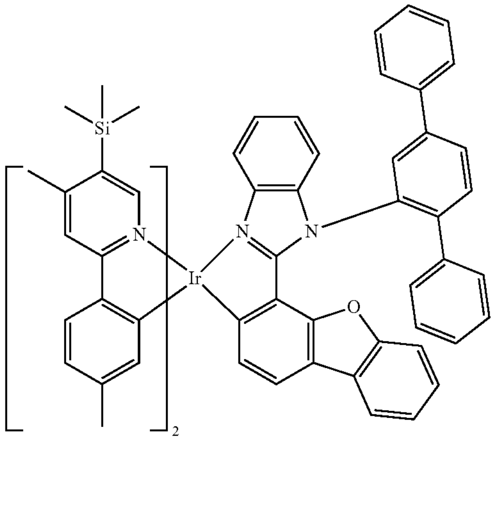
247
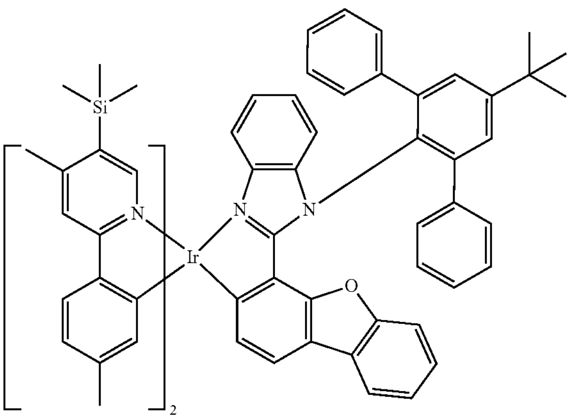
248
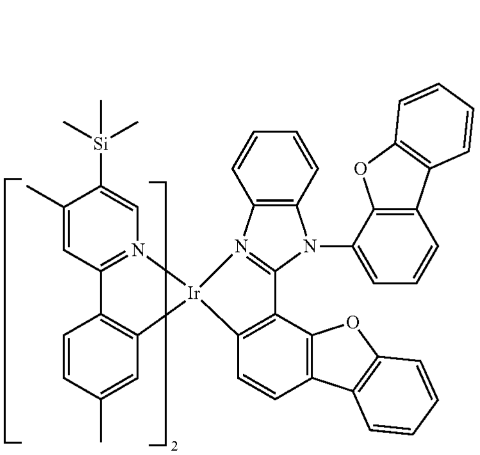
-continued
249
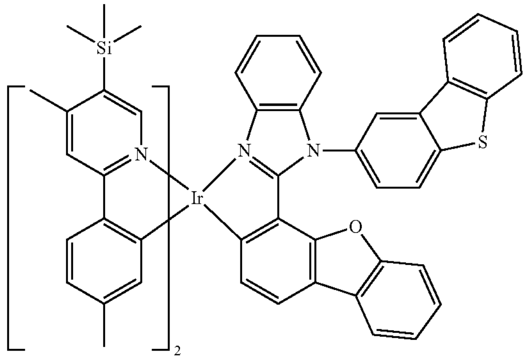
250
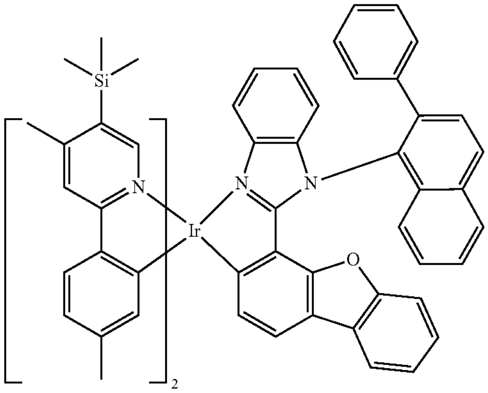
251
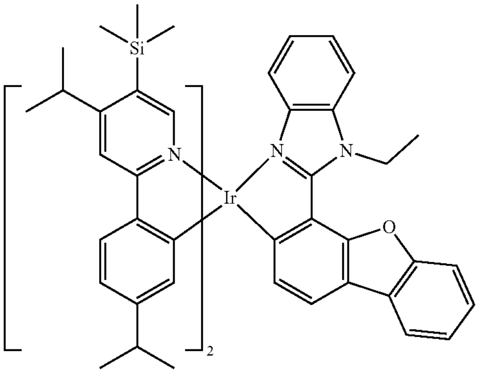
252
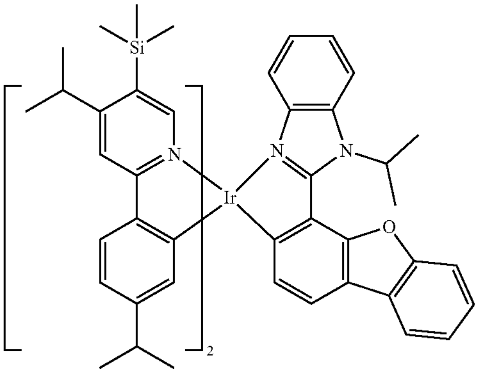

-continued
253
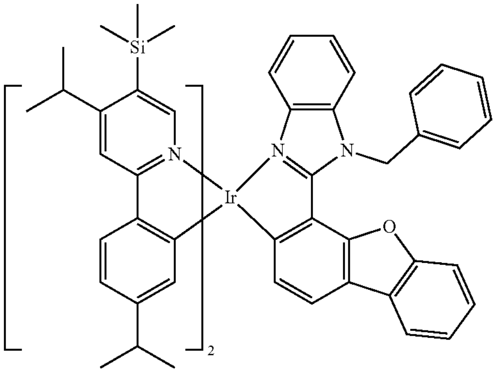
254
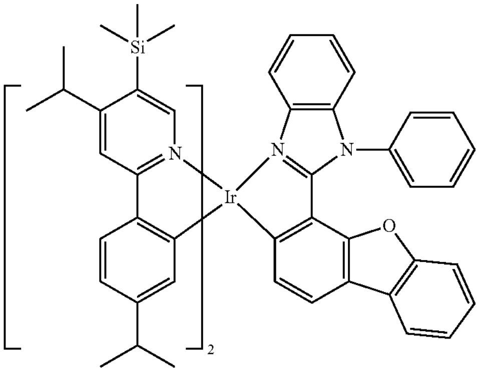
255
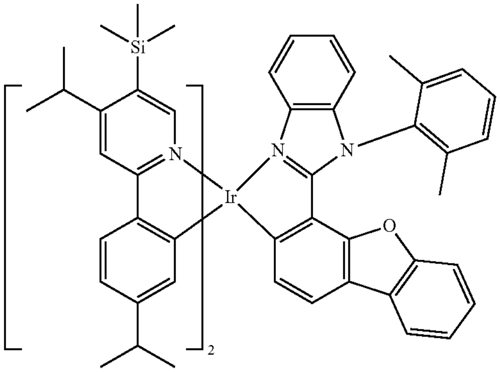
256
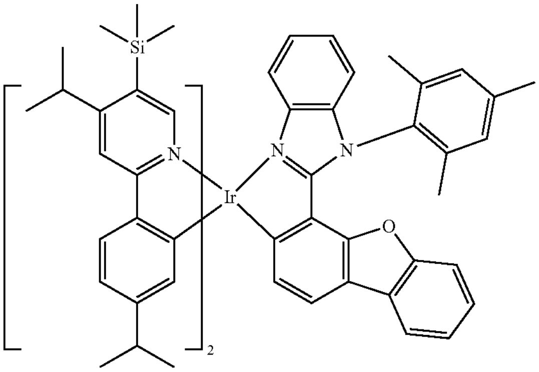
-continued
257
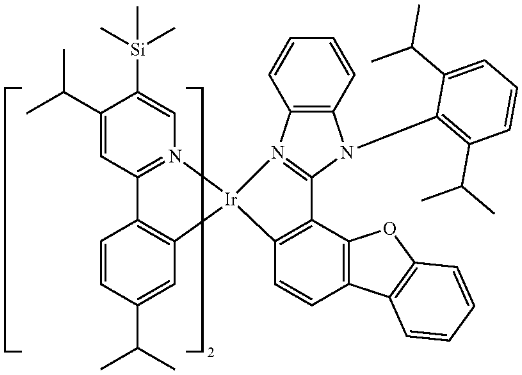
258
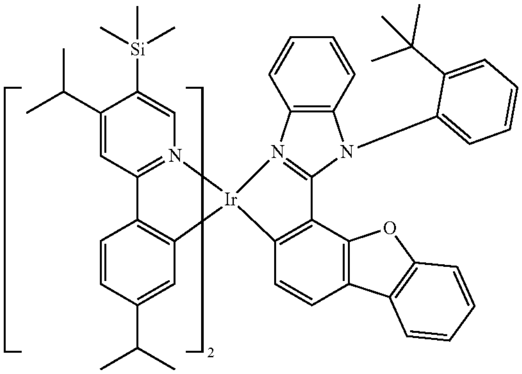
259
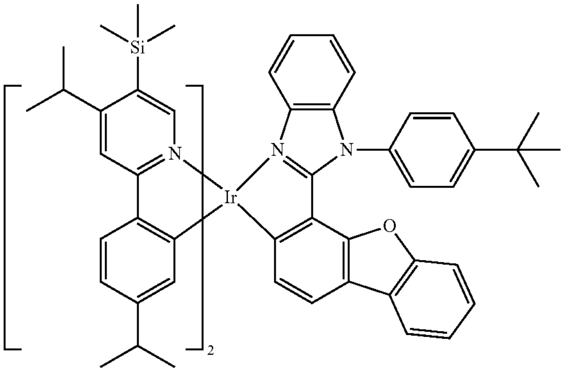
260
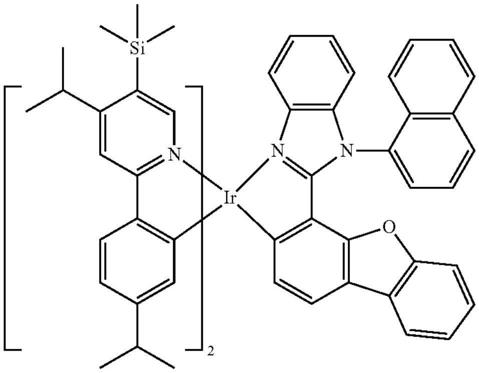

-continued
261
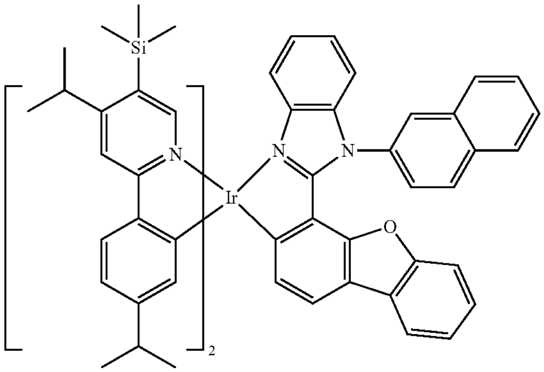
262
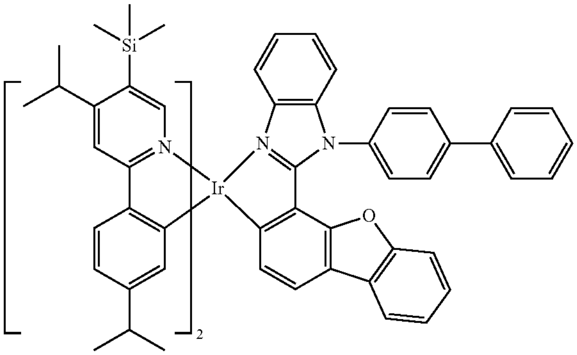
263
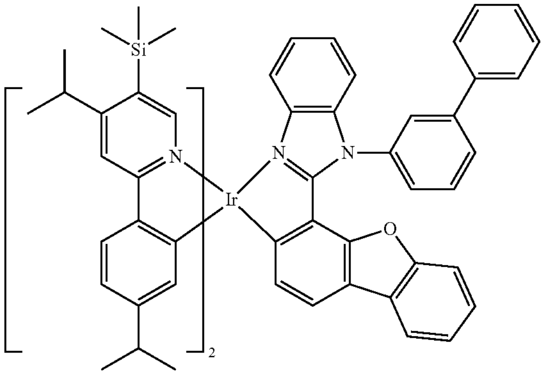
264
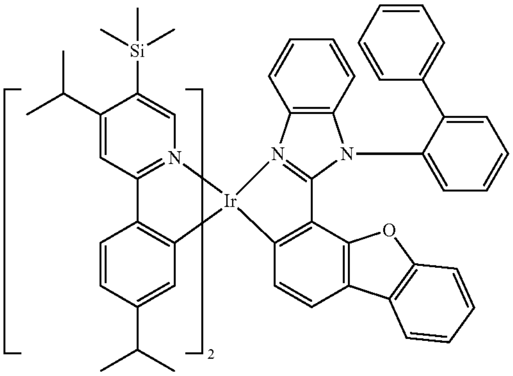
-continued
265
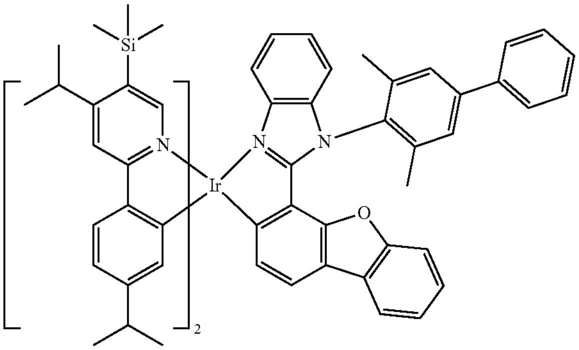
266
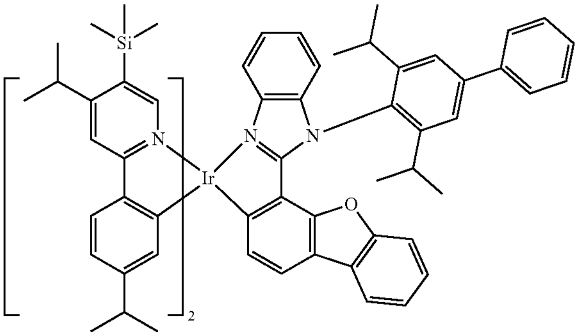
267
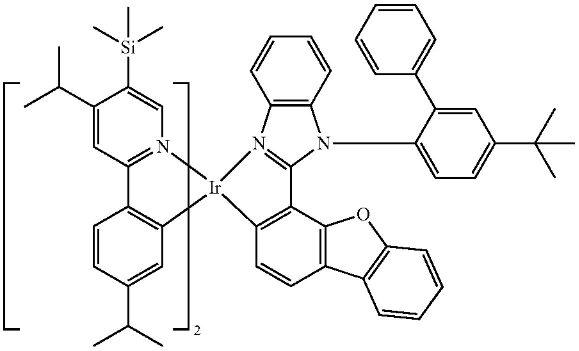
268
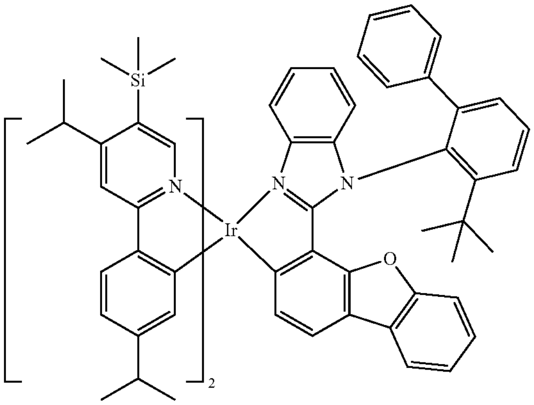

-continued
269
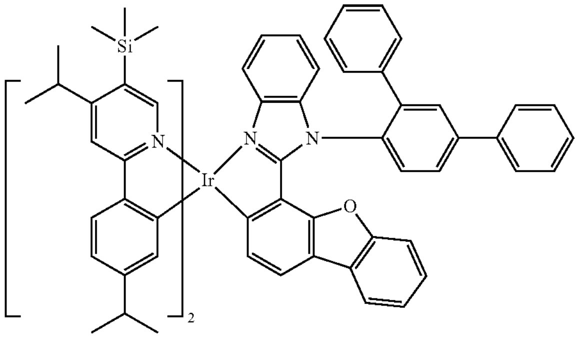
270
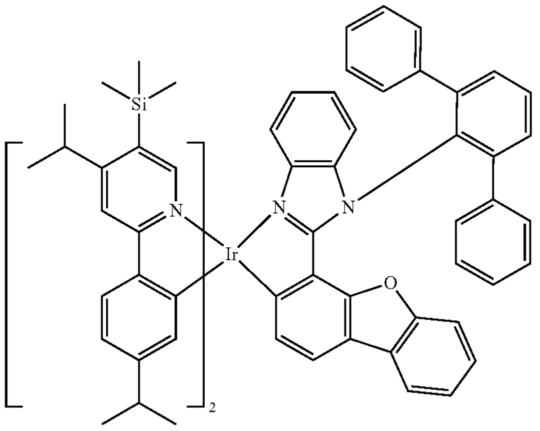
271
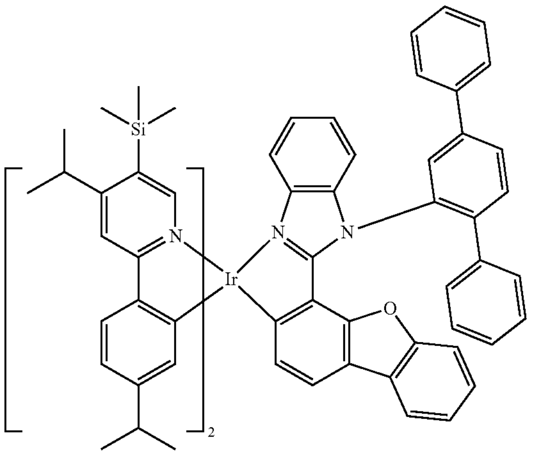
-continued
272
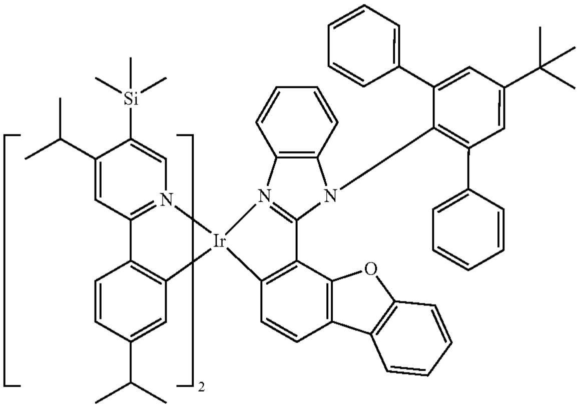
273
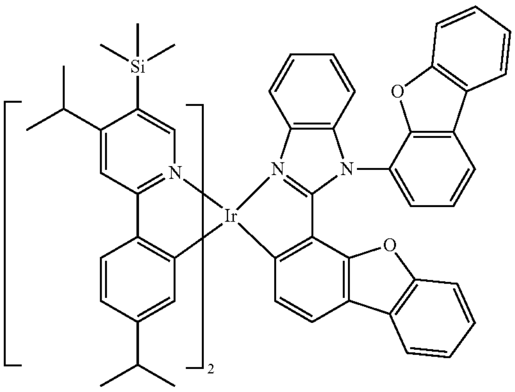
274
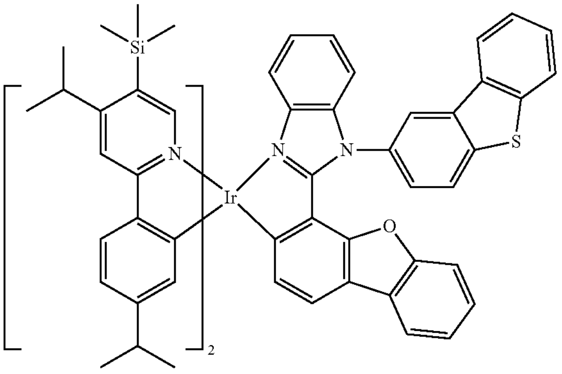

-continued
275
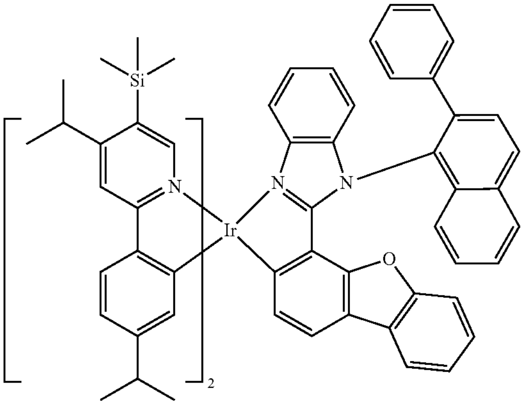
276
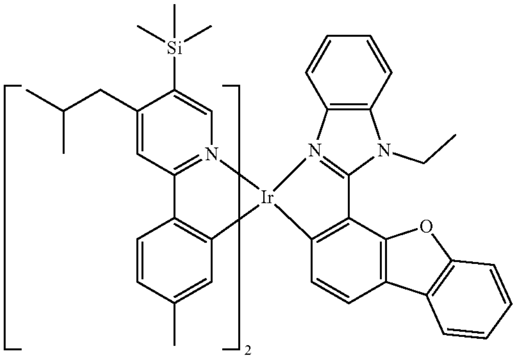
277
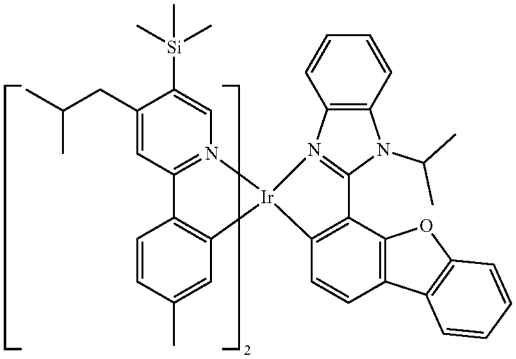
278
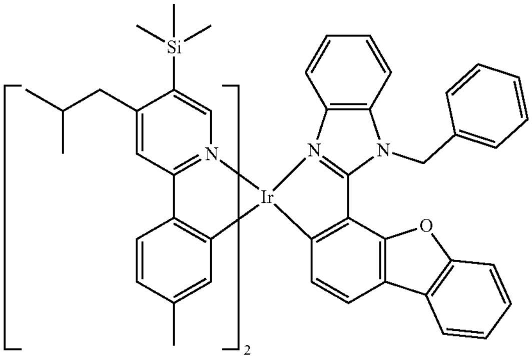
-continued
279
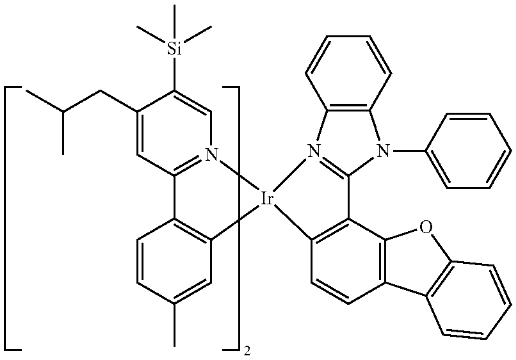
280
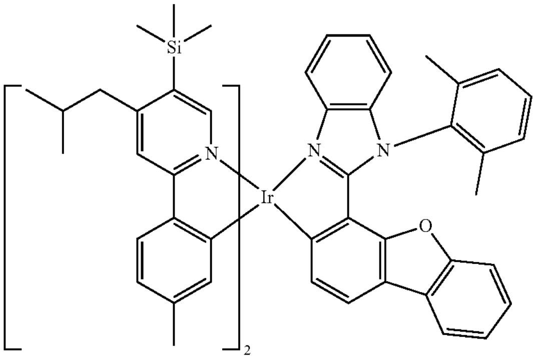
281
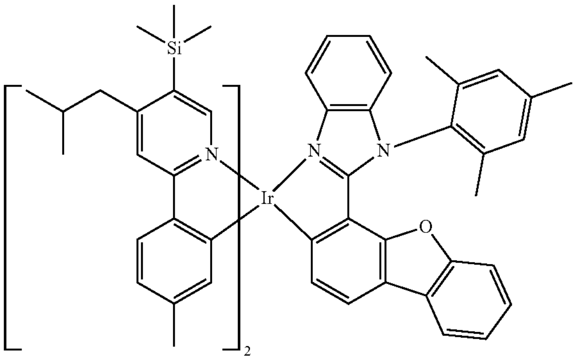
282
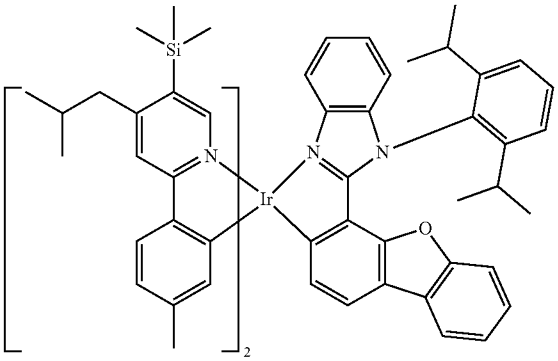

-continued
283
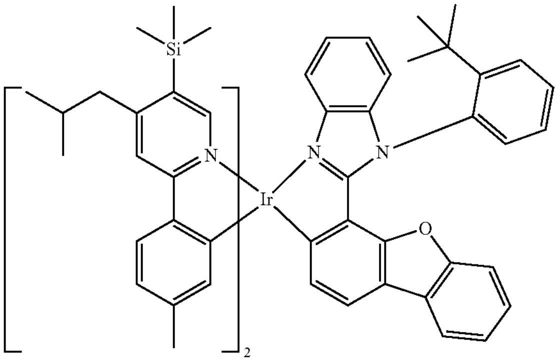
284
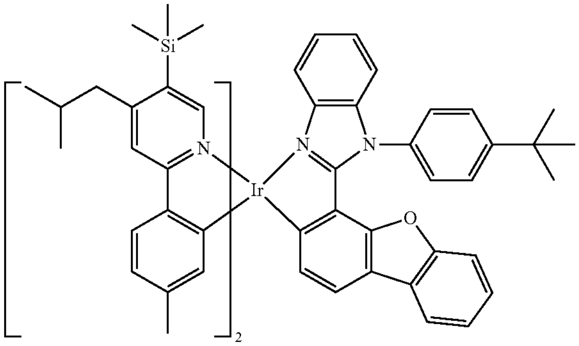
285
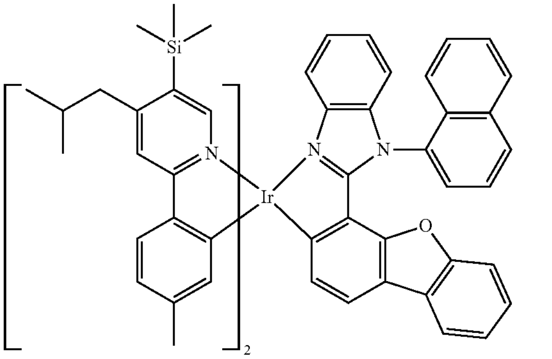
286
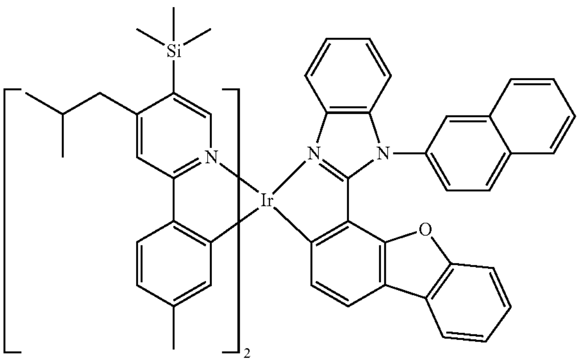
-continued
287
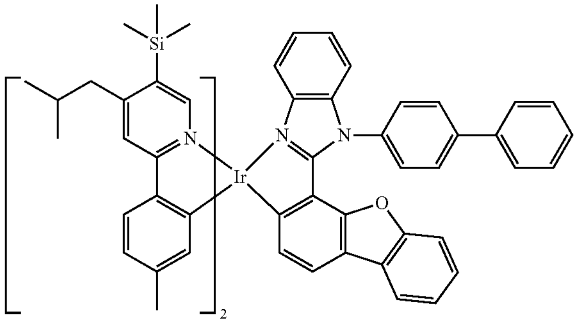
288
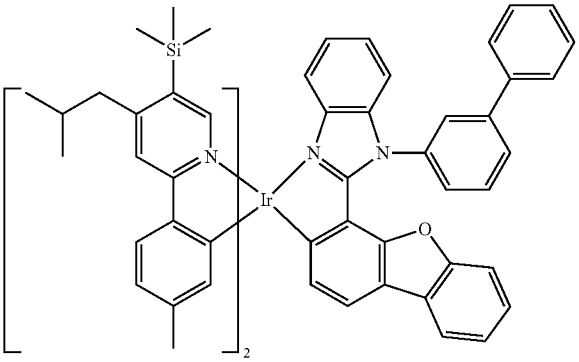
289
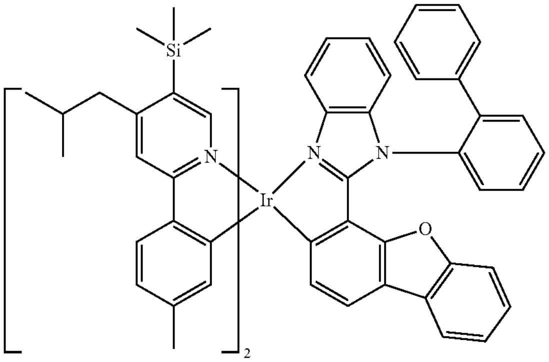
290
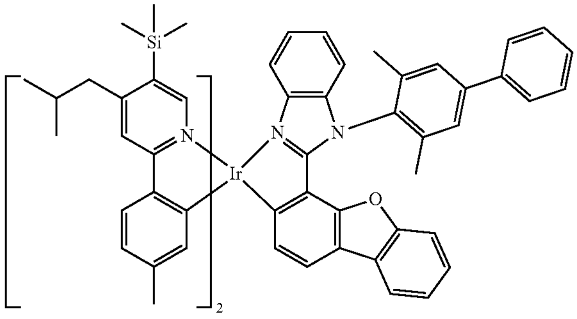

-continued
291
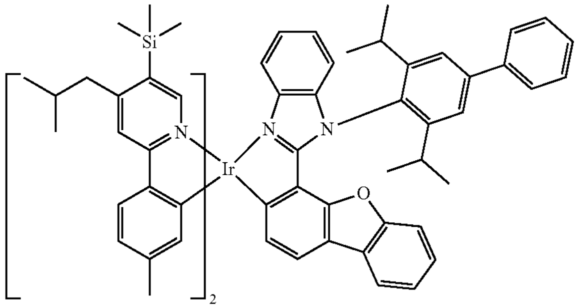
292
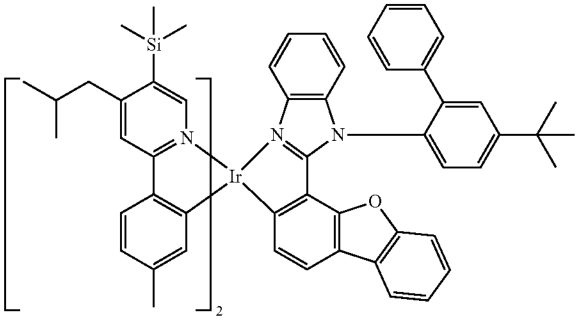
293
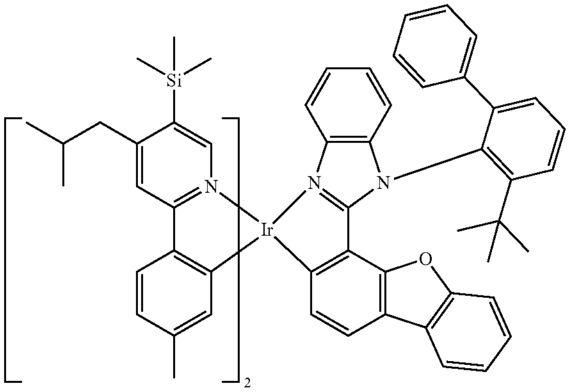
294
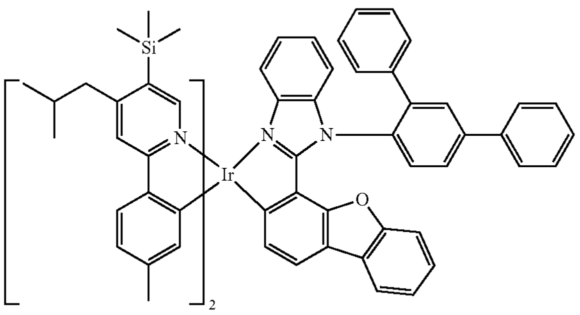
-continued
295
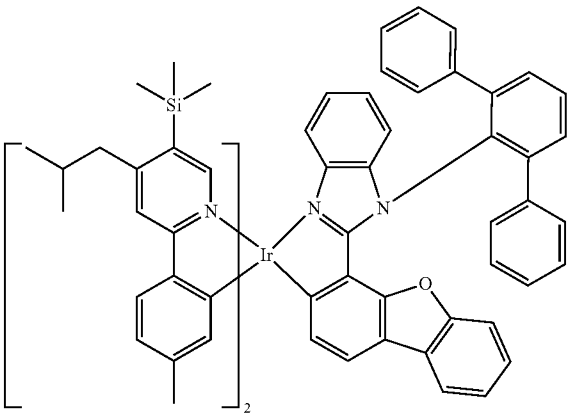
296
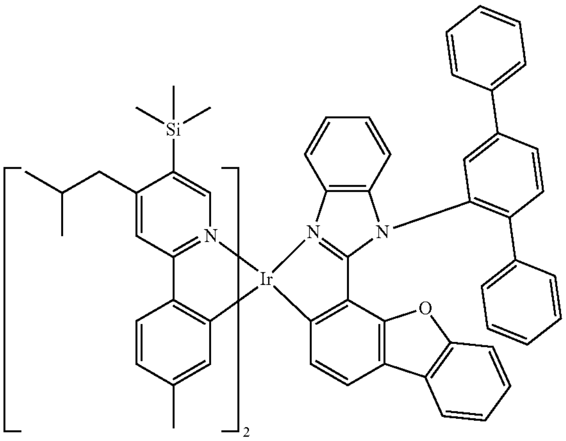
297
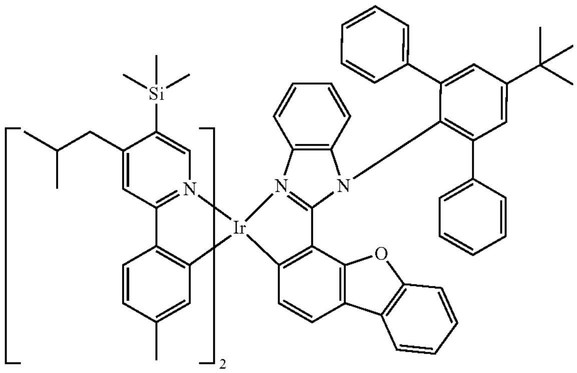

-continued
298
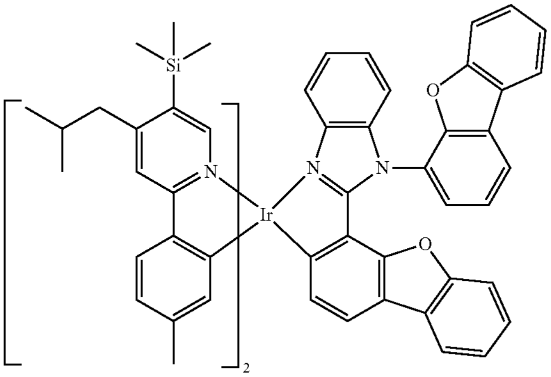
299
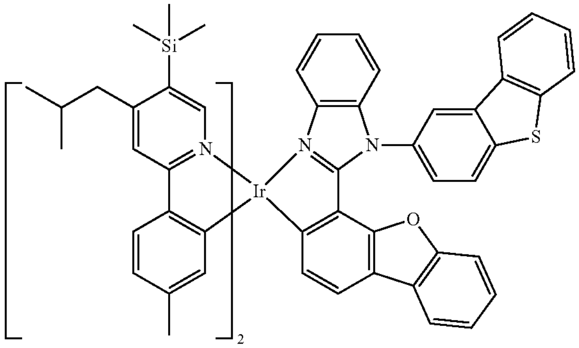
300
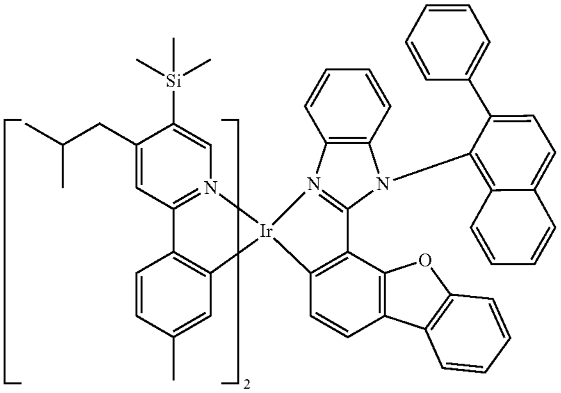
301
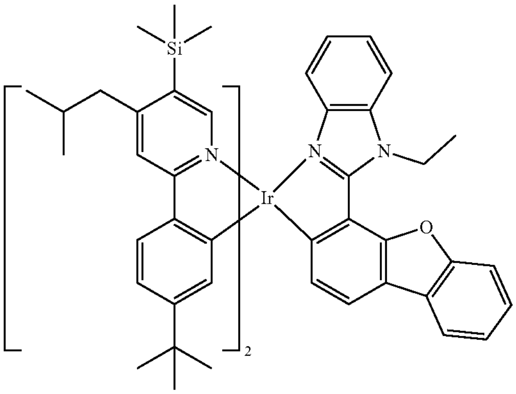
-continued
302
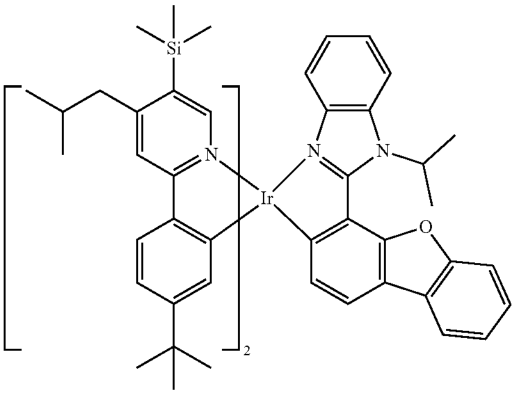
303
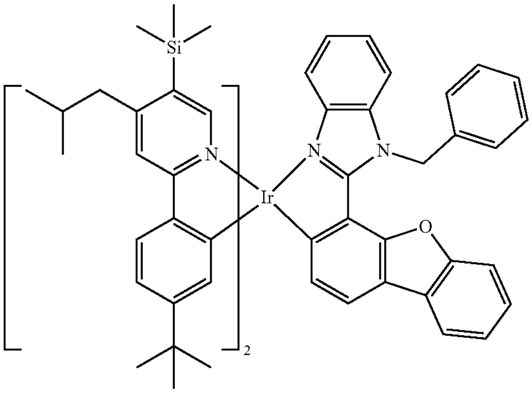
304
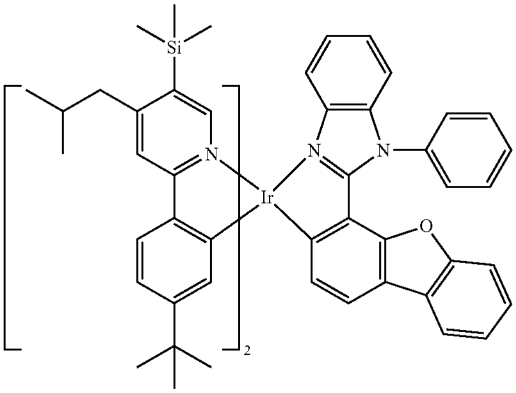

-continued
305
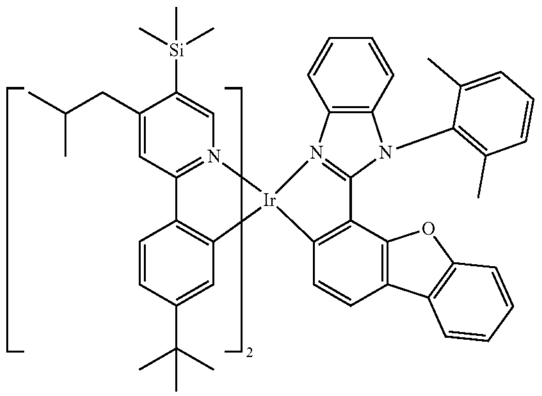
306
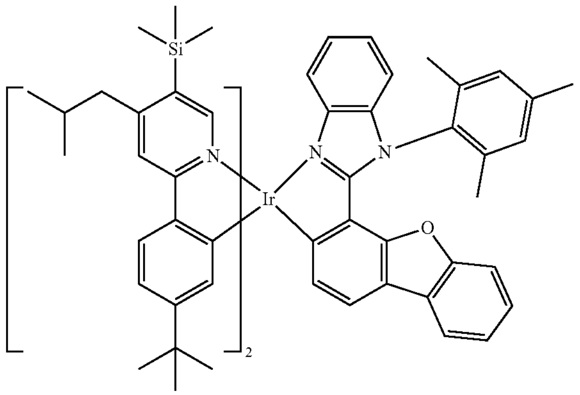
307
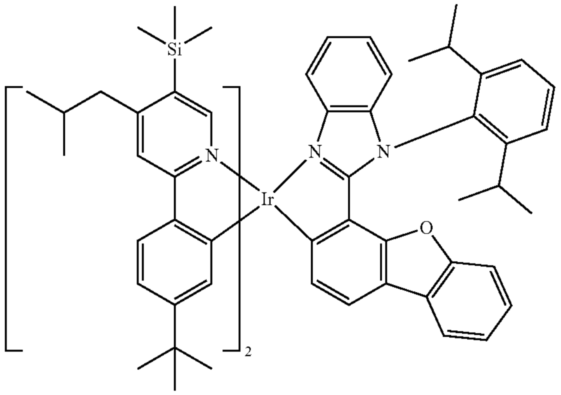
-continued
308
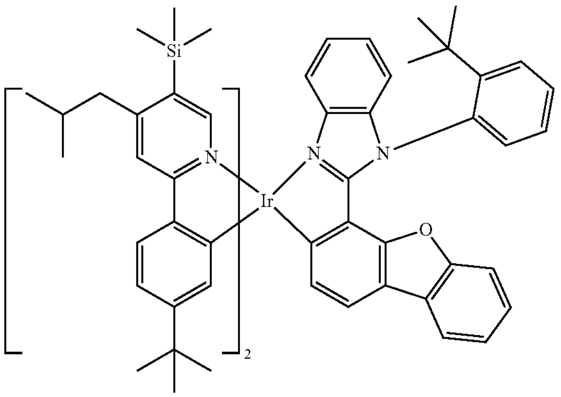
309
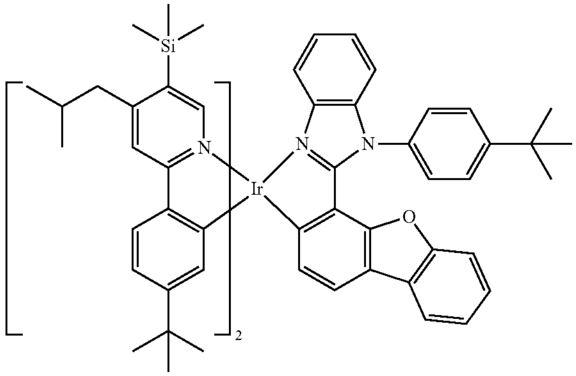
310
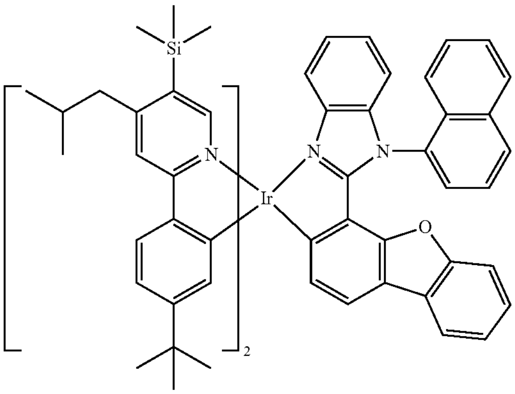
311
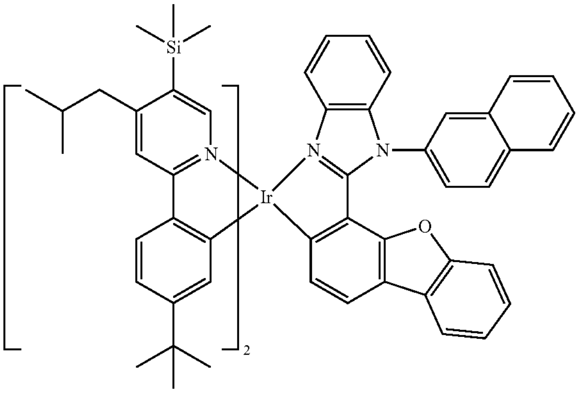

-continued
312
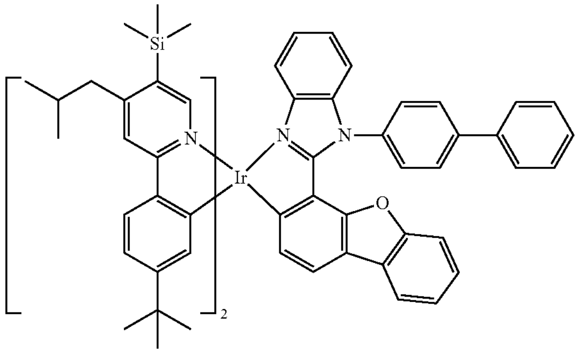
313
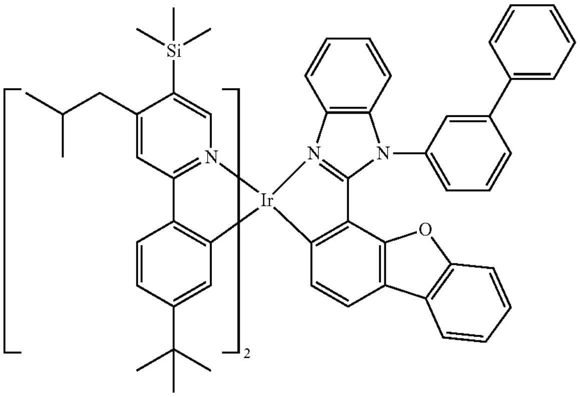
314
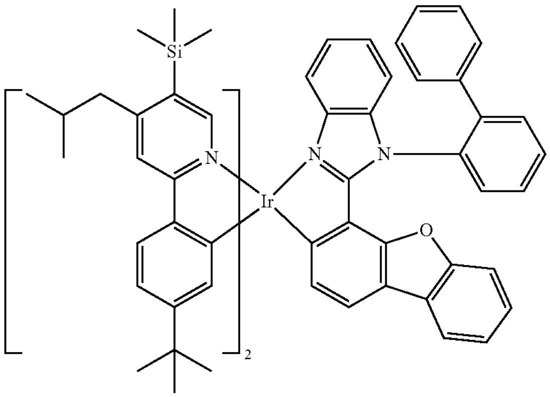
315
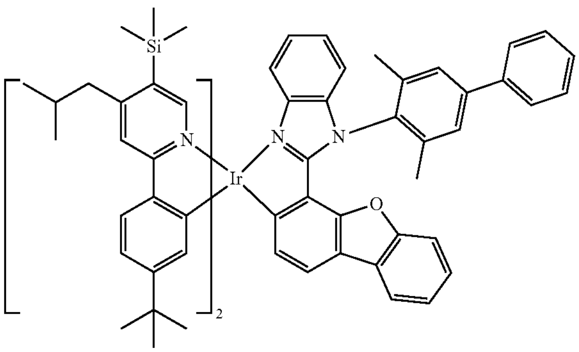
-continued
316
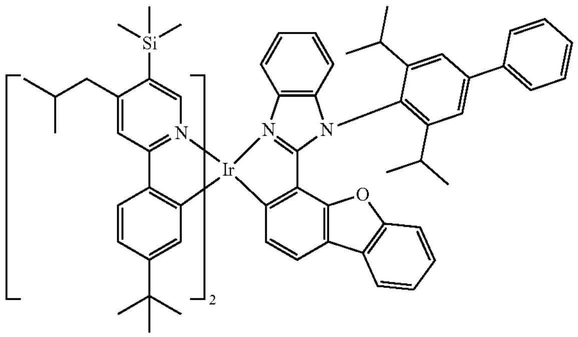
317
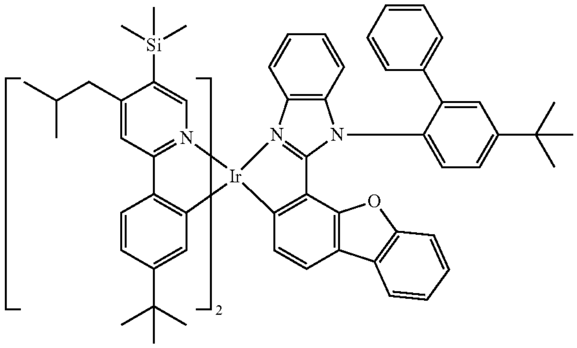
318
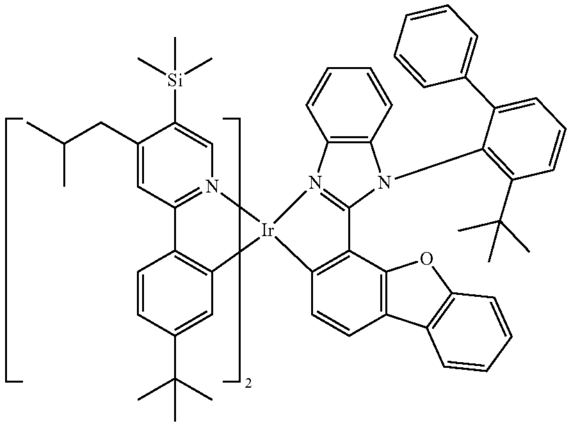
319
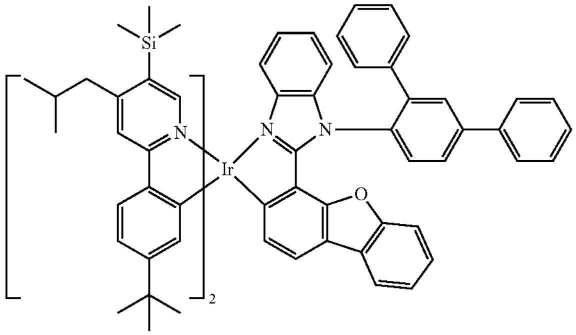

-continued
320
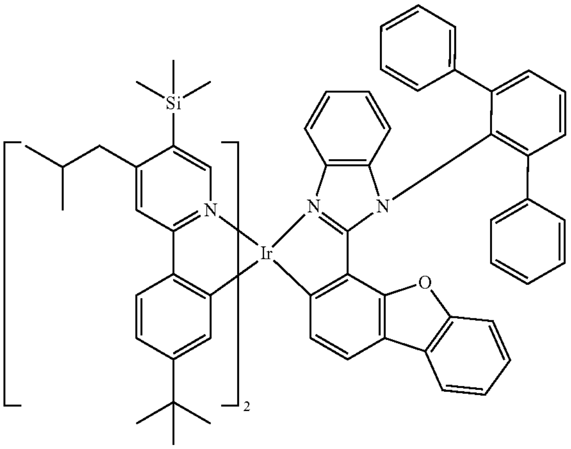
321
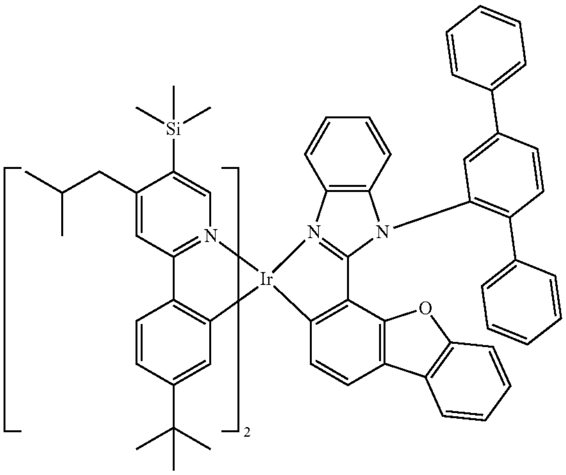
322
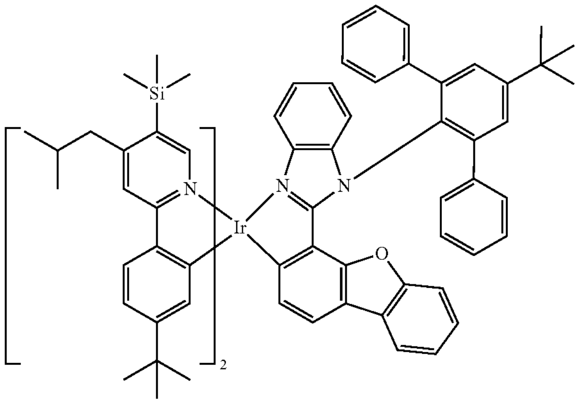
-continued
323
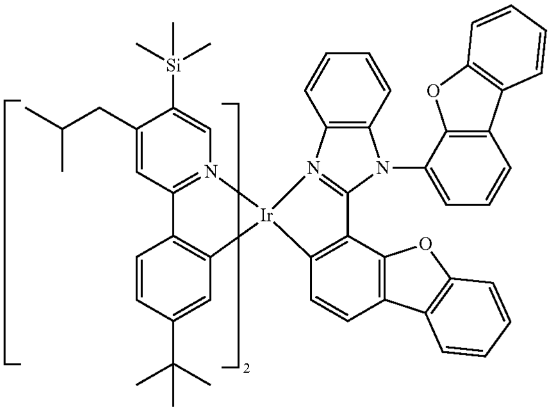
324
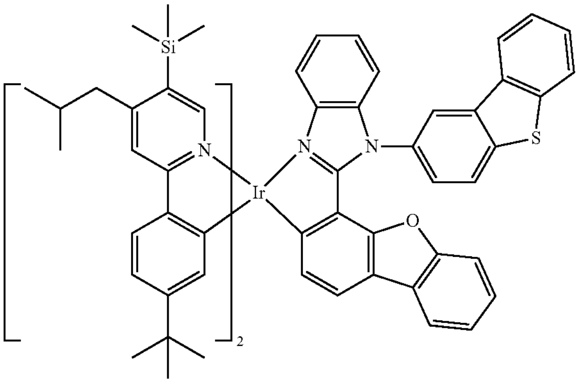
325
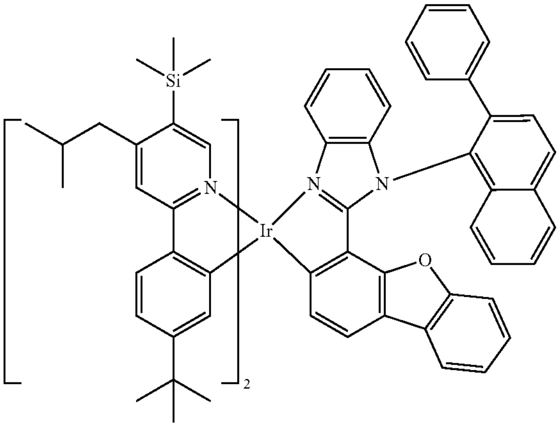
326
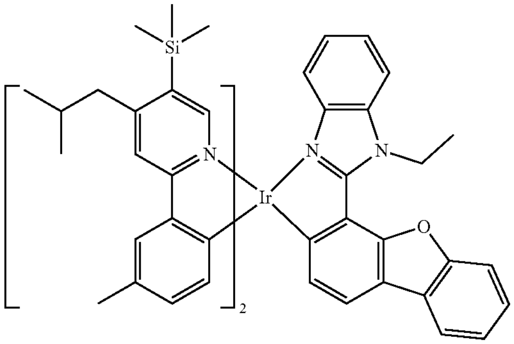

-continued
327
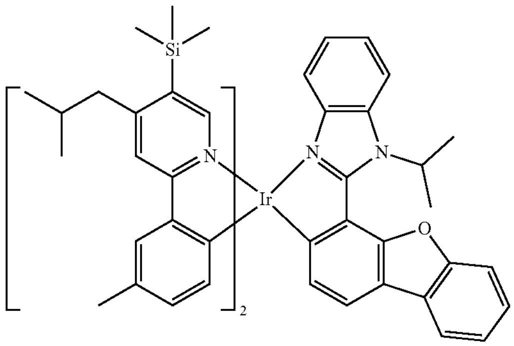
328
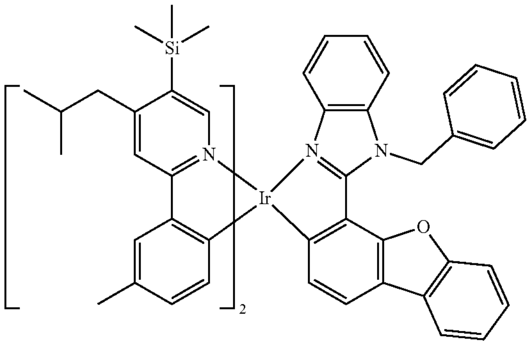
329
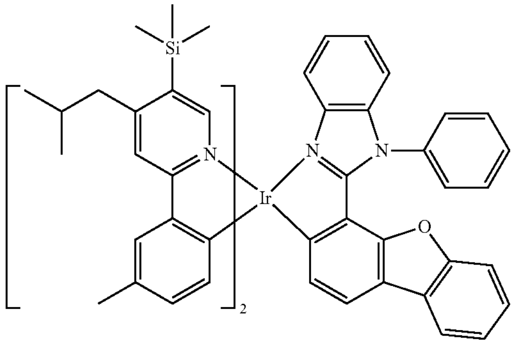
330
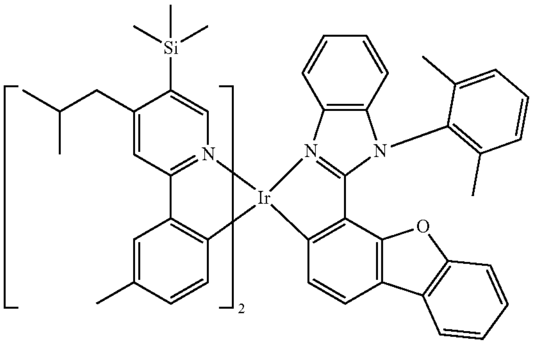
-continued
331
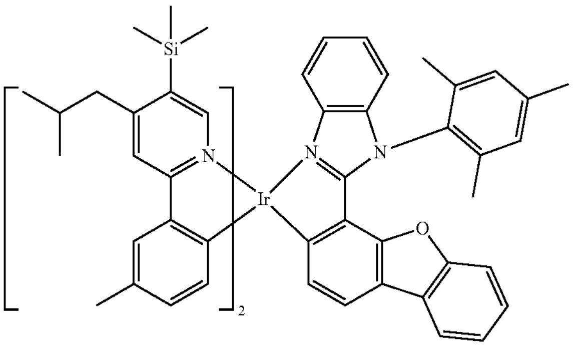
332
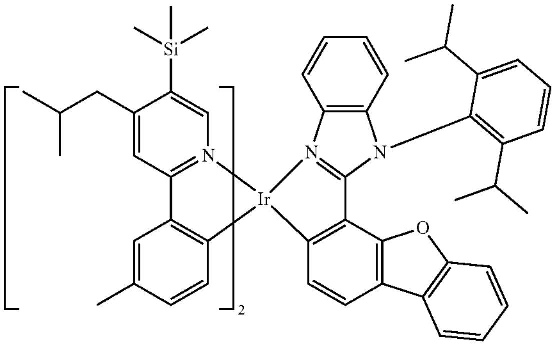
333
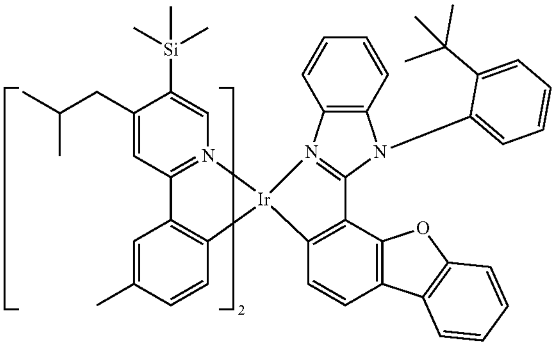
334
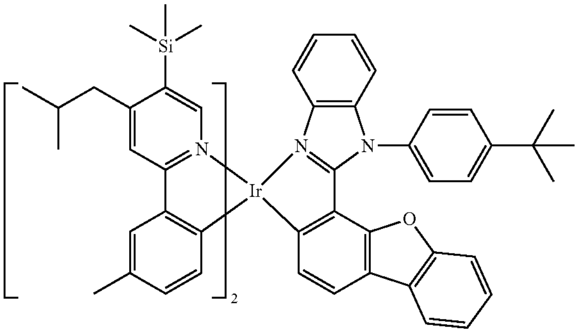

-continued
335
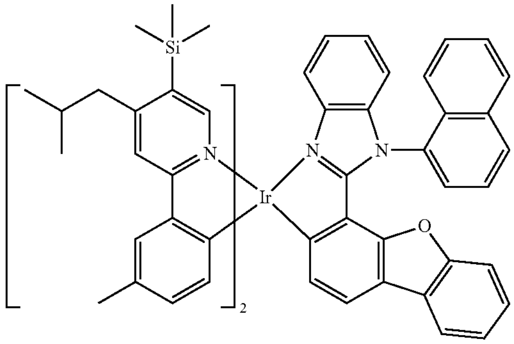
336
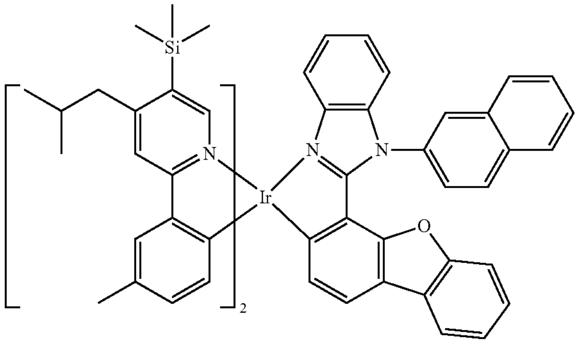
337
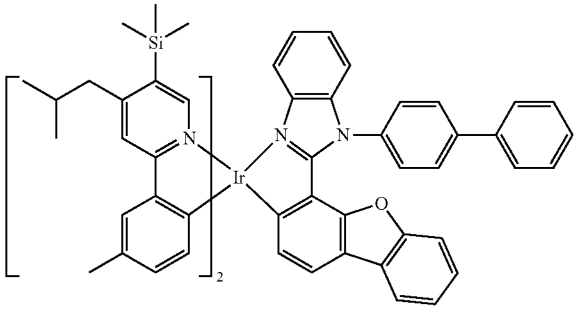
338
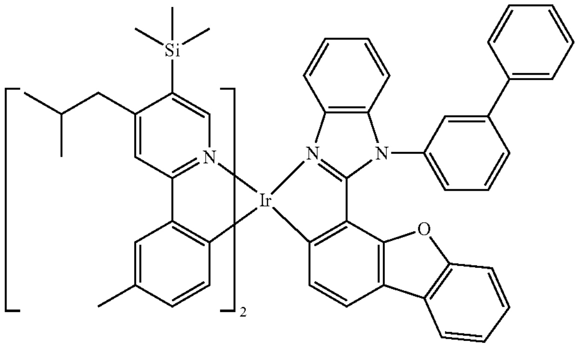
-continued
339
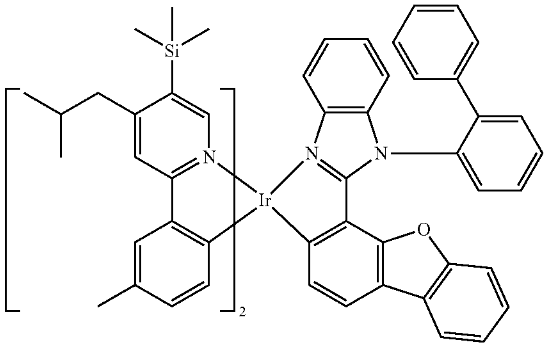
340
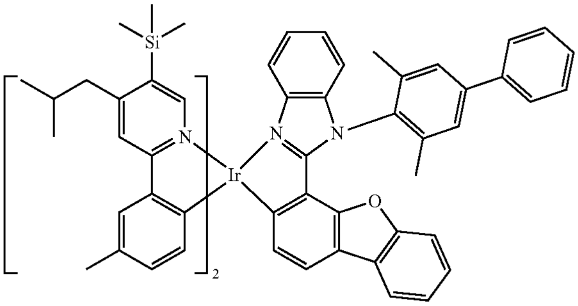
341
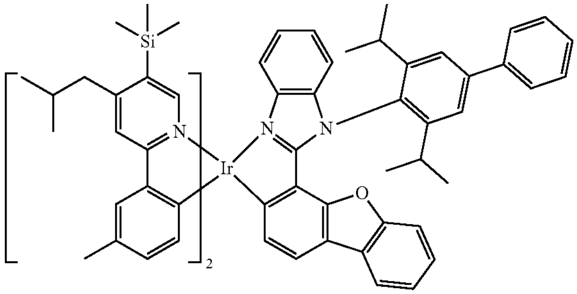
342
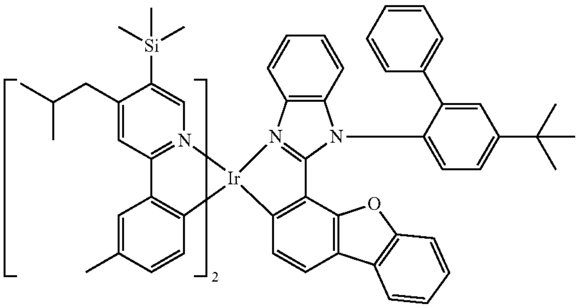

-continued
343
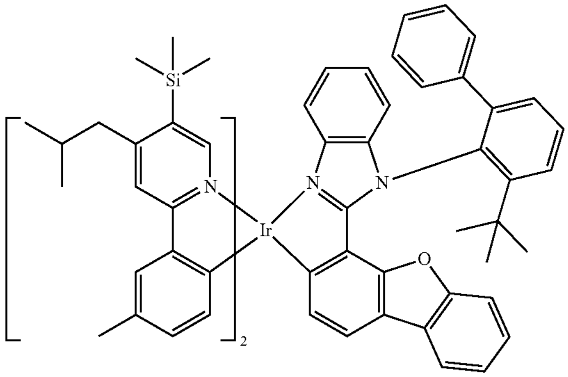
344
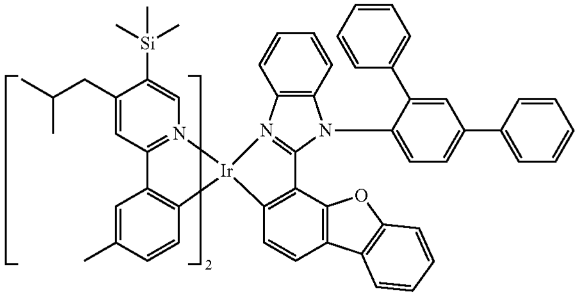
345
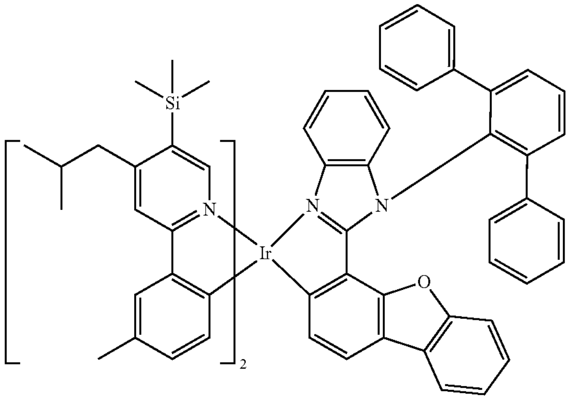
346
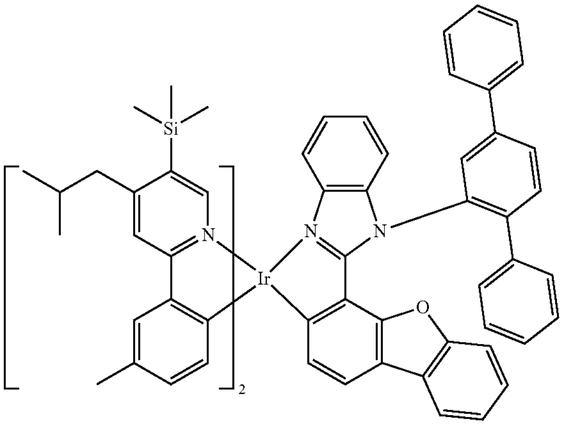
-continued
347
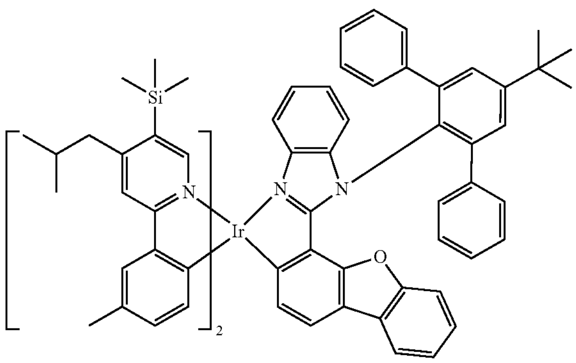
348
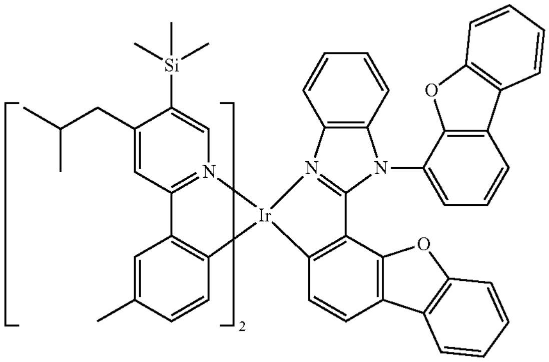
349
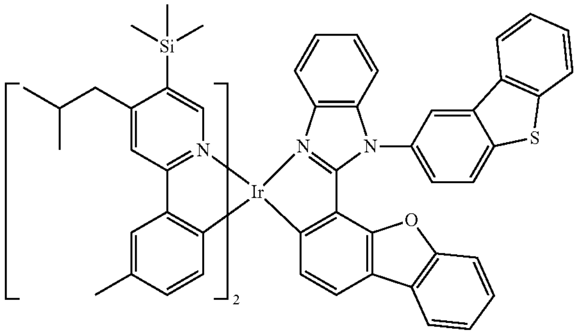
350
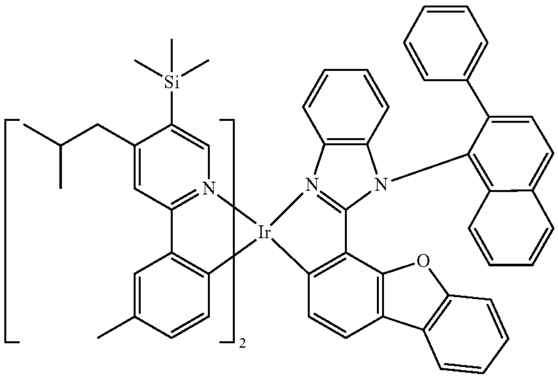

351
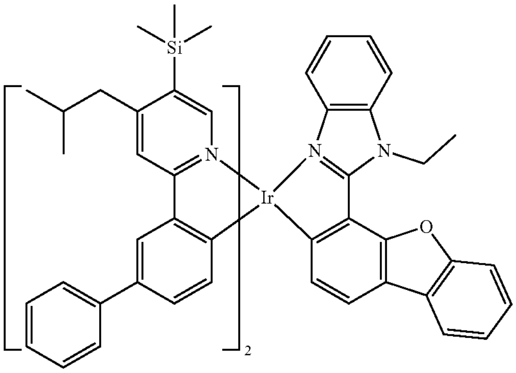
352
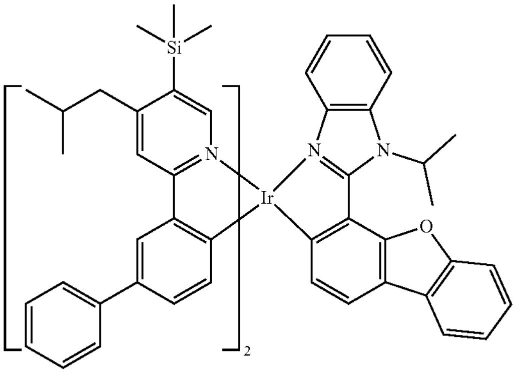
353
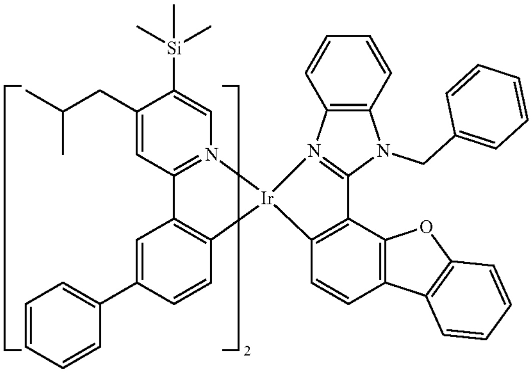
354
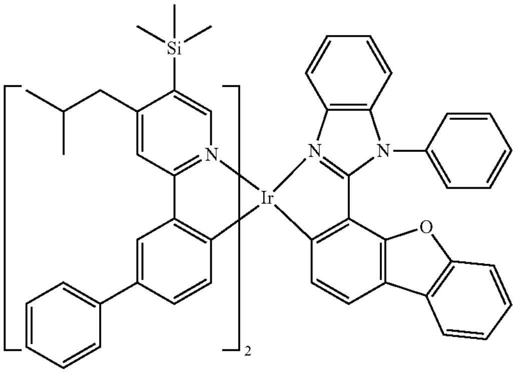
355
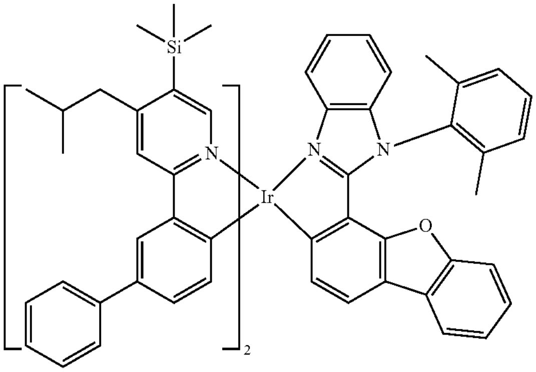
356
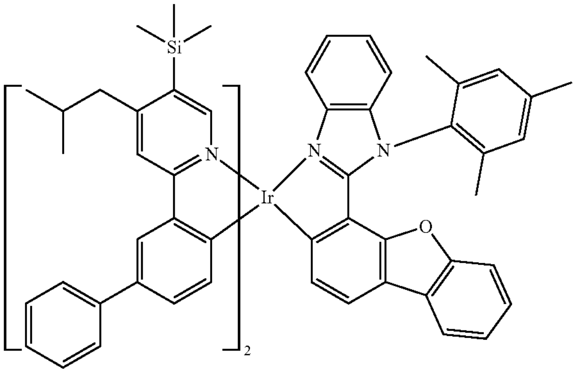
357
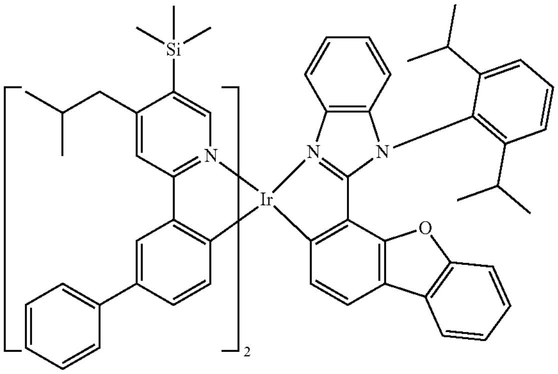
358
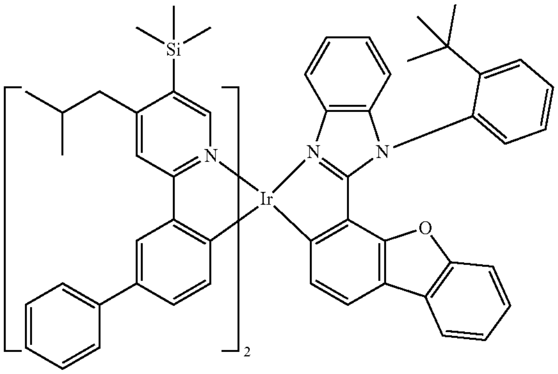

-continued
359
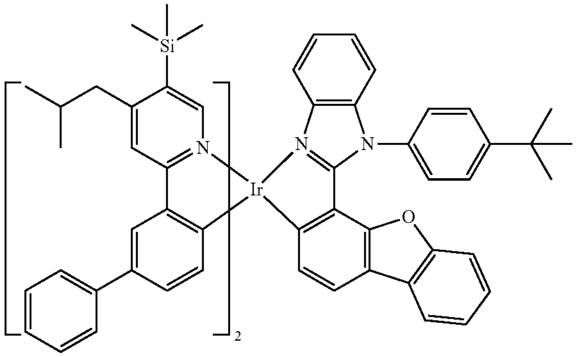
360
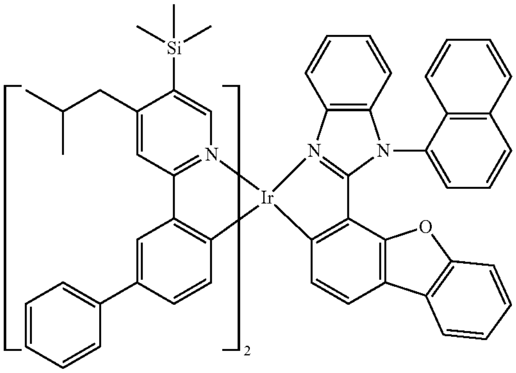
361
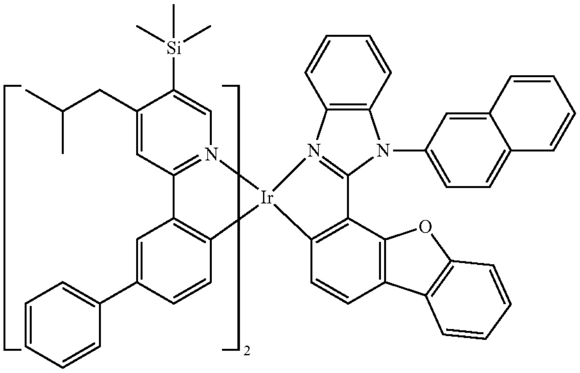
362
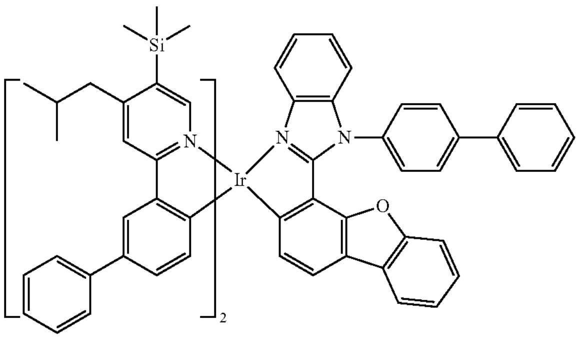
-continued
363
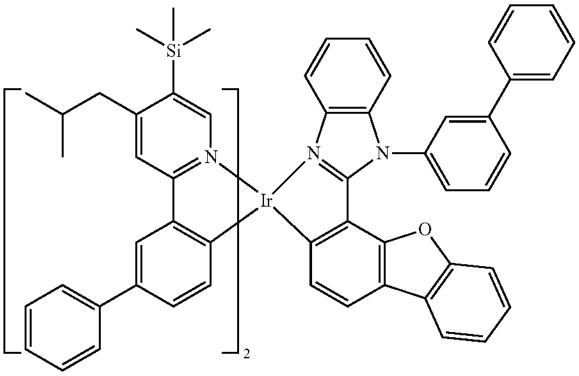
364
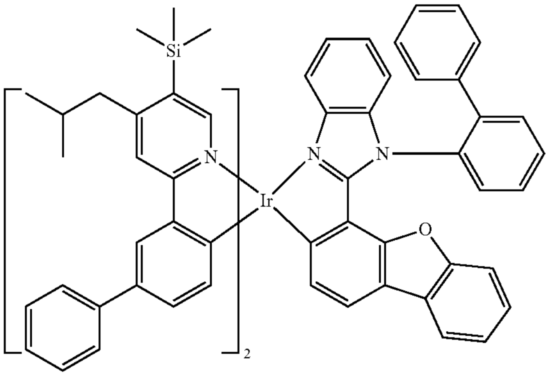
365
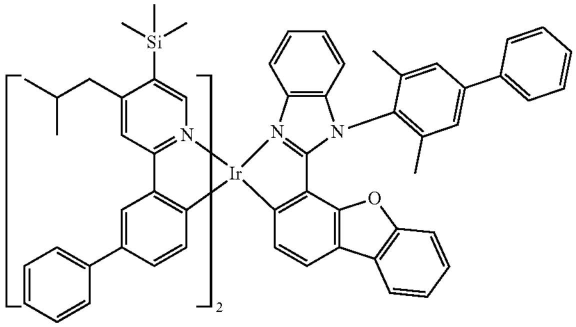
366
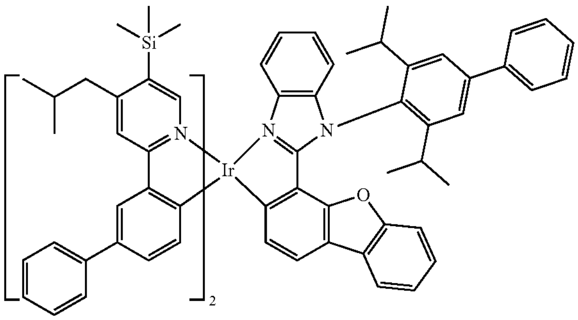

-continued
367
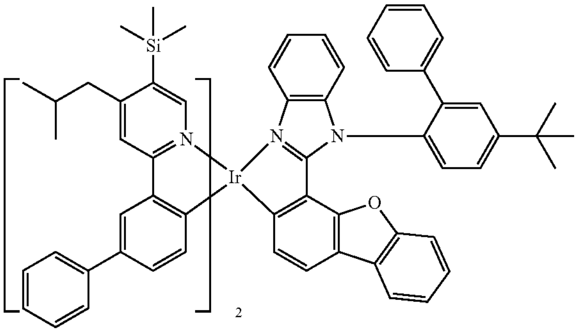
368
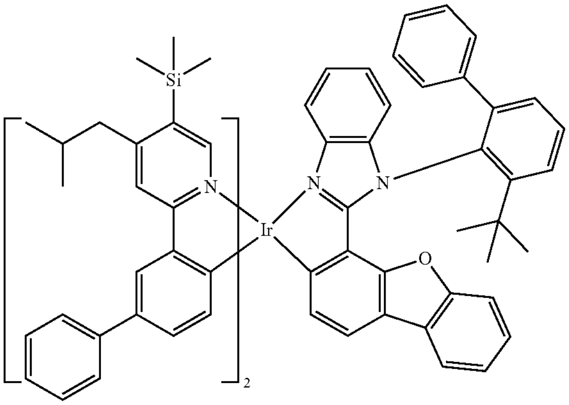
369
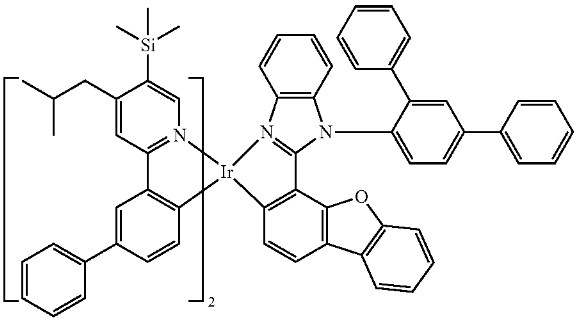
370
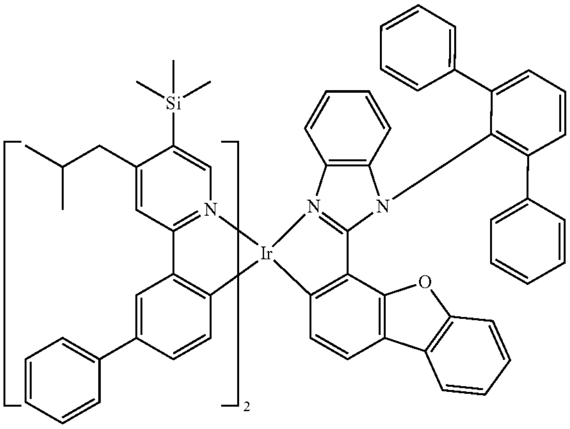
-continued
371
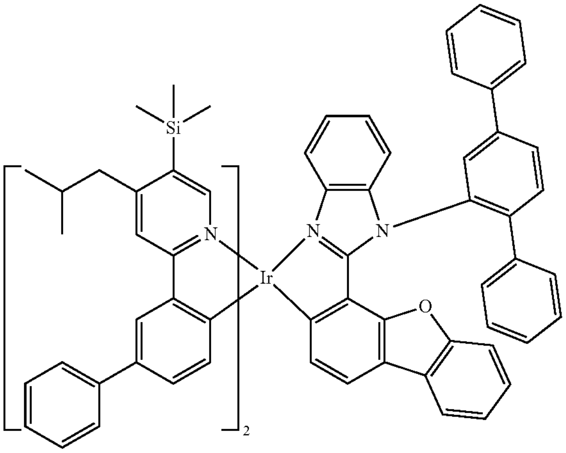
372
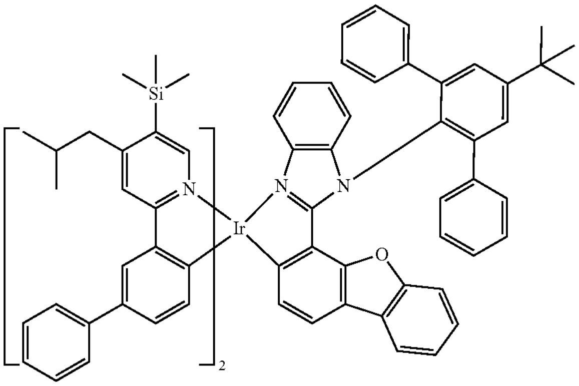
373
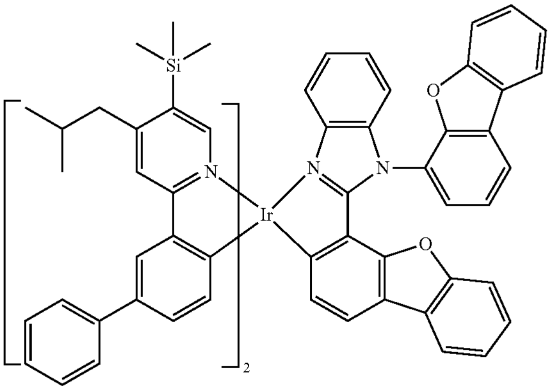

-continued
374
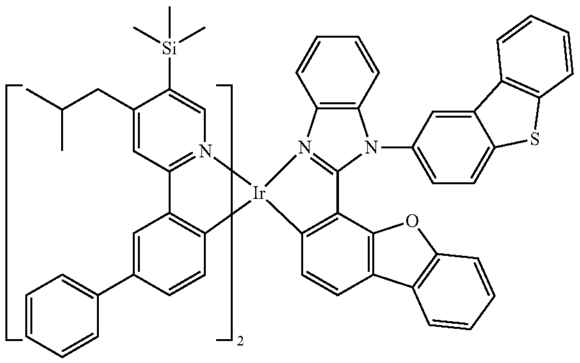
375
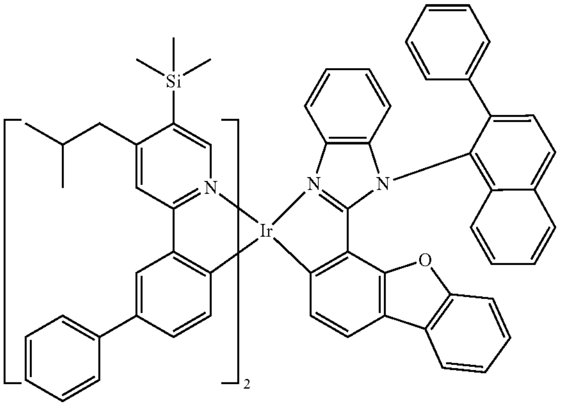
376
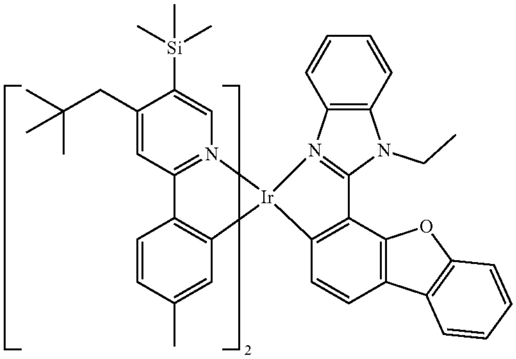
377
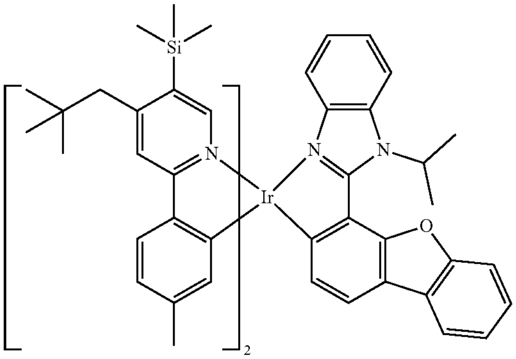
-continued
378
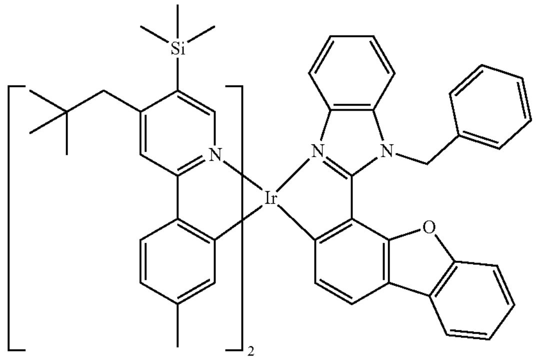
379
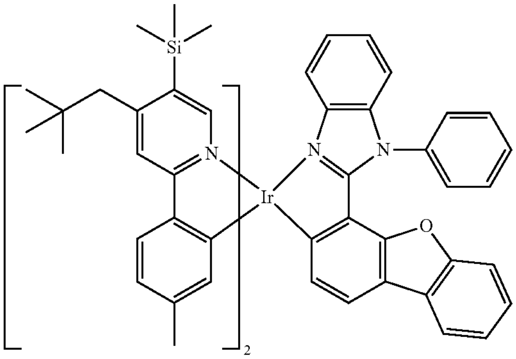
380
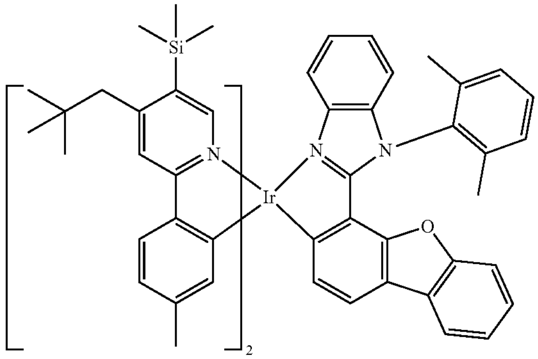
381
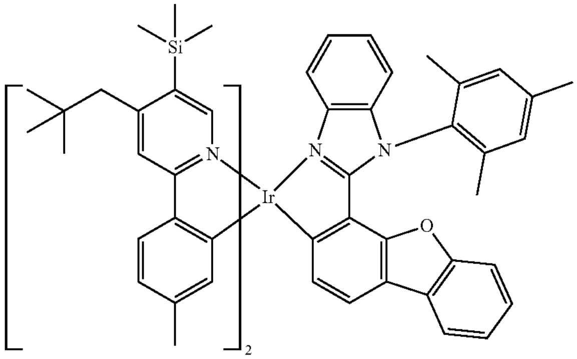

-continued
382
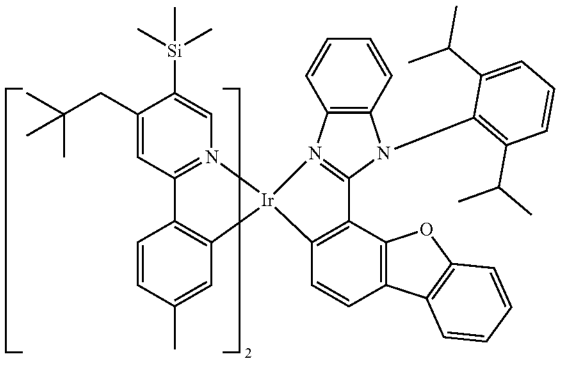
383
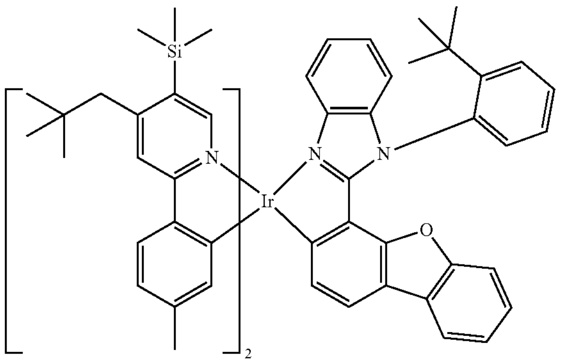
384
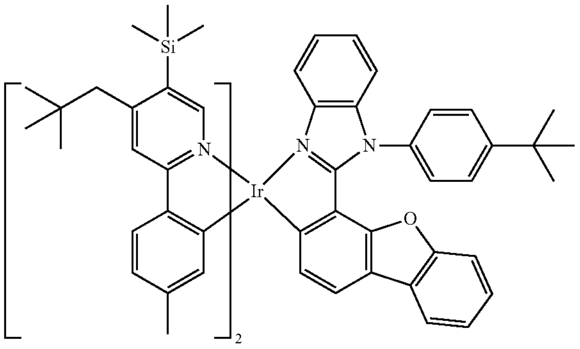
385
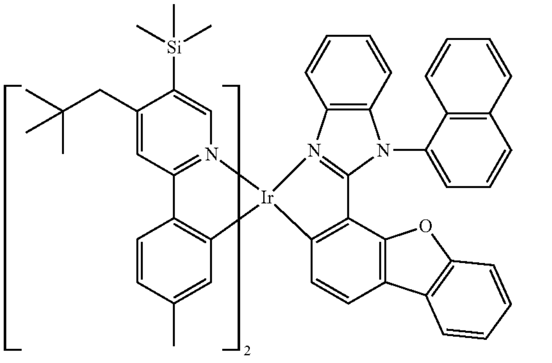
-continued
386
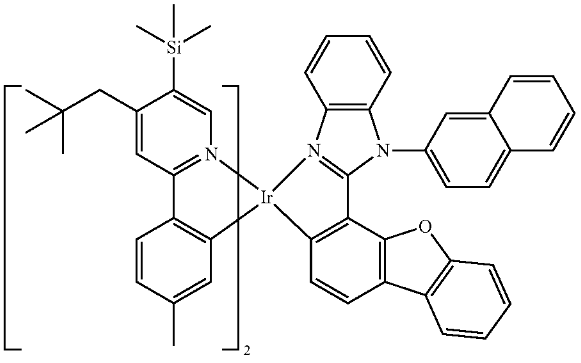
387
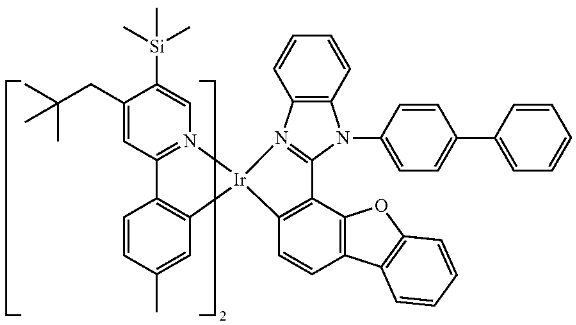
388
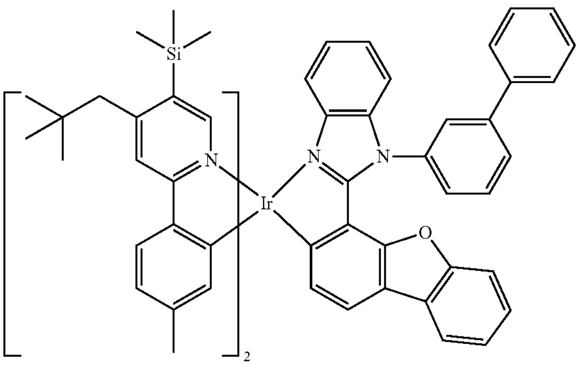
389
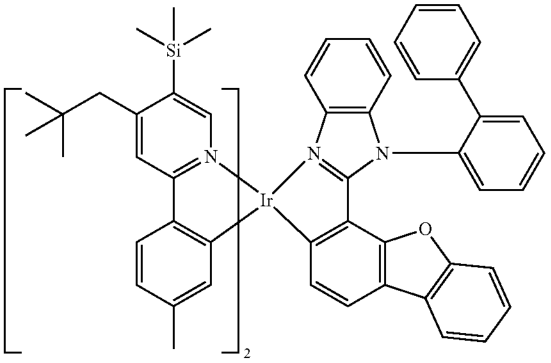

390
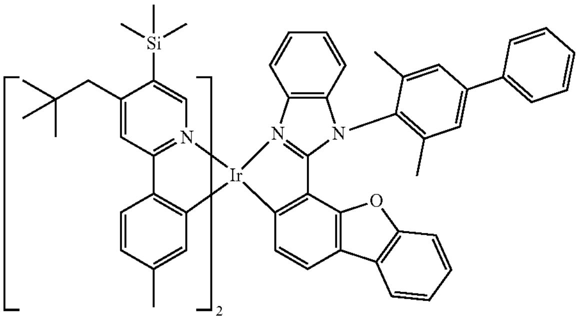
391
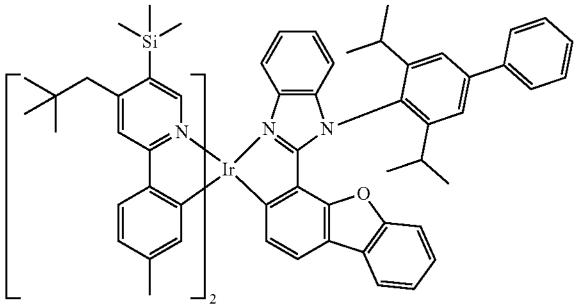
392
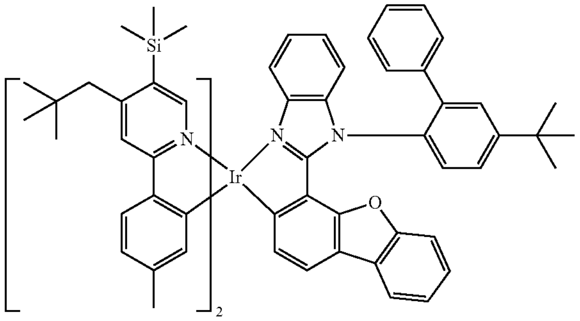
393
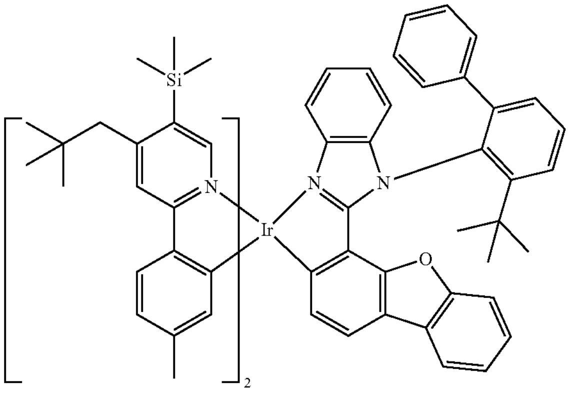
394
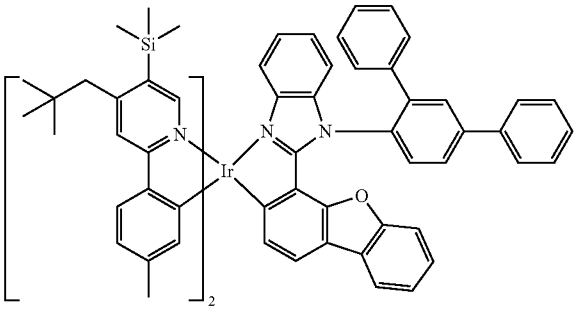
395
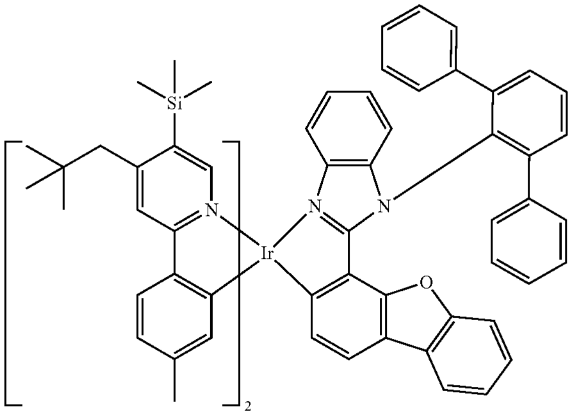
396
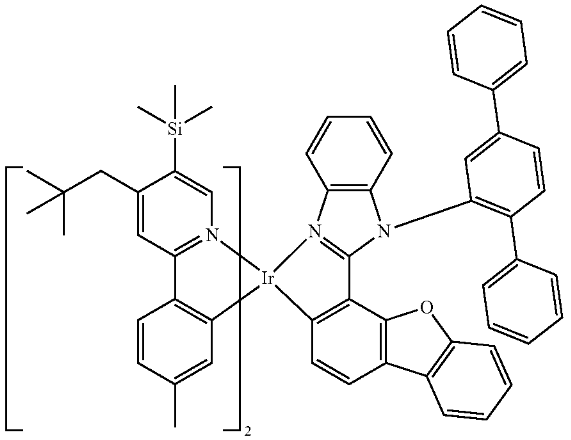
397
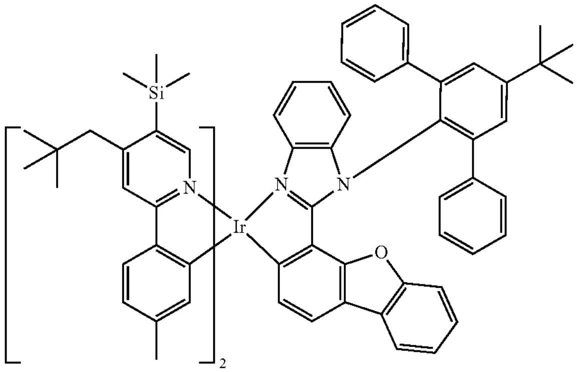

-continued
398
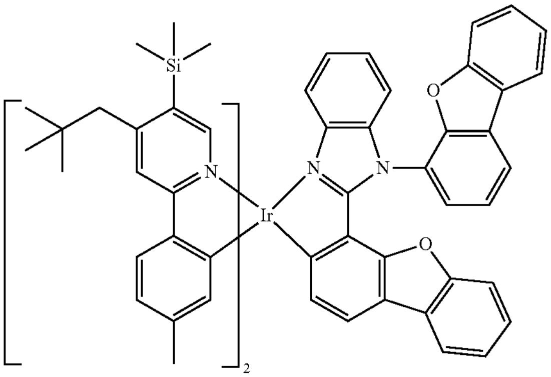
399
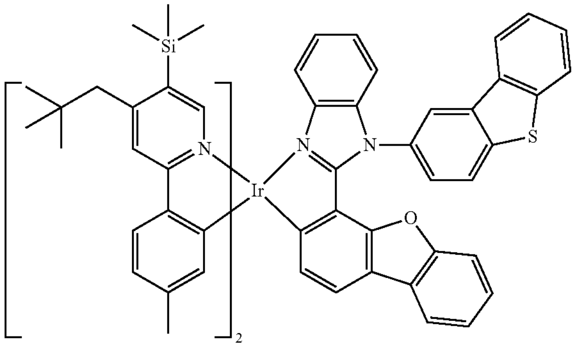
400
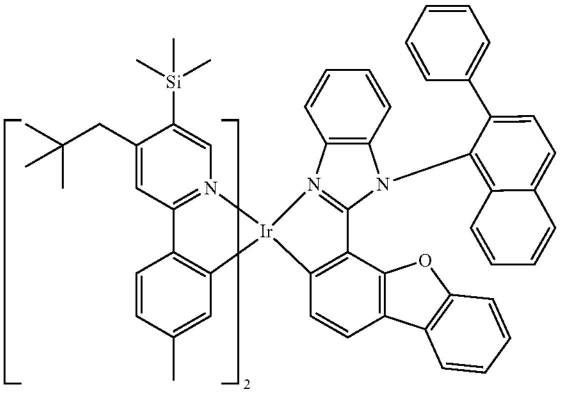
401
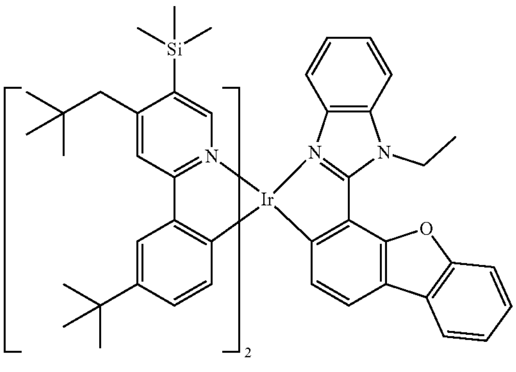
-continued
402
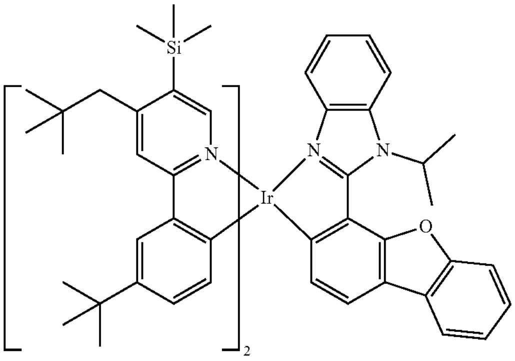
403
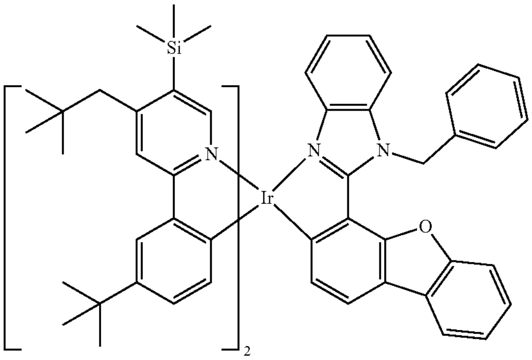
404
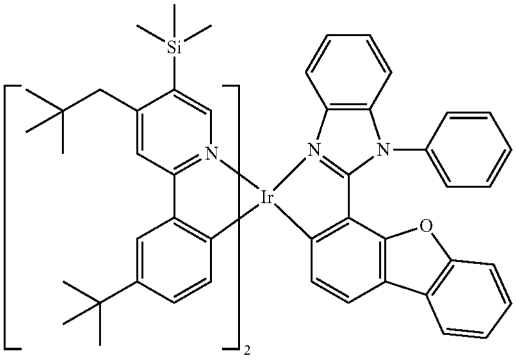
405
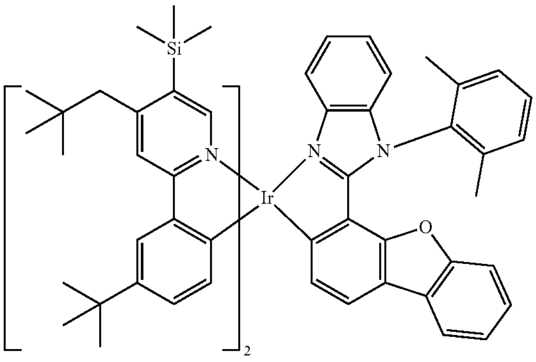

406
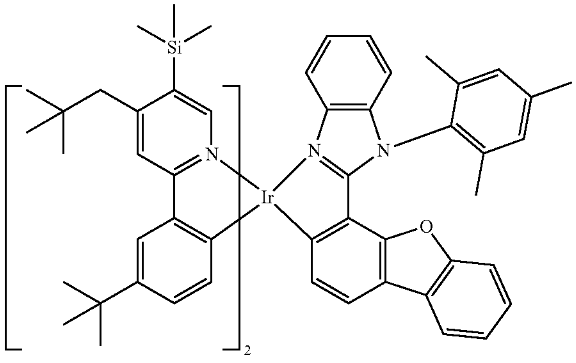
407
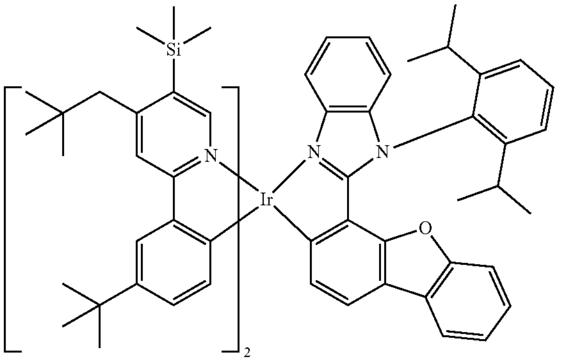
408
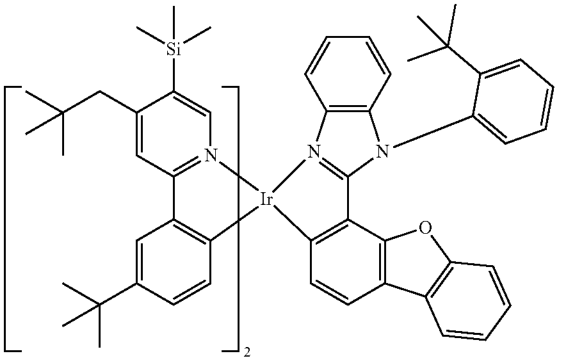
409
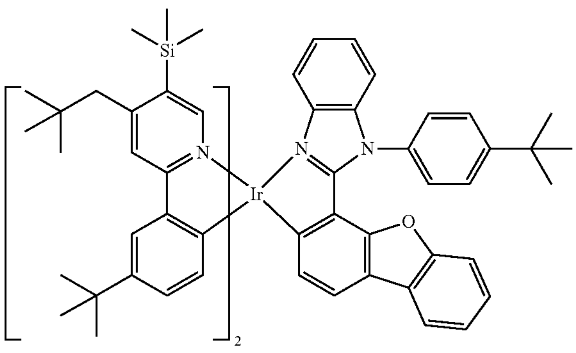
410
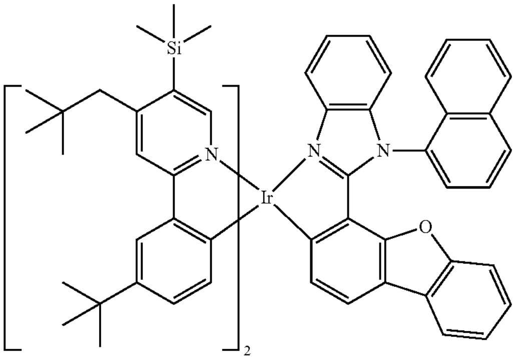
411
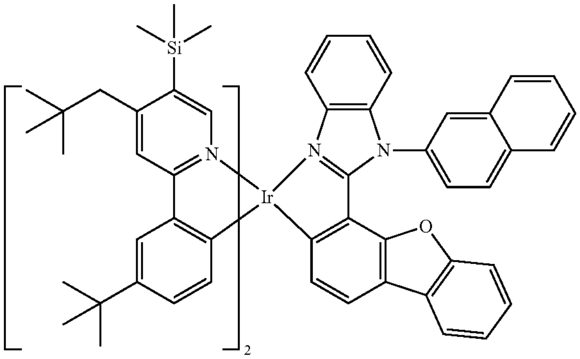
412
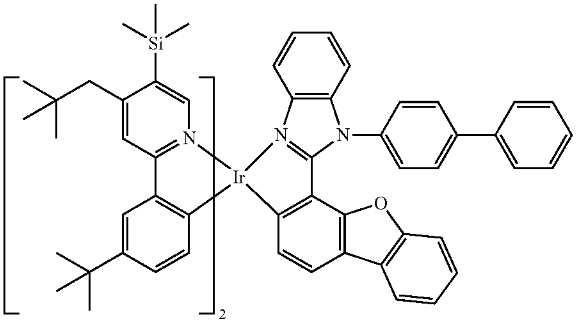
413
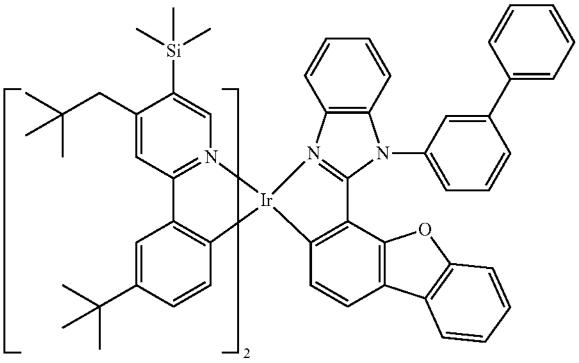

-continued
414
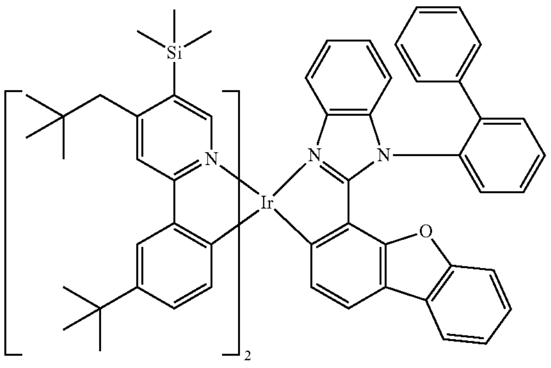
415
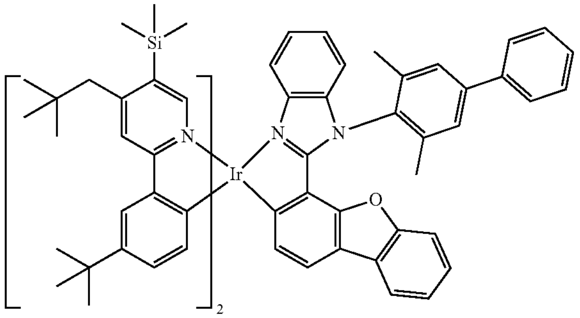
416
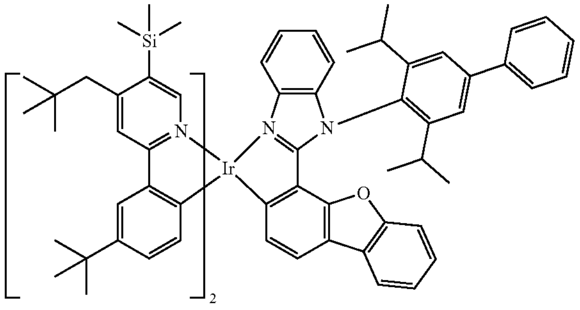
417
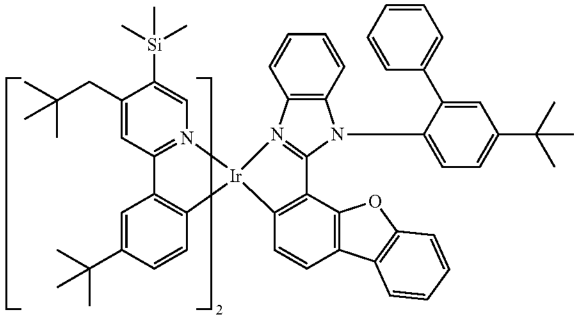
-continued
418
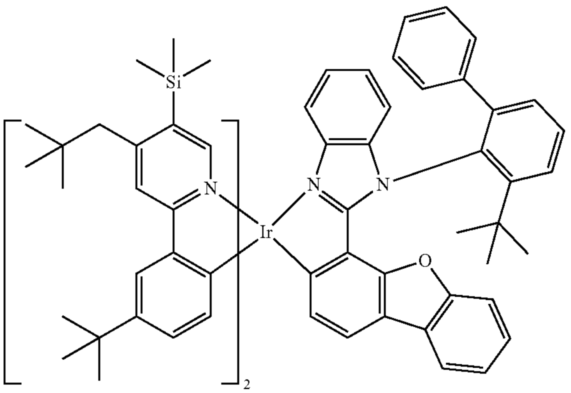
419
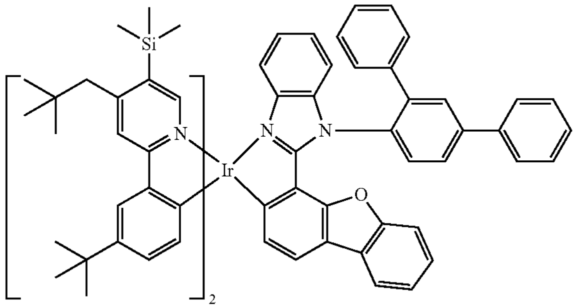
420
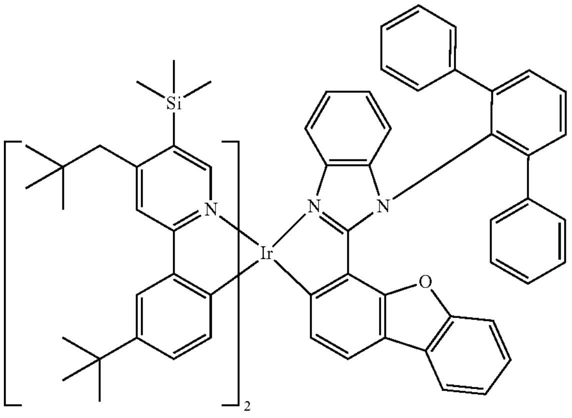
421
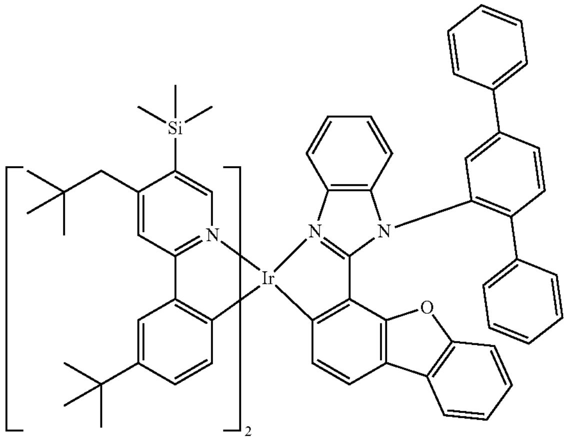

-continued
422
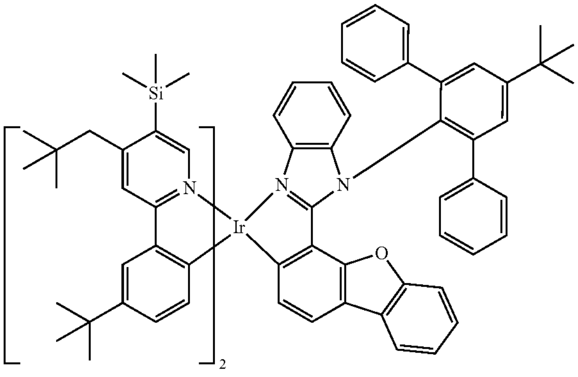
423
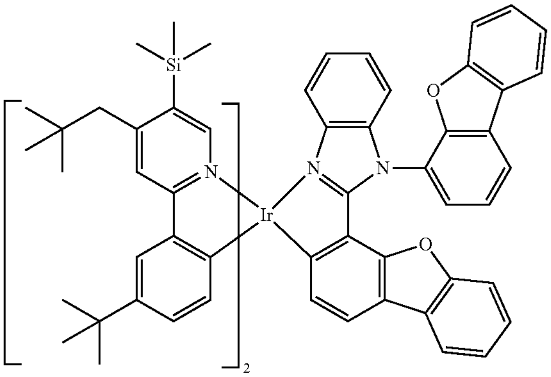
424
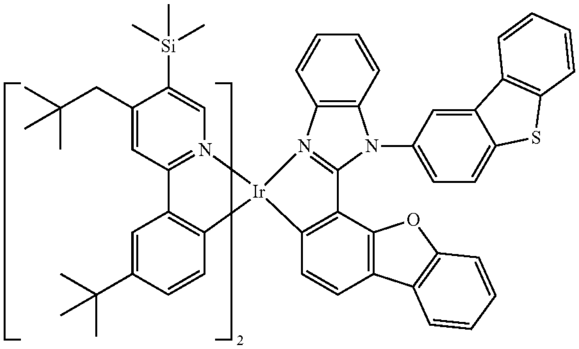
425
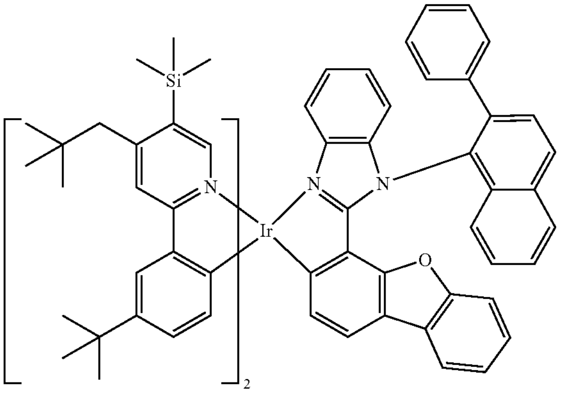
-continued
426
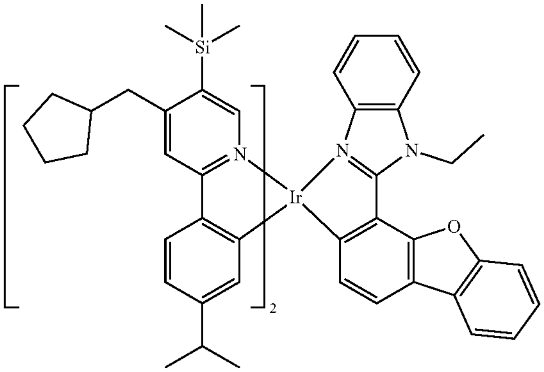
427
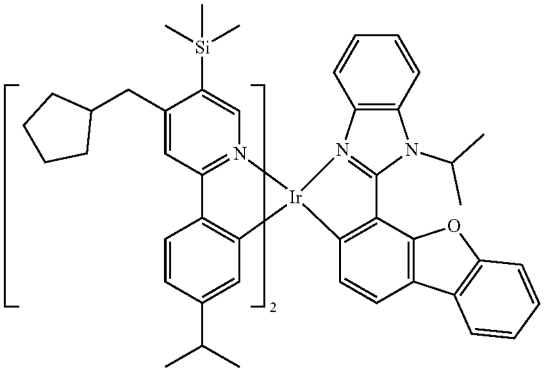
428
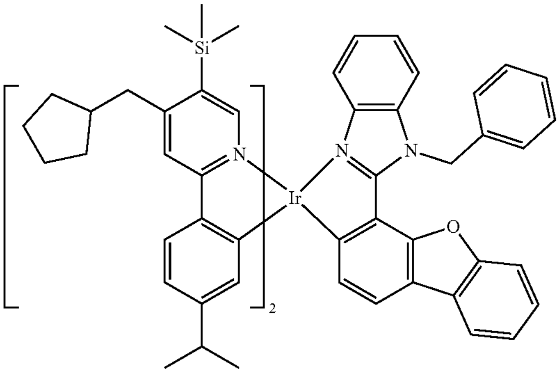
429
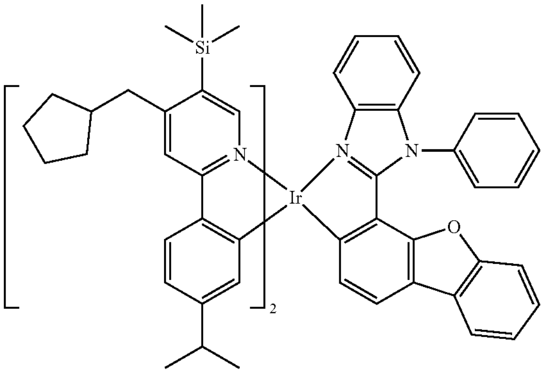

-continued
430
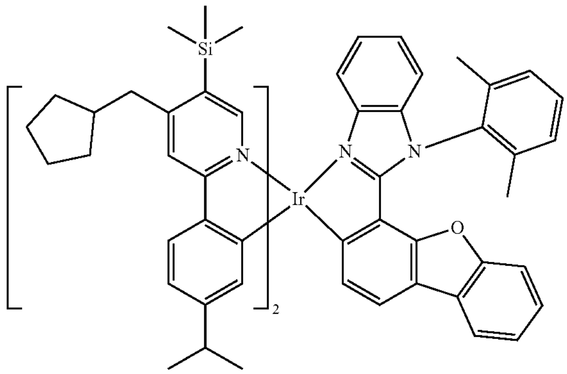
431
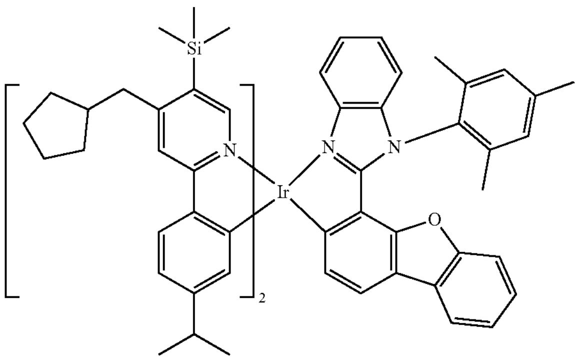
432
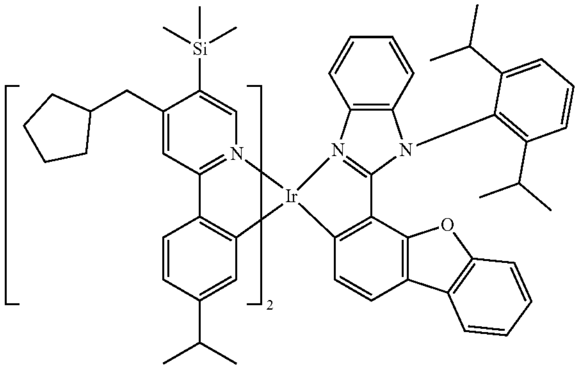
433
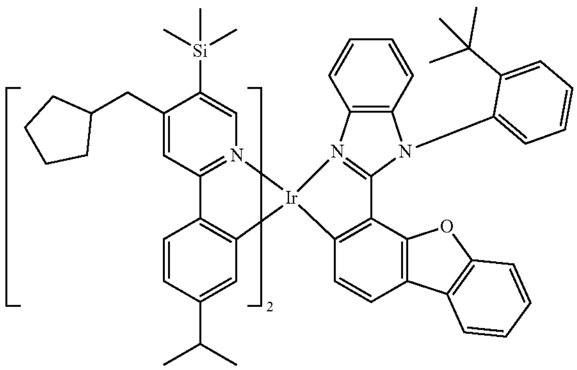
-continued
434
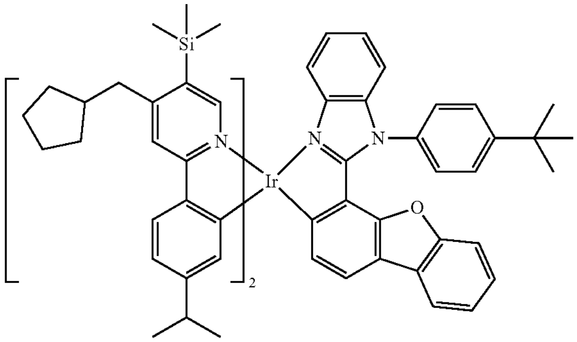
435
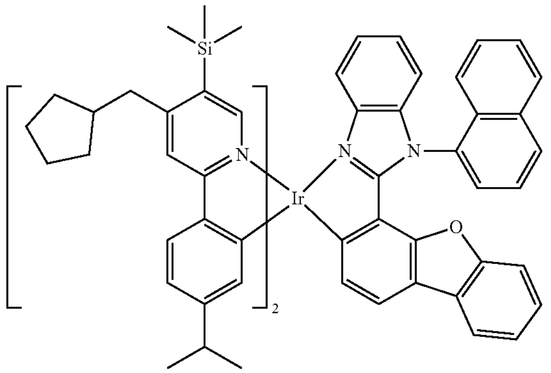
436
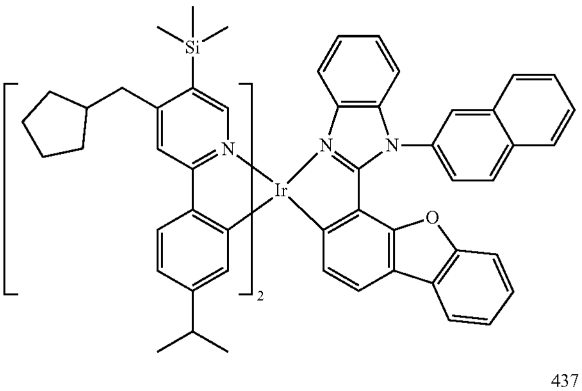
437
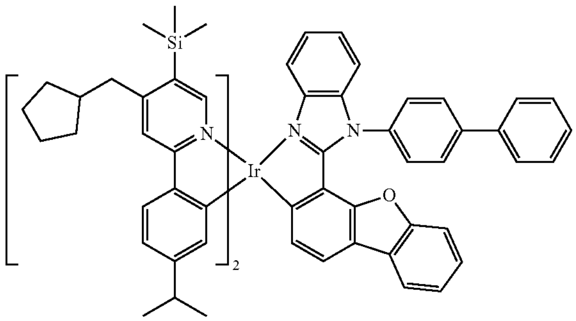

-continued
438
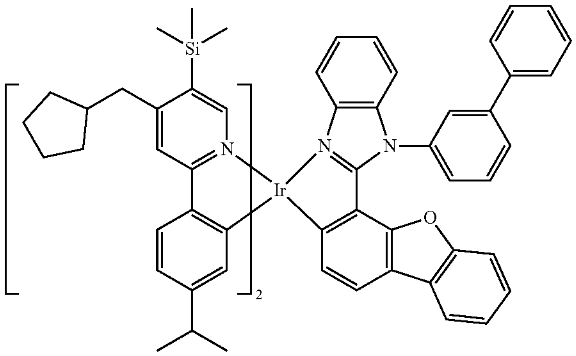
439
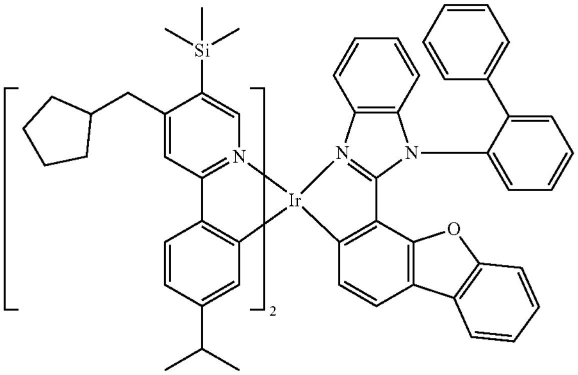
440
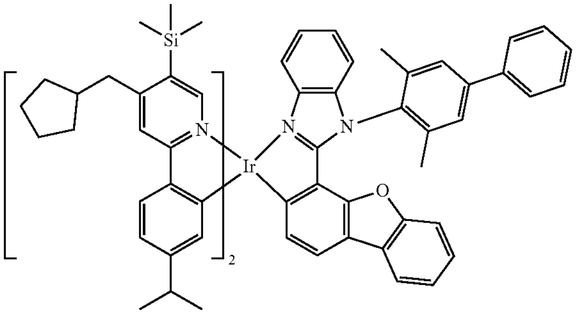
441
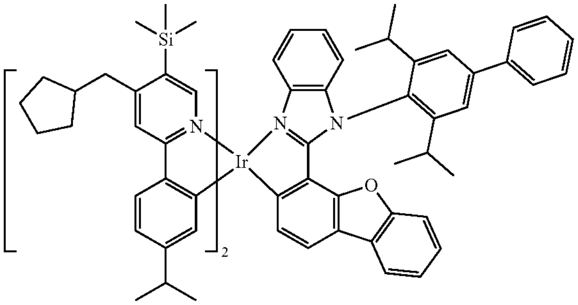
-continued
442
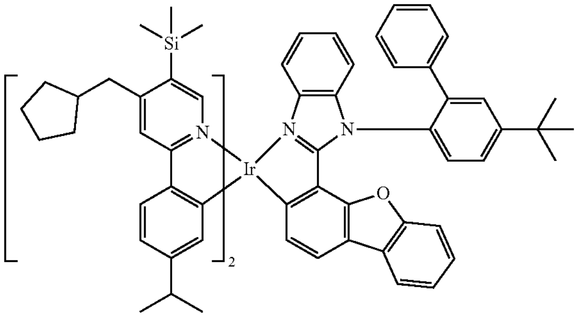
443
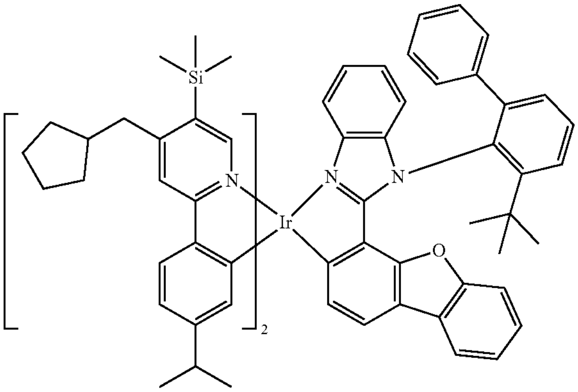
444
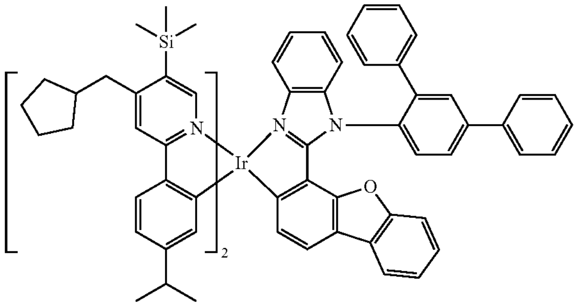
445
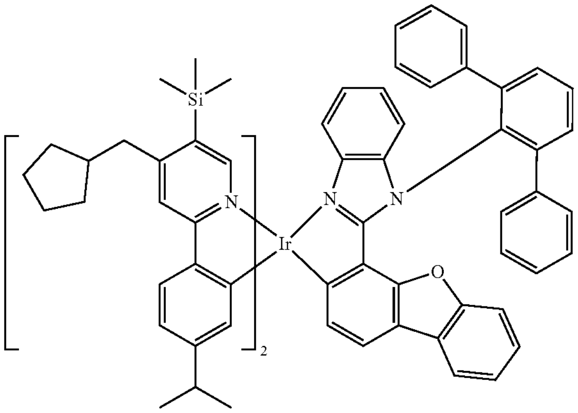

-continued
446
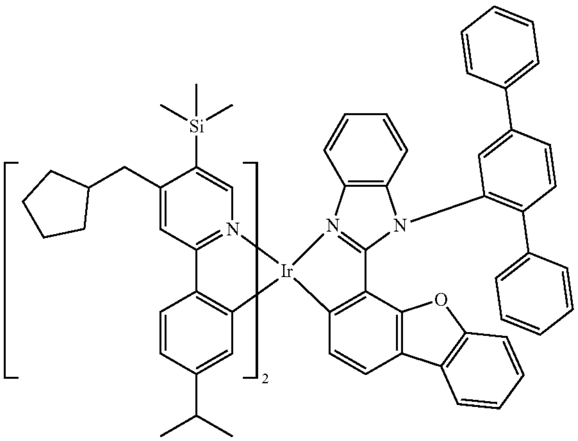
447
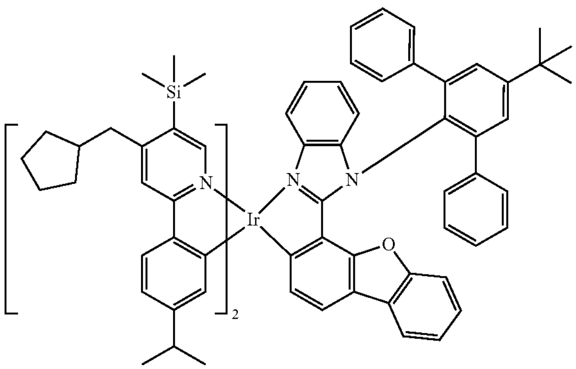
448
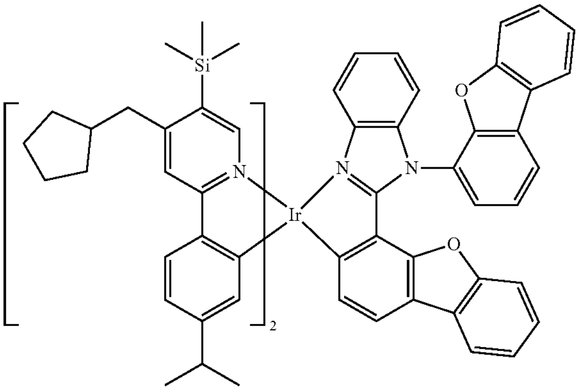
449
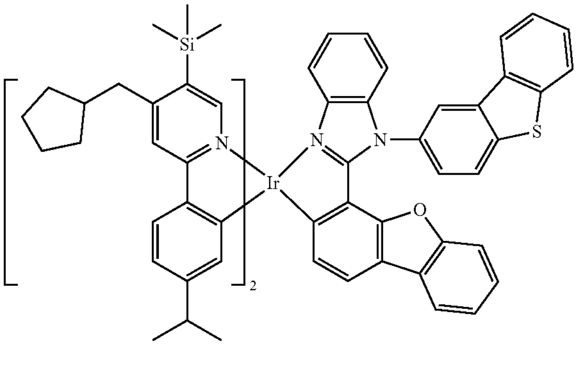
-continued
450
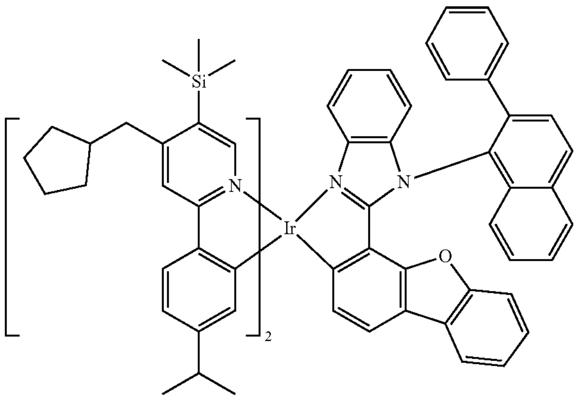
451
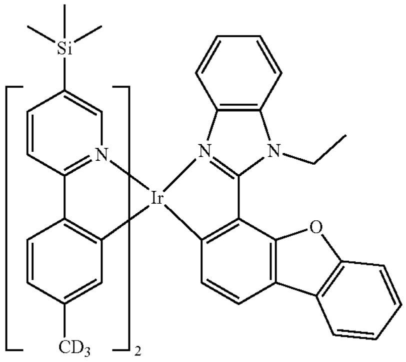
452
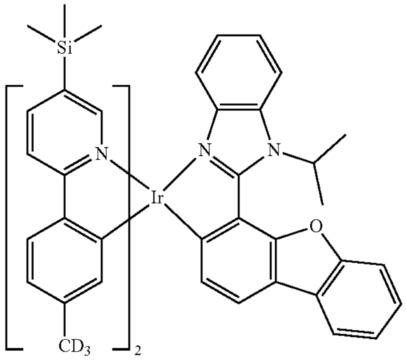
453
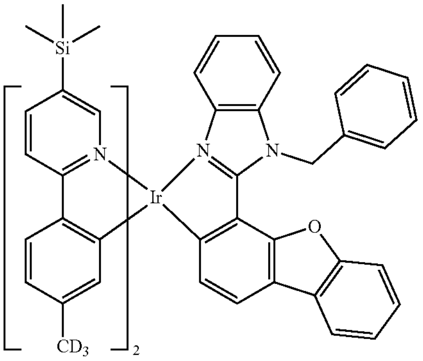

-continued
454
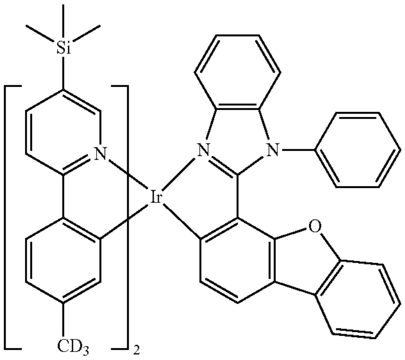
455
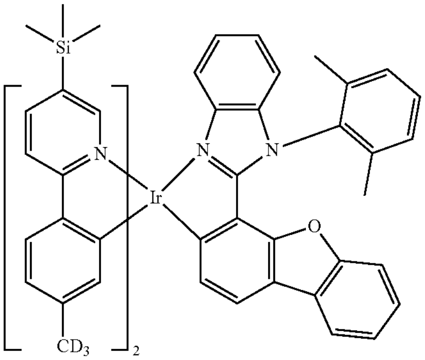
456
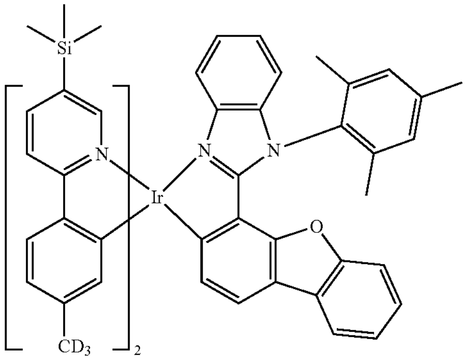
457
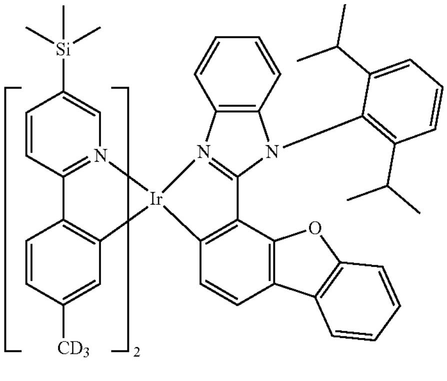
-continued
458
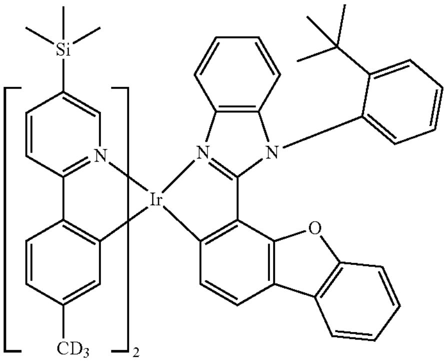
459
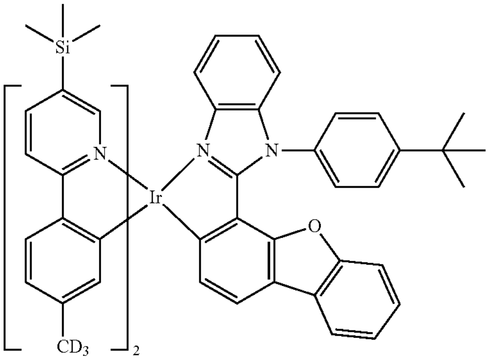
460
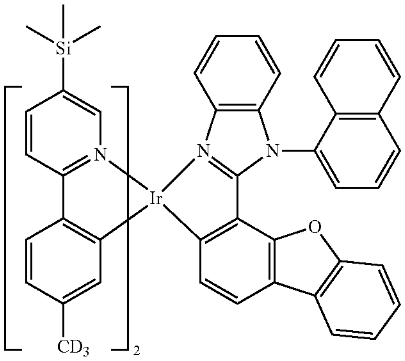
461
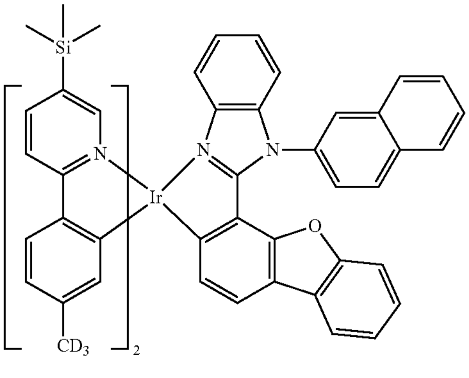

-continued
462
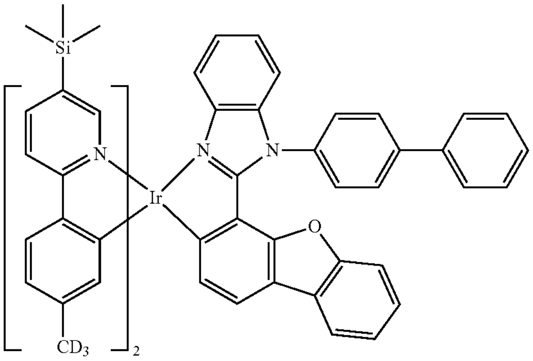
463
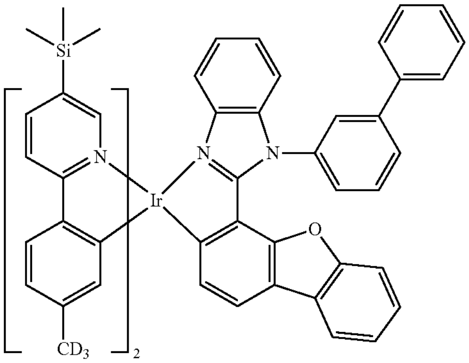
464
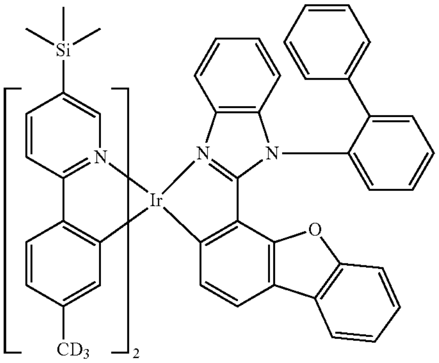
465
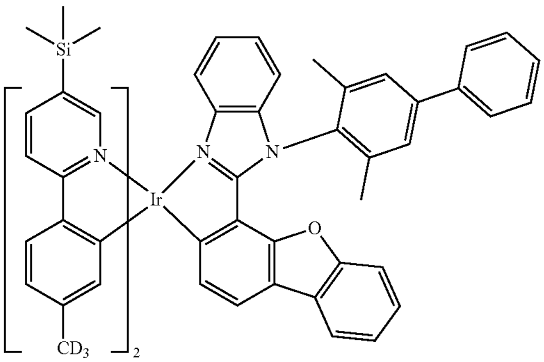
-continued
466
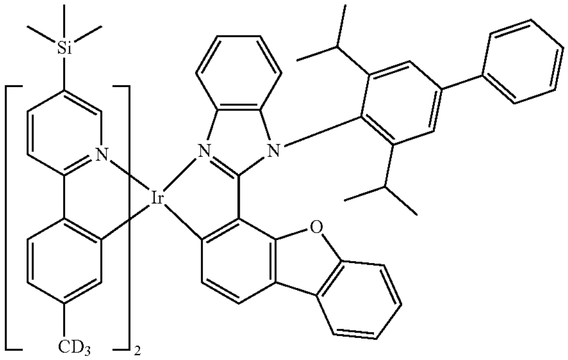
467
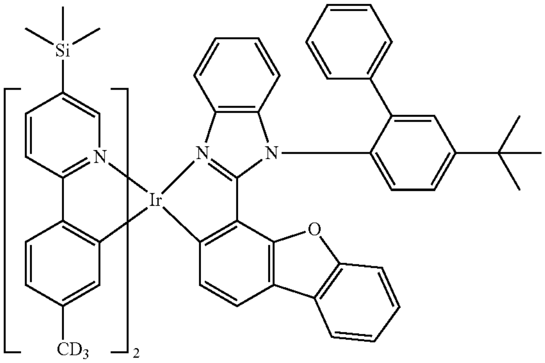
468
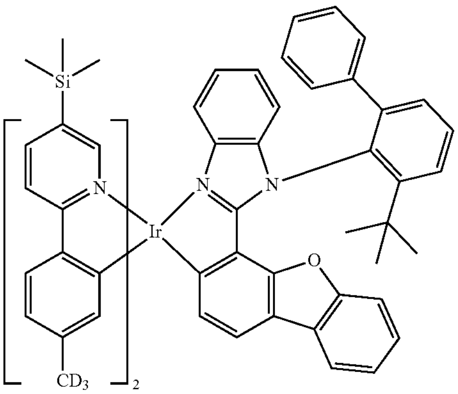
469
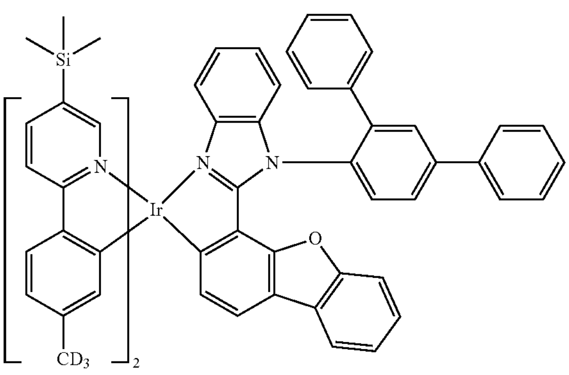

-continued
470
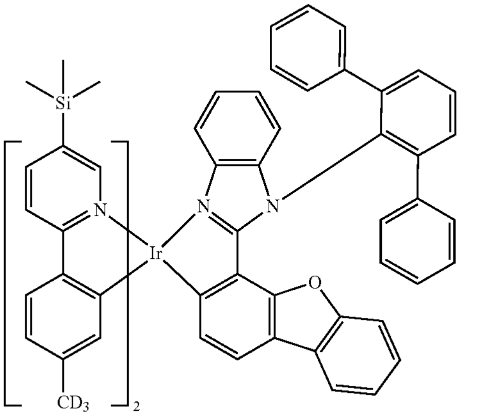
471
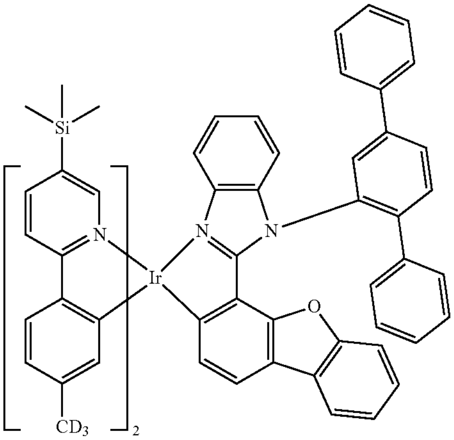
472
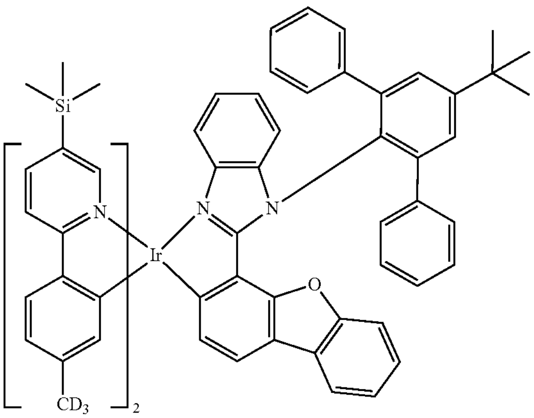
-continued
473
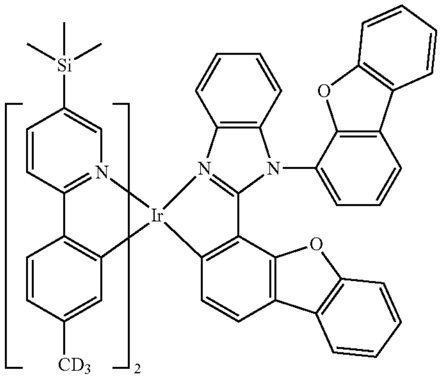
474
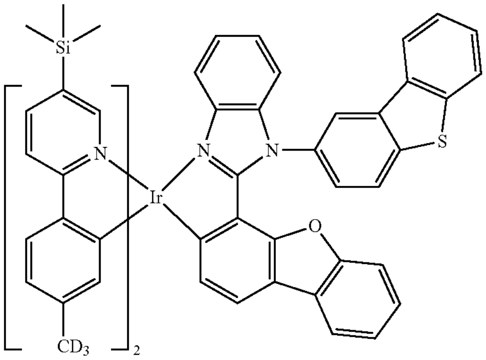
475
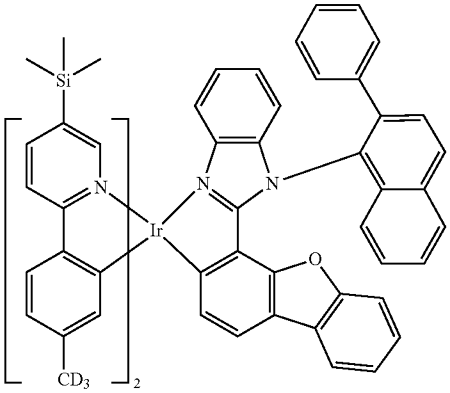
476
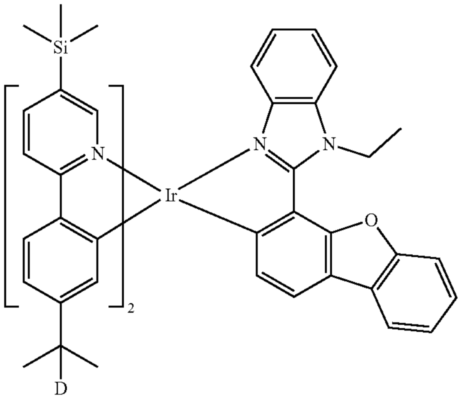

-continued
477
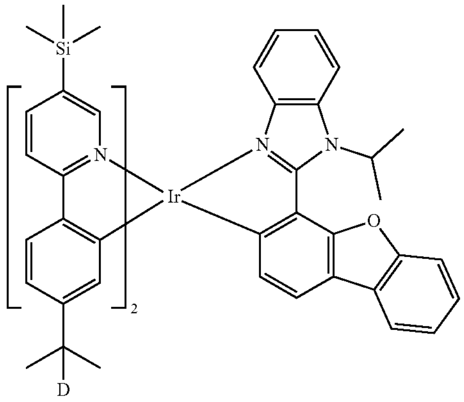
478
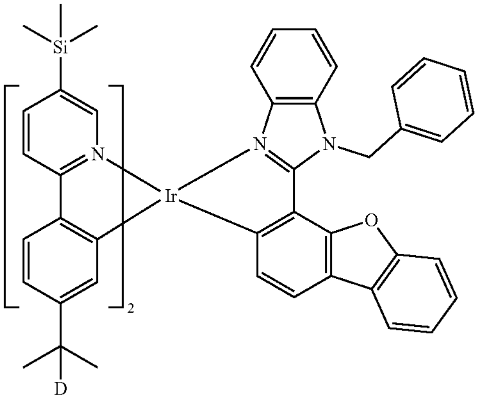
479
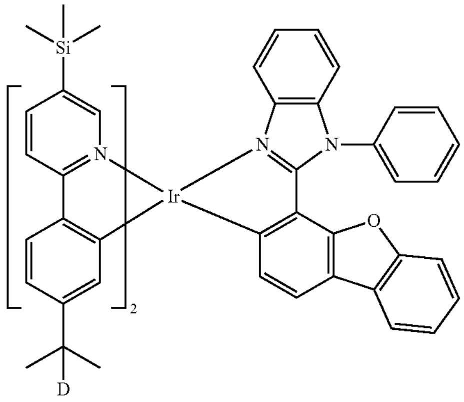
480
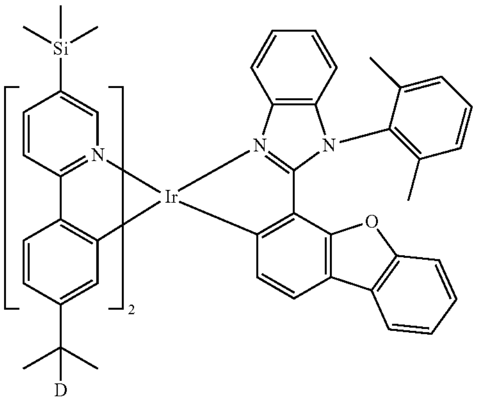
-continued
481
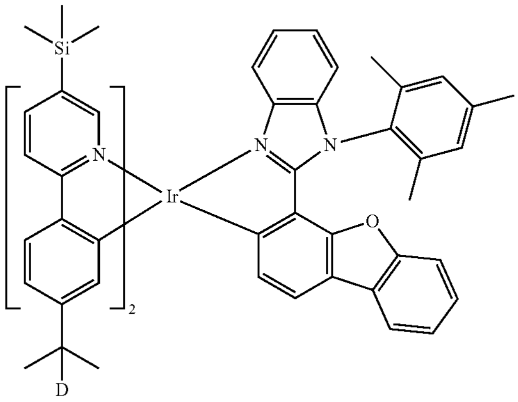
482
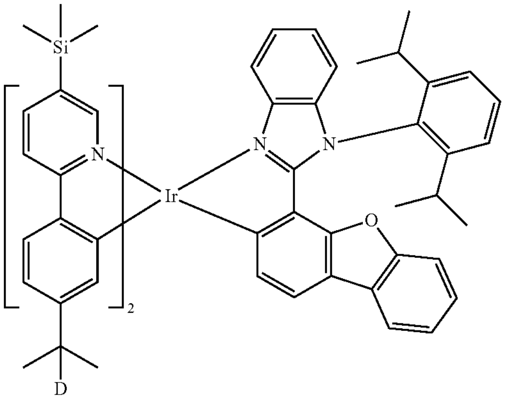
483
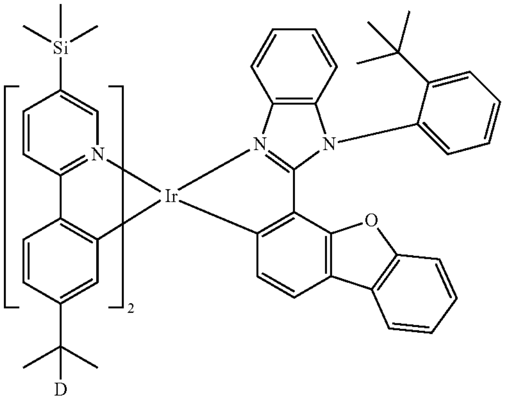
484
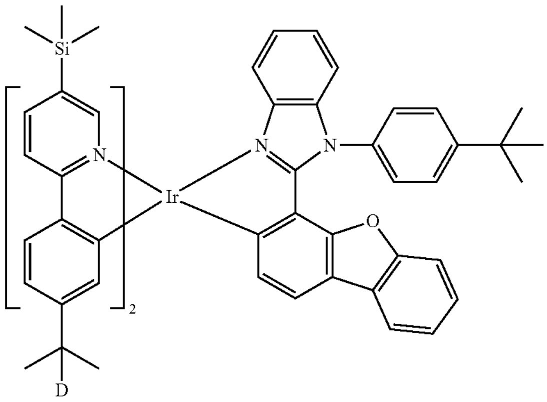

485
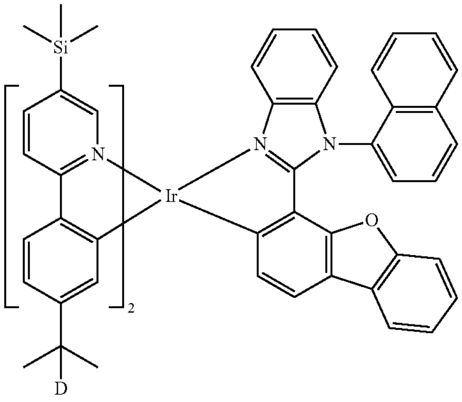
488
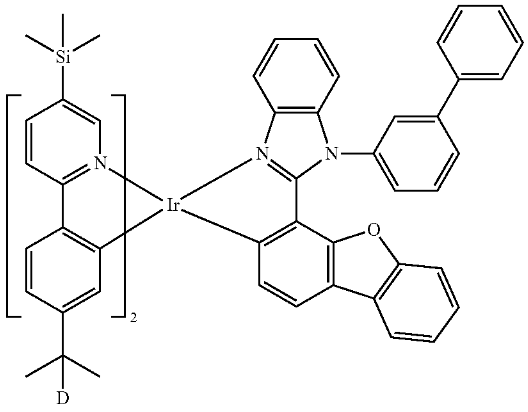
486
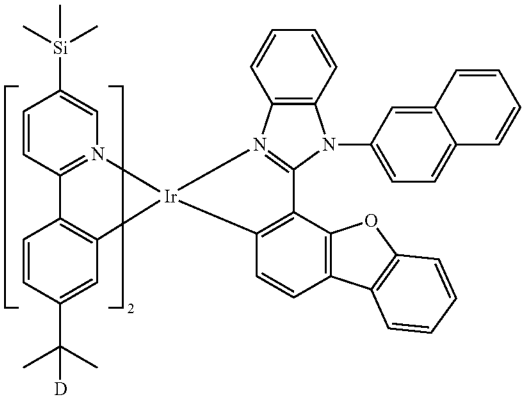
489
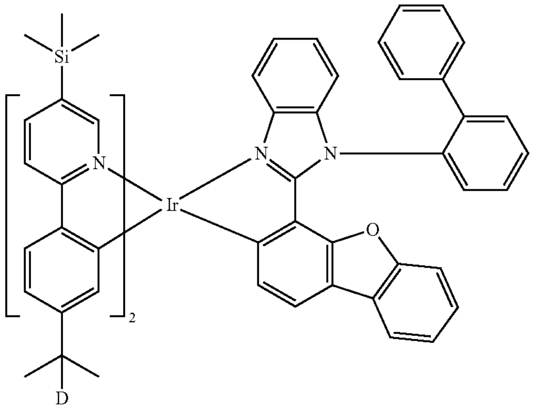
487
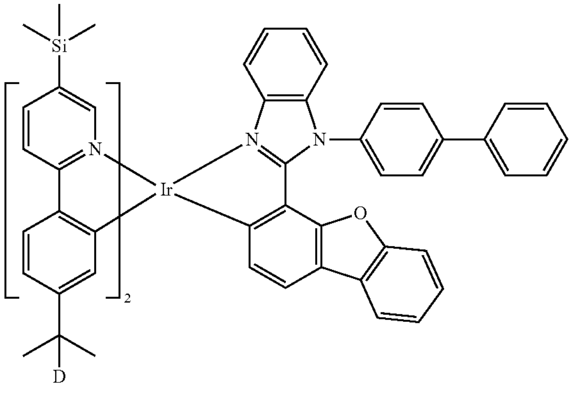
490
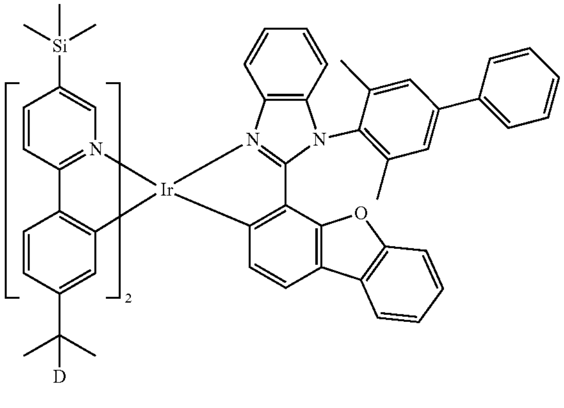

491
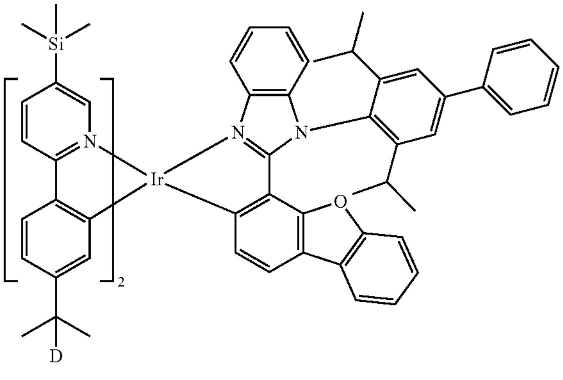
492
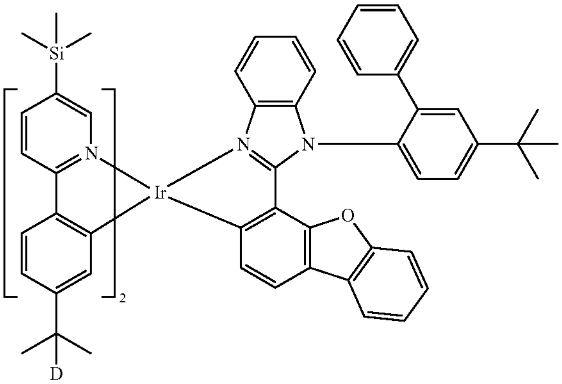
493
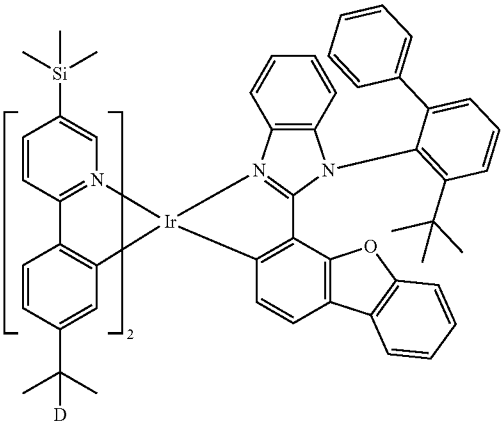
494
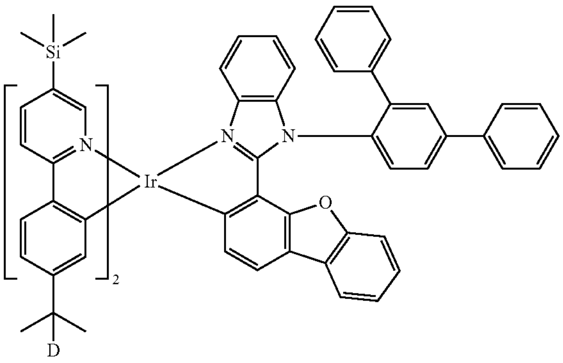
495
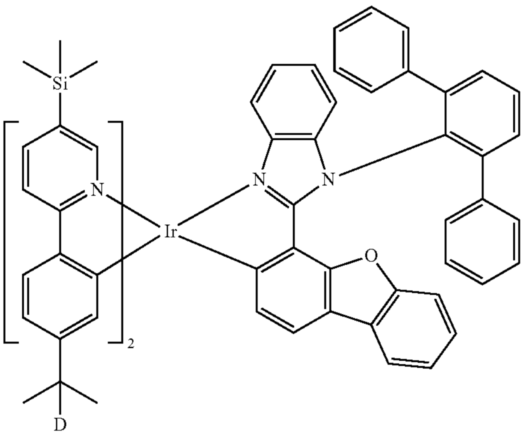
496
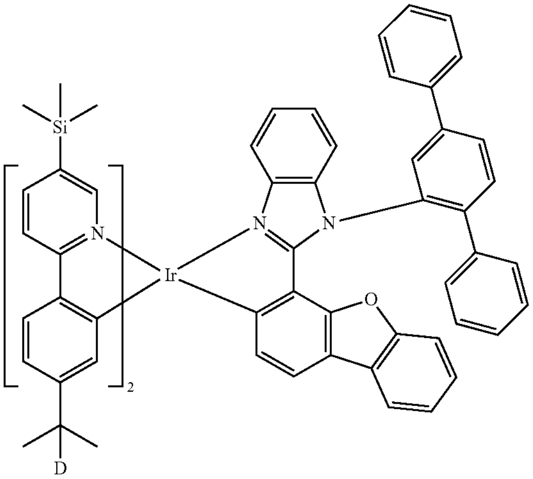
497
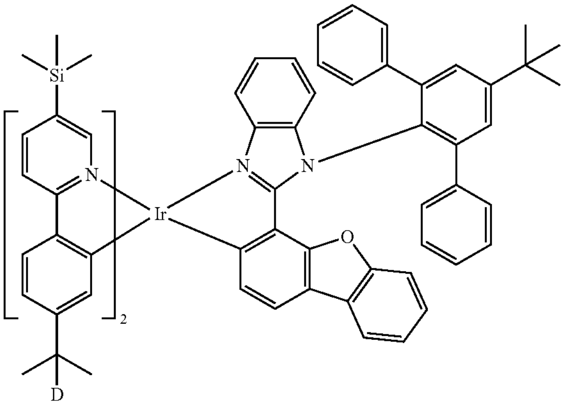

-continued
498
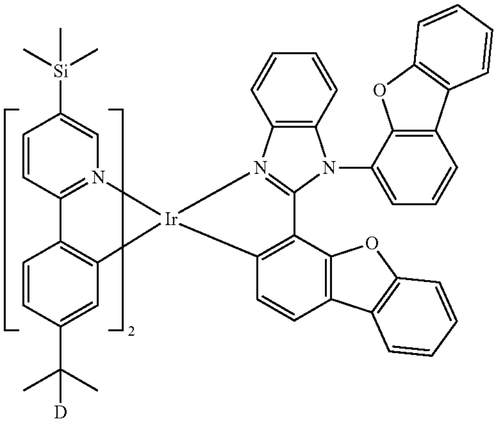
499
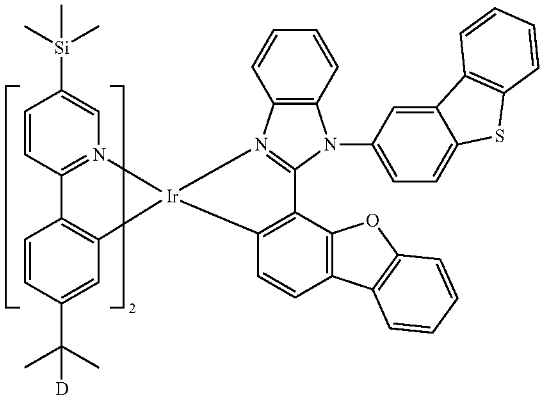
500
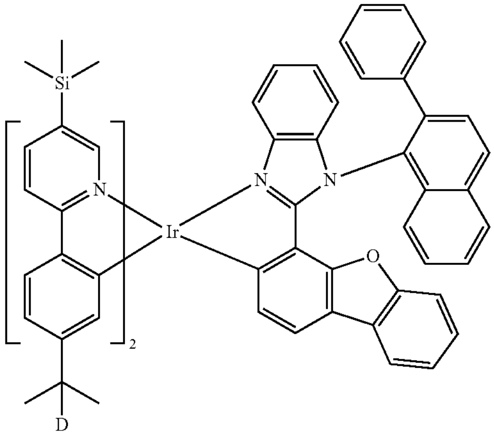
-continued
501
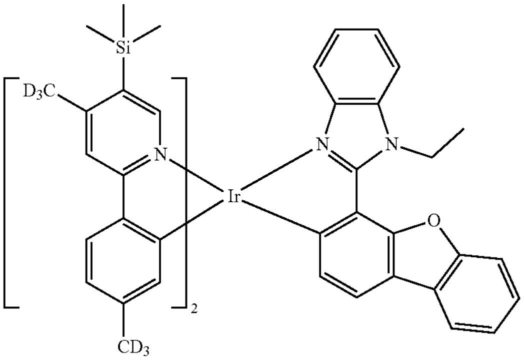
502
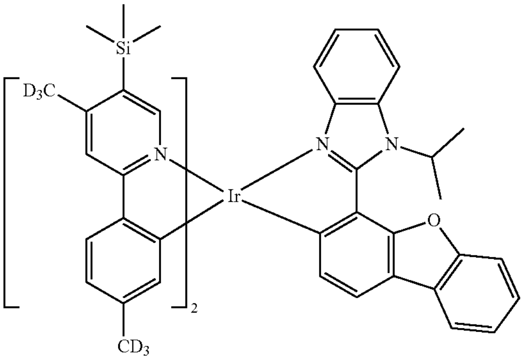
503
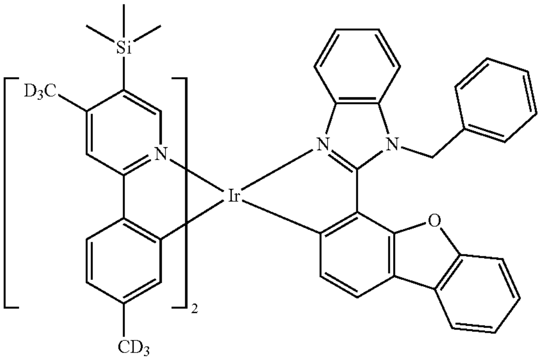
504
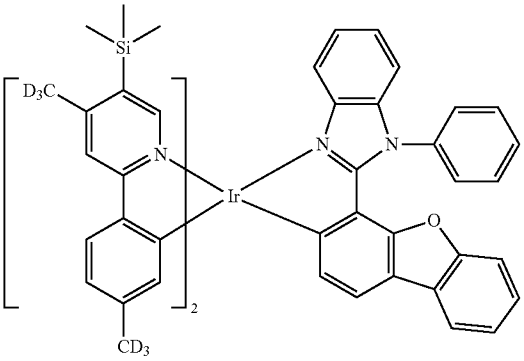

-continued
505
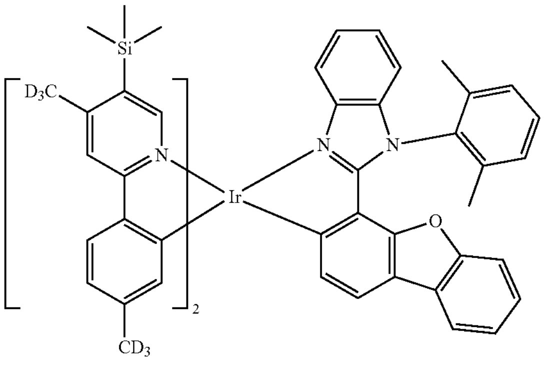
506
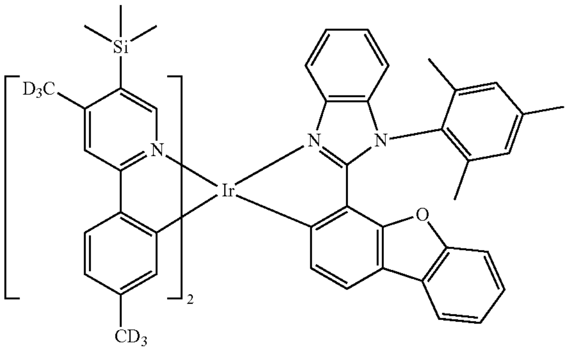
507
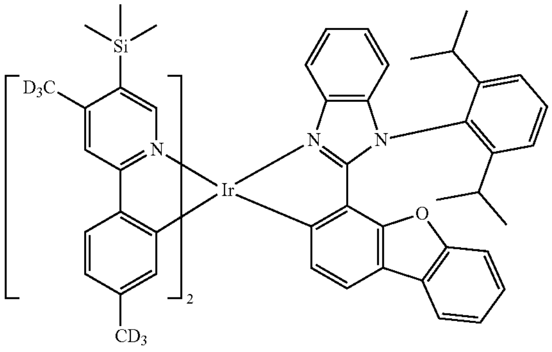
508
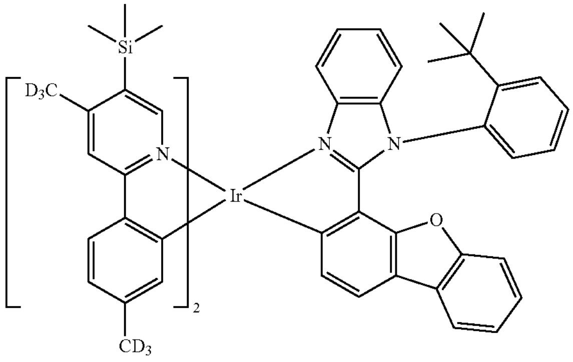
-continued
509
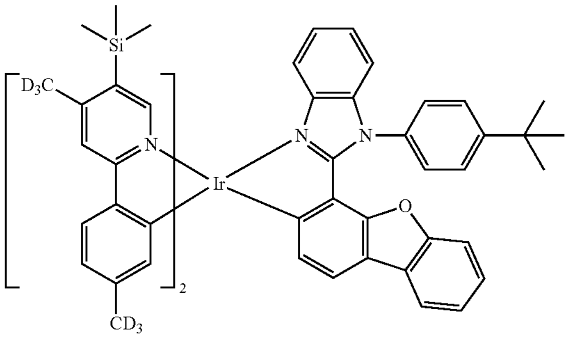
510
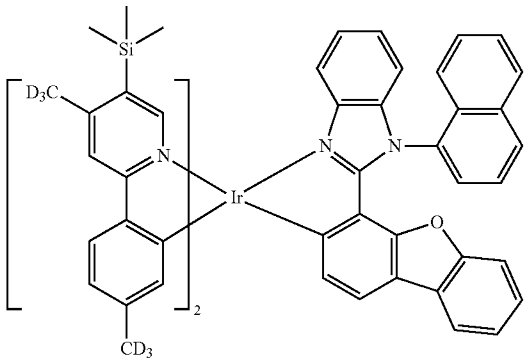
511
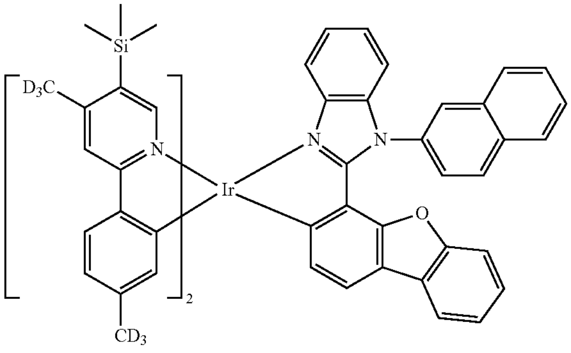
512
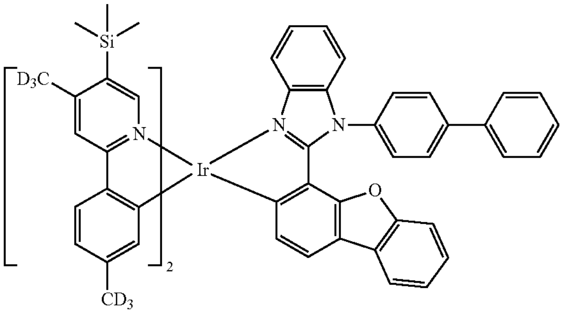

-continued
513
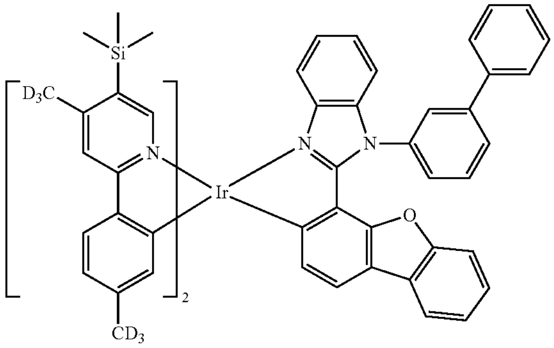
514
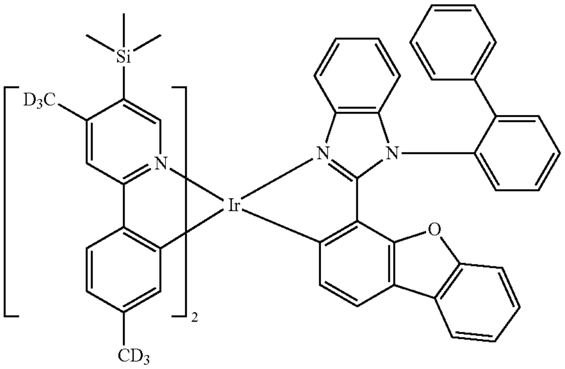
515
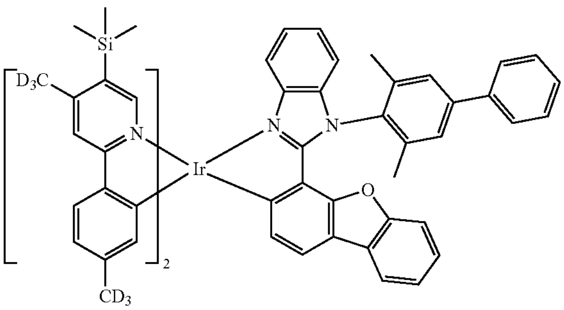
516
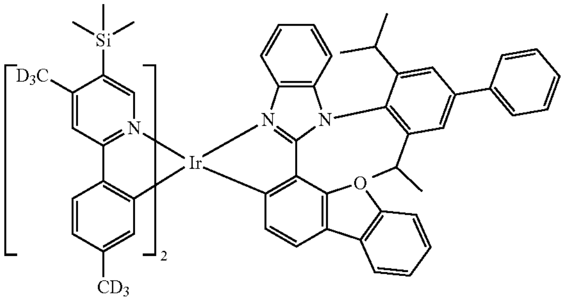
-continued
517
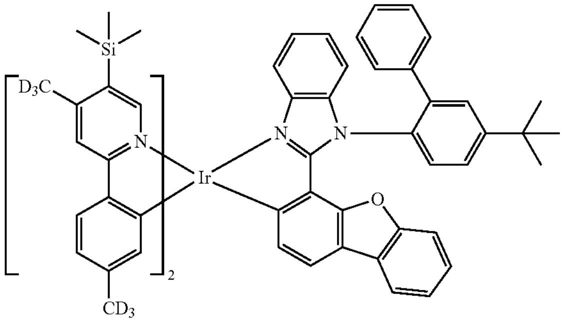
518
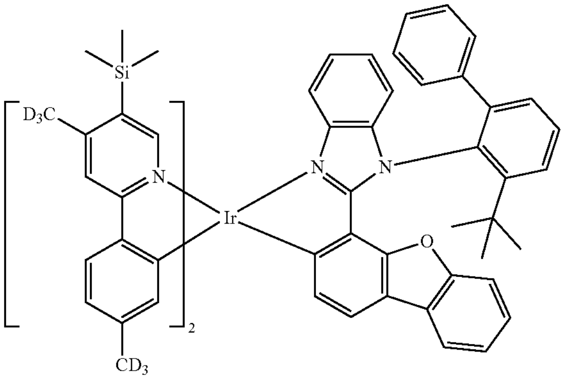
519
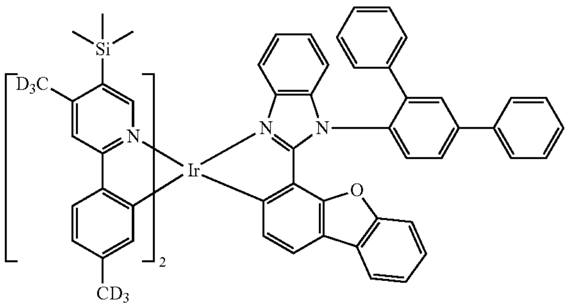
520
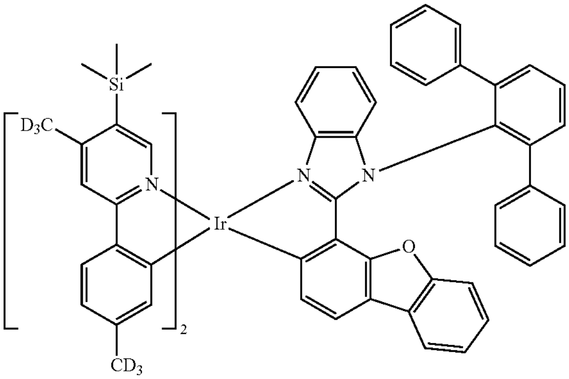

-continued
521
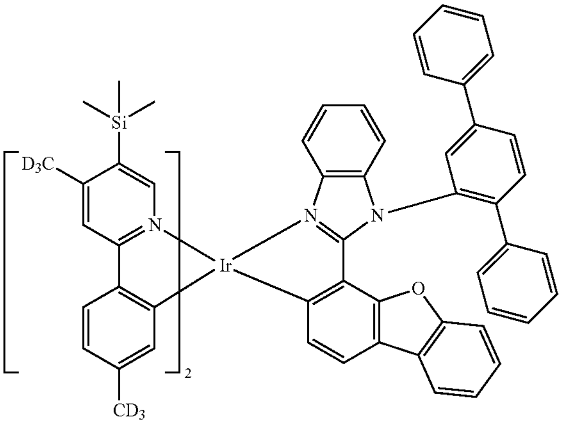
522
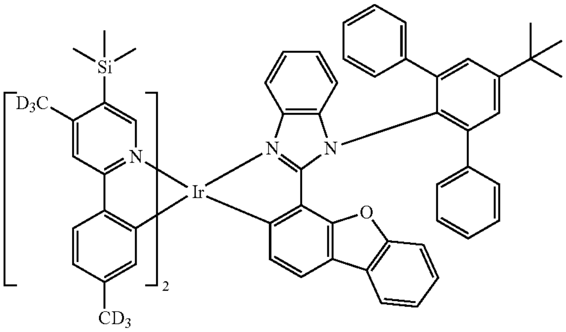
523
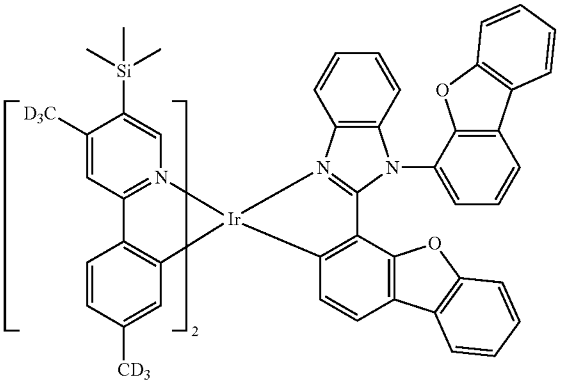
524
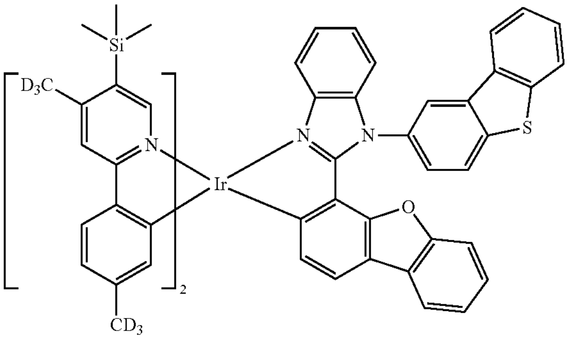
-continued
525
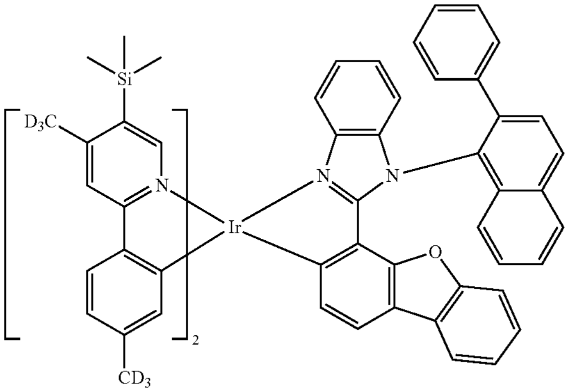
526
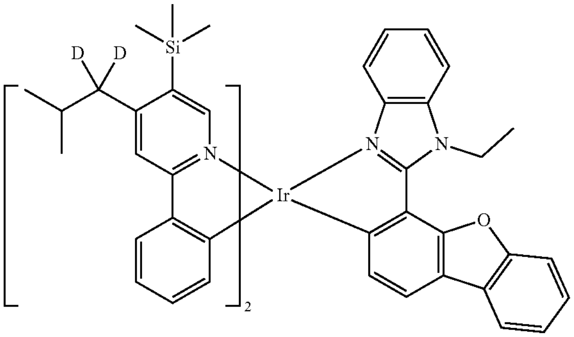
527
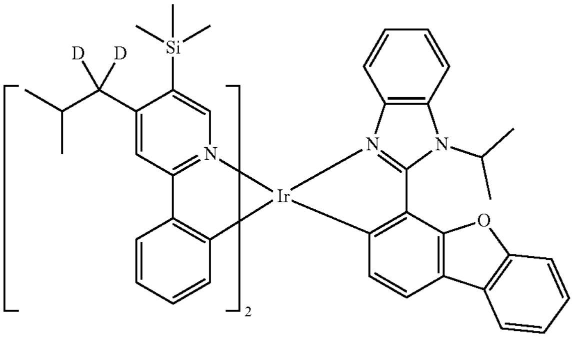
528
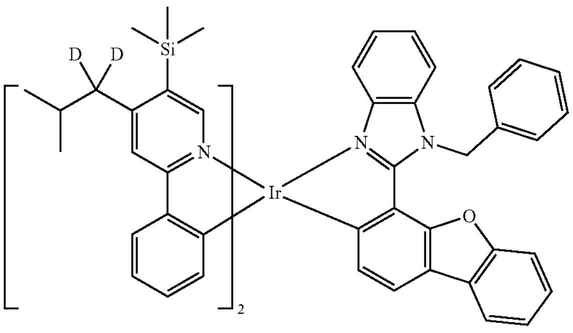

-continued
529
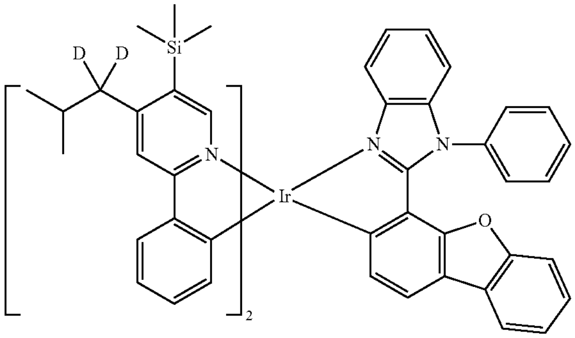
530
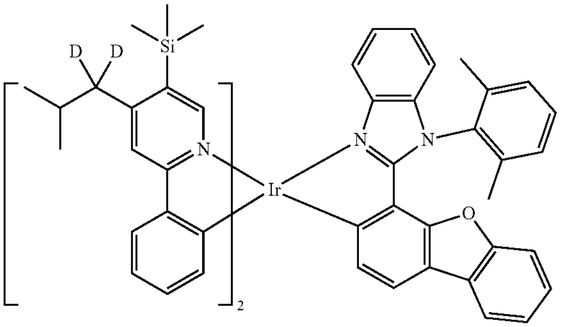
531
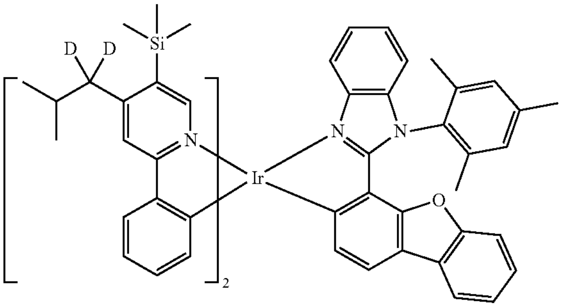
532
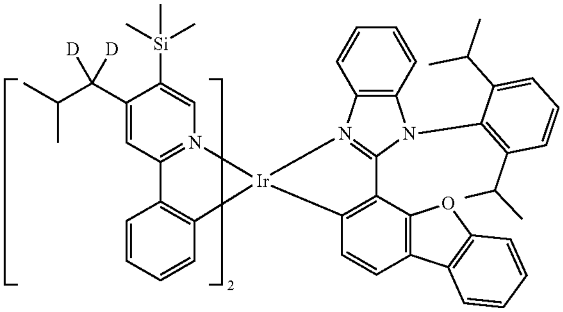
-continued
533
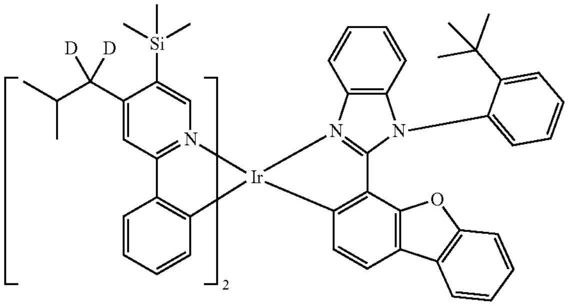
534
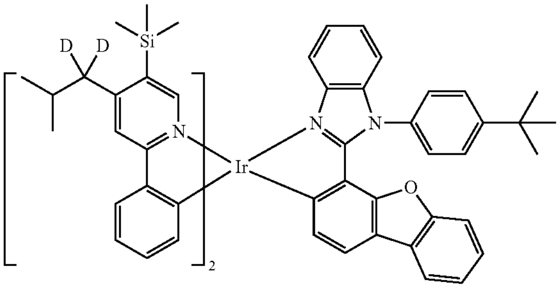
535
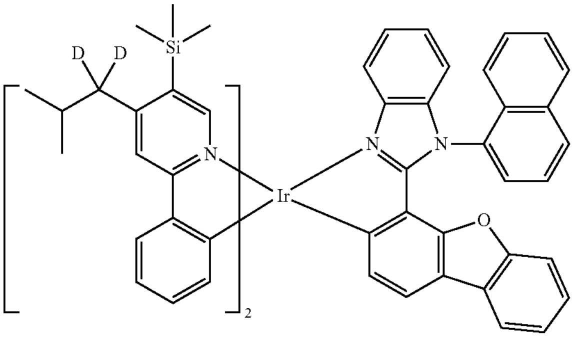
536
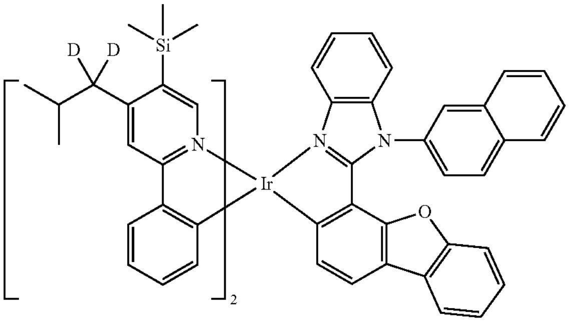

-continued
537
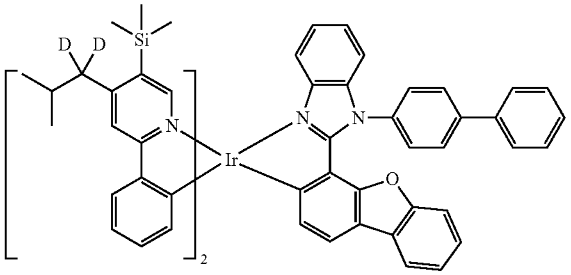
538
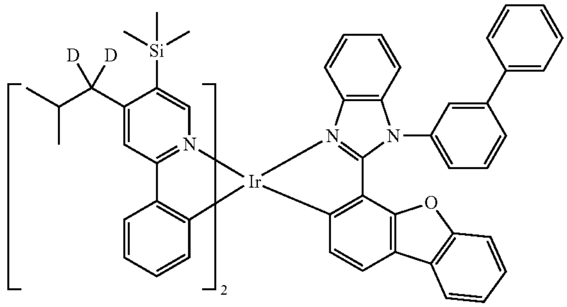
539
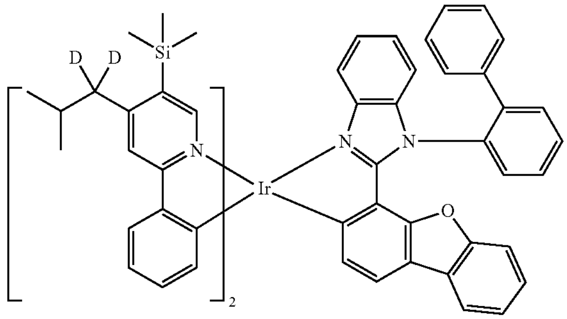
540
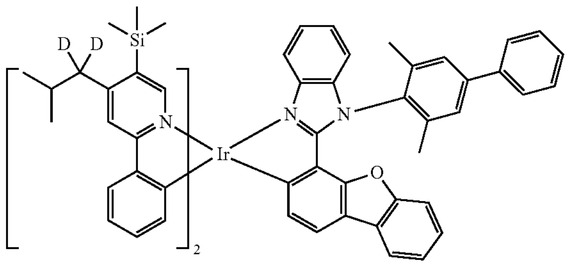
541
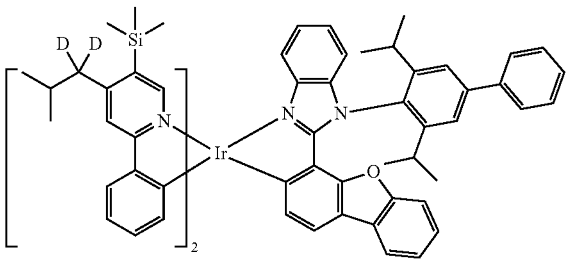
-continued
542
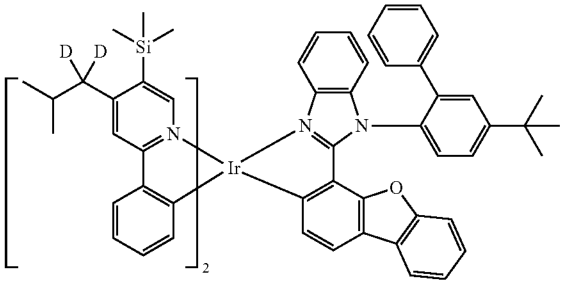
543
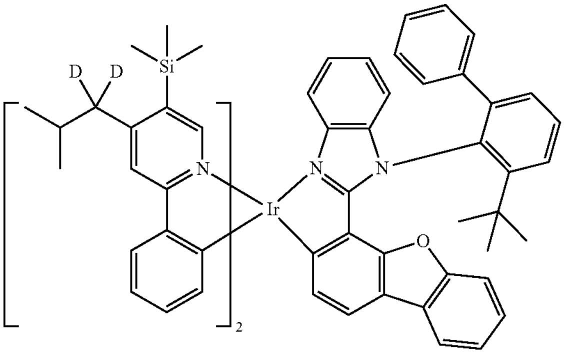
544
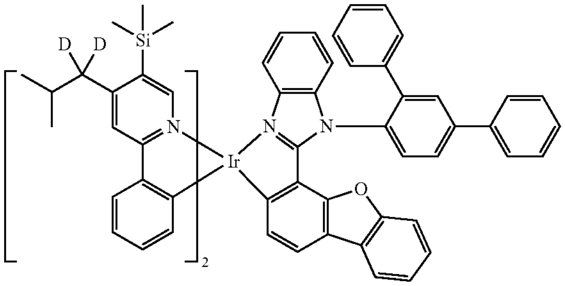
545
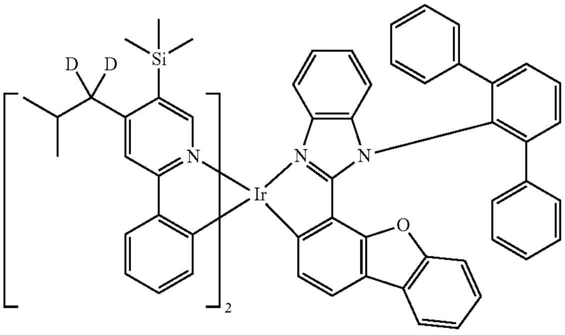

-continued
546
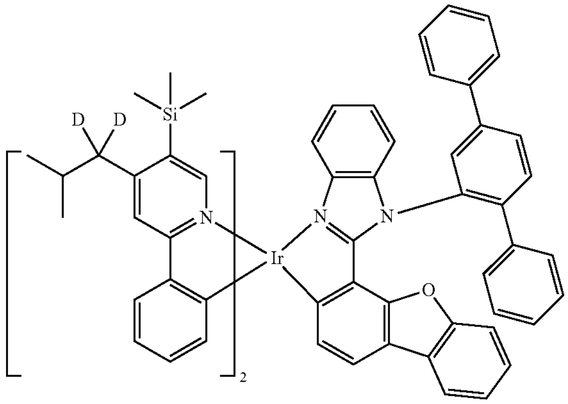
547
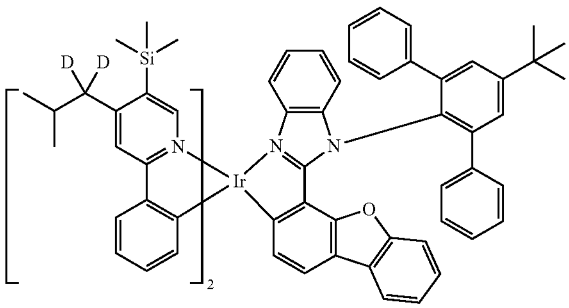
548
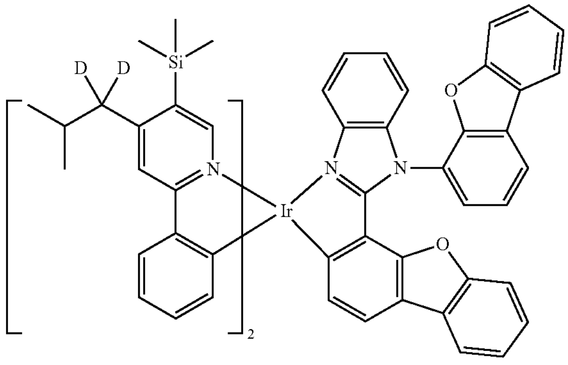
549
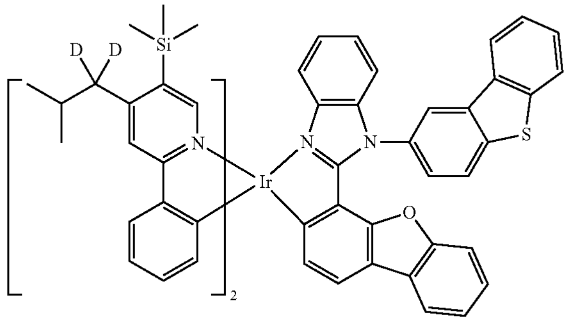
-continued
550
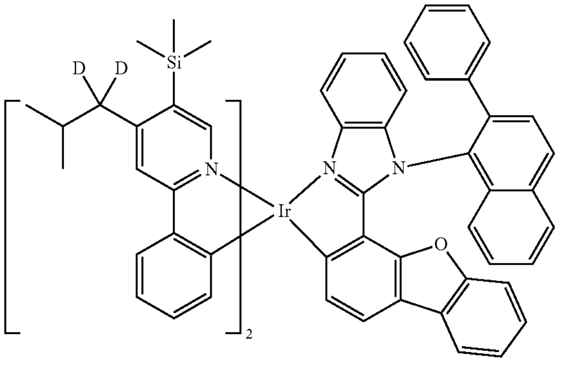
551
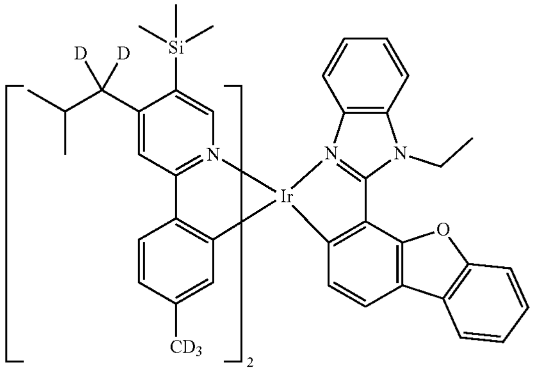
552
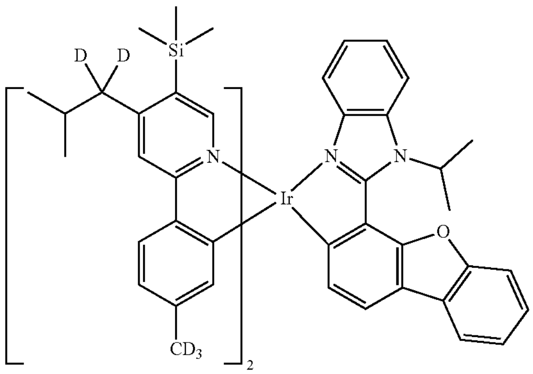
553
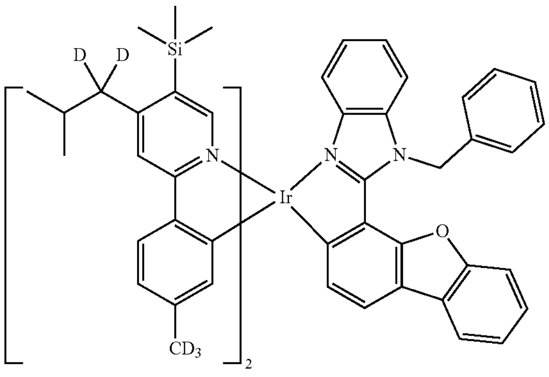

-continued
554
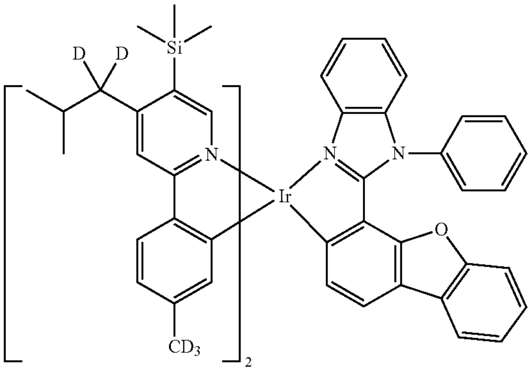
555
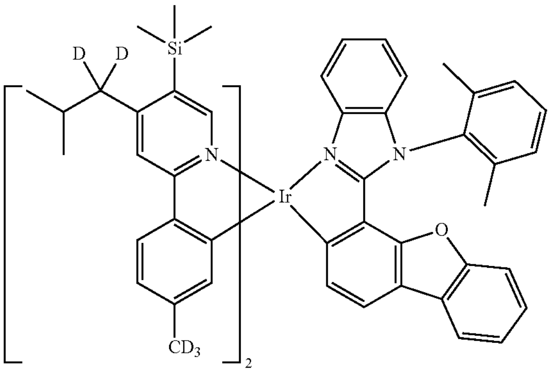
556
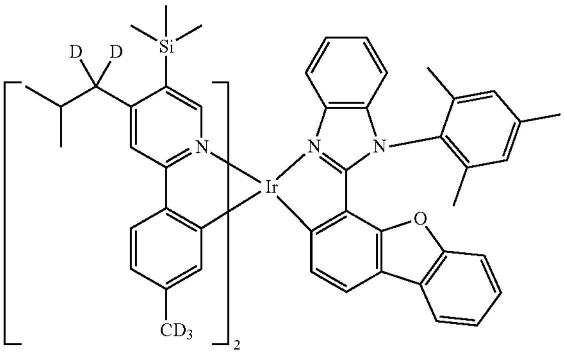
557
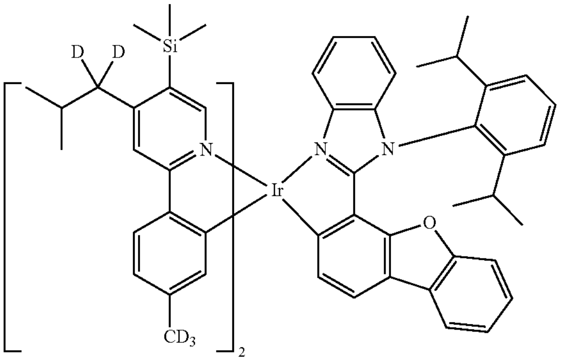
-continued
558
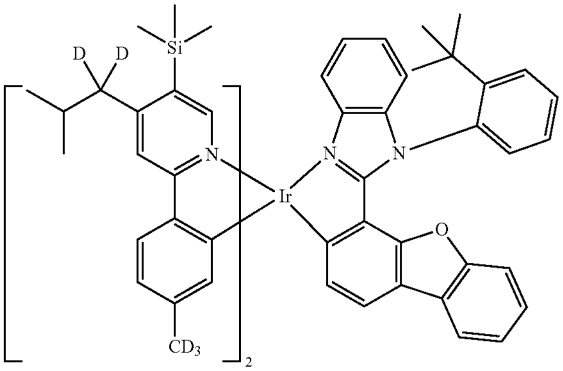
559
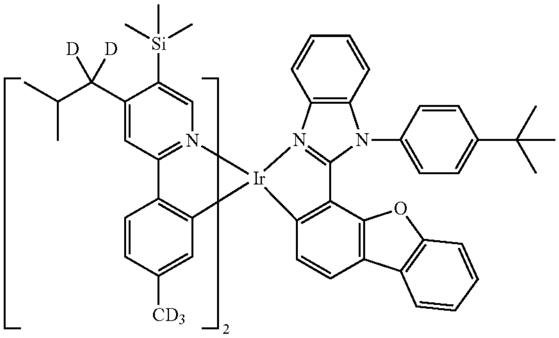
560
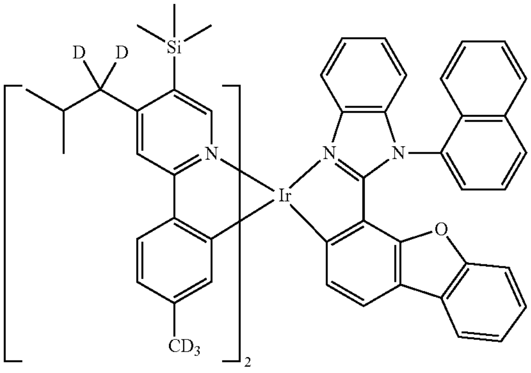
561
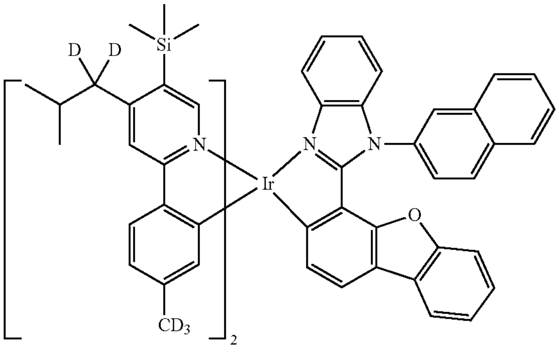

-continued
562
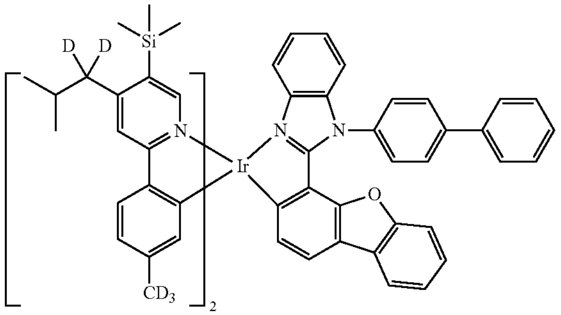
563
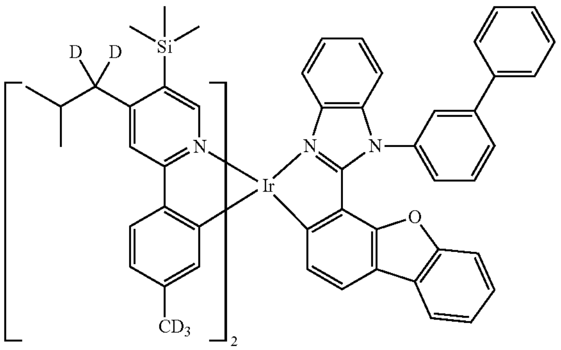
564
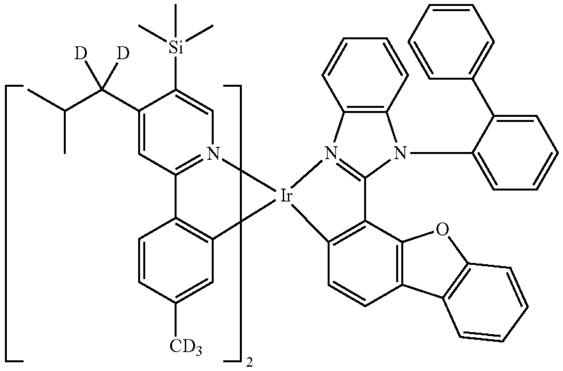
565
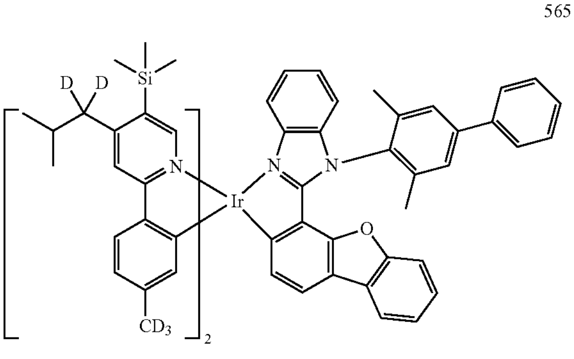
-continued
566
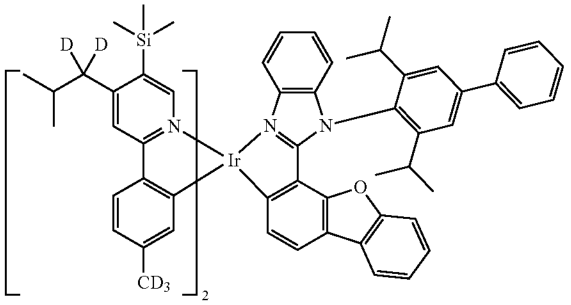
567
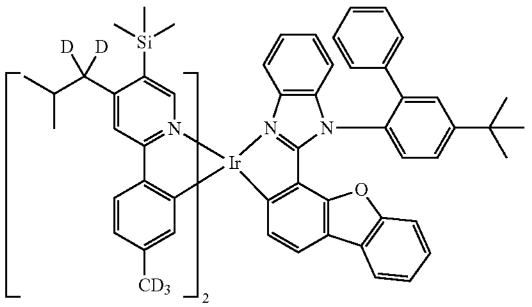
568
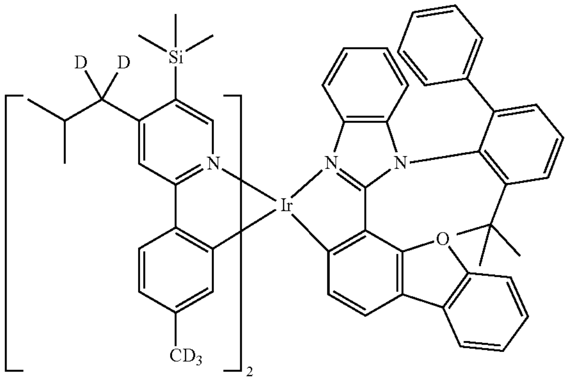
569
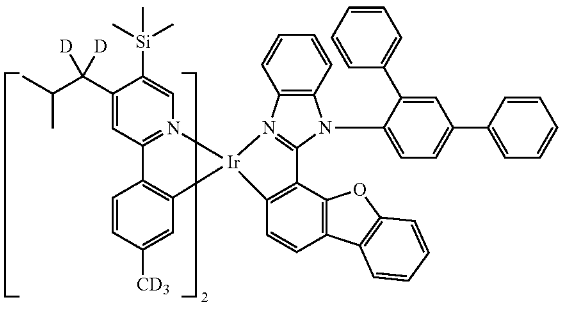

-continued
570
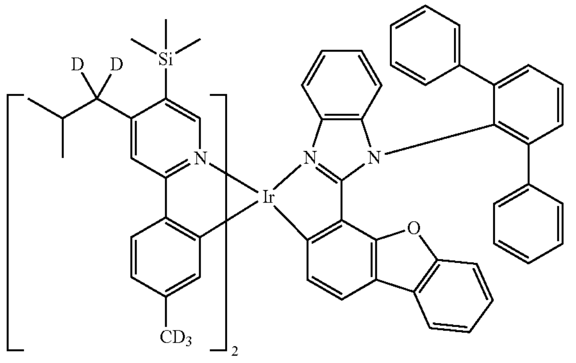
571
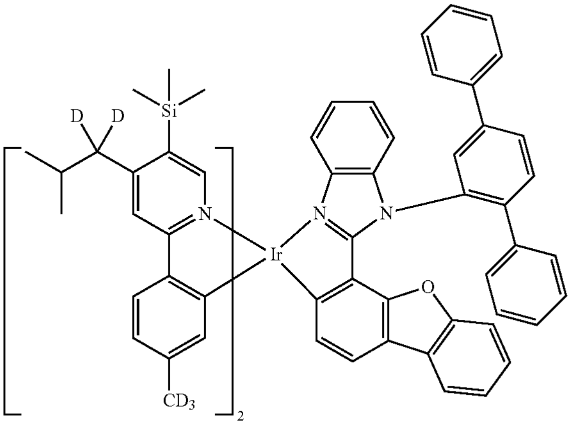
572
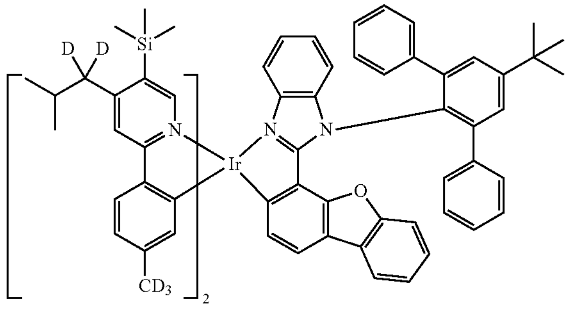
573
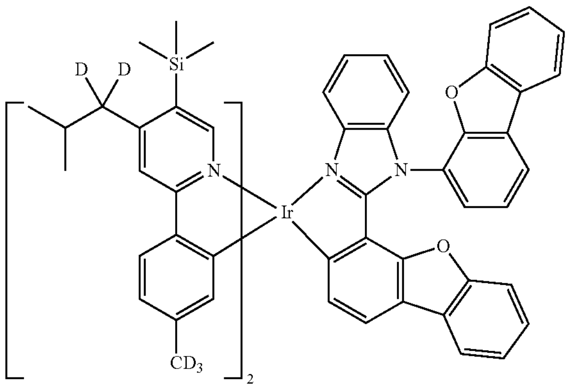
-continued
574
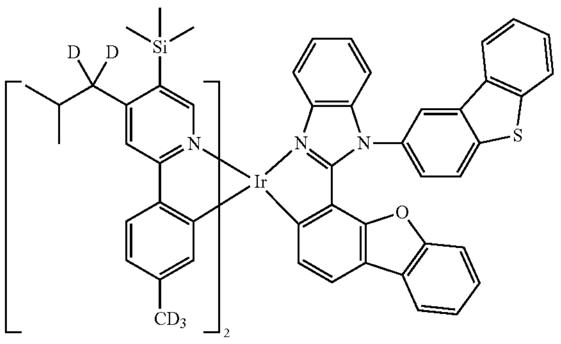
575
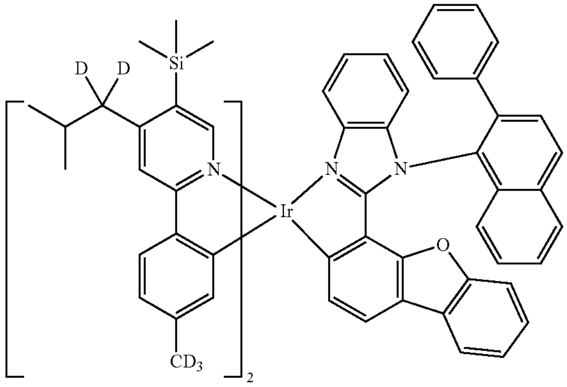
576
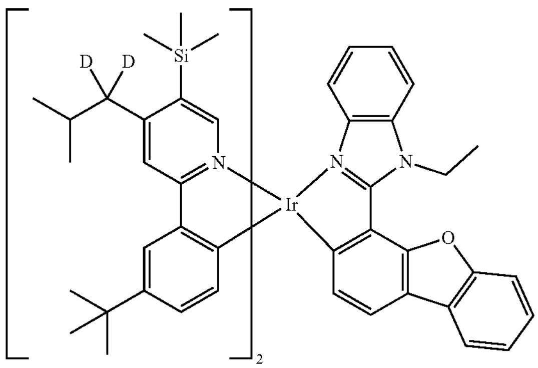
577
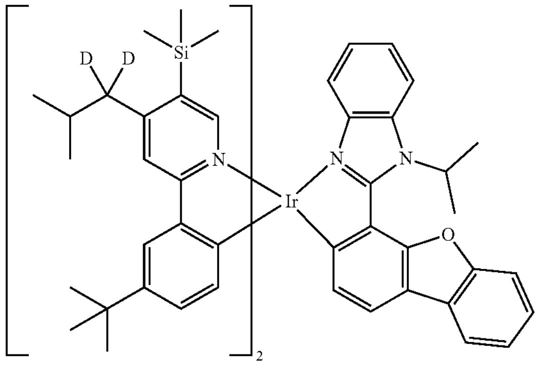

578
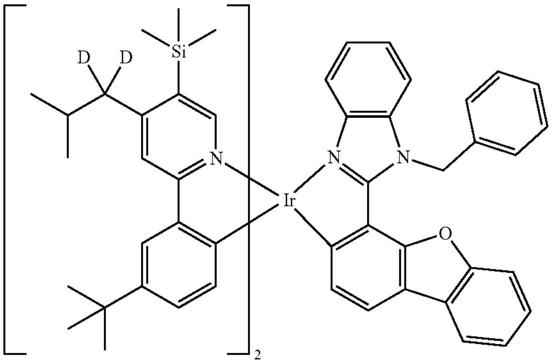
579
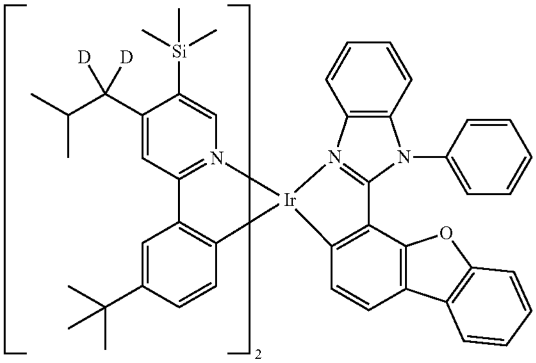
580
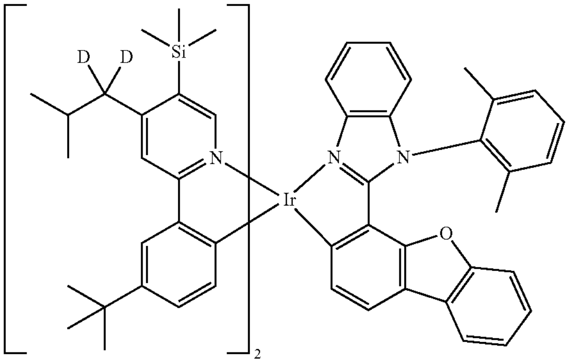
581
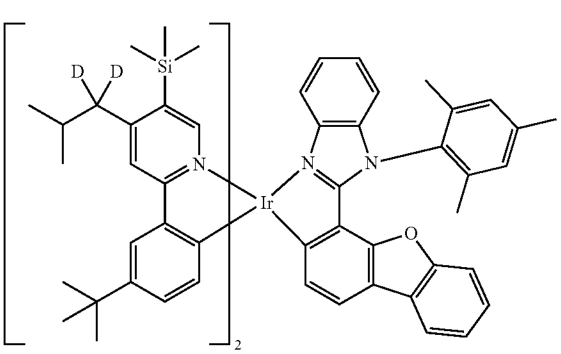
582
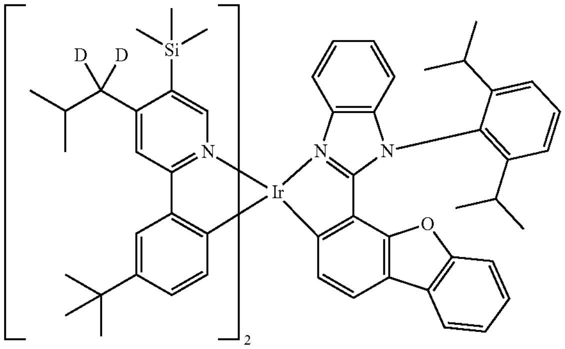
583
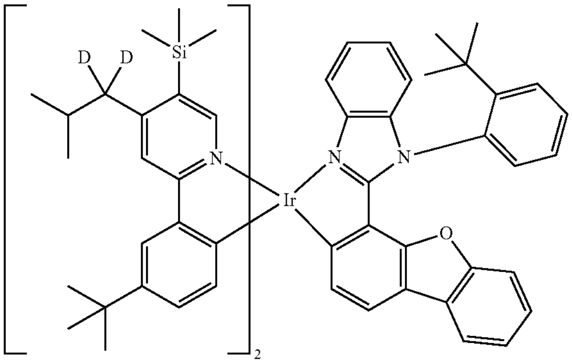
584
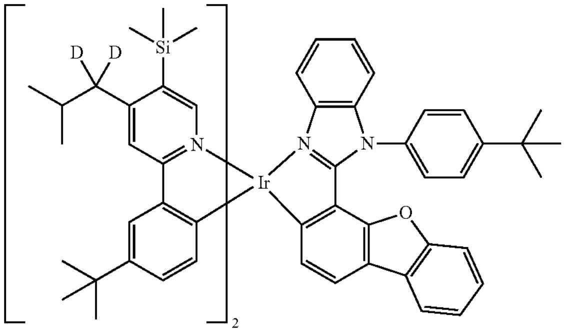
585
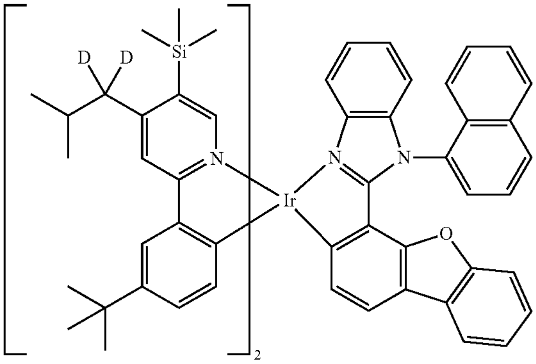

-continued
586
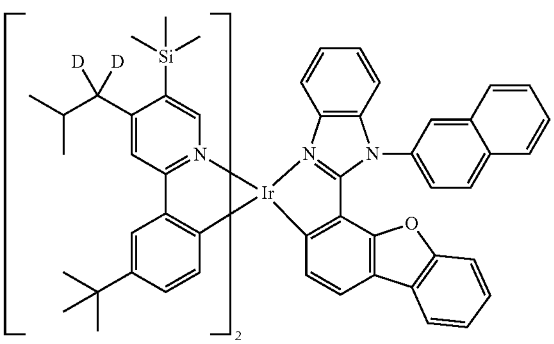
587
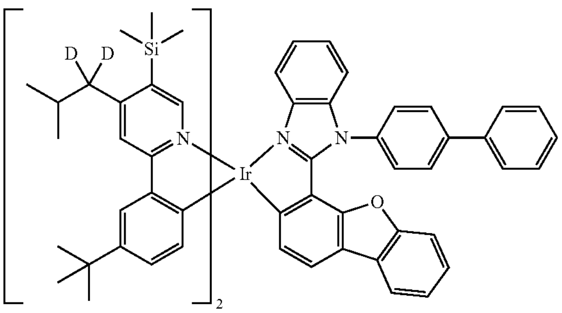
588
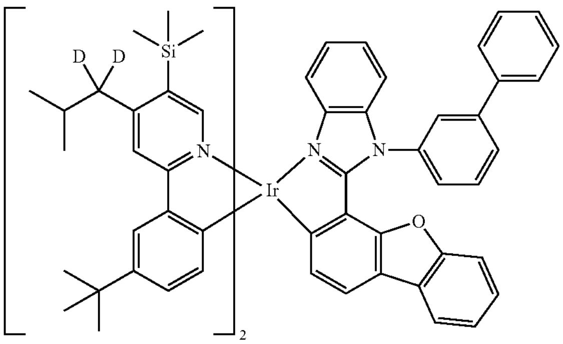
589
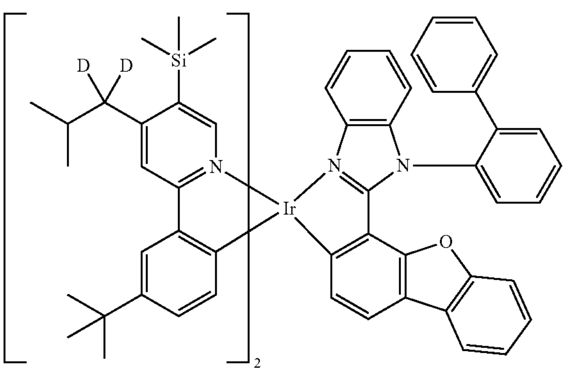
590
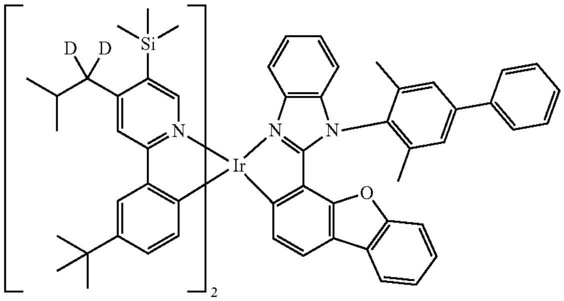
591
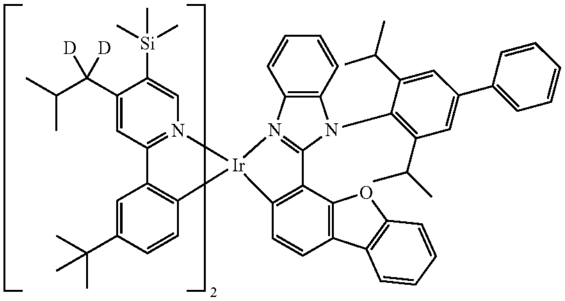
592
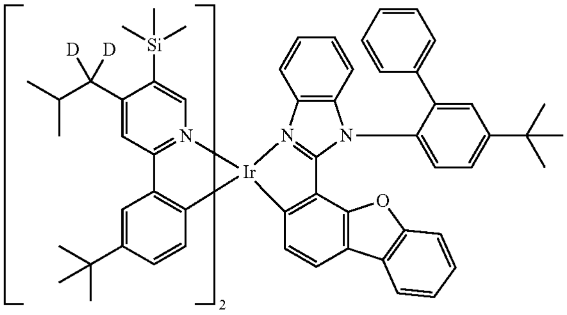
593
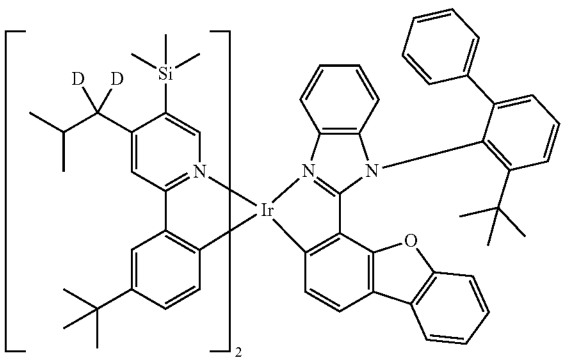

-continued
594
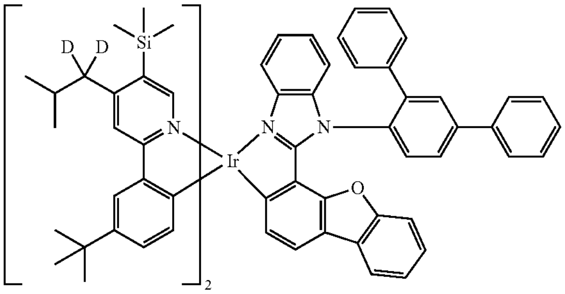
595
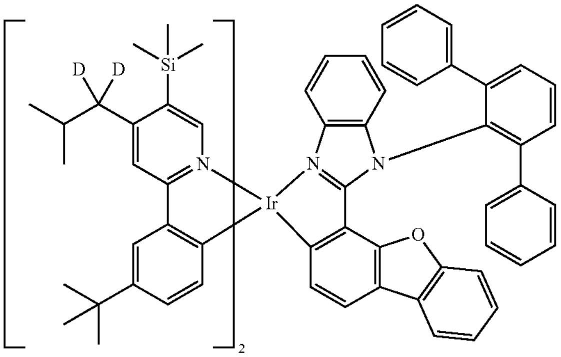
596
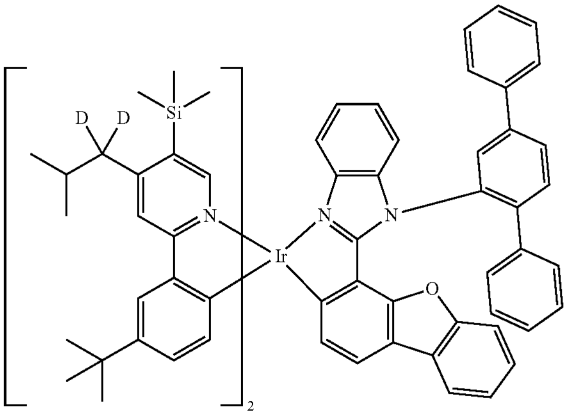
597
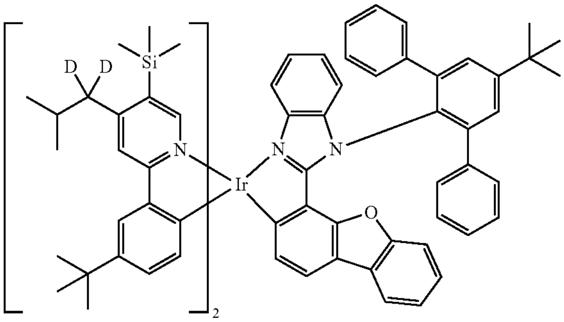
-continued
598
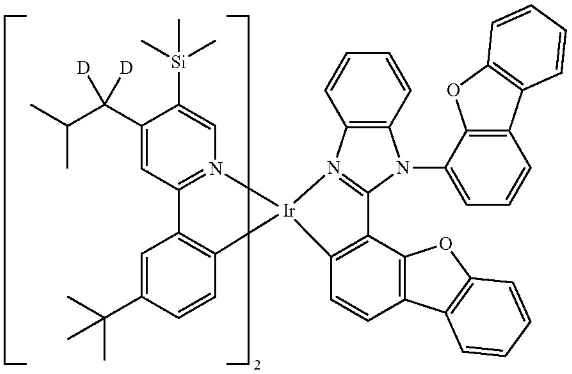
599
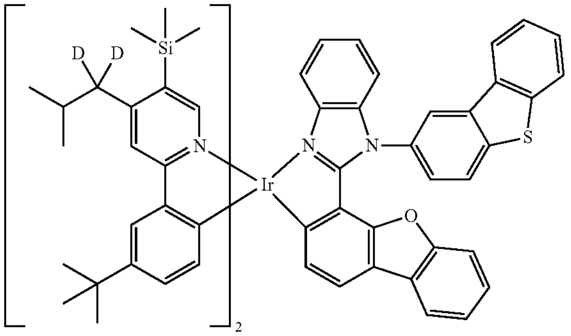
600
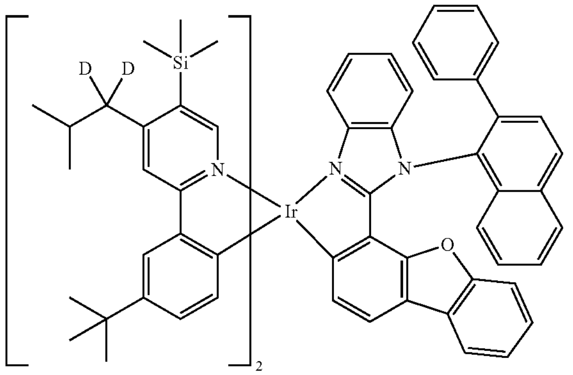
601
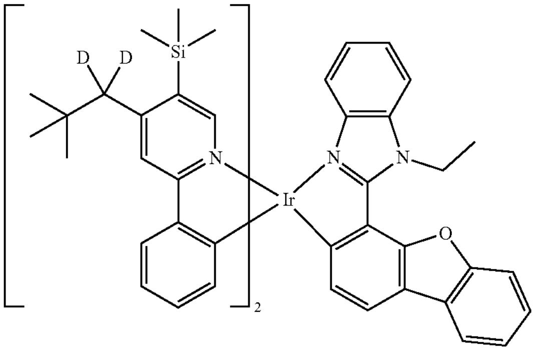

602
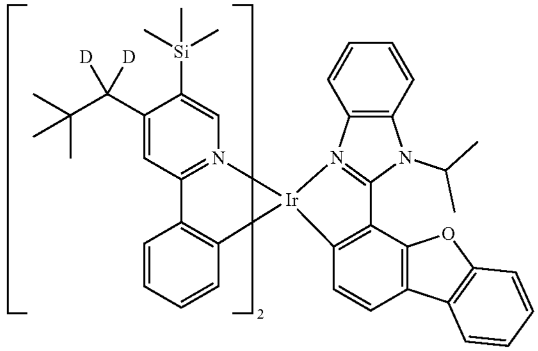
603
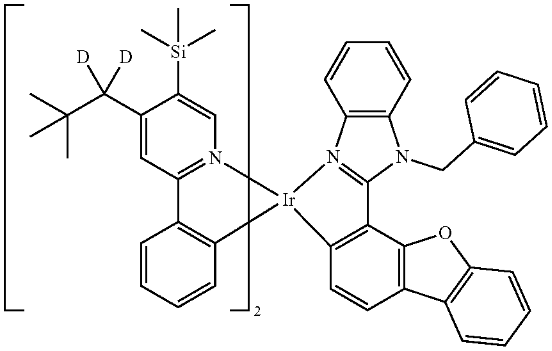
604
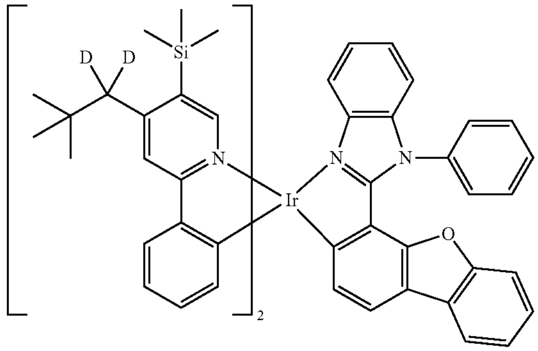
605
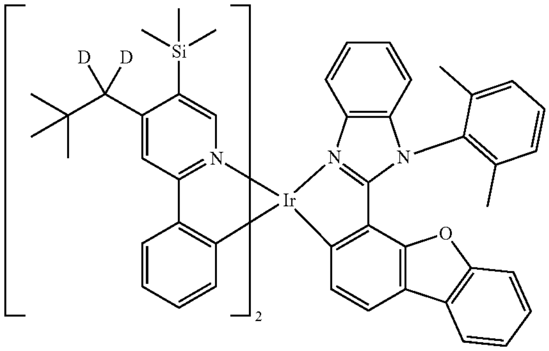
606
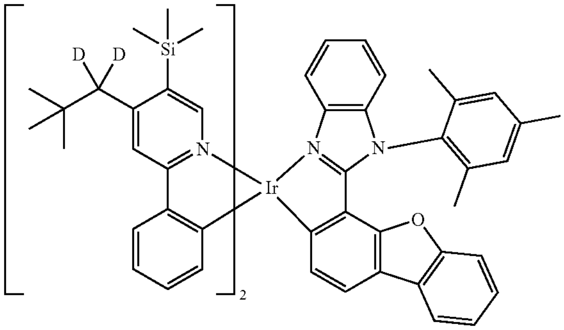
607
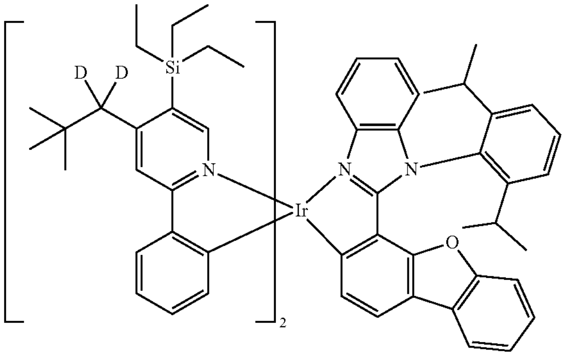
608
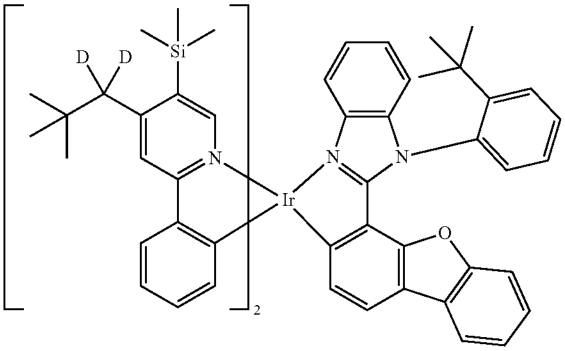
609
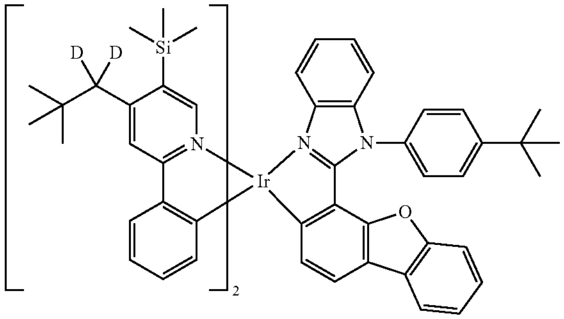

-continued
610
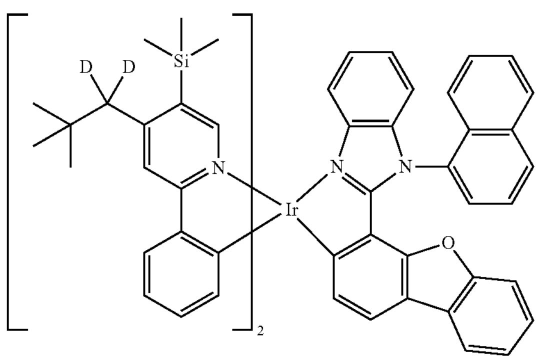
611
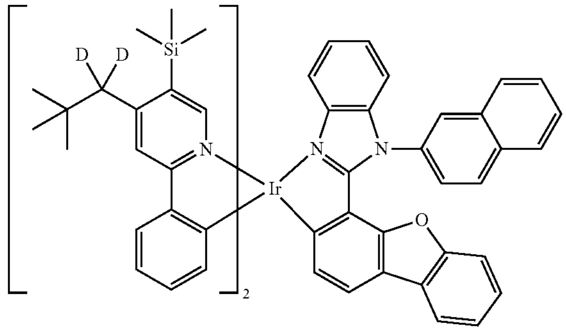
612
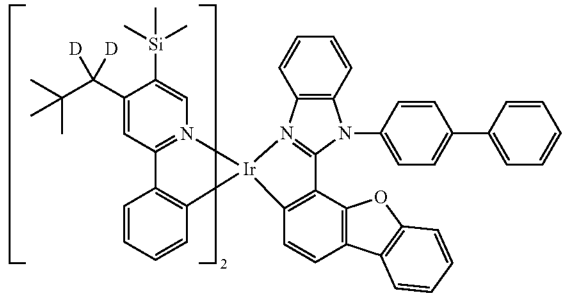
613
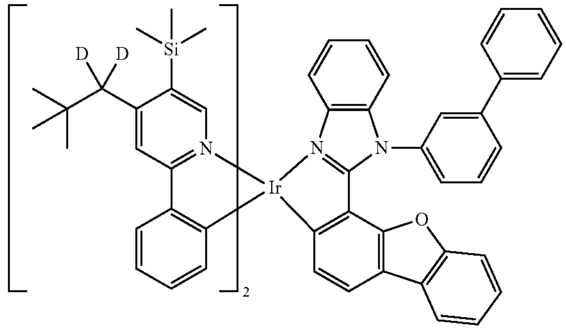
-continued
614
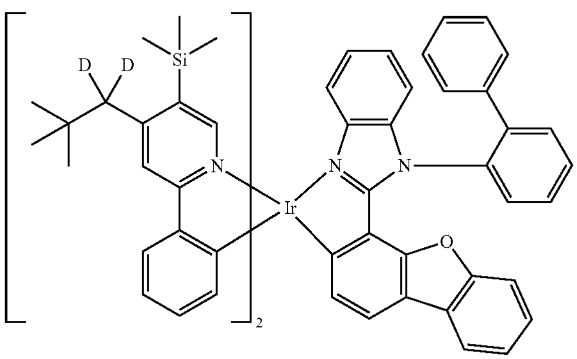
615
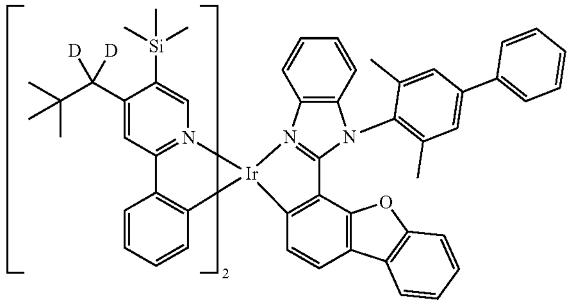
616
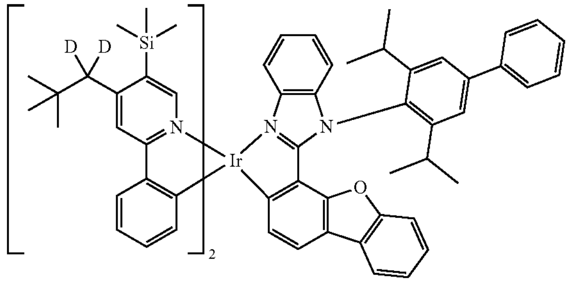
617
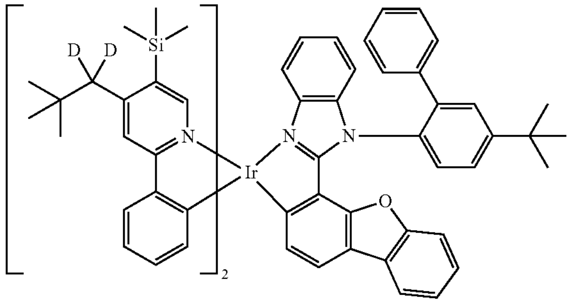

-continued
618
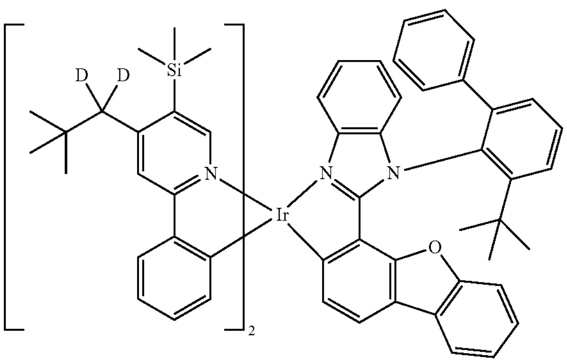
619
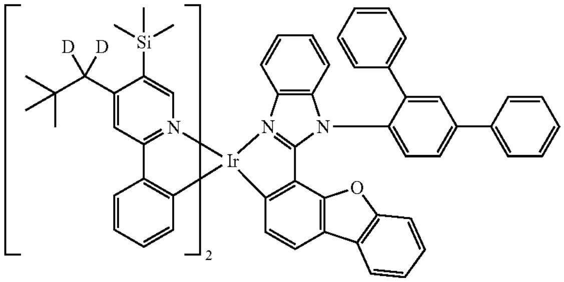
620
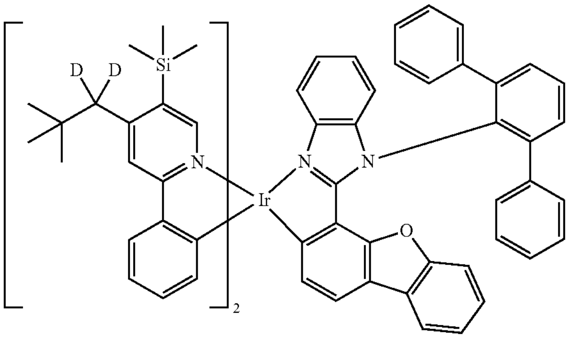
621
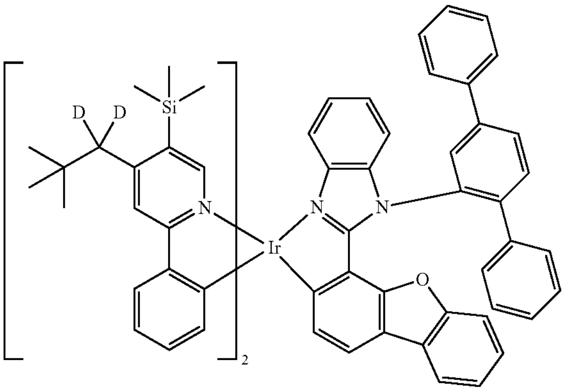
-continued
622
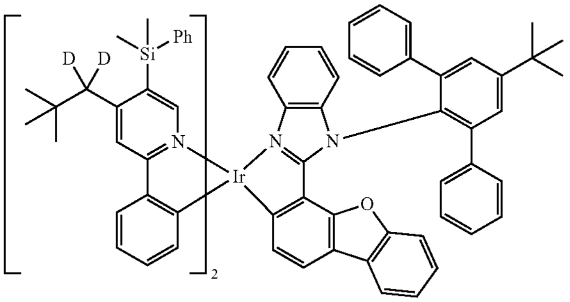
623
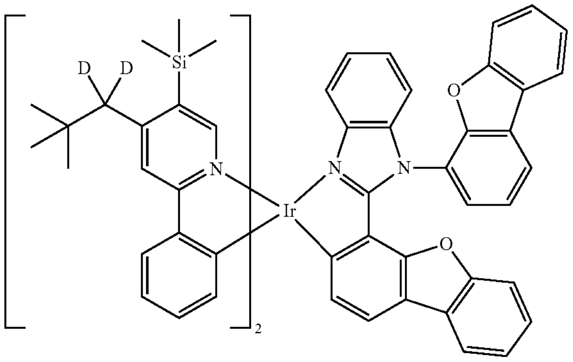
624
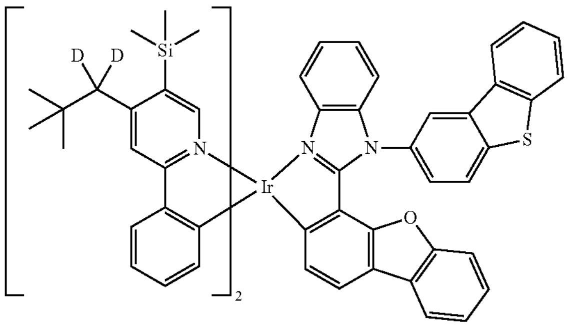
625
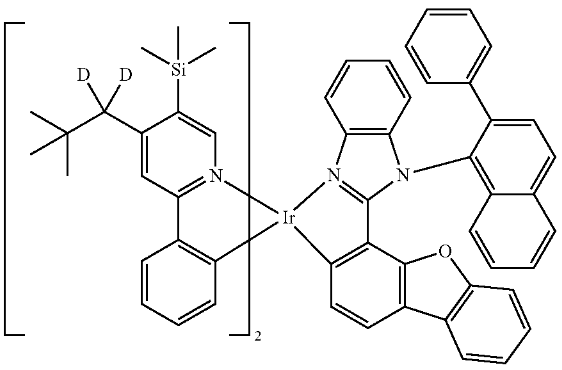

-continued
626
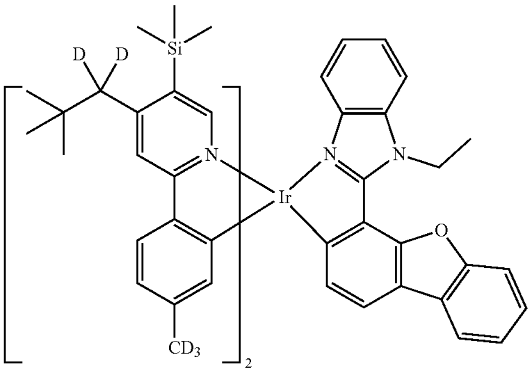
627
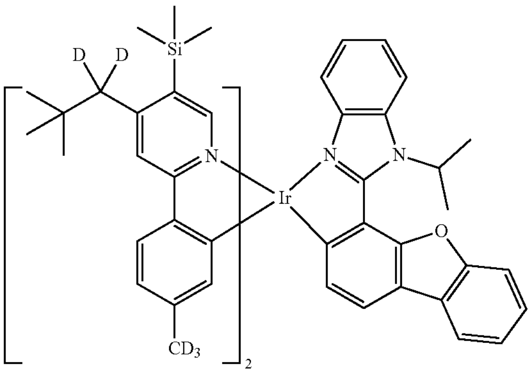
628
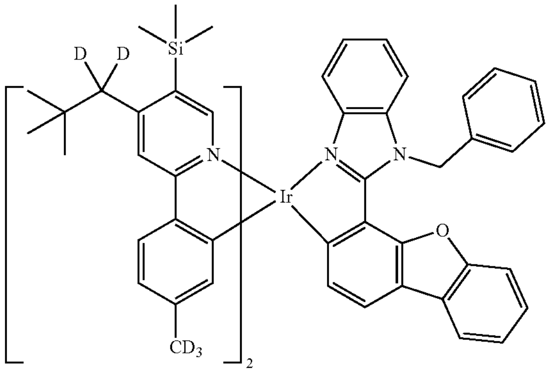
629
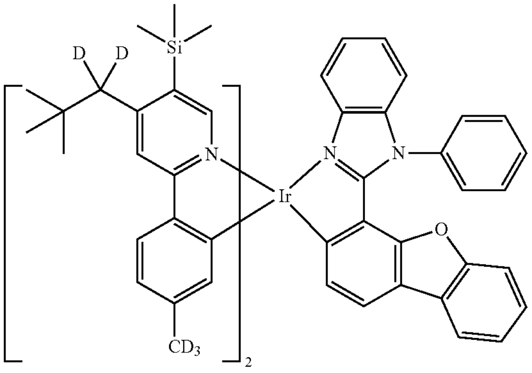
-continued
630
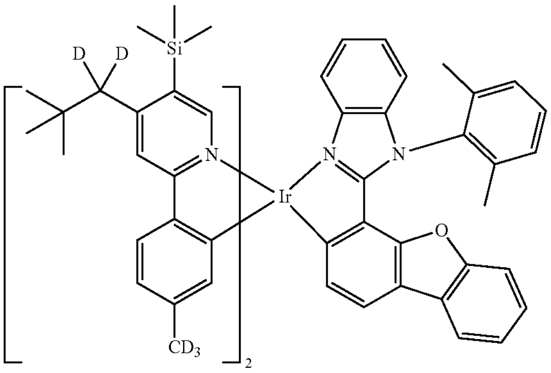
631
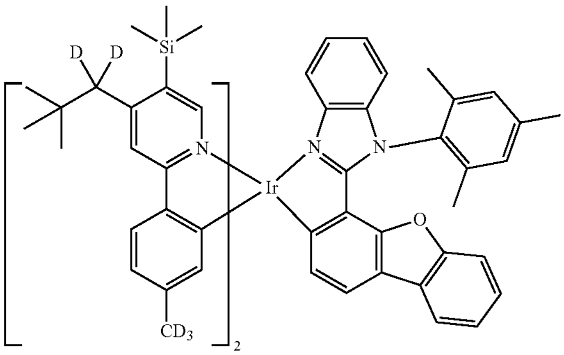
632
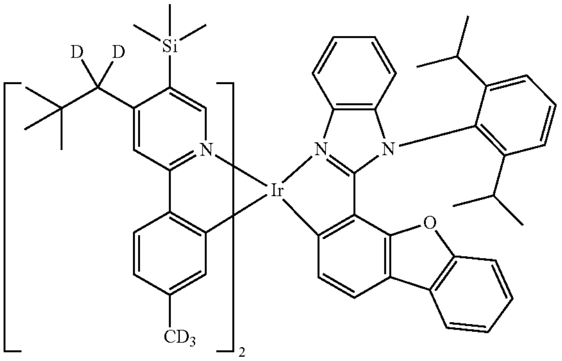
633
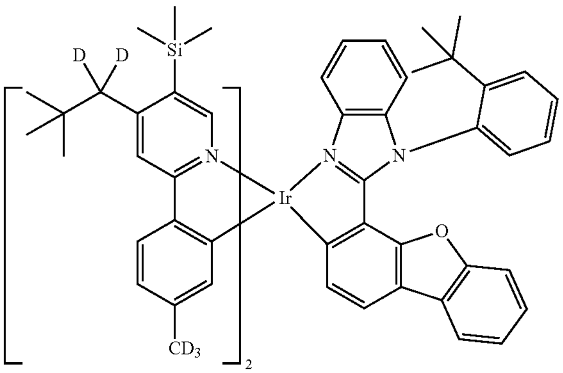

-continued
634
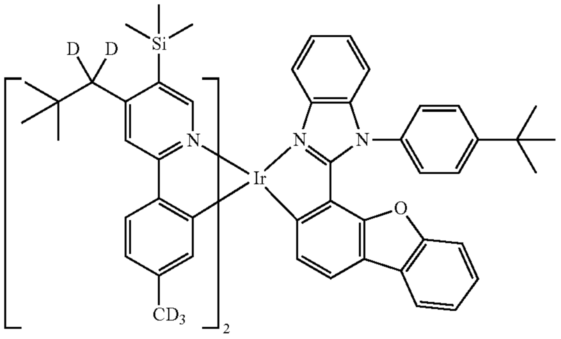
635
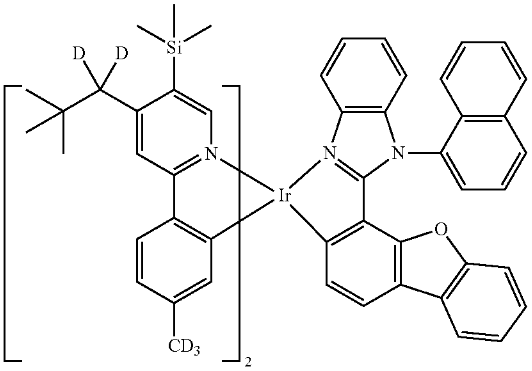
636
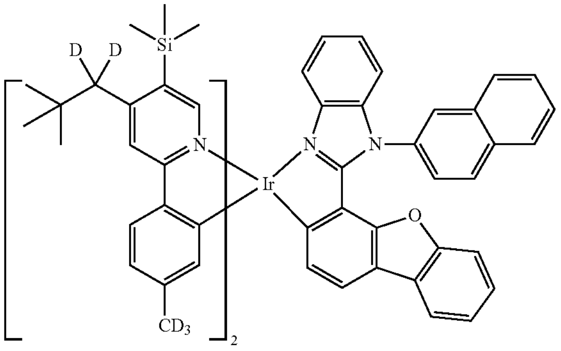
637
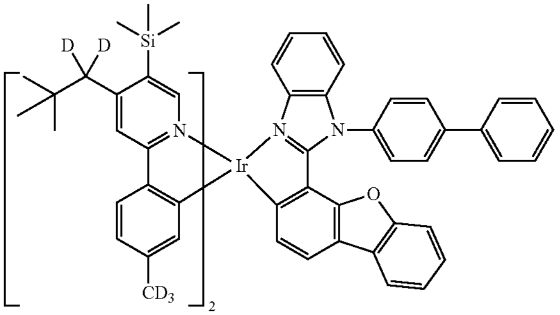
-continued
638
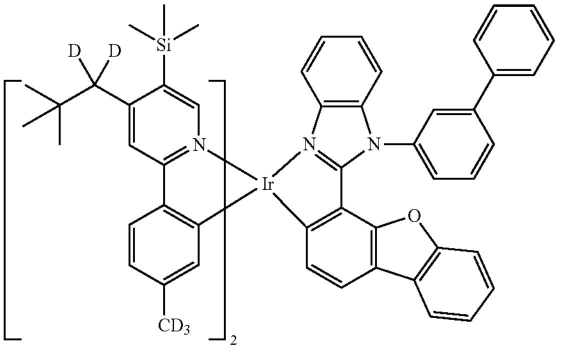
639
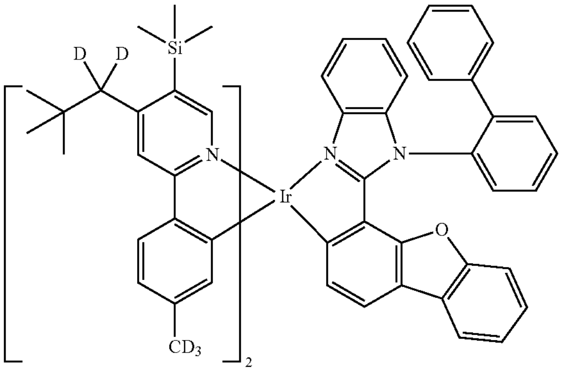
640
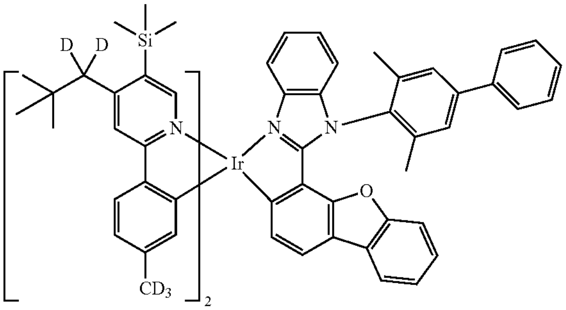
641
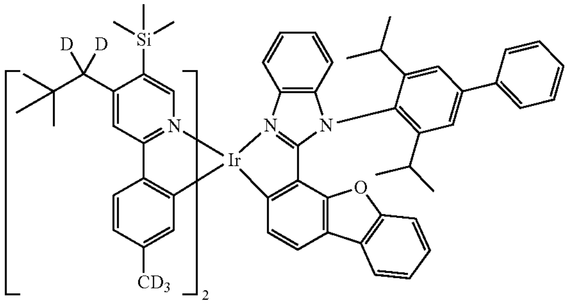

-continued
642
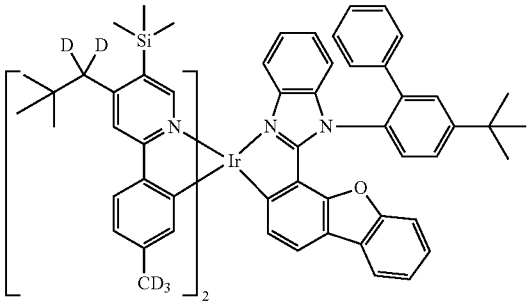
643
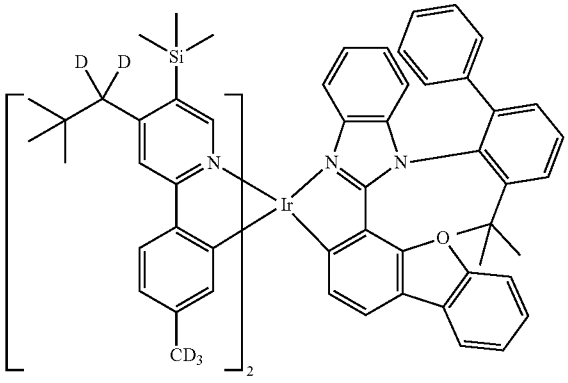
644
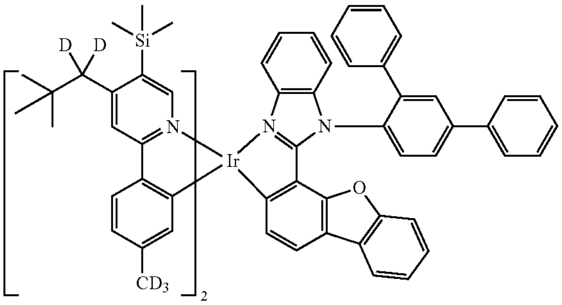
645
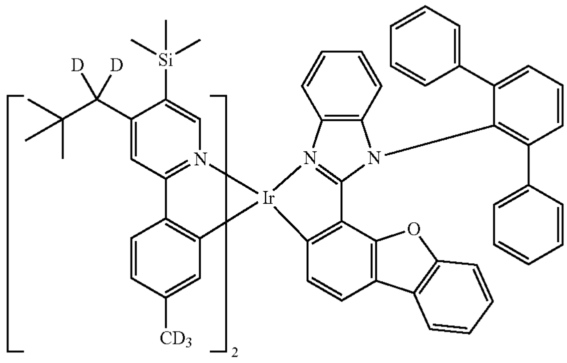
-continued
646
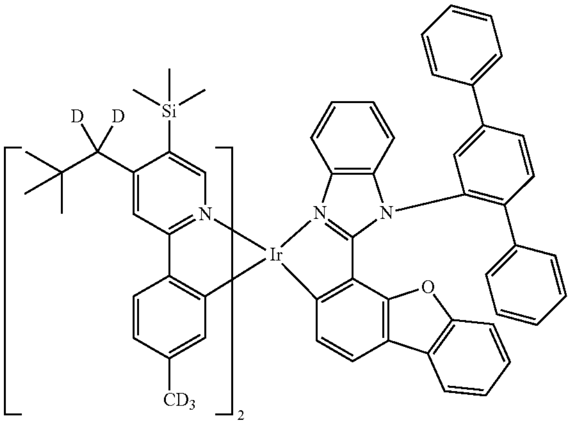
647
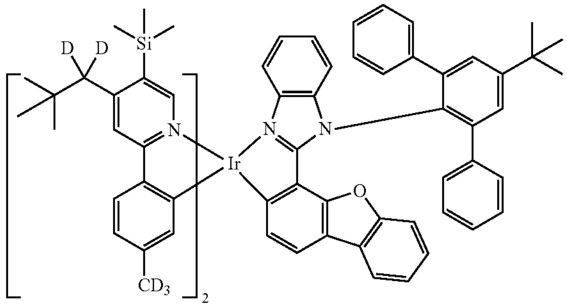
648
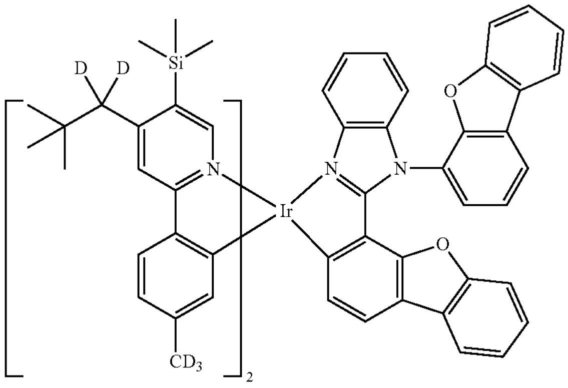
649
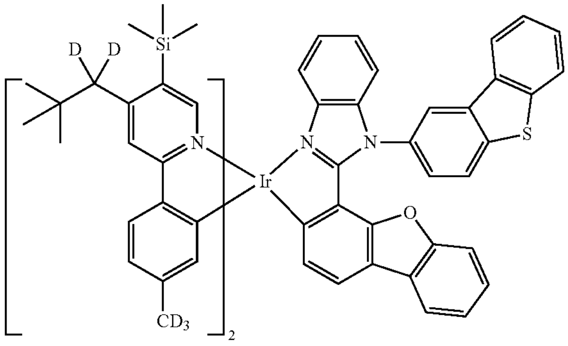

650
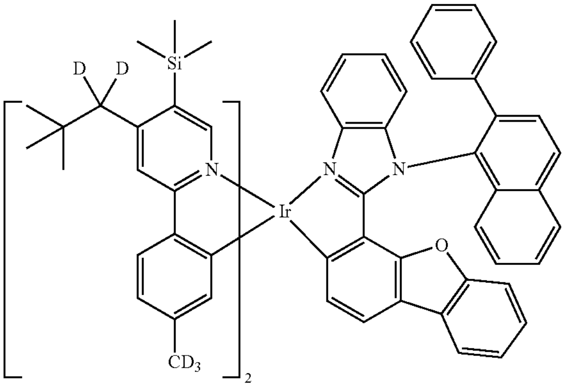
651
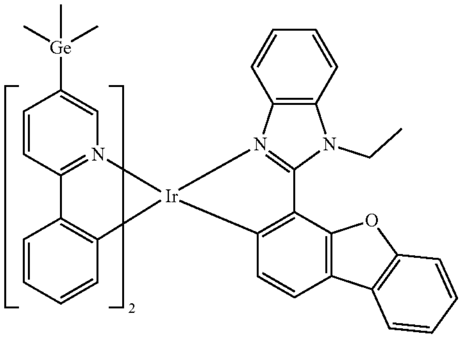
652
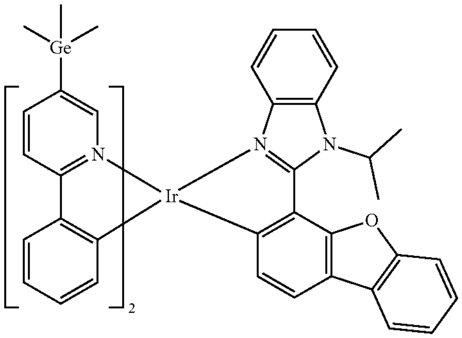
653
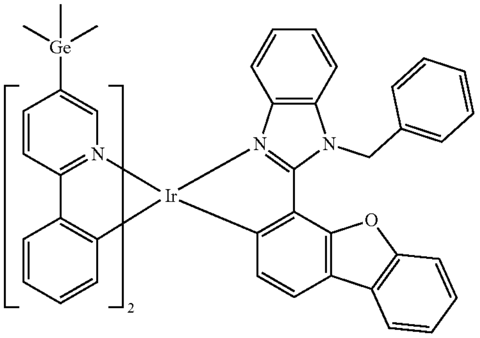
654
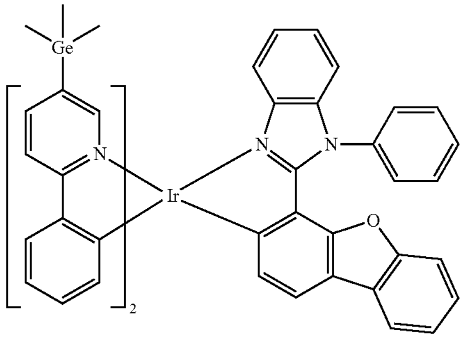
655
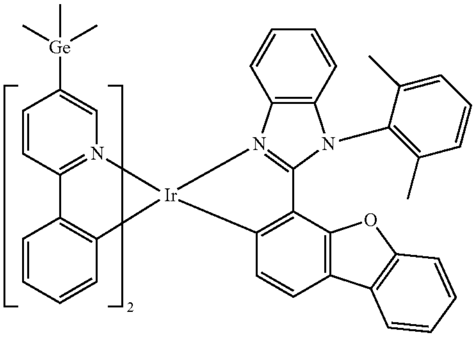
656
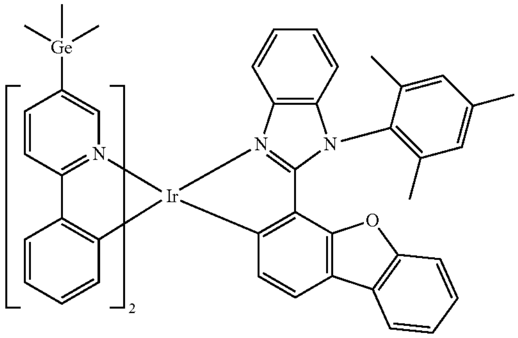
657
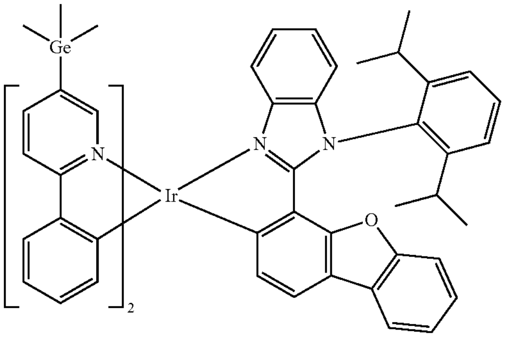

-continued
658
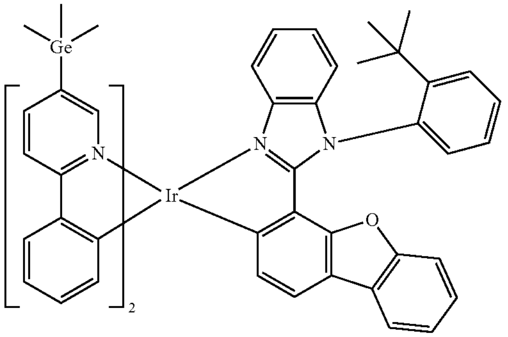
659
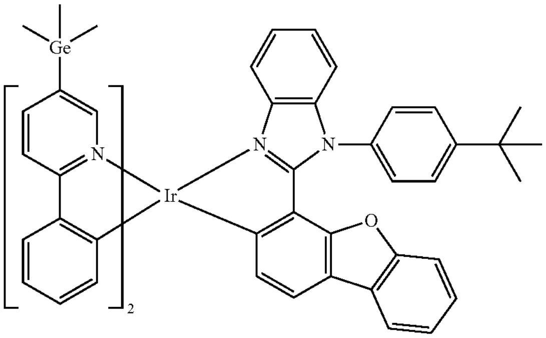
660
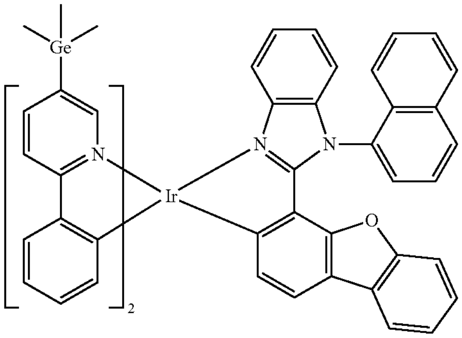
661
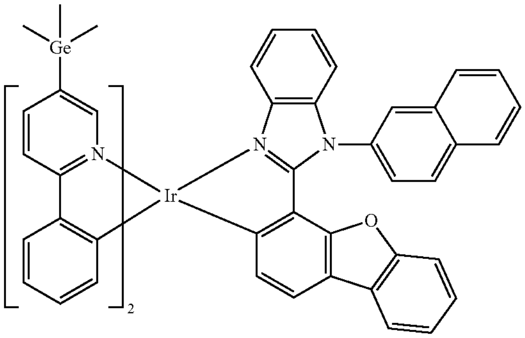
-continued
662
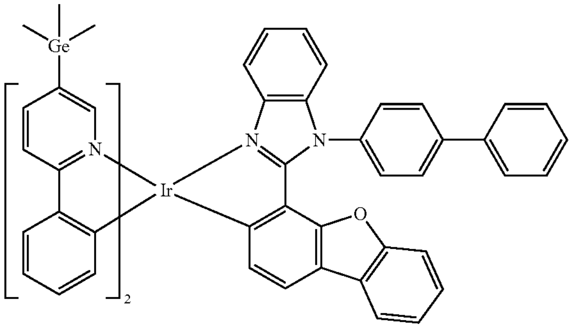
663
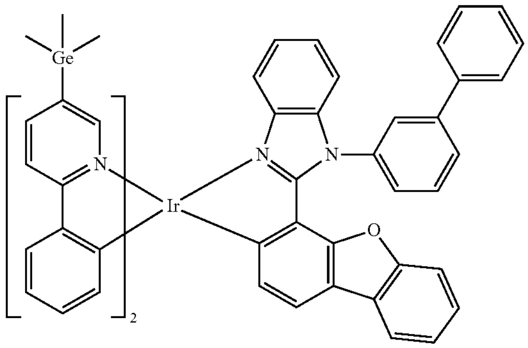
664
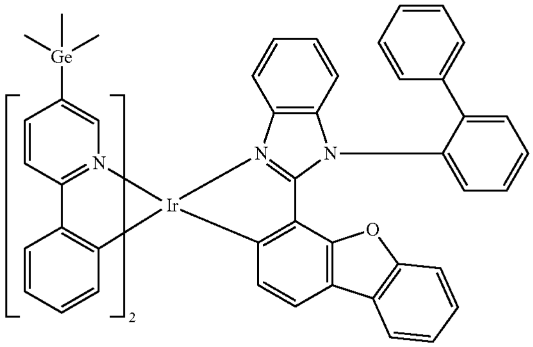
665
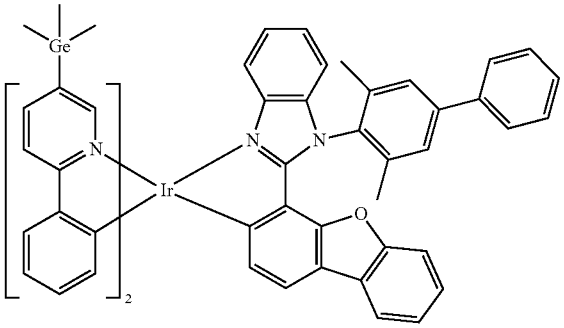

-continued
666
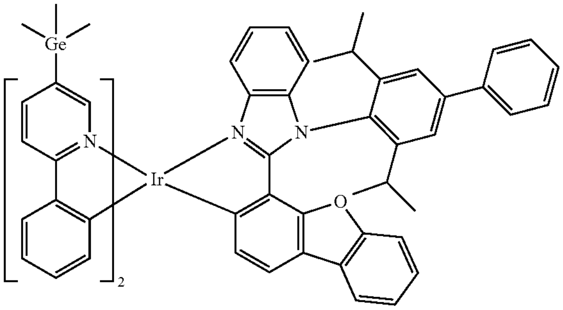
667
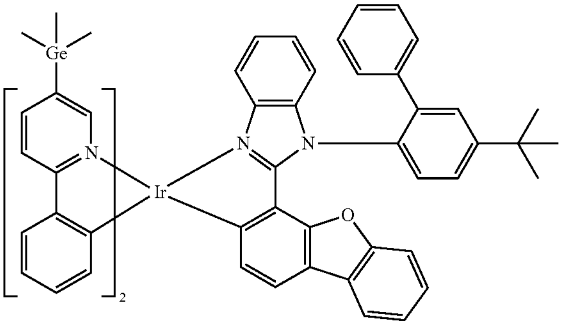
668
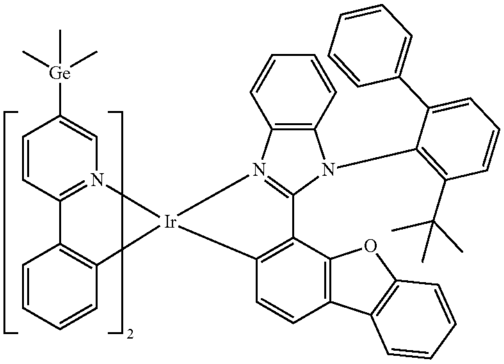
669
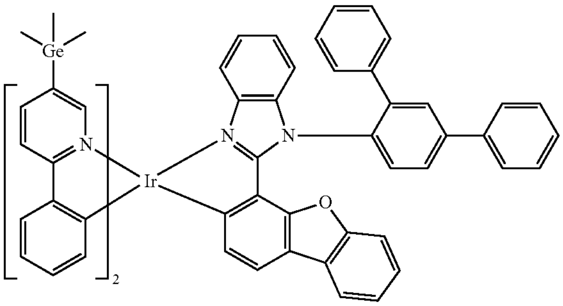
-continued
670
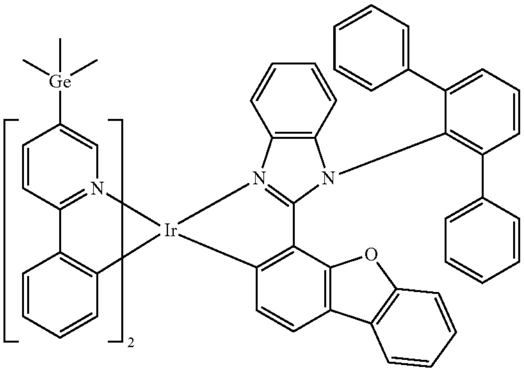
671
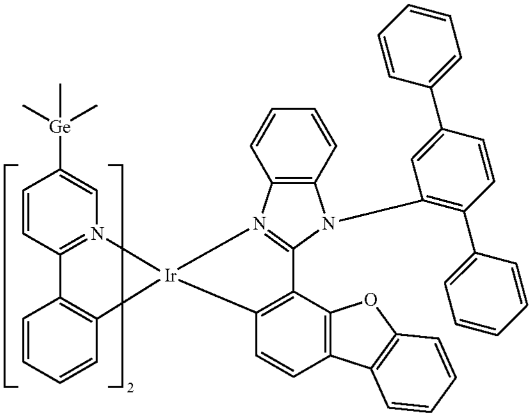
672
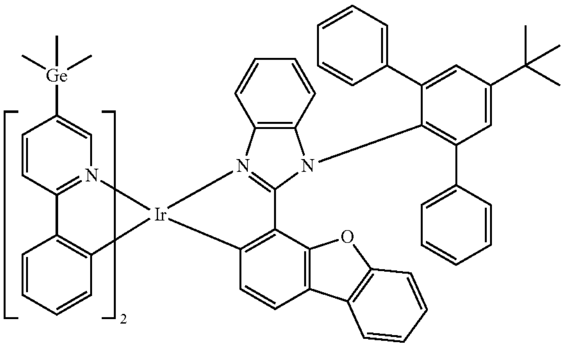
673
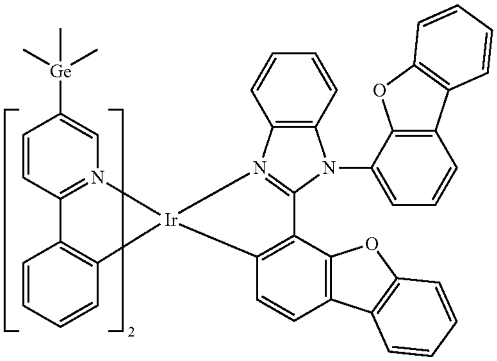

674
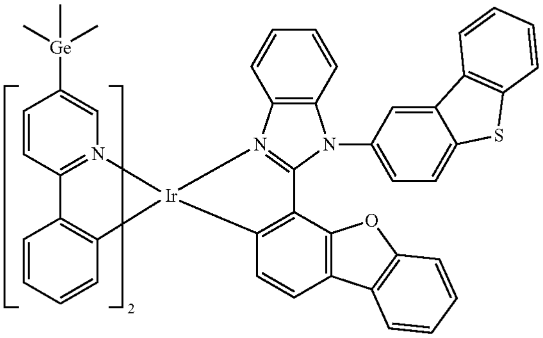
675
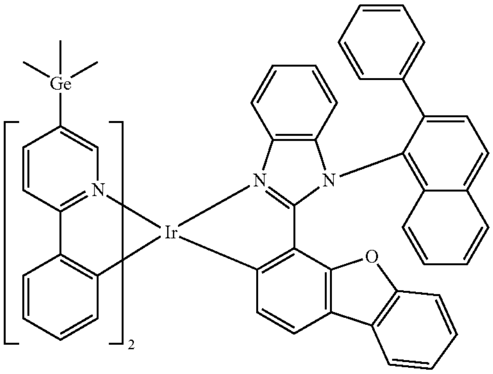
676
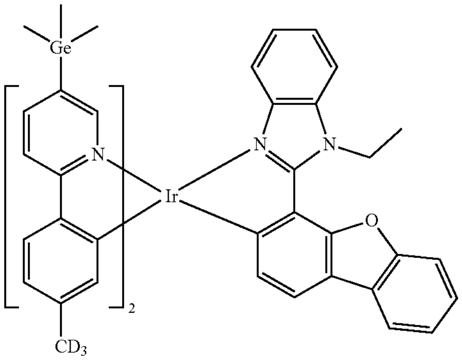
677
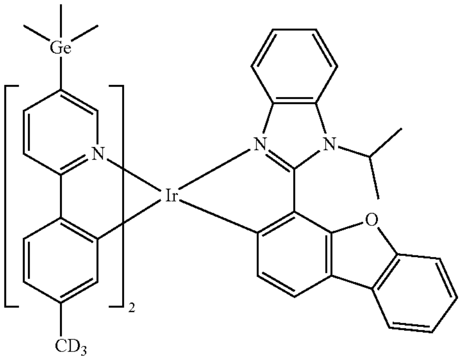
678
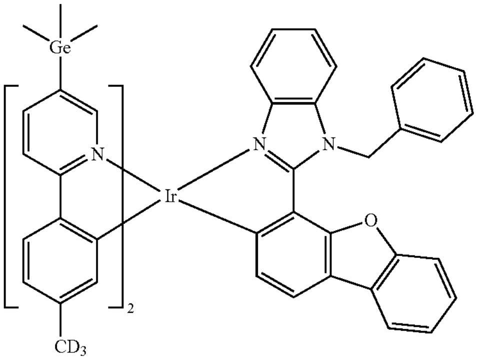
679
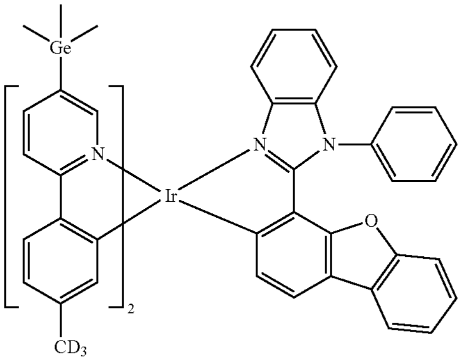
680
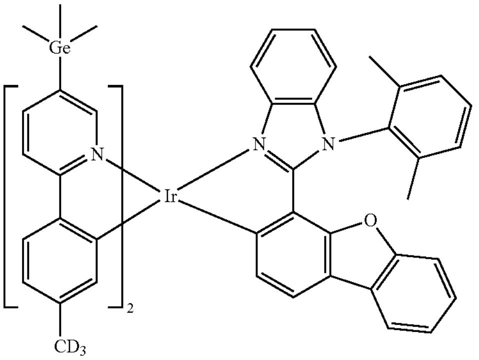
681
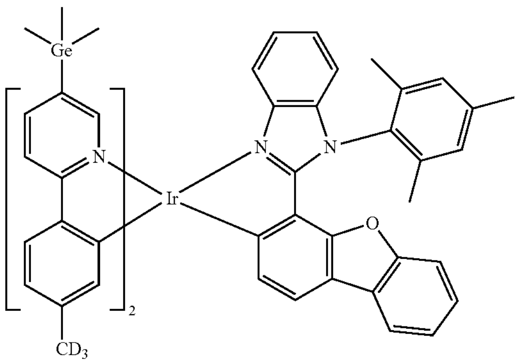

-continued
682
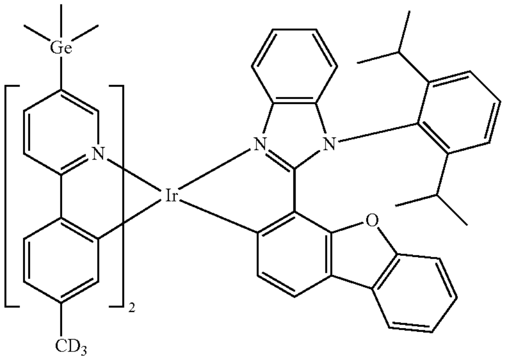
683
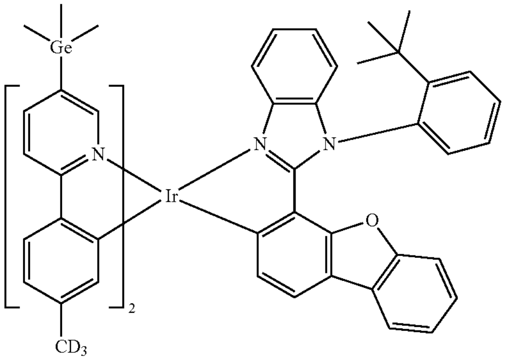
684
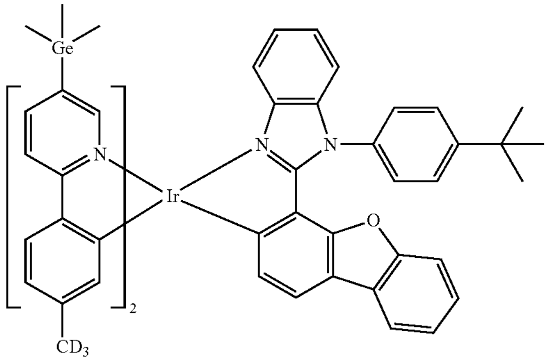
685
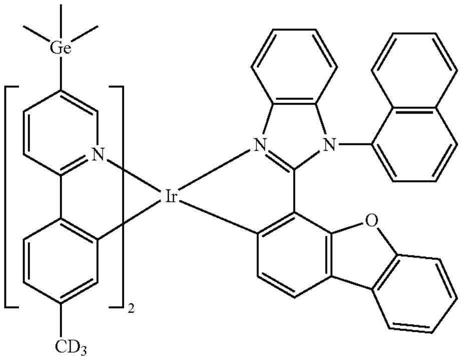
-continued
686
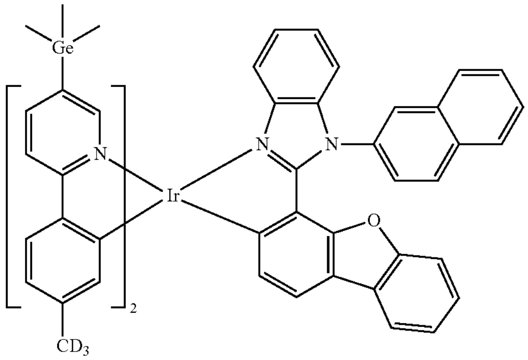
687
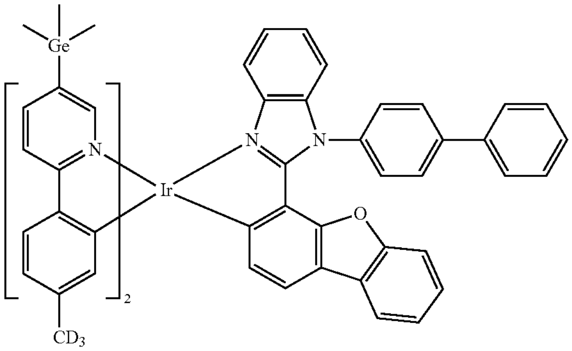
688
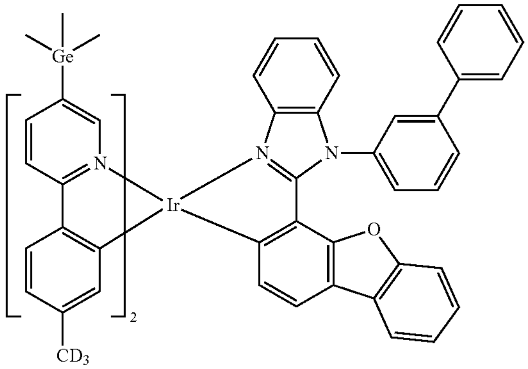
689
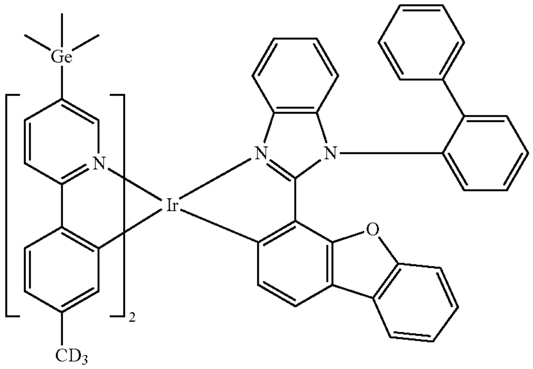

-continued
690
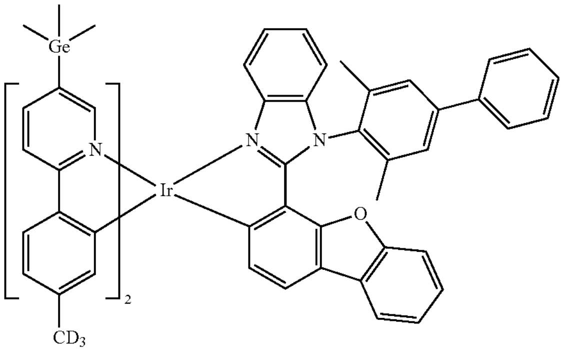
691
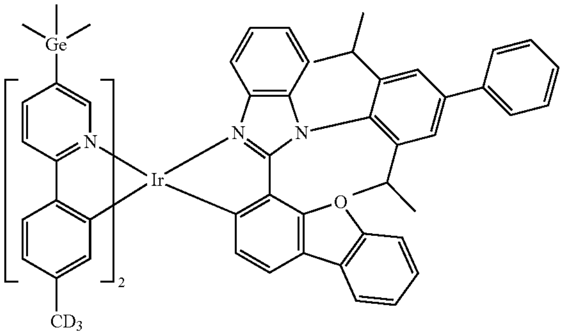
692
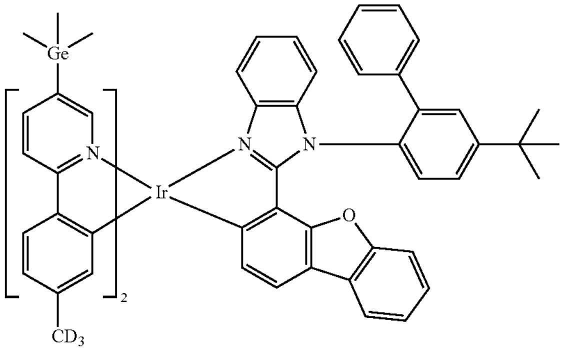
693
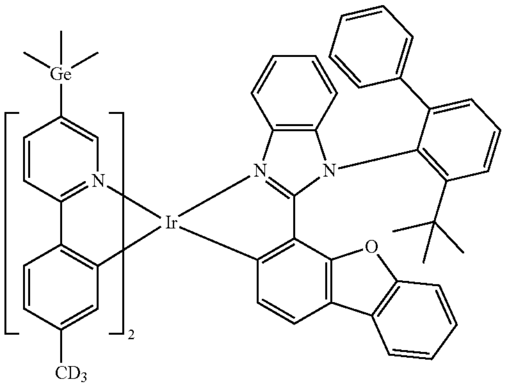
-continued
694
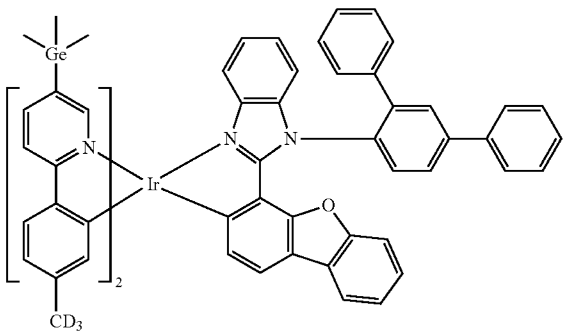
695
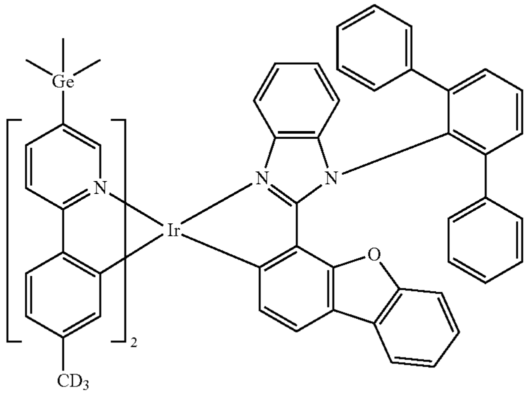
696
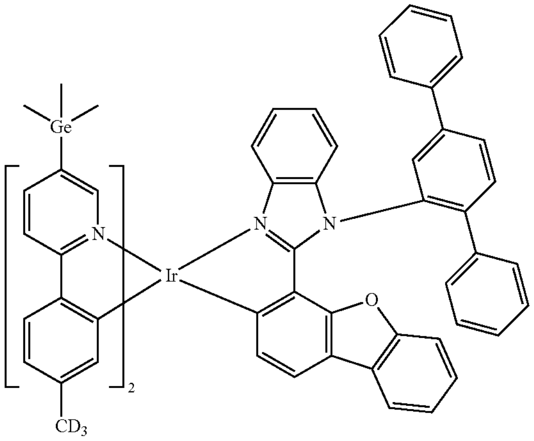
697
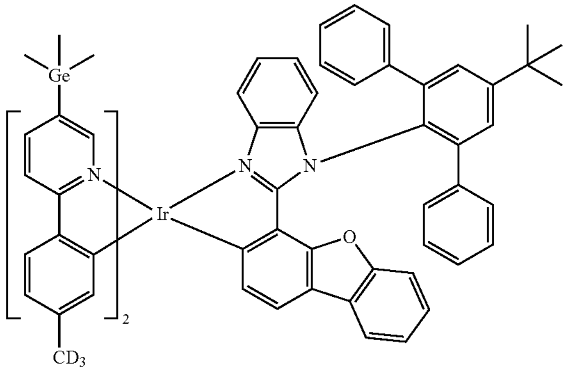

-continued
698
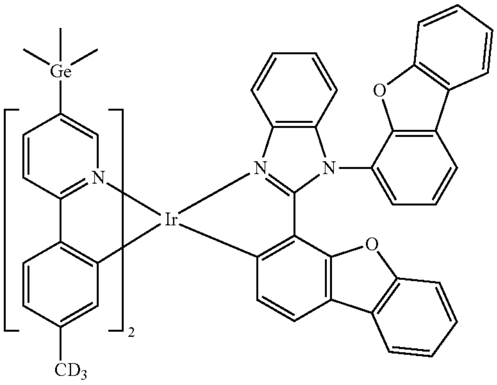
699
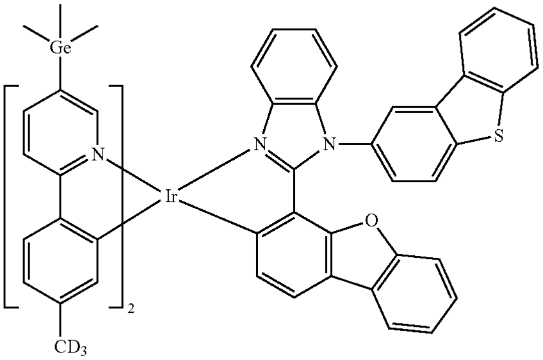
700
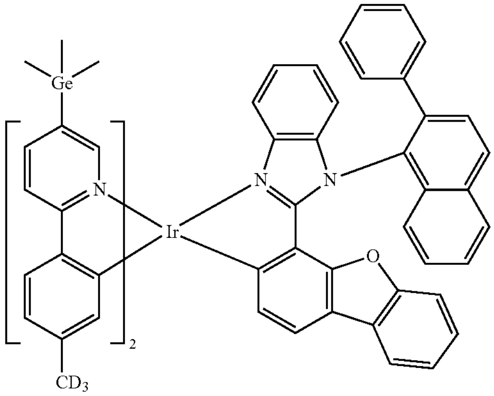
701
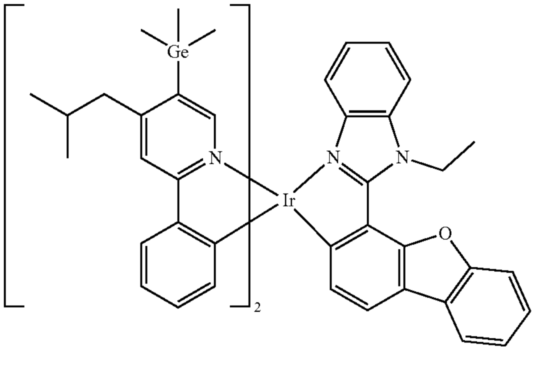
-continued
702
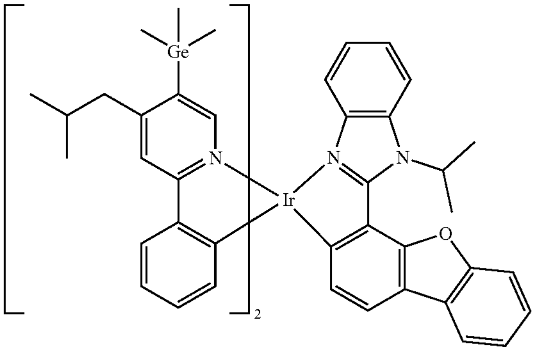
703
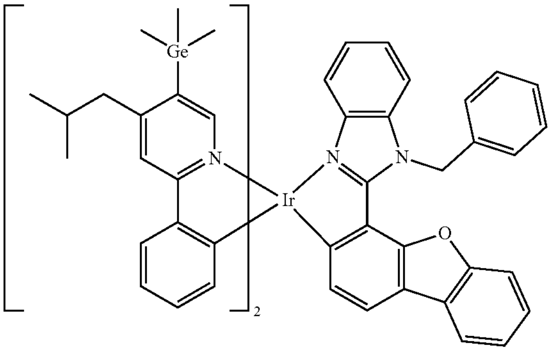
704
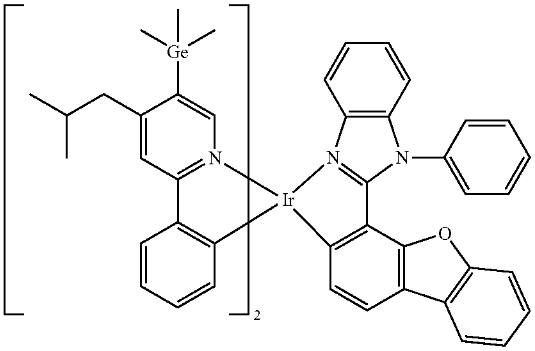
705
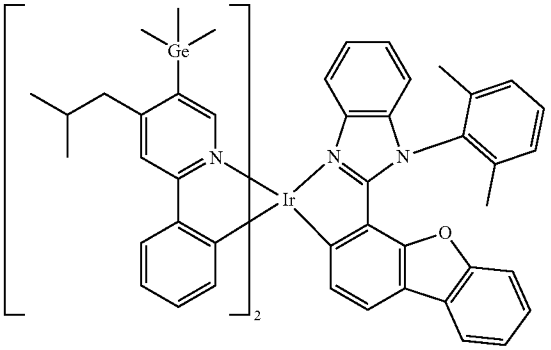

-continued
706
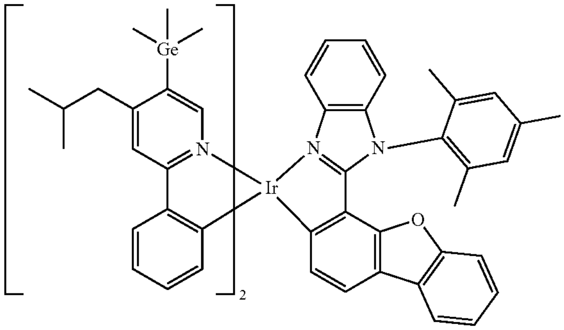
707
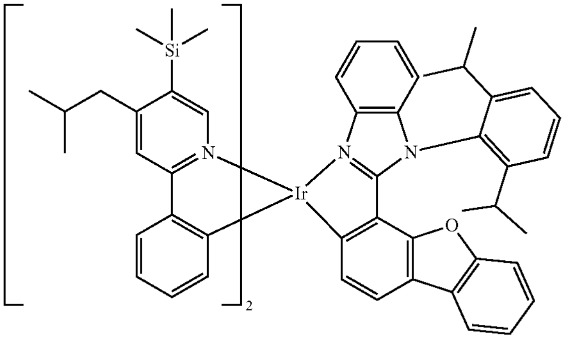
708
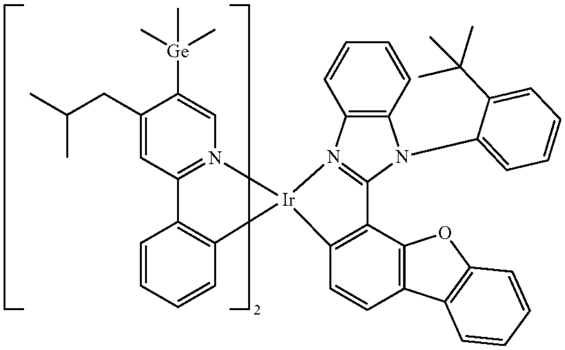
709
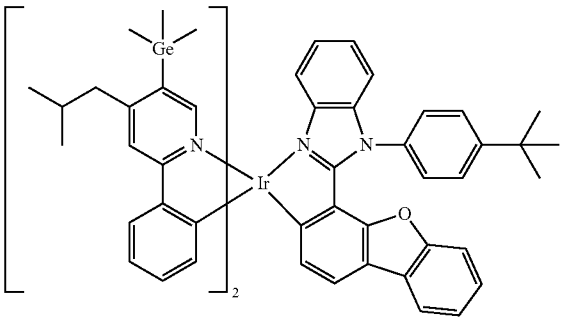
-continued
710
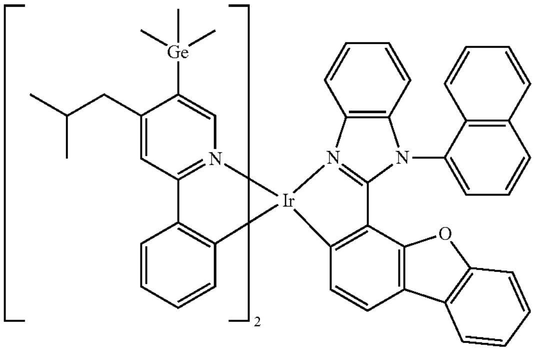
711
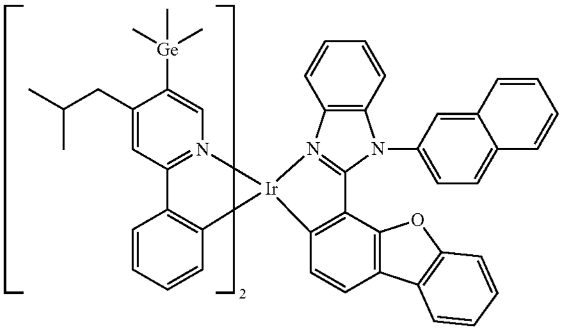
712
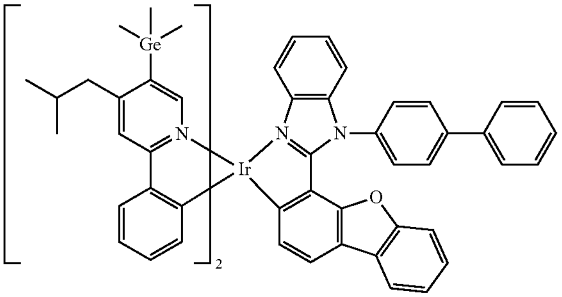
713
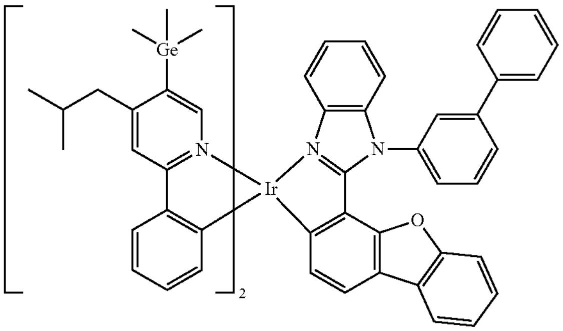

-continued
714
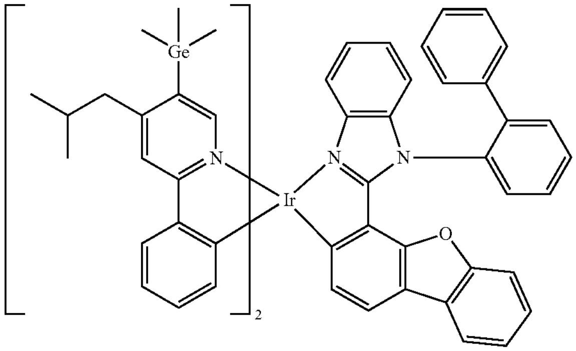
715
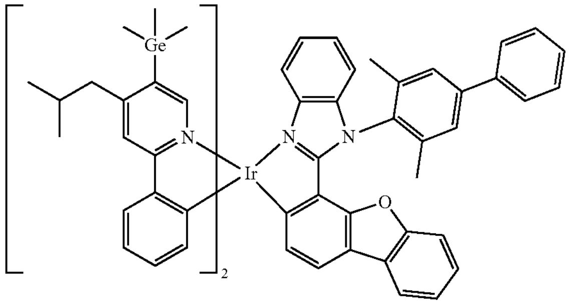
716
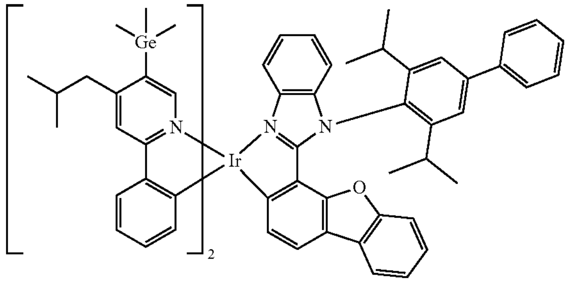
717
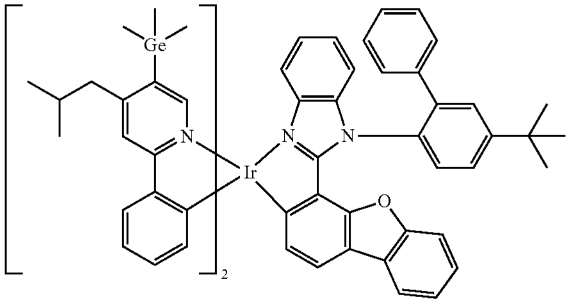
-continued
718
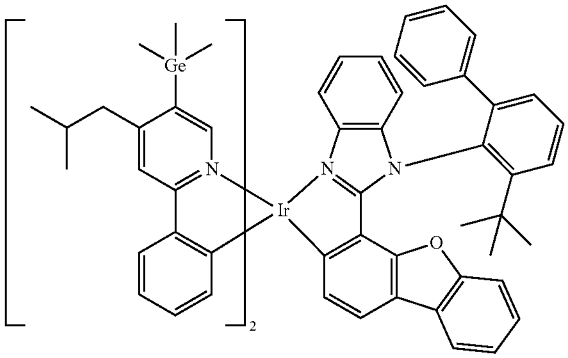
719
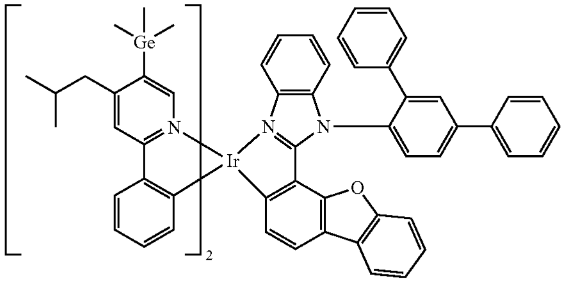
720
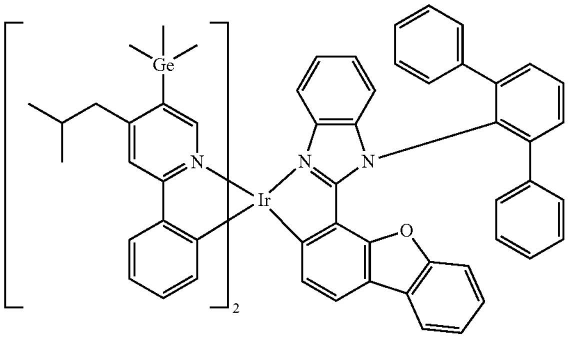
721
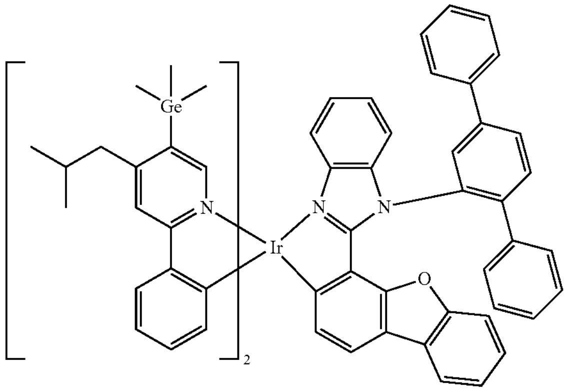

-continued
722
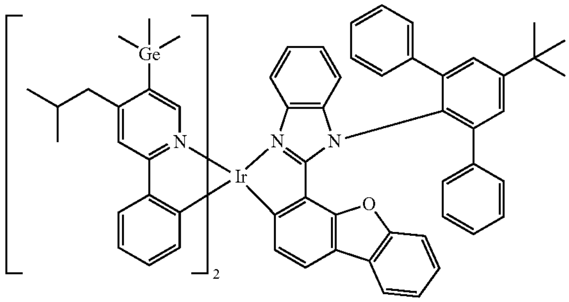
723
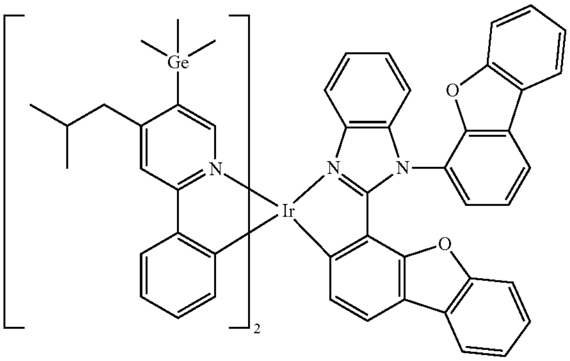
724
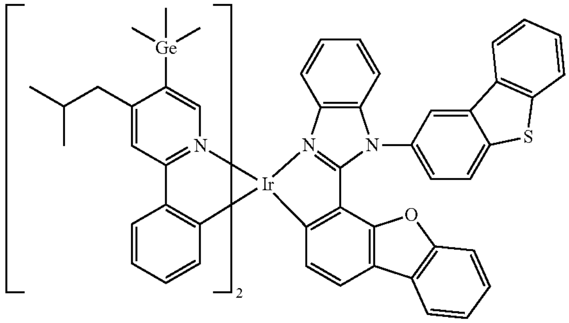
725
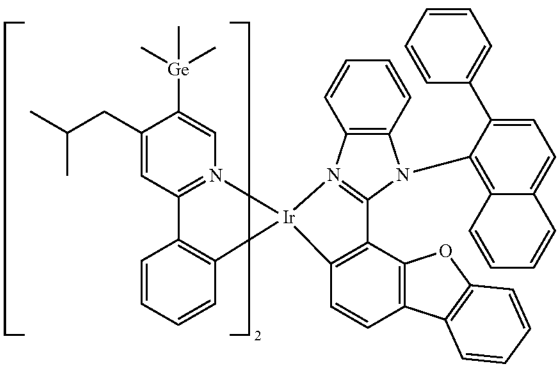
-continued
726
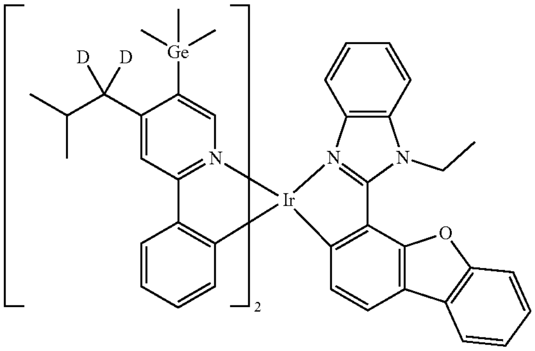
727
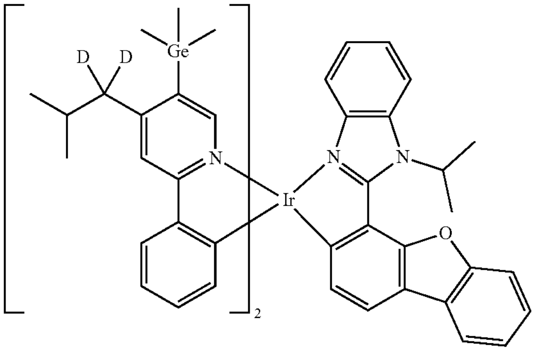
728
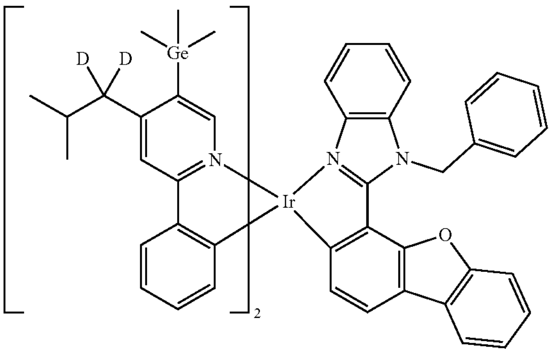
729
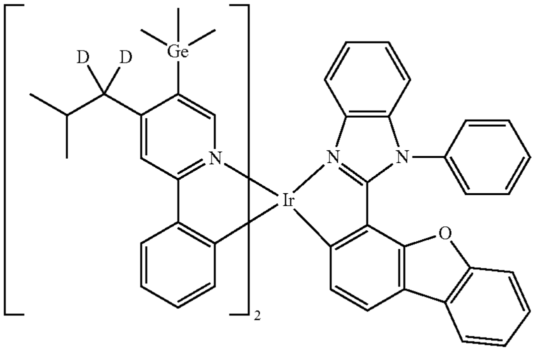

-continued
730
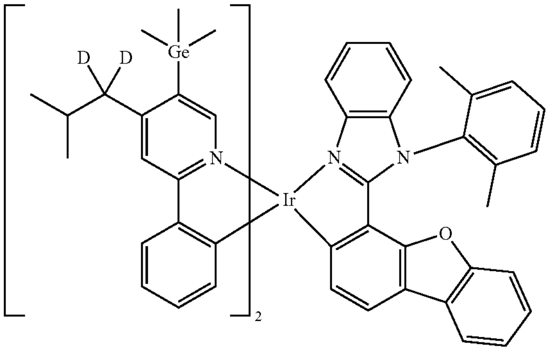
731
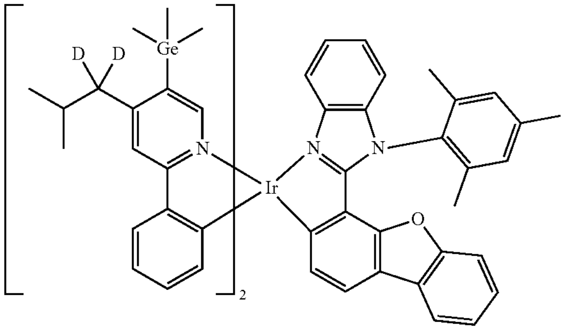
732
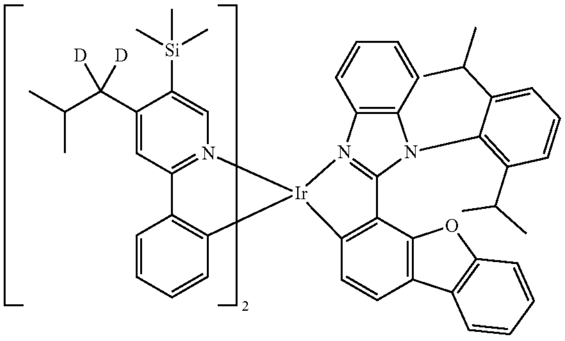
733
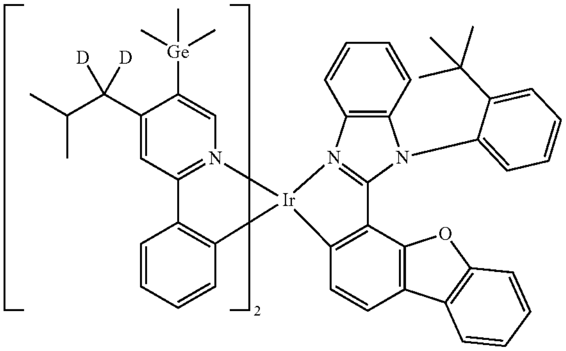
-continued
734
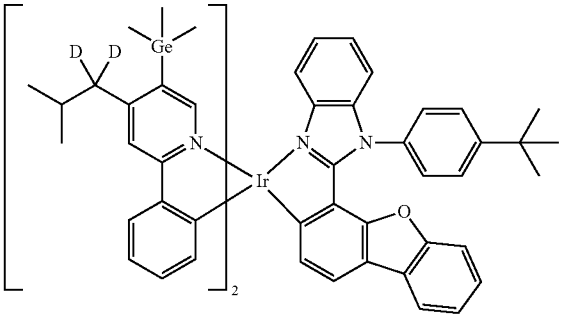
735
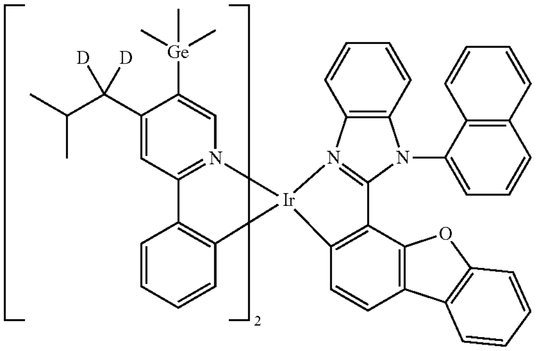
736
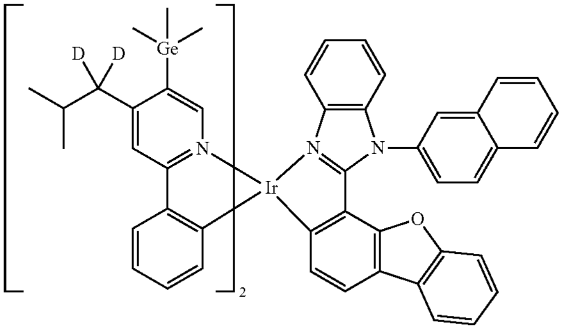
737
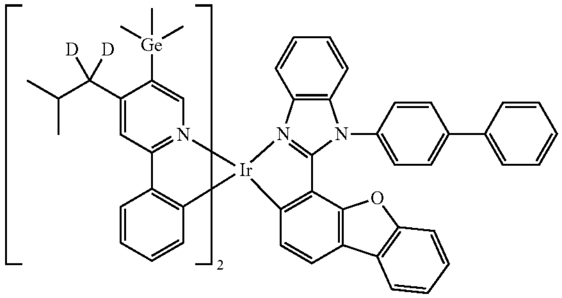

-continued
738
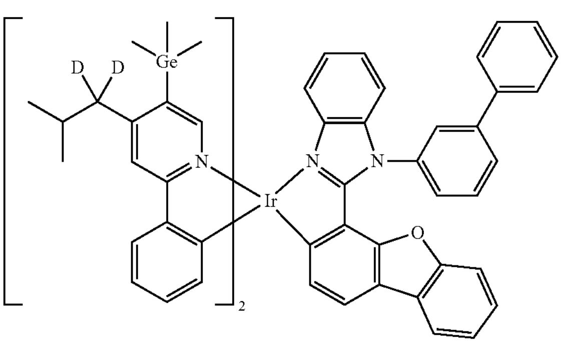
739
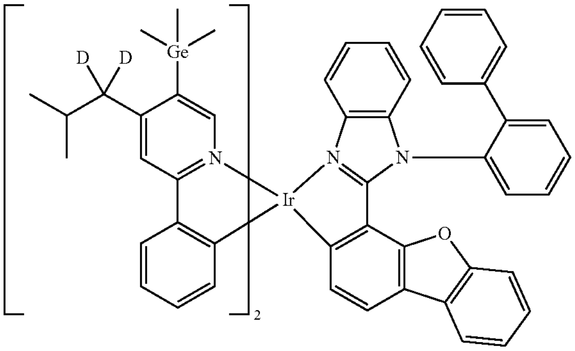
740
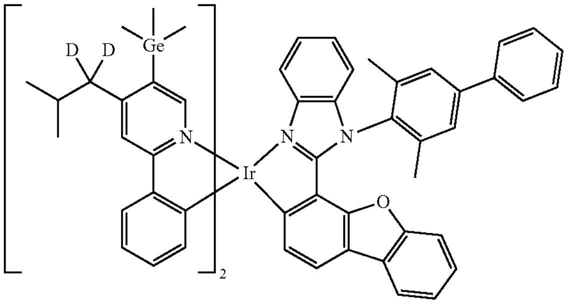
741
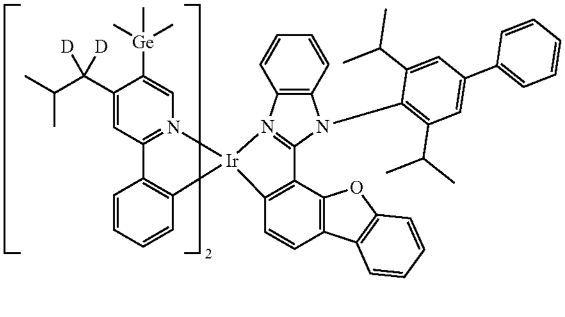
-continued
742
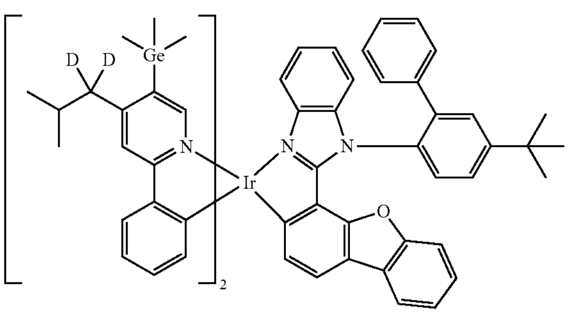
743
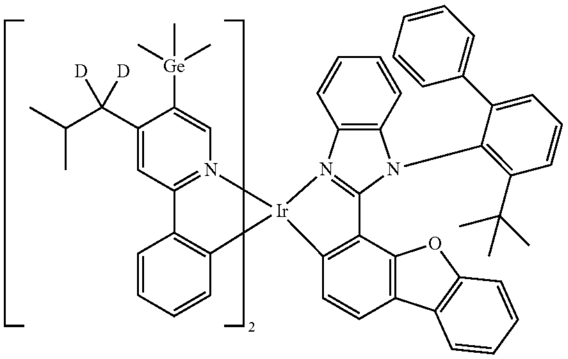
744
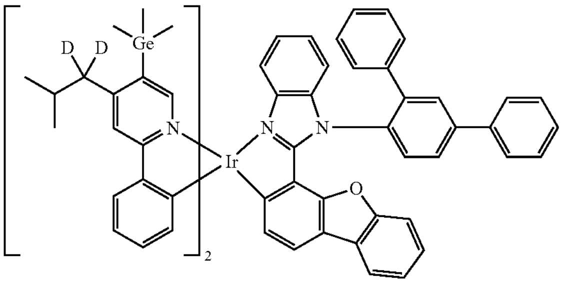
745
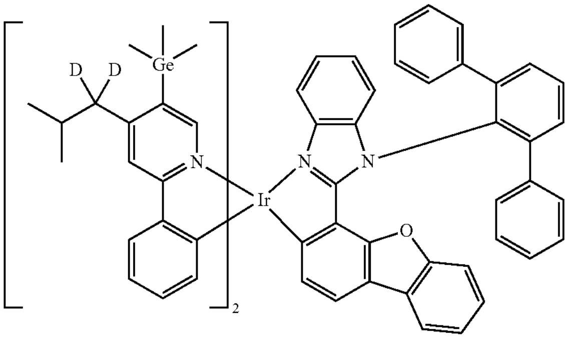

-continued
746
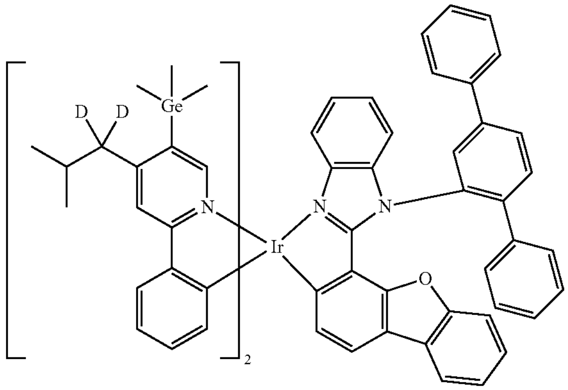
747
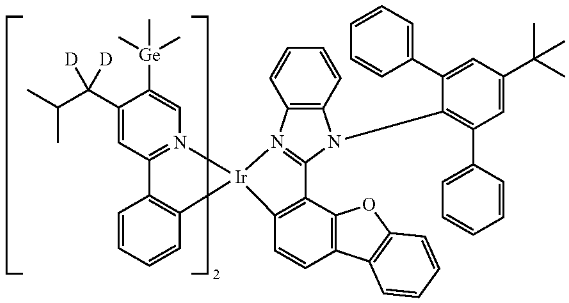
748
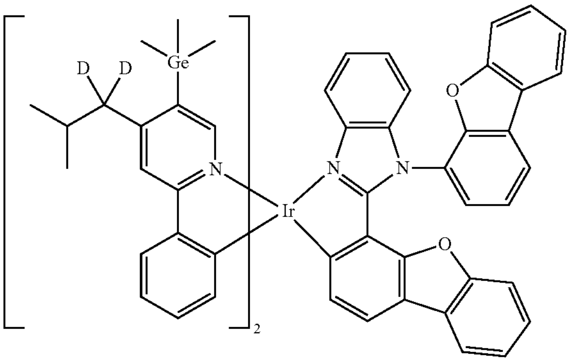
749
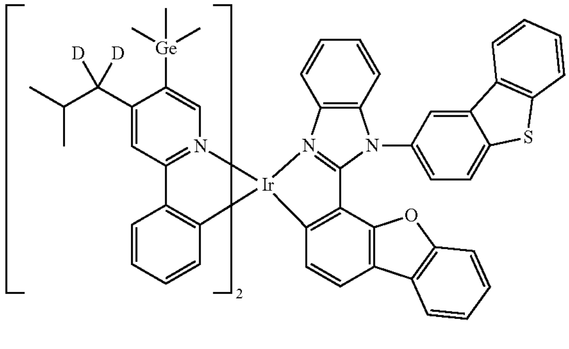
-continued
750
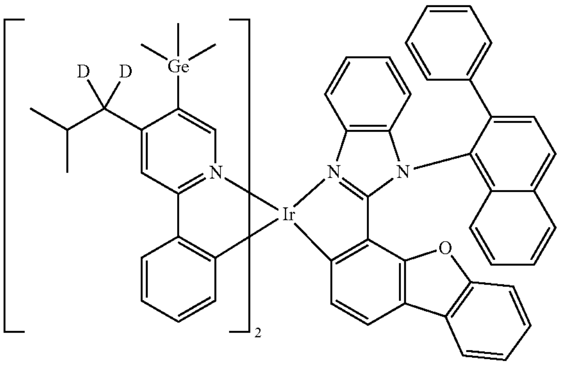
751
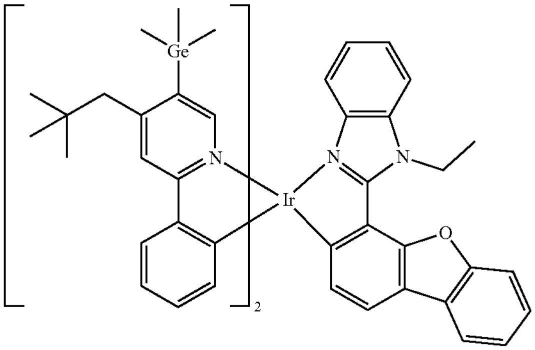
752
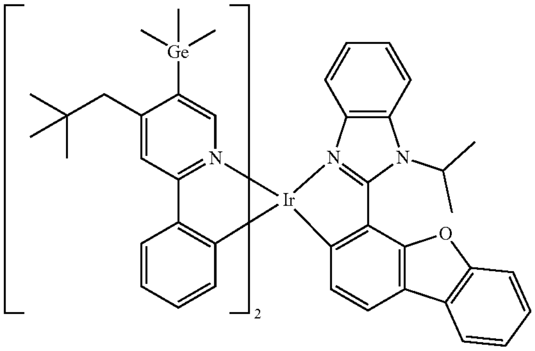
753
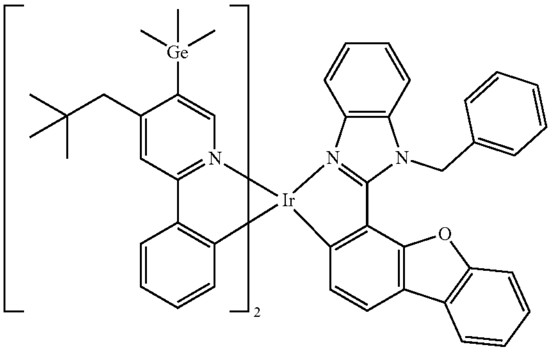

-continued
754
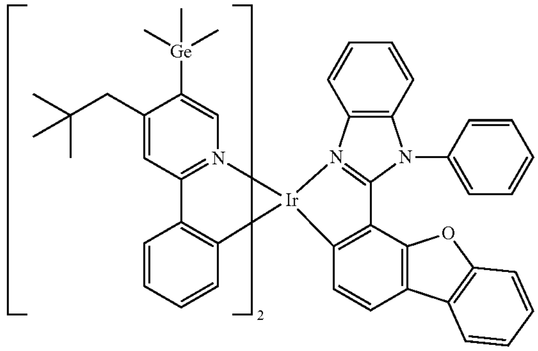
755
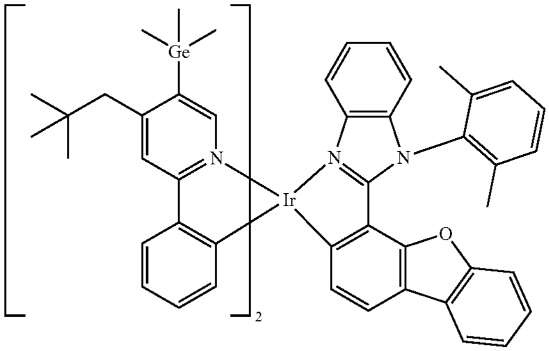
756
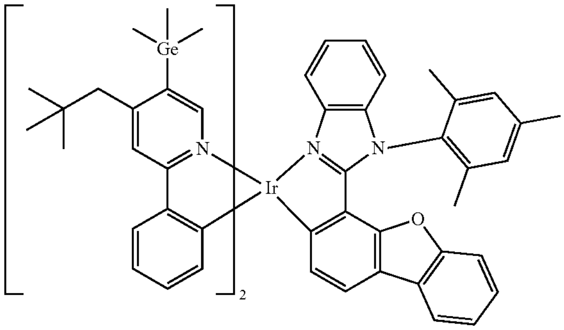
757
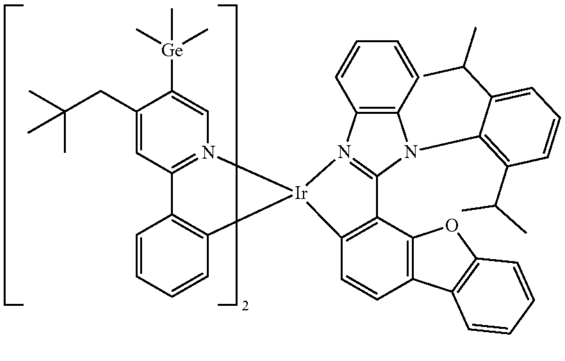
758
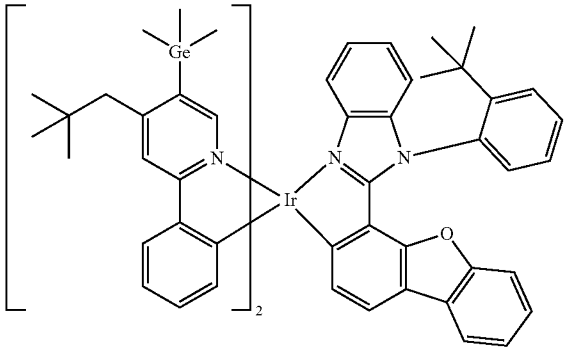
759
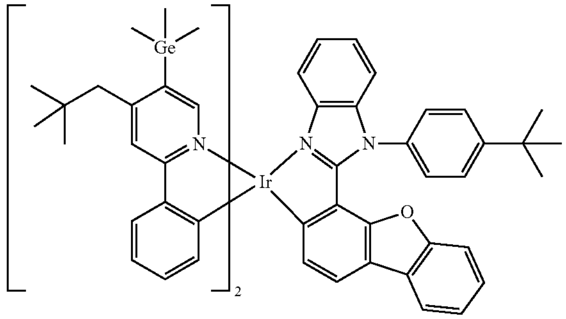
760
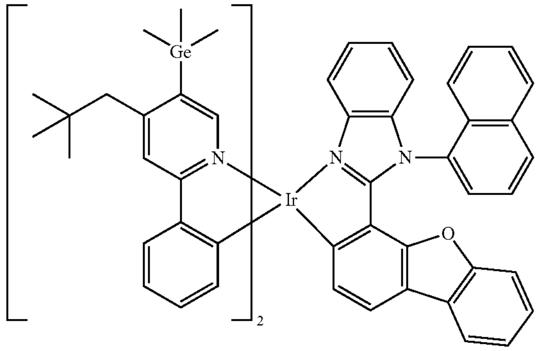
761
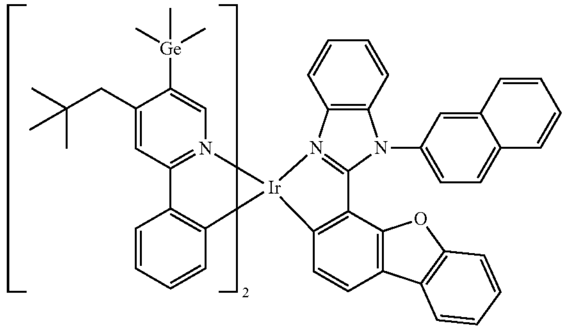

-continued
762
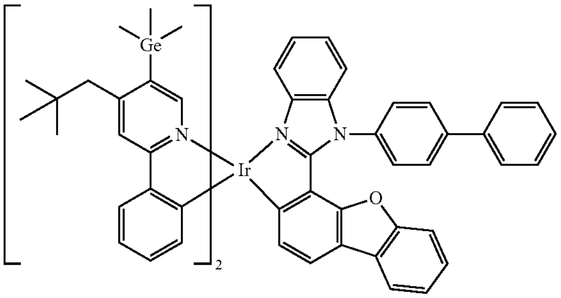
763
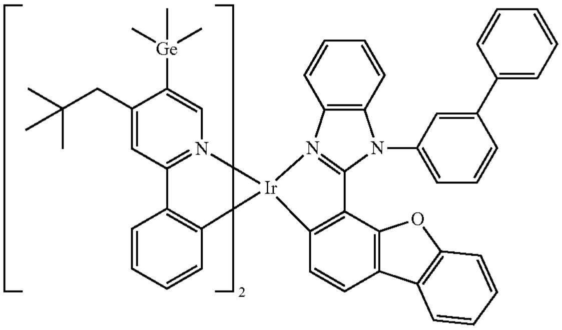
764
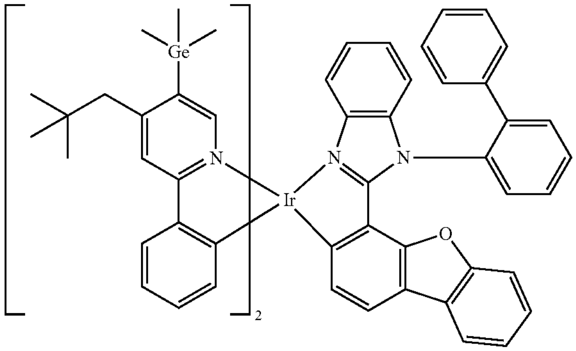
765
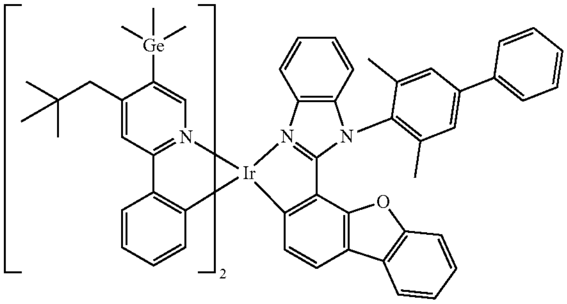
-continued
766
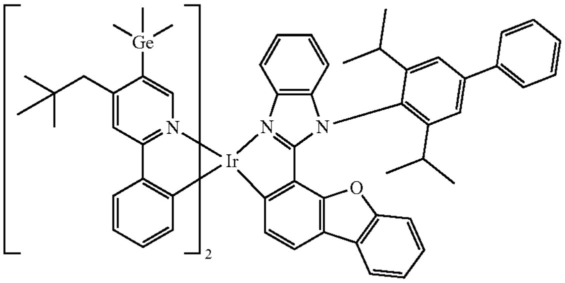
767
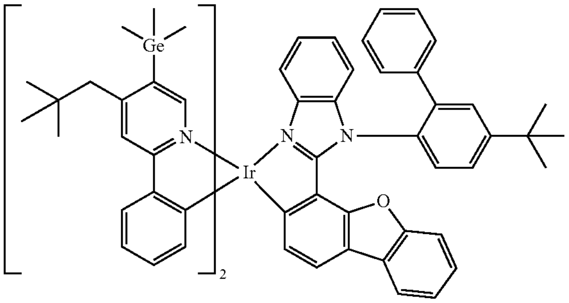
768
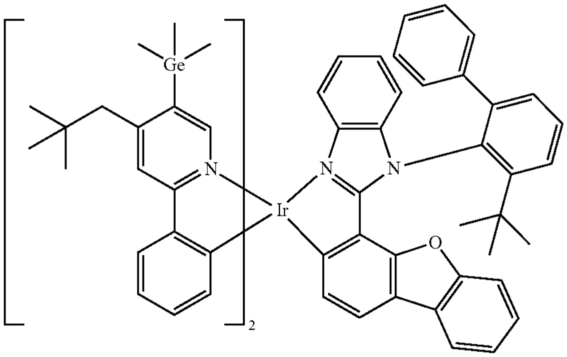
769
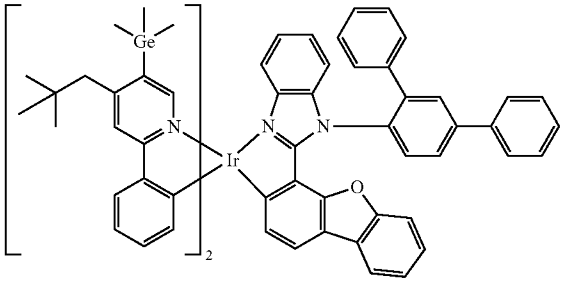

-continued
770
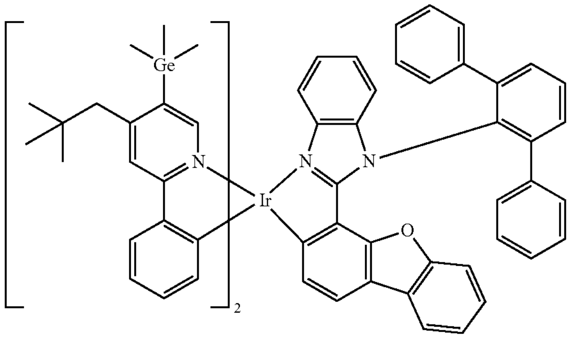
771
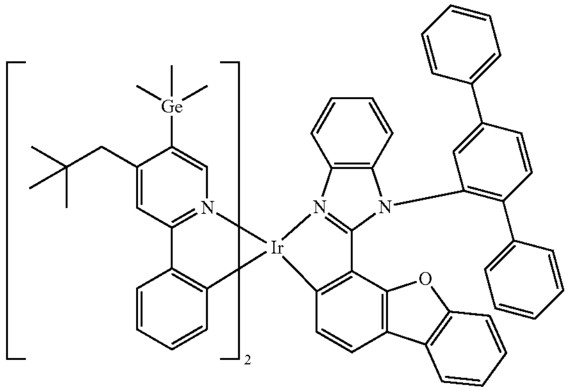
772
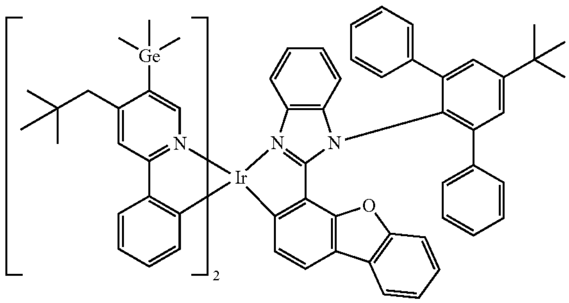
773
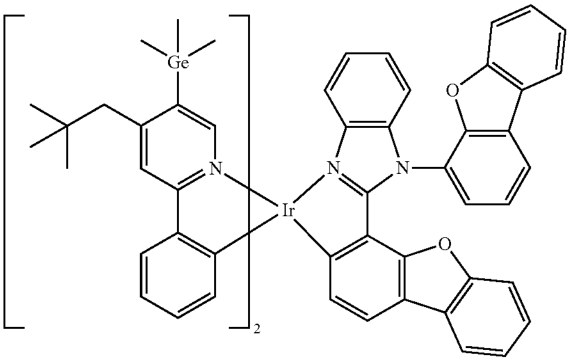
-continued
774
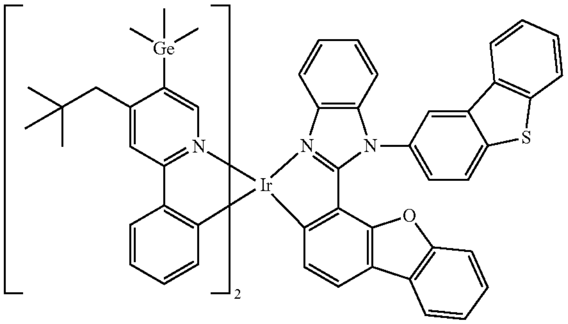
775
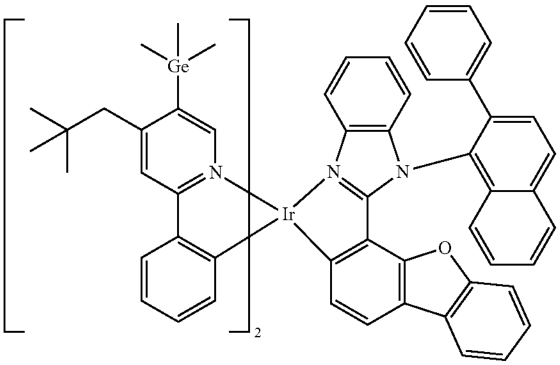
776
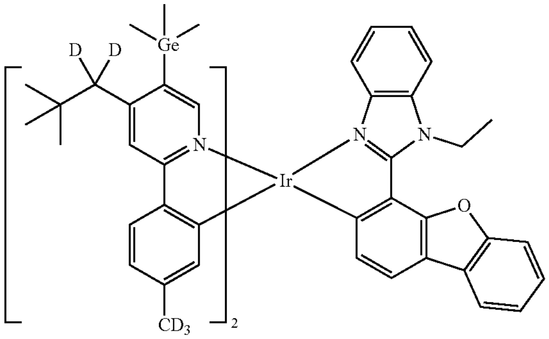
777
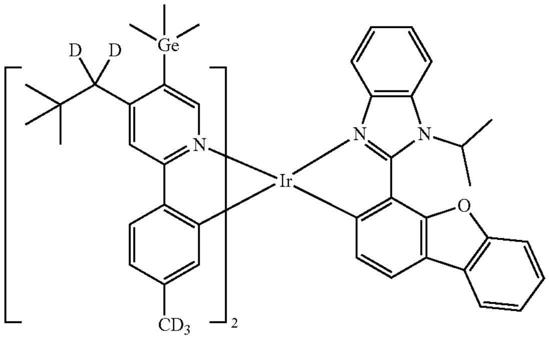

778
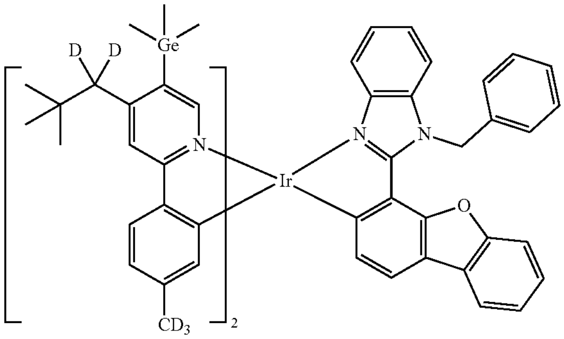
779
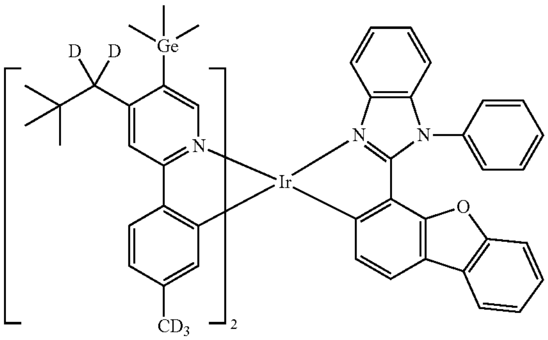
780
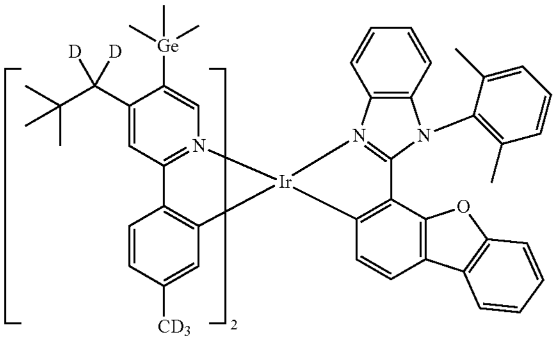
781
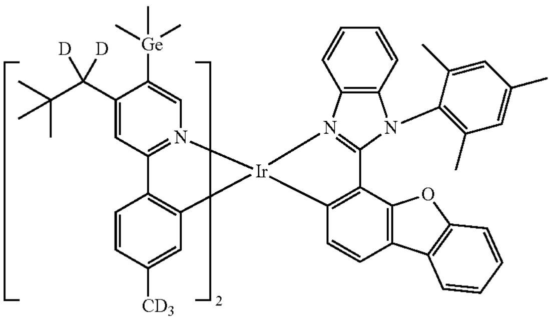
782
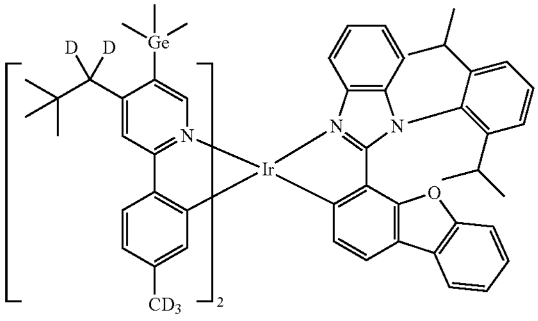
783
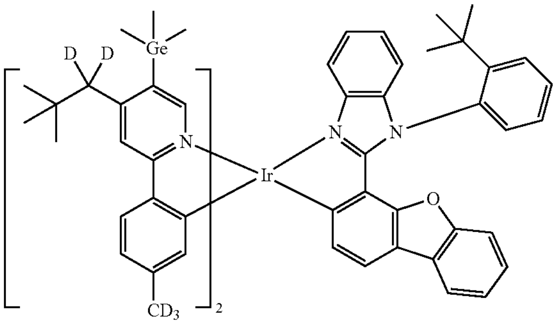
784
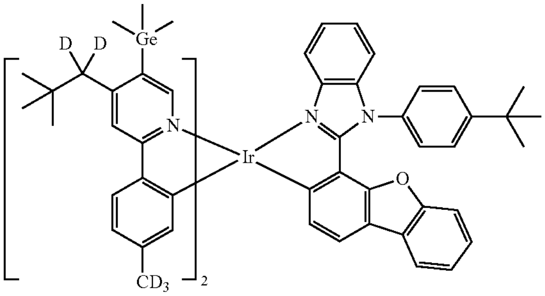
785
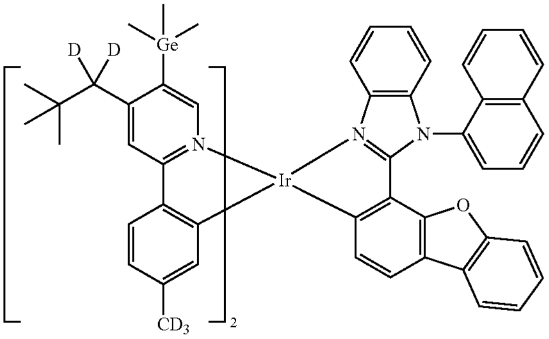

-continued
786
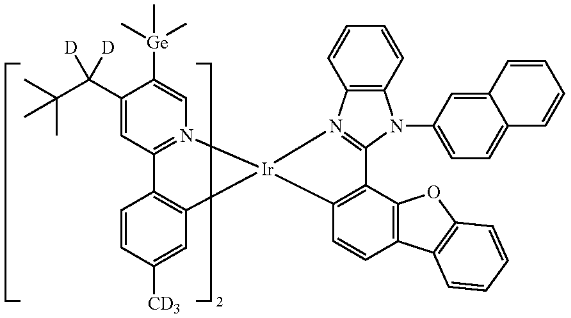
787
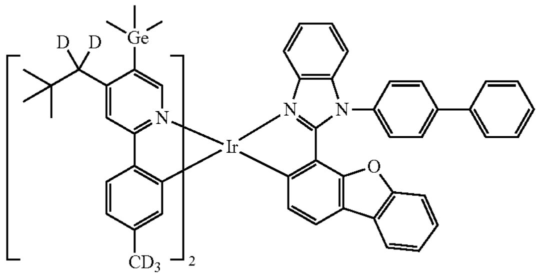
788
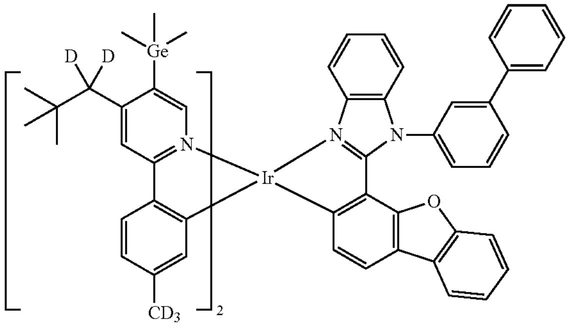
789
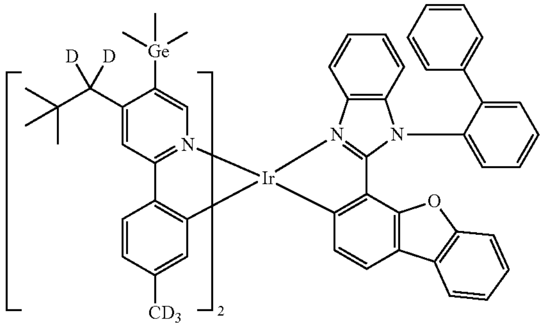
790
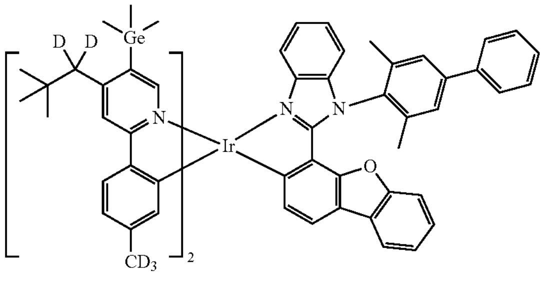
-continued
791
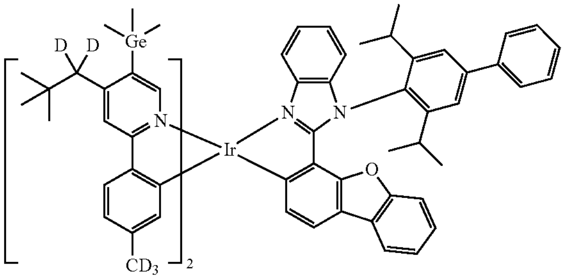
792
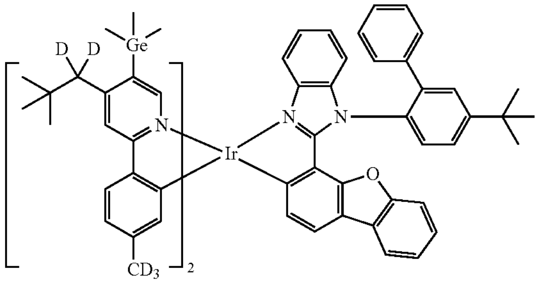
793
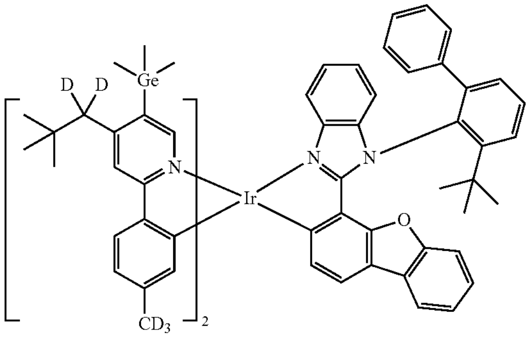
794
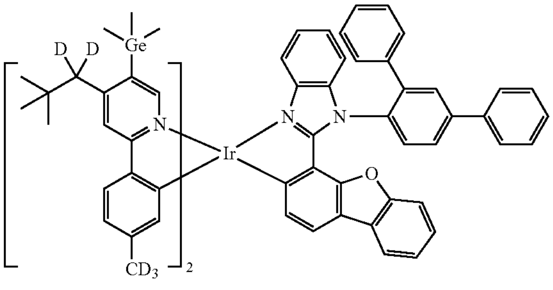

795
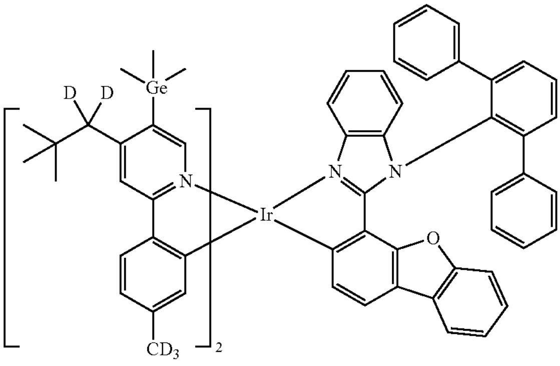
796
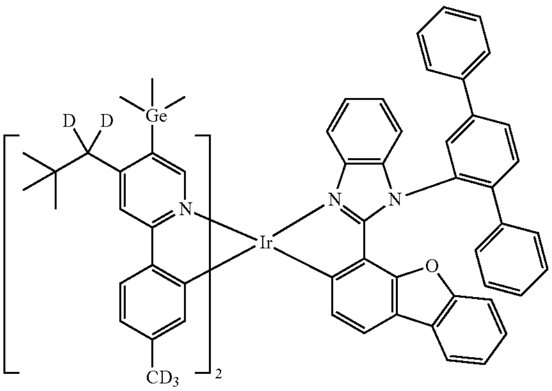
797
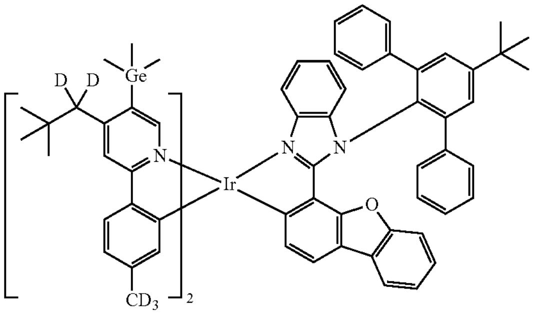
798
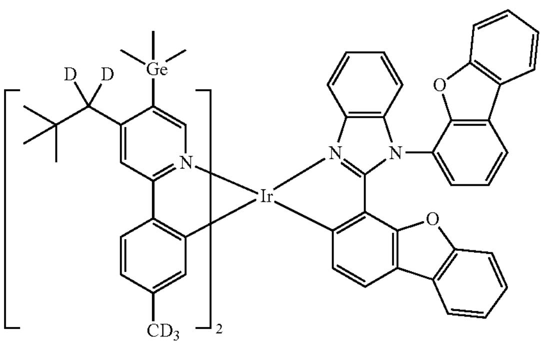
799
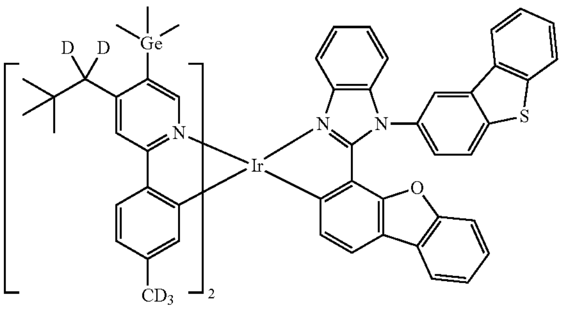
800
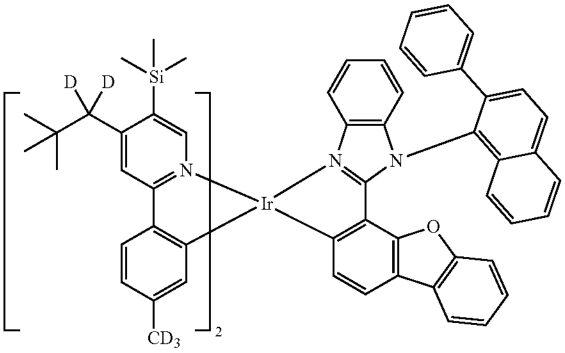
801
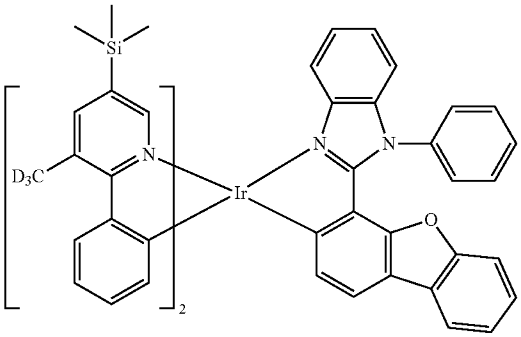
802
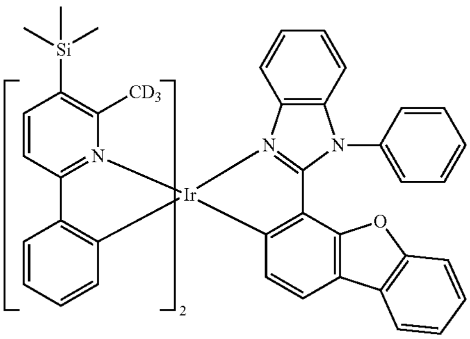

-continued
803
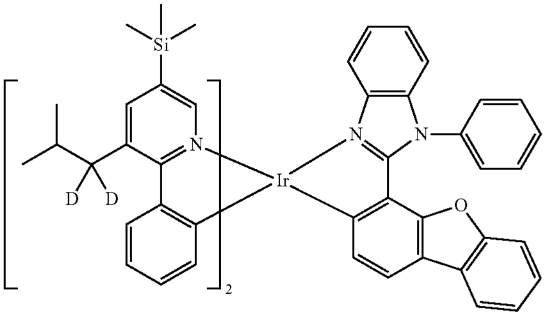
804
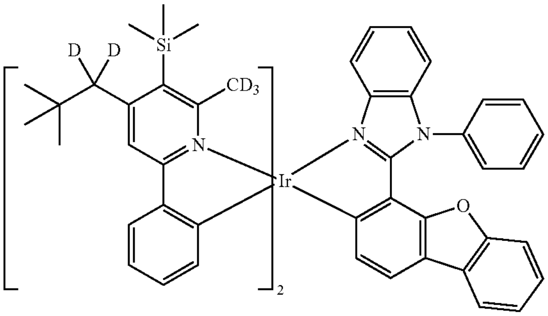
805
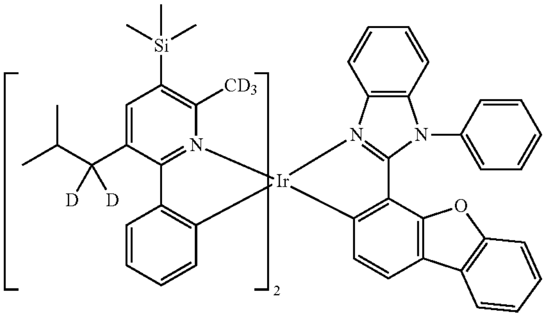
806
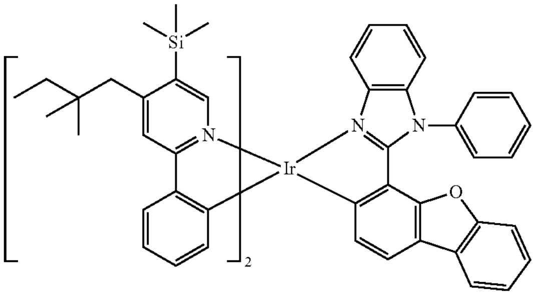
-continued
807
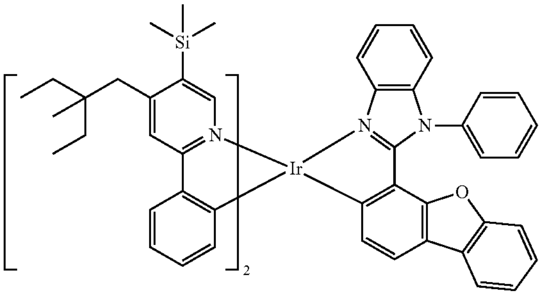
808
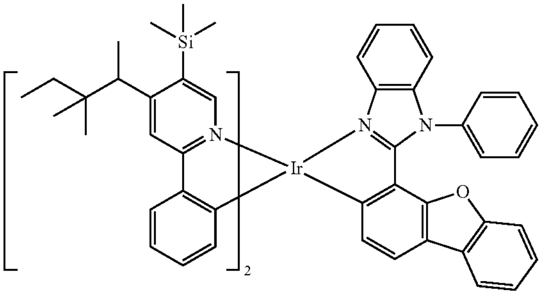
809
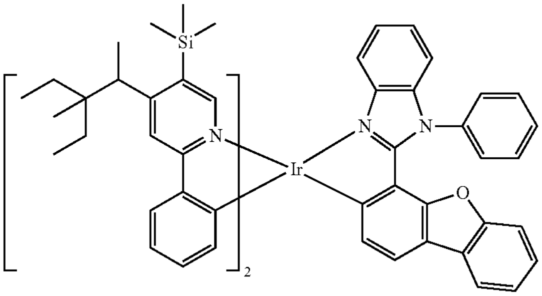
810
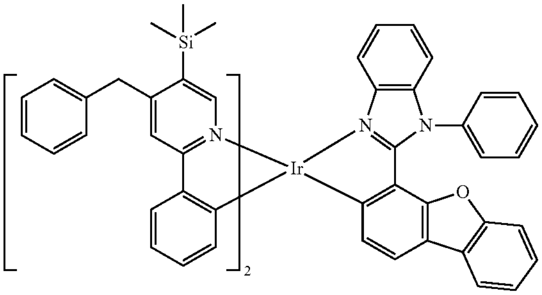
811
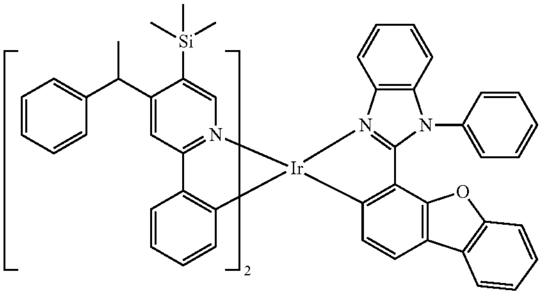

-continued
812
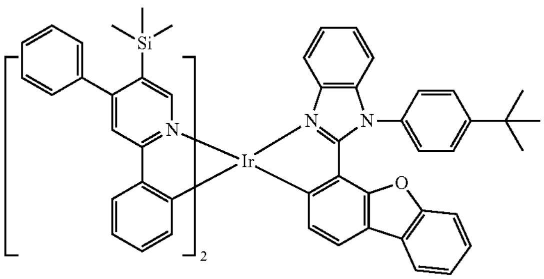
813
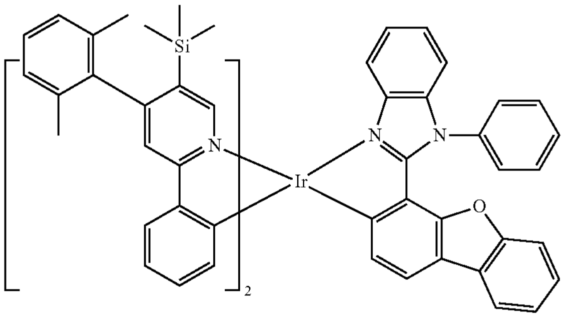
814
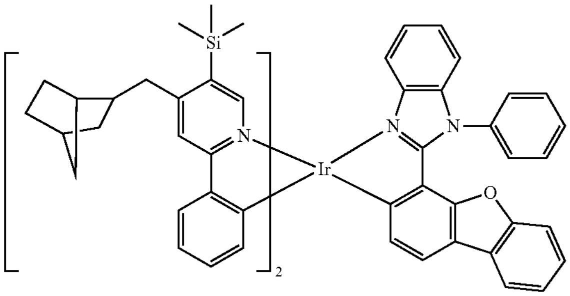
815
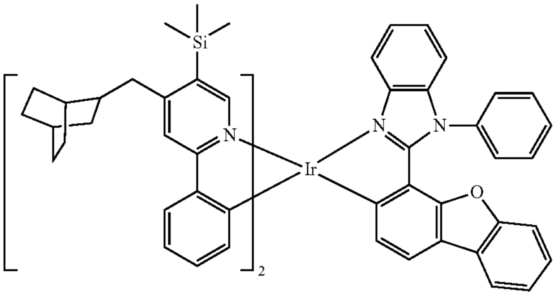
816
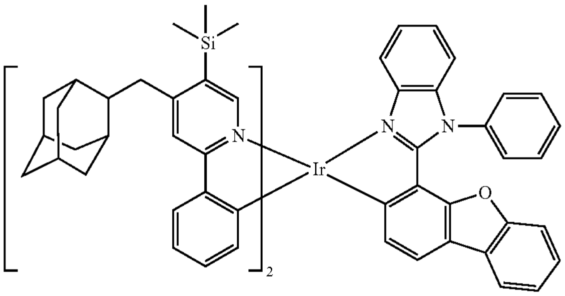
-continued
817
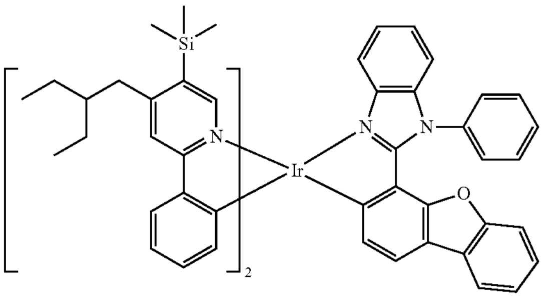
818
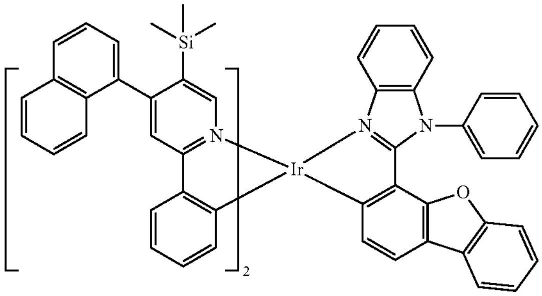
819
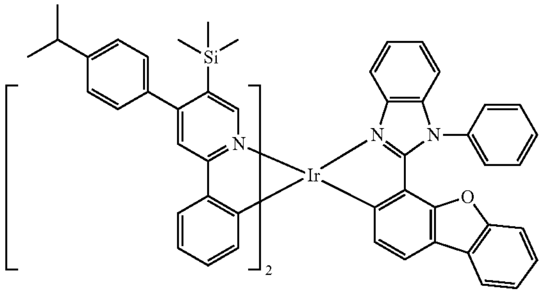
820
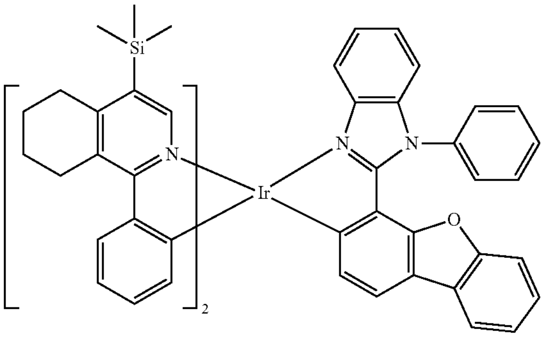
821
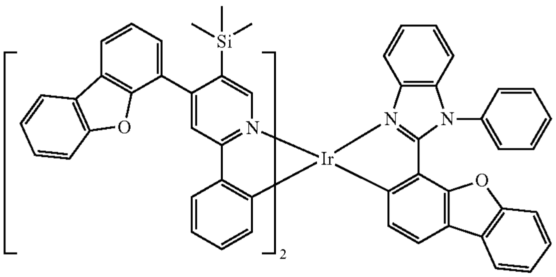

-continued
822
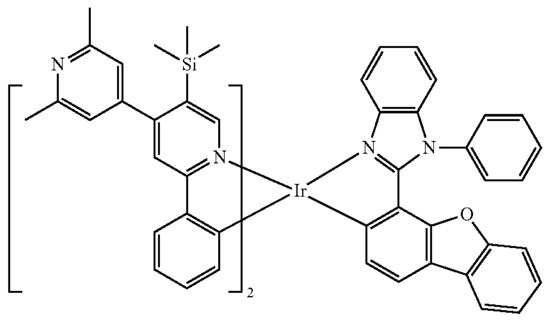
823
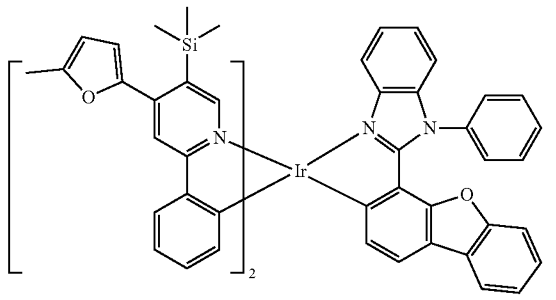
824
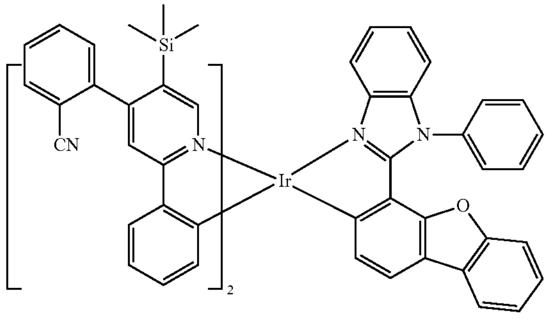
825
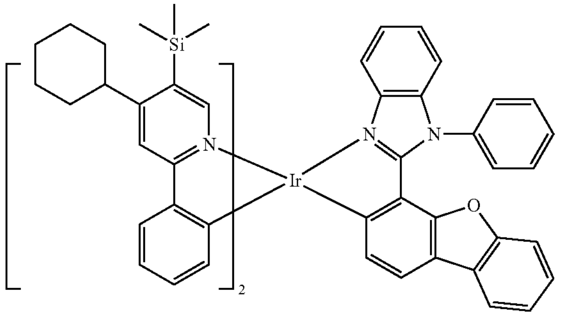
-continued
826
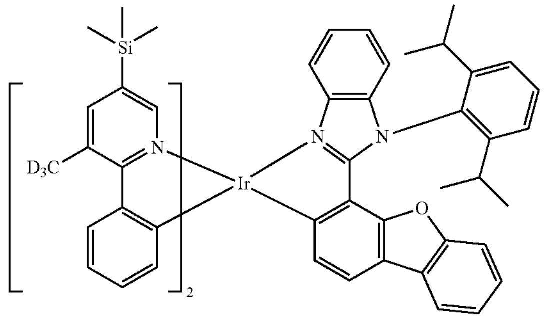
827
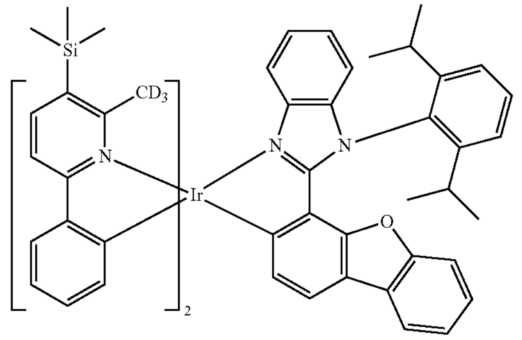
828
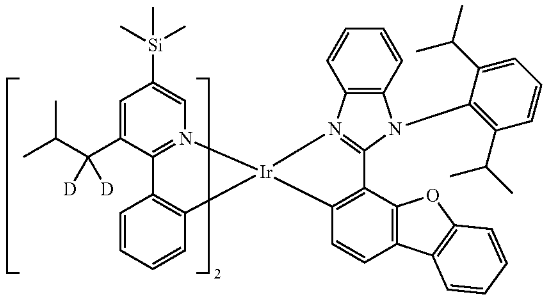
829
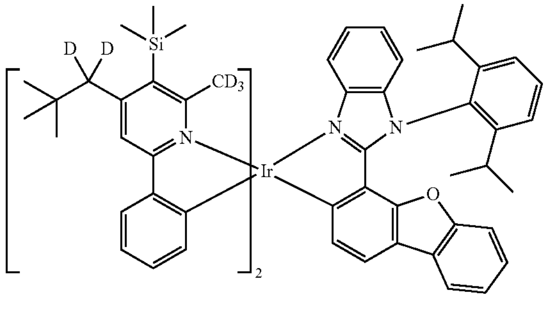

-continued
830
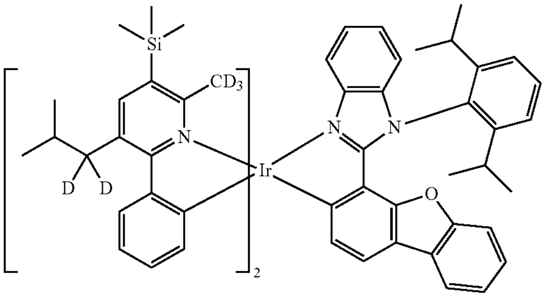
831
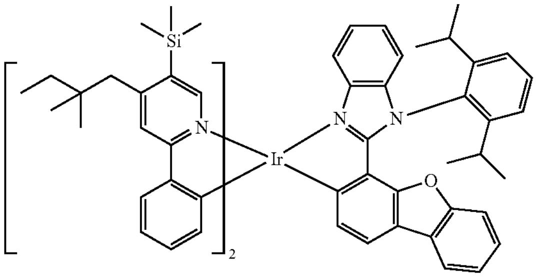
832
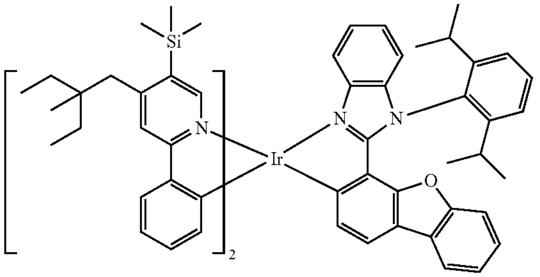
833
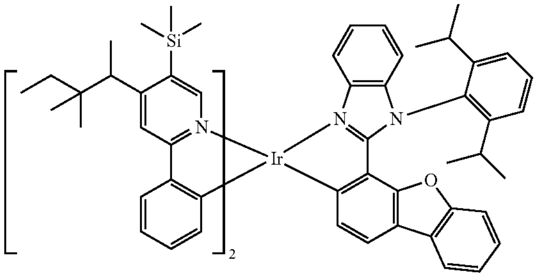
834
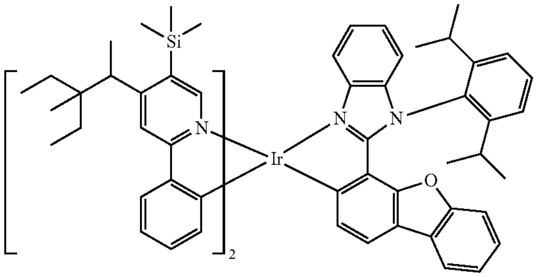
-continued
835
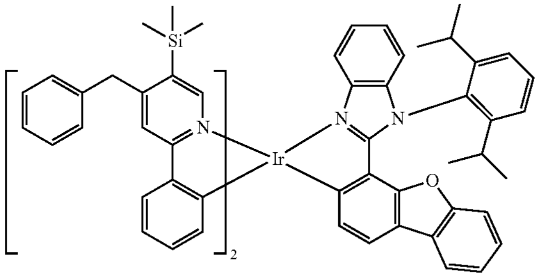
836
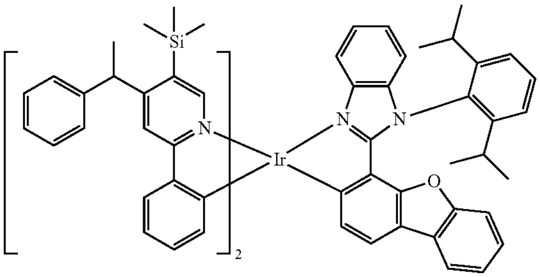
837
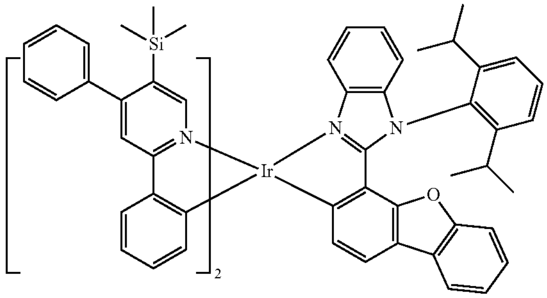
838
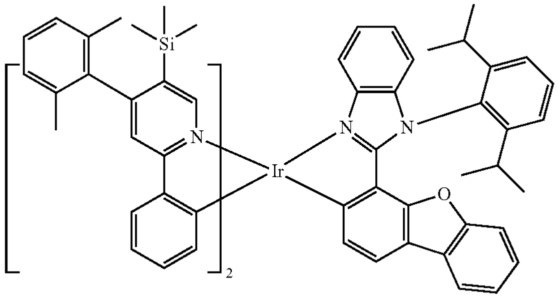
839
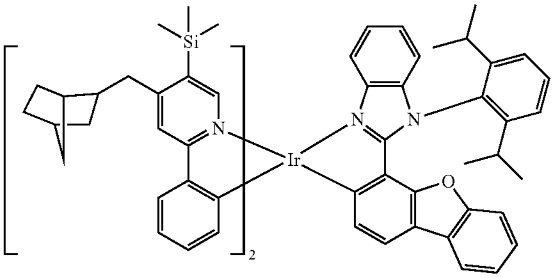

-continued
840
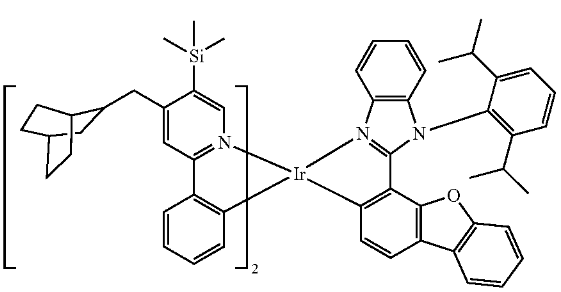
841
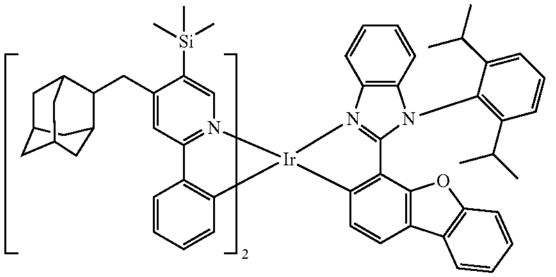
842
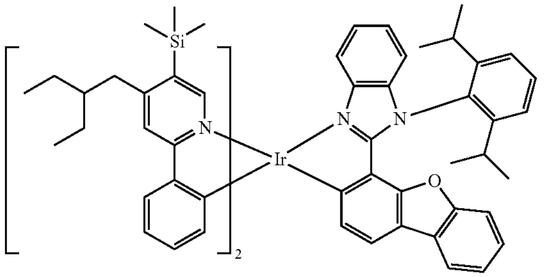
843
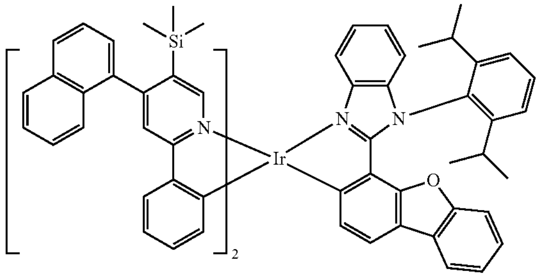
844
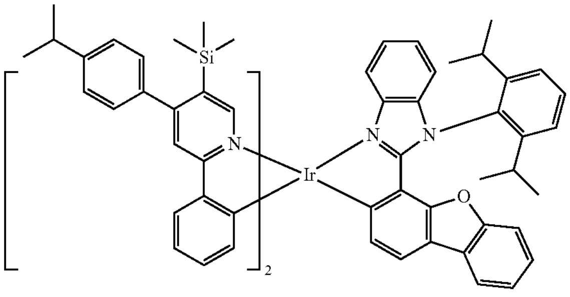
-continued
845
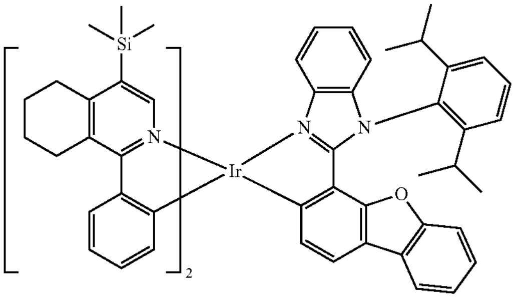
846
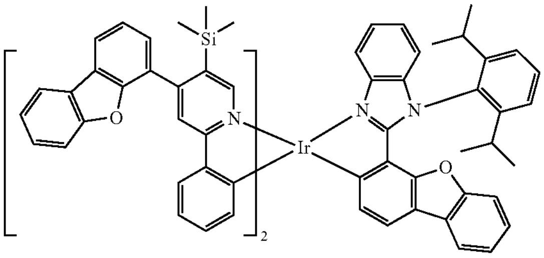
847
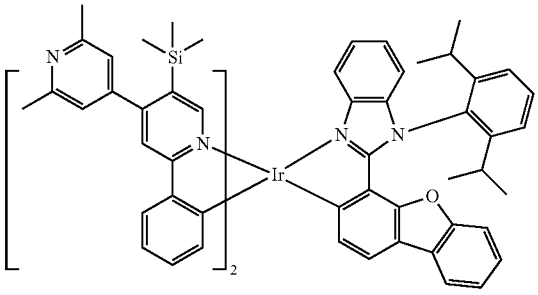
848
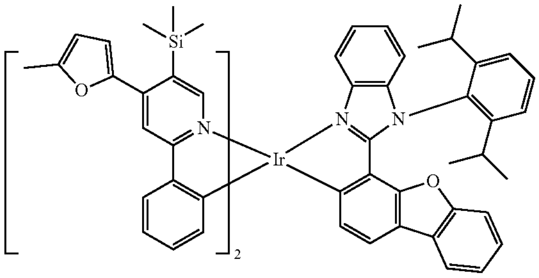
849
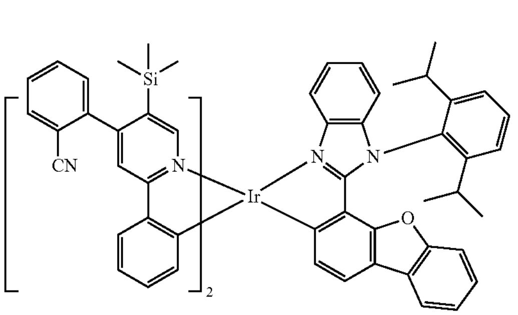

-continued
850
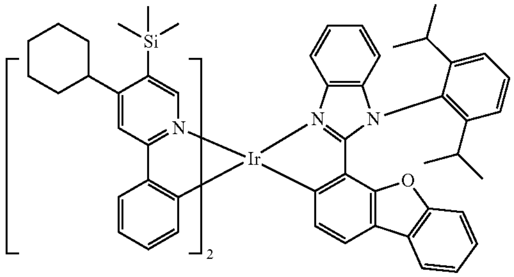
851
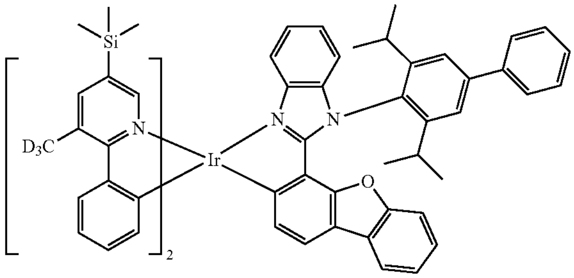
852
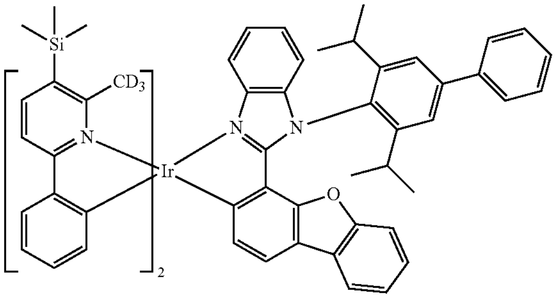
853
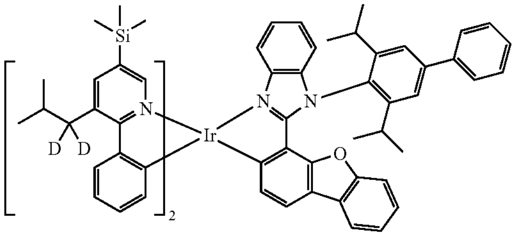
854
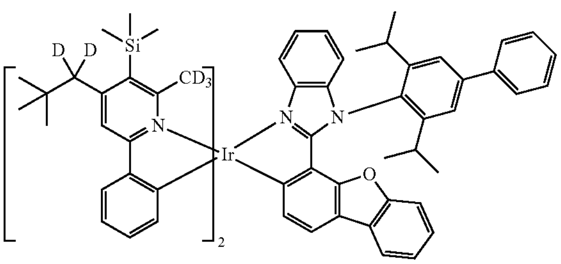
-continued
855
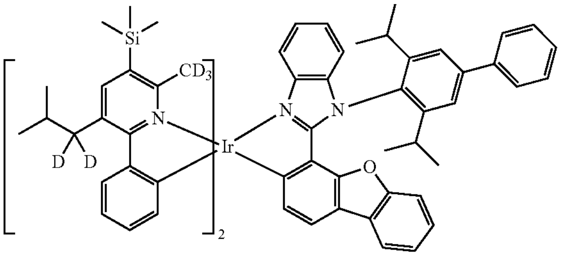
856
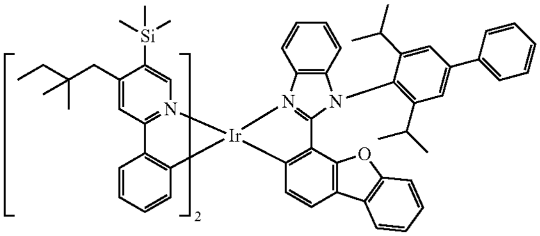
857
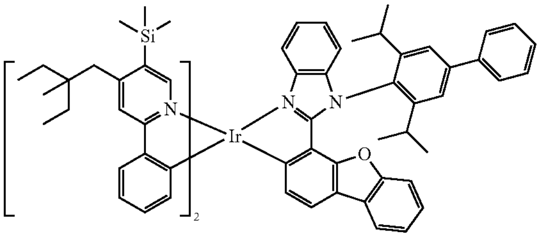
858
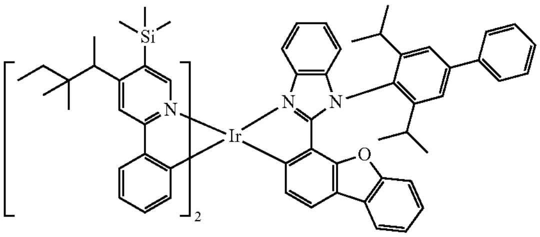
859
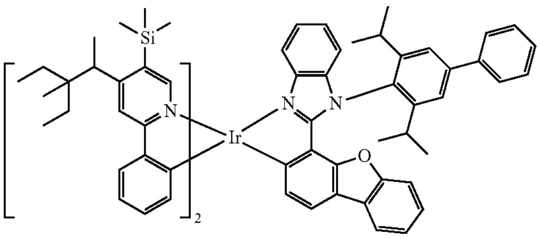
860
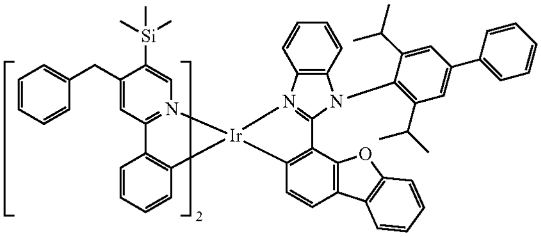

-continued
861
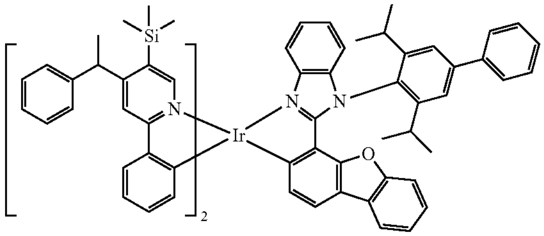
862
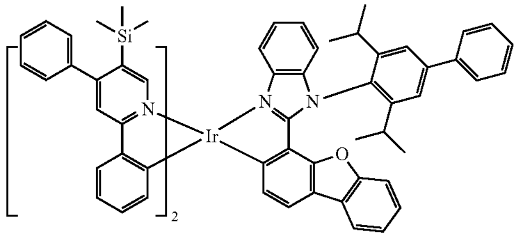
863
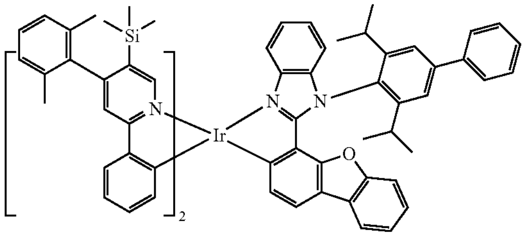
864
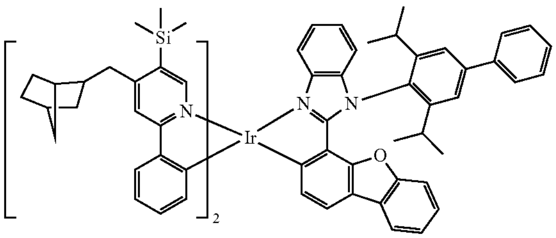
865
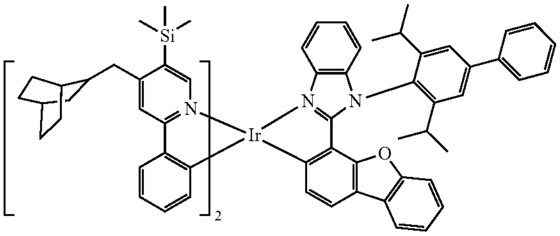
866
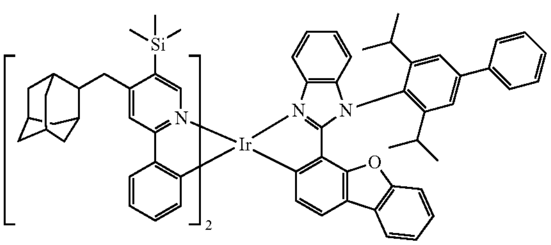
-continued
867
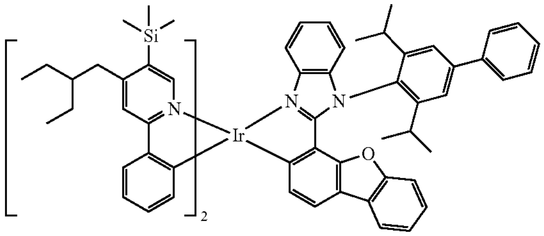
868
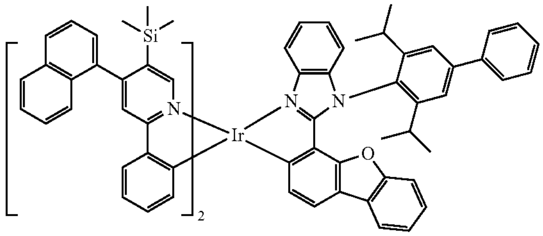
869
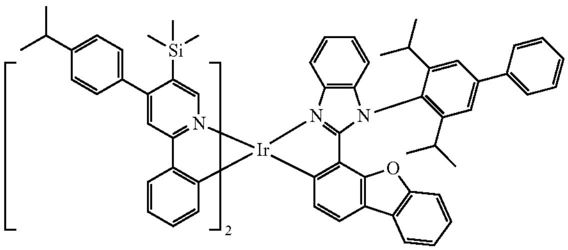
870
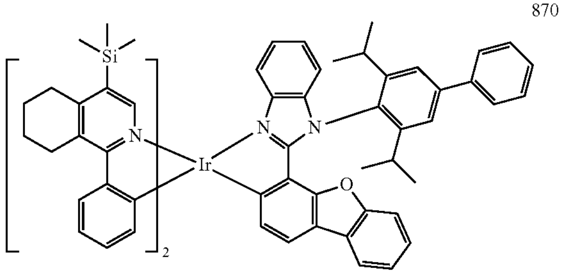
871
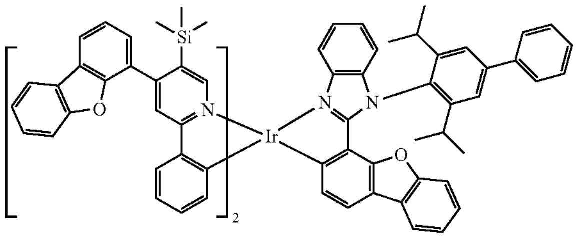
872
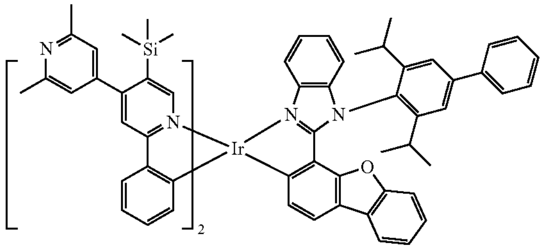

-continued
873
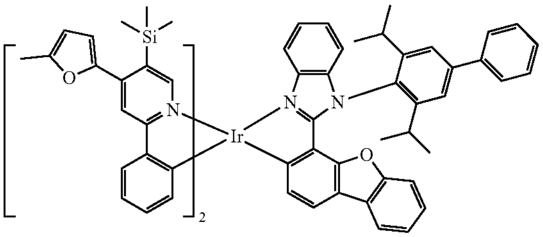
874
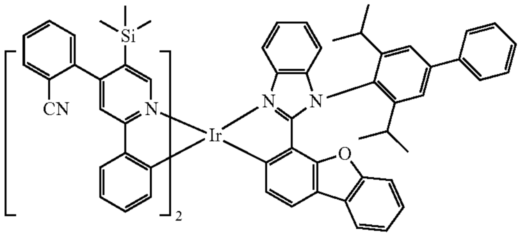
875
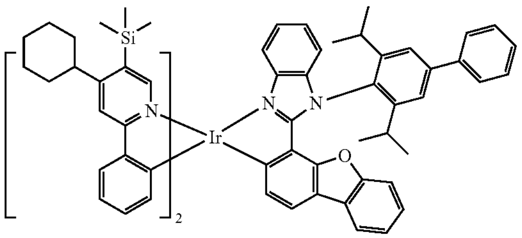
876
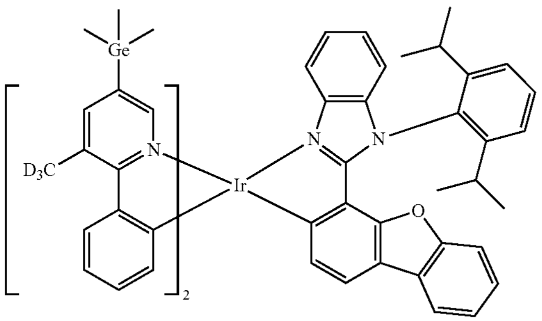
877
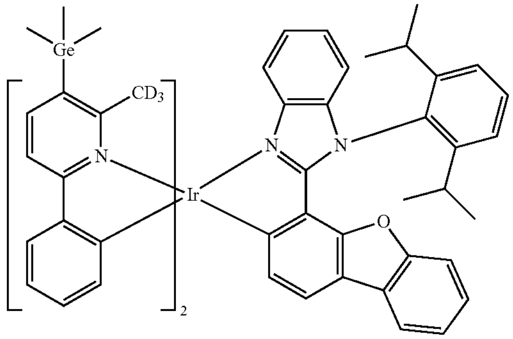
-continued
878
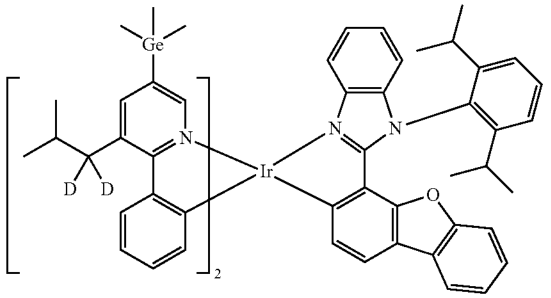
879
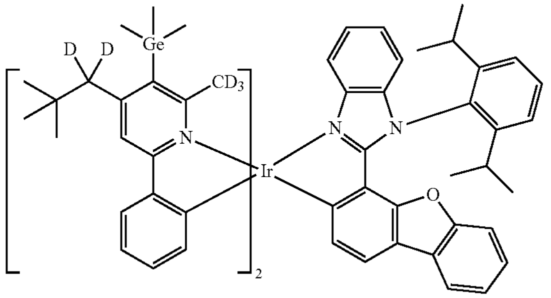
880
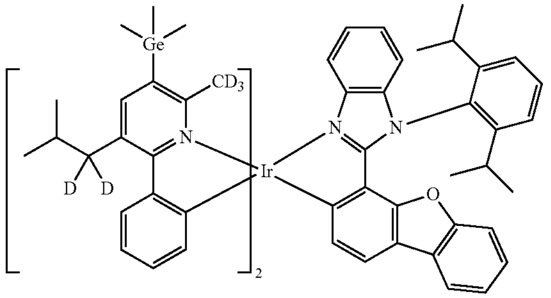
881
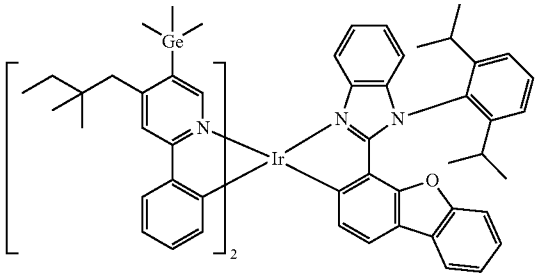
882
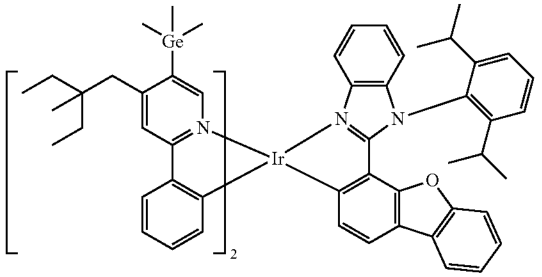

-continued
883
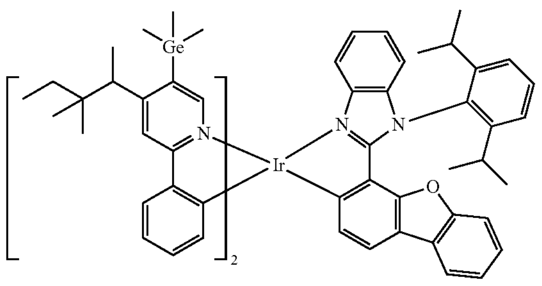
884
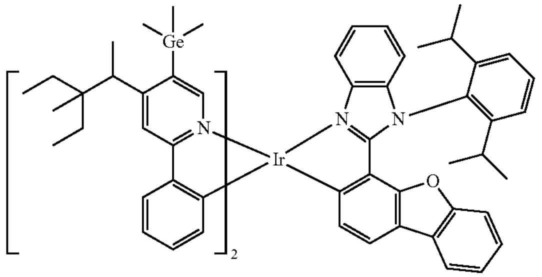
885
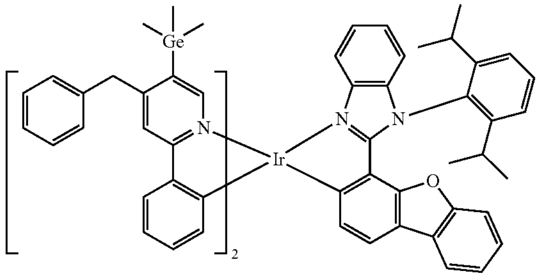
886
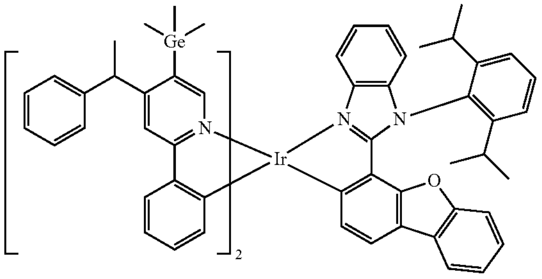
887
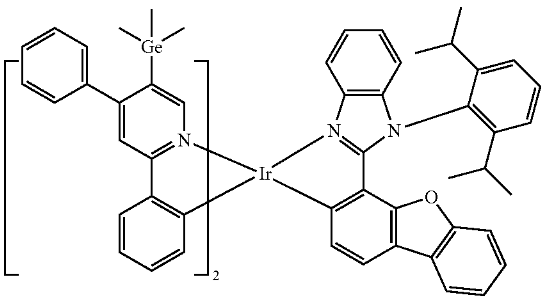
-continued
888
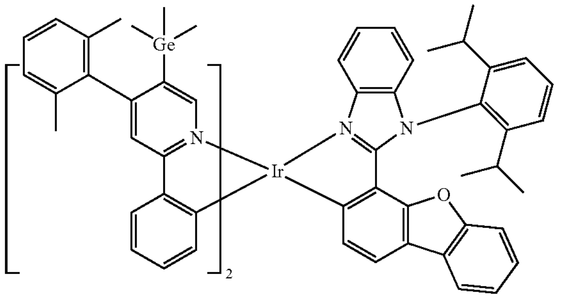
889
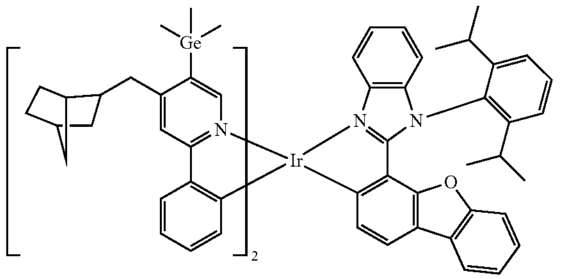
890
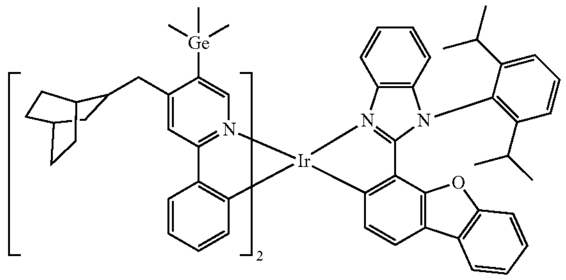
891
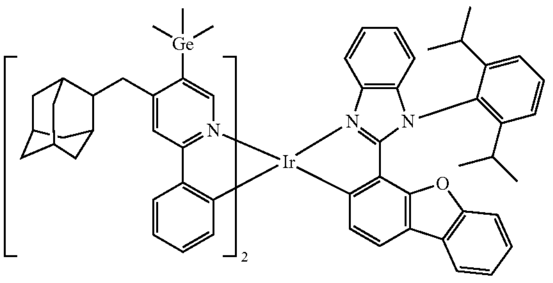
892
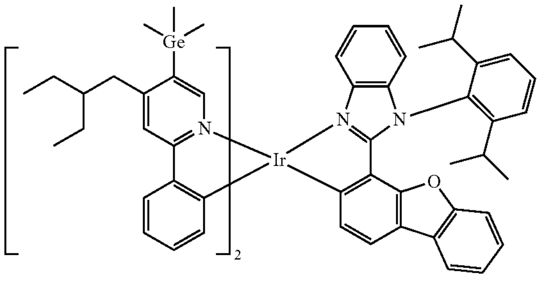

893
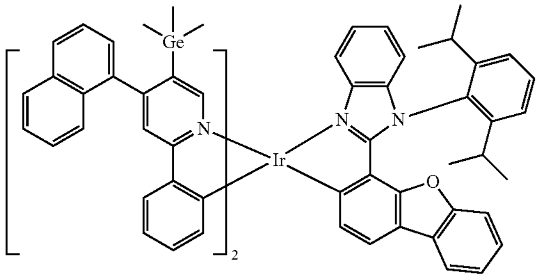
894
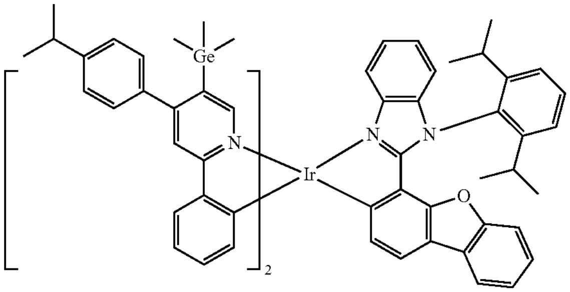
895
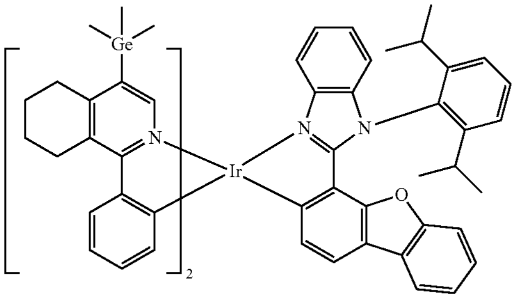
896
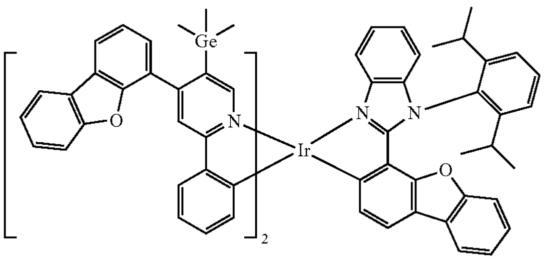
897
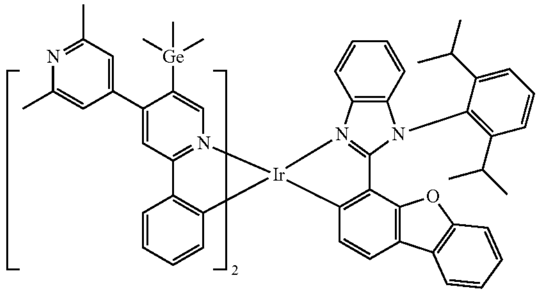
898
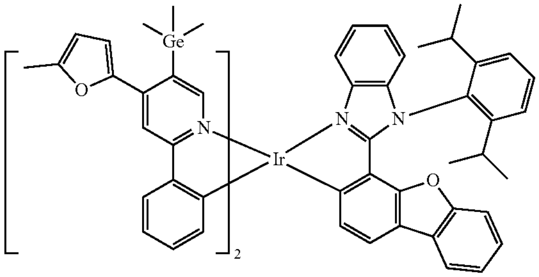
899
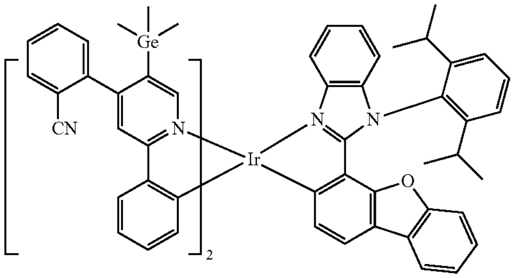
900
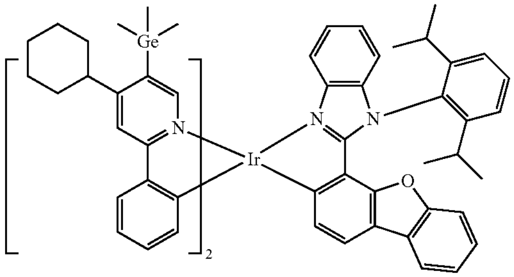
901
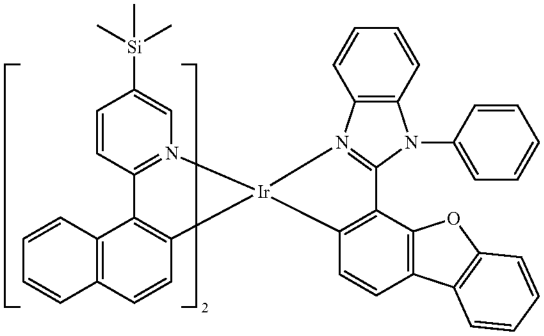
902
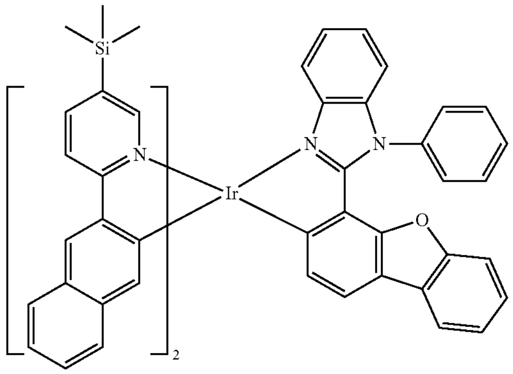

-continued
903
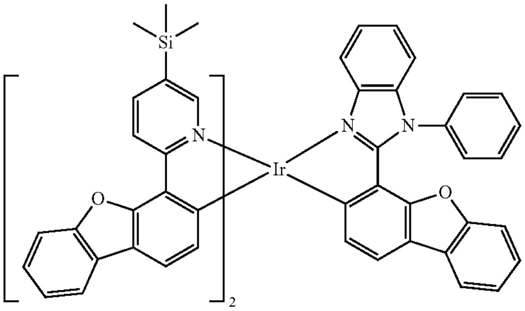
904
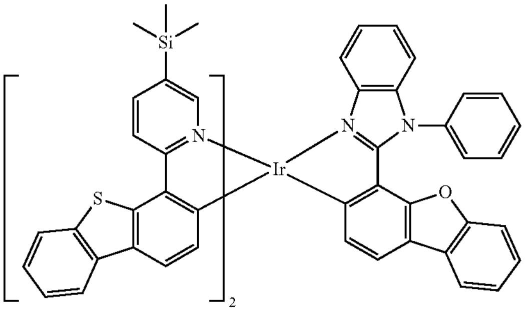
905
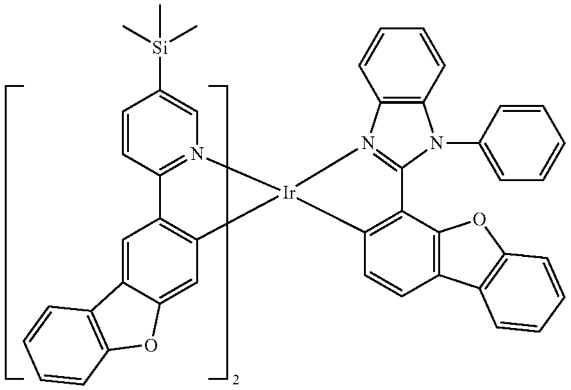
906
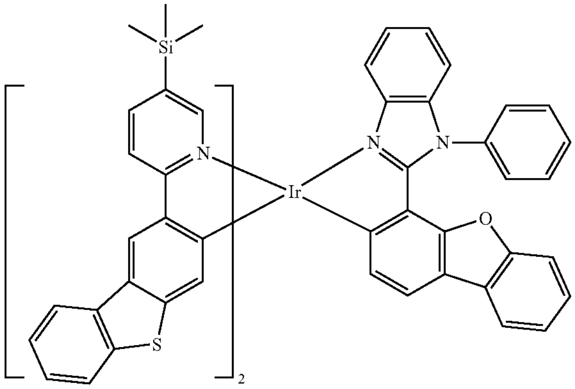
-continued
907
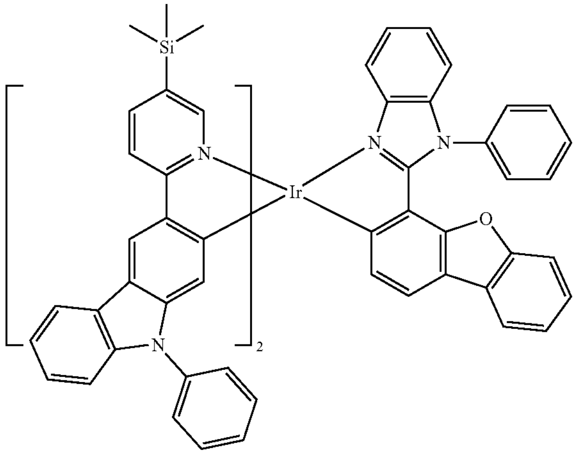
908
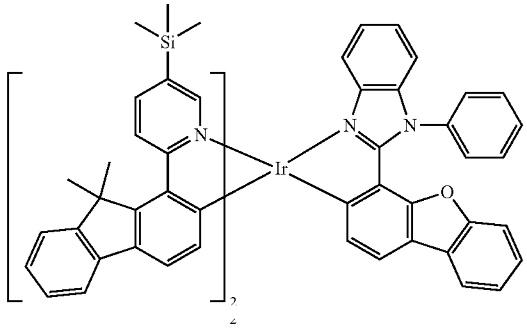
909
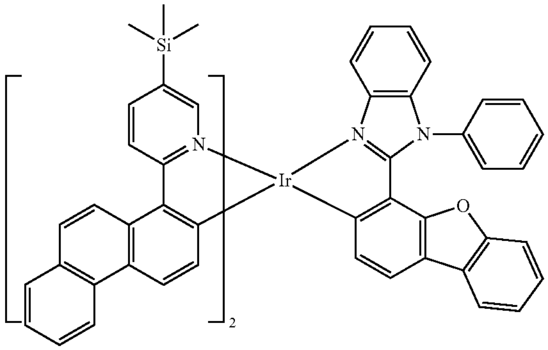
910
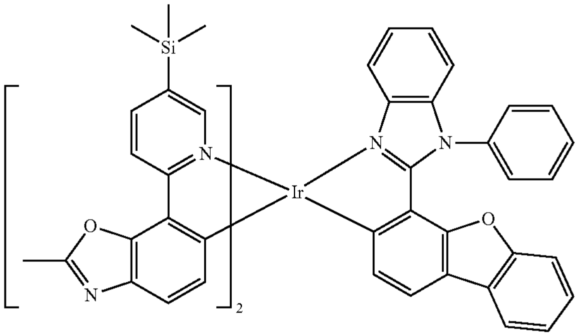

-continued
911
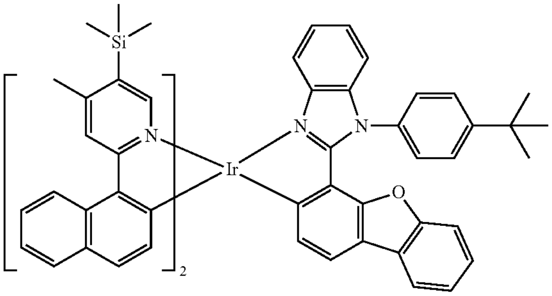
912
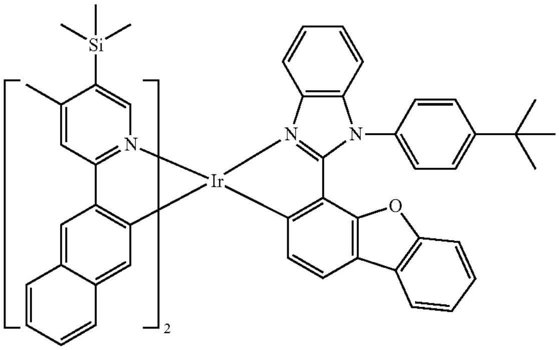
913
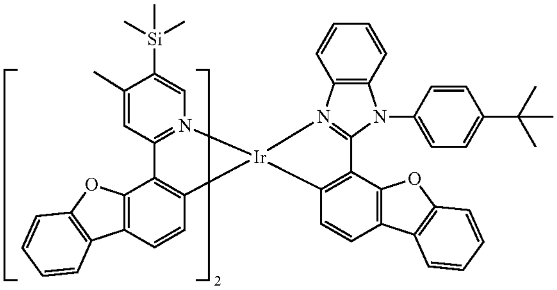
914
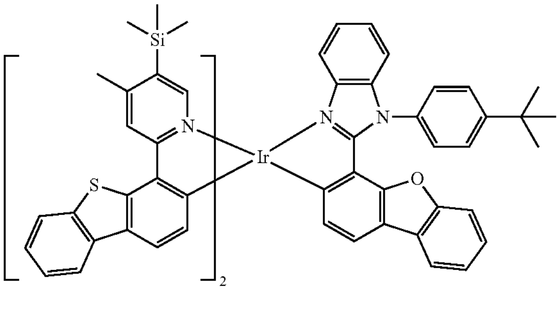
-continued
915
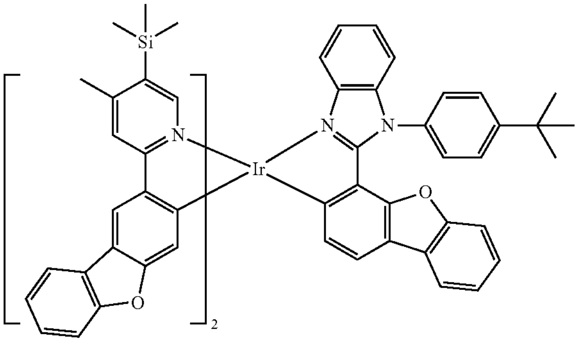
916
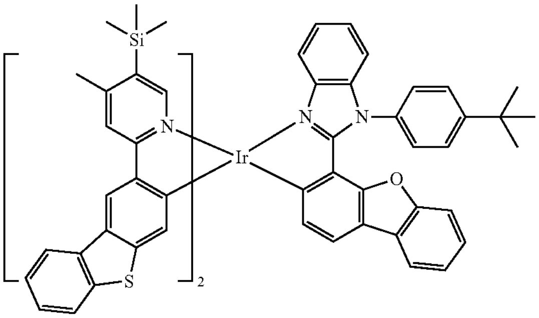
917
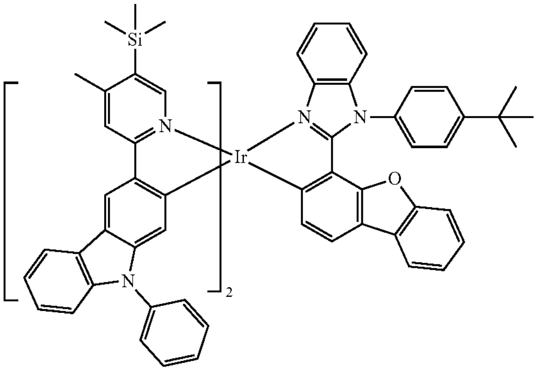
918
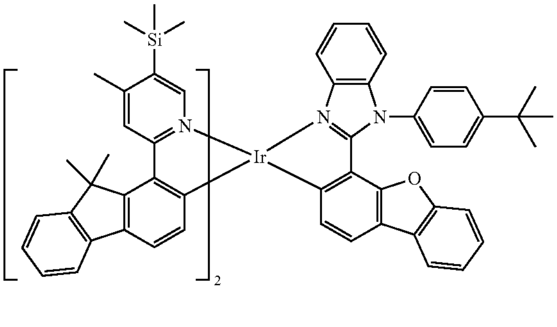

919
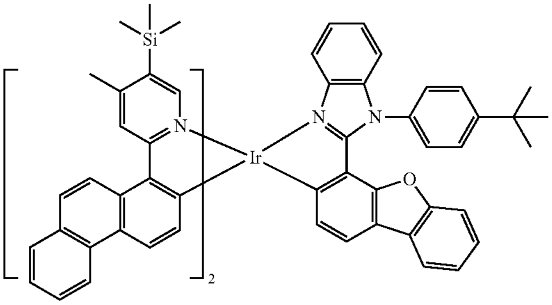
920
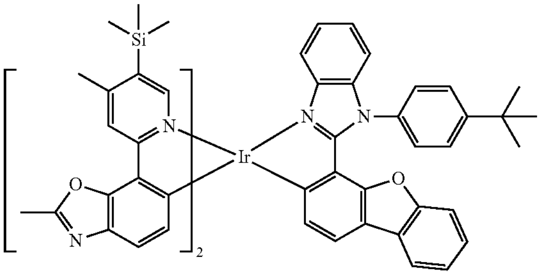
921
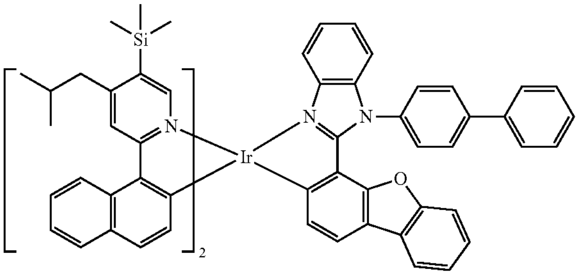
922
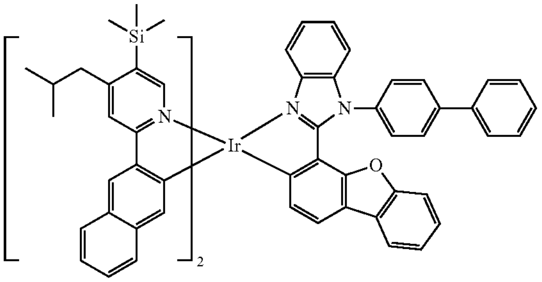
923
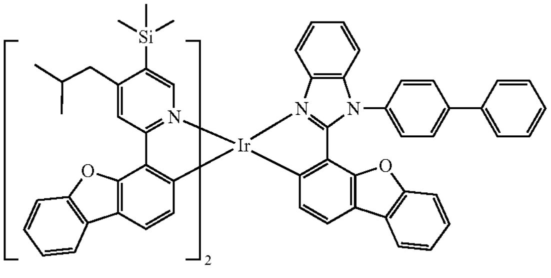
924
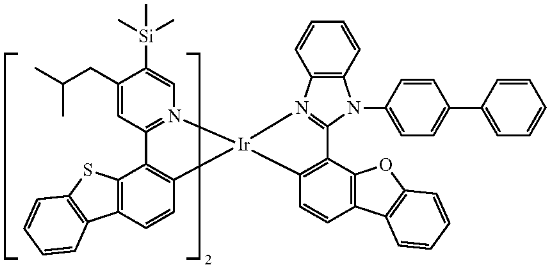
925
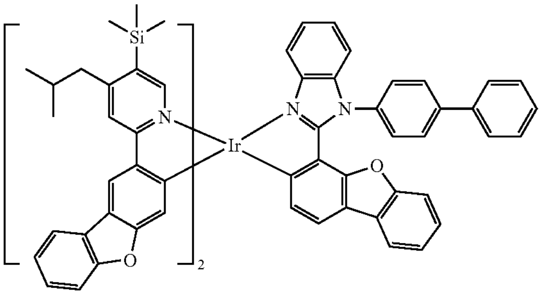
926
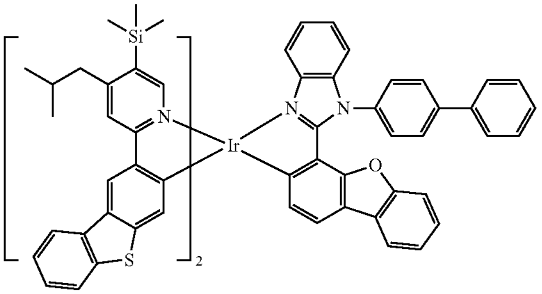
927
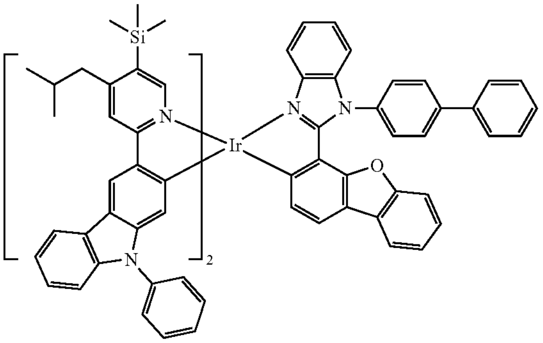
928
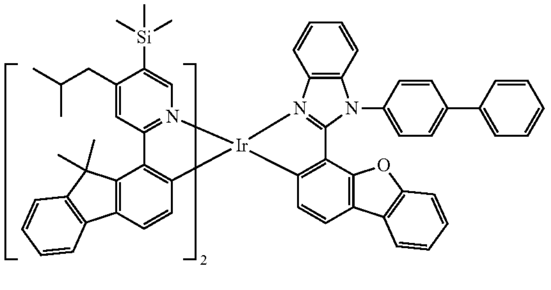

929
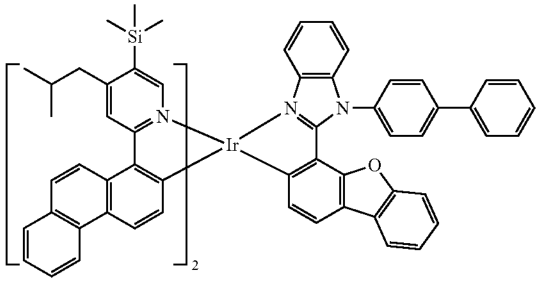
930
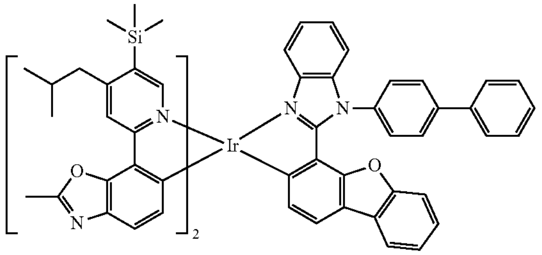
931
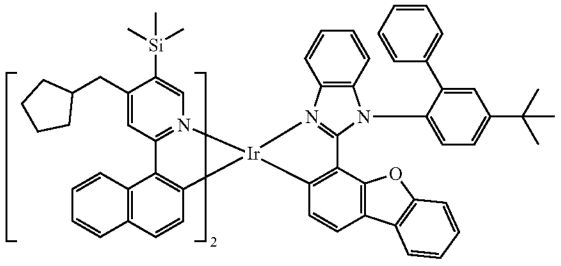
932
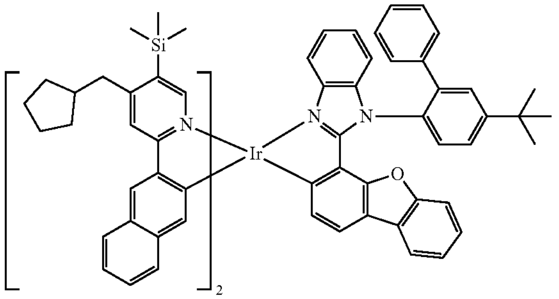
933
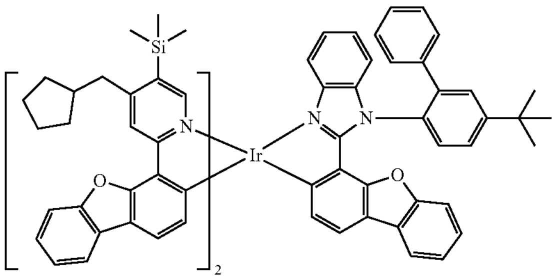
934
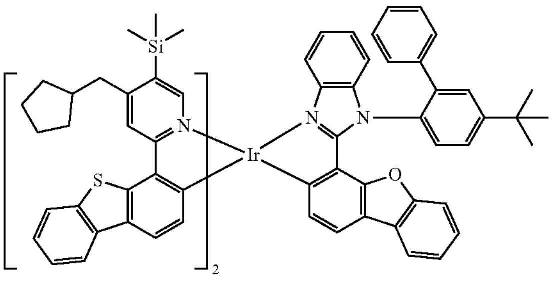
935
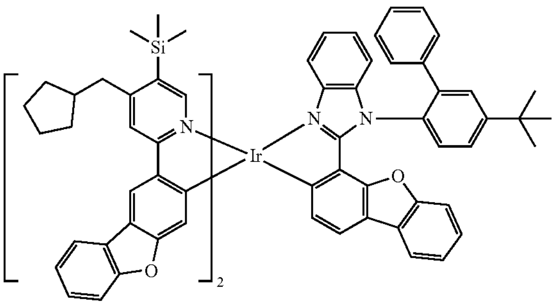
936
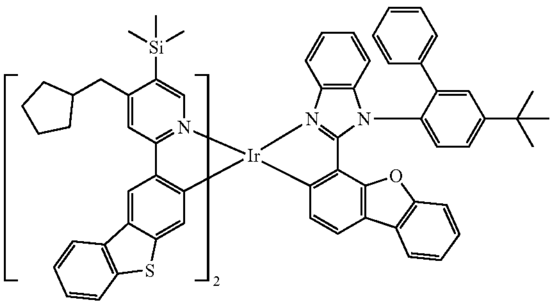
937
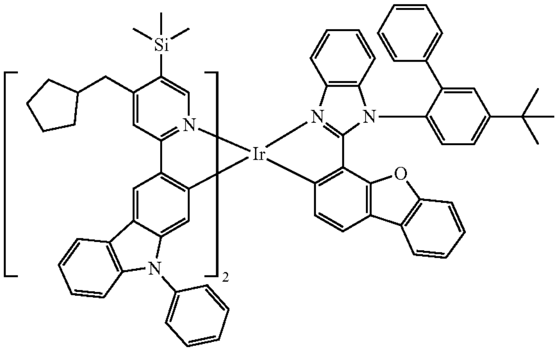
938
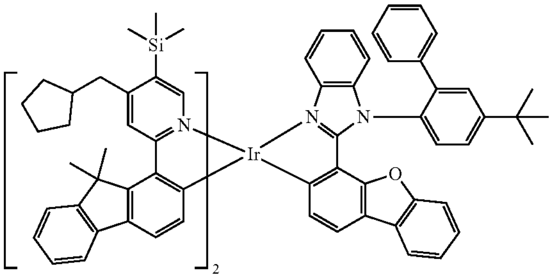

939
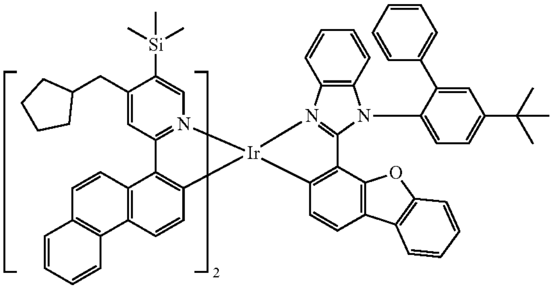
940
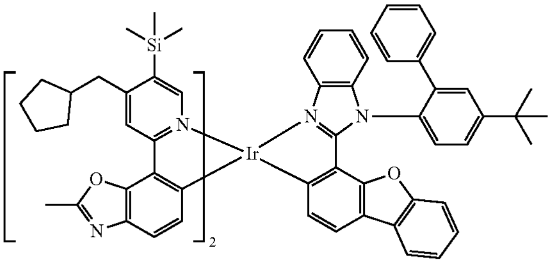
941
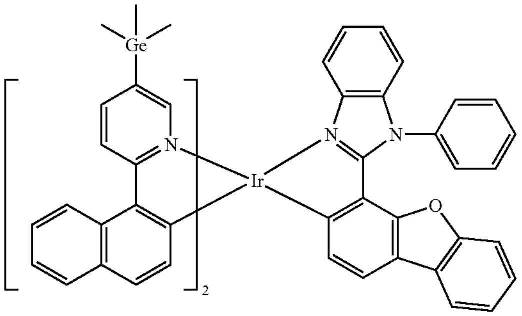
942
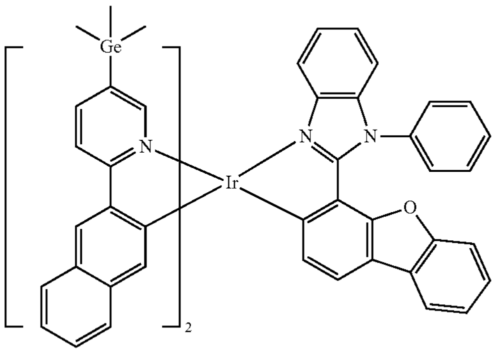
943
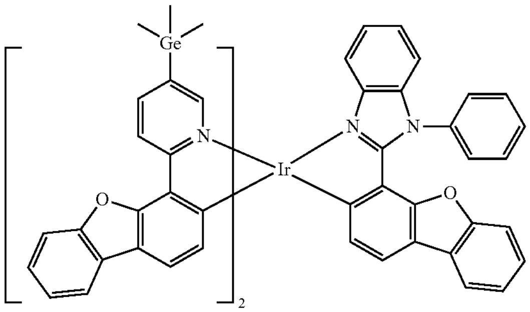
944
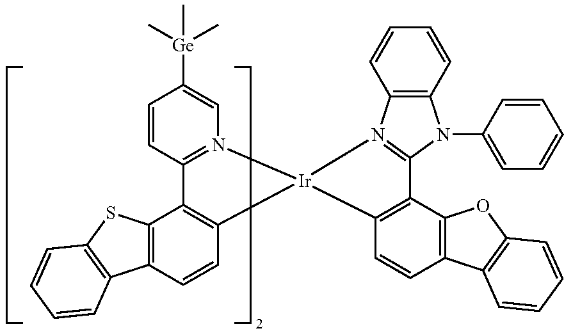
945
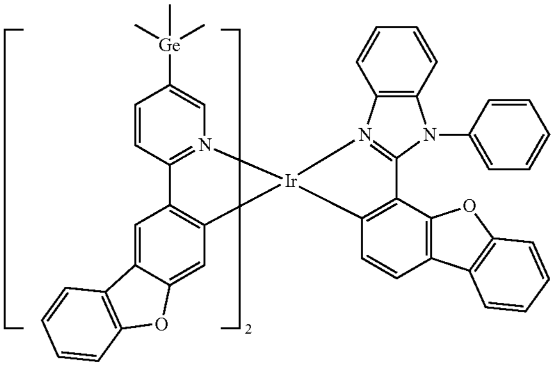
946
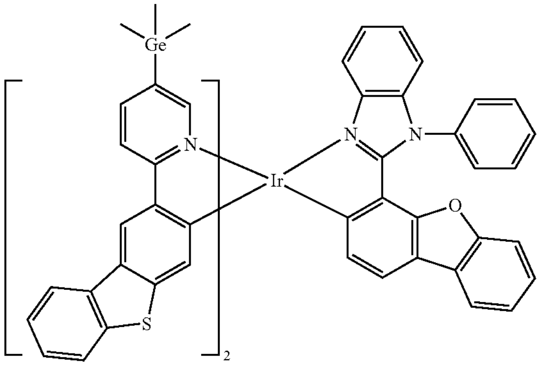

-continued
947
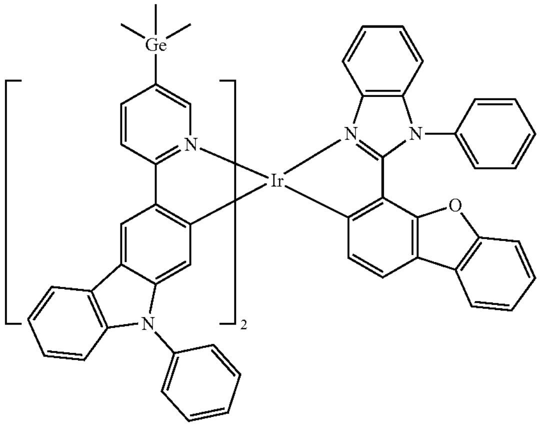
948
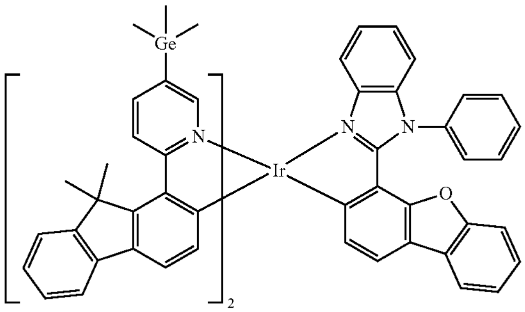
949
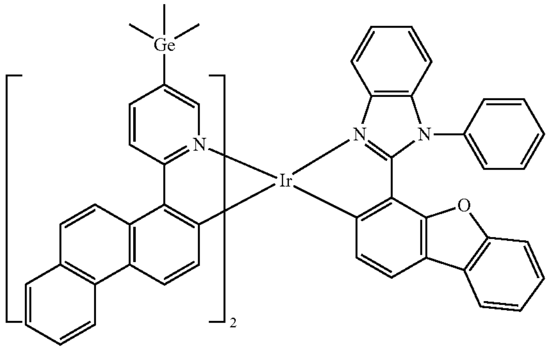
950
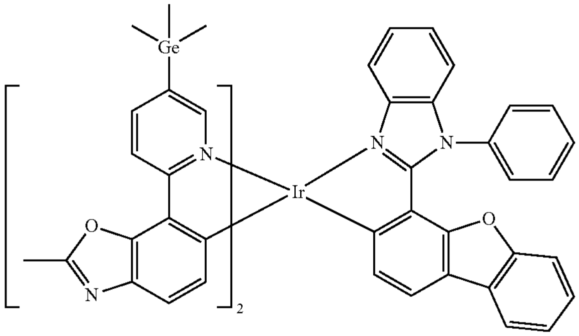
-continued
951
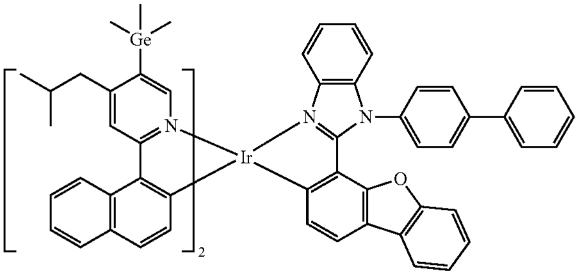
952
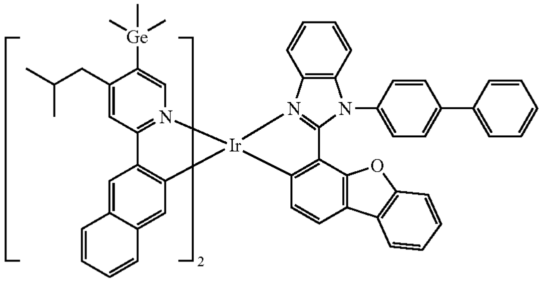
953
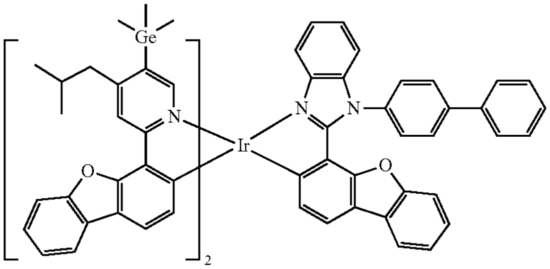
954
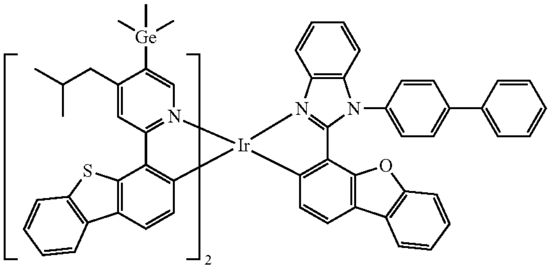
955
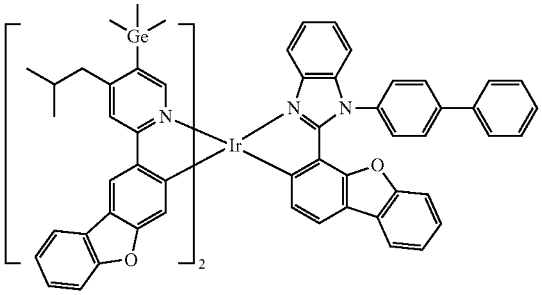

-continued
956
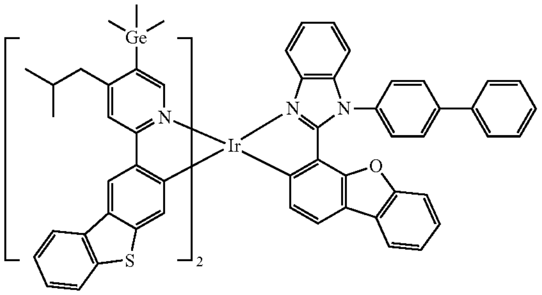
957
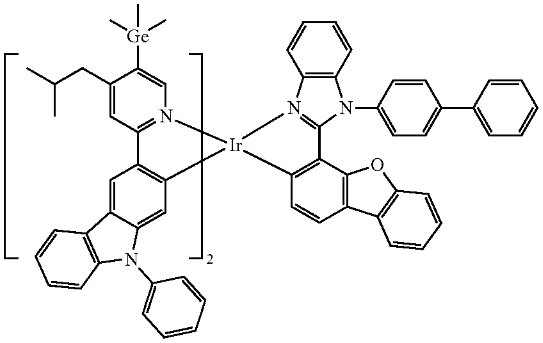
958
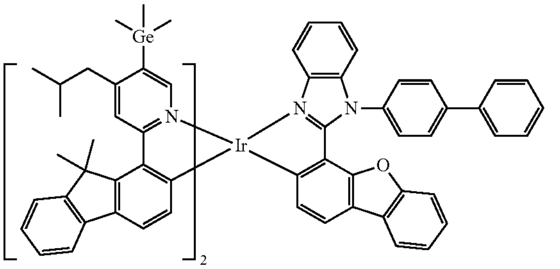
959
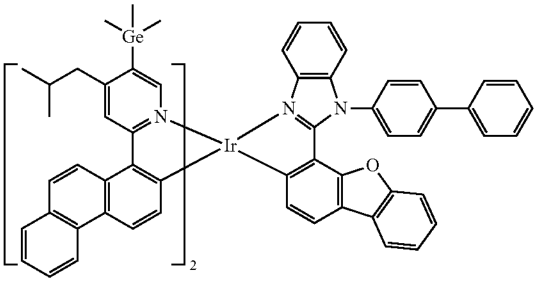
960
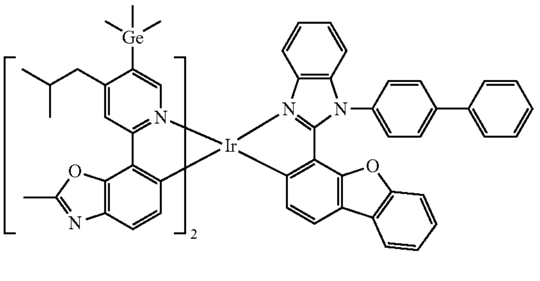
-continued
961
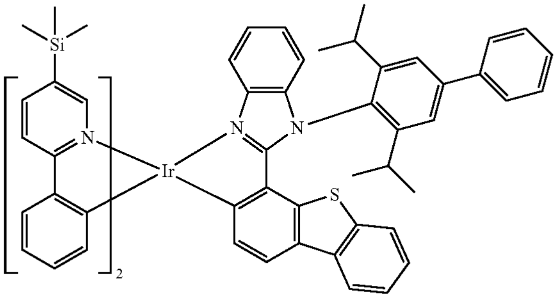
962
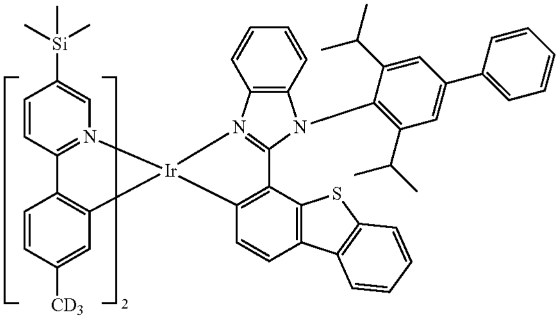
963
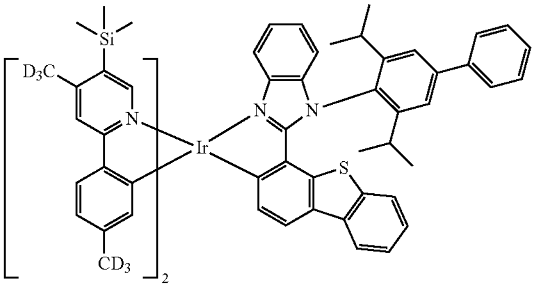
964
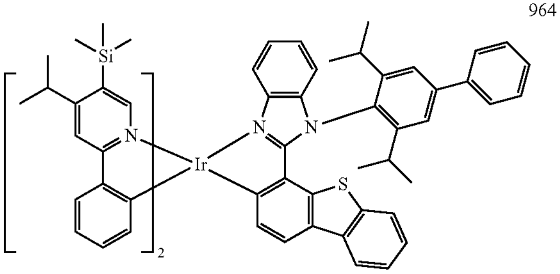
965
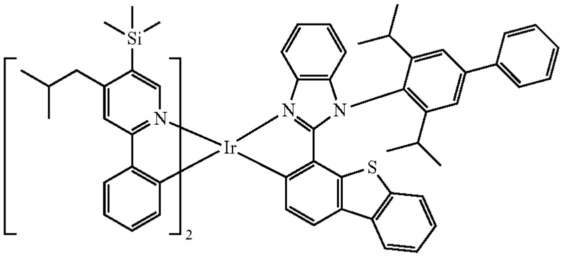

-continued
966
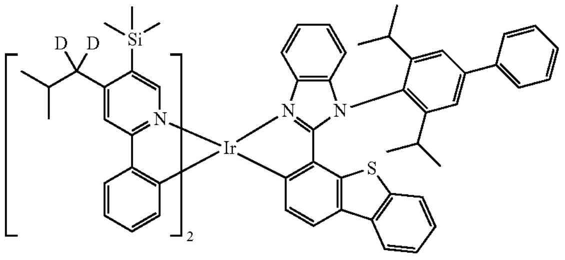
967
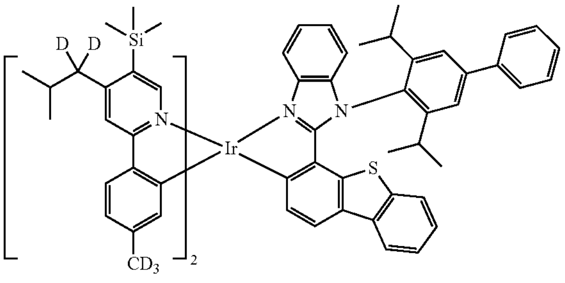
968
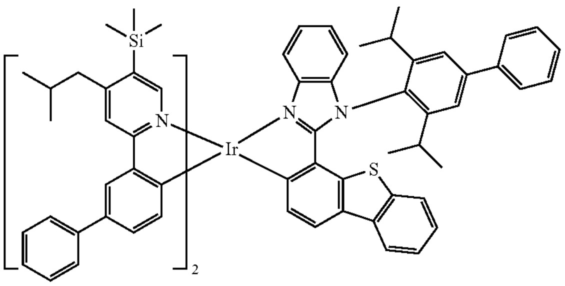
969
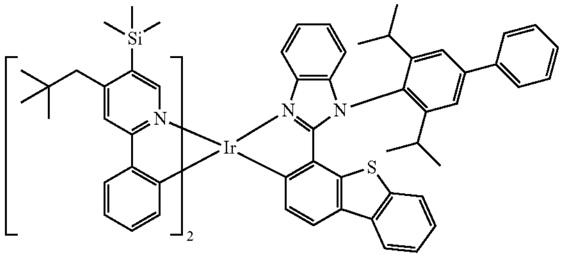
970
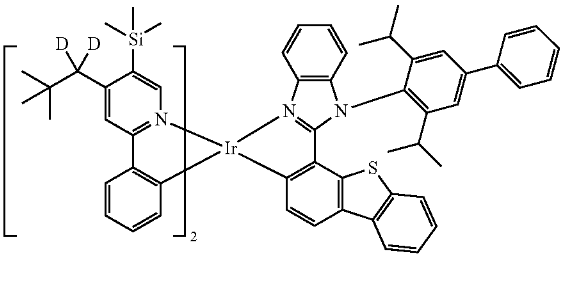
-continued
971
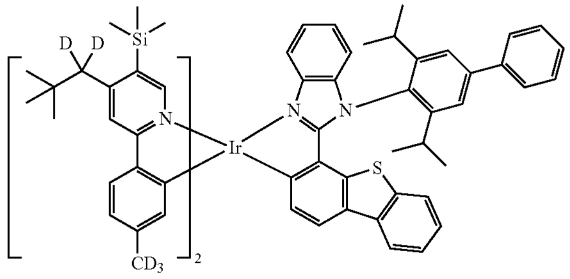
972
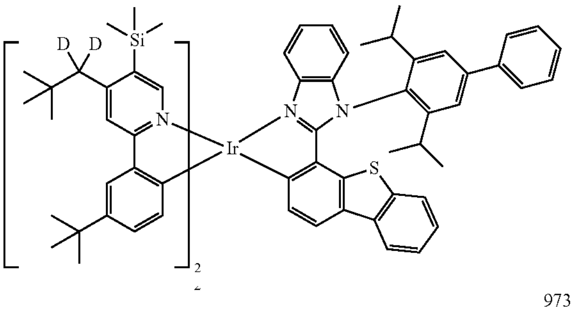
973
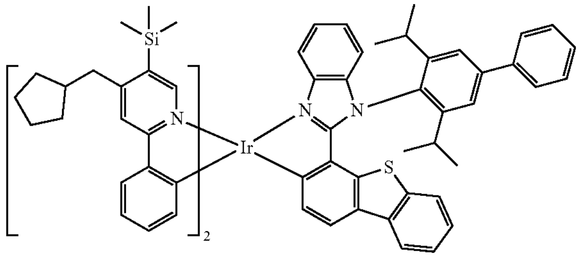
974
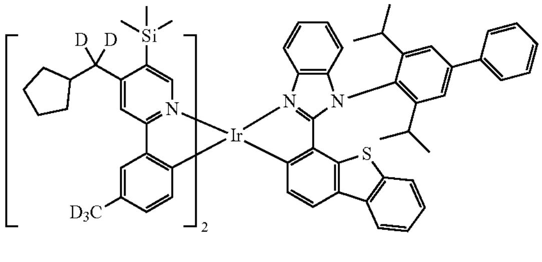
975
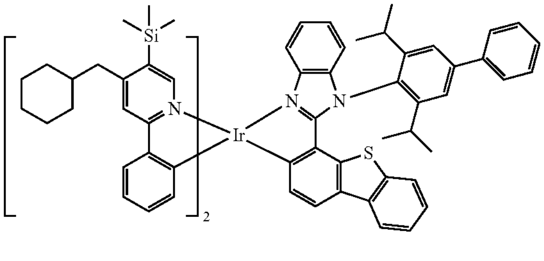

-continued
976
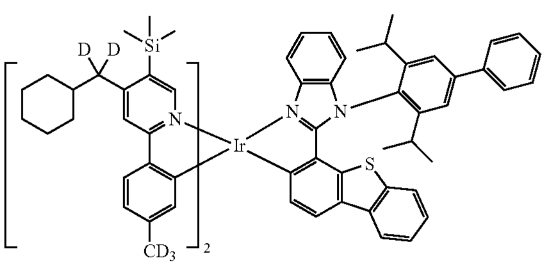
977
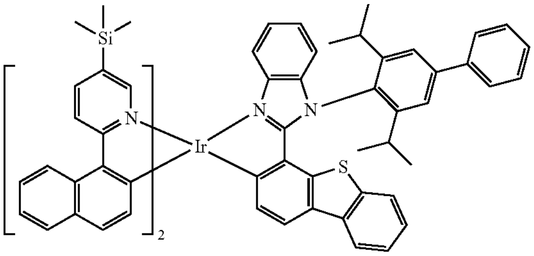
978
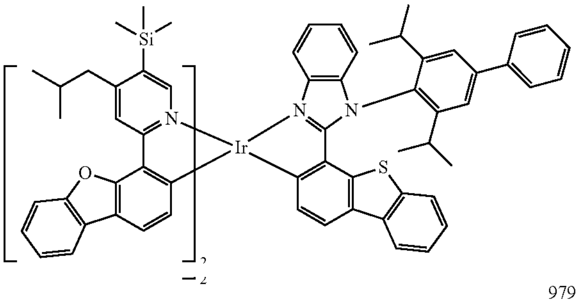
979
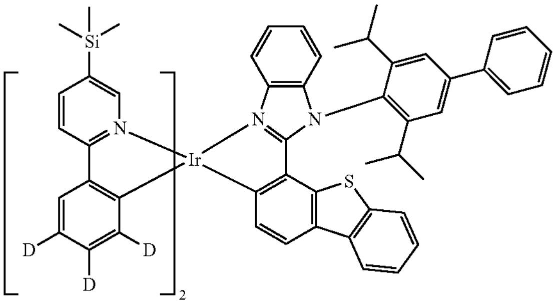
980
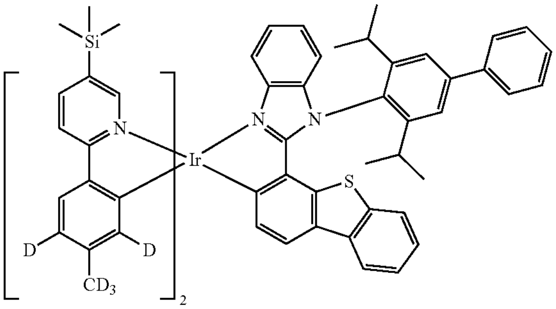
-continued
981
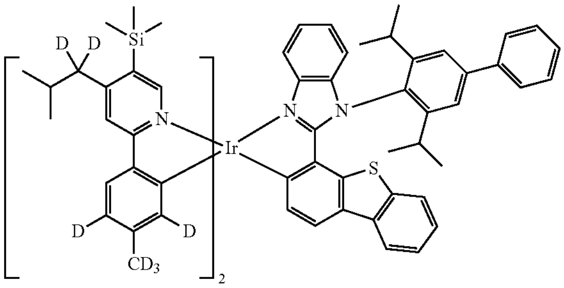
982
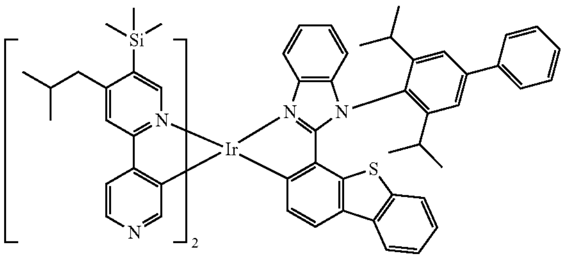
983
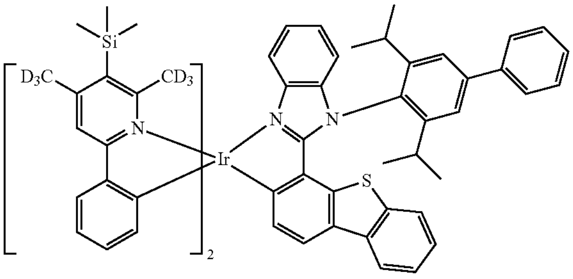
984
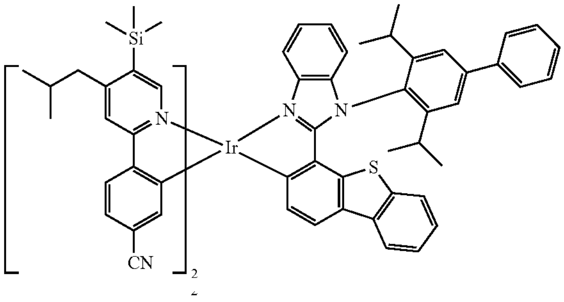
985
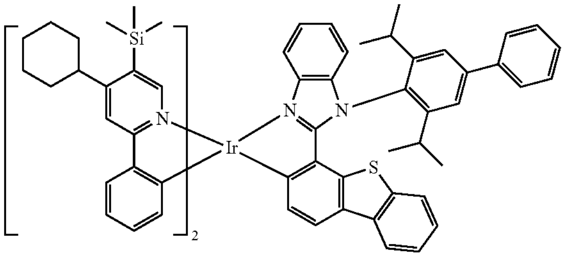

986
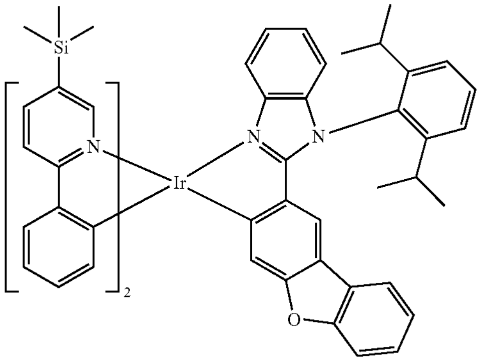
987
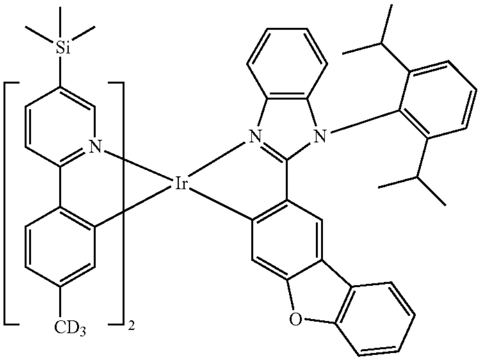
988
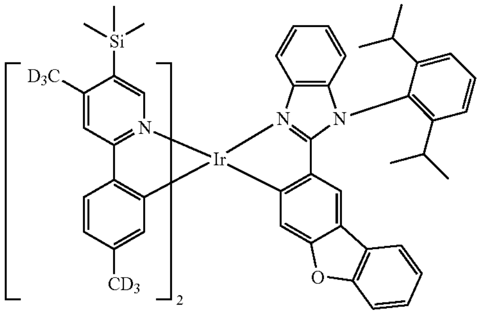
989
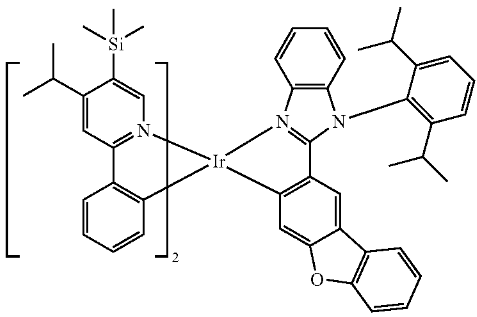
-continued
990
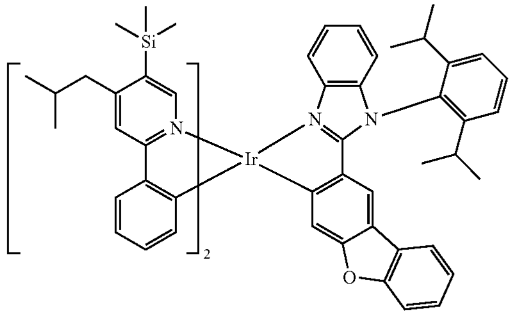
991
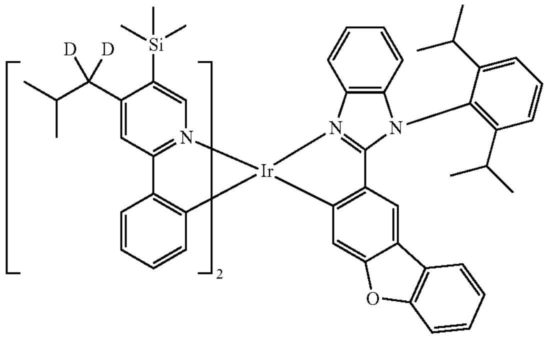
992
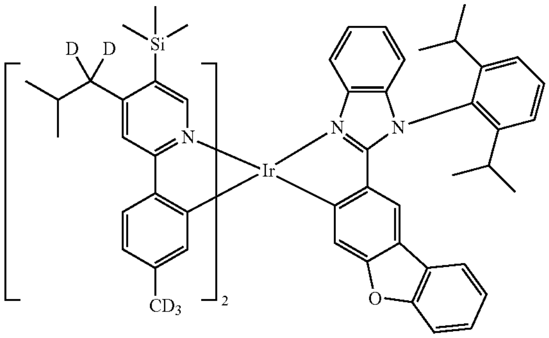
993
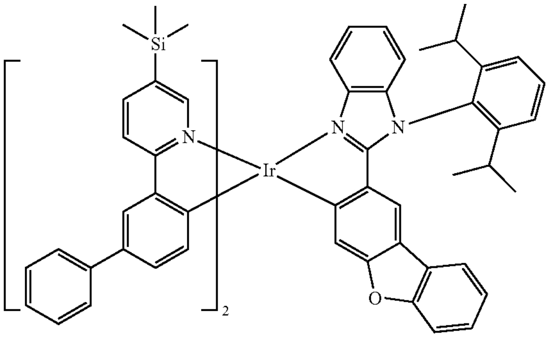

-continued
994
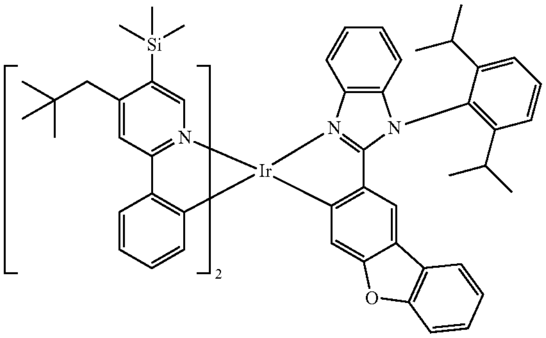
995
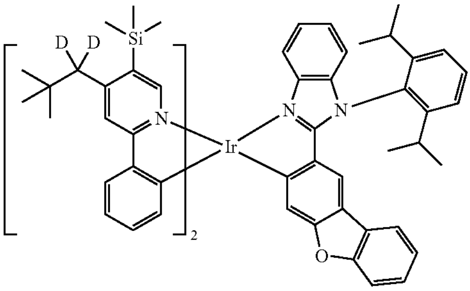
996
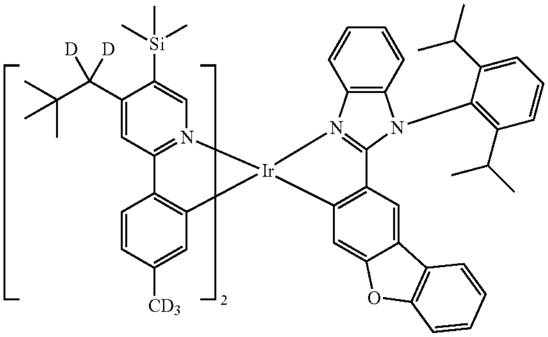
997
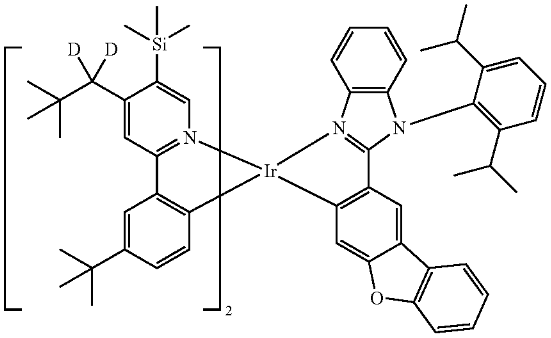
-continued
998
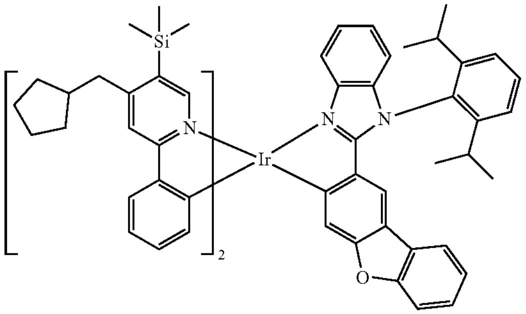
999
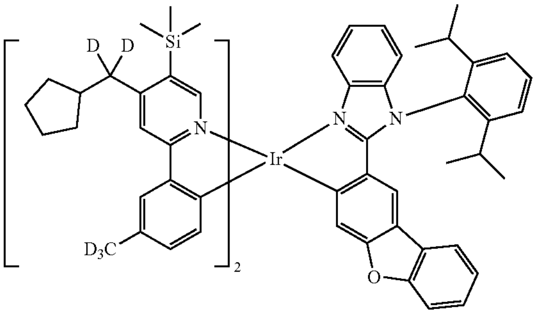
1000
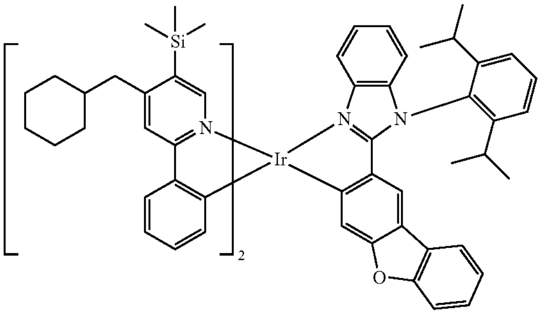
1001
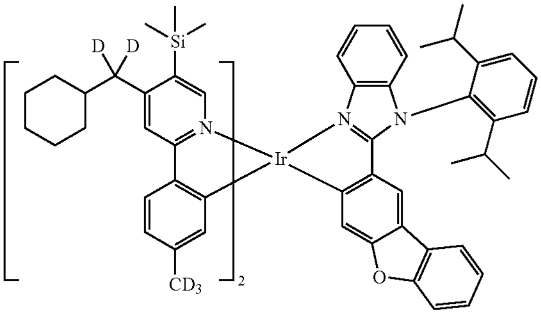

-continued
1002
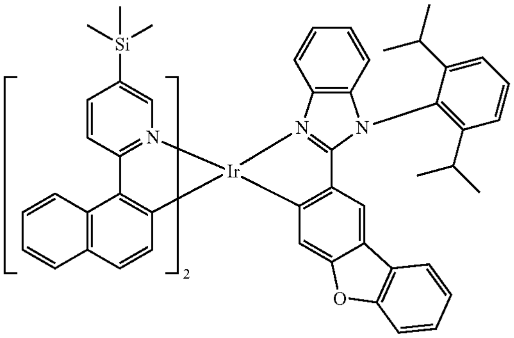
1003
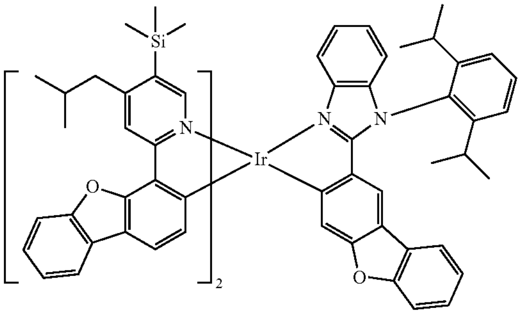
1004
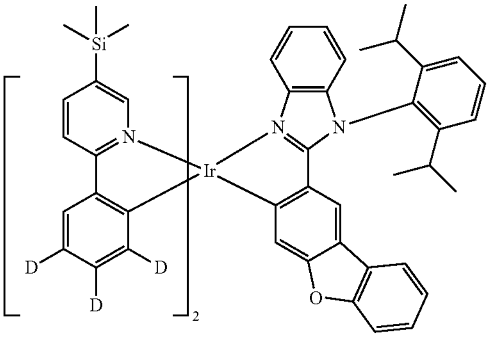
1005
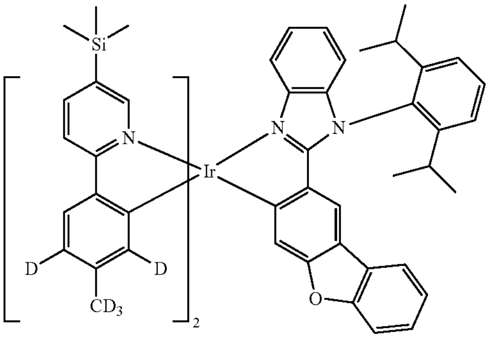
-continued
1006
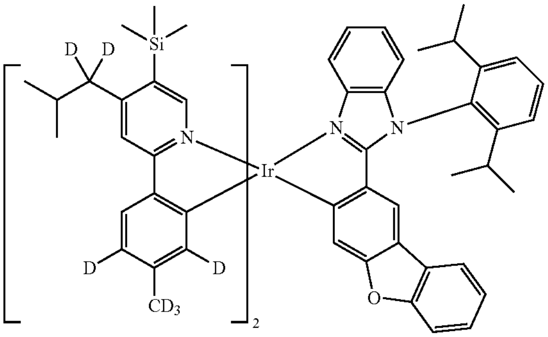
1007
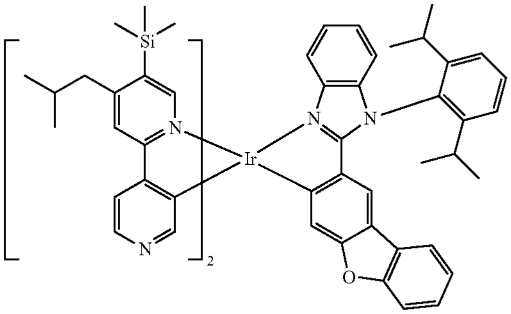
1008
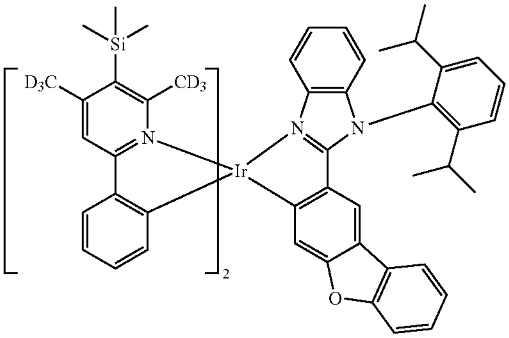
1009
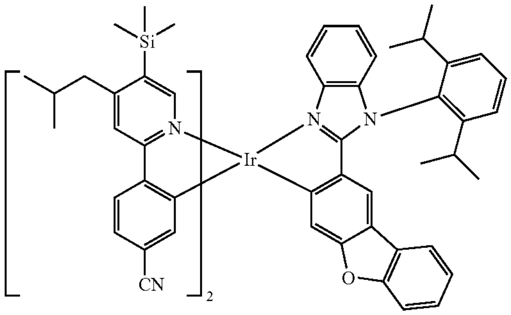

1010
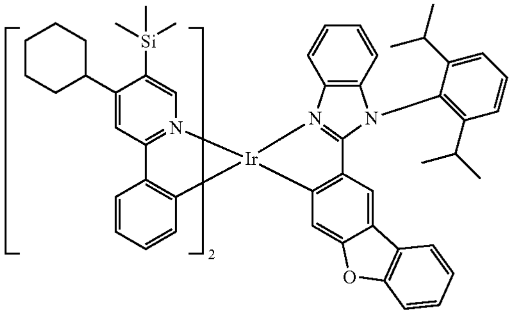
1011
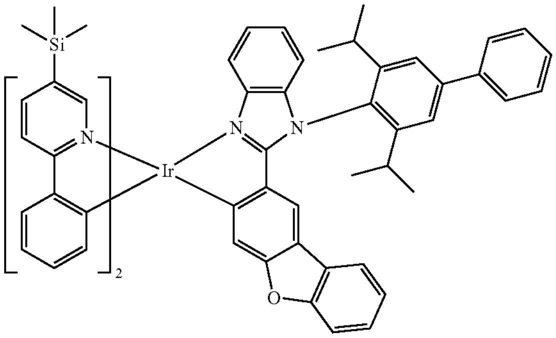
1012
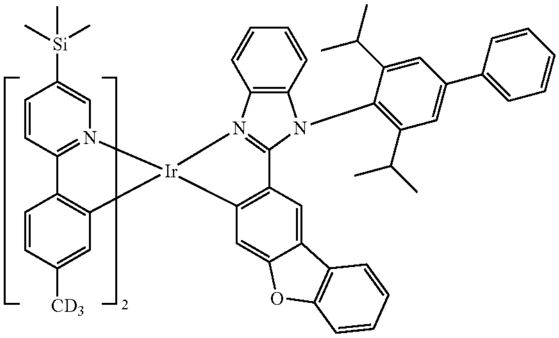
1013
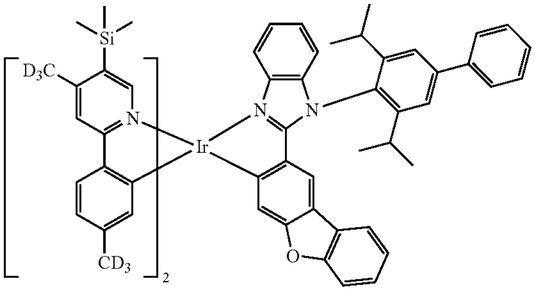
1014
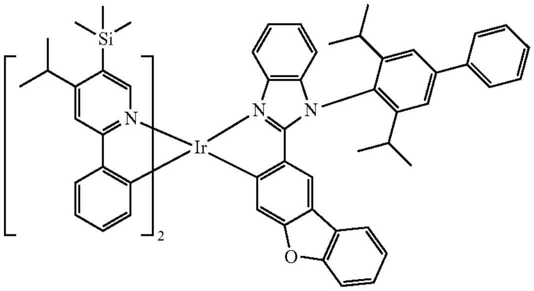
1015
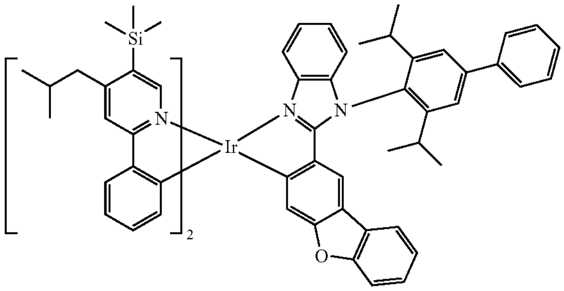
1016
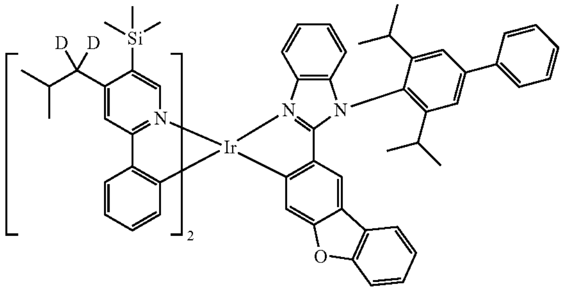
1017
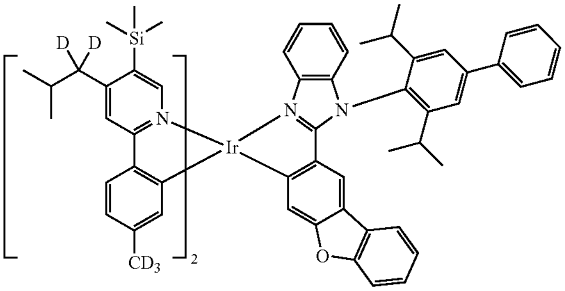
1018
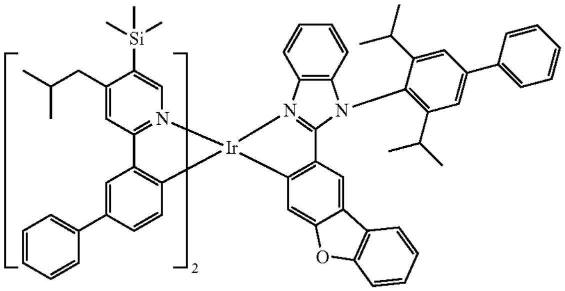

-continued
1019
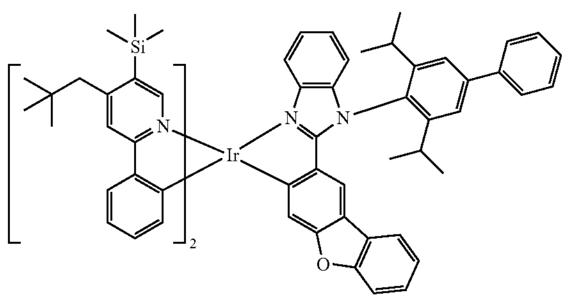
1020
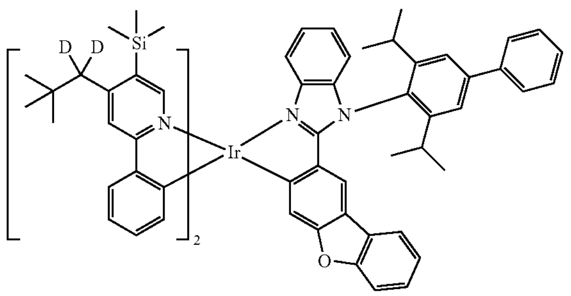
1021
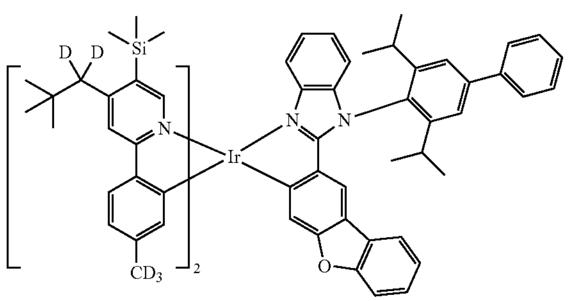
1022
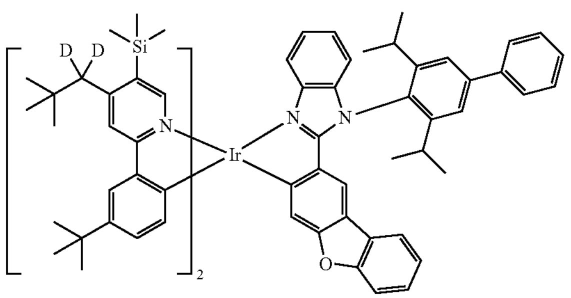
1023
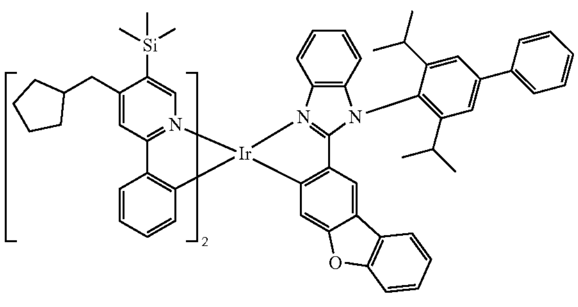
-continued
1024
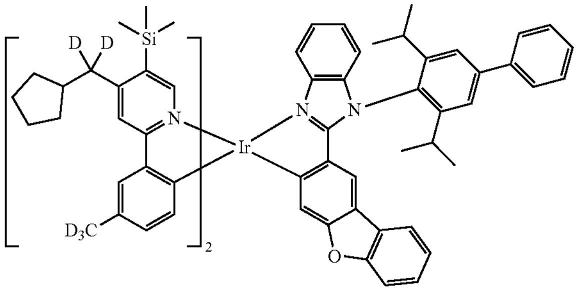
1025
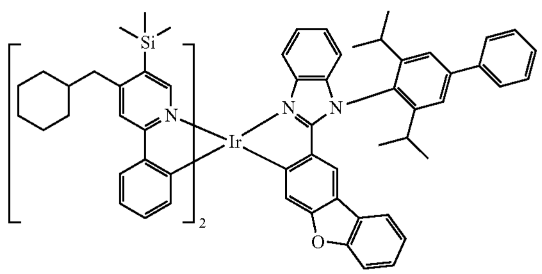
1026
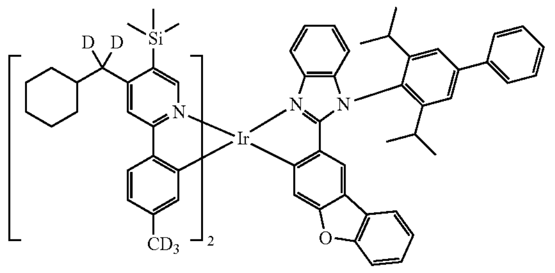
1027
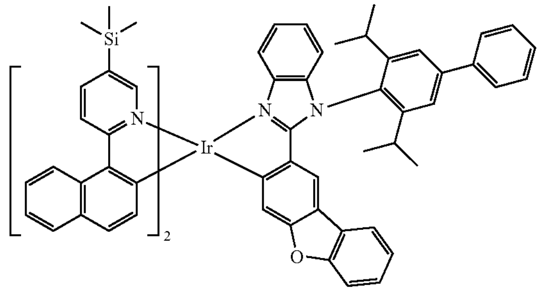
1028
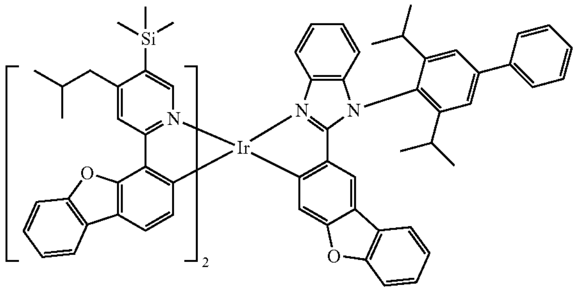

-continued
1029
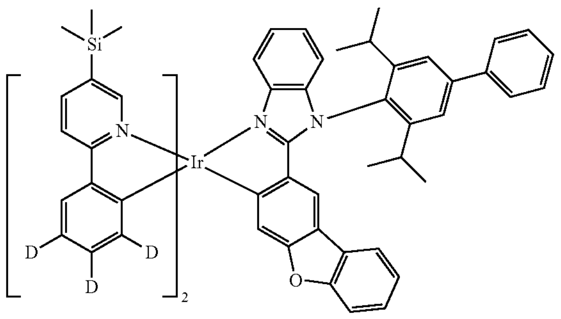
1030
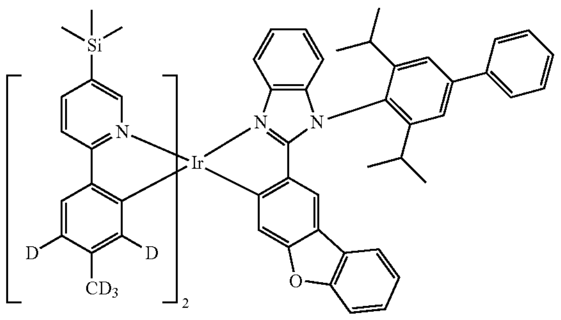
1031
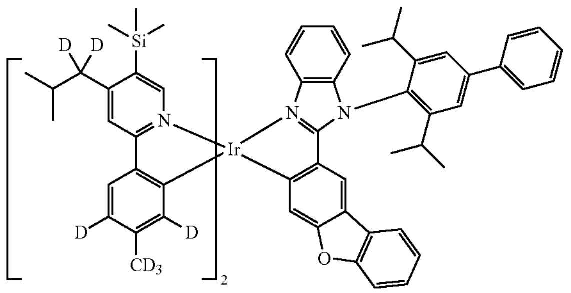
1032
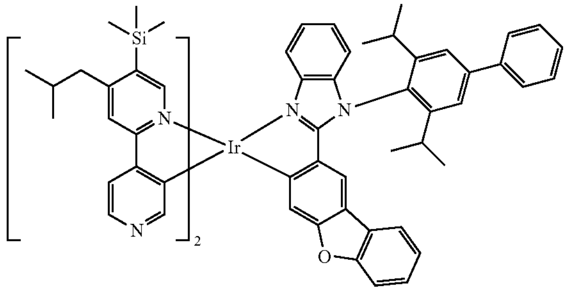
1033
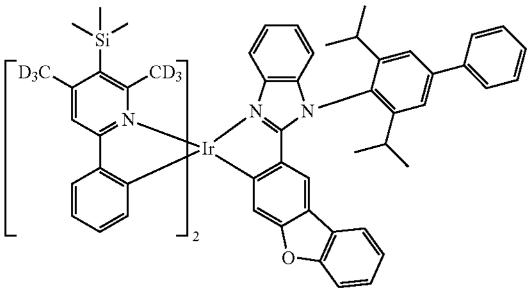
-continued
1034
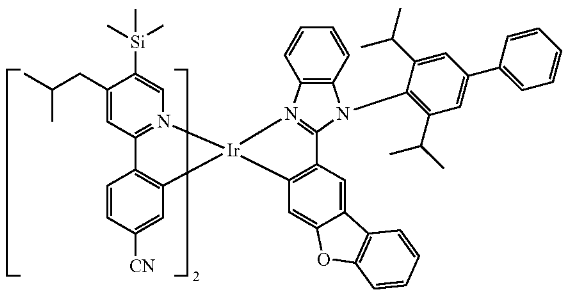
1035
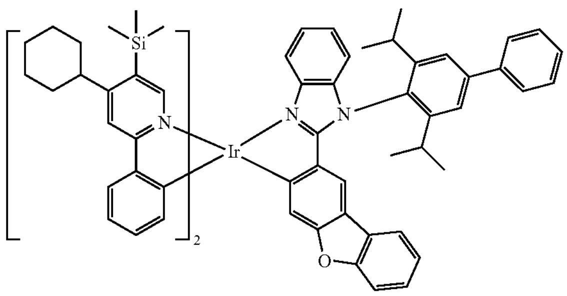
1036
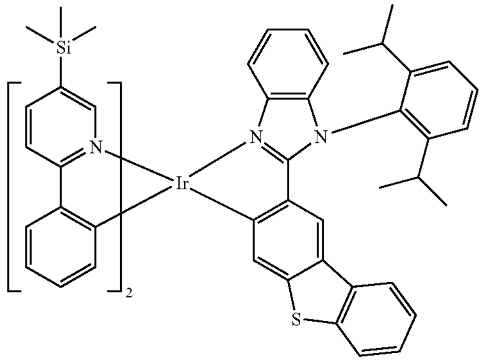
1037
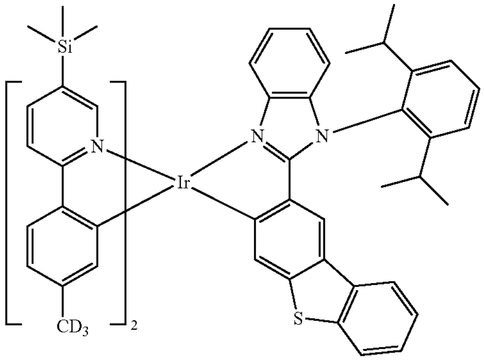

1038
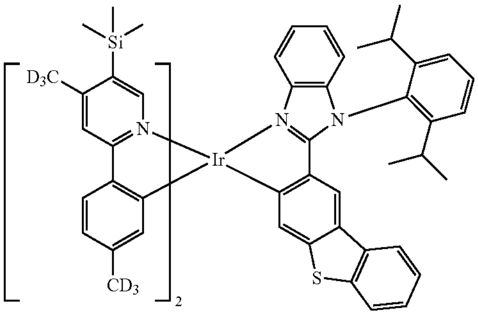
1039
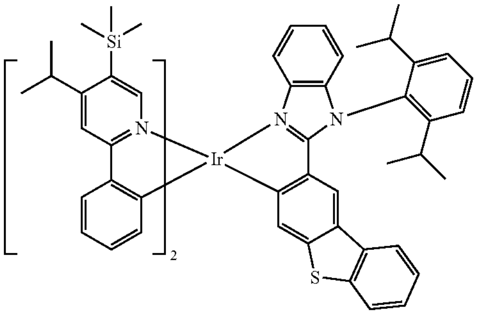
1040
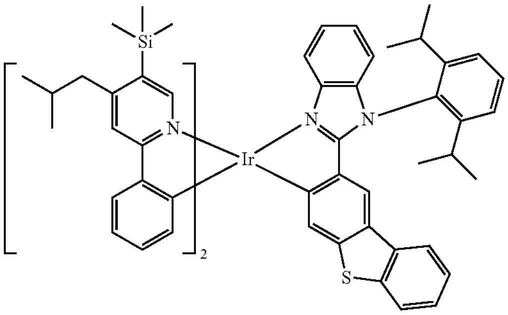
1041
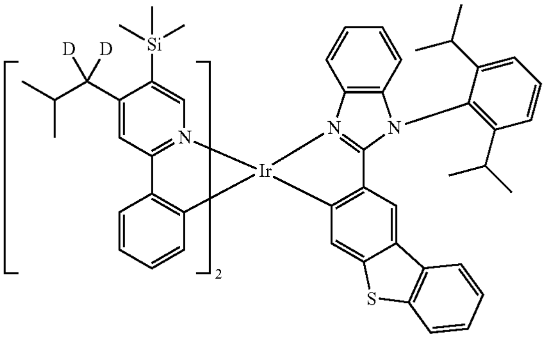
1042
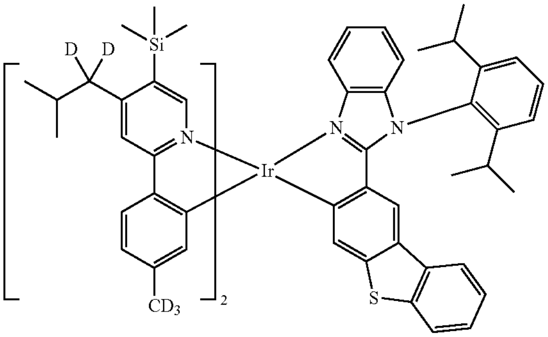
1043
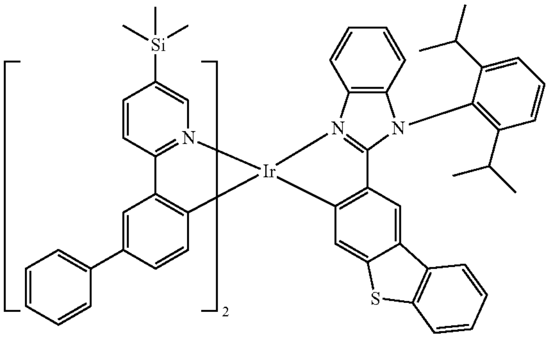
1044
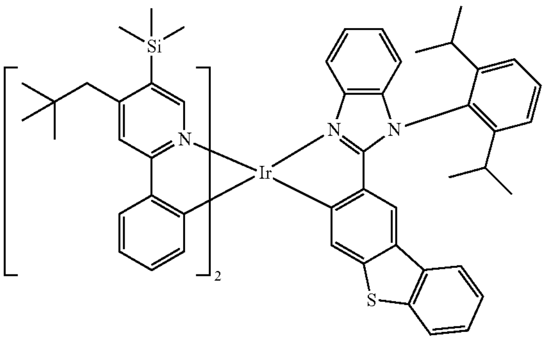
1045
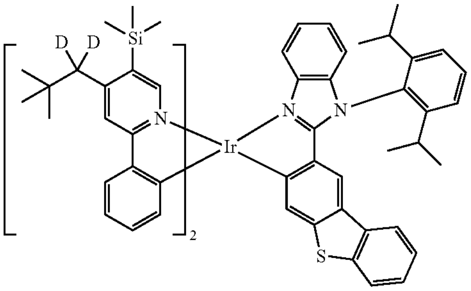

-continued
1046
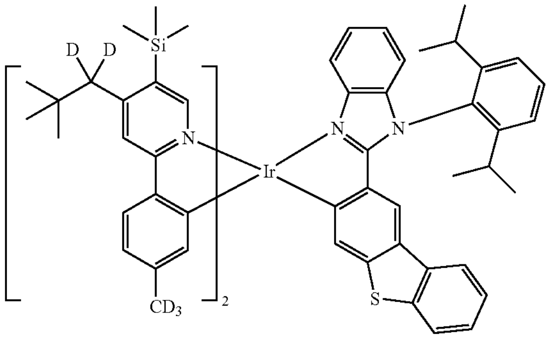
1047
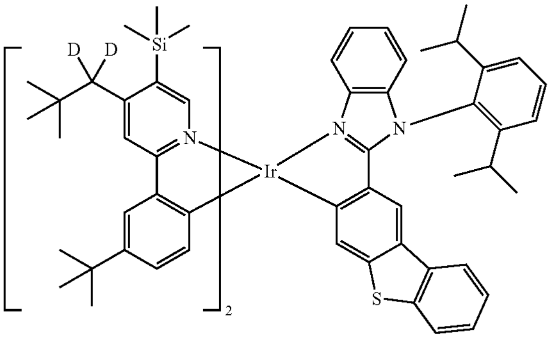
1048
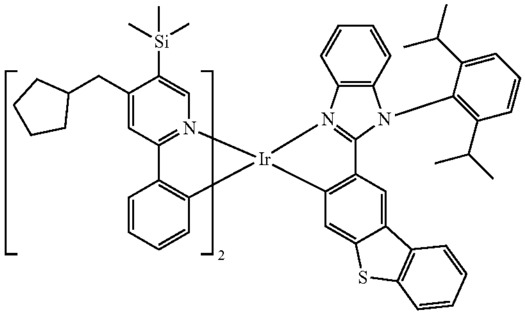
1049
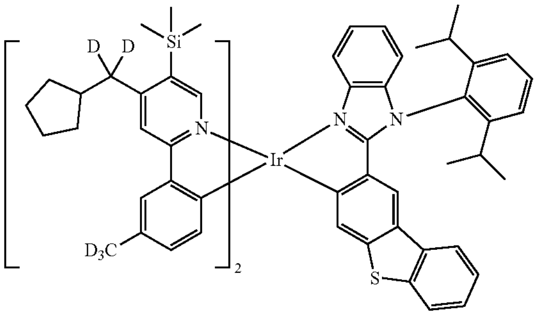
-continued
1050
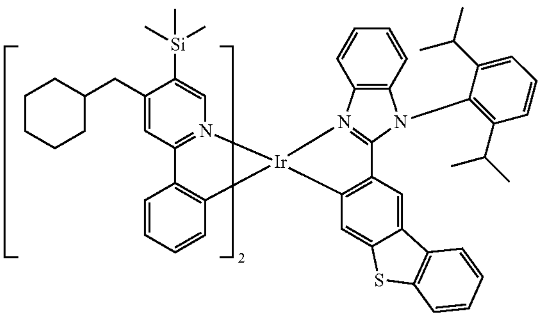
1051
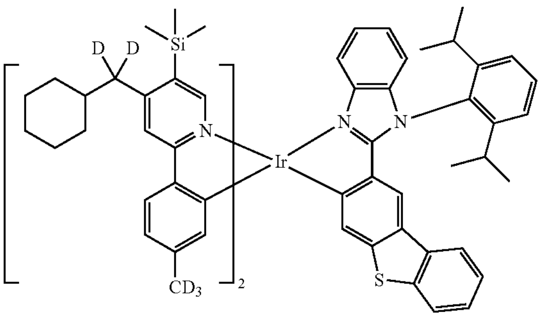
1052
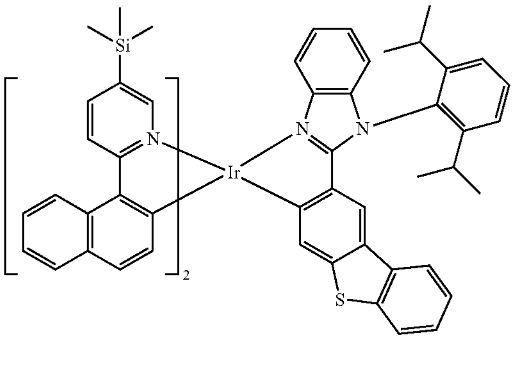
1053
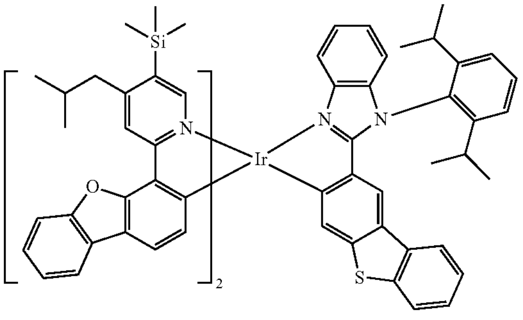

-continued
1054
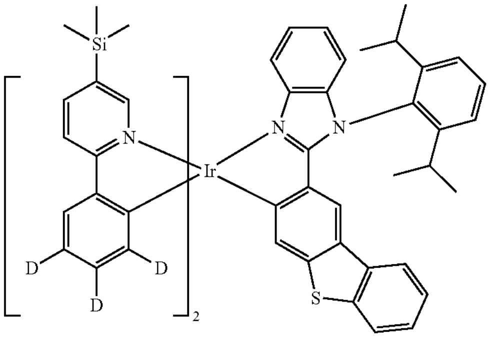
1055
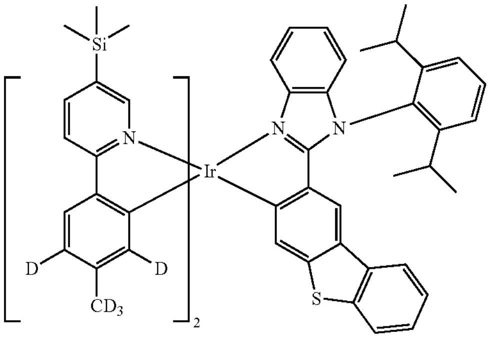
1056
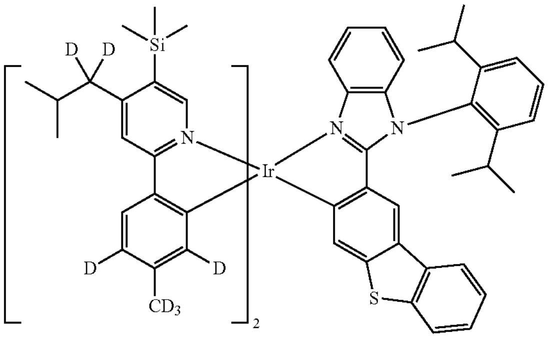
1057
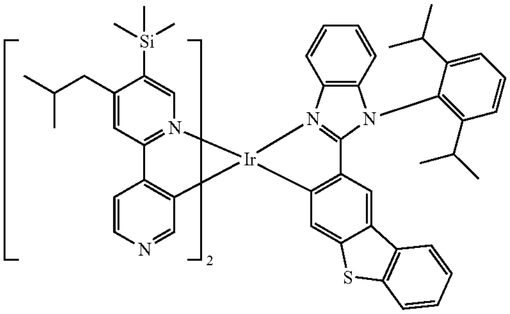
-continued
1058
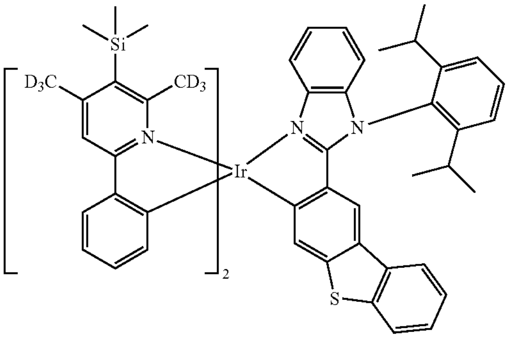
1059
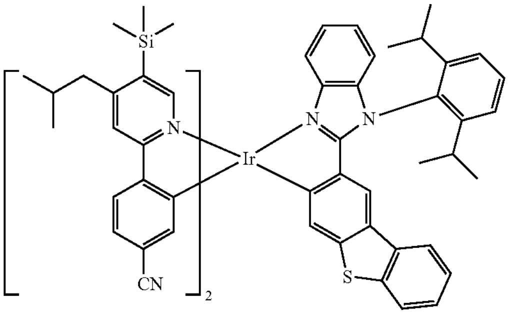
1060
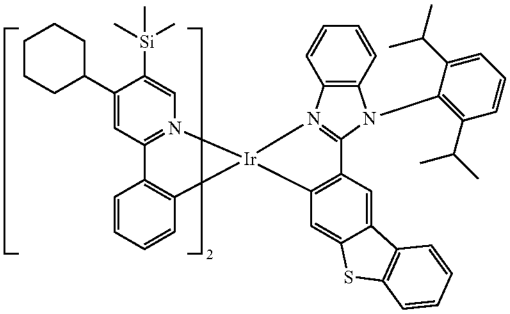
1061
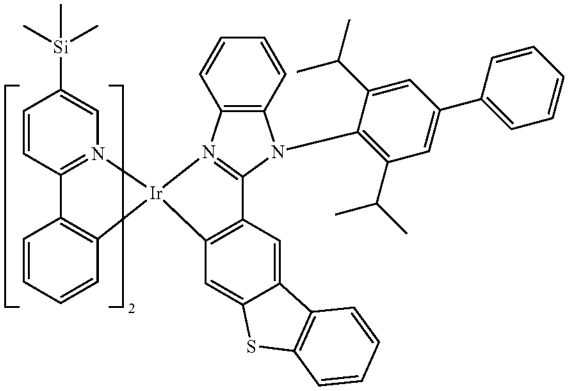

-continued
1062
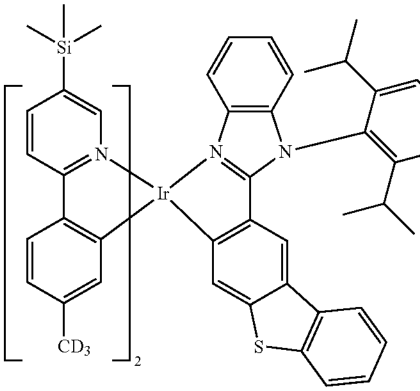
1063
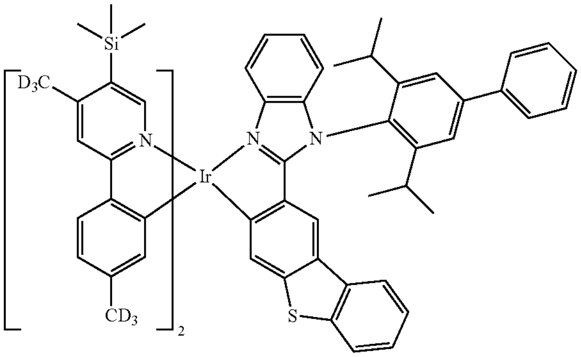
1064
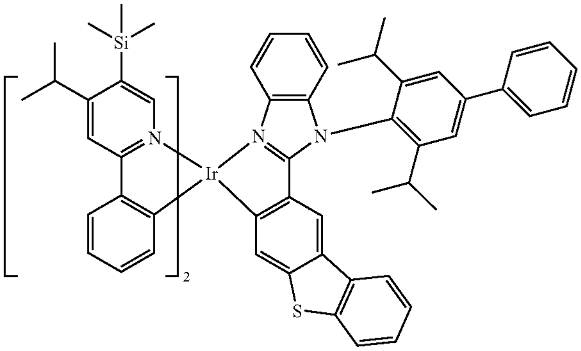
1065
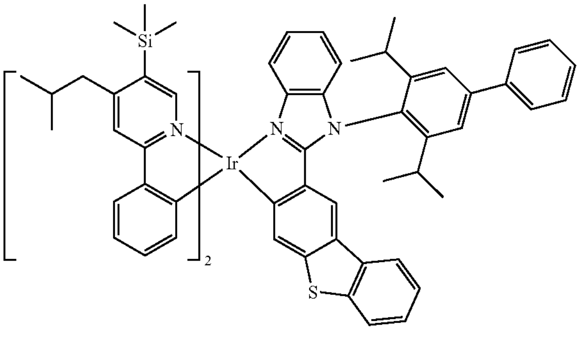
-continued
1066
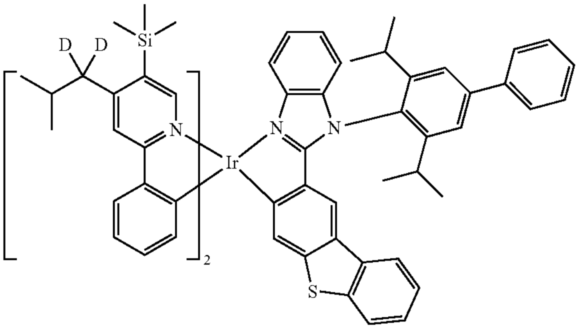
1067
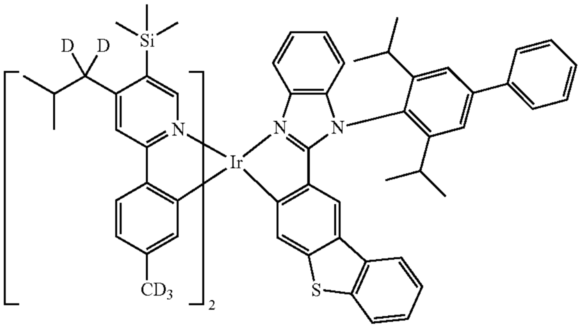
1068
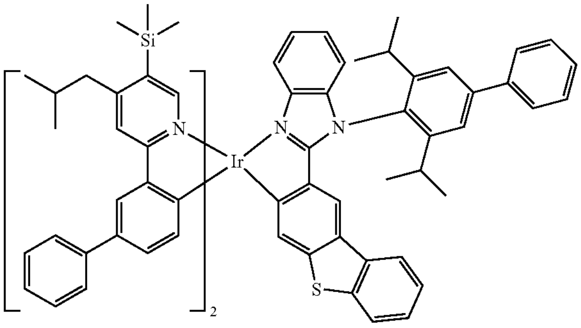
1069
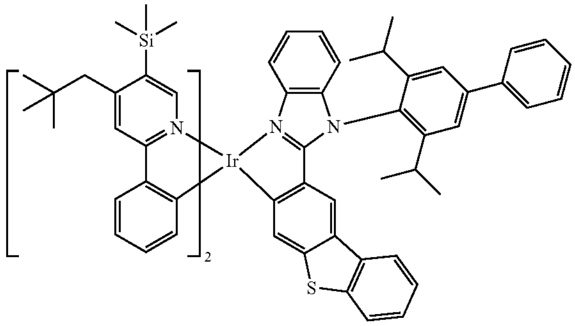

-continued
1070
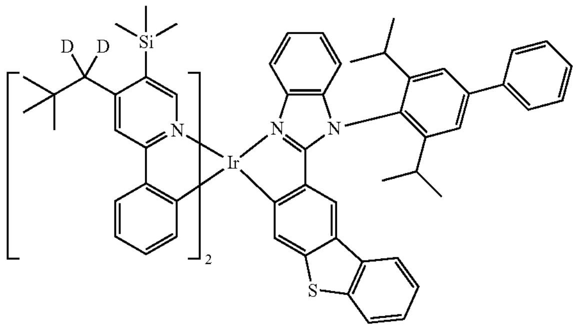
1071
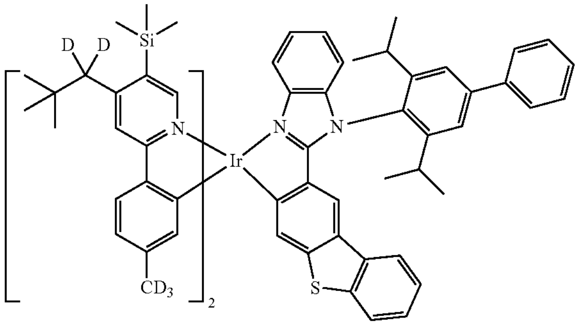
1072
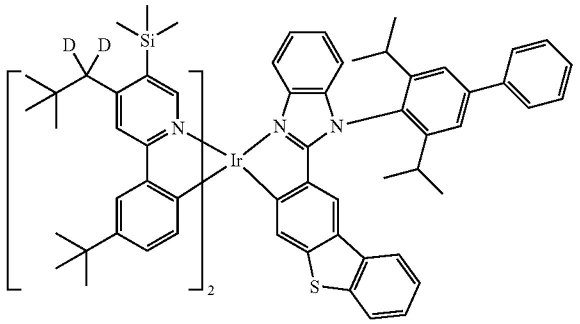
1073
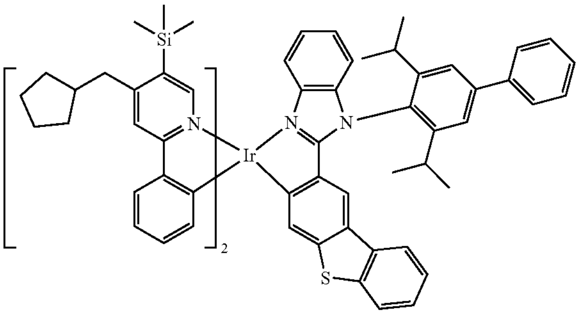
-continued
1074
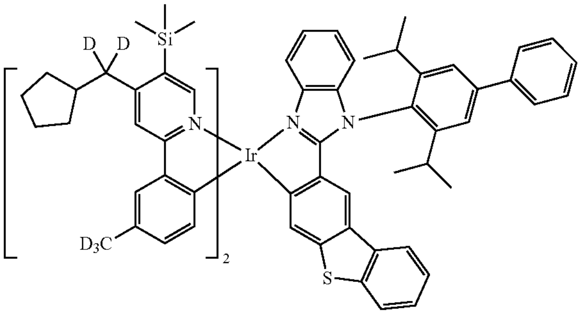
1075
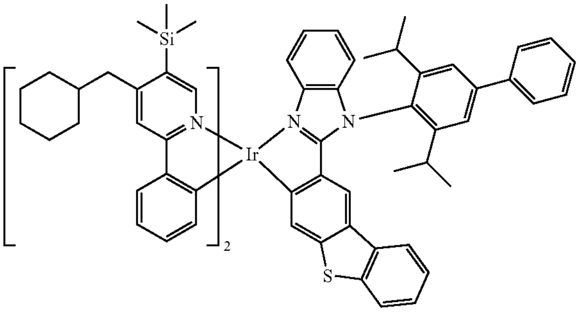
1076
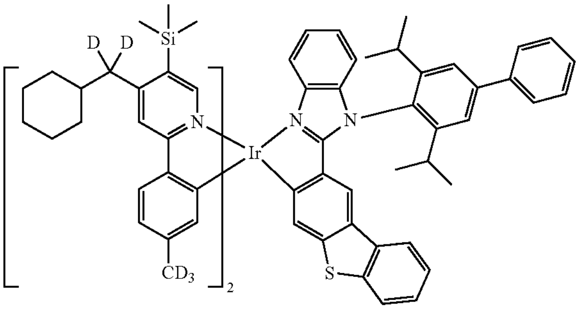
1077
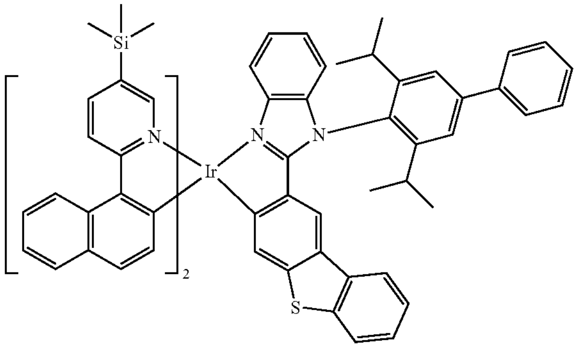

-continued
1078
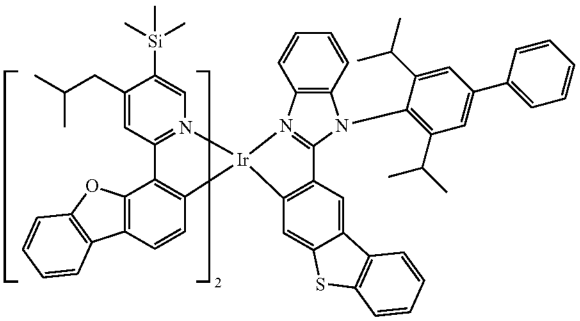
1079
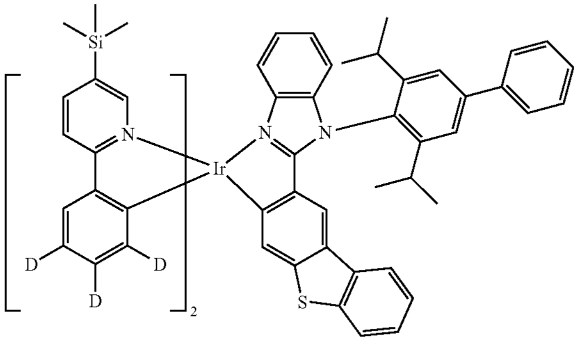
1080
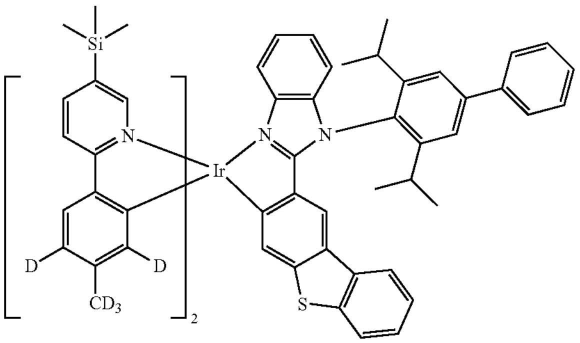
1081
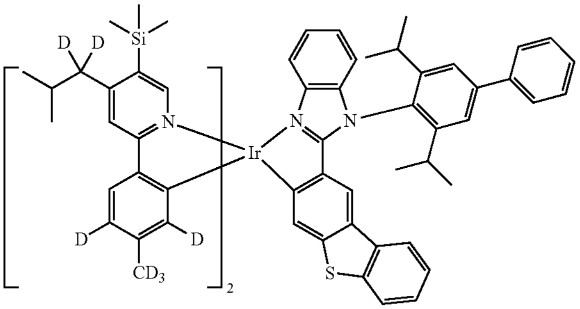
-continued
1082
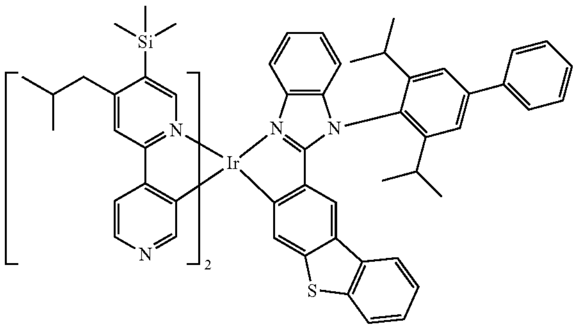
1083
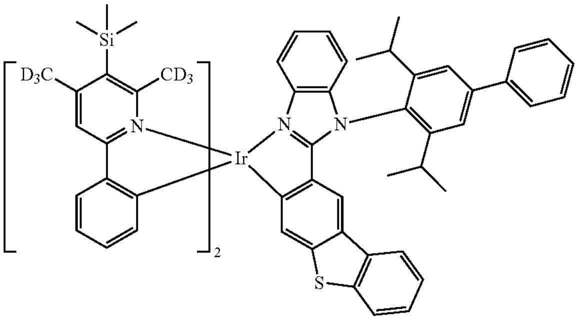
1084
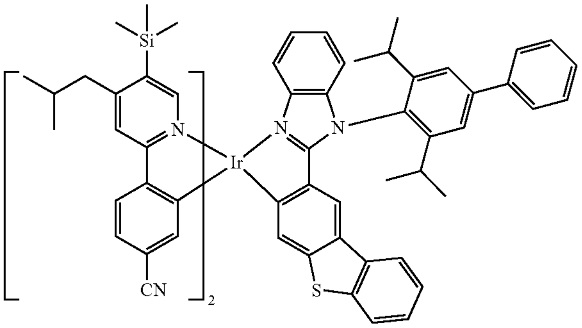
1085
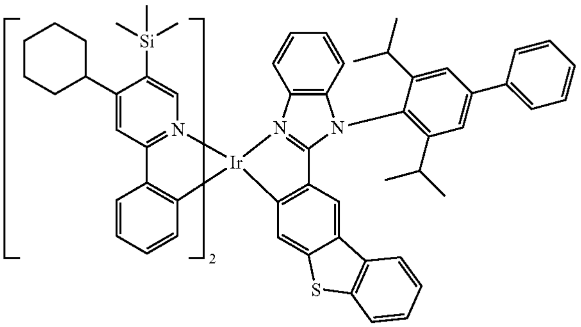

-continued
1086
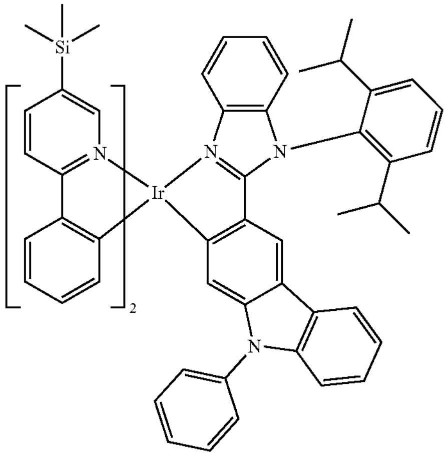
1087
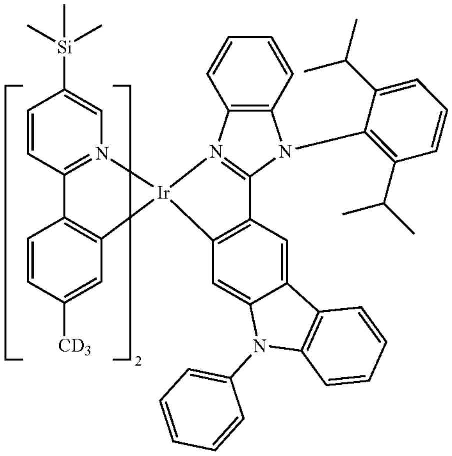
1088
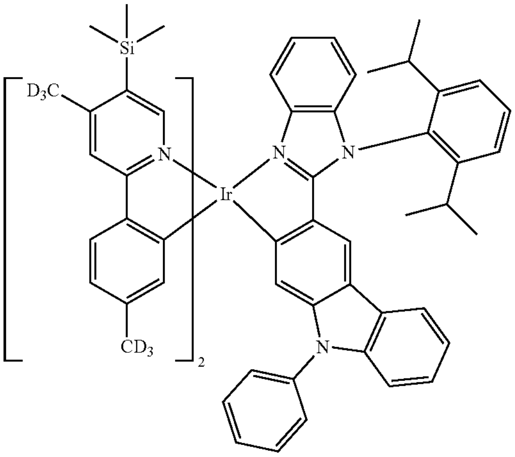
-continued
1089
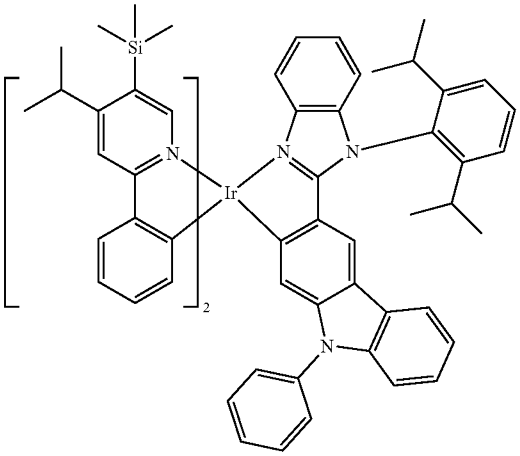
1090
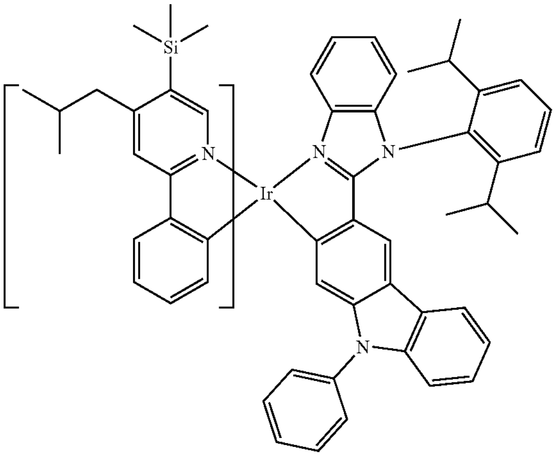
1091
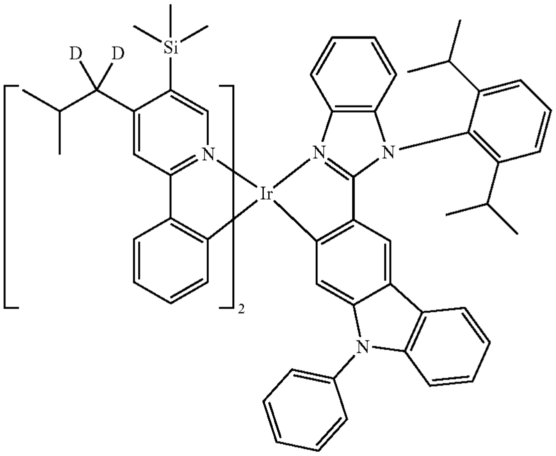

1092
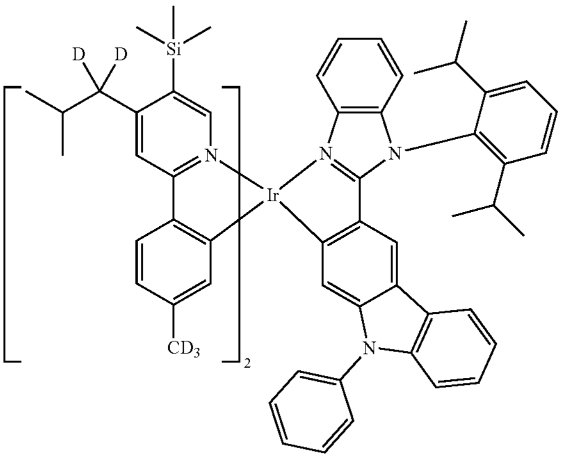
1093
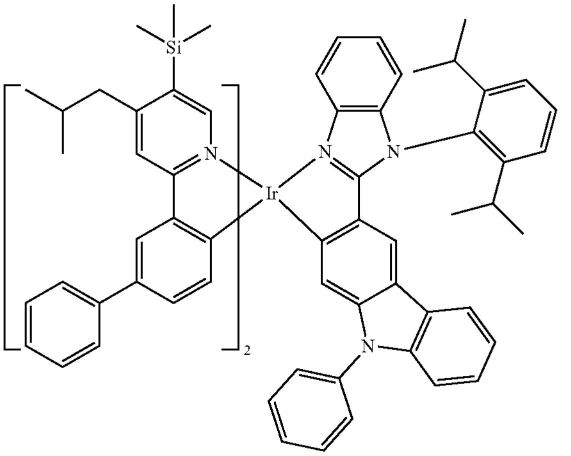
1094
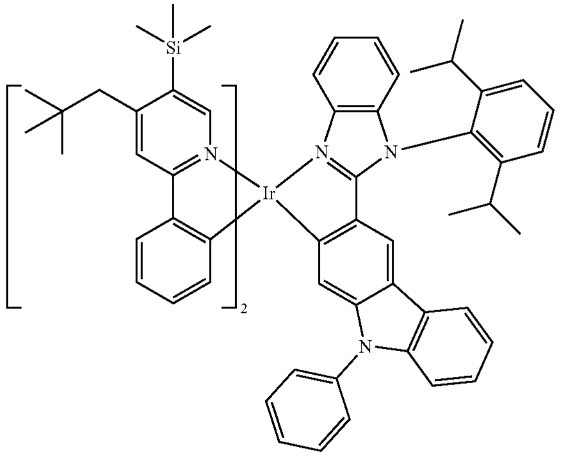
1095
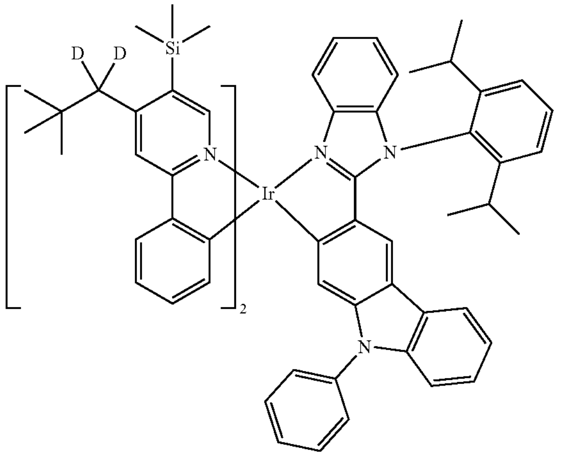
1096
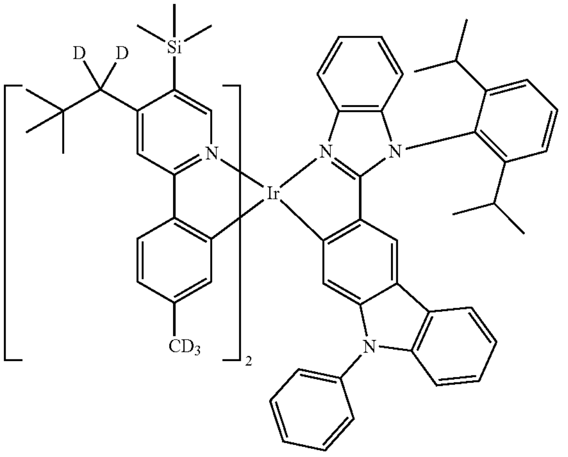
1097
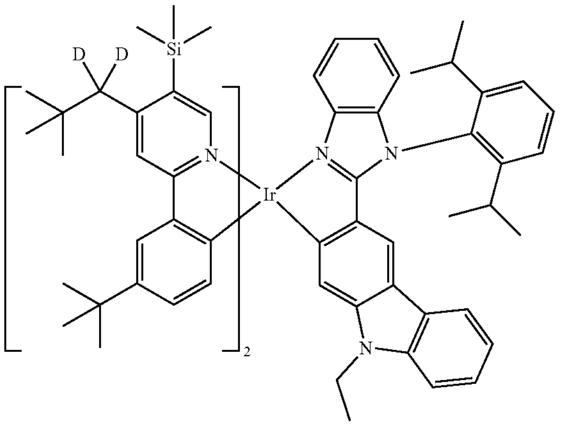

-continued
1098
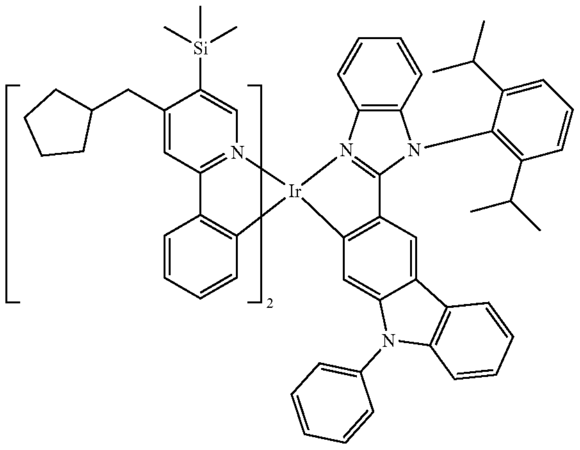
1099
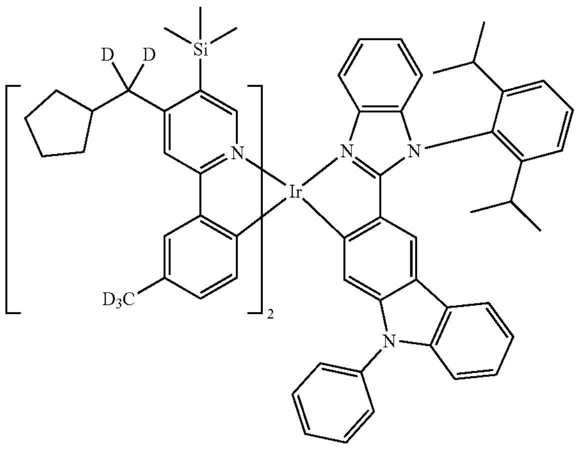
1100
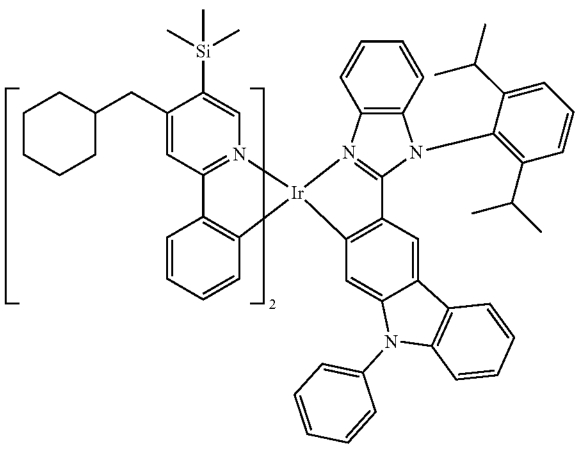
-continued
1101
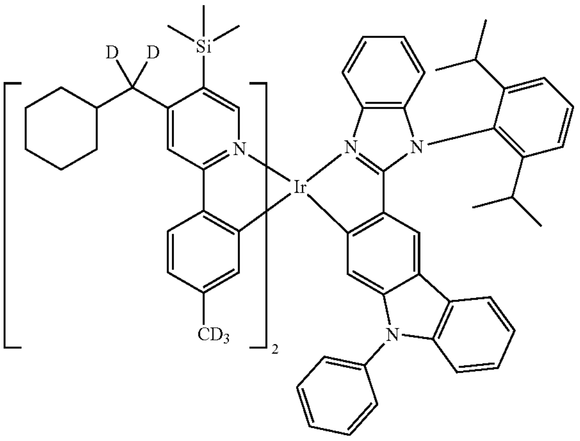
1102
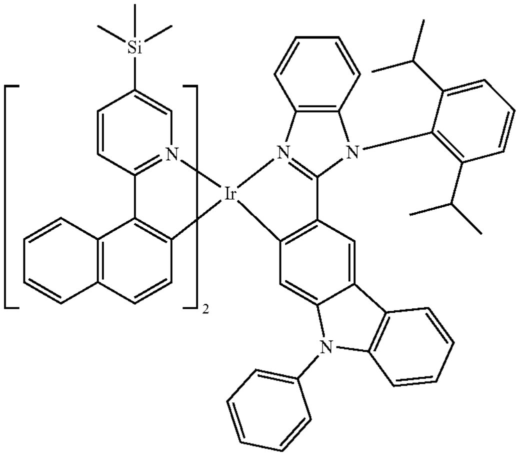
1103
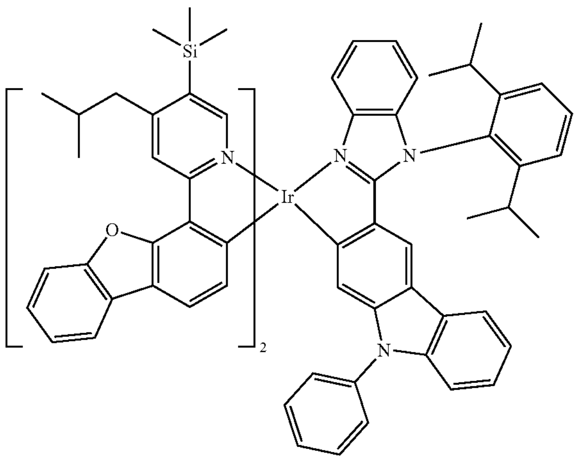

-continued
1104
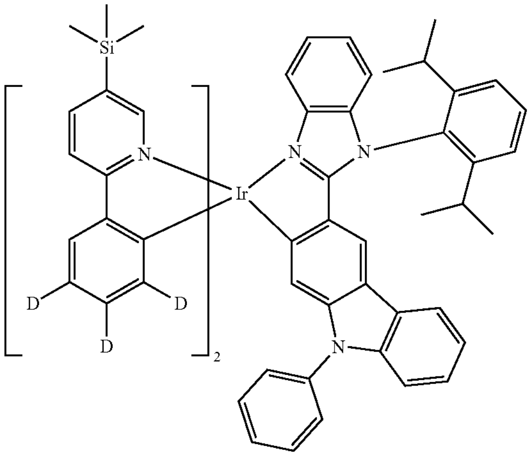
1105
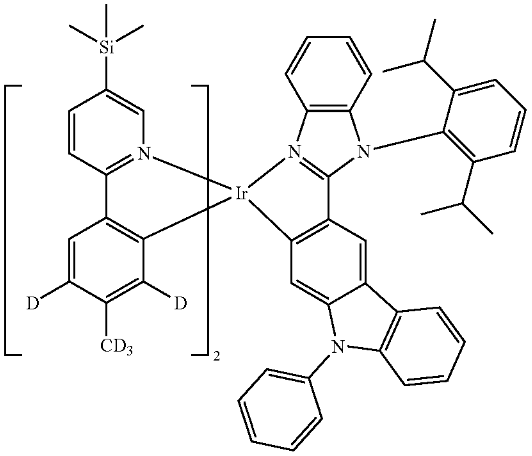
1106
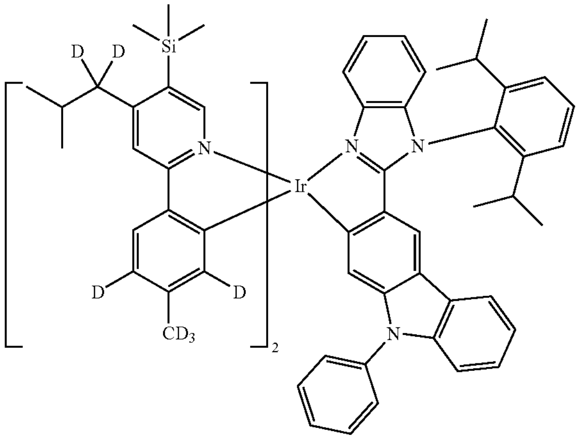
-continued
1107
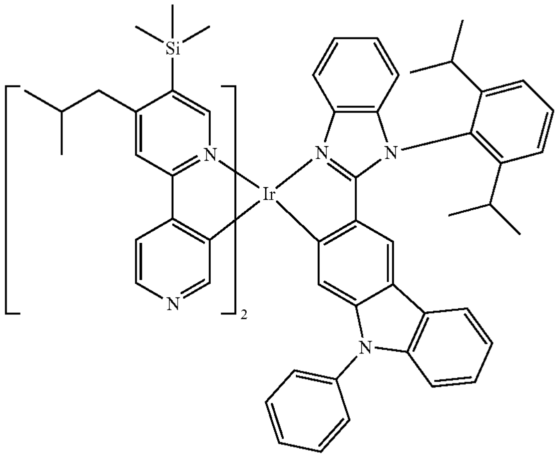
1108
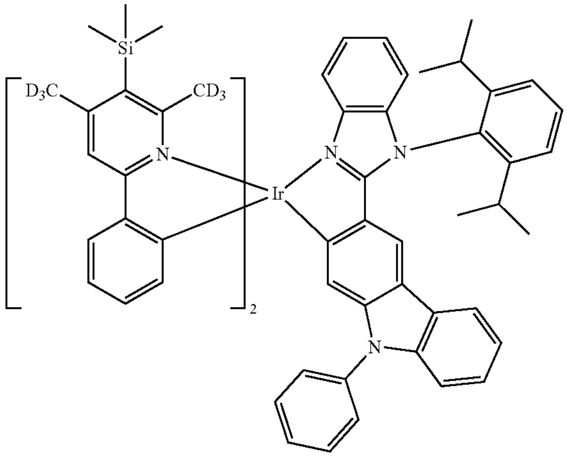
1109
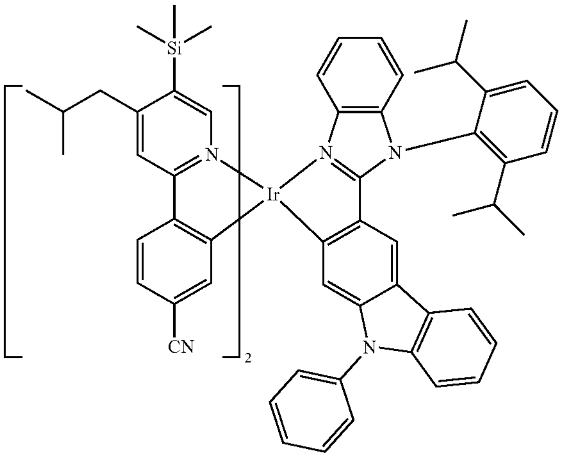

-continued
1110
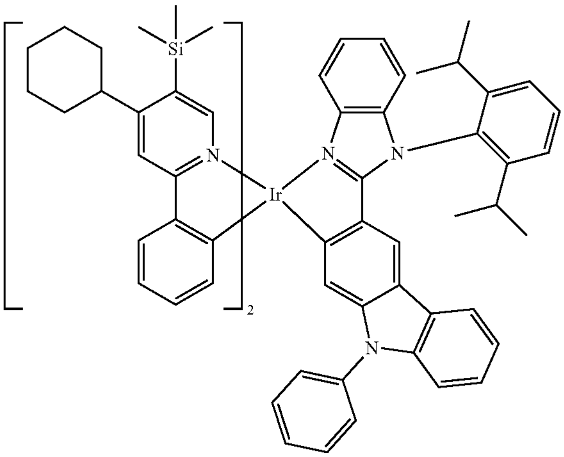
1111
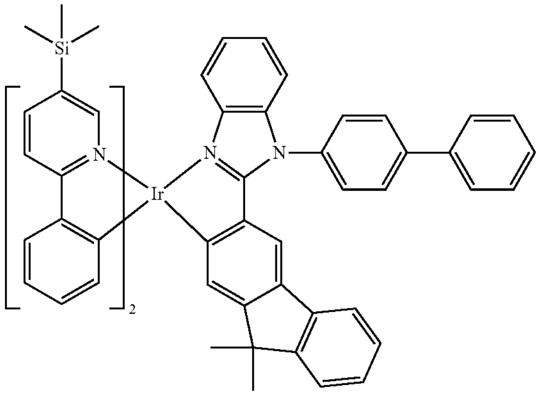
1112
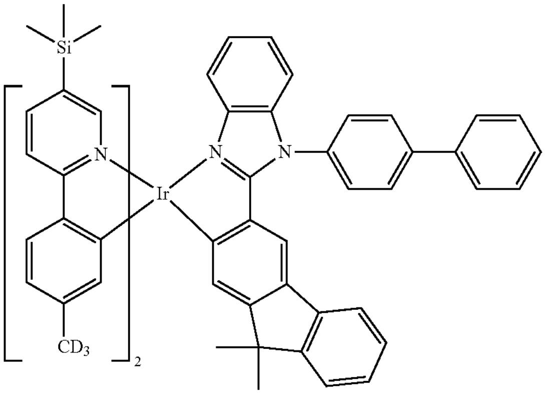
-continued
1113
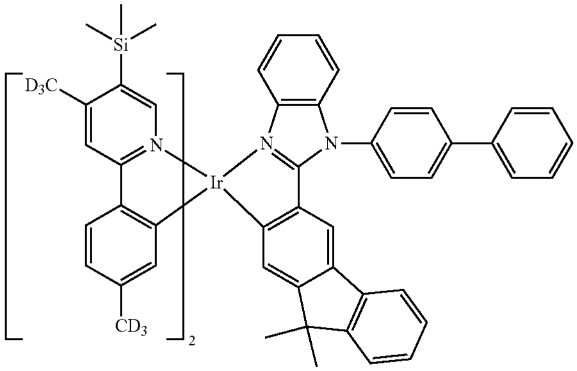
1114
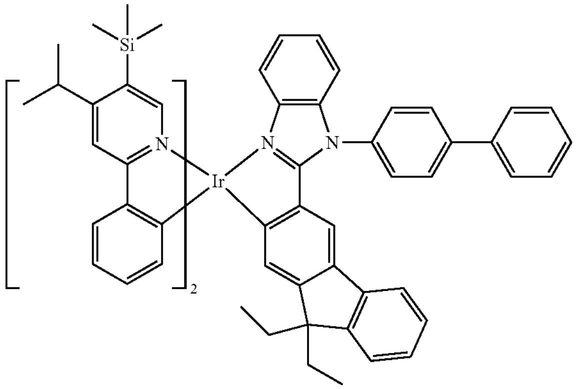
1115
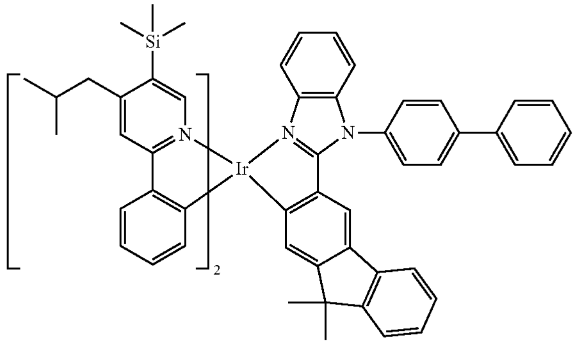
1116
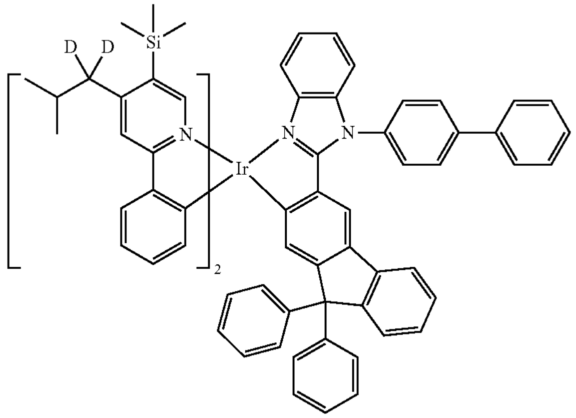

-continued
1117
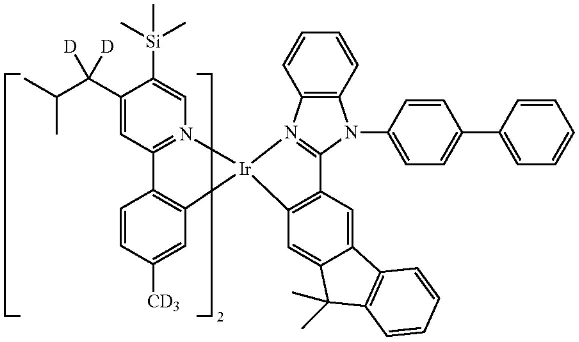
1118
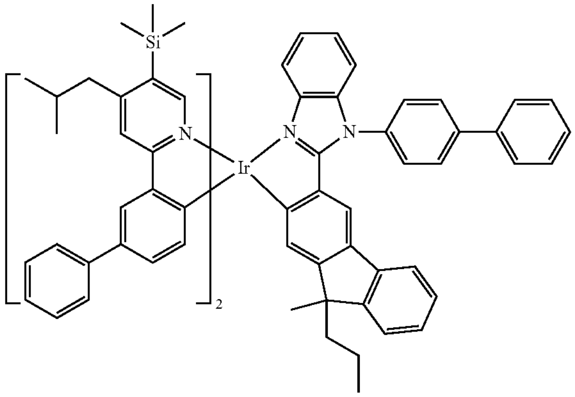
1119
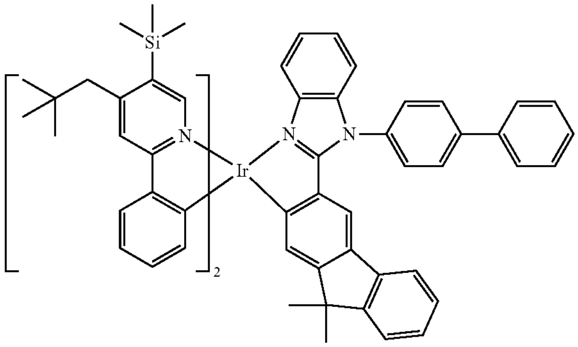
1120
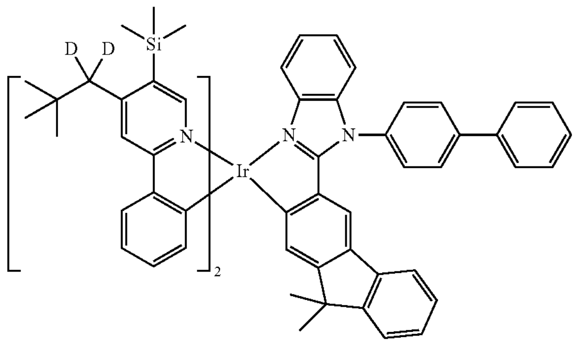
-continued
1121
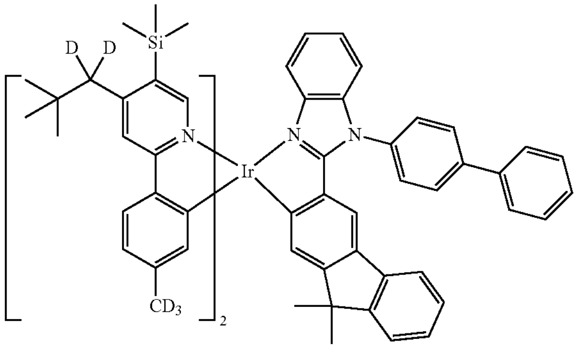
1122
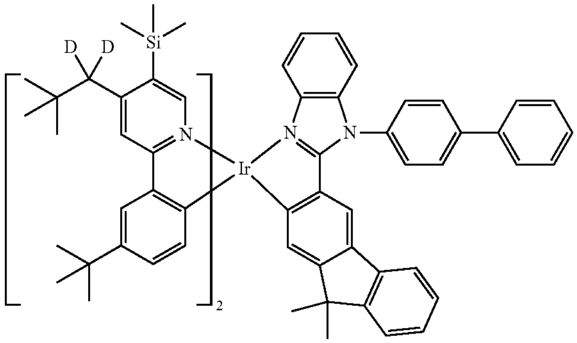
1123
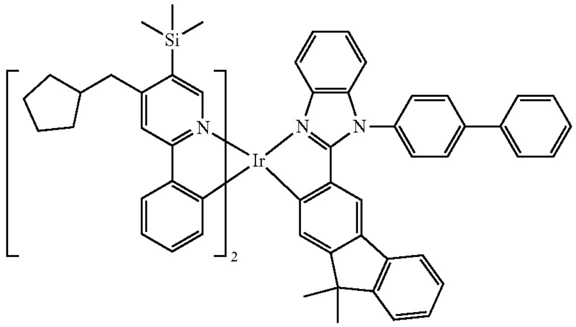
1124
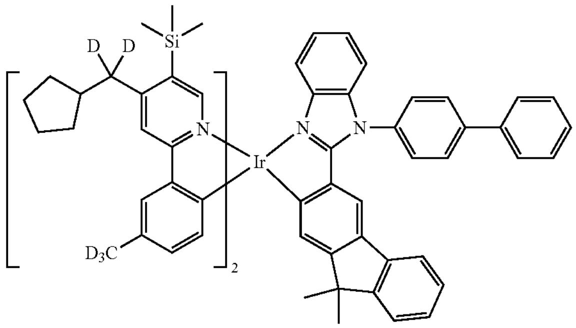

-continued
1125
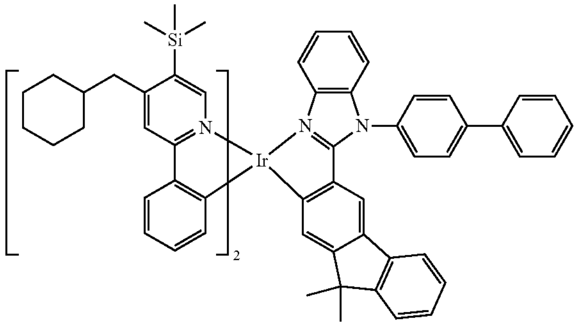
1126
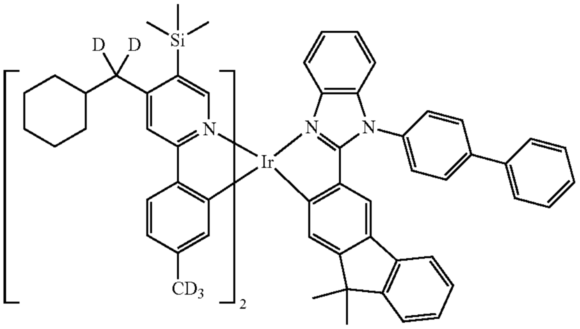
1127
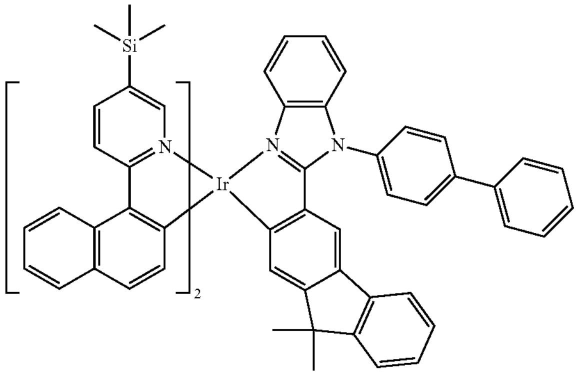
1128
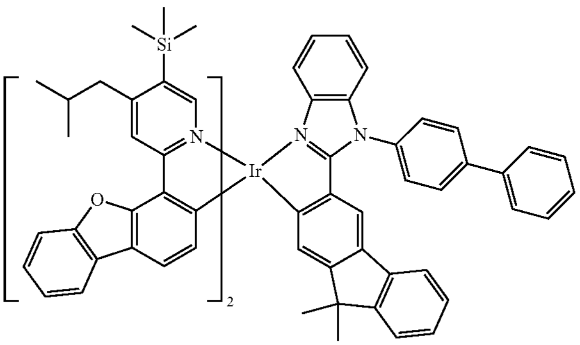
-continued
1129
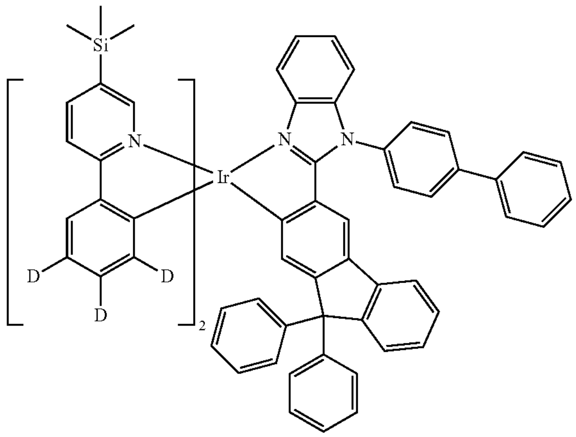
1130
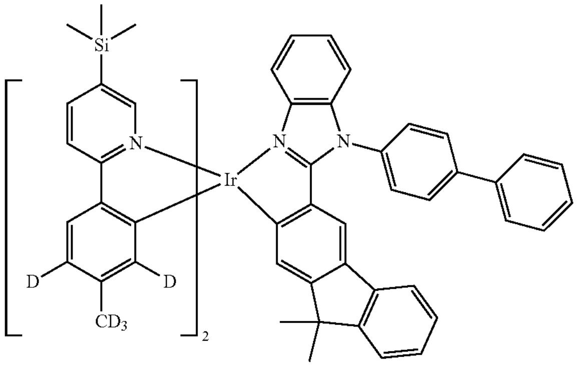
1131
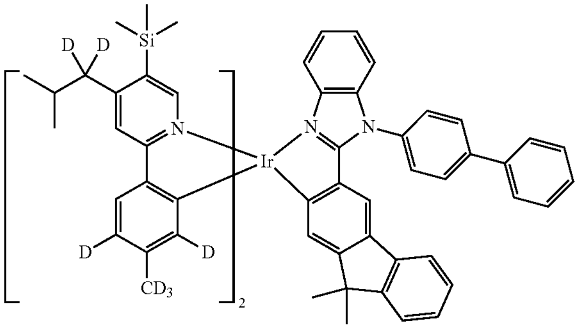
1132
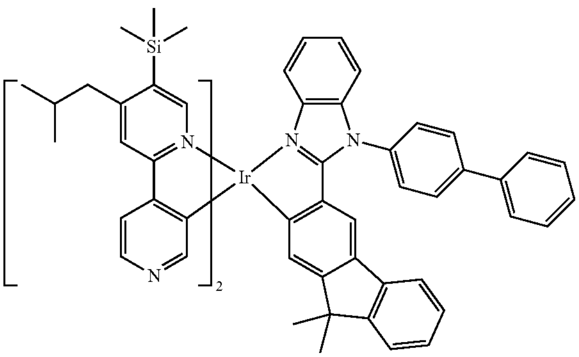

1133
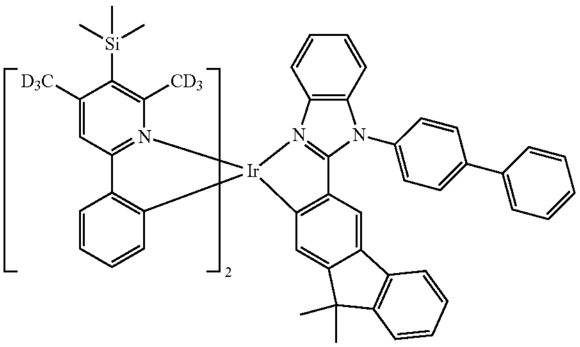
1134
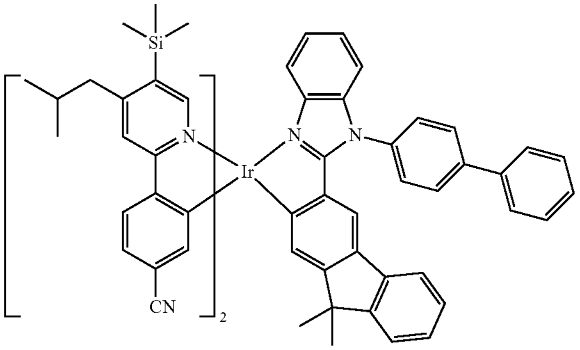
1135
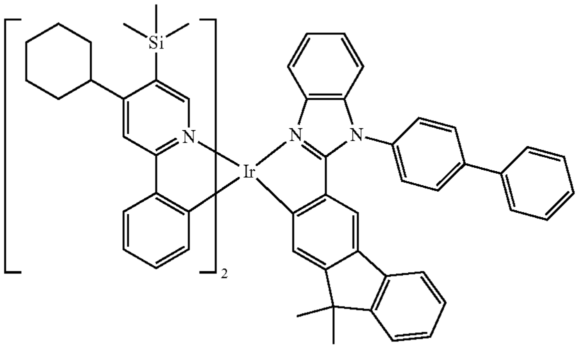
1136
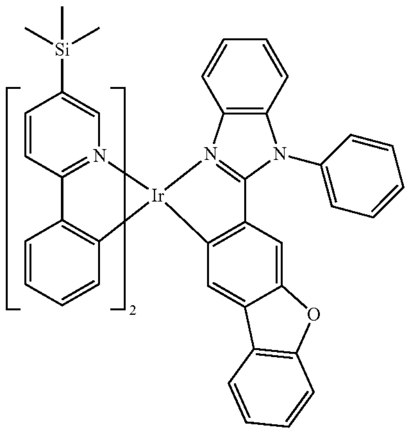
1137
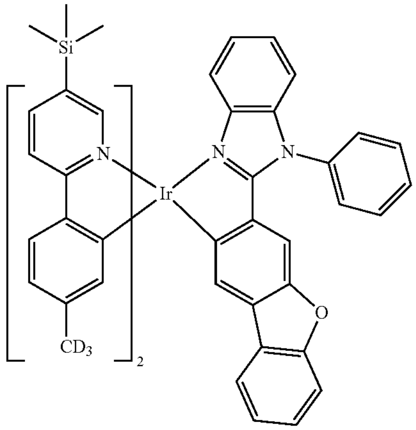
1138
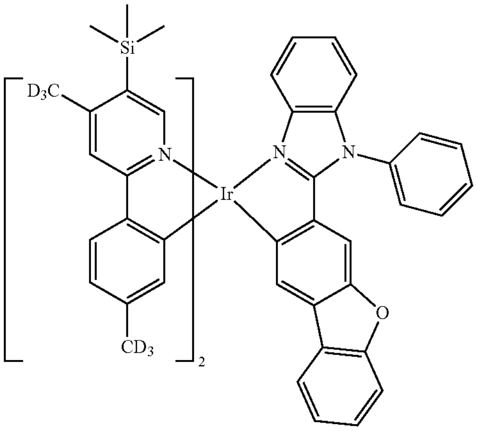
1139
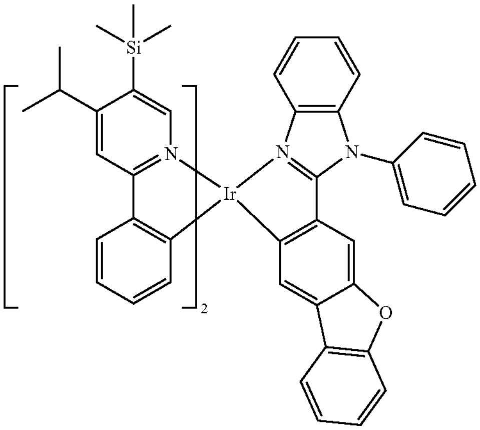

1140
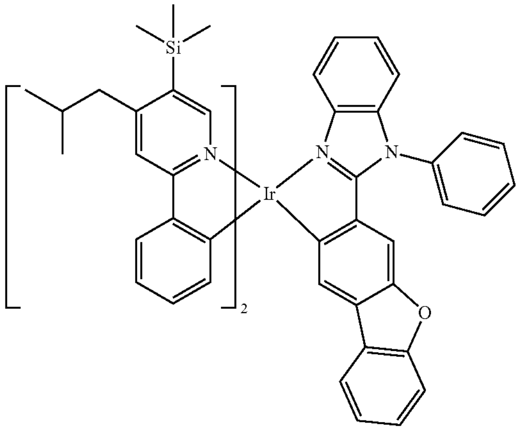
1141
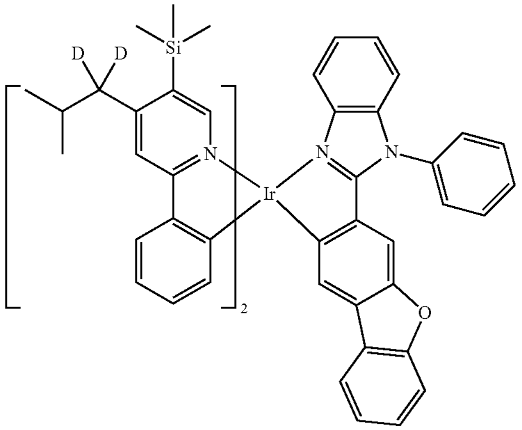
1142
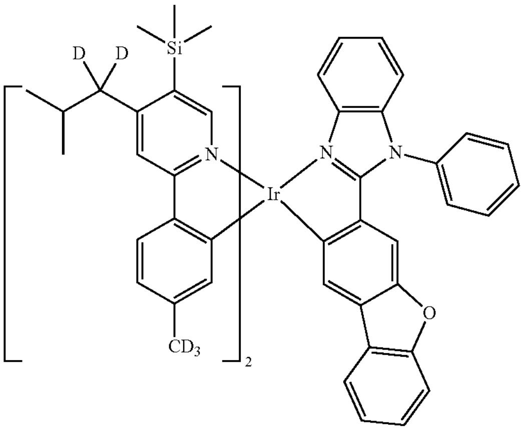
1143
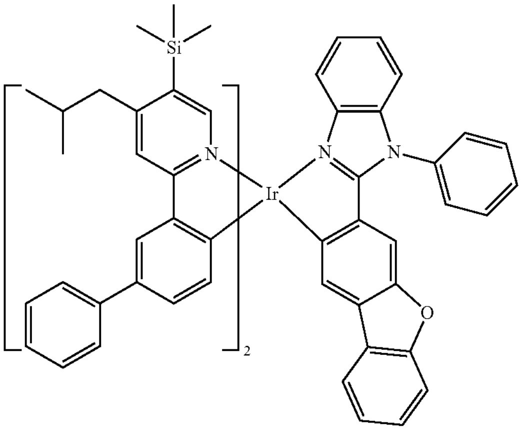
1144
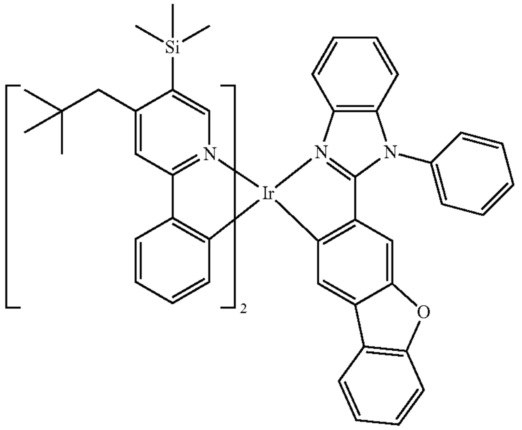
1145
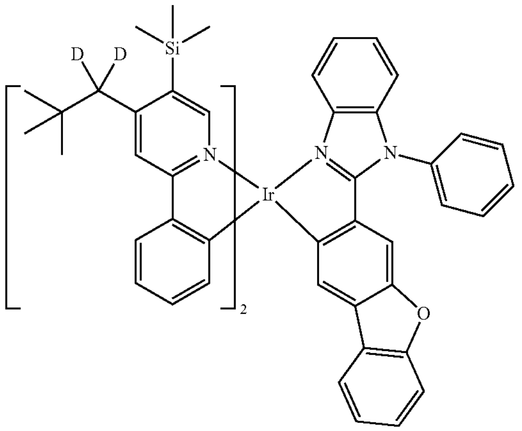

-continued
1146
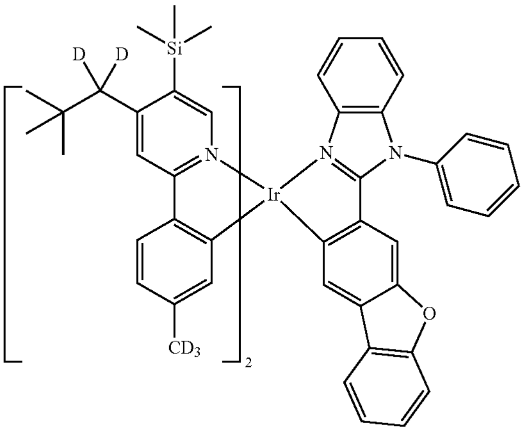
1147
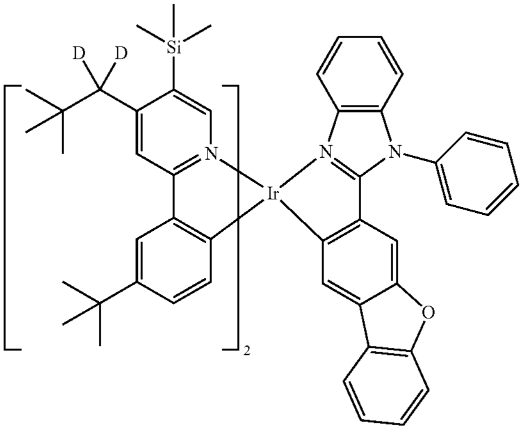
1148
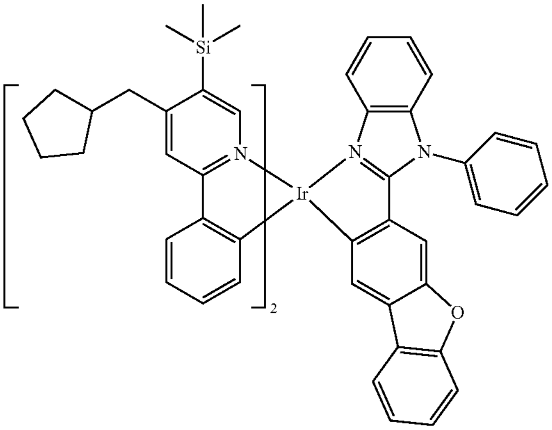
-continued
1149
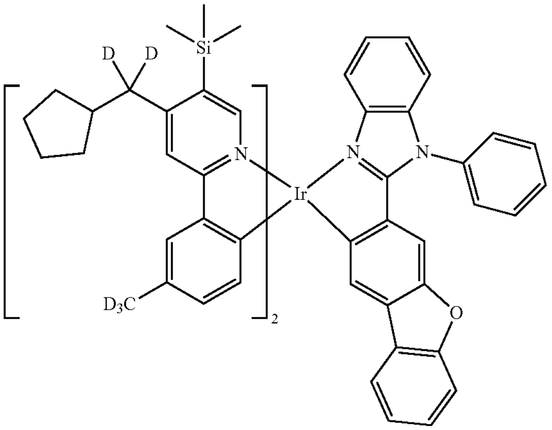
1150
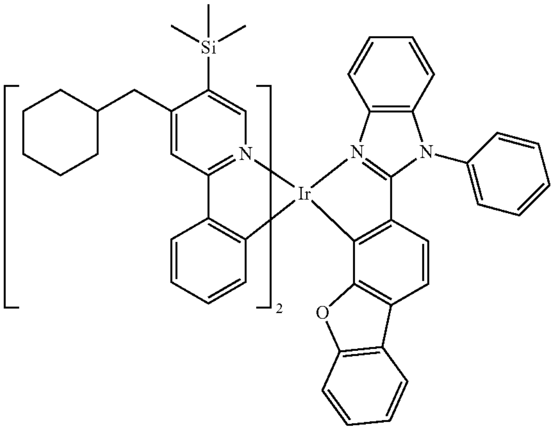
1151
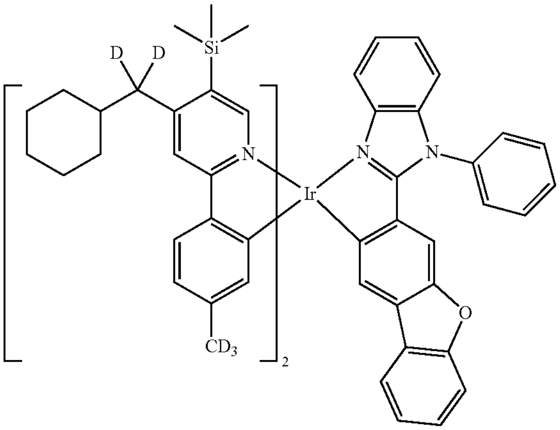

1152
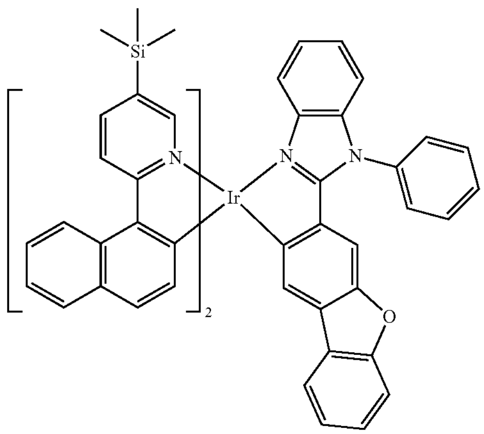
1153
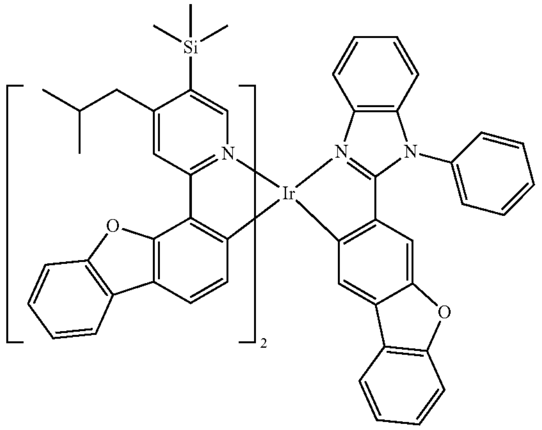
1154
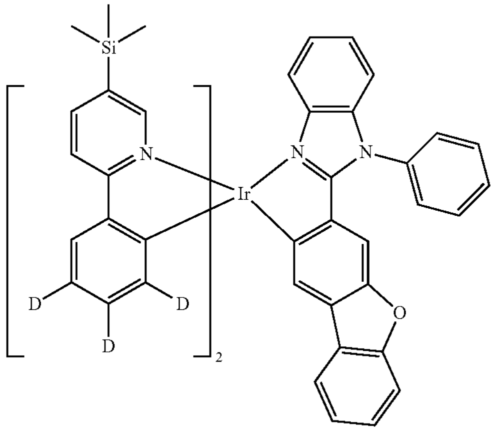
1155
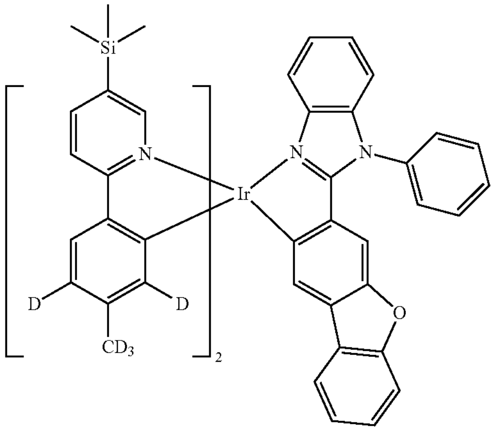
1156
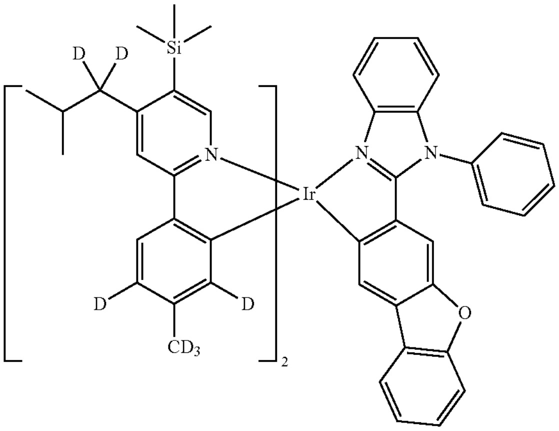
1157
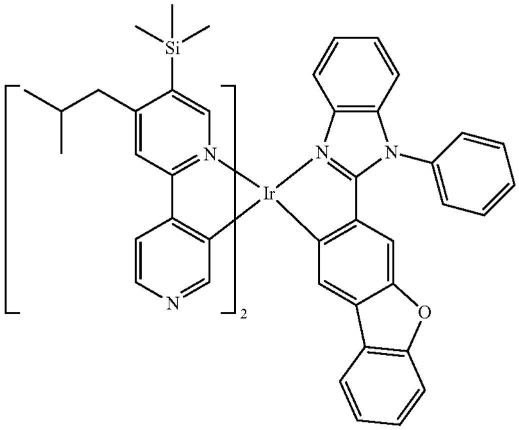

-continued
1158
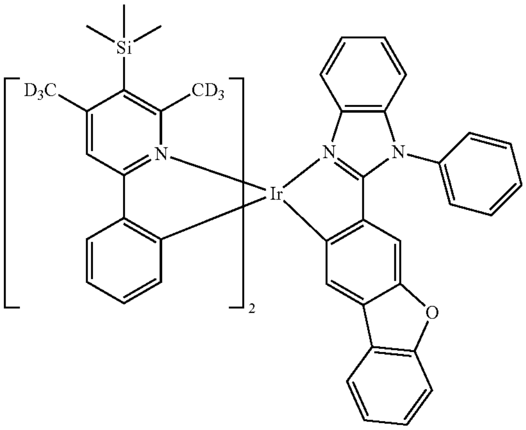
1159
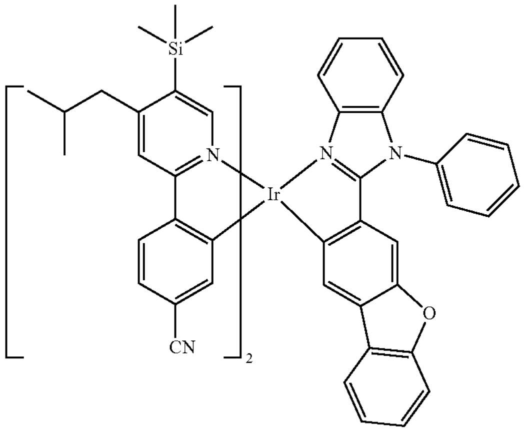
1160
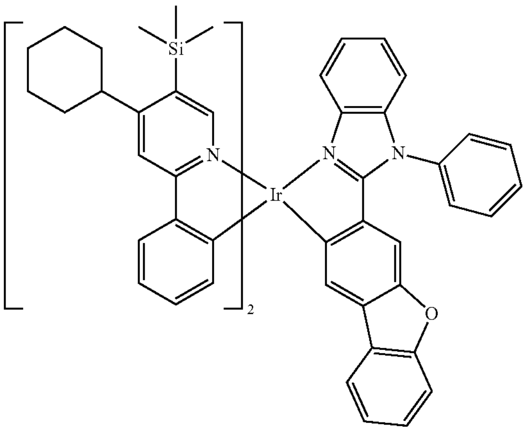
-continued
1161
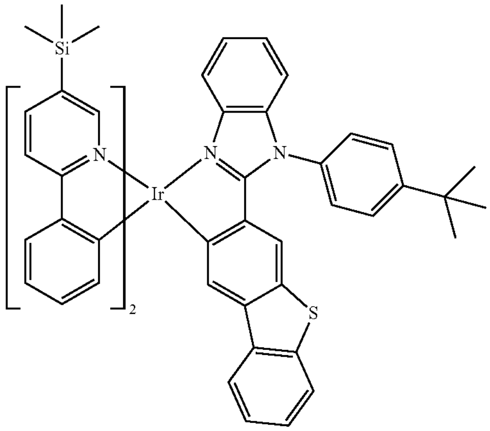
1162
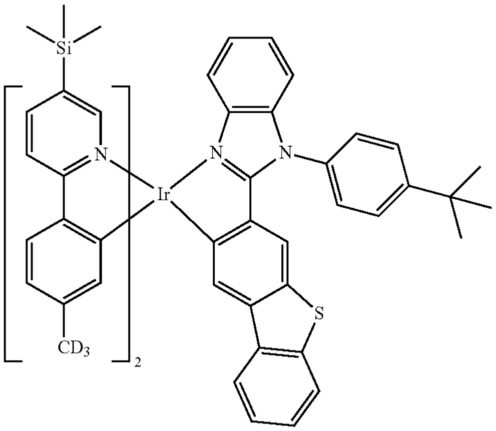
1163
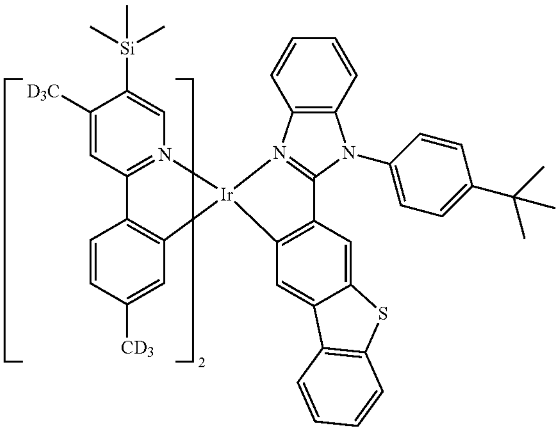

-continued
1164
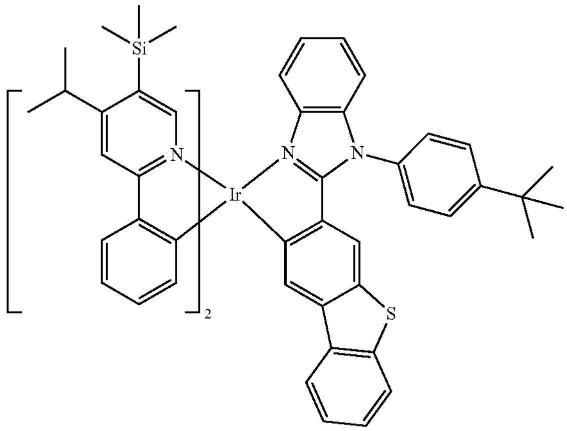
1165
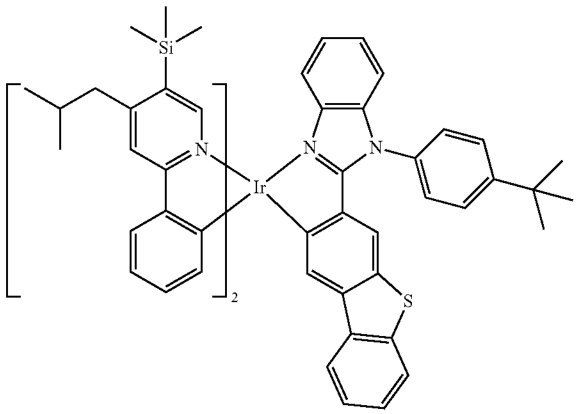
1166
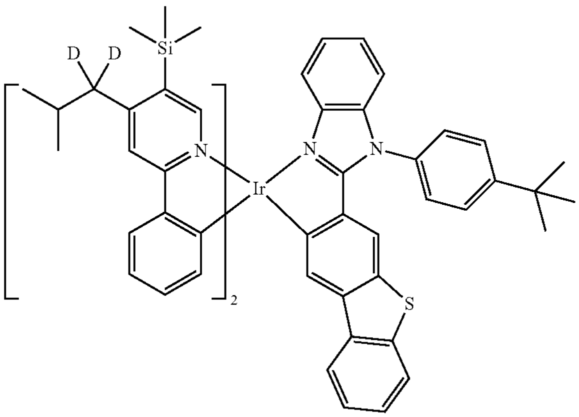
-continued
1167
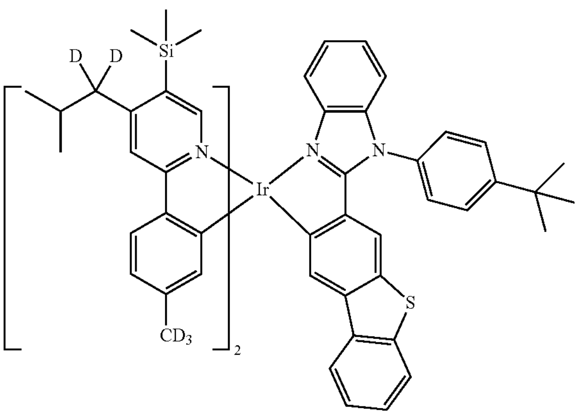
1168
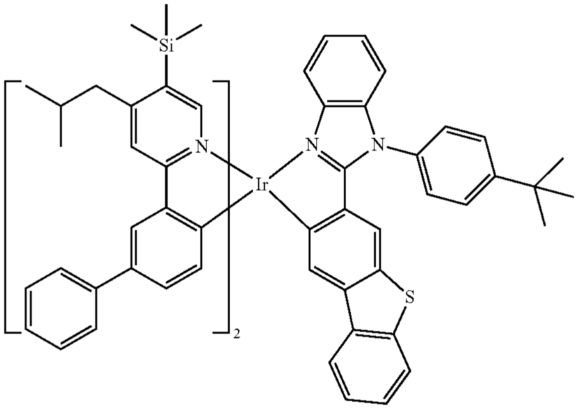
1169
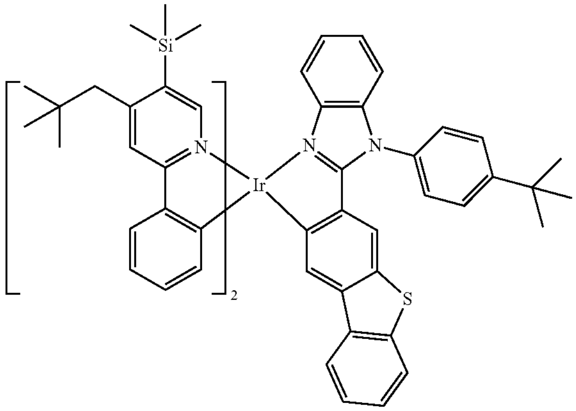

-continued
1170
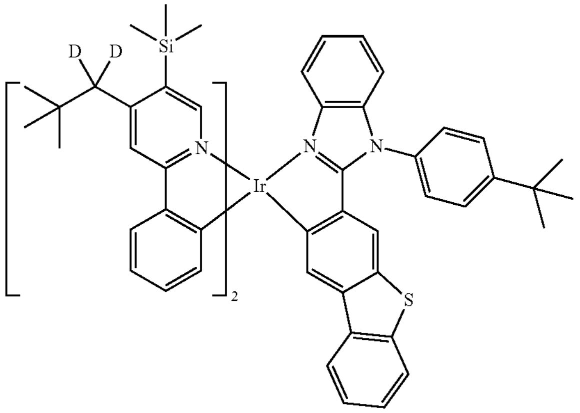
1171
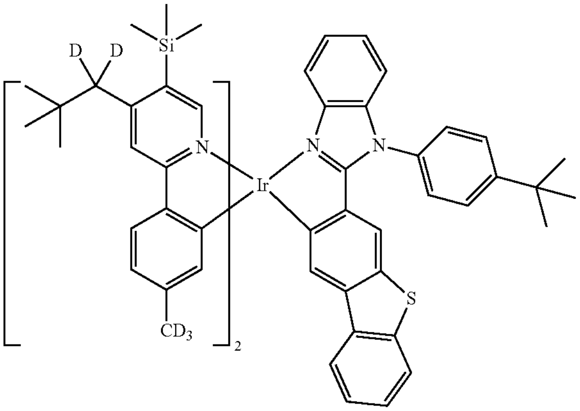
1172
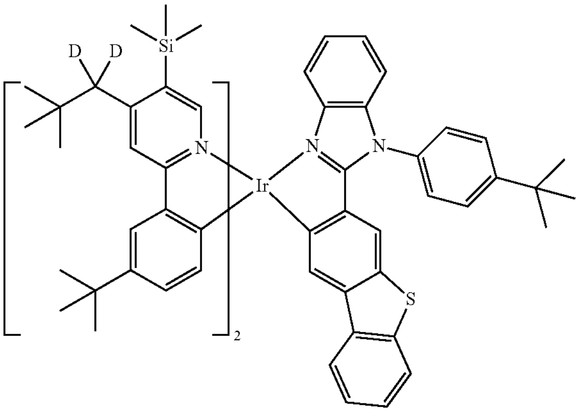
-continued
1173
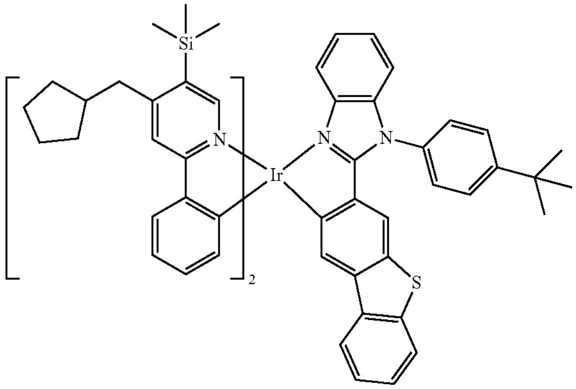
1174
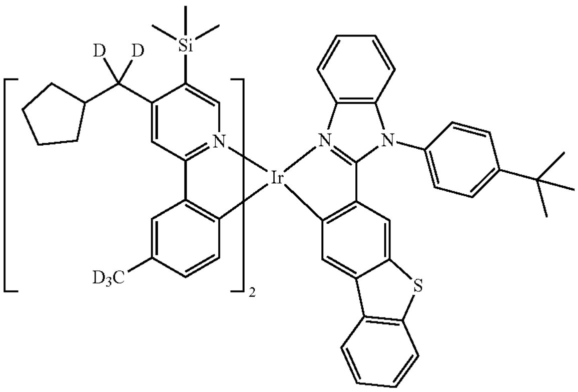
1175
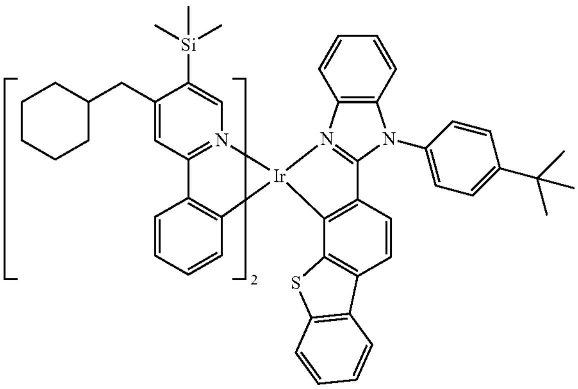
1176
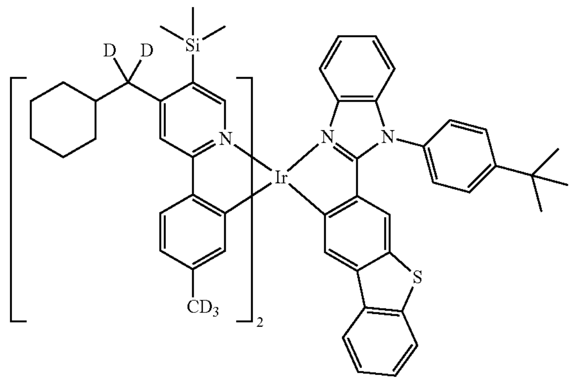

-continued
1177
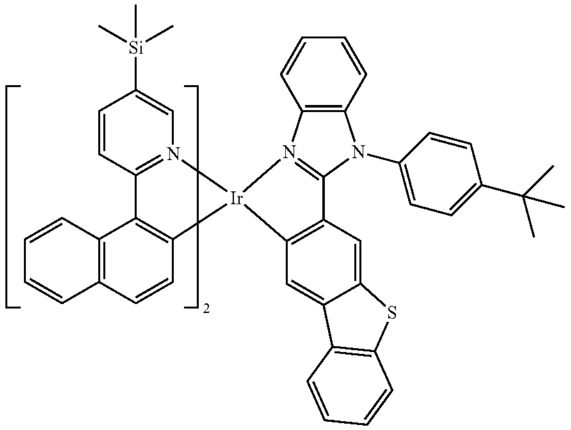
1178
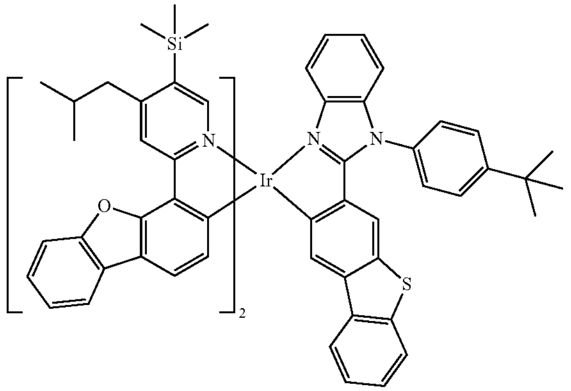
1179
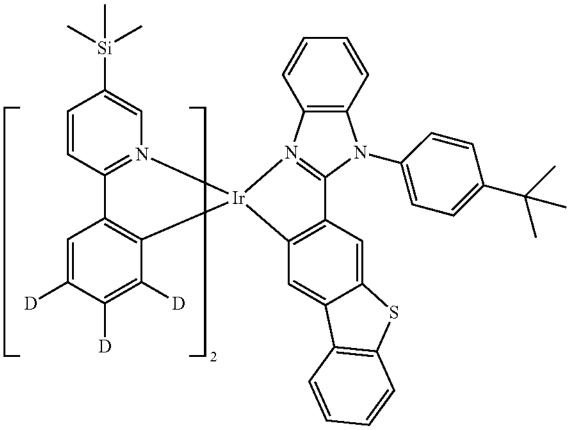
-continued
1180
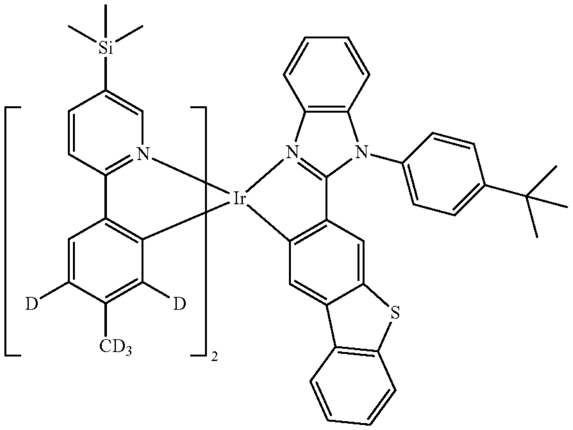
1181
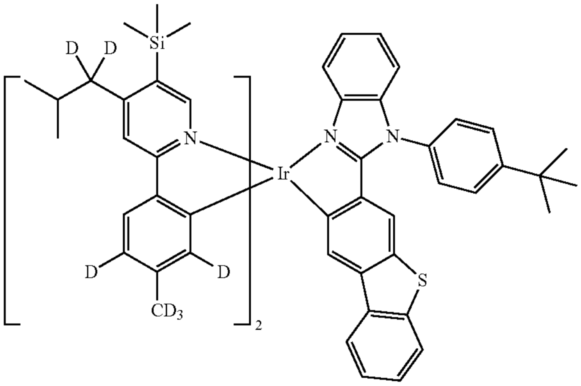
1182
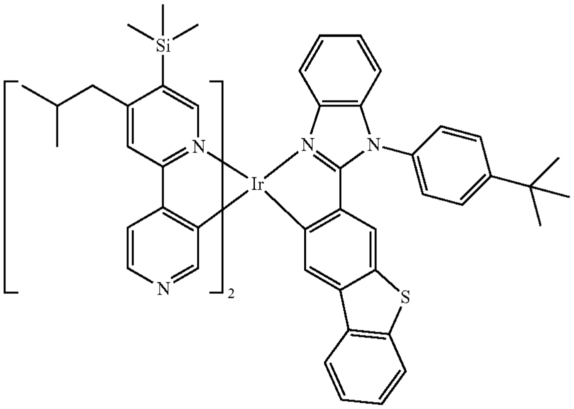

1183
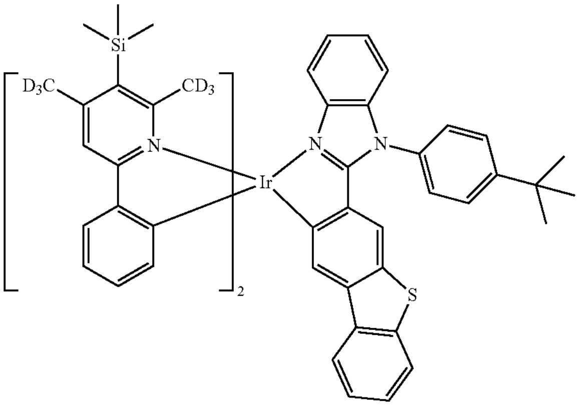
1184
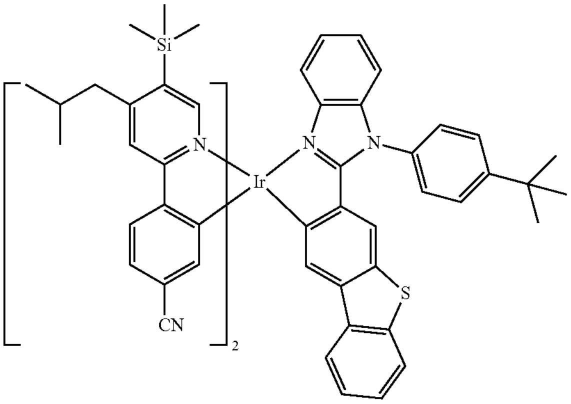
1185
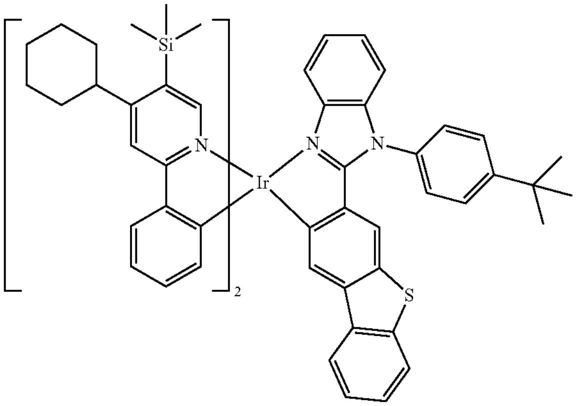
1186
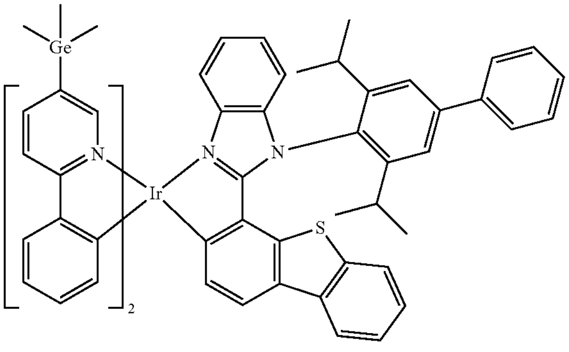
1187
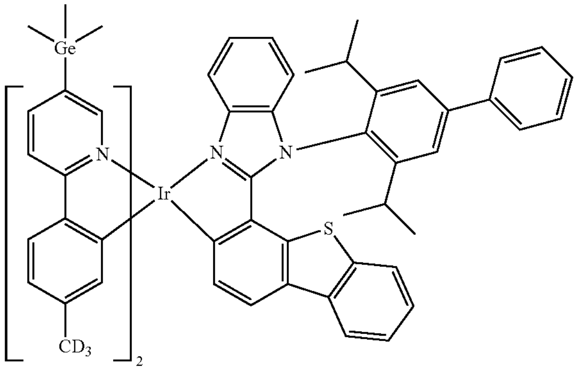
1188
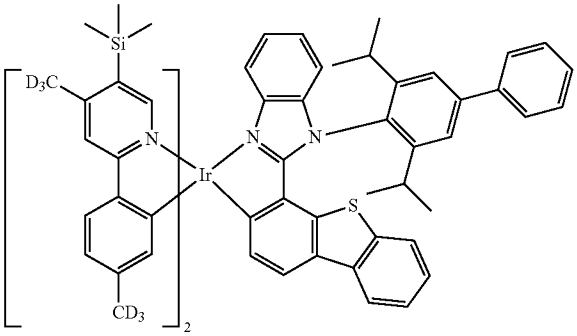
1189
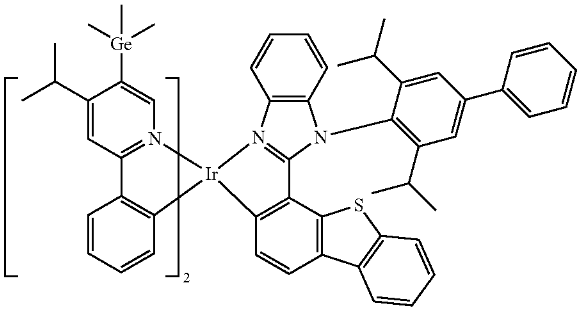
1190
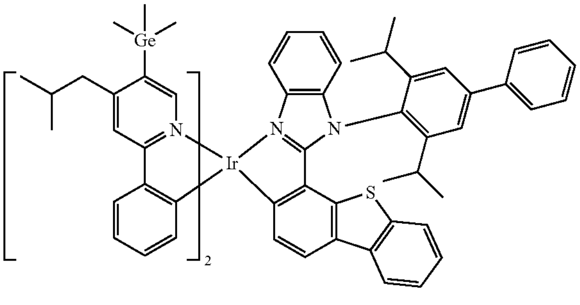

-continued
1191
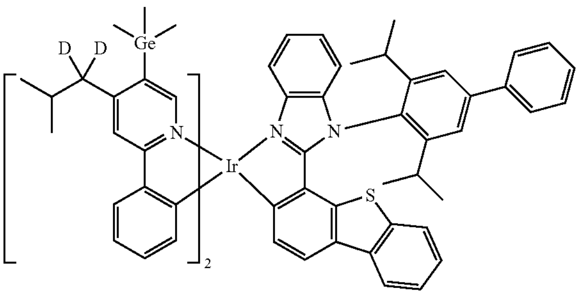
1192
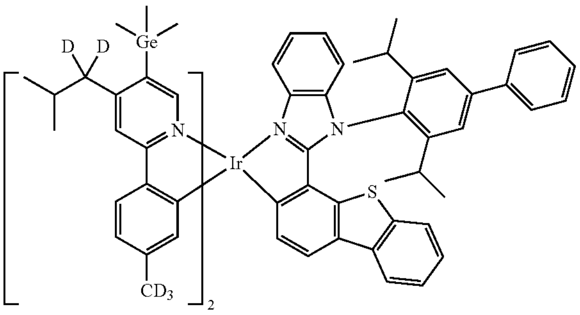
1193
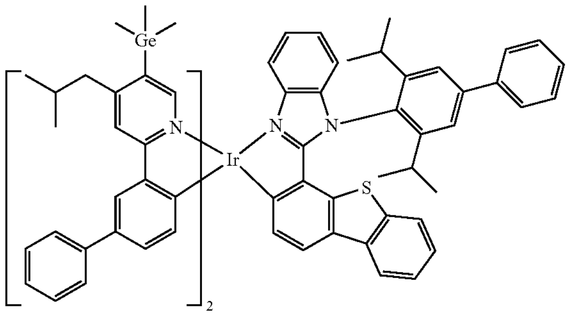
1194
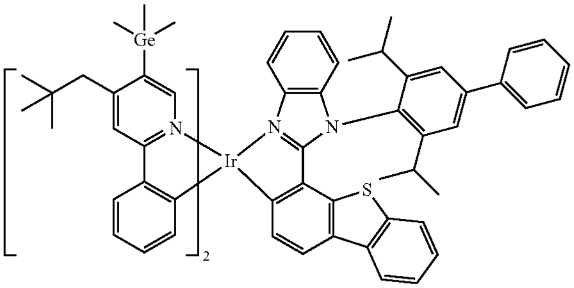
1195
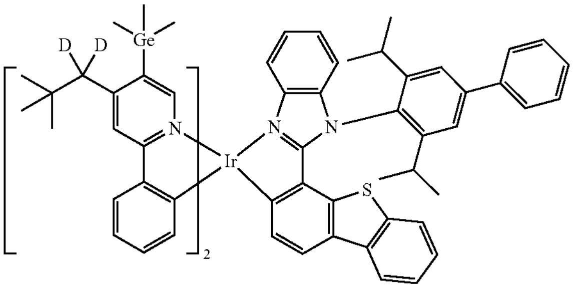
-continued
1196
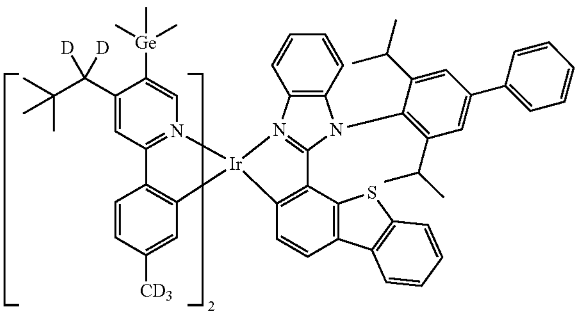
1197
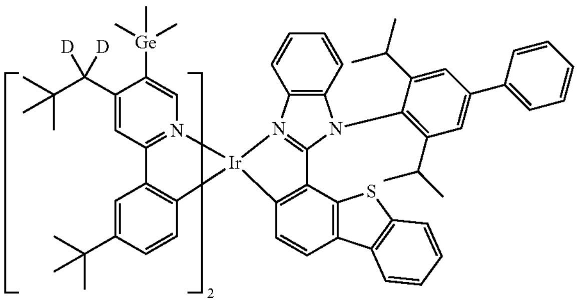
1198
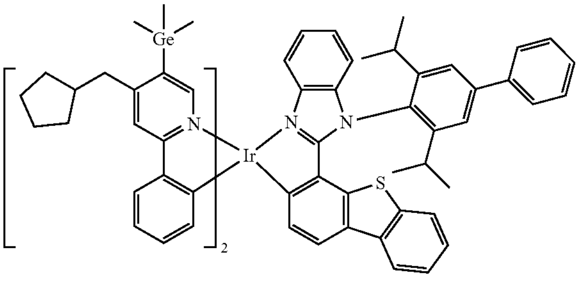
1199
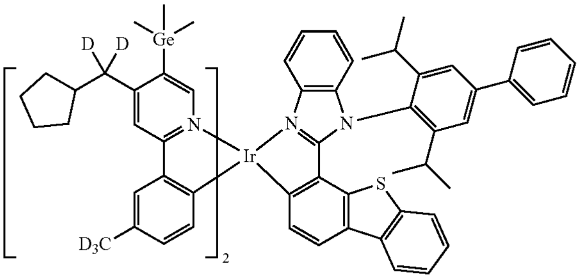
1200
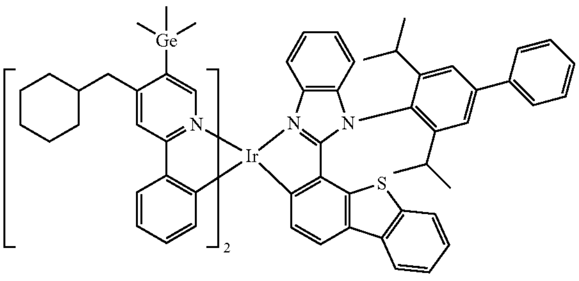

-continued
1201
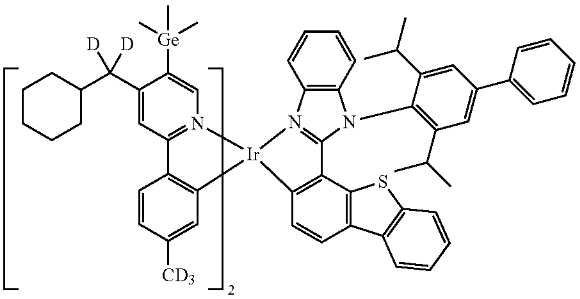
1202
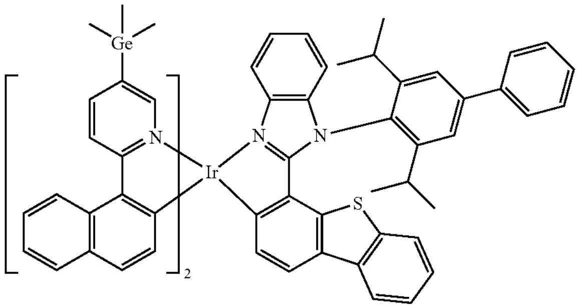
1203
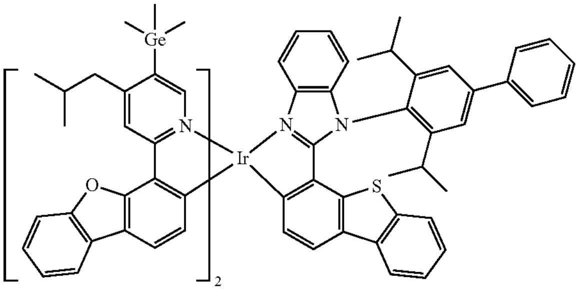
1204
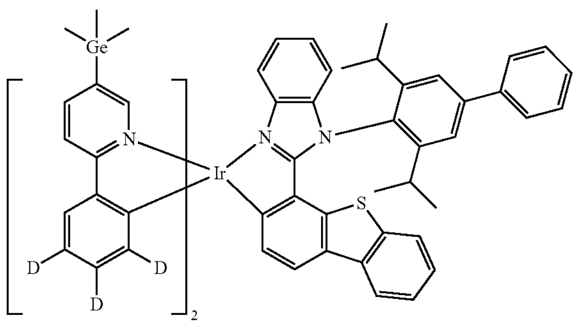
-continued
1205
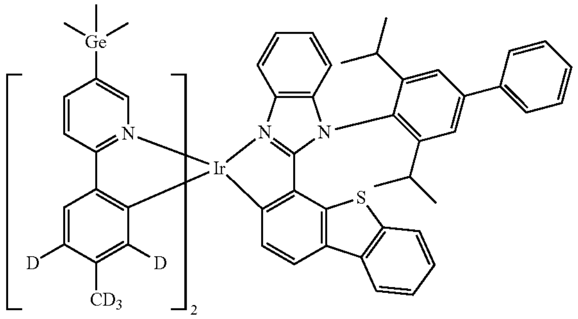
1206
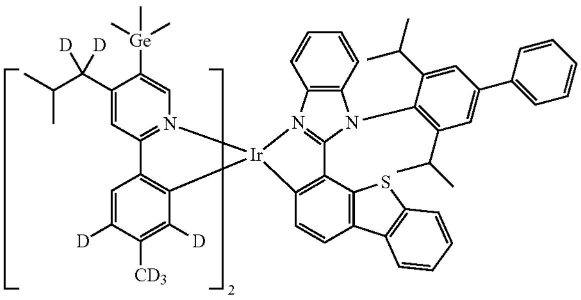
1207
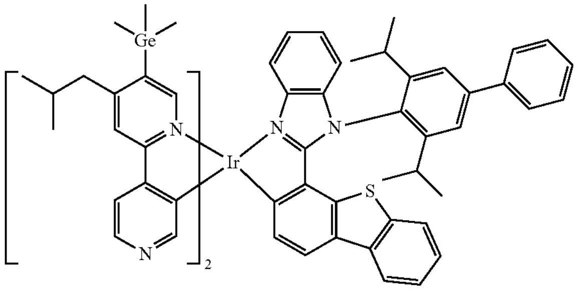
1208
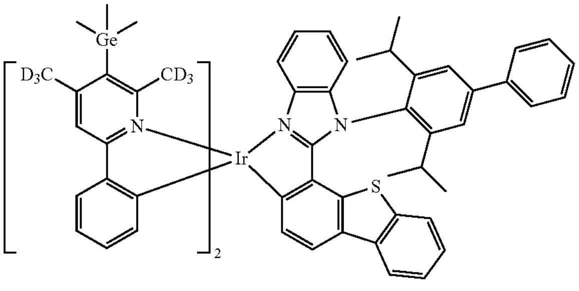
1209
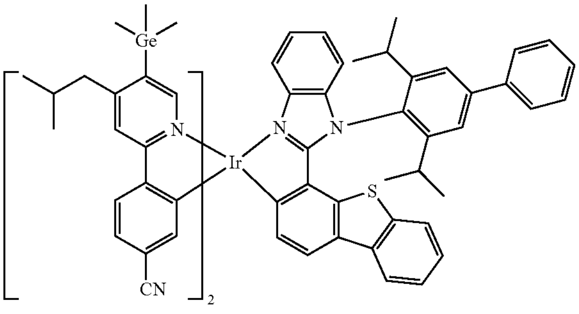

-continued
1210
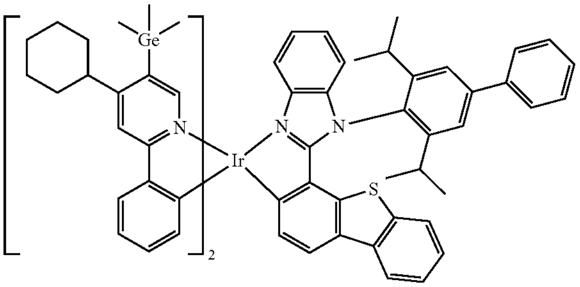
1211
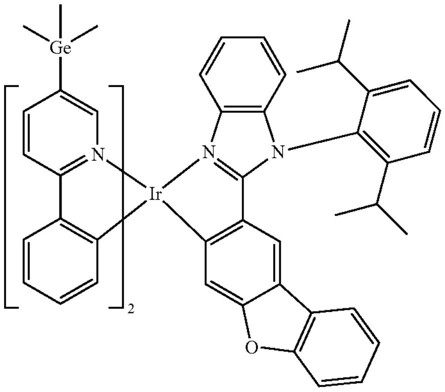
1212
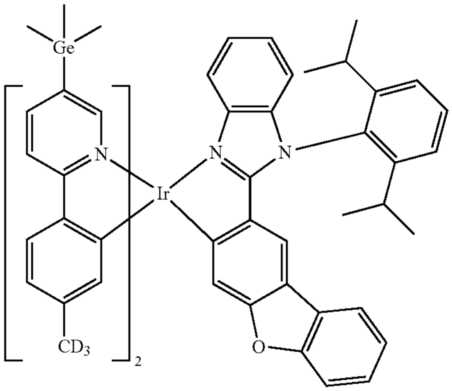
1213
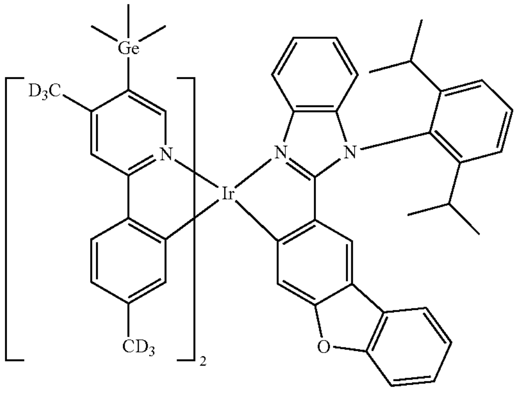
-continued
1214
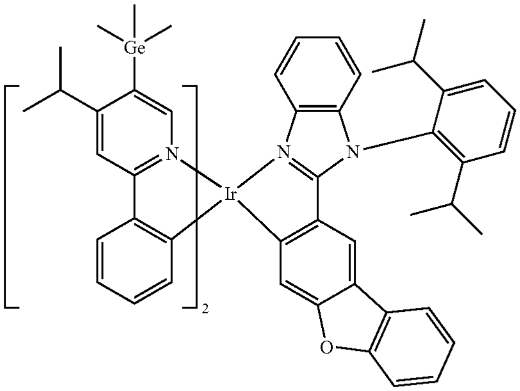
1215
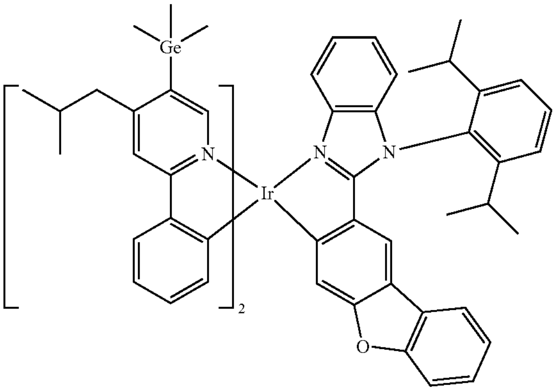
1216
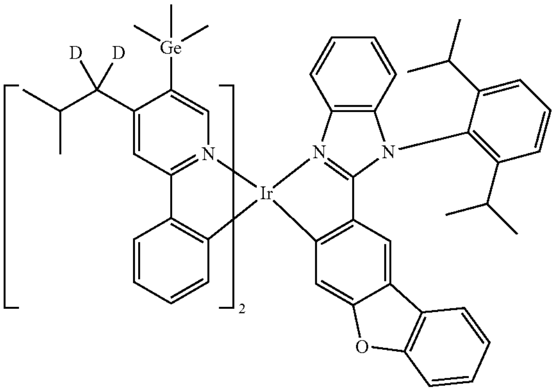
1217
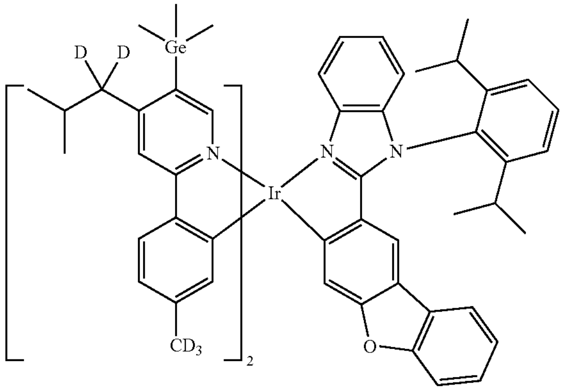

-continued
1218
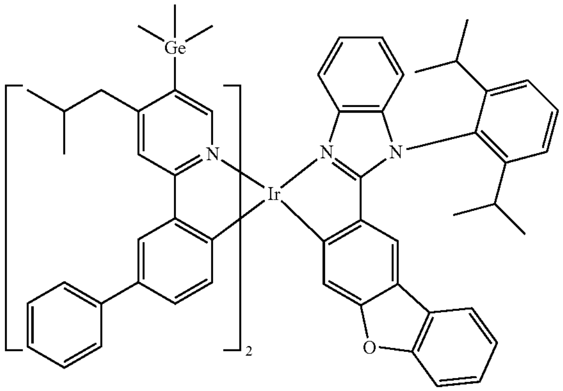
1219
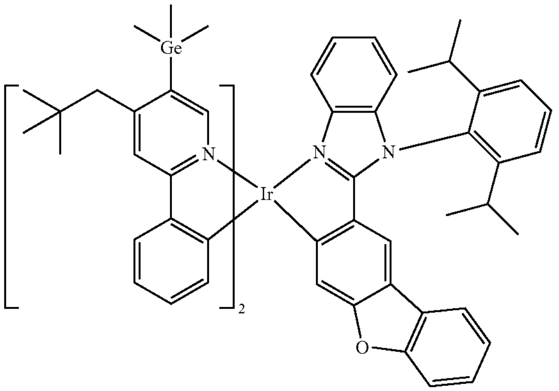
1220
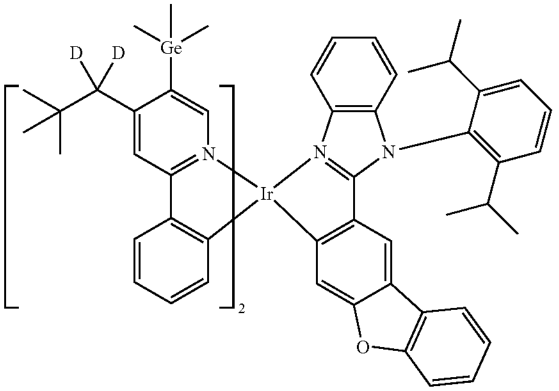
1221
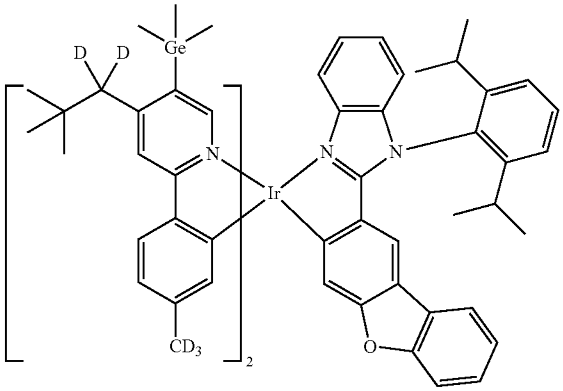
-continued
1222
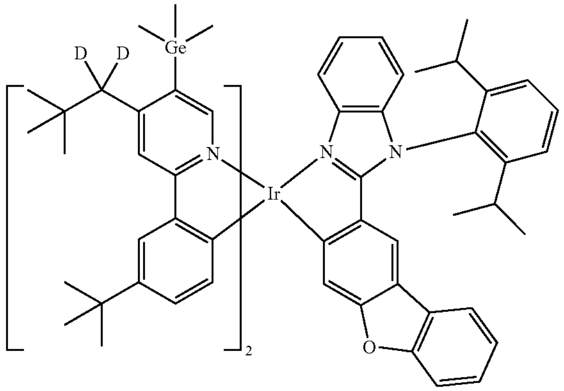
1223
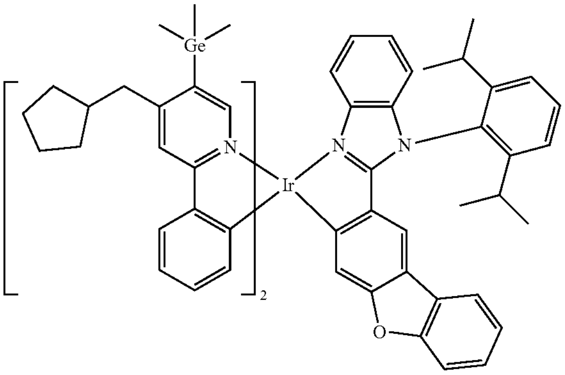
1224
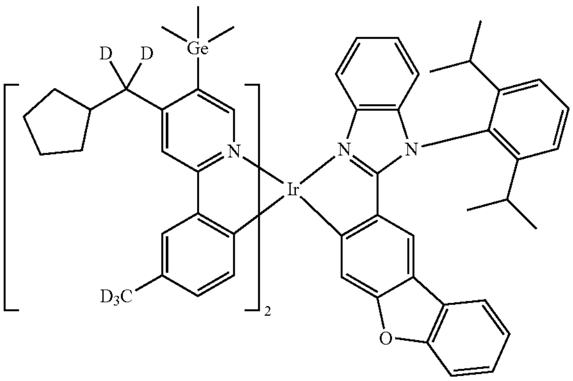
1225
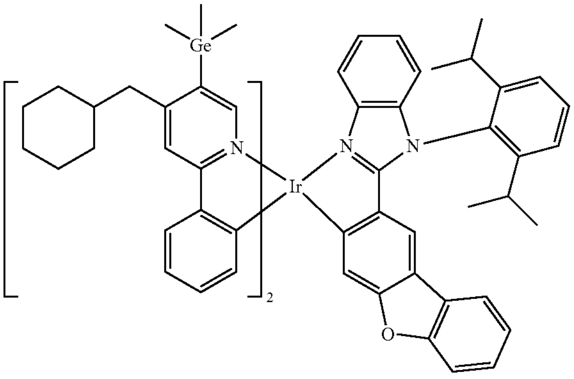

-continued
1226
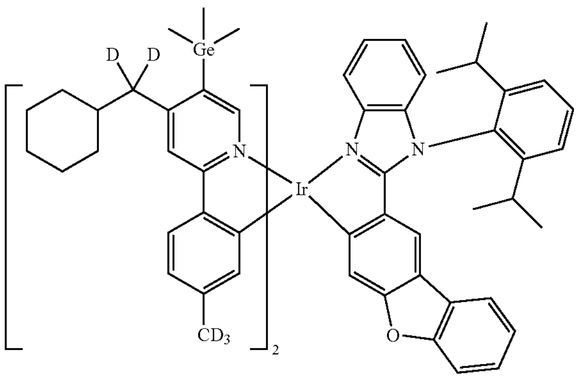
1227
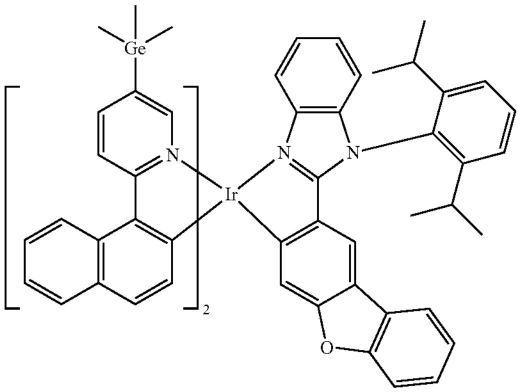
1228
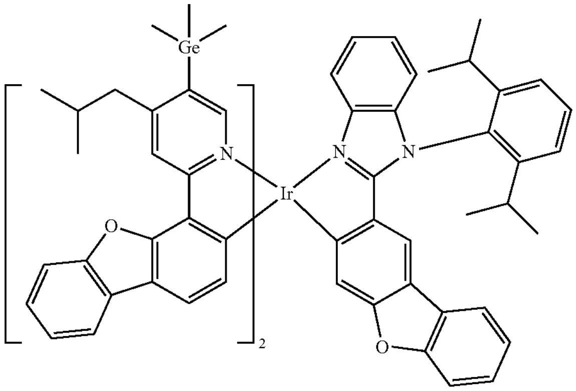
1229
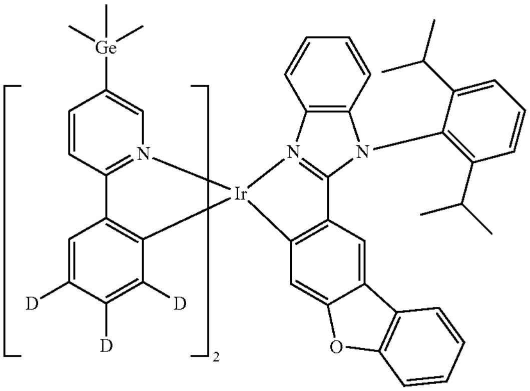
-continued
1230
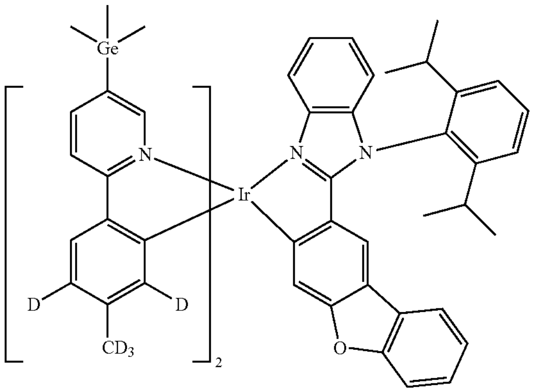
1231
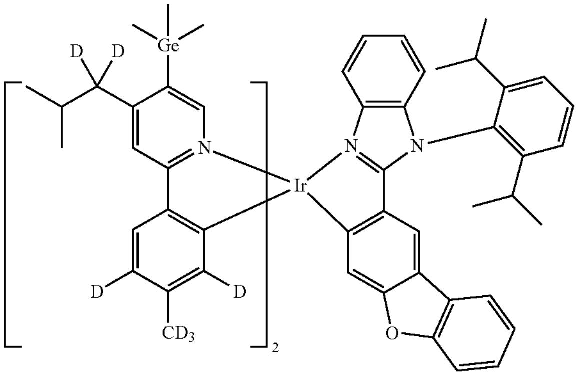
1232
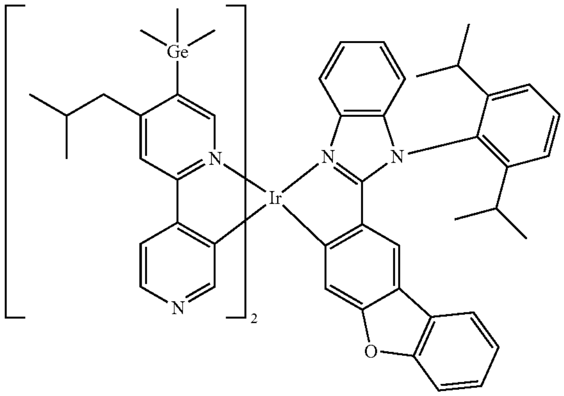
1233
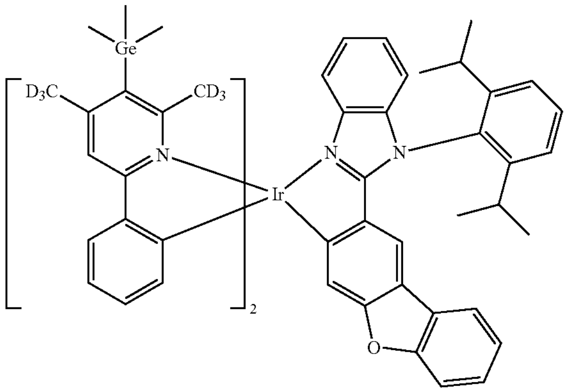

-continued
1234
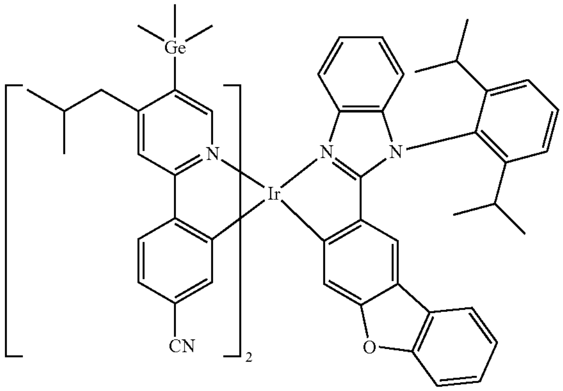
1235
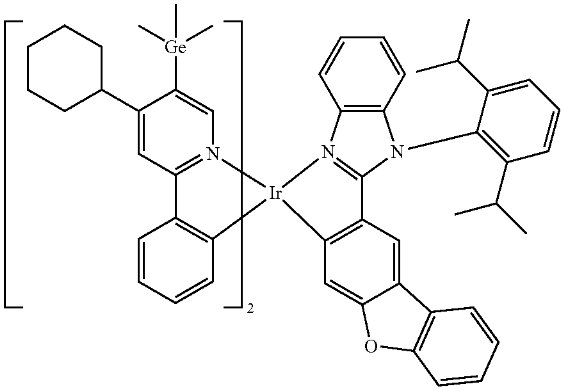
1236
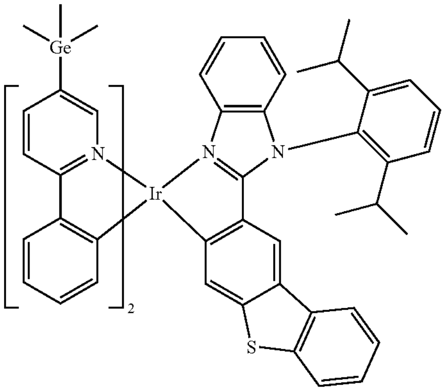
1237
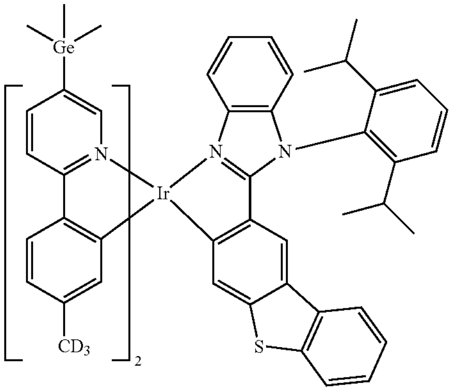
-continued
1238
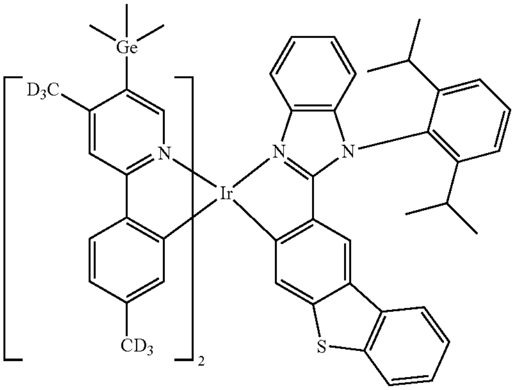
1239
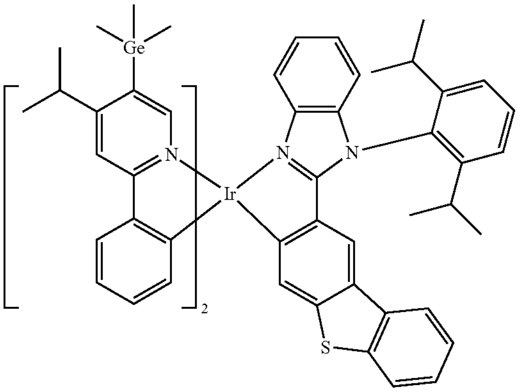
1240
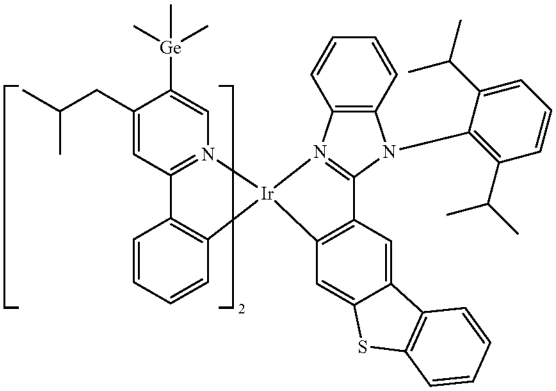
1241
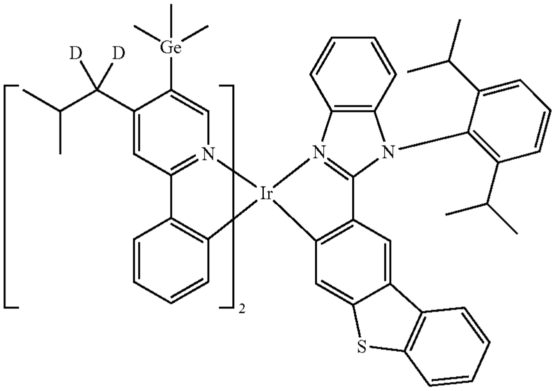

-continued
1242
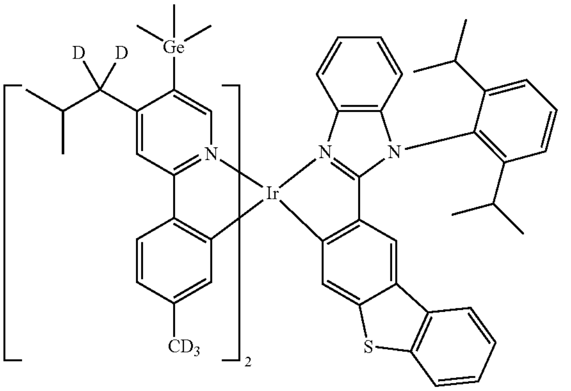
1243
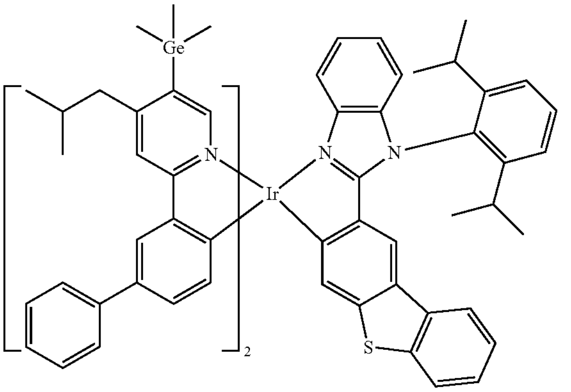
1244
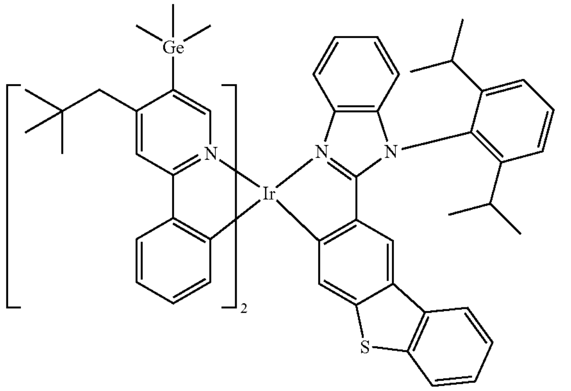
1245
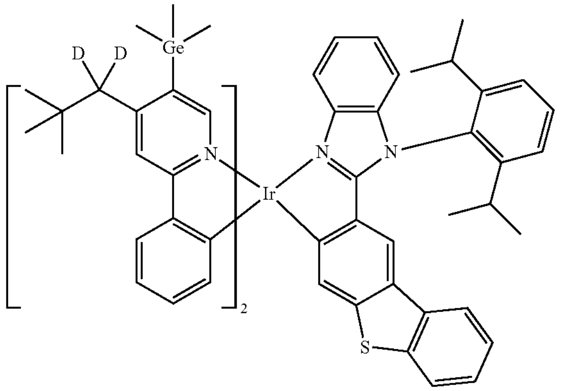
-continued
1246
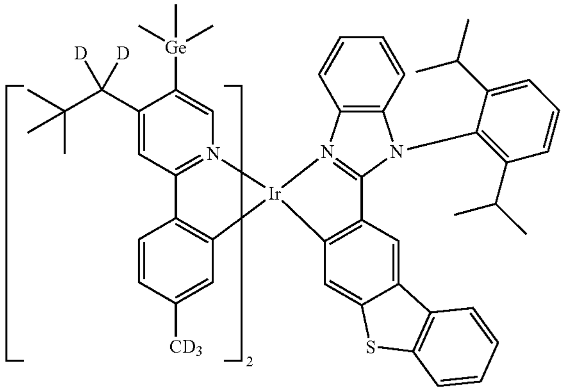
1247
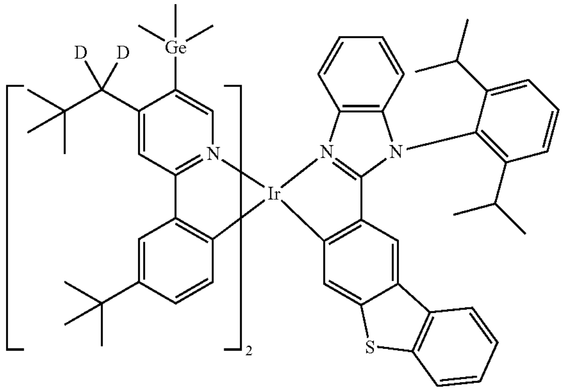
1248
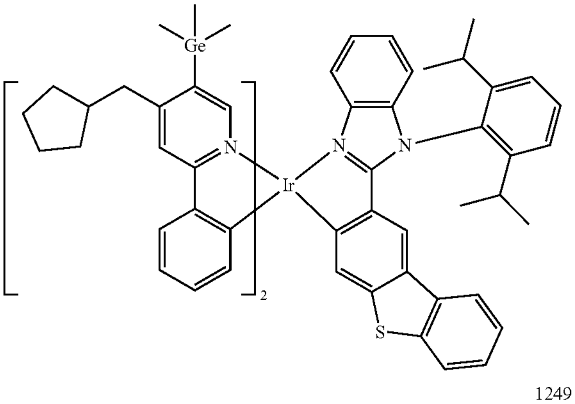
1249
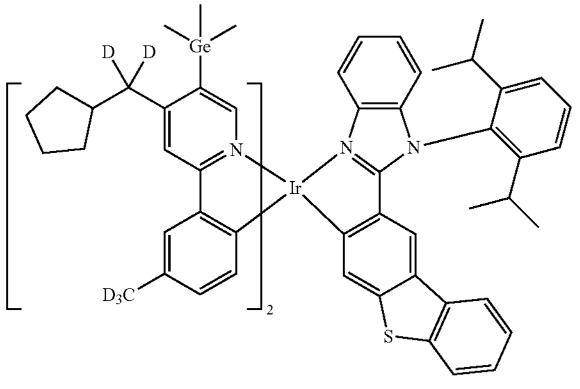

-continued
1250
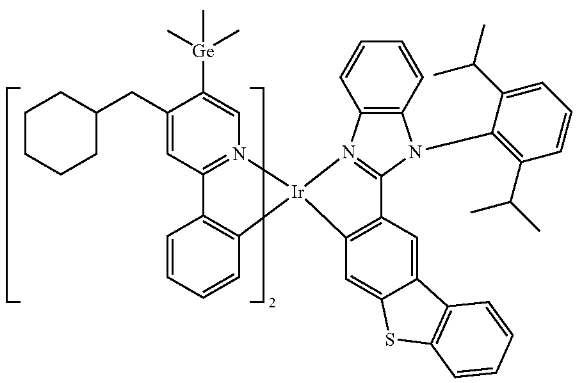
1251
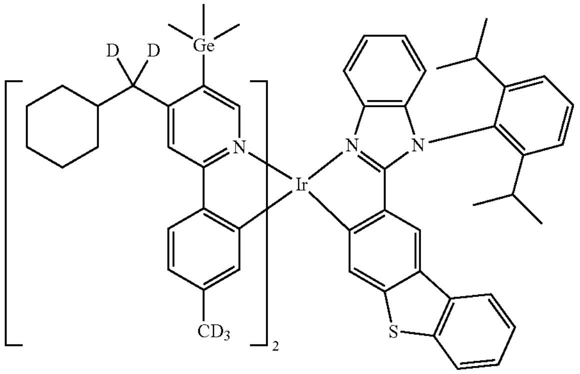
1252
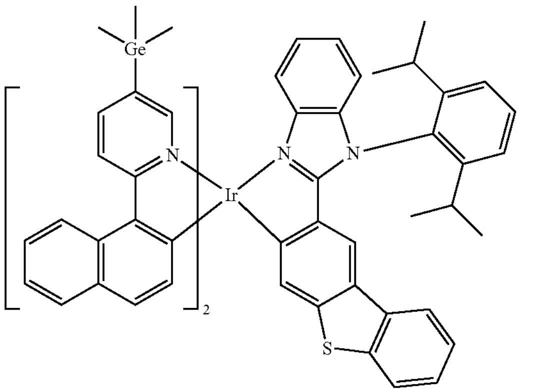
1253
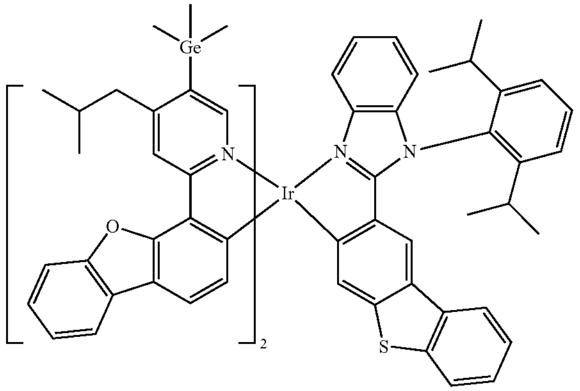
-continued
1254
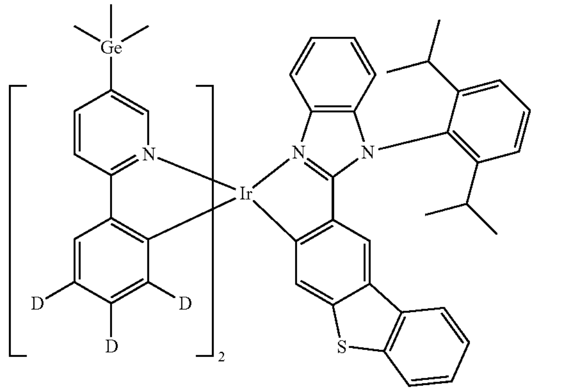
1255
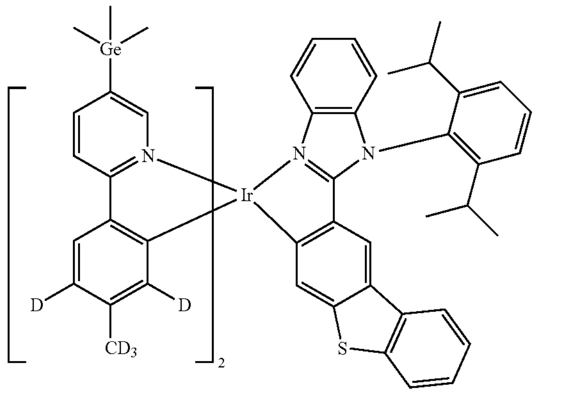
1256
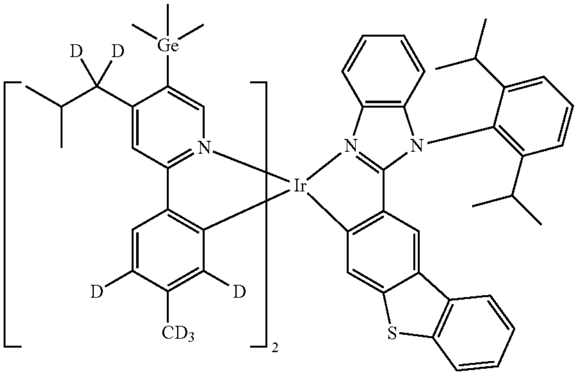
1257
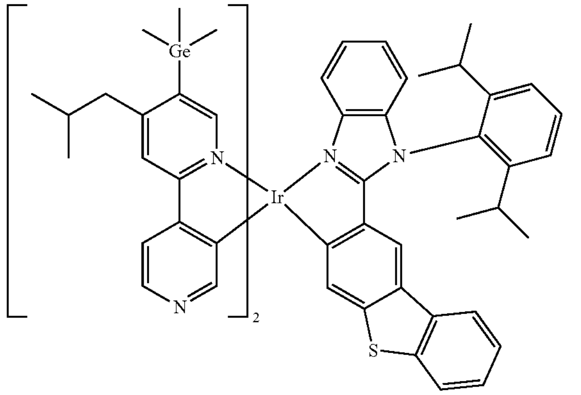

-continued
1258
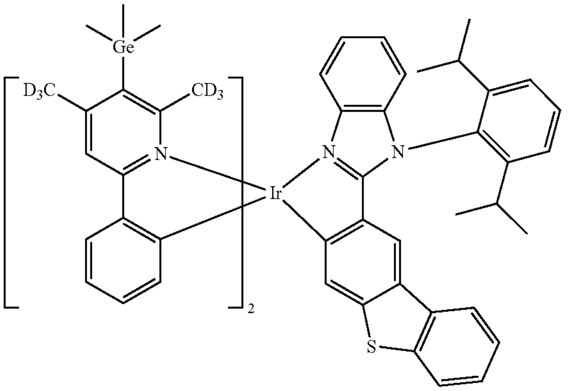
1259
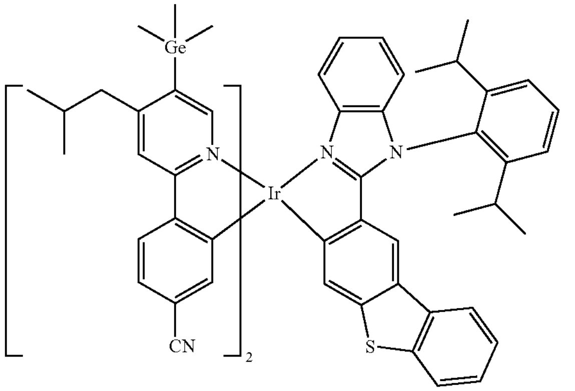
1260
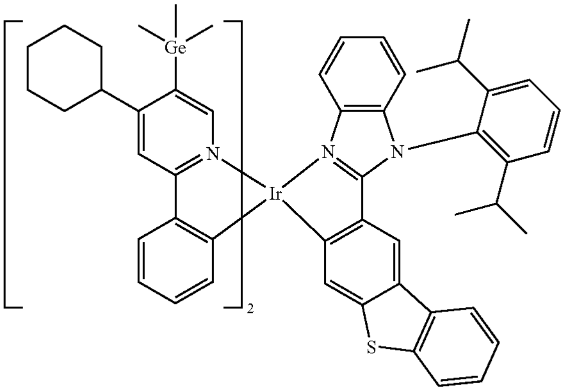
1261
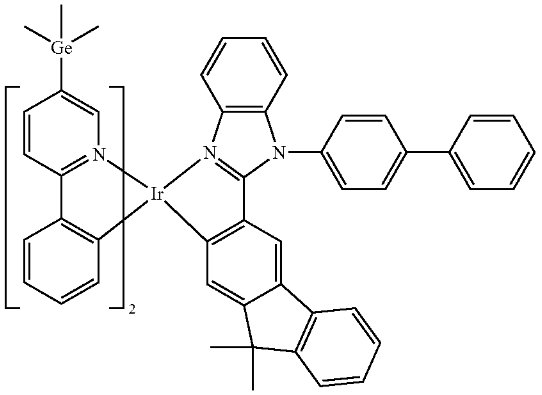
-continued
1262
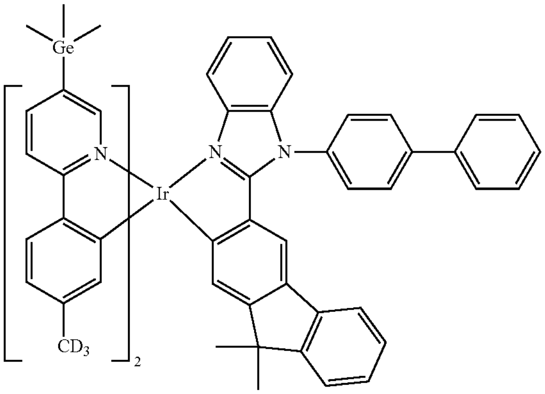
1263
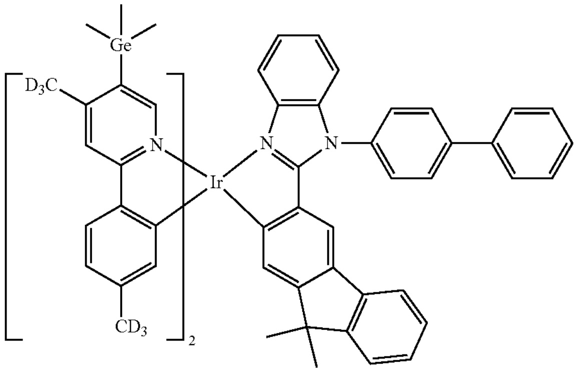
1264
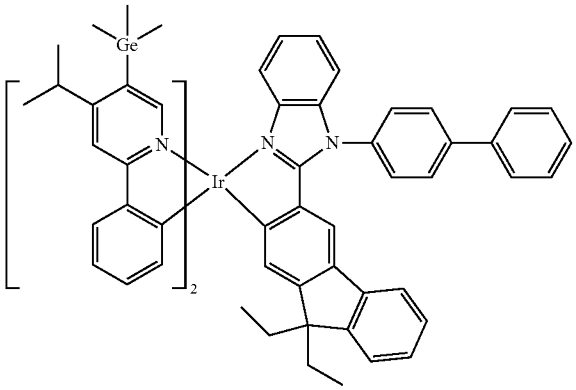
1265
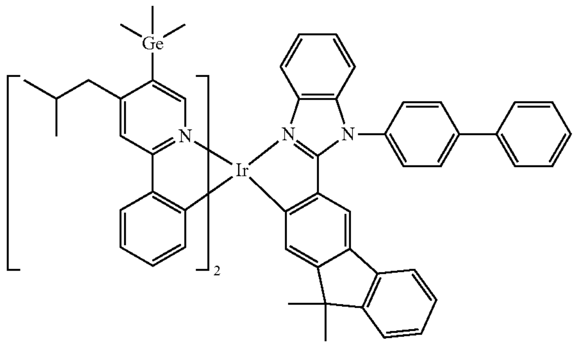

-continued
1266
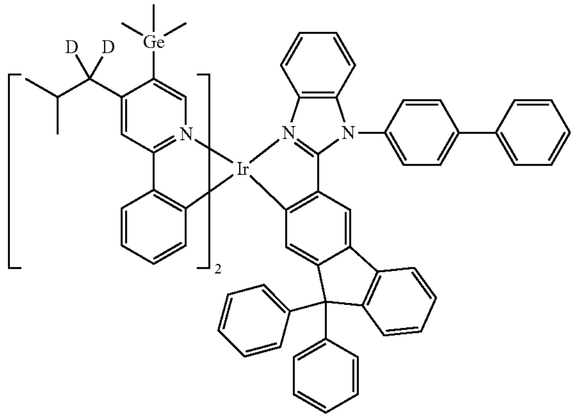
1267
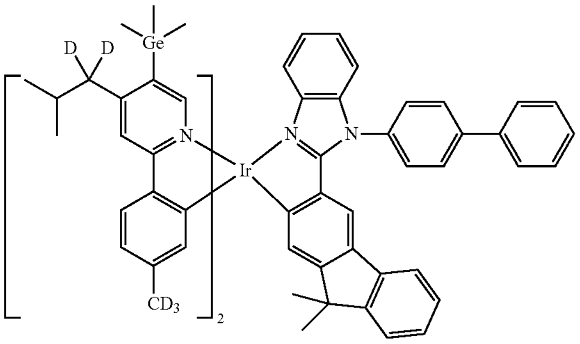
1268
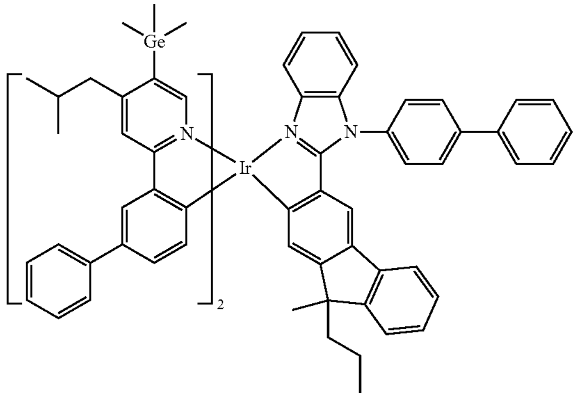
1269
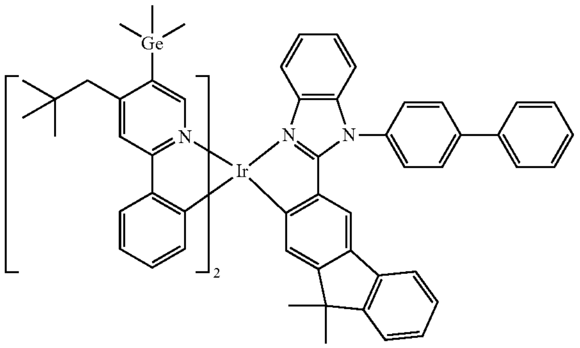
-continued
1270
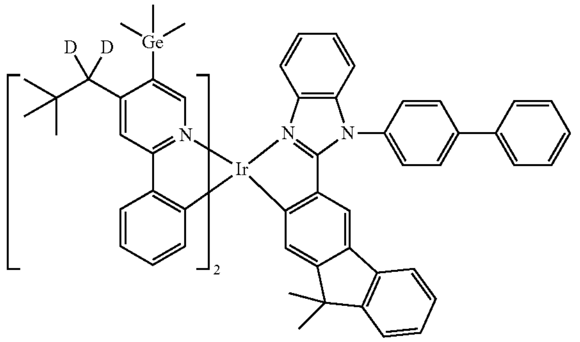
1271
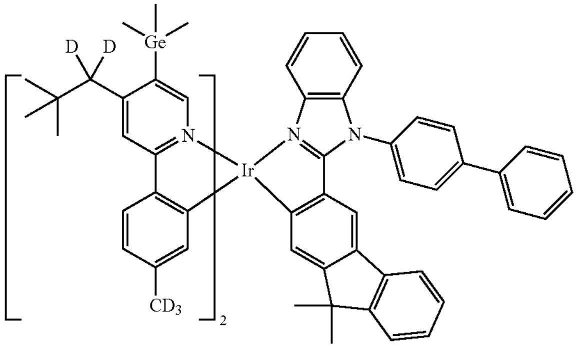
1272
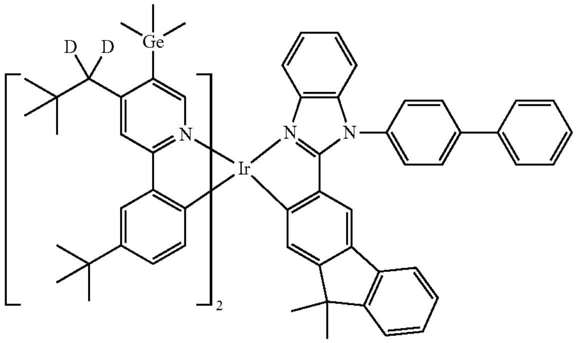
1273
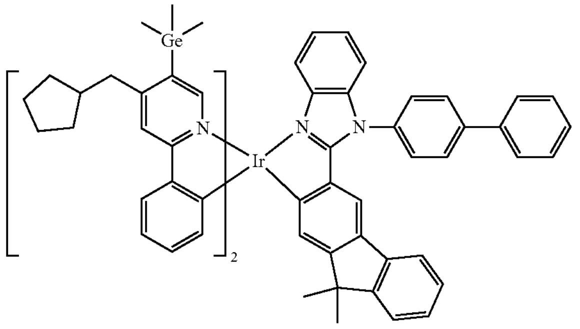

-continued
1274
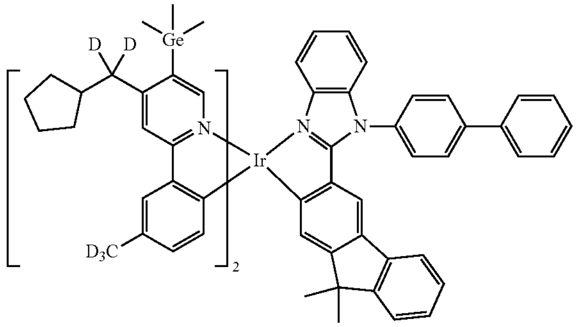
1275
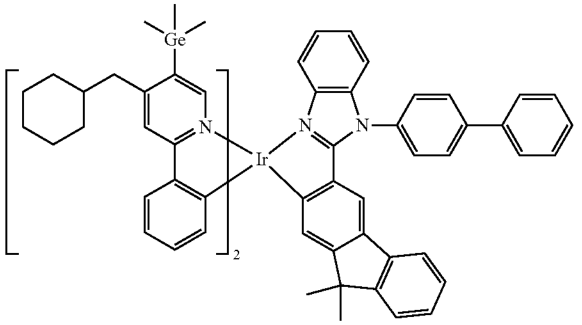
1276
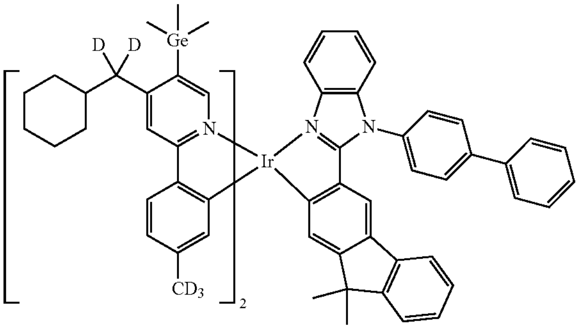
1277
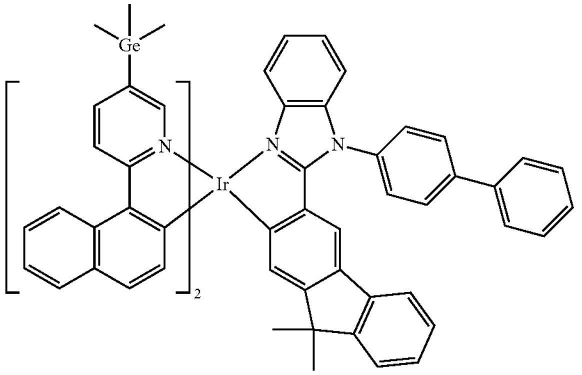
-continued
1278
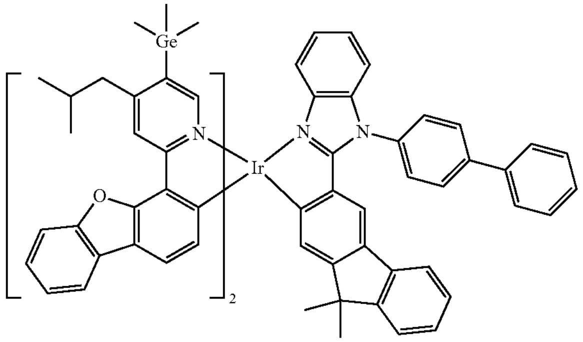
1279
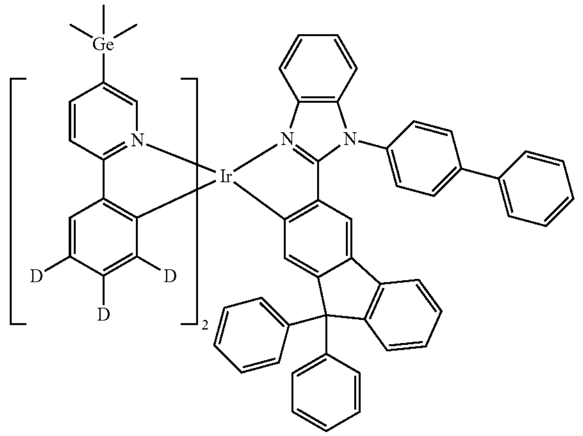
1280
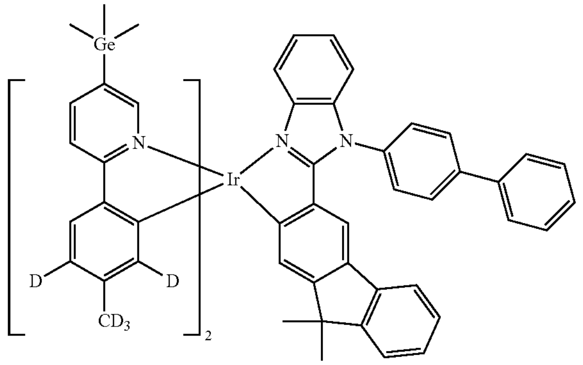
1281
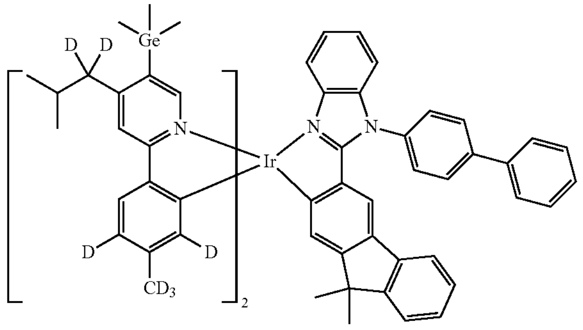

-continued
1282
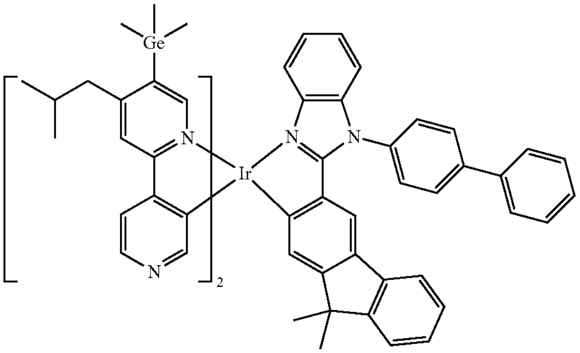
1283
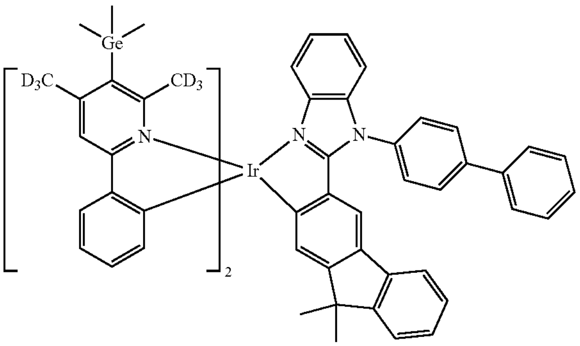
1284
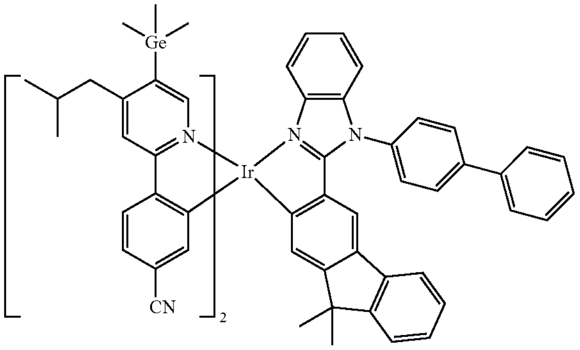
1285
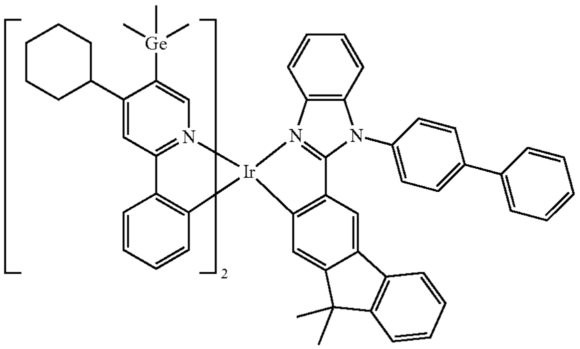
-continued
1286
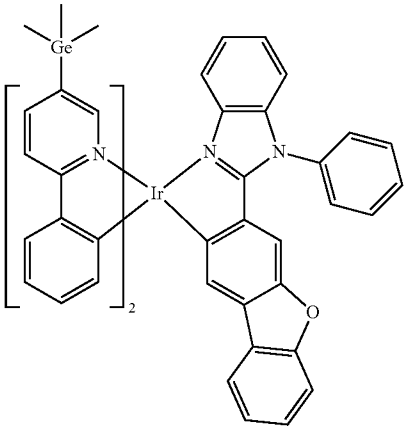
1287
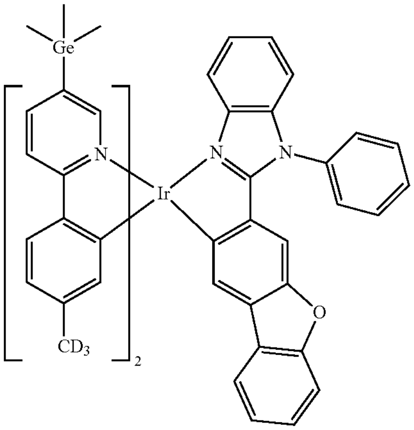
1288
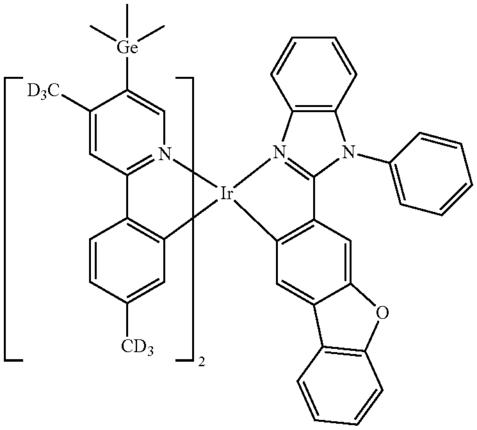

-continued
1289
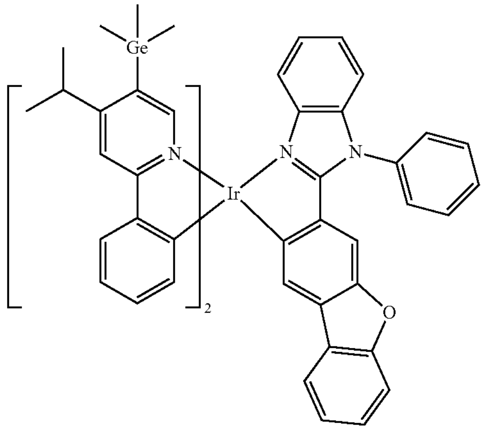
1290
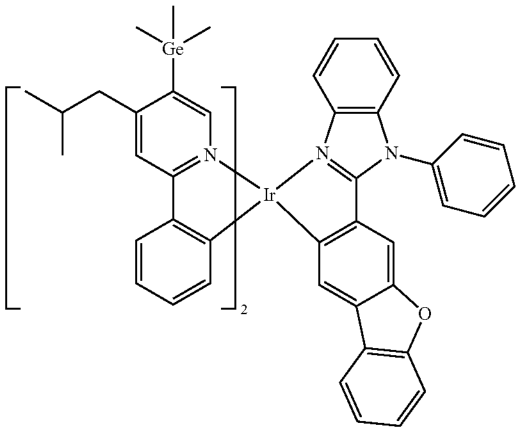
1291
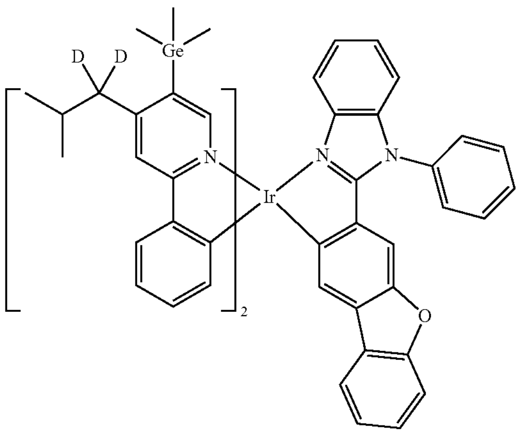
-continued
1292
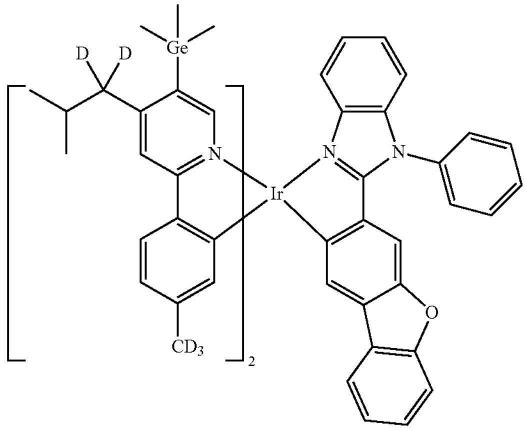
1293
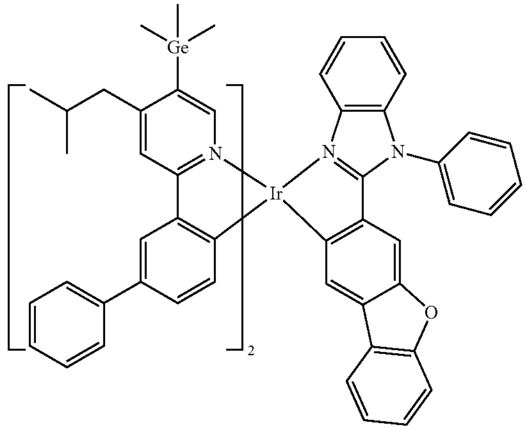
1294
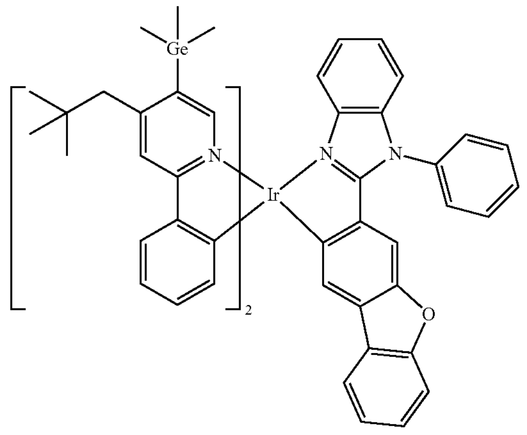

-continued
1295
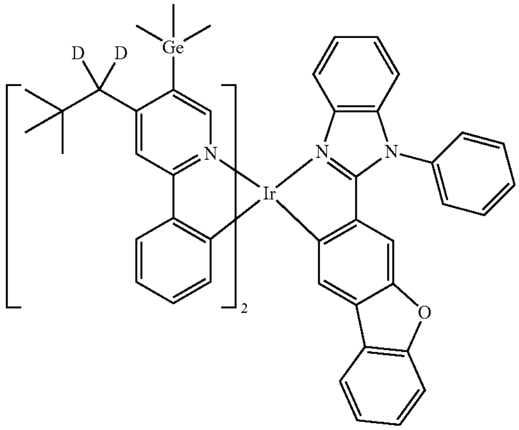
1296
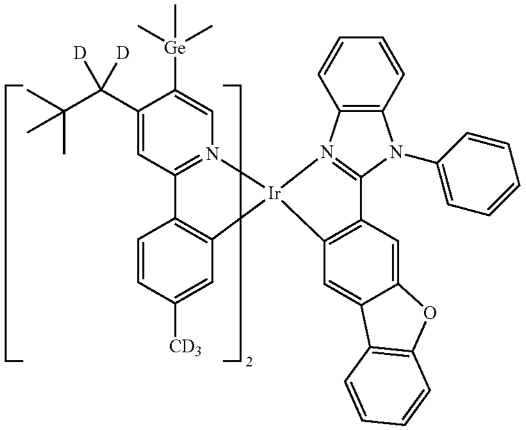
1297
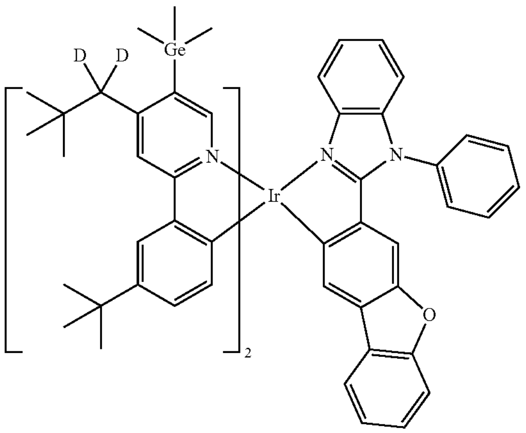
-continued
1298
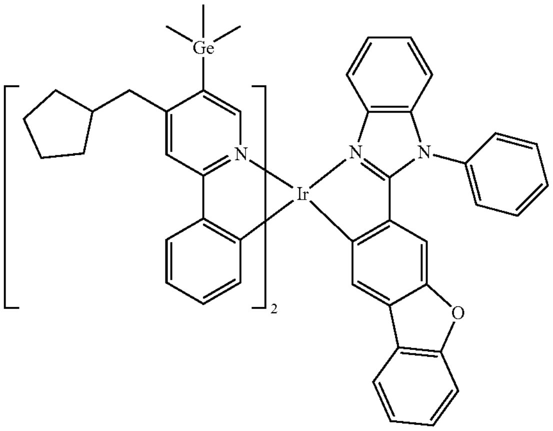
1299
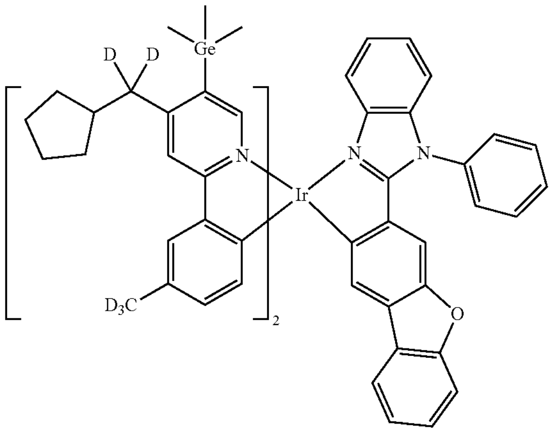
1300
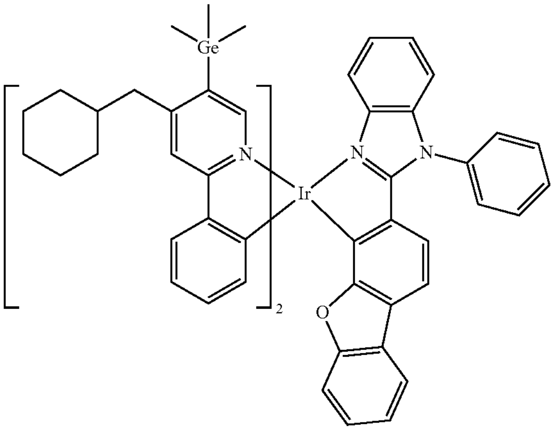

-continued
1301
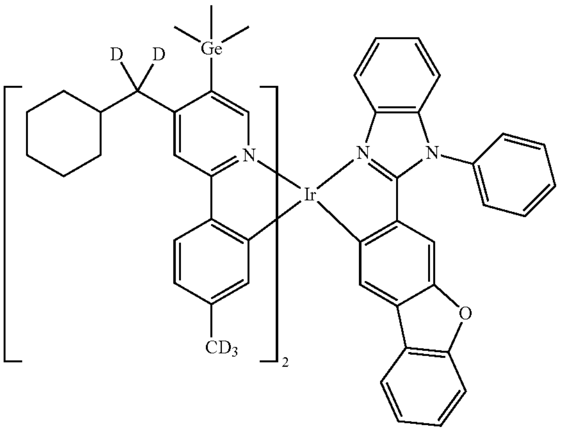
1302
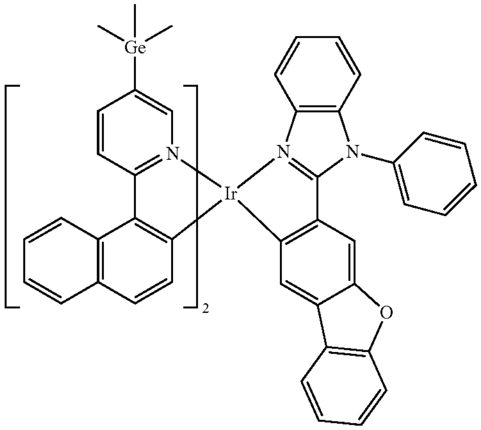
1303
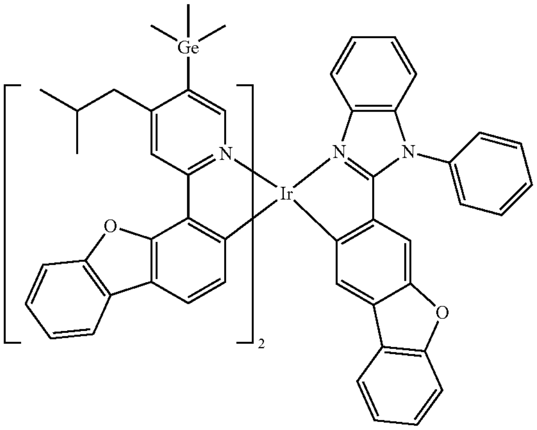
-continued
1304
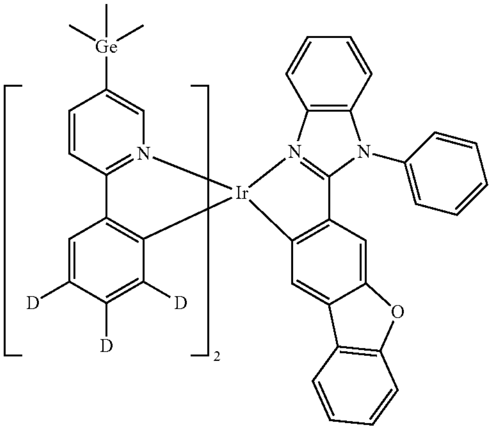
1305
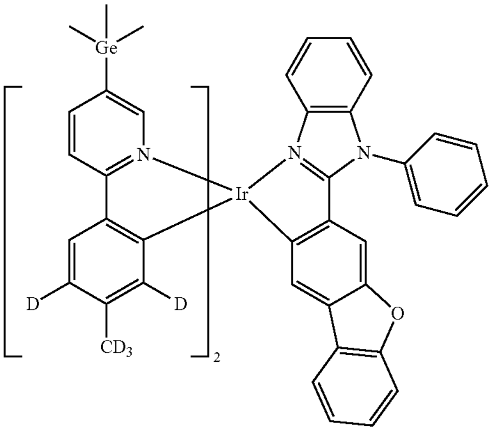
1306
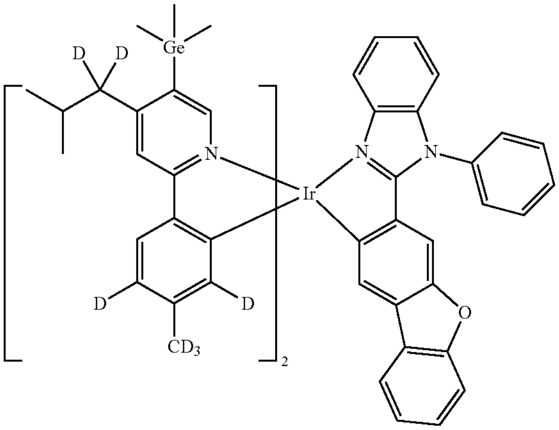

-continued
1307
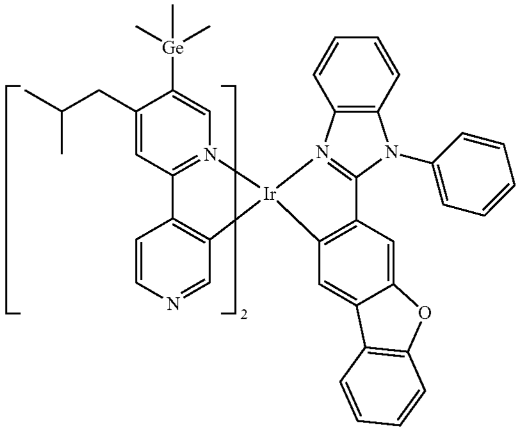
1308
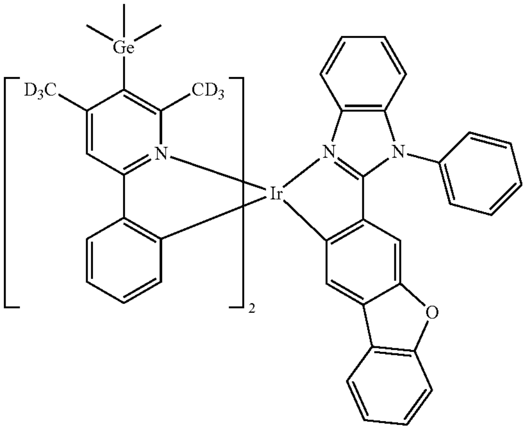
1309
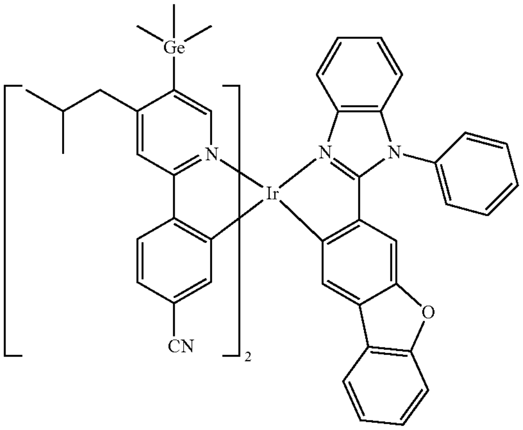
-continued
1310
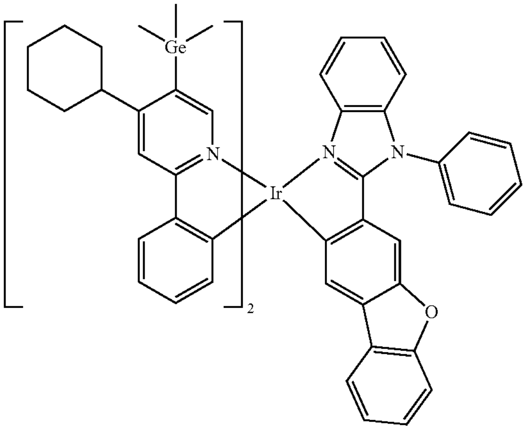
1311
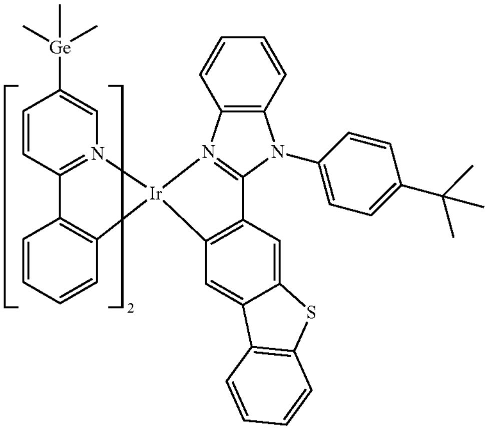
1312
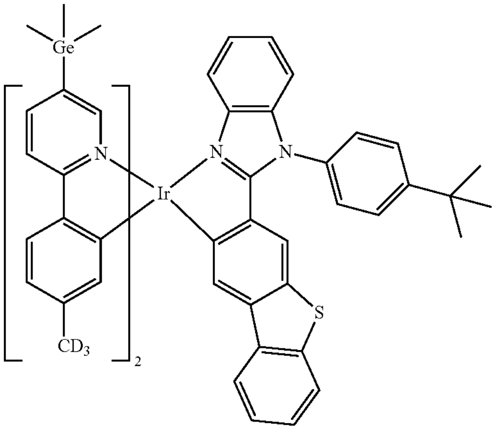

-continued
1313
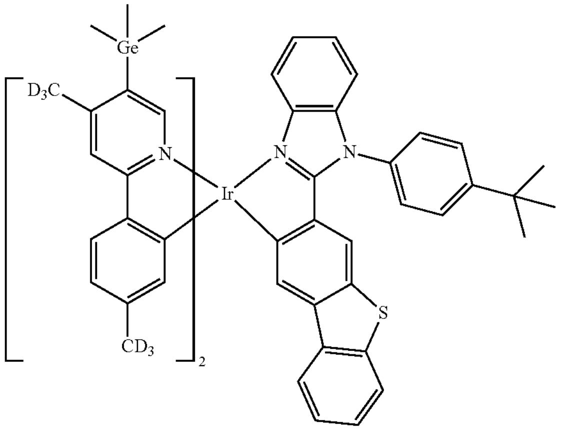
1314
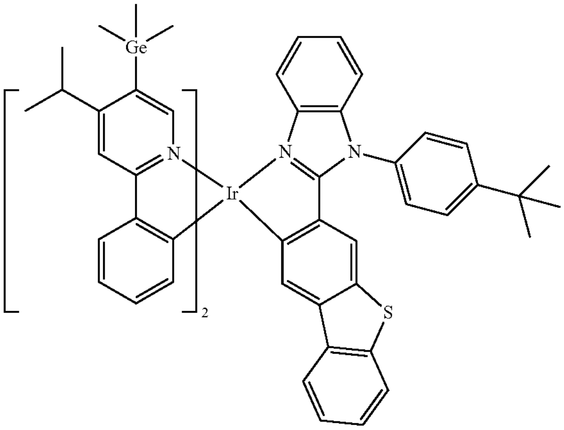
1315
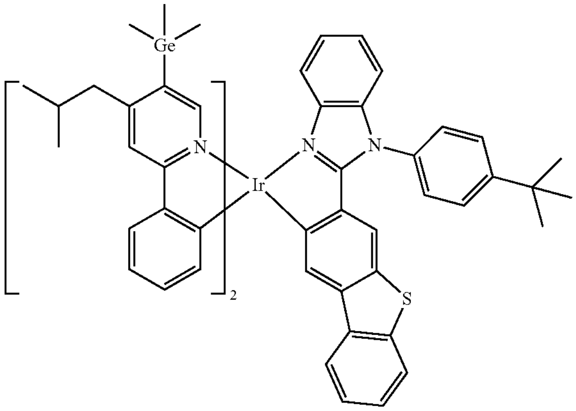
-continued
1316
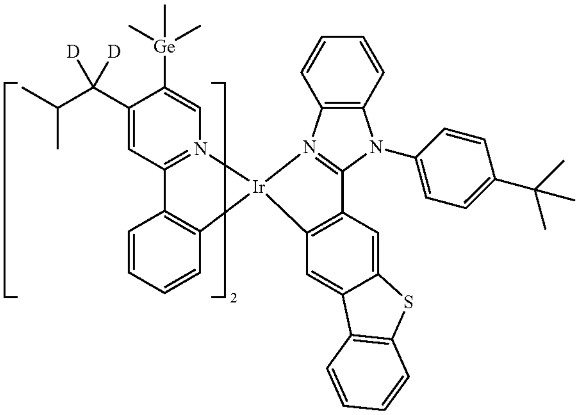
1317
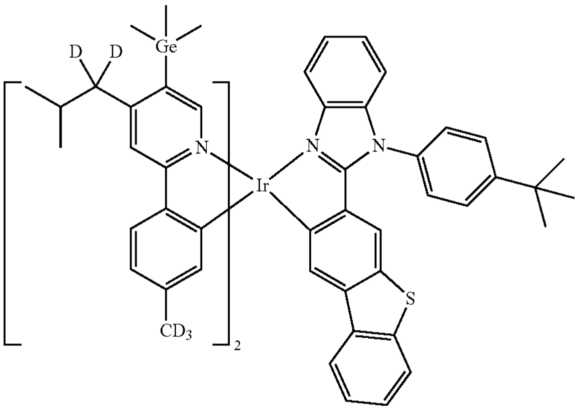
1318
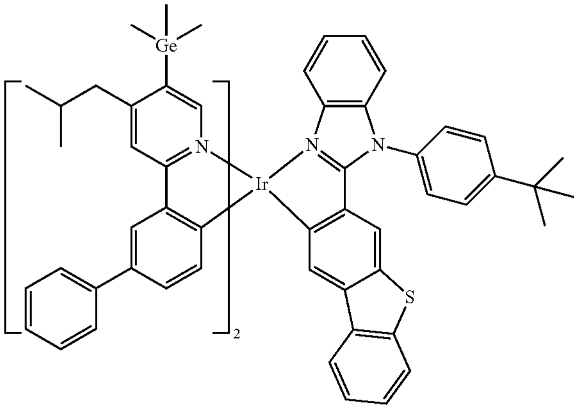

-continued
1319
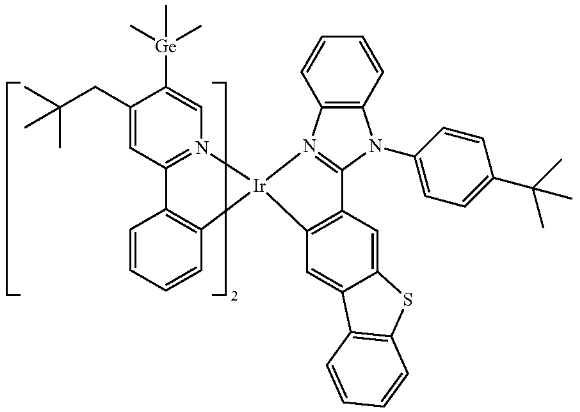
1320
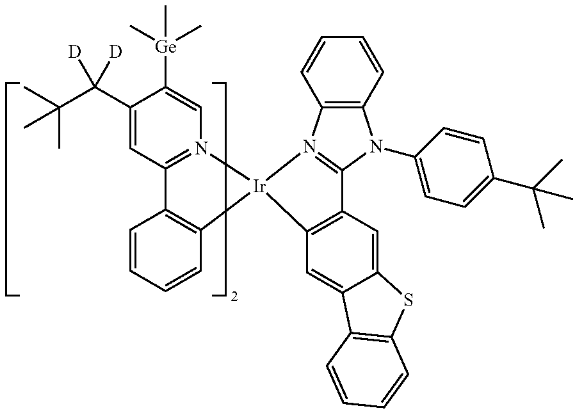
1321
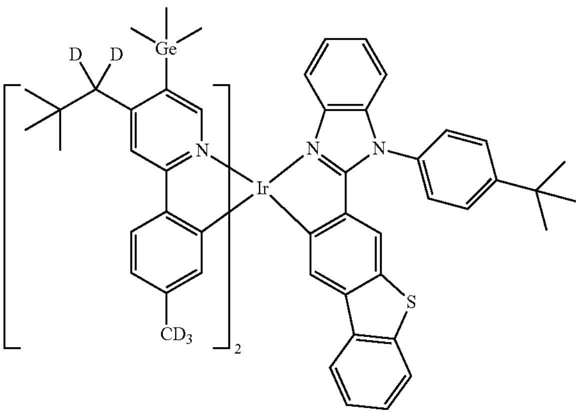
-continued
1322
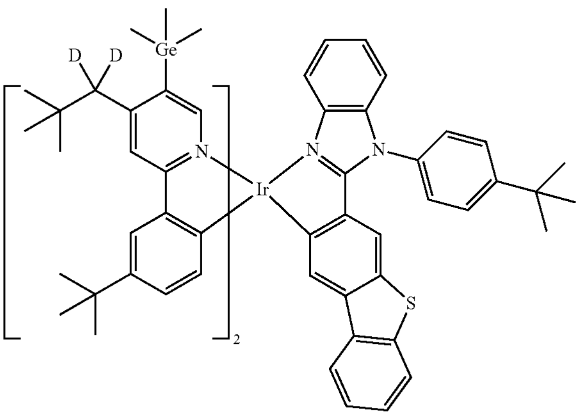
1323
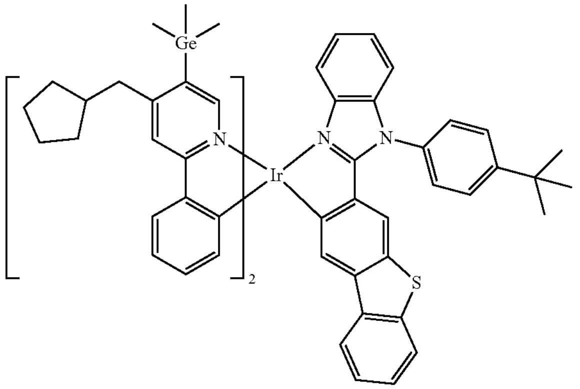
1324
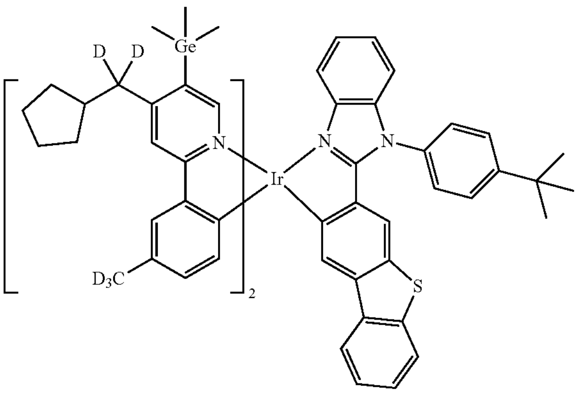

-continued
1325
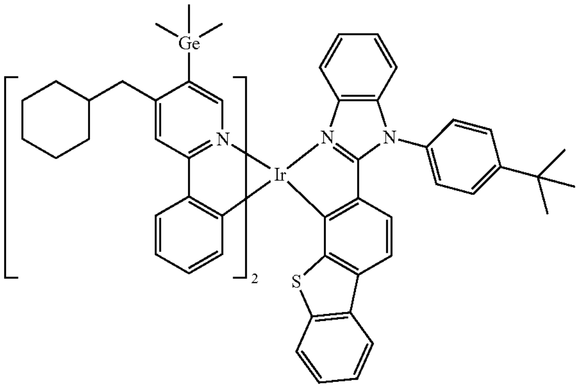
1326
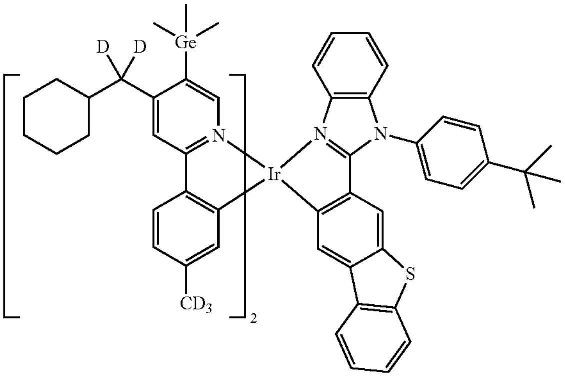
1327
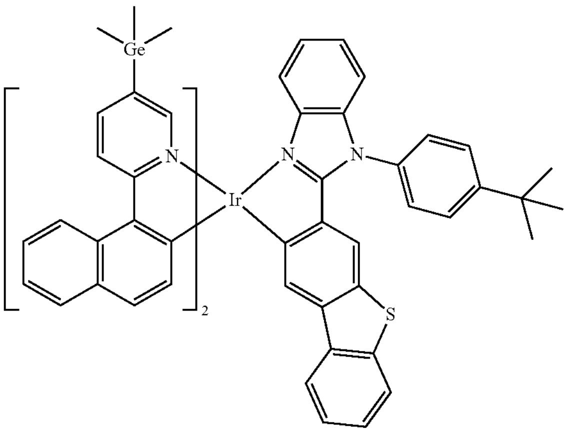
-continued
1328
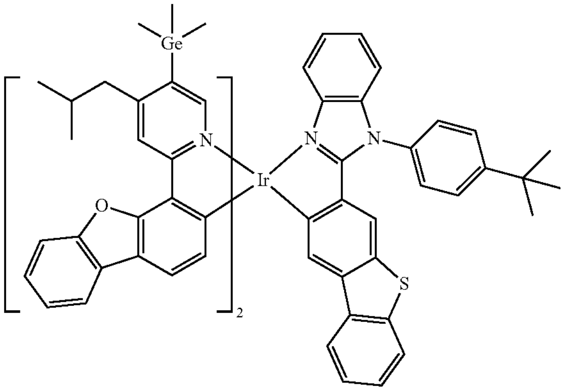
1329
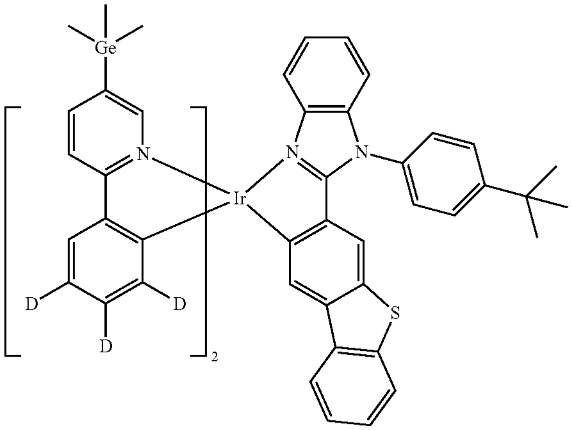
1330
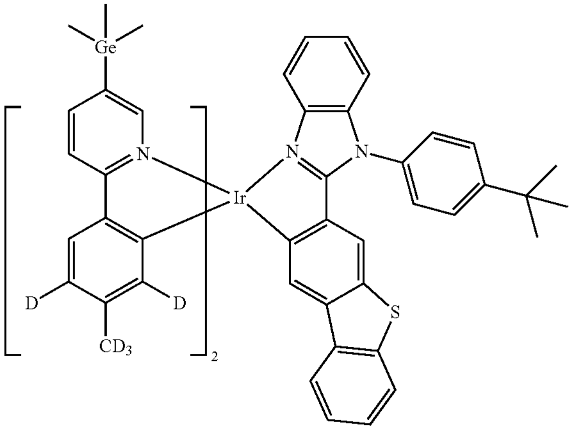

-continued
1331
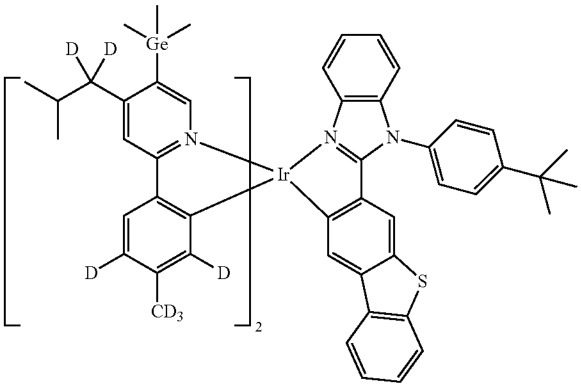
1332
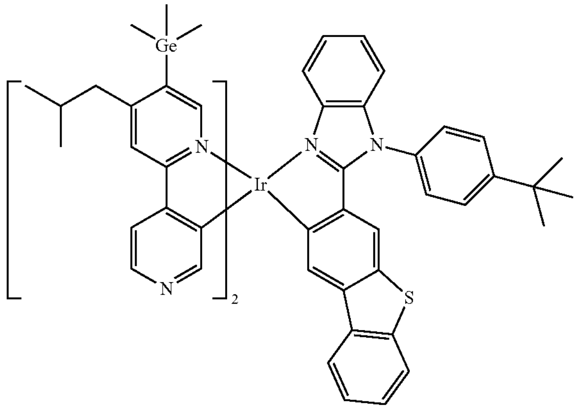
1333
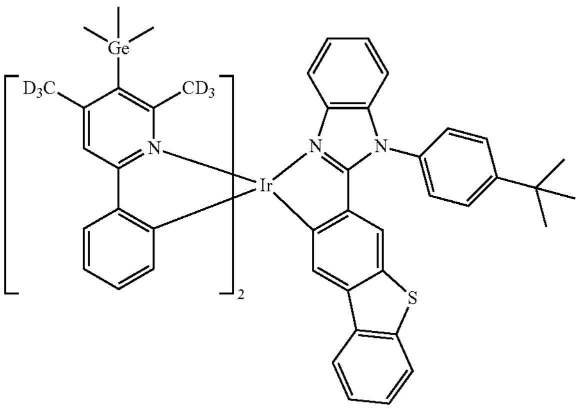
-continued
1334
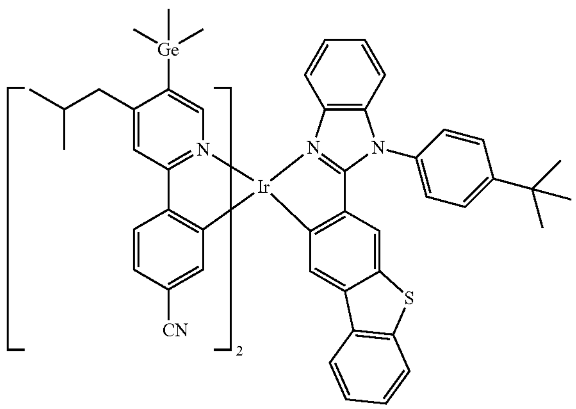
1335
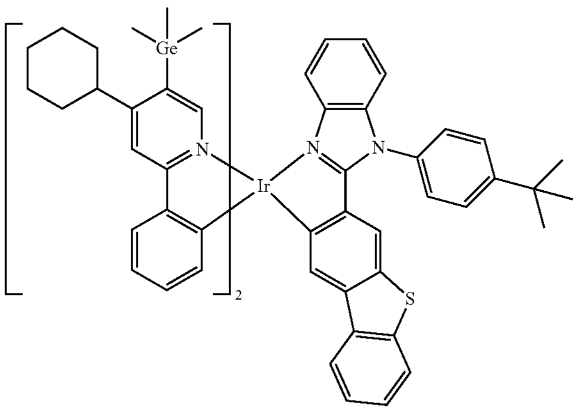
1336
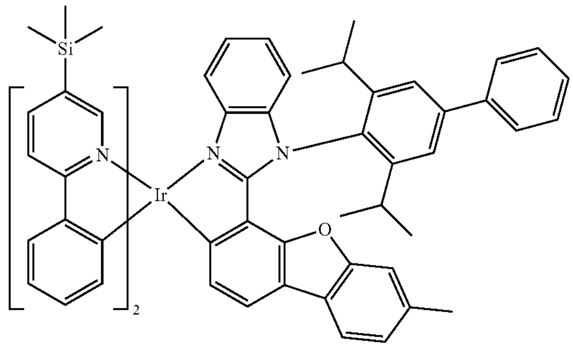
1337
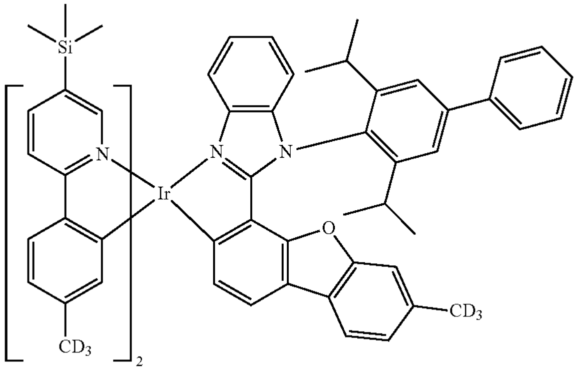

-continued
1338
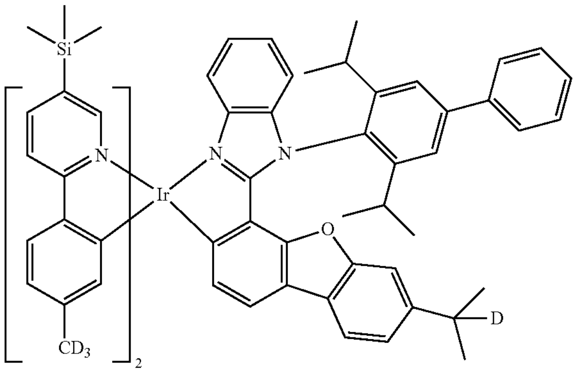
1339
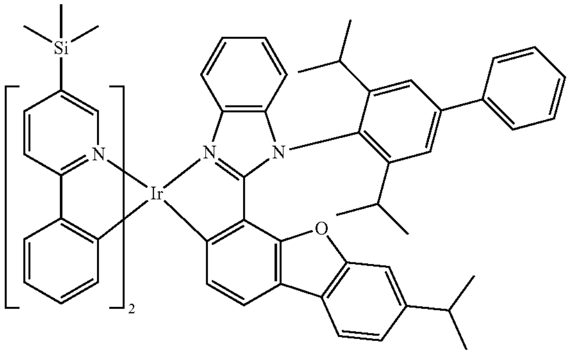
1340
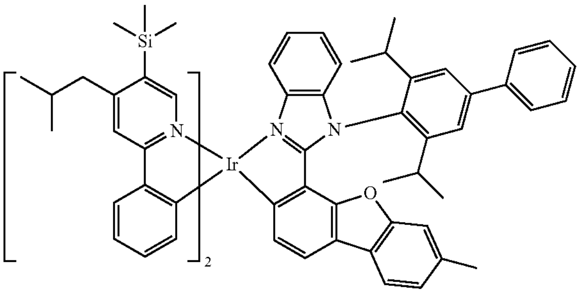
1341
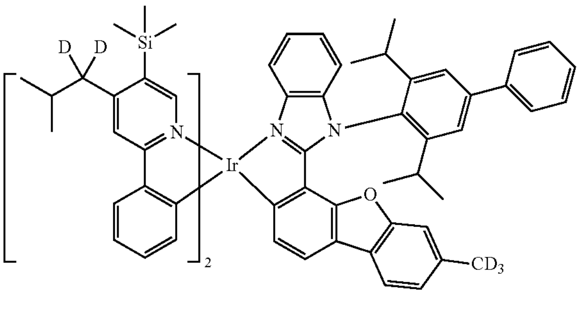
-continued
1342
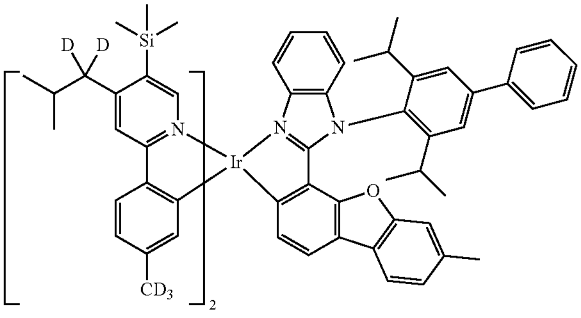
1343
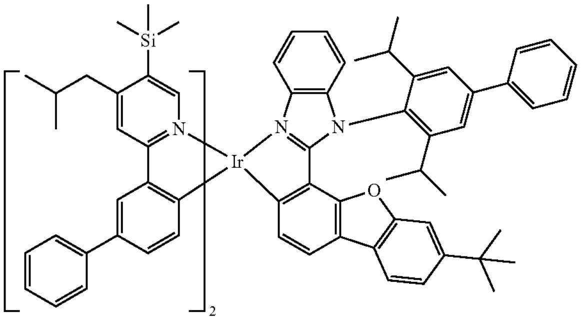
1344
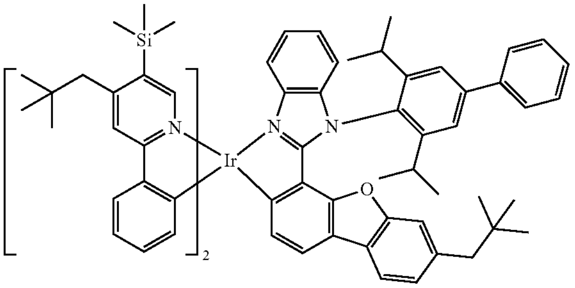
1345
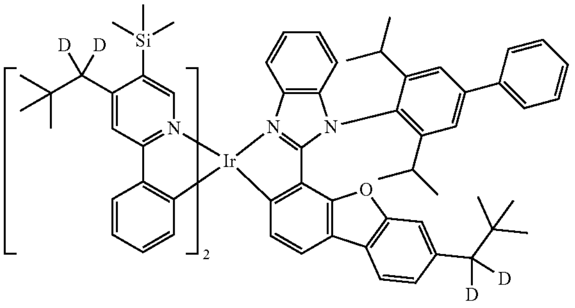

-continued
1346
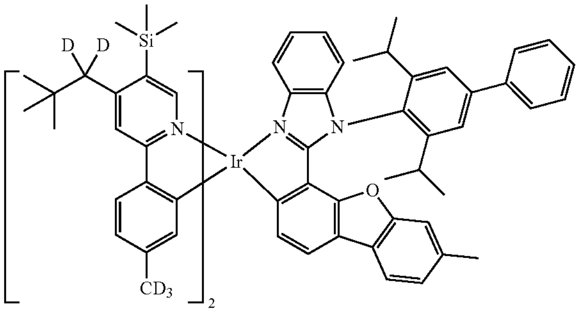
1347
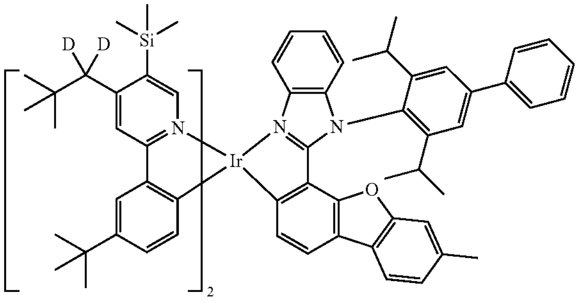
1348
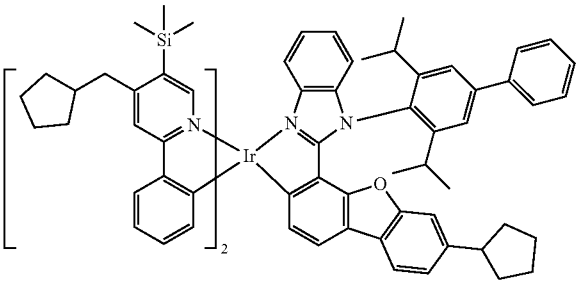
1349
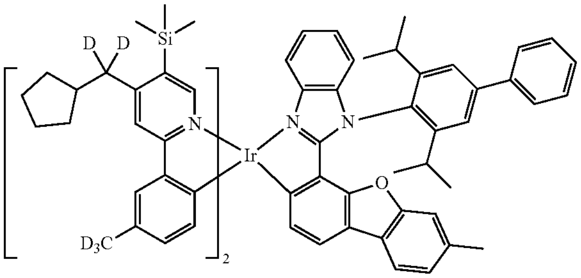
1350
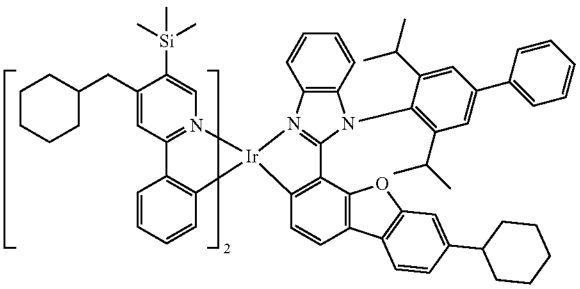
-continued
1351
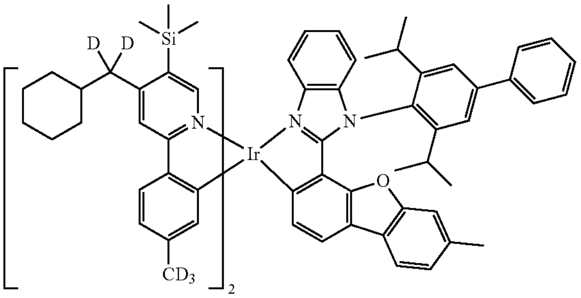
1352
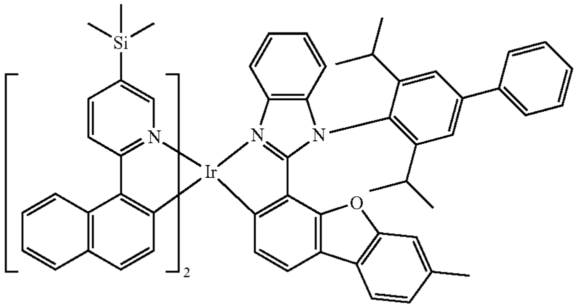
1353
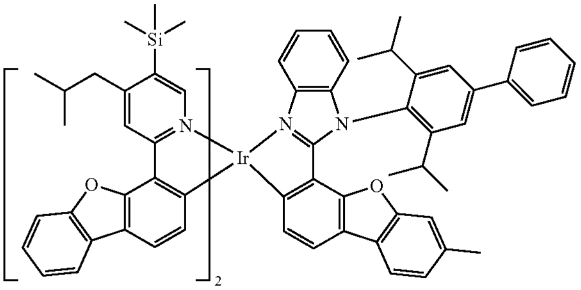
1354
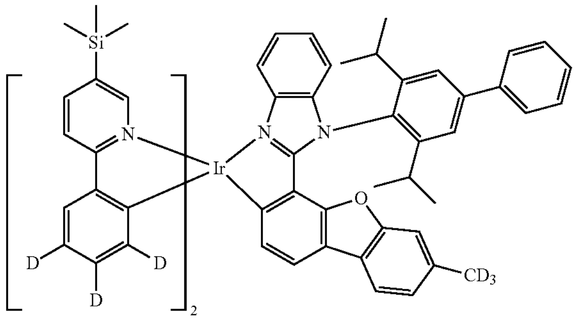

-continued
1355
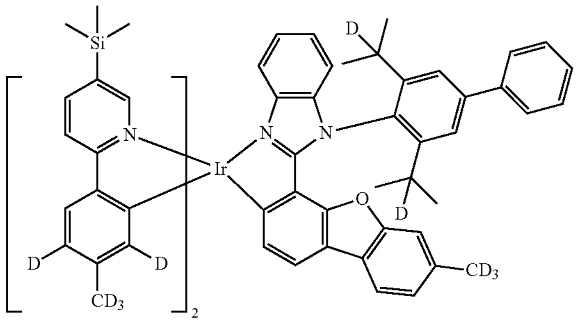
1356
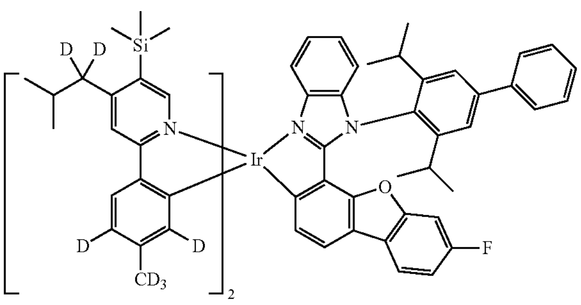
1357
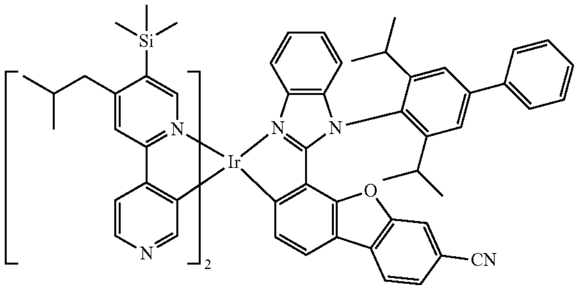
-continued
1358
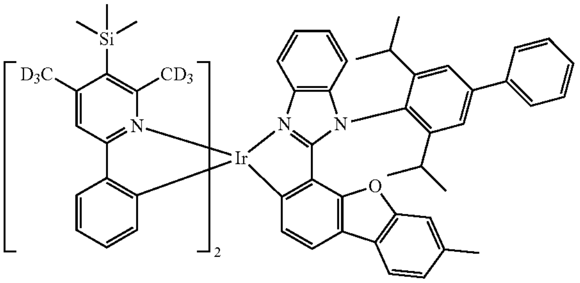
1359
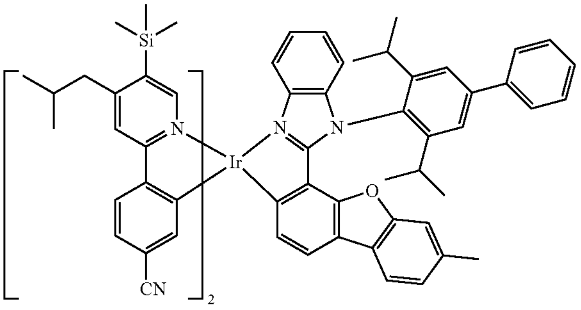
1360
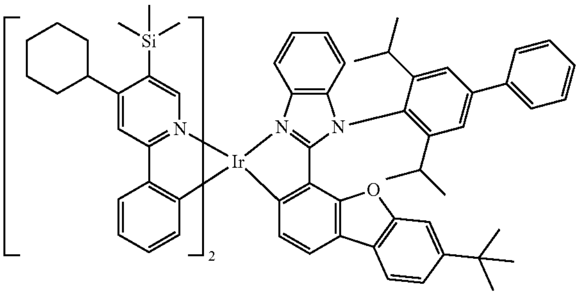
1361
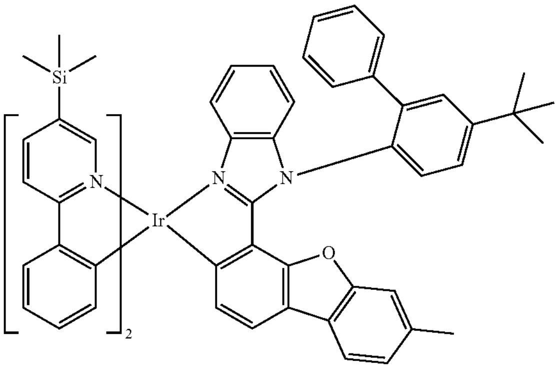
1362
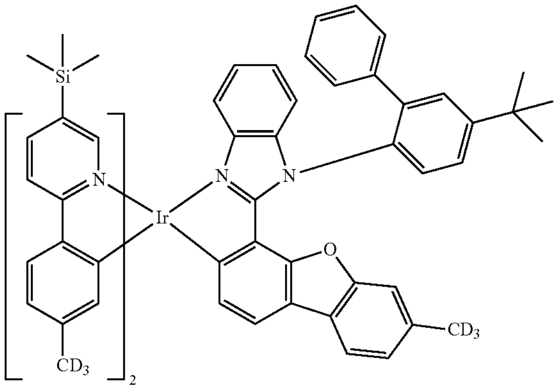

-continued
1363
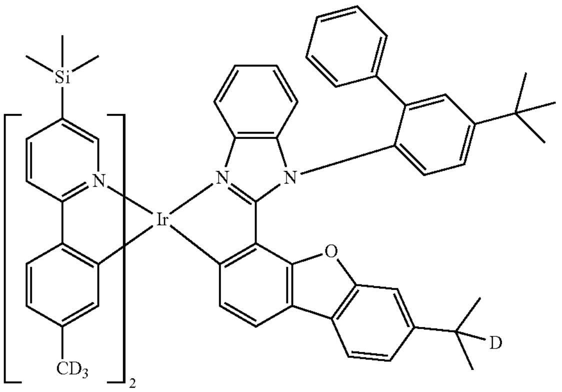
1364
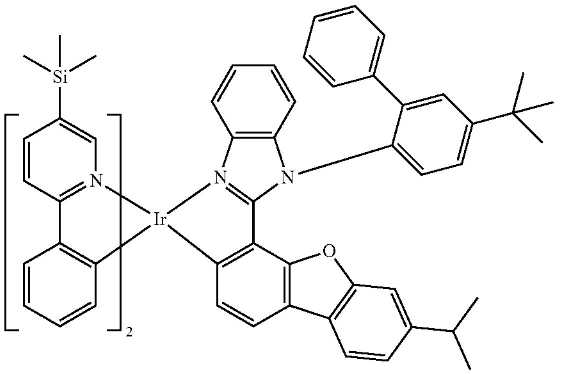
1365
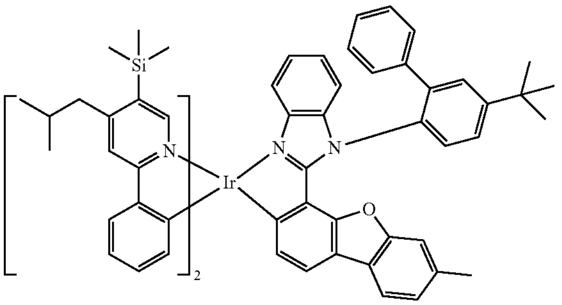
1366
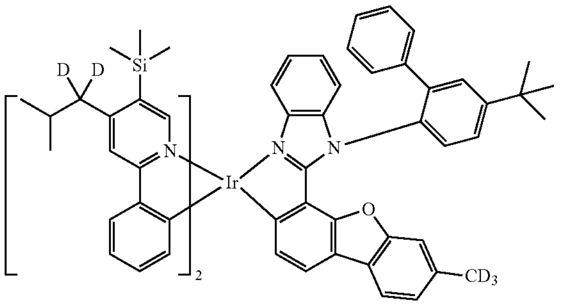
1367
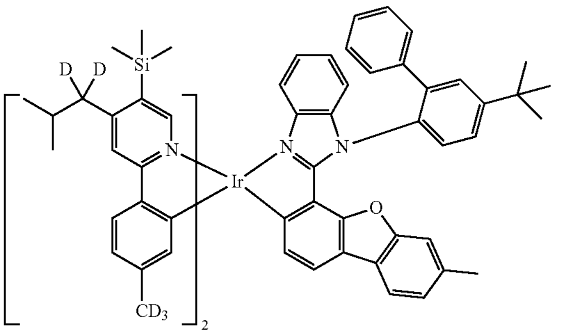
1368
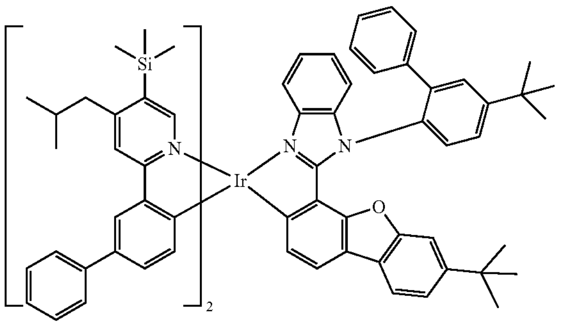
1369
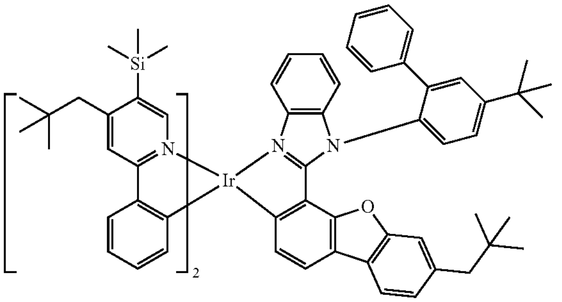
1370
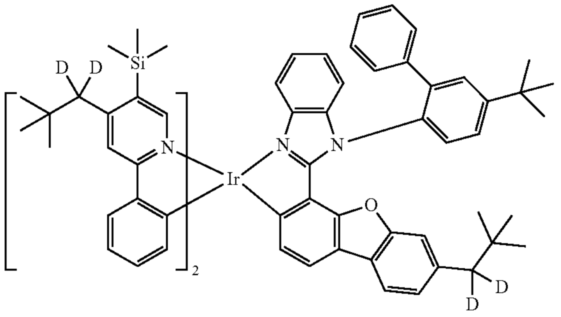

-continued
1371
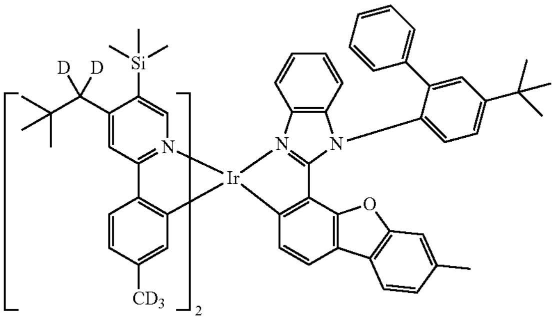
1372
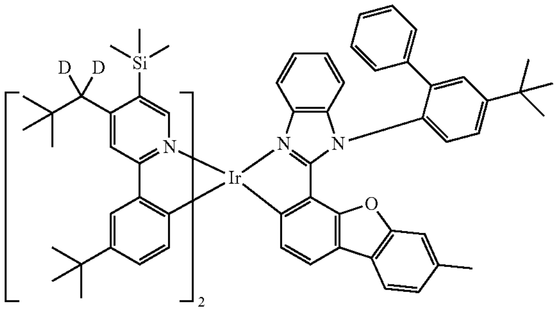
1373
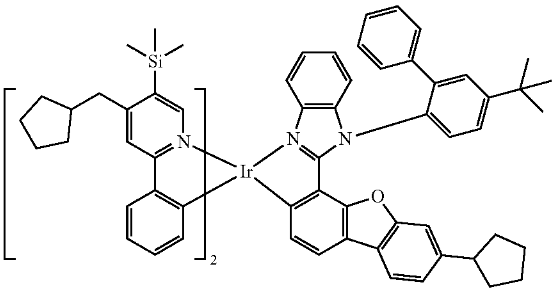
1374
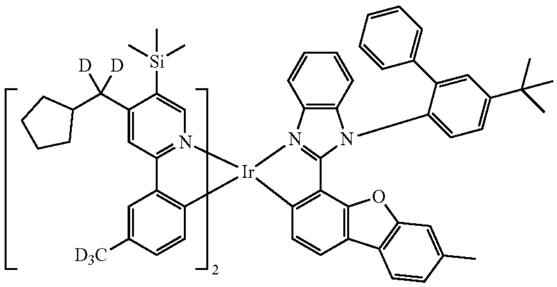
1375
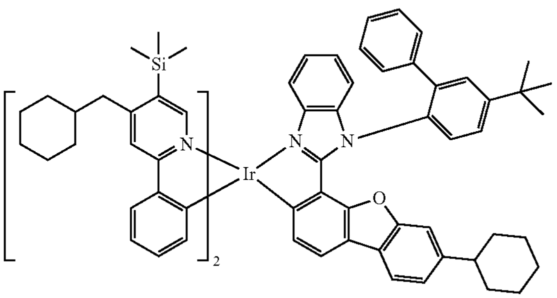
1376
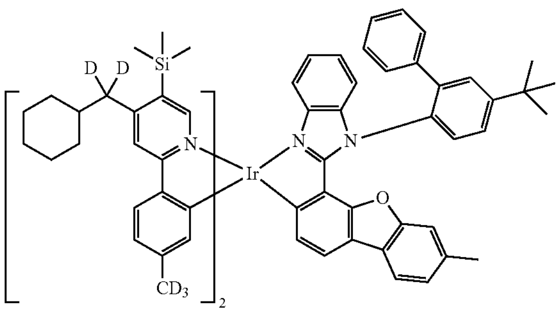
1377
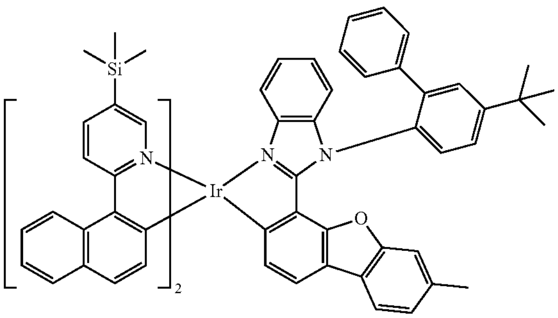
1378
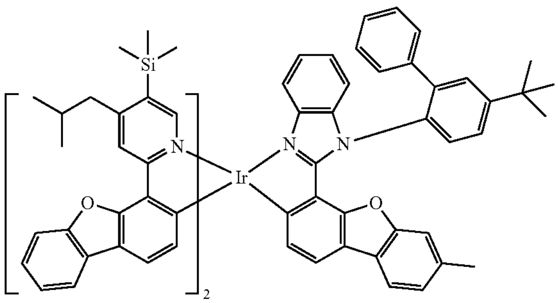

-continued
1379
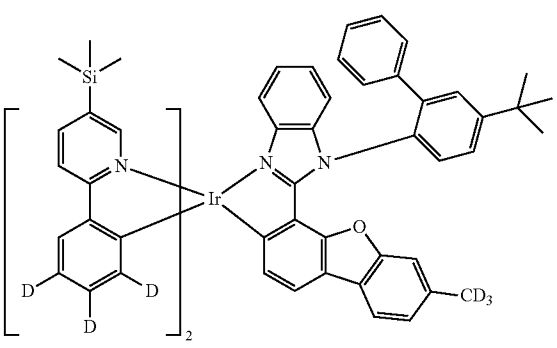
1380
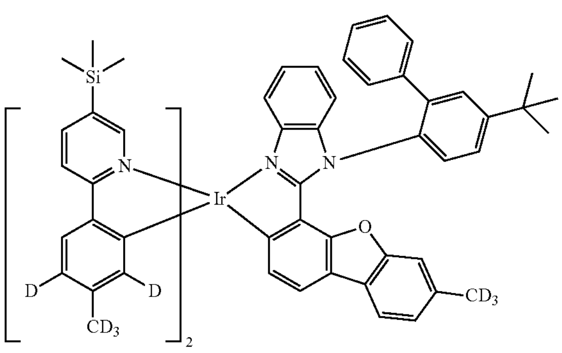
1381
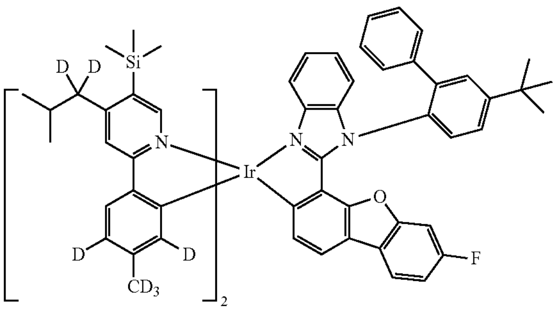
1382
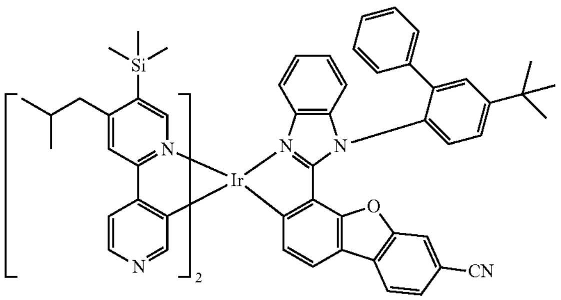
1383
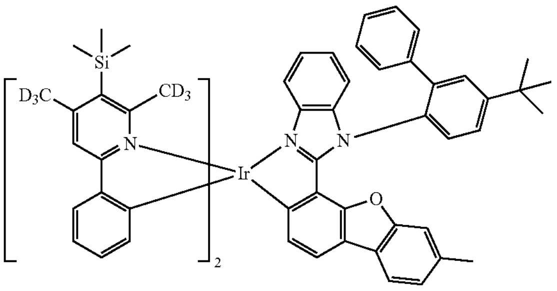
1384
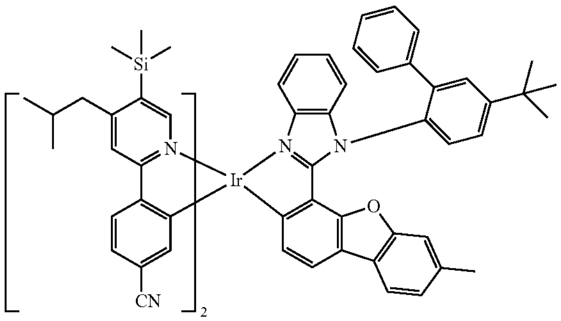
1385
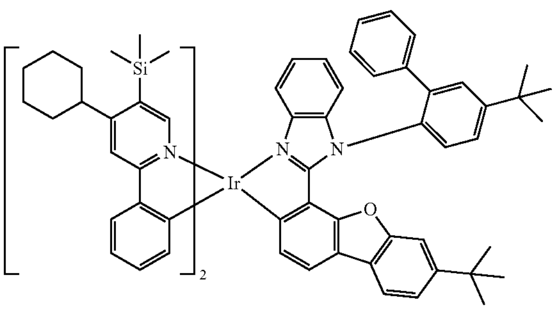
1386
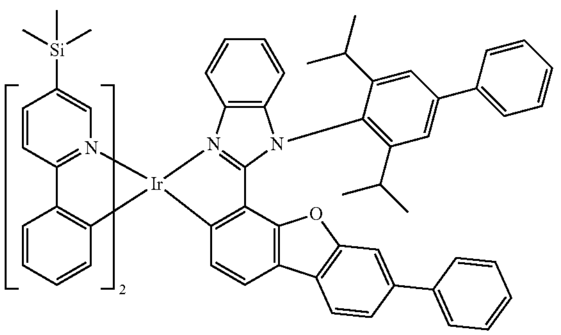

-continued
1387
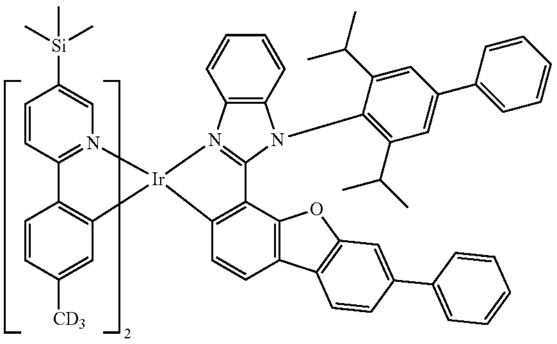
1388
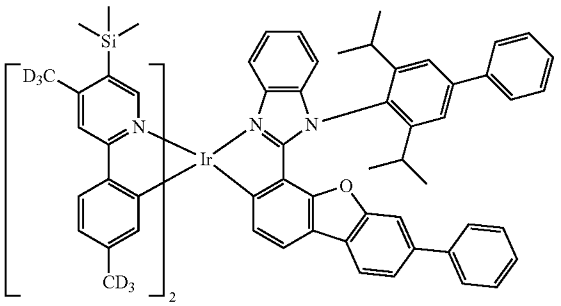
1389
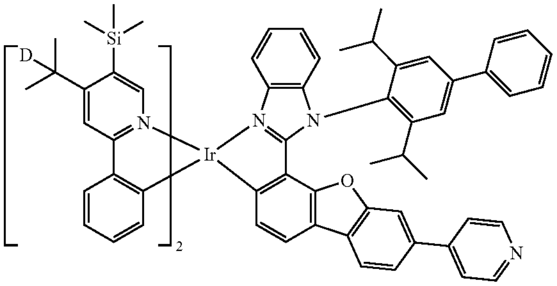
1390
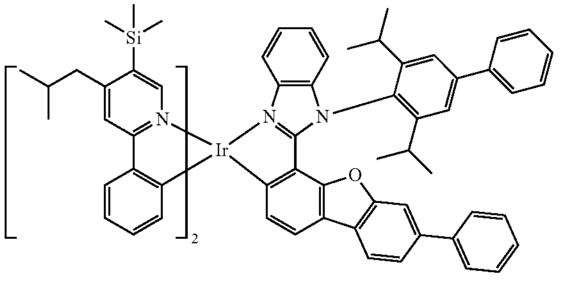
1391
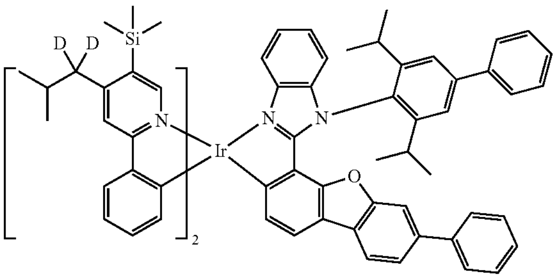
1392
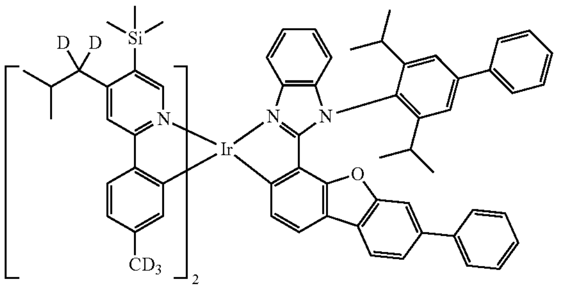
1393
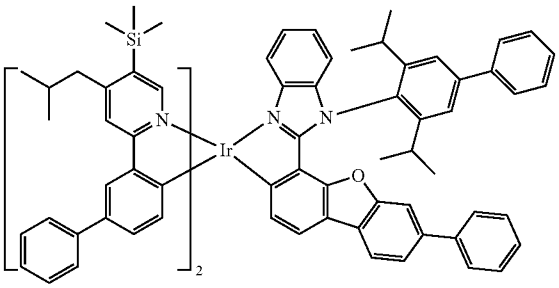
1394
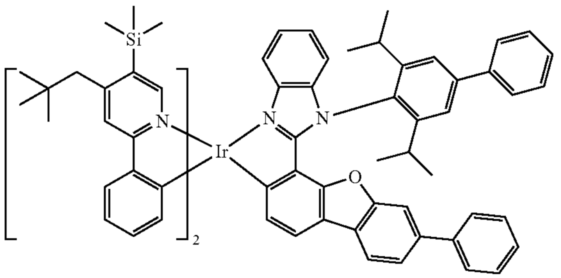
1395
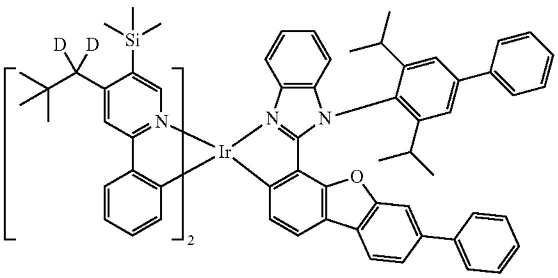
1396
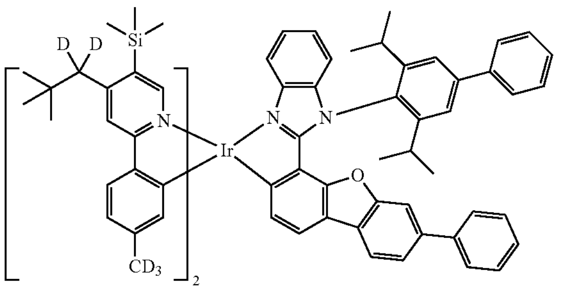

-continued
1397
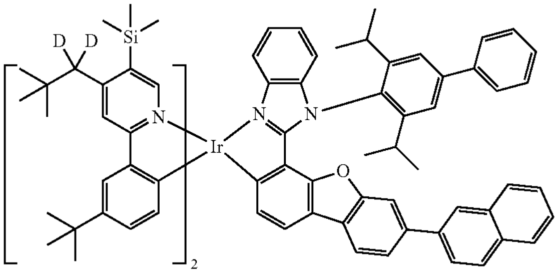
1398
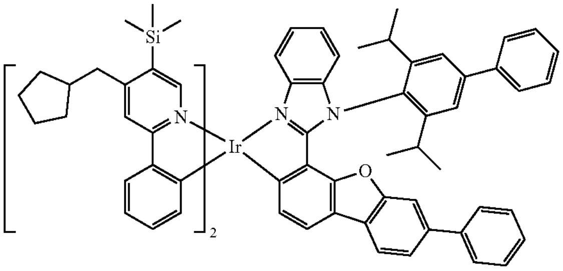
1399
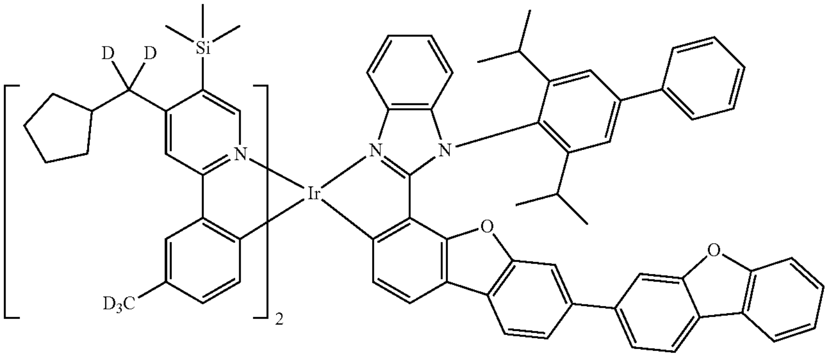
1400
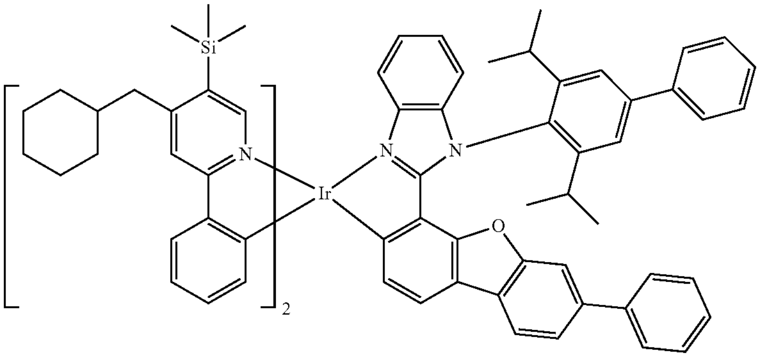
1401
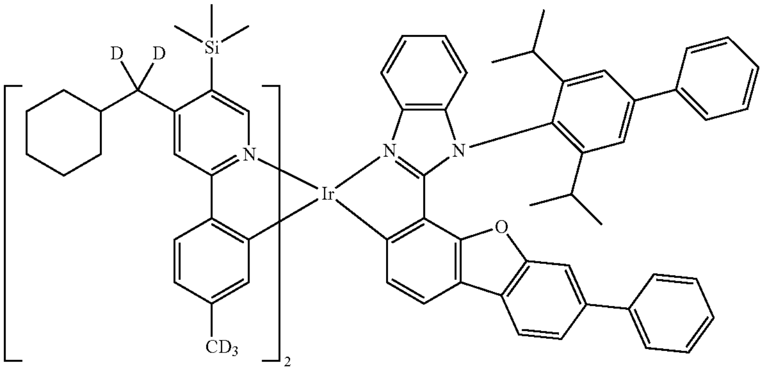

-continued
1402
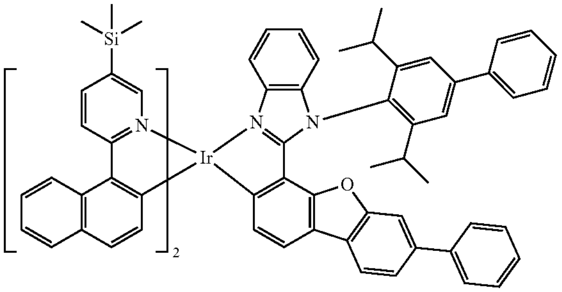
1403
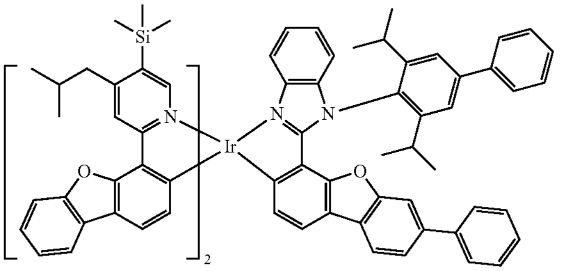
1404
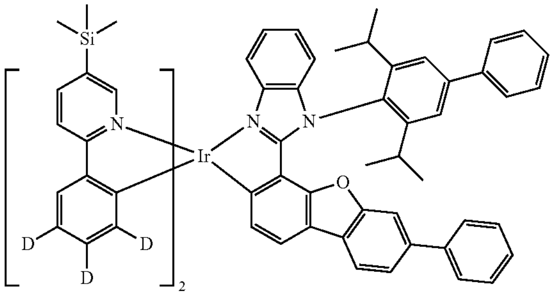
1405
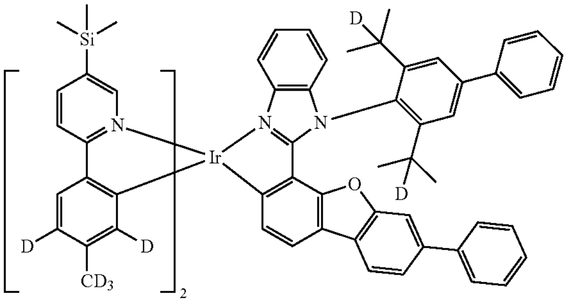
1406
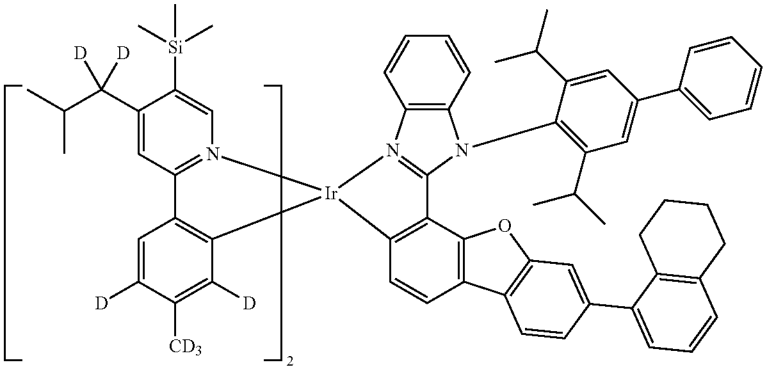
1407
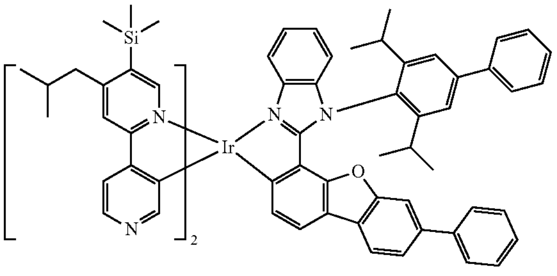
1408
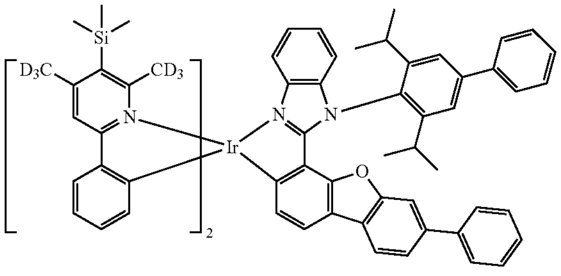

-continued
1409
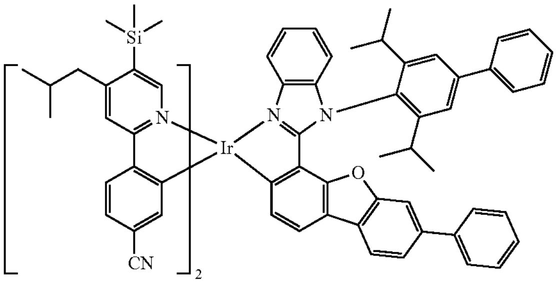
1410
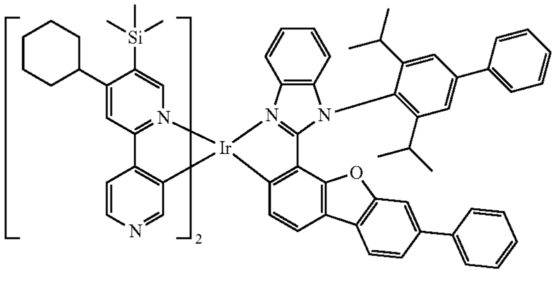
1411
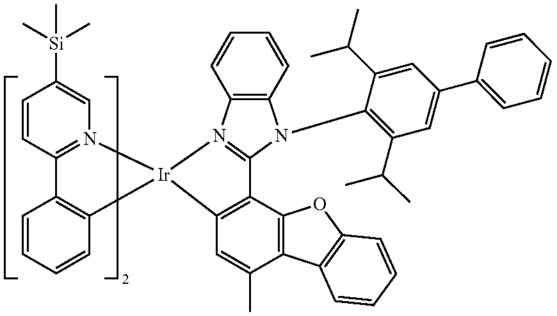
1412
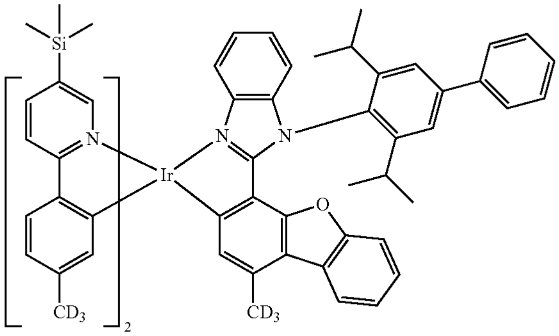
1413
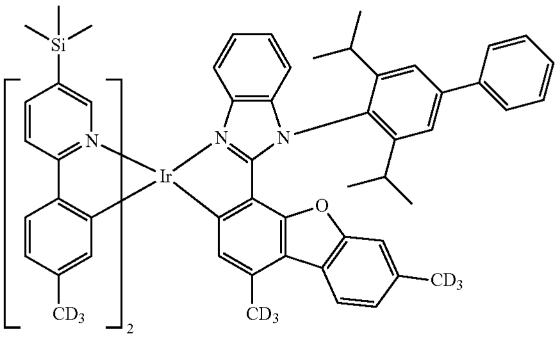
1414
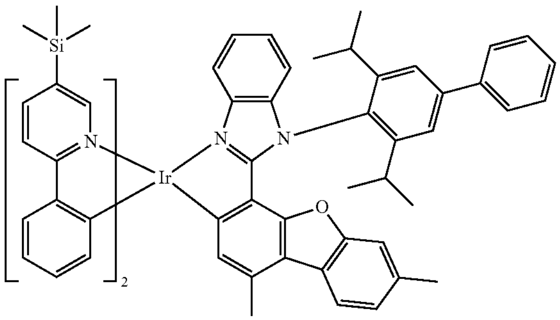
1415
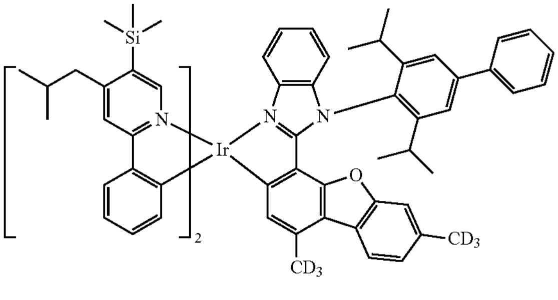
1416
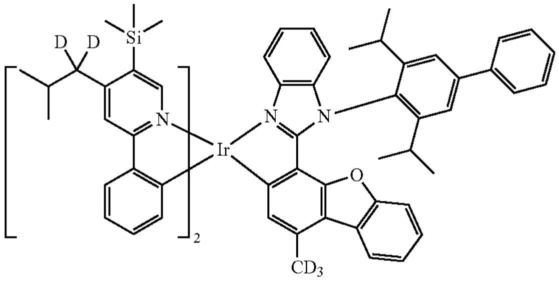

-continued
1417
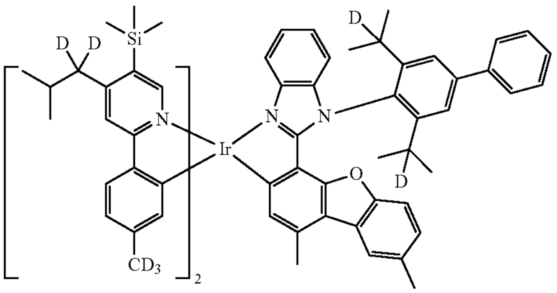
1418
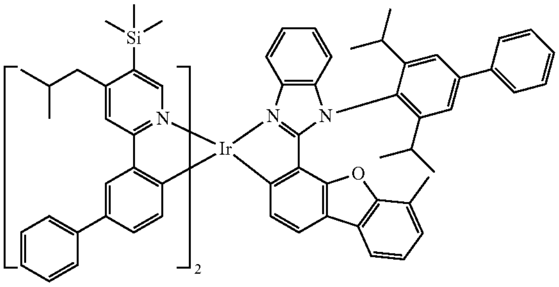
1419
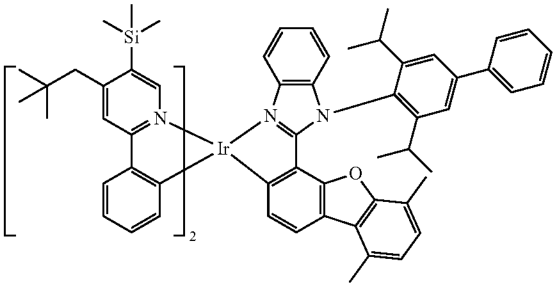
1420
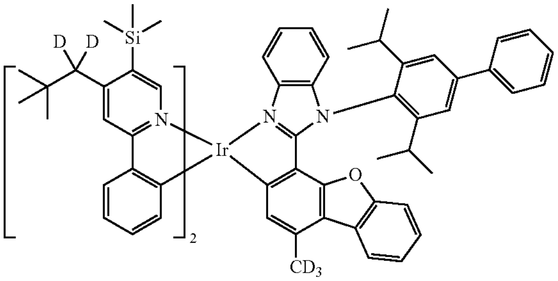
1421
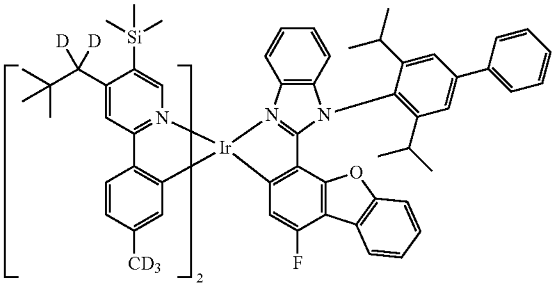
1422
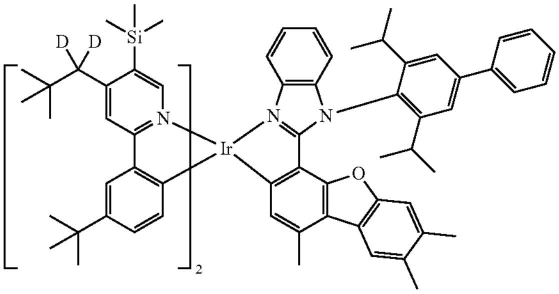
1423
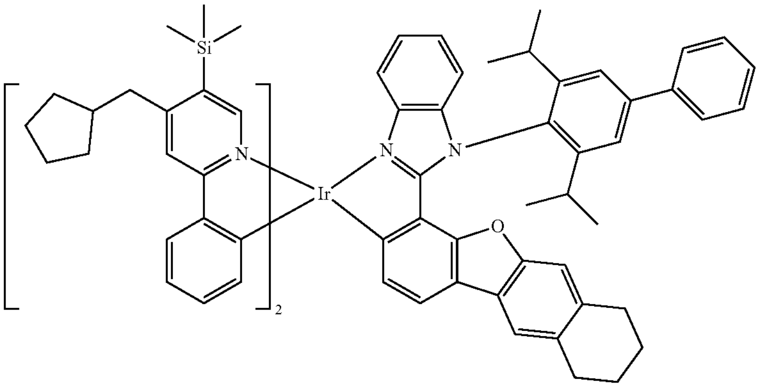

-continued
1424
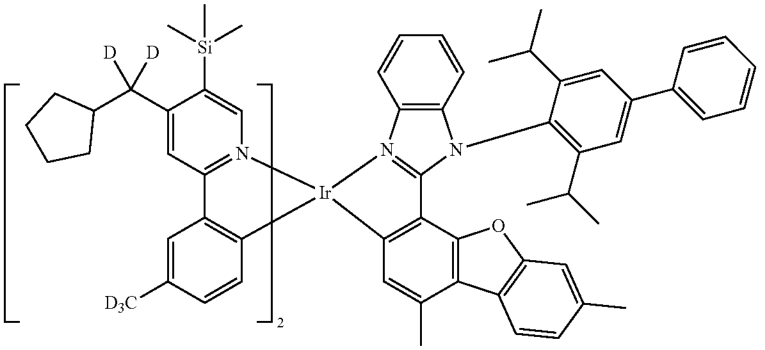
1425
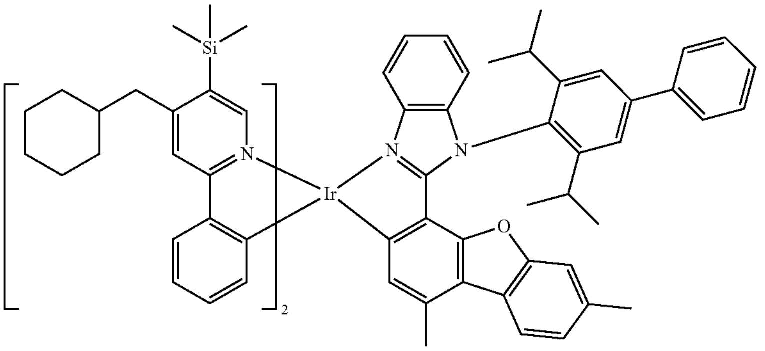
1426
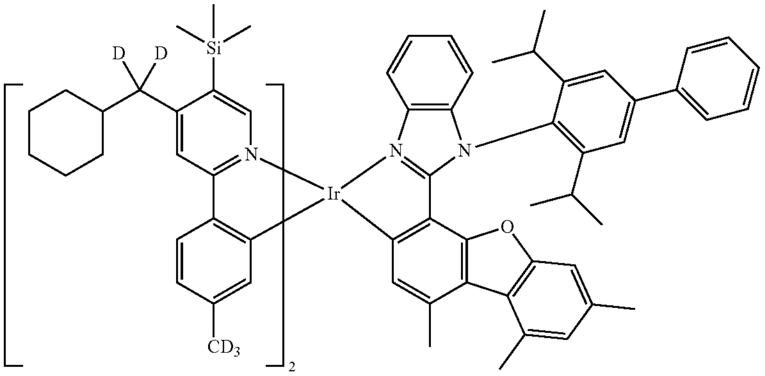
1427
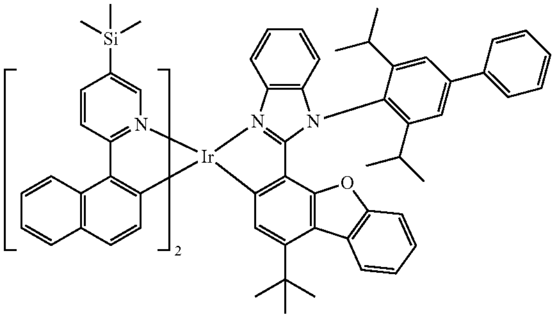
1428
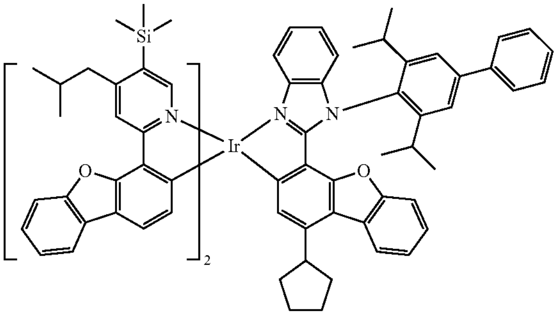

-continued
1429
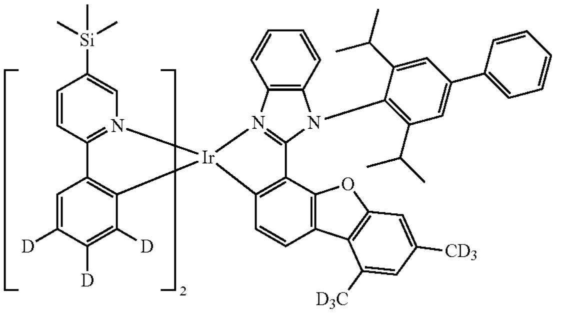
1430
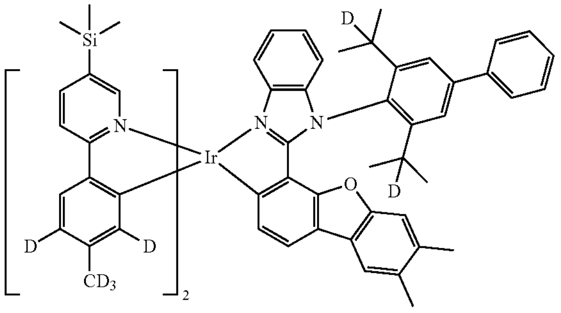
1431
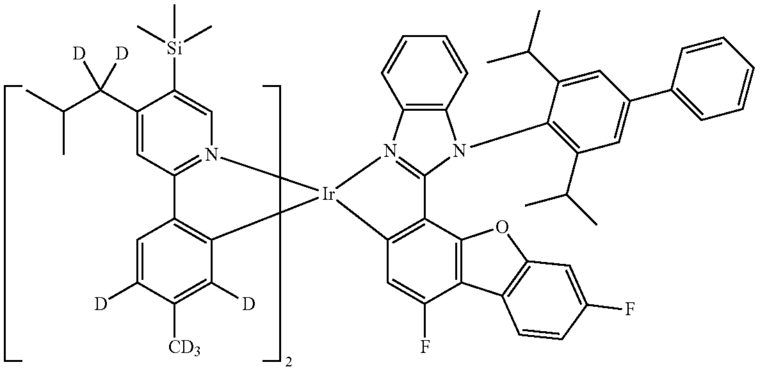
1432
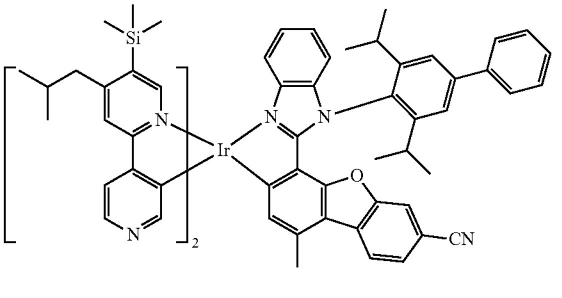
1433
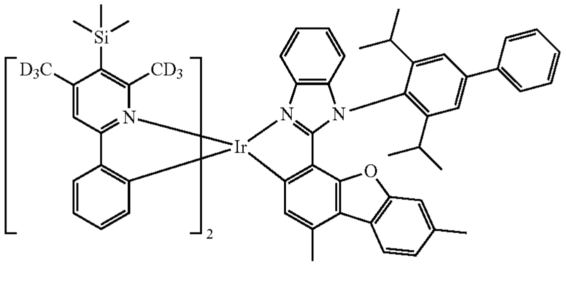
1434
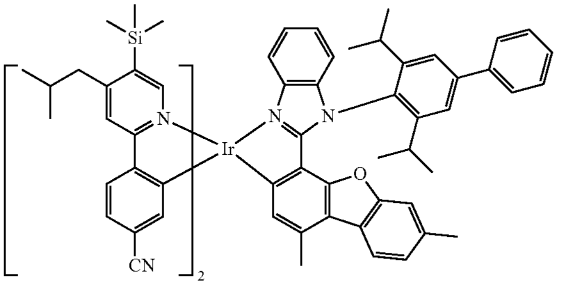
1435
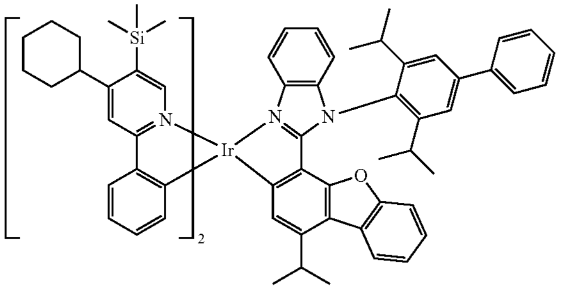

-continued
1436
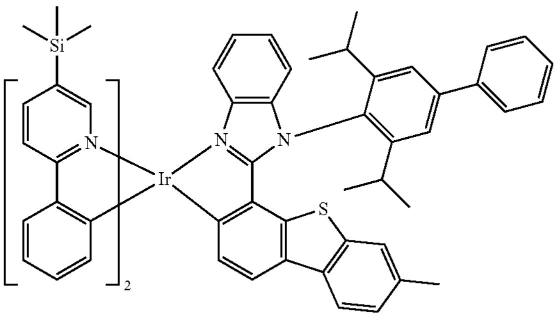
1437
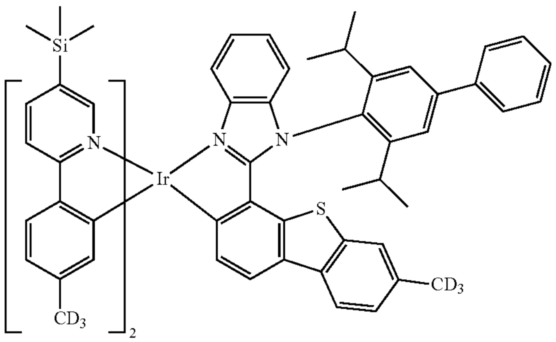
1438
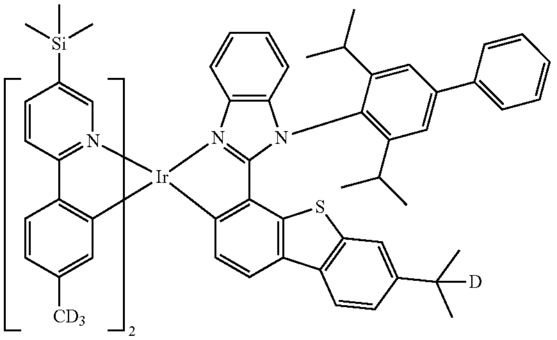
1439
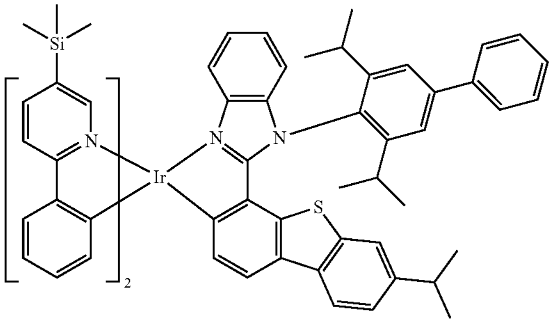
1440
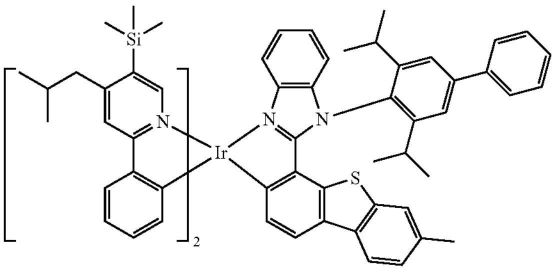
1441
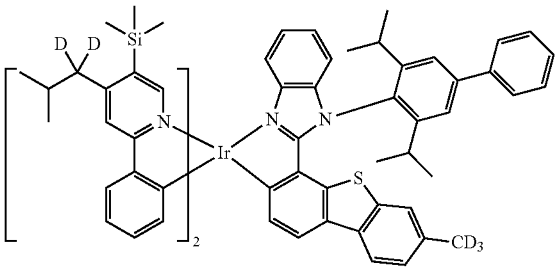
1442
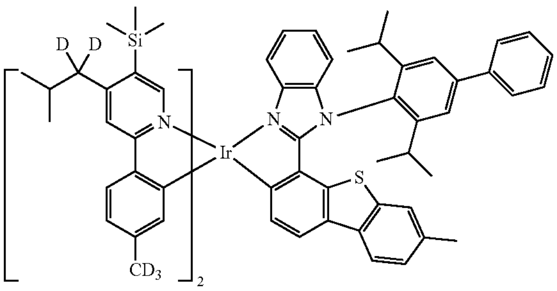
1443
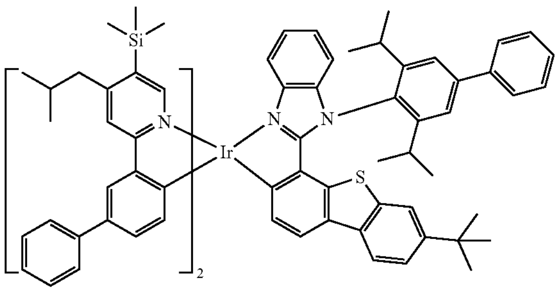
1444
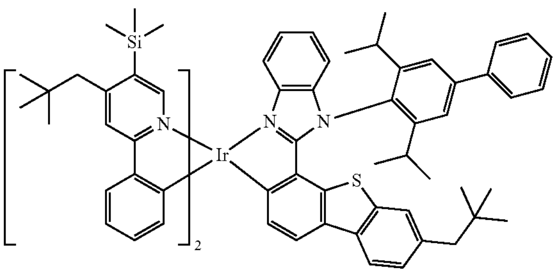
1445
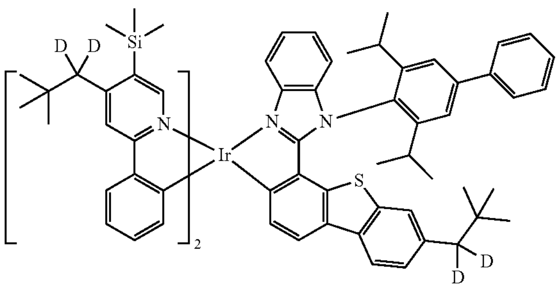

-continued
1446
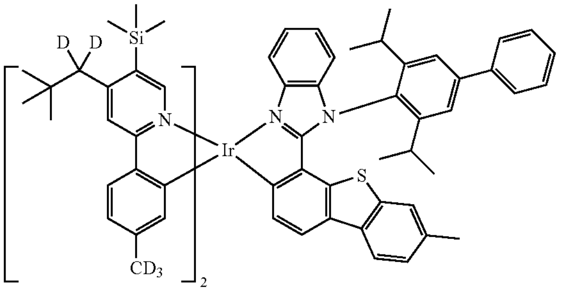
1447
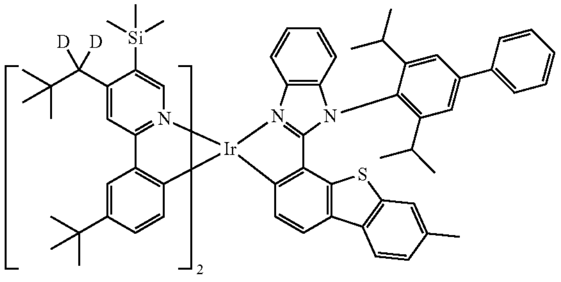
1448
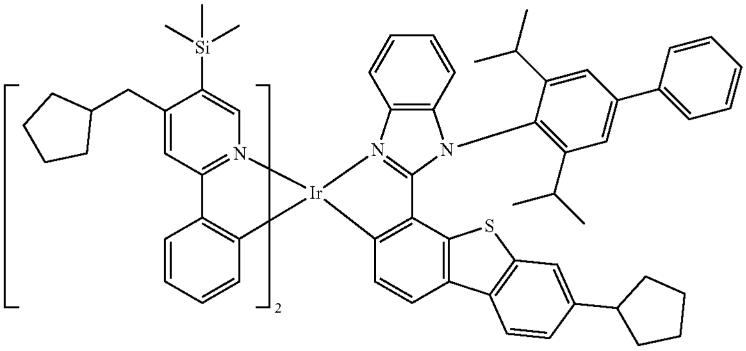
1449
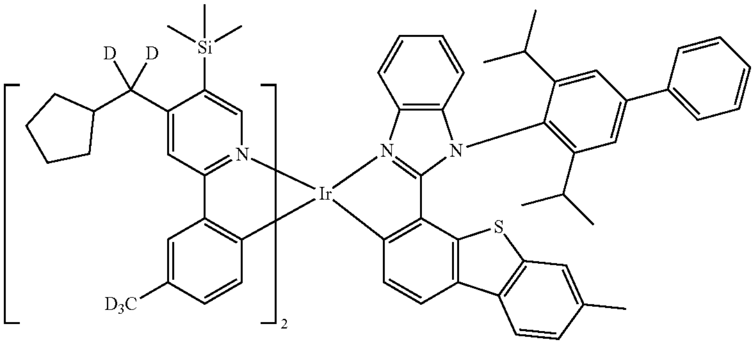
1450
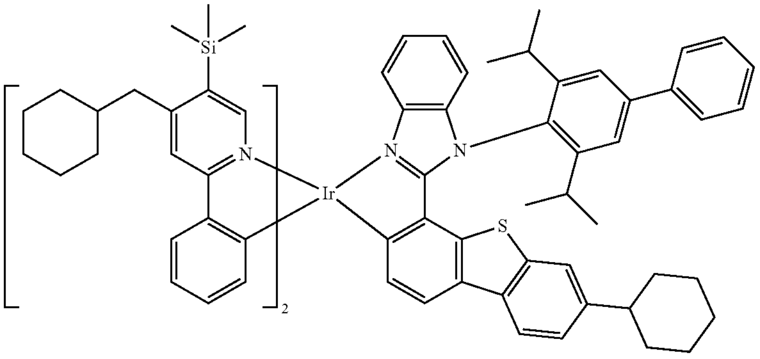

-continued
1451
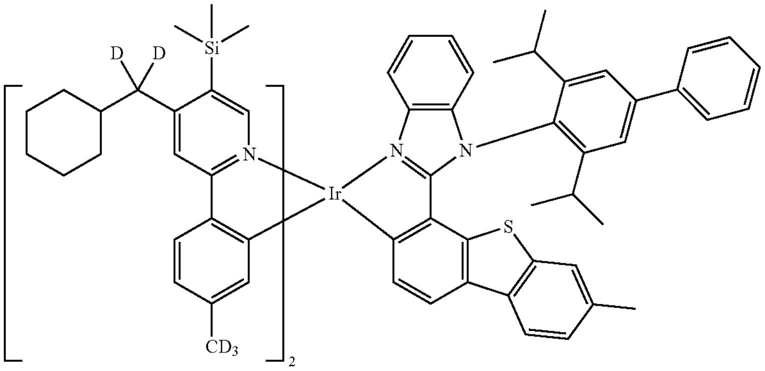
1452
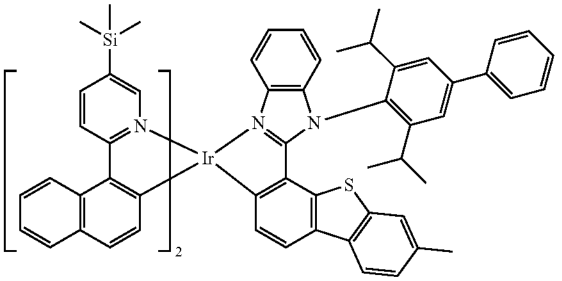
1453
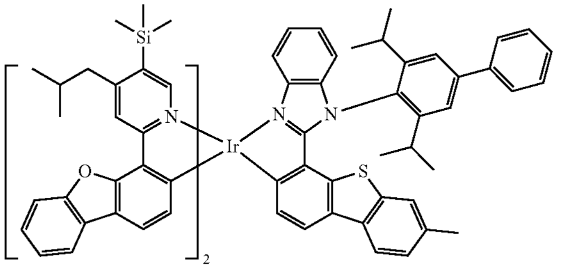
1454
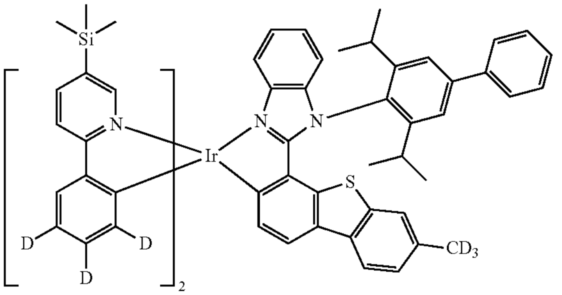
1455
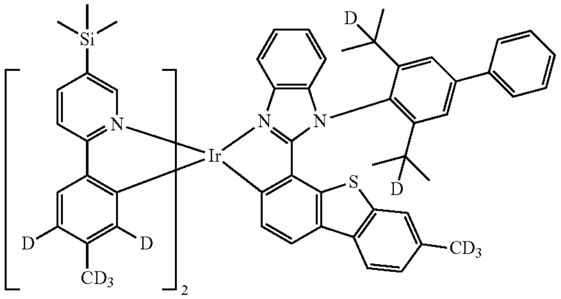
1456
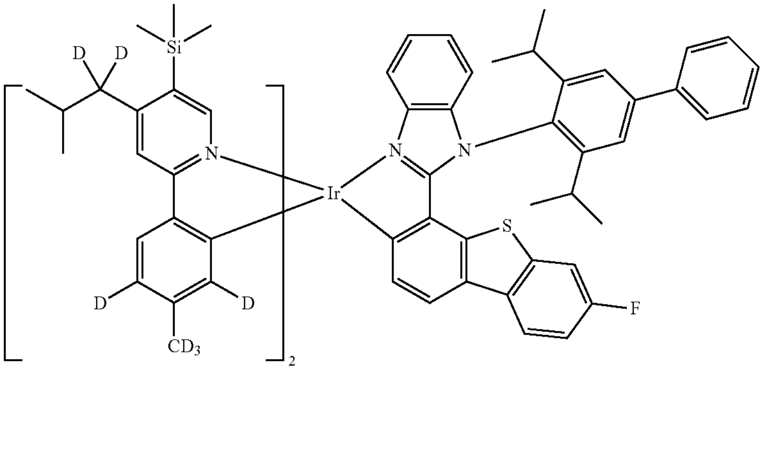

-continued
1457
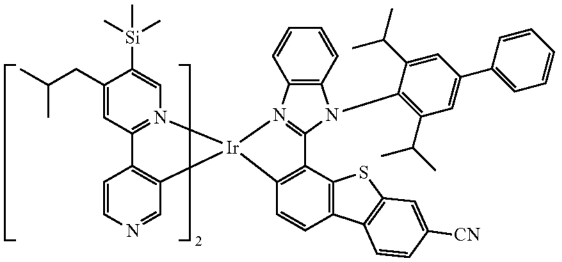
1458
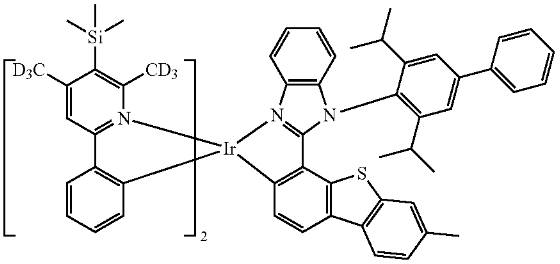
1459
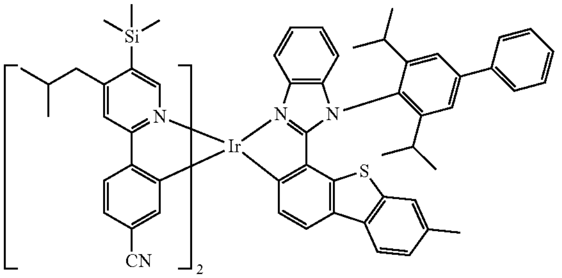
1460
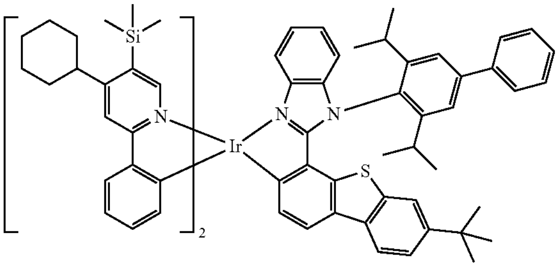
1461
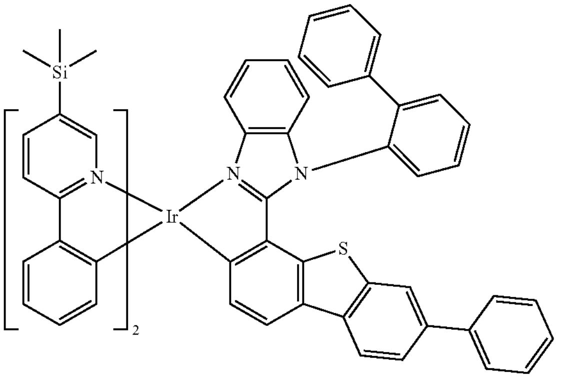
1462
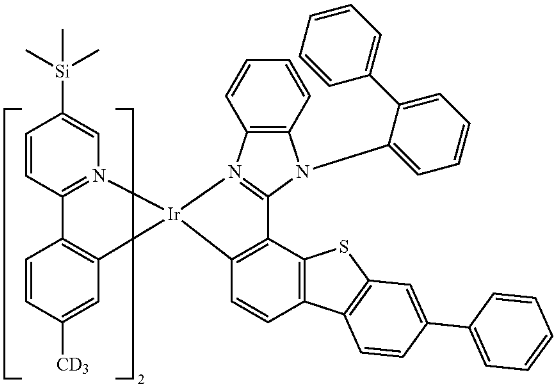
1463
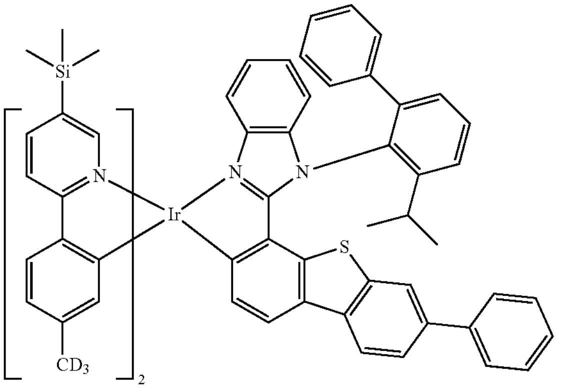

-continued
1464
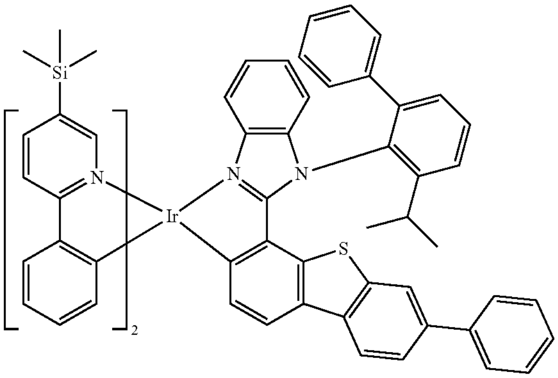
1465
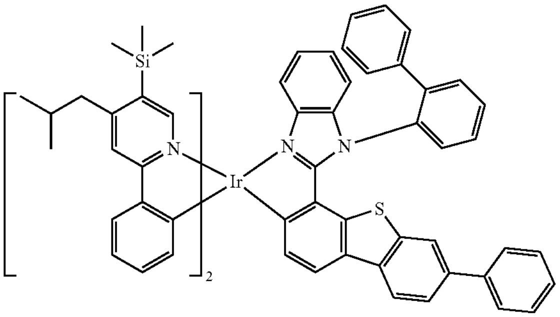
1466
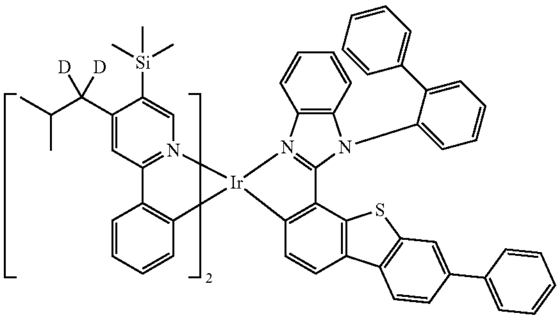
1467
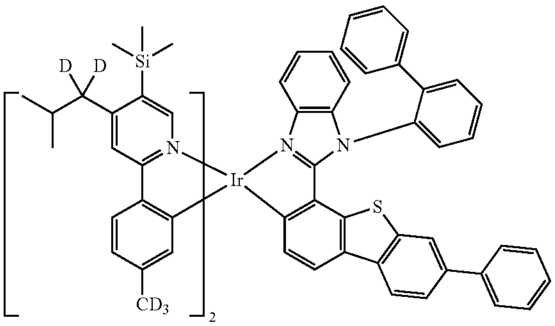
1468
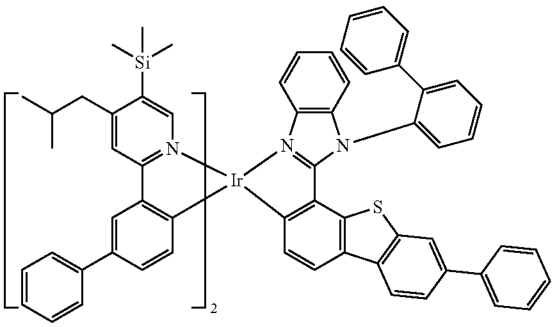
1469
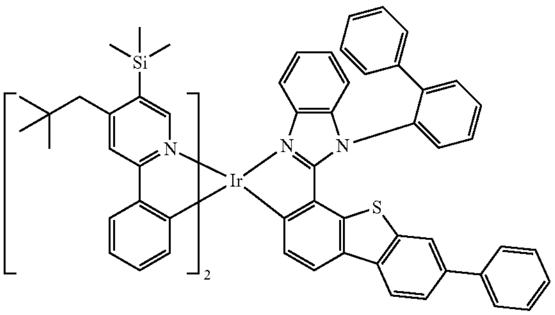
1470
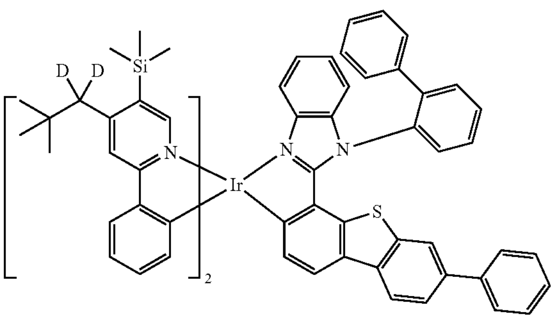
1471
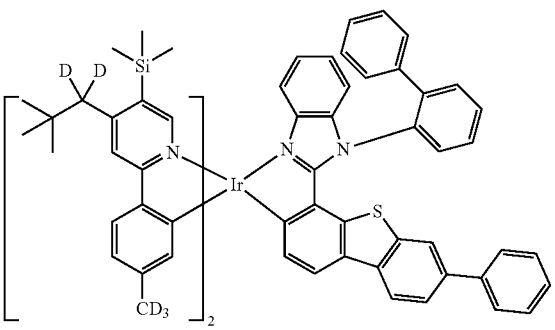

-continued
1472
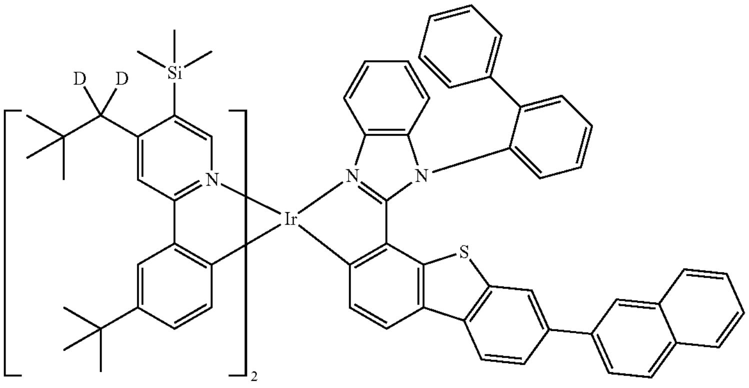
1473
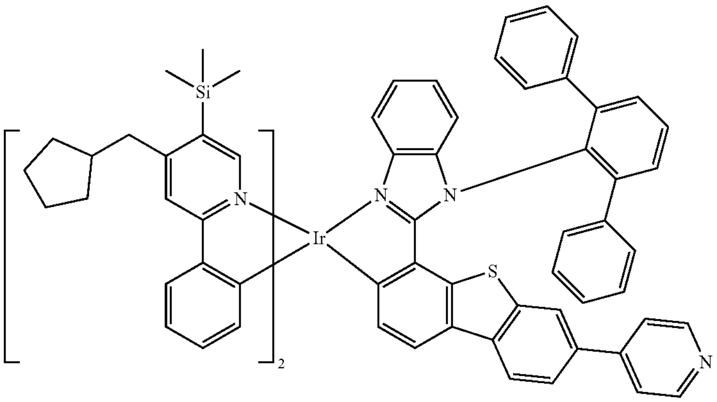
1474
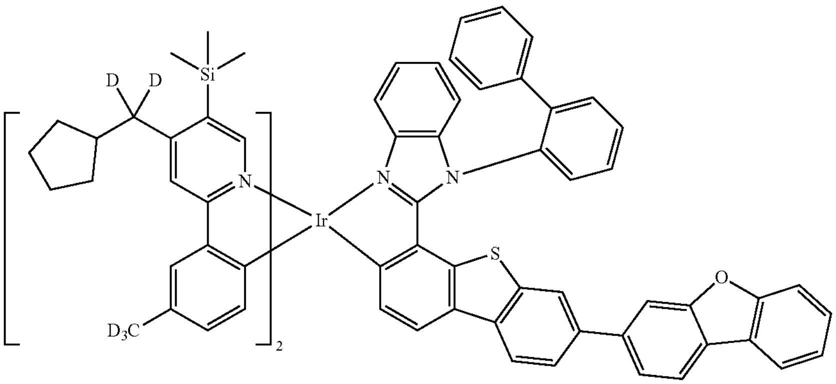
1475
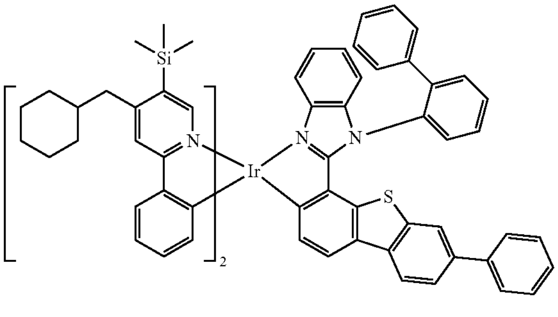
1476
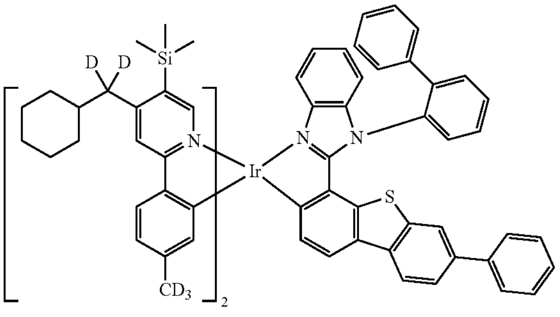

-continued
1477
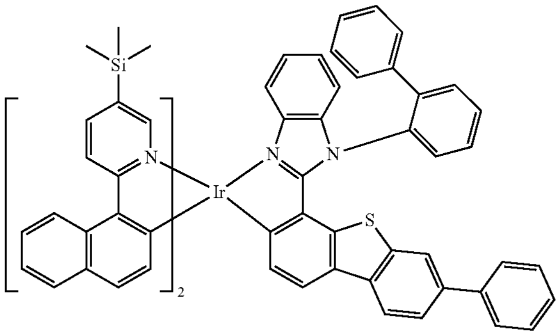
1478
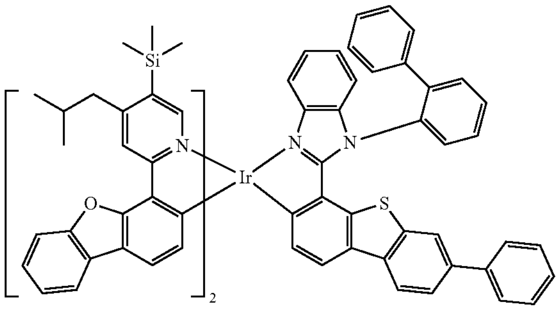
1479
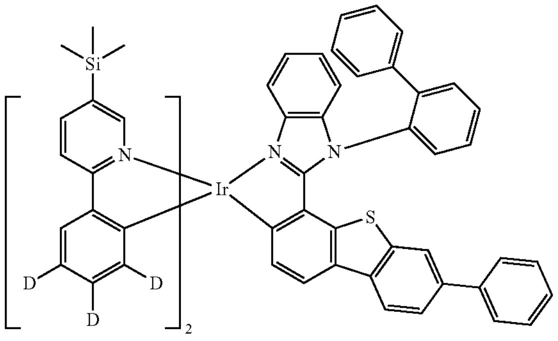
1480
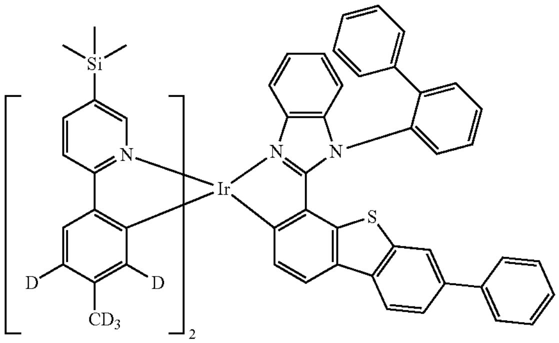
1481
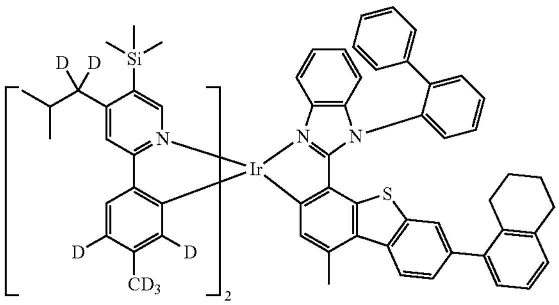
1482
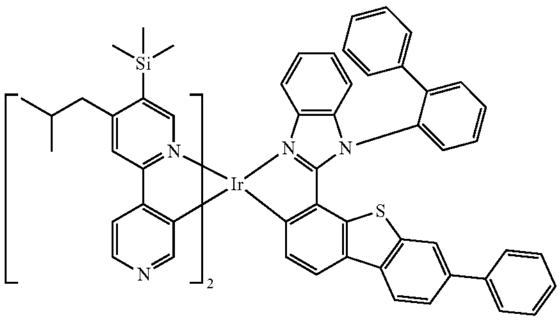
1483
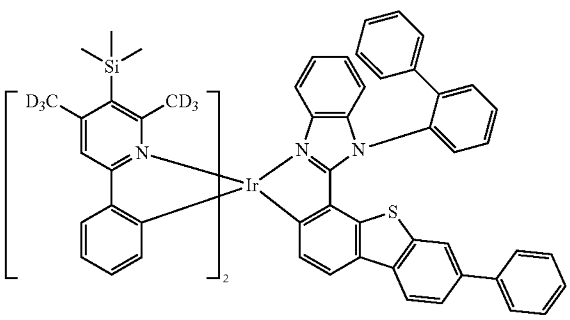
1484
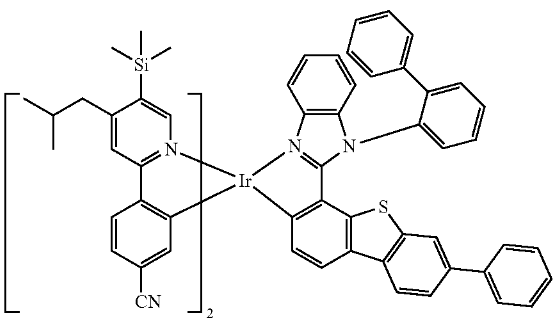

-continued
1485
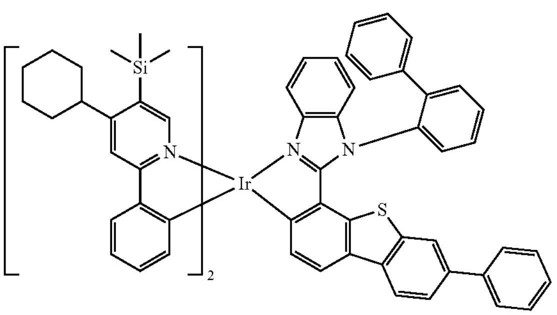
1486
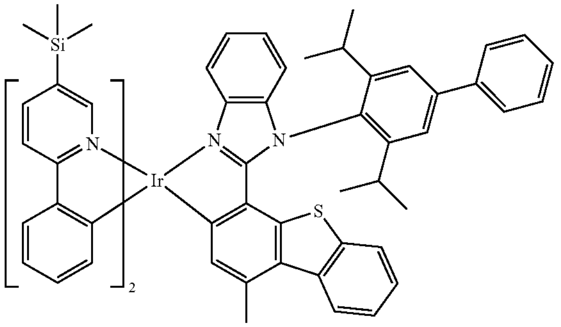
1487
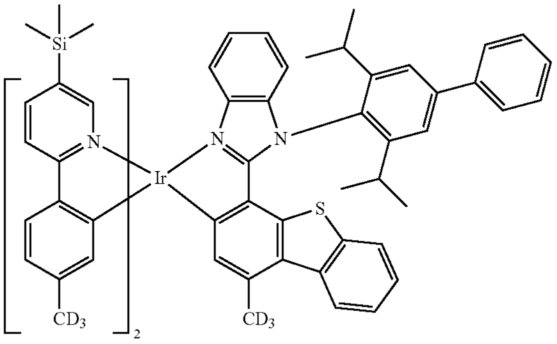
1488
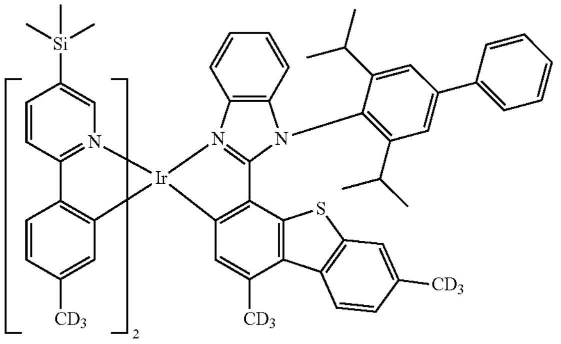
1489
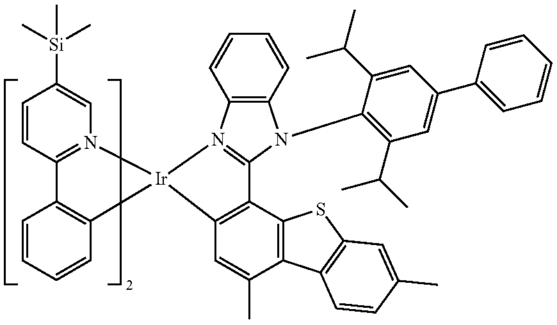
1490
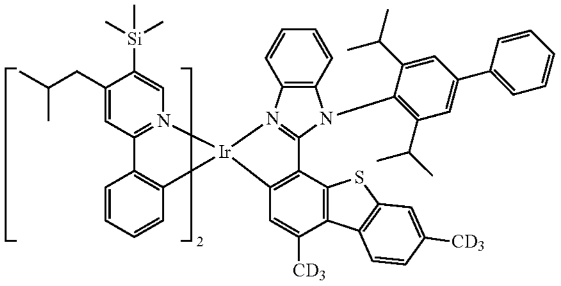
1491
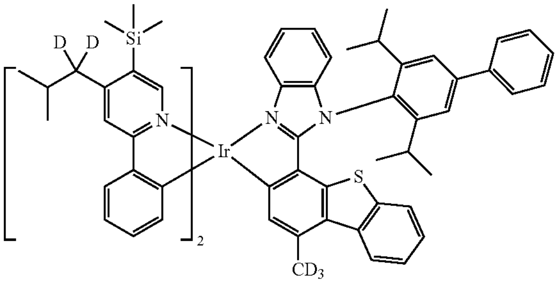
1492
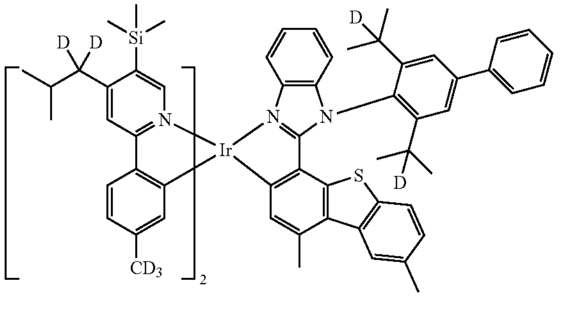

-continued
1493
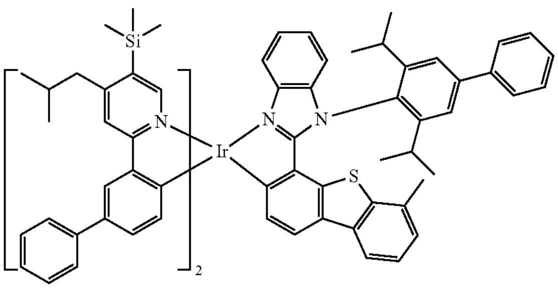
1494
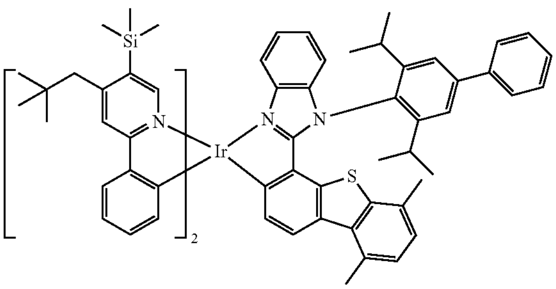
1495
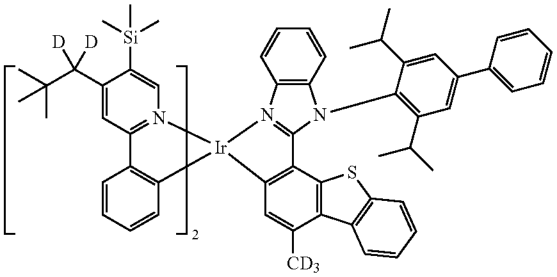
1496
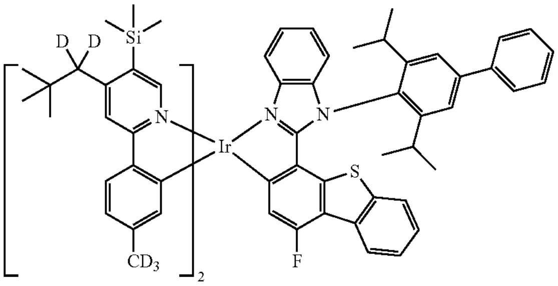
1497
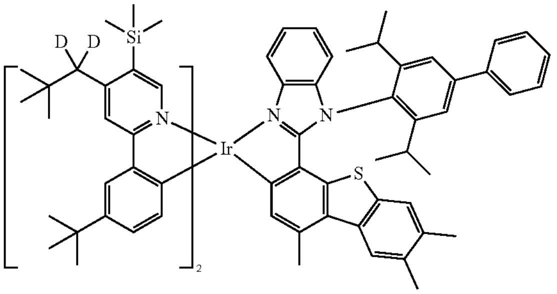
1498
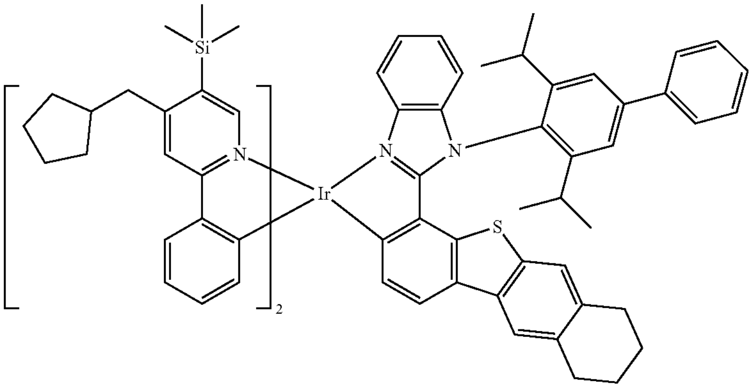

-continued
1489
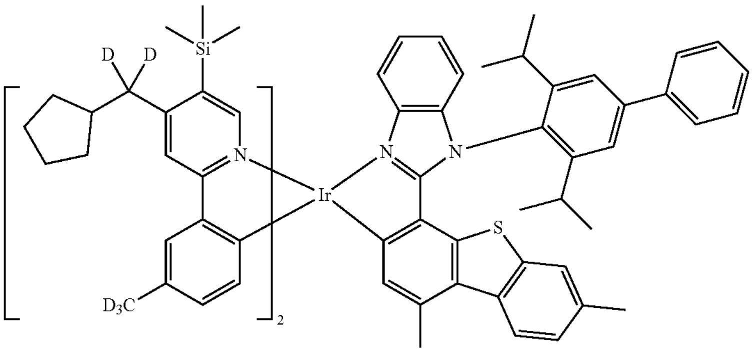
1500
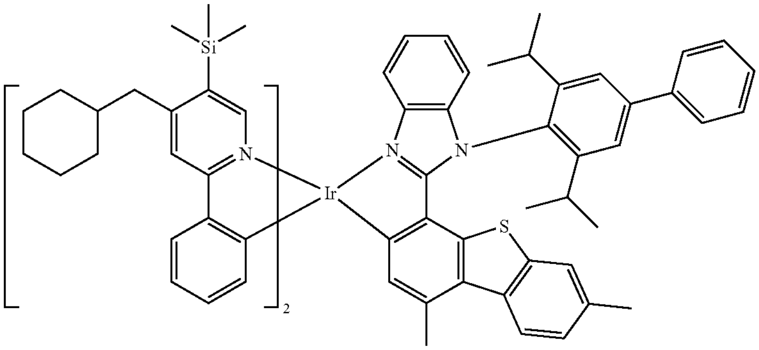
1501
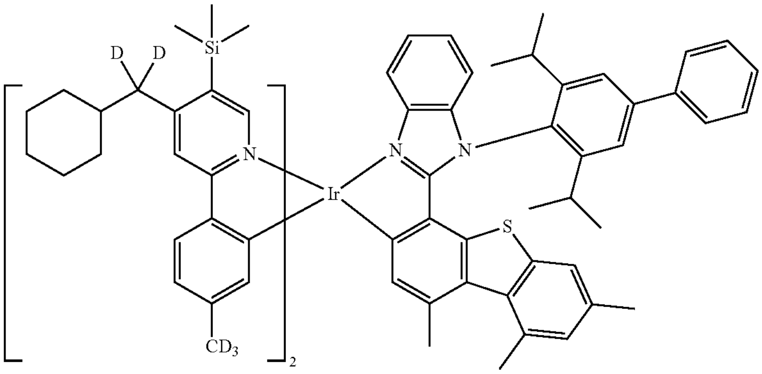
1502
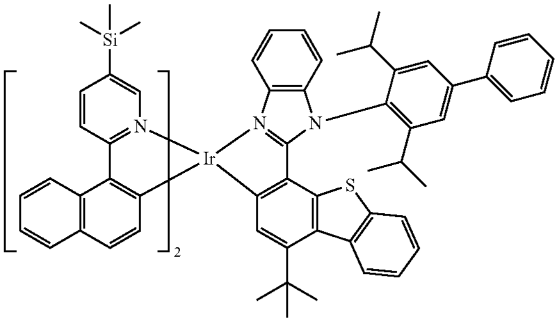
1503
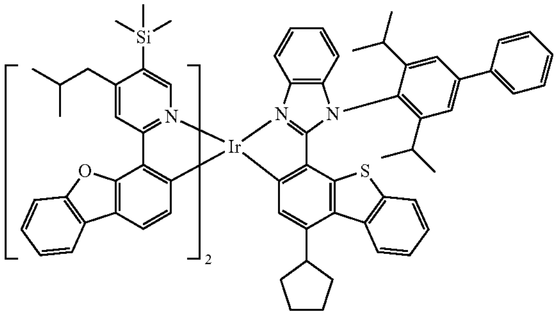

-continued
1504
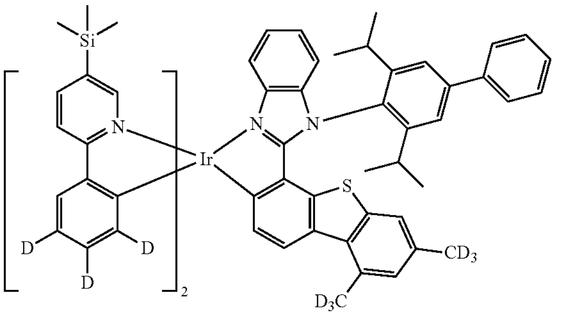
1505
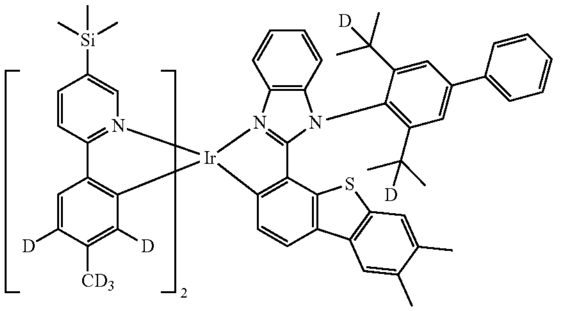
1506
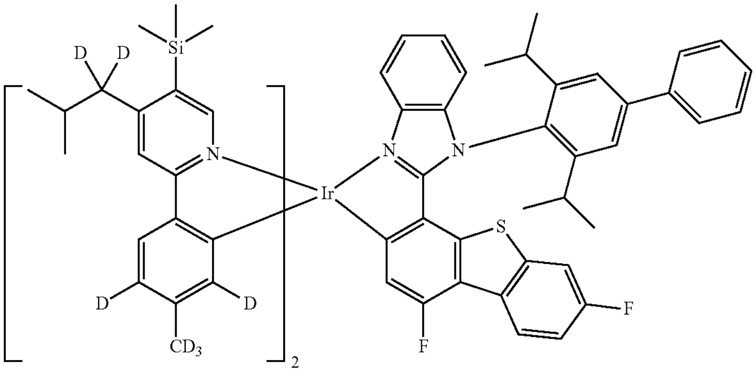
1507
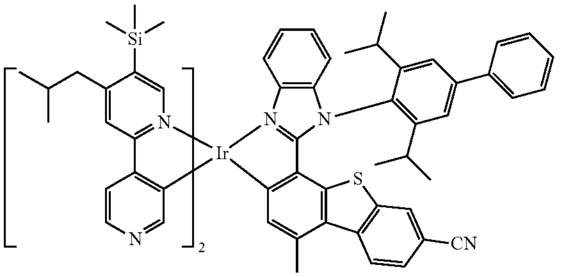
1508
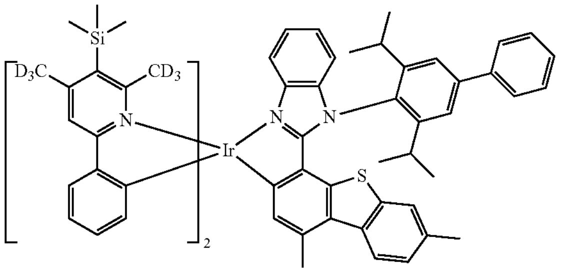
1509
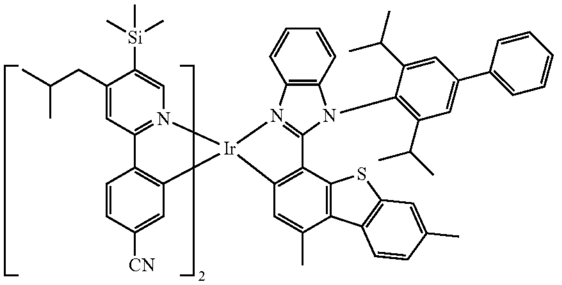
1510
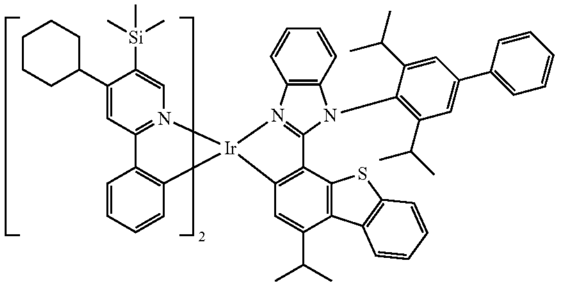

-continued
1511
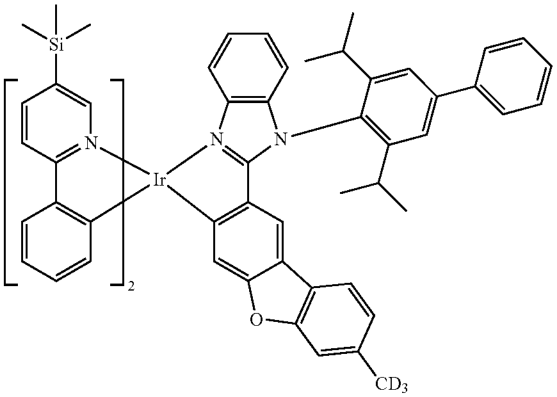
1512
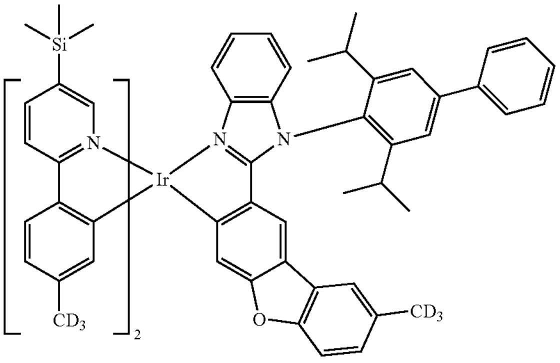
1513
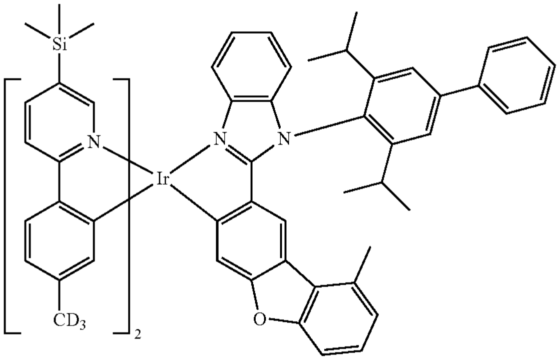
1514
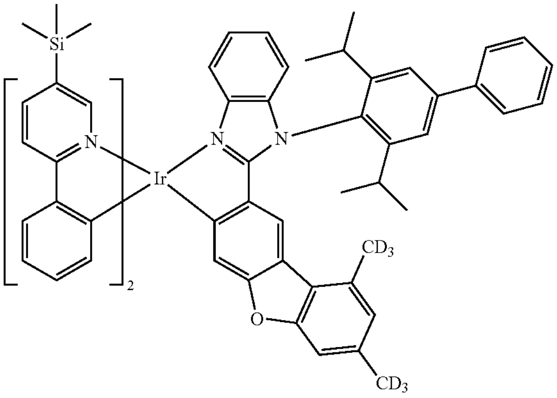
1515
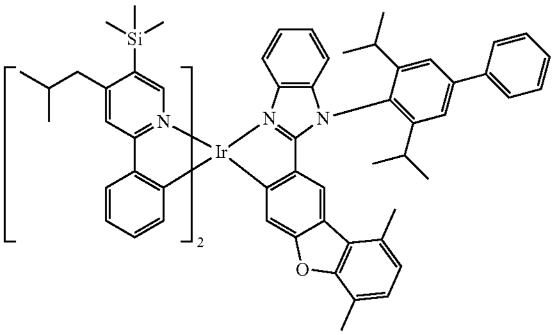
1516
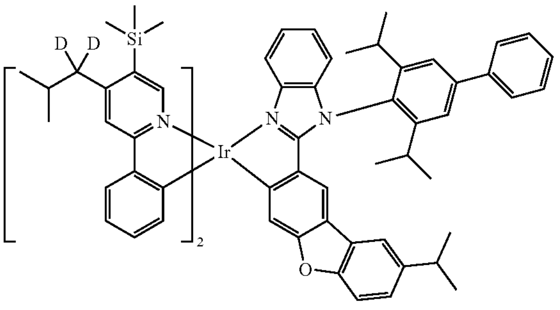
1517
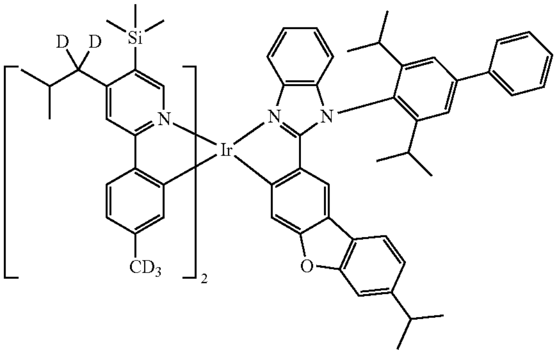
1518
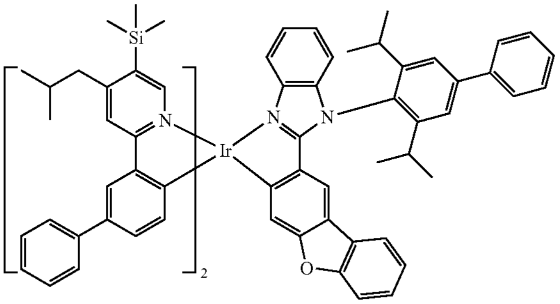

-continued
1519
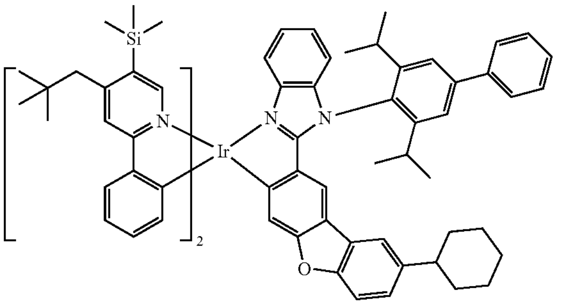
1520
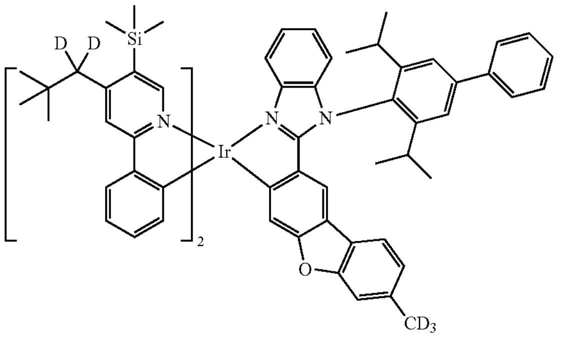
1521
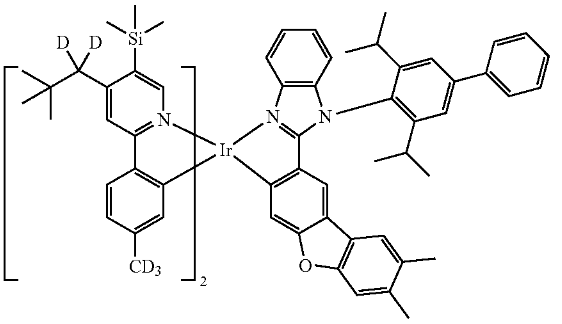
1522
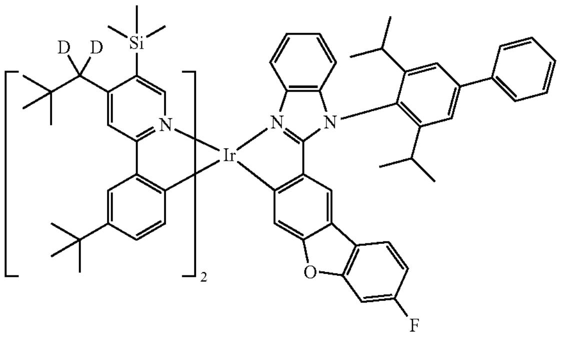
1523
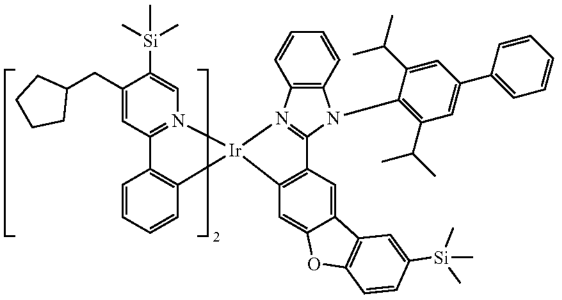
1524
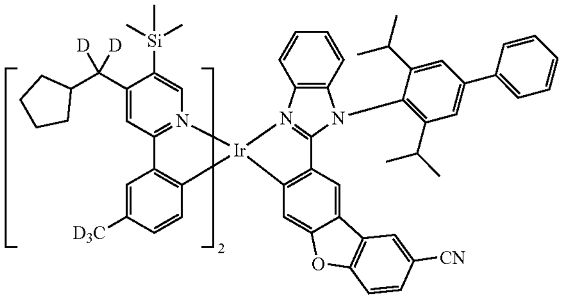
1525
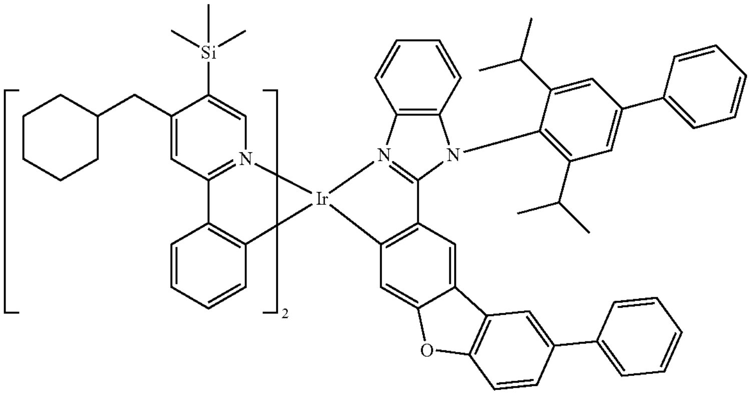

-continued
1526
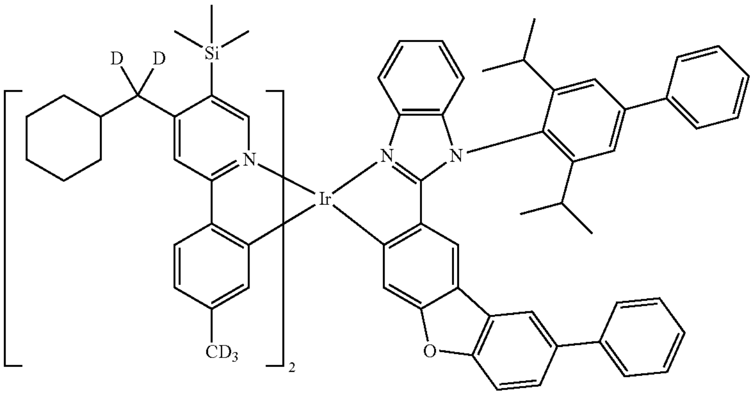
1527
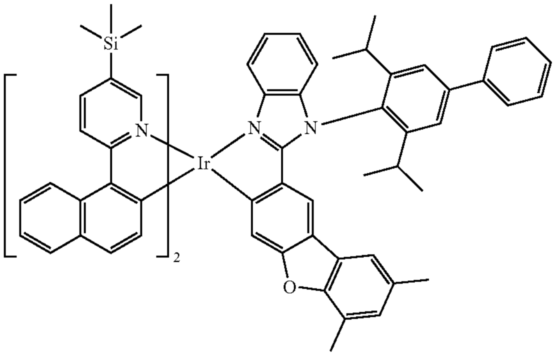
1528
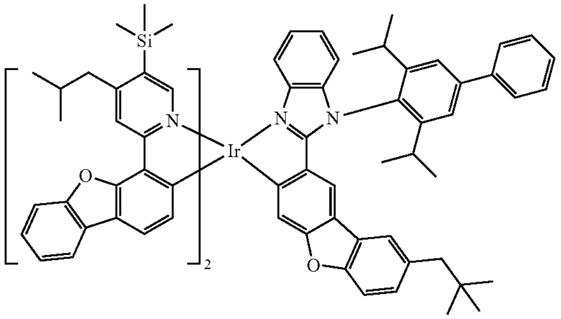
1529
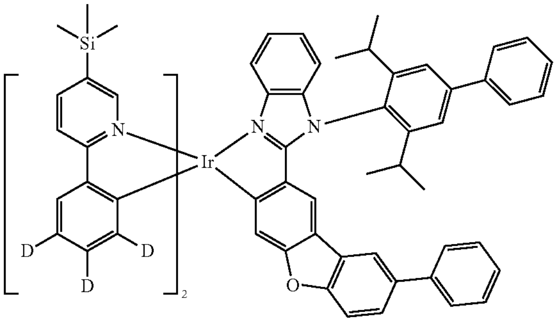
1530
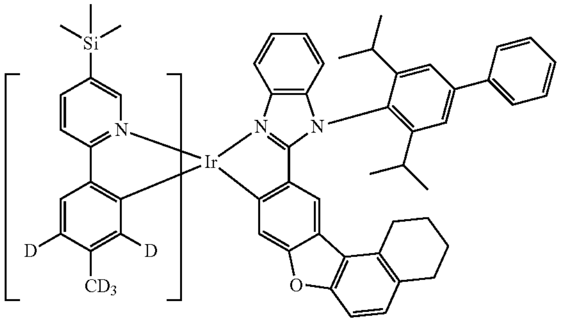
1531
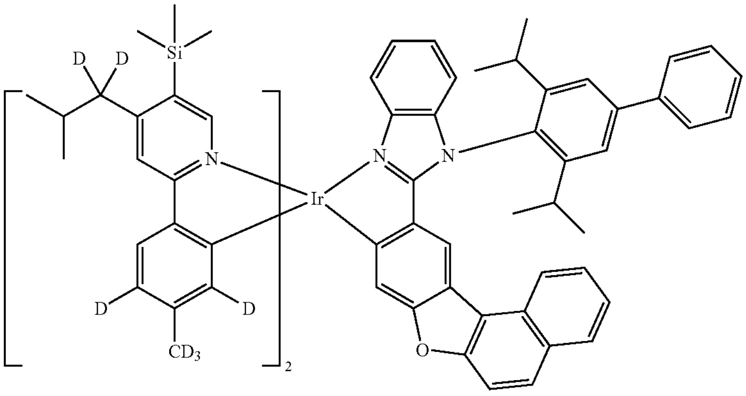

-continued
1532
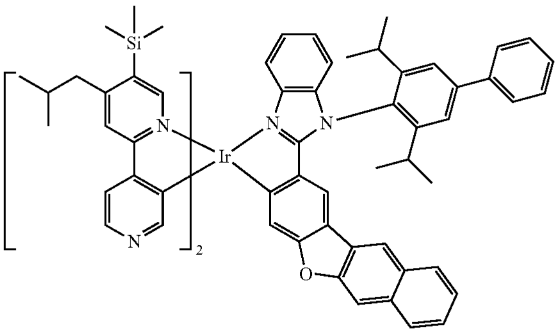
1533
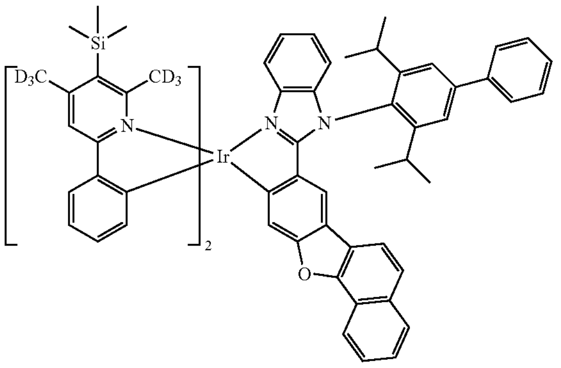
1534
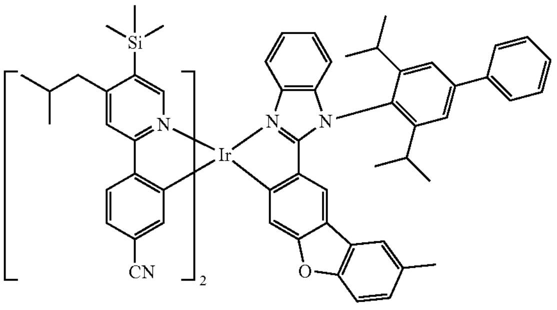
1535
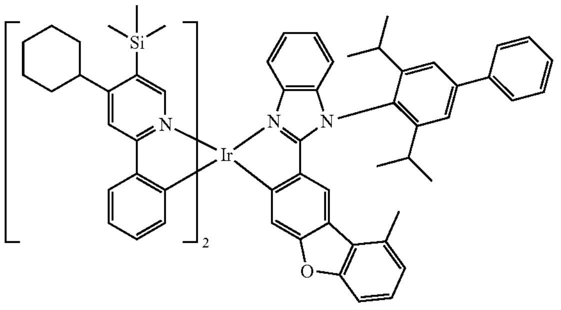
1536
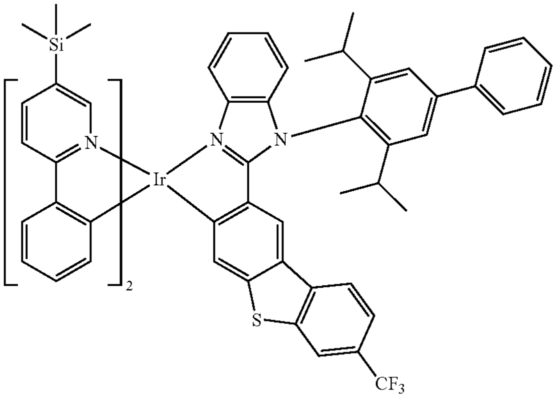
1537
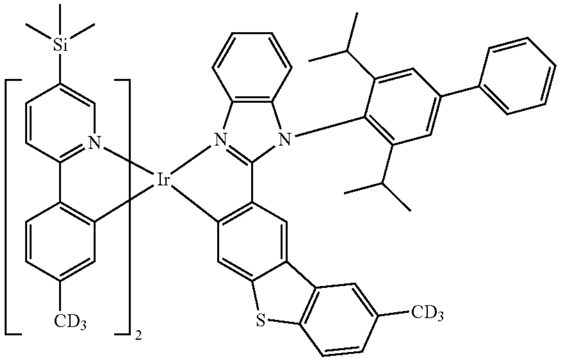
1538
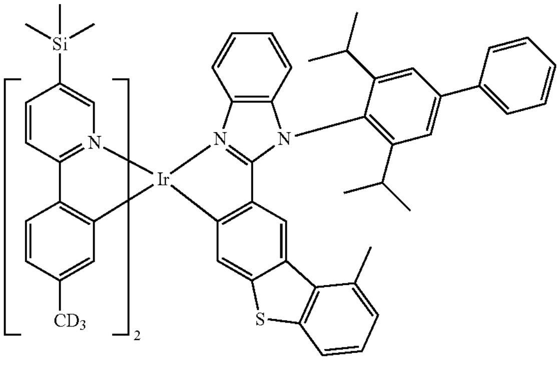
1539
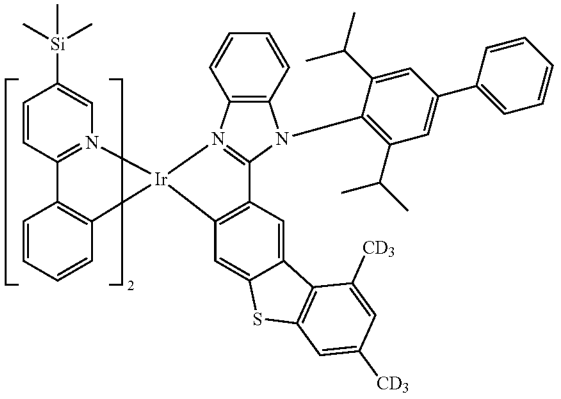

-continued
1540
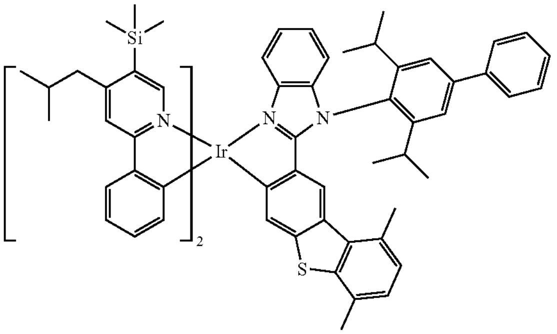
1541
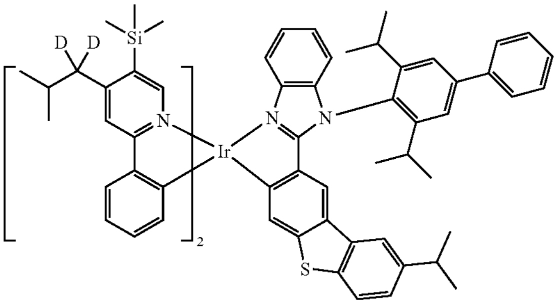
1542
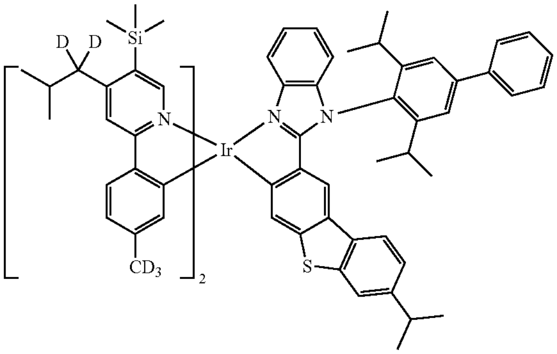
1543
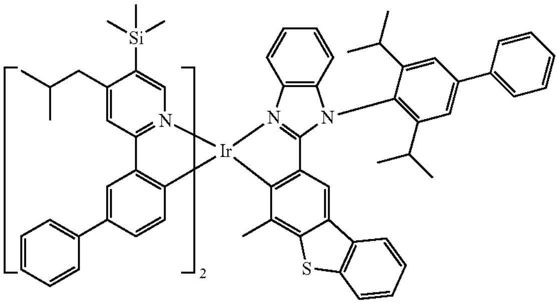
1544
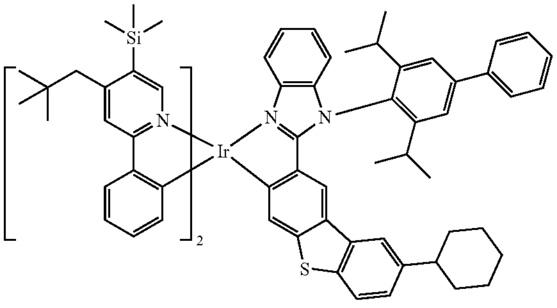
1545
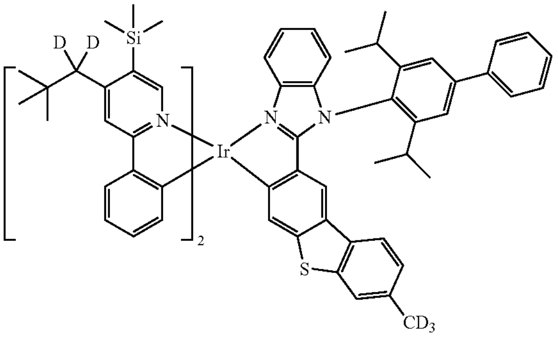
1546
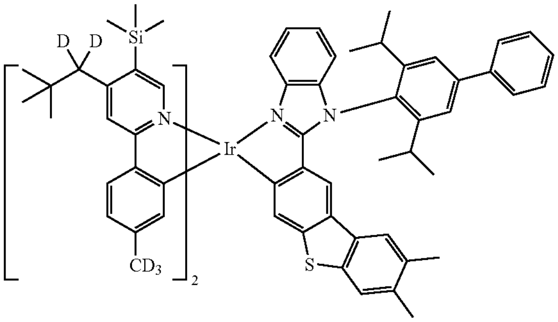
1547
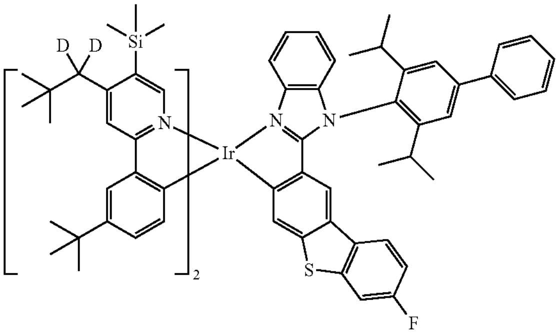

-continued
1548
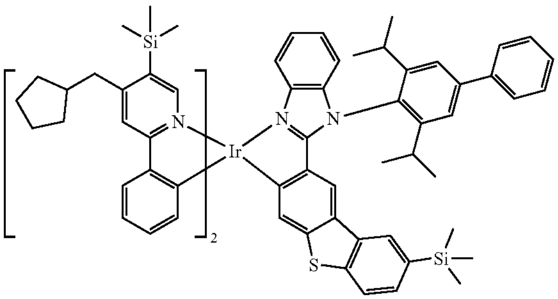
1549
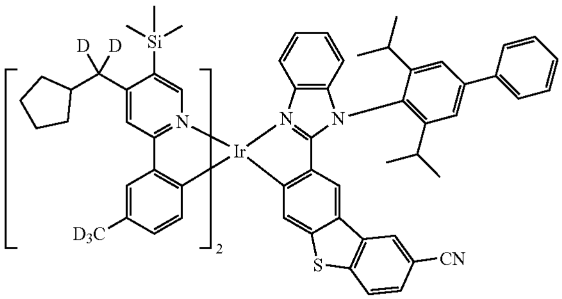
1550
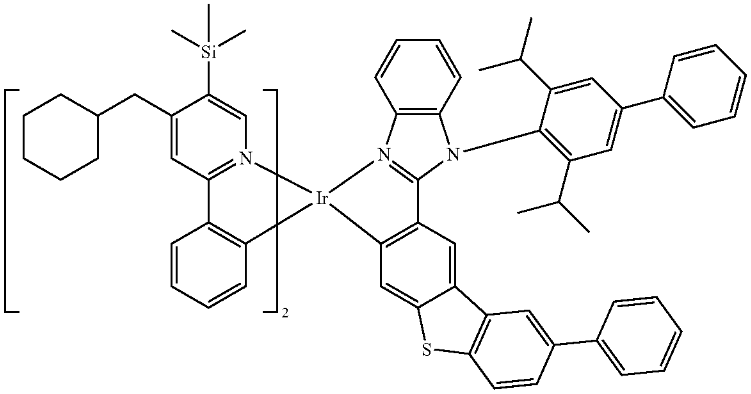
1551
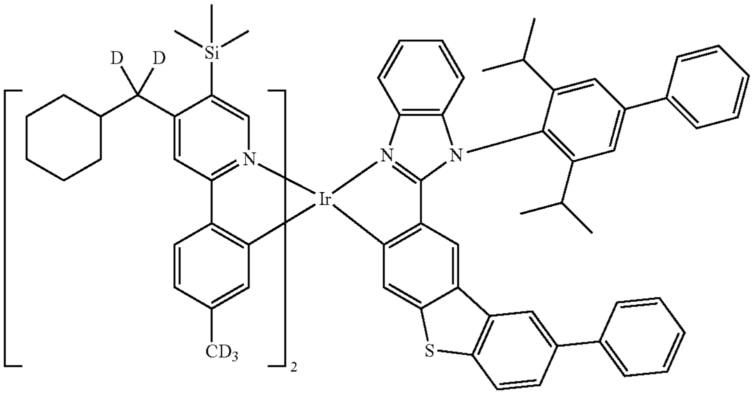
1552
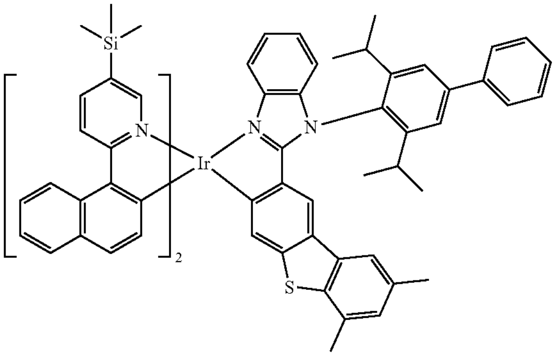
1553
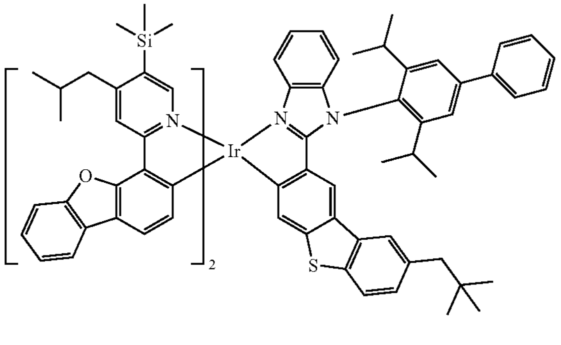

-continued
1554
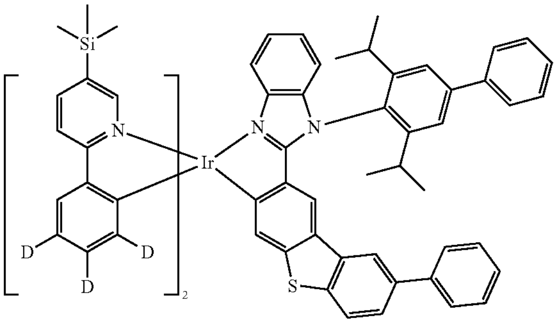
1555
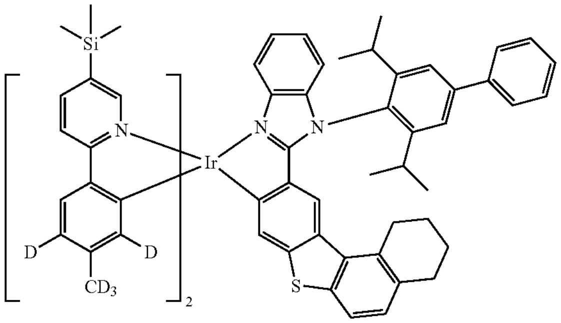
1556
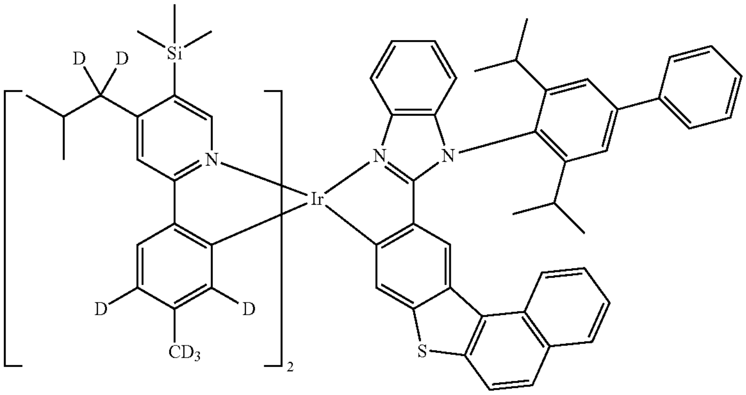
1557
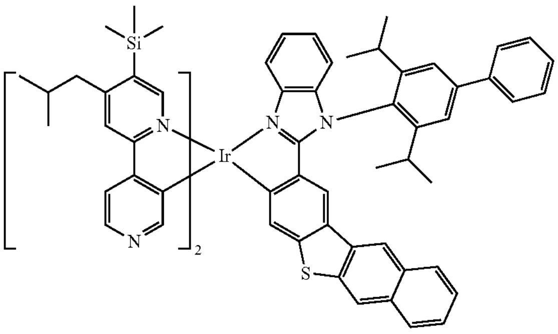
1558
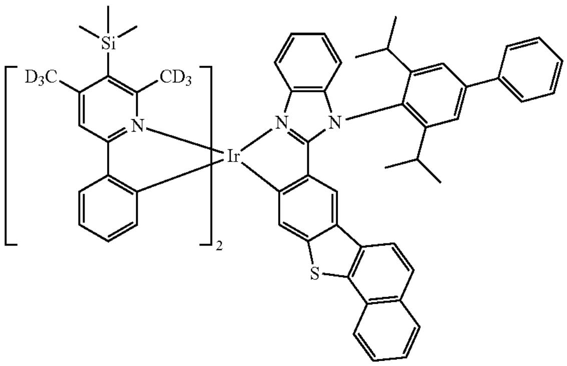
1559
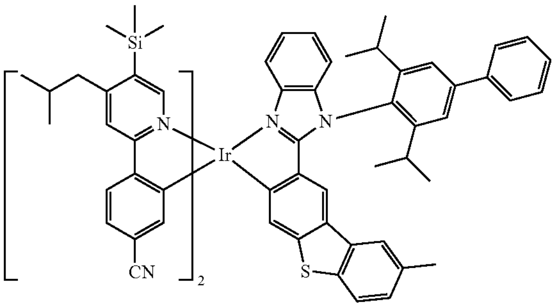
1560
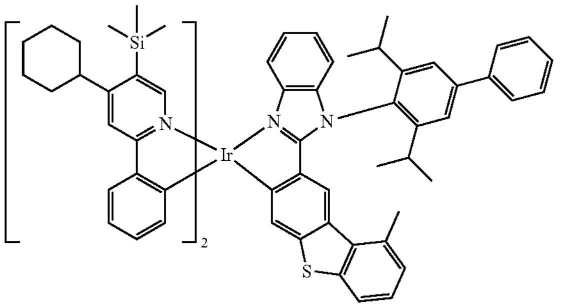

-continued
1561
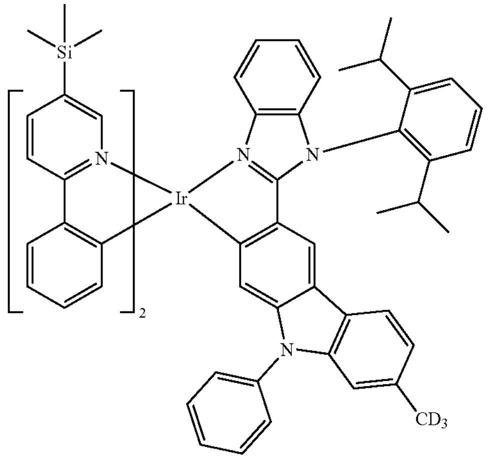
1562
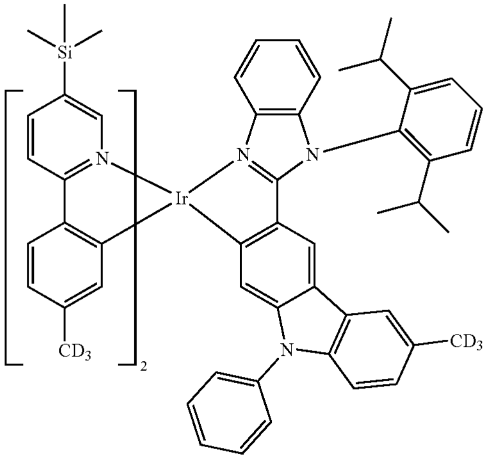
1563
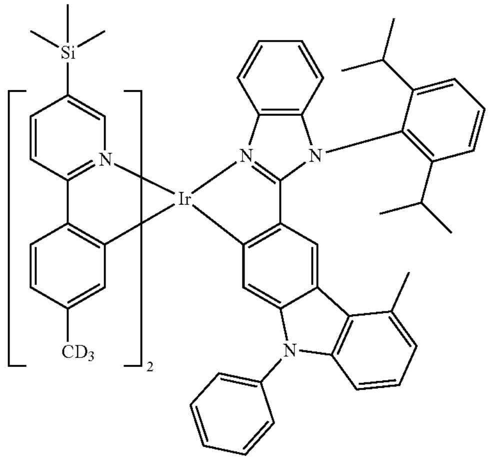
1564
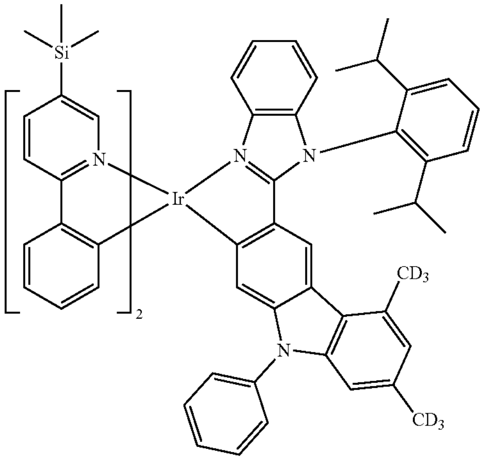
1565
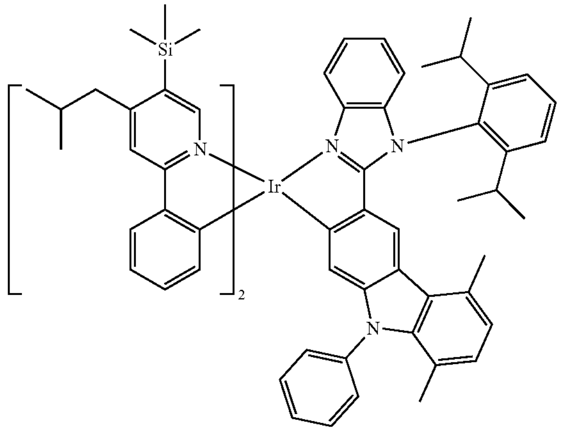
1566
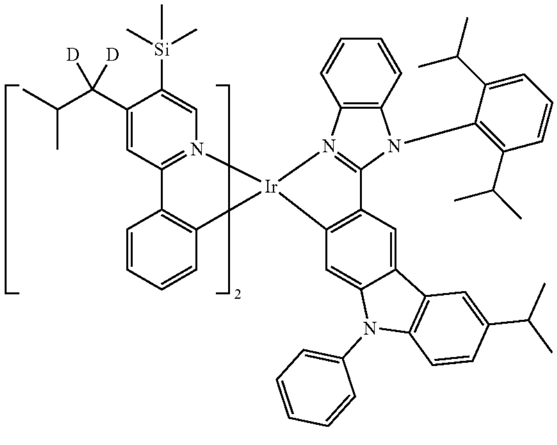

-continued
1567
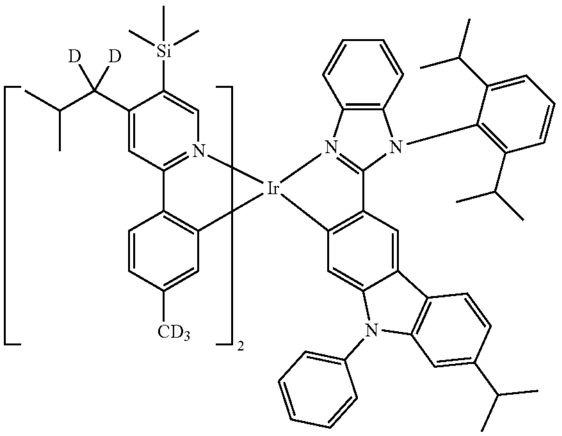
1568
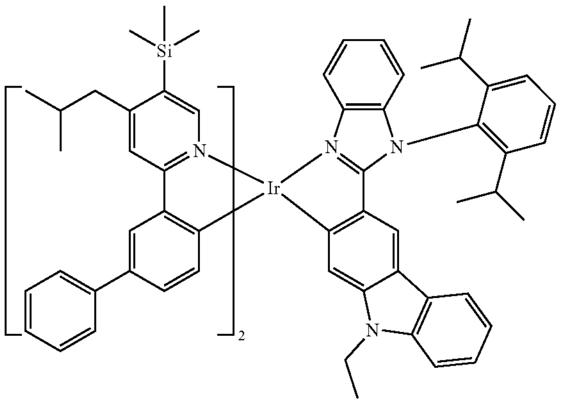
1569
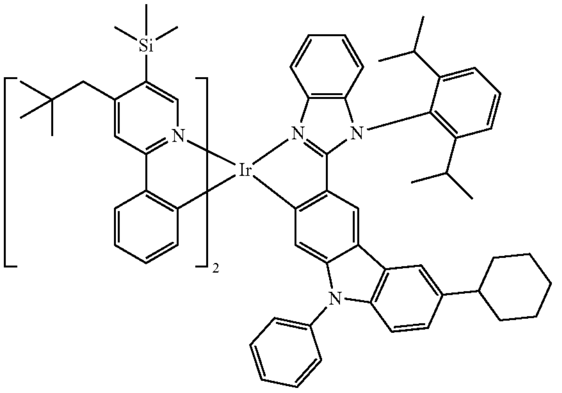
1570
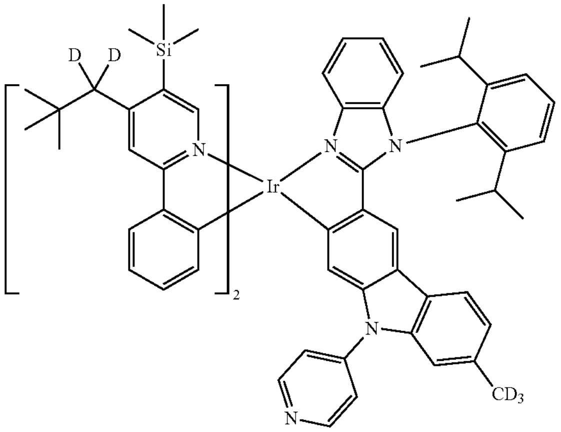
1571
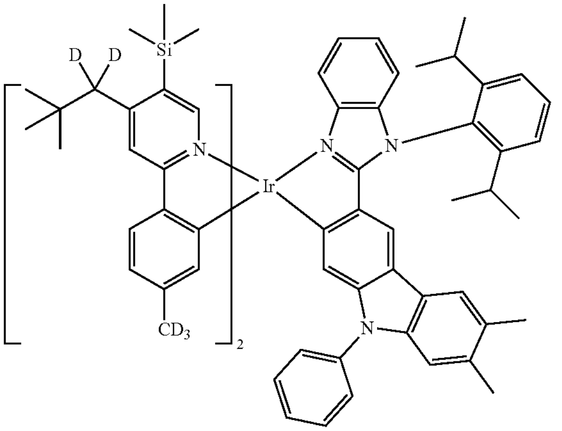
1572
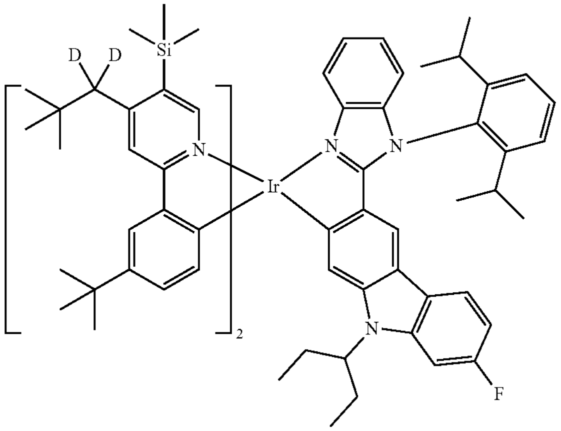

-continued
1573
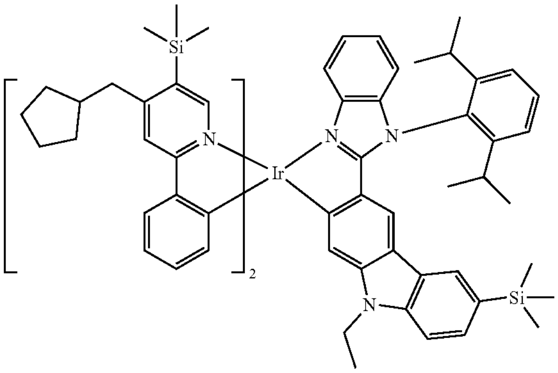
1574
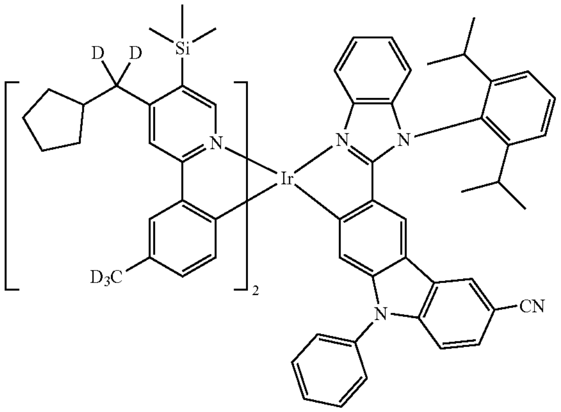
1575
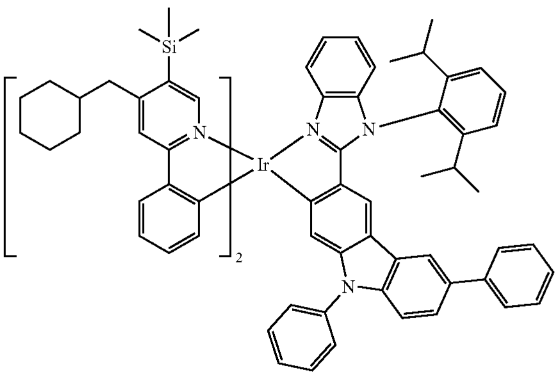
1576
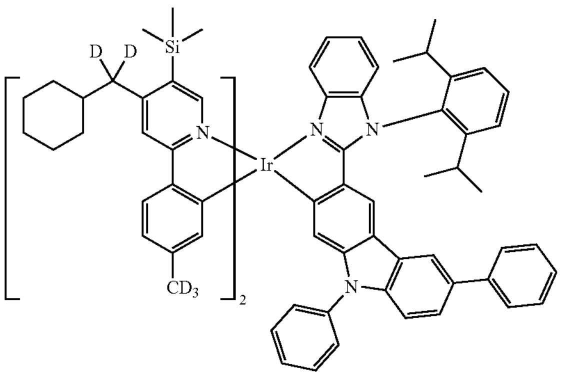
1577
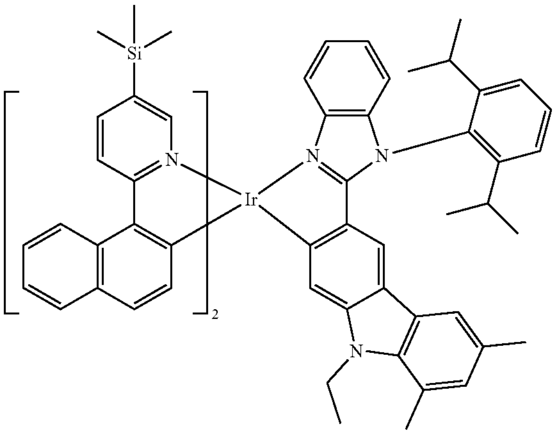
1578
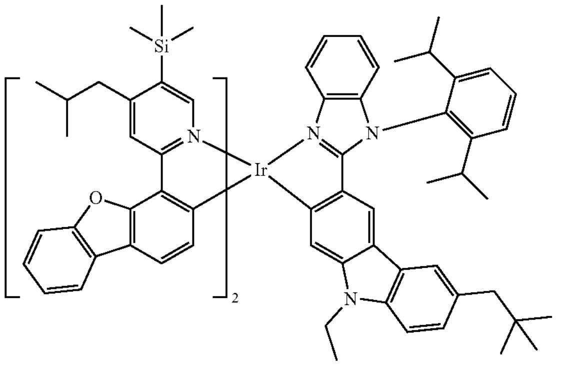

-continued
1579
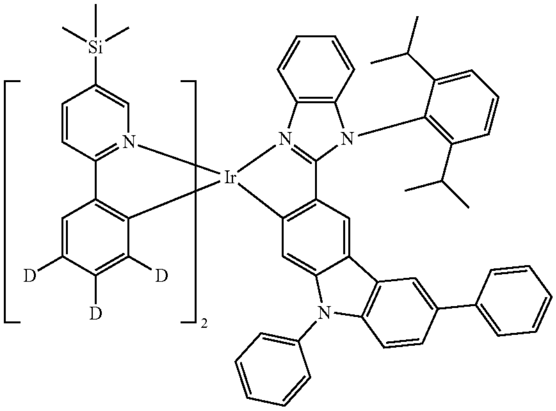
1580
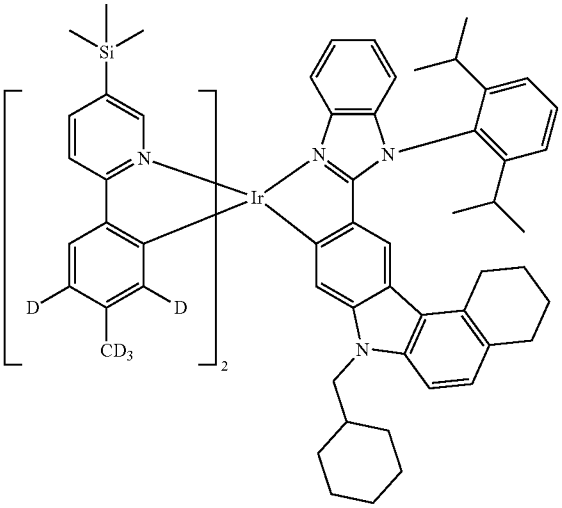
1581
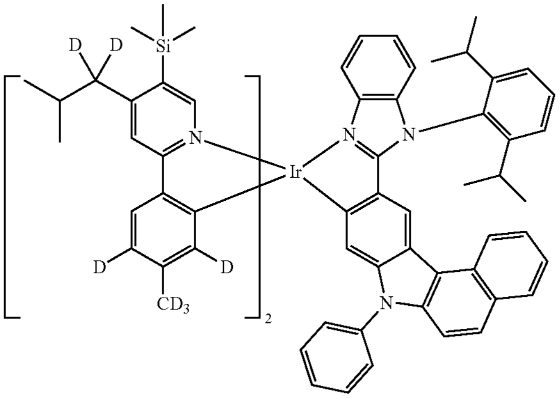
1582
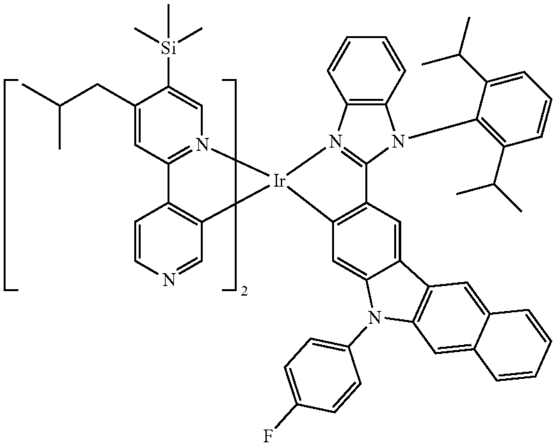
1583
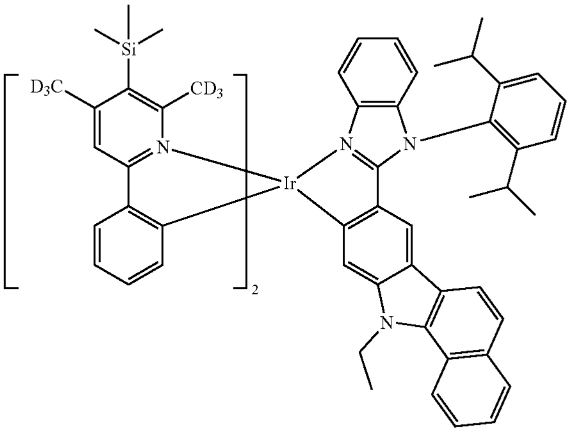
1584
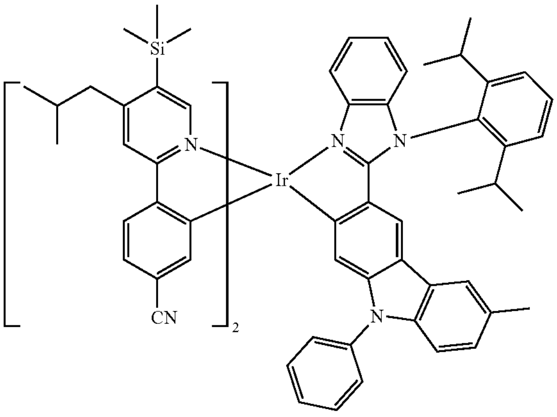

-continued
1585
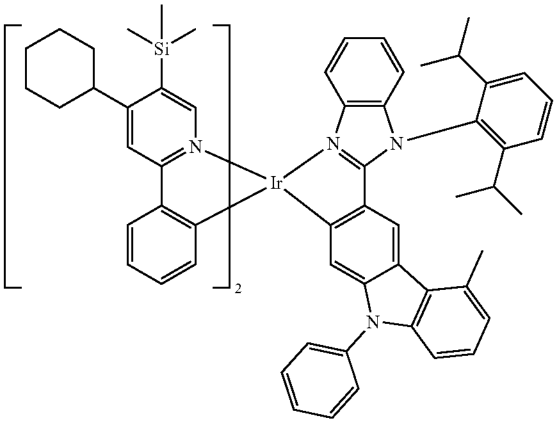
1586
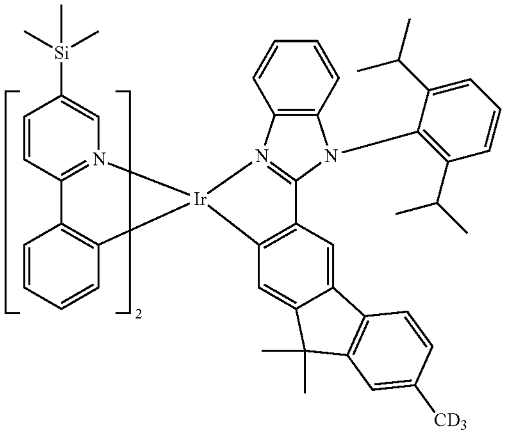
1587
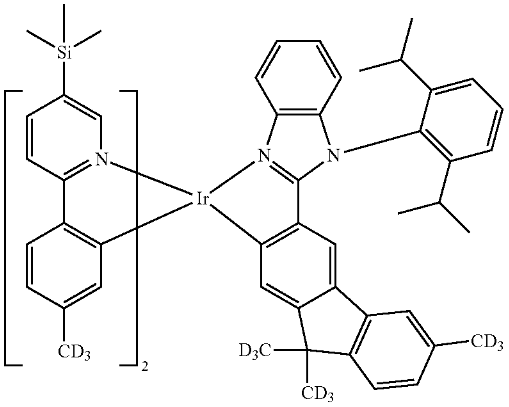
1588
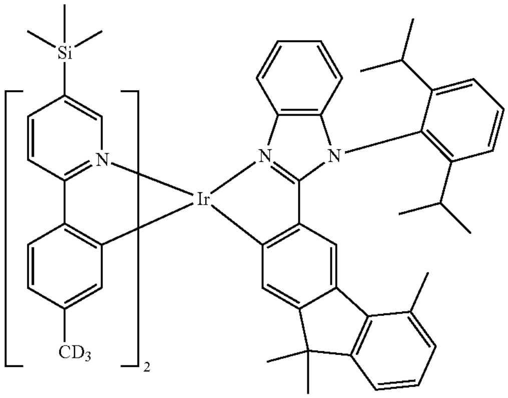
1589
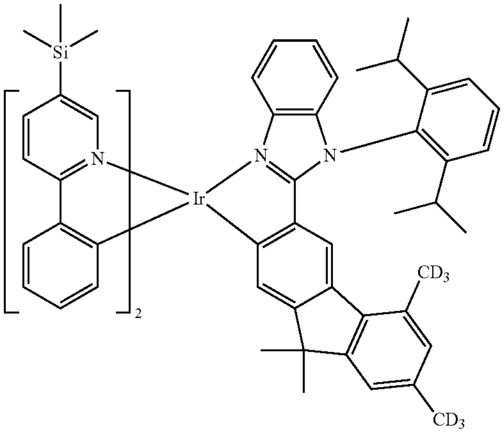
1590
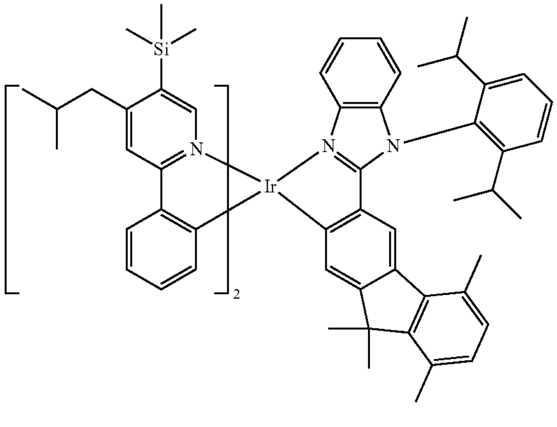

-continued
1591
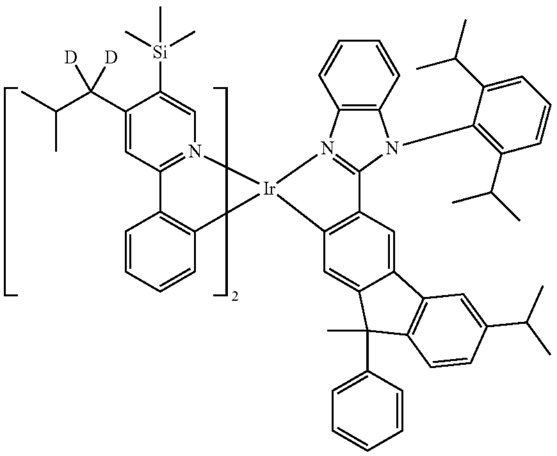
1592
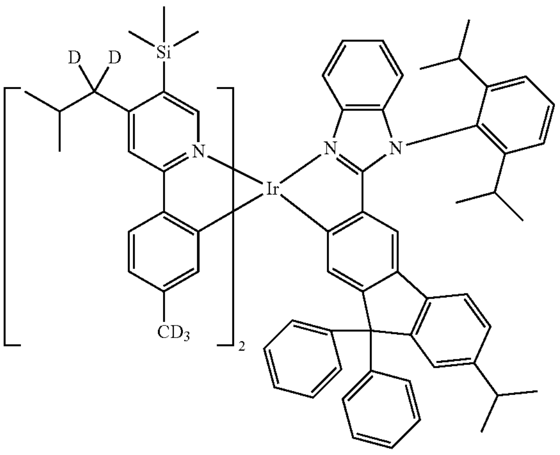
1593
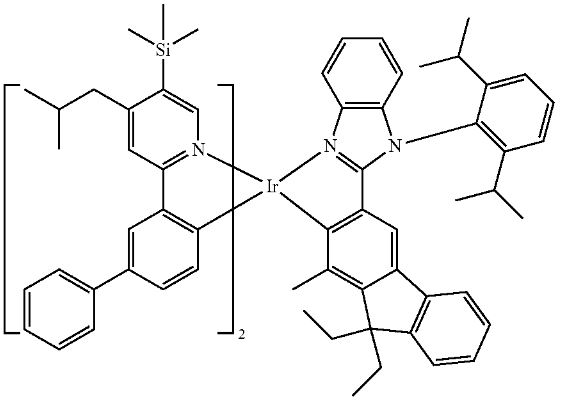
1594
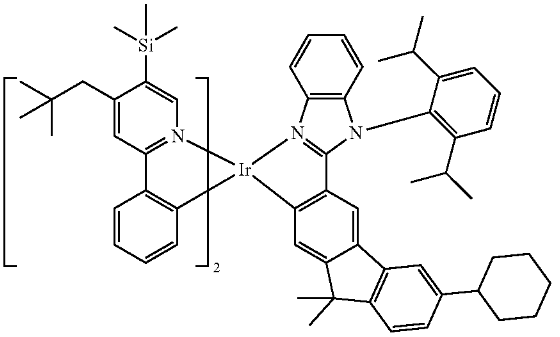
1595
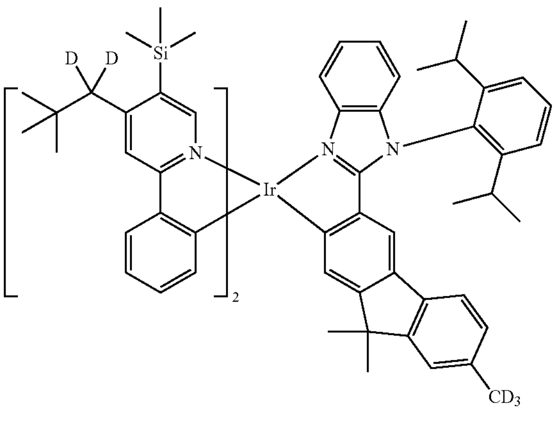
1596
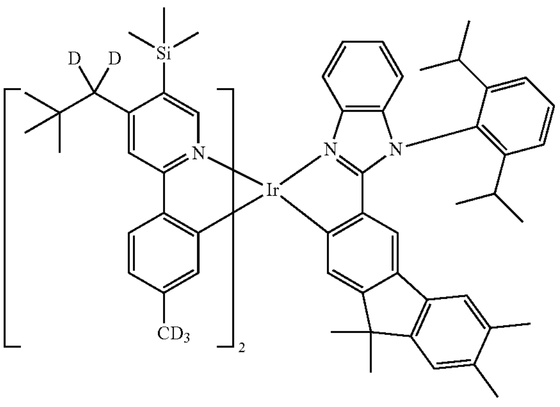

-continued
1597
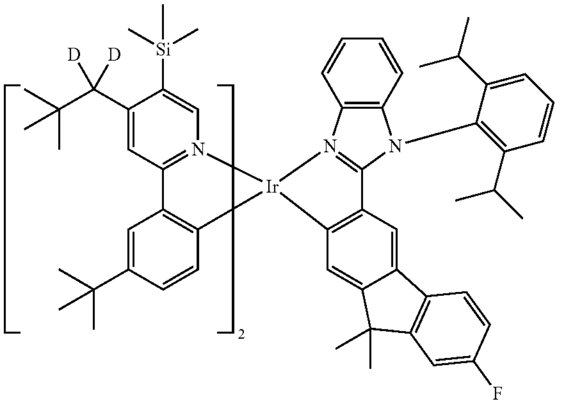
1598
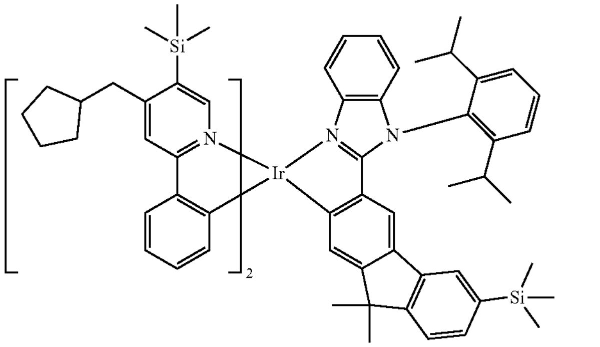
1599
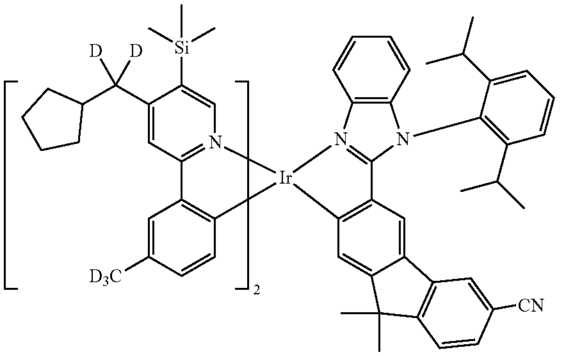
1600
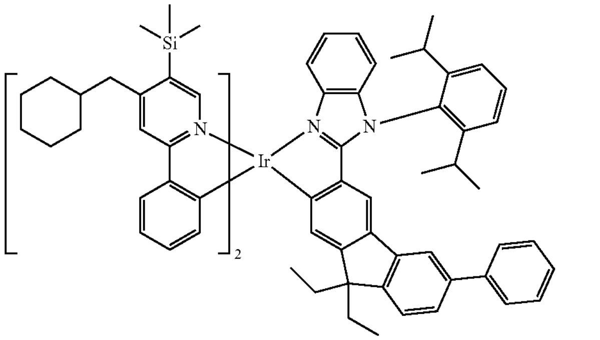
1601
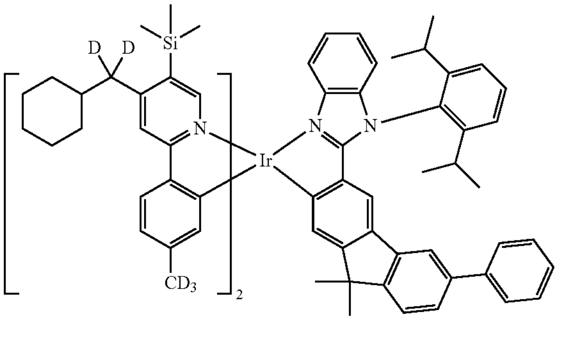
1602
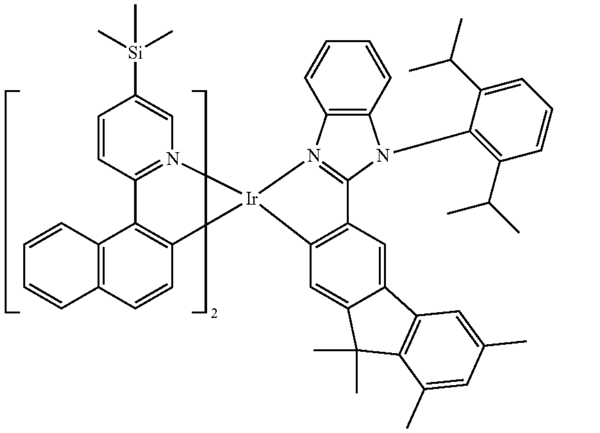
1603
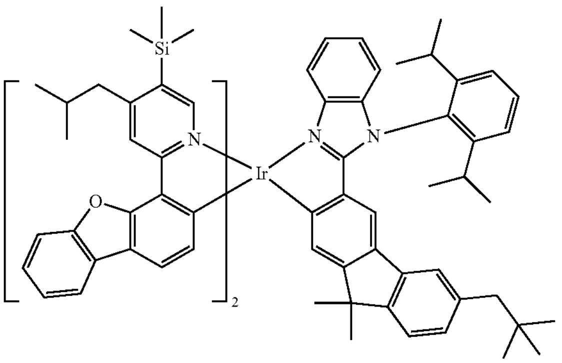
1604
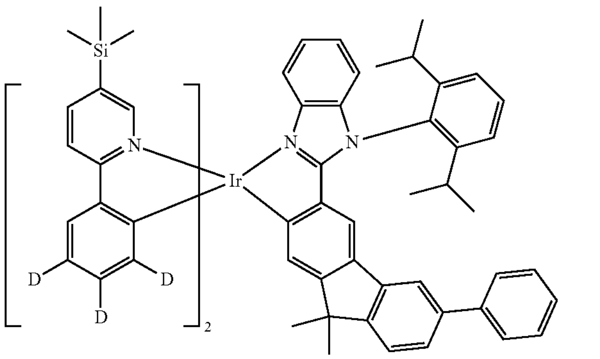

-continued
1605
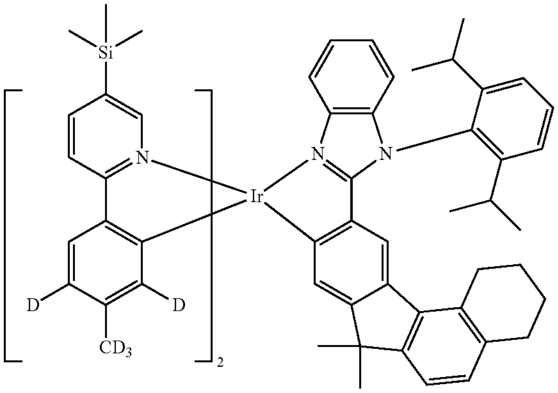
1606
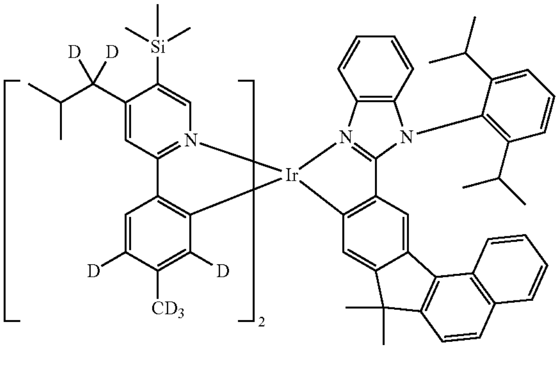
1607
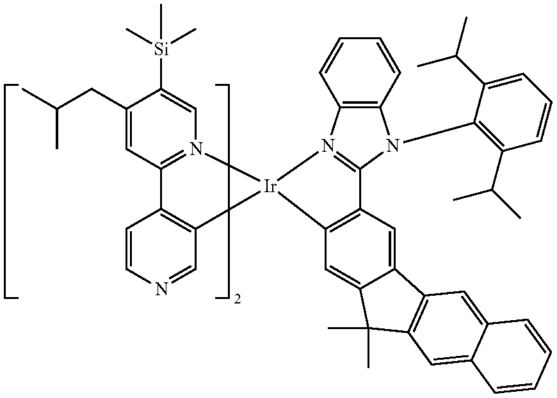
1608
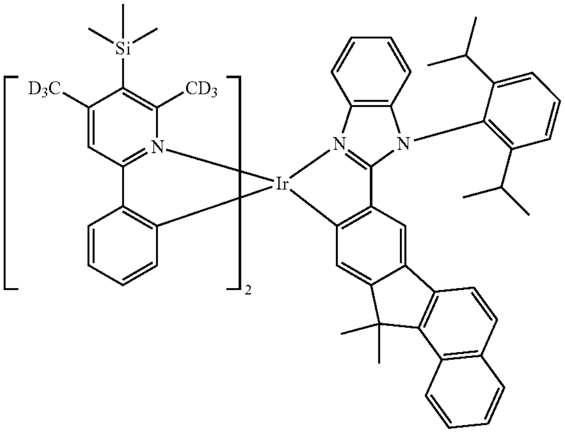
1609
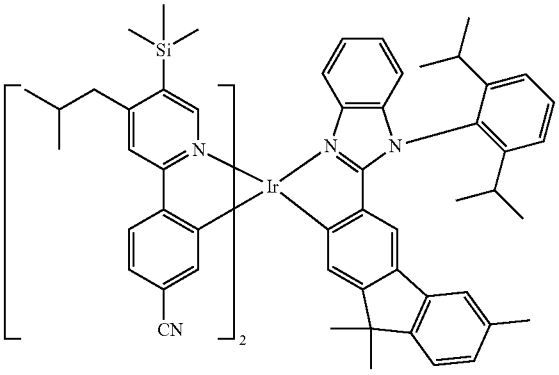
1610
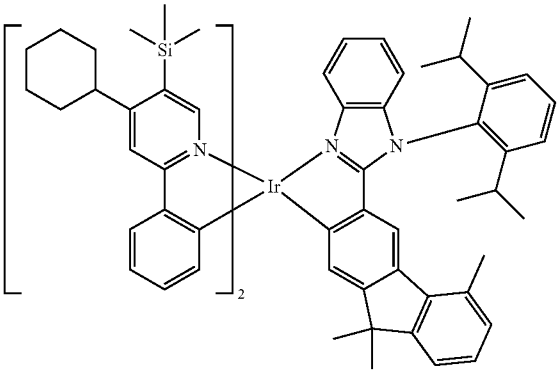
1611
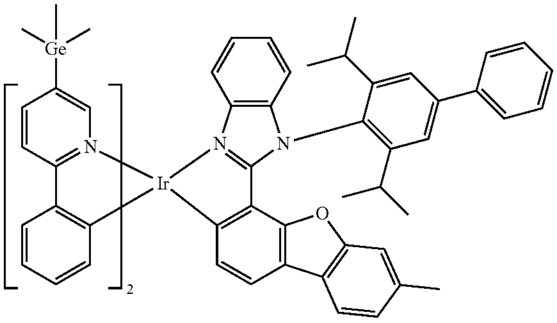
1612
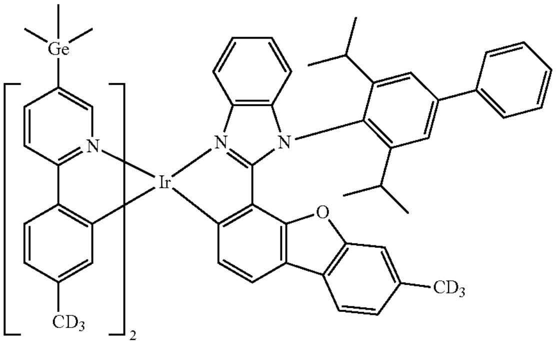

-continued
1613
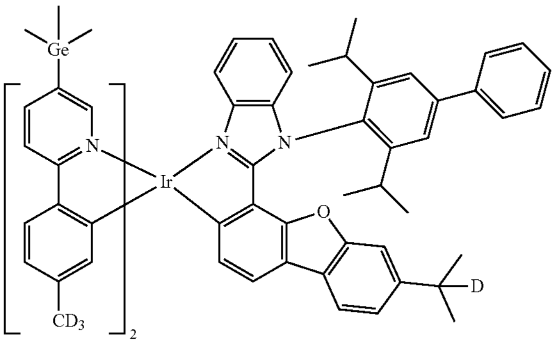
1614
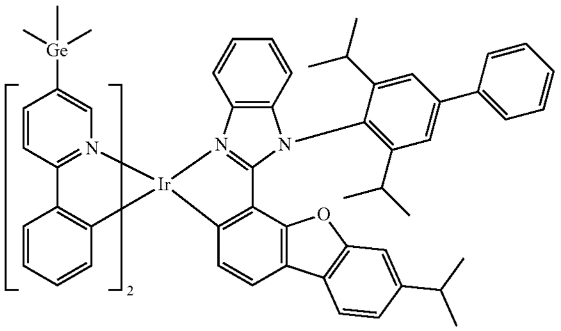
1615
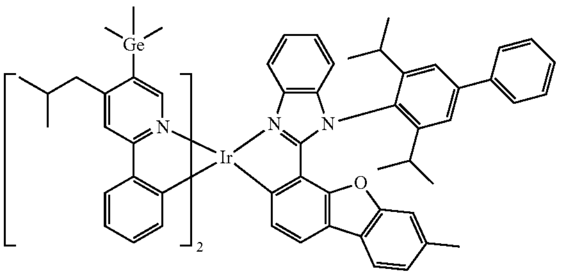
1616
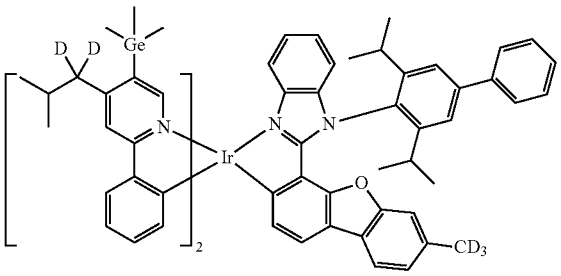
1617
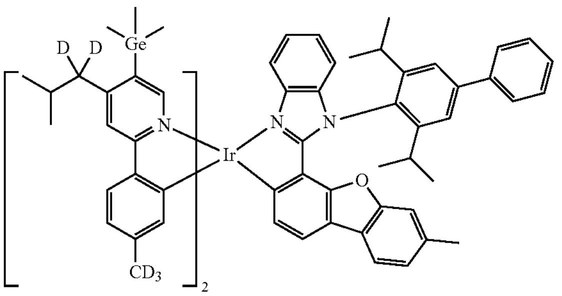
1618
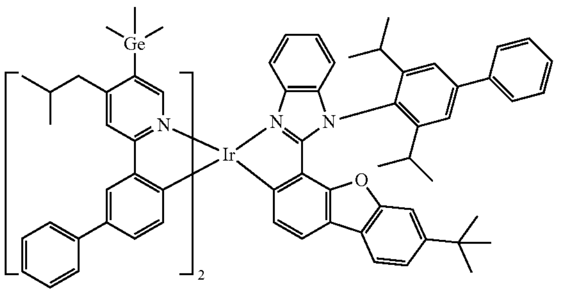
1619
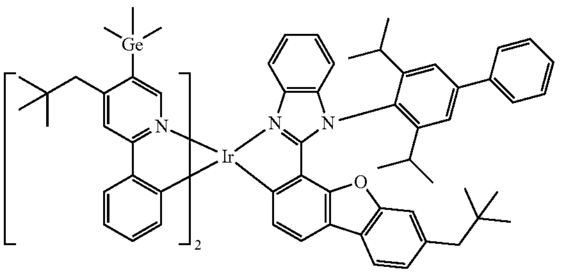
1620
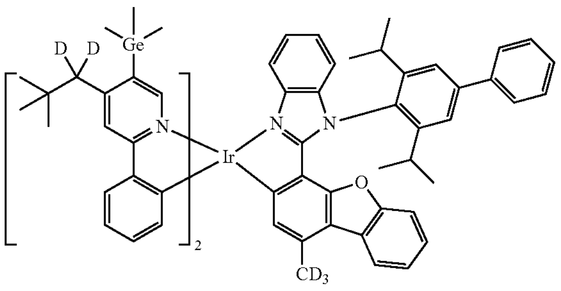
1621
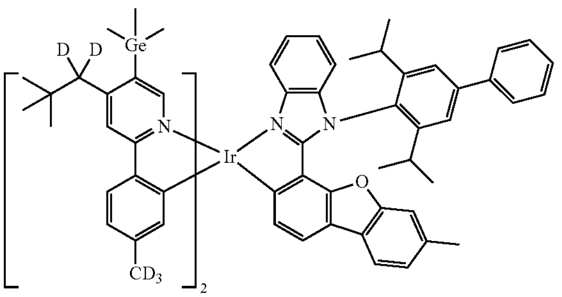
1622
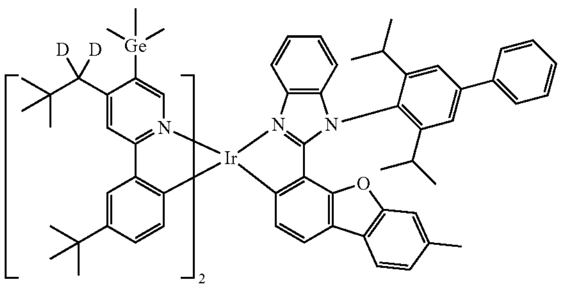

-continued
1623
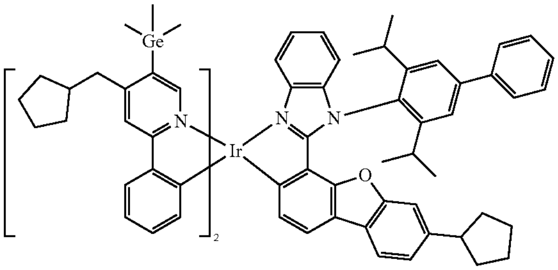
1624
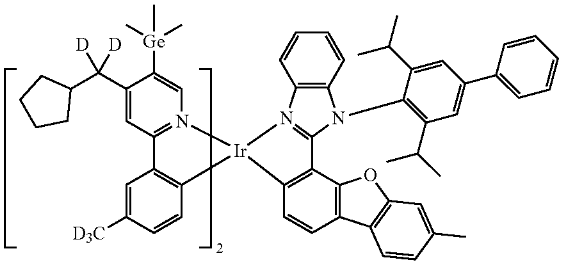
1625
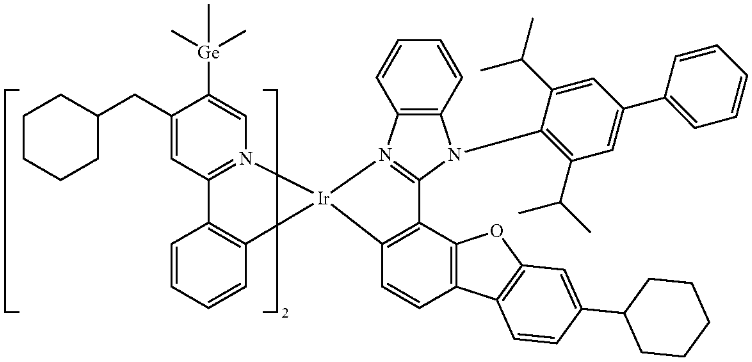
1626
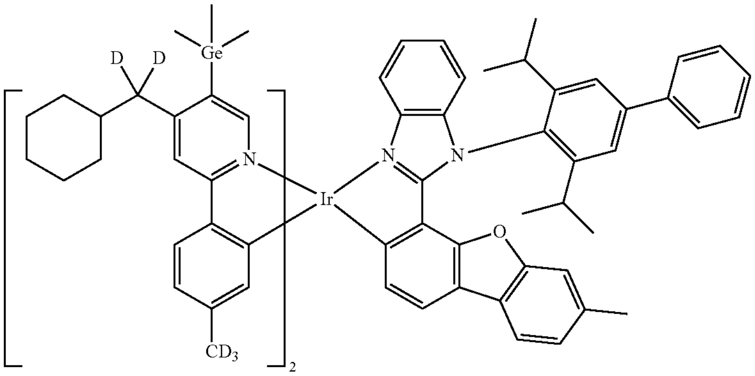
1627
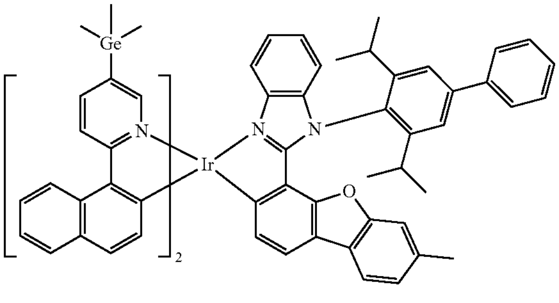
1628
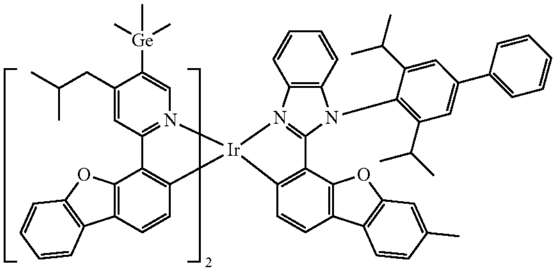

-continued
1629
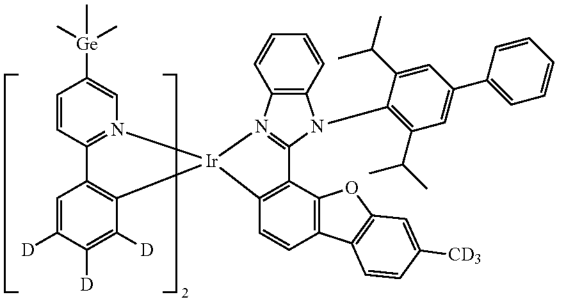
1630
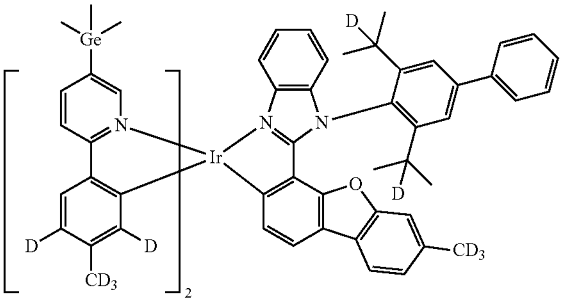
1631
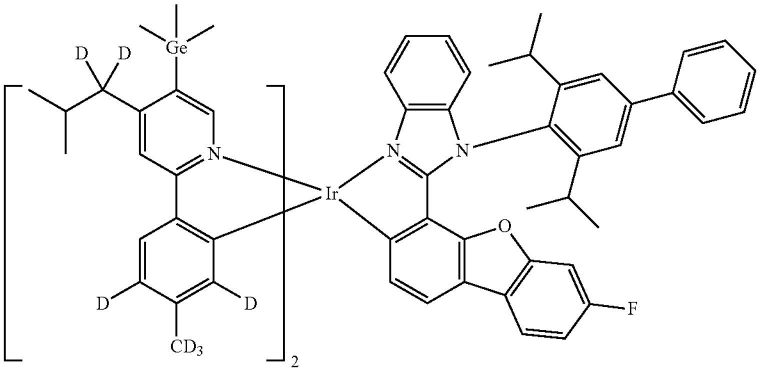
1632
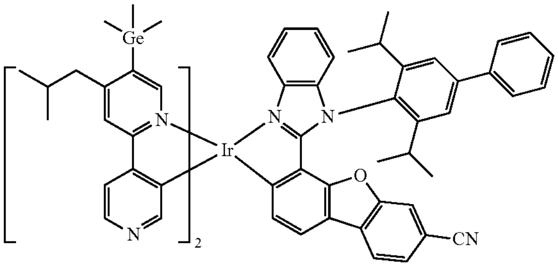
1633
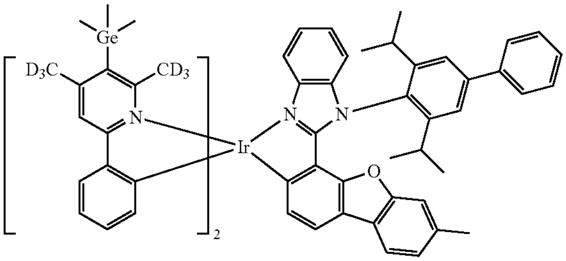
1634
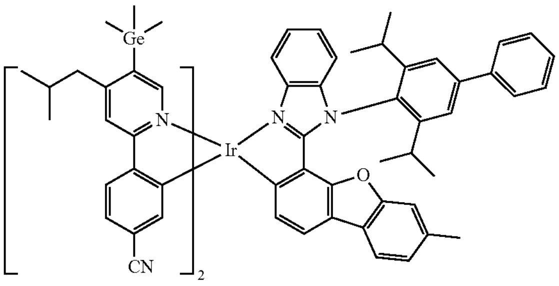
1635
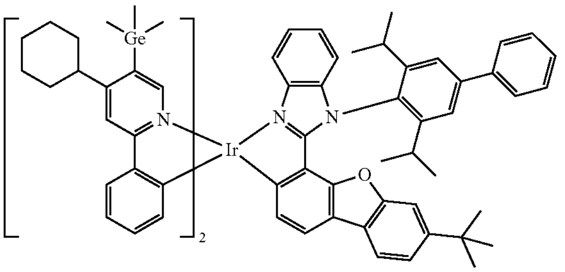

-continued
1636
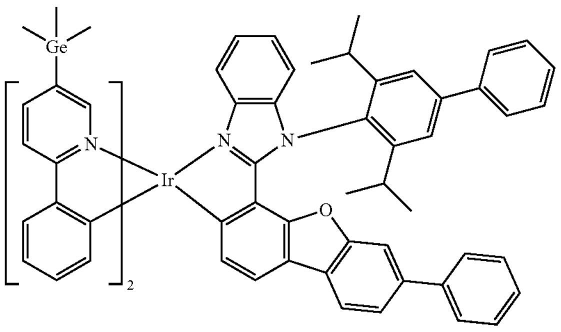
1637
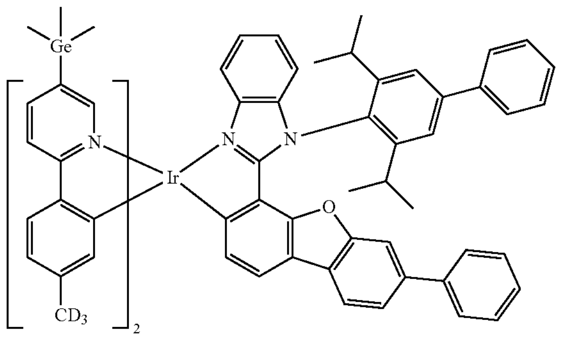
1638
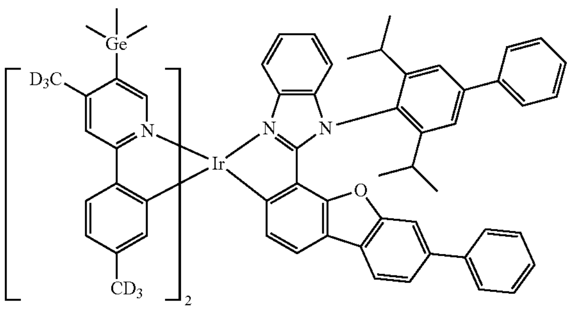
1639
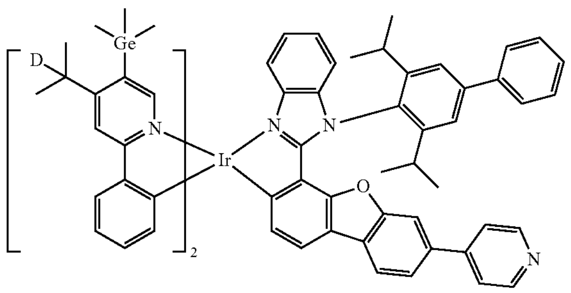
1640
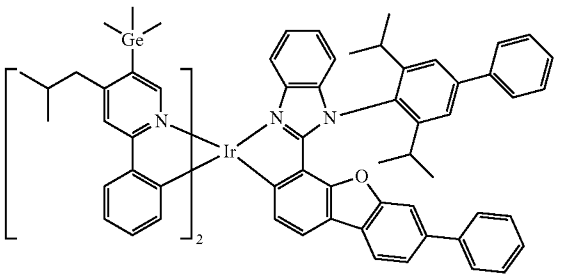
1641
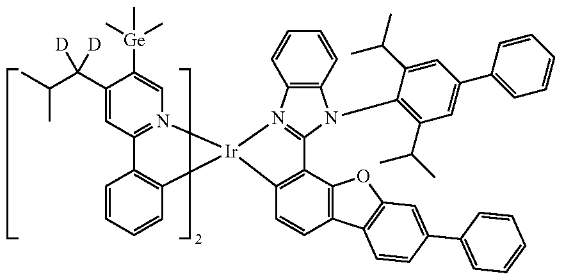
1642
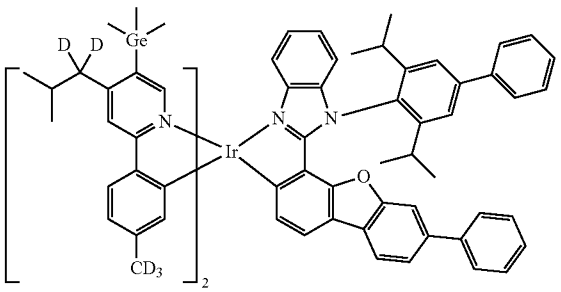
1643
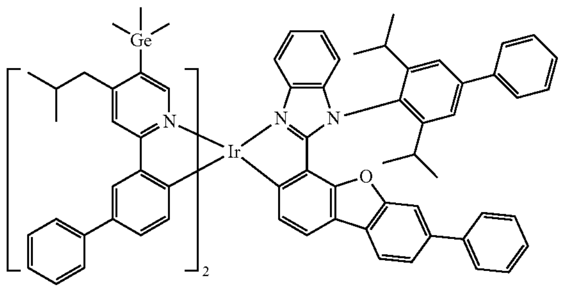
1644
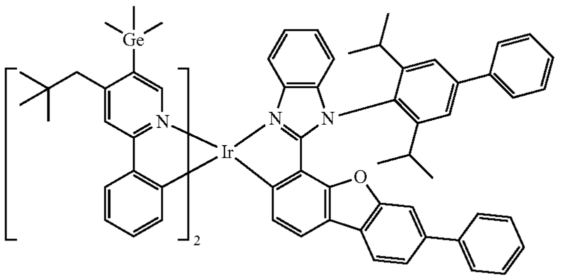
1645
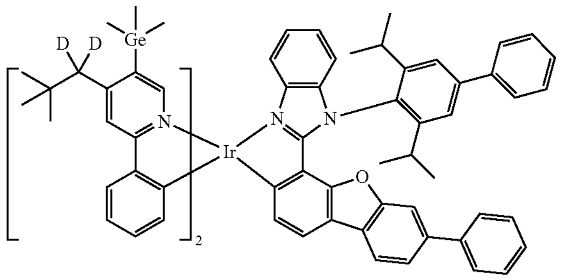

-continued
1646
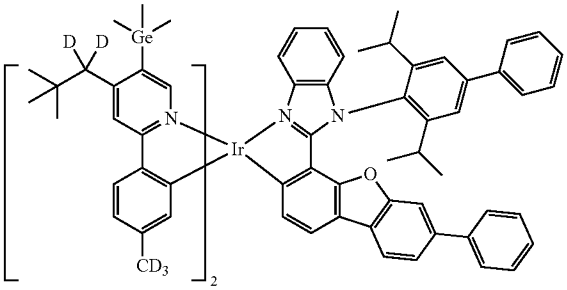
1647
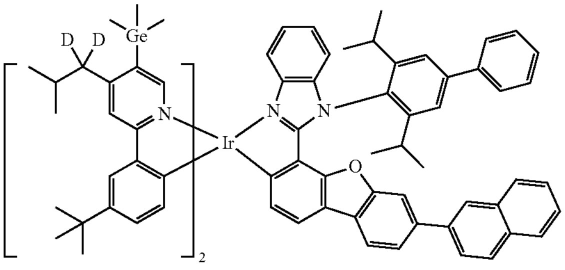
1648
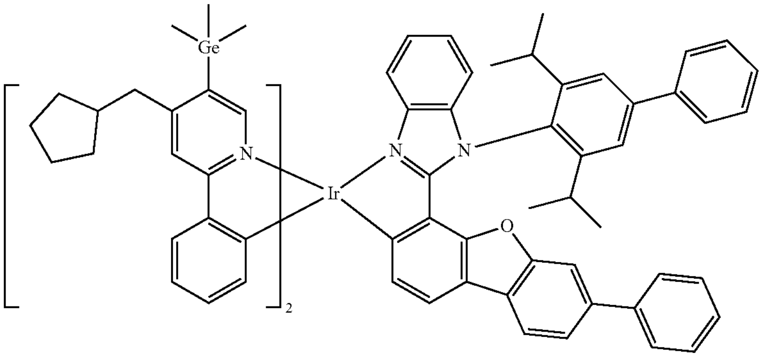
1649
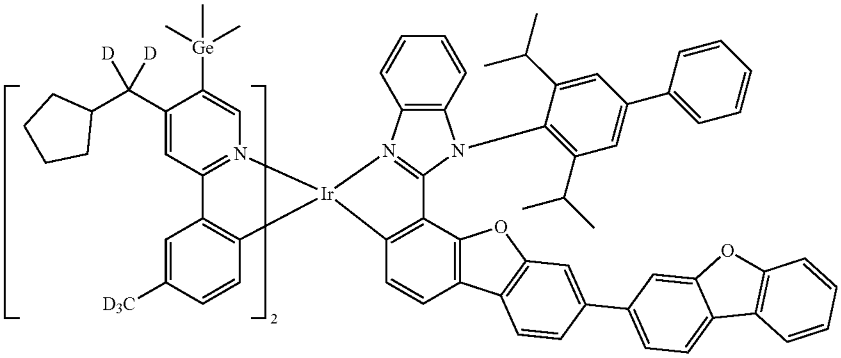
1650
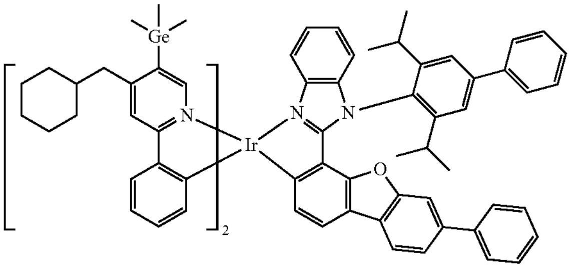
1651
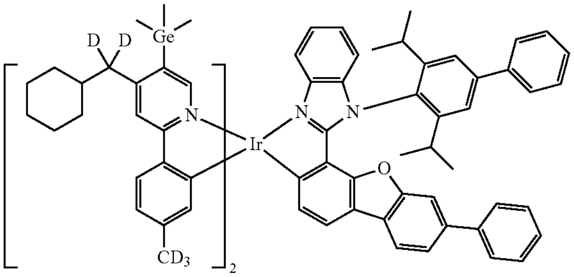

-continued
1652
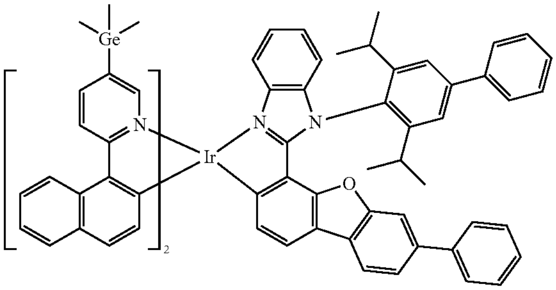
1653
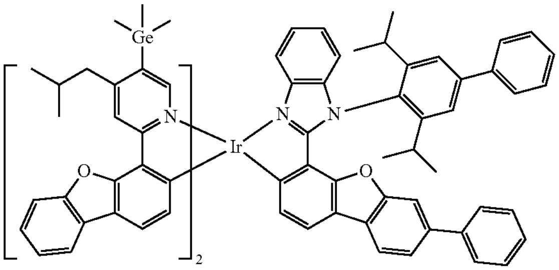
1654
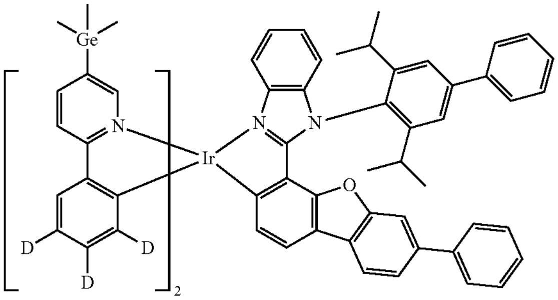
1655
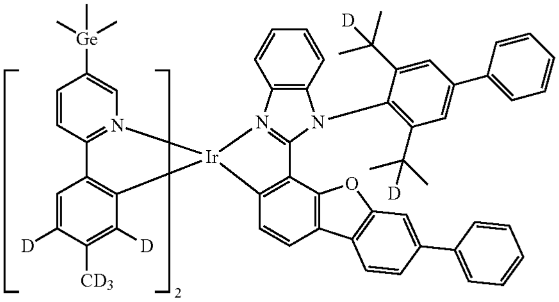
1656
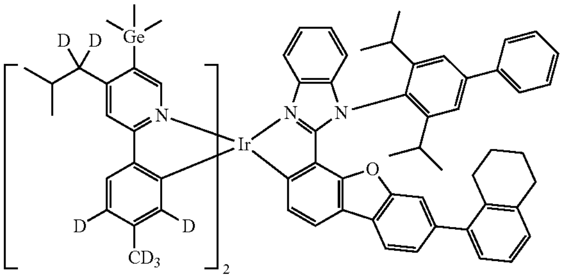
1657
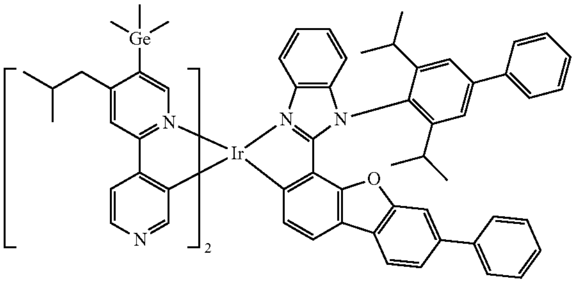
1658
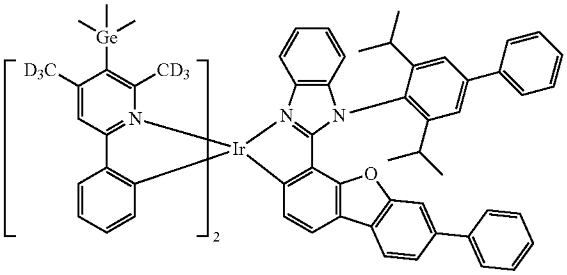
1659
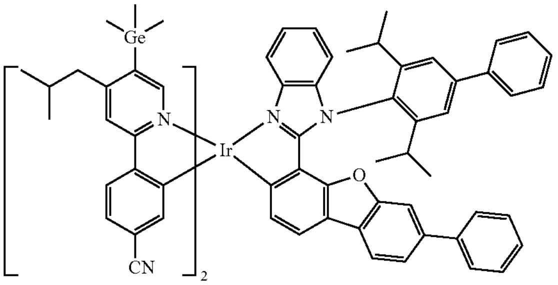
1660
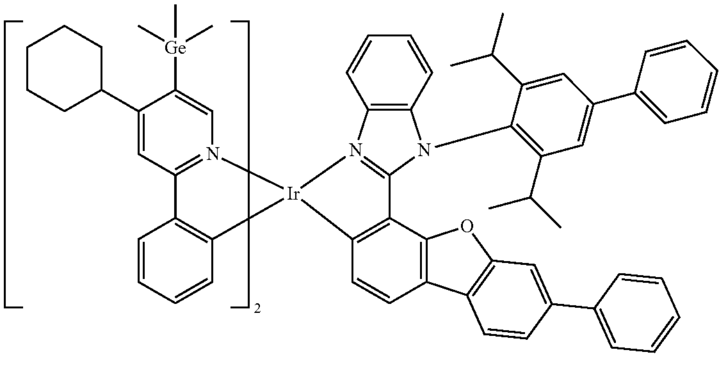

-continued
1661
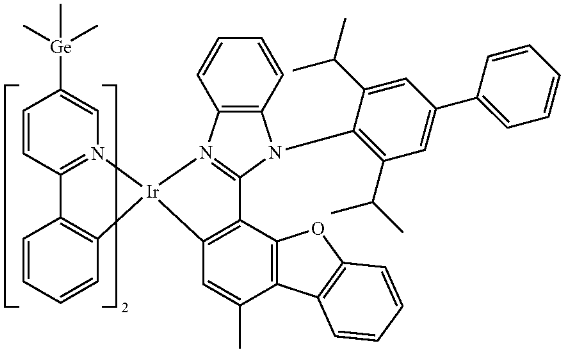
1662
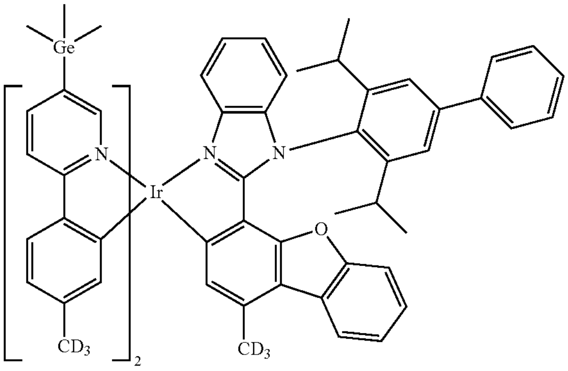
1663
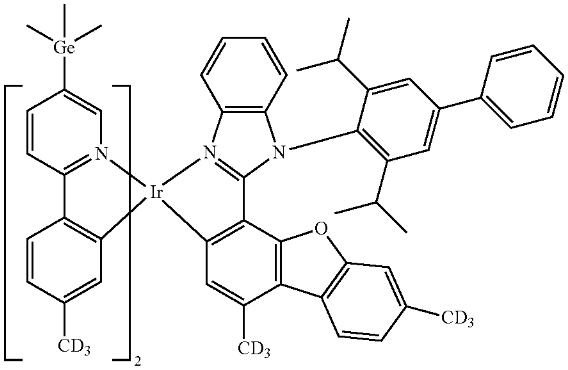
1664
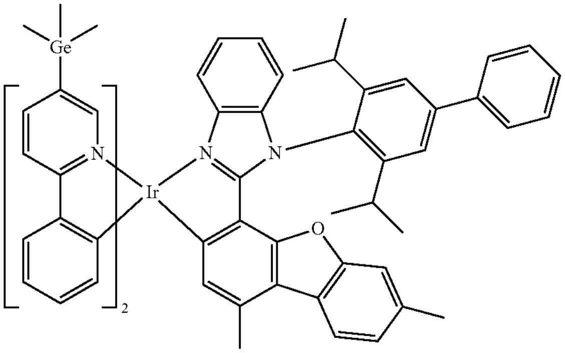
1665
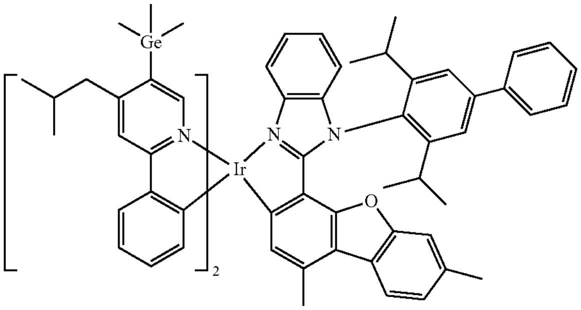
1666
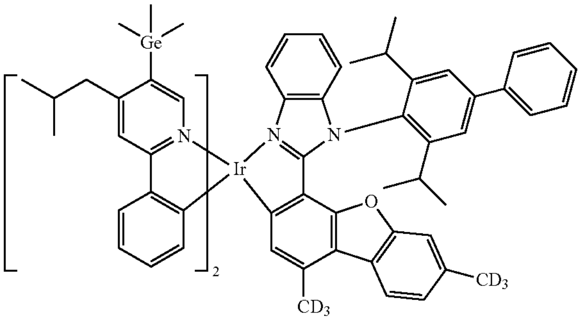
1667
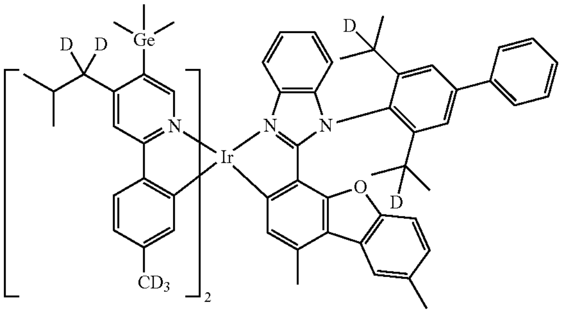
1668
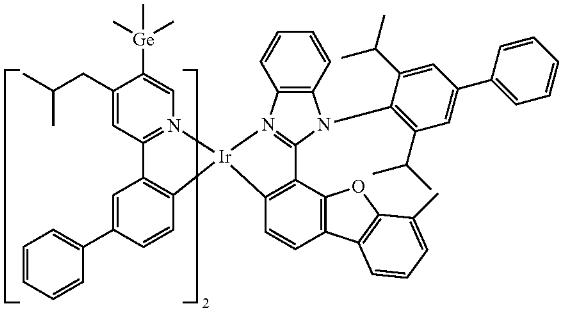

-continued
1669
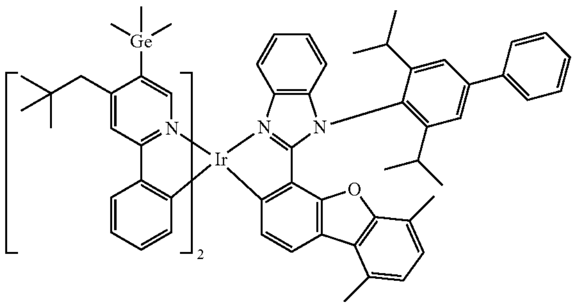
1670
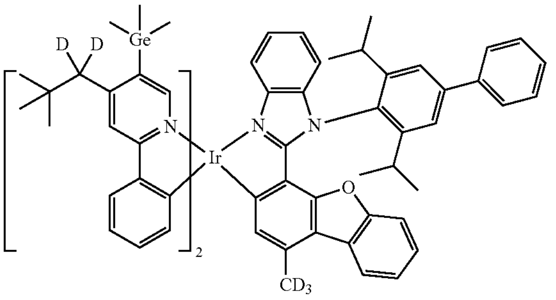
1671
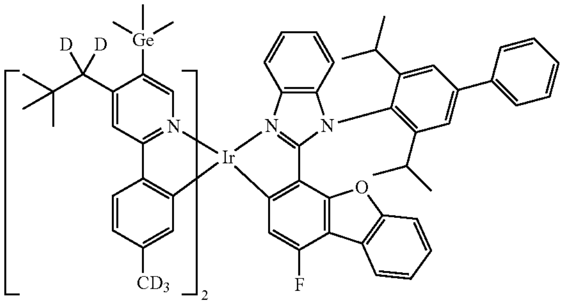
1672
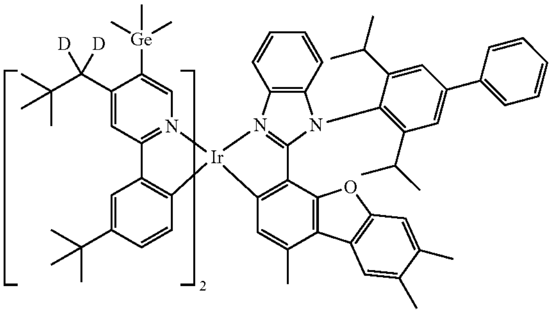
-continued
1673
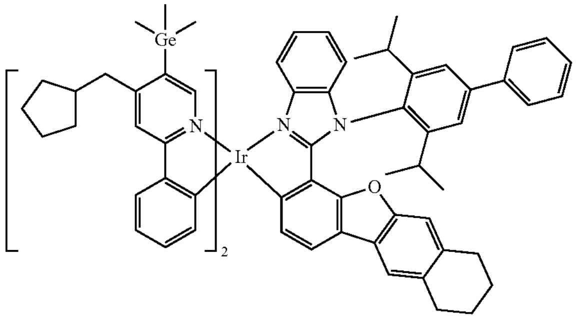
1674
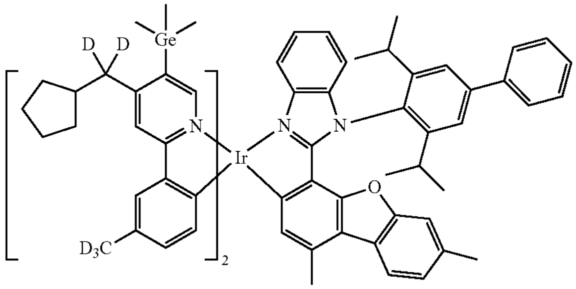
1675
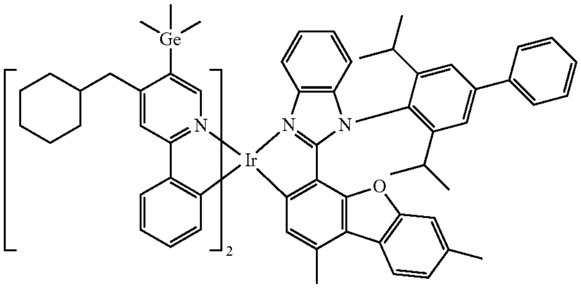
1676
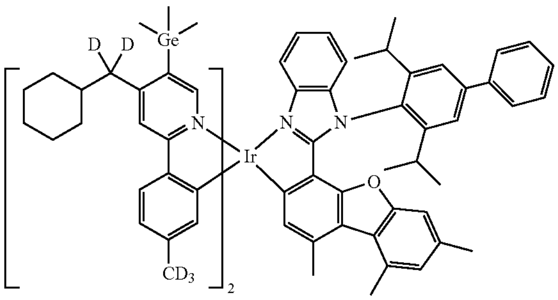

1677
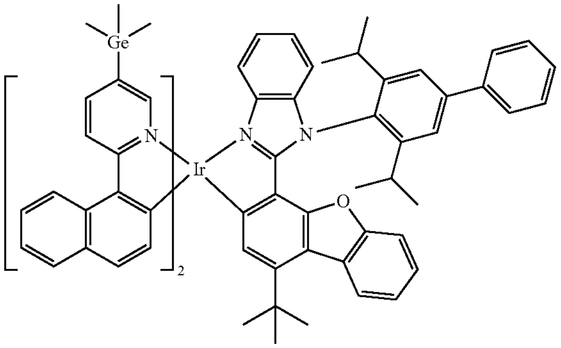
1678
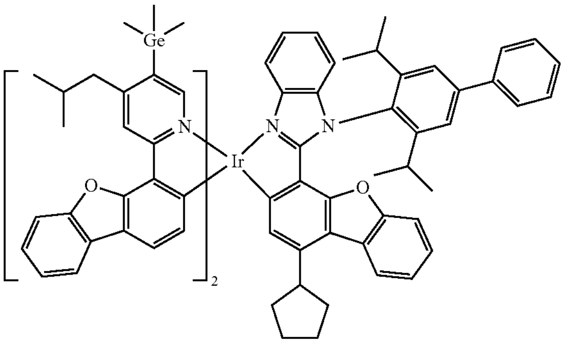
1679
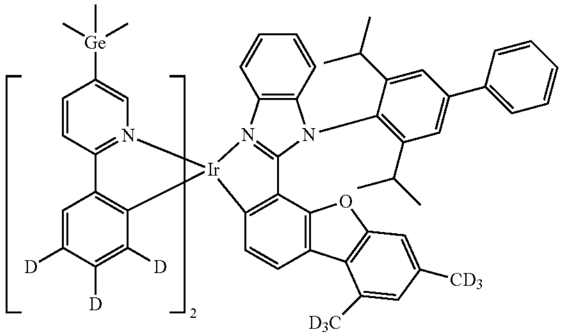
1680
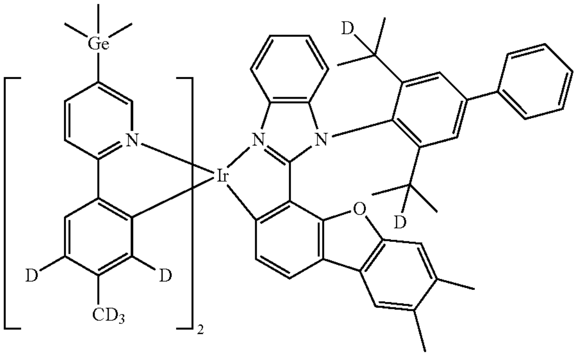
1681
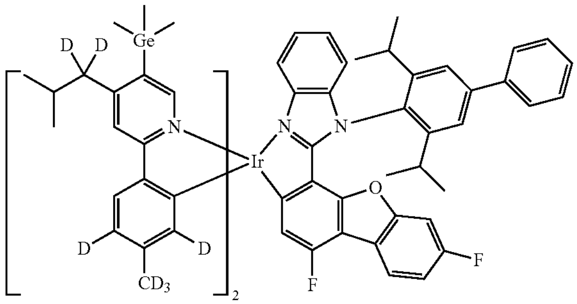
1682
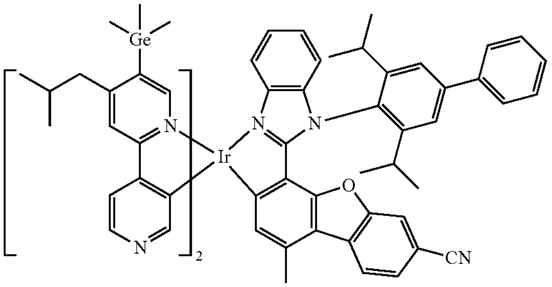
1683
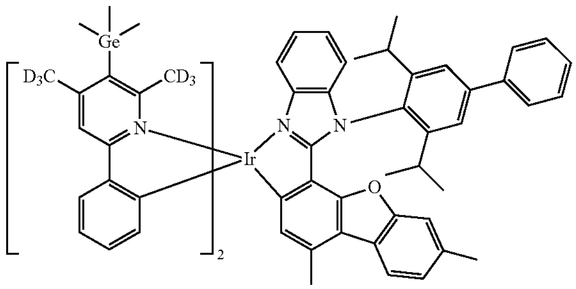
1684
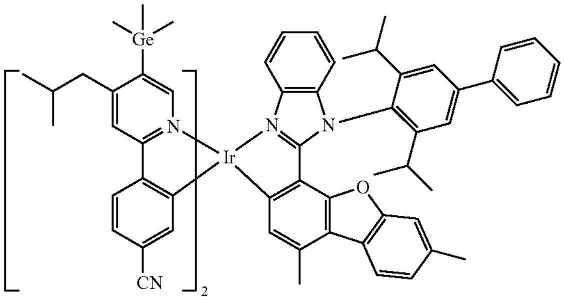
1685
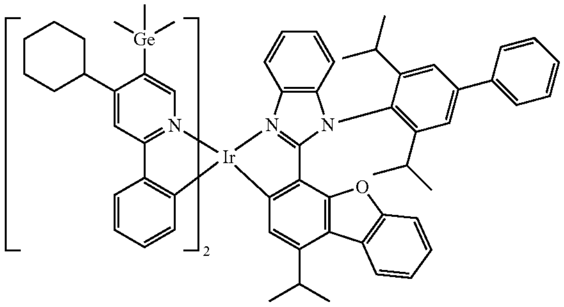

-continued
1686
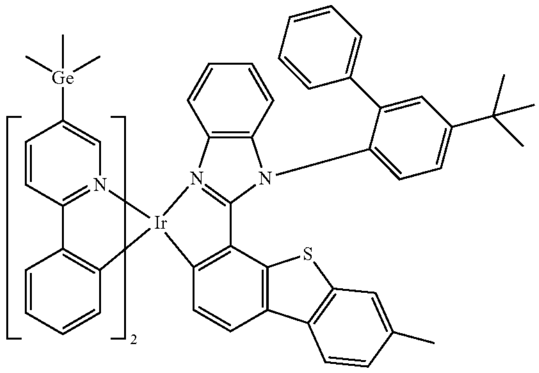
1687
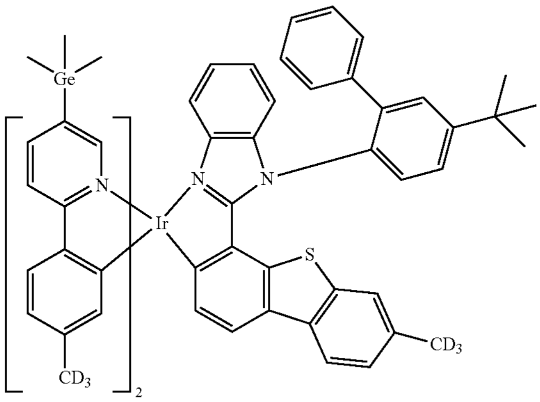
1688
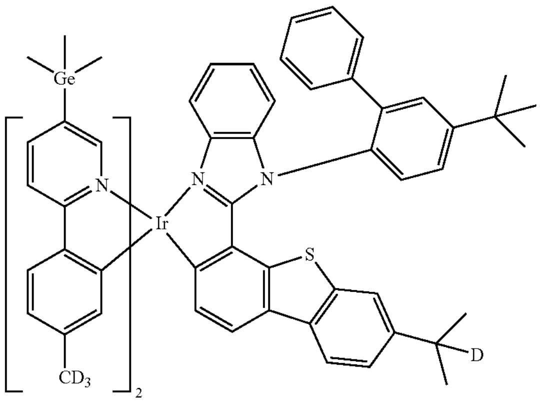
1689
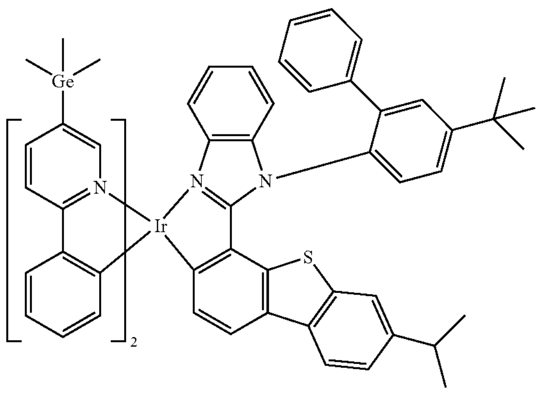
-continued
1690
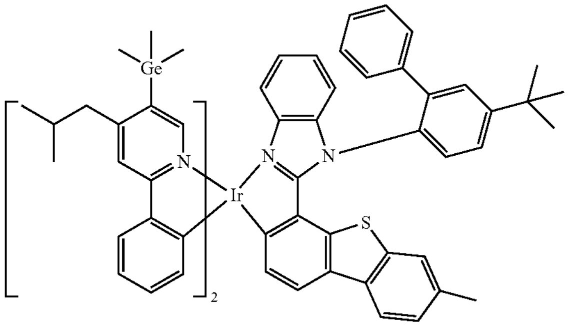
1691
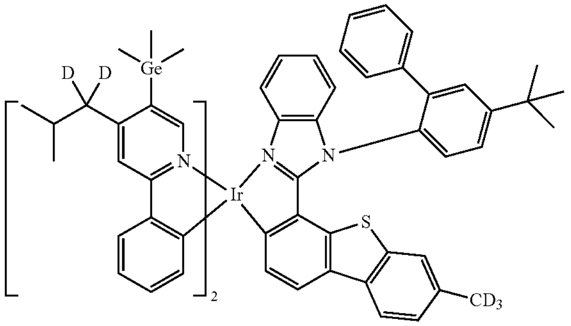
1692
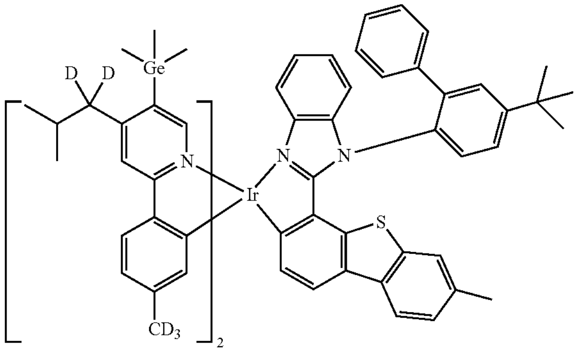
1693
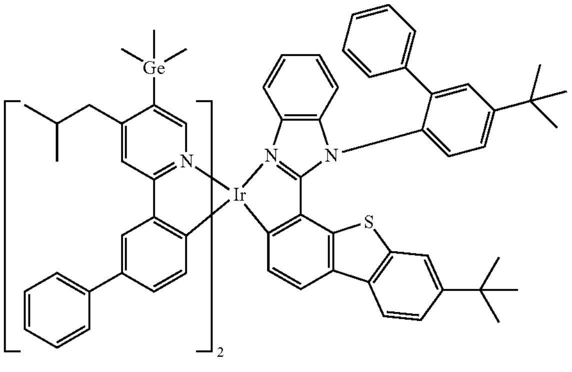

1694
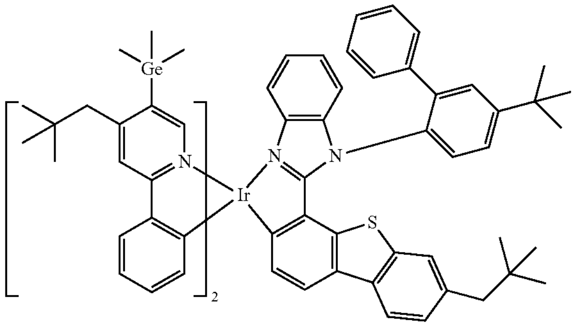
1695
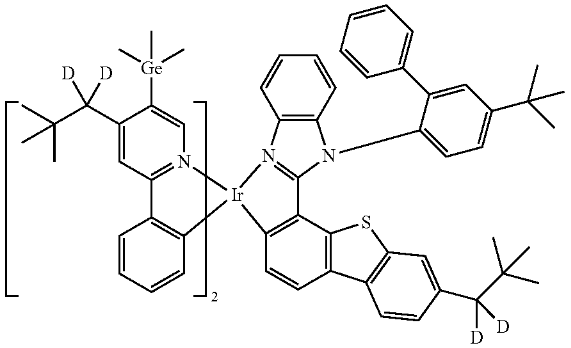
1696
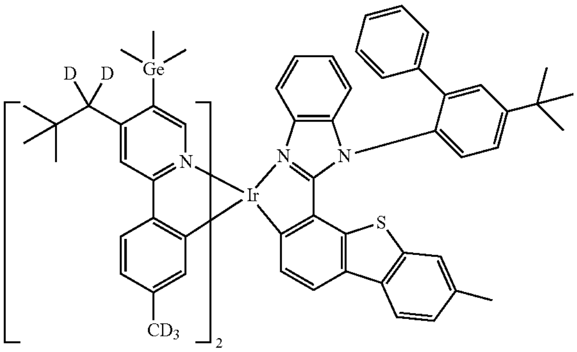
1697
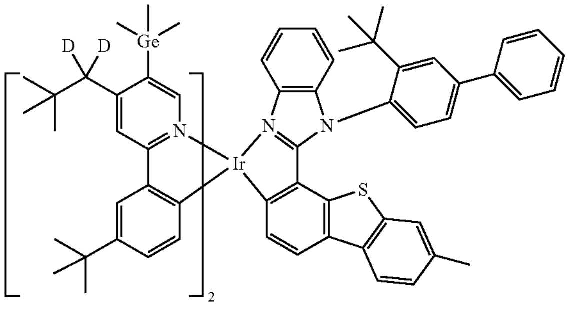
1698
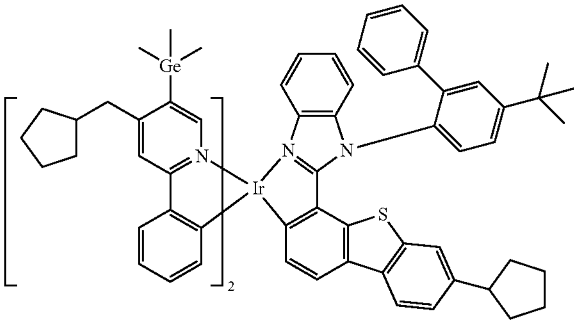
1699
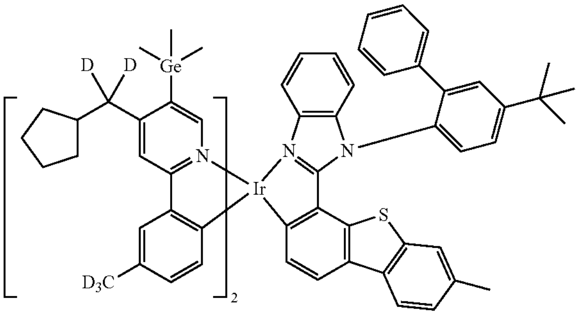
1700
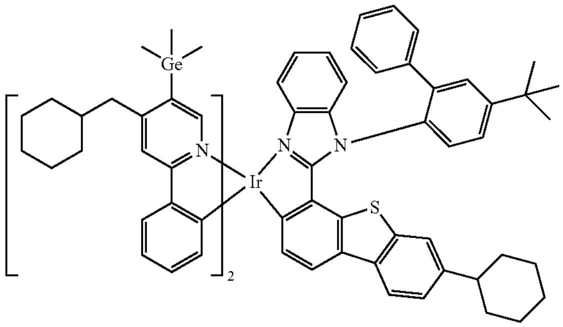
1701
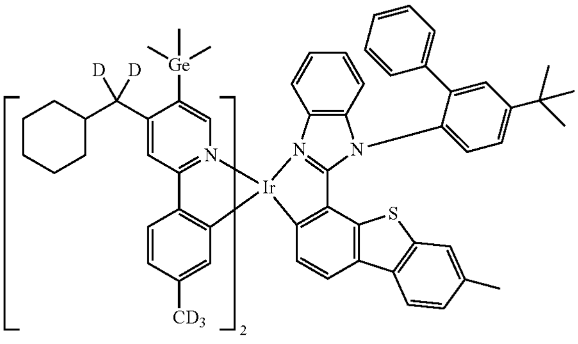

-continued
1702
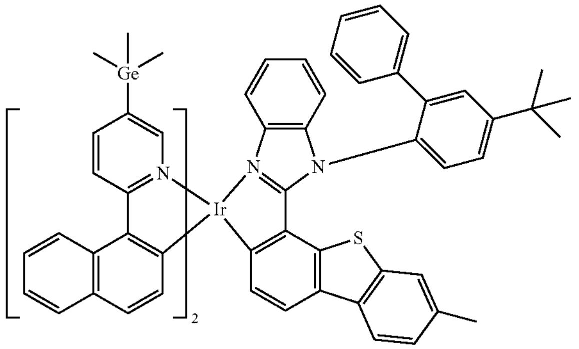
1703
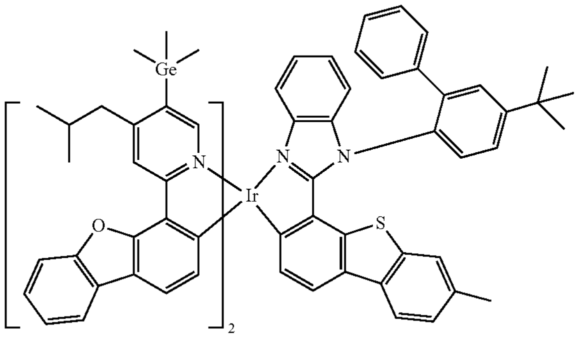
1704
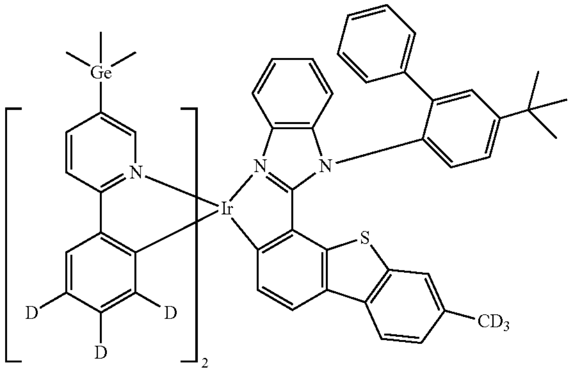
1705
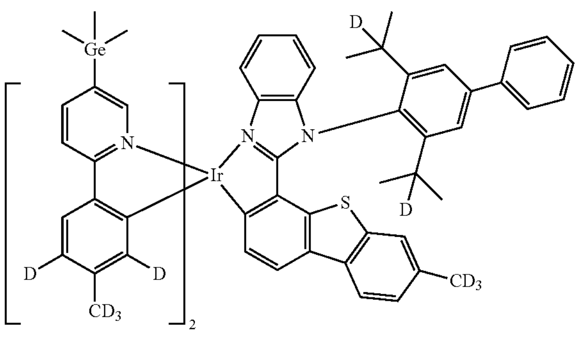
-continued
1706
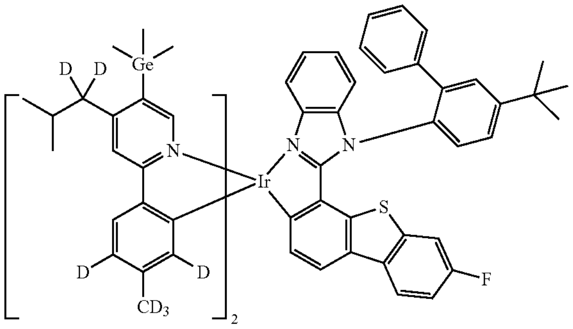
1707
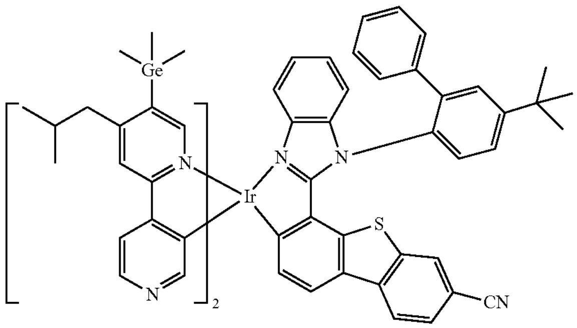
1708
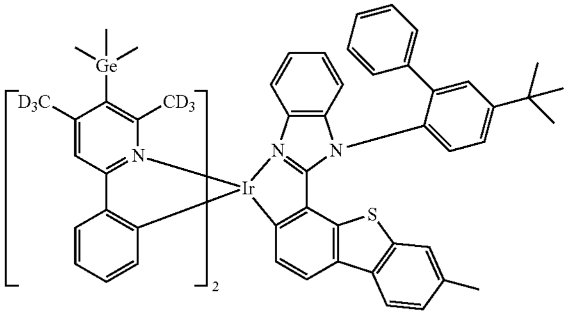
1709
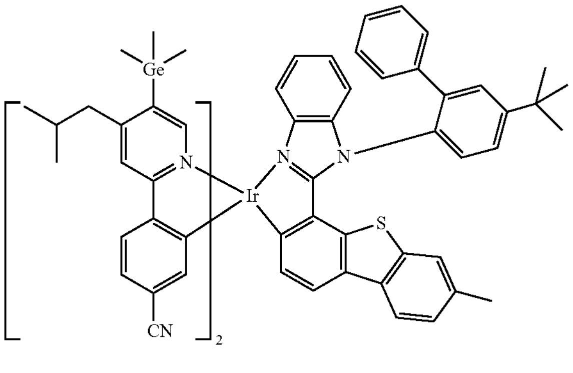

-continued
1710
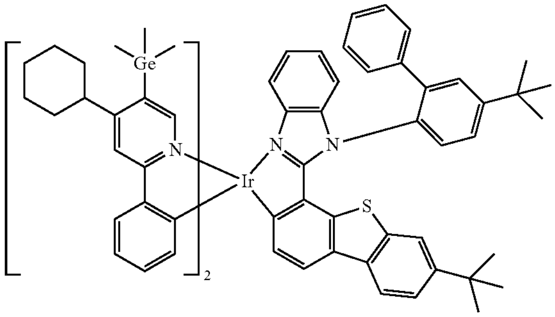
1711
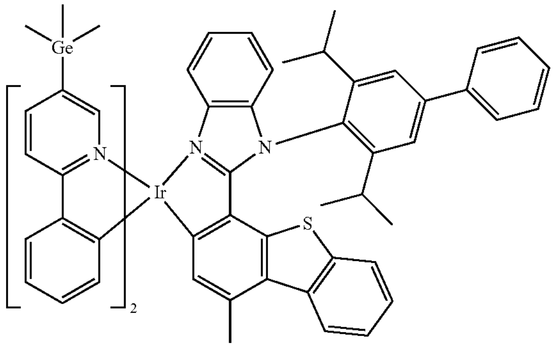
1712
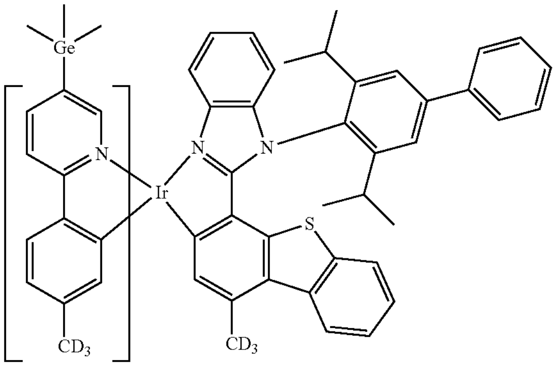
1713
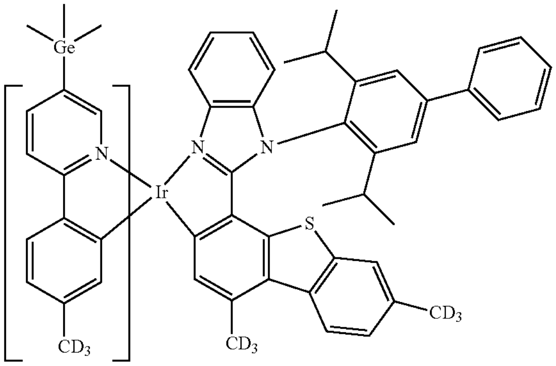
-continued
1714
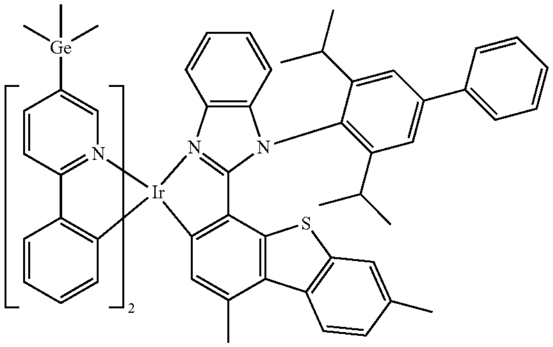
1715
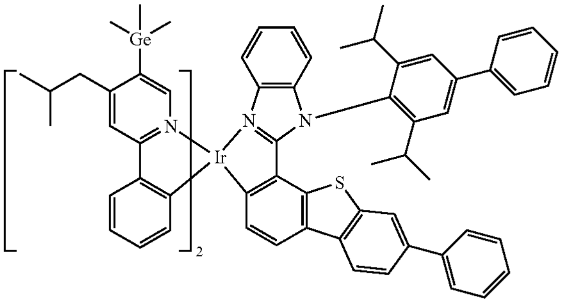
1716
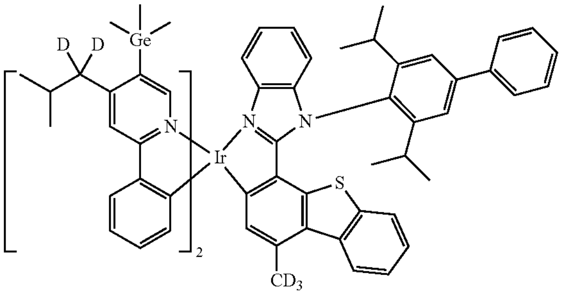
1717
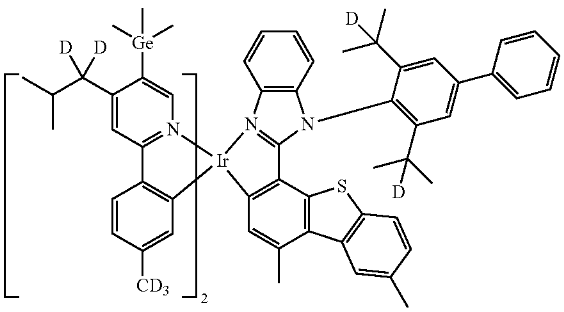

1718
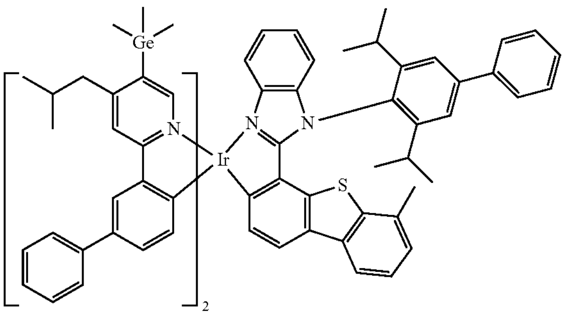
1719
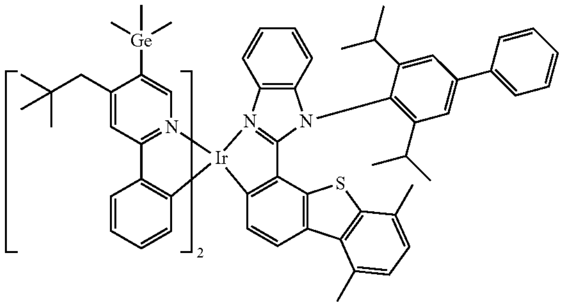
1720
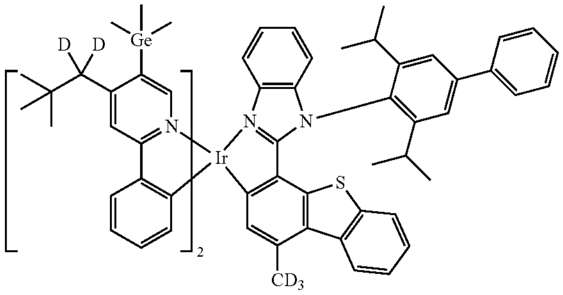
1721
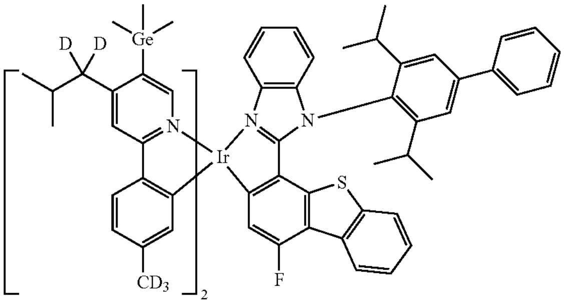
1722
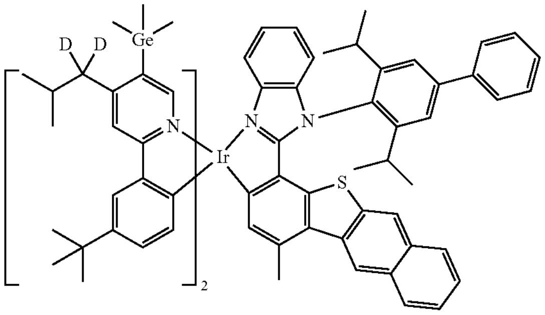
1723
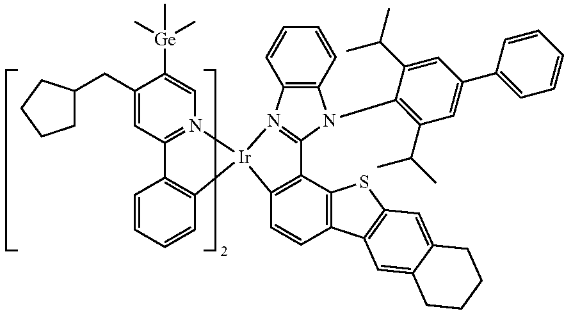
1724
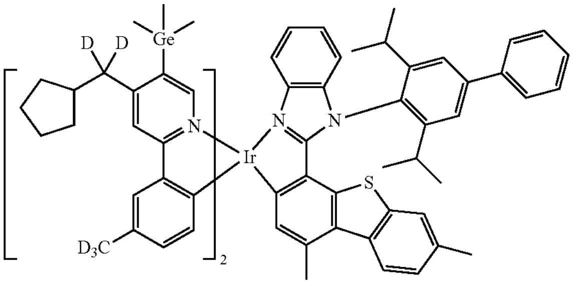
1725
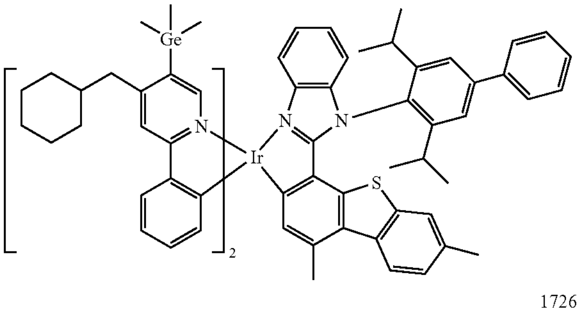
1726
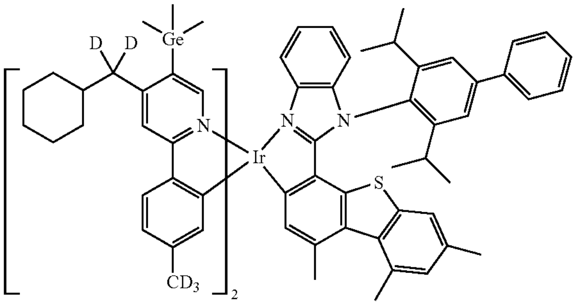

-continued
1727
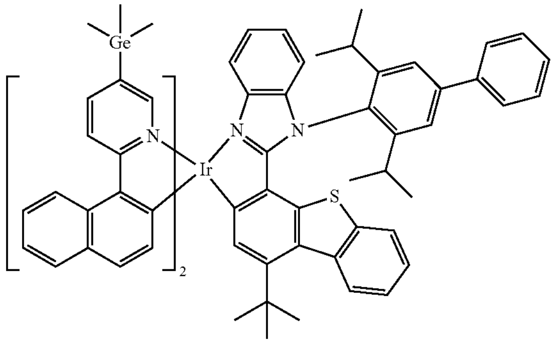
1728
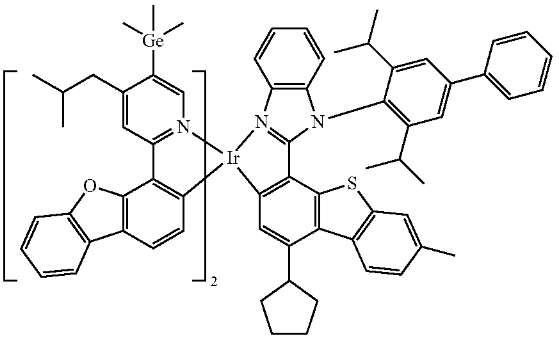
1729
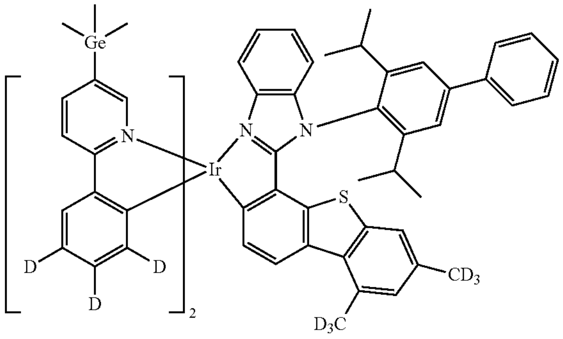
1730
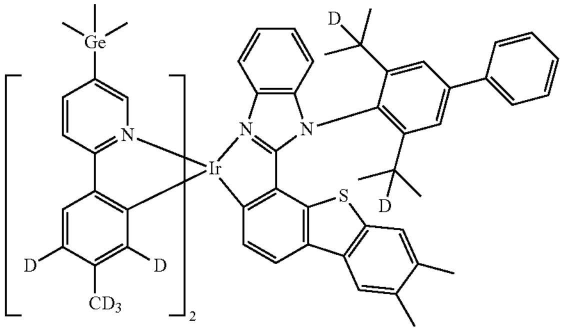
-continued
1731
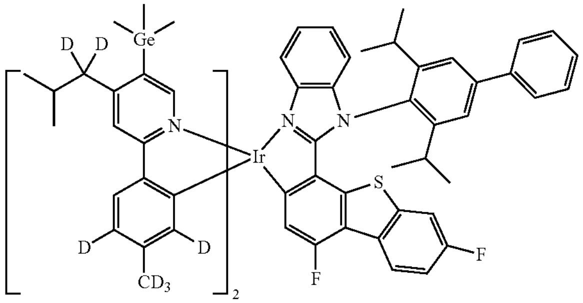
1732
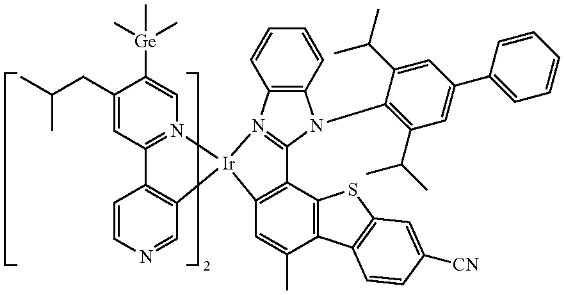
1733
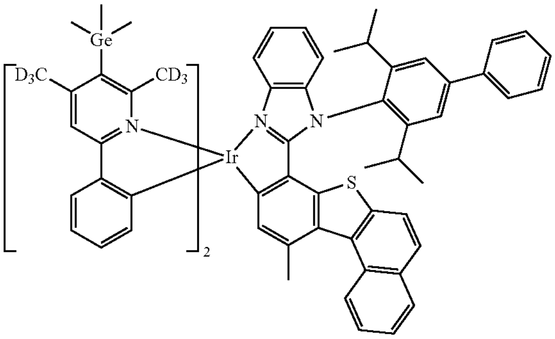
1734
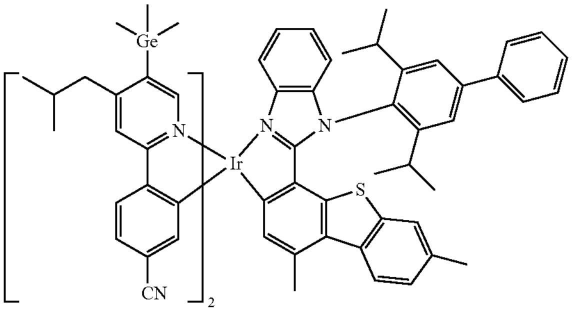

-continued
1735
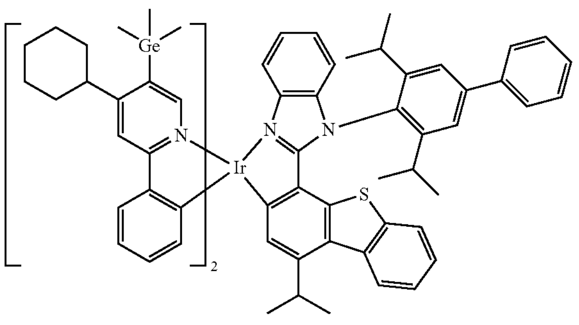
1736
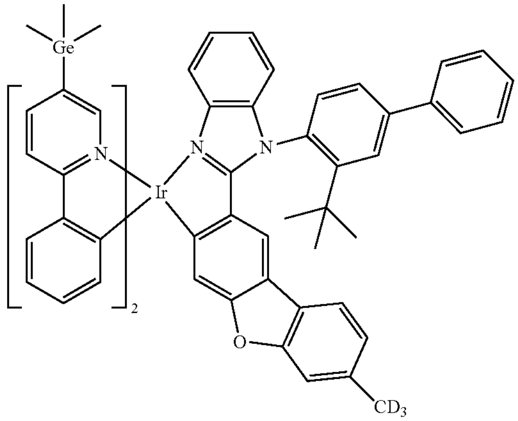
1737
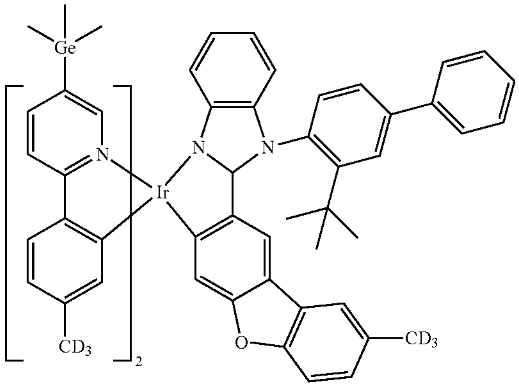
1738
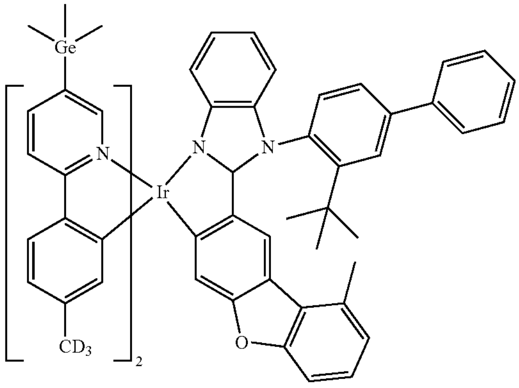
-continued
1739
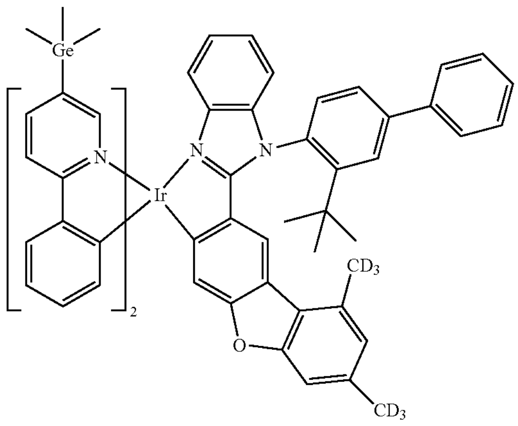
1740
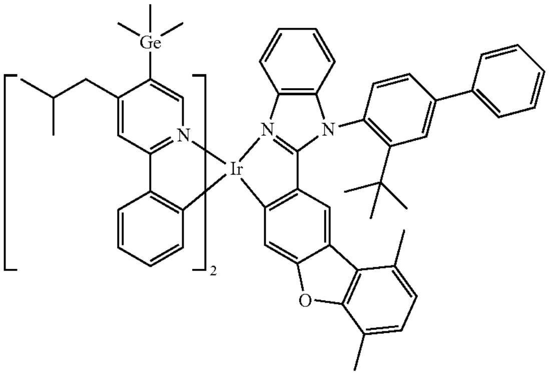
1741
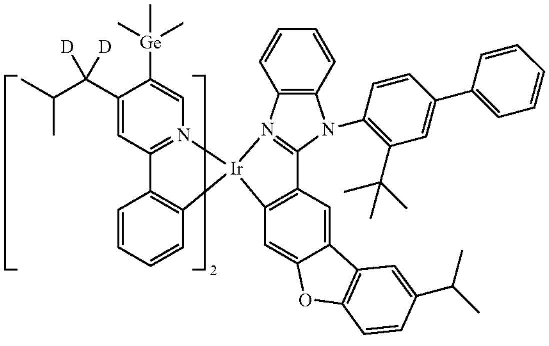
1742
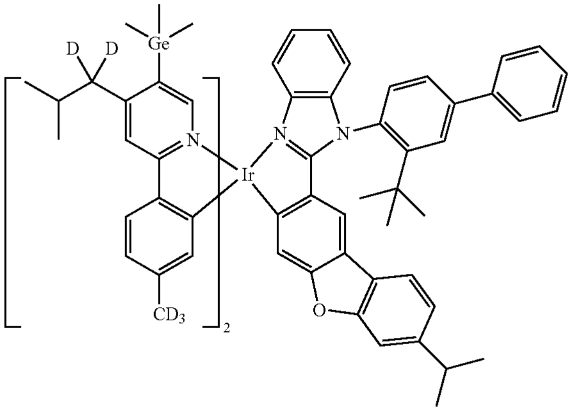

-continued
1743
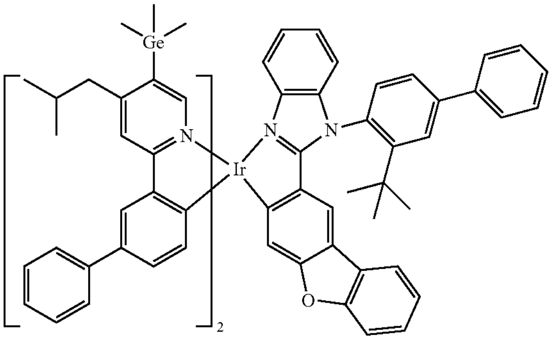
1744
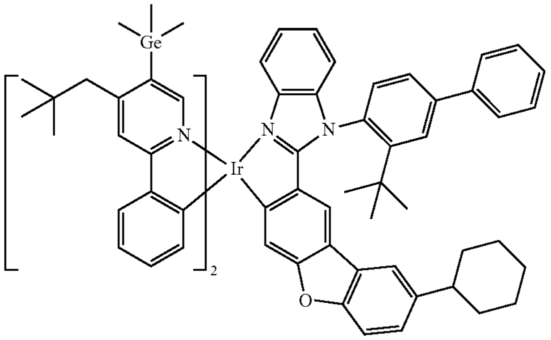
1745
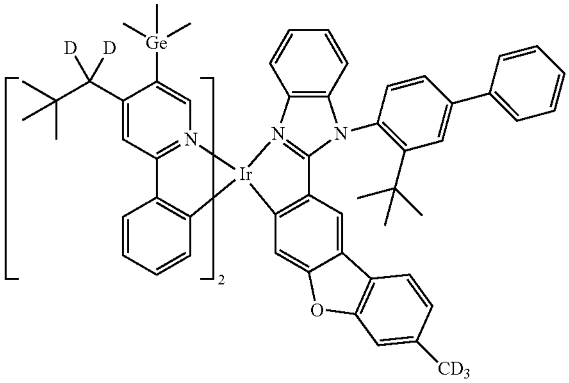
1746
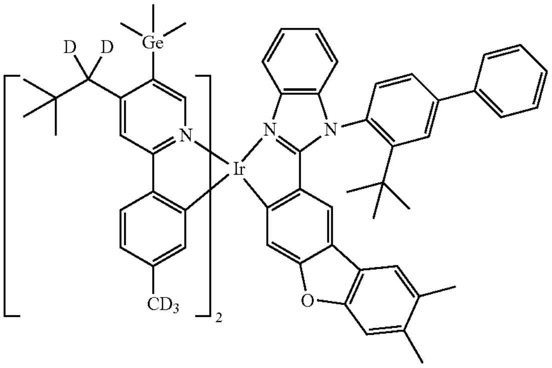
-continued
1747
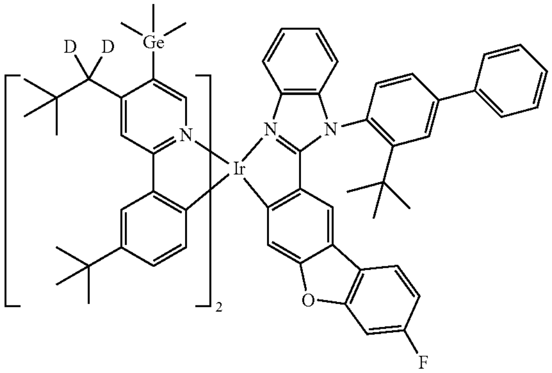
1748
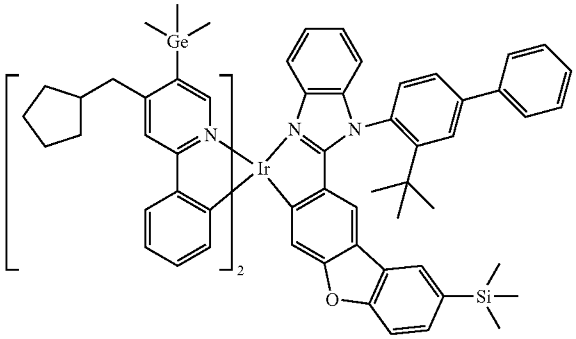
1749
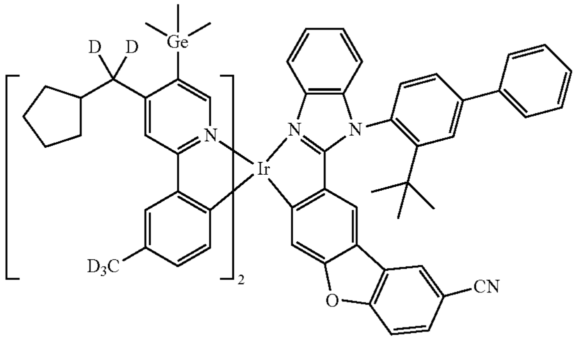
1750
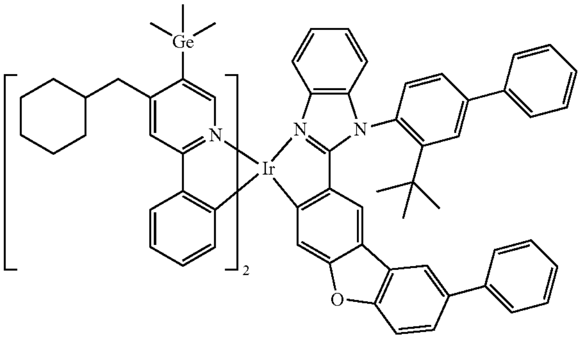

1751
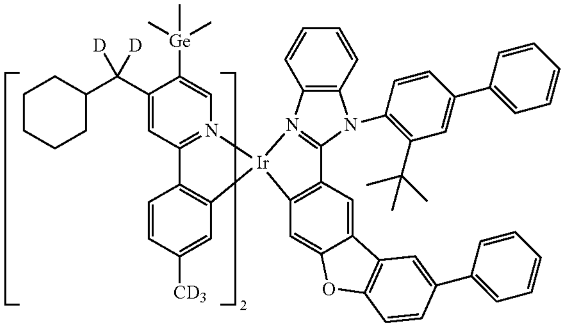
1752
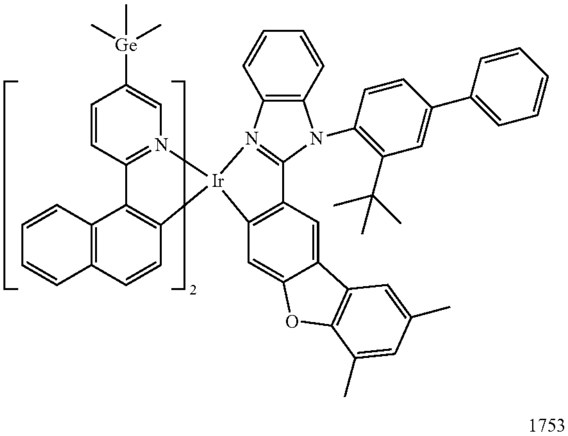
1753
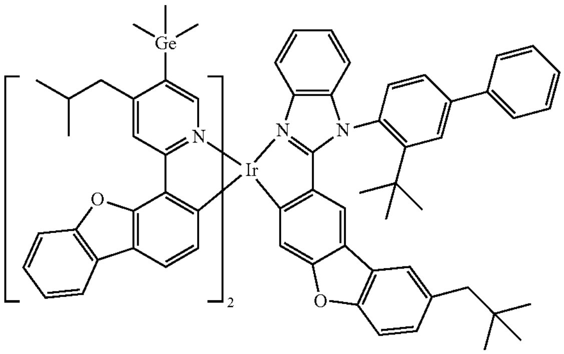
1754
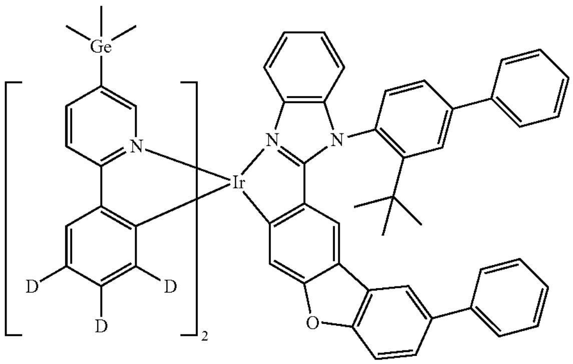
1755
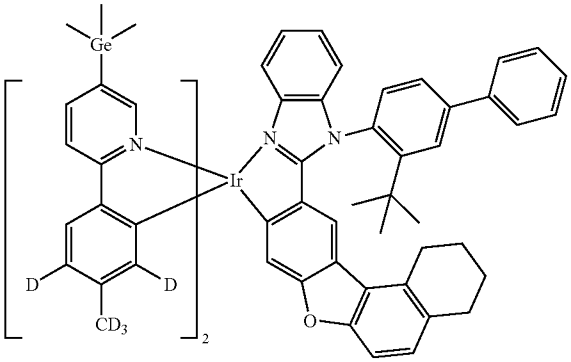
1756
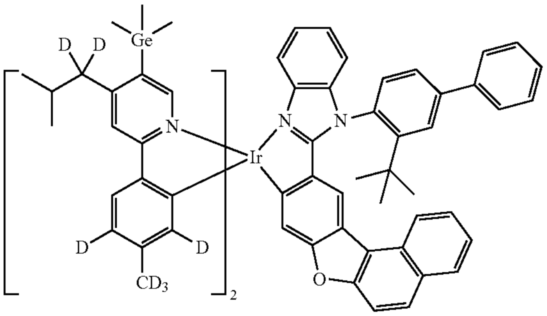
1757
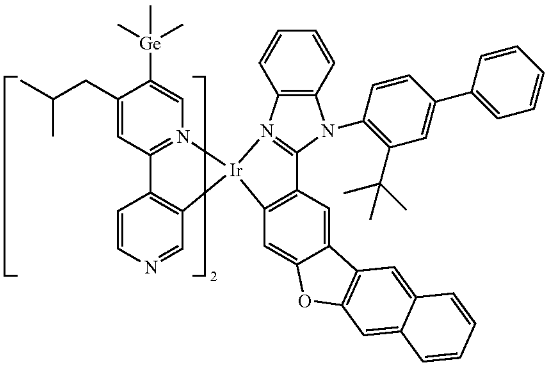
1758
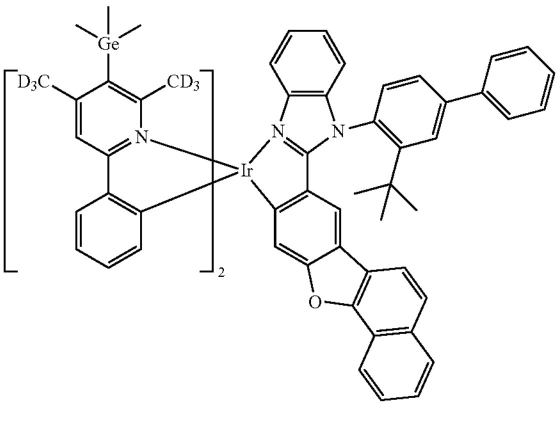

-continued
1759
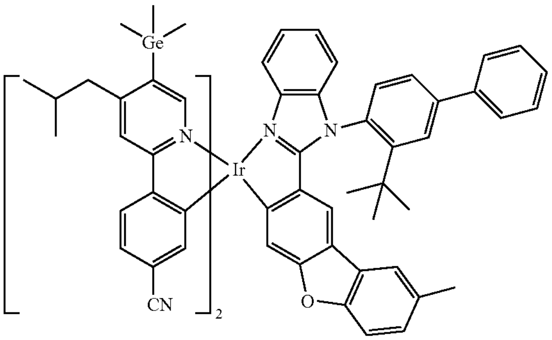
1760
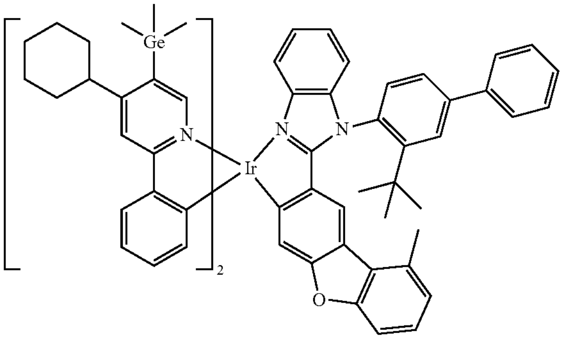
1761
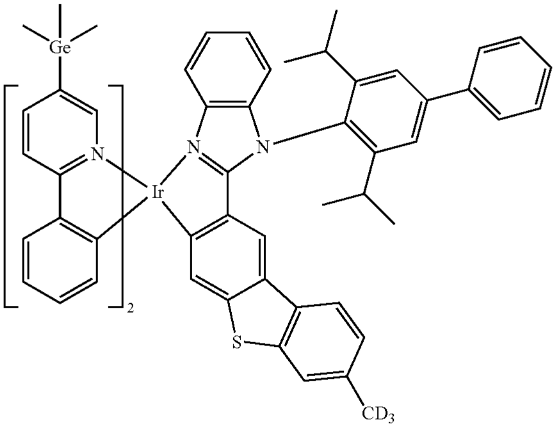
1762
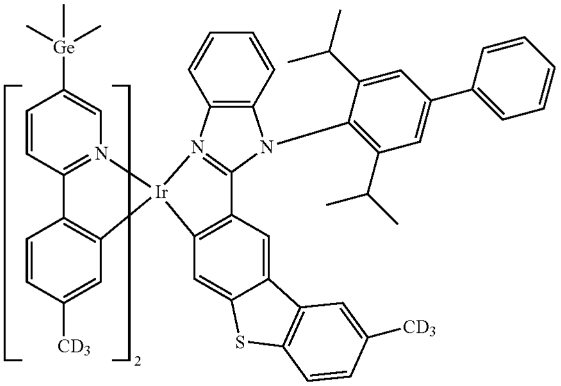
-continued
1763
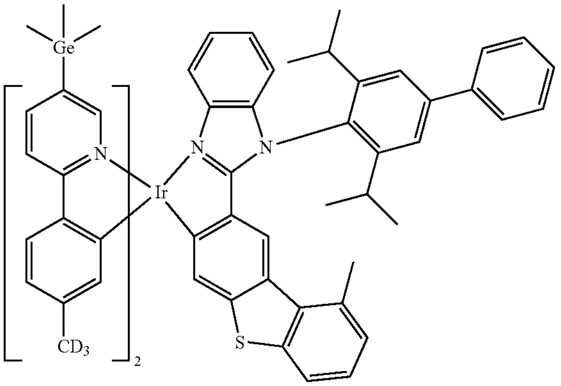
1764
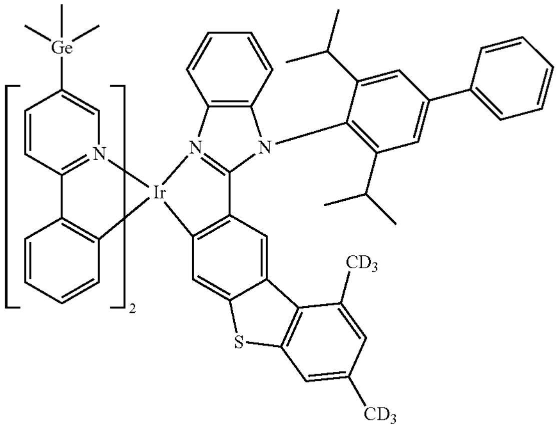
1765
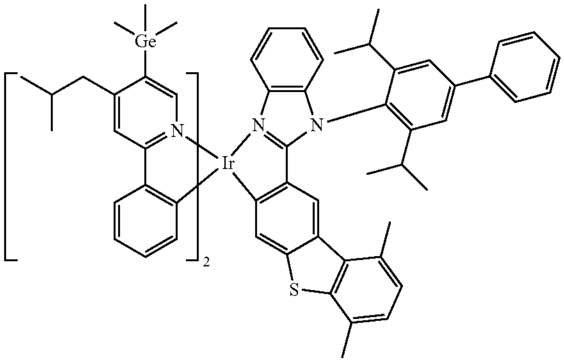
1766
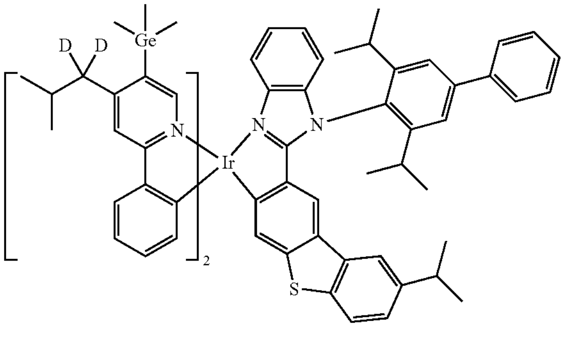

-continued
1767
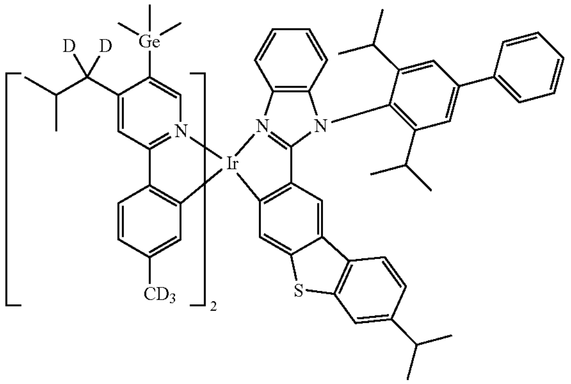
1768
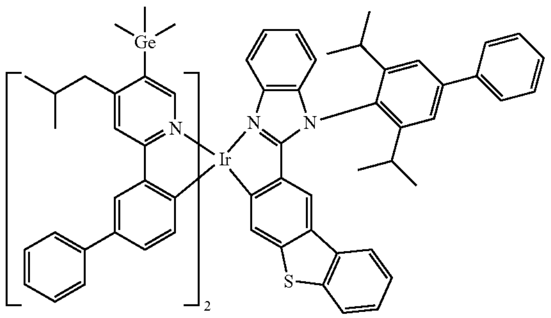
1769
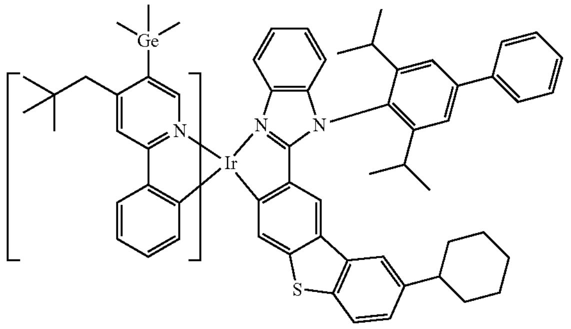
1770
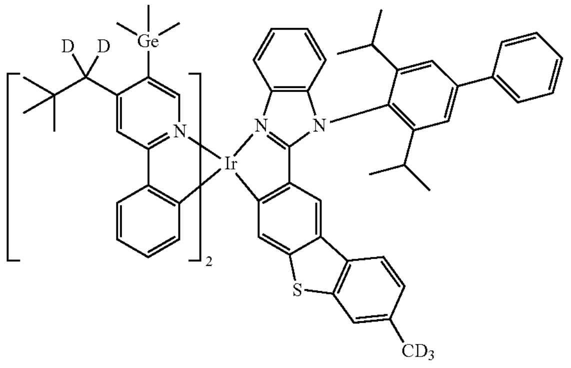
-continued
1771
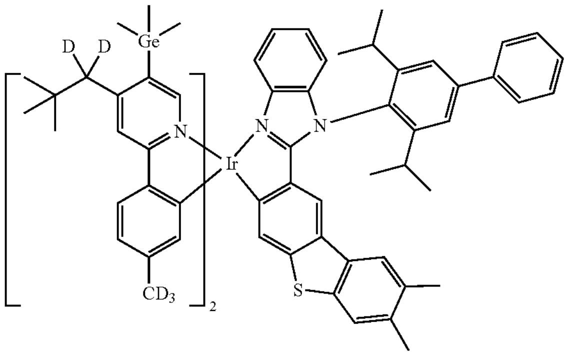
1772
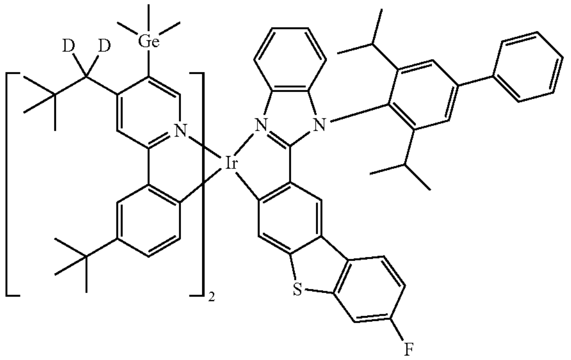
1773
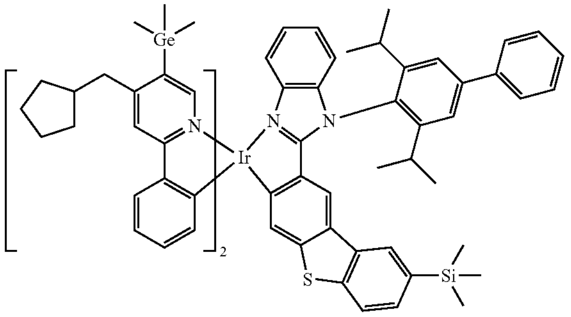
1774
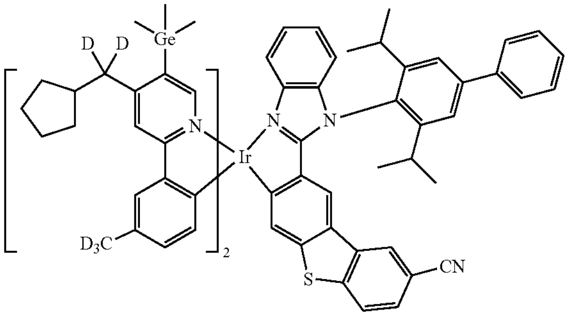

1775
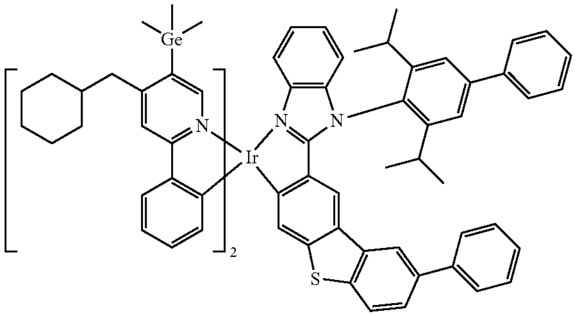
1776
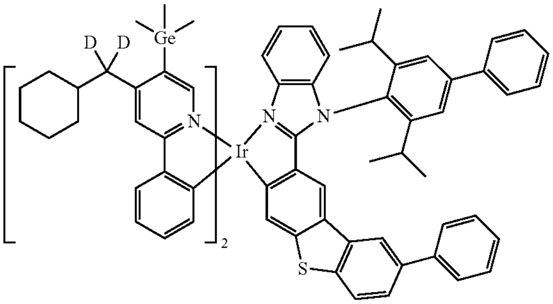
1777
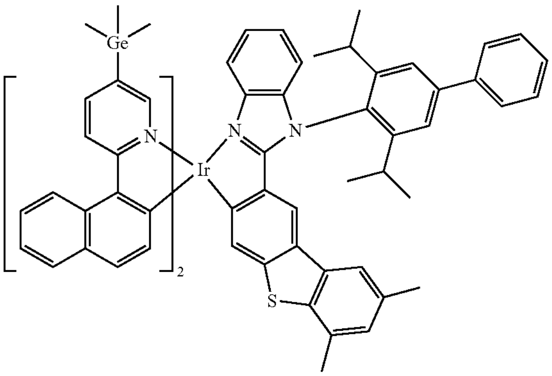
1778
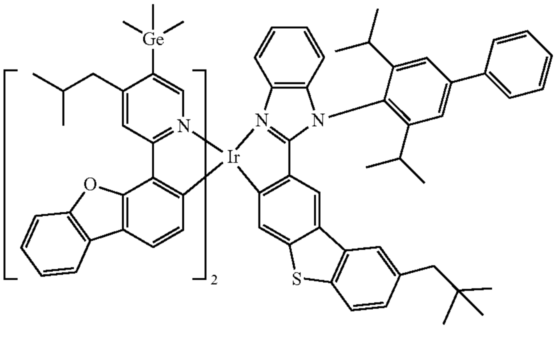
1779
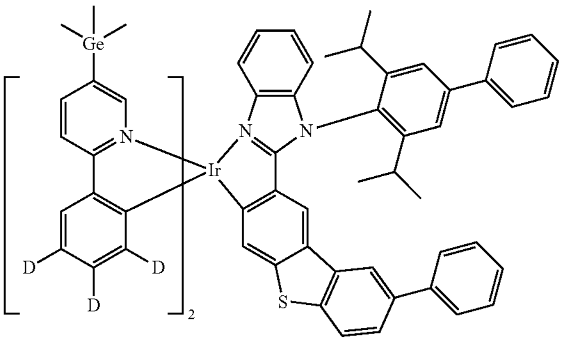
1780
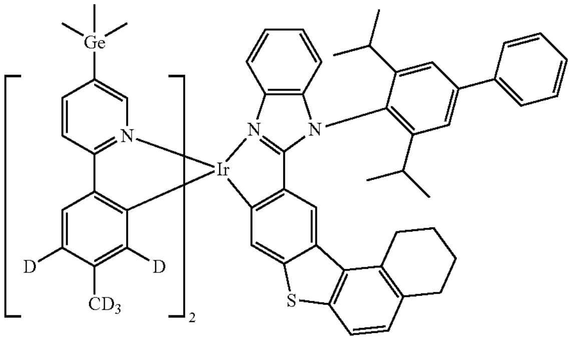
1781
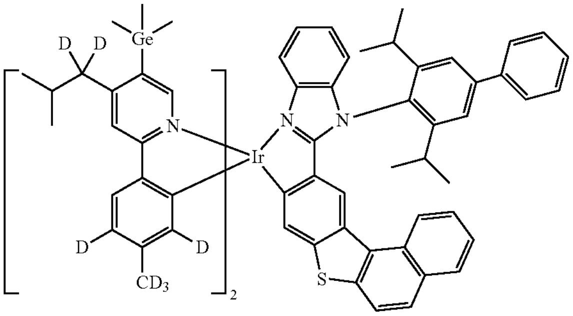
1782
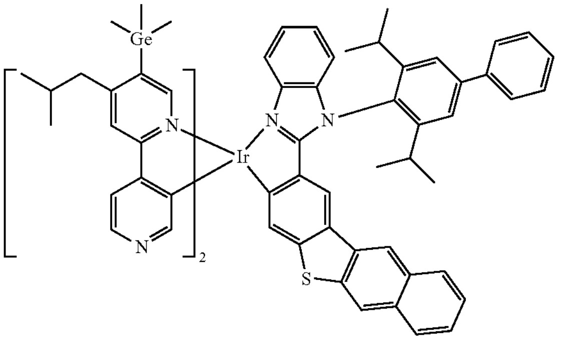

-continued
1783
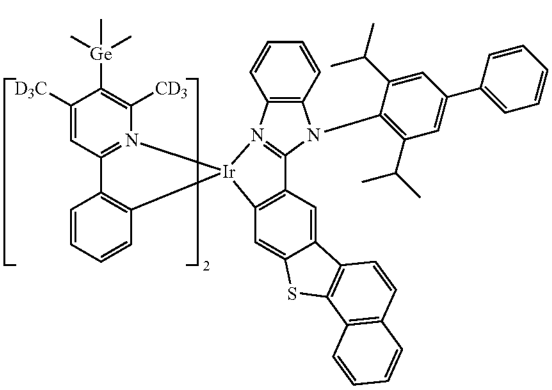
1784
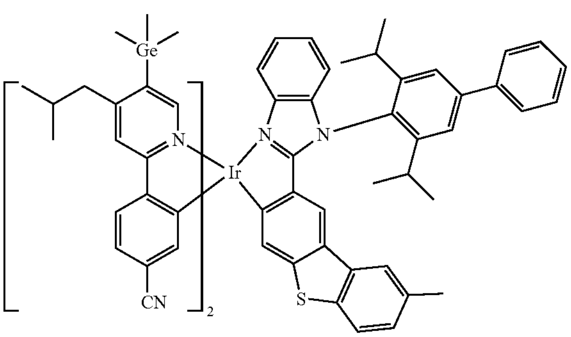
1785
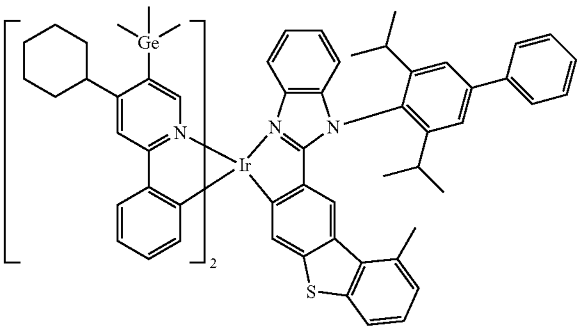
1786
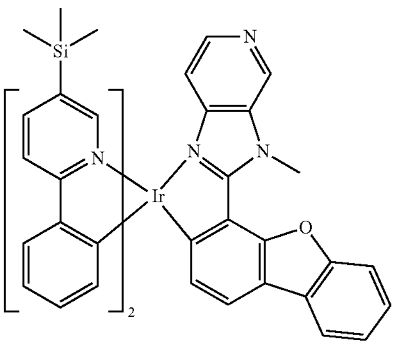
-continued
1787
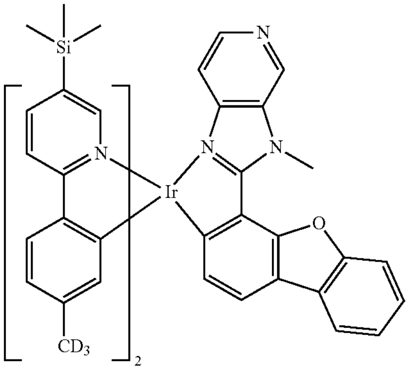
1788
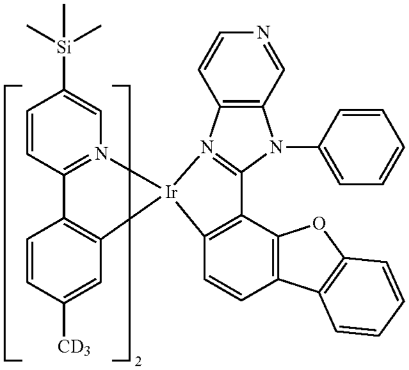
1789
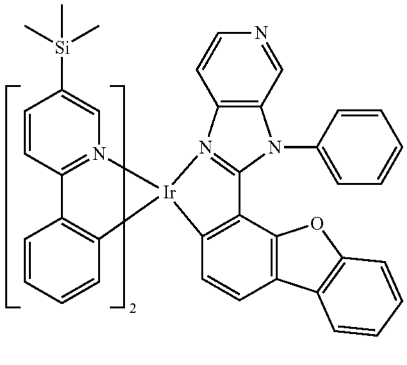
1790
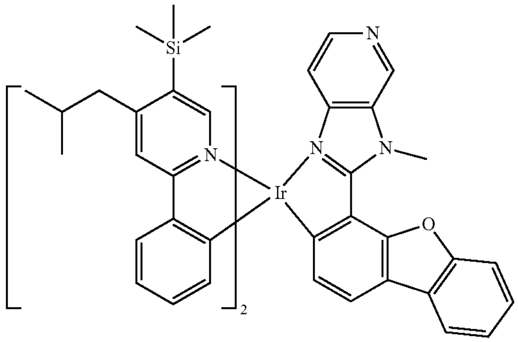

1791
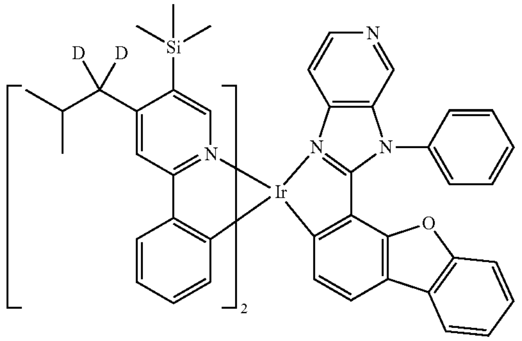
1792
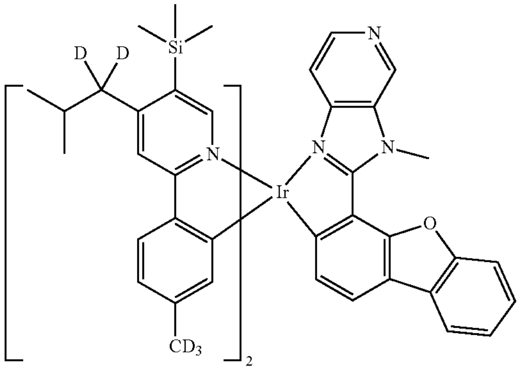
1793
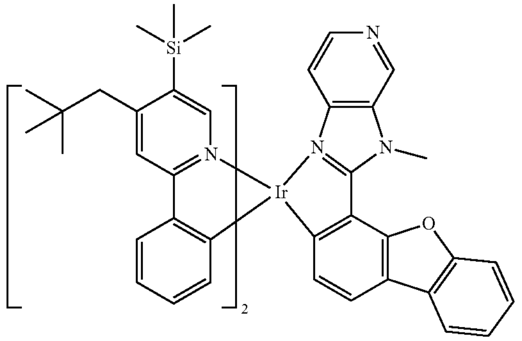
1794
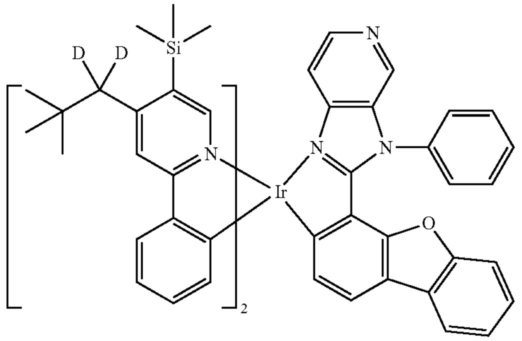
1795
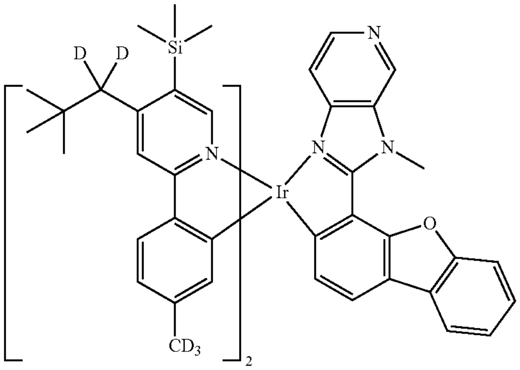
1796
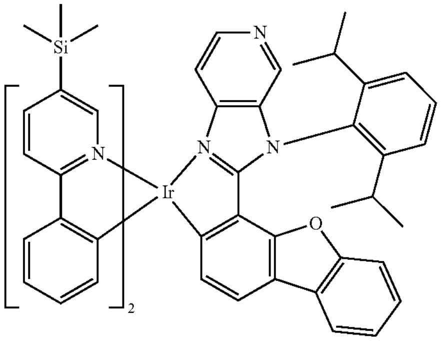
1797
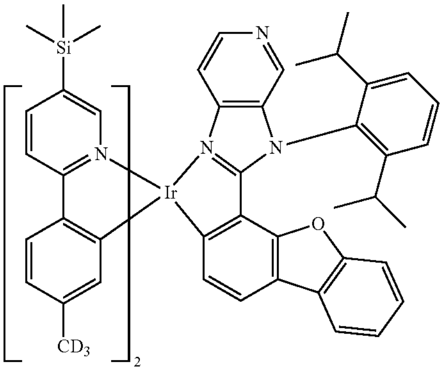
1798
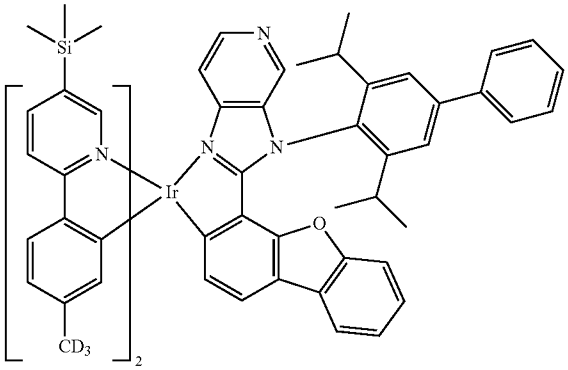

-continued
1799
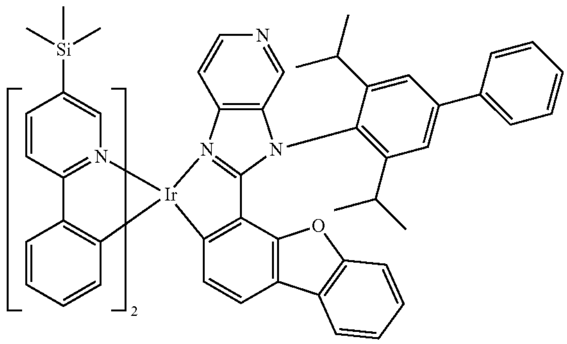
1800
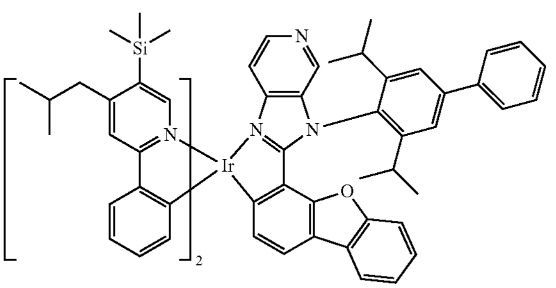
1801
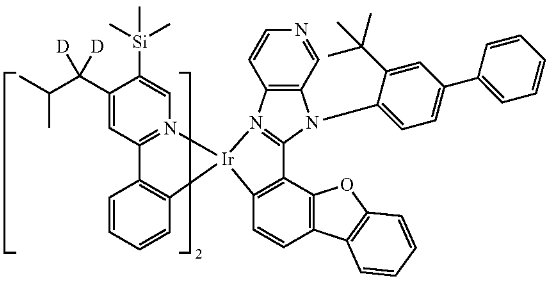
1802
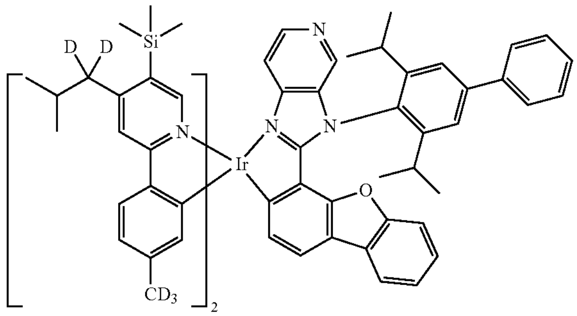
1803
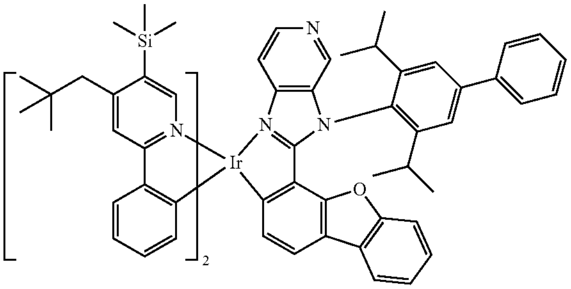
-continued
1804
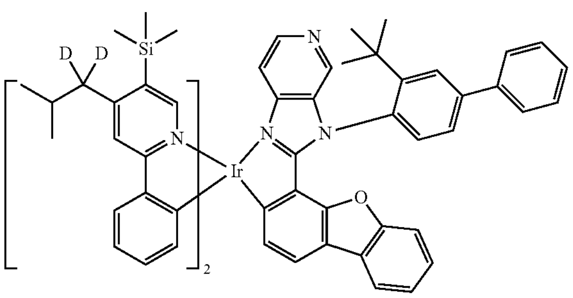
1805
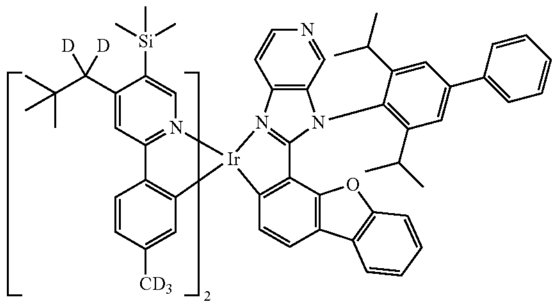
1806
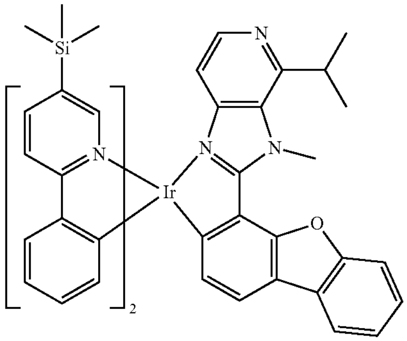
1807
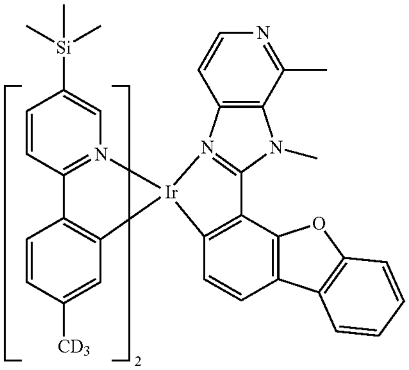

1808
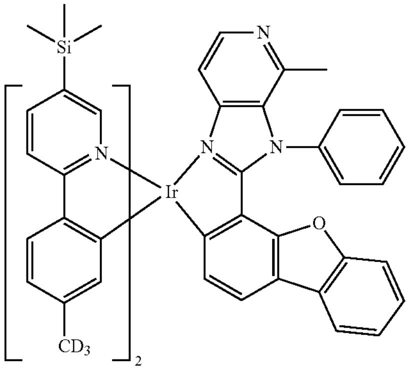
1809
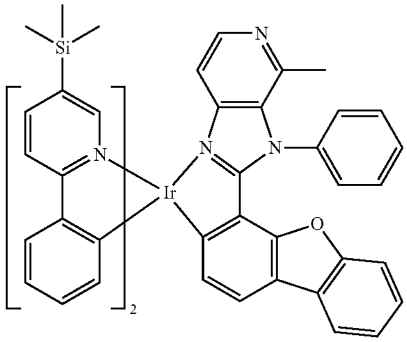
1810
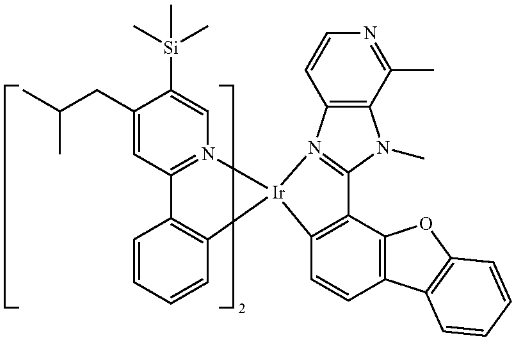
1811
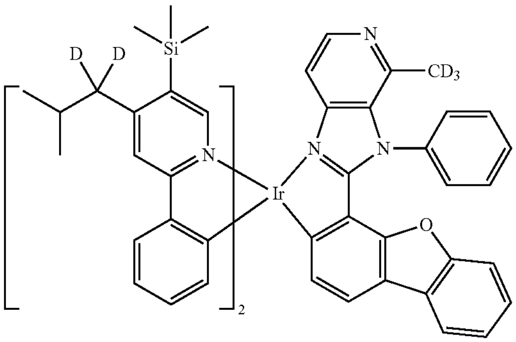
1812
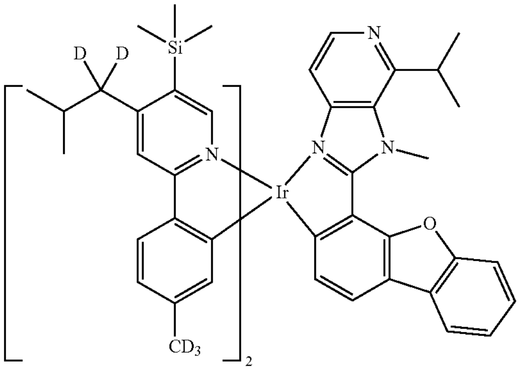
1813
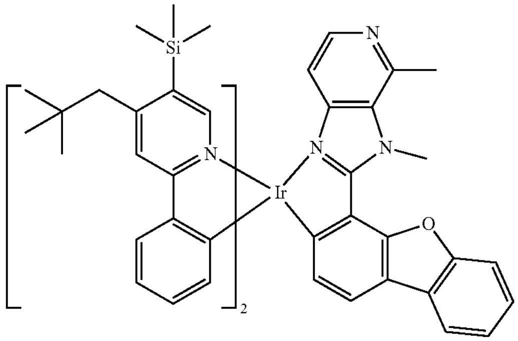
1814
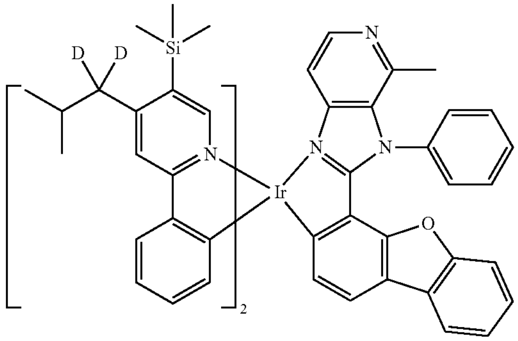
1815
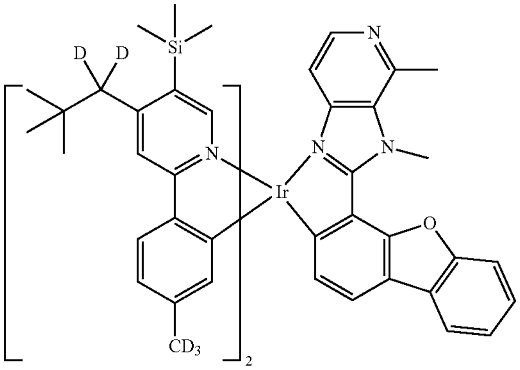

-continued
1816
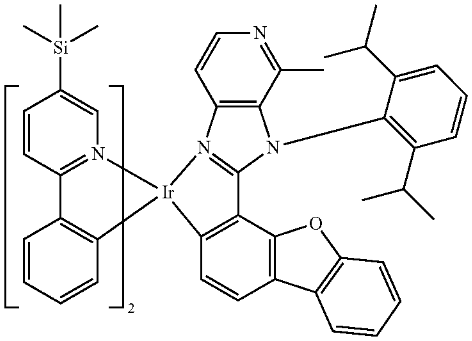
1817
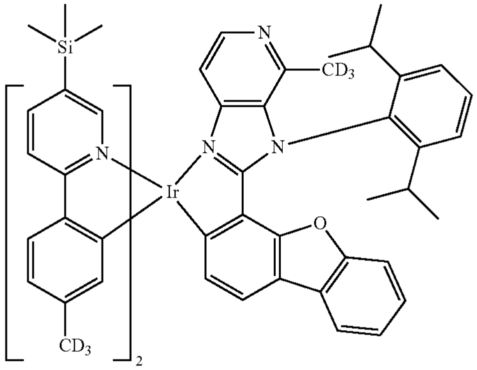
1818
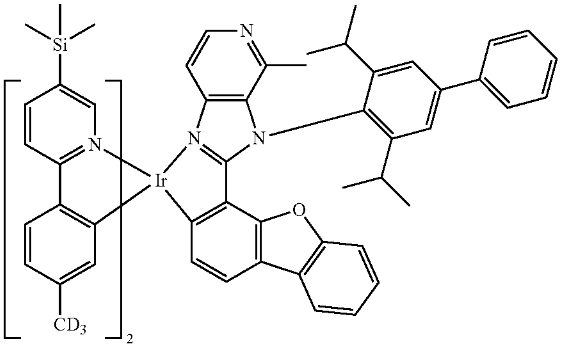
1819
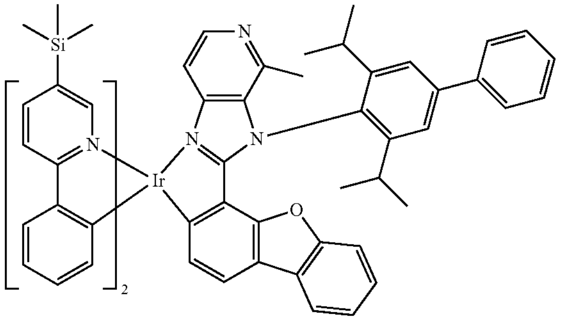
-continued
1820
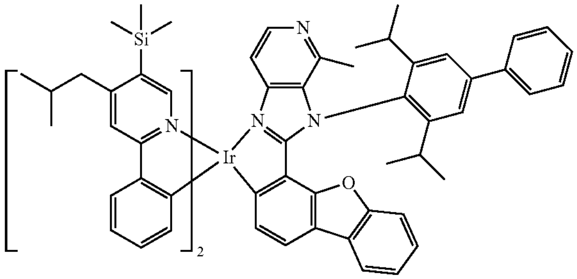
1821
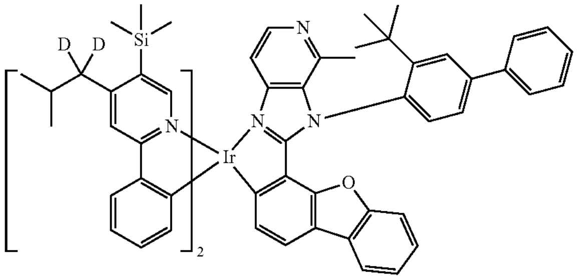
1822
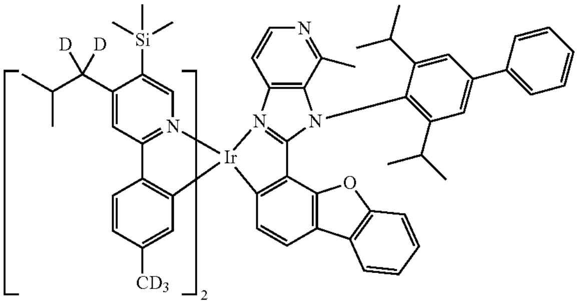
1823
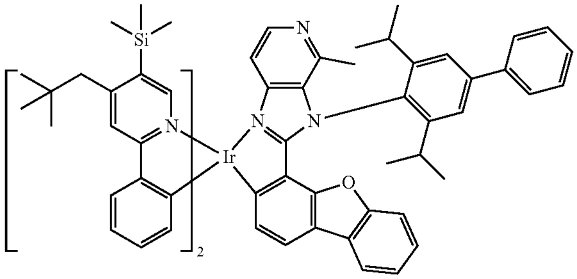
1824
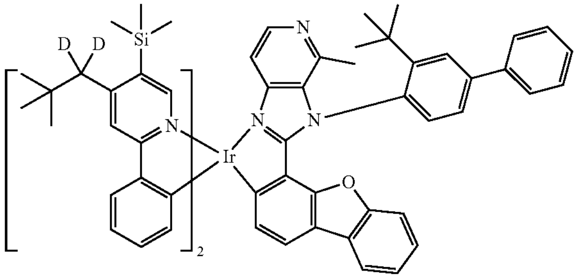

1825
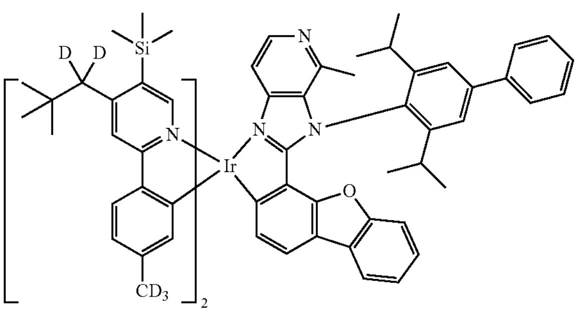
1826
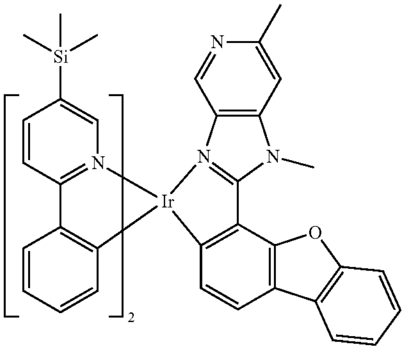
1827
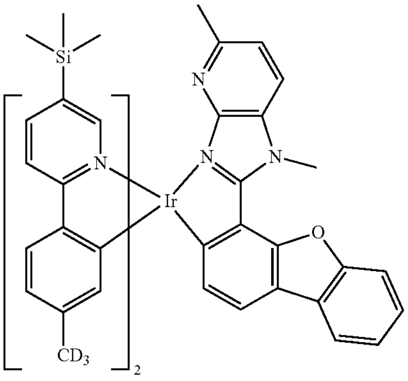
1828
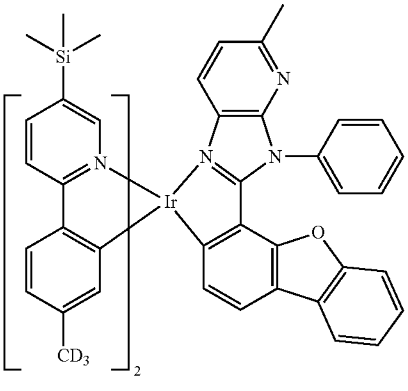
1829
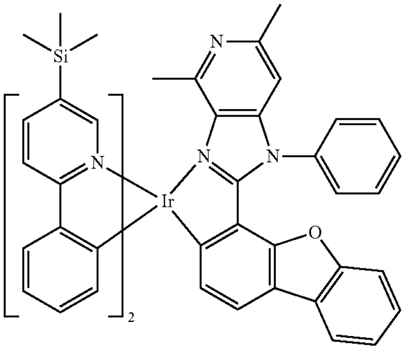
1830
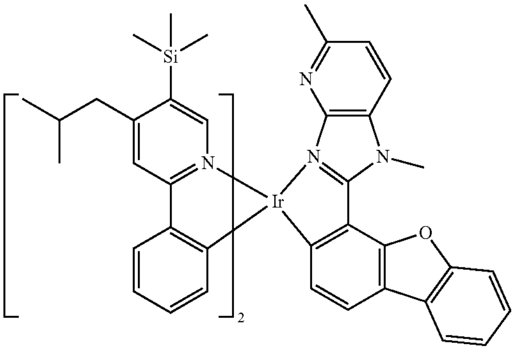
1831
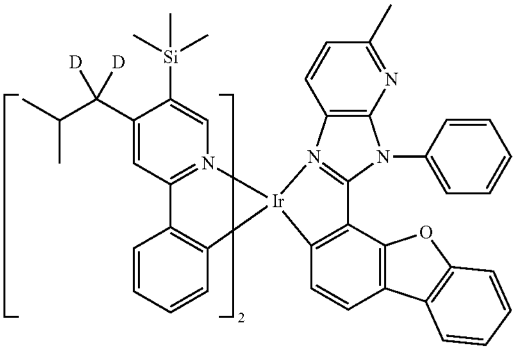
1832
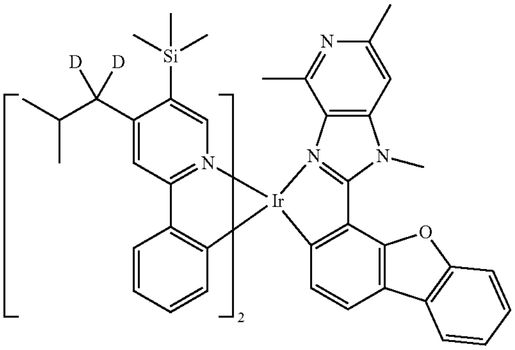

-continued
1833
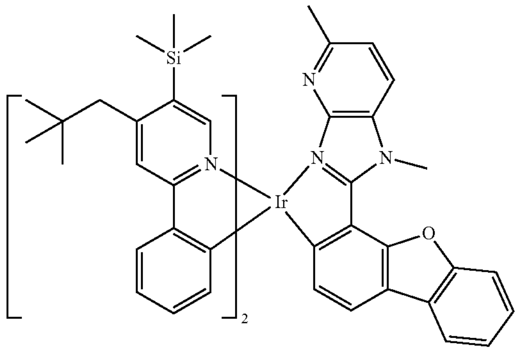
1834
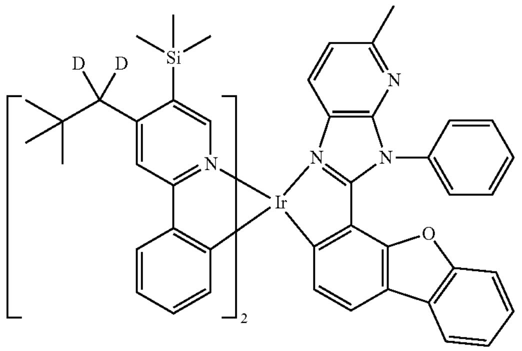
1835
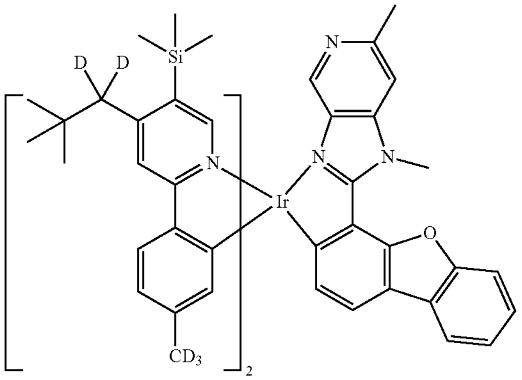
1836
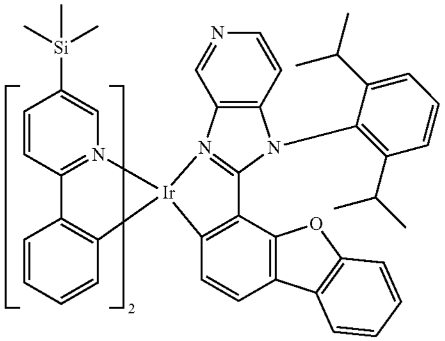
-continued
1837
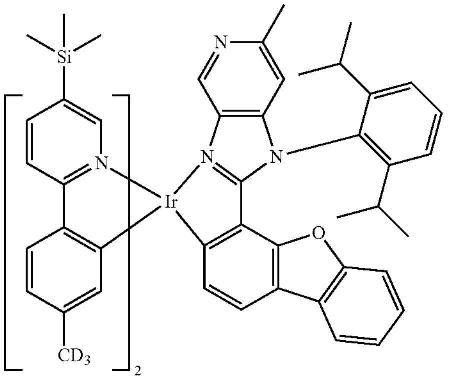
1838
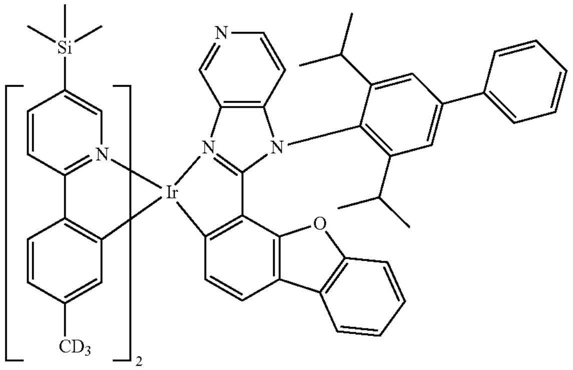
1839
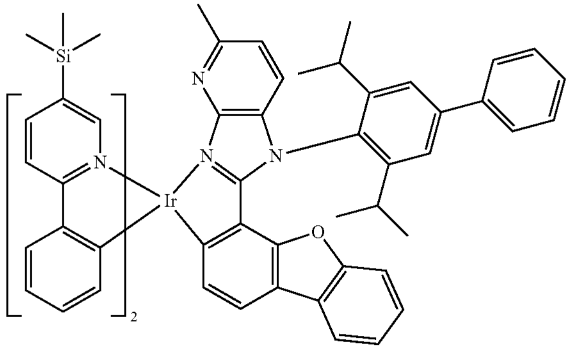
1840
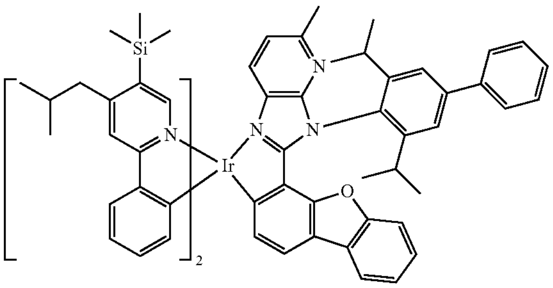

-continued
1841
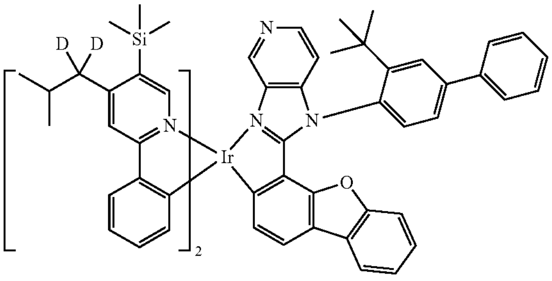
1842
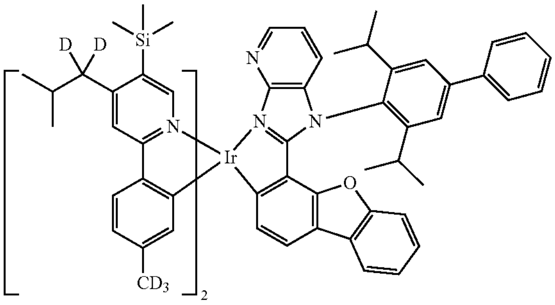
1843
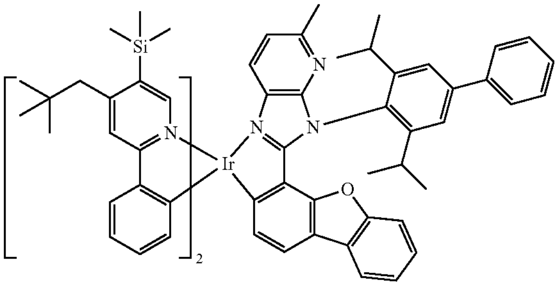
1844
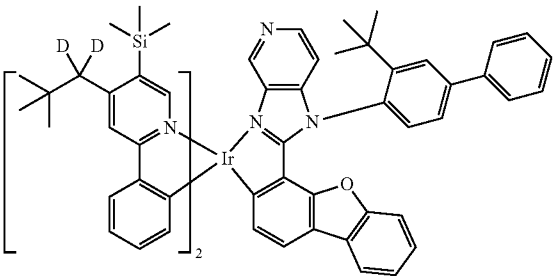
1845
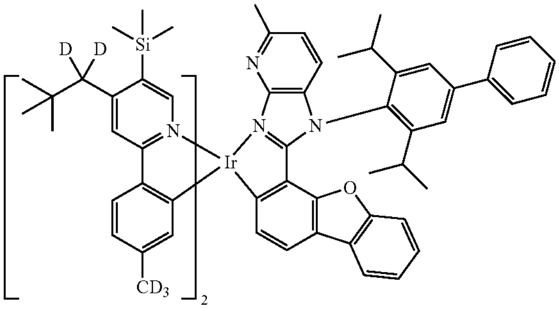
1846
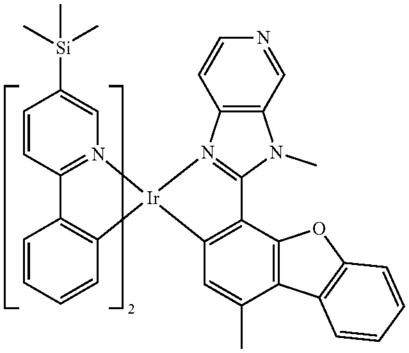
1847
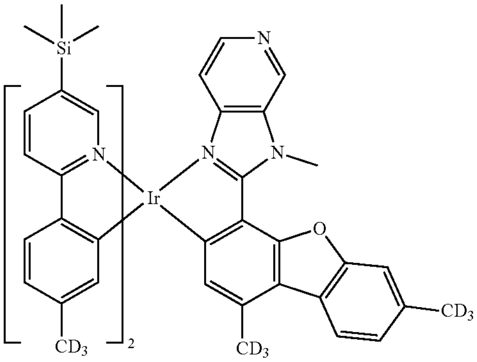
1848
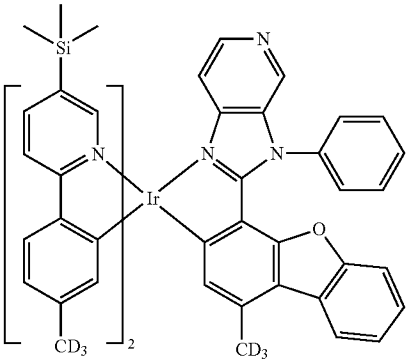
1849
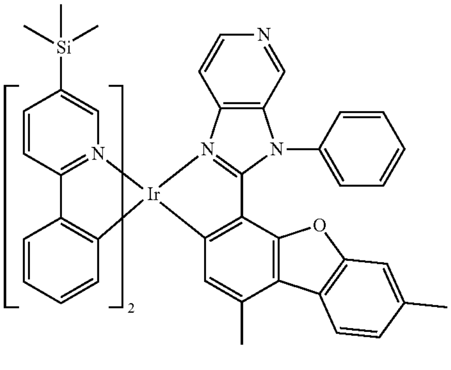

1850
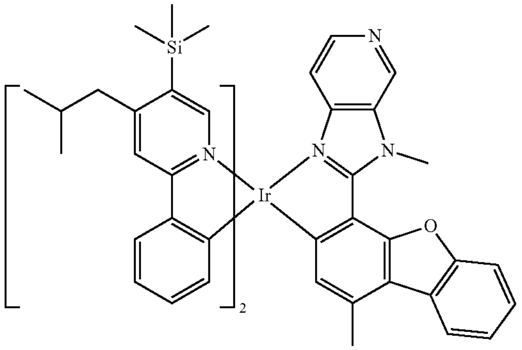
1851
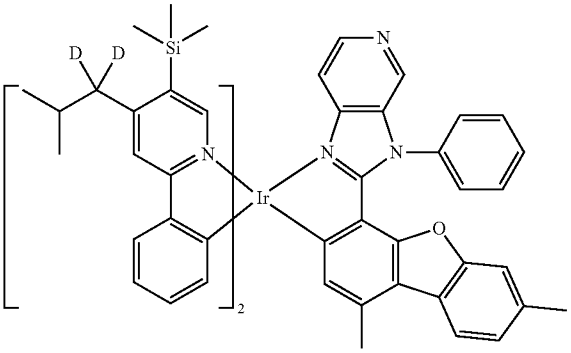
1852
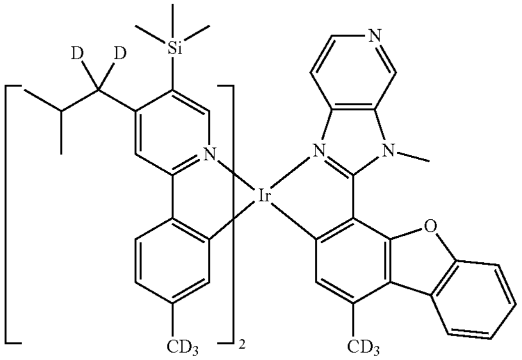
1853
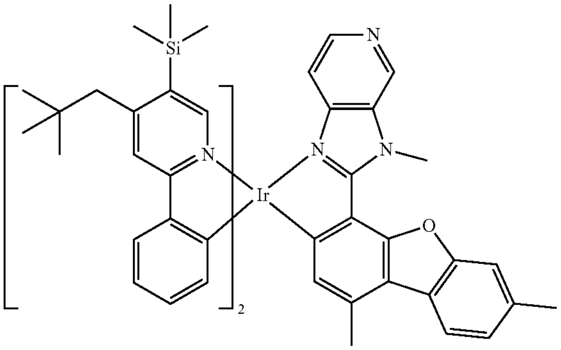
1854
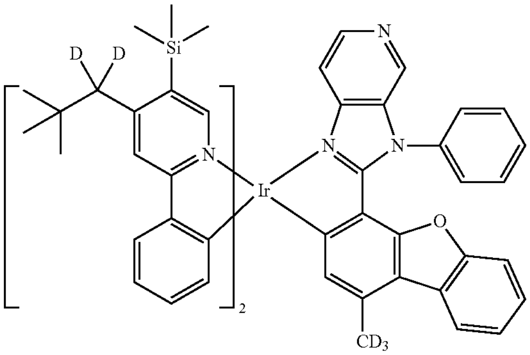
1855
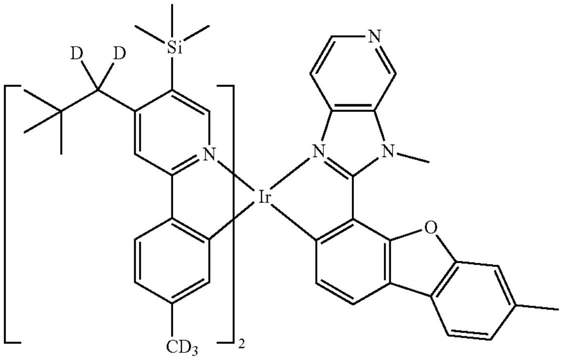
1856
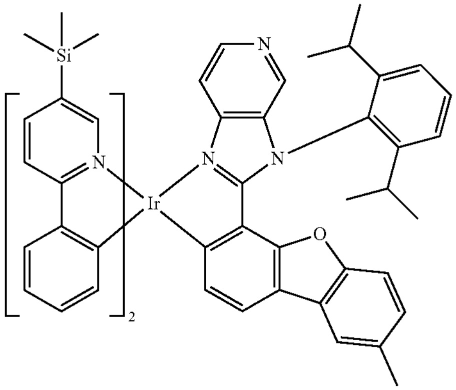
1857
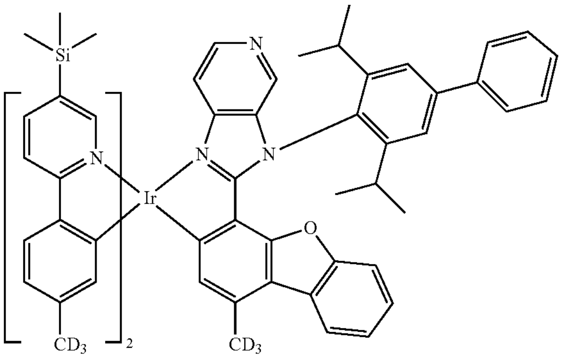

-continued
1858
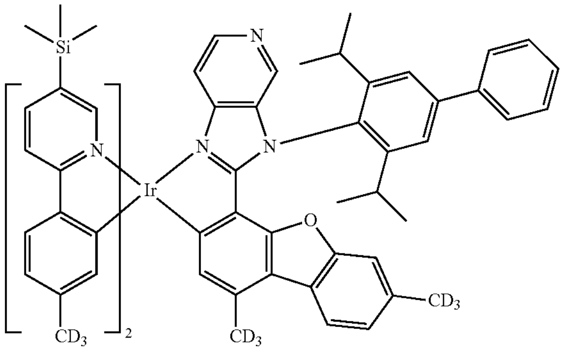
1859
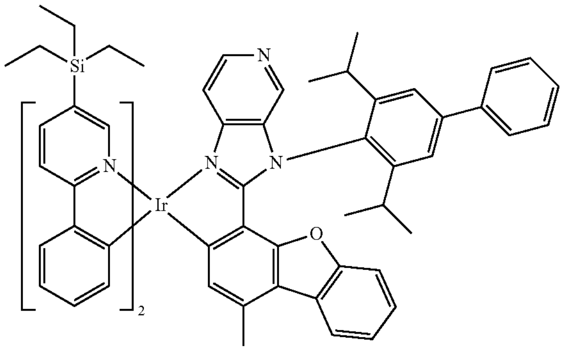
1860
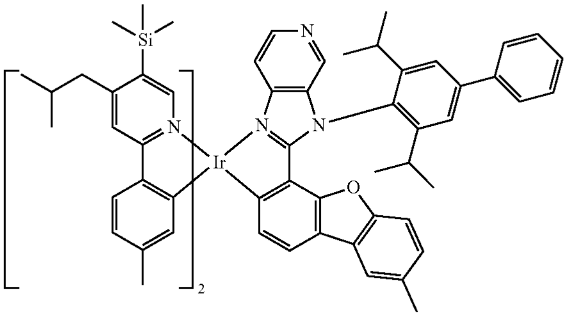
1861
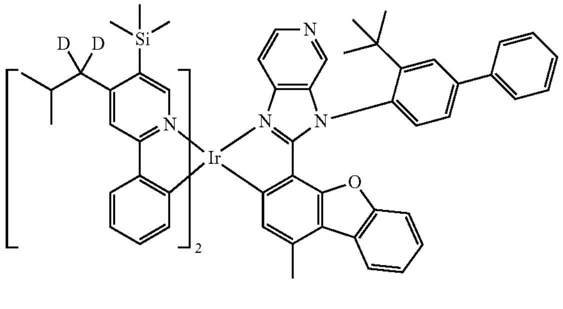
-continued
1862
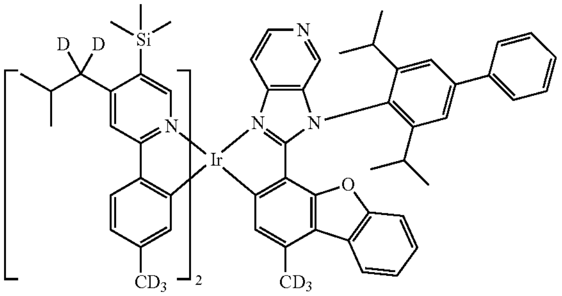
1863
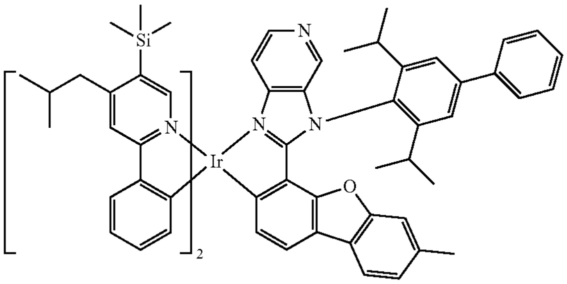
1864
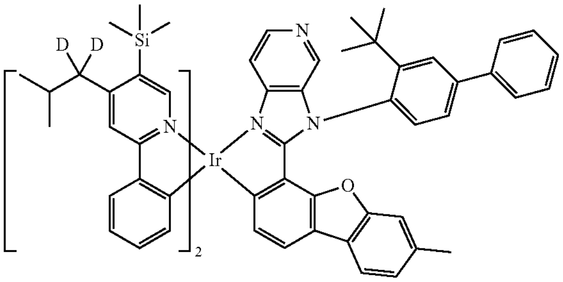
1865
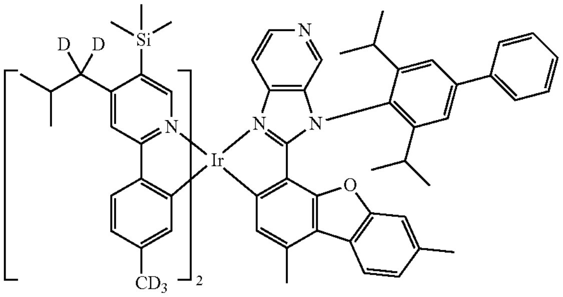
1866
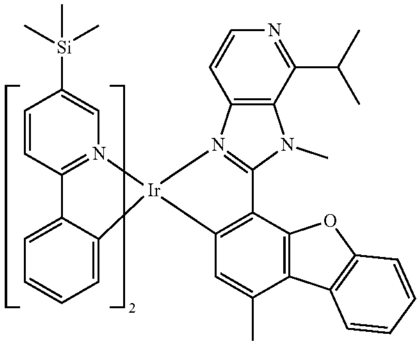

-continued
1867
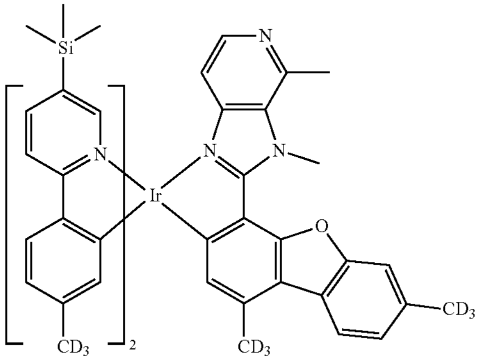
1868
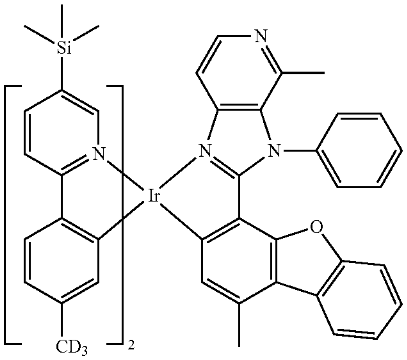
1869
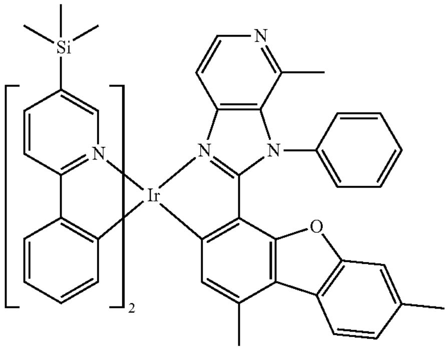
1870
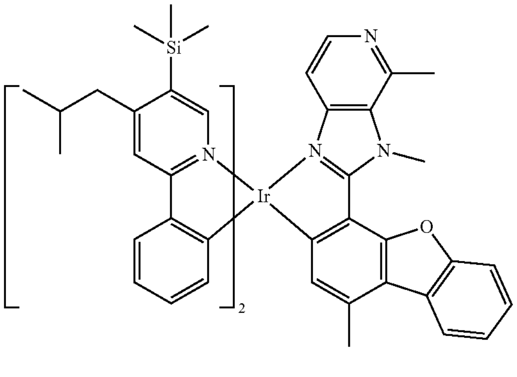
-continued
1871
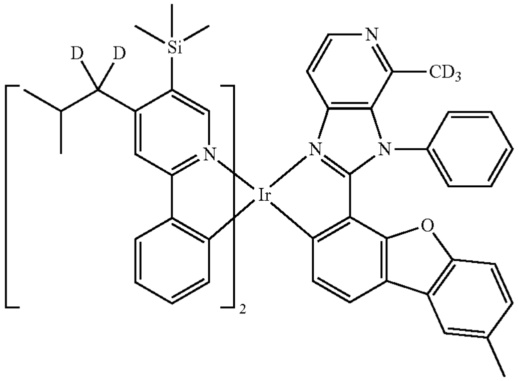
1872
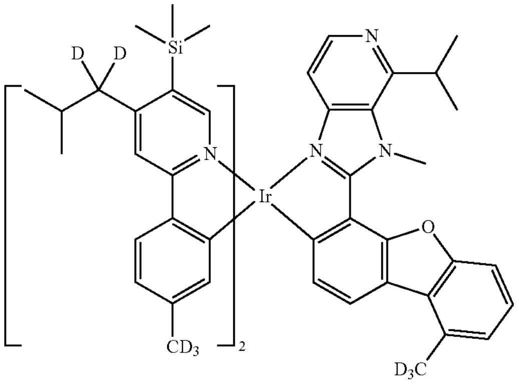
1873
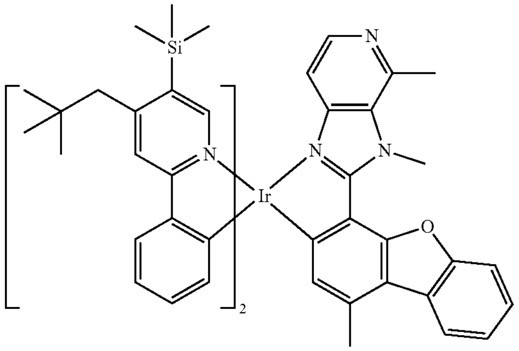
1874
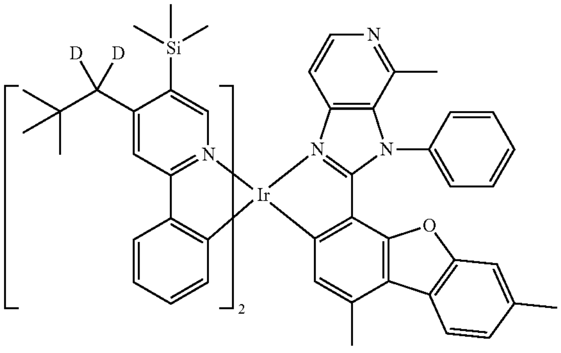

-continued
1875
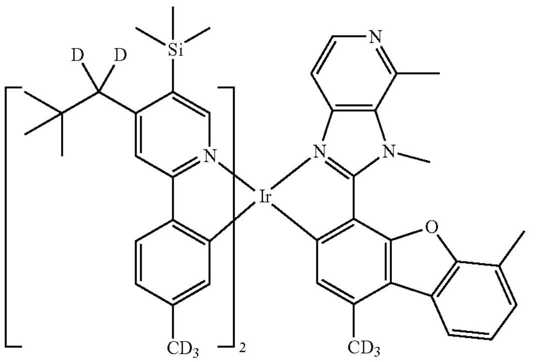
1876
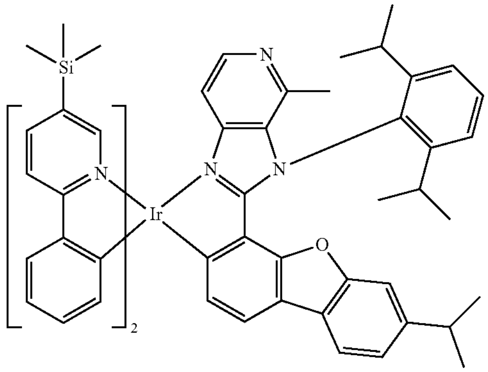
1877
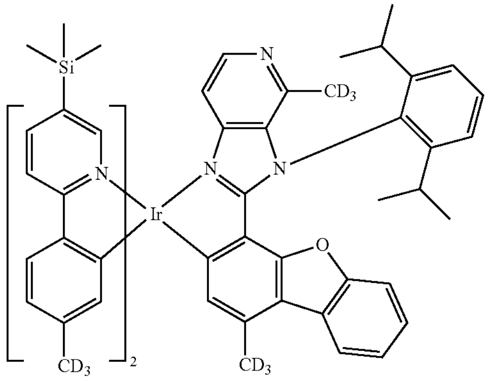
1878
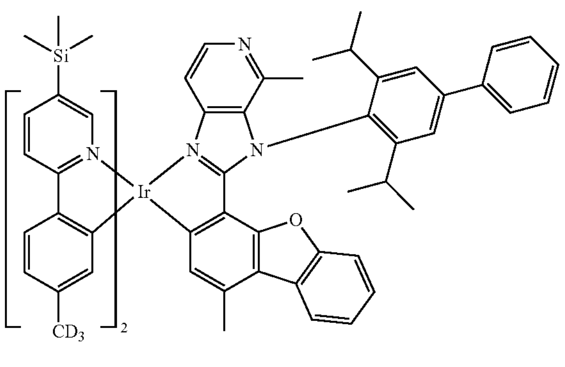
-continued
1879
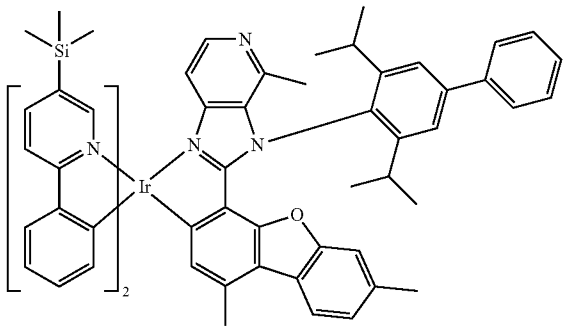
1880
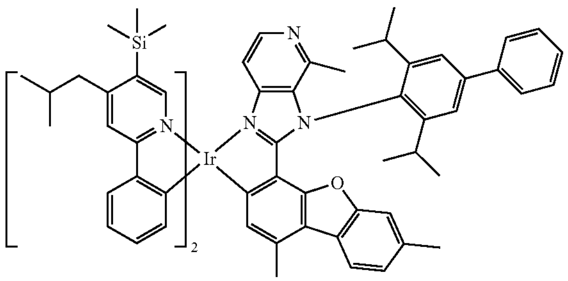
1881
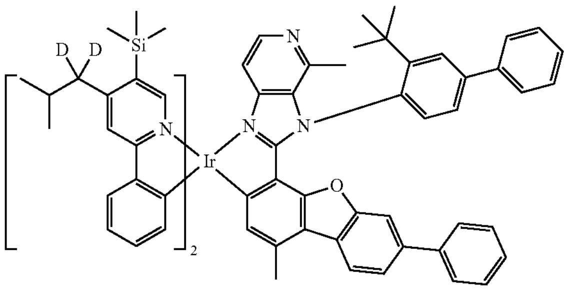
1882
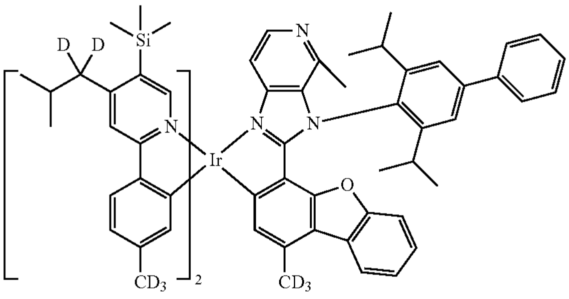
1883
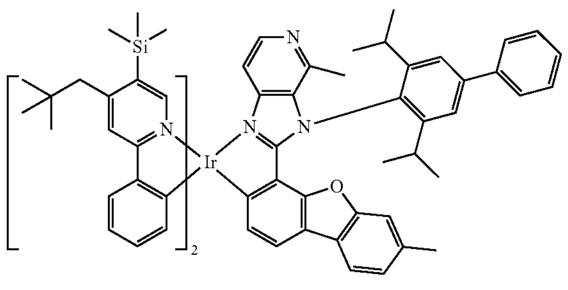

-continued
1884
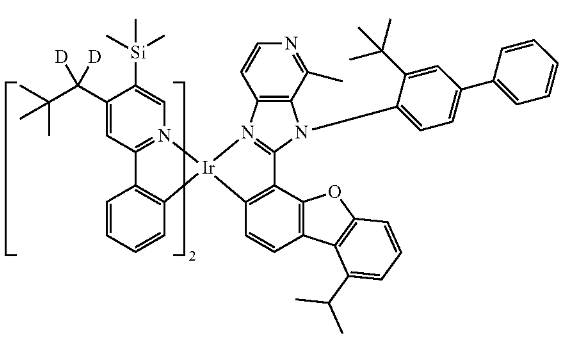
1885
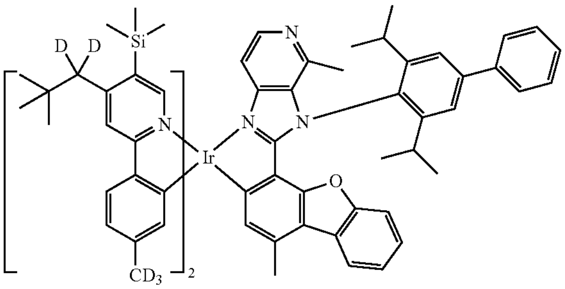
1886
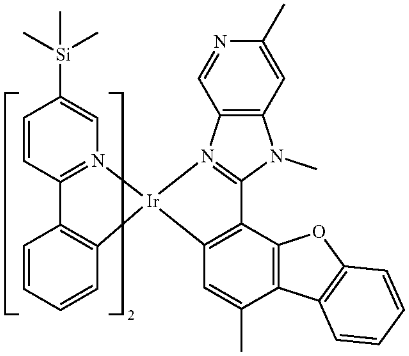
1887
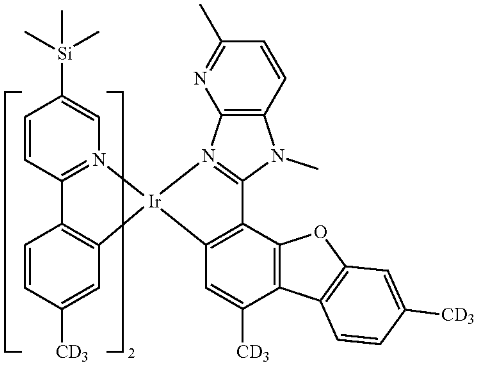
-continued
1888
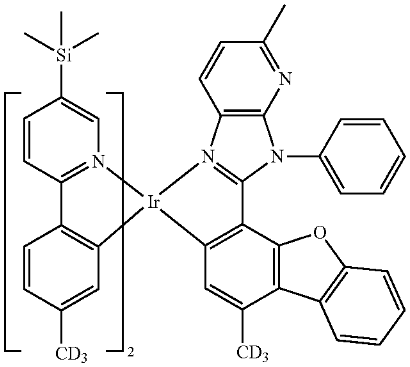
1889
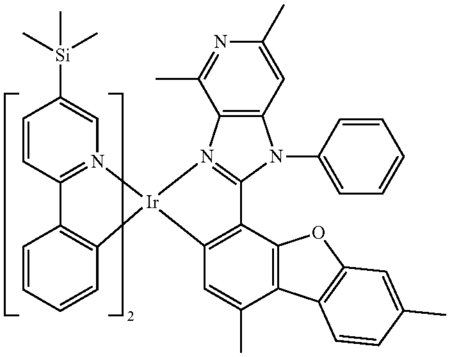
1890
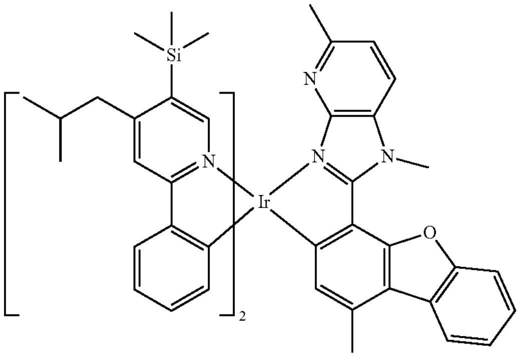
1891
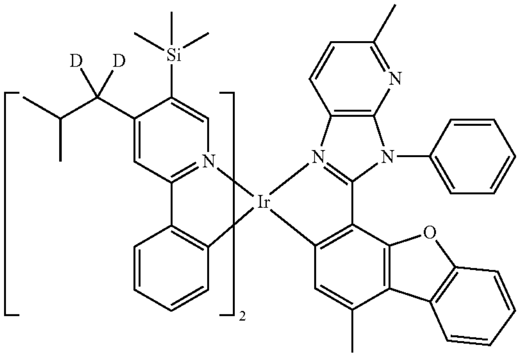

-continued
1892
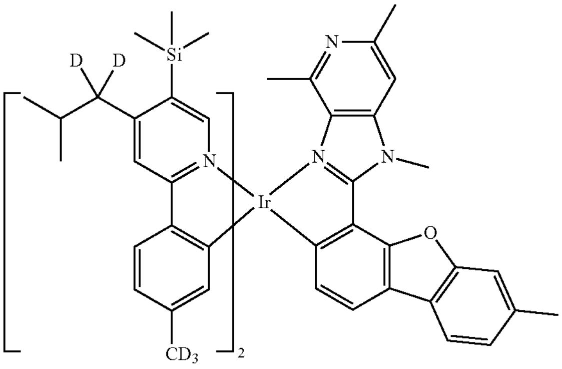
1893
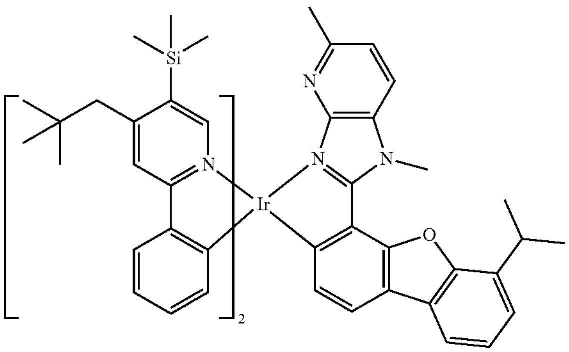
1894
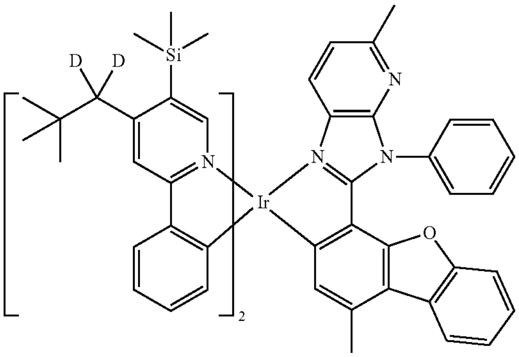
1895
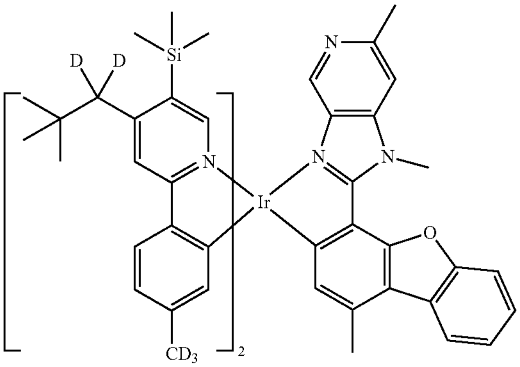
-continued
1896
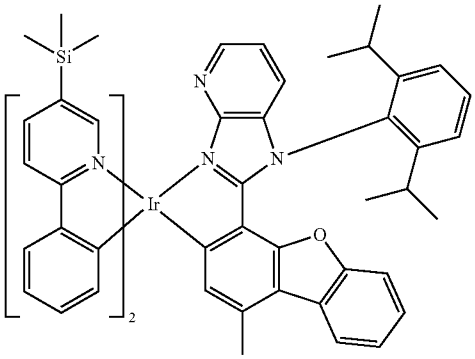
1897
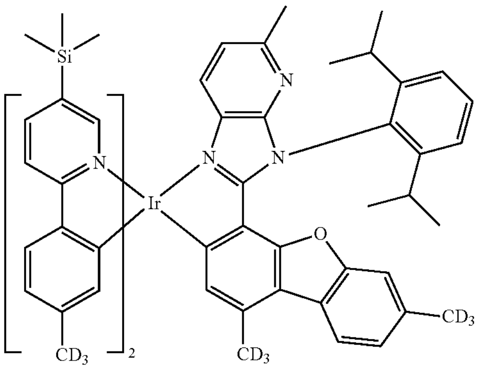
1898
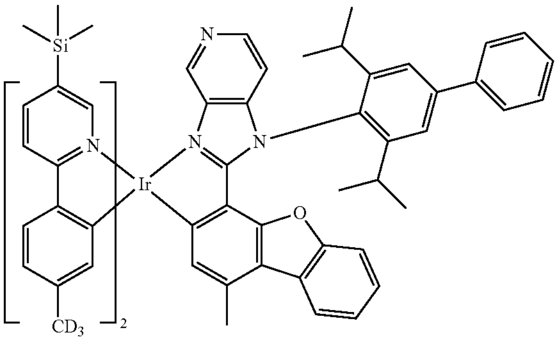
1899
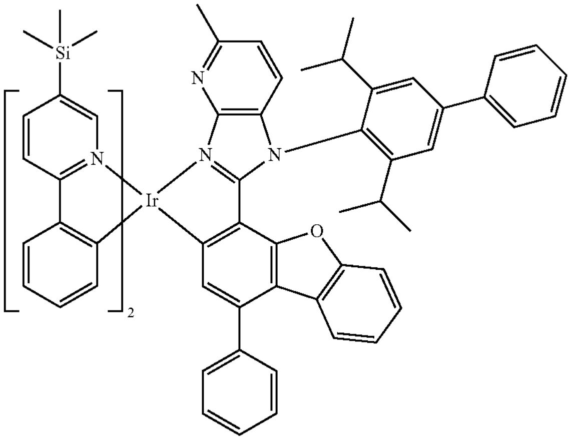

-continued
1900
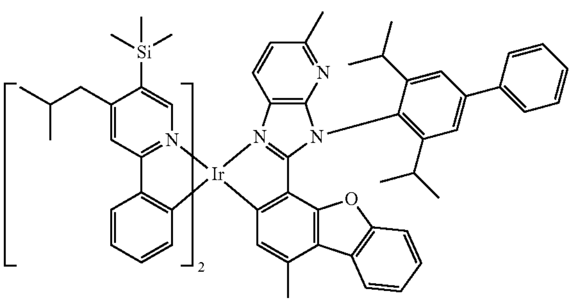
1901
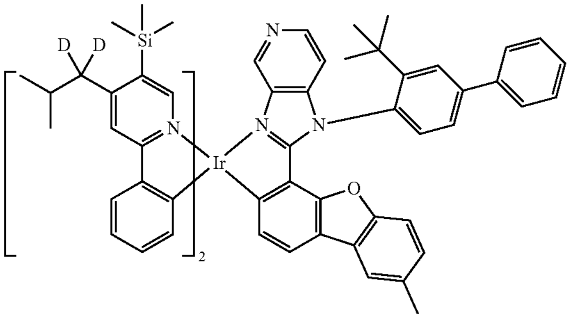
1902
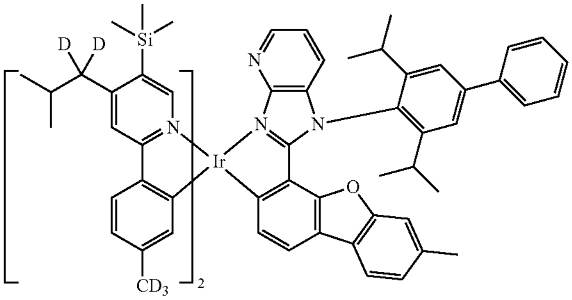
1903
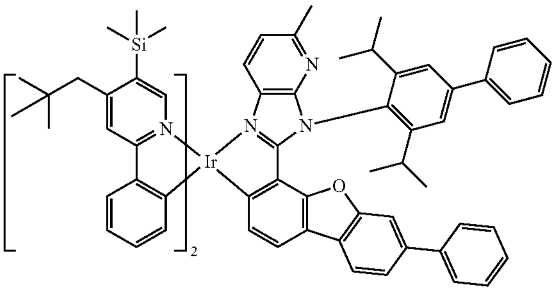
1904
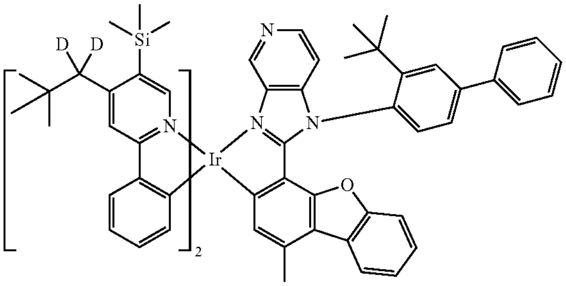
-continued
1905
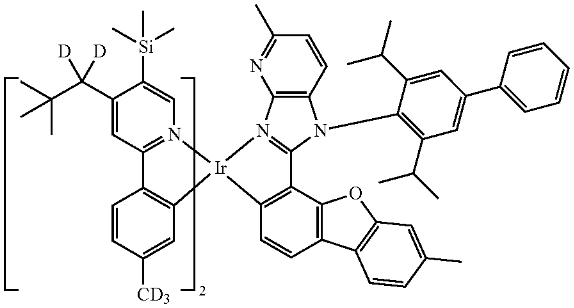
1906
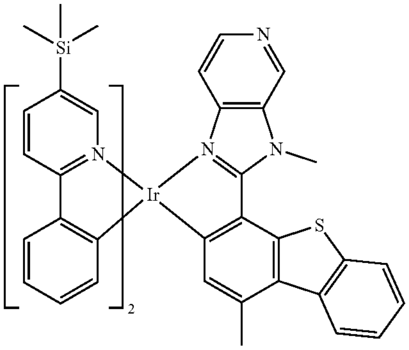
1907
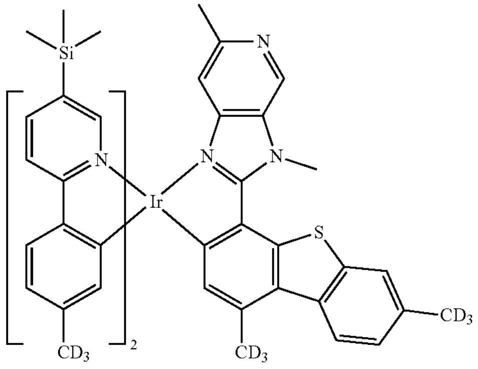
1908
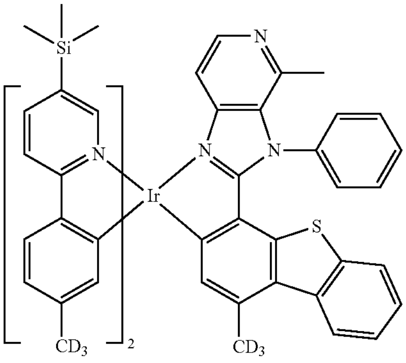

-continued
1909
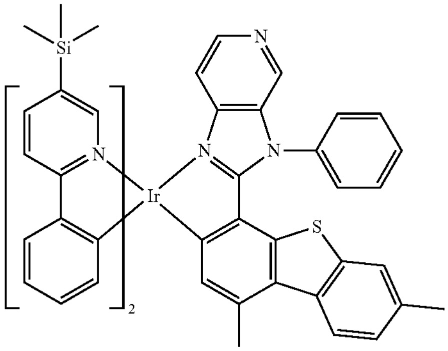
1910
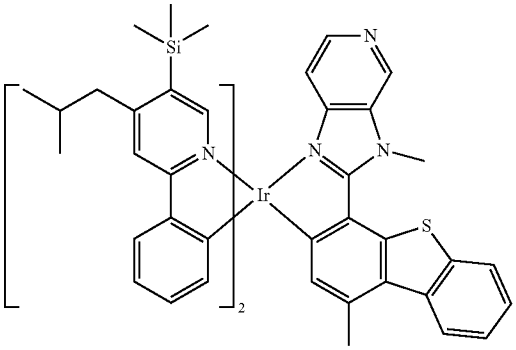
1911
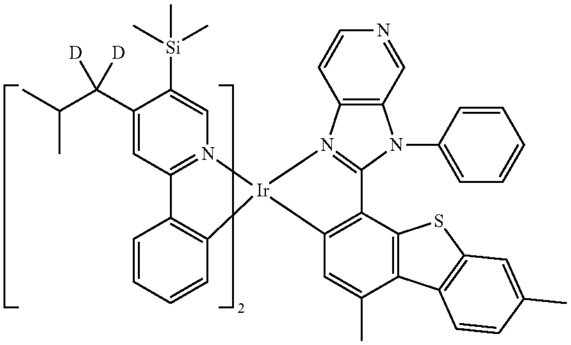
1912
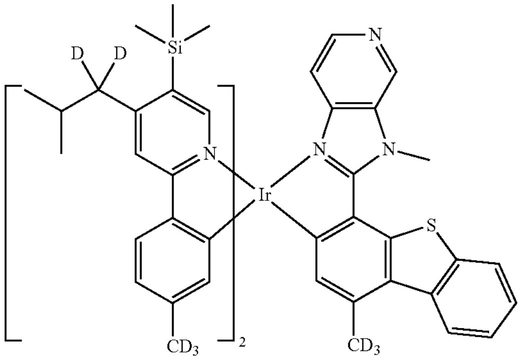
-continued
1913
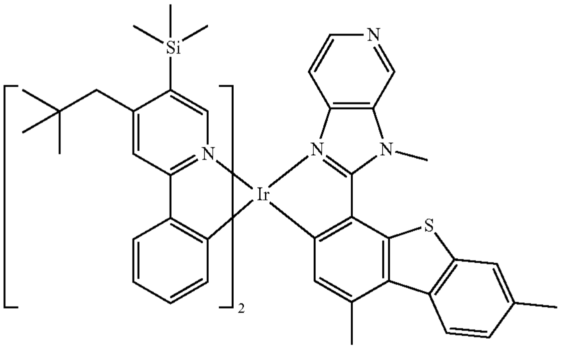
1914
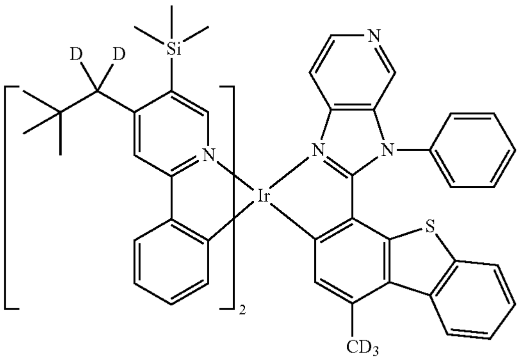
1915
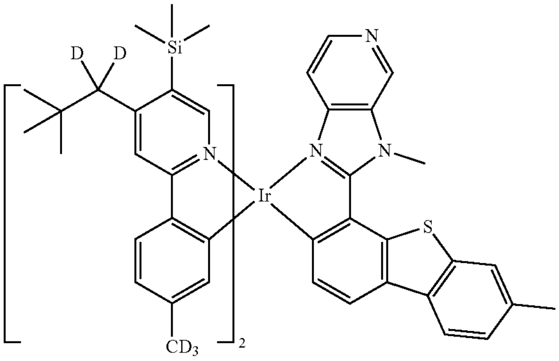
1916
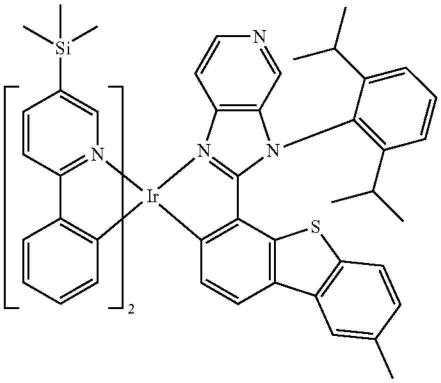

1917
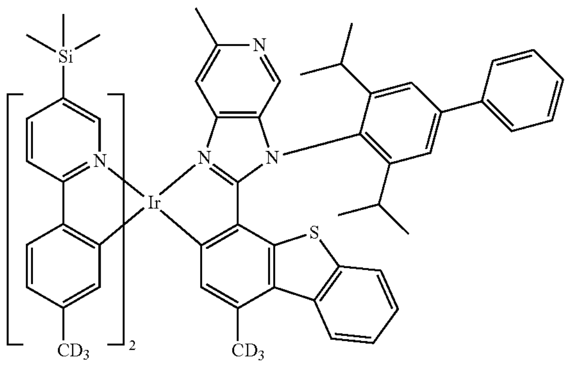
1918
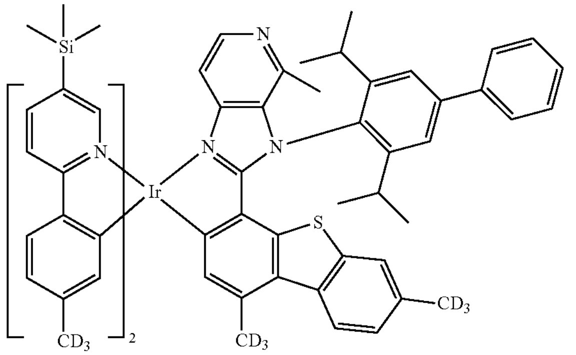
1919
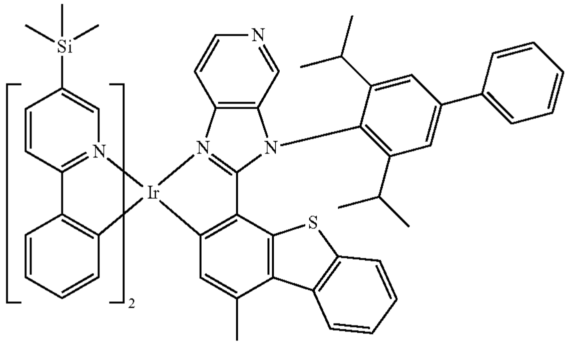
1920
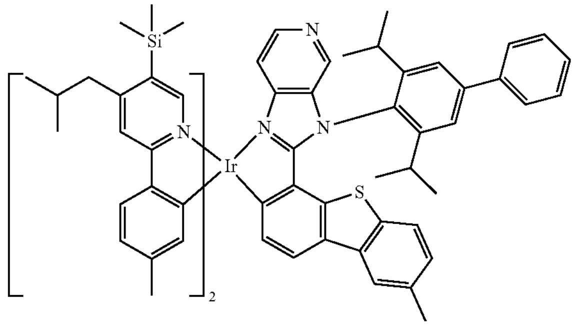
1921
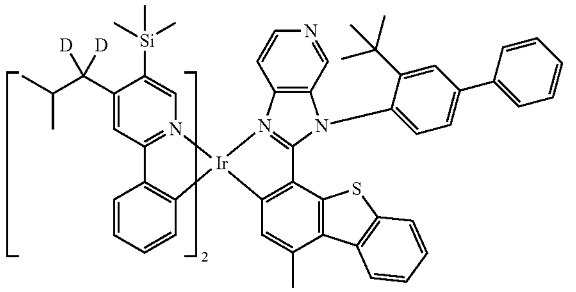
1922
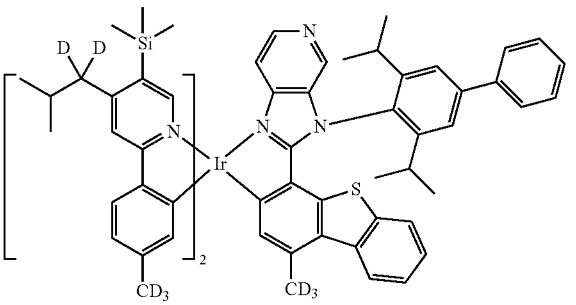
1923
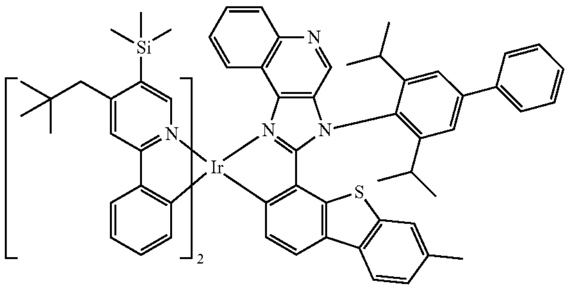
1924
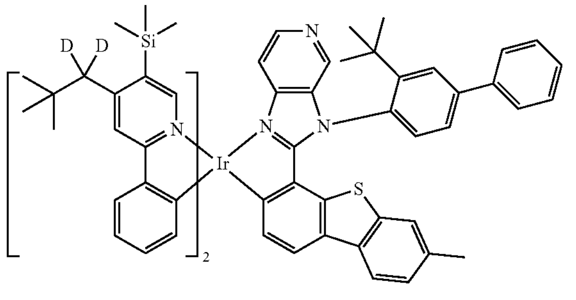
1925
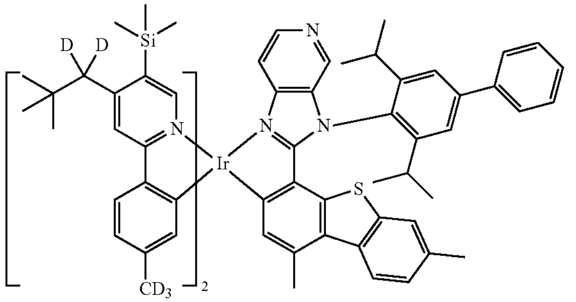

-continued
1926
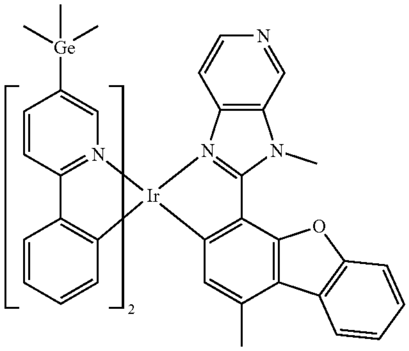
1927
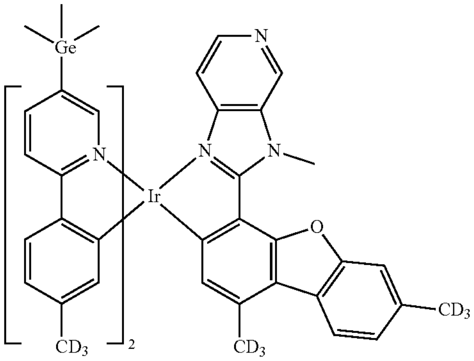
1928
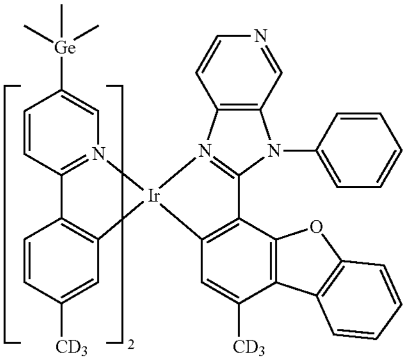
1929
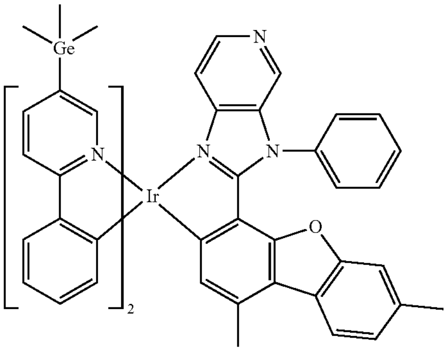
-continued
1930
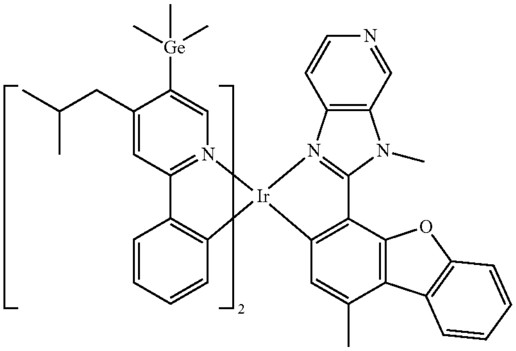
1931
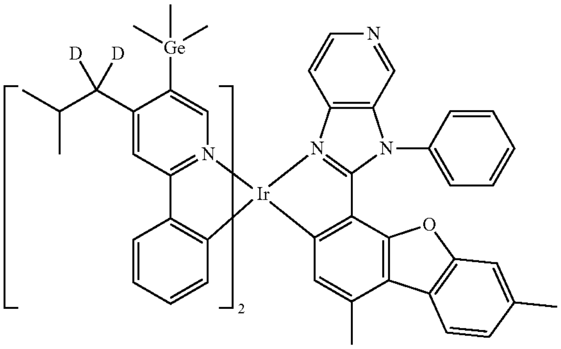
1932
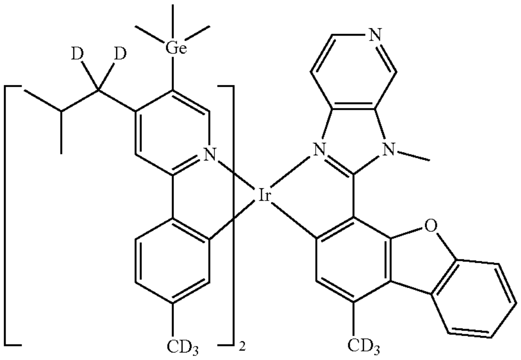
1933
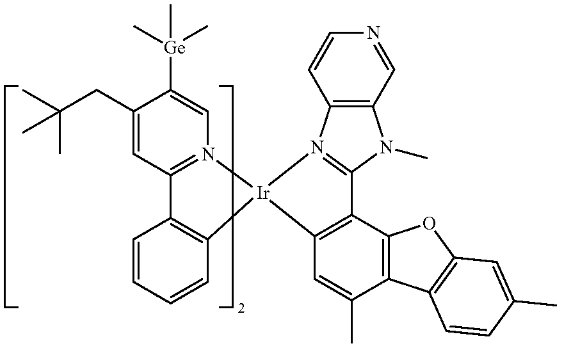

-continued
1934
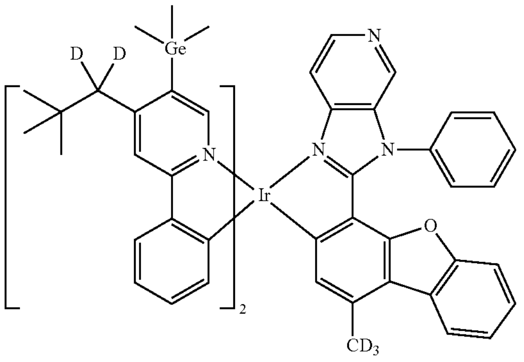
1935
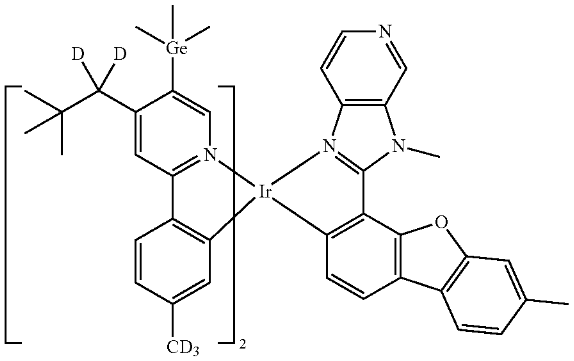
1936
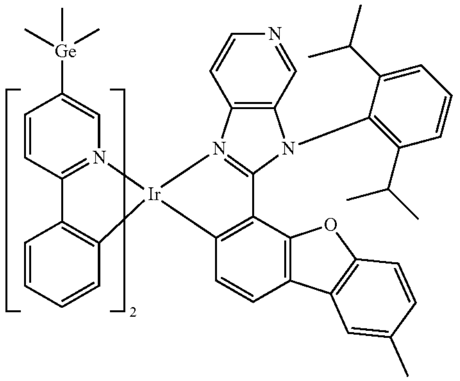
1937
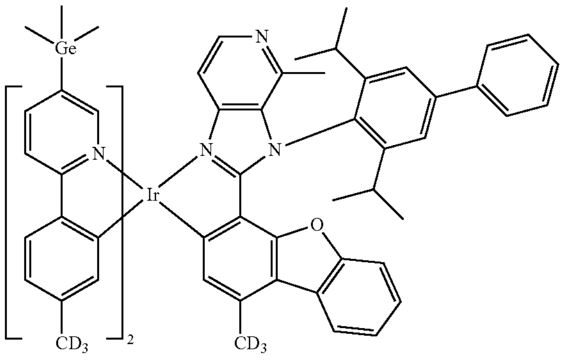
-continued
1938
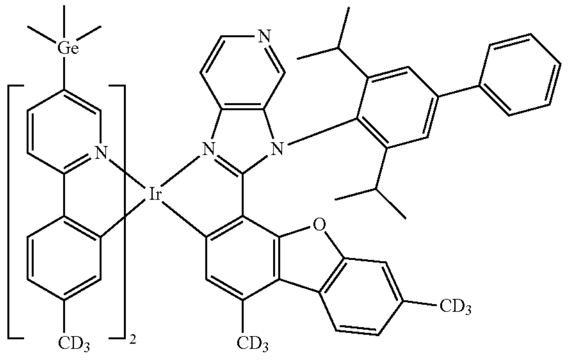
1939
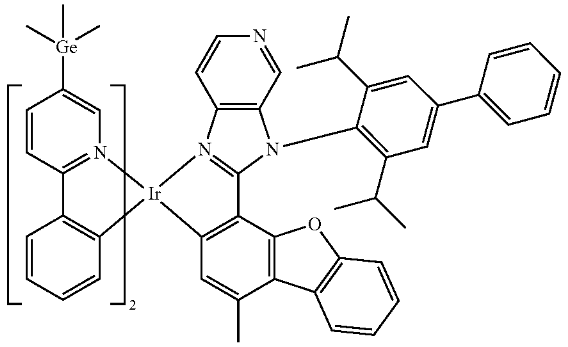
1940
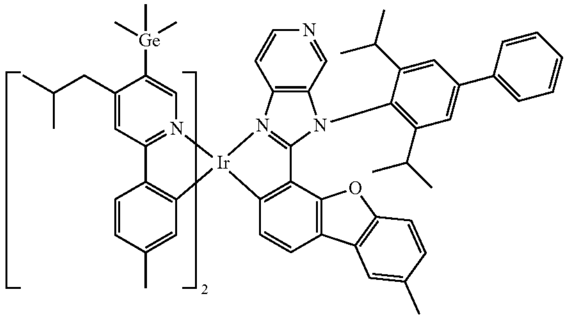
1941
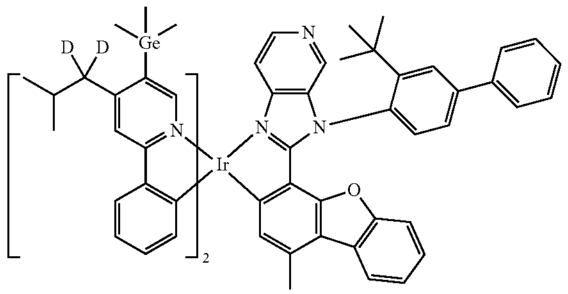

-continued
1942
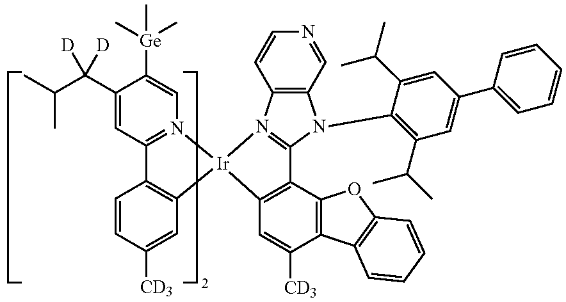
1943
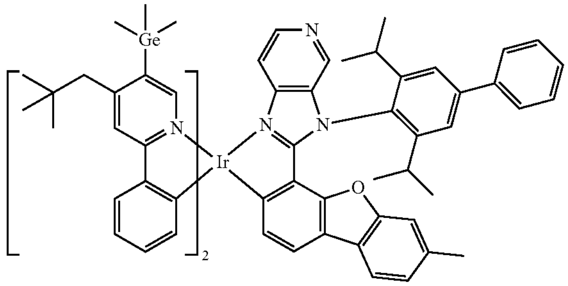
1944
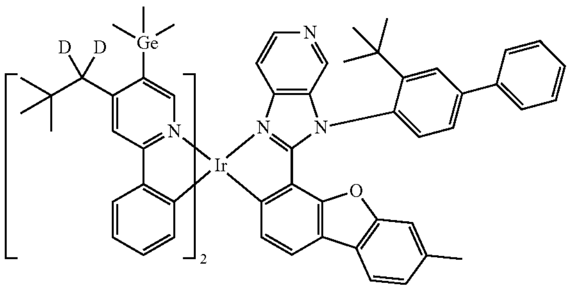
1945
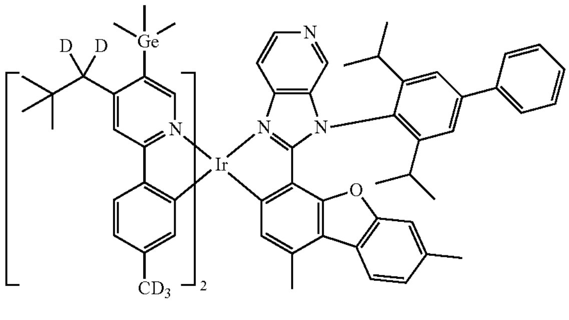
1946
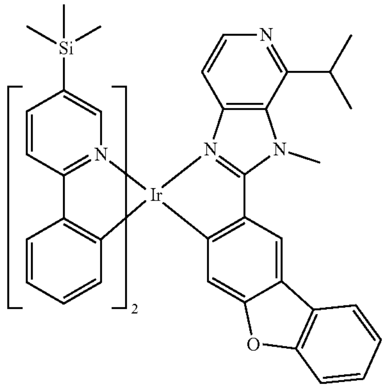
1947
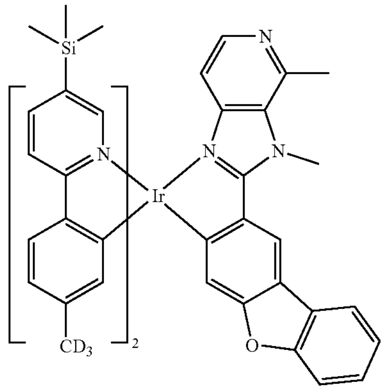
1948
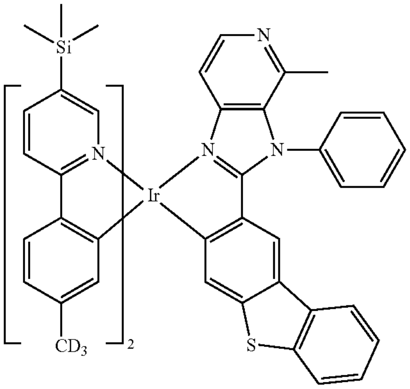
1949
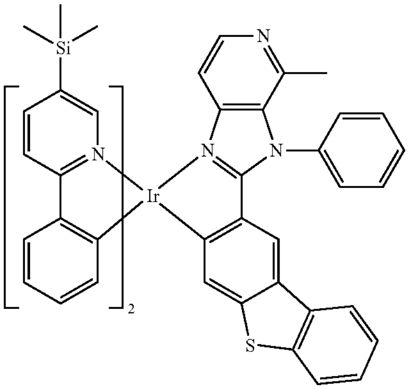

-continued
1950
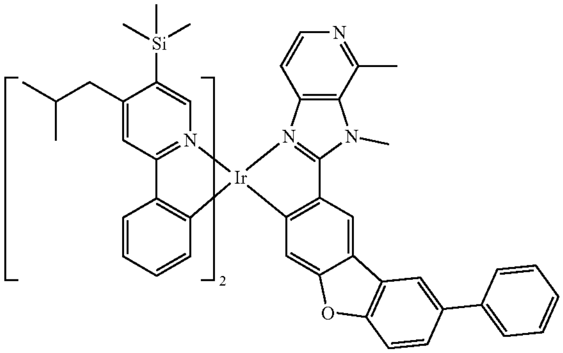
1951
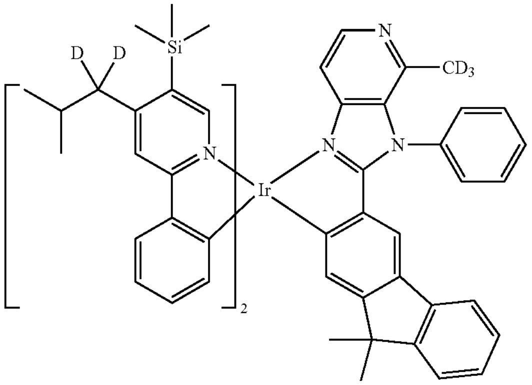
1952
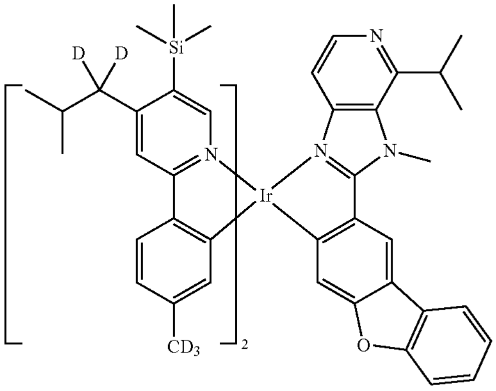
1953
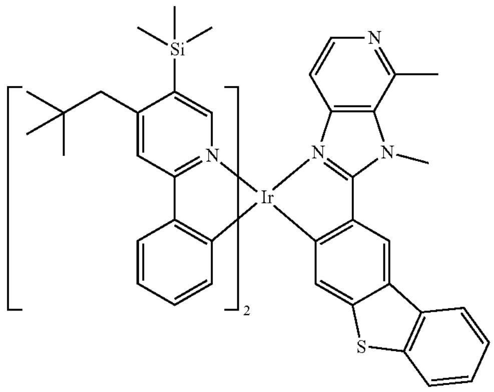
-continued
1954
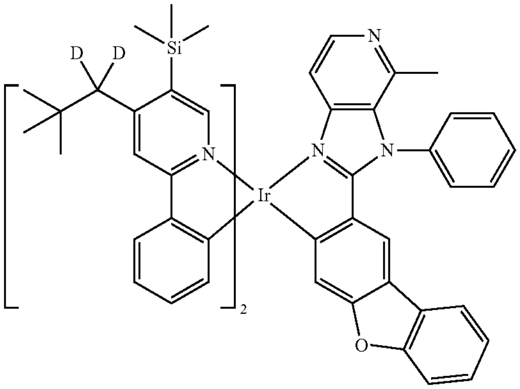
1955
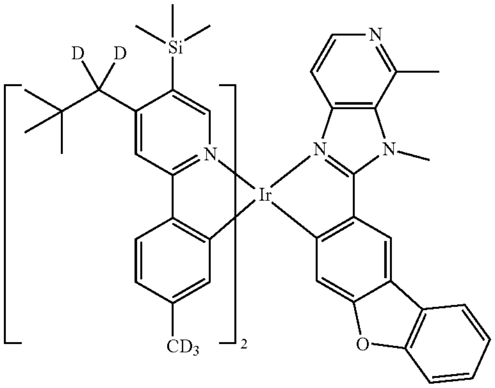
1956
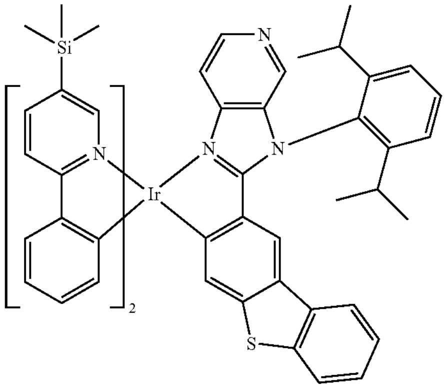
1957
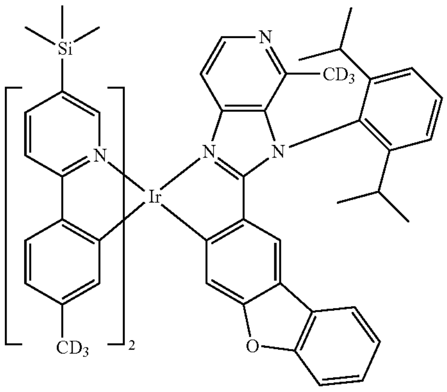

-continued

1958

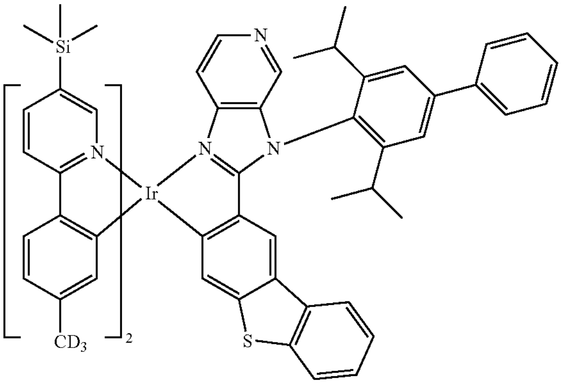

1959

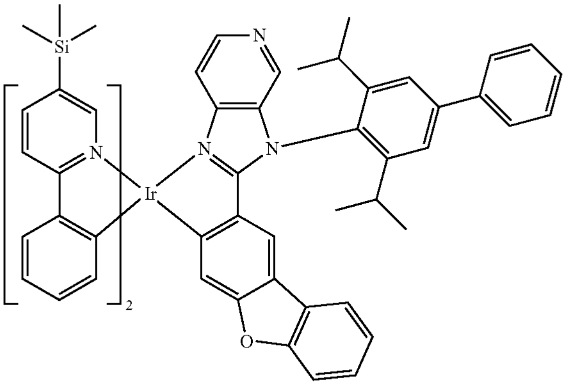

1960

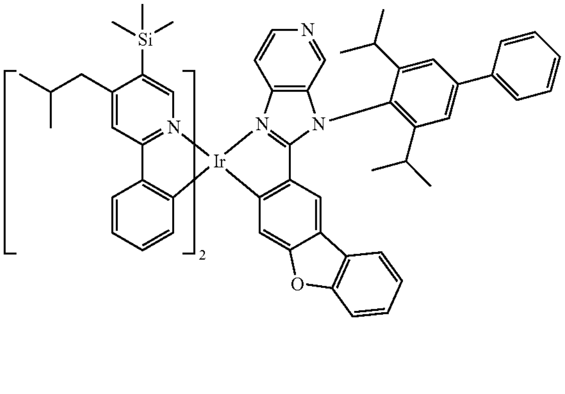

1961

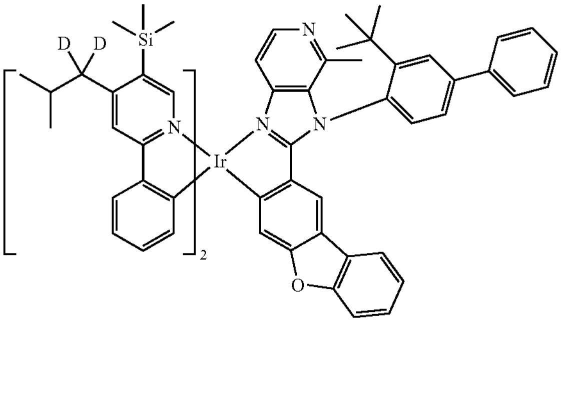

-continued

1962

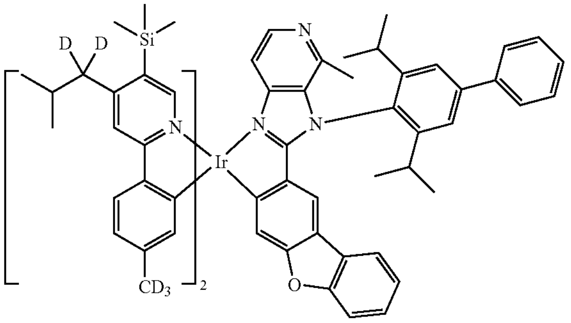

1963

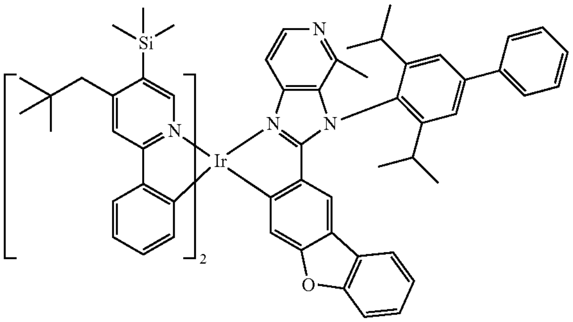

1964

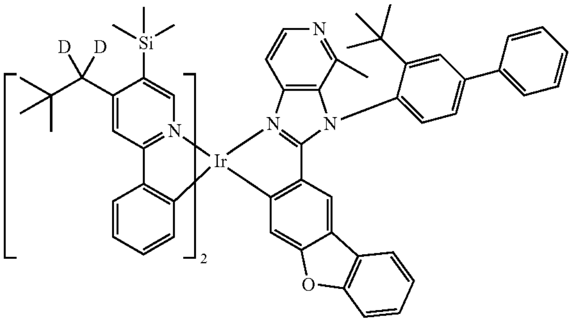

1965

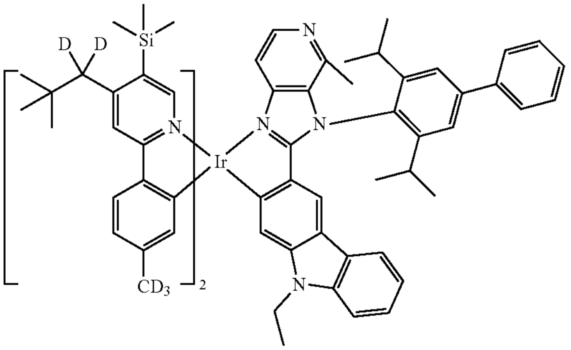

$L_1$ and $L_2$ in the organometallic compound represented by Formula 1 may each be a ligand represented by one of Formulae 1-1 and 1-2A to 1-213, and n1 and n2, respectively indicate the number of $L_1$(s) and the number of $L_2$(s), and may each independently be 1 or 2. That is, the organometallic compound may essentially include $L_1$ (Formula 1-1) essentially including a group represented by *—$X_{11}(R_{21})(R_{22})(R_{23})$ and $L_2$(Formula 1-2A or 1-21B) as a substituent. As a result, molecular orientation and charge mobility ofthe organometallic compound represented by Formula 1 are greatly improved, and thus, the external quantum efficiency and lifespan of an electronic device including the same, for example, an organic light-emitting device including the same, may be improved.

The highest occupied molecular orbital (HOMO) energy level, lowest unoccupied molecular orbital (LUMO) energy level, $S_1$ energy level, and $T_1$ energy level of some compounds of the organometallic compound represented by Formula 1 were evaluated using the Gaussian 09 program with the molecular structure optimization obtained by B3LYP-based density functional theory (DFT), and results thereof are shown in Table 1 and Table 2.

TABLE 1

| Compound No. | HOMO (eV) | LUMO (eV) | $S_1$(eV) | T1 (eV) |
|---|---|---|---|---|
| <Group I> 1 | −4.723 | −1.151 | 2.872 | 2.528 |
| <Group I> 5 | −4.719 | −1.145 | 2.874 | 2.523 |
| <Group I> 6 | −4.702 | −1.133 | 2.868 | 2.523 |
| <Group I> 11 | −4.719 | −1.173 | 2.857 | 2.517 |
| <Group I> 12 | −4.673 | −1.131 | 2.843 | 2.513 |
| <Group I> 14 | −4.707 | −1.181 | 2.844 | 2.511 |
| <Group I> 15 | −4.744 | −1.171 | 2.873 | 2.532 |
| <Group I> 37 | −4.704 | −1.152 | 2.856 | 2.558 |
| <Group I> 184 | −4.721 | −1.139 | 2.871 | 2.552 |
| <Group I> 212 | −4.794 | −1.255 | 2.831 | 2.536 |
| <Group I> 295 | −4.710 | −1.154 | 2.856 | 2.545 |
| <Group I> 982 | −4.706 | 1.149 | 2.862 | 2.554 |
| <Group I> 1042 | −4.761 | −1.197 | 2.8566 | 2.513 |
| <Group I> 1229 | −4.842 | −1.281 | 2.864 | 2.539 |
| <Group I> 1525 | −4.728 | −1.129 | 2.900 | 2.530 |
| <Group I> 1550 | −−4.705 | −1.108 | 2.892 | 2.557 |
| <Group I> 1725 | −4.783 | −1.237 | 2.838 | 2.546 |
| <Group I> 2610 | −1.769 | −1.273 | 3.469 | 2.849 |

TABLE 2

| Compound No. | HOMO (eV) | LUMO (eV) | $S_1$(eV) | T1(eV) |
|---|---|---|---|---|
| <Group II> 16 | −4.750 | −1.239 | 2.812 | 2.538 |
| <Group II> 91 | −4.703 | −1.154 | 2.855 | 2.534 |
| <Group II> 1416 | −4.676 | −1.140 | 2.844 | 2.557 |
| <Group II> 1491 | −4.683 | −1.140 | 2.846 | 2.539 |
| <Group II> 1620 | −4.671 | −1.110 | 2.874 | 2.541 |
| <Group II> 1800 | −4.830 | −1.319 | 2.814 | 2.496 |

From Table 1, it is confirmed that the organometallic compound represented by Formula 1 has such electric characteristics that are suitable for use as a dopant for an electric device, for example, an organic light-emitting device.

Synthesis methods of the first compound represented by Formula 1 may be recognizable by one of ordinary skill in the art by referring to the Synthesis Examples provided below.

Description of Second Compound and Third Compound

The second compound has a HOMO energy level of about −5.5 eV or higher, and the third compound has a LUMO energy level of about −2.8 eV or less.

For example, the second compound may have a HOMO energy level of about −5.5 eV to about −5.0 eV.

For example, the third compound may have a LUMO energy level of about −3.5 eV to about −2.8 eV.

In an embodiment, the second compound and the third compound may each independently be represented by one of Formulae 2 and 3 below, and the second compound and the third compound may be different from each other:

Formula 2

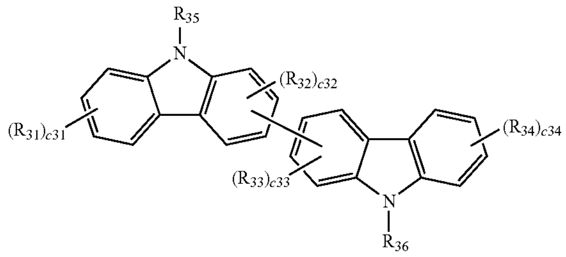

Formula 3

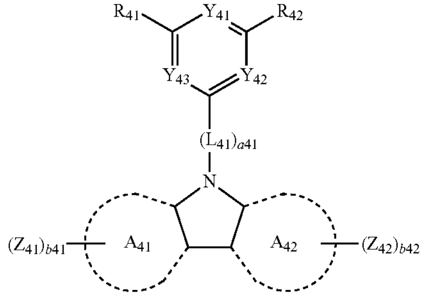

Formula 4

$*—(L_{51})_{a51}—Ar_{51}$.

In Formulae 2 and 3, $A_{41}$ and $A_{42}$ may each independently be a $C_5$-$C_{60}$ carbocyclic group or a $C_1$-$C_{60}$ heterocyclic group, $Y_{41}$ to $Y_{43}$ may each independently be $C(R_{43})$ or N, $L_{41}$ and $L_{51}$ may each independently be a substituted or unsubstituted $C_5$-$C_{60}$ carbocyclic group, or a substituted or unsubstituted $C_1$-$C_{60}$ heterocyclic group, a41 and a51 may each independently be an integer from 0 to 5, $Ar_{51}$ may be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or $P(Q_8)(Q_9)$, $R_{31}$ to $R_{36}$, $R_{41}$ to $R_{43}$, and $Z_{41}$ to $Z_{42}$ may each independently be a group represented by Formula 4, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or $P(Q_8)(Q_9)$, b41 and b42 may each independently be an integer from 0 to 20, c31 and c34 may each independently be an integer from 0 to 4, c32 and c33 may each independently be an integer from 0 to 3, and a substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, the second compound and the third compound may each be a group represented by Formula 2.

For example, the second compound and the third compound may each be a group represented by Formula 3.

For example, the second compound may be a group represented by Formula 2, and the third compound may be a group represented by Formula 3.

For example, the second compound may be a group represented by Formula 3, and the third compound may be a group represented by Formula 2.

For example, $A_{41}$ and $A_{42}$ may each independently be a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an (indolo)phenanthrene group, a (benzofurano)phenanthrene group, or a (benzothieno)phenanthrene group.

For example, at least one of $Y_{41}$ to $Y_{43}$ may be N, but embodiments of the present disclosure are not limited thereto.

For example, two or more of $Y_{41}$ to $Y_{43}$ may be N, but embodiments of the present disclosure are not limited thereto.

For example, $L_{41}$ and $L_{51}$ may each independently be a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyrrolophenanthrene group, a furanophenanthrene group, or a thienophenanthrene group, each unsubstituted or substituted with at least one $R_{40}$, but embodiments of the present disclosure are not limited thereto.

$R_{40}$ is the same as described in connection with $R_{31}$ to $R_{36}$, $R_{41}$ to $R_{43}$, and $Z_{41}$ to $Z_{42}$.

a41 and a51 indicate the number of $L_{41}$(s) and the number of $L_{51}$(s), respectively, wherein, when a41 is 0, $*-(L_{41})_{a41}-*'$ is a single bond, and $*-(L_{51})_{a51}-*'$ is a single bond, when a41 is 2 or more, two or more of $L_{41}$(s) may be identical to or different from each other, and when a51 is 2 or more, two or more of $L_{51}$(s) may be identical to or different from each other.

In an embodiment, $Ar_{51}$ may be: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)

phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$; and $Q_1$ to $Q_9$ are the same as described in the present specification.

For example, $R_{31}$ to $R_{36}$, $R_{41}$ to $R_{43}$, and $Z_{41}$ to $Z_{42}$ may each independently be a group represented by Formula 4, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof, or $—N(Q_1)(Q_2)$, $—Si(Q_3)(Q_4)(Q_5)$, $—Ge(Q_3)(Q_4)(Q_5)$, $—B(Q_6)(Q_7)$, $—P(—O)(Q_8)(Q_9)$, or $—P(Q_8)(Q_9)$, wherein $Q_1$ to $Q_9$ are the same as described in the present specification.

Two neighboring groups of $R_{31}$ to $R_{36}$, $R_{41}$ to $R_{43}$ and $Z_{41}$ to $Z_{42}$ in Formulae 2 and 3 may optionally be linked to form a $C_5$-$C_{30}$ carbocyclic group unsubstituted or substituted with at least one $R_{40}$ or a $C_1$-$C_{30}$ heterocyclic group unsubstituted or substituted with at least one $R_{40}$.

In an embodiment, two neighboring groups of $R_{31}$ to $R_{36}$, $R_{41}$ to $R_{43}$ and $Z_{41}$ to $Z_{42}$ in Formulae 2 and 3 may be linked to form a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphtosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyrrolophenanthrene group, a furanophenanthrene group, or a thienophenanthrene group, each unsubstituted or substituted with at least one $R_{40}$, but embodiments of the present disclosure are not limited thereto.

b41 and b42 in Formula 3 indicate the number of $Z_{41}$(s) and the number of $Z_{42}$(s), respectively, wherein when b41 is 2 or more, two or more of $Z_{41}$(s) may be identical to or different from each other, and when b42 is 2 or more, two or more of $Z_{42}$(s) may be identical to or different from each other.

c31 to c34 in Formula 2 indicate the number of $R_{31}$(s) and the number of $R_{34}$(s), respectively, wherein when c31 is 2 or more, two or more $R_{31}$(s) may be identical to or different from each other, when c32 is 2 or more, two or more of $R_{32}$(s) may be identical to or different from each other, when c33 is 2 or more, two or more of $R_{33}$(s) may be identical to or different from each other, and when c34 is 2 or more, two or more of $R_{34}$(s) may be identical to or different from each other.

In an embodiment, the second compound may be represented by Formula 2-1:

Formula 2-1

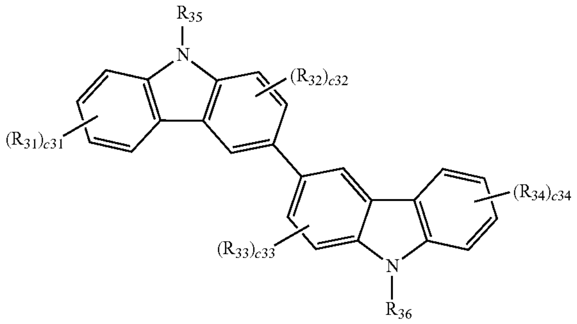

In Formula 2-1, $R_{31}$ to $R_{36}$ and c31 to c34 are the same as described in the present specification.

In an embodiment, the third compound may be represented by Formula 3-1 or Formula 3-2:

Formula 3-1

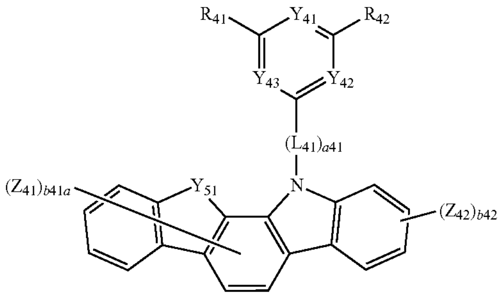

Formula 3-2

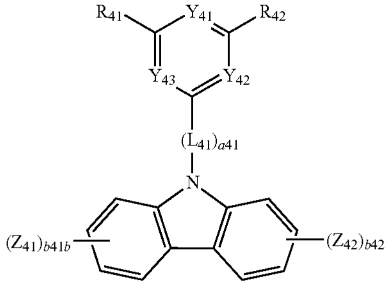

wherein, in Formulae 3-1 and 3-2, $Y_{41}$ to $Y_{43}$, $L_{41}$, a41, $R_{41}$ to $R_{42}$, and $Z_{41}$ to $Z_{42}$ are the same as described in the present specification, $Y_{51}$ may be O, S, Se, $N(Z_{43})$, $C(Z_{43})(Z_{44})$, or $Si(Z_{43})(Z_{44})$, $Z_{43}$ and $Z_{44}$ are the same as described in connection with $Z_{41}$ and $Z_{42}$, b41a may be an integer from 0 to 6, b41 b may be an integer from 0 to 4, and b42 may be an integer from 0 to 4.

In one or more embodiments, the second compound and the third compound may each independently be one of Compounds H1-1 to H1-20:

H1-1

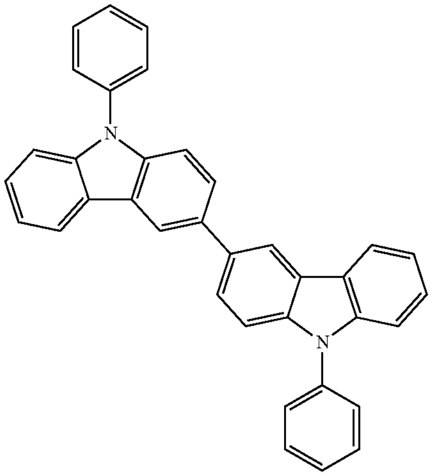

H1-2

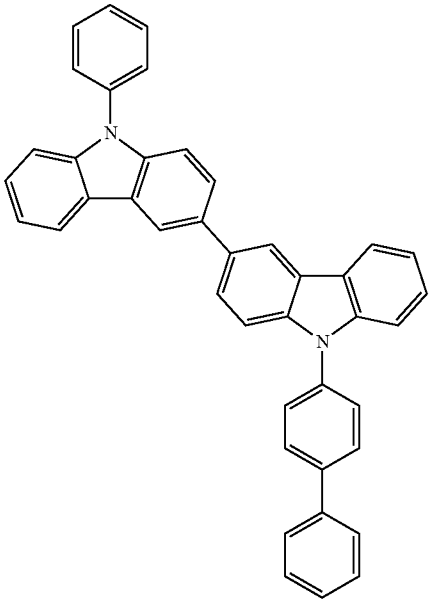

H1-3

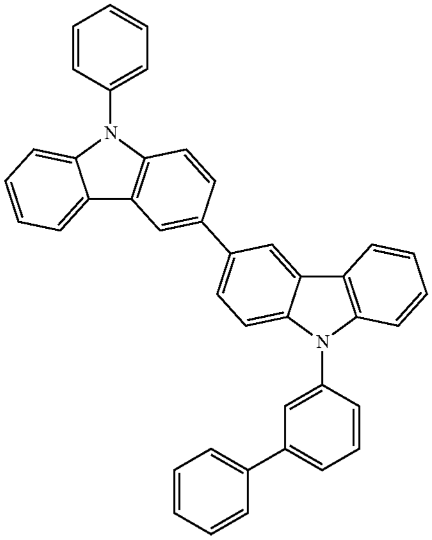

-continued
H1-4
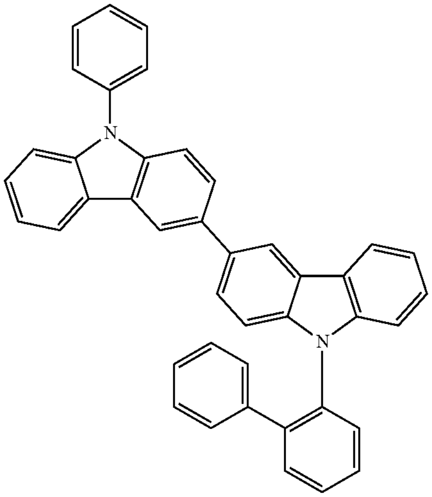
H1-5
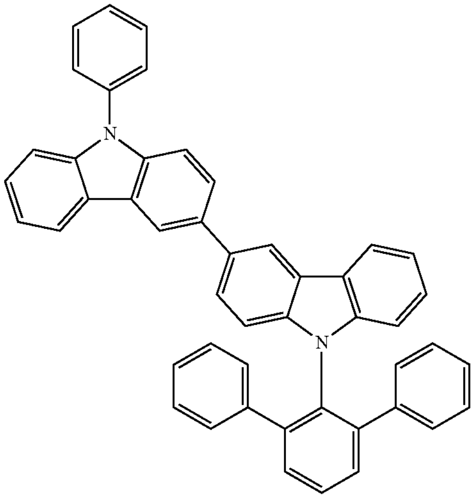
H1-6
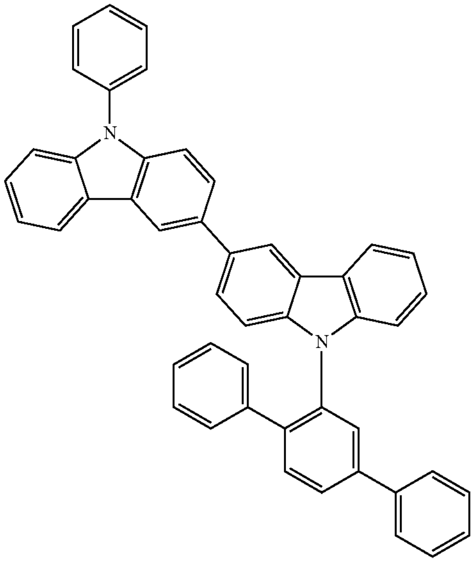
-continued
H1-7
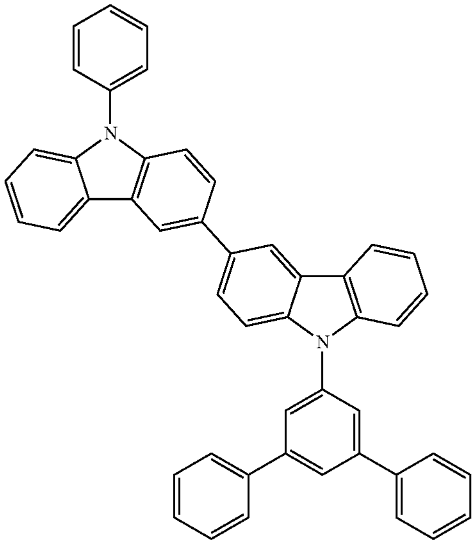
H1-8
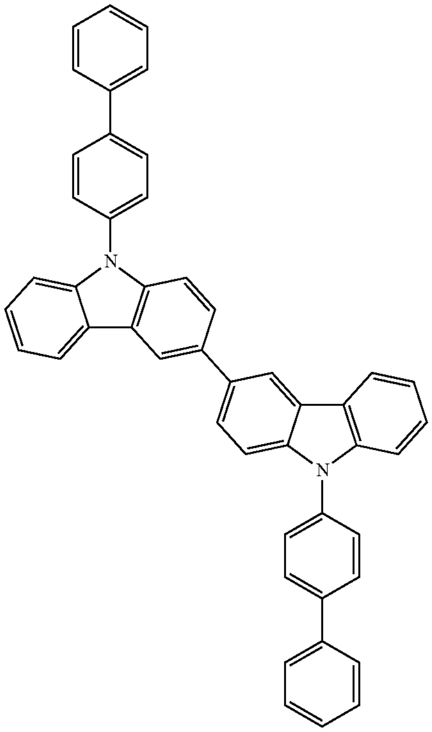

-continued
H1-9
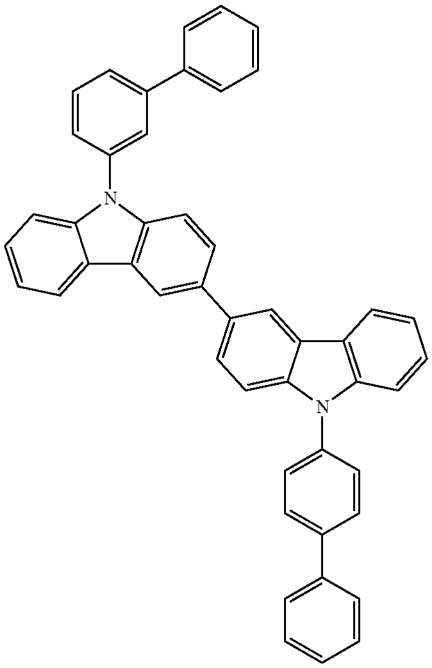
H1-10
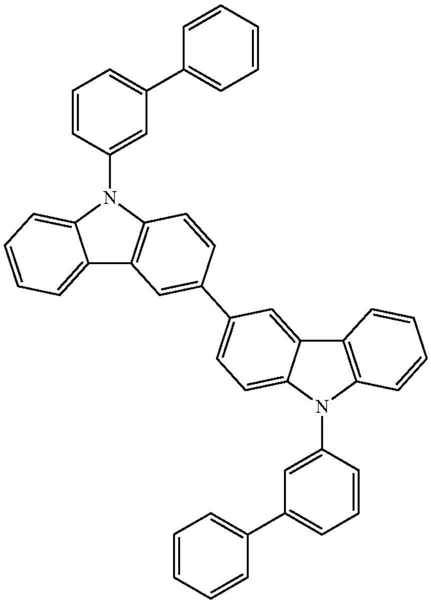
-continued
H1-11
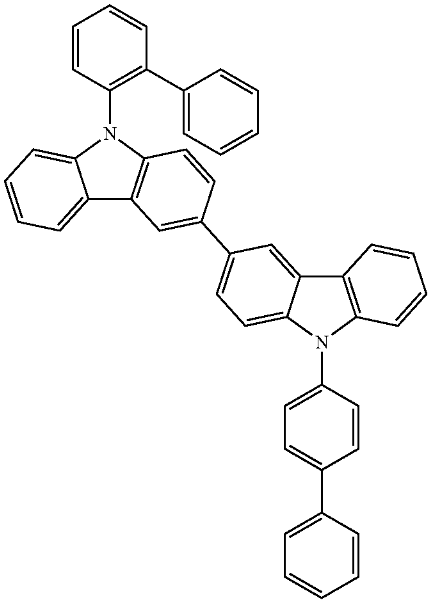
H1-12
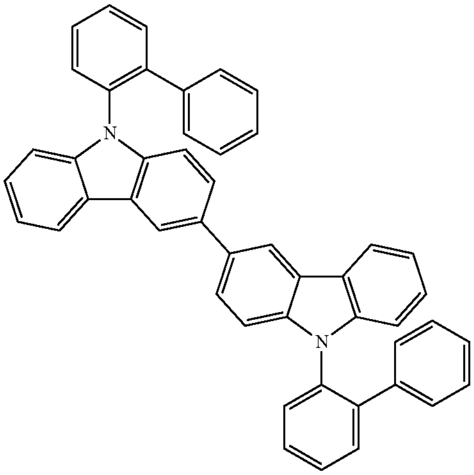
H1-13
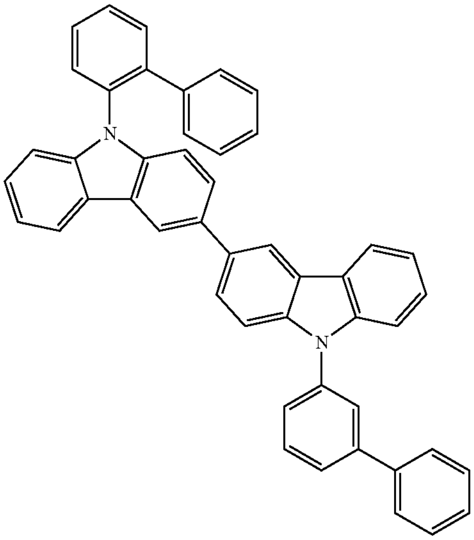

-continued
H1-14
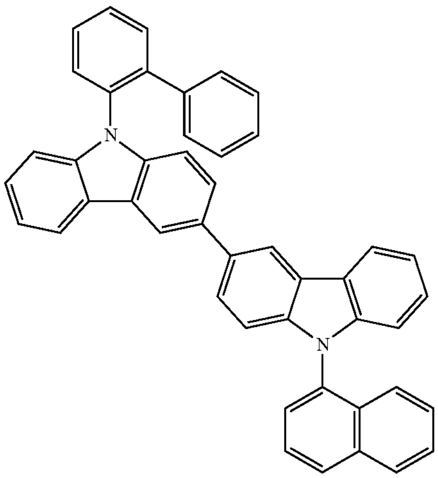
H1-15
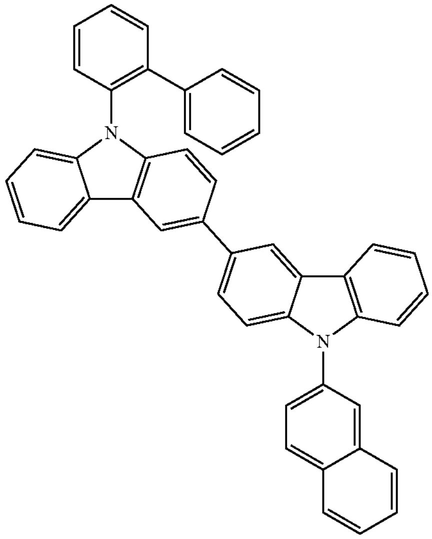
H1-16
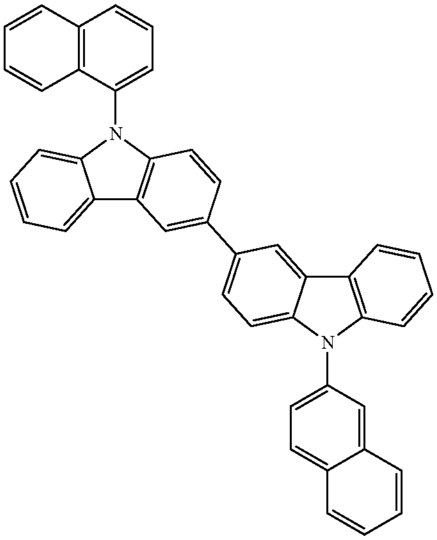
-continued
H1-17
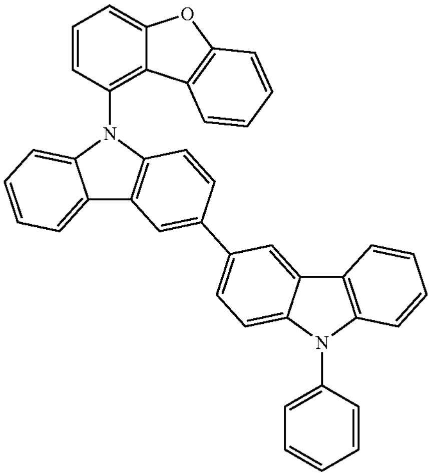
H1-18
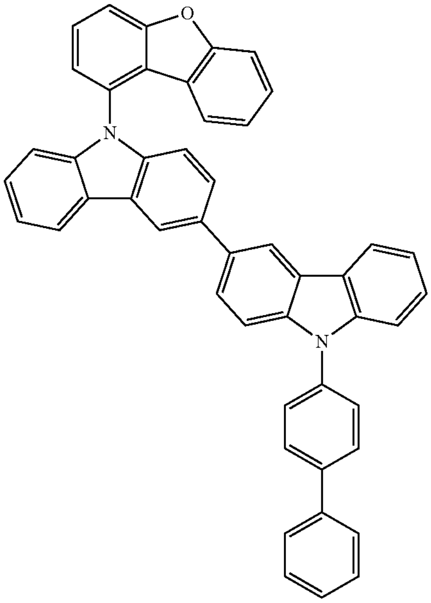
H1-19
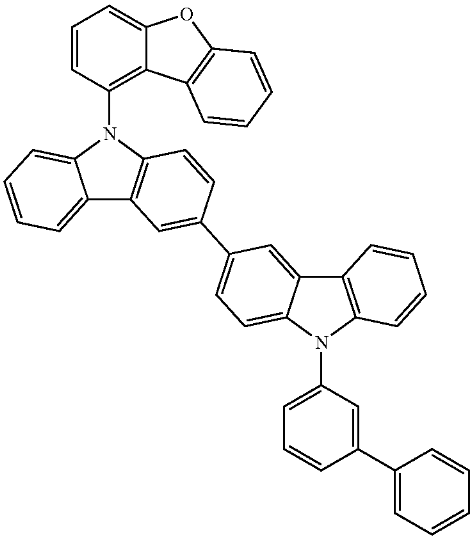

-continued
H1-20
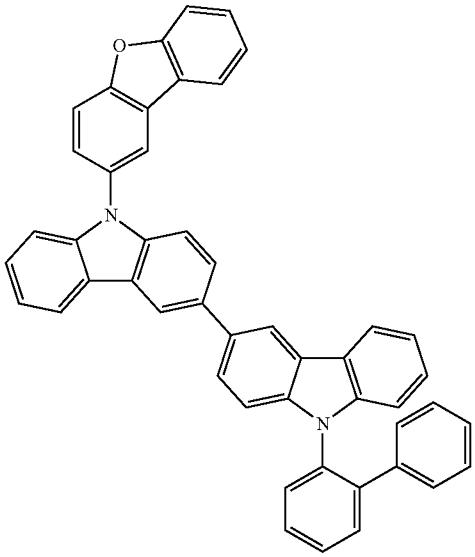
In one or more embodiments, the second compound and the third compound may each independently be one of Compounds H2-1 to H2-33:
H2-1
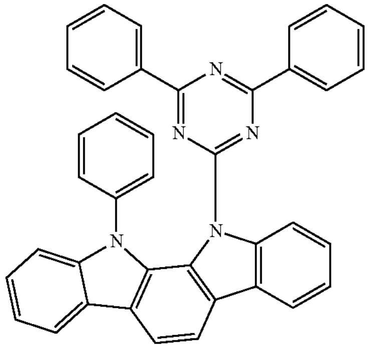
H2-2
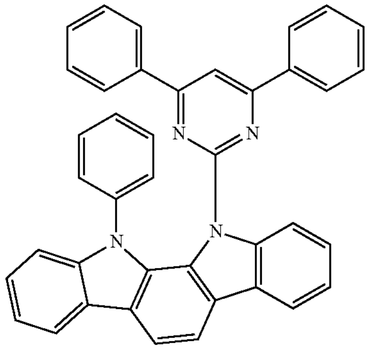
-continued
H2-3
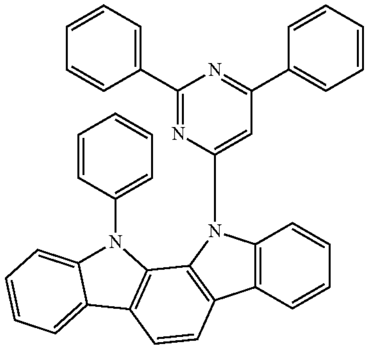
H2-4
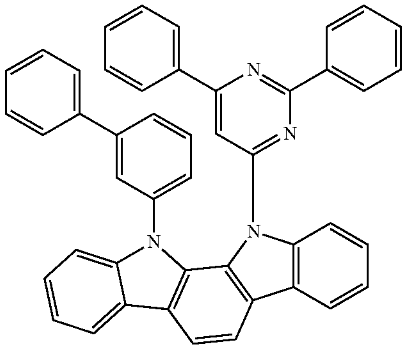
H2-5
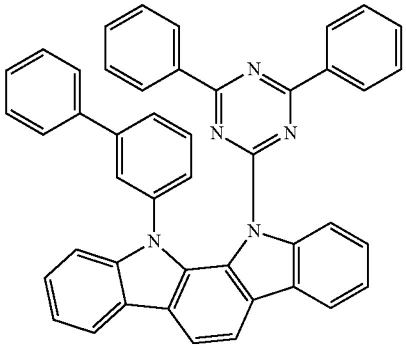
H2-6
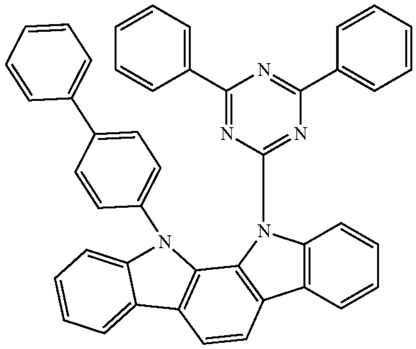

H2-7
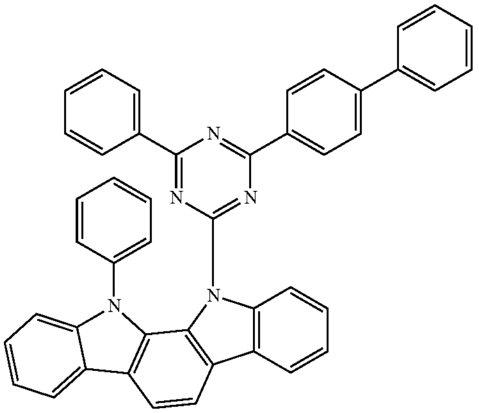
H2-8
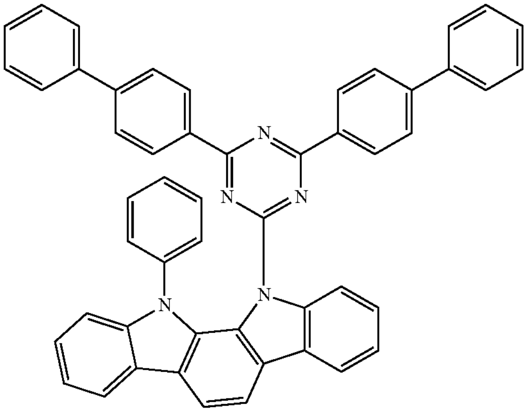
H2-9
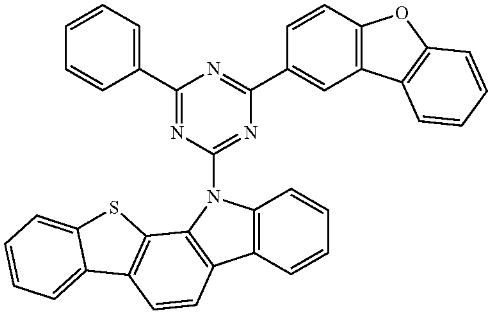
H2-10
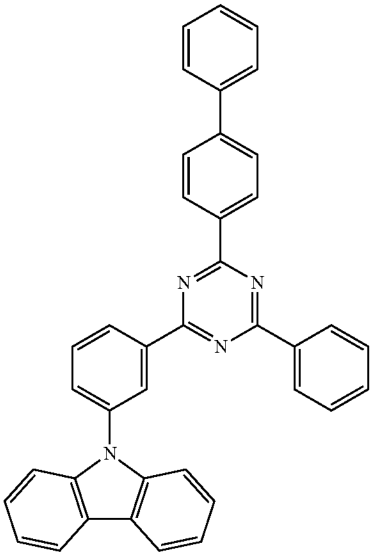
H2-11
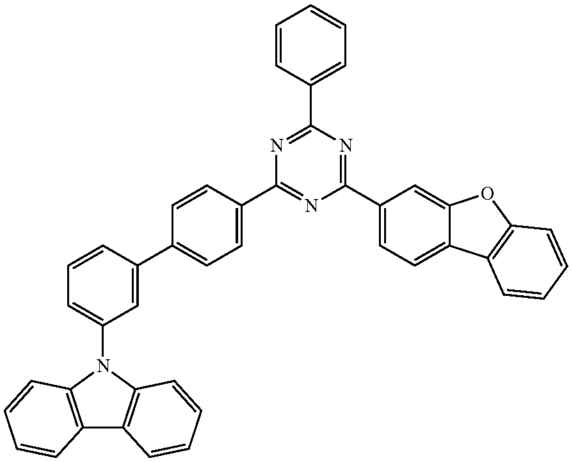
H2-12
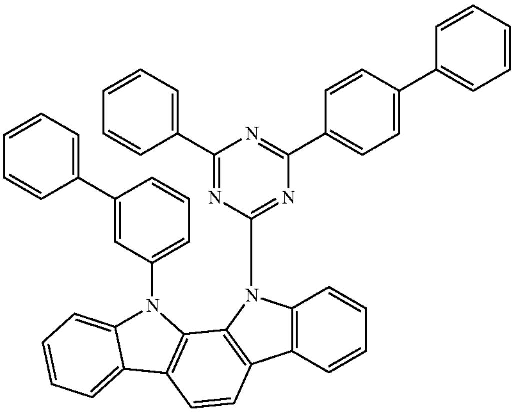

-continued
H2-13
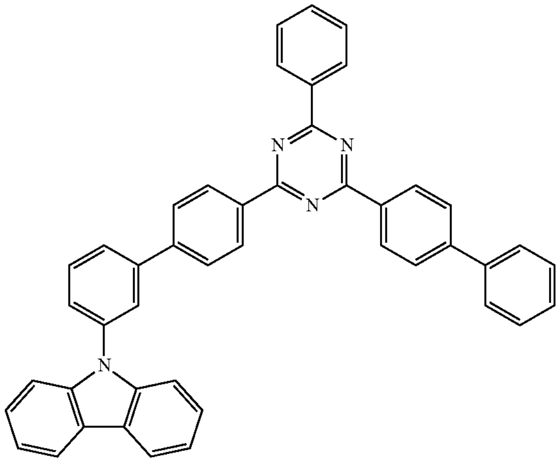
H2-14
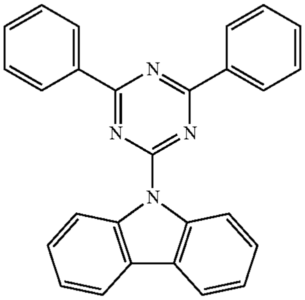
H2-15
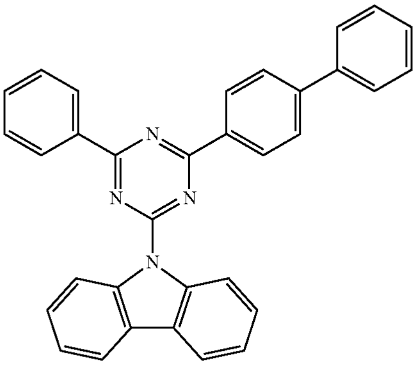
H2-16
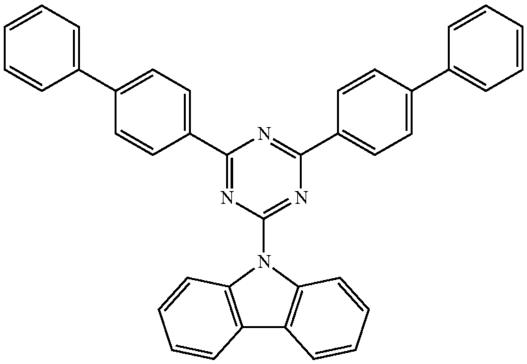
-continued
H2-17
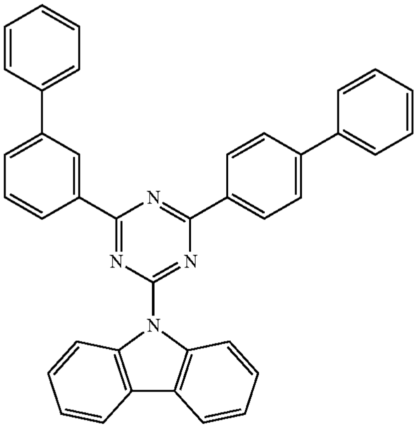
H2-18
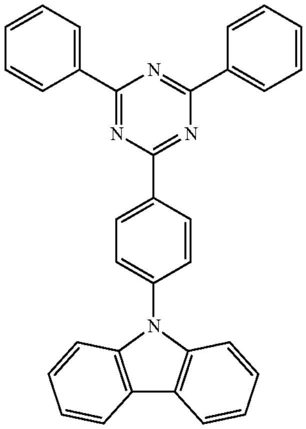
H2-19
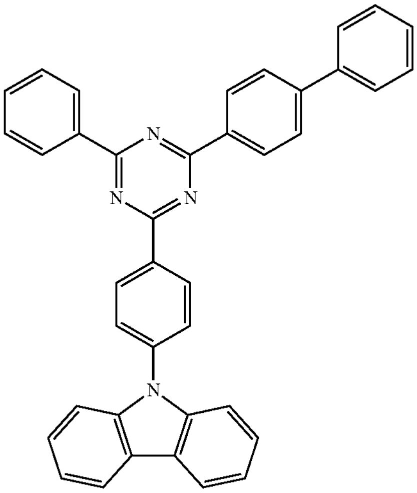

-continued
H2-20
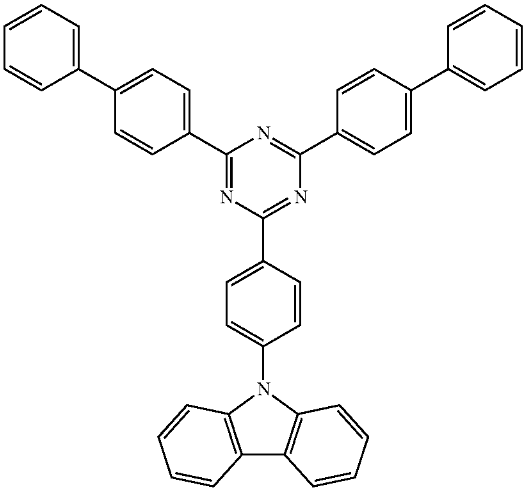
H2-21
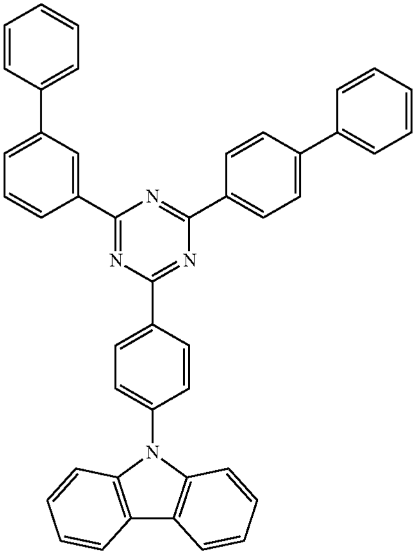
H2-22
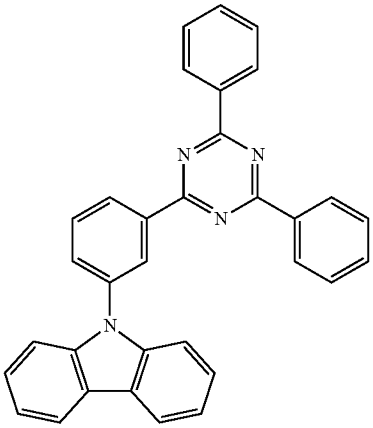
-continued
H2-23
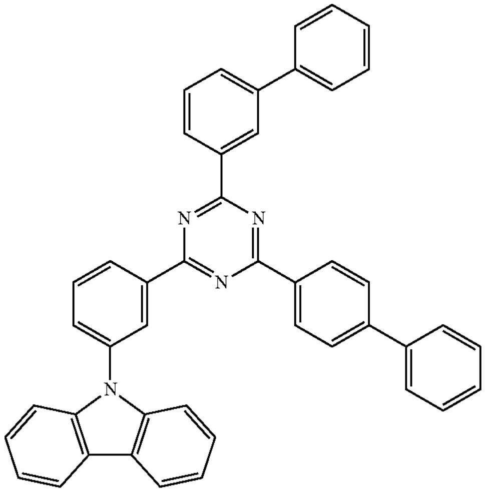
H2-24
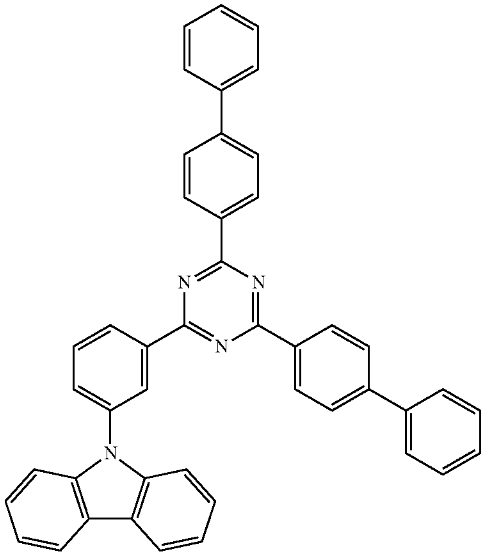
H2-25
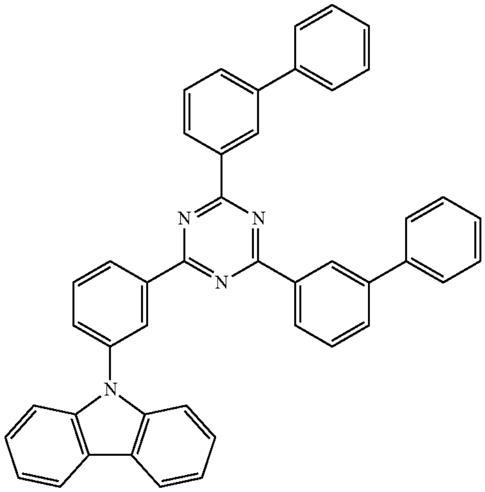

-continued
H2-26
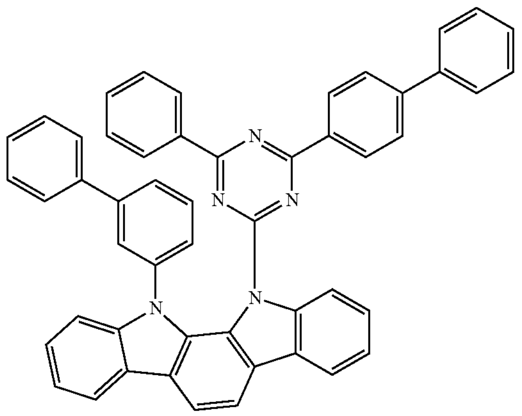
H2-27
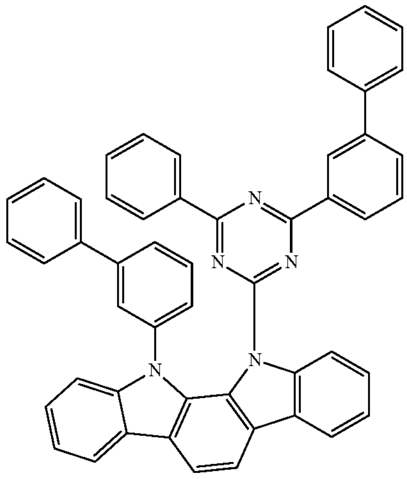
H2-28
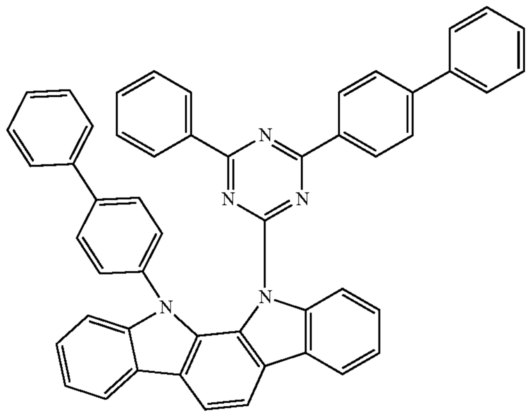
-continued
H2-29
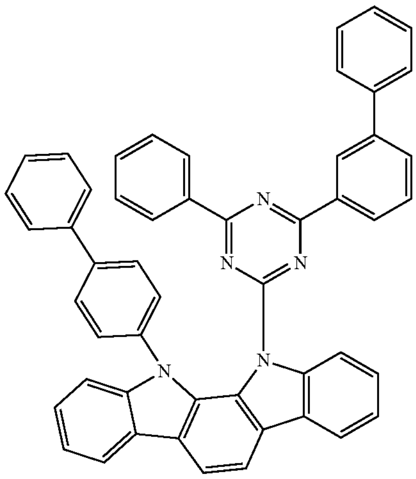
H2-30
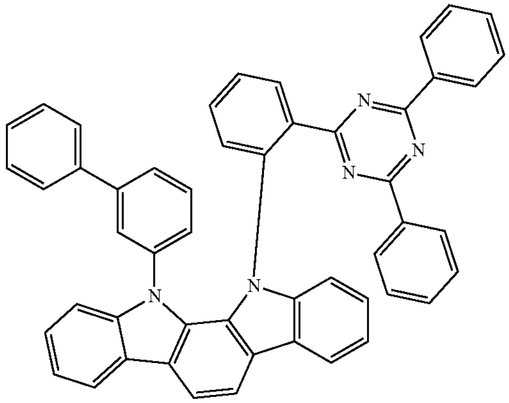
H2-31
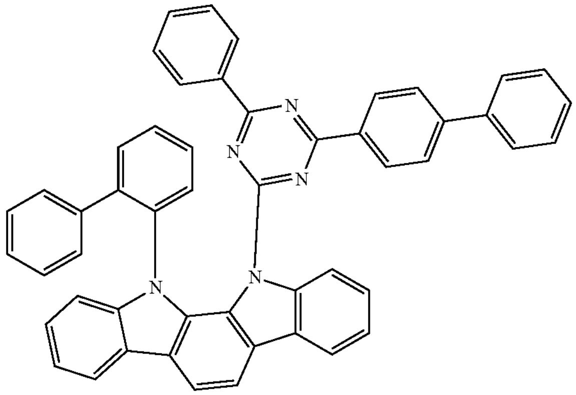

-continued

H2-32

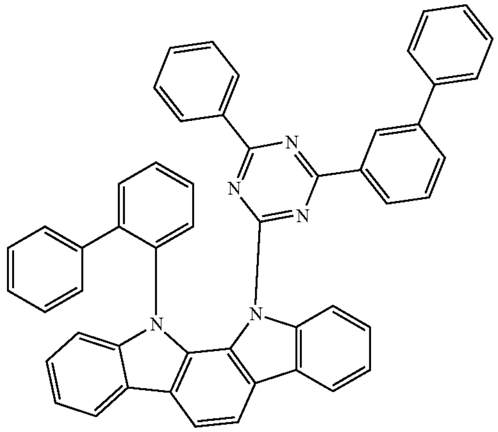

H2-33

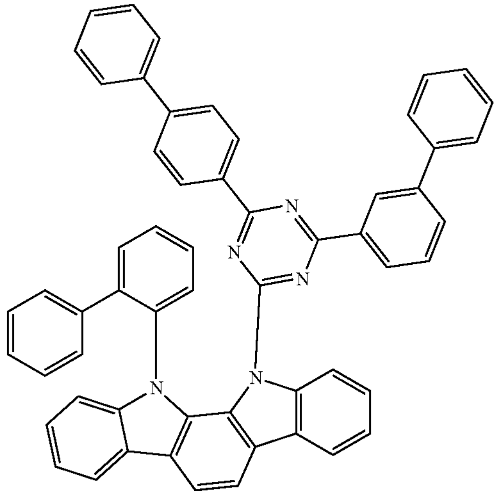

Examples of "$C_1$-$C_{60}$ alkyl group—include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, but embodiments of the present disclosure are not limited thereto.

Examples of the "$C_3$-$C_{10}$ cycloalkyl group" include a cyclopentyl group, a cyclohexyl group, a cycloheptyl group, a cyclooctyl group, an adamantanyl group, a norbornanyl group, a bicyclo[1.1.1]pentyl(bicyclo[1.1.1]pentyl), a bicyclo[2.1.1]hexyl(bicyclo[2.1.1]hexyl), a bicyclo[2.2.1]heptyl (bicyclo[2.2.1]heptyl), a bicyclo[2.2.2]octyl group, but embodiments of the present disclosure are not limited thereto.

The term "π electron-deficient nitrogen-containing cyclic group" used herein refers to a heterocyclic group containing *═N—*' as a ring-forming moiety.

The term "π electron-deficient nitrogen-free cyclic group" used herein refers to a carbocyclic or heterocyclic group that does not include *═N—*' as a ring-forming moiety.

Therefore, the composition including the first compound represented by Formula 1, the second compound represented by Formula 2, and the third compound represented by Formula 3 is suitable for use in an organic layer of an organic light-emitting device, for example, as an emission layer material in the organic layer. Accordingly, another aspect provides: an organic light-emitting device including: a first electrode; a second electrode; and an organic layer located between the first electrode and the second electrode, including an emission layer, and containing the composition.

The organic light-emitting device may have, due to the inclusion of the composition including the first compound through the third compound, a low driving voltage, high efficiency, high power, high quantum efficiency, a long lifespan, a low roll-off ratio, and excellent color purity.

The composition may be used between a pair of electrodes in an organic light-emitting device. In an embodiment, the composition may be included in the emission layer. In this regard, the first compound may act as a dopant, and the second compound and the third compound may each act as a host (for example, a co-host). In an embodiment, the total amount of the second compound and the third compound may be greater than the amount of the first compound. The emission layer may emit, for example, red light having a maximum emission wavelength of about 550 nm or more (for example, equal to or greater than about 550 nm and less than or equal to about 900 nm).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one embodiment, in the organic light-emitting device, the first electrode is an anode, and the second electrode is a cathode, and the organic layer may further include a hole transport region between the first electrode and the emission layer and an electron transport region between the emission layer and the second electrode, and the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIG. 1s a schematic cross-sectional view of an organic light-emitting device 10 according to an exemplary embodiment. Hereinafter, the structure of an organic light-emitting device according to an embodiment of the present disclosure and a method of manufacturing an organic light-emitting device according to an embodiment of the present disclosure will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be a material with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/see to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one m-MTDATA, TDATA, 2-TNATA, NPB, β-NPB, TPD, Spiro-TPD, Spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

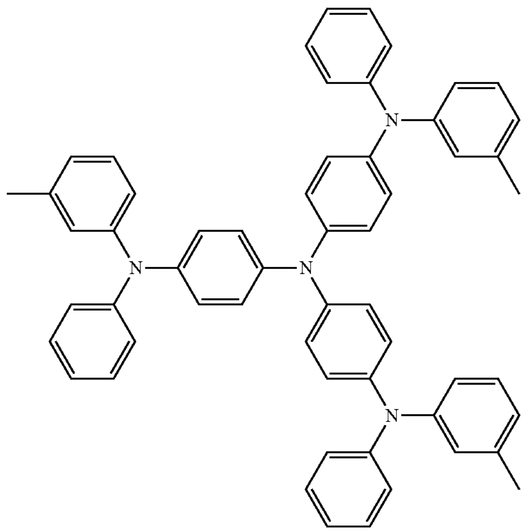

m-MTDATA

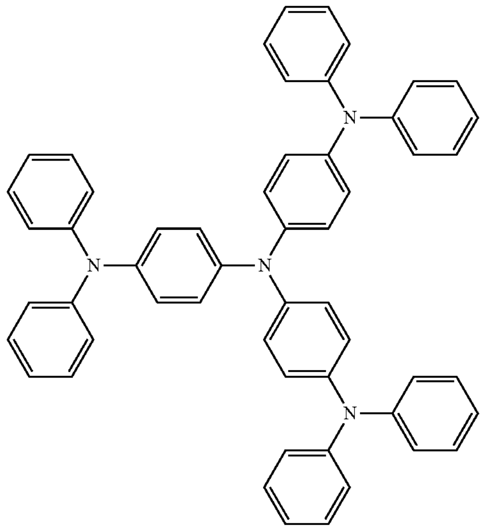

TDATA

-continued
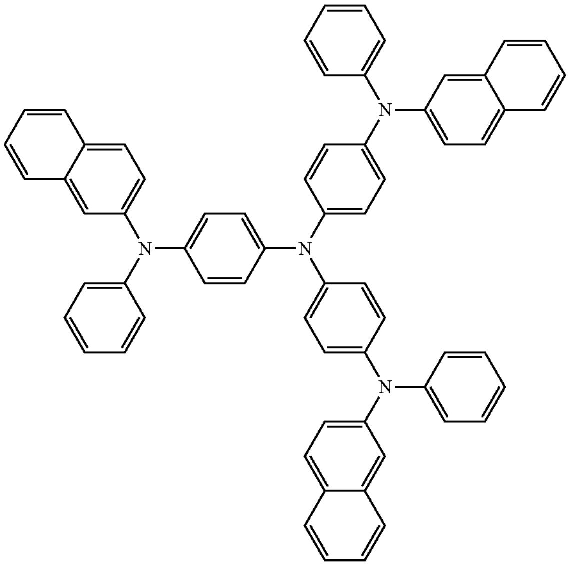
2-TNATA
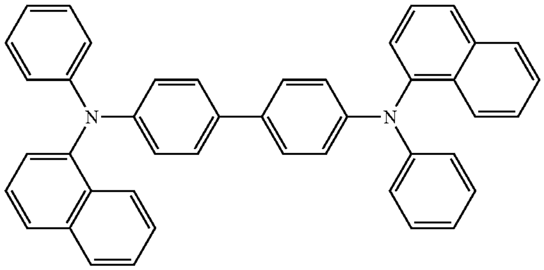
NPB
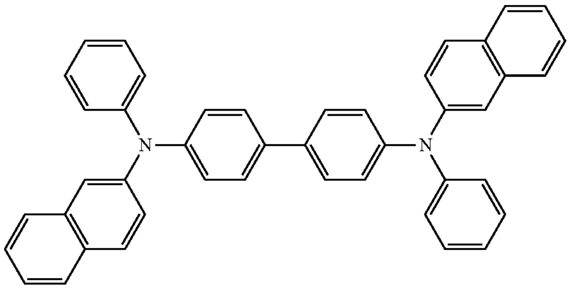
β-NPB
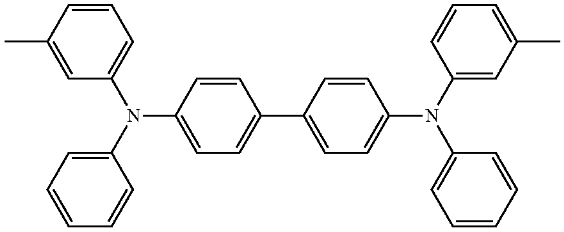
TPD
-continued
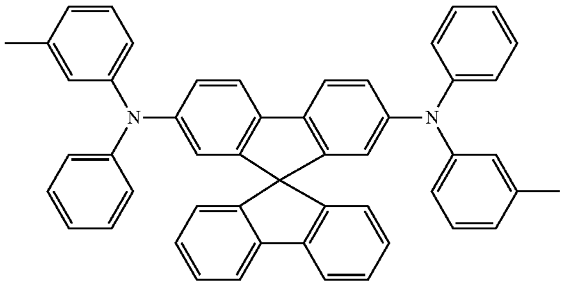
Spiro-TPD
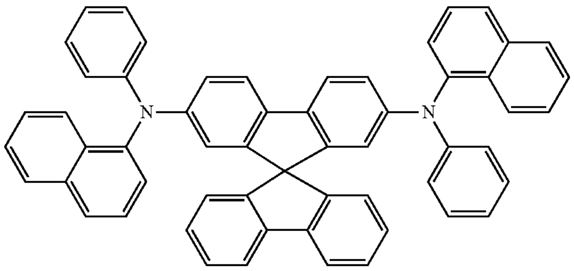
Spiro-NPB
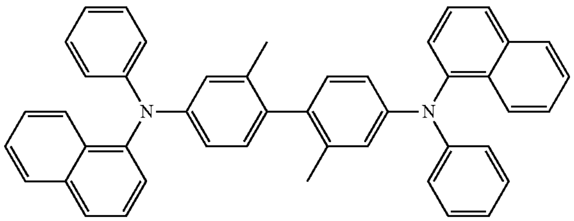
methylated NPB
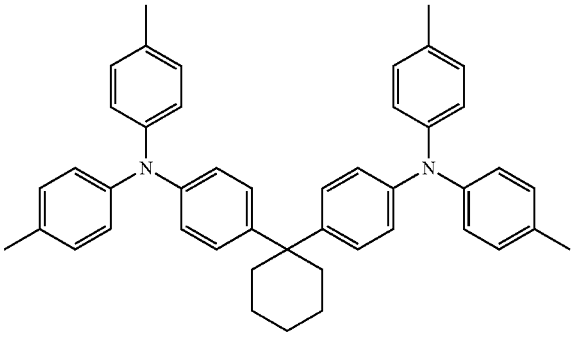
TAPC
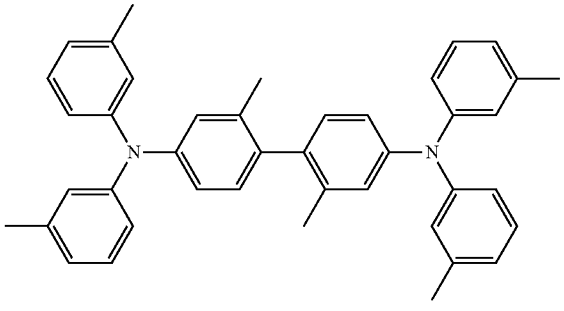
HMTPD -continued Formula 201

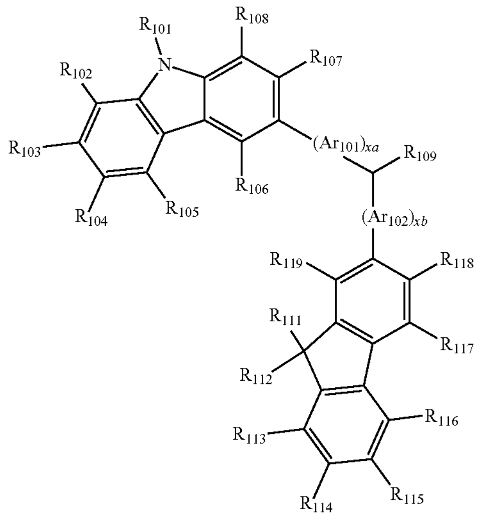

Formula 202

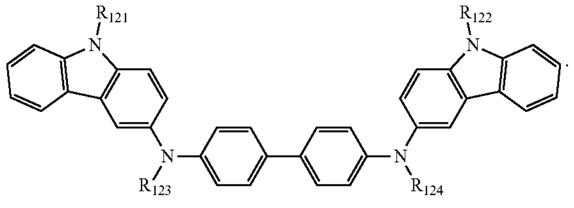

$Ar_{101}$ to $Ar_{102}$ in Formula 201 may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, or any combination thereof.

hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_{11}$-$C_{10}$ heterocycloalkyl group, a $C_3$-$C_{10}$ cycloalkenyl group, a $C_1$-$C_{10}$ heterocycloalkenyl group, a $C_5$-$C_{20}$ aryl group, a $C_1$-$C_{20}$ heteroaryl group, a monovalent non-aromatic condensed polycyclic group, or a monovalent non-aromatic condensed heteropolycyclic group.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof, but embodiments of the present disclosure are not limited thereto.

$R_{109}$ in Formula 201 may be:

a phenyl group, a naphthyl group, an anthracenyl group, or a pyridinyl group; and a phenyl group, a naphthyl group, an anthracenyl group, or a pyridinyl group, each substituted with at least one a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof, hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, or a monovalent non-aromatic condensed heteropolycyclic group.

According to an embodiment, the compound represented by Formula 201 may be represented by Formula 201A below, but embodiments of the present disclosure are not limited thereto:

Formula 201A

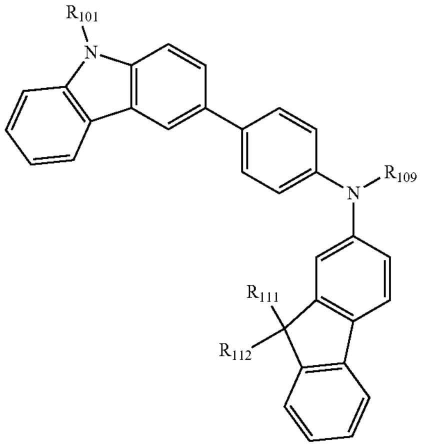

$R_{101}$, $R_{111}$, $R_{112}$, and $R_{109}$ in Formula 201A may be understood by referring to the description provided herein.

For example, the compound represented by Formula 201, and the compound represented by Formula 202 may each include a compound of HT1 to HT20 illustrated below, but are not limited thereto:

HT1

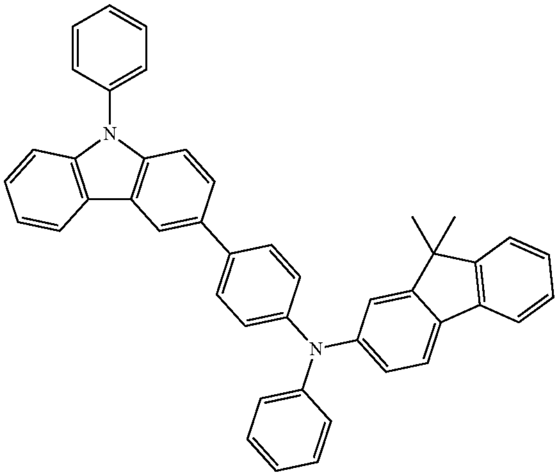

-continued

HT2

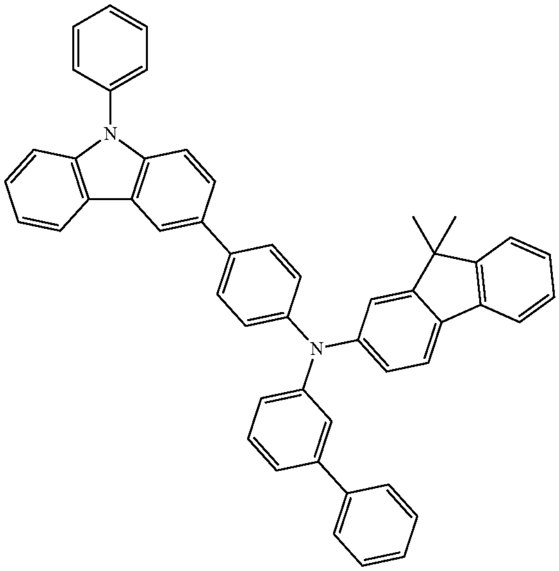

HT3

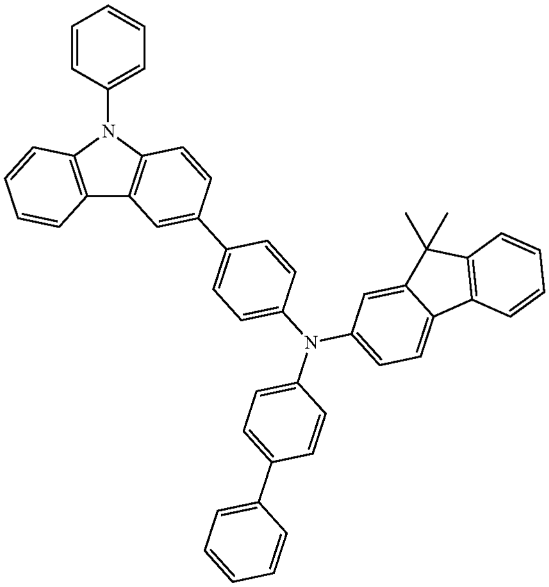

-continued
HT4
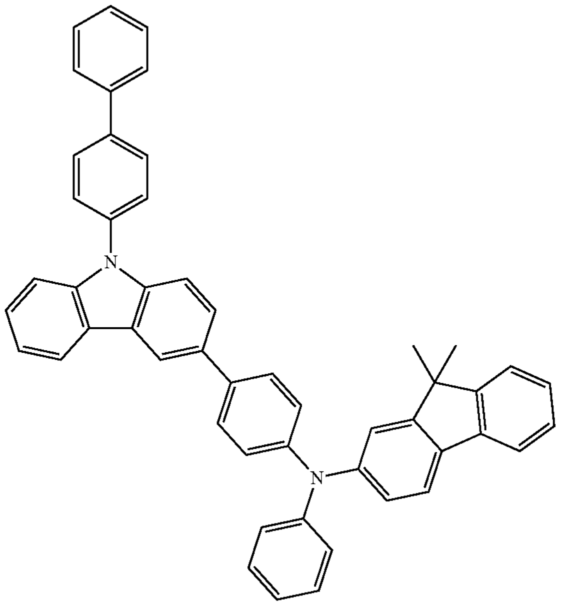
HT5
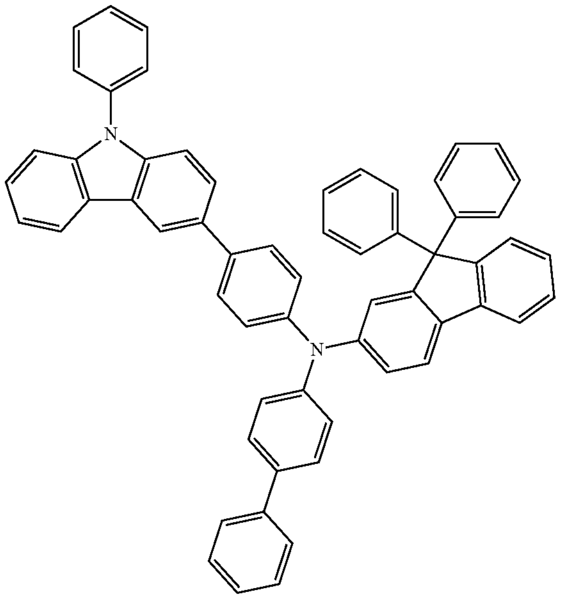
-continued
HT6
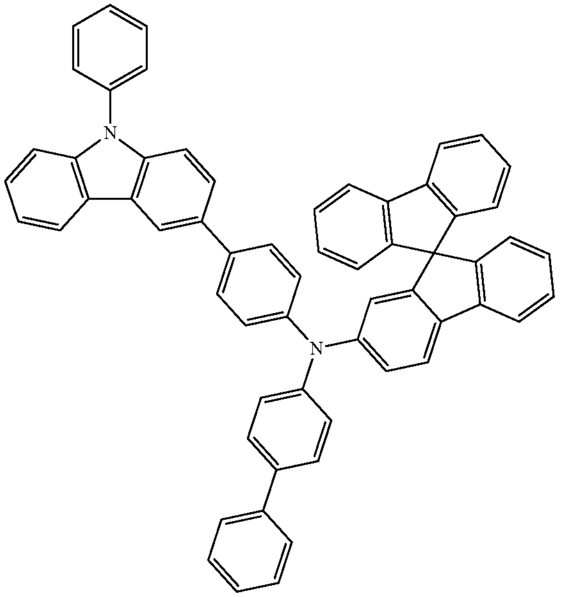
HT7
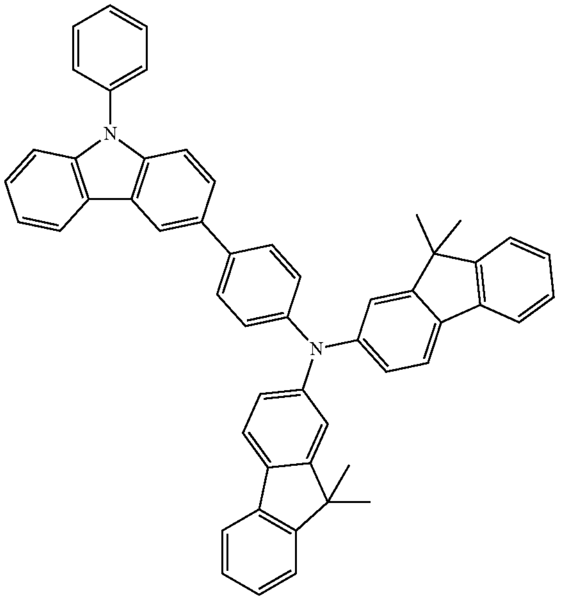

-continued
HT8
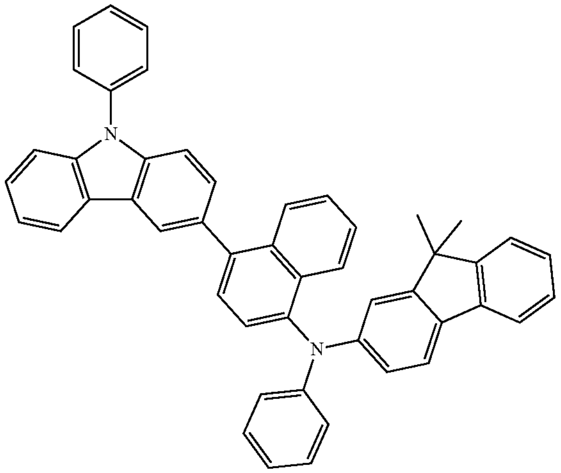
HT9
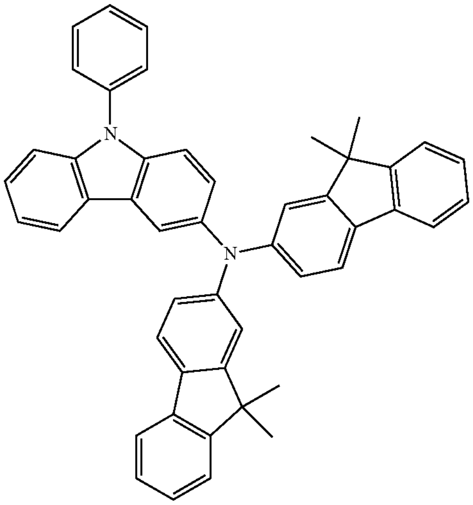
HT10
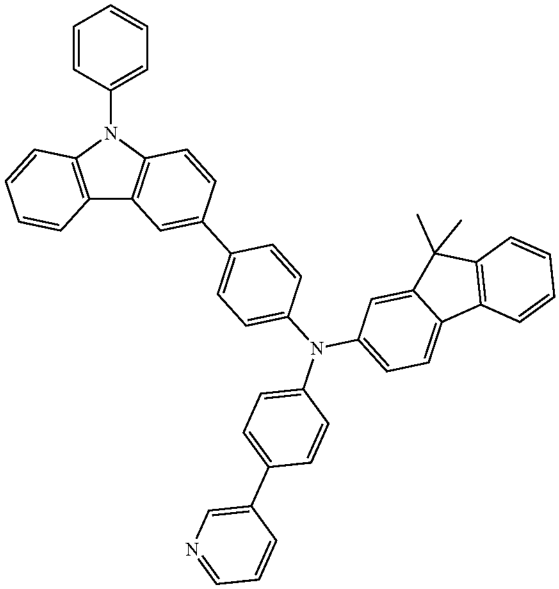
-continued
HT11
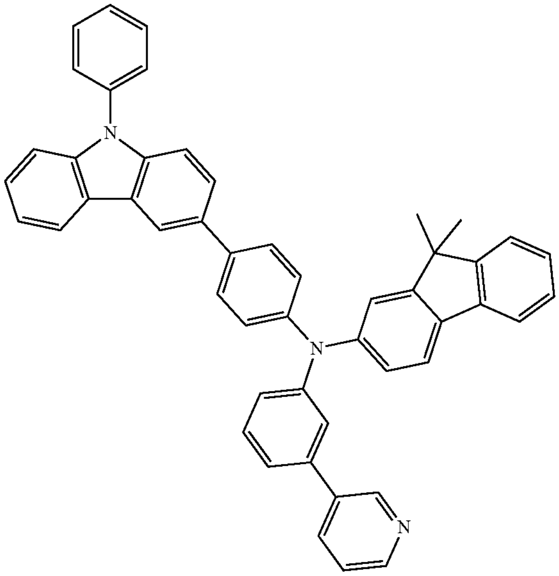
HT12
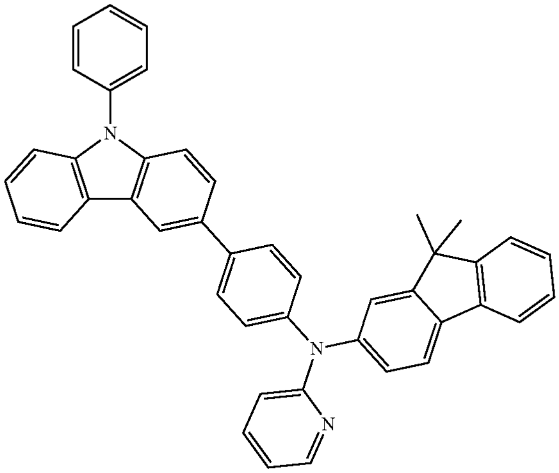
HT13
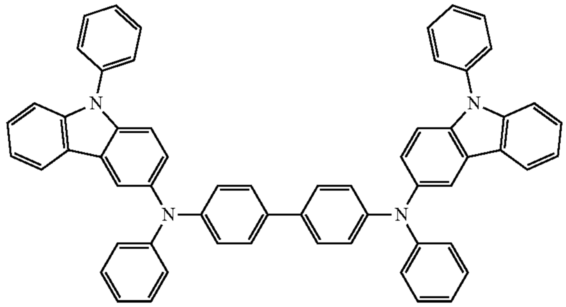

-continued

HT14

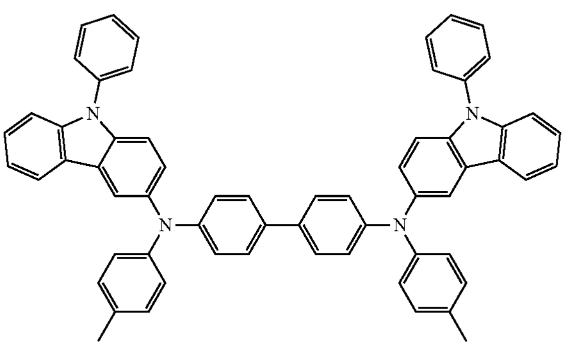

HT15

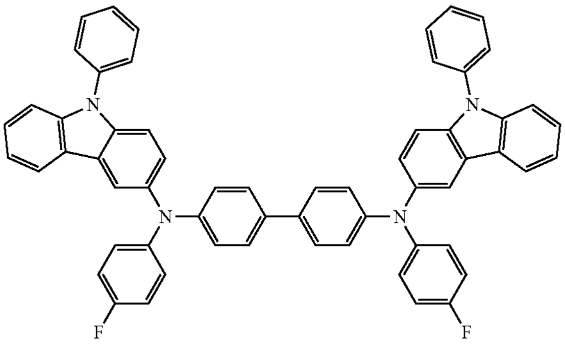

HT16

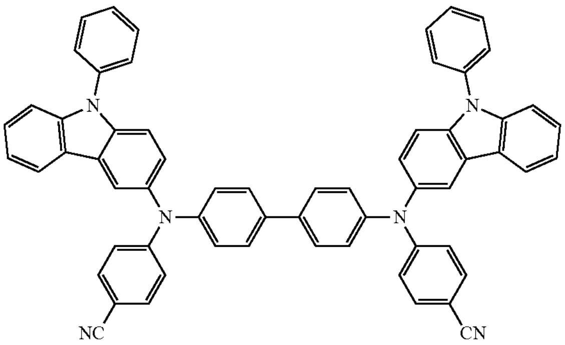

HT17

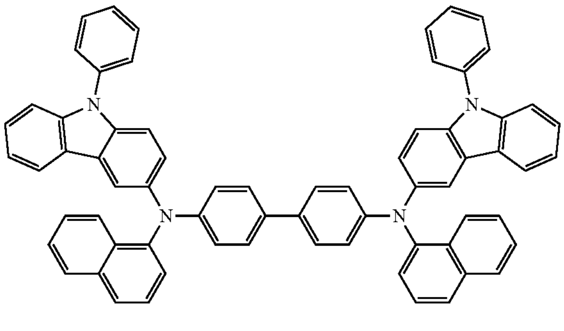

-continued

HT18

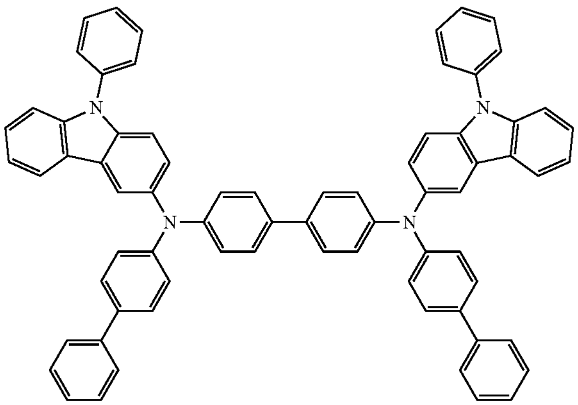

HT19

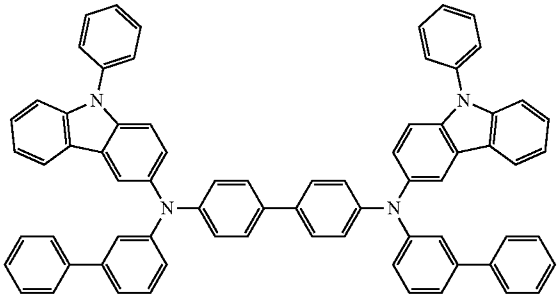

HT20

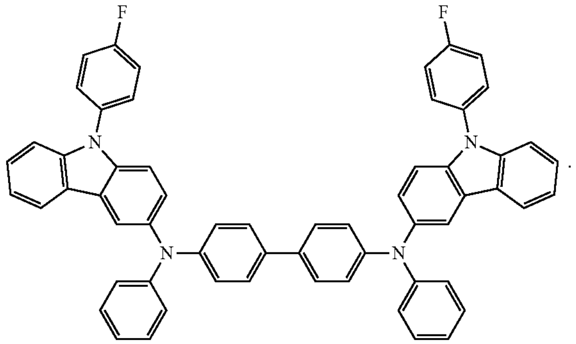

A thickness of the hole transport region may be in the range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Examples of the p-dopant include: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto.

HT-D1

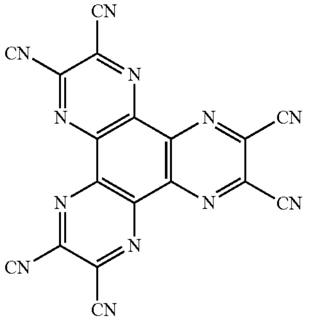

F4-TCNQ

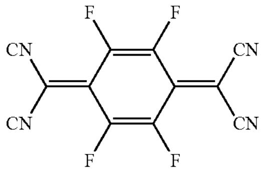

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

Meanwhile, when the hole transport region includes an electron blocking layer, a material for the electron blocking layer may include a material for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include the composition including the first compound, the second compound, and the third compound as described herein.

In an embodiment, the emission layer may include a host and a dopant, the dopant includes the first compound represented by Formula 1, and the host may include the second compound represented by Formula 2 and the third compound represented by Formula 3.

The weight ratio of the second compound to the third compound may be from 1:9 to 9:1, from 2:8 to 8:2, from 3:7 to 7:3, or from 4:6 to 6:4. In an embodiment, the weight ratio of the second compound and the third compound may be 5:5, but embodiments of the present disclosure are not limited thereto.

Meanwhile, the emission layer may further include other dopant and/or host in addition to the composition described in the present specification.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in the range of about 100 Å to about 1,000 Å, for example, about 200 Å to about 600 Å. When the thickness of the emission layer satisfies the ranges described above, excellent luminescence characteristics may be exhibited without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

BCP

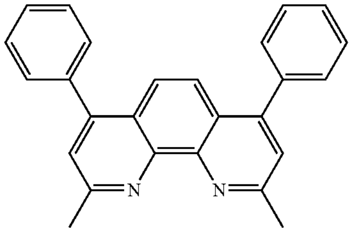

Bphen

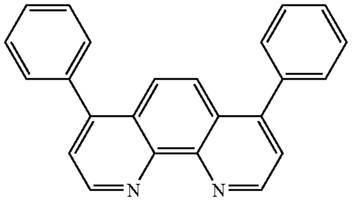

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include at least one BCP, Bphen, Alq3, BAIq, TAZ, NTAZ, or any combination thereof.

Alq$_3$

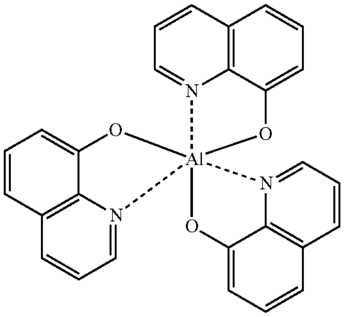

BAlq

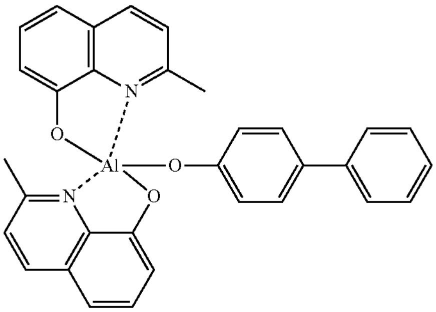

TAZ

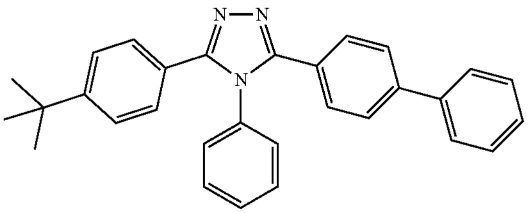

NTAZ

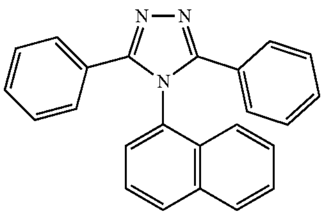

In one or more embodiments, the electron transport layer may include at least one of ET1 to ET25, but are not limited thereto:

ET1

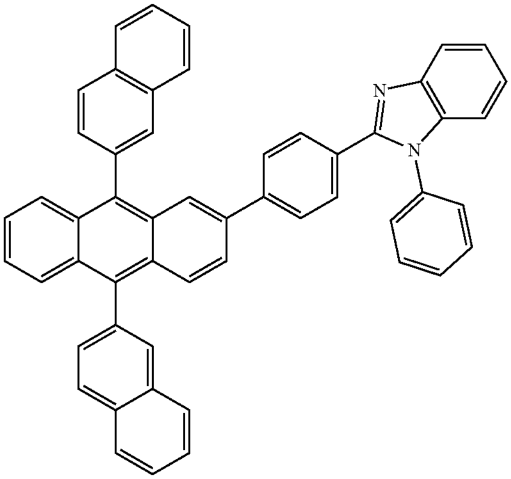

ET2

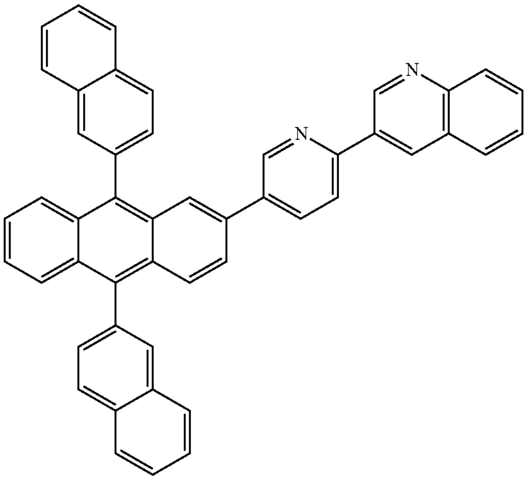

ET3

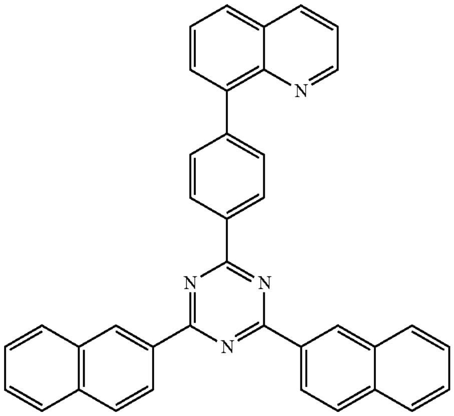

-continued
ET4
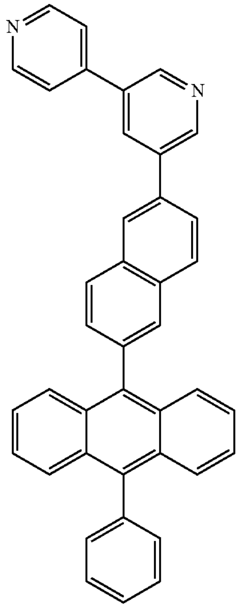
ET5
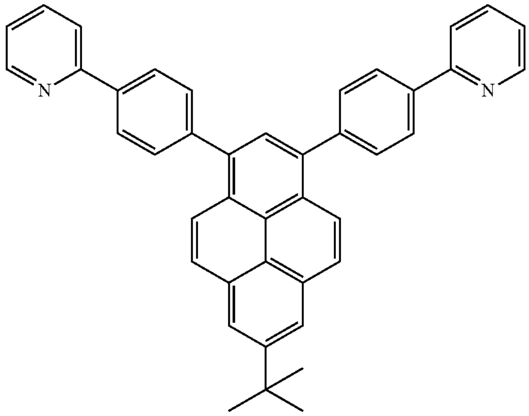
ET6
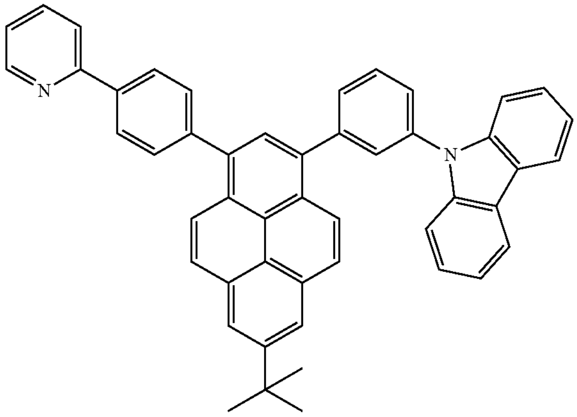
-continued
ET7
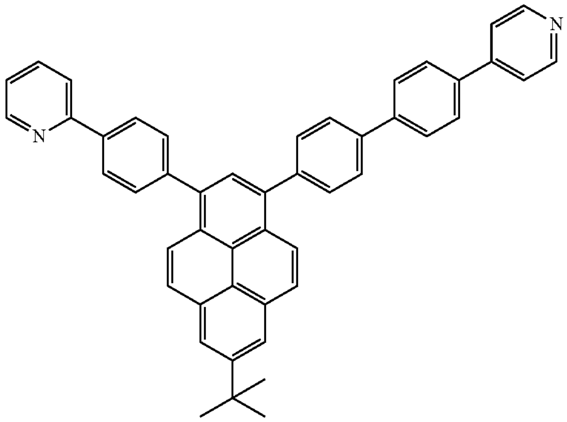
ET8
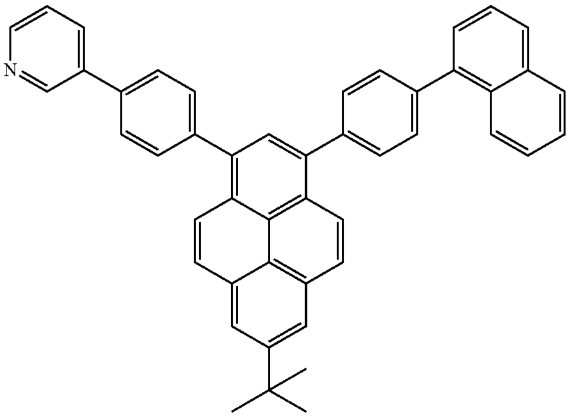
ET9
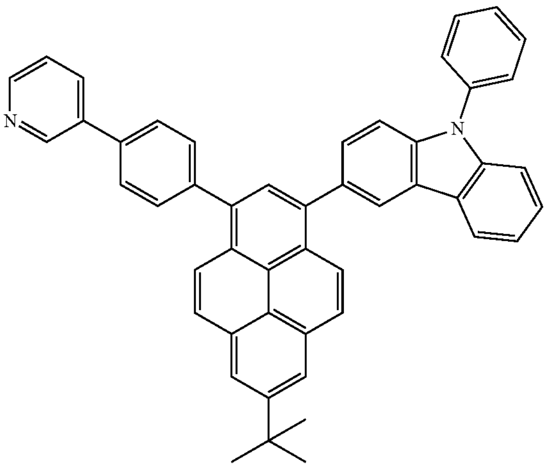

-continued
ET10
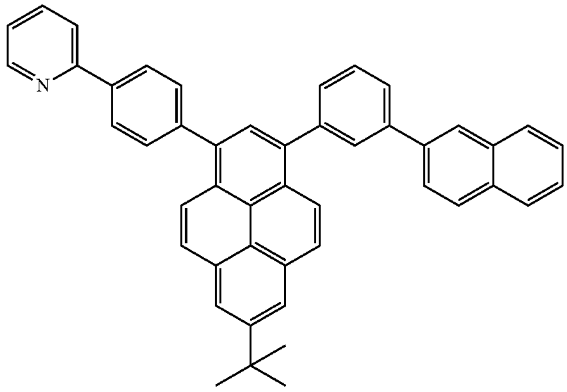
ET11
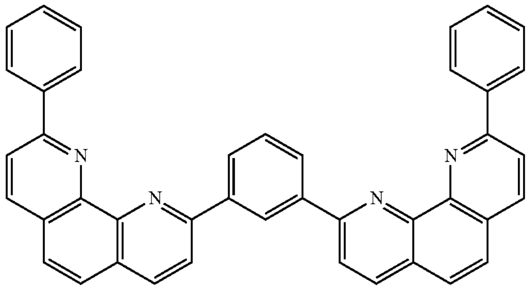
ET12
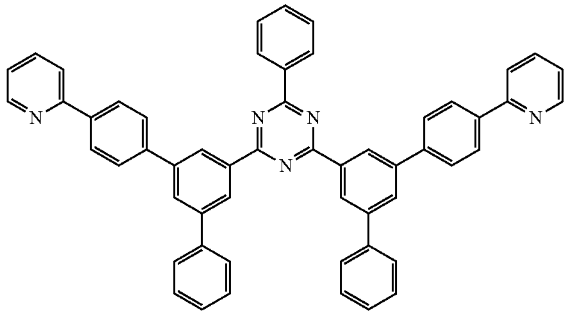
ET13
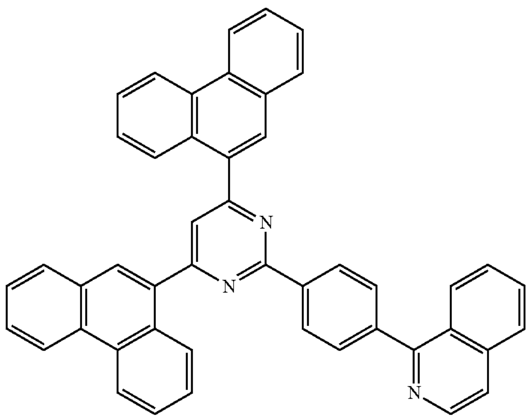
-continued
ET14
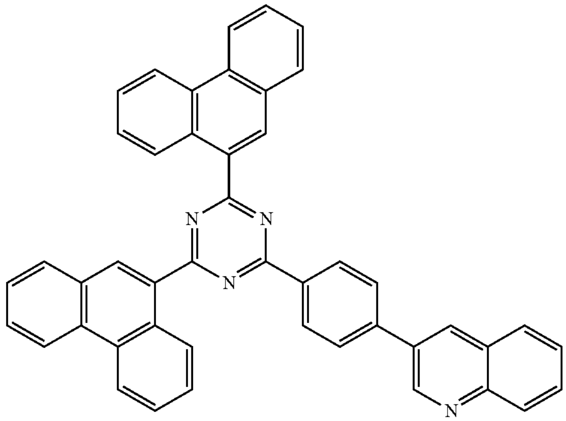
ET15
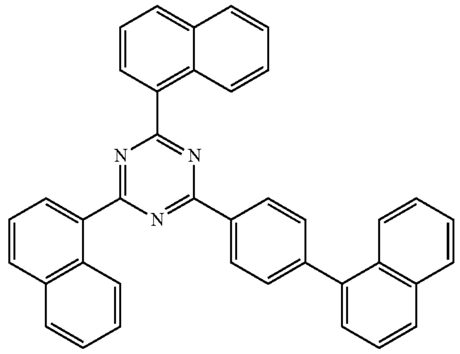
ET16
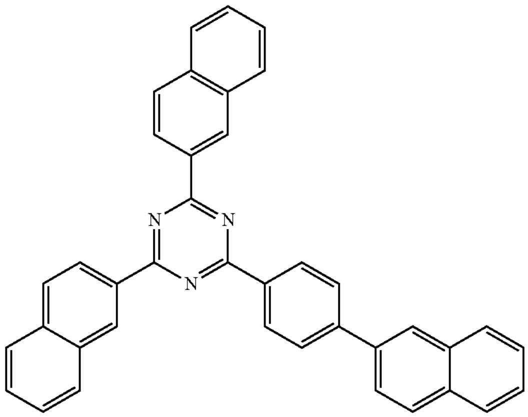

-continued
ET17
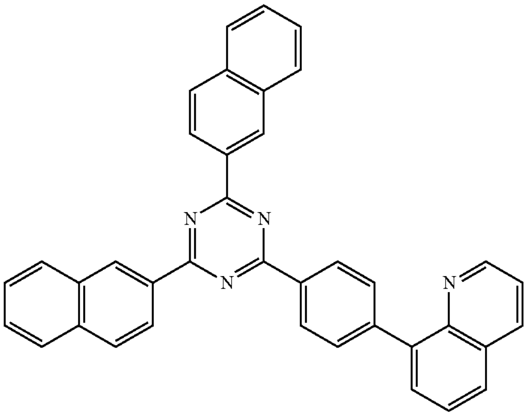
ET18
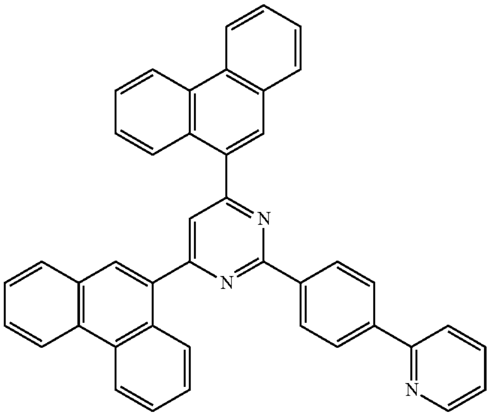
ET19
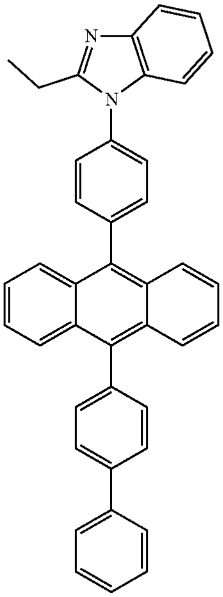
-continued
ET20
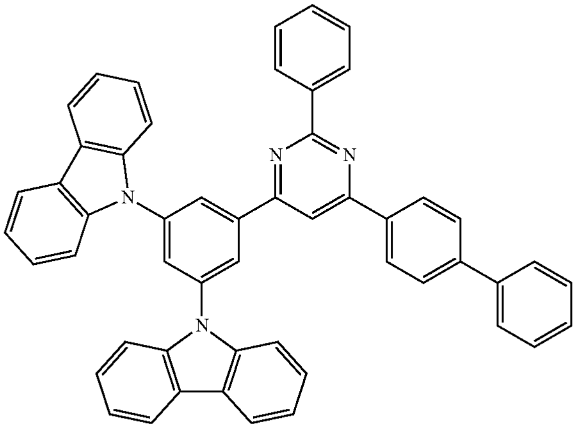
ET21
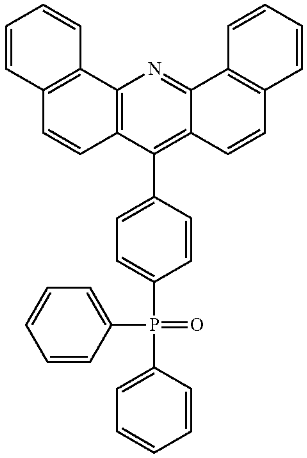
ET22
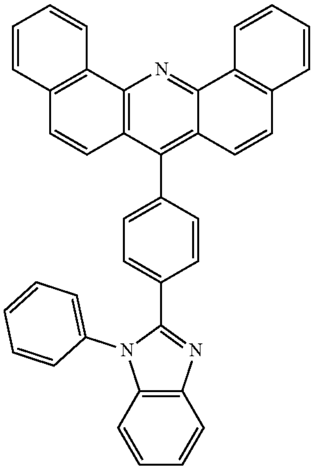

-continued

ET23

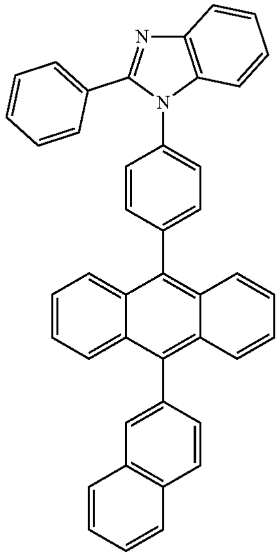

ET24

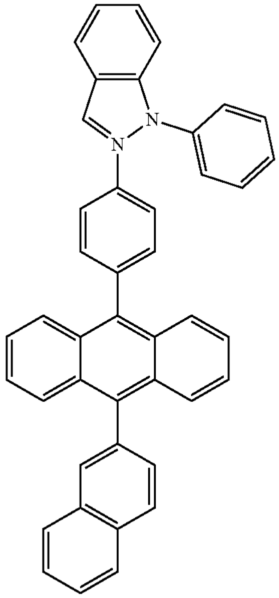

ET25

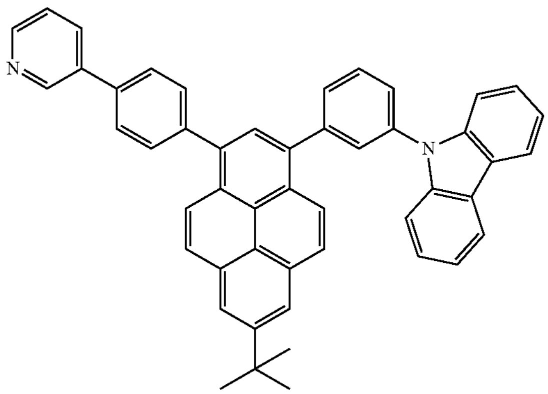

A thickness of the electron transport layer may be in the range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

ET-D1

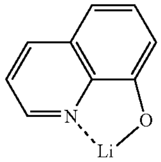

ET-D2

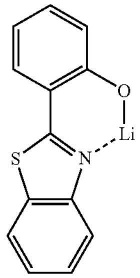

The electron transport region may include an electron injection layer (EIL) that promotes the flow of electrons from the second electrode 19 thereinto.

The electron injection layer may include at least one LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by —$OA_{101}$(wherein $A_{101}$ is the $C_1$-$C_{60}$ alkyl group), and examples thereof include a methoxy group, an ethoxy group, and an isopropyloxy group.

The term "$C_2$-$C_6$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one of N, O, P, Si, S, B, Se, Ge, Te, or any combination thereof as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom N, O, P, Si, S, B, Se, Ge, Te, or any combination thereof as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one of N, O, P, Si, S, B, Se, Ge, Te, or any combination thereof as a ring-forming atom, and 1 to 60 carbon atoms. The term "$C_1$-$C_{60}$ heteroarylene group" as used herein refers to a divalent group having a carbocyclic aromatic system that has at least one of N, O, P, S, B, Se, Ge, Te, or any combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates -$SA_{103}$(wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom of N, O, P, Si, S, B, Se, Ge, Te, or any combination thereof other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom of N, O, Si, P, S, B, Se, Ge, Te, or any combination thereof other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Examples. However, the present disclosure is not limited to the following examples.

EXAMPLES

Example 1

As an anode, a glass substrate with ITO/Ag/ITO deposited thereon to a thickness of 70/1000/70 Å was cut to a size of 50 mm×50 mm×0.5 mm, sonicated with isopropyl alcohol and pure water each for 5 minutes, and then cleaned by exposure to ultraviolet rays and ozone for 30 minutes. Then the resultant glass substrate was loaded onto a vacuum deposition apparatus.

Compounds HT3 and F6-TCNNQ were vacuum-codeposited on the anode at the weight ratio of 98:2 to form a hole injection layer having a thickness of 100 Å, and Compound HT3 was vacuum deposited on the hole injection layer to form a hole transport layer having a thickness of 1,650 Å.

Then, a host (a mixture including Compound H1-2 and Compound H2-12 (the weight ratio of 5:5)) and a dopant (Compound 15 of Group II) were co-deposited at the weight ratio of 98:2 on the hole transport layer to form an emission layer having a thickness of 400 Å.

Thereafter, BCP was vacuum-deposited on the emission layer to form a hole blocking layer having a thickness of 50 Å, $Alq_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing an organic light-emitting device (emitting red light).

2-TNATA

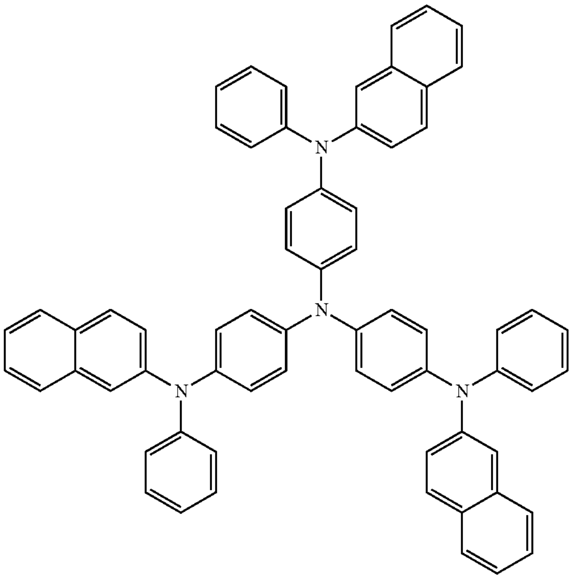

NPB

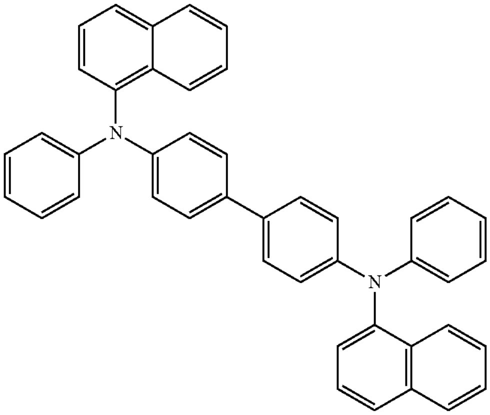

-continued

CBP

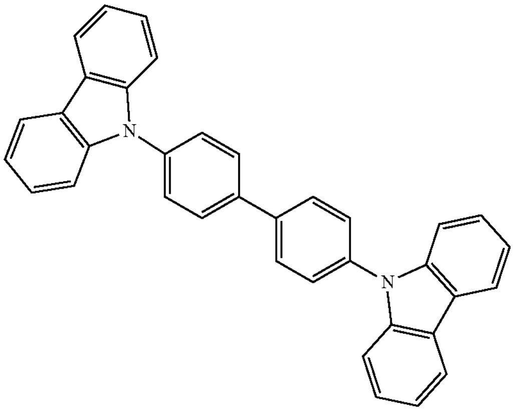

BCP

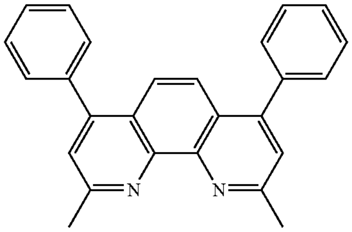

Examples 2 to 4 and Comparative Examples 1 to 4

Organic light-emitting devices were manufactured in the same manner as in Example 1, except that, in forming an emission layer, for use as a host and a dopant, corresponding compounds shown in Table 3 were used.

Evaluation Example 1: Characterization of Organic Light-Emitting Device

The driving voltage, current density, external quantum efficiency (EQE), FWHM of the EL spectrum, emission color, color coordinates, and lifespan ($T_{97}$) of the organic light-emitting devices manufactured according to Examples 1 to 4 and Comparative Examples 1 to 4 were evaluated, and results thereof are shown in Table 3 and Table 4. This evaluation was performed using a current-voltage meter (Keithley 2400) and a luminescence meter (Minolta Cs-1, 000A), and the lifespan ($T_{97}$) (at 3500 nit) was evaluated by measuring the amount of time that elapsed until luminance was reduced to 97% of the initial brightness of 100%. Lifespan ($T_{97}$) and Max EQE (%) were expressed as a relative value (%) to the lifespan and the Max EQE of Comparative Example 1 and Comparative Example 3.

TABLE 3

| | Host compound No. | Dopant compound No. | Driving Voltage Voltage (V) | Max EQE (%) | FWHM (nm) | Emission color | $LT_{97}$ (Relative value, %) |
|---|---|---|---|---|---|---|---|
| Example 1 | H1-2 H2-12 Weight ratio of 5:5 | <Group II> 15 | 4.20 | 109 | 65.0 | green | 130 |
| Example 2 | H1-2 H2-12 Weight ratio of 5:5 Weight ratio of 5:5 | Group I 15 | 4.18 | 113 | 64.7 | green | 105 |

TABLE 3-continued

| | Host compound No. | Dopant compound No. | Driving Voltage Voltage (V) | Max EQE (%) | FWHM (nm) | Emission color | $LT_{97}$ (Relative value, %) |
|---|---|---|---|---|---|---|---|
| Comparative Example 1 | H1-2 H2-12 Weight ratio of 5:5 | A | 4.24 | 100 | 73.5 | green | 100 |
| Comparative Example 2 | H1-2 H2-12 Weight ratio of 5:5 Weight ratio of 5:5 | B | 4.22 | 105 | 65.2 | green | 73 |

TABLE 4

| | Host compound No. | Dopant compound No. | Driving Voltage Voltage (V) | Max EQE (%) | FWHM (nm) | Emission color | $LT_{97}$ (Relative value, %) |
|---|---|---|---|---|---|---|---|
| Example 3 | H1-8 H2-13 Weight ratio of 5:5 | Group II 15 | 4.19 | 111 | 66.2 | green | 156 |
| Example 4 | H1-8 H2-13 Weight ratio of 5:5 | Group I 15 | 4.14 | 115 | 65.5 | green | 109 |
| Comparative Example 3 | H1-8 H2-13 Weight ratio of 5:5 | A | 4.21 | 100 | 75.0 | green | 100 |
| Comparative Example 4 | H1-8 H2-13 Weight ratio of 5:5 | B | 4.16 | 103 | 65.7 | green | 63 |

Group II

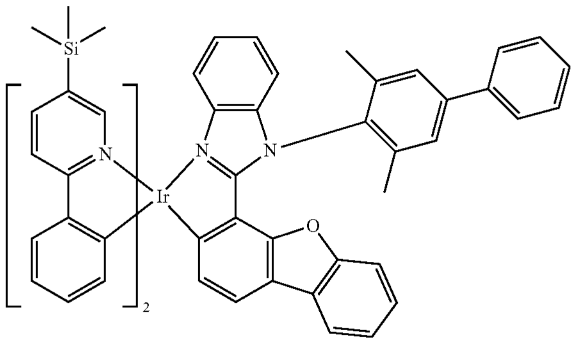

15

Group I

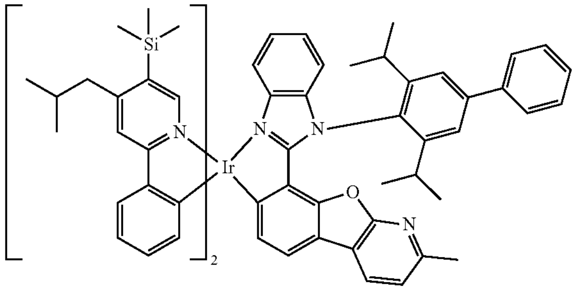

15

-continued

H1-2

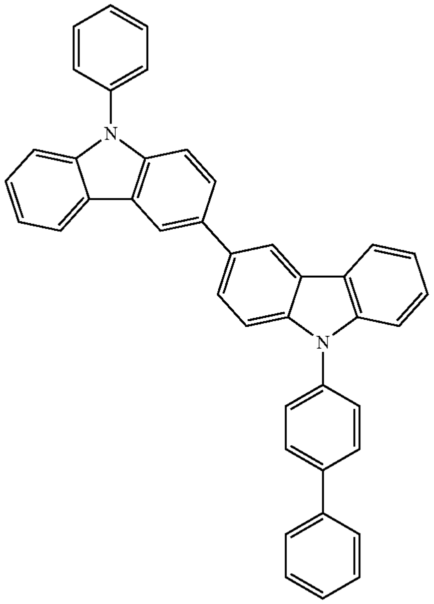

-continued

H1-8

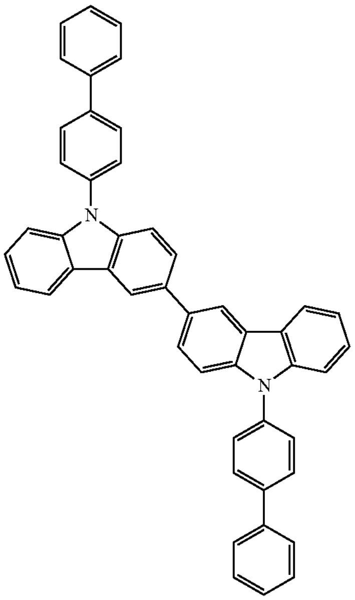

H2-12

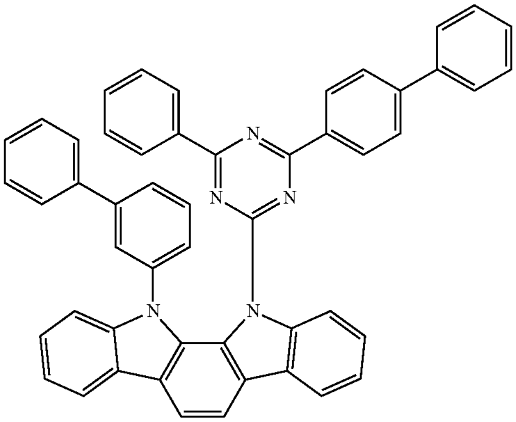

H2-13

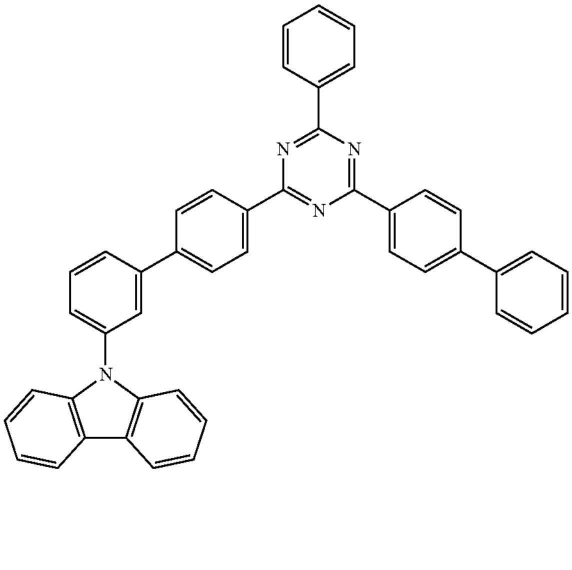

-continued

A

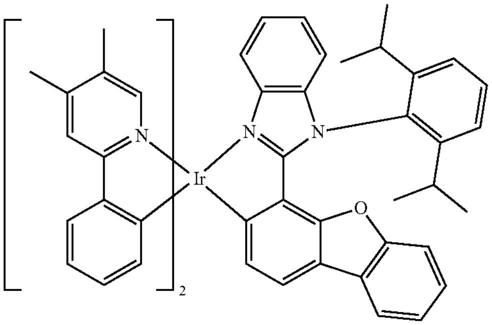

B

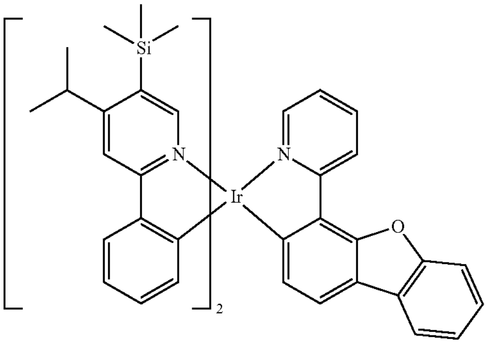

From Table 3, it is seen that the organic light-emitting devices of Examples 1 and 2 have lower driving voltage, higher external quantum efficiency, and better lifespan characteristics compared to the organic light-emitting devices of Comparative Examples 1 and 2.

From Table 4, it is seen that the organic light-emitting devices of Example 3 and 4 have lower driving voltage, higher external quantum efficiency, and better lifespan characteristics compared to the organic light-emitting devices of Comparative Examples 3 and 4.

The composition has excellent electrical characteristics and stability. Thus, an electronic device using the composition, for example, an organic light-emitting device using the composition, may have improved characteristics in terms of driving voltage, current density, efficiency, power, color purity, and/or lifespan characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A composition comprising:

at least one first compound, at least one second compound and at least one third compound;

the at least one first compound is represented by Formula 1;

the at least one second compound has a highest occupied molecular orbital (HOMO) energy level of about −5.5 eV or higher; and the at least one third compound has a lowest unoccupied molecular orbital (LUMO) energy level of about −2.8 eV or less:

$M(L_1)_{n1}(L_2)n_2$ Formula 1 wherein, in Formula 1,

M is Ir, $L_1$ is a ligand represented by Formula 1-1, $L_2$ is a ligand represented by Formula 1-2A or 1-2B, n1 is 2, and n2 is 1, Formula 1-1

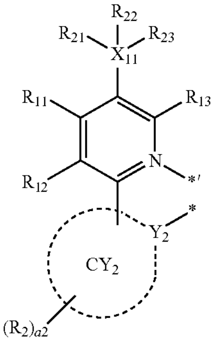

Formula 1-2A

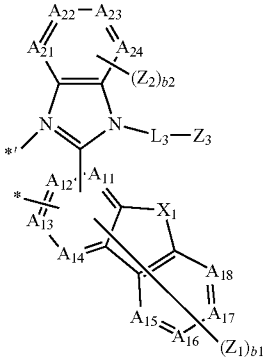

Formula 1-2B

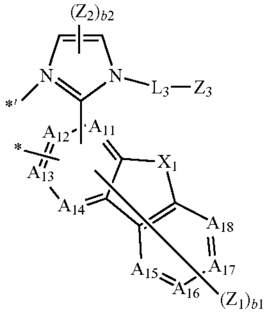

wherein, in Formulae 1-1 and 1-2A and 1-2B, $Y_2$ is C or N, ring $CY_2$ is a $C_5$-$C_{30}$ carbocyclic group or a $C_1$-$C_{30}$ heterocyclic group, $X_{11}$ is Si or Ge, $X_1$ is O, S, Se, $N(Z_{19})$, $C(Z_{19})(Z_{20})$, or $Si(Z_{19})(Z_{20})$, $A_{11}$ to $A_{14}$ are each independently C, N, C bonded to C between two N of a neighboring 5-membered ring, or C bonded to M in Formula 1, and one of $A_{11}$ to $A_{14}$ is C bonded to C between two N of a neighboring 5-membered ring, and one of the others of $A_{11}$ to $A_{14}$ is C bonded to M in Formula 1, and $A_{15}$ to $A_{18}$ and $A_{21}$ to $A_{24}$ are each independently be C or N, at least one of i) to iii) is true:

i) provided that in Formula 1-2A, at least one of $A_{11}$ to $A_{18}$ is N and/or at least one of $A_{21}$ to $A_{24}$ is N, and provided that in Formula 1-2B, at least one of $A_{11}$ to $A_{18}$ is N, ii) $Z_1$ is a substituted or unsubstituted $C_6$-$C_{60}$ aryl group, and iii) b1 is an integer from 2 to 6, and two or more of a plurality of $Z_1$(s) are linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $L_3$ is a single bond, a $C_5$-$C_{30}$ carbocyclic group unsubstituted or substituted with at least one $R_{10}$, or a $C_1$-$C_{30}$ heterocyclic group unsubstituted or substituted with at least one $R_{10}$, $R_2$, $R_{10}$ to $R_{13}$, $R_{21}$ to $R_{23}$, $Z_1$ to $Z_3$, $Z_{19}$, and $Z_{20}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or $P(Q_8)(Q_9)$, a2 is an integer of 0 to 20, wherein, when a2 is 2 or more, two or more of $R_2$(s) are identical to or different from each other, b1 is an integer from 0 to 6, wherein, when b1 is 2 or more, two or more of $Z_1$(s) are identical to or different from each other, b2 is an integer from 0 to 4, wherein, when b2 is 2 or more, two or more of $Z_2$(s) are identical to or different from each other, $R_{11}$ and $R_{12}$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_1$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_2$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as explained in connection with $Z_1$,

* and *' each indicate a binding site to M in Formula 1, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropoly cyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The composition of claim 1, wherein ring $CY_2$ is a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a silole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

3. The composition of claim 1, wherein $R_2$, $R_{21}$ to $R_{23}$, $Z_1$ to $Z_3$, $Z_{19}$, and $Z_{20}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbomenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_2O$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$; and wherein $Q_1$ to $Q_9$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

4. The composition of claim 1, wherein $R_2$, $R_{10}$ to $R_{13}$, and $Z_1$ are each independently:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterium-containing $C_1$-$C_{20}$ alkyl group, a $C_3$-$C_{10}$ cycloalkyl group, a ($C_1$-$C_{20}$ alkyl)$C_3$-$C_{10}$ cycloalkyl group, a phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof, and $Z_2$ is hydrogen, deuterium, a $C_1$-$C_{20}$ alkyl group, or a deuterium-containing $C_1$-$C_{20}$ alkyl group.

5. The composition of claim 1, wherein at least one of $R_2$ in the number of a2, $Z_1$ in the number of b1, $Z_2$ in the number of b2, and $Z_3$ is not hydrogen.

6. The composition of claim 1, wherein $L_3$ is:

a single bond; or a benzene group, a naphthalene group, a phenanthrene group, a dibenzofuran group, or a dibenzothiophene group, each unsubstituted or substituted with deuterium, a $C_1$-$C_{20}$ alkyl group, a deuterium-containing $C_1$-$C_{20}$ alkyl group, a phenyl group, a ($C_1$-$C_{20}$ alkyl)phenyl group, a naphthyl group, a ($C_1$-$C_{20}$ alkyl)naphthyl group, a phenanthrenyl group, a ($C_1$-$C_{20}$ alkyl)phenanthrenyl group, a dibenzofuranyl group, a dibenzothiophenyl group, or any combination thereof, and $Z_3$ is:

hydrogen, deuterium, or a $C_1$-$C_{20}$ alkyl group; or a phenyl group, a naphthyl group, a phenanthrenyl group, a dibenzofuranyl group, or a dibenzothiophenyl group, each unsubstituted or substituted with deuterium, a $C_1$-$C_{20}$ alkyl group, a deuterium-containing $C_1$-$C_{20}$ alkyl group, a phenyl group, a ($C_1$-$C_{20}$ alkyl)phenyl group, a naphthyl group, a ($C_1$-$C_{20}$ alkyl)naphthyl group, a phenanthrenyl group, a ($C_1$-$C_{20}$ alkyl)phenanthrenyl group, a dibenzofuranyl group, a dibenzothiophenyl group, or any combination thereof.

7. The composition of claim 1, wherein a group represented by

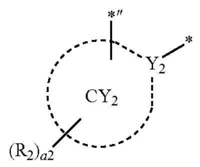

in Formula 1-1 is a group represented by one of Formulae CY2-1 to CY2-33:

CY2-1

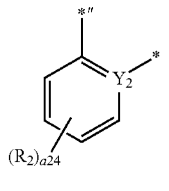

-continued

CY2-2

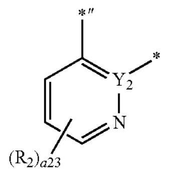

CY2-3

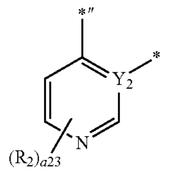

CY2-4

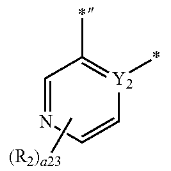

CY2-5

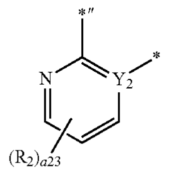

CY2-6

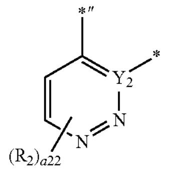

CY2-7

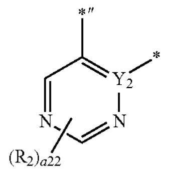

CY2-8

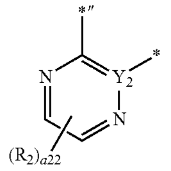

CY2-9

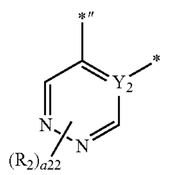

CY2-10

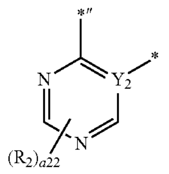

-continued
CY2-11
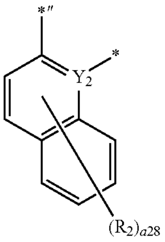
CY2-12
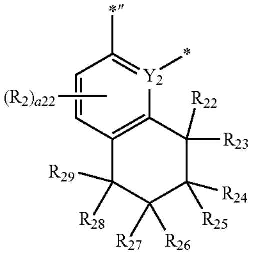
CY2-13
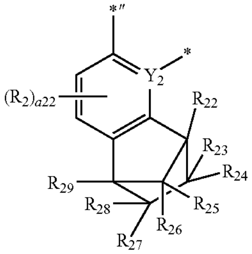
CY2-14
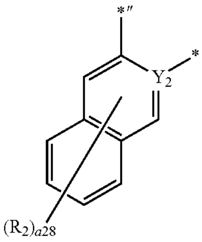
CY2-15
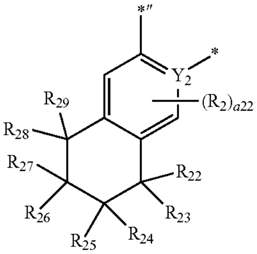
CY2-16
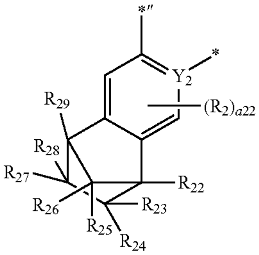
-continued
CY2-17
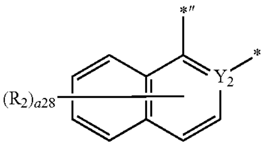
CY2-18
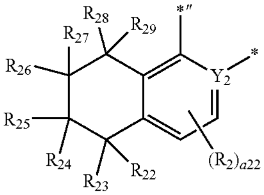
CY2-19
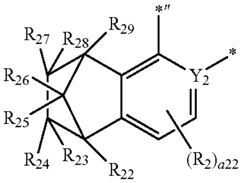
CY2-20
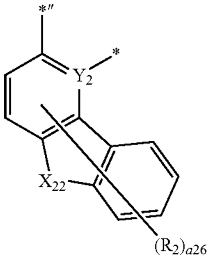
CY2-21
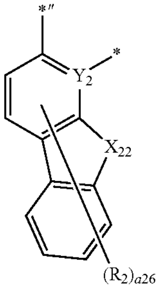
CY2-22
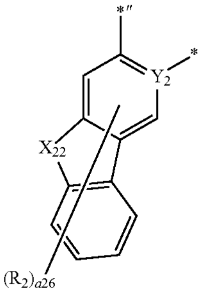

CY2-23

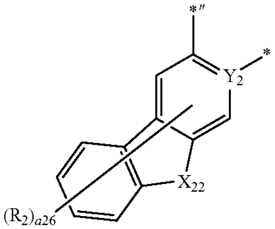

CY2-24

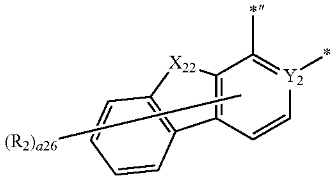

CY2-25

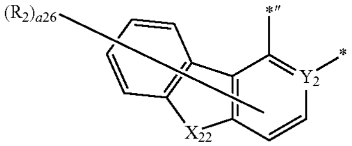

CY2-26

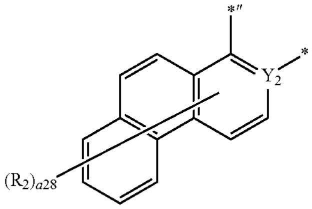

CY2-27

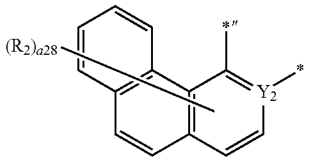

CY2-28

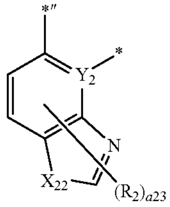

CY2-29

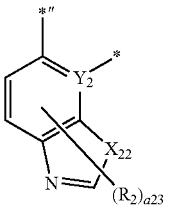

CY2-30

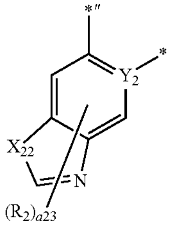

CY2-31

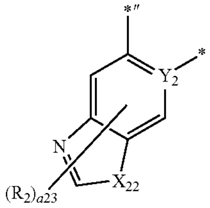

CY2-32

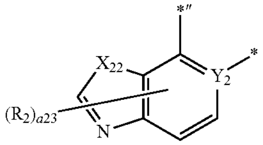

CY2-33

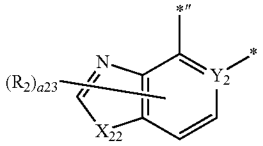

wherein, in Formulae CY2-1 to CY2-33, $Y_2$ and $R_2$ are the same as described in connection with claim 1, $X_{22}$ is $C(R_{24})(R_{25})$, $N(R_{24})$, O, S, or $Si(R_{24})(R_{25})$, $R_{24}$ and $R_{25}$ are the same as described in connection with $R_2$ in claim 1, a28 is an integer from 0 to 8, a26 is an integer from 0 to 6, a24 is an integer from 0 to 4, a23 is an integer from 0 to 3, a22 is an integer from 0 to 2,

*" is a binding site to a neighboring atom in Formula 1-1, and

* is a binding site to M in Formula 1.

8. The composition of claim 1, wherein a group represented by

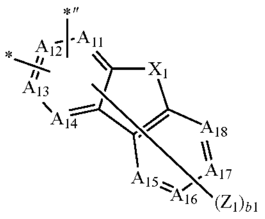

in Formulae 1-2A and 1-2B is a group represented by one of Formulae CY3-1 to CY3-6:

CY3-1

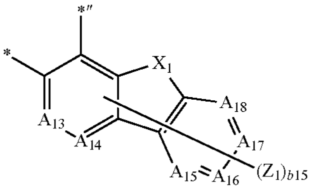

CY3-2

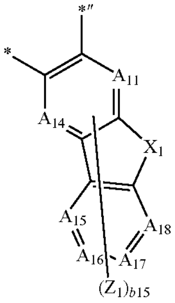

CY3-3

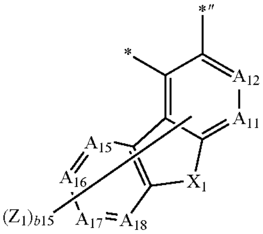

CY3-4

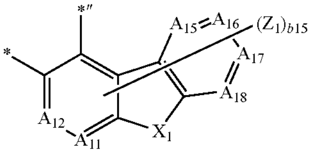

CY3-5

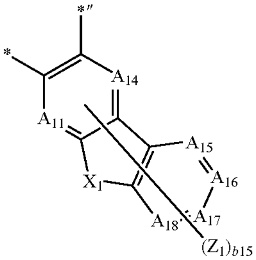

CY3-6

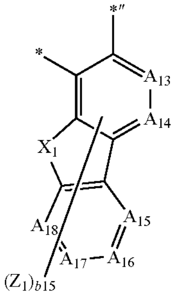

wherein, in Formulae CY3-1 to CY3-6, $X_1$ and $Z_1$ are the same as described in connection with claim 1, $A_{11}$ to $A_{18}$ are each independently C or N, b15 is an integer from 0 to 5,

* indicates a binding site to M in Formula 1, and

*" is a binding site to a neighboring atom in Formulae 1-2A and 1-21B.

9. The composition of claim 1, wherein a group represented by

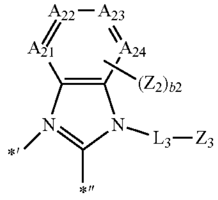

in Formula 1-2A is a group represented by one of Formulae CY4-1 to CY4-60:

CY4-1

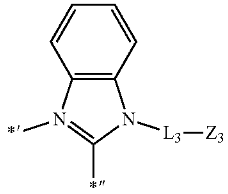

CY4-2

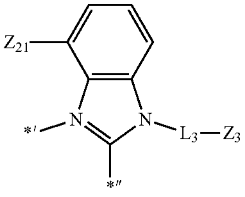

CY4-3

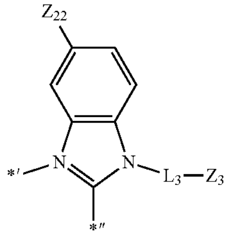

CY4-4

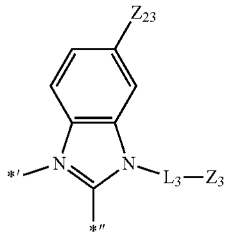

CY4-5

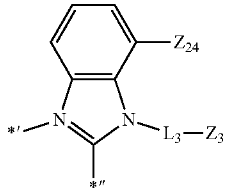

-continued
CY4-6
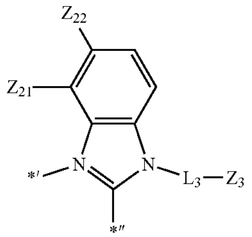
CY4-7
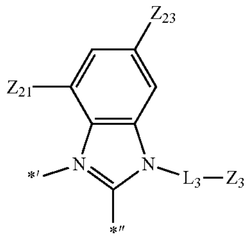
CY4-8
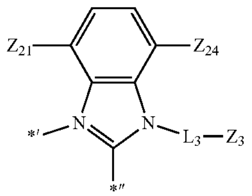
CY4-9
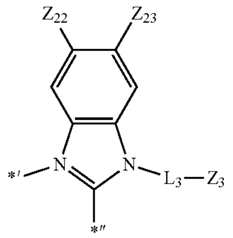
CY4-10
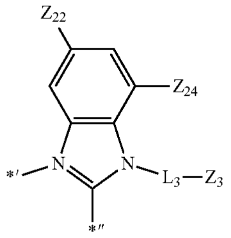
CY4-11
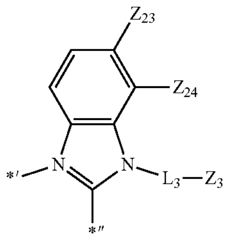
-continued
CY4-12
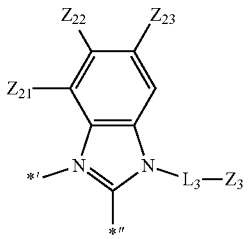
CY4-13
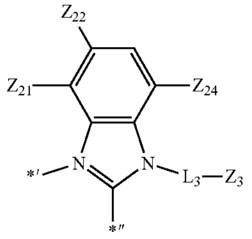
CY4-14
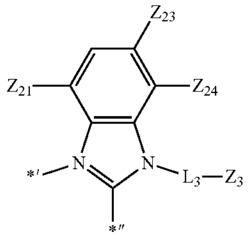
CY4-15
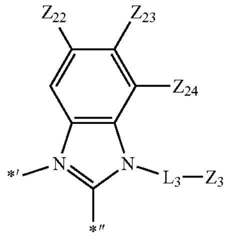
CY4-16
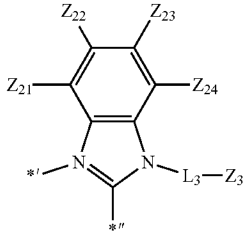
CY4-17
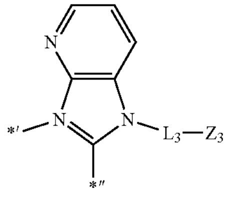

-continued
CY4-18
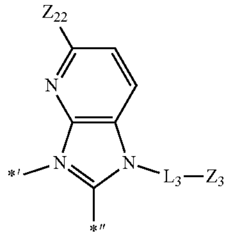
CY4-19
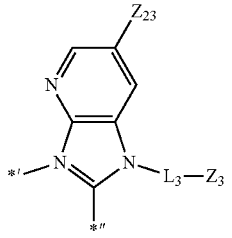
CY4-20
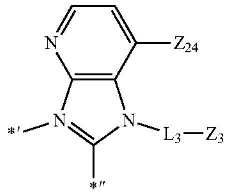
CY4-21
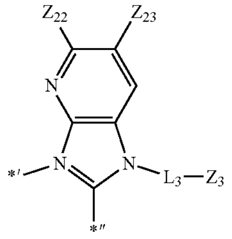
CY4-22
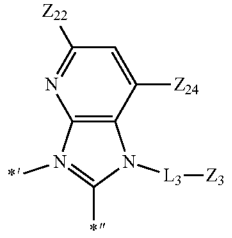
CY4-23
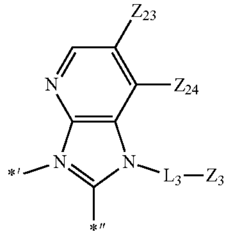
-continued
CY4-24
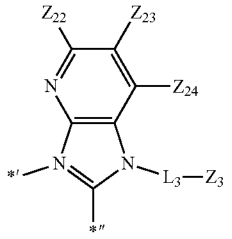
CY4-25
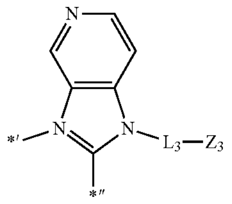
CY4-26
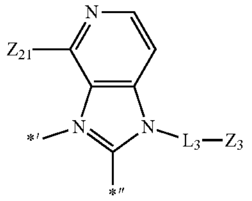
CY4-27
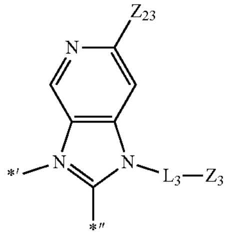
CY4-28
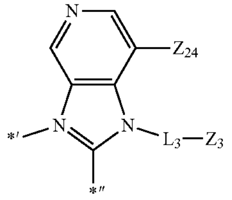
CY4-29
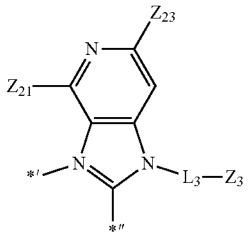
CY4-30
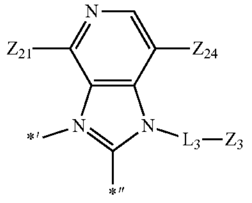

-continued
CY4-31
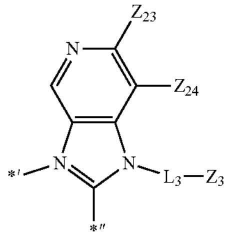
CY4-32
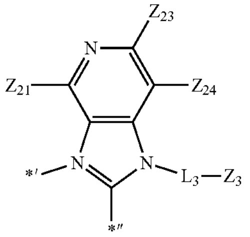
CY4-33
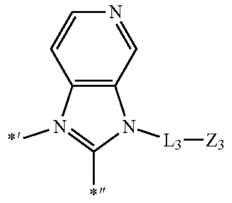
CY4-34
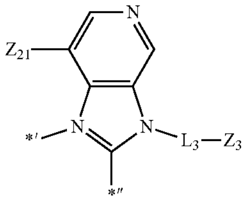
CY4-35
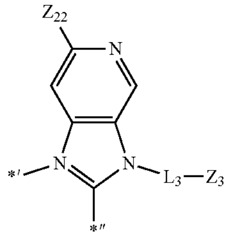
CY4-36
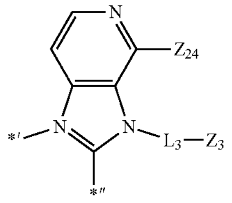
CY4-37
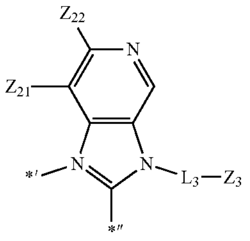
-continued
CY4-38
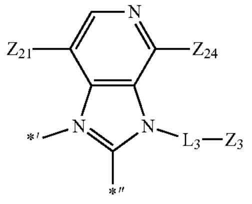
CY4-39
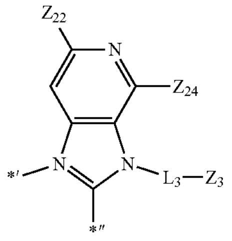
CY4-40
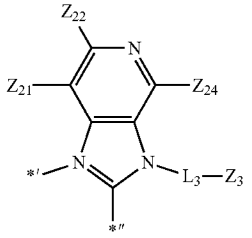
CY4-41
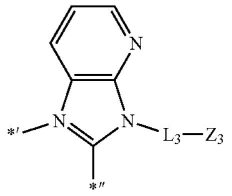
CY4-42
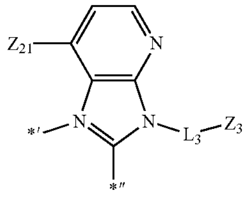
CY4-43
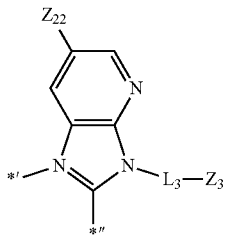
CY4-44
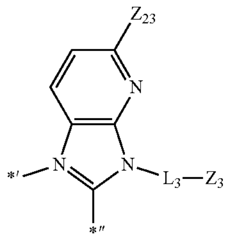

-continued
CY4-45
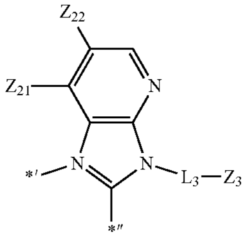
CY4-46
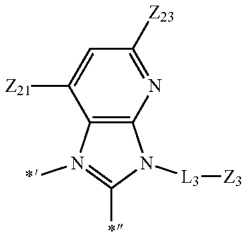
CY4-47
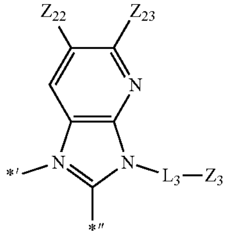
CY4-48
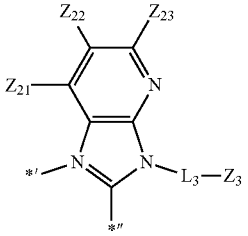
CY4-49
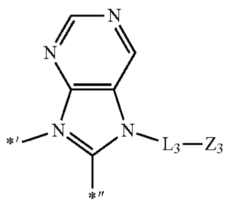
CY4-50
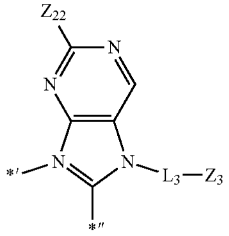
CY4-51
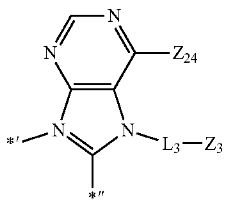
-continued
CY4-52
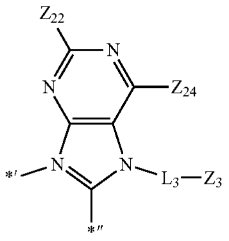
CY4-53
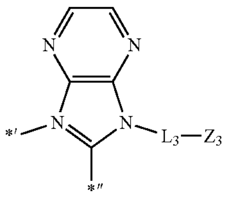
CY4-54
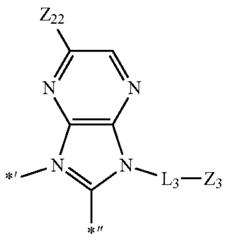
CY4-55
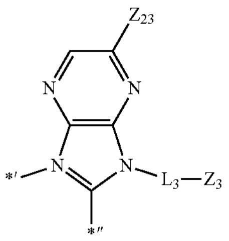
CY4-56
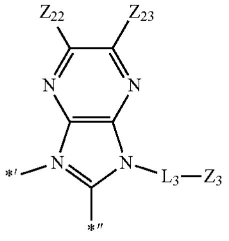
CY4-57
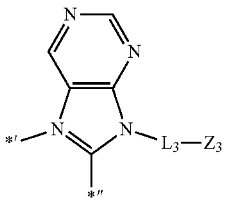
CY4-58
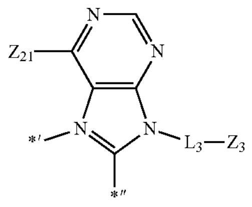

-continued

CY4-59

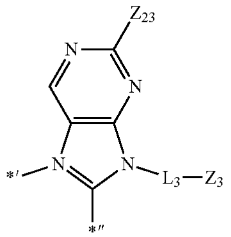

CY4-60

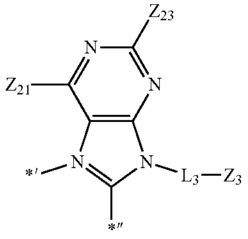

wherein, in Formulae CY4-1 to CY4-60, $L_3$ and $Z_3$ are the same as described in connection with claim 1, $Z_{21}$ to $Z_{24}$ are the same as described in connection with $Z_2$, in claim 1 and each of $Z_{21}$ to $Z_{24}$ is not hydrogen,

*' indicates a binding site to M in Formula 1, and

*" is a binding site to a neighboring atom in Formula 1-2A.

10. The composition of claim 1, wherein the at least one second compound and the at least one third compound are each independently represented by one of Formulae 2 and 3 below, and the at least one second compound and the at least one third compound are different from each other:

Formula 2

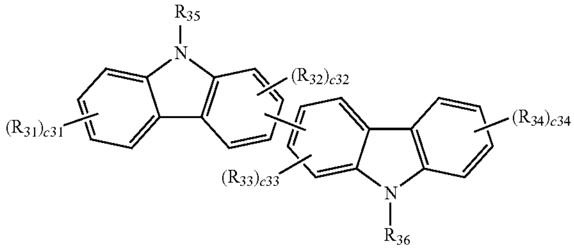

Formula 3

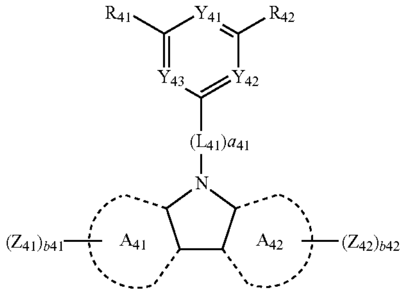

Formula 4

$*-(L_{51})_{a51}-Ar_{51}$ wherein, in Formulae 2 and 3, $A_{41}$ and $A_{42}$ are each independently a $C_5$-$C_{60}$ carbocyclic group or a $C_1$-$C_{60}$ heterocyclic group, $Y_{41}$ to $Y_{43}$ are each independently $C(R_{43})$ or N, $L_{41}$ and $L_{51}$ are each independently a substituted or unsubstituted $C_5$-$C_{60}$ carbocyclic group, or a substituted or unsubstituted $C_1$-$C_{60}$ heterocyclic group, a41 and a51 are each independently an integer from 0 to 5, $Ar_{51}$ is hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or $P(Q_8)(Q_9)$, $R_{31}$ to $R_{36}$, $R_{41}$ to $R_{43}$, and $Z_{41}$ to $Z_{42}$ are each independently a group represented by Formula 4, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or $P(Q_8)(Q_9)$, b41 and b42 are each independently an integer from 0 to 20, c31 and c34 are each independently an integer from 0 to 4, c32 and c33 are each independently an integer from 0 to 3, and a substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropoly cyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropoly cyclic group.

11. The composition of claim 10, wherein at least one in $Y_{41}$ to $Y_{43}$ is N.

12. The composition of claim 10, wherein the at least one second compound is represented by Formula 2, and the at least one third compound is represented by Formula 3.

13. The composition of claim 10, wherein the at least one second compound is represented by Formula 2-1:

Formula 2-1

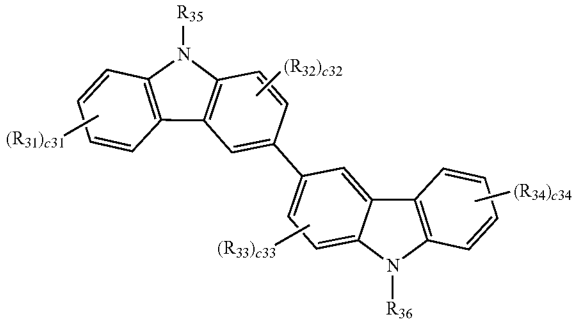

wherein, in Formula 2-1, 10

$R_{31}$ to $R_{36}$ and c31 to c34 are the same as described in connection with claim 10.

14. The composition of claim 10, wherein the at least one third compound is represented by Formula 3-1 or Formula 3-2:

Formula 3-1

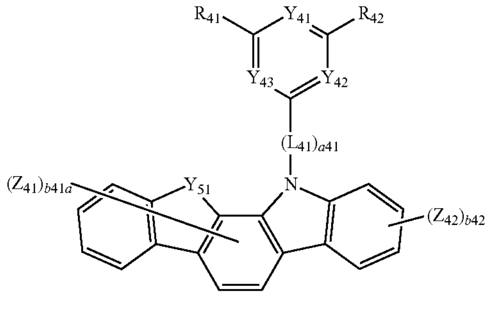

-continued

Formula 3-2

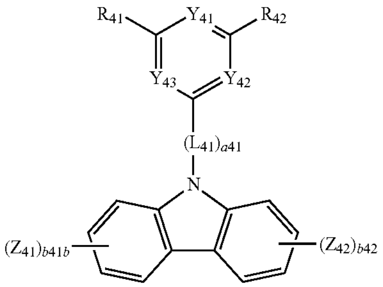

wherein, in Formulae 3-1 and 3-2, $Y_{41}$ to $Y_{43}$, $L_{41}$, a41, $R_4$ to $R_{42}$, and $Z_{41}$ to $Z_{42}$ are the same as described in connection with claim 11, $Y_{51}$ is O, S, Se, $N(Z_{43})$, $C(Z_{43})(Z_{44})$, or $Si(Z_{43})(Z_{44})$, $Z_{43}$ and $Z_{44}$ are the same as described in connection with $Z_{41}$ and $Z_{42}$ in claim 10, b41a is an integer from 0 to 6, b41b is an integer from 0 to 4, and b42 is an integer from 0 to 4.

15. The composition of claim 1, wherein the at least one second compound is one of Compounds H1-1 to H1-20, and the at least one third compound is one of Compounds H2-1 to H2-33:

H1-1

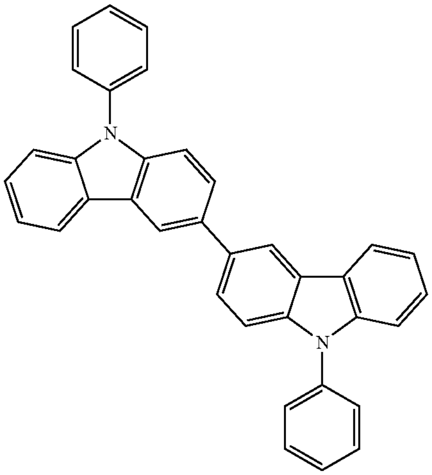

-continued

H1-2

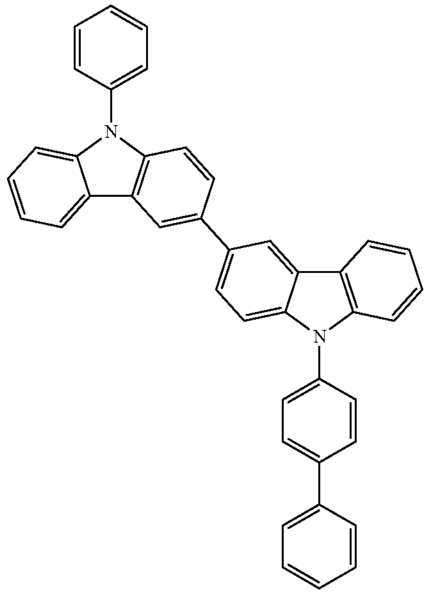

H1-3

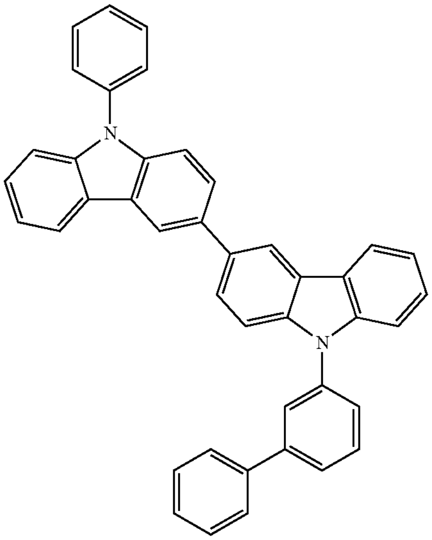

H1-4

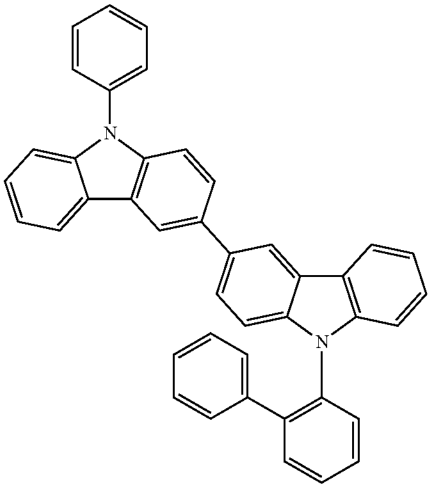

-continued
H1-5
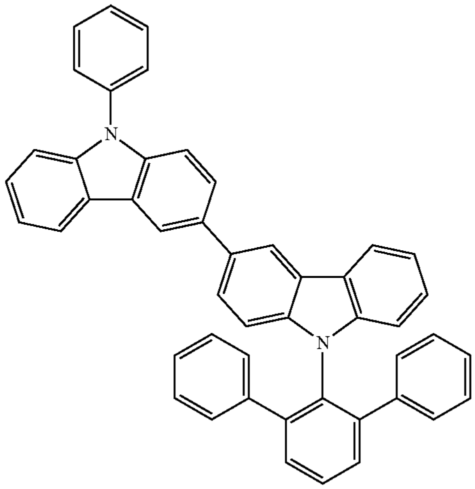
H1-6
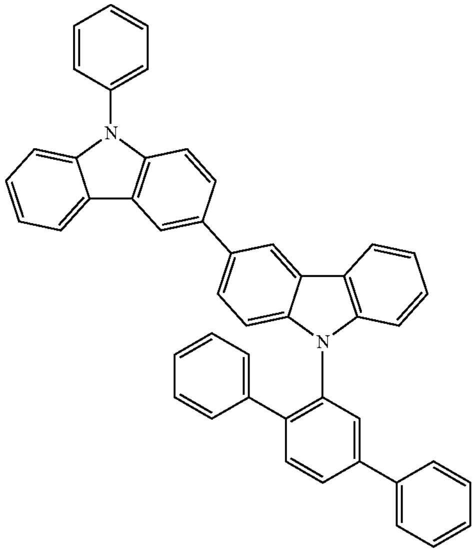
H1-7
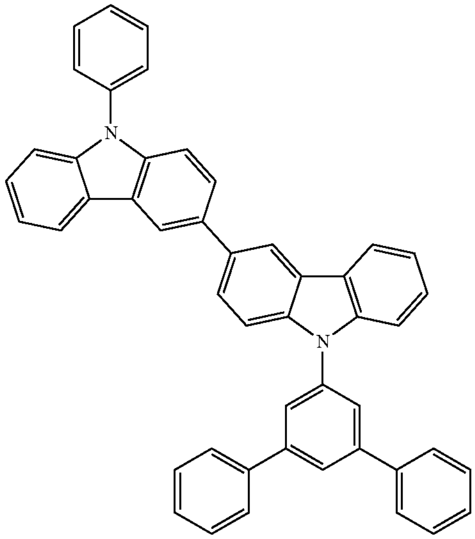
-continued
H1-8
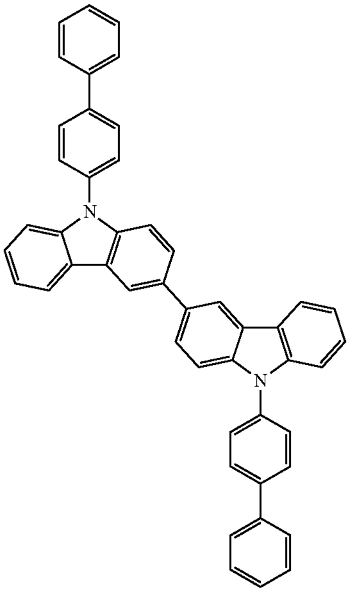
H1-9
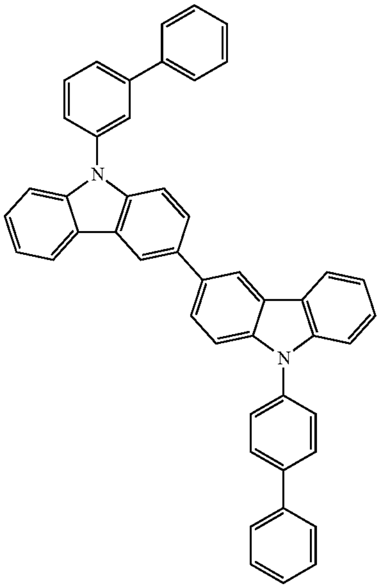

-continued
H1-10
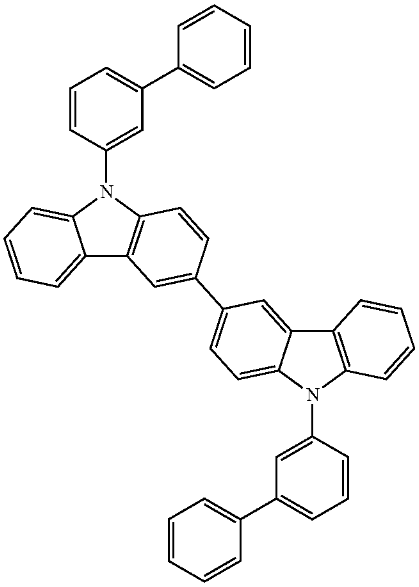
H1-11
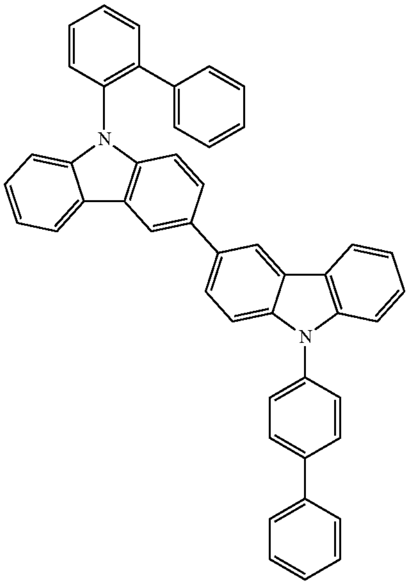
-continued
H1-12
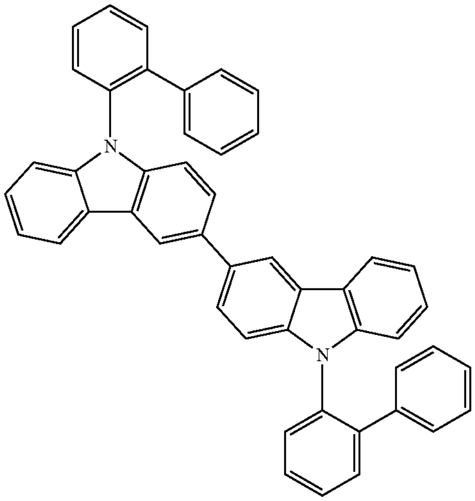
H1-13
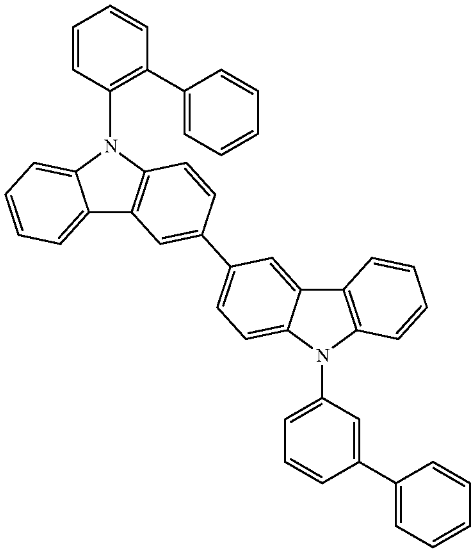
H1-14
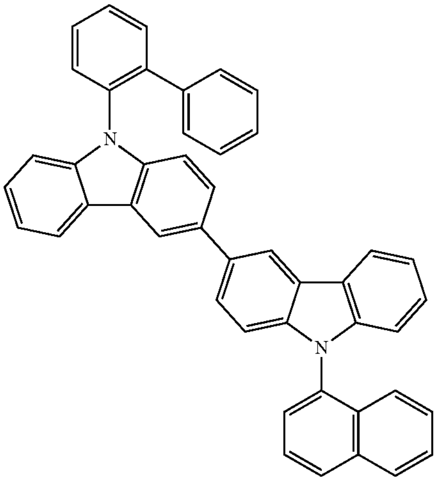

H1-15
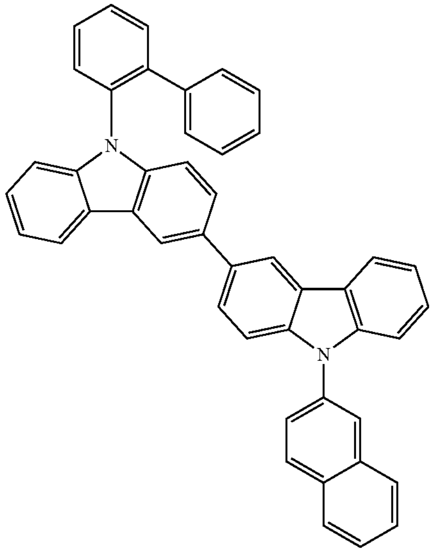
H1-16
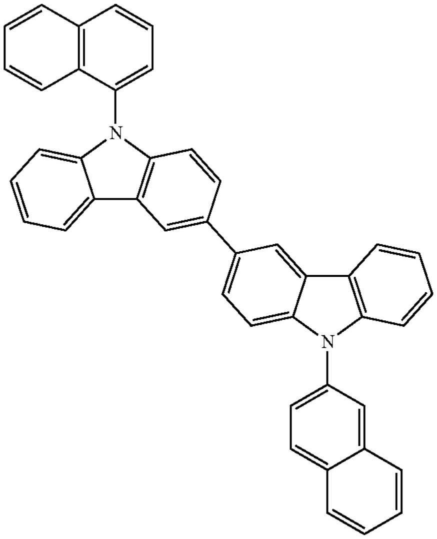
H1-17
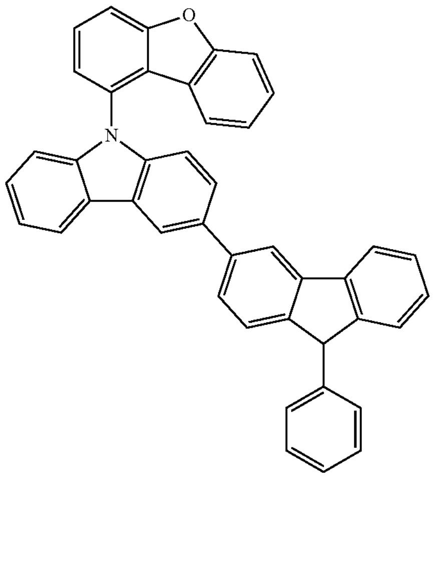
H1-18
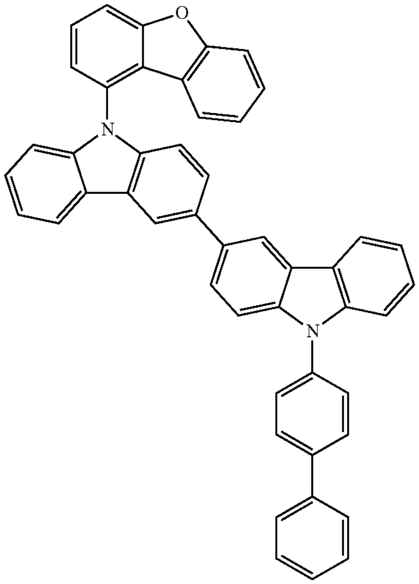
H1-19
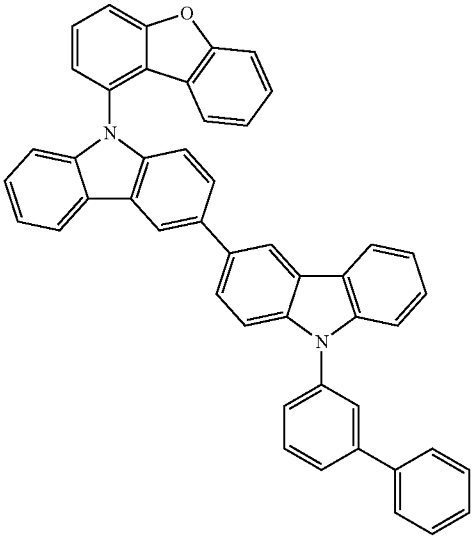

-continued
H1-20
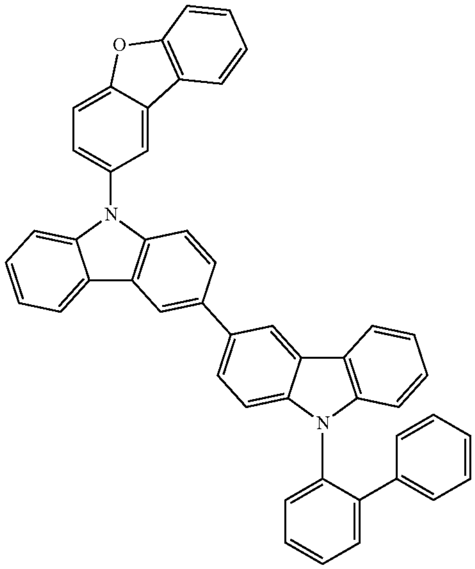
H2-1
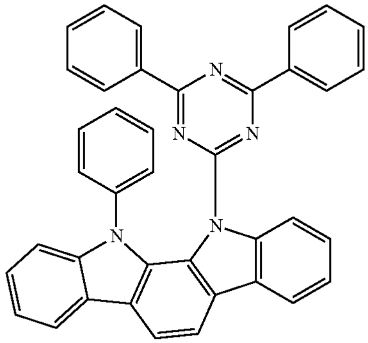
H2-2
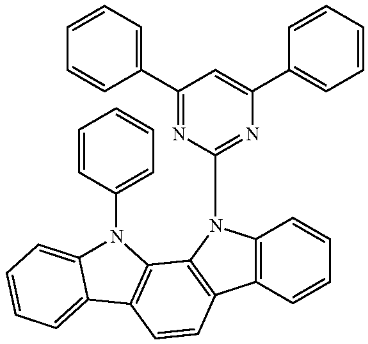
H2-3
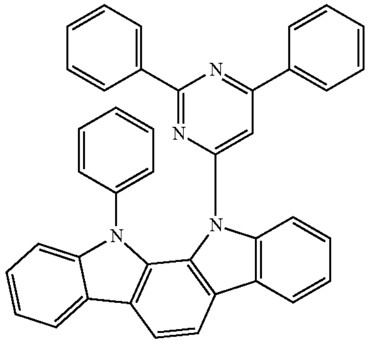
-continued
H2-4
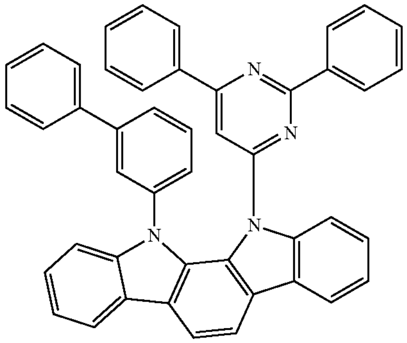
H2-5
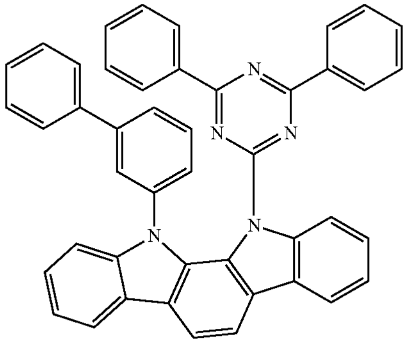
H2-6
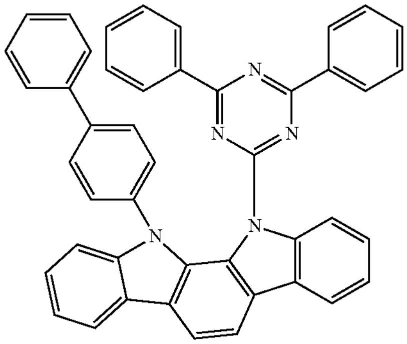
H2-7
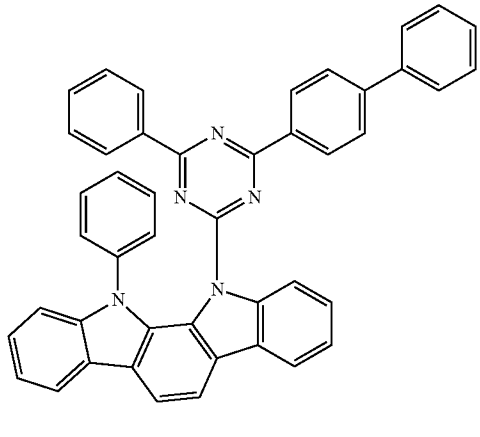

-continued
H2-8
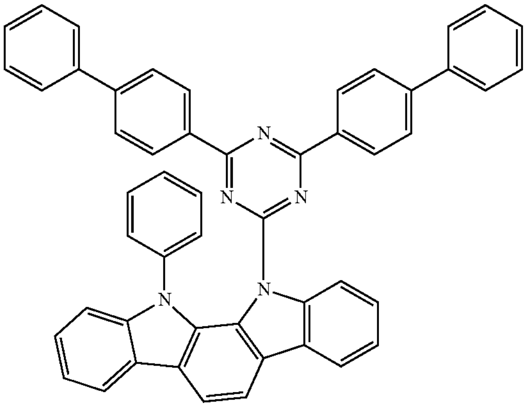
H2-9
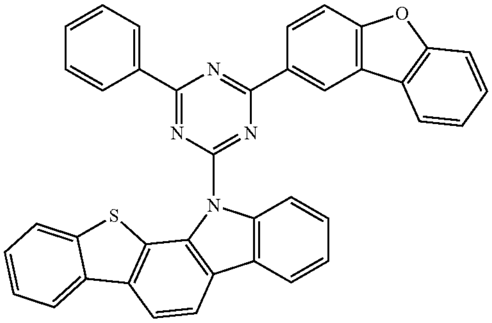
H2-10
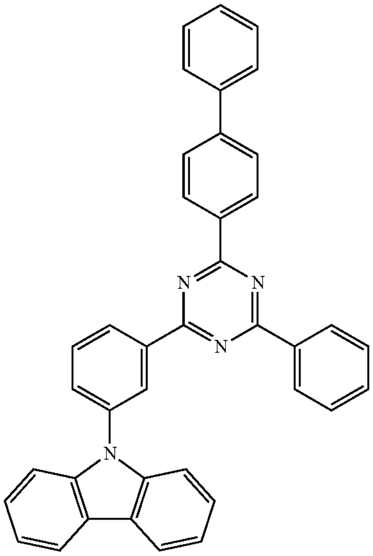
-continued
H2-11
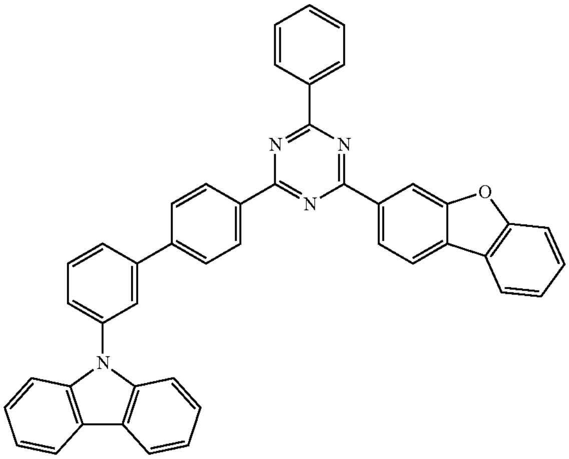
H2-12
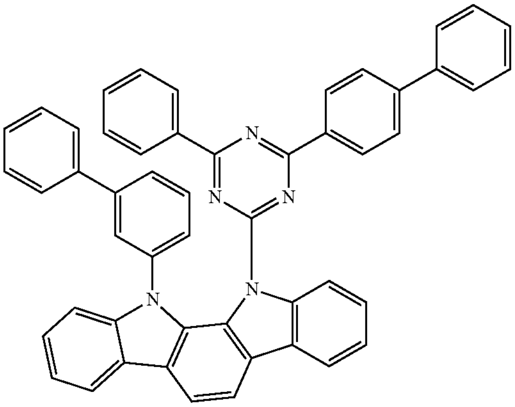
H2-13
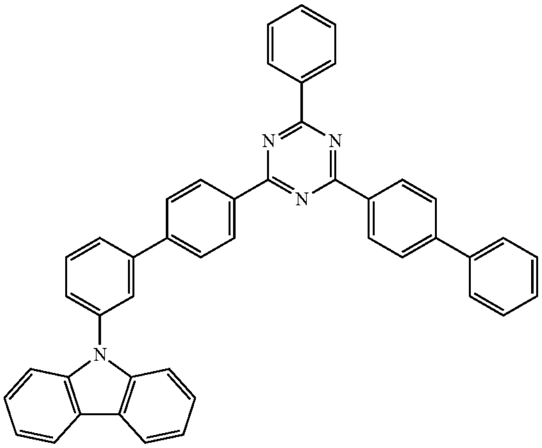

-continued
H2-14
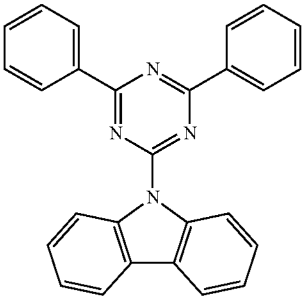
H2-15
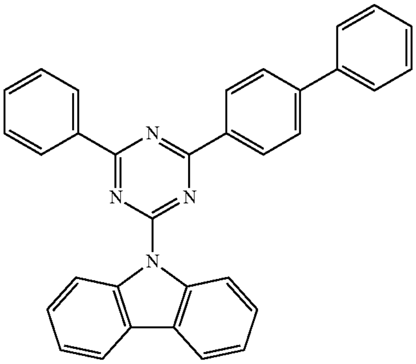
H2-16
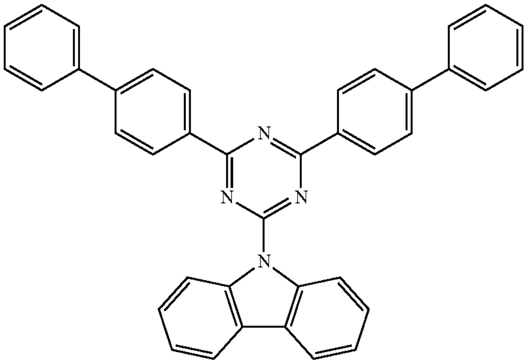
H2-17
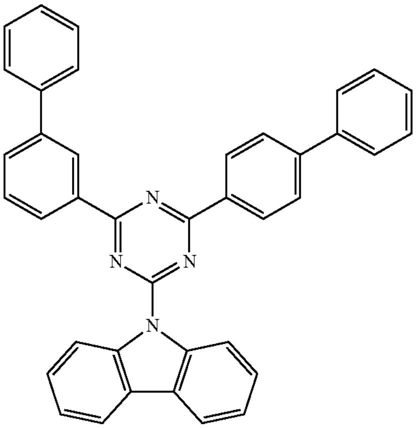
-continued
H2-18
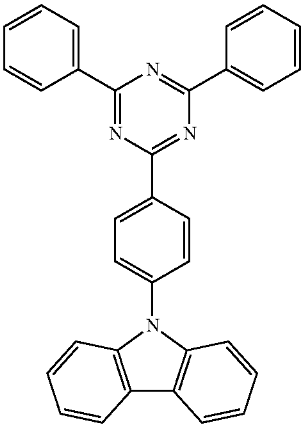
H2-19
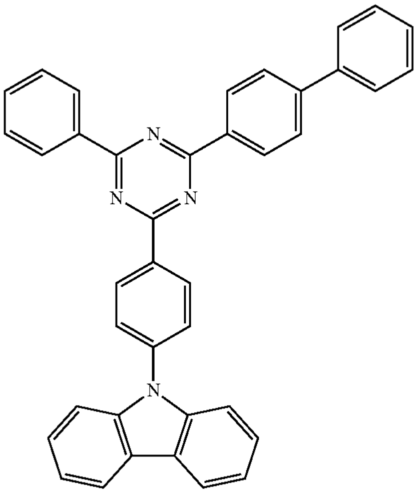
H2-20
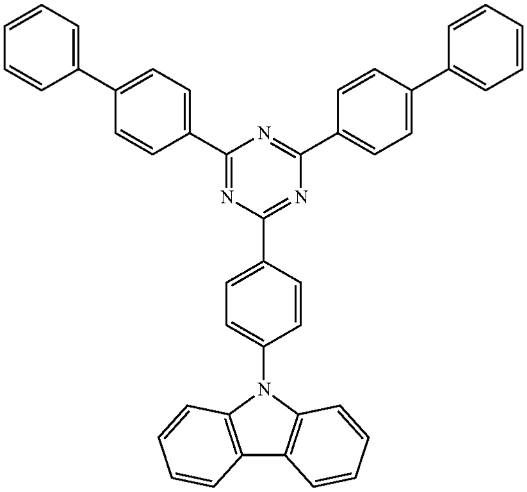

-continued
H2-21
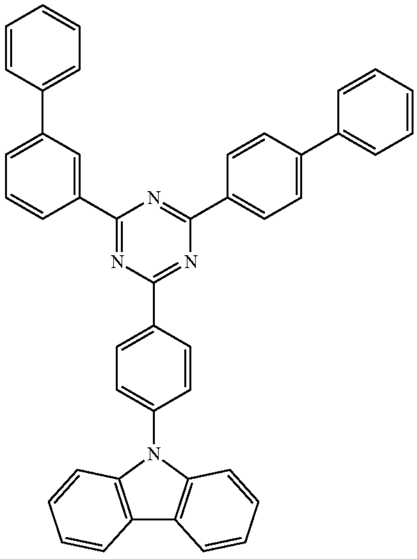
H2-22
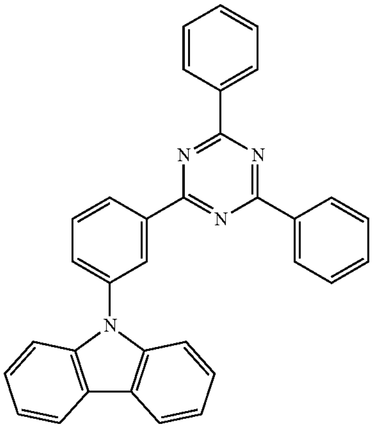
H2-23
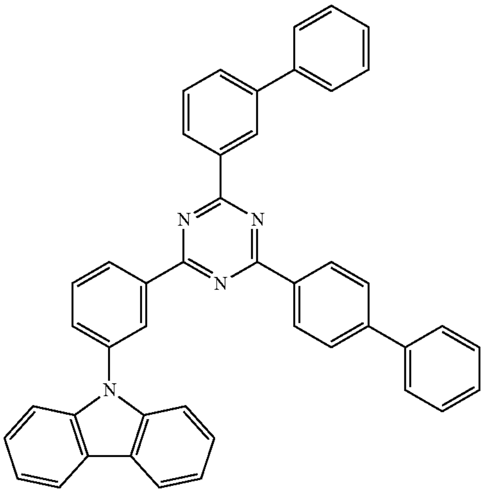
-continued
H2-24
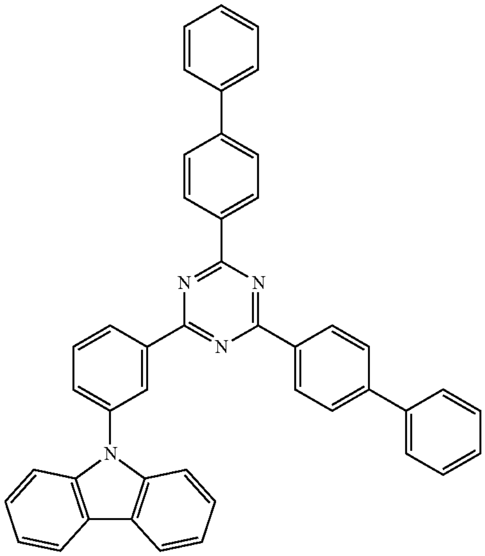
H2-25
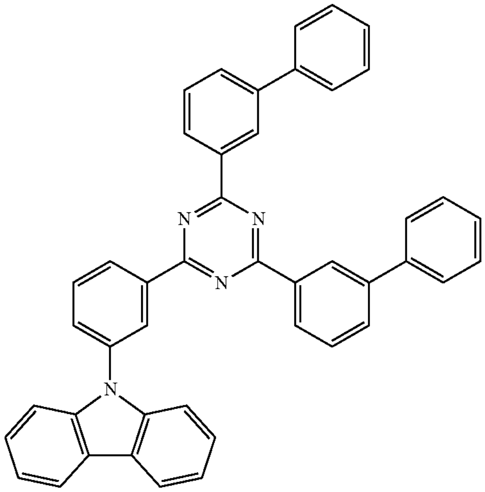
H2-26
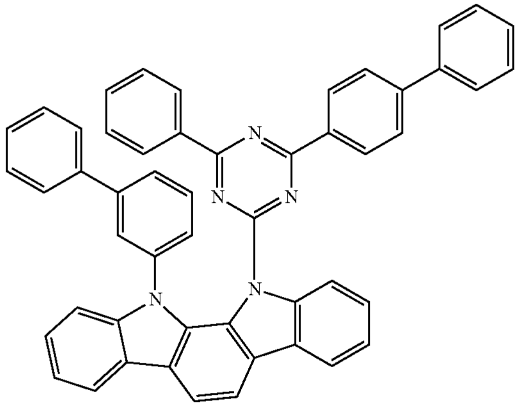

-continued
H2-27
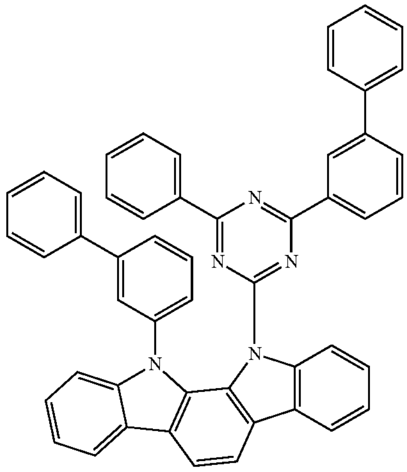
H2-28
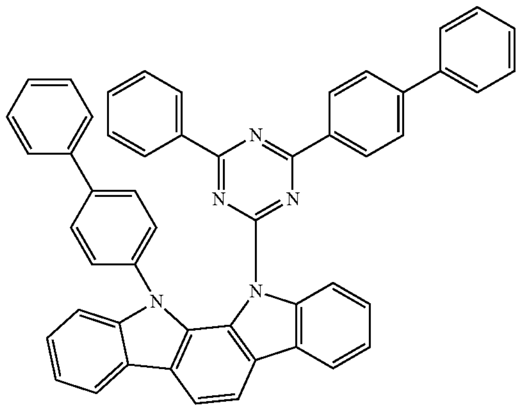
H2-29
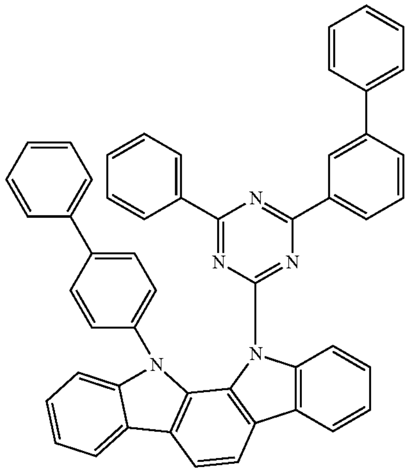
-continued
H2-30
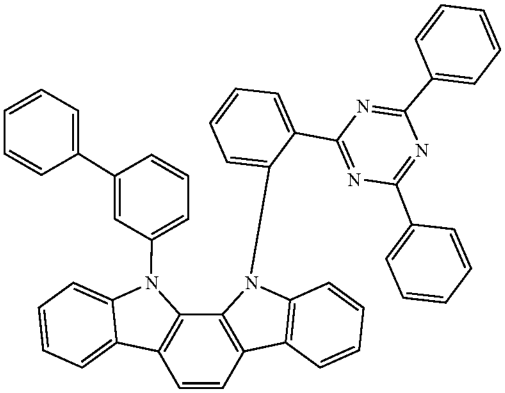
H2-31
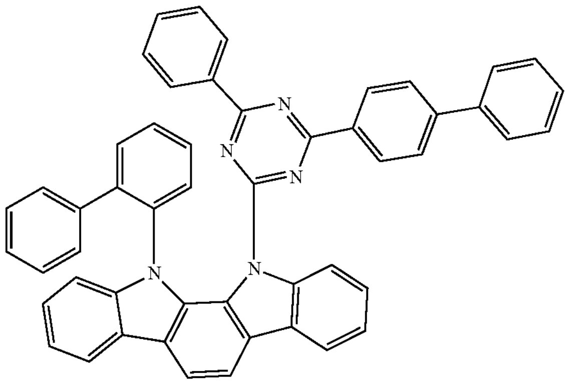
H2-32
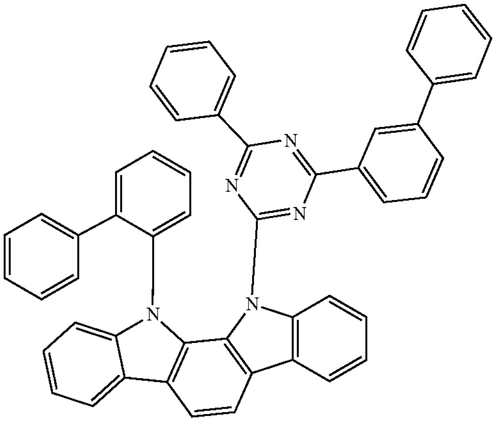

-continued

H2-33

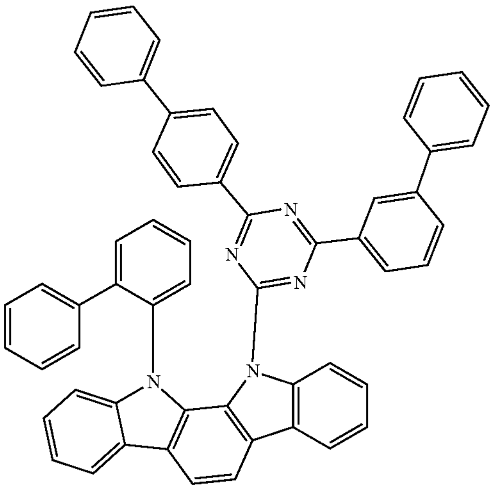

.

16. An organic light-emitting device comprising:

a first electrode;

a second electrode; and an organic layer located between the first electrode and the second electrode and comprising an emission layer, wherein the organic layer comprises the composition of claim 1.

17. The organic light-emitting device of claim 16, wherein the first electrode is an anode, the second electrode is a cathode, the organic layer further comprises a hole transport region between the first electrode and the emission layer and an electron transport region between the emission layer and the second electrode, wherein the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

18. The organic light-emitting device of claim 16, wherein the composition is included in the emission layer.

19. The organic light-emitting device of claim 16, wherein the emission layer emits red light.

* * * * *